US005487172A

United States Patent [19]

Hyatt

[11] Patent Number: 5,487,172

[45] Date of Patent: Jan. 23, 1996

[54] TRANSFORM PROCESSOR SYSTEM HAVING REDUCED PROCESSING BANDWITH

[76] Inventor: Gilbert P. Hyatt, P.O. Box 81230, Las Vegas, Nev. 89180

[21] Appl. No.: 763,461

[22] Filed: Sep. 20, 1991

Related U.S. Application Data

[63] Continuation of Ser. No. 504,691, Jun. 15, 1983, which is a continuation of Ser. No. 754,660, Dec. 27, 1976, Pat. No. 4,486,850.

[51] Int. Cl.[6] .................................................. G06F 17/14

[52] U.S. Cl. .................................. 395/800; 364/DIG. 1; 364/DIG. 2; 364/137

[58] Field of Search ..................... 364/DIG. 1 MS File, 364/DIG. 2 MS File, 715.01, 725, 726, 727, 728.01, 728.02; 395/100, 118, 133, 137, 138, 400, 800

[56] References Cited

U.S. PATENT DOCUMENTS

| | | | |
|---|---|---|---|
| 3,287,702 | 11/1966 | Borck, Jr. et al. | 395/800 |
| 3,287,703 | 11/1966 | Borck, Jr. et al. | 395/800 |
| 3,308,436 | 3/1967 | Borck, Jr. et al. | 395/800 |
| 3,320,595 | 5/1967 | Yanishevsky | 340/727 |
| 3,493,956 | 2/1970 | Andrews et al. | 340/792 |
| 3,534,396 | 10/1970 | Hart et al. | 364/521 |
| 3,601,591 | 8/1971 | Gaines et al. | 364/702 |
| 3,602,702 | 8/1971 | Warnock | 340/729 |
| 3,614,766 | 10/1971 | Kievit | 340/726 |
| 3,621,214 | 11/1971 | Romney et al. | 364/522 |
| 3,747,087 | 7/1973 | Harrison, III et al. | 340/725 |
| 3,821,729 | 6/1974 | Schultze | 340/727 |
| 3,941,926 | 3/1976 | Slobodzian et al. | 340/720 |
| 3,944,997 | 3/1976 | Swallow | 340/703 |
| 3,976,982 | 8/1976 | Eiselen | 364/900 |
| 4,029,947 | 6/1977 | Evans et al. | 364/521 |
| 4,045,789 | 8/1977 | Bristow | 340/724 |
| 4,068,225 | 1/1978 | Lee | 340/724 |
| 4,069,511 | 1/1978 | Lelke | 340/720 |
| 4,070,710 | 1/1978 | Sukonick et al. | 364/900 |
| 4,077,062 | 2/1978 | Nielsen | 364/521 |
| 4,125,873 | 11/1978 | Chesarek | 340/747 |
| 4,129,883 | 12/1978 | Stubben | 340/725 |
| 4,180,805 | 12/1979 | Burson | 340/703 |
| 4,181,953 | 1/1980 | Osofsky | 364/522 |
| 4,189,743 | 2/1980 | Schure et al. | 340/747 |
| 4,200,867 | 4/1980 | Hill | 340/703 |
| 4,208,719 | 6/1980 | Lotz | 340/728 |
| 4,222,048 | 9/1980 | Johnson | 340/727 |
| 4,223,353 | 9/1980 | Keller et al. | 340/799 |
| 4,243,984 | 1/1981 | Ackley et al. | 340/725 |
| 4,267,573 | 5/1981 | Chaikin et al. | 340/727 |
| 4,296,476 | 10/1981 | Mayer et al. | 364/900 |
| 4,301,443 | 11/1981 | Sternberg et al. | 382/49 |
| 4,384,338 | 5/1983 | Bennett | 340/729 |
| 4,396,989 | 8/1983 | Fleming et al. | 364/521 |
| 4,414,685 | 11/1983 | Sternberg | 364/725 |
| 4,475,104 | 10/1984 | Shen | 364/521 X |
| 4,475,161 | 10/1984 | Stock | 364/521 |
| 4,484,187 | 11/1984 | Brown et al. | 340/725 |
| 4,486,785 | 12/1984 | Lasher et al. | 340/728 |
| 4,489,389 | 12/1984 | Beckwith et al. | 340/729 |
| 4,491,874 | 1/1985 | Yamamoto | 364/518 |
| 4,529,978 | 7/1985 | Rupp | 340/727 |
| 4,549,275 | 10/1985 | Sukonick | 364/518 |
| 4,558,438 | 12/1985 | Jones et al. | 340/728 |
| 4,570,233 | 2/1986 | Yan et al. | 340/747 |

*Primary Examiner*—Robert B. Harrell
*Attorney, Agent, or Firm*—Gilbert P. Hyatt

[57] ABSTRACT

An improved transform processing system reduces processing bandwidth with improved processor architectures and improved transform algorithms. A hierarchal arrangement facilitates use of the same coefficients for multiple transforms, particularly when the coefficients have not changed. A detector arrangement is provided for detecting a change condition and then causing the processor to bypass redundant processing operations.

72 Claims, 107 Drawing Sheets

SERIAL COMPUTATION INCREMENTAL PROCESSOR

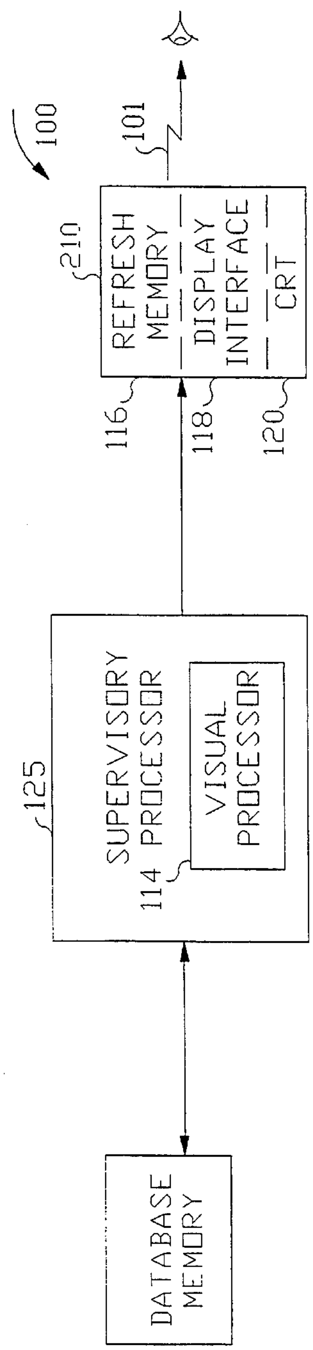
FIG 2
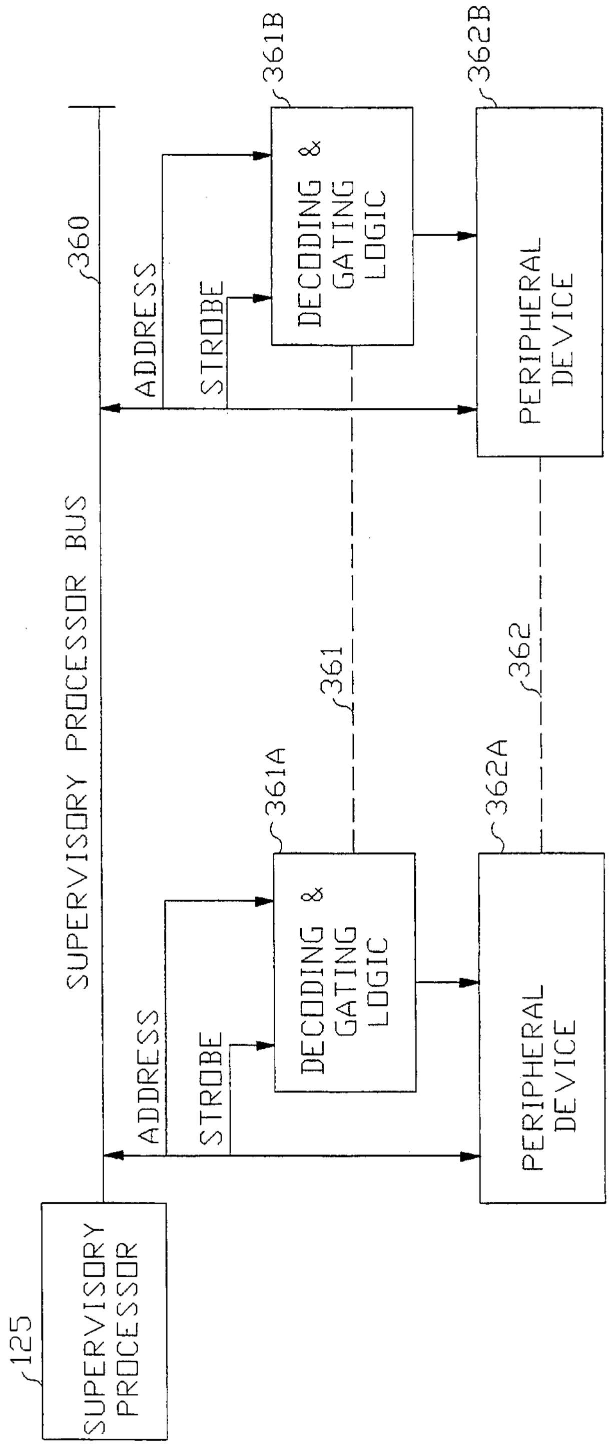
FIG 3 SUPERVISORY PROCESSOR

FIG 4 EXECUTIVE PROCESSOR
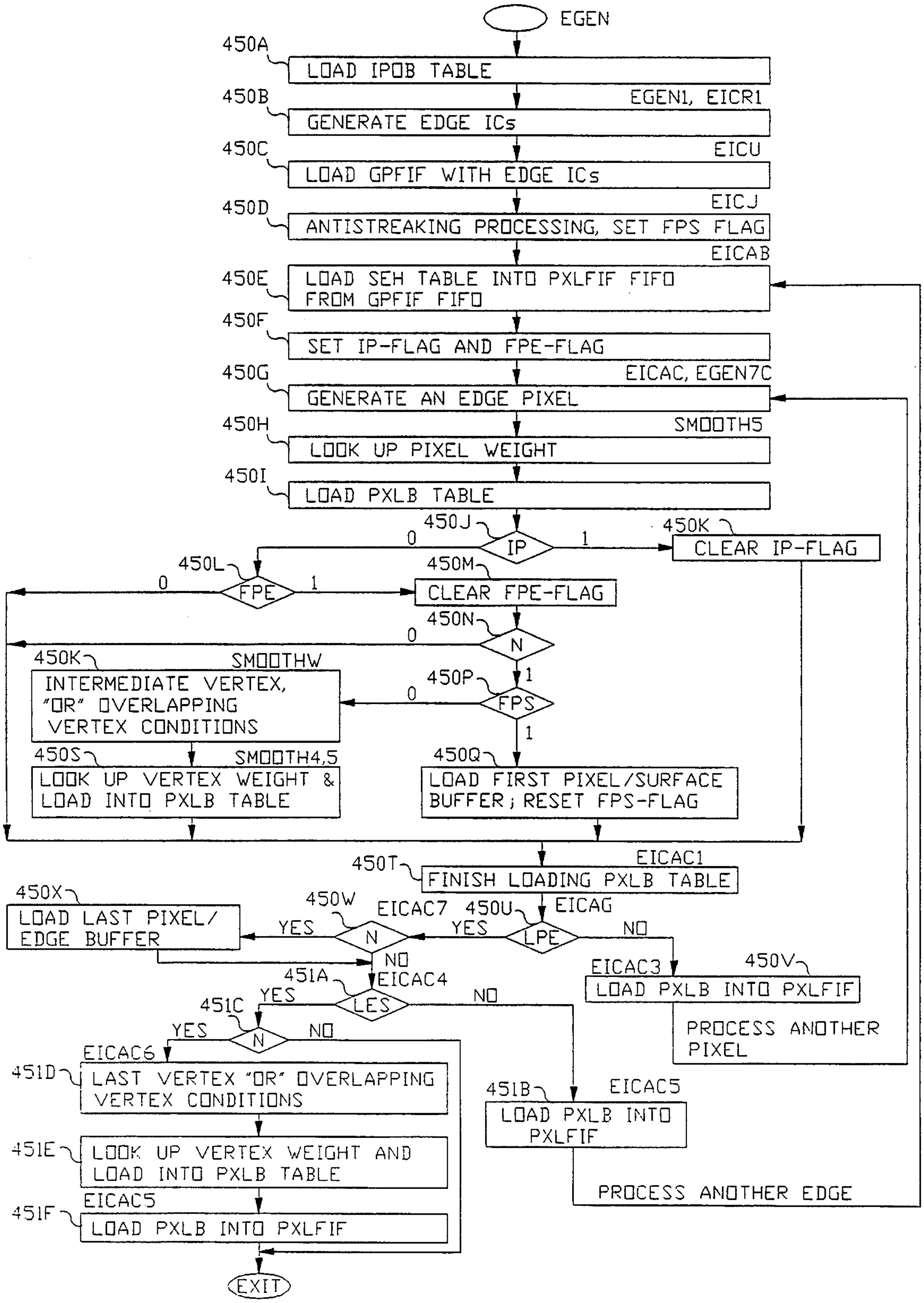

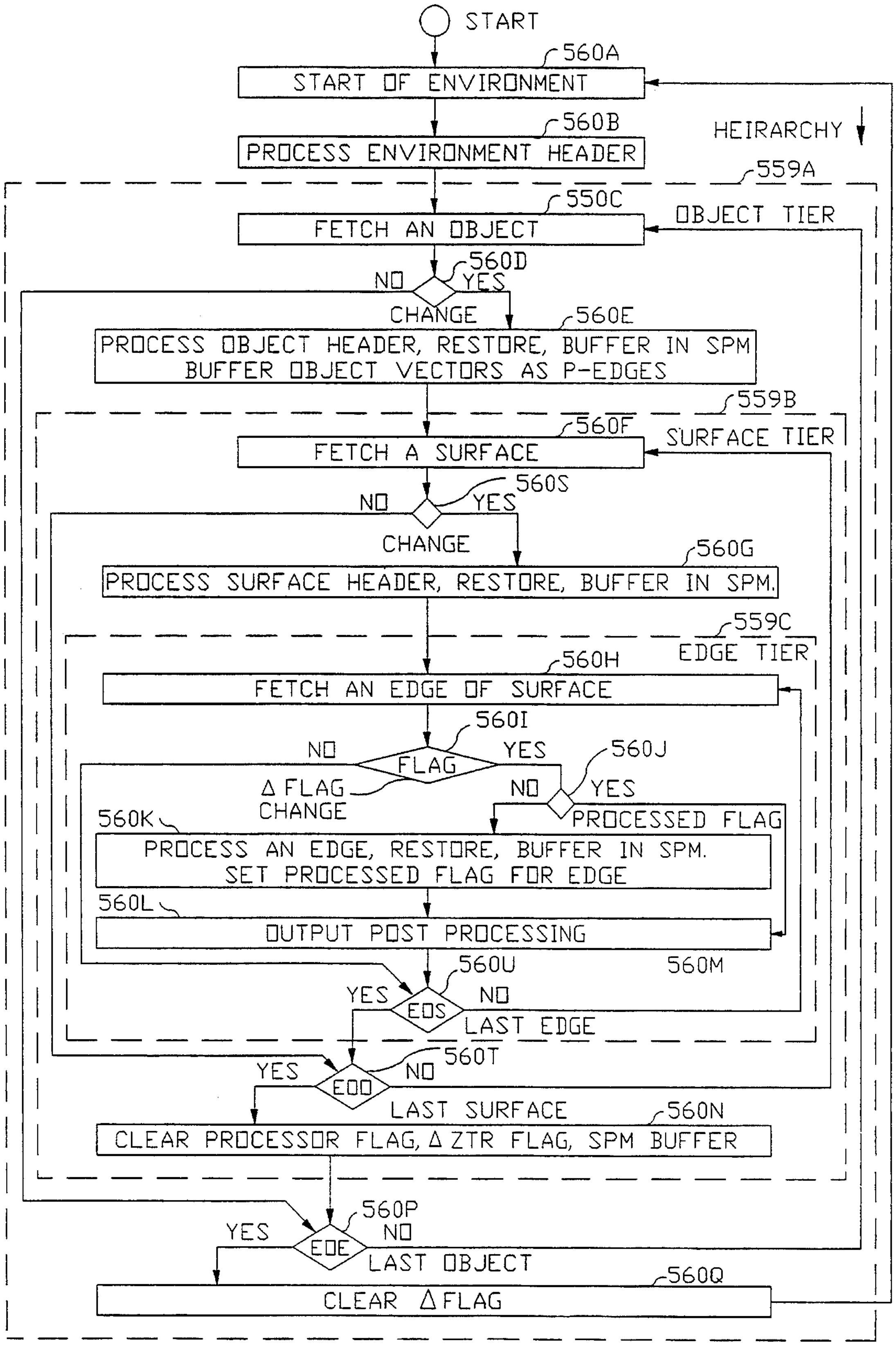
FIG 5A GEOMETRIC PROCESSOR STATE DIAGRAM

OBJECT HEADER PROCESSING

FIG 5D EDGE PROCESSING
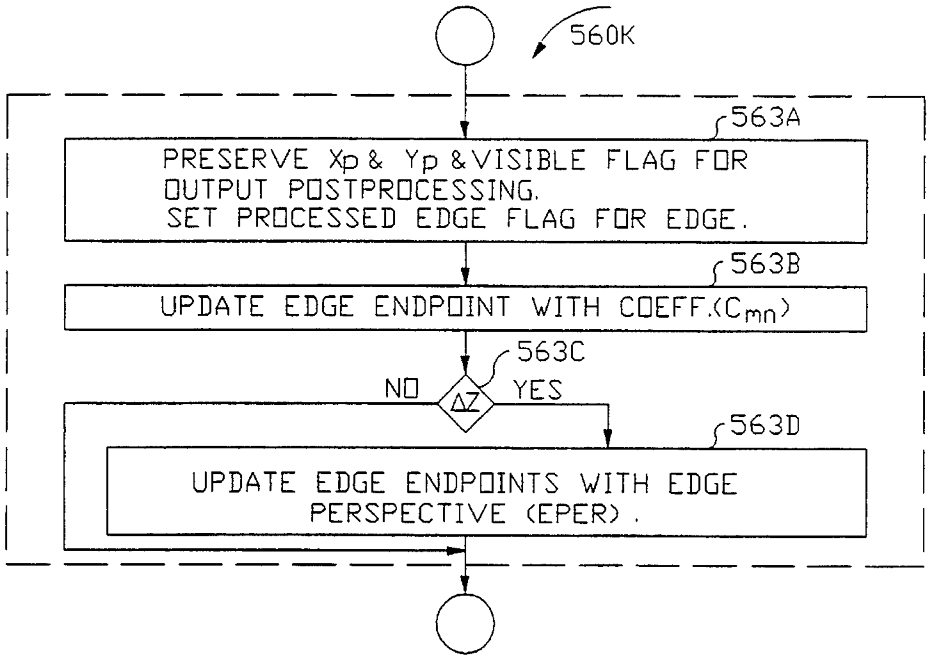
FIG 5E OUTPUT POSTPROCESSING
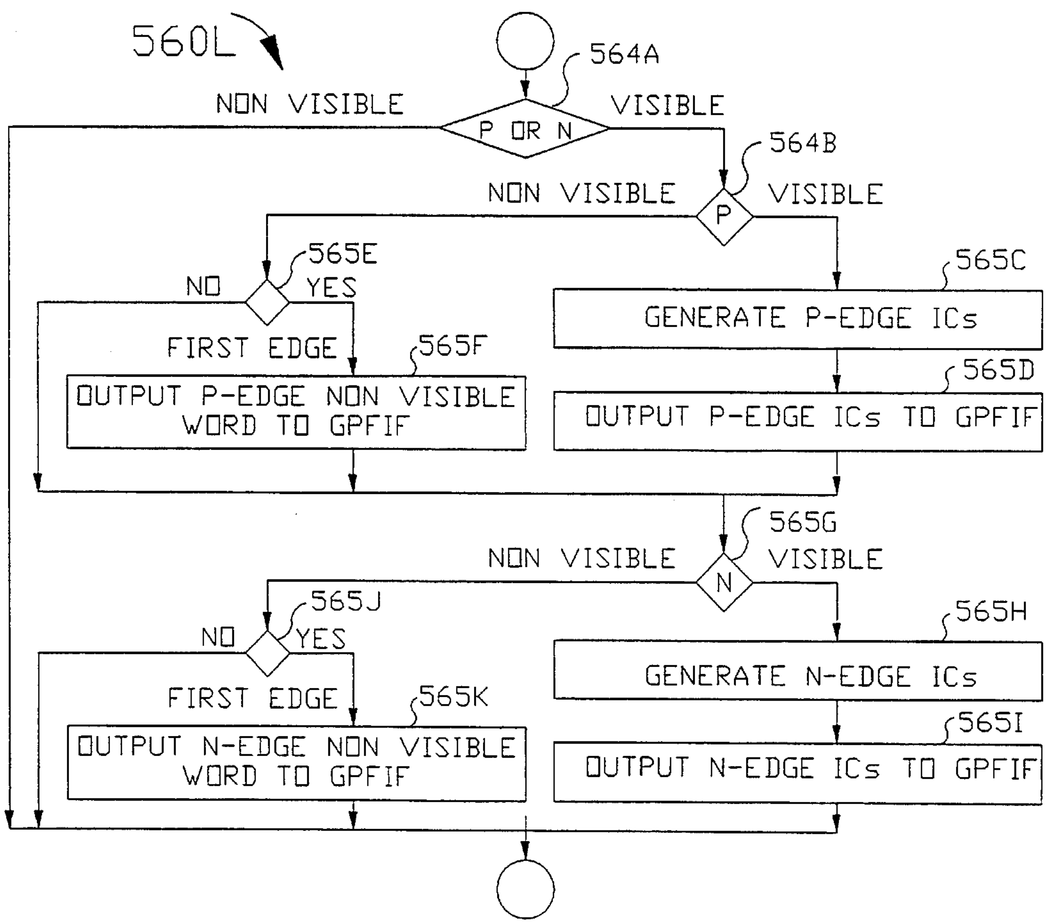

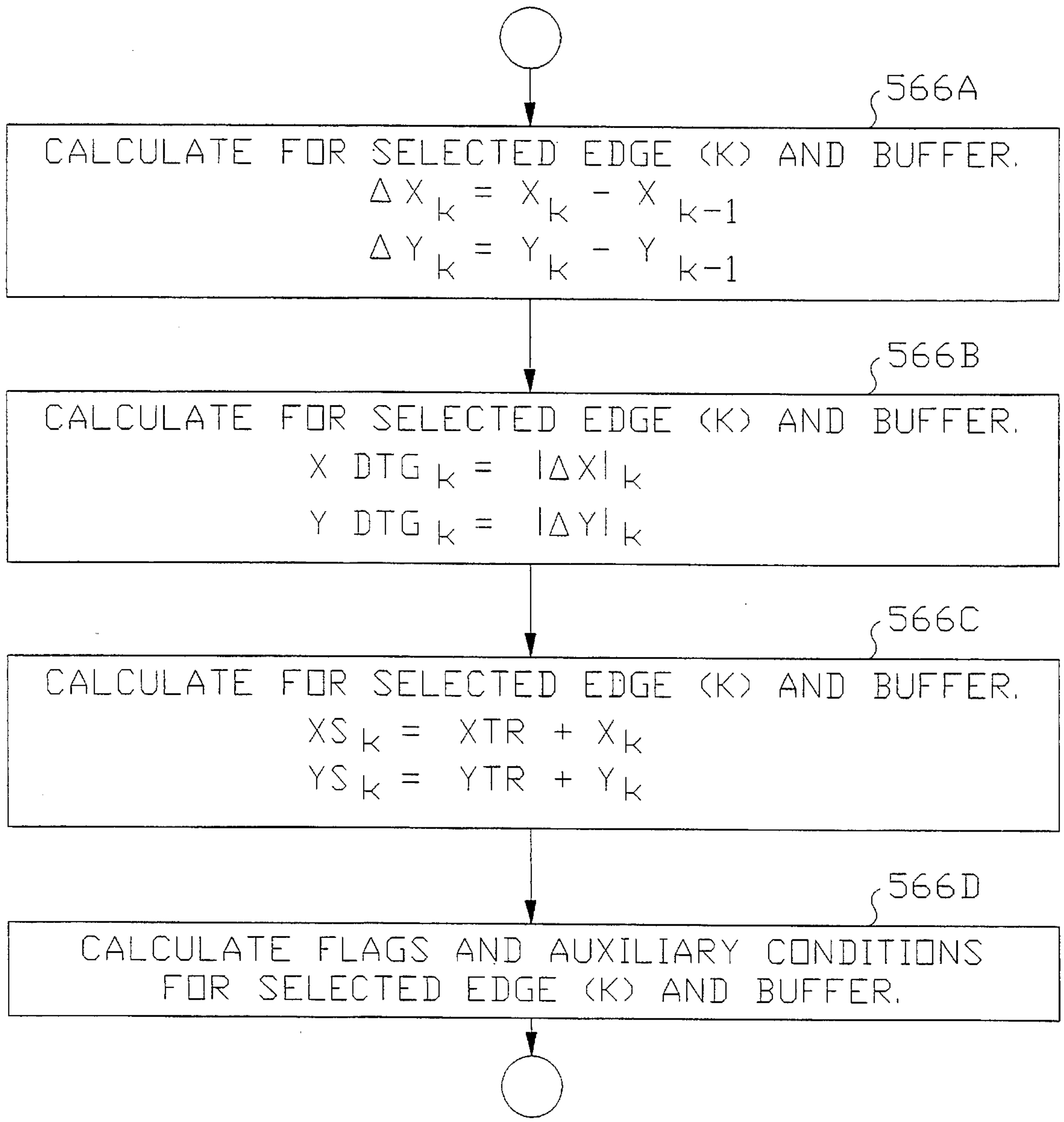
FIG 5F EDGE IC PROCESSING

FIG 5G GEOMETRIC TRANSFORM TABLE $$\begin{bmatrix} x_N \\ y_N \\ z_N \\ 1 \end{bmatrix} = \begin{bmatrix} \theta \\ \text{ROTATION} \end{bmatrix} \times \begin{bmatrix} \phi \\ \text{ROTATION} \end{bmatrix} \times \begin{bmatrix} \psi \\ \text{ROTATION} \end{bmatrix} \times \begin{bmatrix} \text{TRANS.} \end{bmatrix} \times \begin{bmatrix} \text{SCALING} \end{bmatrix} \times \begin{bmatrix} \text{PERSPECTIVE} \end{bmatrix} \times \begin{bmatrix} x_P \\ y_P \\ z_P \\ 1 \end{bmatrix}$$

$$\begin{bmatrix} \theta \\ \text{ROTATION} \end{bmatrix} = \begin{bmatrix} \cos\theta & \sin\theta & 0 & 0 \\ -\sin\theta & \cos\theta & 0 & 0 \\ 0 & 0 & 1 & 0 \\ 0 & 0 & 0 & 1 \end{bmatrix}$$

$$\begin{bmatrix} \phi \\ \text{ROTATION} \end{bmatrix} = \begin{bmatrix} 1 & 0 & 0 & 0 \\ 0 & \cos\phi & \sin\phi & 0 \\ 0 & -\sin\phi & \cos\phi & 0 \\ 0 & 0 & 0 & 1 \end{bmatrix}$$

$$\begin{bmatrix} \psi \\ \text{ROTATION} \end{bmatrix} = \begin{bmatrix} \cos\psi & 0 & -\sin\psi & 0 \\ 0 & 1 & 0 & 0 \\ \sin\psi & 0 & \cos\psi & 0 \\ 0 & 0 & 0 & 1 \end{bmatrix}$$

$$\begin{bmatrix} \text{TRANS.} \end{bmatrix} = \begin{bmatrix} 1 & 0 & 0 & 0 \\ 0 & 1 & 0 & 0 \\ 0 & 0 & 1 & 0 \\ \Delta x & \Delta y & \Delta z & 1 \end{bmatrix}$$

$$\begin{bmatrix} \text{SCALING} \end{bmatrix} = \begin{bmatrix} 1 & 0 & 0 & 0 \\ 0 & 1 & 0 & 0 \\ 0 & 0 & 1 & 0 \\ 0 & 0 & 0 & S \end{bmatrix}$$

$$\begin{bmatrix} \text{PERSPECTIVE} \end{bmatrix} = \begin{bmatrix} 1 & 0 & 0 & 0 \\ 0 & 1 & 0 & 0 \\ 0 & 0 & 1 & -1/D \\ 0 & 0 & 0 & 1 \end{bmatrix}$$

FIG 5H GEOMETRIC TRANSFORM TABLE $$\begin{bmatrix} x_N \\ y_N \\ z_N \\ 1 \end{bmatrix} = \begin{bmatrix} \cos\theta & \sin\theta & 0 & 0 \\ -\sin\theta & \cos\theta & 0 & 0 \\ 0 & 0 & 1 & 0 \\ 0 & 0 & 0 & 1 \end{bmatrix} \times \begin{bmatrix} 1 & 0 & 0 & 0 \\ 0 & \cos\phi & \sin\phi & 0 \\ 0 & -\sin\phi & \cos\phi & 0 \\ 0 & 0 & 0 & 1 \end{bmatrix} \times$$

$$\begin{bmatrix} \cos\psi & 0 & -\sin\psi & 0 \\ 0 & 1 & 0 & 0 \\ \sin\psi & 0 & \cos\psi & 0 \\ 0 & 0 & 0 & 1 \end{bmatrix} \times \begin{bmatrix} 1 & 0 & 0 & 0 \\ 0 & 1 & 0 & 0 \\ 0 & 0 & 1 & 0 \\ \Delta x & \Delta y & \Delta z & 1 \end{bmatrix} \times$$

$$\begin{bmatrix} 1 & 0 & 0 & 0 \\ 0 & 1 & 0 & 0 \\ 0 & 0 & 1 & 0 \\ 0 & 0 & 0 & S \end{bmatrix} \times \begin{bmatrix} 1 & 0 & 0 & 0 \\ 0 & 1 & 0 & 0 \\ 0 & 0 & 1 & -1/D \\ 0 & 0 & 0 & 1 \end{bmatrix} \times \begin{bmatrix} x_P \\ y_P \\ z_P \\ 1 \end{bmatrix}$$

$$\begin{bmatrix} x_N \\ y_N \\ z_N \\ 1 \end{bmatrix} = \begin{bmatrix} \cos\psi\cos\theta & \cos\psi\sin\theta & -\sin\psi & 0 \\ \sin\phi\sin\psi\cos\theta - \cos\phi\sin\theta & \sin\phi\sin\psi\sin\theta + \cos\phi\cos\theta & \sin\phi\cos\psi & 0 \\ \cos\phi\sin\psi\cos\phi + \sin\phi\sin\theta & \cos\phi\sin\psi\sin\theta - \sin\phi\cos\theta & \cos\phi\cos\psi & 0 \\ 0 & 0 & 0 & 1 \end{bmatrix} \times$$

$$\begin{bmatrix} 1 & 0 & 0 & 0 \\ 0 & 1 & 0 & 0 \\ 0 & 0 & 1 & 0 \\ \Delta x & \Delta y & \Delta z & S \end{bmatrix} \times \begin{bmatrix} 1 & 0 & 0 & 0 \\ 0 & 1 & 0 & 0 \\ 0 & 0 & 1 & -1/D \\ 0 & 0 & 0 & 1 \end{bmatrix} \times \begin{bmatrix} x_P \\ y_P \\ z_P \\ 1 \end{bmatrix}$$

$$\begin{bmatrix} x_N \\ y_N \\ z_N \\ 1 \end{bmatrix} = \begin{bmatrix} \cos\psi\cos\theta & \cos\psi\sin\theta & 0 & \sin\psi/D \\ \sin\phi\sin\psi\cos\theta - \cos\phi\sin\theta & \sin\phi\sin\psi\sin\theta + \cos\phi\cos\theta & 0 & -\sin\phi\cos\psi/D \\ \cos\phi\sin\psi\cos\theta + \sin\phi\sin\theta & \cos\phi\sin\psi\sin\theta - \sin\phi\cos\theta & 0 & \cos\phi\cos\psi/D \\ 0 & 0 & 0 & S \end{bmatrix} \times \begin{bmatrix} x_P \\ y_P \\ z_P \\ 1 \end{bmatrix}$$

$$x_N = (\cos\psi\cos\theta)x_P + (\sin\phi\sin\psi\cos\theta)y_P - (\cos\phi\sin\theta)y_P + (\cos\phi\sin\psi\cos\theta)z_P + (\sin\phi\sin\theta)z_P + \Delta x/S$$

$$y_N = (\cos\psi\sin\theta)x_P + (\sin\phi\sin\psi\sin\theta)y_P + (\cos\phi\cos\theta)y_P + (\cos\phi\sin\psi\sin\theta)z_P + (\sin\phi\cos\theta)z_P + \Delta y/S$$

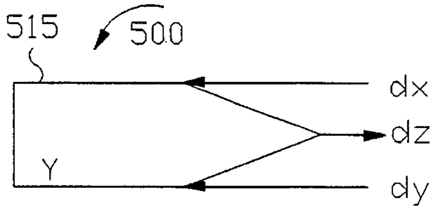
FIG 5I
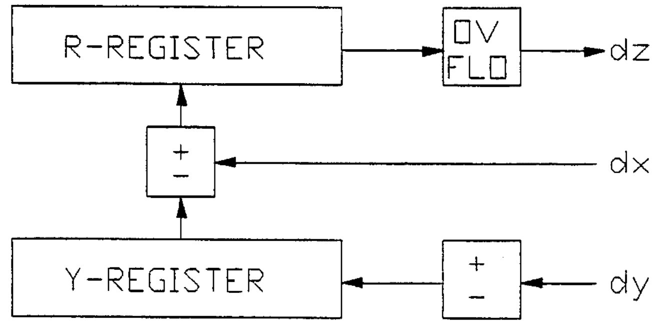
FIG 5J
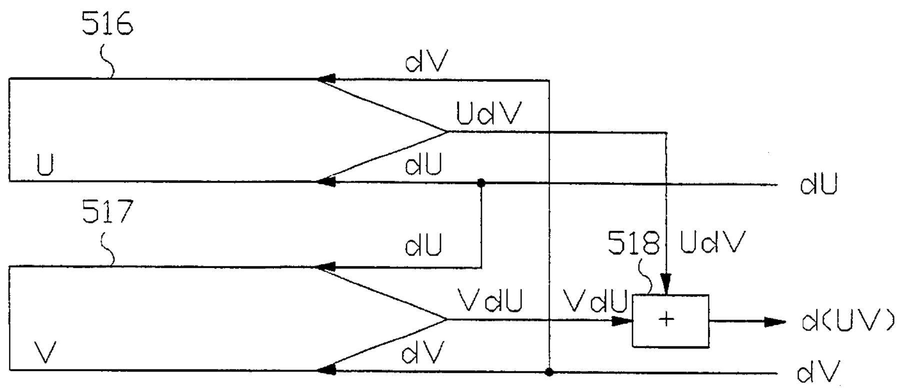
FIG 5K INCREMENTAL MULTIPLIER
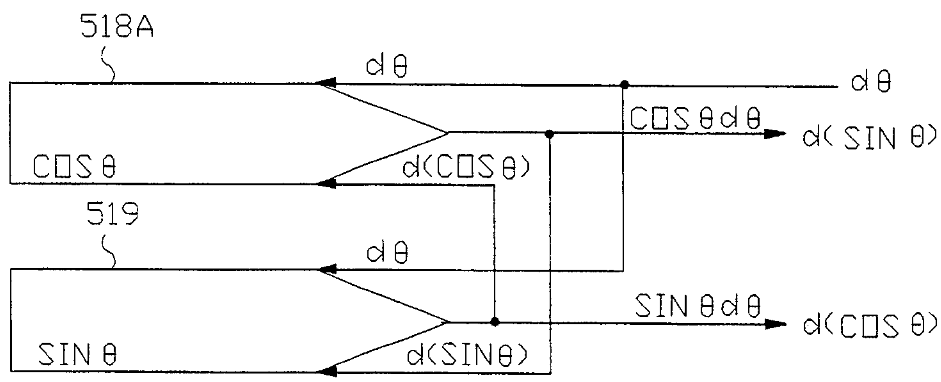
FIG 5L INCREMENTAL SIN/COS GENERATOR
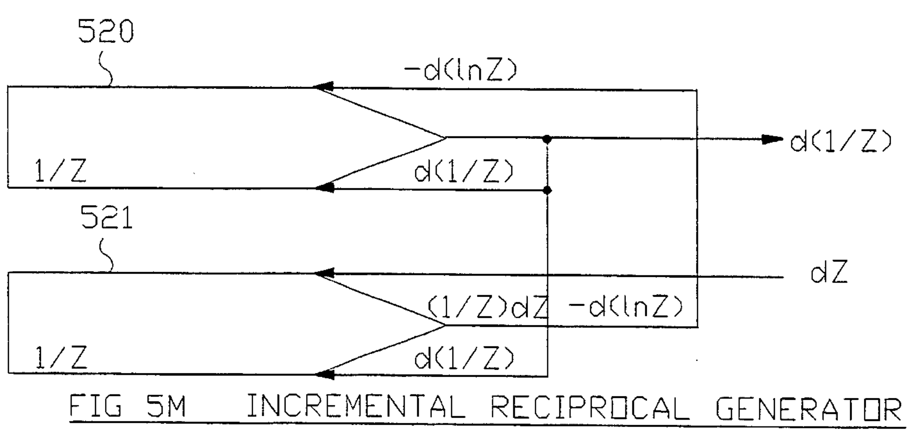
FIG 5M INCREMENTAL RECIPROCAL GENERATOR

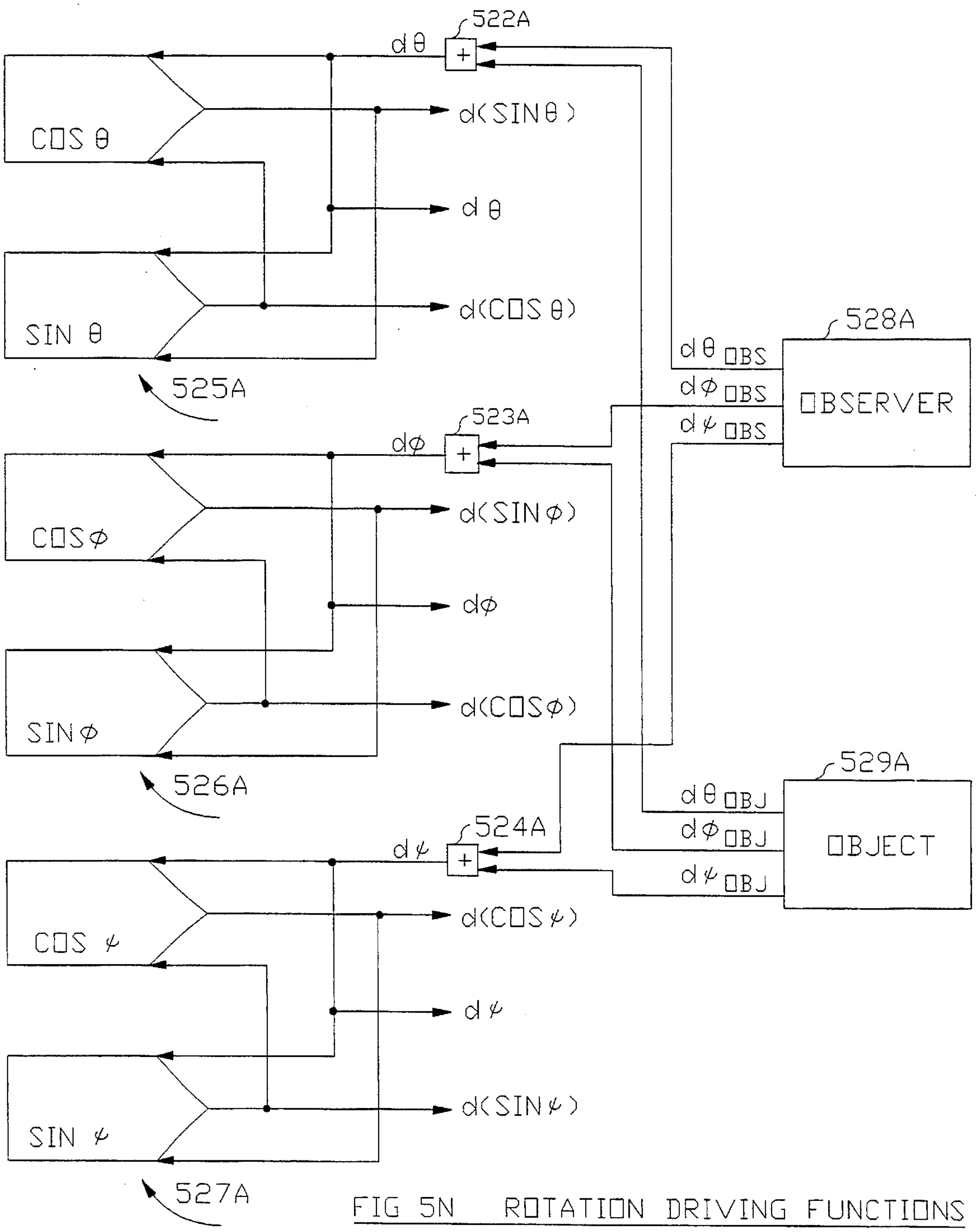
FIG 5N ROTATION DRIVING FUNCTIONS

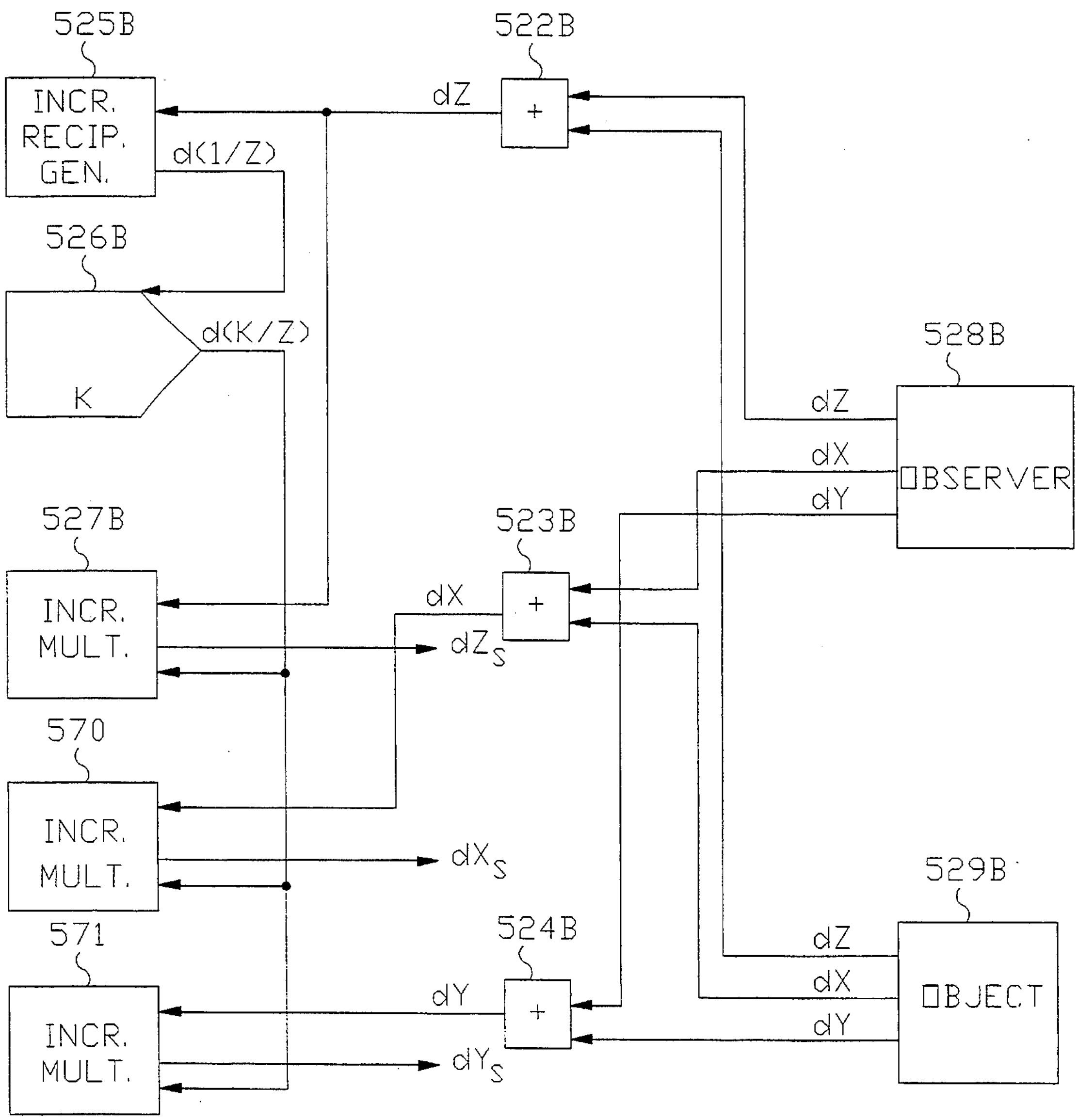
FIG 5S TRANSLATION DRIVING FUNCTIONS

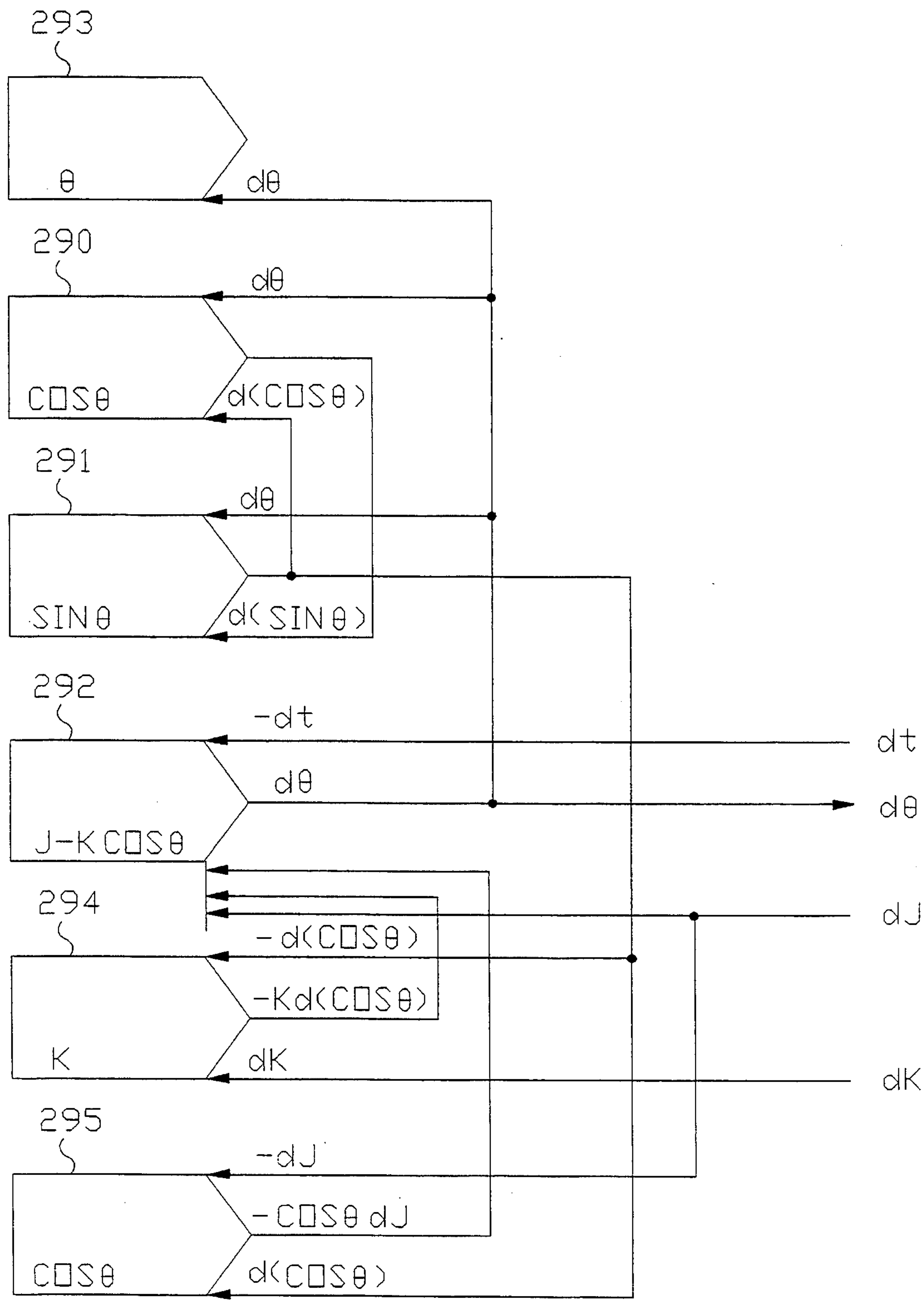
FIG 5T INCREMENTAL ARC - COS GENERATOR

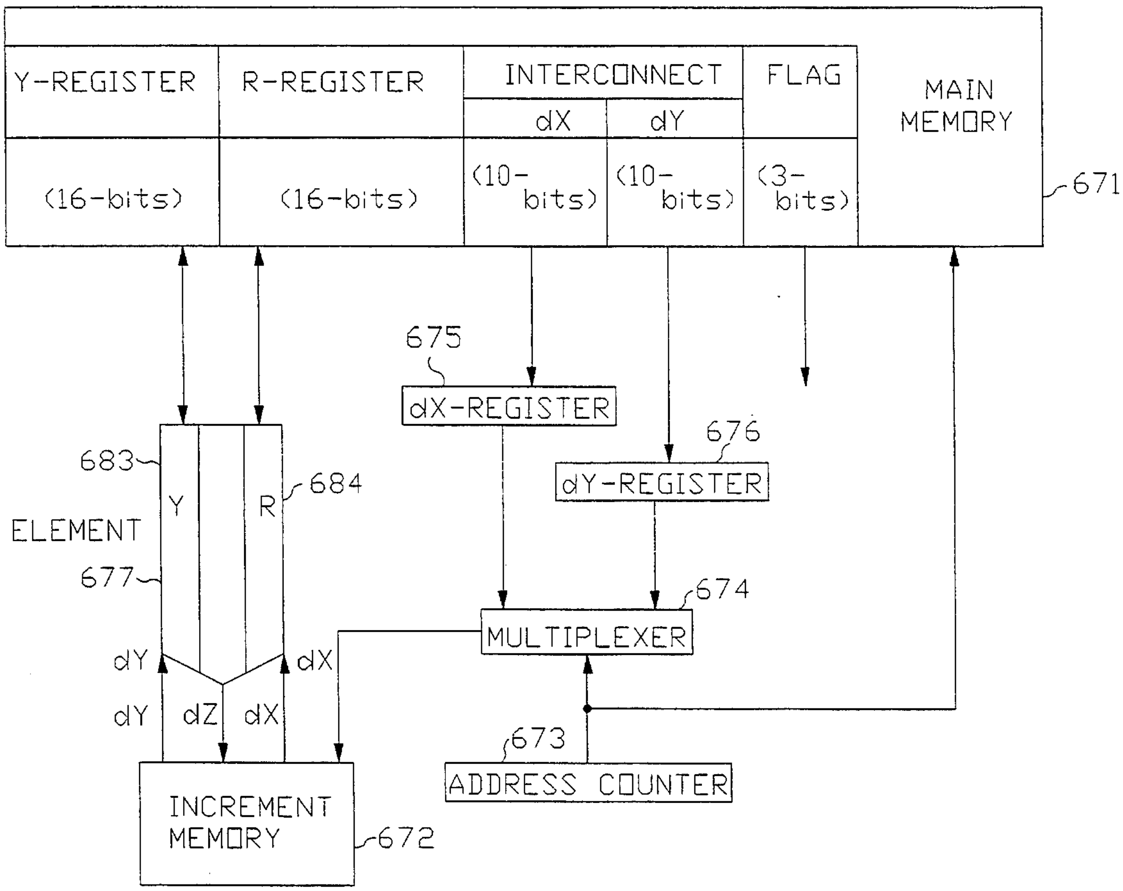
FIG 6 SERIAL COMPUTATION INCREMENTAL PROCESSOR

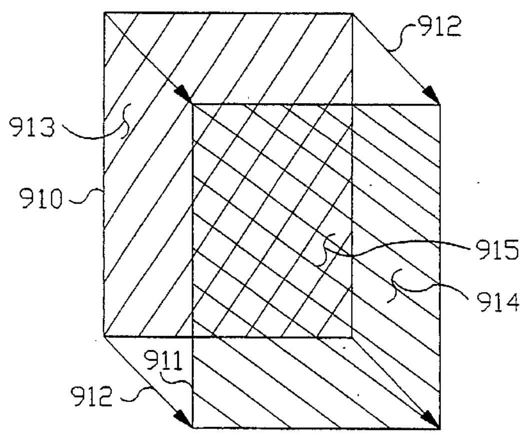
FIG 9A
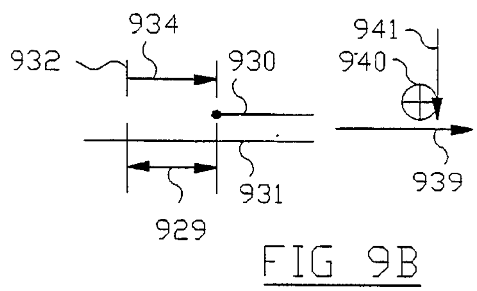
FIG 9B
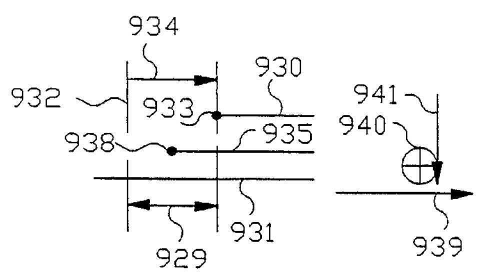
FIG 9C
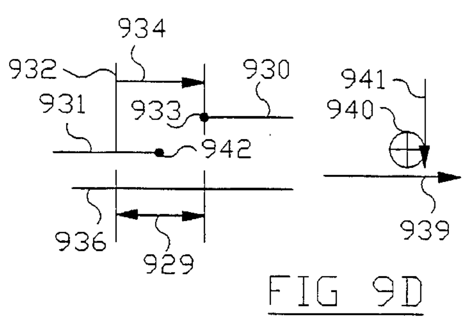
FIG 9D
FIG 9E
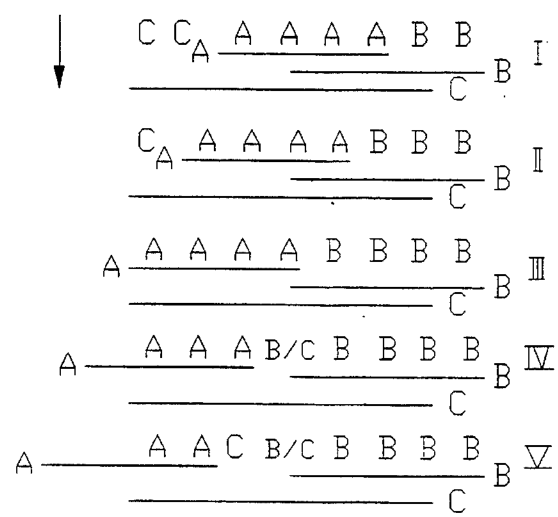
FIG 9F
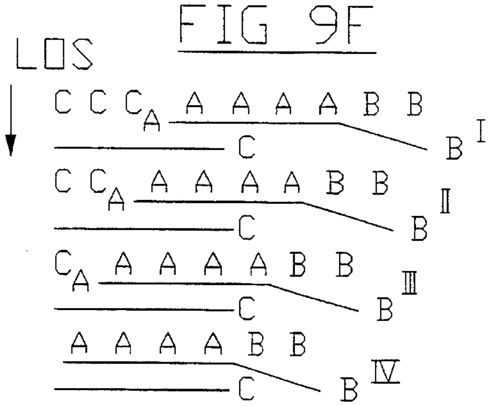
FIG 9G
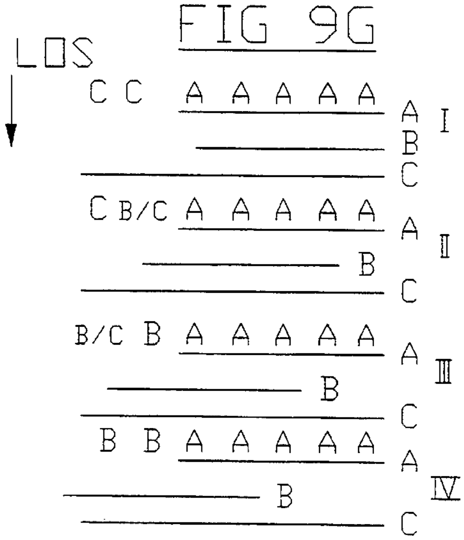

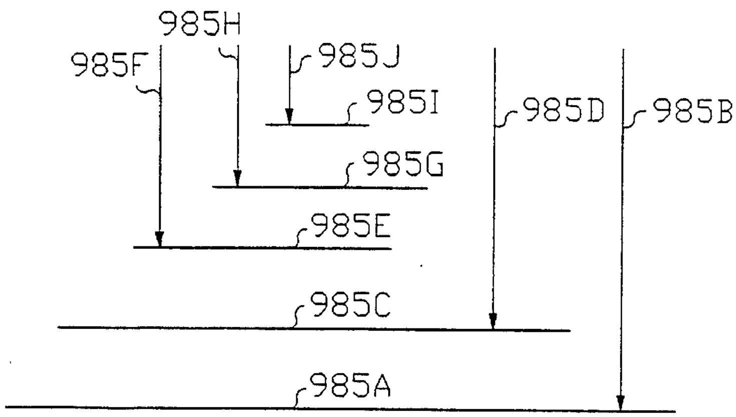
FIG 9K
| | | | | | | | | |
|---|---|---|---|---|---|---|---|---|
| F0 | F1 | F2 | F0 | F1 | F2 | F0 | F1 | F2 |
| F7 | F8 | F3 | F7 | F8 | F3 | F7 | F8 | F3 |
| F6 | F5 | F4 | F6 | F5 | F4 | F6 | F5 | F4 |
| F0 | F1 | F2 | F0 | F1 | F2 | F0 | F1 | F2 |
| F7 | F8 | F3 | F7 | F8 | F3 | F7 | F8 | F3 |
| F6 | F5 | F4 | F6 | F5 | F4 | F6 | F5 | F4 |
| F0 | F1 | F2 | F0 | F1 | F2 | F0 | F1 | F2 |
| F7 | F8 | F3 | F7 | F8 | F3 | F7 | F8 | F3 |
| F6 | F5 | F4 | F6 | F5 | F4 | F6 | F5 | F4 |
FIG 11F
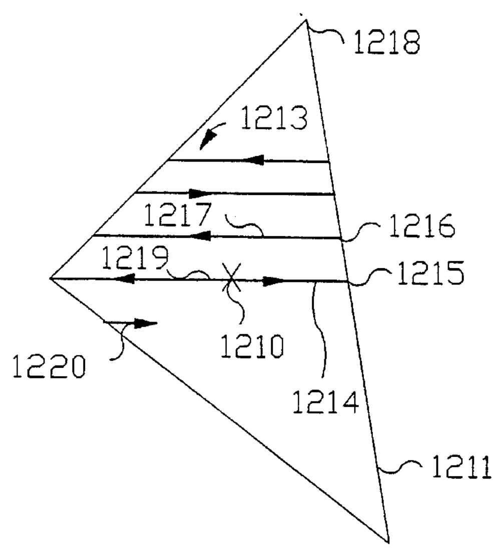
FIG 12

SUBROUTINE UPDATE MIN. ABS. Δ TABLE (AP3B)

FIG 10J INTERSECTION PROCESSING
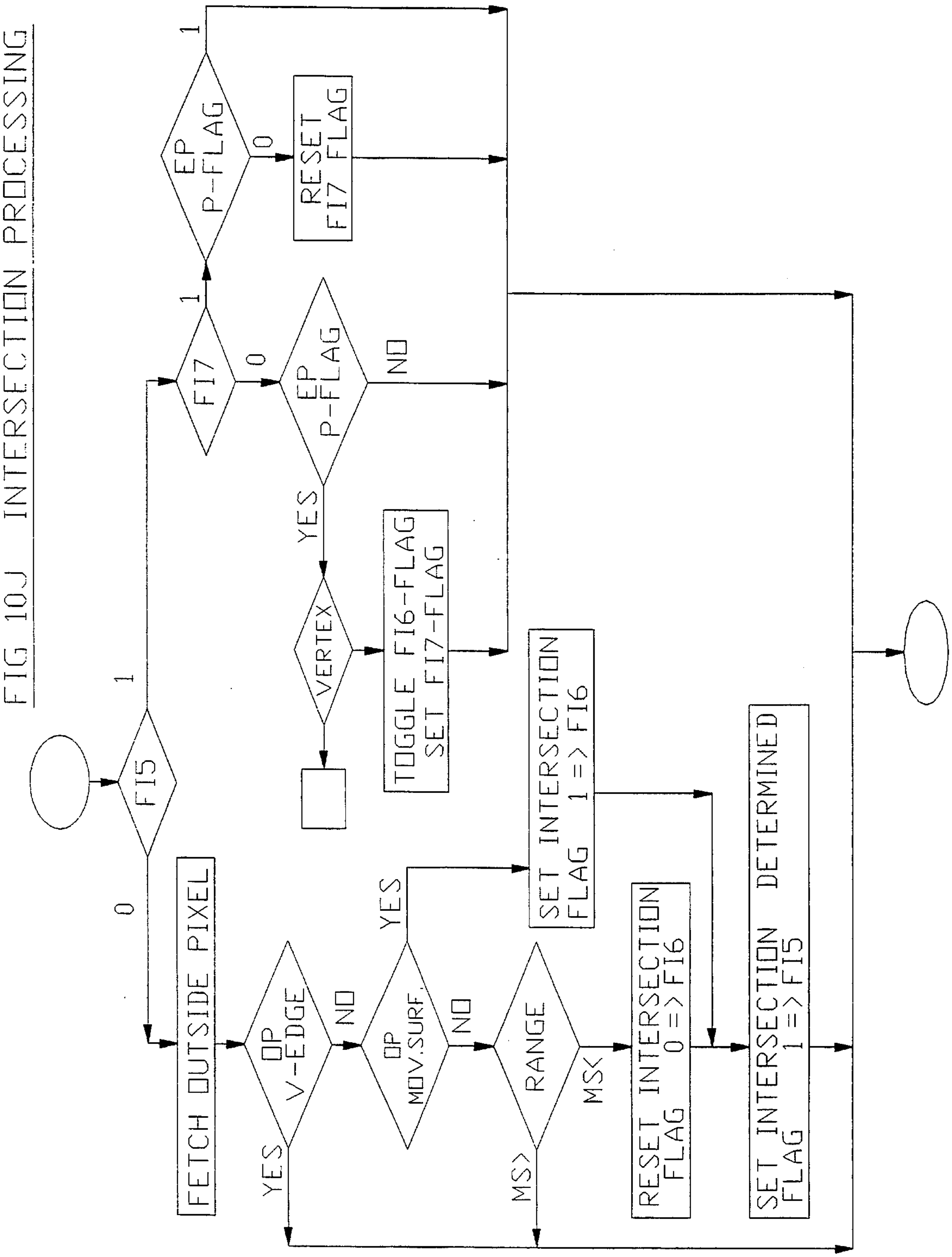

SUB "S" => SIGN BIT
SUB "M" => MAGNITUDE

FIG 10L OCLT SUBROUTINE
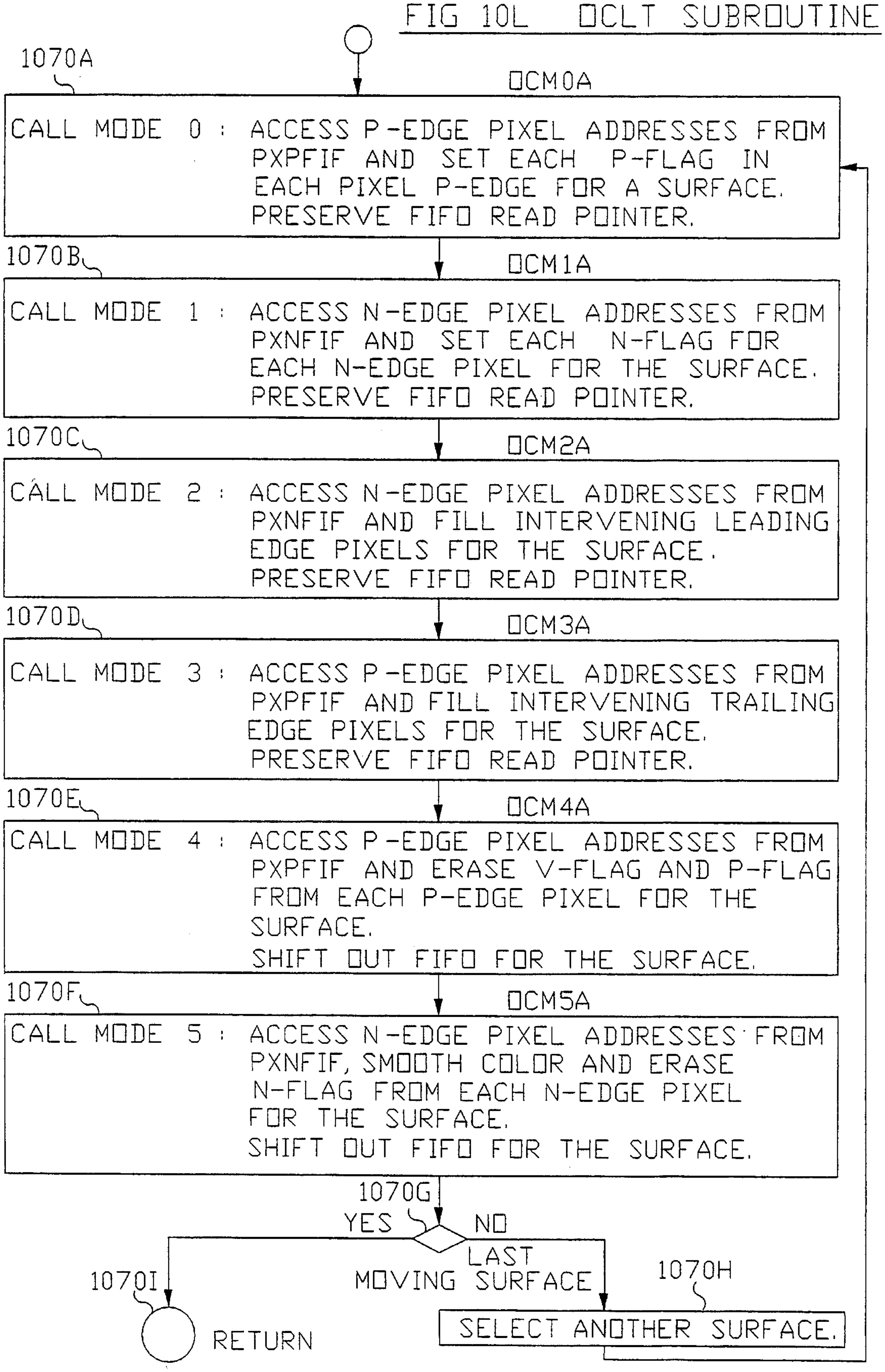

MODE-0 SUBROUTINE

DRAW P-EDGES

MODE-1 SUBROUTINE

DRAW N-EDGES

MODE-2 SUBROUTINE

FILL LEADING EDGE PIXELS

MODE-3 SUBROUTINE

FILL TRAILING EDGE PIXELS

MODE-4 SUBROUTINE
FILL P-EDGE PIXELS

MODE-5 SUBROUTINE
N-EDGE DETERMINATION

ANTISTREAKING PROCESSOR

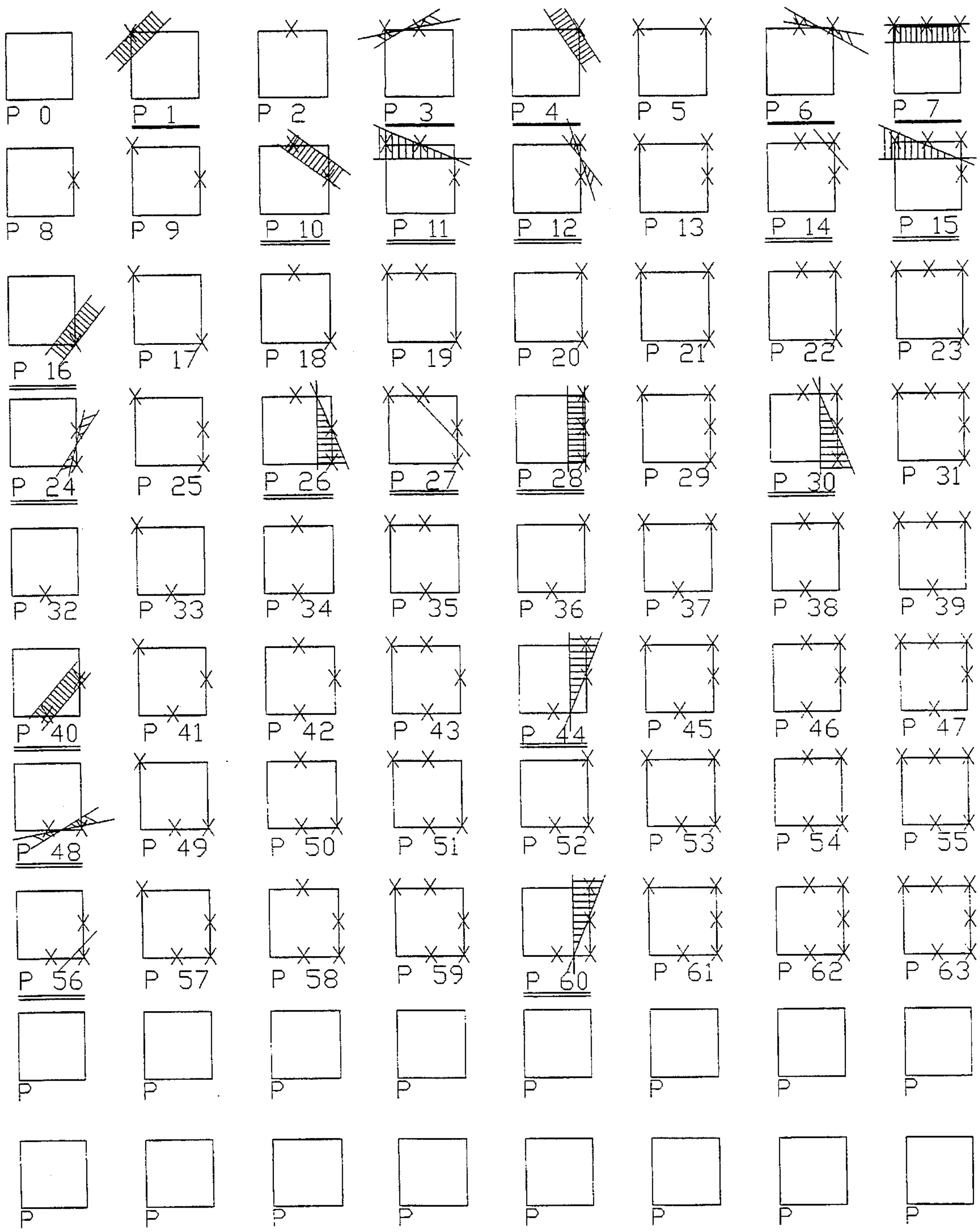
FIG 11I-1 COMPREHENSIVE EDGE SUB-PIXEL TRANSITION DIAGRAMS

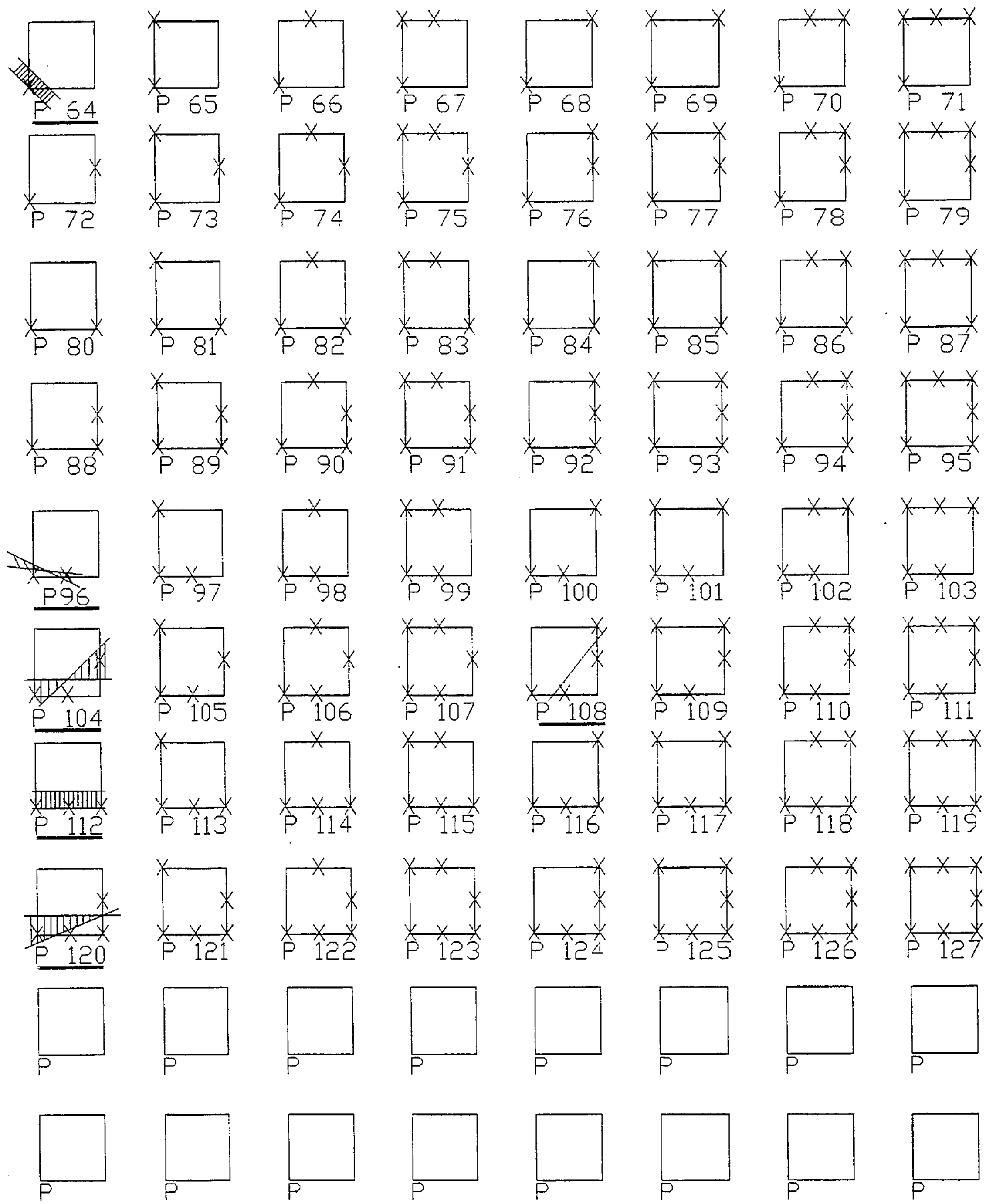
FIG 11I-2 COMPREHENSIVE EDGE SUB-PIXEL TRANSITION DIAGRAMS

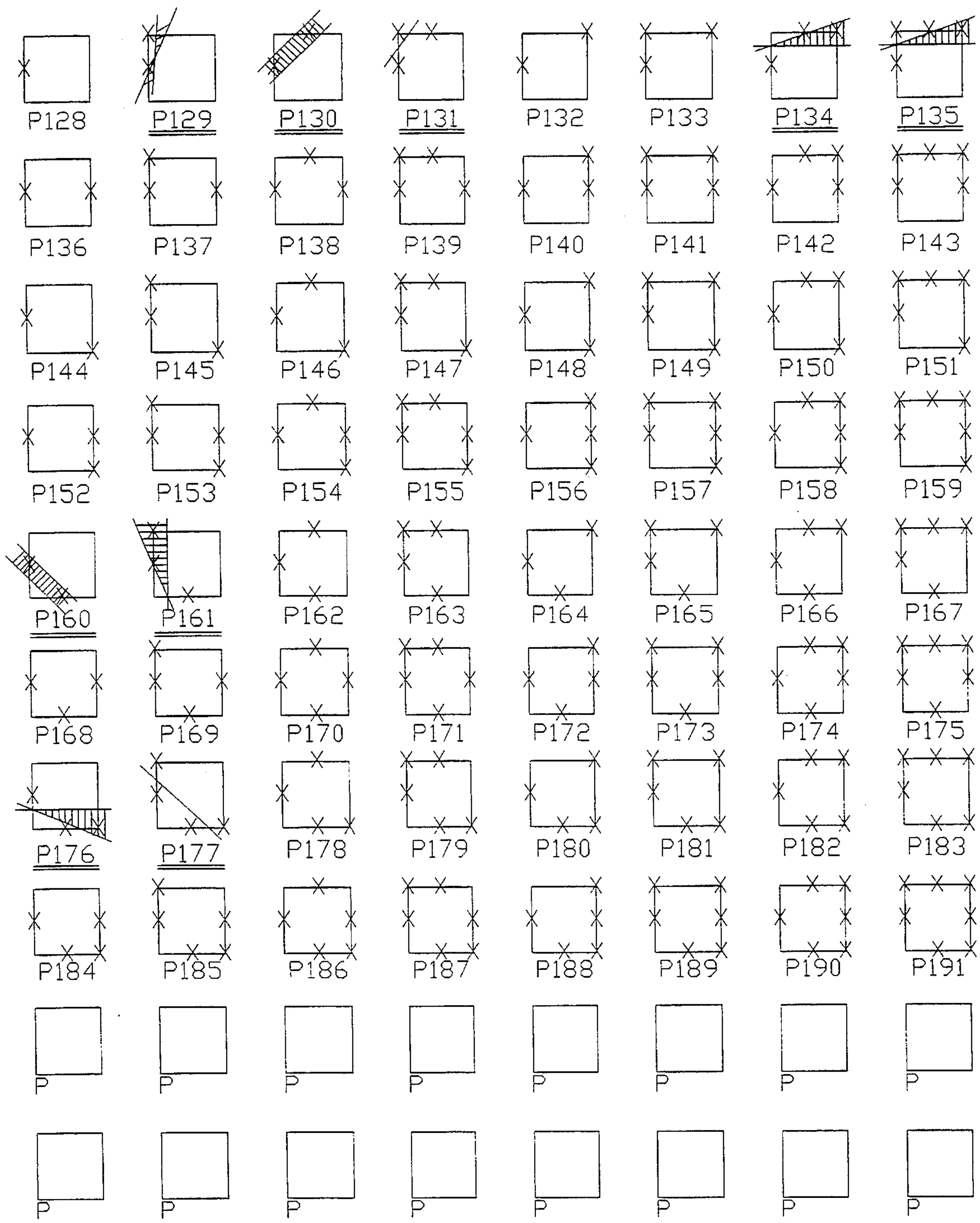
FIG 11I-3 COMPREHENSIVE EDGE SUB-PIXEL TRANSITION DIAGRAMS

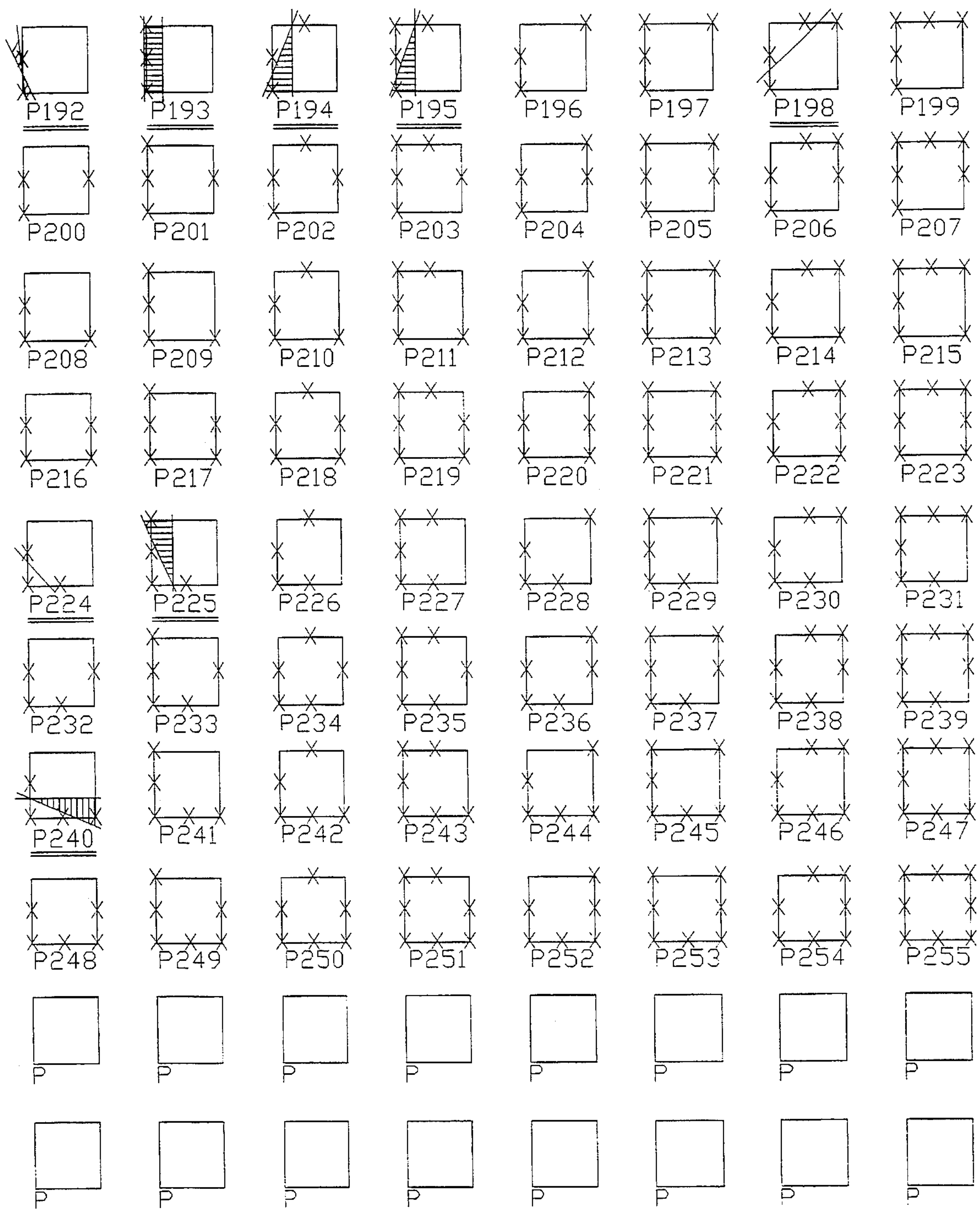
FIG 11I-4 COMPREHENSIVE EDGE SUB-PIXEL TRANSITION DIAGRAMS

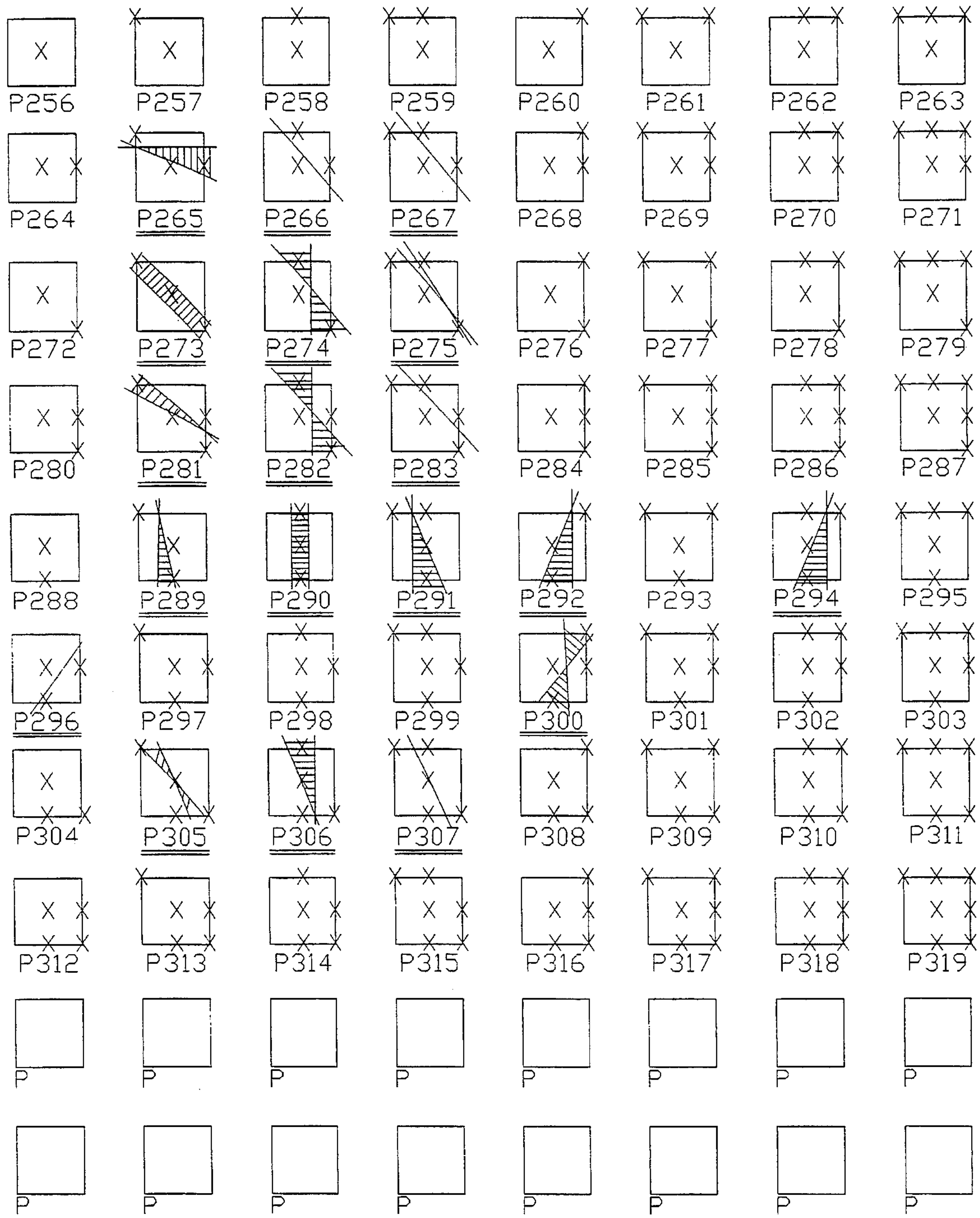
FIG 11I-5 COMPREHENSIVE EDGE SUB-PIXEL TRANSITION DIAGRAMS

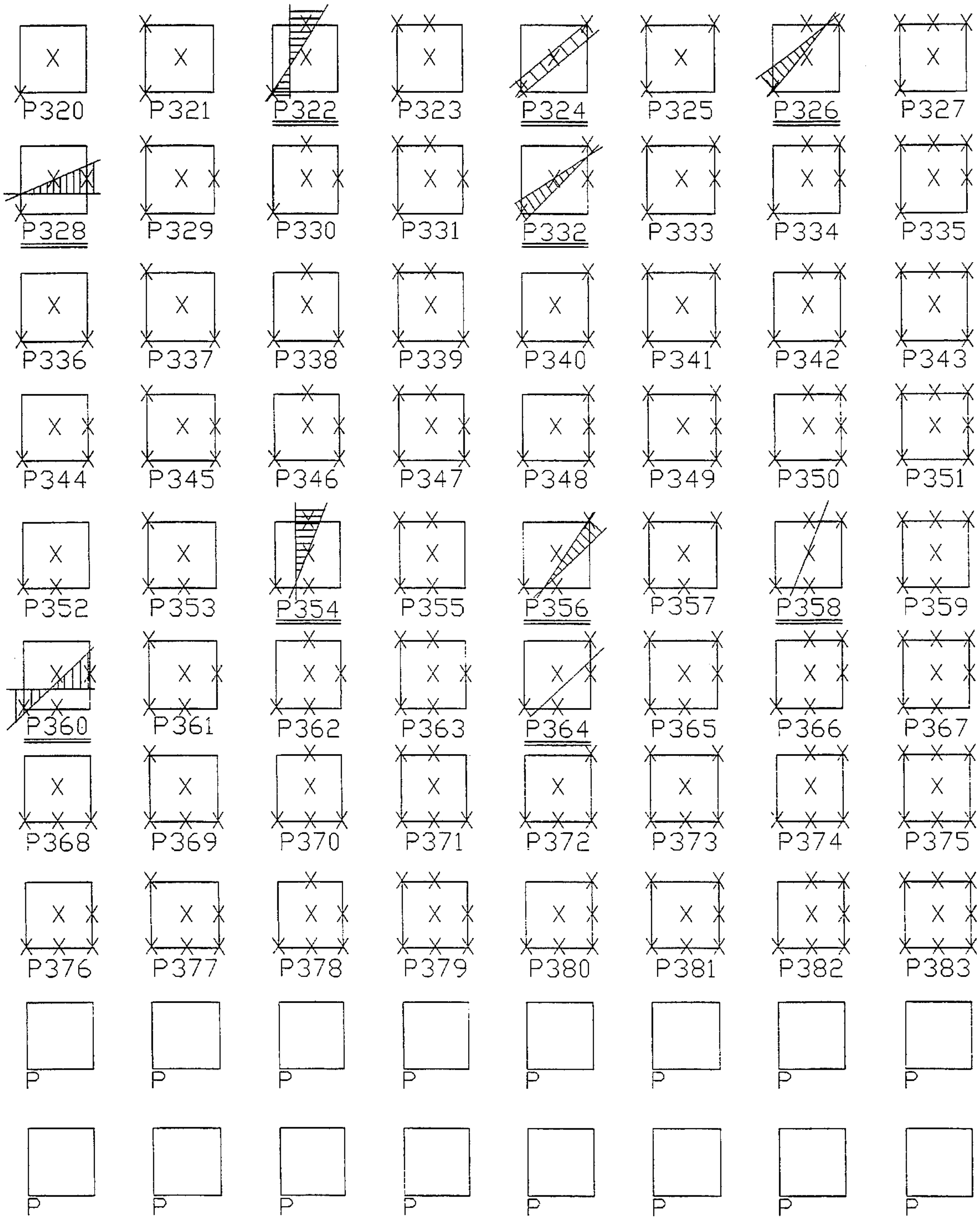
FIG 11I-6 COMPREHENSIVE EDGE SUB-PIXEL TRANSITION DIAGRAMS

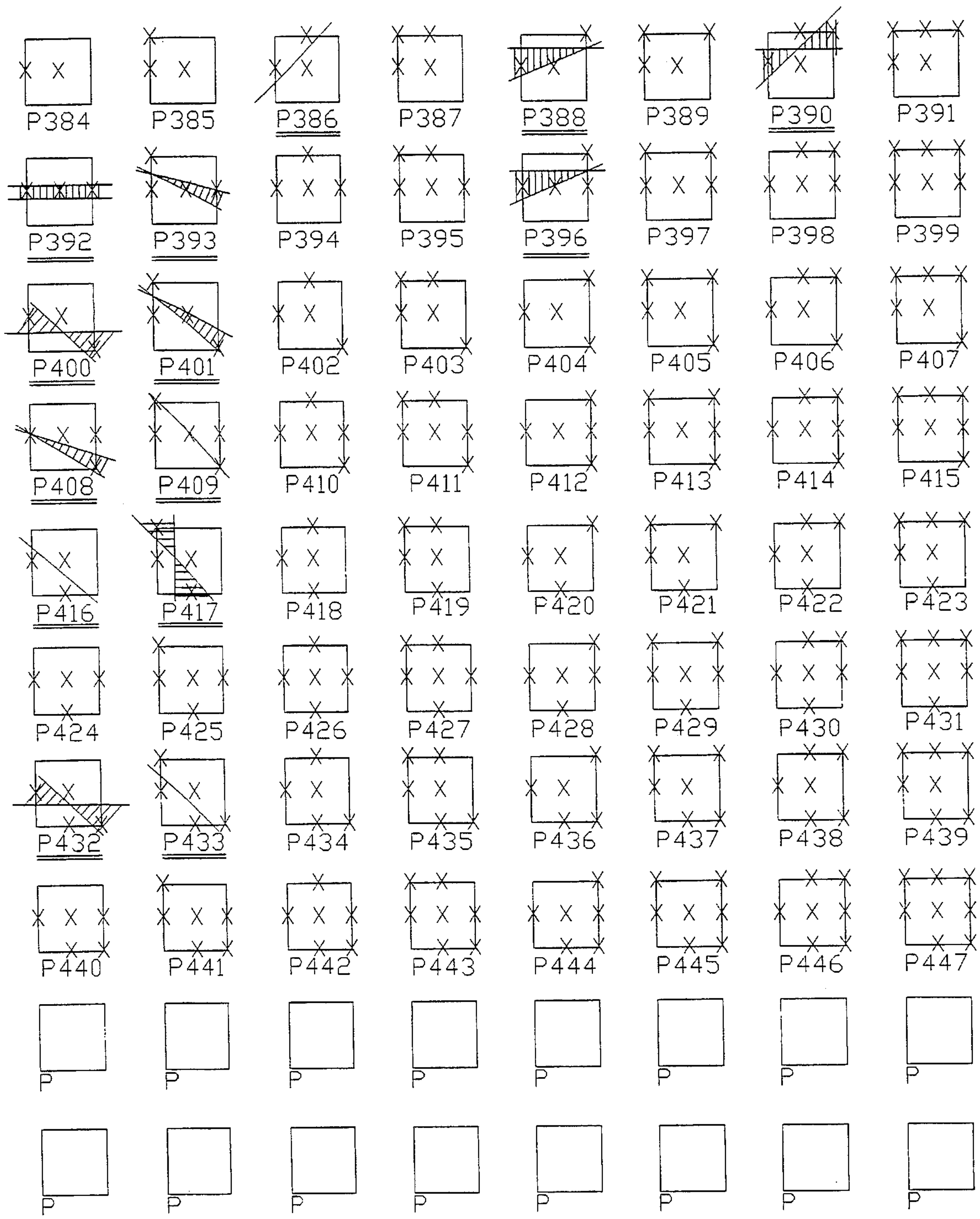
FIG 11I-7 COMPREHENSIVE EDGE SUB-PIXEL TRANSITION DIAGRAMS

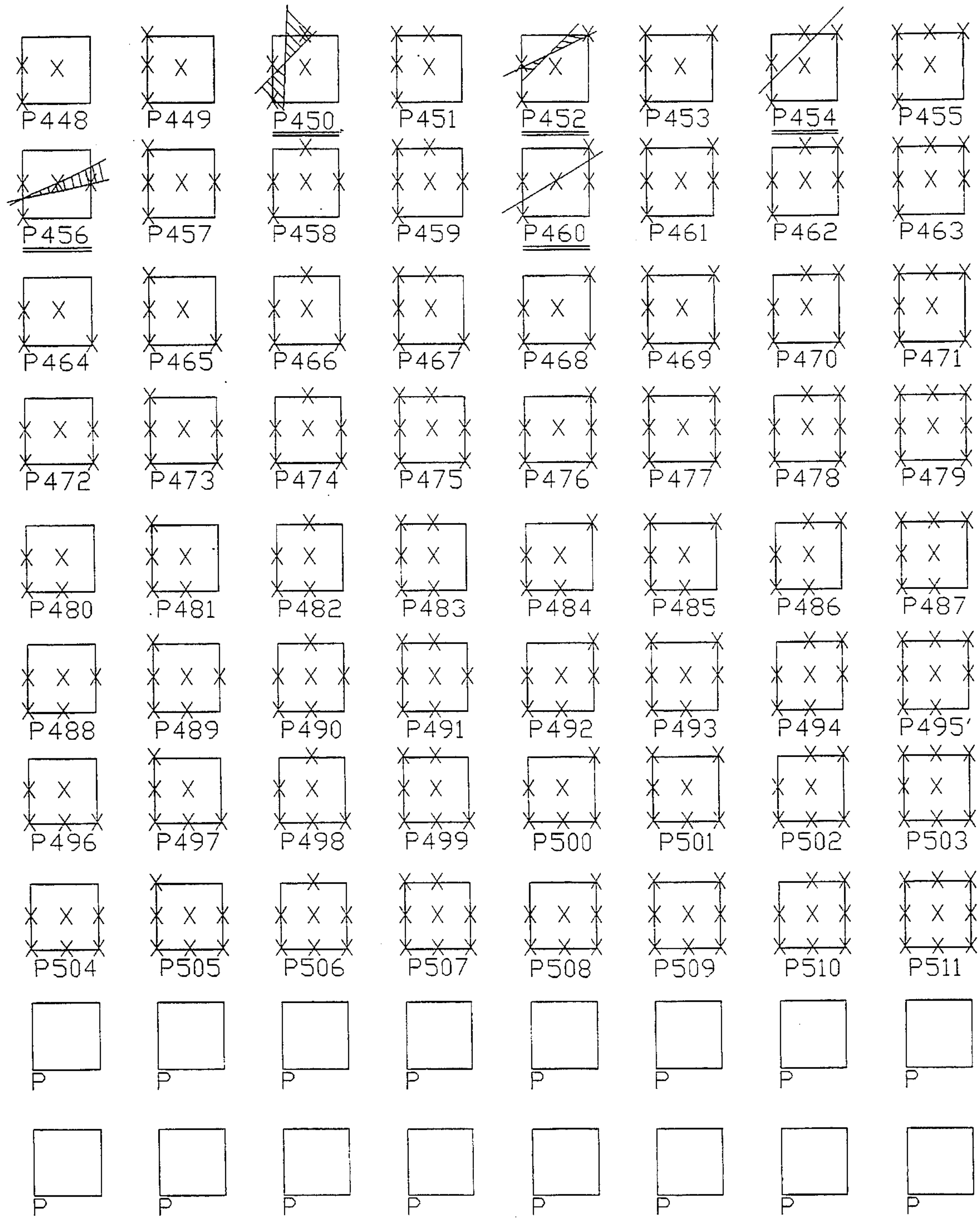
FIG 11I-8 COMPREHENSIVE EDGE SUB-PIXEL TRANSITION DIAGRAMS

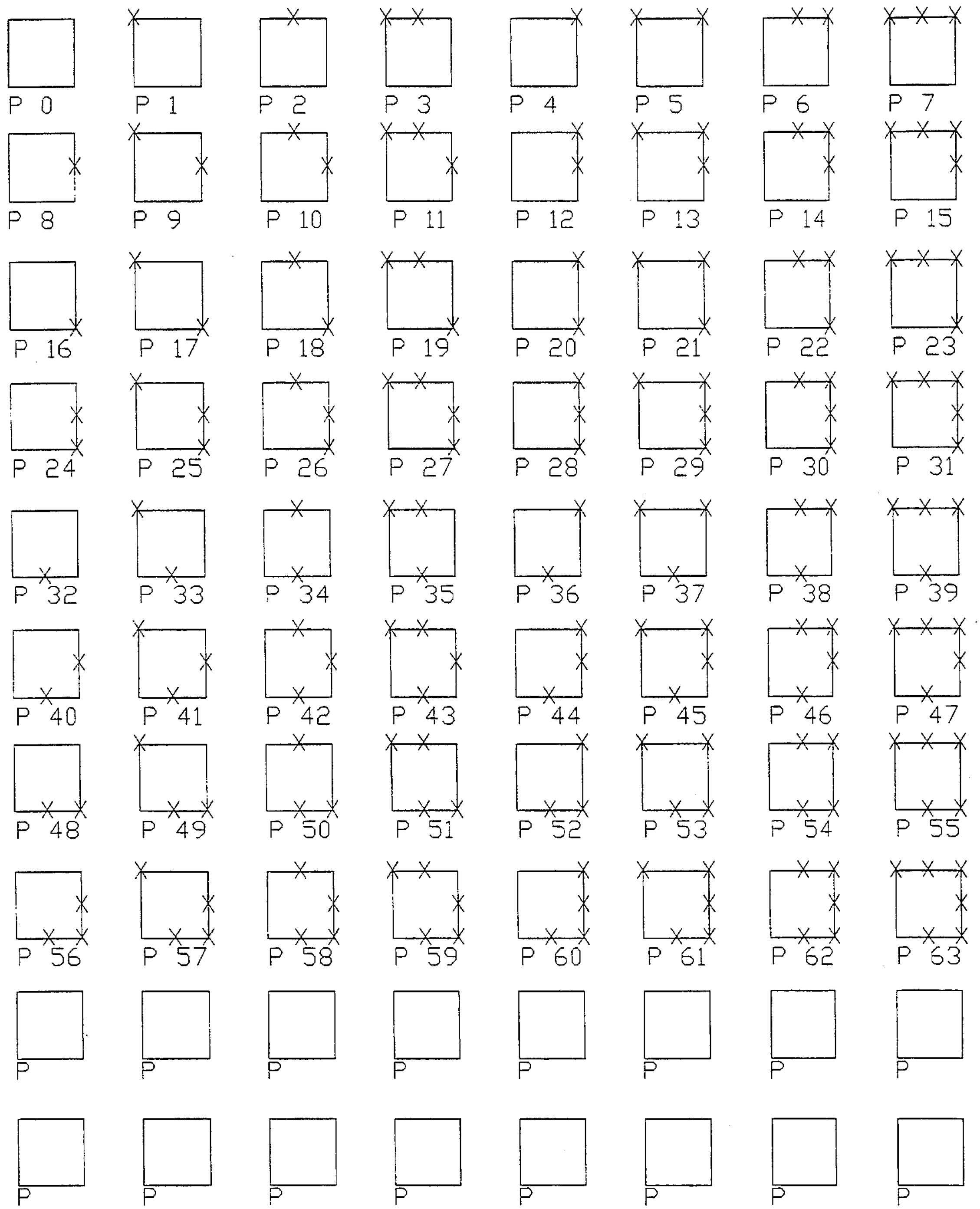
FIG 11J-1 COMPREHENSIVE VERTEX SUB-PIXEL TRANSITION DIAGRAMS

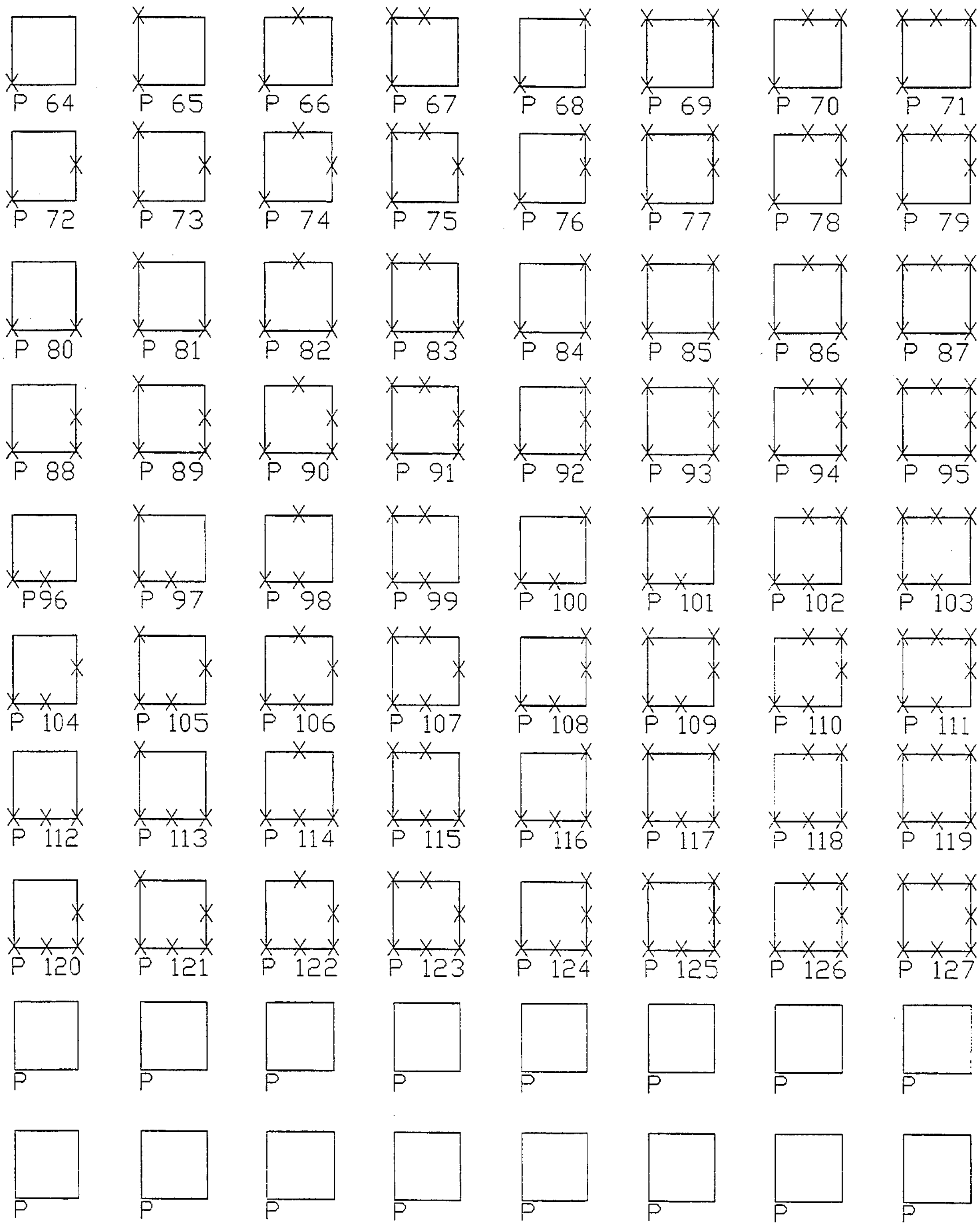
FIG 11J-2 COMPREHENSIVE VERTEX SUB-PIXEL TRANSITION DIAGRAMS

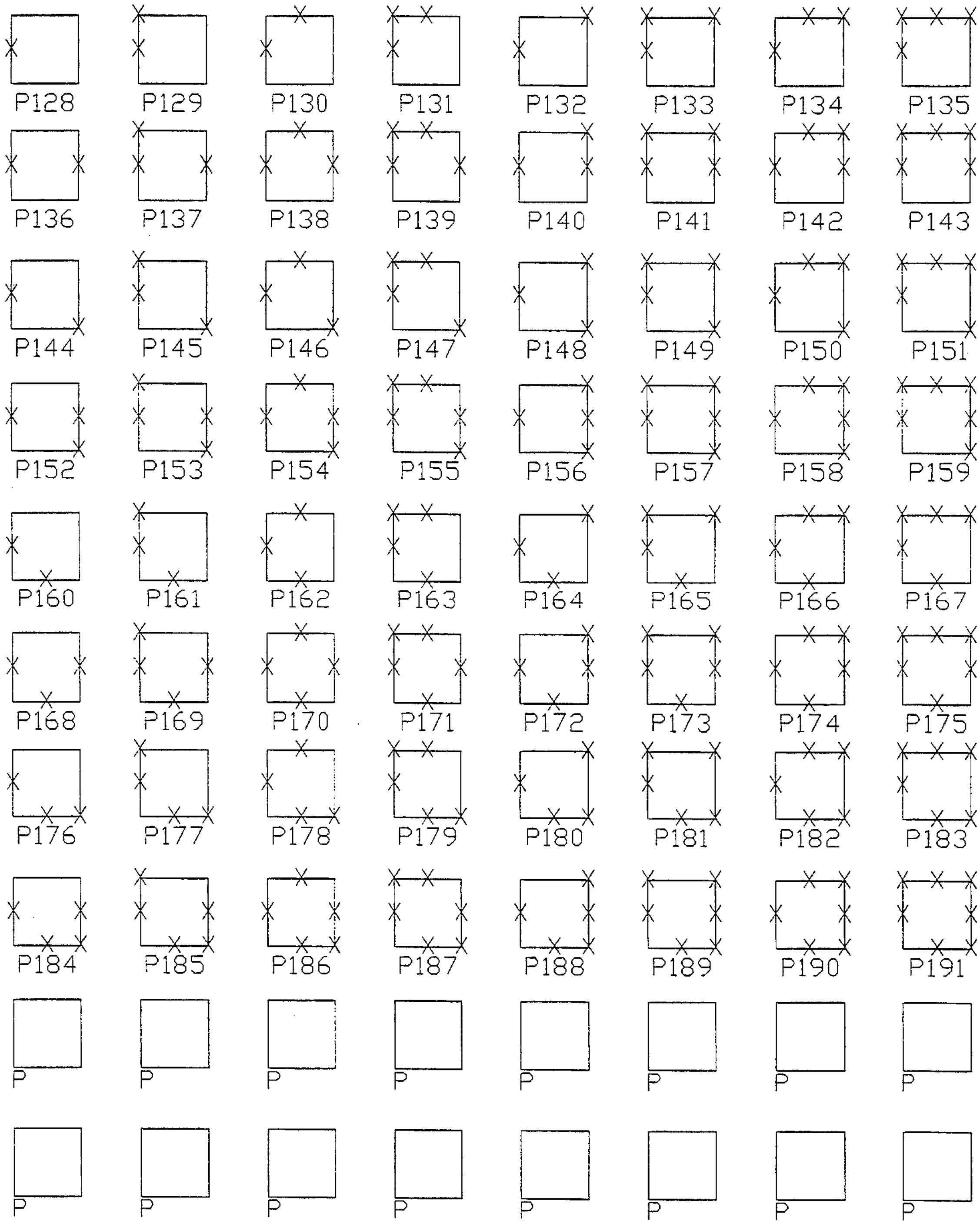
FIG 11J-3 COMPREHENSIVE VERTEX SUB-PIXEL TRANSITION DIAGRAMS

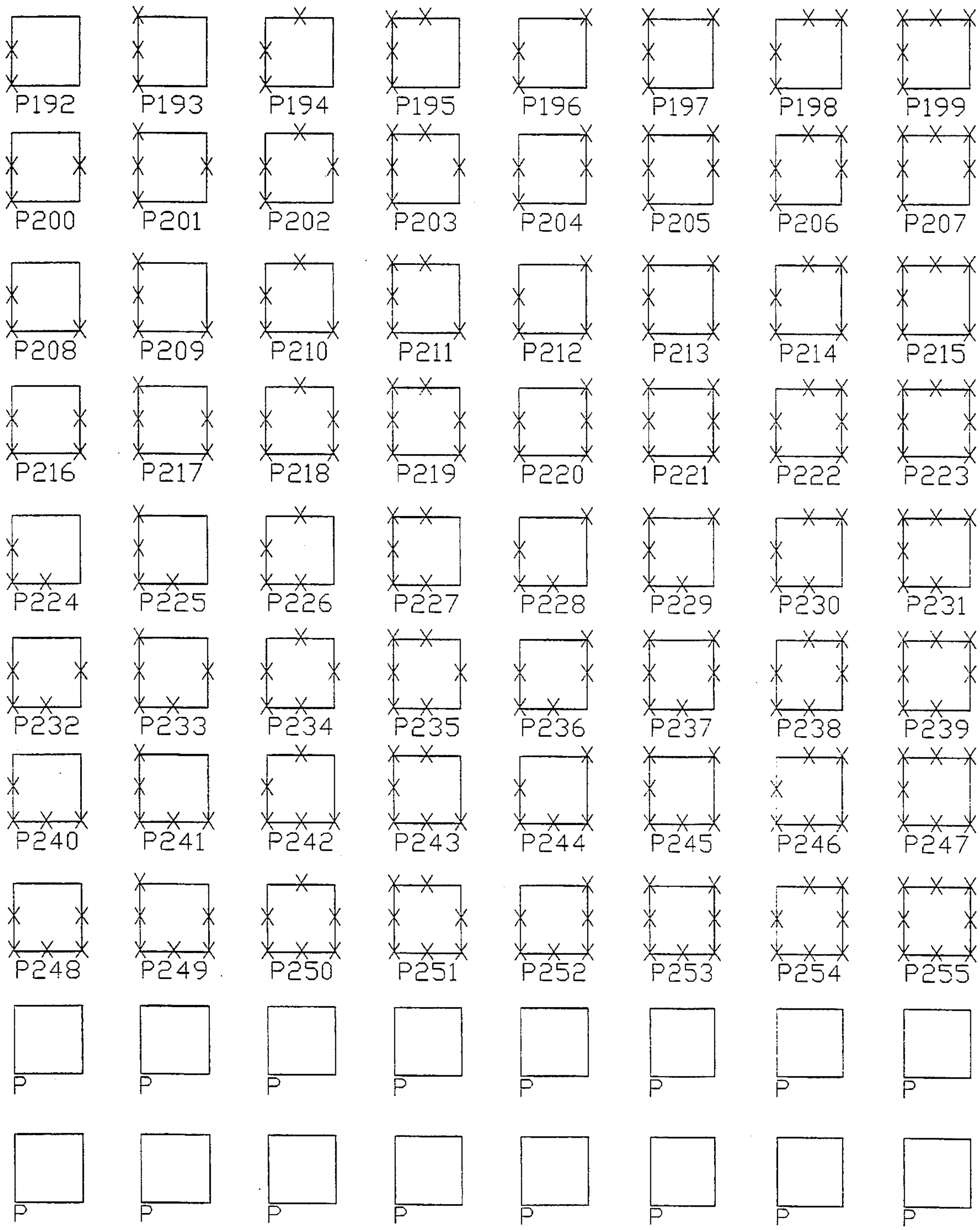
FIG 11J-4 COMPREHENSIVE VERTEX SUB-PIXEL TRANSITION DIAGRAMS

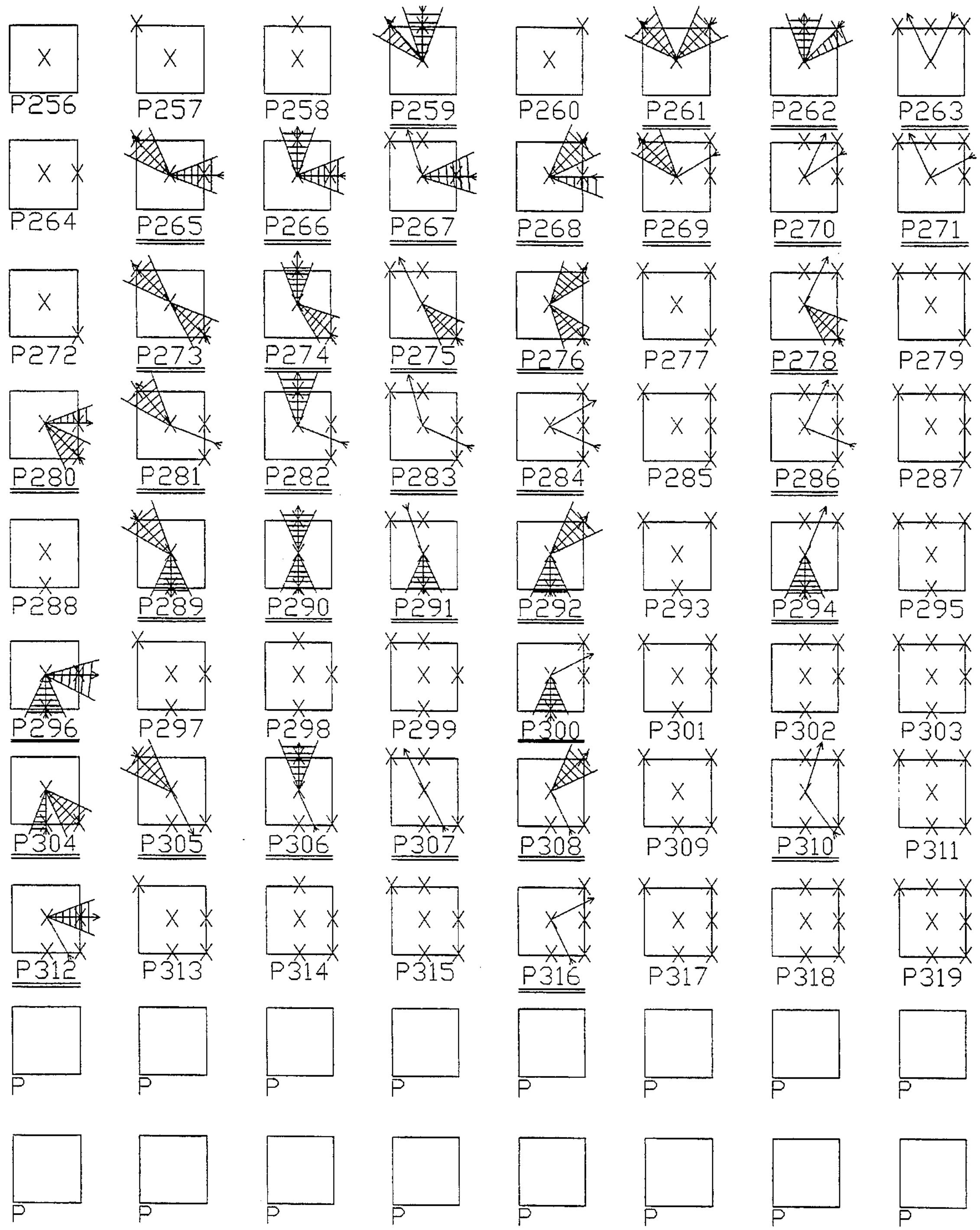
FIG 11J-5 COMPREHENSIVE VERTEX SUB-PIXEL TRANSITION DIAGRAMS

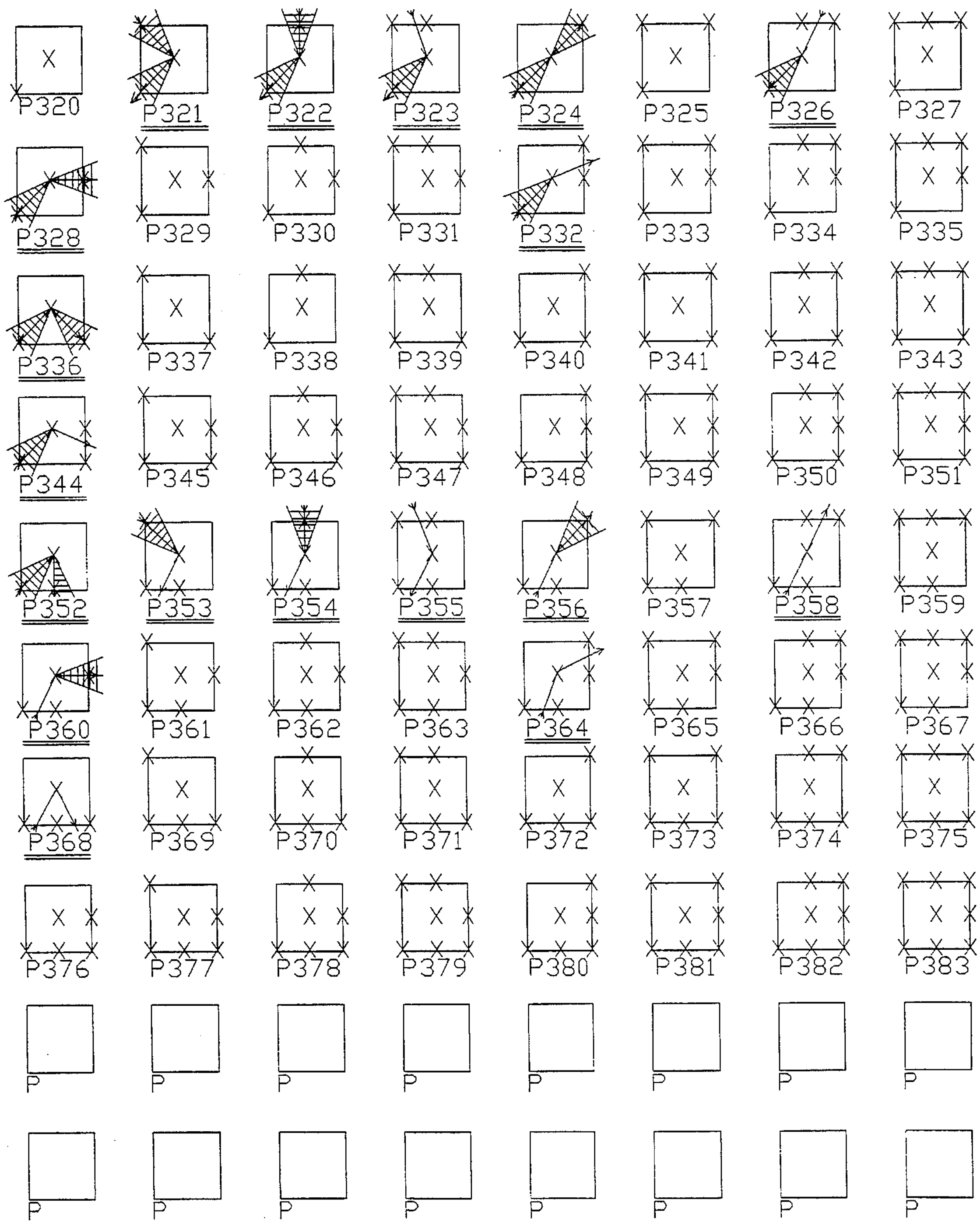
FIG 11J-6 COMPREHENSIVE VERTEX SUB-PIXEL TRANSITION DIAGRAMS

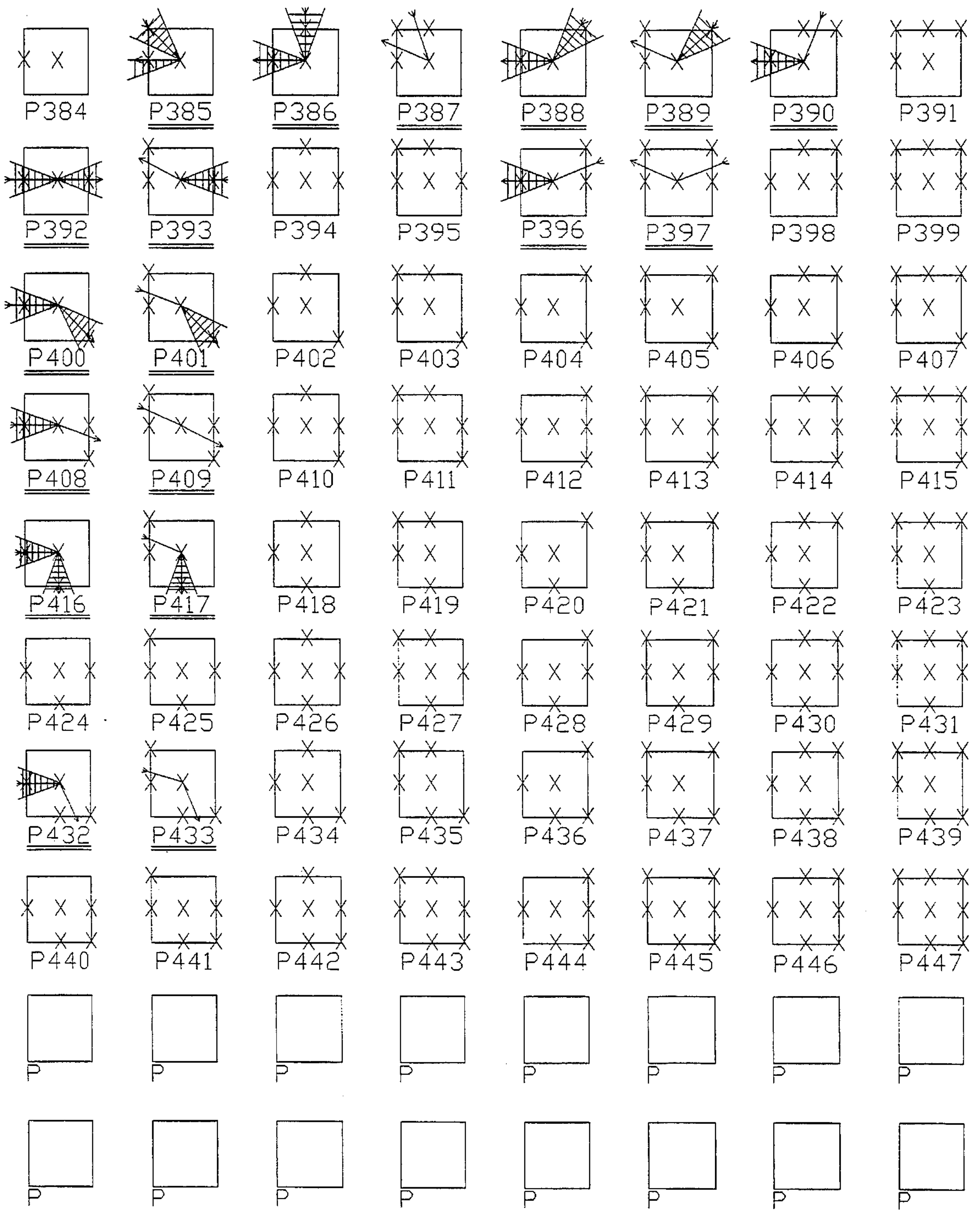
FIG 11J-7 COMPREHENSIVE VERTEX SUB-PIXEL TRANSITION DIAGRAMS

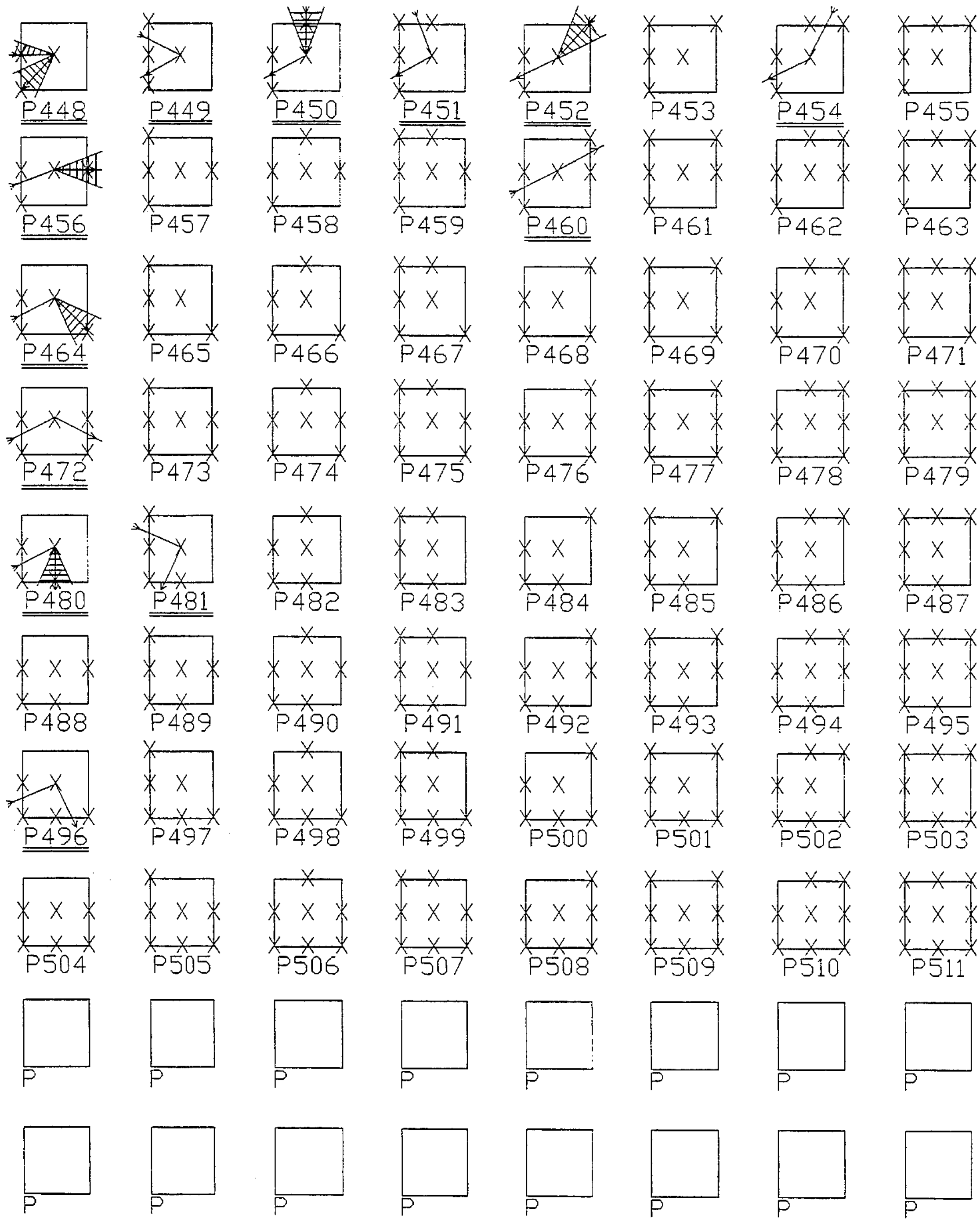
FIG 11J-8 COMPREHENSIVE VERTEX SUB-PIXEL TRANSITION DIAGRAMS

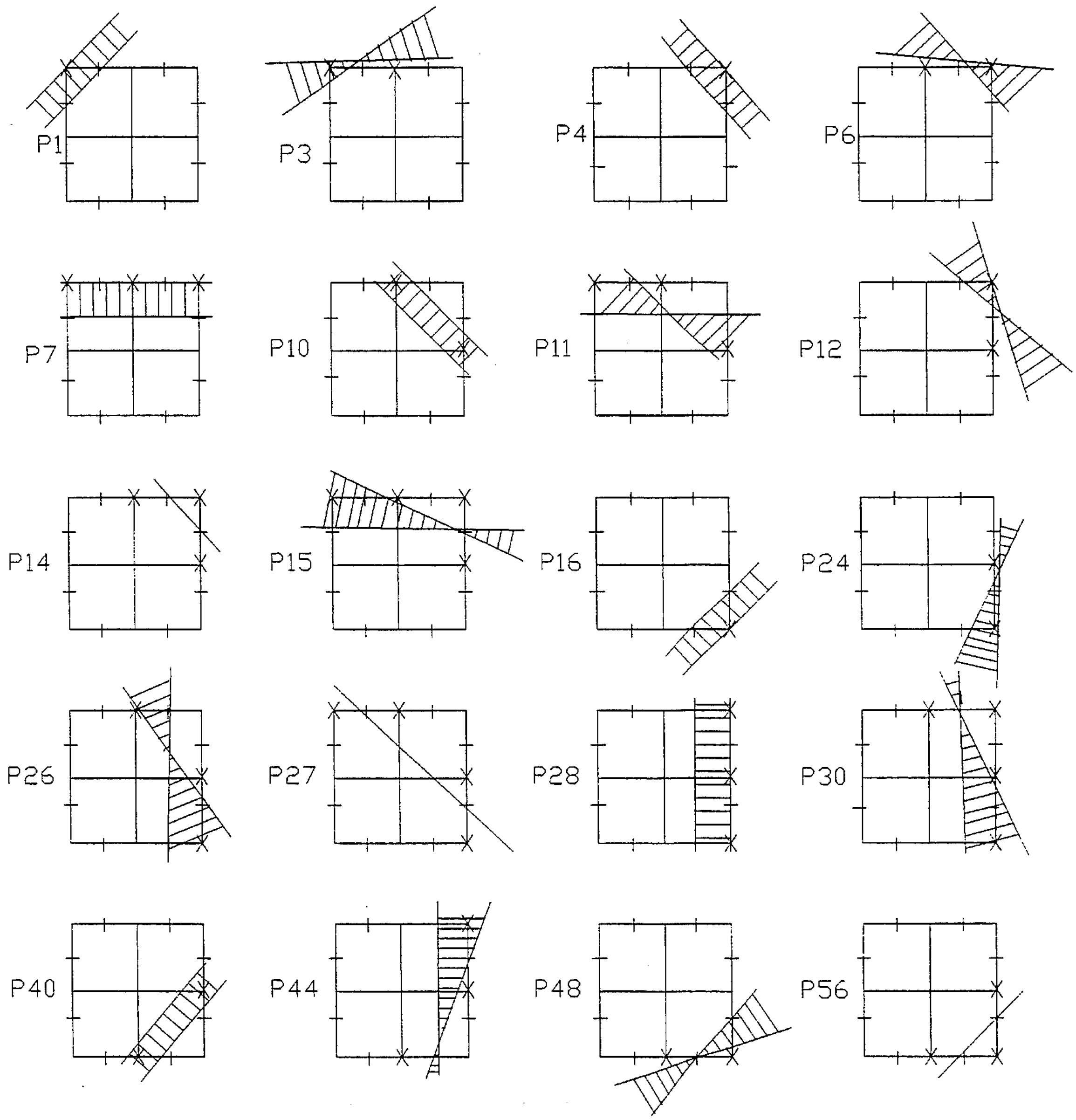
FIG 11K-1 DETAILED EDGE SUB-PIXEL TRANSITION DIAGRAMS

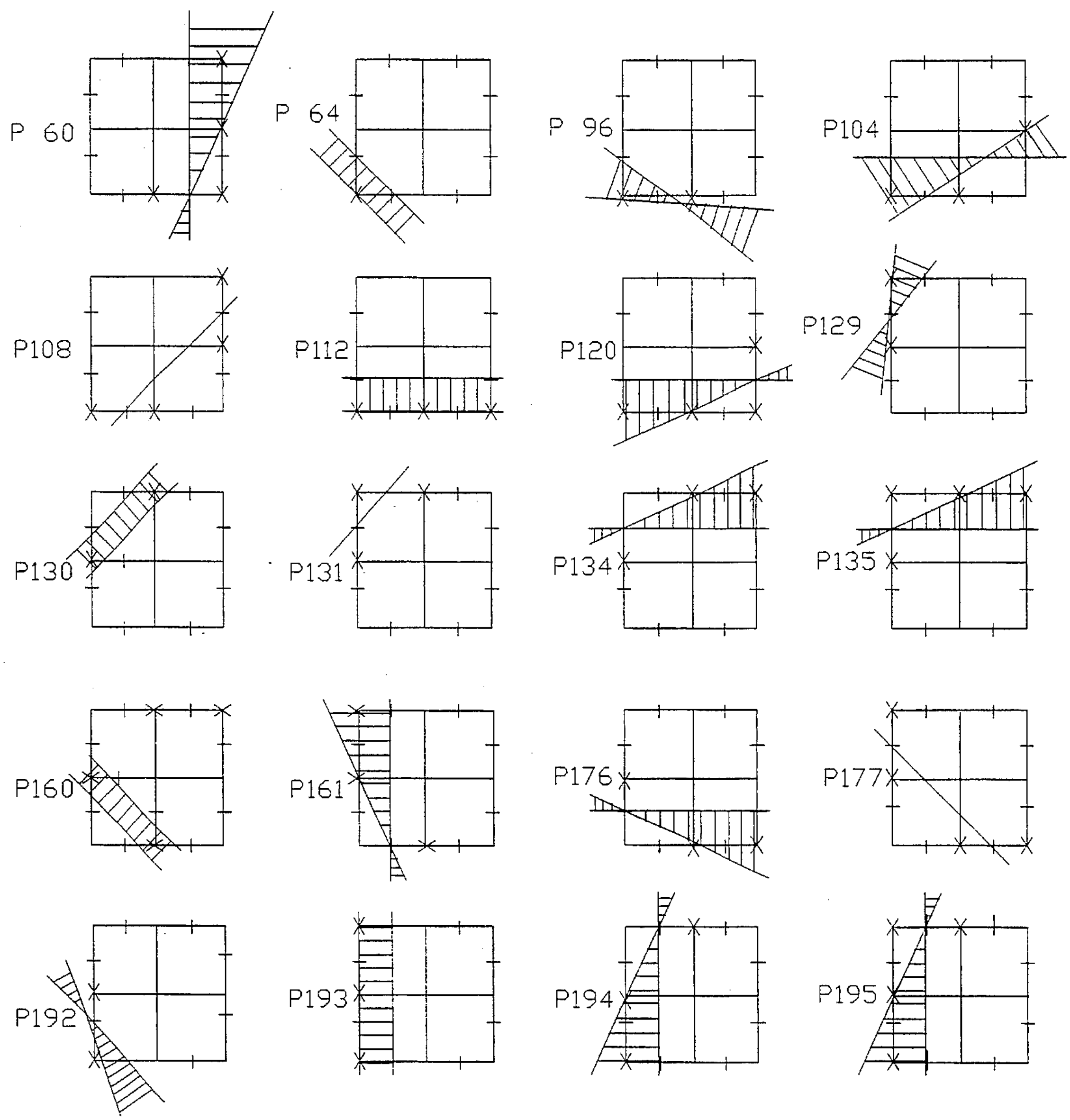
FIG 11K-2 DETAILED EDGE SUB-PIXEL TRANSITION DIAGRAMS

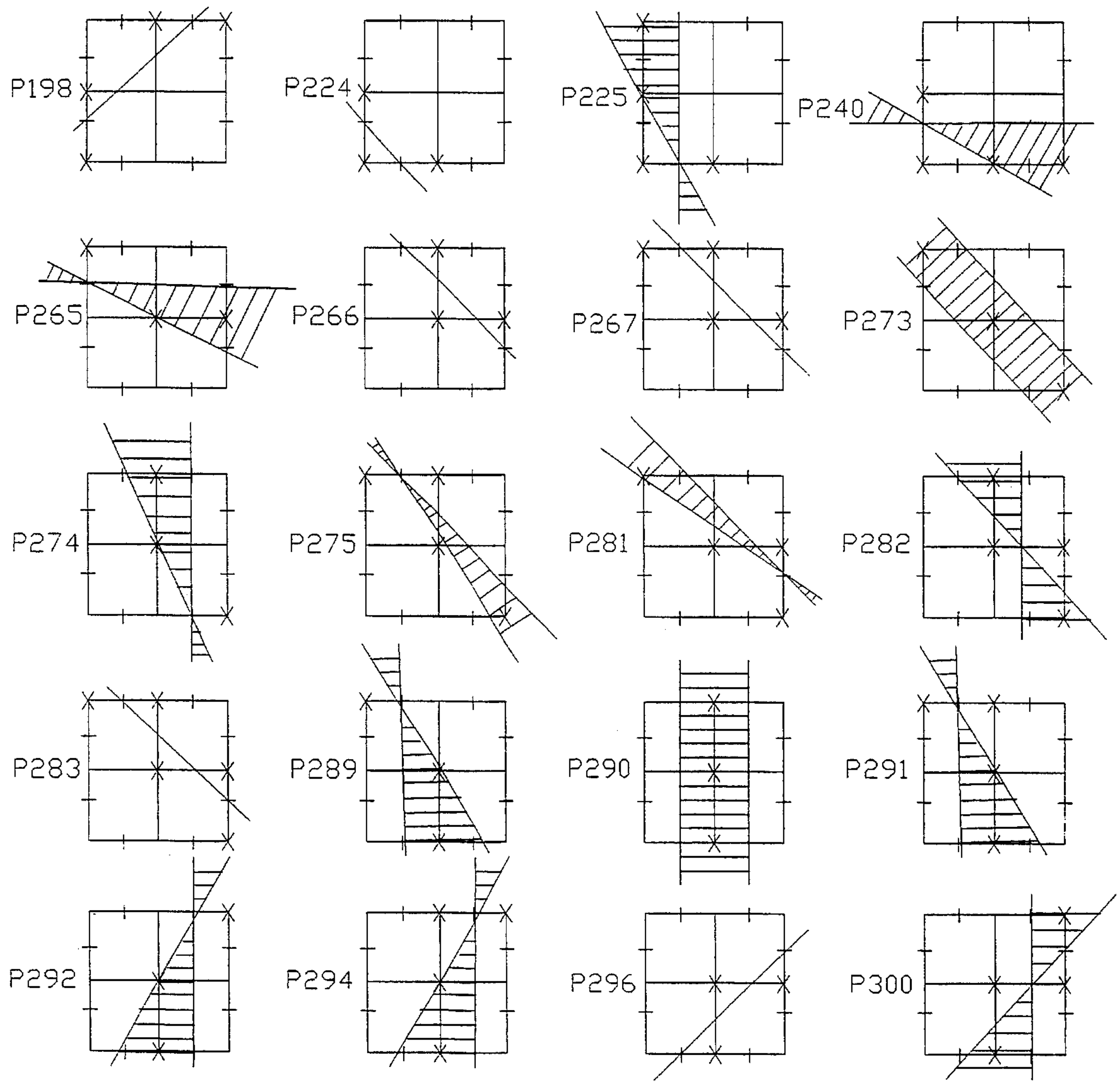
FIG 11K-3 DETAILED EDGE SUB-PIXEL TRANSITION DIAGRAMS

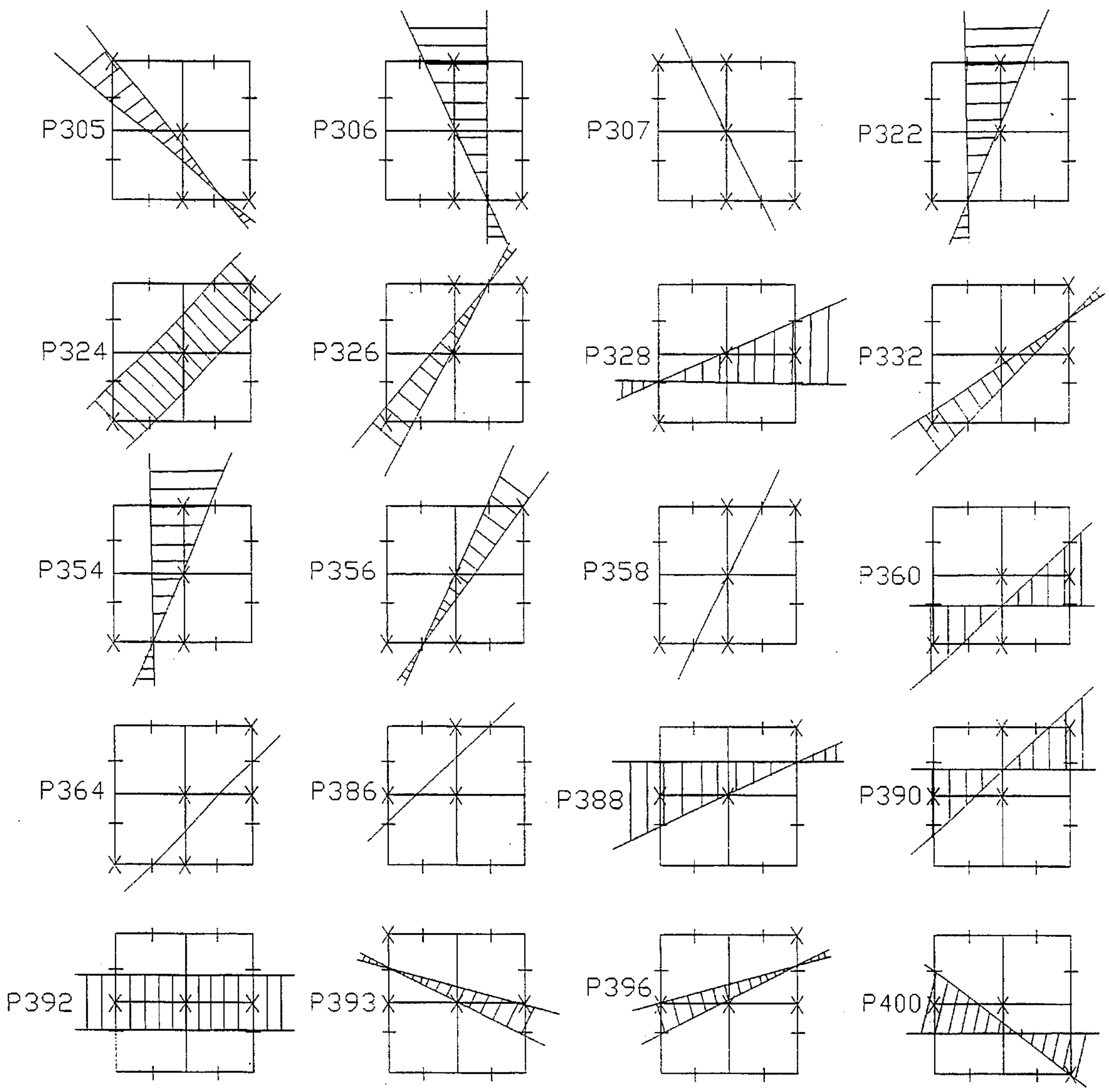
FIG 11K-4 DETAILED EDGE SUB-PIXEL TRANSITION DIAGRAMS

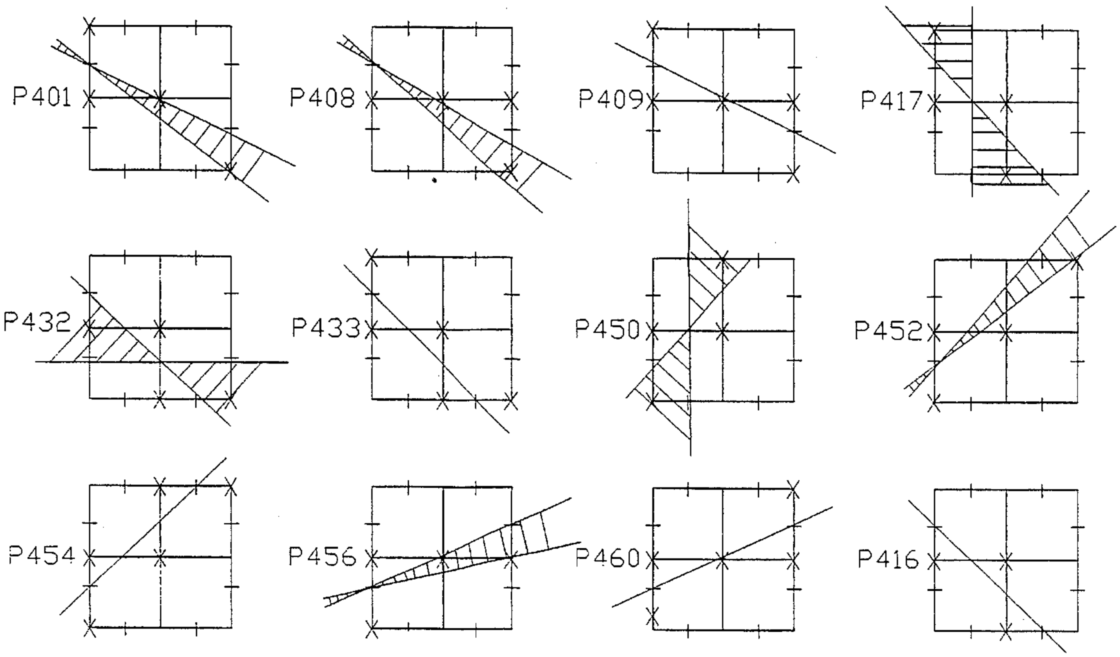
FIG 11K-5 DETAILED EDGE SUB-PIXEL TRANSITION DIAGRAMS

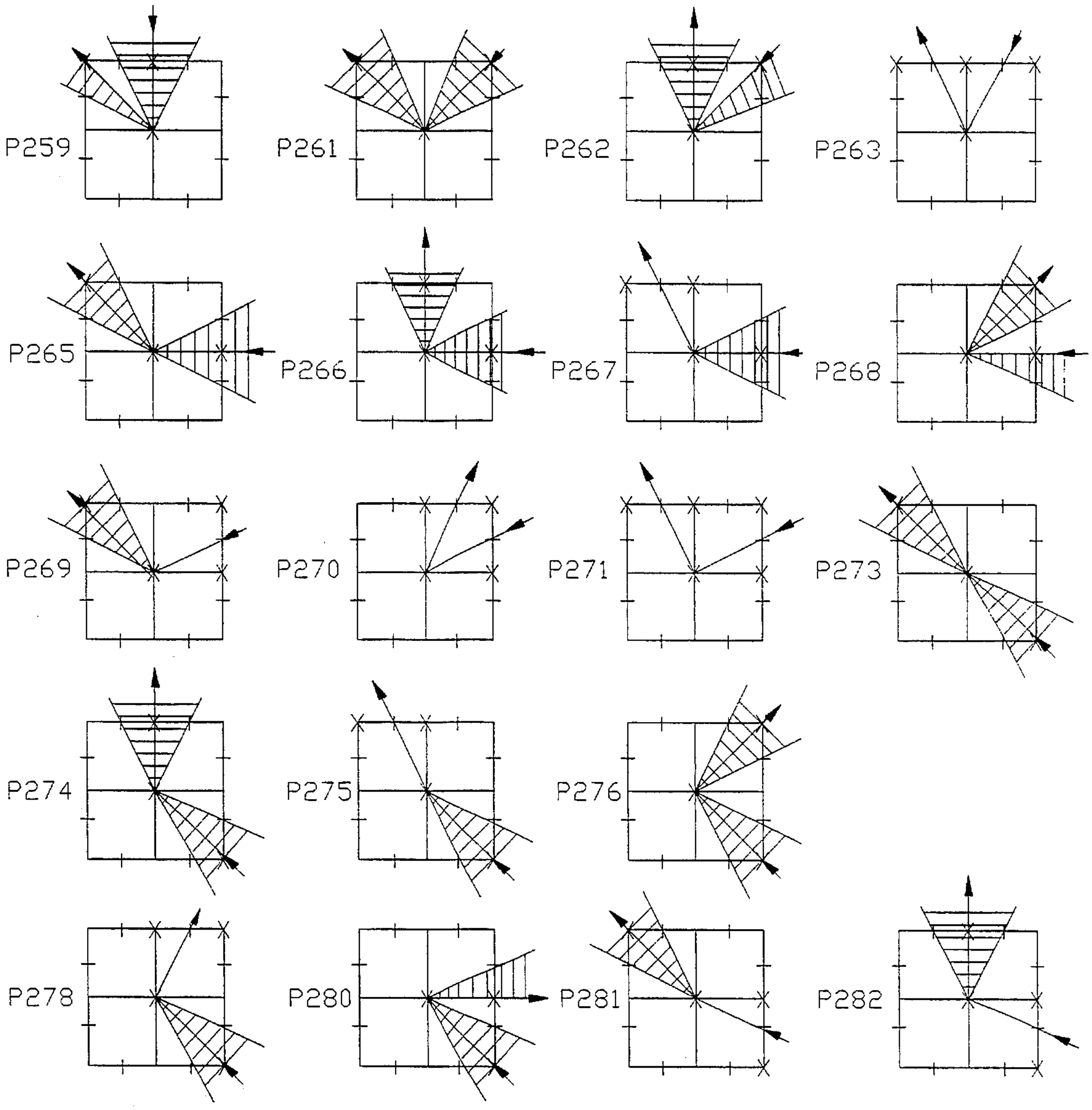
FIG 11L-1 DETAILED VERTEX SUB-PIXEL TRANSITION DIAGRAMS

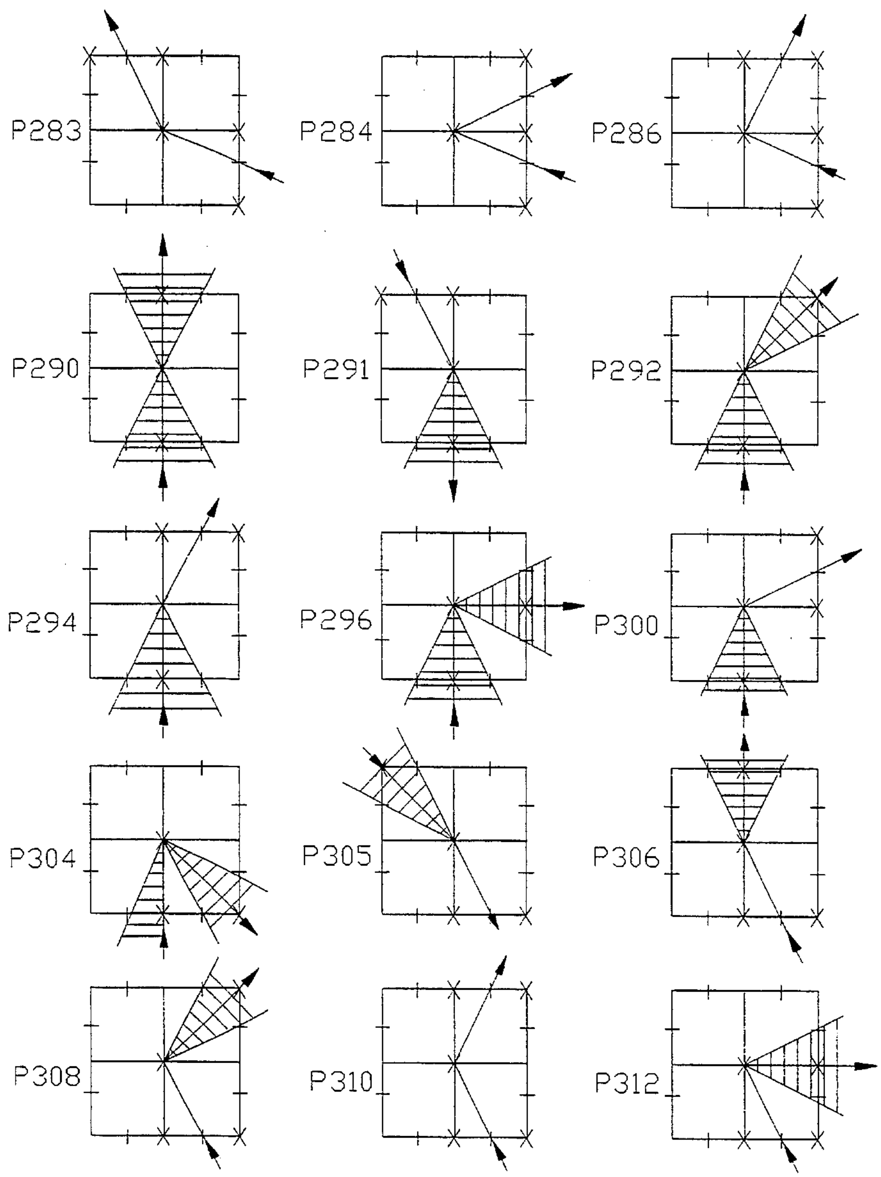
FIG 11L-2 DETAILED VERTEX SUB-PIXEL TRANSITION DIAGRAMS

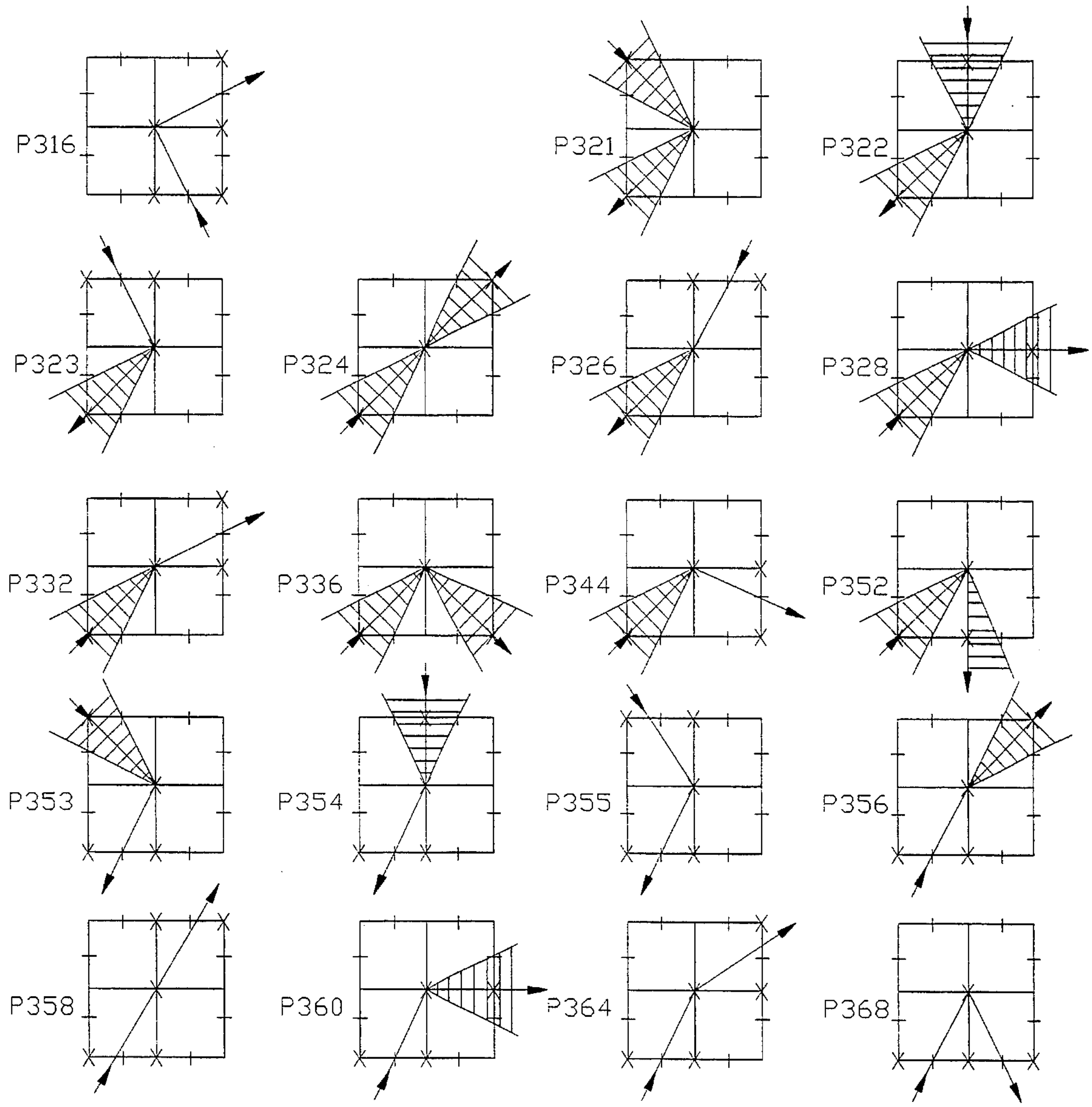
FIG 11L-3 DETAILED VERTEX SUB-PIXEL TRANSITION DIAGRAMS

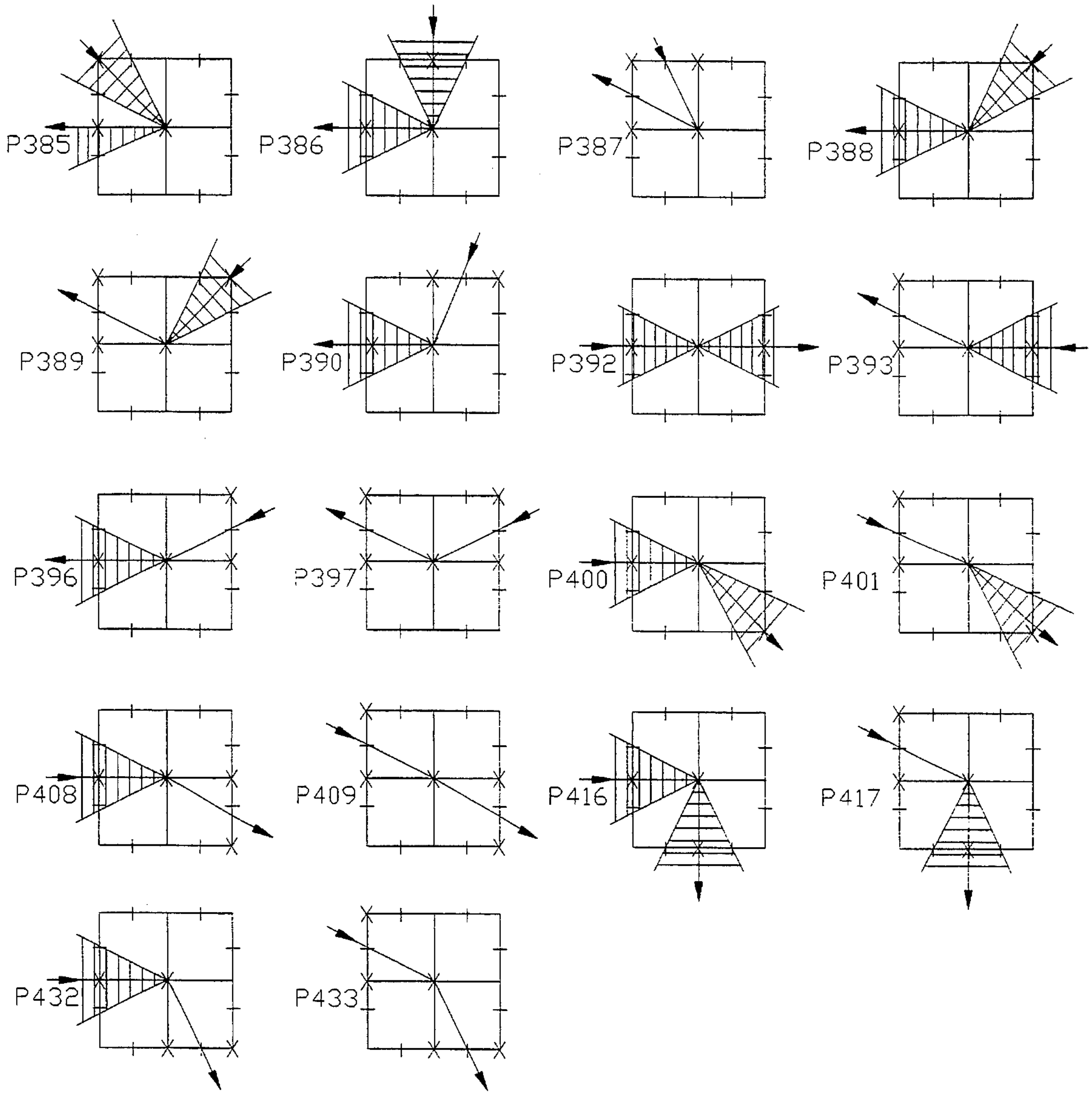
FIG 11L-4 DETAILED VERTEX SUB-PIXEL TRANSITION DIAGRAMS

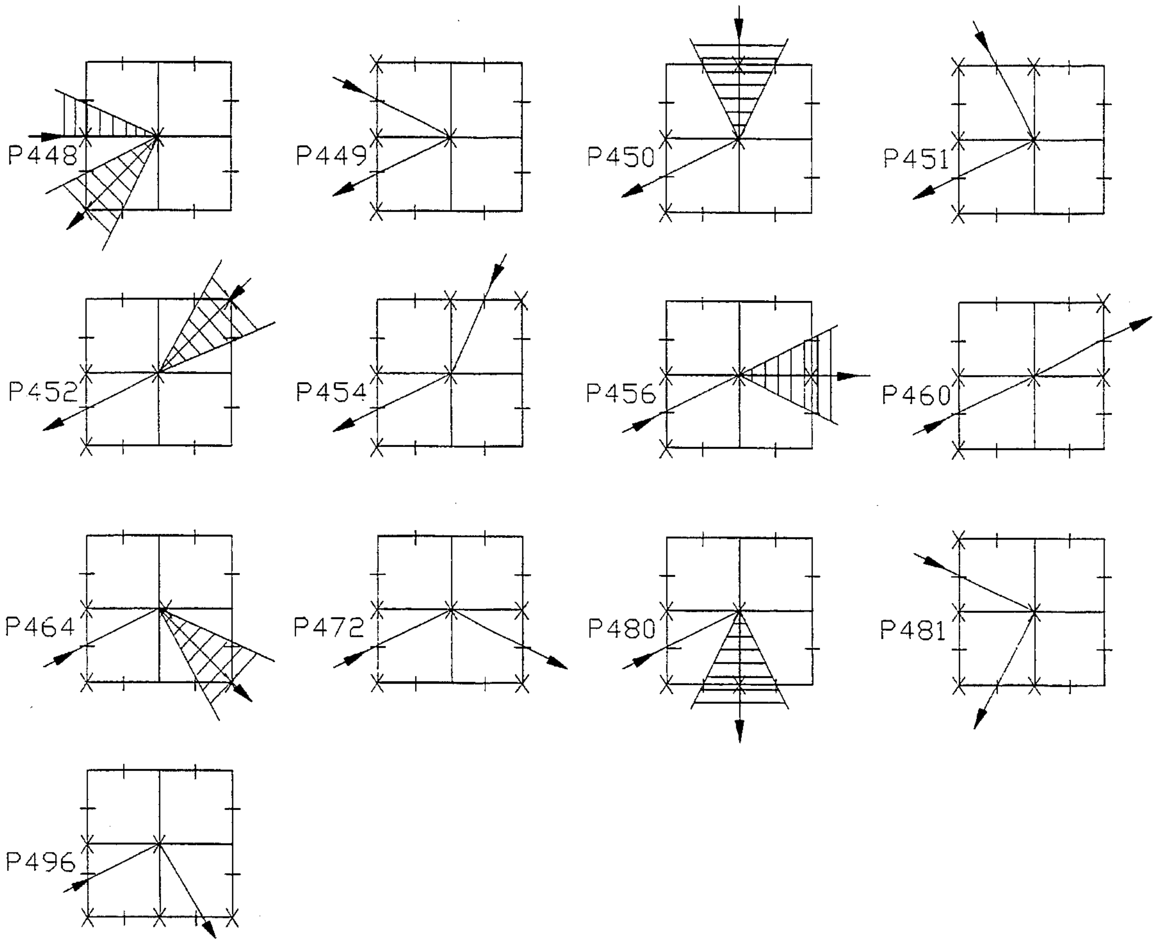
FIG 11L-5 DETAILED VERTEX SUB-PIXEL TRANSITION DIAGRAMS

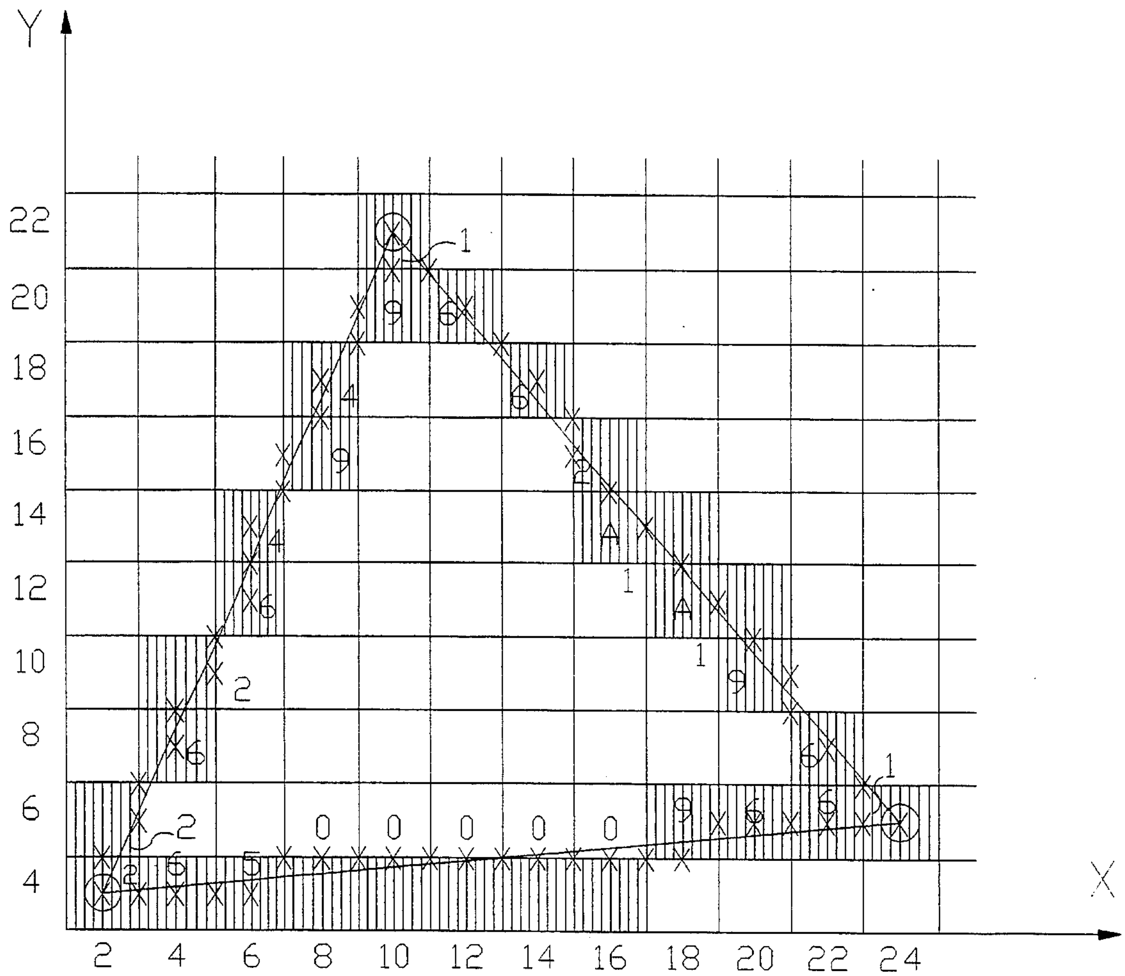
FIG 11M CASE I

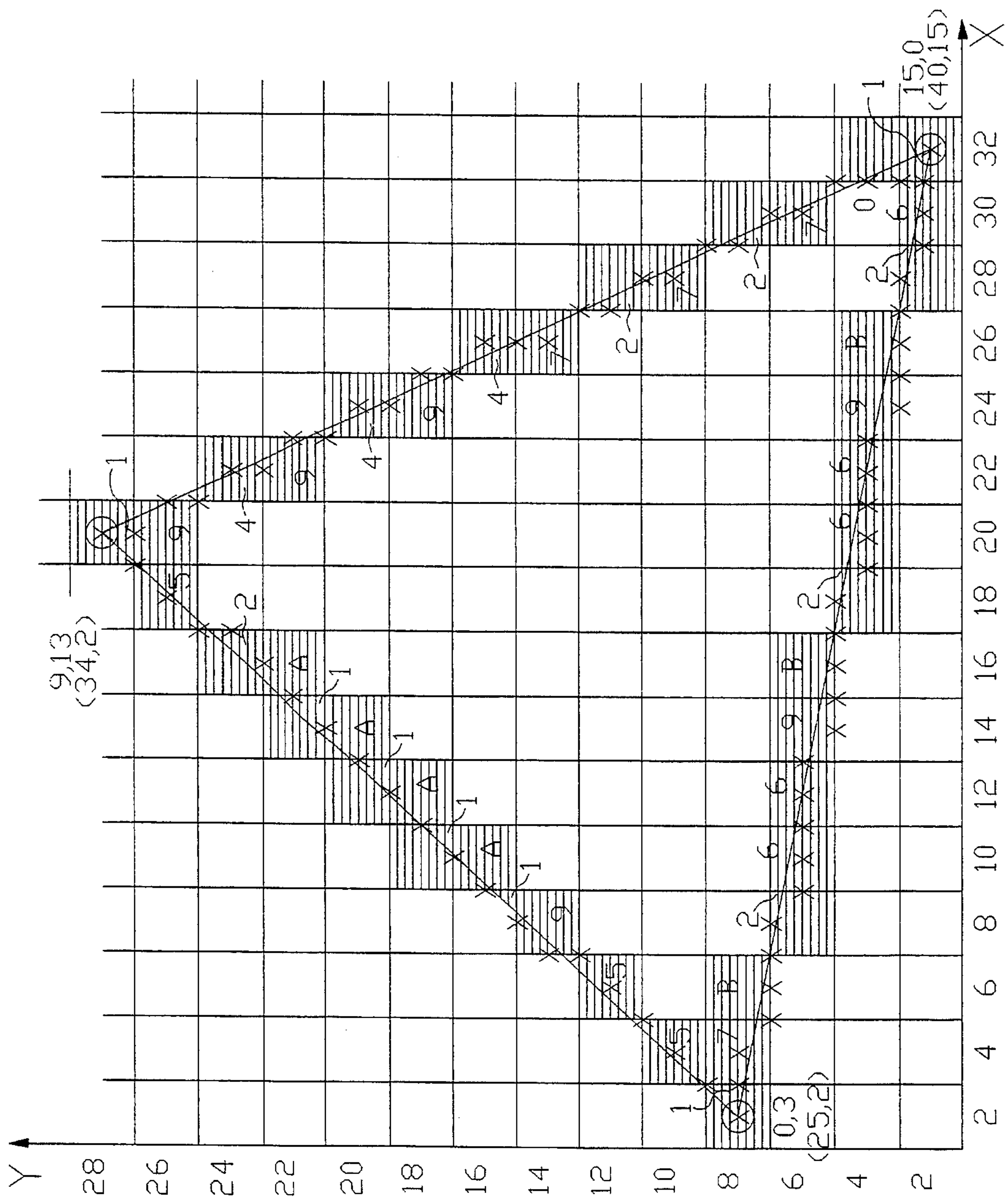
FIG 11N CASE II

RGB COLOR CIRCUITS
RED COLOR CIRCUIT
GREEN COLOR CIRCUIT
BLUE COLOR CIRCUIT
DIGITAL
ANALOG
RED
GREEN
BLUE
1500
1501
1510
1510R
1510G
1510B
1511
1511R
1511G
1511B
1512
1512R
1512G
1512B
1513
1513R
1513G
1513B

DIRECT DAC
LADDER NETWORK
DIGITAL
1528A
ANALOG
1527A
1515A
1517A
1516A
1514A
1524A
1526A

LADDER NETWORK
DIGITAL
1511
1517
1518
1519
1530
1531

RGB COLOR CIRCUITS
SCALE FACTOR
1501
1511R
1511G
1511B
1512R
1512G
1512B
1513R
1513G
1513B

DISPLAY INTERFACE

FIG 17 EXPERIMENTAL SYSTEM

TRANSFORM PROCESSOR SYSTEM HAVING REDUCED PROCESSING BANDWITH

CROSS-REFERENCE TO RELATED APPLICATIONS

This application is a continuation of parent application Ser. No. 06/504,691 filed on Jun. 15, 1983 entitled VISUAL SYSTEM FOR CONTINUOUS DISPLAY OF MOVING THREE DIMENSIONAL IMAGES by Gilbert P. Hyatt; where this parent application Ser. No. 06/504,691 is a continuation in part of application Ser. No. 05/754,660 filed on Dec. 27, 1976 entitled INCREMENTAL DIGITAL FILTER by Gilbert P. Hyatt, now U.S. Pat. No. 4,486,850 issued on Dec. 4, 1984; where the benefit of the filing dates of this parent application Ser. No. 06/504,691 and this grandparent application Ser. No. 05/754,660 is hereby claimed in accordance with 35 USC 120, 35 USC 121, and other authorities therefore; where this parent application Ser. No. 06/504,691 incorporates by reference the following 42 related patent applications:

1. METHOD AND APPARATUS FOR PROCESSING THE DIGITAL OUTPUT OF AN INPUT MEANS Ser. No. 879,293 filed on Nov. 24, 1969; now abandoned;

2. FACTORED DATA PROCESSING SYSTEM FOR DEDICATED APPLICATIONS Ser. No. 101,881 filed on Dec. 28, 1970; now abandoned;

3. CONTROL SYSTEM AND METHOD Ser. No. 134, 958 filed on Apr. 19, 1971;

4. CONTROL APPARATUS Ser. No. 135,040 filed on Apr. 19, 1971;

5. MACHINE CONTROL SYSTEM OPERATING FROM REMOTE COMMANDS Ser. No. 230,872 filed on Mar. 1, 1972, now U.S. Pat. No. 4,531,182 issued on Jul. 23, 1985;

6. COORDINATE ROTATION FOR MACHINE CONTROL SYSTEMS Ser. No. 232,459 filed on Mar. 7, 1972, U.S. Pat. No. 4,370,720 issued Jan. 25, 1983;

7. DIGITAL FEEDBACK CONTROL SYSTEM Ser. No. 246,867 filed on Apr. 24, 1972, U.S. Pat. No. 4,310,878; issued on Jan. 12, 1982;

8. COMPUTERIZED SYSTEM FOR OPERATOR INTERACTION Ser. No. 288,247 filed on Sep. 11, 1972, U.S. Pat. No. 4,121,284; issued on Oct. 17, 1978;

9. A SYSTEM FOR INTERFACING A COMPUTER TO A MACHINE Ser. No. 291,394 filed on Sep. 22, 1972, U.S. Pat. No. 4,396,976 issued on Aug. 2, 1983;

10. DIGITAL ARRANGEMENT FOR PROCESSING SQUAREWAVE SIGNALS Ser. No. 302,771 filed on Nov. 1, 1972;

11. ELECTRONIC CALCULATOR SYSTEM HAVING AUDIO MESSAGES FOR OPERATOR INTERACTION Ser. No. 325,941 filed on Jan. 22, 1973 U.S. Pat. No. 4,060,848; issued on Nov. 29, 1977;

12. ILLUMINATION CONTROL SYSTEM Ser. No. 366,714 filed on Jun. 4, 1973; U.S. Pat. No. 3,986,022; issued Oct. 12, 1976;

13. DIGITAL SIGNAL PROCESSOR FOR SERVO VELOCITY CONTROL Ser. No. 339,817 filed on Mar. 9, 1973, U.S. Pat. No. 4,034,276; issued on Jul. 5, 1977;

14. HOLOGRAHPIC SYSTEM FOR OBJECT LOCATION AND IDENTIFICATION Ser. No. 490,816 filed on Jul. 22, 1974; U.S. Pat. No. 4,209,853 issued Jun. 24, 1980;

15. COMPUTERIZED MACHINE CONTROL SYSTEM Ser. No. 476,743 filed on Jun. 5, 1974, U.S. Pat. No. 4,364,110; issued Dec. 14, 1982;

16. SIGNAL PROCESSING AND MEMORY ARRANGEMENT Ser. No. 522,559 filed on Nov. 11, 1974 issued Jun. 24, 1980, U.S. Pat. No. 4,209,852;

17. METHOD AND APPARATUS FOR SIGNAL ENHANCEMENT WITH IMPROVED DIGITAL FILTERING Ser. No. 550,231 filed on Feb. 14, 1975, U.S. Pat. No. 4,209,843; issued on Jun. 24, 1980;

18. ILLUMINATION SIGNAL PROCESSING SYSTEM Ser. No. 727,330 filed on Sep. 27, 1976; now abandoned;

19. PROJECTION TELEVISION SYSTEM USING LIQUID CRYSTAL DEVICES Ser. No. 730,756 filed on Oct. 7, 1976; now abandoned;

20. MEANS AND METHOD FOR COMPUTERIZED SOUND SYNTHESIS Ser. No. 752,240 filed on Dec. 20, 1976; now abandoned;

21. INCREMENTAL DIGITAL FILTER Ser. No. 754,660 filed on Dec. 27, 1976, U.S. Pat. No. 4,486,850 issued on Dec. 4, 1984;

22. VOICE SIGNAL PROCESSING SYSTEM Ser. No. 801,879 filed on May 31, 1977, U.S. Pat. No. 4,144,583; issued on Mar. 13, 1979;

23. ANALOG READ ONLY MEMORY Ser. No. 812,285 filed on Jul. 1, 1977; U.S. Pat. No. 4,371,953 issued on Feb. 1, 1983;

24. DATA PROCESSOR ARCHITECTURE Ser. No. 844,765 filed on Oct. 25, 1977, U.S. Pat. No. 4,523,290 issued on Jun. 11, 1985;

25. INTELLIGENT DISPLAY SYSTEM Ser. No. 849, 733 filed on Nov. 9, 1977, now abandoned;

26. DIGITAL SOUND SYSTEM FOR CONSUMER PRODUCTS Ser. No. 849,812 filed on Nov. 9, 1977, now abandoned;

27. HIGH INTENSITY ILLUMINATION CONTROL SYSTEM Ser. No. 860,277 filed on Dec. 13, 1977;

28. ELECTRO-OPTICAL ILLUMINATION CONTROL SYSTEM Ser. No. 860,278 filed on Dec. 13, 1977, U.S. Pat. No. 4,471,585 issued on Sep. 11, 1984;

29. SINGLE CHIP INTEGRATED CIRCUIT MICROCOMPUTER ARCHITECTURE Ser. No. 860,253 filed on Dec. 14, 1977;

30. INTEGRATED CIRCUIT COMPUTER ARCHITECTURE Ser. No. 860,252 filed on Dec. 14, 1977, now abandoned;

31. COMPUTER SYSTEM ARCHITECTURE Ser. No. 860,257 filed on Dec. 14, 1977, U.S. Pat. No. 4,371,923 issued on Feb. 1, 1983;

32. PULSEWIDTH MODULATED FEEDBACK ARRANGEMENT FOR ILLUMINATION CONTROL Ser. No. 874,446 filed on Feb. 2, 1978 U.S. Pat. No. 4,342,906 issued on Aug. 3, 1982;

33. MEMORY SYSTEM HAVING SERVO COMPENSATION Ser. No. 889,301 filed on Mar. 23, 1978, U.S. Pat. No. 4,322,819 issued on Mar. 30, 1982;

34. INTELLIGENT CONVERTER SYSTEM Ser. No. 948,378 filed on Oct. 4, 1978;

35. ANALOG MEMORY FOR STORING DIGITAL INFORMATION Ser. No. 160,871 filed on Jun. 19, 1980, now U.S. Pat. No. 4,445,189 issued on Apr. 24, 1984;

36. MEMORY SYSTEM USING FILTERABLE SIGNALS Ser. No. 160,872 filed on Jun. 19, 1980, now U.S. Pat. No. 4,491,930 issued on Jan. 1, 1985;

37. ELECTRO-OPTICAL ILLUMINATION CONTROL SYSTEM Ser. No. 169,257 filed on Jul. 16, 1980, U.S. Pat. No. 4,435,732 issued on Mar. 6, 1984;

38. DATA PROCESSING SYSTEM Ser. No. 223,959 filed on Jan. 12, 1981;

39. DATA PROCESSING SYSTEM Ser. No. 332,501 filed on Jan. 22, 1981, now abandoned;

40. PROJECTION DISPLAY SYSTEM Ser. No. 425,136 filed on Sep. 27, 1982;

41. FILTER DISPLAY SYSTEM Ser. No. 425,135 filed on Sep. 27, 1982, U.S. Pat. No. 4,551,816 issued on Nov. 5, 1985; and 42. ACOUSTIC FILTERING SYSTEM Ser. No. 425,131 filed on Sep. 27, 1982; now U.S. Pat. No. 4,686,655, wherein each of the above identified patent applications is by Gilbert P. Hyatt; and wherein these related patent applications are incorporated herein by reference.

TABLE OF CONTENTS

Figures
Specification
Abstract
Cross-Reference to Related Applications
Background
Field of the Invention
Prior Art
Summary of the Invention
Brief Description of the Drawings Detailed Description
General
System Description (FIG. 1A)
  Multiple Processing Loops
  Hierarchial Visual Complexity
  Program Control Configuration
  CCD Implementation
Multiple Terminal System (FIG. 1B)
Real Time Processor (FIG. 1C)
Experimental System
Supervisory Processor
Executive Processing
Database Memory
  General Description
  Construction of a Generated Environment
Geometric Processor
  General Description
  Hierarchial Processing (FIG. 5A)
  Object Header Processing (FIG. 5B)
  Surface Header Processing (FIG. 5C)
  Edge Processing (FIG. 5D)
  Output Postprocessing (FIG. 5E)
  Edge Initial Condition Processing (FIG. 5F)
  Geometric Processor Information Formats
  Geometric Processor Format Tables
  Environment Header Format Table
  Object Header Format Table
  Surface Header Format Table
  Incremental Geometric Processor
  Incremental Processor Architecture
  Driving Functions
  Incremental Processor Considerations
  Serial Incremental Computation Architecture
  Coordinate Transformation
  Visibility Processing
  Projection Processing
  Higher Order Edges
  Incremental Initial Conditions
Edge Processor (FIGS. 7–8)
  Introduction
  Edge Processor Configuration (FIG. 7A)
  Edge Processor Operation (FIG. 7B)
  Single Loop Edge Processor Configuration (FIG. 7C)
  Edge Processor Demonstration
  Edge Processor Operation (FIG. 8A)
  Alternate Edge Processor Configurations (FIGS. 8B and 8C)
Smoothing Processor (FIGS. 11 and 12)
  Introduction (FIG. 11A)
  Quadrant Area Weighting (FIG. 11B)
  Digital Edge Smoothing (FIGS. 11C and 11D)
  Illumination Effects
  Smoothing Processor Logical Design
Smoothing for an Unknown Edge
Occulting Processor
  General Description
  Filling of Pixels
  Pixel Fill Operations
  Occulting Processing (FIGS. 10K and 8A)
  Background Scenes
  Object Interaction
  Crash Processing
  Extrapolative Occulting Processing
    Mode-0 Processing
    Mode-1 Processing
    Mode-2 Processing
    Mode-3 Processing
    Mode-4 Processing
    Mode-5 Processing
  Fill Processing
  Inside and Outside Determinations
  Antistreaking Processor
  Surface Intersection Processing
  Range Related Detail
Aperture Processor
  Introduction
  Aperture Processor Optimization
  Detailed Implementation
  Hierarchial Aperture Processing
  Aperture Scanner Demonstration
  Concave Surfaces
Refresh Memory (FIGS. 13 AND 14)
  Introduction (FIG. 13A)
  Refresh Memory Bandwidth Consideration
  Refresh Address Counter (FIG. 13B)
  Memory Multiplexing (FIGS. 13C–13E)
  Asynchronous Refresh and Update
  Refresh Memory Lookahead (FIG. 13F)
  Memory Multiplexing Configuration (FIGS. 14A–14C)
  Refresh Memory Map (FIG. 14D)
  Surface Memory Configuration (FIG. 14E)
  Pixel Words
  Image Identification
  Color Fill and Antistreaking
  Refresh Memory Contention Considerations
  Initialization Of Refresh Memory
  Alternate Configurations
Display Interface (FIGS. 15 and 16)
  Introduction
  Raster Scan Operation RGB Color Circuits
Hybrid Intensity Control
Analog Intensity Control
Hybrid Edge Smoothing
Illumination Effects
General
Reflections
Intensity
Surface Shading
Transparency and Tinting
Texturing
Zoom
Display Monitor
Three Dimensional Display Medium
Memory Map Image Processor (FIG. 18)
Memory Map Based Image Processing (FIG. 22)
Image Recording
System Applications
Introduction
General Applications
Design Applications
Layout Applications
Business Graphics
Three Dimensional Computer Aided Design System
Animation CAD System
Parts Programming CAD System
Mechanical CAD System
Integrated Circuit CAD System
Consumer Animation System
3D Operator Control Panel
Generated Environment Applications
Acquired Environment Applications
Generated And Acquired Environment Applications
Vehicle Training System
Terrain Presentation
3D Terrain Presentation
Pattern Recognition
Automatic Operations
Cross Reference to Pertinent Materials
Textbooks
Articles and Patents
Disclosure Documents
Claims

LIST OF TABLES

Geometric Processor Format Tables
Environment Format Table
Object Format Table
Surface Format Table
Edge List Format Table
Geometric Processor Header Tables
Environment Header Format Table
Object Header Format Table
Surface Header Format Table
Geometric Transform Table
Overflow/Underflow Logic Table
Edge Processor Lookup Table
Table of Packed Words
Multiplication Table
Sub-Pixel Condition Change Table (Smooth 3)
Sub-Pixel Transition Tables
Notes, Sub-Pixel Conditions
Hex Code Definition Table
Comprehensive Edge Sub-Pixel Transition Table
Comprehensive Vertex Sub-Pixel Transition Table
Comprehensive Edge and Vertex Sub-Pixel Transition Table
Subpixel Transition Logic
Subpixel Corner Condition Table
Subpixel Midpoint Condition Table
Examples of Smoothing Operation
Case I Operation Table
Case II Operation Table
Unknown Edge Logic Table
Smoothing of Unknown Edge Table
Motion Along an Unknown Edge Table
Unknown Edge—Example I
Unknown Edge—Example II
Unknown Edge—Example III
Unknown Edge—Example IV
Inside/Outside Location Table
Slope Comparison Register Tables
Aperture Processor Condition Table
Triple Quadrant Register Table
Double Quadrant Register Table
Column Multiplexing Table
Row Multiplexing Table
Refresh/Update Rate Table
Memory Architecture Table
Pixel Word Table
Pixel Configuration Table
Edge Processor Tables
Aperture Processor Tables
Tables of Computer Listings
Tables of Computer Listings Supervisory Processor
Tables of Computer Listings Database Memory
Tables of Computer Listings Geometric Processor
Tables of Computer Listings Edge Processor and Smoothing Processor
Tables of Computer Listings Antistreaking Processor
Tables of Computer Listings Occulting Processor
Tables of Computer Listings FIFO Memory
Tables of Computer Listings Aperture Processor
Tables of Computer Listings Spiral Fill Processor
Tables of Computer Listings Refresh Memory and Surface Memory

BACKGROUND OF THE INVENTION

1. Field of the Invention

The field of the present invention is display systems and, in particular, computer graphic (CG) and computer image generation (CIG) systems for displaying moving three dimensional images in real time.

2. Prior Art

The prior art in display systems includes alphanumeric displays, computer graphic displays, computer image generation CIG) displays, and other type displays. Computer image generation displays represent a higher level of capability, providing high detail color images in three dimensions (3D) with various visual and illumination effects. CIG systems are often scanline systems, but may also be implemented with refresh memories. Computer graphic systems usually display static two dimensional (2D) graphic images, but may also provide dynamic 3D moving images similar to CIG displays. Computer graphic displays often use memory mapped refresh memories, but may also be implemented with refresh memories. Alphanumeric displays are conventionally limited with simple character generator-based configurations without memory mapped graphic capabilities.

SUMMARY OF THE INVENTION

The present invention is generally directed to various levels of features; including display technology, processor technology, and system technology, and various features related thereto. In particular, a display system is provided that may be characterized as a computer image generation (CIG) system. It provides important visual features; such as 3D environment, anti-aliasing, occulting, visibility processing, illumination effects, and many other features for realistic visual effects.

One configuration of the visual system of the present invention will now be described. This configuration can have a host system generating visual-related signals to the visual system. The visual system generates visual images in response to signals from a host system, signals from a database memory, and signals from other sources, such as signals from observer controls. The visual processor includes a supervisory processor and a real time processor to process input signals to generate processed visual signals that are used to update a refresh memory. The refresh memory stores visual signals and is updated in response to processed visual signals from the real time processor and generates refresh signals for refreshing a display monitor. A display interface signal processes refresh signals from the refresh memory to generate signal processed signals to the monitor. The monitor generates visual information to an observer in response to the processed signals from the display interface. The refresh memory can be a 2D refresh memory having a separate pixel word for each 2D pixel location to be displayed on a 2D monitor.

The visual processor may be implemented as a combination of a supervisory processor and a real time processor. The supervisory processor may be a non-real time processor, such as a background processor, and the real time processor may be a foreground processor, such as implemented as a special purpose processor. One configuration of the real time processor uses an incremental special purpose processor to perform high speed real time operations, such as changing an image in real time as an object moves through the display environment. The supervisory processor performs many of the slower speed non-real time operations, such as initializing the real time processor to initiate display of an object entering the display environment and compensation for error buildup. The system of the present invention can include various features disclosed herein and combinations thereof, such as discussed below.

Changed portions of images can be selectively updated without the need to regenerate static portions of an image and without the need to regenerate non-changing portions to moving surfaces. Such changes can involve a narrow border of pixels around the edges of moving surfaces and can exclude a large group of non-changing surface pixels that are not within the narrow changing border of moving surfaces and can also exclude pixels of non-moving surfaces. This selective updating of changing pixels reduces processing bandwidth requirements.

Changes to images can be derived from the previous images in refresh memory, such as by extrapolating the prior image conditions to the new conditions.

Occulting processing can be performed in memory, map form by determining changes to existing images on a pixel-by-pixel basis along an edge; processing primarily visible moving surfaces, with reduced processing of non-visible and stationary surfaces. Primary processing involves conditional filling of a pixel along a moving edge with one of two surfaces using a simple range comparison. Secondary processing, may be needed only for a limited percentage of cases. Also, updating may be limited to pixels near an edge of a moving visible surface for small motion increments; where pixels of a moving surface away from the moving edge, pixels of non-moving surfaces, and pixels of non-visible surfaces need not be updated. The simplicity of this occulting processing is based upon the premise that, for most conditions, changes in occulting caused by motion of a surface can be determined by extrapolation of adjacent surface conditions along the edge from the prior image frame.

3D-perspective processing can be provided with an incremental processor, having the same advantages discussed for incremental geometric processing below.

Surface fill can be provided without an explicit fill processor, such as with memory map occulting operations. Fill can be performed once, as an initial condition. Static surface fill conditions can be preserved from frame-to-frame in refresh memory and therefore need not be regenerated. Filling of changed pixels, such in a narrow border around a moving surface, can be performed with change-related occulting processing. This can reduce processing bandwidth associated with fill processing.

Scaling can be performed as an initial condition without the need to repeat scaling processing during operation. Once scaled, the above-described change-related refresh memory preserves the scaled image and overcomes the need to continually re-compute scaling. Also, 3D-perspective processing can provide range-variable scaling in an efficient incremental manner without regeneration.

Geometric processing, such as rotation and translation processing, can be performed with an incremental processor. Complex computations; such as sin-cos generation, multiplication, and arc-tan generation; can be performed with incremental addition and subtraction operations. Also, non-changing parameters need not be redundantly processed, inherent in operation of the incremental processor. Also, the incremental geometric processor simplifies updating of the change-related refresh memory, discussed for update processing above; providing compounded advantages.

Clipping can be performed inherently, without an explicit clipping processor and without regeneration. Objects can be permitted to extend beyond the viewport boundaries when fill is not edge-dependent and when filled surfaces do not need "wire frame" edges, there is reduced need for explicit clipping.

Edge smoothing can be performed by processing to sub-pixel resolution with the edge processor, then performing a table lookup to obtain an area weighting parameter, and then performing relatively low resolution weighting of colors.

A self-contained stand-alone system configuration can be provided. A database can be stored in a self-contained disk memory. Vector lists can be generated with a self-contained supervisory processor. Therefore, a host computer is not required for visual processing. In applications where a host computer is used; host loading, communication traffic, protocols, and interfaces are simplified. Self-contained operation reduces loading of the host computer in applications such as CAD/CAM and facilitates stand-alone operation without a host computer in applications such as a low-end pilot training simulator.

A pipeline architecture can be implemented; where high traffic data paths are dedicated, not shared as with a shared bus architecture. This reduces bus contention and therefore increases throughput. This also reduces hardware, such as bus interfaces and contention arbiters used with shared bus architectures.

Range variable intensity is provided to enhance range-related visual effects, reducing intensity as a function of range. A multiplying DAC circuit in the display interface can control intensity. A range number for each pixel displayed can be output to the range DAC; controlling intensity for that pixel as an inverse function of the range of the pixel image. Alternately, range variable intensity and other intensities can be multiplied with the color parameters in the digital domain rather than multiplied with the DAC circuits in the hybrid domain.

Continuously variable zoom capability is provided, continuously varying size and detail with fine resolution increments from near-range to far-range. Implementation can be implicit in the driving function capability.

Roam capability is provided, where an operator can visually roam through the environment. The operator can roam around objects, between objects, and "inspect" the back sides of objects. Implementation can be implicit in the driving function capability.

Growth can be enhanced with a dedicated pipeline architecture, with expansion "hooks", and with simple efficient processing. Additional features can be provided by adding other processors to the dedicated pipeline, which need not increase traffic in the pipeline. Greater detail can be provided by adding other pipeline processors in parallel, which need not increase traffic in any of the pipelines. Also, dedicated pipeline architecture reduces overhead, where a dedicated architecture has lower overhead then a shared architecture.

One configuration of the system of the present invention will now be briefly discussed. This configuration represents a new and improved approach to man-machine visual communication. In this configuration, visual processing is performed continuously, which closely matches the continuous nature of human visual processing. Therefore, it achieves the combination of better visual effects together with a more efficient processor configuration. It uses continuous processing, such as incremental processing, to achieve high performance and exotic visual effects with simple processors.

Human visual processing is highly sensitive to continuous images. For example, human vision can detect minute discontinuities in continuous motion, such as related to display refreshing at about 30-times a second and display updating at about 10-times a second to overcome flicker and discontinuous effects, respectively. This is because human vision is highly sensitive to changes in the environment. Also, human vision appears to be able to interpolate between visual samples and to extrapolate beyond visual samples to extend continuity for image enhancement. This high sensitivity to changes and motion in the environment indicates the continuous change sensitivity nature of human vision.

In one configuration, a hierarchial incremental processing arrangement can be used to achieve compound efficiencies. For example, it processes changing (not static) portions of a visual environment and it processes incremental changes in the changing portions of the visual environment. This is a second order improvement of processing efficiency. This hierarchial incremental arrangement can be implemented with a change-driven refresh memory to store non-changing portions of an environment so that they need not be recomputed and this arrangement can update changing portions of the visual environment in the refresh memory to compensate for changing portions of the environment. Updates of the changes can be performed incrementally with an incremental processor, such as a version of a digital differential analyzer.

In this continuous processing configuration, a visual scenario can be implemented by accessing 3D objects from a database memory and controlling these objects in position, range, and orientation with scenario control inputs. Objects are defined with surfaces, surfaces are defined with edges, and edges are defined with coordinates of edge endpoints. Translation and rotation of edge endpoints implicitly translates and rotates the related edges, which implicitly translates and rotates the related surfaces, which implicitly translates and rotates the objects in the environment. Edge endpoint coordinates for each object can be obtained from various sources, such as from the database memory and the host computer. Translation and rotation information can be obtained from a scenario control input, such as from a host system and from an observer who is controlling the rotating and translating of objects in the environment, to create a scene and to vary that scene. For example, in a pilot training simulator application, a host system creates a stationary environment and an observer, a pilot trainee, generates control signals for translation and rotation using pilot controls of the simulated aircraft. In a CAD/CAM system, a designer creates an environment by building up the designed object with smaller objects and the designer controls rotation and translation of the designed object for viewing and for design modification. This configuration uses the scenario command signals to select objects stored in the database and to control position and orientation of these objects in the environment and then to perform dependent operations that are a function of the translations and orientations; such as occulting of more remote objects by nearer objects, reduction in size as a function of range, reduction in intensity as a function of range, smoothing of edges, and other dependent operations.

Features of the present invention include the following. A change-related refresh memory permits generating of a scene having moving and stationary objects. Moving portions of the scene can be incrementally changed in refresh memory to display image motion. Stationary portions of the scene can be preserved in the refresh memory. Motion of an image can be generated incrementally by identifying and updating refresh memory pixels that are changed as a consequence of the motion and by not processing or changing refresh memory pixels that do not change as a consequence of the motion. Motion can be generated incrementally by determining the prior position of an edge, by determining the next position of the edge, and by changing the pixels therebetween. 3D motion can be provided with rotation, translation, scaling, and perspective processing performed with an incremental processor that calculates changes in edge position as a result of changes in rotation, translation, scale factor, and perspective and by selectively erasing and rewriting changes in images into refresh memory. Visibility and non-visibility processing can be achieved by incrementally incrementing or decrementing the visibility angle of a surface in response to object rotation and by detecting the sign of the visibility angle; where a positive sign indicates surface visibility and a negative sign indicates surface non-visibility. Edge motion can be incrementally provided by generation of a prior-edge for erasing prior-edge pixels in the refresh memory and by generation of a next-edge for drawing next-edge pixels in the refresh memory and by filling intervening pixels between the prior-edge and the next-edge positions. Hidden line removal processing for moving surfaces can be performed by filling trailing edge exited pixels with the pixel word of the adjacent surface and by filling leading edge entered pixels with the pixel word of the moving surface covering the pixel or the pixel word stored in the pixel; whichever has the shorter range. Determination of the surface that is visible in a selected pixel can be performed by identifying the shortest range surface encompassing the selected pixel. Surfaces encompassing the selected pixel can be determined by tracing the edges of all surfaces and identifying those surfaces that traverse all four quadrants around the selected pixel. Efficient use of refresh memory circuits can be achieved by storing a surface identifier code in each pixel word that is representative of the surface visible in that pixel. Refresh operations can be implemented by accessing the surface identifier codes from a sequence of pixels and accessing the color, intensity, and range parameters for each pixel from and auxiliary memory in response to the surface identifier codes accessed from refresh memory.

An objective of the present invention is to provide a means and method for improved computer image generation.

Another objective of the present invention is to provide a means and method for continuous display processing.

Another objective of the present invention is to provide a means and method for incremental display processing.

Another objective of the present invention is to provide a means and method for improved coordinate transformation.

Another objective of the present invention is to provide a means and method for improved occulting.

Another objective of the present invention is to provide a means and method for improved edge smoothing.

Another objective of the present invention is to provide a means and method for improved image clipping.

Another objective of the present invention is to provide an improved means and method for hidden edge removal.

Another objective of the present invention is to provide an improved means and method for rear surface removal.

Another objective of the present invention is to provide an improved means and method for rotation processing.

Another objective of the present invention is to provide an improved means and method for translation processing.

Another objective of the present invention is to provide an improved means and method for scaling processing.

Another objective of the present invention is to provide an improved means and method for perspective processing.

Another objective of the present invention is to provide an improved means and method for edge processing.

Another objective of the present invention is to provide an improved means and method for smoothing processing.

Another objective of the present invention is to provide an improved means and method for range variable intensity generation.

Another objective of the present invention is to provide an improved means and method for range variable detail generation.

Another objective of the present invention is to provide an improved means and method for range variable size generation, Another objective of the present invention is to provide an improved means and method for shading.

Another objective of the present invention is to provide an improved means and method for texturing.

Another objective of the present invention is to provide an improved means and method for shadowing.

Another objective of the present invention is to provide an improved means and method for refresh memory implementation.

Another objective of the present invention is to provide an improved means and method for identifying a surface in an aperture.

Another objective of the present invention is to provide an improved means and method for updating a refresh memory.

Another objective of the present invention is to provide an improved means and method for computer aided design.

Another objective of the present invention is to provide an improved means and method for mechanical computer aided design.

Another objective of the present invention is to provide an improved means and method for integrated circuit computer aided design.

Another objective of the present invention is to provide an improved means and method for air traffic control.

Another objective of the present invention is to provide an improved means and method for simulation, Another objective of the present invention is to provide an improved means and method for training.

Another objective of the present invention is to provide an improved means and method for animation.

Another objective of the present invention is to provide an improved means and method for video games.

Another objective of the present invention is to provide an improved means and method for parts programming.

Another objective of the present invention is to provide an improved means and method for aircraft cockpit operations.

Another objective of the present invention is to provide an improved means and method for vehicular operation.

Another objective of the present invention is to provide an improved means and method for genetic engineering design.

Another objective of the present invention Is to provide an improved means and method for architectural design.

Another objective of the present invention is to provide an improved means and method for landscape design.

Another objective of the present invention is to provide an improved means and method for industrial control.

Another objective of the present invention is to provide an improved means and method for man-machine interface.

Another objective of the present invention is to provide an improved means and method for business decisions.

The foregoing and other objects, features, and advantages of the present invention will become apparent from the following detailed descriptions of preferred embodiments of this invention as illustrated in the accompanying drawings.

BRIEF DESCRIPTION OF THE DRAWINGS

A better understanding of the present invention may be obtained from a consideration of the detailed description hereinafter taken in conjunction with the drawings, which are briefly described below.

FIG. 1A shows a single channel display configuration, FIG. 1B shows a multiple channel display configuration, and FIG. 1C shows a block diagram representation of one configuration of the real time processor in accordance with FIGS. 1A and 1B.

FIG. 5, comprising FIGS. 5A, 5B, 5C, 5D, 5E, 5F, 5G, 5H, 5I, 5J, 5K, 5L, 5M, 5N, 5O, 5P, 5Q, 5R, 5S, 5T, 5U, 5V, and 5W, are block diagram and schematic representations of various geometric processor configurations; where FIG. 5A is a flow diagram and state diagram of hierarchial geometric processor operation, FIG. 5B is a flow diagram and state diagram representation of object header processing in accordance with FIG. 5A, FIG. 5C is a flow diagram and state diagram representation of surface header processing in accordance with FIG. 5A, FIG. 5D is a flow diagram and state diagram representation of edge processing in accordance with FIG. 5A, FIG. 5E is a flow diagram and state diagram representation of output post processing in accordance with FIG. 5A, FIG. 5F is a flow diagram and state diagram representation of edge initial condition processing in accordance with FIG. 5A, FIGS. 5G and 5H are a Geometric Transform Table, FIG. 5I is a schematic symbol for an incremental processor element, FIG. 5J is a block diagram representation of an incremental processor element, FIG. 5K is a block diagram representation of an incremental multiplier, FIG. 5L is a block diagram representation of an incremental sin/cos generator, FIG. 5M is a block diagram representation of an incremental reciprocal generator, FIG. 5N is a block diagram of rotation driving function logic, FIG. 5P is a block diagram of a component rotation element for vector transformation, FIG. 5Q is a block diagram of a vector rotation element for vector transformation, FIG. 5R is a more detailed block diagram of a vector rotation element in accordance with FIGS. 5P and 5Q, FIG. 5S is a block diagram of translation driving function logic, FIG. 5T is a block diagram of an incremental arc-cos generator, and FIGS. 5U to 5W are blocked diagram and schematic representations of an incremental implementation of geometric matrix equations.

FIG. 6 is a block diagram representation of a serial incremental processor.

FIG. 7, comprising FIG. 7A is a block diagram representation of an edge processor configuration, FIGS. 7B and 7C are flow diagram and state diagram representations of alternate edge processor configurations, and FIGS. 7D to 7G show vector relationships of an edge processor in accordance with the arrangement shown in FIG. 7B.

FIG. 8, comprising FIG. 8A shows a flow diagram and state diagram representation of simplified edge processor and occulting processor operation and where FIGS. 8B and 8C show alternate edge processor configurations.

FIG. 9, comprising FIGS. 9A, 9B, 9C, 9D, 9E, 9F9G, 9H, 9I, 9J, and 9K, illustrate occulting processor operation; where FIG. 9A illustrates surface motion, FIG. 9B thru FIG. 9D illustrate edge effects associated with one configuration of occulting processing, FIG. 9E illustrates occulting processing for an occulting surface moving over an occulted surface and exposing occulted surfaces, FIG. 9F illustrates a moving object having a pair of occulting surfaces moving over an occulted surface, FIG. 9G illustrates a moving occulted surface moving from under an occulting surface and moving over an occulted surface, FIGS. 9H and 9I illustrate inside and outside processor operation, FIG. 9J illustrates occulting processing of pixels in the proximity of a prior-edge and next-edge, and FIG. 9K illustrates range variable detail.

FIGS. 10F to 10J illustrate intersection processing, FIGS. 10K-1 to 10K-4 provide flow diagram and state diagram representations of intersection processing, FIGS. 10L to 10R provide flow diagram and state diagram representations of iterative occulting processing, FIG. 10S provides a flow diagram and state diagram representation of antistreaking processing, and FIG. 10T provides a flow diagram and state diagram representation of occulting processing.

FIG. 11, comprising FIGS. 11A, 11B, 11C, 11D, 11E, 11F, and 11G, illustrates smoothing processing; where FIG. 11A illustrates a pixel environment around an edge, FIG. 11B illustrates subpixel geometry for smoothing processing, FIG. 11C is a block diagram representation of one smoothing processing configuration, FIG. 11D illustrates one configuration of a multiplier and adder channel in accordance with FIG. 11C, FIG. 11E illustrates an arrangement for providing range and intensity weighting in addition to the color weighting described with reference to FIG. 11C, FIG. 11F showing sub-pixel coordinates for a plurality of adjacent pixels, FIG. 11G provides a flow diagram and state diagram representation of smoothing weight table lookup and processing operations, FIG. 11I shows comprehensive edge sub-pixel transitions, FIG. 11J shows comprehensive vertex sub-pixel transitions, FIG. 11K shows detailed edge sub-pixel transitions, FIG. 11L shows detailed vertex sub-pixel transitions, FIG. 11M shows smoothing operation in a first case, and FIG. 11N showing smoothing operation in a second case.

FIG. 12 illustrates scan processing.

FIG. 13, comprising FIG. 13A is a block diagram and schematic diagram representation of one configuration of a refresh address counter arrangement. FIG. 13B illustrates a refresh memory address counter arrangement, FIG. 13C illustrates vertical partitioning of a refresh memory, FIG. 13D illustrates horizontal partitioning of a refresh memory, FIG. 13E is a block diagram representation of a refresh memory configuration having vertical partitioning and horizontal partitioning, and FIG. 13F is a block diagram representation of an output register configuration for interfacing to a refresh memory.

FIG. 14, comprising FIG. 14A is a block diagram and schematic representation of horizontal partitioning in accordance with FIG. 13D; FIG. 14B is a block diagram and schematic representation of a combined horizontal and vertical partitioning arrangement in accordance with FIGS. 13C, 13D, 13E, and 14A; FIG. 14C is a detailed block diagram and schematic representation of the combined horizontal and vertical partitioning arrangement in accordance with FIG. 14B; FIG. 14D is a refresh memory map representation; and FIG. 14E is a block diagram representation of an alternate refresh memory configuration.

FIG. 15, comprising FIG. 15A is a block diagram representation of three color channels, FIG. 15B is a schematic representation of a direct digital-to-analog converter, FIG. 15G is a schematic representation of a combined direct and inverse digital-to-analog converter, FIG. 15H is a block diagram of three color channels having multiple intensity circuits, and FIG. 15I is a block diagram representation of a color circuit and intensity circuit arrangement interfaced to a refresh memory.

FIG. 22, comprising FIG. 22A is a block diagram representation, FIG. 22B shows image rotation, FIG. 22C shows translation of a viewport window over a memory map, and FIG. 22D is a flow diagram and state diagram representation of rotation and translation of a window.

Figure 1A:
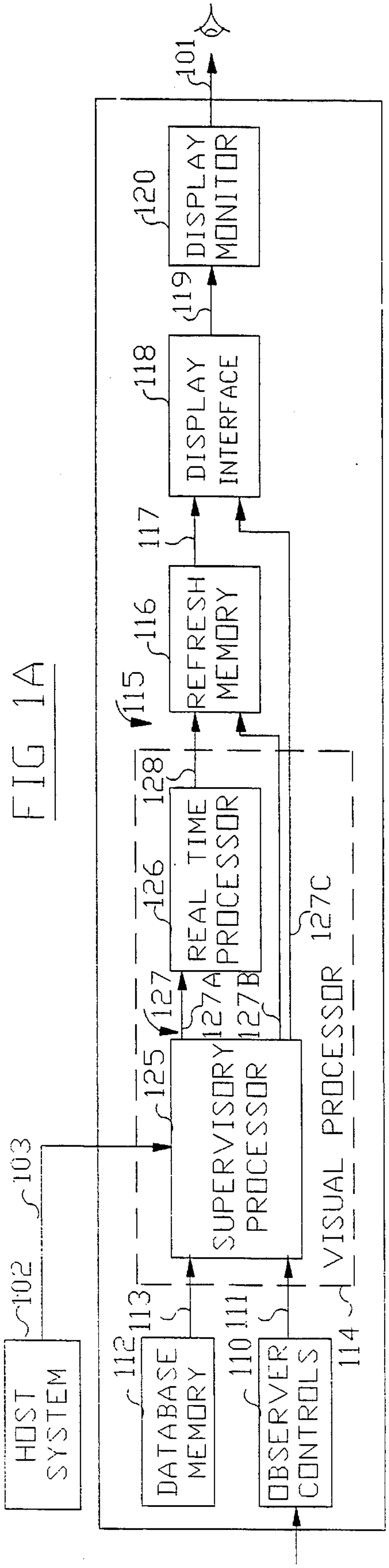
FIGS. 1A, 1B and 1C is a block diagram representation of one configuration of the system of the present invention; where

To facilitate disclosure of the illustrated embodiments, the components shown in FIGS. 1 through 22 of the drawings have been assigned reference numerals and a description of such components is given in the following detailed description. The components in the figures have in general been assigned reference numerals, where the hundreds digit of each reference numerals corresponds to the figure number. For example, the components in FIG. 1 have reference numerals between 100 and 199 and the components in FIG. 2 have reference numerals between 200 and 299, except that a component appearing in successive drawing figures has maintained the first reference numeral.

DETAILED DESCRIPTION

General

The system of the present invention can take any of a number of possible forms. Illustrative embodiments of various arrangements of the present invention are provided in the accompanying figures and are described hereinafter.

System Description (FIG. 1A)

A visual system is provided that generates images to an observer. These images may be synthesized from digital information stored in a database memory and processed with a visual processor. The visual system may be a stand-alone system generating images under its own independent control. Alternately, a visual system may operate in response to external inputs such as from an observer or from a host system. Stand-alone operation may be in response to a pre-programmed scenario, may be in response to operator controls provided with the visual system or may be otherwise provided. Operation in response to a host system permits the visual system to be used as a peripheral or terminal of the host system or otherwise controlled by the host system to provide the desired visual scenario. The visual system may be implemented in various forms, both internally and externally. Various configurations thereof are disclosed herein. It is intended that the various disclosed features may be usable in different combinations and variations thereof. However, it is not practical to provide a comprehensive combination of all of the desirable combinations of features disclosed herein because of the large number of combinations thereof. Therefore, the features will be disclosed in selected exemplary embodiments, where other combinations thereof can be provided from the teachings herein.

A block diagram of one configuration of the visual system of the present invention is shown in FIG. 1A. This configuration shows host system 102 generating host signal 103 to visual system 100. Visual system 100 generates visual images 101 in response to host signal 103 from host system 102, database memory signal 113 from database memory 112, and signals from other sources such as observer signals 111 from observer controls 110. Visual processor 114 comprising supervisory processor 125 and real time processor 126 processes input signals; such as host signals 103, observer signals 111, and database signals 113; to generate processed visual signals 115 including processed visual signals 127 from supervisory processor 125 and processed visual signals 128 from real time processor 126. Processed visual signals 115 are used to update refresh memory 116. Refresh memory 116 stores visual signals as updated in response to processed visual signals 115 and generates refresh signals 117 for refreshing monitor 120. Display interface 118 signal processes refresh signals 117 from refresh memory 116 to generate signal processed signals 119 to monitor 120. Monitor 120 generates visual information 101 to an observer in response to signal processed signals 119 from display interface 118. Refresh memory 116 may be a 2D refresh memory having a separate pixel word for each 2D pixel location to be displayed on a 2D monitor. In alternate embodiments, refresh memory 116 may have a 3D architecture for storing 3D information to be displayed on a 2D or a 3D monitor. However, for simplicity of discussion herein, a 2D refresh memory arrangement is discussed for displaying 3D information processed with visual processor 114 on a 2D display monitor 120.

Visual processor 114 may be implemented as a combination of supervisory processor 125 and real time processor 126. Supervisory processor 125 may be a non-real time processor such as a background processor and real time processor 126 may be a foreground processor, such as implemented as a special purpose processor. One configuration of real time processor 126 uses an incremental special purpose processor. Real time processor 126 performs many of the high speed real time operations. Supervisory processor 125 performs many of the slower speed non-real time operations. Real time operations may include changing an image in real time as an object moves through the display environment. Non-real time operations may include initializing real time processor 126 to initiate display of new object entering the display environment. In one configuration, real time processor 126 may introduce errors in the display and supervisory processor 125 may compensate for these errors. For example, real time processor 126 may have a lower resolution than supervisory processor 125, where supervisory processor 125 may periodically update real time processor 126 to bound error accumulation.

Database memory 112 stores database information to provide database signals 113 to visual processor 114. Database information may include information on stationary objects, moving objects, background objects, and other visual objects. Information may include object characteristics such as surfaces of an object, a surface normal vector for each surface of an object, edge end point coordinates for each edge of each surface of an object, color of each surface of an object, and other object-related information. The object may be placed in the display environment with translational and rotational of object positions which may be commanded from host system 102, from observer controls 110, and from other sources. Visual processor 114 processes database information 133 to generate processed visual information 115. Visual processor 114 performs coordinate translation and rotation to translate and rotate database information 113 from object-related coordinates contained in database memory 112 to observer-related coordinates for display on monitor 120. Visual processor 114 also performs other processing, such as scaling objects as a function of range. Visual processor 114 may also determine which pixel of which surfaces of an object are visible, in view of whether the surface is pointed towards or away from the observer and in view of occulting objects that may intervene in the observer's line-of-sight for the particular pixels.

The arrangement shown in FIG. 1A may be modified to have different configurations. For example, database memory 112 may be fully or partially included in host system 102 and database signals 113 may be fully or partially included in host signals 103 for controlling visual system 100. Similarly, observer controls 110 may be fully or partially contained in host system 102 and observer control signals 111 may be fully or partially included in host signals 103 for controlling visual system 100. Supervisory processor 125 and real time processor 126 may be partitioned to be different parts of the same processor, or to be pluralities of different processors, or to be a single processor, or to be a distributed processor, or to be a parallel processor, or to be a pipeline processor, or other alternates, variations, and combinations of such processors and various known processors.

Refresh memory 116 may be included in visual system 100 as shown in FIG. 1A. Alternately, refresh memory 116 may be excluded from system 100, where processed signals 115 may not be stored in refresh memory 116 but may be used directly to excite monitor 120. Refresh memory 116 can be synchronous or asynchronous in operation. One form of synchronous operation updates information in refresh memory 116 with processed signals 115 for each refresh operation with refresh signals 117. Alternately, updating of information in refresh memory 116 with processed visual signals 115 may be asynchronous. For example, updating information in refresh memory 116 out of synchronism with refresh signals 117, such as with rate asynchronism where updating is performed at a different rate than refresh, phase asynchronism where updating is performed at a different time then refresh, and period asynchronism where updating is performed at a different duration then refresh.

Interface 118 and monitor 120 may be supplemented or replaced with other output devices. For example, monitor 120 may be supplemented or replaced by a video tape recorder, photographic camera, or other recording device. Also, display interface 118 together with monitor 120 may be replaced with a digital recorder for recording refresh memory signals 117 on a digital tape recorder, disk memory, or other device.

Monitor 120 in a preferred configuration is a CRT raster scan display monitor. However, in alternate configurations, monitor 120 may be other display devices such as calligraphic displays, plasma displays, liquid crystal displays, or other display or may be other than a display medium such as a video recorder.

The form of the geometric information as it progresses through the various elements of FIGS. 1A to 1C will now be discussed. Geometric information in database memory 112 is in the form of initial conditions, such as initial condition edge endpoint coordinates. These initial geometric coordinates are communicated to geometric processor 130 under control of supervisory processor 125 for updating from initial conditions, such as zero angular conditions, to scenario-related conditions, such as angular orientations of an object in the viewport. Geometric information in geometric processor 130 can be maintained in updated form, such as updated edge endpoint coordinates. Transformed edge endpoint information from geometric processor 130 is output to edge processor 131 where it is converted from edge endpoint coordinates to edge pixel coordinates, providing edge pixels inbetween the edge endpoints to bound a surface. Edge pixel information from edge processor 131 is output to occulting processor 132 to fill surfaces bounded by the edge pixels. Smoothing processor 133 may be considered to be related to surface filling because it smooths the edge pixels so that they may be considered to be filled with subpixel information.

In view of the above, geometric information may be considered to be in edge endpoint coordinate-form from database memory 112 through geometric processor 130, in edge pixel form from edge processor 131 to occurring processor 132, and in surface form from occulting processor 132 and progressing therefrom. Surface information from occulting processor 132 and smoothing processor 133 is used to update refresh memory 116 for display on monitor 120.

The system of the present invention may be used in various applications. For example, host system 102 may be a simulation system for observer training and visual system 100 may be a terminal thereof, where host signals 103 control a training scenario using database signals 113 and observer signals 111 to generate simulation training images 101 with monitor 120. Alternatively, host system 102 may be a computer aided design (CAD) system for design of equipment and visual system 100 may be a terminal thereof, where host signals 103 control a design scenario using database signals 113 and observer signals 111 to generate a design-related image 101 with monitor 120. Alternatively, host system 102 may be a computer aided manufacturing (CAM) system for controlling a manufacturing processor and visual system 100 may be a terminal thereof, where host signals 103 control a manufacturing scenario using database signals 113 and observer signals 111 to generate a manufacturing-related image 101 with monitor 120. Alternatively, host system 102 may be an entertainment system for observer entertainment and visual system 100 may be a display thereof, where host signals 103 control an entertainment scenario using database signals 113 and observes signals 111 to generate an entertainment image 101 with monitor 120. Alternatively, host system 102 may be a process control system for controlling a process and visual system 100 may be a terminal thereof, where host signals 103 control a process scenario using database signals 113 and observer signals 111 to generate a process control image 101 with monitor 120. Alternately, visual system 100 may be a self-contained entertainment system, such as a video game system for generating visual images 101 in response to database information 113 and observer control signals 111 without the use of host system 102 generating host control signal 103.

An interfacing configuration can use buffer memories; such as a first-in-out (FIFO), last-in-first out (LIFO), push down stack, table, queue, and other interface memories. A discussion of a FIFO interface memory arrangement is illustrative of the various other memory interface arrangements.

Initial conditions may be generated, and loaded into a FIFO memory for temporary storage as they are generated. Edge processor 131 can unload initial conditions from the FIFO memory as it completes the generation of the previous edge and becomes available for generating another edge. The sequence of edge initial conditions loaded into the FIFO can be the sequence of edges to be generated by edge processor 131. A FIFO memory is characteristic of outputting information in the sequence that the information is input, such as outputting the earliest information stored therein prior to the outputting of later information stored therein.

Use of memories for interfacing has important advantages, such as reducing contention and permitting asynchronous operation of various processors. Operations, such as asynchronous and pipeline operations, can cause unequal processing loads, where one processor may be heavily loaded at a time that another processor is lightly loaded. Use of memories for interfacing processors that are operating asynchronously permits each processor to operate at its own rate. This is because short term differences in processing characteristics can be averaged by permitting a lightly loaded processor to unload an input interface memory and to load an output interface memory even when the processor is temporarily processing input conditions faster than they are being generated by an input processor and even when the processor is temporarily generating output conditions faster then they are being processed by an output processor. Such memory interfaces have particular advantages in a pipeline processor, where various processors in the pipeline can be operating asynchronously to each other.

Figure 17:
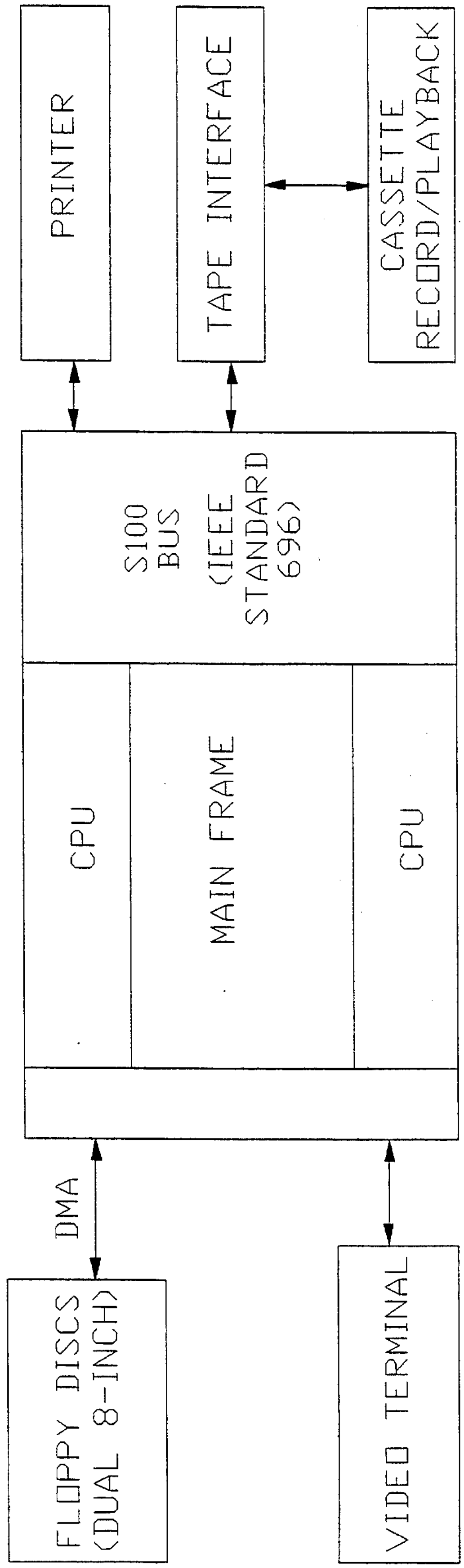
FIG. 17 illustrates an experimental system used for demonstrating various features of the present invention.

The features of the system of the present invention have been demonstrated on an experimental system, which is discussed herein, such as with reference to FIG. 17. Computer listings used to demonstrate a FIFO memory are attached hereto in the Tables Of Computer Listings in the sub-table entitled FIFO memory. These listings are illustrative of the various FIFO descriptions herein and provide supplemental details, such as in the annotations in the left hand columns and the details of the assembly language code in the middle column.

Flow diagrams may be used to disclose operation of a software configuration, a firmware configuration, and a hardware configuration of a device. Flow diagrams are well known for documentation of software and firmware implementations. State diagrams are well known for implementation of hardware configurations. Flow diagrams and state diagrams are similar, indicating the sequence of processing and the logic associated with the processing. It is herein intended that flow-type diagrams be representative of software flow diagrams, firmware flow diagrams, and hardware state diagrams for implementation of software, firmware, and hardware configurations of the teachings herein. Similarly, descriptions of hardware configurations herein may be implemented in software and firmware; such as with emulation methods and based upon the similarities between implementing software, firmware, and hardware configurations; such as with flow diagrams and state diagrams.

Multiple Processing Loops

A multiple processing loop arrangement can be provided that has a lower precision and higher speed processor in combination with a higher precision and lower speed processor to achieve high precision and high speed. This general architecture will be discussed relative to a higher speed incremental geometric processor in combination with a lower speed higher resolution supervisory processor to illustrate the features.

A high speed incremental processor 130 can be used to process geometric information in real time and a supervisory processor 125 can be used to process whole number geometric information at slower speed for correcting error buildup in the higher speed incremental processor. This facilitates a simpler real time processor that is tolerant of error buildup and facilitates reduced supervisory processor loading with non-real time image generation. In this hierarchial approach, supervisory processor 125 re-computes parameters in non-real time to higher precision for bounding errors. Therefore, the incremental processor may be permitted to make approximations to facilitate simple real time processing. Simplified real time processing may be achieved, with tolerance of certain error mechanisms for simplicity of implementation; used in conjunction with whole number processing at high precision for bounding errors and at low rate for reducing complexity.

Bounding of errors and compensating for real time processing approximations may be considered to be supervisory operations of the supervisory processor that are performed in conjunction with other supervisory operations; such as inter-system and intra-system communication, and initial condition generation.

The discussion for bounding of errors applies to certain processing and not to other processing. For example, bounding of error buildup in the incremental processor for translation, rotation, scaling, and other related geometric processing may be relatively important because of the potential error buildup thereof. However, processing such as edge generation with the edge processor and edge smoothing with the smoothing processor may not need such error bounding processing because errors introduced therein may not propagate and may be inherently bounded.

Real time processor 126 may implement relatively simple occulting processing in real time and supervisory processor 125 may update real time processor 126 in non-real time to compensate for processing ambiguities that may be introduced by the relatively simpler processing of real time processor 126. In this manner, high speed real time foreground processing may be performed in a relatively simple processor implementation that takes advantage of simplified processing, where ambiguities may be compensated for by supervisory processor 125 operating in non-real time. Real time processor 126 may operate hundreds or thousands of times faster than supervisory processor 125. For example, a thirty frame per second update rate performed with real time processor 126 can be supplemented with a three second or thirty second update period performed with supervisory processor 125. Such supervisory processor processing speeds alone may not be tolerable for real time systems, such as training simulator systems. However, when supplemented with the higher speed update rate of real time processor 126, the slower iteration rate of supervisory processor 125 may be acceptable. Further, supervisory processor 125 may include a priority structure, where tasks are prioritized and where higher priority tasks are performed at a higher rate than lower priority tasks. For example, faster moving objects may have a higher priority than slower moving objects and slower moving objects may have a higher priority than stationary objects. Also, occulting processing may have a higher priority than edge smoothing processing because ambiguities introduced with real time processor 126 for occulting processing may be accumulating and ambiguities introduced with real time processor 126 for edge smoothing may be non-accumulating. Other priority structures may be used with supervisory processor 125.

Propagation of errors in digital systems is an important consideration. Digital errors propagate as a function of roundoff and other digital characteristics. Digital errors also propagate in incremental processors as a result of the integration implementation. However, these errors can be bounded to maintain operation within the desired precision. Various error bounding implementations will now be discussed.

Whole number computations introduce errors such as roundoff errors. Supervisory processor 125 can be implemented with a high resolution operand word, such as a 24-bit operand word, to reduce errors to a very small value. Incremental computations introduce errors, such as DDA difference equation errors. Propagation of incremental errors can be bounded by periodically recomputing the whole-number value of the parameters from the fundamental parameters; such as from the database information, environment information, and driving functions.

An incremental geometric processor can be a relatively high speed iterative processor that iteratively and incrementally propagates the image in accordance with the scenario. Errors, such as roundoff errors and integration errors, can propagate over a period of time and may build up to significant errors if unbounded. However, an error bounding implementation can be provided. Roundoff errors can be reduced with an increased word length. A 16-bit word length for an incremental geometric processor is discussed herein. However, other word lengths may be implemented, such as a lower resolution 12-bit word length or higher resolution 20-bit, 24-bit, or 32-bit lengths. Integration errors may be reduced with a higher order corrections, such as a trapezoidal correction to better approximate digital integration with incremental difference equations. Such a corrections is discussed in U.S. Pat. No. 3,586,837 by Hyatt et al. These correction methods reduce error buildup but do not bound error buildup. A method for bounding error buildup in an incremental geometric processor will now be discussed.

Supervisory processor 125 can derive parameters that are discussed herein as being implemented with incremental processing in an incremental geometric processor; such as translation, orientation, and scaling with whole number processing; thereby bounding errors to whole number processing errors, such as roundoff type errors. Such whole number errors may be relatively small and may be bounded by the word length of the whole number supervisory processor. However, such whole number processing may require more processing resources than incremental processing. Therefore, a combination of incremental processing in a high speed iterative loop and whole number processing in a low speed outer error compensation loop facilitates efficient high speed incremental processing and bounding of errors with high resolution whole number processing. In this arrangement, an incremental processor generates image information in incremental form at the frame rate or other relatively high rate and a supervisory processor generates image information in whole number form to high resolution at a lower rate. For example, the incremental processor may update the image once every 33-milliseconds for frame rate updating and the supervisory processor may re-compute the incremental parameters once every 30-seconds for error bounding. In this manner, the supervisory processor may be recomputing the parameters in whole number form at one thousandth of the rate that the incremental processor is computing the parameters, thereby providing a relatively small load on the whole number supervisory processor. The supervisory processor re-computing the parameter in whole number form can bound error built up in the incremental processor. As the parameters are recomputed in whole number form, they may be compared with the corresponding incremental derived parameters for correction thereof.

In one configuration, the whole number re-computed parameters may be loaded into the incremental processor in place of the incrementally derived corresponding parameters to correct incremental error buildup. However, this may not update the various intermediate parameters such as subcomputation results used to derive the re-computed parameters. Therefore, an alternate method may be used where the error is corrected with an incremental driving function. The driving function may be generated by subtracting the whole number re-computed parameter from the corresponding incrementally derived parameter to obtain the difference therebetween and to generate an incremental driving function to the incremental processor, such as with a whole number to incremental converter, to drive the incremental processor to correct the error.

Simplified incremental processing capability in combination with high resolution whole number processing capability will now be discussed. Processing can be performed in simple form by making simplifying assumptions. For example, occulting processing can be significantly simplified by temporarily ignoring certain conditions; such as the conditions discussed as apertures, intervening occulted edges, and moving occulted surfaces becoming visible. Totally ignoring these conditions may not be permissible because these conditions may cause errors in the image, such as improperly occulted surfaces. However, if simplified occulting is tolerated for real time operation and is corrected with the supervisory processor operating in non-real time, such as with conventional occulting processing; then a reduction in occulting processor complexity may be achieved with an acceptable level of precision. In this manner, the occulting processor may be implemented with occulting processing approximations to simplify real time occulting processing. The supervisory processor can perform this occulting processing in high resolution whole number form at a rate slower than real time rate, such as once per second, and can correct errors that may have developed with simplified real time occulting processing. This discussion is not intended to mean that occulting effects, such as apertures and intervening edges, will not be performed by the occulting processor in real time; but is intended to be exemplary of the present feature of using simplified real time processing in combination with bounding of error buildup by re-computing the parameters at a slower non-real time rate.

An adaptive error bounding scheduling arrangement will now be discussed. This scheduling arrangement can keep track of the error causing operations, such as driving functions, to facilitate error bounding as a function of error buildup. In this manner, error bounding processing need only be performed for an object when required as a result of error buildup and need not be performed for an object when not required merely as a result of an iteration rate. This can significantly reduce the processing bandwidth associated with error bounding selectively, adaptively, computationally, or otherwise selectively scheduling error bounding processing. Error bounding can be provided on an as-required basis. Incremental errors can build up as a function of motion and hence as a function of driving functions. Therefore, driving functions can be added, integrated, or otherwise accumulated to indicate when error bounding processing for an object is necessary. For example, an incremental driving function parameter can be accumulated in the Y-register of a DDA incremental element for each object and for each degree of freedom; i.e.; X, Y, Z, θ, Ø, and Ψ could be accumulated for each object. Alternately, vector sums (i.e.; RSS), scaler sums, or other combinations thereof can be accumulated as a composite indication of error buildup. These incremental driving function parameters can be tested periodically to determine if a error bounding threshold is reached. When an error bounding threshold is reached, the identification of the object can be placed in an error bounding queue or otherwise communicated to the supervisory processor to schedule error bounding computations for that object.

Hierarchial Visual Complexity

The visual complexity of an environment may be considered to be in a hierarchial form to better illustrate features of the present invention, in particular the change-related refresh memory updating. These considerations will be illustrated with the following example. A base of the hierarchy may be the total environment in which the observer may move during the scenario. This total environment may involve an environment database of 100,000 edges. The next level in the hierarchy may be the portion of the environment within the observer's field-of-view, such as defined by the volume of space encompassed by the refresh memory. The edges contained in this volume may be treated in the real time processor and may total 2,000-edges, about 2% of the total environment database. The next level in the hierarchy may be the number of edges that are visible to the observer; where non-visible edges, such as determined through visibility and occulting processing, are removed. Visible edges may be stored in refresh memory and may total only 500-edges, which is about ½% of the 100,000-edges in the environment database and 25% of the total number of edges in the real time processor within the observer's field-of-view. The next level in the hierarchy may be the number of visible edges-that are moving. There may be only 100-visible moving edges. This is only 1/10% of the number of edges in the total environment, 5% of the total number of edges in the observer's field of view, and 20% of the number of visible edges in the observer's field-of-view. In this hierarchy, the front end processor; i.e., the real time processor; will process the 2,000-edges in the observer's field-of-view; but the refresh memory update logic may only have to update 100-edges that are moving and visible within the observer's field-of-view.

The above described hierarchial processing arrangement may characterize the nature of the related processors. For example, the geometric processor may have a 2,000 edge processing load while the refresh memory update logic may only have a 100-changing edge processing load. Therefore, fill processing such as occulting and edge smoothing may have a relatively light processing load. Further, fill processing; such as edge, occulting, and smoothing; may be performed on a pixel-by-pixel basis along a visible moving edge and therefore may be performed in a related manner together as subsets of the same moving edge update processing. Such an implementation of consistent edge, smoothing, and occulting processing further reduces computational loading of the visual processor.

Program Control Configuration

The arrangement discussed herein may be implemented in a program control configuration, such as a software configuration or firmware configuration. For example, as shown in FIG. 2, visual processor 114 may be implemented with a general purpose computer under program control, such as a PDP 11 computer or VAX computer manufactured by Digital Equipment Corporation, or may be implemented under firmware control with a microprocessor, such as the AMD-2900 manufactured by American Micro Devices. Operations discussed herein for real time processor 126 implemented with special purpose processing logic may alternately be implemented under program control, such as software control or firmware control in a general purpose computer or microprocessor respectively. Refresh memory 116 may be part of the memory of the general purpose processor or microprocessor and may be accessed on a direct memory access (DMA) basis to provide video signals from refresh memory 116 to display interface 118. Alternately, visual processing performed by visual processor 114 may be performed wholly or in part in host system 102. For example, database memory 112 may be a disk memory associated with host system 102, observer controls 110 may be operator controls associated with host system 102, visual processor 114 may be implemented under program control in host system 102, and refresh memory 116 may be included in the main memory or other memory of host system 102 having refresh signals 117 output such as under DMA control.

A program control implementation of a visual system may be lower in cost and simpler in hardware implementation but may be lower in speed and may not be operable in real time. However, many applications may permit non-real time operation. For example, implementation of real time processor 126 under firmware control in supervisory processor 125 may reduce update rates to slower than one update per second. This may be satisfactory for many applications, such as some CAD/CAM system applications. Incremental processing discussed herein may be performed under program control. Coordinate rotation, translation, scaling, and other processing may be performed in whole number form, such as in supervisory processor 125 as an alternate to the disclosed incremental form in real time processor 126.

CCD Implementation

Conventional CGI systems are implemented with digital processors. An arrangement discussed herein has been discussed in the embodiment of using digital processors, such as digital differential analyzer processors. However, an alternate embodiment can be implemented using analog processors or hybrid processors. One analog or hybrid processor embodiment can use charge coupling devices (CCDs) such as discussed in the patent applications referenced herein and in the CCD disclosure herein.

CCDs are analog signal processing devices that can store analog signals and process analog signals. They can be combined with digital circuits such as in the form of a multiplying digital to analog converter (DAC) to facilitate hybrid multiplication. Alternately, they can be implemented in an analog multiplication arrangement. Various forms of hybrid and analog signal processing can be used including trigonmetric processing, arithmatic procesing, and logic processing. For example, an Euler angle transform arrangement discussed above using DDA processors can be implemented with hybrid processors. Such transformation involves sum of the products processing, where a vector magnitude is multiplied by sine and cosine functions of the angles to generate components to be summed with other components to provide the transformed vectors. Sum of the product computations can be performed relatively simply with hybrid circuits. For example, a digital sine word or cosine word can be connected to multiplying DACs, where the vector to be resolved in analog signal form can be multiplied thereby by cascading multiplying DACs having an analog parameter input, a digital trigometric sine or cosine function input, and an analog output. The analog output may then be connected to the analog input of the next multiplying DAC state. Summation may be performed in the analog domain with differential amplifiers and operational amplifiers. Other analog signal processing may also be provided. For example, CCD memory circuits can be used for is pixel map memory discussed herein and for other memories discussed herein.

Figure 1C:
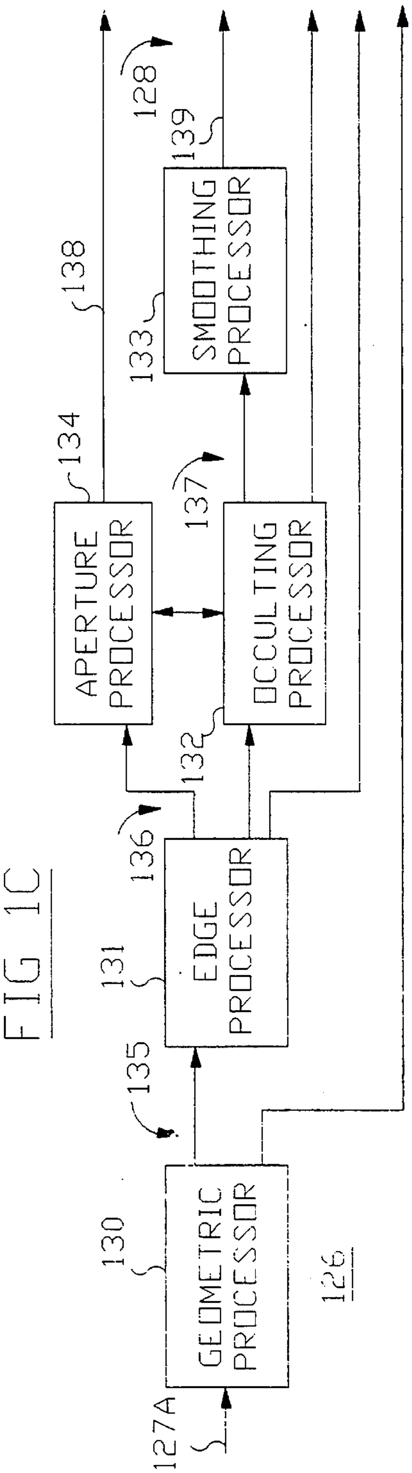
Figure 1B:
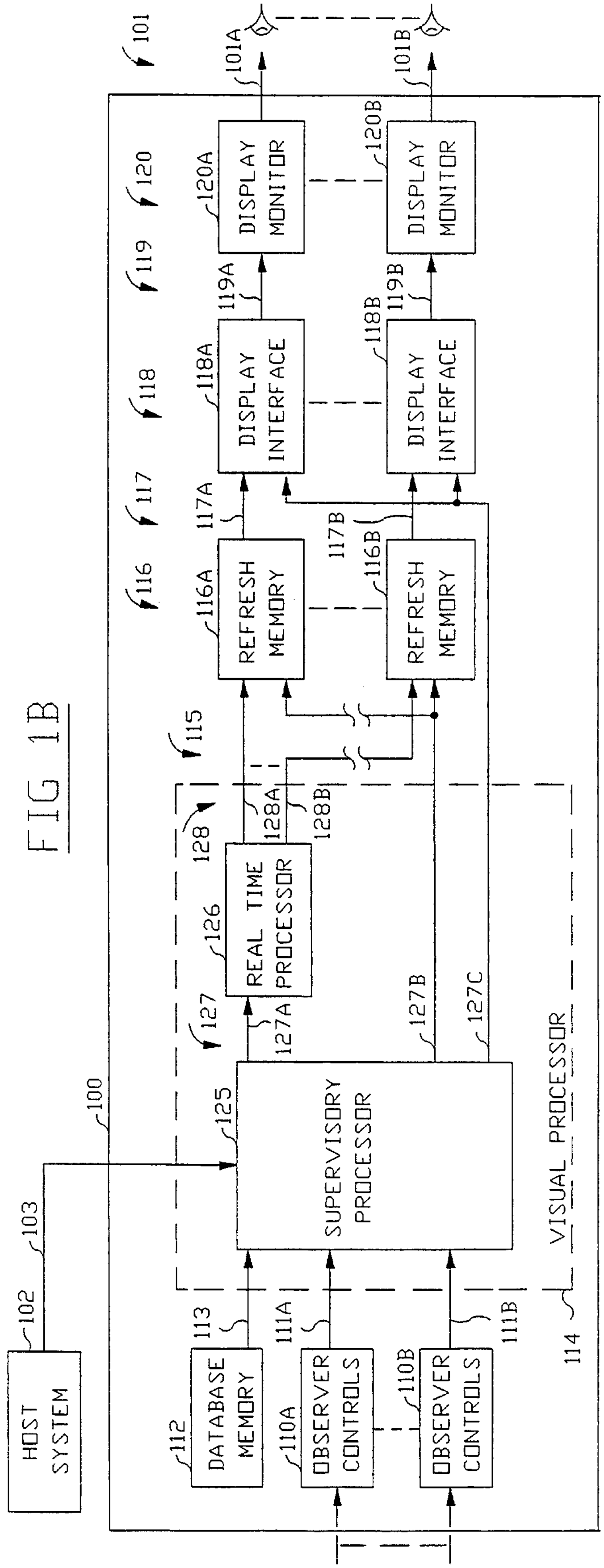

Multiple Terminal System (FIG. 1B)

Visual system 100 shown in FIG. 1A was discussed in a single terminal configuration having a single monitor 120 for simplicity of discussion. However, visual system 100 can be provided in a multiple terminal configuration (FIG. 1B), where a plurality of monitors 120 share portions of system 100. Multiple monitors may be configured as multiple master monitors 120A–120B and may be combined with one or more slave monitors. A master monitor is herein intended to mean a monitor that can display information different from the information displayed on other master monitors. A slave monitor is herein intended to mean a monitor that displays information the same as information displayed on master monitor. A slave monitor can share portions of system 100 with other related slave monitors and the related master monitor. A master monitor and the slave monitors related thereto may share some electronics with other master monitors and the slave monitors related thereto or may not share any other electronics therewith.

Sharing of electronics such as database memory 112, visual processor 114, refresh memory 116, and display interface 118 between various monitors is discussed below. Sharing of electronics therebetween may be combined with some non-sharing of electronics therebetween, such as with some dedicated electronics for each master terminal in various embodiments of system 100. Sharing of electronics between a plurality of terminals may provide greater protection against overload because of the greater amount of electronic resources that may be allocated and the greater probability that the loading will be nearer an average condition when averaged over a greater number of master terminals. Also, processor resources can be allocated to processing tasks of a plurality of master terminals that need processing resources as a function of priorities and processing bandwidth requirements. For example, if one master terminal has a heavy processing load because of a complex scene and other terminals have light processing loads because of simple scenes, additional processing resources such as geometric processors and edge processors may be assigned to the higher priority and heavier processing loads of the monitor with the heaviest work load. Therefore, sharing of common electronics between a plurality of terminals can provide important advantages in resource allocation and overload protection in addition to reduced costs.

Host system 102 may be common to a plurality of terminals. For example, a simulation system may have a plurality of terminals for different views of the same scene for the same observer or different scenes for different observers. Different scenes for the same observer may be implemented as different scenes from a plurality for cockpit windows in a pilot training embodiment. Different scenes for different observers may be a CAD/CAM system having a plurality of terminals for different designers designing different devices and time sharing use of host system 102.

Database memory 112 may be shared between a plurality of master terminals (FIG. 1B). Database memory 112 may have database information for objects such as an object library. Each of a plurality of master systems may use combinations of the same objects and of different objects from database memory 112 to establish different scenes and different scenarios such as under control of host system 102 and as processed by visual processor 114 and refreshed with refresh memory 116. Therefore, object information from database memory 112 can be shared by a plurality of visual terminals.

Visual processor 114 may be shared between a plurality of master terminals (FIG. 1B). Visual processor 114 has processing resources for processing object information for display on a display monitor. Object information processed with visual processor 114 may be shared with a plurality of master display terminals. For example, supervisory processor 125 may be a general purpose microprocessor having program routines that can be used for processing of visual information, relatively independent of which of a plurality of master terminals are displaying that visual information. Similarly, real time processor 126 may be a programmable processor that can be used for processing of visual information relatively independent of which of a plurality of master terminals are displaying that visual information. Similarly, real time processor 126 has refresh memory control logic such as edge processors, smoothing processors, and occulting processors that can be used for processing of visual information relatively independent of which of a plurality of master terminals are displaying that visual information. Also, a single edge processor may have the ability to accomodate processing requirements in excess of the requirements for a single terminal having basic system capability. Therefore, one edge processor may be shared to meet the processing requirements of a plurality of different master terminals.

Refresh memory 116 in one multiple terminal configuration may be dedicated to a single one of a plurality of master terminals (FIG. 1B). However, configurations can be provided for sharing portions of refresh memory 116 or the whole of refresh memory 116 with a plurality of visual terminals. For example, an application having consistent but different displays on a plurality of master terminals may be able to share portions of refresh memory with different terminals. Also, auxiliary memories having color, range, and other object information may be shared with a plurality of master monitors. Similarly, control electronics, such as raster scan conversion address counters and raster scan synchronization logic can be shared between a plurality of master terminals.

Display interface 118 in one multiple terminal configuration may be dedicated to a single one of a plurality of master terminals (FIG. 1B). However, portions thereof may readily be shared between a plurality of master terminals. For example, hybrid processing resources; such as for shading, texturing, and other processing may be implemented in a form for time sharing between a plurality of master terminals.

In applications where processing resources or memory resources may not be shared due to a system requirement, important economies may still be achieved with shared use of overhead circuitry. For example, a single sync pulse generator can be shared between plurality of visual processors and CRT synchronization circuitry can be shared between a plurality of monitors. Also, overhead circuitry associated with the geometric processor can be shared between geometric processors for different master terminals similar to the sharing thereof with a plurality of geometric processor modules for the same master terminal.

In view of the above, important economies may be achieved by sharing portions of visual system 100 with a plurality of monitors. However, significant advantages accrue from the dedication of a single visual system 100 to a single terminal, such as implementation of special requirements with self contained dedicated electronics rather than time shared electronics. Therefore, portions of visual system 100 may be shared in some applications and not shared in other applications depending on system requirements and trade off considerations.

The benefits of a multiple terminal system in applications needing multiple terminals include reduced price and greater reliability. For example, and implementation of a quad terminal configuration may have a price per terminal of only one-half of the price per terminal of an implementation of a single self-contained terminal configuration.

Real Time Processor (FIG. 1C)

Real time processor 126 has been described with reference to FIGS. 1A and 1B. A more detailed discussion of one configuration of real time processor 126 will now be provided with reference to FIG. 1C.

Real time processor 126 can include various processors, such as for processing visual information in real time to update refresh memory 116. Various configurations of real time processor 126 (FIGS. 1A–1B) may be considered to be a pipeline processor, implicit in the particular arrangement of interconnecting the various processors in real time processor 126 in pipeline form; may be considered to be a parallel processor, implicit in the parallel configuration of multiple processors such as multiple edge processors; may be considered to be an array processor, implicit in the array of processor elements; may be considered to be a distributed processor, where processing tasks are distributed among different processors; and may be considered to be a multiprocessor, implicit in the multiple processors included therein. Other characterizations are implicit in the real time processor architecture.

Real time processor 126 can be provided in different configurations. One configuration is shown in FIG. 1C having real time processor 126 including multiple processors such as geometric processor 130, edge processor 131, occulting processor 132, smoothing processor 133, and aperture processor 134. These processors may be used individually or in combination. Also, real time processor 126 may include other combinations of processors 130–134 and other processors. The configuration shown in FIG. 1C will herein be discussed as exemplary of various different architectures.

Geometric processor 130 performs processing of environmental and scenario information to construct a 3D environment. One configuration of geometric processor 130 will now be discussed. Geometric processor 130 receives input information 127A, such as object oriented edge endpoint coordinates and driving function signals, and generates output signals 135 which may include translated, rotated, and scaled edge endpoint coordinates and auxiliary information. Input information 127A may include surface-related polygons having coordinates of edge endpoints or polygon verticies in object-related coordinates. Object coordinates are translated to locations in the environment and are rotated about an object-related coordinate origin to provide the proper location and orientation. Auxiliary processing such as scaling of an object to the proper size, deriving initial conditions for other processors such as slope initial conditions for edge processor 131, surface normal vector processing for visibility determination, and other auxiliary processing is also performed in geometric processor 130.

In one configuration, geometric processor 130 may be an incremental processor, such as implemented with a digital differential analyzer (DDA). Alternately, geometric processor 130 may include different types of stored program processors, special purpose processors, and other processors to perform the desired processing. For example, geometric processor 130 may be implemented with a microprocessor or a plurality of microprocessors to perform the geometric processing. Alternately, geometric processor 130 may be implemented with a hybrid processor, such as using analog summing multiplying DACs for nonlinear processing, or other processors. Similarly, geometric processor 130 may be implemented as an analog processor; such as using operational amplifiers, analog mutlipliers, and other analog processing elements. In a configuration disclosed in detail herein, geometric processor 130 is configured in the form of an incremental processor to illustrate the forms of processing therewith and one configuration thereof. An incremental geometric processor has many advantages including compatibility with an incremental refresh memory for updating changes therein; relatively simple processing operations, such as implementing nonlinear processing of multiplication and trigonometric functions with linear summing-type operations; and other advantages. Geometric processor 130 may include a plurality of geometric processors for simultaneously processing geometric conditions for different surfaces, objects, and portions of a scene.

Edge processor 131 processes edge endpoint data 135, such as startpoint and endpoint coordinates, to generate pixel coordinate information 136 along the edge. Edge endpoint coordinates 135 may be provided to other processors, such as aperture processor 134 and occulting processor 132, and may be provided to refresh memory 116 for determining changes in occulting along the edge with occulting processor 132, apertures enclosed by a surface with aperture processor 134, and storing of edge information such as with a flag in refresh memory 116. Edge processor 131 may generate prior-edge pixels and next-edge pixels, such as to define a change in surface conditions as a result of motion; where occulting processor 132 determines occulting in the intervening area between the prior-pixel and the next-pixel for filling with the occulting surface pixel conditions. Edge processor 131 may include a plurality of separate edge processors for simultaneously generating different edges in parallel processor form.

Occulting processor 132 provides occulting processing for filling of changed pixels, such as pixels inbetween a prior-edge and a next-edge of a surface in a change-responsive refresh memory configuration. Alternately, occulting processor 132 can perform other occulting processing such as using recursive processing, partitioning of the environment to isolate objects, hidden line removal, and other processing. Occulting processor 132 may include a plurality of occulting processors for simultaneously determining occulting for different pixels, edges, surfaces, objects, or portions of the scene. Occulting processor 132 generates pixel fill information 137 in response to generation of edge pixel information 136 from edge processor 131, such as by performing change-related occulting processing of pixel information inbetween a prior-edge pixel and a next-edge pixel associated with a moving edge.

Smoothing processor 133 can perform edge smoothing to reduce aliasing, increase effective resolution, and provide a more effective and pleasing display. Smoothing processor 133 reduces the effect of staircasing associated with raster scan type displays. For calligraphic or other types of displays, smoothing processor 133 may not be necessary and may be deleted. Smoothing may be performed with many methods, such as area weighting of adjacent colors. With this area weighting processing method, pixel color is a weighted sum of the colors of the adjacent surfaces traversing the edge pixel, where weighting of the color associated with a particular surface traversing an edge pixel is proportional to the area of the pixel exposed to that surface. Other smoothing processors can be used in place thereof, such as pulse rate modulated smoothing processors. Smoothing processor 133 may include a plurality of smoothing processors for simultaneously smoothing different edge pixels, edge vectors, surfaces, objects, or portions of a scene.

Aperture processor 134 may provide for determining which surfaces encompass or surround a particular aperture pixel or pixels. These surfaces may be visible, nonvisible, or partially visible. One aperture processor configuration tests all edge pixels of a particular surface with the aperture pixel to determine if the edge pixels traverse all 4-quadrants around the aperture pixel and therefore surround the aperture pixel. Other aperture processing arrangements can be provided, such as searches for surfaces surrounding a particular pixel or other processors. Aperture processor 134 generates information 138 on surrounding of aperture pixels with surfaces in response to generation of edge pixel information 136 from edge processor 131.

Alternate configurations of real time processor 126 may be provided. For example, certain of the processors shown in FIG. 1C may not be included in real time processor 126 and other processors not shown in FIG. 1C may be included in real time processor 126.

Signals 127A, 135–138, and 128 are shown in simplified form for purposes of illustration of one configuration of signal flow, illustrating only some of the primary signal flow paths. These illustrated signal flow paths can be changed by addition, deletion, and re-routing to facilitate the desired configuration. For example, signal 127A from supervisory processor 125 to geometric processor 130, signal 135 from geometric processor 130 to edge processor 131, signal 136 from edge processor 131 to occulting processor 132, signal 137 from occulting processor 132 to smoothing processor 133, and signal 139 from smoothing processor 133 to refresh memory 116 provides a form of pipeline arrangement. Other signal flow paths may be provided; where, for example, geometric processor 130 and edge processor 131 may communicate information directly to refresh memory 116 with signals 128. Also, aperture processor 134 can be implemented in a parallel signal flow path as shown in FIG. 1C or alternately in a sequential signal flow path, such as inbetween edge processor 131 and occulting processor 132. Also, supervisory processor 125 is shown communicating with geometric processor 130. However, other signal flow paths may be provided, such as for supplying initial conditions to edge processor 131, occulting processor 132, smoothing processor 133, aperture processor 134, and other processors that may be provided. Also, processors 130–134 may provide two-way communication with supervisory processor 125 for receiving initial conditions and control signals therefrom and for providing status and processed information thereto.

Experimental System

An experimental system has been developed and reduced to practice in order to demonstrate various features and capabilities of the system of the present invention. This system is sometimes referred to VIPER-X, VIsual PERspective-eXperimental. It is implemented on an S-100 bus-based computer system to emulate important portions of the final system.

The hardware and software used to implement this system and the demonstrations are disclosed in various disclosure documents filed with the U.S. Patent and Trademark Office (PTO); as discussed below. These disclosure documents are herein incorporated by reference.

The emulation system, including software and hardware, is described in Disclosure Document No. 104,507 (Nov. 30, 1981) at pages 3 to 10 and 46 to 196; Disclosure Document No. 109,837 (Jul. 19, 1982) at pages 35 to 41; Disclosure Document No. 114,269 (Jan. 26, 1983) at page 7; and Disclosure Document No. 115,301 (Mar. 2, 1983) at pages 98 to 725.

The emulated system; including listings, flow charts, traces, graphical printouts, and other printouts; are shown in Disclosure Document No. 104,507 (Nov. 30, 1981) at page 10 to 46; Disclosure Document No. 105,339 (Jan. 12, 1982) at pages 47 to 103; Disclosure Document No. 106,056 (Feb. 12, 1982) at pages 38 to 243; Disclosure Document No. 107,525 (Apr. 12, 1982) at pages 29 to 65; Disclosure Document No. 109,065 Jun. 18, 1983) at pages 27 to 162; Disclosure Document No. 109,337 (Jul. 19, 1982) at pages 23 to 34 and 42 to 84; Disclosure Document No. 110,457 (Aug. 17, 1982) at pages 14 to 44 and 100 to 222; Disclosure Document No. 111,128 (Sep. 16, 1983) at pages 3 to 35 and 39 to 273; Disclosure Document No. 111,980 (Oct. 21, 1982) at pages 3 to 128; Disclosure Document No. 112,841 (Nov. 22, 1982) at pages 110 to 168; Disclosure Document No. 113,628 (Dec. 27, 1982) at pages 20 to 118; Disclosure Document No. 114,269 (Jan. 26, 1983) at pages 8 to 102; Disclosure Document No. 115,301 (Mar. 2, 1983) at pages 23 to 27; and Disclosure Document No. 117,613 (May 27, 1983) at pages 24 to 251.

The experimental system 1700 shown in FIG. 17 includes an S-100 bus mainframe 1710 and various peripheral devices. The mainframe includes a microprocessor board with an Intel 8080 microprocessor, 64K of RAM, and various input and output cards to interface to the peripherals. The peripherals include dual 8 inch floppy disks 1712, a video terminal 1714, a printer 1716, and a tape cassette with interface 1720. Software includes the CP/M disk operating system (DOS), the Symbolic Interactive Debugger (SID), the macro assembler (MAC), and various auxiliary routines such as LOAD.

Various features of the present invention have been reduced to practice with the experimental system. Emulated modules include sypervisory processor 125, database memory 112, observer controls 110, geometric processor 130, edge processor 131, occulting processor 132, smoothing processor 133, aperture processor 134, refresh memory 116 display interface 118, and display monitor 120. Many of the features discussed herein for these modules have been emulated on the experimental system. For example, multitudes of edge processor features ranging from edge startpoint processing to edge endpoint processing and including extensive iterative processing therebetween has been emulated in detail as set forth hereinafter in the edge processor and smoothing processor listings in the Tables Of Computer Listings the degree that the experimental system provides end-to-end operation (from database memory to CRT display monitor) of the system under control of the supervisory processor to provide graphical moving images.

Supervisory Processor

Figure 10A:
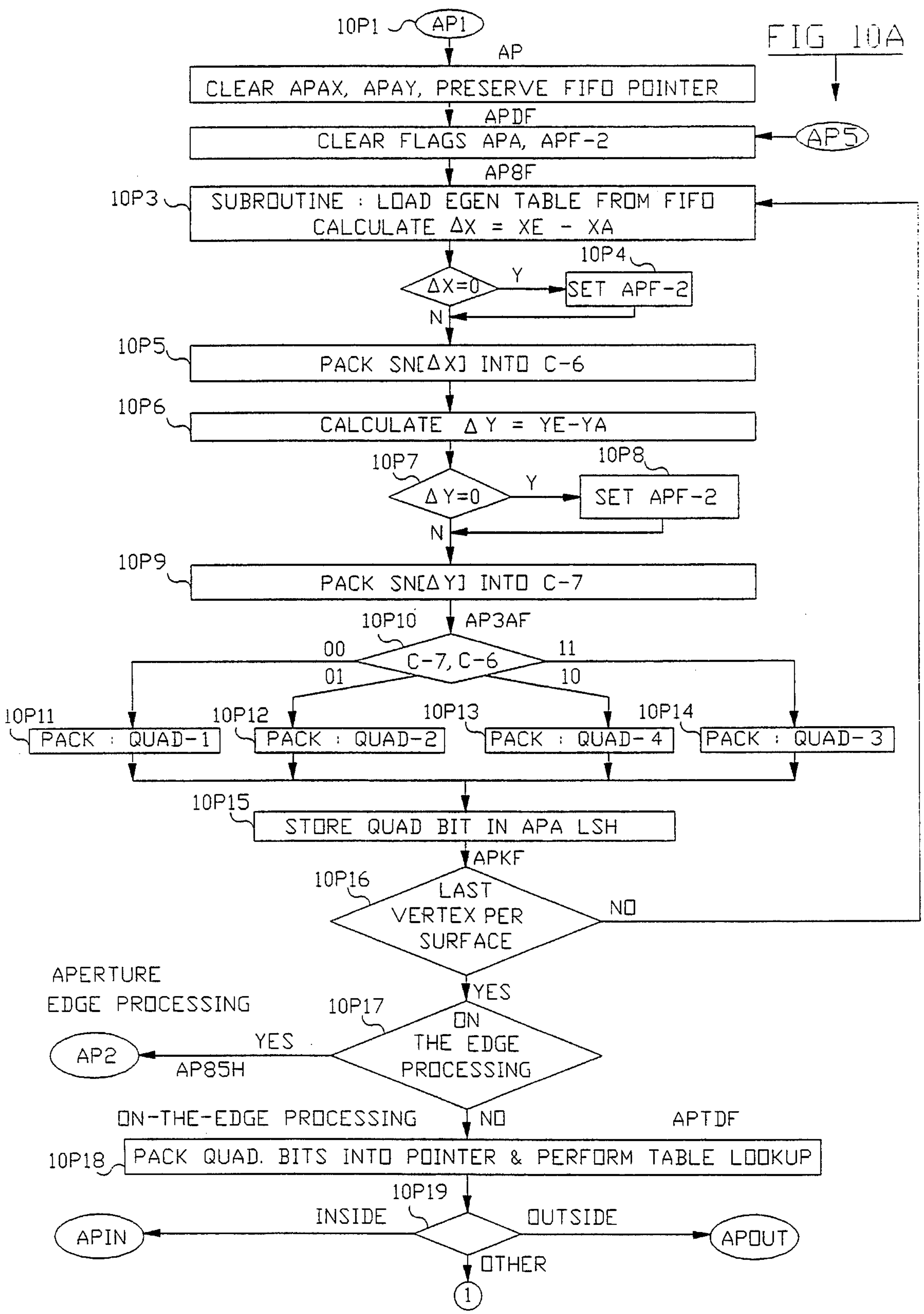
FIGS. 10A, 10B, 10C, 10D, 10E, 10F, 10G, 10H, 10I, 10J, 10K, 10L, 10M, 10N, 10O, 10P, 10Q, 10R and 10S illustrates occulting processing, where FIGS. 10A to 10E provide a flow diagram and state diagram representation of one configuration of aperture processing.
Figure 10B:
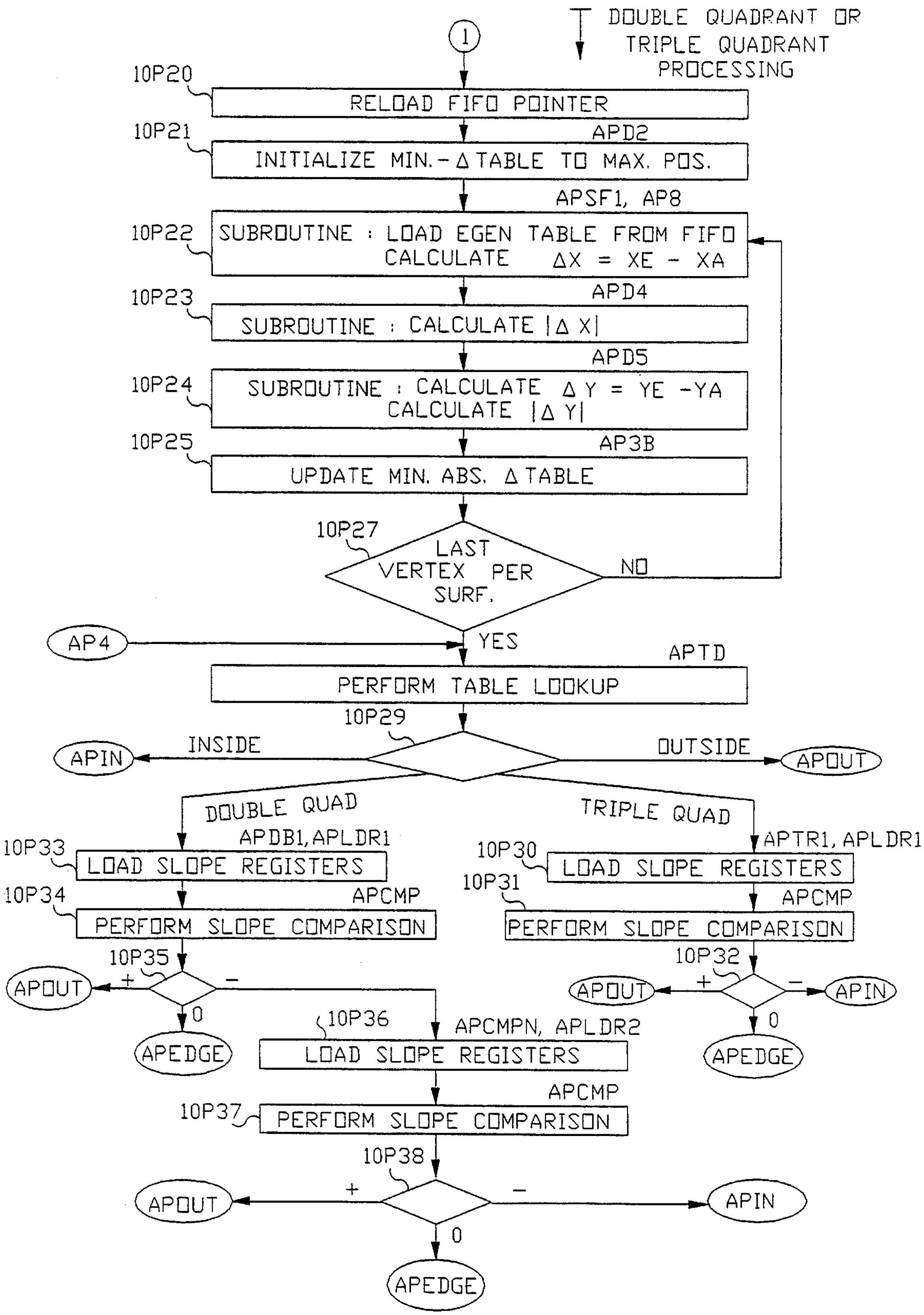
Figures 1, 10C:
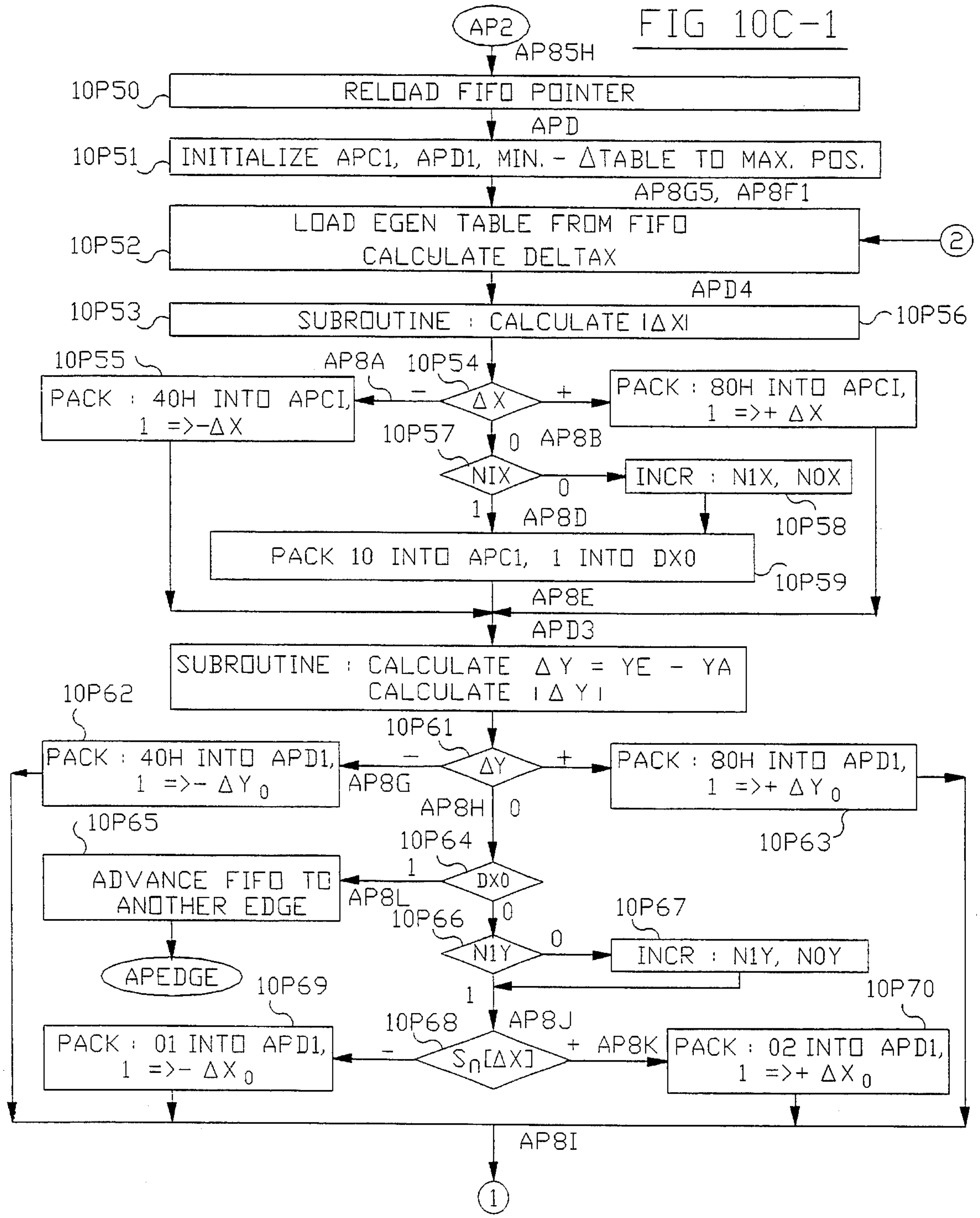
Figures 2, 10C:
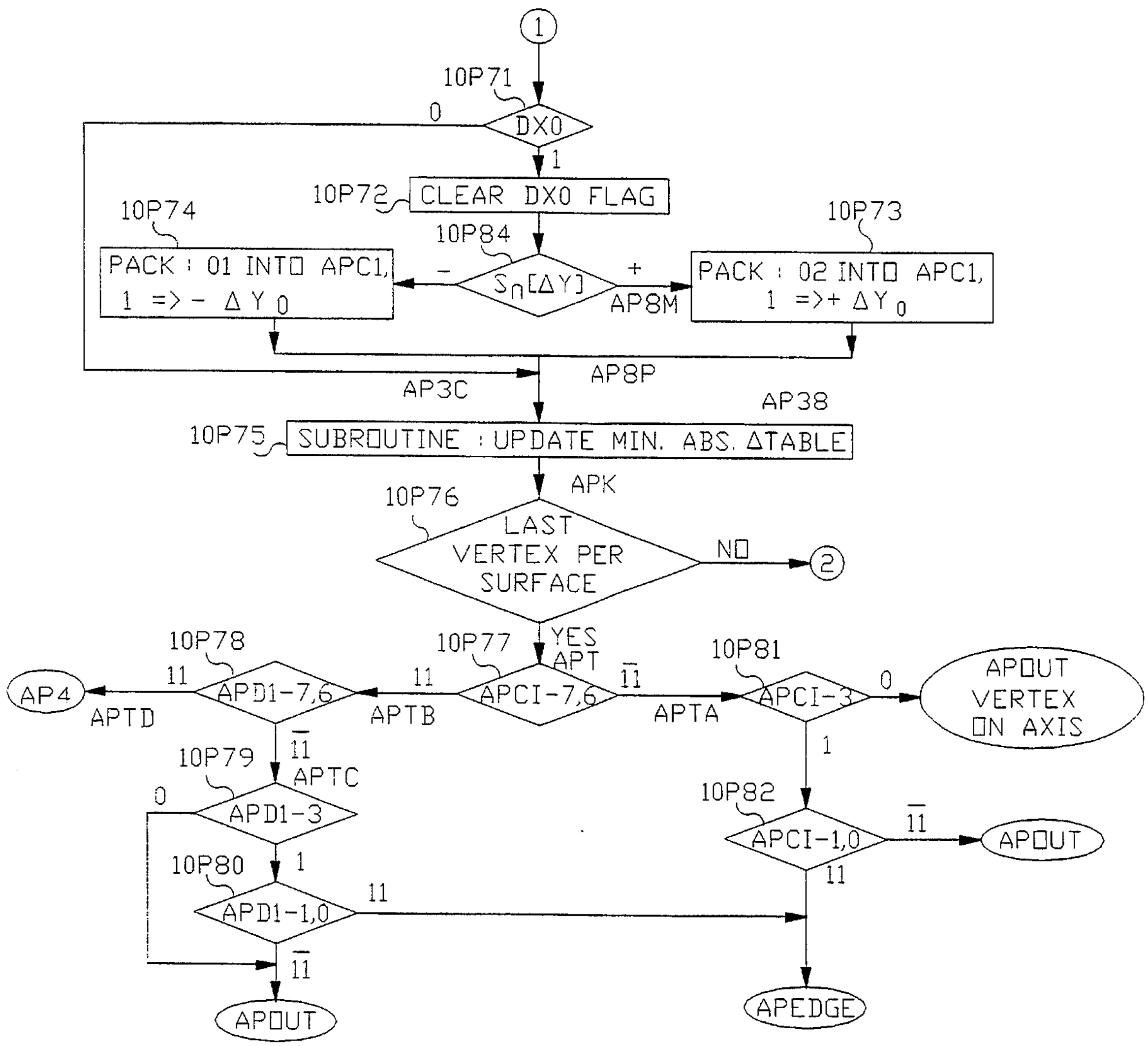
Figure 10D:
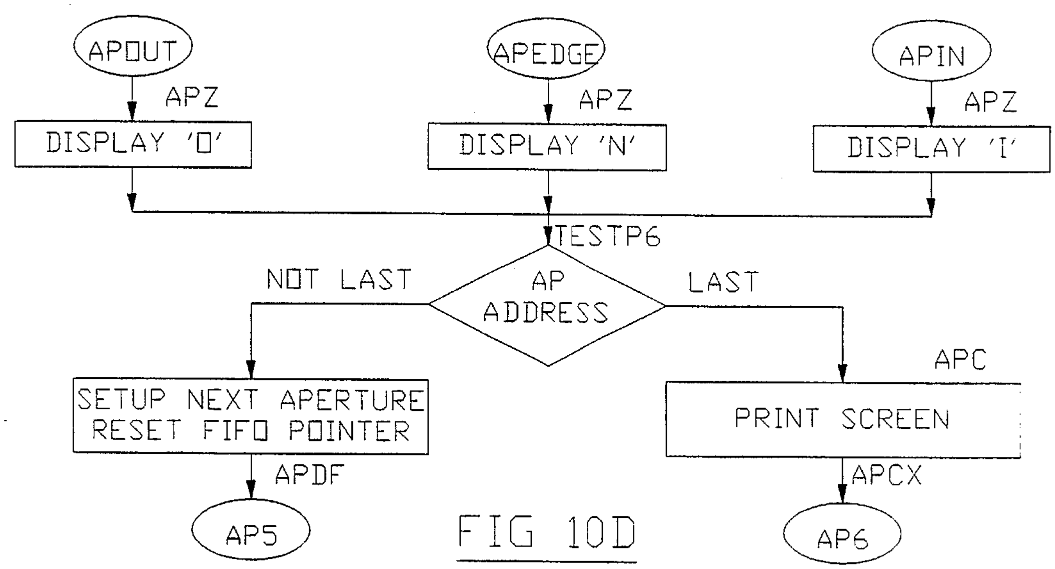

Supervisory processor 125 (FIG. 1A) performs many functions that may be characterized as supervisory processor functions; such as initializing, controlling, and communicating with various elements within system 100 and external to system 100. Therefore, supervisory processor 125 can be interfaced to various portions of system 100. One form of interfacing is shown in FIG. 3. Supervisory processor 125 may be a bus oriented microprocessor, such as provided with the Intel 8085 and 8086 single chip-type microprocessors, or may be implemented with a hit slice microprocessor such as the AMD 2900.

A typical bus contains data lines, address lines, and strobe lines. The address lines can be decoded to select a particular peripheral 362 and the strobe lines can gate the peripheral device implemented with decode and gating logic 361 to communicate with supervisory processor 125 along bus 360. Such communication may be implemented in forms well known in the art or may be implemented in other forms as discussed herein.

Supervisory processor 125 can be implemented as with a general purpose stored program processor, such as with a commercially available AMD-2900 bit-slice chip set available from American Micro Devices Inc. Supervisory processor 125 primarily performs supervisory operations and secondarily performs non-real time (background) processing and auxiliary processing. Supervisory processing includes intersystem communication, such as with host system 102; intrasystem communication, such as with database memory 112, real time processor 126, and refresh memory 116; resource allocation; generation of initial conditions for real time processor 126 and refresh memory 116; and self check and diagnostics. Auxiliary processing includes outer loop background processing, such as high accuracy processing to eliminate error buildup in real time processor 126 and general purpose support of real time processor 126, such as contingency processing.

Computational resources can be assigned by supervisory processor 125 on a priority basis. Priorities can be determined by various considerations under supervisory processor control. For example, priorities can be assigned so that higher speed moving objects have a higher priority than lower speed moving objects. A high processing load can be caused by a scene having many high moving objects and having complex occulting therebetween. A low processing load can he caused by only a few moving object moving at slow speed and having simple occulting therebetween. Processing resources can be allocated on a priority basis; where higher priority processing tasks can be performed first and lower priority processing tasks can be performed on a time available basis, at a lower iteration rate, with simplifying assumptions, or with other such flexibilities.

Resource allocation can be performed with a hierachial architecture, where supervisory processor 125 assigns priorities. Also, update periods can be varied as a function of processing load, where higher update rates can he used for more rapidly moving objects and lower update rates can be used for more slowly moving objects. Secondary considerations; such as shadowing, texturing, glint, and shading; when provided can be placed on a low priority basis.

Because the eye is often more sensitive to rapid motion than it is to slow motion, an object moving across the screen at a multi-pixel rate may exhibit a stepping motion from position-to-position more readily than an object moving across the screen at a slow rate, such as at a sub-pixel rate. Therefore, objects exhibiting the highest rate of motion can have the highest priority and the related highest update rate and objects exhibiting the lowest rate of motion can have the lowest priority and the related lowest update rate.

The features of the system of the present invention have been demonstrated on an experimental system, which is discussed herein, such as with reference to FIG. 17. Computer listings used to demonstrate the supervisory processor are attached hereto in the Tables Of Computer Listings in thc sub-table entitled Supervisory Processor. These listings illustrate supervisory processor operations and provide supplemental details, such as in the annotations in the left hand columns and the details of the assembly language code in the middle column.

Executive Processing

Executive Processing will now be discussed with reference to FIG. 4. FIG. 4 illustrates executive processing for edge processing, smoothing processing, antistreaking processing. The executive processor shown in FIG. 4 can be used in conjunction with other executive processors for controlling the various operations performed by the system and discussed with reference to FIGS. 1A to 1C above and in greater detail for each element of the system hereinafter. The executive processor shown in FIG. 4 is specific to the experimental system operations of edge generation, smoothing, and antistreaking.

Operation begins with the EGEN routine, proceeding to element 450A to load the IPOB table with initial conditions. Operation then proceed to element 450B to generate initial conditions for the edges of a surface. Operation then proceeds to element 450C to load the FIFO GPFIF with edge initial conditions. Operation then proceeeds to element 450D to perform antisteaking processing, discussed with reference to FIG. 10M herein. Operation then proceeds to elements 450E thru 451B for iteratively processing a plurality of edges around a surface. In element 450E, the surface header table SEH is loaded into the PXLFIF FIF0, derived from information accessed from the GPFIF FIFO. Operation then proceeds to element 450F to set the initial pixel flag IP and the first pixel per edge flag (FPE) for first pixel per edge processing.

Operation then proceeds to element 450G to 450V for iteratively processing a plurality of pixels along the edge. In element 450G, the edge processor is accessed for generating an edge pixel. Operation then proceeds to element 450H to lookup the smoothing weight for the new pixel using SM00TH5 processing, discussed with reference to FIG. 11H. Operation then proceeds to element 450I to load the pixel table into the FIFO.

Operation then proceeds to element 450J to test for an initial pixel. If the initial pixel flag is set, indicative of the centerpoint subpixel coordinate FS, operation proceeds along the 1 path to clear the IP-flag and to bypass smoothing processing for that initial pixel condition. This is because smoothing processing is provided when the edge exits a pixel, but the initial pixel is set at the centerpoint of a vertex pixel and therefore does not have smoothing associated therewith. Smoothing for vertices is discussed hereinafter.

If the initial pixel flag tested in element 450J is not set, operation proceeds along the 0 path to element 450L to test the first pixel per edge (FPE) flag. If the first pixel per edge flag is not set, operation proceeds along the 0 path to bypass vertex processing. This is because vertex processing is performed for the first pixel per edge, with the exception of the startpoint vertex, where processing for the startpoint vertex is discussed hereinafter. If the FPE-flag is set, operation proceeds along the 1 path to perform vertex smoothing processing. Operation proceeds to element 450M to clear the FPE-flag, as indicative of processing for the first pixel per edge being performed. Operation then proceeds to element 450N to test for an N-edge. If a P-edge is detected, operation proceeds along the 0 path to bypass vertex smoothing processing because smoothing need not be performed for P-edges. If an N-edge is detected, operation proceeds along the 1 path to perform vertex smoothing processing. Operation proceeds to element 450P to test for a first pixel per surface condition. If the first pixel per surface is detected, operation proceeds along the 1 path to element 450Q to load the first pixel per surface buffer with vertex smoothing information and to reset the FPS-flag. This is because smoothing for the first pixel per surface cannot be performed until the last pixel per surface is processed to complete smoothing information for the vertex that is common to the first pixel per surface and the last pixel per surface. If the first pixel per surface is not detected in element 450P, operation proceeds along the 0 path to element 45CR to process an intermediate vertex which is a vertex that is not a startpoint or endpoint vertex, by ORing together the partial smoothing conditions from the endpoint vertex of the previous edge and the startpoint vertex of the present edge to obtain the total smoothing conditions for the vertex. Operation then proceeds to element 450S to lookup the smoothing weight for the vertex and to load the smoothing weight for this vertex into the pixel table PXLB.

After initial pixel and first pixel per edge processing in elements 450J to 450S, operation proceeds to element 450T to complete loading of the pixel table PXLB. Operation then proceeds to element 450U to test for a last pixel per edge (LPE). If a last pixel per edge is not detected, operation proceeds along the NO path to element 450V to load the pixel table PXLB into the FIFO and then to loop back to element 450G for processing of another pixel along the edge. If a last pixel per edge is detected in element 450U, operation proceeds along the YES path to element 450W for last pixel per surface processing. In element 450W, a test is made for an N-edge. If a P-edge is detected, operation proceeds along the NO path bypassing the smoothing processing in element 450X because smoothing processing need not be performed for a P-edge. If an N-edge is detected in element 450W, operation proceeds along the YES path to element 450X to load the smoothing information from the last pixel per edge into a buffer for subsequent vertex smoothing processing, which will be performed when the smoothing information associated with the adjacent first pixel per edge for that vertex is obtained.

Operation proceeds to element 451A to test for a last edge per surface. If a last edge per surface is not detected, operation proceeds along the NO path to element 451B to load the pixel table PXLB into the FIFO and to loop back to element 450E for processing of another edge if a last pixel per edge is detected in element 451A, operation proceeds along the YES path to element 451C to perform endpoint vertex smoothing. A test is made for an N-edge in element 451C. If a P-edge is detected, operation proceeds along the NO path to bypass surface endpoint smoothing processing because smoothing need not be performed for a P-edge. If an N-edge is detected in element 451C, operation proceeds along the YES path to element 451D. Operation then exits from the executive processor for subsequent occulting processing. To process an intermediate vertex which is a vertex that is not a startpoint or endpoint vertex, by ORing together the partial smoothing conditions from the endpoint vertex of the previous edge and the startpoint vertex of the present edge to obtain the total smoothing conditions for the vertex. Operation then proceeds to element 450S to lookup the smoothing weight for the vertex and to load the smoothing weight for this vertex into the pixel table PXLB.

DATABASE MEMORY

General Description

Database memory 112 stores environmental information and auxiliary information. Environmental information defines the visual environment, such as geometric edge endpoint information. Auxiliary information includes programs for the microprocessor, programs for the geometric processor, and initial conditions for visual scenes. Programs include computer graphic emulation programs, visual programs, and selfcheck and diagnostic programs. Initial conditions include predefined scenes and checkpoints of selected scenes. Checkpointing capability permits storage of the contents of the refresh memory, geometric processor memory, and portions of the main memory of the microprocessor for reconstruction of a particular scene.

The interface to database memory 112 can be implemented as a direct memory access (DMA) port to the supervisory processor 125. Database and auxiliary information can be loaded into database memory 112 from a host system 102 or from an auxiliary memory through supervisory processor 125. Supervisory processor 125 can provide database memory management operations and communication between database memory 112 and other devices, such as real time processor 126 and host system 102.

Environmental information can be organized into object information, scene information, and scenario information.

Object information includes the information for each surface making up that object in object coordinates. Surface information includes edge endpoint vector coordinates, surface normal vector coordinates, and surface color. Edge endpoint vector coordinates and surface normal vector coordinates can be represented as the three-dimensional vectors eminating from the object origin coordinate point, a common reference point for all parts of the particular object. Positioning and orienting the object origin coordinate point in the scene also positions and orients the edge endpoint vectors and face normal vector for that object in the scene.

Scene information includes information on the construction of the scene; such as position, orientation, and size of objects in the scene and assignments of color for each surface of each object in the scene. Scene information facilitates using predefined objects of a general purpose nature in a particular special purpose scene. A particular object can be used many times in a scene by assigning different positions, orientations, sizes, and surface colors to the object to distinguish therebetween. For example, an air traffic control training simulator can use a single aircraft object from the database placed in eighty different locations to simulate a heavy traffic environment. Each aircraft object can be independently oriented in a different three-dimensional direction and can be independently assigned different surface colors. Each aircraft object can be commanded to independently translate and rotate in accordance with scenario information under control of real geometric 130. Once an object has been placed into the display environment, in the form of initial conditions loaded into geometric processor 130 and has been placed into the refresh memory; it can be automatically translated, rotated, occulted, smoothed, filled, clipped, and otherwise modified in accordance with the scenario information and the interaction with other objects.

Scenario information includes motion commands for objects in the scene and motion commands for the observer's line-of-sight. This represents the driving function to dynamically drive the observer and the objects in the scene through the scenario.

Object, scene, and scenario information may be predetermined and stored in the database memory. Alternately, portions of this information can be obtained from the host system, from the observer, and from other sources. For example, in a fire control training environment the host system can control target motion and the observer can control motion of his line of sight, such as through a sight reticle.

The features of the system of the present invention have been demonstrated on an experimental system, which is discussed herein, such as with reference to FIG. 17. Computer listings used to demonstrate the database memory are attached hereto in the Tables Of Computer Listings in the sub-table entitled Database Memory These listings are compatible with the processor descriptions herein, such as using common mneumonics and symbols, and provide supplemental details, such as in the annotations in the left hand columns and the details of the assembly language code in the middle column, relative to a database configuration that is consistent with such processors.

Construction of a Generated Environment

A feature of the present invention for constructing an environment with 3D generated object images will now be discussed. This feature provides an effective means for generating an environment that corresponds to the desired environment. One implementation thereof will now be described.

A plurality of 3D objects may be stored in a database for an image generation system, as discussed herein with reference to FIG. 1A. Generated object images may be selected from the database and introduced into a generated environment such as having a location and an orientation in that environment. The placement in the environment may be commanded with a host computer, with operator control, and with other command arrangements. For example, an object in the database can be selected with a keyboard defined acronym and can be introduced into the generated environment with an operator controlled light pen, cursor, or other device. Orientation can be commanded with a light pen, joy stick, track ball, or other operator device. Because the selected object is defined in the database in 3D form, placement and orientation thereof in the generated environment constitutes placement and orientation of a 3D object. However, the observer may not be burdened with the full 3D nature of the operation because the object may merely be assigned a location and orientation by the command arrangement; where the 3D configuration may not have to be defined by the observer. The 3D configuration may be implicit in the selection of the database-resident object.

Generation of an environment for an image generation system can be provided in various ways. External information can be received and placed in the environment, such as communicated from a host system. Acquired image information may be received from sensors and processed to identify objects or patterns sensed therewith. Observer inputs may adapt the generated environment to the desired configuration and may introduce annotations, cursors, overlays, and other information. A generated environment can be updated as new image information becomes available and as the actual environment becomes better defined. As the actual environment is investigated and as the generated environment is utilized; updates, corrections of inconsistencies, and refinements may be determined for improving the generated environment. This is in addition to the changing of this environment as a function of driving functions, such as motion of the observer and motion of generated objects.

Formation and updating of a generated environment with acquired and processed information is discussed in the section herein related to combined actual and generated images.

Various objects may be synthesized for the database. A library of objects may be provided that is adapted to the application. An application involving a ground environment may include rocks, trees, and buildings. The types of objects and the variety of objects may be guided by the application. Each type of object may have a variety of configurations to facilitate precise synthesis of the environment. For example, a battlefield application may have a plurality of military objects, such as tank objects; where each tank object is representative of a different type of tank. A battlefield environment may include tanks, trucks, cannons, command posts, and troops and may also include portions of an air environment having helicopters and fixed wing aircraft. An air battle environment may include aircraft objects, objects from the ground environment, airport objects, and navigational objects. An ocean surface environment may include ships and aircraft. An underwater environment may include rocks, mines, submarines, and fish. Mines in an underwater environment may include buried mines, bottom mines, and tethered mines. An underground seismic environment may include rocks and formations. A medical environment may include human organs, bones, and muscles. A mapping environment may include terrain formations. Objects may be opaque, transparent, translucent, tinted and combinations thereof. For example, in a buried mine hunting application, the ocean floor may be provided with transparent non-occulting formations to permit buried mines to be seen. In an aircraft surveillance application, hills may be provided in transparent form to facilitate visualization of objects occulted thereby. Tinting of transparent surfaces may aid in the use thereof. Partially transparent surfaces will also aid in the use thereof. Fictitious objects and symbols may also be used. For example, pathways may be used, such as a highway in the sky for an aircraft environment and a seaway on the water or in the water for a naval application, for observer guidance and visual cues. Other symbols; such as flags, explosions, cursors, brackets, circles, and others; may be provided.

Topographical information may be obtained from topographical charts and may be entered into the database to facilitate generation of an environment having proper topographical features.

GEOMETRIC PROCESSOR

General Description

Processing performed by geometric processor 130 can include rotational, translational, range variable size, and edge visibility processing; which are discussed below.

Geometric processor 130 can process edge endpoint coordinates to transform the edge endpoint coordinates to provide image motion. The image may be regenerated in each frame from database information. Alternately, the image may be extrapolated from the prior frame image to the next frame image in the form of continuous processing. Extrapolative processing may be provided with incremental type processing to obtain changes in the image. Alternately, a hybrid approach can be implemented, where processing up through geometric processor 130 is regenerative and processing past geometric processor 130 is extrapolative; where conversion from regenerative to extrapolative information can be obtained by subtracting corresponding parameters in sequential frames, derived in the geometric processor 130, regeneratively to obtain the difference (i.e.; prior and next parameters) for subsequent extrapolative processing with fill processors 131–134.

Geometric processing can be implemented in various forms; including matrix processing, direction cosine processing, and trigonometric equation processing. Matrix, direction cosine, and trigonometric equations are well known in the art for whole number regenerative processing. Geometric processor 130 can be implemented as a whole number processor, such as in a conventional, manner or alternately can be implemented as an incremental processor to facilitate extrapolative processing to reduce complexity and increase speed. Considerable detail is provided herein for incremental implementations of geometric processor 130. However, geometric processor 130 can alternately be implemented with whole number implementations.

Matrix equations may be implemented as the product of a plurality of coefficient matricies for transforming a three component (X, Y, and Z) vector. The coefficient matricies may include 3 angular transform matricies $\theta$, Ø, $\Psi$; a translational matrix; a scaling matrix; a perspective matrix; and other matricies that may be appropriate. If an extrapolative arrangement is implemented, the scaling matrix may not be necessary because scaling may be implemented as an initial condition scale factor that is then adjusted in size as a function of the perspective matrix.

Coefficient matricies can be processed in various ways. One method is the use of a matrix processor that implements matrix operations. Another method is to combine the matricies through matrix multiplication, expand the matricies in a well known manner to obtain trigonometric equations, and then implement the expanded equations. The arrangements discussed with reference to FIGS. 5U to 5W provide an incremental implementation of expanded matrix equations. The arrangements discussed with reference to FIGS. 5P to 5R provide an incremental implementation of coordinate resolution to transform a vector from a first coordinate system into a second coordinate system.

Three-dimensional rotational processing can be performed by geometric processor 130 in incremental computational form. Three-dimensional rotational processing can be implemented by rotating each of the three coordinates of an edge endpoint through each of the three dimensional angles of rotation and then combining the trigonometric components to obtain the three-dimensional coordinates of the rotated edge endpoint. The computation can be implemented as a sum-of-the-products of trigonometric and vector parameters. The trigonometric parameters can be generated with an incremental sin/cos generator for each of the three angles and then incrementally multiplied together and incrementally summed together in various combinations to generate the rotated coordinates. Incremental sin/cos generation, incremental multiplication, and incremental addition are simple operations when implemented with the serial computation incremental processor, such as a DDA.

Three-dimensional translation processing can be performed by geometric processor 130 in incremental computational form. Three-dimensional translational processing can be implemented by translating each of the three coordinates of an edge endpoint through each of the three-coordinates of translation and then recombining the components to obtain the three dimensional coordinates of the translated edge endpoint. The computation can be implemented as an incremental sum of vector components to generate the translated coordinates. Incremental addition is a simple operation with the serial computation incremental processor.

Range variable size and perspective processing can be performed by geometric processor 130 in incremental computation form. It can be implemented by incrementally scaling object size as a function of range as range of an object is varied. Range scaling involves incremental multiplication of edge dimensions as a function of inverse range. Incremental multiplication is a simple operation with a serial computation incremental processor.

Edge visibility processing for each surface can be performed by rotating and translating the face normal vector similar to rotation and translation processing for edge endpoints discussed above and simultaneously generating the visibility angle between each face normal vector and the observer. A logical test on whether the angle is positive or negative represents a determination of whether the related surface is visible or non-visible, respectively.

Clipping and pseudo-edge generation processing, provided in conventional systems, may not be required for the present system. Conventional systems provide clipping to compensate for objects presented partially on and partially off the display screen. Conventional systems provide pseudo-edge generation so that each surface will have both, a right hand edge and a left hand edge, even when the surface has been clipped. This requirement for both, right hand and left hand edges, facilitates the particular type of color fill operations utilized by those systems and eliminates streaking effects. However, the present system can use incremental motion to introduce objects onto the screen and remove objects from the screen, eliminating the need for clipping processing. Also, the present system can use a refresh memory color fill operation, discussed with reference to FIGS. 13 and 14 herein, that eliminates the need for pseudo-edge generation processing. In the present system, the refresh memory can extend beyond the visible portion of the display environment to permit Objects that are not yet visible to be stored in refresh memory. Supervisory processor 125 can generate the initial conditions for an object in the refresh memory before it is visible and geometric processor 130 can incrementally move this object into the visible portion of the refresh memory as the visual scenario progresses.

Refresh operations read out the visible portion of refresh memory 116 to refresh the CRT monitor in raster scan form. However, the non-visible portion of refresh memory 116 is not read out to refresh the CRT, which implicitly clips off the non-visible portion of that surface even though the non-visible portion is also in refresh memory 116. Pseudo-edges need not be generated in this configuration because of the color fill method used in refresh memory 116. Therefore, clipping and pseudo-edge processing are unnecessary in this configuration and thus do not require processing resources.

The system of the present invention includes important innovations contained in the geometric processor. One is a hierarchial structure for the geometric processor which provides important efficiencies in geometric processing, such as reduction in redundant processing. Another is change-related processing, such as incremental processing, which provides further efficiencies. Another is performance of illumination-related processing, such as intensification and shading in the geometric processor. Still another is visibility processing that accumulates angular changes as indicative of surface visibility. Many other features will be discussed for the geometric processor herein.

The features of the system of the present invention have been demonstrated on an experimental system, which is discussed herein, such as with reference to FIG. 17. Computer listings used to demonstrate the geometric processor are attached hereto in the Tables Of Computer Listings in the sub-table entitled Geometric Processor. These listings provide supplemental details on operation and interfacing of a geometric processor and provide supplemental details, such as in the annotations in the left hand columns and the details of the assembly language code in the middle column.

Hierarchial Processing (FIG. 5A)

A hierarchial processing arrangement that can be used with geometric processor 130 is shown in FIG. 5A. It is shown progressing from the higher level tiers to the lower level tiers. A hierarchy of processing operations extend from the environmental tier in the outermost structure to the object tier 559A, the surface tier 559B, and the edge tier 559C. Processing is placed on higher level tiers to reduce redundant processing. Processing performed on higher level tiers is common to lower level tiers and hence need not be performed on the lower level tiers. For example, rotation of a plurality of surfaces of the same object is characterized by rotation of each of the surfaces on the same object through the same angle. Therefore, trigonometric functions of this angle are the same for each of the surfaces. Consequently, the trigonometric relationships are the same for surfaces on the same object. This reduces processing by generating the functions at a high level in the hierarchy and using these generated functions at lower levels in the hierarchy without regeneration thereof.

Many geometric operations, such as matrix operations, associated with geometric processing are applicable to the hierarchial architecture discussed herein. For example, a rotation matrix may be common to all edges associated with a particular object and therefore need be computed only once for each object. Other hierarchial processing is discussed herein with reference to FIGS. 5A–5F and with reference to the Geometric Processor Format Tables.

The hierarchial processing shown in FIG. 5A is described with reference to the hierarchy; where the environment is composed of objects, each object is composed of surfaces, and each surface is composed of edge vectors. The processing is illustrated for various types of information associated with each tier. Information associated with the environmental tier is shown in the Environmental Format Table, information associated with the object tier is shown in the Object Format Table, and information associated with the edge vectors is shown in the Vector Format Table. Each format table is composed of a header, containing pertinent information for that format table, and a list of lower tier elements associated therewith. For example, the Environment Format Table contains the environment header setting forth information pertinent to the environment and a list of the objects contained in the environment. The Object Format Table contains the object header setting forth information pertinent to each of the objects in the environment and a list of the surfaces contained in that object. The Surface Format Table contains information pertinent to each of the surfaces in the object and a list of the edges contained in that surface. The Vector Format Table contains a list of vectors. Other groupings of information can also be provided. The header associated with the particular tier can be formatted; as shown in the Environment Header Format Table, Object Header Format Table, and Surface Header Format Table.

The processing shown in FIGS. 5A–5F iterates through hierarchial operations, processing information contained in the tables in hierarchial form. For example, the environmental header is processed to identify the environmental-related considerations. Each object in the environment is then processed by first processing the object-related information contained in the object header and then processing the surface-related information for each of the surfaces in the object. Each surface in the object is then processed by first processing the surface-related information contained in the surface header and then processing the edge-related information for each of the edges in the surface. Each edge in the surface is then processed. This hierarchial processing is discussed in greater detail with reference to FIGS. 5A–5F hereinafter.

Hierarchial processing will now be discussed in more detail with reference to FIG. 5A. A hierarchial arrangement consisting of the environment tier 560A and 560B, the object tier 559A, the surface tier 559B, and the edge tier 559C provides hierarchial iterative processing. For example, the environment tier is accessed once per frame to update the image and controls accessing of a plurality of objects on the object tier 559A. The objects are iteratively processed, one iteration per object, until all objects in the environment have been processed. For each object, a plurality of surfaces on surface tier 559B are iteratively processed, one iteration per surface, until all surfaces in the particular object have been processed. For each surface, a plurality of edges on the edge tier 559C are iteratively processed, one iteration per edge, until all edges in the particular surface have been processed. When the last edge of a particular surface has been processed, the next surface in the object is processed until the last surface in the object has been processed, resulting in iterating back to the object tier to process the next object. When the last surface in a particular object has been processed, the next object in the environment is processed until the last object in the environment has been processed, resulting in iterating back to the environment tier to process the next environment for the next frame. Therefore, processing iterates through all of the edges for each surface, all of the surfaces for each object, and all of the objects for the environment to generate an image.

Parameters associated with a particular tier are selected to be compatible with processing within that tier on lower levels of the hierarchy. This permits processing to be performed on a higher level of the hierarchy, reducing the need for redundant processing on lower levels on the hierarchy. For example, trigonometric processing relating to the angles of rotation of an object are common to all surfaces and to all edges within that object. Therefore, such processing can be performed on the object tier and then used on the surface tier and edge tier without being rederived on the surface tier and edge tier.

Processing efficiency can be improved by not processing some of the static information that has not changed. An arrangement for bypassing of processing associated with static information will now be discussed with reference to FIG. 5A.

For object tier 559A, a check is made for a change in the object. If a change is detected in the object, then the information for the object is processed. If a change did not occur in the object, then the related information for the object is not processed; but operation loops around processing of that object to process the next object. This facilitates efficiency of operation; where non-changing portions of the image need not be unnecessarily processed, such as involved in a regenerative configuration. When the last object per environment is detected; operation proceeds to the next higher tier to process the next environment. The last object per environment is detected with the end of environment (EOE) flag in element 560P. If the last object per environment is not detected; operation proceeds within the same tier, looping back to access and process the next object per environment until the last object per environment is detected; at which time operation branches upward to the next higher tier, the environment tier, to process the next environment.

For surface tier 559B, a check is made for a change in the surface. If a change is detected in the surface, then the information for the surface is processed. If a change did not occur in the surface, then the related information for the surface is not processed; but operation loops around processing of that surface to process the next surface. This facilitates efficiency of operation; where non-changing portions of the image need not be unnecessarily processed, such as involved in a regenerative configuration. When the last surface per object is detected; operation proceeds to the next higher tier to process the next object per environment. The last surface per object is detected with the end of object (EOO) flag in element 560T. If the last surface per object is not detected; operation proceeds within the same tier, looping back to access and process the next surface per object until the last surface per object is detected; at which time operation branches upward to the next higher tier, the object tier, to process the next object.

For edge tier 559C, a check is made for a change in the edge. If a change is detected in the edge, then the information for the edge is processed. If a change did not occur in the edge, then the related information for the edge is not processed; but operation loops around processing of that edge to process the next edge. This facilitates efficiency of operation; where non-changing portions of the image need not be unnecessarily processed, such as involved in a regenerative configuration. When the last edge per surface is detected; operation proceeds to the next higher tier to process the next surface per object. The last edge per surface is detected with the end of surface (EOS) flag in element 560U. If the last edge per surface is not detected; operation proceeds within the same tier, looping back to access and process the next edge per surface until the last edge per surface is detected; at which time operation branches upward to the next higher tier, the surface tier, to process the next surface.

Processing of information in a hierarchial form will now be discussed further with reference to FIG. 5A.

Processing enters the environment tier by proceeding to the start of the environment in element 560A and then processing the environment header in element 560B.

Operation proceeds from environment tier 560B to object tier 559A, where an object is fetched from memory in element 550C for processing. Operation proceeds to element 560D to test for a change in that object. If a change in the object has occurred, operation proceeds along the YES path from element 560D to element 560E to process information for that object; including processing of header information in element 560E, discussed in greater detail with reference to FIG. 5B, and processing of the surfaces in that object in the surface tier 559B. If a change in the object has not occurred, operation proceeds along the NO path from element 560D to test if it is the last object in the environment in element 560P. If the last object is not detected, operation proceeds along the NO path iterating back within the environment tier for the next object. If the last object is detected, operation proceeds the YES path from element 560P to perform object postprocessing in element 560Q and to exit the object tier 559A, completing the processing for that environment frame and initiating processing for the next frame.

Operation proceeds from object tier 559A to surface tier 559B, where a surface is fetched from memory in element 560E for processing. Operation proceeds to element 560S to test for a change in that surface. If a change in the surface has occurred, operation proceeds along the YES path from element 560S to element 560G to process information for that surface; including processing of header information in element 560G, discussed in greater detail with reference is FIG. 5C, and processing of the edges in that surface in the edge tier 559C. If a change in the surface has not occurred, operation proceeds along the NO path from element 560S to test if it is the last surface in the object in element 560T. If the last surface is not detected, operation proceeds along the NO path iterating back within the surface tier to element 560F for the next surface. If the last surface is detected, operation proceeds along the YES path from element 560T to perform surface postprocessing in element 560N, to exit the surface tier 559B, and to test for a last object in element 560P. If the last object is not detected, operation proceeds along the NO path iterating back within the environment tier for the next object. If the last object is detected, operation proceeds the YES path from element 560P to perform object postprocessing in element 560Q and to exit the object tier 559A for completing the processing for that environment frame and for initiating processing for the next frame.

Operation proceeds from surface tier 559B to edge tier 559C, where an edge is fetched from memory in element 560H for processing. Operation proceeds to element 560I to test for a change in that edge. If a change in the edge has occurred, operation proceeds along the YES path from element 560I to element 560J to check for a processed flag, indicative of the edge already having been processed. If the processed flag is set, operation branches around element 560K for elimination of redundant processing. If the processed flag is not set, operation proceeds to element 560K to process the edge and to set the processed flag. Operation then proceeds to element 560L is perform output postprocessing and then to element 560U to rest for a last edge condition.

If a change in the edge has not occurred, as tested in element 560I, operation proceeds along the NO path from element 560I to test if it is the last edge in the surface in element 560V.

In element 560U, a test is made for the last edge in the surface. If the last edge is not detected, operation proceeds along the NO path iterating back within the edge tier to element 560H for the next edge of the surface. If the last edge is detected, operation proceeds along the YES path from element 560U to exit the edge tier and to test for a last surface in the object in element 560T. If the last surface is not detected, operation proceeds along the NO path iterating back within the surface tier to element 560F for the next surface. If the last surface is detected, operation proceeds along the YES path from element 560T to perform surface postprocessing in element 560N, to exit the surface tier 559B, and to test for a last object in element 560P. If the last object is not detected, operation proceeds along the NO path iterating back within the environment tier for the next object. If the last object is detected, operation proceeds the YES path from element 560P to perform object postprocessing in element 560Q and to exit the object tier 559A for completing the processing for that environment frame and for initiating processing for the next frame.

Figure 5B:
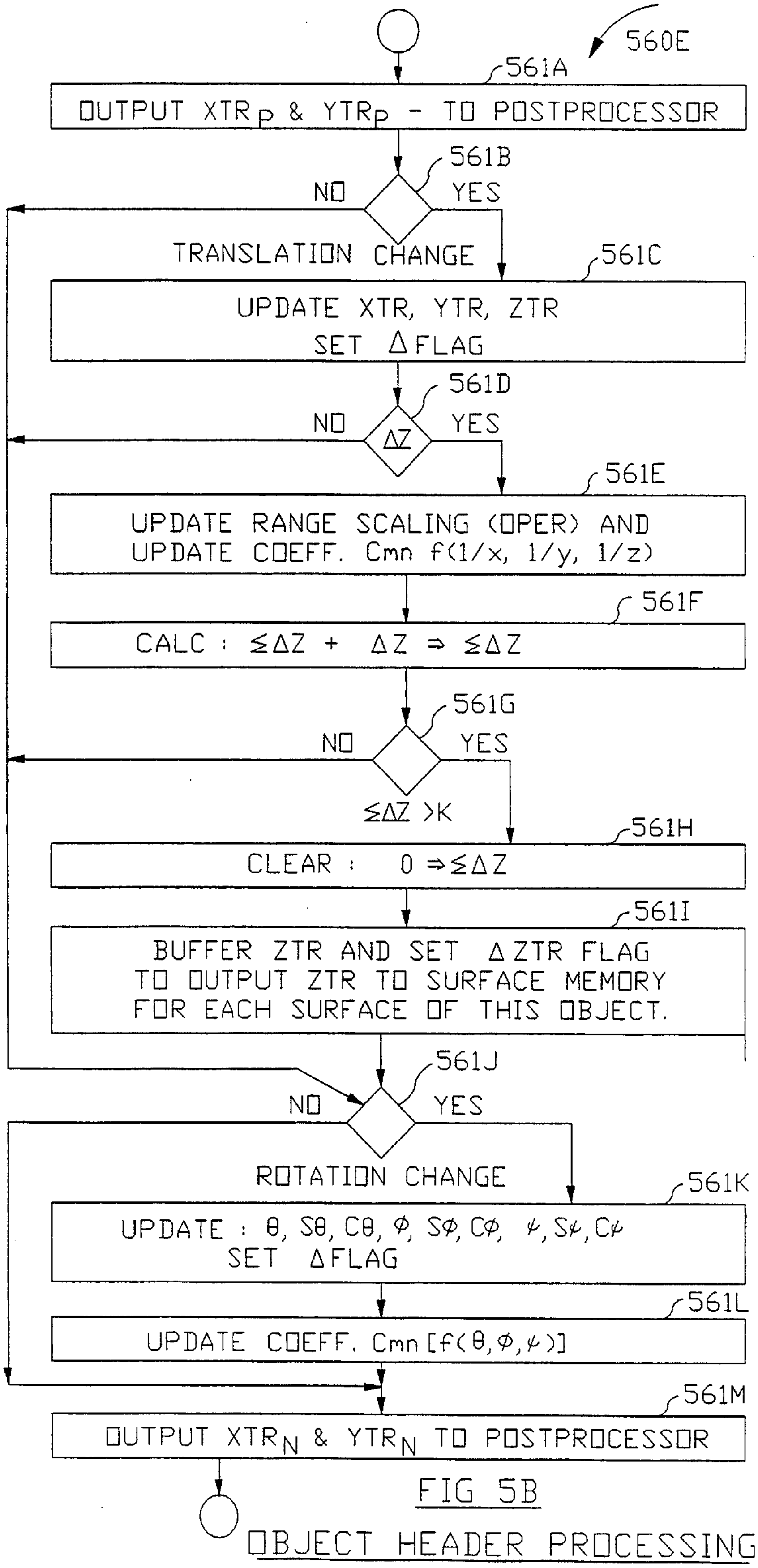

Object Header Processing (FIG. 5B)

Object header processing 560E (FIG. 5A) will now be discussed in greater detail with reference to FIG. 5B. Object header processing commences with element 561A, which preserves the translational P-surface position, XTRP and YTRP for the object, which will be used for output postprocessing, as discussed with reference to FIG. 5E. XTR and YTR are preserved as XTRP and YTRP in a temporary buffer for the present object so that they will be available after XTR and YTR have been updated to the translational positions for the next position, XTRN and YTRN.

Operation proceeds to element 561B, where a test for a translation change is performed. If translation has not occurred, operation proceeds along the NO path bypassing elements 561C to 561I, related to translation change processing, and proceeds to elements 561J to 561L, related to rotation processing. If a translation change is detected in element 561B, operation proceeds along the YES path to perform translation change processing with elements 561C to 561I. Operation proceeds to element 561C, where translation parameters XTR, YTR, and ZTR are updated in accordance with the translation change position. The prior XTR and YTR positions have been preserved for output postprocessing in element 561A, to be used in conjunction with the translational next position, the updated XTR and YTR positions, during output postprocessing. A delta flag is set in element 561C representative of a change occurring for the present object, to be used in conjunction with the change-related processing for the surface header, discussed with reference to FIG. 5C.

Operation proceeds to element 561D to test for a Z-translational change. If a Z-translational change is not detected in element 561D, operation proceeds along the NO path to element 561J bypassing the Z-translational change processing in elements 561E to 561I. If a Z-translational change is detected in element 561D, operation proceeds along the YES path to element 561E where range scaling and coefficients that are a function of the Z-translational position are updated.

Certain parameters that are a function of Z-motion need not be updated to the fine resolution of the ZTR parameter. Therefore, Z-motion increments can be accumulated until a coarser Z-motion increment is reached before updating such parameters. The finer Z-motion increments can be accumulated in a buffer, identified as the sum-delta-Z buffer, by adding the present delta Z-parameter to the sum-delta-Z parameter in the buffer in element 561F. The sum-delta-Z parameter is tested in element 561G. If the sum-delta-Z parameter is less than a threshold K, it is preserved in the sum-delta-Z buffer and operation proceeds along the NO path to element 561J, bypassing the coarser resolution delta-Z processing in elements 561H and 561I. If the sum-delta-Z parameter is equal to or greater than the threshold K, operation proceeds along the YES path to element 561H where the sum-delta-Z buffer is cleared, indicative of execution of the sum-delta-Z parameter, and to element 561I where the delta-ZTR flag is set to select updating of surface memory. This execution includes buffering the Z-translational position ZTR for subsequent output to the surface memory for each surface of this object during surface memory updating and setting of the delta-ZTR flag, indicative of a delta-ZTR parameter that is to be output to surface memory for each surface of the object being processed.

Operation proceeds to element 561J, where a test for a rotation change is performed. If rotation has not occurred, operation proceeds along the NO path bypassing elements 561K and 561L, related to element 561M, bypassing rotation change processing, and proceeds to element 561M. If a rotation change is detected in element 561J, operation proceeds along the YES path to perform rotation change processing with elements 561K and 561L. In element 561K, the rotation change is used to update the rotation parameters; which are the three angles θ, Ø, and Ψ and the sine S and cosine C functions of these three angles. The delta flag is set in element 561K, indicative of a change occurring for the present object, to be used in conjunction with the change-related processing for the surface header discussed with reference to FIG. 5C. The updated angles and sines and cosines of the angles derived in element 561K are used to update the coefficients that are a function of the changed angles and trigonometric functions of the angles in element 561L.

Operation proceeds to element 561M, where the X and Y translational positions for the next position of the object XTRN and YTRN are output to the postprocessor for postprocessing in conjunction with the X and Y translational positions of the prior surface XTRP and YTRP output to the postprocessor in element 561A for use in output postprocessing described with reference to FIG. 5E.

Updating of the coefficients for a Z-axis change is discussed for element 561E and for an angular change is discussed for element 561L. Updating of the coefficients can be grouped together so that all of the coefficients are updated in substantially the same processing element for all changes, such as Z-axis translational changes and angular changes. This may be accomplished by buffering the changes as they occur, such as buffering the Z-axis changes and the angular changes used to update the Z-axis related parameters in element 561E and the angular change related parameters in element 561K for updating of all of these change related parameters substantially simultaneously, such as in conjunction with element 561M before exiting the object header processing.

The coefficients discussed herein, such as the range related coefficients discussed with reference to element 561E and the angle related coefficients discussed with reference to elements 561K and 561L, may be the coefficients of the matrix operations. These coefficients may be coefficients included in the various coefficient matrices; the θ, Ø, and Ψ rotational matrices; the translational matrix; the perspective matrix; and other matrices. These coefficient matrices maybe preserved in separate form, factored therebetween, or alternately may be combined together such as with matrix multiplication to obtain a combined coefficient matrix that is the matrix algebraic combination of the separate matrices. Illustrative matrix equations providing factored coefficient matrices and combined coefficient matrices are provided herein.

Matrix operations may be performed in various ways, such as in incremental form, whole number form and combinations of incremental and whole number form. The hierarchial geometric processing arrangements discussed herein are applicable to any of these forms of processing.

Figure 5C:
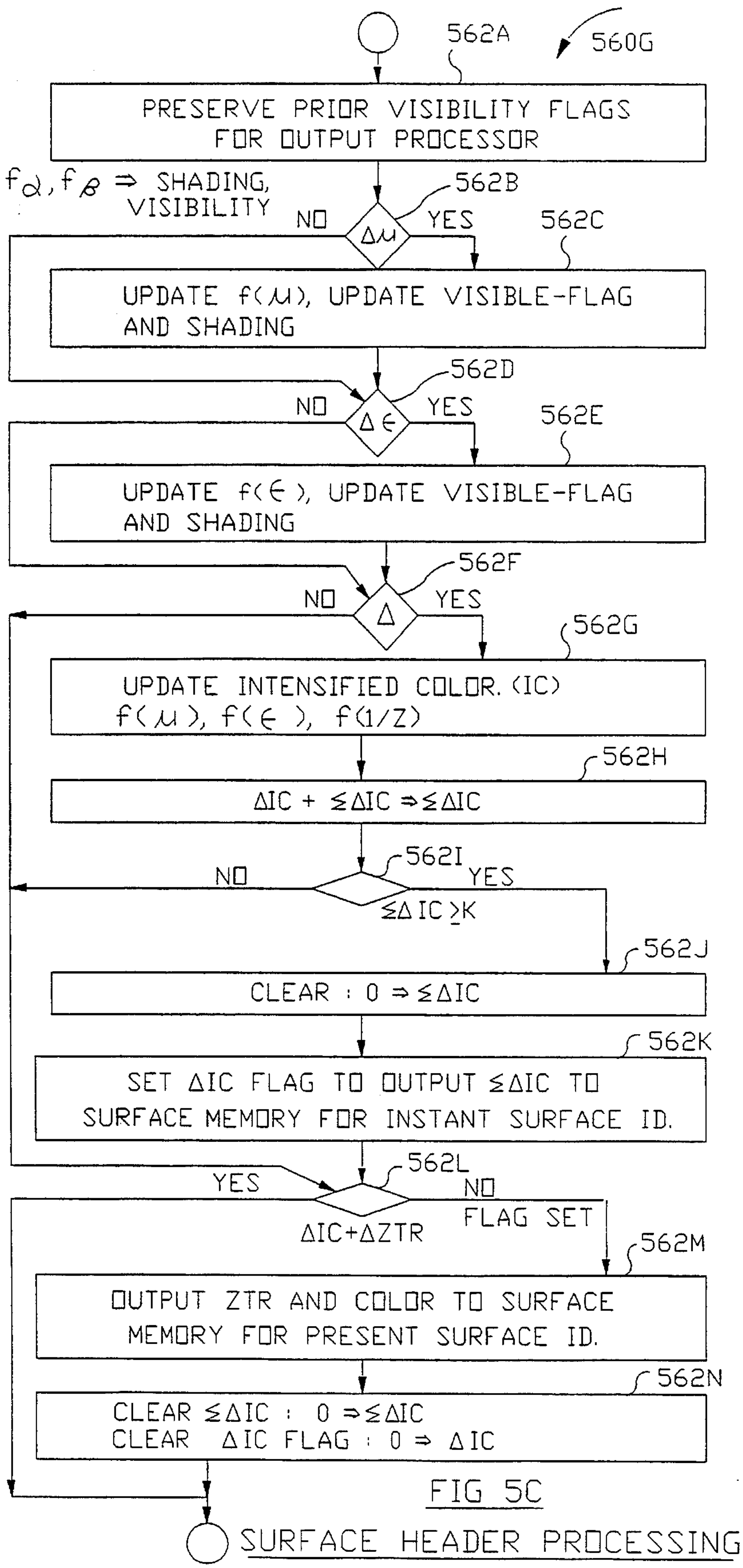
Figure 5P:
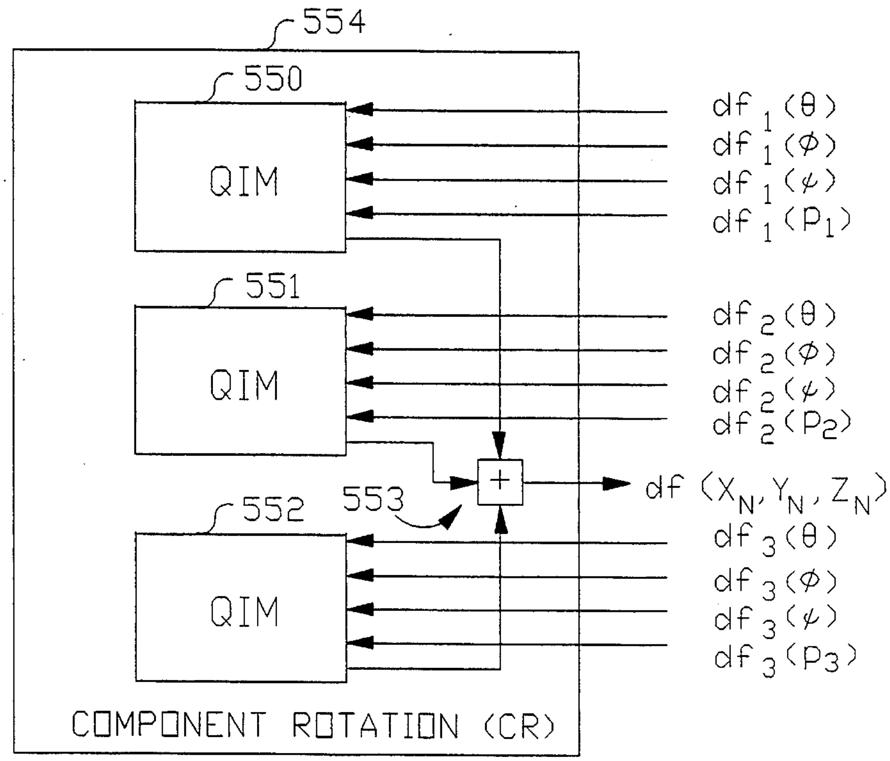
Figure 5Q:
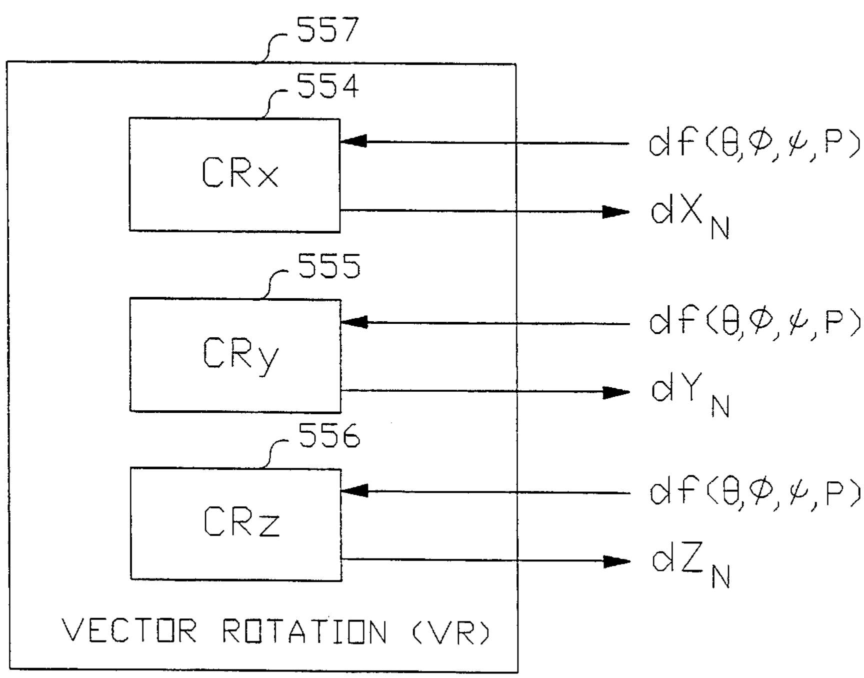
Figure 5R:
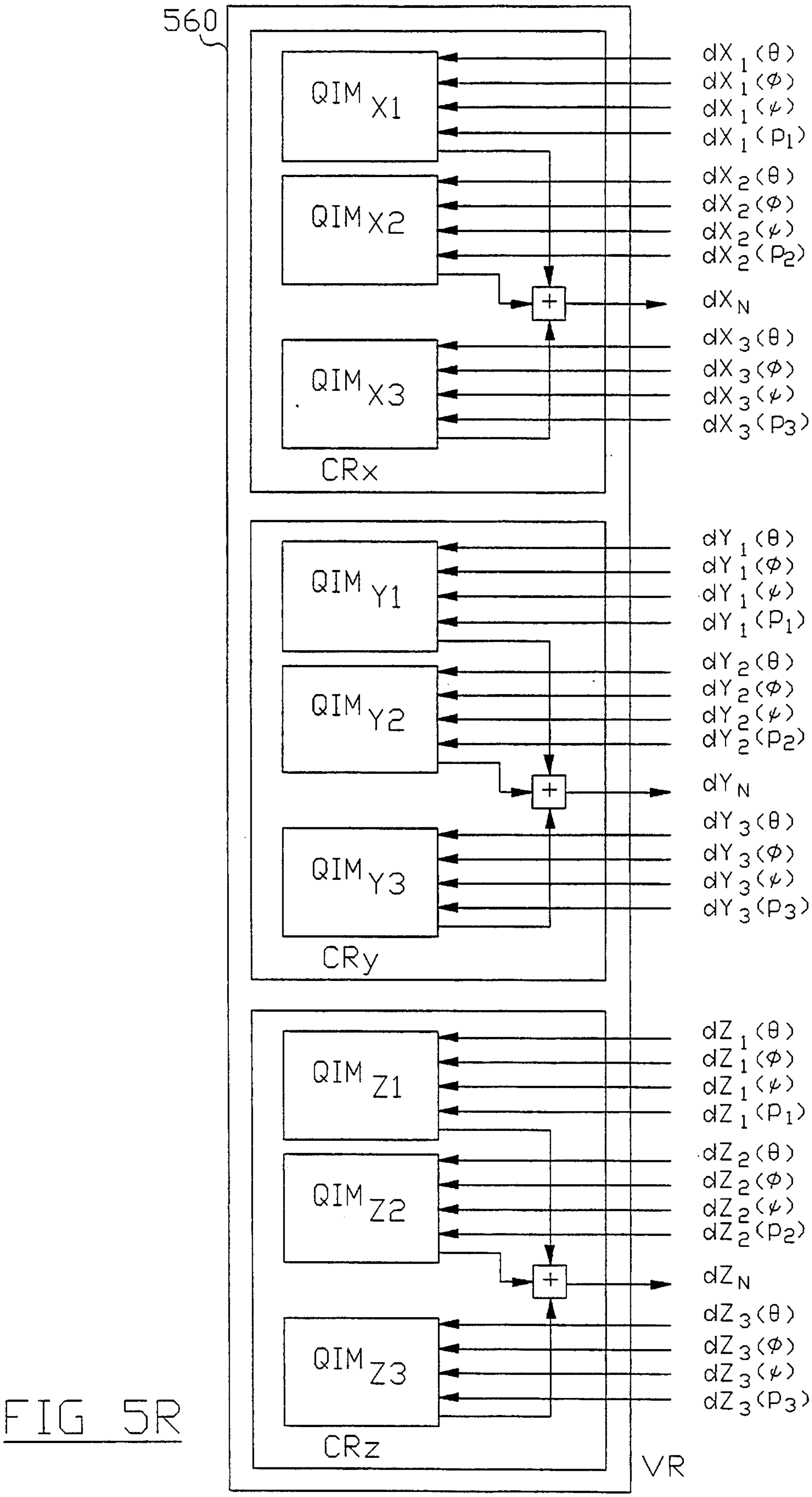
Figure 5U:
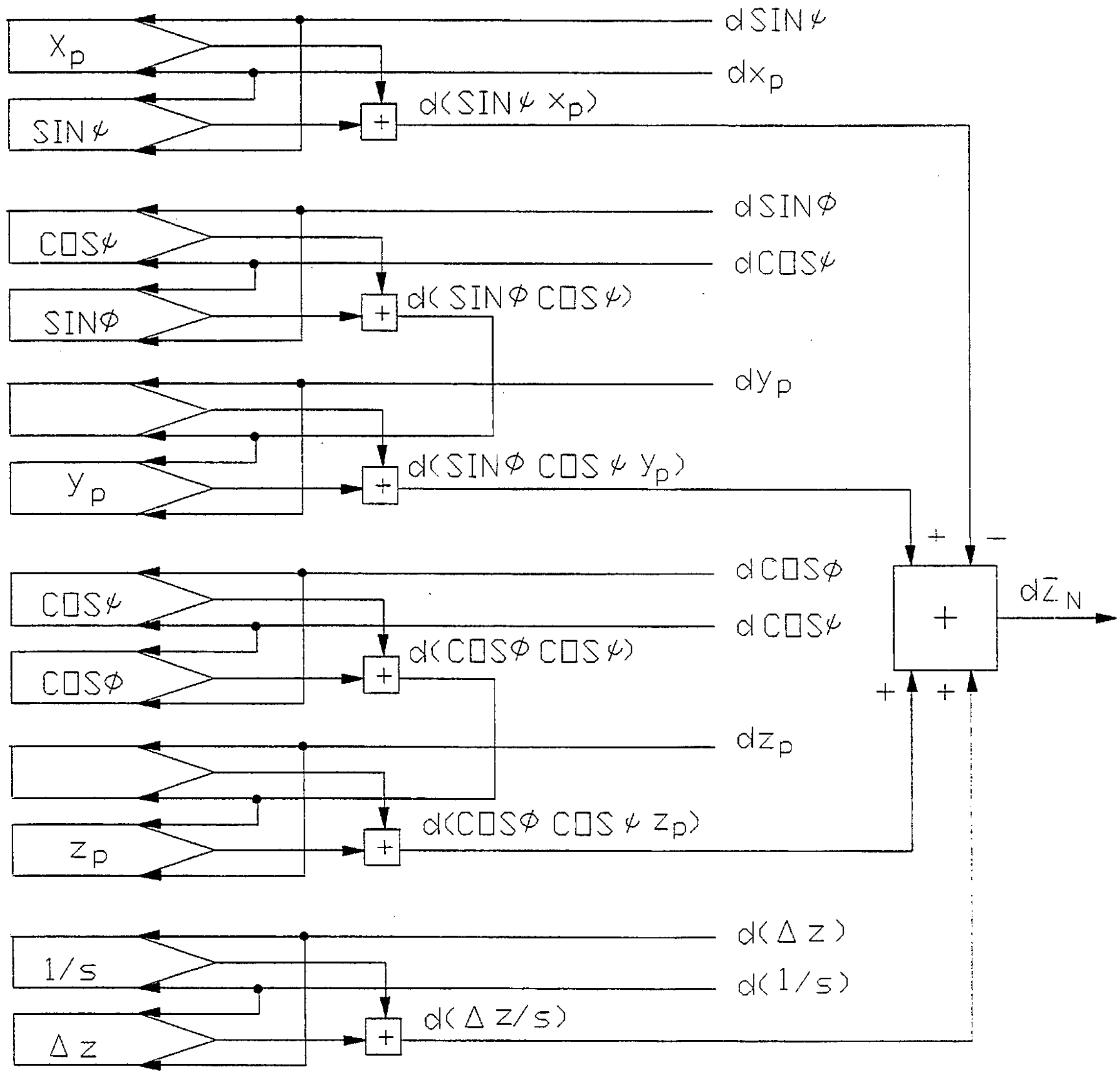
Figure 5V:
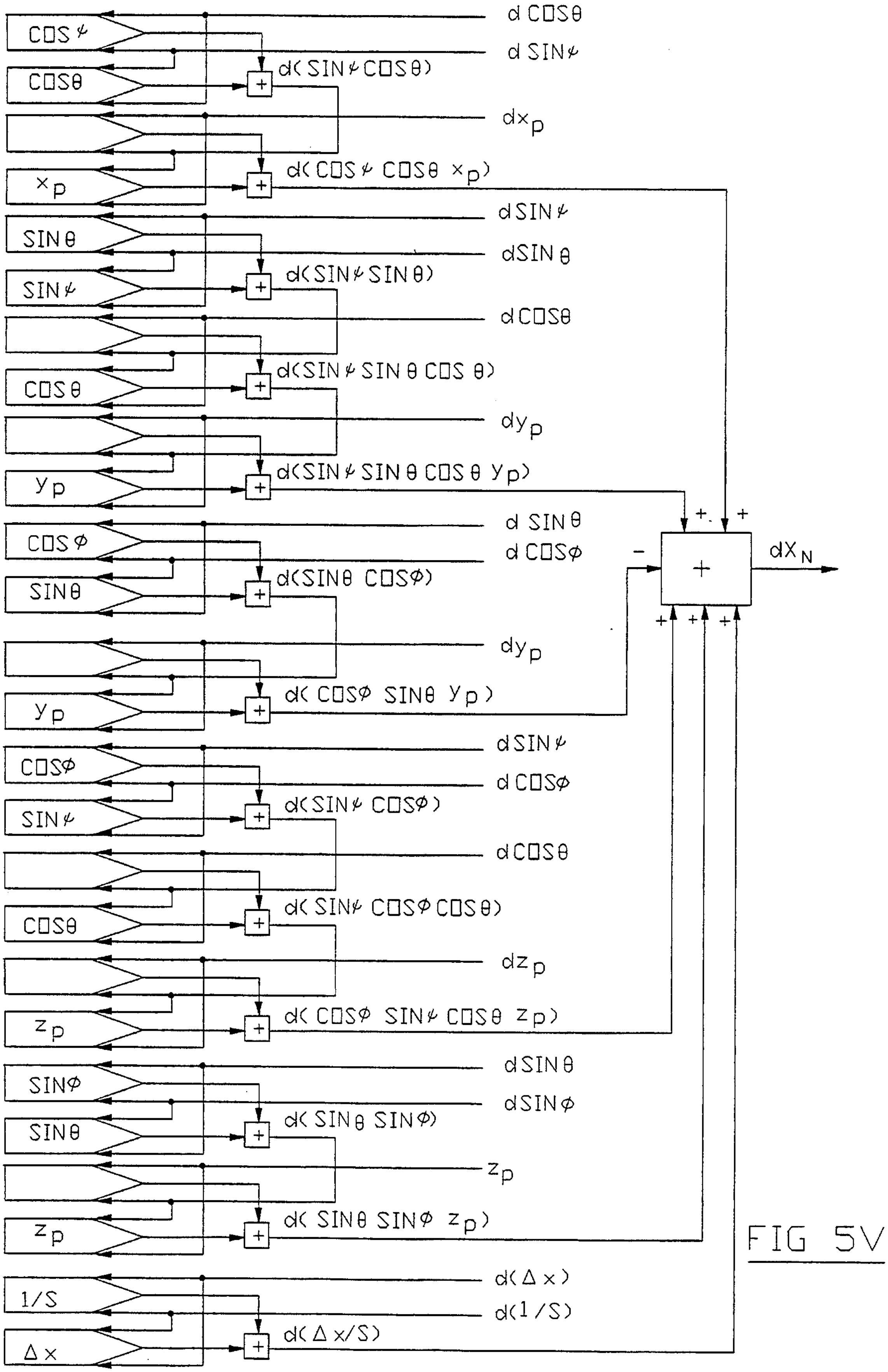
Figure 5W:
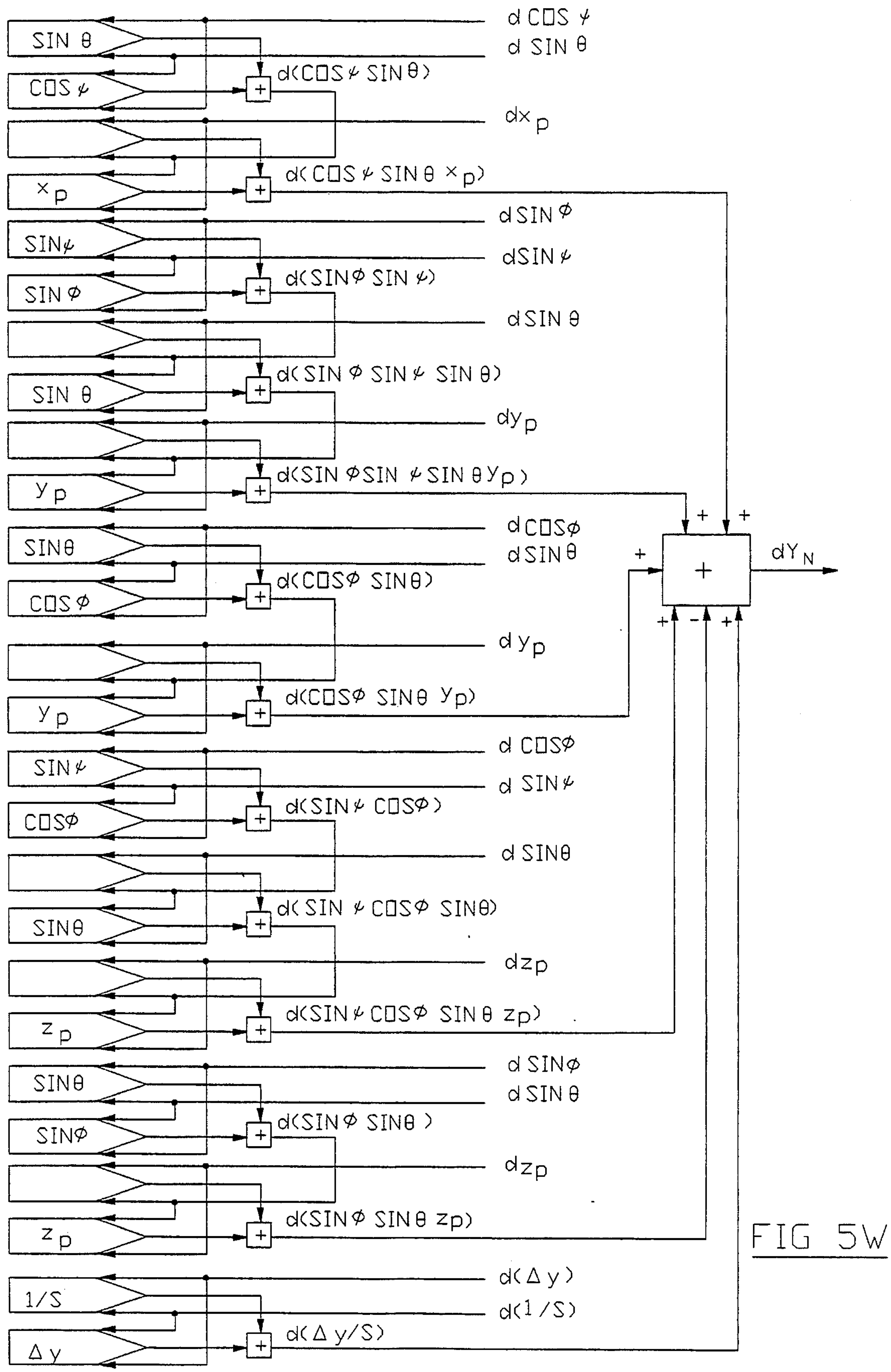

Surface Header Processing (FIG. 5C)

Surface header processing 560G (FIG. 5A) will now be discussed in greater detail with reference to FIG. 5C. Surface header processing implements the hierarchial processing configuration by performing processing for each surface of the particular object. Parameters that have been derived on the object tier and are therefore common to all surfaces of the object may be used on the surface tier for surface header processing.

Surface header processing commences with element 562A, where the visibility flags for the P-surface are preserved for postprocessing before the visibility flags are updated for the N-surface. Operation proceeds to elements 562B to 562E for shading and visibility processing. Shading and visibility are both a function of the viewport angles, mu and epsilon. Visibility is based upon the angles, mu and epsilon, being representative of a visible surface tilted positively toward the observer and a nonvisible surface tilted negatively away from the observer. Therefore, the viewport angles both being positive is representative of a visible surface and either or both being negative is representative of a nonvisible surface. A boundary condition is the viewport angles being zero, with the surface being perpendicular to the plane of the viewport; thereby presenting the surface as an edge.

Shading processing, like visibility processing, is a function of the viewport angles. Shading can be represented as an intensity-related function, where the intensity can be processed to decrease as a function of the viewport angles tilting away from the source of illumination. For simplicity, the source of illumination can be considered to be over the observer's shoulder and into the viewport and the shading parameters can be related to the tilting of the surface from the plane of the viewport. Shading can be a function derived from various functions of the viewport angles; such as linear relationships of the angles, vector relationships of the angles, trigonometric (sine and cosine) relationships of the angles, vector trigonometric relationships of the angles, or others.

A test is made for a change in mu in element 562B. If a change did not occur, operation proceeds along the NO path to element 562D, bypassing element 562C. If a change is detected, operation proceeds along the YES path to element 562C, where the parameters that are a function of mu, the visibility flag and shading parameters, are updated in accordance therewith. Operation then proceeds to element 562D to test for a change in epsilon. A test is made for a change in epsilon in element 562D. If a change did not occur, operation proceeds along the NO path to element 562F bypassing element 562E. If a change is detected, operation proceeds along the YES path to element 562E where the parameters that are a function of epsilon, the visibility flag and shading parameters are updated in accordance therewith. Operation then proceeds to element 562F to test for a change in intensity.

The delta flag is tested in element 562F to determine if a change occurred and consequently if intensity processing is necessary. This includes shading processing as a function of a change in the viewport angles and range variable intensity processing as a function of Z-motion. If the delta flag is not set, operating proceeds along the NO path to element 562L, bypassing intensity processing elements 562G to 562K. If the delta flag is set, operation proceeds along the YES path to elements 562G to 562K for intensity processing. In element 562G, the intensified color parameters IC that are a function of the viewport angles before shading and that are a function of Z-motion for range variable intensity are updated and in element 562H the changes in the intensified color are updated.

Intensified color need not be updated to the fine resolution of the processing. Therefore, intensified color increments can be accumulated until a coarser intensified color threshold is reached before updating such color parameters. The finer intensified color increments can be accumulated in a buffer, identified as the sum-delta-IC buffer, by adding the present delta-IC parameter to the sum-delta-IC parameter in the buffer in element 562H. The sum-delta-IC parameter is tested in element 562I. If the sum-delta-IC parameter is less than a threshold K, it is preserved in the sum-delta-IC buffer and operation proceeds along the NO path to element 562L, bypassing the coarser resolution delta-IC processing in elements 562J and 562K. If the sum-delta-IC parameter is equal to or greater than the threshold K, operation proceeds along the YES path to element 562J where the sum-delta-IC buffer is cleared, indicative of execution of the sum-delta-IC parameter, and to element 562K where the delta-IC parameter is set to select updating of surface memory with the new IC-parameter. This execution includes buffering the intensified color for subsequent output to the surface memory for this surface during surface memory updating and setting of the delta-IC flag, indicative of a delta-IC parameter that is to be output to surface memory for the present surface being processed.

After the intensified color processing discussed above, operation proceeds to element 562L for updating surface memory. If the delta-IC flag is set, the intensified color has changed by a minimum amount and therefore the surface memory needs to be updated with the new intensified color. Similarly, if the delta-ZTR flag is set, the range has changed by a minimum amount and therefore the surface memory range needs to be updated with the new range. The delta-ZTR flag was set on the object tier in element 561I based upon the change in Z reaching a threshold value and the delta-IC flag was set on the surface tier in element 562K based upon the change in IC reaching a threshold value in accordance with the hierarchial processing configuration. Alternately, surface memory could have been updated with the new ZTR-parameter for all surfaces associated with a particular object when the new ZTR-parameter was determined on the object tier in element 561I without the need to store the delta ZTR-flag. Also, surface memory could have been updated with the new intensified color parameter for each surface associated with the particular object when the new intensified color parameter is determined on the surface tier in element 562K without the need to store the delta-IC flag. In this alternate configuration, it would not be necessary to provide the output generation of ZTR and color together with elements 562L and 562M. When the surface memory is updated for intensified color, the sum-delta-IC parameter is cleared and the sum-delta-IC flag is cleared, as shown in element 562N, and a new accumulation of sum-delta-IC increments is begun. The delta-ZTR flag is not cleared for a surface iteration, but is maintained for all surfaces of the particular object. The delta-ZTR flag is cleared after all surfaces for the particular object are processed in element 563N (FIG. 5C) because the delta-ZTR flag pertains to the object and therefore to all surfaces therein, where all surfaces for the same object have the range parameter in surface memory correspondingly updated.

Edge Processing (FIG. 5D)

Edge processing 560K (FIG. 5A) will now be discussed in greater detail with reference to FIG. 5D. For each edge having a change, as defined with the delta-flag in element 560I, that has not as yet been processed, define with the processed flag in 560J; processing for the edge is performed as discussed with reference to FIG. 5D. Before being updated for an N-surface, the edge parameters associated with a P-surface; particularly the edge X and Y endpoint coordinates and the visibility flag; are output to the post-processor for subsequent postprocessing for the P-surface. The processed edge flag is set for the particular edge in element 563A so that this edge will not be redundantly processed for other surfaces having this edge as a common edge. Operation proceeds to element 563B, where the edge endpoint coordinates are updated using the coefficients derived in the hierarchial processing, as previously discussed. For example, matrix coefficients can be derived in the object tier, such as in elements 561E and 561L (FIG. 5B) to derive matrix coefficients common to all edges for the particular object. Edge update operations in element 563B can be performed using the previously derived coefficients to update the edge endpoint coordinates from the P-position to the N-position.

A test is made for a delta-Z condition in operation 563C. If a delta-Z change did not occur, operation proceeds along the NO path to exit processing for the particular edge. If a delta-Z change did occur, operation proceeds along the YES path to element 563D to perform perspective processing for the particular edge.

Edge endpoint coordinates have a component of alpha and beta angles, but not the gamma angle. This is because alpha and beta angular motion tilts an edge from the plane of the viewport and therefore changes the Z-position of the edge endpoint, while gamma angular motion rotates the edge in the plane of the viewport and therefore does not change the Z-component.

Edge processing results in a P-edge and an N-edge to be generated. As discussed for occulting processing herein, the P-edge will be erased and the N-edge will be drawn to provide edge motion. Changes in conditions can result in a visible surface remaining visible, a nonvisible surface remaining nonvisible, a visible surface becoming nonvisible, and a nonvisible surface becoming visible. Consequently, the visibility flag for both the P-surface and the N-surface are necessary to cover the conditions of a surface going from visible to nonvisible or from nonvisible to visible.

Output Postprocessing (FIG. 5E)

Output postprocessing 560L (FIG. 5A) has been discussed for hierarchial processing relative to FIG. 5A. This output postprocessing will now be discussed in detail with reference to FIG. 5E. As discussed relative to FIG. 5A, output postprocessing is performed for each edge of a particular surface having a changed condition. Output postprocessing operations commence with element 564A testing for the P-edge or N-edge being visible. If neither the P-edge nor the N-edge is not visible, operation proceeds along the NONVISIBLE path to bypass output processing because a nonvisible surface need not be drawn (an N-surface) nor erased (a P-surface).

If either or both, the P-surface or the N-surface, are visible; operation proceeds along the VISIBLE path to element 564B to test whether the P-surface is visible or nonvisible. If the P-surface is visible, operation proceeds along the VISIBLE path where the present edge is processed and loaded into the GPFIF FIFO in elements 565C and 565D. If the P-surface is nonvisible, operation proceeds along the NONVISIBLE path where a nonvisible word is loaded into the GPFIF FIFO for the first edge to command disabling of P-surface erase processing in the occulting processor. For a visible P-surface, initial conditions for the P-edges of that surface are generated in operation 565C and are loaded into the GPFIF FIFO in operation 565D, such as detailed in the program listings in the EGEN routine. If the P-surface is nonvisible, operation proceeds along the NONVISIBLE path to operation 565E, where a test is made for the first edge. If the first edge is detected, operation proceeds along the YES path to element 565F where a nonvisible P-surface word is stored in the GPFIF FIFO. If the first edge has already been processed, operation proceeds along the NO path to exit the P-surface output postprocessing, bypassing operation 565F.

Operation proceeds to element 565G to test whether the N-surface is visible or nonvisible. If the N-surface is visible, operation proceeds along the VISIBLE path where the present edge is processed and loaded into the GPFIF FIFO in elements 565H and 565I. If the N-surface is nonvisible, operation proceeds along the NONVISIBLE path where a nonvisible word is loaded into the GPFIF FIFO for the first edge to command disabling of N-surface draw processing in the occulting processor. For a visible N-surface, initial conditions for the N-edges of that surface are generated in operation 565H and are loaded into the GPFIF FIFO in operation 565I, such as detailed in the program listings in the EGEN routine. If the N-surface is nonvisible, operation proceeds along the NONVISIBLE path to operation 565J, where a test is made for the first edge. If the first edge is detected, operation proceeds along the YES path to element 565K where a nonvisible N-surface word is stored in the GPFIF FIFO. If the first edge has already been processed, operation proceeds along the NO path to exit the N-surface output postprocessing, bypassing operation 565K.

Edge Initial Condition Processing (FIG. 5F)

Generation of the edge ICs, discussed with reference to elements 565C and 565H (FIG. 5E), are further discussed with reference to FIG. 5F and are discussed in still further detail with reference to FIGS. 7 and 8. One edge processor configuration discussed herein uses particular initial conditions, the generation of which will now be discussed with reference to FIG. 5F. Alternate edge processors may need other initial conditions, which may be readily provided from the teachings herein.

Edge initial condition generation commences with operation 566A, where the delta-X and delta-Y parameters for the particular edge are calculated. The delta parameters for an edge, either a P-edge or an N-edge, are calculated by subtracting the edge endpoint coordinate from the edge startpoint coordinate to obtain the vector from the startpoint to the endpoint. These delta vectors are used to implicitly provide a slope parameter with the edge generator, discussed with reference to FIGS. 7 and 8 herein. The distance-to-go (DTG) parameter is derived from the delta parameter, where the distance-to-go along a particular coordinate is the absolute magnitude of the delta vector for that coordinate. The actual coordinate for the edge pixels in absolute magnitude form in screen coordinates is generated in operation 566C. For example, the coordinate of the edge pixel relative to the viewport coordinates can be derived by adding the edge pixel coordinates relative to the object coordinate reference Xk and Yk to the translational position of the object coordinate reference XTR and YTR. Various condition flags and auxiliary information needed by the particular type of edge processor are generated in operation 566D.

Geometric Processor Information Formats

Information formats for a hierarchial configuration of the geometric processor are summarized in the Geometric Processor Format Tables. These tables further illustrate the hierarchial nature of the processing the headers for the particular format tables; the environment, object, and surface headers; are discussed in still greater detail in the geometric processor header tables. The parameters to be derived are listed and the processing related thereto is implied with these header format tables.

The general form of the Geometric Processor Format Tables is a plurality of columns defining (a) a symbol pertaining to the line of information, (b) a name pertaining to the line of information, (c) the number of bytes pertaining to the line of information, and (d) notes pertinent to the line of information. The bracket symbol [] in the Geometric Processor Format Tables represents the term [154+6V+(19+E)S]; which is the equation representing the number of bytes for each block of object information for the present example. The parentesis symbol () in the Geometric Processor Format Tables represents the term (19+E); which is the equation representing the number of bytes for each block of surface information for the present example. By substitution of the variables of the average number of edges per surface E, the average number of surfaces per object S, and the average number of objects in the environment B; the number of bytes of storage used in the geometric processor memory can be estimated.

GEOMETRIC PROCESSOR FORMAT TABLES

| SYMB | NAME | BYTES | NOTES |
|---|---|---|---|
| | | ENVIRONMENT FORMAT TABLE | |
| SOE | START OF ENVIRONMENT | 1 | |
| HE | HEADER, ENVIRONMENT | 14 | |
| B1 | OBJECT 1 | [] | |
| B2 | OJBECT 2 | [] | |
| B3 | OBJECT 3 | [] | |
| B4 | OBJECT 4 | [] | |
| ↑ | ↑ | ↑ | |
| ↓ | ↓ | ↓ | |
| B(N − 1) | OBJECT (N − 1) | [] | |
| BN | OBJECT N | [] | |
| EOE | END OF ENVIRONMENT | 1 | |
| | TOTAL | 16 + [] | 16 + [154 + 6V + (19 + E)S]B<br>16 + 154B + 6VB + 19SR + ESB |
| | | OBJECT FORMAT TABLE | |
| SO J | START OF OBJECT | 1 | |
| HOJ | HEADER OF OBJECT | 150 | |
| VL | VECTOR LIST FOR OBJECT | 2 + 6V | 12V/2 = DUPLICATE EDGES NEED NOT BE STORED OR PROCESSED REDUNDANTLY |
| S1 | SURFACE 1 | () | |
| S2 | SURFACE 2 | () | |
| S3 | SURFACE 3 | () | |
| S4 | SURFACE 4 | () | |
| ↑ | ↑ | ↑ | |
| ↓ | ↓ | ↓ | |
| S(N − 1) | SURFACE (N − 1) | () | |
| SN | SURFACE N | () | |
| EOJ | END OF OBJECT | 1 | |
| | TOTAL | [[154 + 6V + ()S] | [154 + 6V(19 + E)S] |
| | | SURFACE FORMAT TABLE | |
| SOS | START OF SURFACE | 1 | |
| HOS | HEADER OF SURFACE | 17 | |
| E1 | EDGE 1 ADDRESS | 1 | CLOCKWISE SEQUENCE OF EDGES. |
| E2 | EDGE 2 ADDRESS | 1 | ADDRESS POINTER TO VECTOR LIST. |
| E3 | EDGE 3 ADDRESS | 1 | |
| ↑ | ↑ | ↑ | |
| ↓ | ↓ | ↓ | |
| E(N − 1) | EDGE (N − 1) ADDRESS | 1 | |
| EN | EDGE N ADDRESS | 1 | |
| EOS | END OF SURFACE | 1 | |
| | TOTAL | (19 + E) | |
| | | EDGE LIST FORMAT TABLE | |
| SVL | START OF EDGE LIST | 1 | |
| XEP-1 | EDGE 1 X-COMPONENT | 4 | |

-continued

GEOMETRIC PROCESSOR FORMAT TABLES

| SYMB | NAME | BYTES | NOTES |
|---|---|---|---|
| YEP-1 | EDGE 1 Y-COMPONENT | 4 | |
| ZEP-1 | EDGE 1 Z-COMPONENT | 4 | |
| XEP-2 | EDGE 2 X-COMPONENT | 4 | |
| YEP-2 | EDGE 2 Y-COMPONENT | 4 | |
| ZEP-2 | EDGE 2 Z-COMPONENT | 4 | |
| XEP-N | EDGE -N X-COMPONENT | 4 | |
| YEP-N | EDGE -N Y-COMPONENT | 4 | |
| ZEP-N | EDGE -N Z-COMPONENT | 4 | |
| EVL | END OF EDGE TTST | 1 | |
| | TOTAL | 2 + 12E | |

FOOTNOTES:
1. Updated vectors for object are temporarily stored in scratch pad and then transferred to the vector list.

GEOMETRIC PROCESSOR HEADER TABLES

| SYMB | NAME | BYTES | NOTES |
|---|---|---|---|
| | ENVIRONMENT HEADER FORMAT TABLE | | |
| EID | ENVIRONMENT ID | 2 | |
| EF | ENVIRONMENT FLAGS | 2 | |
| ISα | ILLUMINATION SOURCE α | 1 | |
| ISβ | ILLUMINATION SOURCE β | 1 | |
| ISδ | ILLUMINATION SOURCE γ | 1 | |
| ICR | ILLUMINATION COLOR R | 1 | |
| ICG | ILLUMINATION COLOR G | 1 | |
| ICB | ILLUMINATION COLOR B | 1 | |
| IIR | ILLUMINATION INTENSITY R | 1 | |
| IIG | ILLUMINATION INTENSITY G | 1 | |
| IIB | ILLUMINATION INTENSITY B | 1 | |
| EOH | END OF HEADER | 1 | |
| | TOTAL | 14 | |
| | OBJECT HEADER FORMAT TABLE | | |
| BID | OBJECT ID | 2 | BF1 = INITIALIZE OBJECT IN REFRESH MEMORY |
| BF | OBJECT FLAGS | 2 | BF2 = VISIBILITY: 0 = NON-VISIBLE<br>1 = VISIBLE |
| XTR | X-TRANSLATION | 6 | |
| YTR | Y-TRANSLATION | 6 | |
| ZTR | Z-TRANSLATION | 6 | |
| θ | θ | 2 | |
| Sθ | SINθ | 4 | |
| Cθ | COSθ | 4 | |
| φ | φ | 2 | |
| Sφ | SINφ | 4 | |
| Cφ | COSφ | 4 | |
| ψ | ψ | 2 | |
| Sψ | SINψ | 4 | |
| Cψ | COSψ | 4 | |
| C11 | COEFF. 11 | 4 | |
| C12 | COEFF. 12 | 4 | |
| C13 | COEFF. 13 | 4 | |
| C14 | COEFF. 14 | 4 | |
| C21 | COEFF. 21 | 4 | |
| C22 | COEFF. 22 | 4 | |
| C23 | COEFF. 23 | 4 | |
| C24 | COEFF. 24 | 4 | |
| C31 | COEFF. 31 | 4 | |
| C32 | COEFF. 32 | 4 | |
| C33 | COEFF. 33 | 4 | |
| C34 | COEFF. 34 | 4 | |
| C41 | COEFF. 41 | 4 | |
| C42 | COEFF. 42 | 4 | |
| C43 | COEFF. 43 | 4 | |
| C44 | COEFF. 44 | 4 | |
| BP | OBJECT PERSPECTIVE | 6 | |
| ΣΔZ | ACCUMULATIVE DELTA Z | 1 | |
| DX0 | XTR 0-ORDER DRIVING FUNCT. | 2 | DRIVING FUNCTIONS |
| DX1 | XTR 1-ORDER DRIVING FUNCT. | 2 | 0-ORDER => POSITION CHANGES |
| DX2 | XTR 2-ORDER DRIVING FUNCT. | 2 | 1-ORDER => VELOCITY CHANGES |
| DY0 | YTR 0-ORDER DRIVING FUNCT. | 2 | 2-ORDER => ACCELERATION CHANGE |
| DY1 | YTR 1-ORDER DRIVING FUNCT. | 2 | DIT => INDEP VAR. => TIME |

-continued

GEOMETRIC PROCESSOR HEADER TABLES

| SYMB | NAME | BYTES | NOTES |
|---|---|---|---|
| DY2 | YTR 2-ORDER DRIVING FUNCT. | 2 | CUM => EXTRAPOLATIVE BUILDUP |
| DZ0 | ZTR 0-ORDER DRIVING FUNCT. | 2 | |
| DZ1 | ZTR 1-ORDER DRIVING FUNCT. | 2 | |
| DZ2 | ZTR 2-ORDER DRIVING FUNCT. | 2 | |
| Dθ0 | θ 0-ORDER DRIVING FUNCT. | 2 | |
| Dθ1 | θ 1-ORDER DRIVING FUNCT. | 2 | |
| Dθ2 | θ 2-ORDER DRIVING FUNCT. | 2 | |
| Dϕ0 | ϕ 0-ORDER DRIVING FUNCT. | 2 | |
| Dϕ1 | ϕ 1-ORDER DRIVING FUNCT. | 2 | |
| Dϕ2 | ϕ 2-ORDER DRIVING FUNCT. | 2 | |
| Dψ0 | ψ 0-ORDER DRIVING FUNCT | 2 | |
| Dψ1 | ψ 1-ORDER DRIVING FUNCT. | 2 | |
| Dψ2 | ψ 2-ORDER DRIVING FUNCT. | 2 | |
| DTT | NUMBER OF ITERATIONS | 2 | |
| CUM. | CUMULATIVE DR. FUNCT. | 2 | COMPOSITE OF ALL TRANS & ROT. DRIVING FUNCT. |
| EOH. | END OF HEADER | 1 | FOR REGENERATIVE UPDATE |
| | TOTAL | 150 | |

FOOTNOTES?
1. DELTA PARAMETERS ARE TRANSITIONARY AND ARE STORED TEMPORARILY IN SCRATCH PAD.

SURFACE HEADER FORMAT TABLE

| SYMB | NAME | BYTES | NOTES |
|---|---|---|---|
| SID | SURFACE ID | 2 | CORRESPONDS TO SURFACE ID IN SURFACE MEMORY |
| SF | SURFACE FLAGS | 2 | SF1 = LAST VECTOR |
| CR | COLOR, RED | ½ | |
| CB | COLOR, BLUE | ½ | |
| CG | COLOR, GREEN | ½ | |
| IR | INTENSIFIED RED | ½ | |
| IB | INTENSIFIED BLUE | ½ | |
| IG | INTENSIFIED GREEN | ½ | |
| IN | INTENSITY | 1 | |
| SH | SHADING | 1 | |
| SW | SHADOWING | 1 | |
| Nμ | NORMAL μ | 1 | } VISIBILITY } SHADING |
| Nε | NORMAL ε | 1 | |
| Rμε | NORMAL RSS | 1 | |
| Cμε | COS R με | 1 | |
| Sμε | SIN R με | 1 | |
| SP | STARTPOINT VERTEX POINTER | 1 | STARTPOINT => ENDPOINT OF LAST EDGE |
| ΣΔIC | ACCUMULATIVE DELTA-IC | 1 | |
| EOH | END OF HEADER | 1 | |
| | TOTAL | 17 | |

Geometric Processor Format Tables

The Environment Format Table shows the format for environmental information. It includes a start of environment (SOE) code, a header (HE) for the environment, object blocks, and an end of environment (EOE) code. The start of environment (SOE) code is a unique code that identifies the beginning of the environmental information. The environment header contains information pertinent to all objects in the environment in a hierarchial form, discussed in greater detail with reference to the Environment Header Format Table. The group of objects, N-objects for this example, are provided as Object-1 to Object-N (B1 to BN) as N-blocks of object information. Each block of object information (B1 to BN) is in the form discussed with reference to the Object Format Table. The end of environment code is a unique code that identifies the end of the environment information.

The Object Format Table shows the format for object information. It includes a start of object (SOJ) code, a header (HOJ) for the object, surface blocks, and an end of object (EOJ) code. The start of surface (SOJ) code is a unique code that identifies the beginning of the object information. The object header contains information pertinent to all surfaces in the object in a hierarchial form, discussed in greater detail with reference to the Object Header Format Table. The group of surfaces, N-surfaces for this example, are provided as Surface-1 to Surface-N (S1 to SN) as N-blocks of surface information. Each block of surface information (S1 to SN) is in the form discussed with reference to the Surface Format Table. The end of object code is a unique code that identifies the end of the environment information.

The Surface Format Table shows the format for surface information. It includes a start of surface (SOS) code, a header (HOS) for the surface, edge blocks, and an end of surface (EOS) code. The start of surface (SOS) code is a unique code that identifies the beginning of the surface information. The surface header contains the information pertinent to all edges in the surface in a hierarchial form, discussed in greater detail with reference to the Surface Header Format Table. The group of edges, N-edges for this example, are provided as Edge-1 to Edge-N (E1 to EN) as N-blocks of edge information. Each block of edge information (El to EN) is in the form discussed with reference to the Edge List Format Table. The end of the surface code is a unique code that identifies the end of the surface information.

The Edge List Format Table shows the format for edge information. It includes a start of edge list (SVL) code, edge blocks, and an end of edge list (EVL) code. The start of edge list (SVL) code is a unique code that identifies the beginning of the edge information. The group of edges, N-edges for this example, are provided as Edge-1 to Edge-N (EP-1 to EP-N) as N-blocks of edge information.. Each block of edge information includes an X-component, Y-component and Z-component (XEP, YEP, and ZEP respectively). The end of edge list code is a unique code that identifies the end of the edge information.

The edges could be grouped with the surfaces so that each surface block includes the edges defining that surface. However, the edges are shown here grouped separately for greater efficiency. This is because, for a solid object, an edge is common to two adjacent surfaces and provides the boundary therebetween. Therefore, an edge would be duplicated for each of the adjacent surface blocks. Grouping of vectors separately in a vector list permits each edge to be updated only once and then to be accessed in its updated form by a plurality of adjacent surfaces. The Surface Format Table has edge addresses identifying the edges included with that surface. The edge list can also include edge identification numbers to identify each edge. However, the location of the edge in the edge list implies edge identification. For example, the first edge in the list is edge number-1, the second edge in the edge list is edge number-2, and the last edge in the edge list is edge number-N. Therefore, because the edge identification number is implicit in the edge location in the edge list, an additional edge identification number in the edge list is not necessary.

Environment Header Format Table

The Environment Header Format Table, includes information pertinent to the whole environment, including information pertinent to all objects and to all surfaces of all objects in a hierarchial fashion. In particular, the environment header includes illumination information, as listed in the Environment Header Format Table, and may include other information appropriate to the environment tier of the information hierarchy.

The environment ID (EID) identifies the environment. In a typical application, a single environment is portrayed at one time. However, there may be multiple environments in the database, such as selected by the supervisory processor. The environment ID permits identification of the selected environment.

The environment flags (EF) include a set of flags that pertain to the environment header. The environment flag word includes spare flag conditions.

Illumination information includes illumination source angles (alpha, beta, and gamma) to define the direction of illumination; illumination colors (red, green, and blue) to define the color or the color temperature of the illumination; and illumination intensity for the colors (red, green, and blue). For example, for a daylight condition, illumination source direction may be overhead, illumination color may be towards the blue part of the spectrum and away from the red part of the spectrum, and illumination intensity may be high and may be concentrated at the blue part of the spectrum and away from the red part of the spectrum. Alternately, for a sunset condition, illumination source direction may be low on the horizon, illumination color may be towards the red part of the spectrum and away from the blue part of the spectrum, and illumination intensity may be relatively low and may be concentrated at the red part of the spectrum and away from the blue part of the spectrum. Alternately, the illumination intensity parameters can be grouped together in a single intensity scale factor parameter, where the differences in intensity between the different red, green, and blue parameters can be implicit in the magnitude of the illumination color bytes. Alternately, the illumination intensity parameters can be merged with the illumination color parameters to provide color magnitudes that include the relative color intensities between the red, green, and blue colors and the scale factor levels for all three colors.

Information in the environment header can be processed as follows. As the scenario progresses, the source of illumination relative to the observer can vary, thereby varying the illumination source direction (alpha, beta, and gamma). Also, as scenario progresses, illumination color and illumination intensity can vary as a function of the time of day; such as a function of ambient light, solar light, or lunar light. Illumination color and illumination intensity information can provide the color and intensity information pertaining to ambient illumination. Illumination source information can provide the information needed for shadowing and other illumination direction-related effects.

The end of header (EOH) code is a unique code that identifies the end of the envirомment header information.

Object Header Format Table

The Object Header Format Table includes information pertinent to a particular object, including information pertinent to all surfaces of the object in a hierarchial fashion. In particular, the object header includes translation, rotation, perspective, and driving function information, as listed in the Object Header Format Table, and may include other information appropriate to the object tier of the information hierarchy.

The object ID (BID) identifies the object. In a typical application, a plurality of objects are portrayed at a time within the enviroment. The object ID permits identification of the selected object.

The object flags (BF) include a set of flags that pertain to the object header. The object flag word includes spare flag conditions.

The translation parameters (XTR, YTR, and ZTR) define the translational position of the object, such as the translational position of the object coordinate system relative to the coordinate system of the viewport. Translational position is maintained to high resolution (i.e.; 6-bytes) because of the large dynamic range of motion, including motion within the field of view as the viewport and including motion outside of the field of view of the viewport.

Rotational position of the object is defined with the rotational angles θ, Ø, Ψ and the trigonometric functions of these angles. Object angular orientation can be defined as the angular position of the object about the coordinate system of that object. The angular functions can be used for calculating the coefficients, which are a function of the trigonometric funtions of the angles, and for calculating other angle-related parameters, such as visibility and shading.

Coefficients for transformation processing are shown as coefficients C11 to C44. These represent coefficients of the X, Y, and Z terms in the coefficient matricies, transformation equations, incremental processing, or other geometric processing implementation. Coefficients provided in the object header illustrate the hierarchial processing arrangement. This represents an implementation for calculating coefficients pertinent to many edges of an object once on an object level and then using these coefficients as pre-computed coefficients for processing of a plurality of edges rather than re-computing the same coefficients for each edge.

The object perspective parameter BP represents one or more perspective-related parameters based upon the Z-position of the object for perspective processing. Perspective processing can be implemented in a hierarchial manner, such as matrix-type equations, having hierarchial-related features similar to those discussed for coefficients C11 to C44 above.

The accumulated delta-Z (sum-delta-Z) parameter pertains to the delta-Z threshold processing, discussed with reference to element 561G in FIG. 5B.

Driving functions are provided to facilitate scenario operations. These driving functions include zero-order, first-order and second-order driving functions for translation in the X, Y, and Z translational directions and for rotation in the θ, Ø, Ψ angular directions. The zero-order driving function pertains to a position change; the first-order driving function pertains to a velocity change, which is integrated to update position; and the second-order driving function pertains to an accelaration change, which is integrated to update velocity and doubly integrated to update position. Position, velocity, and acceleration pertain to translational and rotational position, velocity, and acceleration. The driving functions can be used to drive the object translationally and rotationally with zero-order, first-order, and second-order motion for non-linear motion scenarios. For example, translational driving functions translate and accelerate the object through the environment and rotational driving functions rotate and accelerate the object about its axis.

The number of iterations (DTT) defines the number of iterations for the driving functions to control motion. In one implementation, the programmed number of iterations are counted-down towards zero and the driving functions are re-defined when the iteration count reaches zero to change the form of motion.

The cumulative driving function (CUM) accumulates counts as a function of the progression of the driving function, as an indication of driving function-related error accumulation. The cumulative driving function can be implemented as a plurality of terms as an alternate to the single term. For example, each driving function can have its own cumulative parameter as an indication of the cumulative driving function over a plurality of iterations. When the cumulative driving function parameter or parameters has accumulated to a level indicative of a driving function-related error threshold, outer loop error bounding processing can be performed to re-compute the header parameters for the object header, surface header, and vectors to reduce accumulated errors; such as with high resolution whole number computations. In response to this error reduction computation, the cumulative driving function parameter or parameters can be reduced in magnitude or can be zero set; indicative of reduced errors and tolerance to additional error accumulation; for further driving function operation and driving function accumulation.

The end of header (EOH) code is a general code that identifies the end of the object header information.

Surface Header Format Table

The Surface Header Format Table includes information pertinent to a particular surface, including information pertinent to all edges in a hierarchial fashion. In particular, the surface header includes surface color, surface color intensification, surface normal, and surface startpoint information, as listed in the Surface Header Format Table, and may include other information appropriate to the surface tier of the information hierarchy.

The surface ID (SID) identifies the surface. In a typical application, a plurality of surfaces are portrayed at one time for each object. The surface ID permits identification of the selected surface within the selected object.

The surface flags (SF) include a set of flags that pertain to the surface header. The surface flag word includes spare flag conditions.

The surface-related parameters in the hierarchial configuration include color-related parameters, surface normal-related parameters, and accumulated delta-IC parameters. The color-related parameters include the colors red (CR), blue (CB), and green (CG); which define the three color components of the surface. Intensified colors red (IR), blue (IB), and green (IG) represent the colors (CR, CB and CG) as intensified by the intensity (IM), shading (SH), shadowing (SW), and other intensifying parameters. For example, the colors can be intensified by the intensity parameter (IN) by multiplication of each color component (CR, CB, and CG) by the intensity parameter. The color parameters (CR, CB, and CG) can be intensified by the shading parameter (SH); which is a scale factor derived by the angular relationship between the observer, the surface normal vector, and the source of illumination; by multiplication of each color component (CR, CB and CG) by the surface normal related shading parameter. Color parameters (CR, CB and CG) can also be intensified by the shadowing parameter (SW) which defines the degree of shadow on the surface.

The surface normal angles (mu and epsilon) define the tilt of the surface relative to the viewport and consequently define visibility, shading, and other tilt-related parameters. Visibility is defined by one or both of the surface normal angles being negative, representative of the surface being tilted away from the observer and therefore being a non-visible backside surface. The degree of tilt defines the tilt-related illumination effect, such as for shading. Assuming that the source of illumination is over the observer's shoulder, the vector tilt or root-sum-of-the-squares (RSS) of the tilt can be used to define the degree of shading.

The start point vertex pointer (SP) defines the startpoint vertex; such as for start of edge processing to define the edge pixels around the periphery of the surface.

The end of header (EOH) code is a general code that identifies the end of the surface header information.

Incremental Geometric Processor

One configuration of geometric processor 130 is an incremental geometric processor, such as using of a digital differential analyzer (DDA). Each DDA processor can be implemented as a parallel word serial computation processor used in parallel with other similar DDA processors to provide a hybrid (serial and parallel) computational architecture. Each parallel DDA processor element may be identical to the others. Therefore, a single DDA processor will be discussed as representative of the parallel DDA processor arrangements.

A representative DDA computation element (sometimes called an integrator) is shown in block diagram form in FIG. 5J and in schematic notation form in FIG. 5I. It is composed of a pair of registers, the Y-register and the R-register. Internal operations are whole number operations and are executed in parallel word form. External operations are incremental operations and are executed in incremental form. Incremental Y-inputs (dy inputs) are used to incrementally update (add to or subtract from) the Y-register. The Y-number in the Y-register represents the whole number dependent variable and the incremental input to the Y-register dy represents the incremental dependent variable dy communicated from other DDA elements. The Y-number in the Y-register is added to (or subtracted from) the R-number in the R-register under control of the incremental independent variable dx communicated from other DDA elements. The R-number is the remainder number, the least significant portion of the solution generated by a DDA element. The most significant portion of the solution is the incremental output variable dz derived by detecting the overflow (or underflow) of the R-number when updated with the y-number.

Therefore, the representative DDA element comprises two registers (the R-register and the Y-register), an incremental adder (subtracter), a parallel whole number adder (subtracter), and overflow (underflow) logic. This represents a very small amount of computation logic, particularly when implemented with current MSI circuits. For example, the incremental dy adder (subtracter) and the Y-register can be implemented with an MSI up/down counter; the R-register can be implemented with a static flip-flop register; and the Y-R register adder subtracter can be implemented with an adder/subtracter; all commercially available MSI circuits. The overflow (underflow) logic and control logic can be implemented with combinations of MSI and SSI circuits. Alternately, a complete DDA element can be implemented on a simple custom MSI integrated circuit chip.

Incremental computations are performed by interconnecting DDA elements so that the dz-output increment from each DDA element is connected as the dy or dx input increment to other elements. Complex operations can be performed with DDAs, such as trigonometric function generation (sin, cos, tan, etc); multiplication and division; roots and exponents; and hyperbolics. However, the DDA elements perform these complex operations using only addition, subtraction, and simple logical operations. This is in contrast to whole number processor, which require complex circuitry or complex time consuming subroutines to perform such processing. Therefore, incremental processing provides significant efficiencies in performing complex analytic operations for continuous applications.

A serial incremental computational architecture can be used for each DDA incremental processing module. A serial incremental processor can be implemented with a single DDA computation element that is time shared to perform a large number of computational operations. For example, a DDA element operating at 6-MHz can generate 200,000 computations in the 1/30 of a second frame period and can generate 600,000 incremental computations in the 1/10 second update period. This is about sufficient for a basic high detail image including three-dimensional rotation, three-dimensional translation, face visibility, and range variable size processing.

The logical arrangement of a single DDA element uses parallel arithmetic internally. The DDA computations discussed above use serial (operation-by-operation) computations. Therefore, this DDA processor module is characterized as a serial computation parallel word DDA incremental processor. Other combinations of serial and parallel computations and serial and parallel words have been considered. The serial computation parallel word incremental processor will be discussed herein as illustrative of other configurations.

Incremental Processor Architecture

An incremental processor is provided that generates solutions in response to changes. Although an incremental processor herein may include a processor that updates the computations in response to a single bit or in response to a least significant increment, incremental processing may be provided with a variable increment size; such as discussed in the related patent applications referenced herein.

Conventional CGI display systems are implemented with whole number transformations, where whole number multiplications and whole number geometric operations are used for coordinate transforms. However, in accordance with another feature of the present invention, a continuous change computation can be implemented to reduce the amount of redundant information to be processed based upon continuous change-related processing. For example, an Euler angle transform can be implemented with an incremental or a change-related processor, such as a digital differential analyzer (DDA). Such incremental processors are discussed in the related patent application Ser. No. 754,660 and other patent applications referenced herein. Implementation of an incremental coordinate transform processor can be provided for high speed operation at low cost.

A block diagram of an incremental processor element 500 is shown in FIGS. 5J. Element 500 includes Y-register 510, R-register 513, and logic 511, 512, and 514. Y-register 510 stores the Y-dependent variable. Y-update logic 511 incrementally updates the Y-number (the dependent variable) in Y-register 510 under control of incremental dy input signals. R-register 513 stores the R-number, which may be characterized as a remainder parameter. R-register update logic 512 updates the R-number in R-register 513 in response to the Y-number in Y-register 510 under control of the incremental independent variable dx. Output logic 514 generates incremental output dz in response to the R-number in R-register 513. Element 500 operates by receiving incremental input signals dy and dx and by updating the Y-number in Y-register 510 and the R-number in R-register 513 respectively in response thereto. Incremental output dx is generated in response to an overflow or underflow of the R-number in R-register 513.

Updating of the Y-number in Y-register 510 is performed by incrementally adding or subtracting the dy increments to the Y-number using incremental dy update logic 511. Y-register 510 and update logic 511 may be implemented in the form of an up-down counter for incrementing and decrementing the Y-number in response to +dy increments and −dy increments, respectively. Therefore, the Y-number in Y-register 510 will change as dy increments are received. For a constant Y-number, the dy increments are zero.

The R-number in R-register 513 is updated under control of dx increments. A positive dx-increment causes the Y-number in Y-register 510 to be added to the R-number in R-register 513 under control of update logic 512. A negative dx increment causes the Y-number in Y-register 510 to be subtracted from the R-number in R-register 513 under control of update logic 512. The R-number varies under control of independent variable dx controlling updating thereof and in response to the Y-number in Y-register 510 which updates the R-number in R-register 513.

Output logic 514 detects overflows and underflows of the R-number in R-register 513. An overflow generates a positive dx incremental output signal and an underflow generates a negative dx incremental output signal, as determined with output logic 514. The dx incremental output signal may be considered to be the most significant portion of the R-number, where the R-number in R-register 513 may be considered to be the least significant portion of the output number.

Y-register 510 and R-register 513 may be conventional digital registers, such as implemented with flip-flops. They may be implemented as serial registers for serial operations or may be implemented as parallel registers for parallel operations. Update logic 511 and 512 may be implemented in serial or parallel form. Similarly, output logic 514 may be implemented in serial or parallel form.

Incremental inputs dx and dy and incremental output dx may be binary increments or ternary increments. Binary increments may be implemented as either one or zero signals on a single line. Ternary increments may be implemented with two signal lines, where a positive increment may be represented with a binary one on the positive incremental line, a negative increment may be represented with a binary one on the negative incremental line, and a zero increment may be represented with zeros on both incremental lines.

Y-update logic 511 may be implemented with counter logic for incrementing or decrementing the Y-number in Y-register 510 in response to positive dy increments and negative dy increments, respectively, on the dy input line. R-update logic 512 may be implemented with a whole number added-subtractor for adding or subtracting the Y-number in Y-register 510 to or from the R-number in R-register 513 under control of the dx incremental input. Addition may be commanded by a positive dx increment and subtraction may be commanded by a negative dx increment. Updating of the R-number in R-register 513 with the Y-number in Y-register 510 causes the R-number in R-register 513 to overflow or underflow. Overflows and underflows are detected with output logic 514 for generating a positive dx increment for an overflow and a negative dx increment for an underflow.

Element 500 (FIG. 5J) may be illustrated schematically as shown with element 515 (FIG. 2I). The incremental dependent variable dy is shown input near the bottom of element 515 for incrementally updating the Y-number shown inside element 515. The incremental independent variable dx is shown input near the top of element 515 for controlling updating of the R-number with the Y-number. The incremental dx output is shown at the center of element 515, generated in response to overflow or underflow conditions of the R-number.

Processing with incremental processing elements is performed by interconnecting the elements in a particular form. Interconnection of elements for implementing particular processing will now be discussed in the form of a parallel incremental processor by interconnecting incremental processor elements in parallel form. This configuration permits simplified discussion. However, other incremental processing arrangements; such as time shared incremental processors implemented in what may be called serial processing form with a plurality or elements time sharing a hardware element; is discussed with reference to FIG. 6B.

The arrangement shown in FIG. 5K provides incremental multiplication. Whole number initial conditions U and V are loaded into the Y-registers of elements 516 and 517, respectively. Incremental inputs dU and dV are input as changes to the dependent and independent variables for the two elements 516 and 517. For example, dU is input as changes to the dependent variable U for U element 516 and as changes to the independent variable V for V element 517. Similarly, dV is input as changes to the dependent variable V for V element 517 and as changes to the independent variable V for V element 516. V element 517 has the V dependent variable updated by the dV incremental input and has the independent variable controlled by the dV incremental input. This yields incremental output VdU. Similarly, the U element 516 has the U dependent variable updated by the dU incremental input and has the independent variable controlled by the dV incremental input. This yields incremental output UdV.

The VdU output of element 517 and the UdV output of element 516 are summed together with incremental added 518 to provide the output (VdU+UdV); which in differential terms is the incremental-product d(UV). Therefore, the arrangement shown in FIG. 5K implements an incremental multiplication for two variables.

The arrangement shown in FIG. 5K may be simplified for multiplication by a constant. If the U-number is a constant, not a variable; then the dU input is zero because there is no change therefor. Hence, element 516 contains the U-number in the Y-register without a dU update signal. Also, element 517 will not generate any output signal VdU and therefore need not be implemented. Similarly, with a zero VdU increment input to added 518, the output of added 518 is identically the UdV output of element 516. Therefore, added 518 can also be eliminated for multiplication by a constant. Hence, multiplication by a constant (U) can be provided by loading the constant U into the Y-register of element 516, inputting the independent variable dV as the independent variable to element 516, and Using the incremental output UdV as the incremental product of a variable dV and a constant U.

The arrangement shown in FIG. 5L provides an incremental cos-sin trigonometric function generation. Whole number initial conditions cosθ and sinθ are loaded into the Y-register of elements 518A and 519, respectively. Changes in the angle θ are input as the independent variable dx of each elements 518A and 519. The incremental outputs of each element are the changes in the incremental products cosθdθ for the output of element 518A and sinθdθ for the output of element 519. Cosθdθ is equal to d(sinθ) and sinθdθ is equal to d(cosθ) from differential equations and difference equations. Therefore, the output of element 518A is d(sinθ) and the output element 519 is d(cosθ), as shown in FIG. 5L. The d(sinθ) output of element 518A is input as the dependent variable to update the sing parameter in element 519 and the d(cosθ) output of element 519 is input as the dependent variable to update the cosθ parameter in element 518A. As the dθ increments proceed, the cosθ and sinθ parameters are updated and the d(cosθ) and d(sinθ) incremental changes are output for other processing. Therefore, the arrangement shown in FIG. 5L implements an incremental sin-cos generator for an angle θ and can be used to generate similar trigonometric functions for other angles.

The arrangement shown in FIG. 5M provides incremental reciprocal generation. Whole number initial condition 1/Z are loaded into the Y-registers of elements 520 and 521. Incremental input dz to element 521 generates the incremental output (1/z)dz, which is the incremental (1n z). However, the incremental reciprocal of a z, d(1/z), is the negative of the reciprocal of z and the differential of (1n z) which is d(1/z)=−1d(1n z)]. This function is generated with element 520, where 1/Z in the Y-register of element 520 is multiplied by the incremental natural log of z, d(1n z), input as the independent variable to generate the output d(1/z) as the incremental product −1/z[d(1n z)]. This incremental reciprocal output is also fedback to the dependent variable input of elements 520 and 521 to update the 1/z numbers in the Y-registers.

The arrangement shown in FIG. 5T provides an incremental arc cos θ generation. Whole number initial conditions; θ, cosθ, sinθ, (J-K) cosθ, K, and cosθ are loaded into the Y-registers of elements 593, 590, 591, 592, 594 and 595 respectively. Incremental inputs dJ and dK are input as changes of the cos components and incremental input dt is a clock pulse input to drive an implicit servo to generate the arc cos function. Elements 590 and 591 represent a sin-cos generator, such as discussed with reference to FIG. 5L above. Sin-cos generator 590 and 591 is driven by the incremental angle dθ from servo element 592 for generating the incremental sin and cos functions of angle θ. The incremental angle dθ is also accumulated in the Y-register of element 593 and is output as dθ to facilitate other processing. Servo 592 may be considered to be an implicit servo, as discussed in the Levine book referenced herein. Servo element 592 subtracts the incremental trigonometric functions Kd(cos θ) from element 594 and (cos θ)dJ from element 595 from input parameter dJ to generate the difference therebetween which is the incremental changes in the angle dθ. The angle dθ is used to drive sin-cos generator 590 and 591 to null out servo element 592 through formation of the nulling trigonometric components generated with elements 594 and 595. Therefore, the arrangement shown in FIG. 5T implements an incremental arc-cos operation. Similarly, other inverse trigonometric functions, such as arc-sin and arc-tan functions, may also be generated.

Driving Functions

Driving functions may be used to drive the generated image or portions thereof. For example, the whole environment may have relative motion due to observer motion. Also, an object may be moved within the environment for object motion. Observer motion and object motion may be superimposed, where an observer's perspective may be changed relative to the whole environment and an object may be moved with the environment simultaneously therewith. An incremental implementation thereof is shown in FIGS. 5N and 5S, representative of other implementations thereof. Motion can be implemented with observer driving logic 528A and object driving logic 529A to generate rotational motion (FIG. 5N) and observer driving logic 528B and object driving logic 529B to generate translational motion (FIG. 5S). Observer and object driving functions can be superimposed by adding the driving functions with adders 522A–524A and 522B–524B; as shown in FIGS. 5N and 5S. Observer driving logic 528A and 528B may drive all objects in the environment because observer motion may effect the total environment. Object driving logic 529A and 529B may be different for each object and may be zero for stationary objects. However, even stationary objects may have relative motion caused by observer driving logic 528A and 528B.

In accordance with the initial condition generation arrangement discussed herein; objects may be entered, removed, or replaced in the environment by driving objects into the environment from the frame of the refresh memory and by driving objects out the environment. Objects driven out of the environment may be removed from the geometric processor main memory to permit use of those main memory locations for other objects or may not be removed therefrom to permit eventual driving of that object back into the environment. Driving of objects into and out of the environment may be performed at high speed, such as in one refresh frame so as to appear instantaneous for entry, removal, or replacement of an object. This can be implemented by dedicating a high speed motion incremental processor element and a fill processor to the object being rapidly driven so as to facilitate rapid updating of the real time processor.

Driving functions may be derived from-various sources. Vehicle motion may constitute observer motion, where vehicle motion signals may be used in addition to or in place of observer motion control. Also, observer motion may be input with observer control 110 (FIG. 1A) such as to facilitate simulated scenarios. Driving functions for individual objects may be provided in various forms. Automatic object driving functions may be generated by detecting non-matching object conditions between an acquired image and a generated image. Object motion driving functions may also be provided by monitoring objects in the actual environment, such as vehicles, and providing driving functions for the corresponding objects in the generated image.

Vehicle motion may be obtained from the various vehicle systems, for use as image driving functions. For example, vehicle navigation system such as inertial, radar, sonar, Loran, satellite, and other vehicle navigation systems conventionally provide location and orientation information. Also, vehicle location may be obtained from checkpoint fixes taken by a pilot, celestial fixes taken by a navigator or astrotracker, sonar buoy fixes taken by a navigator, and others. Vehicle attitude may be obtained from gyro sensors such as vertical and heading gyros and compasses such as gyro and magnetic compasses, and from other sources.

Observer controls 110 (FIG. 1A) may be used for driving functions. For example, observer controls 110 may be used to introduce observer motion, such as for modifying an observer's perspective for the whole environment or for selectively driving individual objects or groups of objects. For example, an observer may introduce translation, rotation and scaling driving functions to better position, orient, and size a generated object image to better match an acquired image pattern. Observer controls may include a light pen, a touch panel on the display face, a track ball, a joy stick, and other observer controls.

Observer perspective may be determined with observer sensors, such as a head position sensor and a line-of-sight eye sensor. These sensors generate observer-related signals that may be used as driving functions to drive the generated environment.

Driving functions are further discussed with reference to the Object Header Format Table herein.

Incremental Processor Considerations

CGI processing speed is generally related to the integration time constant of the human eye. Generally, thirty frames per second is considered to be adequate for displaying continuous motion to a human. However, a parallel incremental processor can operate at a multiple MHz iteration rate and therefore can provide solutions almost one million times faster than needed for continuous vision. Therefore, a parallel word, serial computation incremental processor can be used for a real time visual system. However, other processors; such as a serial word parallel computation processor, a parallel word parallel computation processor, and other architectures may be used. In a parallel word serial computation processor, each operation, such as each fetch operation or store operation, can be performed in a fraction or a microsecond. Therefore, over 33,000 operations can be performed in a thirtieth of a second frame period. This permits high computation power for coordinate transforms. Further computational capability may be provided with a plurality of parallel processors, where each processor can be implemented as a parallel word serial computation incremental processor.

An incremental processor arrangement is shown in FIG. 6B, time sharing incremental processor hardware element 677 with a plurality of software elements stored in main memory 671. The nomenclature will be defined for convenience of illustration. A combination of R and Y register parameters and auxiliary information and logic may be called a computational element. A computational element may be implemented in hardware 677 (FIG. 6B) and may be called a hardware element. Element information, such as Y-register and R-register information, may be stored in main memory 671 and may be called a software element. In one illustration, a plurality of software elements stored in main memory 671 time share one or more hardware elements 677 implemented with hardware logic.

The incremental processor has been discussed for a single hardware element time shared between a plurality of elements in main memory to exemplify one implementation of rotation, translation, and other processing. Many other partitioning configurations may be provided. For example, a plurality of hardware elements 677 may be time shared between different elements in main memory 671. Main memory 671 may be partitioned into different blocks assigned to different hardware elements 677. A plurality of hardware elements may be provided for various purposes, such as for increasing processing speed. For example, two hardware elements can each be time shared with a quantity of software elements in main memory to provide twice the iteration rate of a single hardware element. For this example, a first half of main memory 671 may be assigned to a first hardware element 677 and a second half of main memory 671 may be assigned to a second hardware element 677.

Main memory 671 of the incremental processor may be configured as a plurality of blocks of main memory and hardware elements may be assigned thereto with fixed or variable assignments. In a fixed assignment configuration, a software element that is time sharing a hardware element may be permanently assigned, such as through wired logic. In a variable assignment configuration, software elements may be assigned to different hardware elements at different times. Variable assignment may be performed in various ways, such as under control of special purpose logic or under supervisory processor program control. For example, variable hardware logic assignments may be provided on a resource availability basis; where a plurality of hardware elements may be assigned as they have available capability. A hardware element may set a ready flag when it has finished processing its last group of software elements. It may then be assigned the next group software elements to be processed.

In a variable assignment configuration, hardware elements may be assigned to software elements or blocks of software elements under program control with supervisory processor 125. Supervisory processor 125 can perform priority determination processing and can assign blocks of software elements to a hardware element 677 in accordance with the priority processing. For example, main memory 671 may be configured as a plurality of blocks, where each block has one or more objects related thereto. Stationary objects may not require processing or may require only a small amount of processing in the absence of observer motion; where stationary objects (without observer motion) need not have translation, rotation, scaling, and face normal vector processing. Therefore, a hardware element may not have to be assigned to process software elements that are not changing. Also, objects having low processing priority, such as slowly moving objects, may be assigned fewer hardware elements. For example, two lower priority blocks, four lower priority blocks, or other quantities of lower priority blocks may be assigned to a single hardware element to provide updating thereof. However, the more blocks assigned to a hardware element, the lower the update rate because of the greater number of software elements that are time sharing a hardware element. Similarly, high priority processing, such as for a rapidly moving object or otherwise high priority processing, may be assigned one or more hardware elements for higher fate processing thereof. For example, high priority objects may have the smaller partitioned block of main memory 671 assigned to a hardware element 677 for greater processing rate.

The two extremes of time sharing of hardware elements are the lower rate extreme of a single hardware element 677 time shared by all software elements and the higher rate extreme of a different hardware element dedicated to each software element for no time sharing of hardware elements. For the time shared single hardware element, processing is relatively slow and hardware complexity is relatively low. For simpler configurations, such as for simpler display configurations having relatively few edges to be displayed, and for slower update rate requirements, such as non-real time or near-real time operation, high levels of time sharing may be acceptable. Lower levels of time sharing for greater update rates may be provided as needed to meet system requirements, such as for higher update rates and for a higher level of details. For highest update rates, a fully parallel computation incremental processor may be provided without time sharing of hardware elements, where each software element has a dedicated hardware element. Visual display requirements generally will not need such high update rates and therefore can be implemented with time sharing of hardware elements.

Serial Incremental Computation Architecture

A serial incremental geometric processor configuration will now be discussed. In various system configurations, a thirty frame per second rate is adequate. However, incremental processing elements can operate at a multi-megahertz rate, which is significantly faster than required. Therefore, incremental processing elements can be time shared to reduce hardware complexity and cost. A serial incremental processor is described herein in the form of a serial computation parallel word processor, which is illustrative of other processing arrangements; such as serial processing serial word arrangements, parallel processing serial word arrangements, and parallel processing parallel word arrangements.

A serial processing parallel word implementation of an incremental processing arrangement will now be discussed with reference to FIG. 6B. A hardware implemented incremental processing element 677 is time shared between a plurality of processing operations. This is accomplished by loading the Y number and R-number from main memory 671 into the Y-register 683 and R-register 684 respectively of element 677; then accessing the dy and dx increments from increment memory 672; and then generating the dz output with element 677 in response thereto for storage into increment memory 672. The Y-number and R-number for each of a plurality of processing elements are stored in main memory 671. The interconnections between elements are established by the dy and dx incremental input to each element, defined by the interconnect field of main memory 271. The interconnect field may include the increment memory address of the dy and dx increments for the particular computation element.

For most processing; the address of the dz output increment, the dx input increment, and the dy input increment for the same processing element are different. Therefore, multiplexer 674 is used to multiplex different addresses from address counter 673, dx address register 675, and dy address register 676.

In one configuration; 1,024 processor elements may time share a single hardware element 677. In this configuration, the R-number and the Y-number may be designated as 16-bits each. Also, in this configuration, the dx and dy incremental interconnections may be 10-bit subfields to permit selection of one of the 1,024 increments stored in increment memory 672 for the dx increment and one of the 1,024 increments stored in increment memory 672 for the dy increment. Main memory 671 may have a plurality of fields including an R-field of 16-bits, a Y-field of 16-bits, and an interconnect field of 20-bits. The interconnect field may have a dx-subfield of 10-bits and dy-subfield of 10-bits. The R-field and Y-field contain the 16-bit R-number and Y-number respectively for loading into a 16-bit R-register 684 and a 16-bit Y-register 683 of element 677. The dx-subfield stores the address of the increment in increment memory 672 that will be input as the dx-increment for that element and the dy-subfield stores the address of the increment in increment memory 672 that will be input as the dy-increment for that element. The dz-increment from element 677; generated in response to the R-number, Y-number, dy-increment, and dx-increment; will be stored into increment memory 672 for use by other processor elements.

A sequential address counter 673 may be used to sequentially access the processor element from main memory 671 and to simultaneously address the dz-output increment for inclement memory 672 corresponding to the same processor element. Therefore, a particular address in address counter 673 may select the R-number and Y-number from main memory 671 for the particular processor element and may select the dz-output increment for increment memory 672 for that same processor element. Therefore the address of the processor element in main memory 671 also defines the address of the dz-increment for that same processor element in increment memory 272.

Connecting of a first processor element in main memory 671 to an output dz-increment of a second processor element stored in increment memory 672 is accomplished by storing the address of that second processor element in the dx-subfield or the dy-subfield of the first processor element. For example, if the fifth processor element receives a dx-input increment from the thirtieth processor element dz-output increment and a dy-input increment from the second processor element dz-output increment, then the interconnect field of the fifth processor element has the address of the thirtieth processor element in the dy-subfield and the address of the second processor element in the dy-subfield.

When the numbers of a particular processor element are accessed from main memory 671, the R-number and Y-number are loaded into R-register 684 and Y-register 683 respectively of element 677 and the dx-interconnect subfield and dy-interconnect subfield are loaded into the dx-address register 675 and the dy-address register 676. The dx-increment is accessed from increment memory 672 in response to the dx-address in dx-address register 675 through multiplexer 674. Similarly, the dy-increment is accessed from increment memory 672 in response to the dy-address in dy-address register 676 through multiplexer 674. After the dx and dy increments have been accessed from increment memory 672, and dx output increment of element 670 can be determined and can be input to increment memory 672 for storage at the address location determined by address counter 673, corresponding to the processor element address for that particular element in main memory 671. Multiplexer 674 multiplexes the dy-address and dx-address from dx-address register 675 and dy-address register 676 respectively for accessing the dx and dy increments respectively. Multiplexer 674 also multiplexes the dz-address from address counter 673 for storage of the output dz-increment.

Simultaneously with storing of an updated dz increment in increment memory 672, the updated contents of the Y-number and R-number from element 677, which are stored in Y-register 683 and R register 684 respectively, are stored back-into the related locations of main memory 671 as updated parameters. The interconnect field is not usually changed during a computation because it defines the nature of the computation, which may be defined as a program comprised of interconnections.

Address counter 673 increments through the sequence of processor elements stored in main memory 671 with the associated accessing and storing of dz-increments in increment memory 672 until all processor elements in main memory 671 have performed the related processing. Then, address counter 673 is reset to the first address for another iteration of sequential processing of the processor elements in main memory 671.

Additional fields may be contained in main memory 671 for other operations. For example, a flag-field may be implemented to flag the word accessed from main memory 671 as being different in form from that discussed above. For example, if an element has multiple dy-inputs; then the multiple dy-inputs can be addressed with a plurality of sequential words in main memory 671 for selection of multiple increments from increment memory 672 for multiple updating of the Y-number in Y-register 683 of element 677. Similarly, multiple dx-increments may be accessed from increment memory 672 for multiple incremental update of the R-number in R-register 684 of element 677. Effectively, setting of a flag bit for a particular processor element in a flag field of main memory 671 can indicate a change in the nature of the field information in main memory 671 to command different processor operations.

For simplicity of discussion, multiple sequential operations for increment memory have been discussed, including accessing a dx-increment, accessing a dy-increment, and storing a dz-increment. However, sequential operations of increment memory 672 could slow down processor operation. Processor operation can be increased in various ways, such as by increasing speed for increment memory 672 and by reducing the number of sequential operations for increment memory 672. Also, processor operation can be enhanced with other techniques, such as lookahead and overlapping operations. Speed can be increased by using higher speed memory circuits for increment memory 672. The number of sequential operations can be reduced by paralleling hardware.

Speed enhancement of increment memory 672 will now be discussed. Increment memory 672 is significantly smaller than main memory 671. For example, main memory 671 may have a 53-bit word length comprising 16-bits for the R-field, 16-bits for the Y field, 20-bits for the interconnect-field and 1-bit for the flag-field for one configuration discussed above. However, increment memory 672 may have only a 2-bit word length, comprising a 2-bit increment field for a 2-bit ternary incremental number. Therefore, increment memory 672 may be only about four percent of the size of main memory 671. Consequently, using a higher speed type memory for increment memory 672, compared to the type memory used for main memory 671, may have only a small system cost impact. For example, main memory 671 may be implemented as a relatively low cost MOS FET memory available on a 64k bit VLSI chip and increment memory 672 may be implemented as a relatively high speed bipolar memory for rapid increment accessing and storage.

Reduction of sequential operations for increment memory 672 will now be discussed. Increment memory 672 may be speeded up by using parallel operations. For example, increment memory 672 may be implemented as a pair of increment memories, where one of the increment memories is accessed for the dx-increment and where the other one of the increment memories is accessed for the dy-increment. Each of these two incremental memories may contain the same information, where the dz-increment from element 677 may be stored into the same locations in each of the two increment memories for simultaneous random accessing of the dx-increment and the dy-increment from the dx-subfield and the dy-subfield of main memory 671.

The economy of the serial processing configuration discussed herein will now be illustrated with a sizing thereof. This sizing will include performance and cost. In prior art systems, the level of detail is often measured by the number of edges that can be processed during a frame. Therefore, the processing capability will herein be related to edges. A reasonably detailed system may have a capability of 2,000 edges. Therefore, a 2,000 edge system will now be sized for the system of the present invention.

The number of processor elements per edge will now be calculated for the above processor configuration. Based upon the processing discussed herein, sixty incremental processor elements are assumed for rotation and translation of each edge endpoint coordinate or edge endpoint vector. Also, sixty processor elements are assumed for rotation and translation of each face normal vector. Because each surface will have a plurality of edges, which may be an average of four edges per surface; face-related processing may contribute an average of one quarter of sixty processor elements or fifteen processor elements per edge. Also, about twenty processor elements are assumed for processing relating to each object, including trigonometric function generators and range scaling. Because each object may have many surfaces and each surface may have several edges; herein assumed to be fifty edges per object for simplicity of discussion; each object may contribute about an average of one processor element to the number of processor elements per edge. Also, various auxiliary functions such as scaling may be required. Therefore, for simplicity of discussion and for convenience of calculation for this example, it will now be assumed that an average 100 processing elements are needed per edge.

For an illustrative example, processor performance can be estimated from the following parameters. Continuous motion can be achieved with a thirty frame per second update rate. An integrated circuit processor can be configured to operate at a six megahertz processing rate. Based upon the processing per object, surface, and edge including trigonometric function generation, scaling, translation, and rotation; 100 elements per edge is assumed. From these assumptions, a serial computation parallel word incremental processor can process 200,000 elements per frame ($6\times10^6$ elements/sec)/(30 frames/sec)$=2\times10^5$ elements/frame and can update 2,000 edges per frame.

($2\times10^5$ elements/frame)/(100 elements/edge)=2,000 edges/frame

Serial computation parallel word incremental processors can be used in combinations to achieve greater performance. For example, a system requiring 6,000 edges of detail can be implemented with three serial computation parallel word incremental processors.

For the above example, memory sizing will now be discussed. Main memory 671 can be assumed to have a 16-bit R-number field, a 16-bit Y-number field, a 20-bit interconnect field, and a 1-bit flag field for a total of 53-bits per element. Based upon the assumed 100 elements per edge; a number of 5,300 bits per edge is estimated.

(53 bits/element)(100 elements/edge)=5,300 bits/edge

Integrated circuit memories are available with $2^{16}$ (64K) bits per chip relating to an average of about 12-edges per chip.

($64\times10^3$ bits/chip)/(5,300 bits/edge)=12 edges/chip

Therefore, a system having 2,000 edges will need about 167 16K memory chips.

(2,000 edges)/(12 edges/chip)=167 chips.

The serial computation architecture may be adapted to higher production configurations to achieve lower cost; such as by using ROMs for storing fixed information and RAMs (or other alterable memories) for storing variable information. For example, some applications may have a fixed environment to be used with a variable scenario, such as a pilot training system for a particular airport having a fixed airport environment to be used for pilot training at that particular airport. In such a fixed environment application, the environment may be established by the interconnect field in main memory 671 and the variable scenario may be established by the Y-register and R-register fields in main memory 671. The fixed information in the interconnect field may be stored in ROM and the variable information in the Y-register and R-register fields may be stored in alterable memory. This provides the combined flexibility of RAM for variable information and the lower cost and higher reliability of ROM for fixed information.

ROM may be less advantages for lower production applications because of non-recurring costs for ROM masks. RAM may be more advantages for storing fixed information in lower production applications because RAM permits loading of information electrically and therefore eliminates the need for special mask charges and other special requirements. However, in higher production applications, the special considerations such as ROM mask charges may be amortized over a sufficient number of systems and therefore may be acceptable.

In the above discussed combination of RAM and ROM configured main memory, address counter 673 can access both RAM and ROM portions simultaneously. Therefore, the system need not have special architecture to facilitate this RAM and ROM partitioning. In one configuration of a RAM-based main memory, the RAM may be configured with multiple RAM chips and therefore may be considered to be a multiple memory configuration addressed by a single address counter.

Operation of the serial incremental processor may be improved be implementing overlapping operations and lookahead operations. For example, overlapping operations may be performed by simultaneously accessing the parameters of a next element from main memory 671, executing an incremental update on a present element, and storing the incremental solutions from a prior element into increment memory 672. The overlapping nature is implicit in these three simultaneous operations. The lookahead nature is implicit in the outputting of the next element parameters from main memory 671 while processing the present element with element 677 and while storing the incremental results of the prior element into increment memory 672. A three level lookahead operation is also implied, where the incremental solution being stored in increment memory 672 is from a prior incremental operation, the processing being performed with element 677 is from a present element, and the parameters being accessed from main memory 671 are for a next element. This may be characterized as a three tier overlapping and lookahead operation. Some buffer storage of information and redundancy may be required to facilitate this overlapping and lookahead capability. For example, redundant address counters or buffer registers for address information may be desired for simultaneous storing into increment memory 672 of an incremental solution from a prior element and fetching of next element parameters from main memory 671. Alternately, arithmetic logic may be used to convert the main address counter 673 into the different addresses for increment memory 672 and main memory 671, which may be a single increment or multiple increments apart in address because of the single address overlapping and lookahead capability.

Initial condition generation for a serial incremental processor includes the assignment of objects. Supervisory processor 125 can fetch object information from the database; apply initial conditions thereto, such as initial translation, rotation, and scaling; and set up the initial conditions in the main memory of a serial incremental processor. Each object may be set up relatively independent of other objects having its own rotation, translation, and scaling elements. As the scenario evolves, the objects are updated in response to the driving functions, such as rotation and translation driving functions.

After an object has passed out of the observer's field of view and therefore out of the viewport, the object may be deleted from geometric processor 130, such as under control of supervisory processor 125, in order to leave space in geometric processor 130 for introduction of other objects entering the field of view. Such an object is automatically deleted from refresh memory 116 implicit in its passing out of the field-of-view.

The incremental configuration of the geometric processor may be arranged for reassignment of processing resources that are not being fully utilized to other tasks that can better utilize these processing resources. For example, in the absence of observer motion, stationary objects need not be processed for rotation and translation because they will not change. Therefore, in this environment, stationary objects do not require processing resources. Stationary objects may be stored in the main memory of the geometric processor, but the iteration of the serial incremental geometric processor can be controlled to skip the portions of main memory associated with stationary objects unless observer motion is commanded. In another configuration, parameters for stationary objects may be excluded from main memory 671 of geometric processor 130 until observer motion is detected. In still another configuration that precludes observer motion, stationary object parameters may be stored in an auxiliary memory not having incremental processing capability to be available for occulting and edge smoothing determinations for refresh memory 116 but without the capability for incremental geometric updates which do not occur with stationary objects in a stationary observer environment.

The organization of elements in main memory 671 and incremental memory 672 of geometric processor 130 may be provided in a form convenient for system implementation. For example, the incremental elements are interconnected through the interconnect field in main memory 671. The interconnect field can interconnect incremental elements relatively independent of their locations in main memory. Therefore, elements may be grouped in main memory in a convenient form with a minimum of constraints. For example, the elements having edge endpoint coordinate whole number parameters may be grouped at the "top" part of main memory and the elements having sub-computational products and other intermediate processing parameters may be grouped at the "bottom" part of main memory. The grouping may be in a form convenient to supervisory processor operations, such as having ordering and grouping convenient for iterative stored program processing of parameters also being processed with geometric processor 130. Also, incremental elements can be grouped in forms that are convenient for special purpose logic in geometric processor 130, such as for updating refresh memory 116. These groupings may be in sequential form and may be in ascending, descending, or other ordered form. Also, surfaces may be ordered in the form of increasing range to simplify searches for occulting. Edges of the same object may be grouped together or may be grouped in other forms that may be convenient for processing. Alternately, main memory information may be grouped into object-related files; as discussed for hierarchial processing herein.

Coordinate Transformation

A 3D perspective display, such as a CGI display, conventionally includes 3D edges which are transformed into the 3D coordinates of the observer and then are projected onto a 2D display screen. Transformation includes translation of position and rotation of orientation. 3D translation involves relatively simple processing, such as subtraction of coordinates. 3D rotation involves more complex processing to rotate one coordinate system into another coordinate system. Such 3D rotations are well known; such as in the aircraft navigation, guidance, CGI, and control art. Geometric computations for coordinate rotation include the Euler angle rotation and direction cosine rotation. Other coordinate rotations are also well known in the art.

One configuration of a incremental visual transform processor can be implemented in the following manner. A plurality of parallel word serial computation incremental processors can receive 3D coordinate information from a database and can receive observer angle information. Database coordinate parameters can be stored in the main memory of the incremental processor and can be incrementally updated as the observer angular and translational position changes.

Coordinate transformation (rotation and translation) may be performed in various ways. Well known coordinate rotation methods are Euler, direction cosines, and matrix coordinate rotations. Coordinate transformation involves rotating and translating one coordinate system into a second coordinate system. Visual objects may be defined with surfaces and surfaces may be defined with edge endpoint coordinates and face normal vector coordinates. Rotating of an object coordinate system into an observer's coordinate system and translating of an object coordinate system into an observer's coordinate system provides the proper relative orientation and position of the object in the scene relative to the observer. Transformation processing arrangements will now be discussed.

A vector in a prior coordinate system Xp, Yp, Zp can be transformed into a new coordinate system Xn, Yn, Zn. Components of vectors in prior coordinate systems may be projected onto the rectilinear axes of the new coordinate system by resolving through angles of rotation θ, Ø, and Ψ and by translating through positions; as discussed herein.

Coordinate rotation and translation can be implemented with whole number and with incremental processing arrangements. Incremental processing arrangements are discussed with reference to FIG. 5 herein.

Incremental coordinate rotations will now be discussed with reference to FIGS. 5L–5R and with reference to equations (1) thru (3).

Each of next vector components Xn, Yn, Zn may be derived by taking the components of each of the prior vector components Xp, Yp, Zp and resolving them through the trigonometric functions (sine and cosine functions) of each of the three angles θ, Ø, and Ψ. Therefore, rotation of a 3D vector from one coordinate system to another coordinate system can be implemented with three equations for Xn, Yn, Zn; each equation composed of the sum of a plurality of product terms $Xp[f(\theta,Ø,\Psi)]$ $Yp[f(\theta,Ø,\Psi)]$ $Zp[f(\theta,Ø,\Psi)]$ Therefore, each of the three equations represents a plurality of sums of a plurality of products; herein assumed to be sums of three product terms for ease of illustration;

$$Xn=Xp[f1(\theta,Ø,\Psi)]+Yp[f4(\theta,Ø,\Psi)]+Zp[f7(\theta,Ø,\Psi)] \quad eq(1)$$

$$Yn=Xp[f2(\theta,Ø,\Psi)]+Yp[f5(\theta,Ø,\Psi)]+Zp[f8(\theta,Ø,\Psi)] \quad eq(2)$$

$$Zn=Xp[f3(\theta,Ø,\Psi)]+Yp[f6(\theta,Ø,\Psi)]+Zp[f9(\theta,Ø,\Psi)] \quad eq(3)$$

One incremental implementation of equations (1) thru (3) will now be discussed. An incremental sin and cos generator may be implemented, as discussed for angle θ with reference to FIG. 5L herein. Sin and cos generators may be implemented for other angles, such as Ø and Ψ, similar to the arrangement discussed for angle θ in FIG. 5L. The whole number trigonometric functions, sin and cos of the angle, are available in the Y-registers of the two incremental elements (FIG. 5L). The incremental trigonometric functions d(sinθ) and d(cosθ) are available as the dz incremental outputs from the two elements (FIG. 5L).

Figure 50:
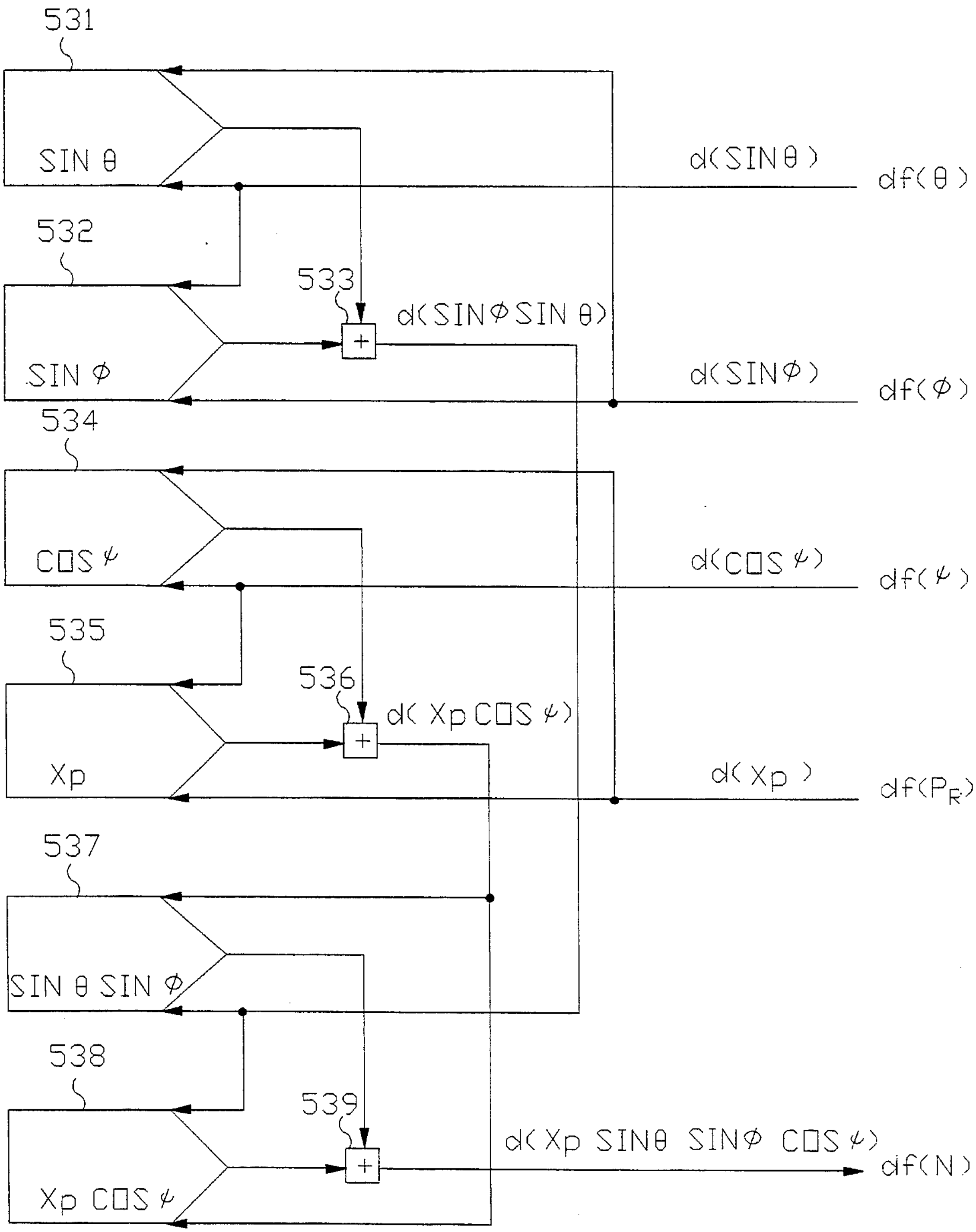
FIG. 50 is a block diagram of a quad incremental generator for vector transformation.

Angular rotations can be represented as the sum of the products of trigonometric components of the rotated vectors. In accordance with one feature of the present invention, incremental angular rotation may be provided to achieve reduced cost and enhanced performance. The incremental arrangement discussed with reference to FIG. 5 may be used to perform the processing. For example, the incremental multiplier discussed with reference to FIG. 5K can perform incremental sum of the products processing. Incremental trigonometric generators, such as discussed with reference to FIG. 5L, may be used to provide the incremental and whole number trigonometric functions of the angles. The trigonometric generators may be controlled from incremental angular change signals for providing the incremental and whole number trigonometric processing, as discussed herein with reference to FIG. 5N. The trigonometric processing of vectors may be performed with a quad incremental multiplier (QIM) to provide quad product terms for angular rotation, as discussed herein with reference to FIG. 5O. The quad incremental multipliers may be combined into a component rotation (CR) processor to provide a sum of the products term representing a single dimensional rotated vector, as will be described with reference to FIG. 5P hereinafter. The quad incremental multiplier and component rotation processors, discussed with reference to FIGS. 50 and 5P, may be combined to provide 3D vector rotation (VR), as discussed with reference to FIGS. 5Q and 5R herein.

A trigonometric generator for calculating trigonometric functions of rotational angles is shown in FIG. 5N. The trigonometric angular functions generated with the processor shown in FIG. 5N may be processed with incremental multipliers shown in FIG. 5K in the configuration shown in FIG. 5O to generate incremental vector products incremental products can be combined using the processor shown in FIG. 5P to generate 3D vector rotations using the processors shown in FIGS. 5Q–5R. These processors will be discussed in greater detail hereinafter.

Angular rotation may be provided as a result of observer motion and as a result of object rotation. The processing arrangements shown in FIGS. 5N–5S may be repeated for many different objects. However, many of such processing arrangements may be shared between a plurality of objects. For a stationary observer, observer rotation need not be performed. For a stationary object, object rotation need not be performed. Implementation of the general case having both, observer motion and object rotation, will now be described.

Observer controls 110 (FIG. 1A) may be implemented with well known controls; such as a joy stick, track ball, direction switch, or with an eye movement detector. Observer signals may be directly generated in incremental form or may be converted to incremental form. Analog signals may be converted to incremental from by detecting changes, such as with differential amplifiers. Digital numbers may be converted to incremental form by detecting changes, such as with arithmetic subtractors. Other incremental converters may also be used. Also, observer motion may be simulated, such as by a computer directly generating observer angles. Angles may be generated in three dimensions; θ, Ø, Ψ. The subscript OBS designates an observer-related parameter. The subscript OBJ designates an object-related parameter.

Object controls 529A and 529B may be implemented with well known controls. For simplicity of discussion herein, object controls will be assumed to be a host computer. In this example, object-related angles are generated by a host computer, defining object rotation and orientation.

As shown in FIG. 5N; the incremental angular changes for observer 528A and object 529A are summed with adders 522A to 524A for incremental changes in θ, Ø, Ψ respectively. The sum incremental angle from each of adders 522A to 524A are input to sin-cos generators 525A to 527A, each of which may be implemented as discussed with reference to FIG. 5L herein. In this configuration, processor 525A generates trigonometric functions of θ, processor 526A generates trigonometric functions of Ø, and processor 527A generates trigonometric functions of Ψ. These trigonometric functions may be processed with the incremental multiplier shown in FIG. 5O and the various coordinate transform processors shown in FIGS. 5P to 5R in certain configurations, whole number angular position may be desired, which may be obtained from the Y-registers of the processing elements.

The trigonometric function generators shown in FIG. 5N may used to rotate all coordinates of an object having the same object angular motion generated with input arrangement 529A. If several objects have the same angular motion, as generated with input arrangement 529A, they can all use the same trigonometric function generators 525A to 527A (FIG. 5N). If different objects have different angular motion, as generated with input arrangement 529A, they would use different trigonometric function generators 525A to 527A (FIG. 5N). Observer angular motion generated with arrangement 528A may be common to the complete scene and therefore may be common to all objects. If an object is stationary, it may not require object angular motion arrangement 529A. In this case, a trigonometric function generator such as shown in FIG. 5N may be used, excluding object motion input arrangement 529A and associated adders 522A to 524A. All of such stationary objects may share trigonometric function generators for only observer motion 528A, where such a stationary object does not add object motion components.

One configuration of a quad incremental multiplier (QIM) 530 is shown in FIG. 5O. This multiplier performs a quadruple incremental product of the three sin and cos functions of θ, Ø, and Ψand the vector component d(PR) to generate the incremental product df(N). Operation will be described with f(Ø) being sin Ø, f(θ) being sin θ, f(Ψ) being cos Ψ, and df(PR) being d(Xp) as shown in FIG. 5O. Elements 531 and 532 and adder 533 implement a first incremental multiplier for generating the incremental sinθ and cosØ parameters; elements 534 and 535 and adder 536 implement a second incremental multiplier for generating the incremental XP and cos Ψparameters; and elements 537 and 538 and adder 539 implement a third incremental multiplier for generating the incremental product df(N) of the two incremental sub-products d(sinθ sinØ) and d(Xp cos Ψ). Alternate incremental multiplication arrangements may also be provided.

As shown in FIG. 5P; three QIM arrangements 550 to 552 and incremental adder 553 may be combined in a single component rotation (CR) processing element 554 to process one of equations (1) thru (3) and all three of equations (1) thru (3) may be implemented with three component rotation (CR) processors 554 to 556 (FIG. 5Q) in vector rotation (VR) processor 557 for processing three vector components. The three QIM components of one of the vector components are incrementally generated and incrementally added together with incremental adder 553 to generate a single rotated vector component (FIG. 5P). Three of these vector components are generated in the three component rotation processors 554 to 556 (FIG. 5Q) to generate the three components set forth in equations (1) thru (3). These three vector components (FIG. 5Q) constitute rotation of a single vector, such as an edge vector or a face normal vector. Many vectors for the same object and possibly for different objects may share the same trigonometric function generators (FIG. 5N); such as discussed with reference to the hierarchial processing (FIGS. 5A to 5H). However, different objects that rotate independent of each other may require different trigonometric functions generators (FIG. 5N).

The processor shown in FIG. 5R is a more detailed illustration of the vector rotation (VR) processor shown in FIG. 5Q. Each of three component rotation (CR) processors are shown in FIG. 5R, including the three QIM processors contained therein. The nine QIM processors for the three CR processors are also shown partitioned in FIG. 5R, consistent with the arrangement shown in FIGS. 5P and 5Q.

A well known matrix transformation will now be discussed as illustrative of various forms of geometric processing including other matrix transforms, direction cosines, Euler angles, and others. Also, these illustrative matrix transforms will be shown implemented in incremental processor form to illustrate methods of implementing various geometric processing techniques in incremental form.

A matrix transform may be implemented as shown in the Geometric Transform Table (FIGS. 5C and 5H), comprising a vector matrix and a coefficient matrix for transforming the vector from the prior vector position to the next vector position, indicated by subscripts P and N respectively. The coefficient matrix may be formed by the concatination of a plurality of matricies for performing different geometric operations; such as rotation, translation, scaling, and perspective matricies. The rotation matricies can be composed of three different matricies for rotation about the three coordinate axis; θ, Ø, and Ψ. Representative forms of the three rotation matricies, the translation matrix, the scaling matrix, and the perspective matrix are shown in the Geometric Transformation Table. Combining of these matricies can be performed by matrix multiplication, progressively combining matricies to obtain a final concatinated coefficient matrix, as shown in the Geometric Transformation Table. The matrix equation can then be expanded into trigonometric equations for implementation in incremental form, as shown in the Geometric Transformation Table. For simplicity of illustration, expansion of the matrix equation into the three geometric equations for Xn, Yn, and Zn is shown for rotation and translation but not shown for scaling or perspective. This expansion has been simplified for the purposes of demonstrating the conversion of matrix equations to trigonometric equations and the implementation of the trigonometric equations in incremental form. One skilled in the art can readily modify other matrix equations and can expand matrix equations to trigonometric equations from the teachings herein.

The trigonometric equations for rotation and translation shown in the Geometric Transformation Table can be implemented in incremental form using the techniques discussed with reference to FIGS. 5I to 5T above yielding incremental processor configurations of the form shown in FIGS. 5U to 5W. As can be seen from a comparison between the three trigonometric equations in the Geometric Transformation Table and the incremental processor configuration in FIGS. 5U to 5W, there is a direct correspondence between the terms in the trigonometric equations and the terms in the incremental implementation. Therefore, one skilled in the art can readily provide an incremental configuration for various different configurations of trigonometric equations from the teachings herein.

Visibility Processing

Opaque surfaces on objects can obscure other objects, as discussed for occulting herein, and can also obscure other surfaces on the same object located therebehind, as discussed hereinafter.

Obscuring of other surfaces of the same object is performed by face visibility processing. A face normal vector can be defined for each surface. If the face normal vector is greater than zero degrees, the horizontal direction; then the face is visible because it is pointing towards the observer. If the face normal vector is less than zero degrees, then the face is non-visible because it is pointing away from the observer. Non-visible surfaces with face normal vector angles less than zero degrees need not be portrayed on the display and need not be fill processed; such as with edge, smoothing, and occulting processing.

Face visibility determination is made by examination 6f the face normal angle. This angle may be derived with the vector processing described with reference to FIG. 5. The face normal vector may be transformed with an arrangement such as shown in FIGS. 5I to 5T to obtain the translated and rotated vector coordinates. Then, the angle may be determined, such as with an arc-cos or arc-tan computation. One form of arc-cos processing using an incremental configuration is shown in FIG. 5T having sin-cos generator 590 and 591 driven by incremental servo 592 generating incremental angle $d\theta$ which is accumulated with element 593 to generate a whole number angle $\theta$. Elements 594 and 595 generate components of the servoed solution for generation of the angle $d\theta$. The servo; comprising elements 592, 594, and 595; solves the equation $\cos\theta$ equals (J-K)($\cos\theta$); where J and K are known and are used as incremental inputs dJ to elements 592 and 595 and dK to element 594. This equation is solved for angle $\theta$, which is the arc-cos of J/K. Face normal examination may be made by examining the sign of the angle $\theta$ in element 593. A positive angle $\theta$ is indicative of a visible face and a negative angle $\theta$ is indicative of a non-visible face.

Alternately, visibility processing can be implemented by incrementally updating the visibility angles as the object is incrementally rotated. For example, as an object is incrementally rotated; incremental object rotation angles $d\theta$, dØ, dΨ are available to update the viewport angles for visibility determination. Therefore, the viewport angles can be incremented and decremented, or otherwise incrementally updated, in response to the incremental object rotating angles. Visibility can be determined by checking the sign of the viewport angles, as discussed above.

Subsequent fill processing; such as occulting and edge smoothing, can be performed dependent upon the visibility of a surface. Prior to performing such fill processing, the angle $\theta$ can be examined to determine whether this subsequent processing is necessary for a visible edge (positive angle $\theta$) or whether this subsequent processing is unnecessary for a non-visible edge (negative angle $\theta$).

Projection Processing

Information in the real time processor may be 3D information. However, the display medium may be a 2D processor display medium. Therefore, the 3D information in the real time processor is converted to 2D information. It may be considered that the refresh memory needed to refresh a 2D medium is a 2D refresh memory. However, 3D effects are provided therein; such as occulting, range variable scaling, range bytes for pixels, 3D rotations and translations, and other 3D effects. Nevertheless, in one configuration, 2D pixels may be provided. This is achieved by projecting the 3D information from the real time processor onto the 2D plane of the refresh memory. This projection can be accomplished by entering information into refresh memory and updating changes in refresh memory as motion propagates in the X-dimension and Y-dimension. Alternately, perspective processing, such as in the geometric processor, can provide such projections.

Motion that propagates in the Z-dimension can be configured as range-related effects, such as range variable size and changes in the object range byte. However, in a 2D refresh memory configuration, Z-direction motion is not explicitly represented in the form of a third dimension of pixel words. Therefore, the entering of the X and Y motion information into the refresh memory may be considered to be a projection of 3D visual information into a 2D refresh memory. This is not to indicate that a 2D refresh memory and a 2D monitor do not contain 3D information. A 2D refresh memory and a 2D monitor can have a 3D perspective; implicit in occulting, range variable scaling, range variable intensity, pixel word range byte, and other such range-related information. However, this discussion is intended to indicate the difference between a system having a 2D refresh memory with a 2D medium and a system having a 3D refresh memory with a 3D medium. Such a 3D refresh memory may have a third dimension of pixel words at different ranges. Such a 3D medium may be implemented in holographic form, as discussed in the referenced patent applications, or with an oscillating mirror arrangement, or in other forms. A 3D medium is discussed in the section entitled Three Dimensional Display Medium herein.

Higher Order Edges

For convenience of discussion, edges have been described herein as linear edges. However, edges may be implemented as non-linear edges; such as circular arcs, parabolic segments, hyperbolic segments, elliptical segments, second order curves, third order curves, and higher order curves. Many of these curves are discussed in the referenced patent applications in the context of contour generation, such as in the context of fairing contour and curve fitting. Also, these contours are discussed therein in the context of incremental processing and the display thereof on a CRT medium. These discussions have pertinence hereto. An edge may be defined in the form of a higher order (non-linear) contour and may have various parameters related thereto to characterize the shape of the contour. For example, just as a single slope parameter characterizes a first order (linear) contour, two parameters may be used to characterize a second order contour, such as a circle or a parabola; three parameters may be used to characterize a third order contour, such as a cubic exponential contour; and other quantities of parameters may be used to characterize other higher order contours.

Generation of higher order curves for identifying edge pixels along a higher order contour can be performed with an incremental edge processor. Also, higher order edge contours may be rotated, translated, and scaled in the geometric processor based upon processing of the characterizing parameters for each edge contour. For example, just as the edge endpoint coordinates of a linear edge are rotated, translated, and scaled in the geometric processor; similarly, edge endpoint coordinates and edge characterizing parameters (such as edge centerpoint coordinates of a circular contour and coefficients of a cubic contour) may be translated, rotated, and scaled to implement the visual scenario.

The above discussed fairing contour and higher order contours may be implemented in 3D with 3D coordinates and contour characterizing parameters in accordance with the 3D environment discussed therein.

Use of higher order contours may reduce the amount of storage and processing required. This is because higher order contours synthesized with linear edges may require a large number of linear edges to achieve the desired precision in synthesizing a higher order contour. However, higher order contours may be used to fit a higher order edge with fewer edge segments than with linear contours. For example, a single circular contour may be used to form an edge for a circular aircraft fuselage cross section. However, many short linear edges may be required to synthesize a circular aircraft fuselage edge to a reasonable degree of precision. Therefore, even though a single higher order contour may require more storage and more processing than a single linear contour, a single higher order contour may replace many linear contours and therefore may provide a significant reduction in storage and processing requirements.

Incremental Initial Conditions

The microprocessor accesses database information, formats the accessed database information as necessary, applies initial conditions to the database information, and introduces this database information into the main memory of the real time processor for processing. In one embodiment, database information is grouped into object files, where each file pertains to a different object such as a vehicle, a building, or a tree.

The serial computation incremental processor is "programmed" based upon the interconnections stored in the interconnect field and the initial conditions for the Y-register and R-register fields of the main memory. In one visual system configuration, object information is accessed from the database, initialized such as with rotation and translation processing, and then stored in main memory. In one embodiment, object information in the database may be a plurality of vector end points defining surfaces of an object directed from the origin of the object. In another embodiment, object information may be stored in the database for each object in main memory format. In yet another embodiment, the interconnect field may be stored in the database. In still another embodiment, object vector end point information may be stored in the database in other than the main memory format, where object information may be formatted by the microprocessor when initializing a new object for insertion into main memory.

One embodiment of initializing the real time processor from database memory will now be discussed. Database information may be stored indifferent files, where each file may pertain to different objects such as a vehicle, a building, and a tree. Each object may have its own local coordinate system and may be defined by the vector end point coordinates referenced to the origin of the local object coordinate system. Each object may be defined with surface edge end point coordinates and face normal vector coordinates. Incremental processor computations may be performed by translating and rotating the local object coordinate system based upon translation and rotation driving functions, such as determined from observer commands or host system commands. Initially, each object may be translated into the proper postion in the environment and rotated into the proper orientation and having the proper range variable size. These conditions are initial conditions imposed upon the object, implicit in the Y-register field and R-register field numbers when the object is initialized and placed into the incremental processor main memory. The object is translated, rotated, and otherwise modified from these initial conditions by driving functions which operate through the interconnect field to update the translation, rotation, and other conditions of the object.

The interconnect field may be object oriented, where the edge endpoint coordinates and other information for each object are connected to the driving functions for that object, such as a sin/cos incremental angle generators, to vary the conditions of that object as the scenario progresses. Therefore, the Y-register field and R-register fields may be considered as defining the conditions of the object in the environment, the interconnect field may be considered as defining the characteristics of the object itself, and the object may be relatively isolated from other objects in incremental processor main memory. In this manner, objects may be initialized and introduced into main memory as they move into the observer's field-of-view and may be removed from main memory as they progress out of the observer's field-of-view.

The R-register and Y-register fields represent information on object parameters in the object coordinate system modified by the object being translated, rotated, and otherwise adapted to the observer's coordinate system. Therefore, initial conditions associated with the object coordinate system such as end point coordinates in the object coordinate system may be stored in the database. However, the object may then be positioned at a single location in the environment or at multiple locations in the environment. Therefore, the Y-register and R-register field database information may be modified to place the object in the observer's coordinate system as the object coordinate system is positioned into the observer's coordinate system.

One form of organization information into database memory is to provide separate database object files for different objects. Each object file may be a complete representation of a particular object and may include the incremental processor main memory information for that object. For example, the database information may include the X-register, R-register, interconnect, and flag fields for each of a plurality of elements characterizing that object. This information can include object endpoint coordinates, face normal vector coordinates, triple angle ($\theta$,Ø,$\Psi$) sin/cos generators, and scaling elements and other elements required for incremental processing An object file may be pre-programmed in local object coordinates relative to the local origin of the object. Each object may be placed in a single position or in multiple positions in the environment. For example, a single tree object in the database can be located at a plurality of positions in the environment, having a different rotational orientation and size scaling for each position such as for providing a forest of trees having different positions, orientations, sizes and occultation therebetween derived from a single tree object in the database. Each object file may be initialized such as by translating and rotating the object coordinate system to a position and orientation in the observer's coordinate system and placing the initialized object file into the incremental processor main memory for scenario-related processing as a function of the scenario driving functions. Once in the main memory, the driving functions will cause the object to be updated as the scenario progresses for position, orientation, range variable size, range variable intensity, and occultation.

Initial conditions may also be provided for refresh memory information when introducing a new object. Use of the refresh memory non-visible frame configuration permits new objects to be introduced through the non-visible frame and then to be progressively moved into the environment by the incremental processor under control of driving functions.

Initial condition generation for an object will now be discussed. An object available from the database in object coordinates and in main memory format can initially be directly loaded into the incremental processor main memory. An initial condition driving function can be provided in the main memory for driving the object conditions from database object oriented coordinates to display environment observer oriented coordinates. This may be achieved by incrementally driving the origin of the object coordinate system to the location and orientation defined for it in the environment, by incrementally driving the size to a desired amount such as with a range variable size driving function, and then by normalizing the range to the object's range in the environment. This initial condition generation function can be initiated in anticipation of the object being introduced into the environment but prior to the object being introduced into the environment.

Once the object has been initialized in main memory, scenario driving functions can move it into the refresh memory non-visible frame and eventually into the refresh memory visible portion. The non-visible frame provides a method for introducing an object into refresh memory before it is visible to the observer for resolution of discontinuities and ambiguities in the non-visible frame portion before it becomes visible. Moving an object into the non-visible frame may be implemented with simple occulting processing of a moving object filling a pixel, which is simple processing. Moving an object out of the environment through the non-visible frame involves occulting processing of vacating a pixel, which may be omitted in the frame because of the non-visibility thereof, but which may be performed therein to facilitate an object moving back into the visible refresh memory after having passed into the non-visible frame such as caused by a change in direction of motion.

Therefore, objects may be stored in normalized form in the database and may be readily introduced into the incremental processor and the refresh memory without extensive initial condition computations, such as using the inherent processing capabilities of the real time processor and the inherent occultation and other capabilities of the refresh memory.

The storage of objects in the database in the format of the incremental processor main memory significantly simplifies initial-condition generation during real time operation. However, this format must then be generated for the database. Also, sub-computational initial conditions such as sub-computational products, R-register remainders, and others may also be stored in the database as part of the main memory format to simplify initial condition generation and to minimize initial condition transients and perturbations. Database object generation having such capabilities can be generated with an incremental processor implemented in hardware, simulated in software, or configured by a programmer. Initial condition generation can be readily provided for any configuration, such as R-register parameters associated with a particular object configuration as initial conditions relative to the object coordinate point. A database object generator may be implemented in software such as processing with a host computer or with the microprocessor. A database object generator may take database information from the host computer's database, such as in a CAD/CAM system or from other well known databases and sources of object information. It may then develop the initial conditions for the object including Y-register, R-register, interconnect, and flag field initial conditions to characterize the object in the main memory format of the serial computation incremental processor. The microprocessor may access the database of a host CAD/CAM system to obtain object information in CAD/CAM database format, assemble the CAD/CAM database information into the main memory format information, and then store this assembled information in the visual system database for subsequent display to an observer.

Once visual information is stored in the database in main memory format, initial condition generation for the real time processor and refresh memory is relatively simple. Such initial condition generation can be controlled by the microprocessor for introduction into the real time processor and refresh memory. In the architecture discussed herein, the real time processor and refresh memory processes with the visual processing with only a small amount of supervisory control by the microprocessor. Therefore, only a small amount of microprocessor computational resources may be required for such processing.

Some of the initial condition processing performed by the microprocessor may include establishing priorities of objects for real time processor resources, initializing the initial condition driving function generator to drive an object to its initial conditions in the environment, initializing the introduction of the object into the non-visible frame of the refresh memory from the real time processor information, and removing of an object from the real time processor after it has passed out of the observer's field-of-view.

Initial condition generation will now be discussed with reference to FIG. 1A. Operation begins with power turnon. Host computer 102 may perform initialization functions such as assembly and outputting of visual information. Visual information may include object files, environment information, and driving functions. Each object file may include lists of vectors defining the objects. Vectors may be characterized with endpoint coordinates of that vector. Startpoint coordinates may be implicit as the endpoint coordinates of the, previous vector connected thereto. Vectors may be grouped into surfaces having surface information such as a surface mormal vector and other pertinent surface related information.

Environment information may include selection of objects for placement in the environment having particular environmental conditions. For example, a forest comprising a plurality of tree objects may be formed by selecting a single tree object file and designating that tree object file to be placed at each of a plurality of locations and being scaled to different sizes and being rotated to different orientations and being assigned different colors. Similarly, a truck convoy or group of trucks traversing roads and comprising a plurality of truck objects may be formed by selecting a single truck object file and designating that truck object file to be placed at each of a plurality of locations and being scaled to different sizes and being rotated to different orientations and being assigned different colors. The placement of objects in the environment need not be limited to the visible portion of the environment, but can include non-visible portions outside of the observer's field-of-view; which may eventually be within the observer's field-of-view as a result of observer panning and zooming and object motion.

Driving functions may be provided, including designation of motion of each object in the environment. Driving functions may be in the form of velocity and acceleration profiles, position as a function of time, tables of incremental changes in position, or other, Driving functions cause designated objects within the environment to change position (both translational and rotational) in the environment.

The memory map for the main memory for a particular edge, surface, and object may be in the same format as other edges, surfaces, and objects. Therefore, the interconnect field and flag field may be predefined in a fixed format relative to a base or index address. The base or index address may designate the start address for that particular object. Interconnect field addresses may be relative to this base address. The differences in objects (other than the Y-register and R-register parameters) may be primarily in the number of edges per surface and the number of surfaces per object.

However, the microprocessor assembler program can readily adapt these, such as by deletion of unused edge and surface-related words in main memory for objects not requiring the standard number or maximum number of edges and surfaces. Consequently, the R-register field and Y-register field information may be readily derived from the object files in database memory and the interconnect and flag fields may be fixed format information relative to a base address or index that may be readily adapted to the particular object interconnect and flag field information.

The supervisory processor can generate initial condition driving functions and standard driving functions. Initial condition driving functions can drive objects that have been loaded initially into the geometric processor main memory from the initial conditions to their environmental conditions. Standard driving functions change the environmental conditions for the objects. Generation of initial condition driving functions may include whole number to incremental generators to convert whole number initial conditions of position, orientation, and scaling into incremental form to drive an incremental processor to position, orient, and scale the initial object conditions to the initial environmental conditions. A whole number to incremental generator may include an incremental countdown circuit to increment the whole number down to zero such as with an incremental clock signal being the incremental driving function. The operation may then be terminated when the whole number is incremented down to zero. As the initial environmental conditions are being generated by the initial condition driving functions, the increment memory and refresh memory may be incrementally updated. For example, a truck object starting with object initial conditions may be incrementally "driven" into the visible environment with the environmental initial conditions converted to incremental driving functions. As the truck object is incrementally "driven" into the environment, the incremental processor is updated to reflect the conditions for that truck object as it changes position, orientation, and scale and the refresh memory is updated as the truck object is "driven" into the refresh memory such as with smoothing and occulting processing. Therefore, the incremental smoothing and occulting processing will be generated as the truck object is "driven" into its proper environmental conditions in refresh memory.

If a plurality of superimposed objects starting at an initial object coordinate point are simultaneously "driven" into the refresh memory in superimposed form, the incremental occulting and smoothing processing may have more involved occulting and smoothing operations. Therefore, it may be desireable that objects be "driven" into the refresh memory in a non-superimposed form. This may be achieved by "driving" the objects into the refresh memory in sequence one following the other. Alternately, the objects may be initialized so that they are "driven" into the refresh memory from different directions. Offsetting of the objects in translational position to different sides of the refresh memory can be readily accomplished with simple addition and subtraction of coordinate information. Offsetting of object initial conditions may be compensated for by offsetting of the environmental initial conditions so that offset objects are driven from an offset position to proper environmental initial conditions.

Alternately, initial condition generation can be provided in whole number form. For example, the microprocessor may calculate the whole number initial conditions for the R-register and Y-register for each element-as an alternate to the above described incremental generation of these R-register and Y-register parameters by "driving" objects into the environment. Also, the microprocessor may calculate the occulting and smoothing conditions for each pixel and may initialize the refresh memory in accordance therewith. However, the incremental initial condition generation discussed herein is a method for automatically generating the initial conditions for the incremental processor and for the refresh memory consistent with the manner in which these conditions are updated in normal operation.

Edge Processor (FIGS. 7–8)

Introduction

Edge processor 131 can be used to process edge information for updating refresh memory 116 (FIG. 1A). In one configuration, edge processor 131 generates addresses of pixels along an edge by processing edge endpoint pixel coordinates. Edge processor 131 may be an incremental processor for incrementally interpolating inbetween an edge startpoint and an edge endpoint to generate addresses of the edge pixels therebetween. The edge pixel addresses may be used for updating refresh memory 116. Edges may be processed in pairs. A prior-edge and a next-edge can be generated, representing a prior-edge position already displayed and a next-edge position to be displayed. For example, prior-edge pixels may have an edge erased therefrom; next-edge pixels may have an edge written thereto; and the pixel therebetween may be updated, such as for filling or vacating occulting processing.

Figure 7A:
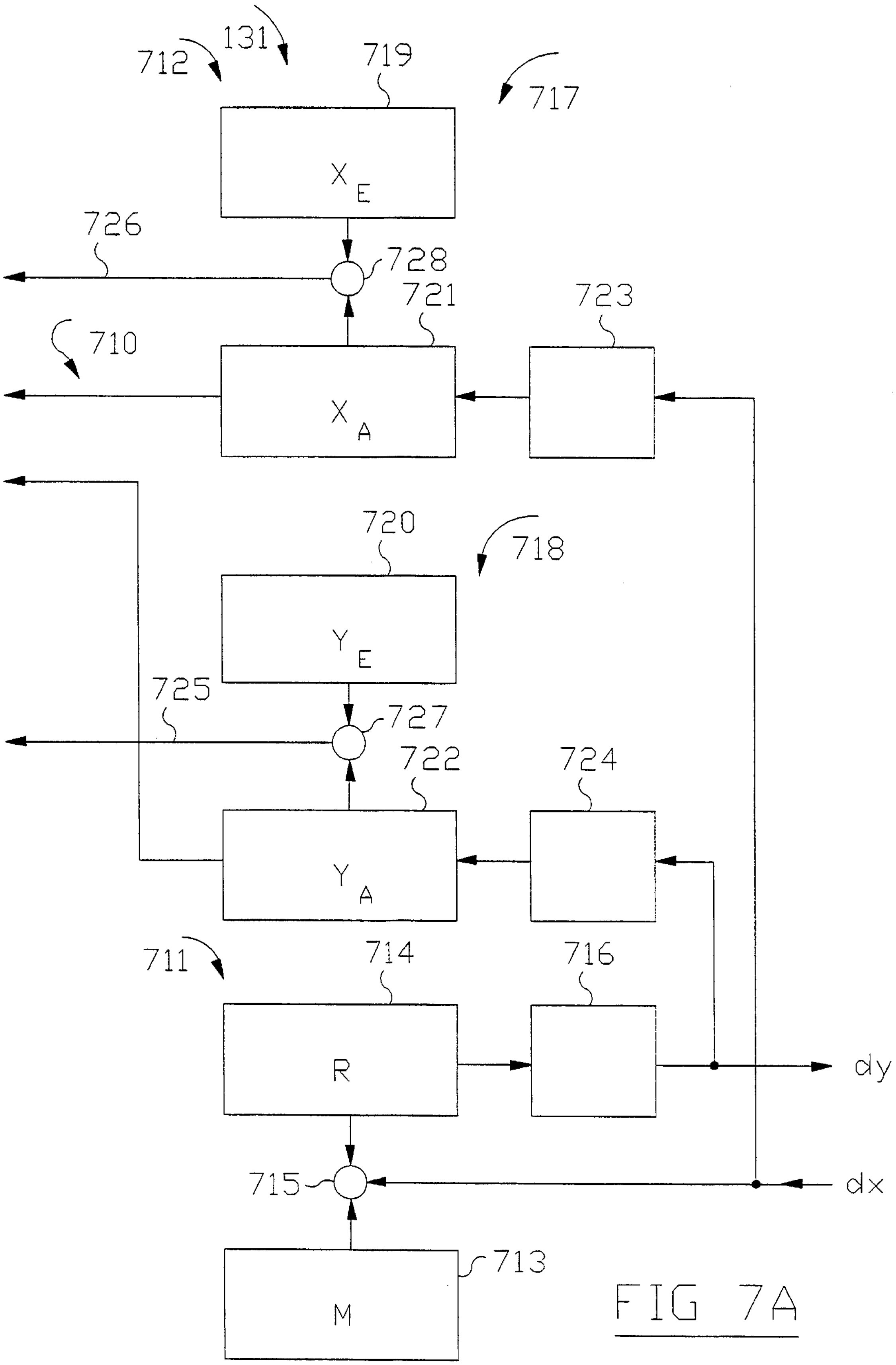
FIGS. 7A, 7B, 7C, 7D, 7E, 7F and 7G, illustrates edge processor operation; where

Edge Processor Configuration (FIG. 7A)

Edge processors may be implemented in various forms. A specific form will now be discussed with reference to FIG. 7A to illustrate operation of one edge processor configuration.

Edge processor 131 may be incremented with a pixel clock in one dimension for generating incremental pixel steps in the other dimension, established by the slope of the edge. Edge processor 131 can be initialized so that the slope is less than unity and so that the pixel clock is along the longest rectilinear (X or Y) component of the edge. When the pixel clock increments from pixel-to-pixel (or subpixel-to-subpixel) in the selected rectilinear dimension (X or Y), each edge pixel word can be examined and updated. The incremental changes in the two rectilinear directions (X and Y) are accumulated in X and Y dimension registers to provide a whole number coordinate position to identify each pixel for an edge. When the accumulated edge position reaches the edge endpoint coordinates, the edge has been completely updated and the edge processor is re-initialized for updating the next edge.

Edge processor 131 comprises incremental element 711 and edge endpoint detector 712. Incremental element 711 is composed of slope M-register 713, remainder R-register 714, dx logic 715, and dy logic 716. Slope number M in M-register 713 is incrementally multiplied by the dx incremental signal by adding the M-number in M-register 713 to the R-number in R-register 714 using addition logic 715 controlled by the dx increment and detecting an overflow from R-register 714 with overflow logic 716 to generate the dy incremental output. Incremental element 711 can operate similar to incremental elements, such as well known digital differential analyzer elements.

Endpoint detector 712 is composed of X-endpoint detector 717 and Y-endpoint detector 718. Endpoint coordinates $X_E$ and $Y_E$ are loaded into endpoint coordinate registers 719 and 720 respectively. Edge increments dx and dy are added to the actual edge position coordinates $X_A$ and $Y_A$ respectively stored in the $X_A$ register 721 and the $Y_A$ register 722 respectively with the dx incremental adder 723 and the dy incremental adder 724 respectively. The actual X-number and Y-number stored in registers 721 and 722 respectively are compared with endpoint numbers $X_E$ and $Y_E$ respectively stored in registers 719 and 720 respectively using the X-subtractor network 728 and the Y subtractor network 727 respectively to subtract the actual coordinates $X_A$ and $Y_A$ respectively from the endpoint coordinates $X_E$ and $Y_E$ respectively to determine when actual coordinates $X_A$ and $Y_A$ respectively have reached endpoint coordinates $X_E$ and $Y_E$. When the $Y_A$ number in $Y_A$-register 722 is equal to the $Y_E$ number in register 720, Y-completion signal 725 is generated indicative of edge processor 131 reaching the Y coordinate endpoint. Similarly, when the $X_A$ number in $X_A$-register 721 is equal to the $X_E$-number in register 719, X-completion signal 726 is generated indicative of edge processor 700 reaching the X-coordinate endpoint. When coincident signals 725 and 726 have been generated, edge processor 131 has completed processing of that edge, indicative of availability of edge processor 131 for processing of other edges.

Edge pixel information for edge smoothing may he obtained from information generated with edge processor 151. For example, quadrant boundary intersections can be determined with the dx and dy incremental signals and quadrant transitions can be determined with the actual X number $X_A$ and the actual Y number $Y_A$ stored in $X_A$ register 721 and $Y_A$ register 722 respectively. Incremental signals dx and dy may be stored in flip-flops for edge smoothing determination. Actual edge positions $X_A$ and $Y_A$ are already stored in registers 721 and 722 respectively and therefore are readily available for edge smoothing determinations.

Initial condition determination for an edge will now be discussed. Edge slope M is determined by dividing the X and Y components of the edge. This may be performed incrementally for each edge in the environmental processor in the real time processor. This slope processing is included in the previously estimated 100 elements per edge. Initial conditions for the $X_A$ and $Y_A$ numbers in registers 721 and 722 respectively are the startpoint coordinates for a particular edge, which may correspond to the endpoint coordinates of a prior edge terminating thereon. The edge endpoint coordinates $X_E$ and $Y_E$ can be generated with the real time processor and may be available therefrom as initial conditions for edge processor 131. The $X_A$ and $Y_A$ numbers stored in registers 721 and 722 are updated as the edge processor progresses along the edge from the startpoint coordinates $X_A$ and $Y_A$ loaded as initial conditions and progressing towards the endpoint coordinates $X_E$ and $Y_E$ stored in registers 719 and 720 also loaded as initial conditions.

Occulting processing will now be discussed with reference to edge processor 131 shown in FIG. 1A. When edge processor 131 addresses a pixel, identified by pixel coordinates $X_A$ and $Y_A$ in registers 721 and 722 respectively; then occulting processing for that pixel can be performed with occulting processor 132. For example, occulting processing may include a logical determination of whether the edge has filled a pixel or has vacated a pixel. When filling a pixel, the range byte in that pixel is compared with the range associated with the moving edge, where the pixel word for the proper one of the two occulting objects is loaded into that pixel. When vacating a pixel, the adjacent surface is examined and, if appropriate, the pixel word for that adjacent surface is loaded into the vacated pixel. If the moving edge does not completely fill or vacate the pixel, the above discussed fill operation will be implemented as an edge smoothing fill operation. Occulting processing is discussed in greater detail herein in the section related thereto.

Edge processor 131 may be loaded with initial conditions, such as from supervisory processor 125. Various interfacing arrangements may be provided therebetween. One interfacing arrangement has been discussed with reference to FIG. 3 herein and other interfacing arrangements are discussed elsewhere herein. In accordance with the arrangement shown in FIG. 3 registers of edge processor 131 may be configured as peripheral devices 362, where registers of edge processor 131 may be connected to bus 360 and may be selected with decoding and gating logic 361 to facilitate initialization thereof. Initialization may be performed in various forms. In one form, signals 725 and 726 (FIG. 7A) may be polled by supervisory processor 125 under program control to detect completion of edge processing with edge processor 131, indicating the need to load new initial conditions for another edge. In another form, signals 725 and 726 may interrupt supervisory processor 125 under interrupt control to indicate completion of edge processing with edge processor 131; indicating the need to load new initial conditions for another edge. Other methods of communication between supervisory processor 125 and edge processor 131 may also be implemented.

Edge processor 131 can output processed edge information to subsequent processors, such as for smoothing and filling of pixels and for loading refresh memory. Various interfacing arrangements may be provided therebetween. For example, in a pipeline processor, information may be communicated over hardwired dedicated connections or may be provided with memory interfaces, such as discussed herein. For example, in a FIFO memory interface arrangement, edge pixel information, such as edge pixel X and Y addresses can be loaded into a FIFO for subsequent writing of the edge into refresh memory 116.

Edge processor 131 can be initialized with startpoint and endpoint coordinates, slope or reciprocal slope, and other parameters. The other parameters can include an R-register initial condition, control and status flags, and linking between edges of the same surface. These parameters can be generated under control of supervisory processor 125, under hardware control, or under other control. For example, supervisory processor 125 can derive coordinate and slope information and can provide this information to edge processor 131. Alternately, this information may be derived under hardware control for testing slope and reciprocal slope to determine which is the fractional parameter and packing a flag in response thereto. Also, generating edge processor initial conditions can be implemented with combinations of supervisory processor control and hardware control. Supervisory processor control reduces hardware, but further loads supervisory processor 125 and operates slower than hardware control. Therefore, combinations thereof may be used, such as identifying the edge to be processed under supervisory processor control and accessing edge information and packing control flags under hardware control.

Edge processor initialization involves deriving pertinent parameters and transferring them to the edge processor. These parameters can include X and Y startpoint coordinates, X and Y endpoint coordinates, and slope for the particular edge. These parameters can be accessed directly under control of initialization logic. For example, edge complete signals 725 and 726 (FIG. 7A) generated by edge processor 131 can control accessing of an edge queue or can control accessing of host system 102 for initial conditions related to a new edge in sequence to be processed. Therefore, edge processor initialization can be self contained and need not involve supervisory processor operation. However, in alternate configurations, initialization of edge processor 131 can be performed under control of supervisory processor 125.

Supervisory processor 125 can determine priorities of edges for assignment to edge processors. For example, moving visible edges may have the highest priority, moving non-visible edges may have the next highest priority, stationary visible edges may have the next highest priority, and stationary nonvisible edges may have the lowest priority. Also, priorities within these categories can be assigned. For example, objects having faster motion may have higher priorities than objects having slower motion. Other priorities can also be provided.

Priorities can be implemented in various configurations. In one configuration, an edge queue for an edge processor can store a sequence of edge identifiers in the sequence of priority. Edge processor 131 can access the edge identifiers in sequence and therefore process the related edges in the related priority. Supervisory processor 125 may reassign priorities, such as by changing the sequence of edge identifiers in an edge queue. For example, a stationary edge becoming a moving edge can be changed from a low priority to a higher priority. Similarly, a nonvisible edge becoming a visible edge can be changed to a higher priority. Also, objects entering a scene can involve insertion of new edge identifiers in the edge queue and objects leaving a scene can involve removing of edge identifiers from the edge queue. Changes in priority can be performed by moving information from a lower edge address in the edge queue to a higher edge address in the edge queue, such as well known sorting and reassembling operations.

The edge queue can be implemented in various configurations. In one configuration, the edge queue may be implemented as a single queue that services a plurality of edge processors. In another configuration, the edge queue may be implemented as a plurality of edge queues, where each of the plurality of edge queues is dedicated to a particular edge processor. The edge queue may store an edge identifier, such as a pointer that points to the edge parameters in a processor memory. Alternately, the edge queue may store the initial conditions themselves for direct loading into an edge processor. Other configurations can also be provided. In the pointer configuration, the edge identifier may be a base address, such as the first address associated with the edge-related elements in a processor memory. Fixed format processor operations can provide fixed address relationships to the base address. For example, the supervisory processor main memory format may provide the five edge processor initial condition parameters by storing X-startpoint, Y-startpoint, X-endpoint, Y-endpoint, and slope parameters in the first 5-words respectively starting at the pointer address. Therefore, the edge processor initial condition logic can directly access the initial condition parameters from main memory of supervisory processor 125.

Edges can be assigned to edge processors by the supervisory processor. Once an edge processor becomes available, identified by edge completion output signals that are indicative of the edge generator arriving at the endpoint coordinates of the edge, the edge processor can be reassigned based upon edge priorities, discussed herein for resource allocation. The supervisory processor may have an edge queue for storing edges in the desired priority. The priority structure may be multi-dimensional. The first priority dimension may be the preassigned priority of the edge, which may be a function of motion and the significance to the scenario. The second priority dimension may be chronological, where edges of the same priority may be processed in chronological order of the occurrence. When an edge processor becomes available, the supervisory processor can fetch the next edge from the queue and can fetch the initial conditions from the real time processor. The initial conditions can be loaded into the edge processor and edge processor operations can be initiated. The edge processor updates the edge in an off line manner with respect to the supervisory processor and real time processor. The edge complete signals are generated automatically after completion of updating of that edge. In this manner, the supervisory processor controls resource allocation and priority, permitting edge processors to be added in modular fashion to increase processing resources for greater performance.

An edge processor can have a substantial edge processing capability. Based upon a 6-MHz clock rate and ½-pixel resolution, an edge processor can process 100,000-pixels in a thirtieth of a second refresh period and 300,000-pixels in a tenth of a second update period. Assuming a 2,000-edge system and a 20-pixel per edge average length, a single edge processor may be able to update all edge pixels each refresh period.

Each edge processor may rave an input queue and/or an output queue. The input queue may be loaded by the supervisory processor under program control to assign edges to the edge processor. The output queue may be provided to fill processors, such as occulting processors and smoothing processors. Queues may be implemented with IC RAMs configured as a FIFO memory. Interfacing of the edge processor may be enhanced with these queues. The supervisory processor may load the edge assignment queue for the edge processor and the edge processor may load the edge update queue for the occulting and smoothing processors. This facilitates asynchronous operation of these processors, where the edge processor can access the next edge from an edge assignment queue and can load pixel addresses for that edge into a pixel update queue asynchronous with the loading of the edge assignment queue by the supervisory processor and accessing of the pixel update queue by the occulting and smoothing processors. The queues may be implemented as first-in-first-out (FIFO) memories. As the edge assignment queue is loaded by the supervisory processor, an edge load address counter may be incremented as a pointer to the next edge load address. As the edge assignment queue is accessed by the edge processor, an edge access address counter may be incremented as a pointer to the next edge access address. As the pixel assignment queue is loaded by the edge processor, a pixel load address counter may be incremented as a pointer to the next pixel load address. As the pixel assignment queue is accessed by the occulting and smoothing processors, a pixel accessing address counter may be incremented as a pointer to the next pixel access address.

This queue configuration provides various advantages, such as permitting asynchronous operation between processors; i.e., between the supervisory processor 125, edge processor 131, occulting processor 132, and smoothing processor 133. It also enhances expansion, malfunction detection, malfunction correction, and other features; implicit in the asynchronous operation between elements. It also facilitates resource allocation, such as assignment of processing resources on a priority basis, for significantly enhanced utilization of processing resources. It also simplifies interfacing between the various processors, where a processor can input information by accessing a memory and output information by loading a memory without the need for certain auxiliary logic such as handshaking, synchronizing, and special buffering logic. It also permits better utilization of time share resources, where a processor can operate at a maximum processing rate without being slowed down by other processors. It also enhances performance of multiple tasks. For example, processing resources may have different tasks assigned thereto that may be different than tasks assigned to other processng resources; i.e., the edge processor may be assigned to generation of visible, non-visible, moving, and non-moving edges but occulting and smoothing processors may only be assigned to process visible moving edges. Edge processors may operate at a higher pixel rate then occulting and smoothing processors. Asynchronous operation with FIFO memories facilitates processing of edge pixels at a high rate without the edge processor without being slowed down by lower pixel processing rates of occulting and smoothing processors.

Edge processor 131 generates X and Y addresses of pixels along an edge of a surface. Initial conditions are slope (m), X and Y actual position, and X and Y final position; as discussed with reference to FIG. 7A. Edge processor 131 begins operation at the initial actual position, which is the startpoint address of the first pixel along the edge, and generates the addresses of the successive pixels along the edge until the actual position is equal to the final position.

Figure 7B:
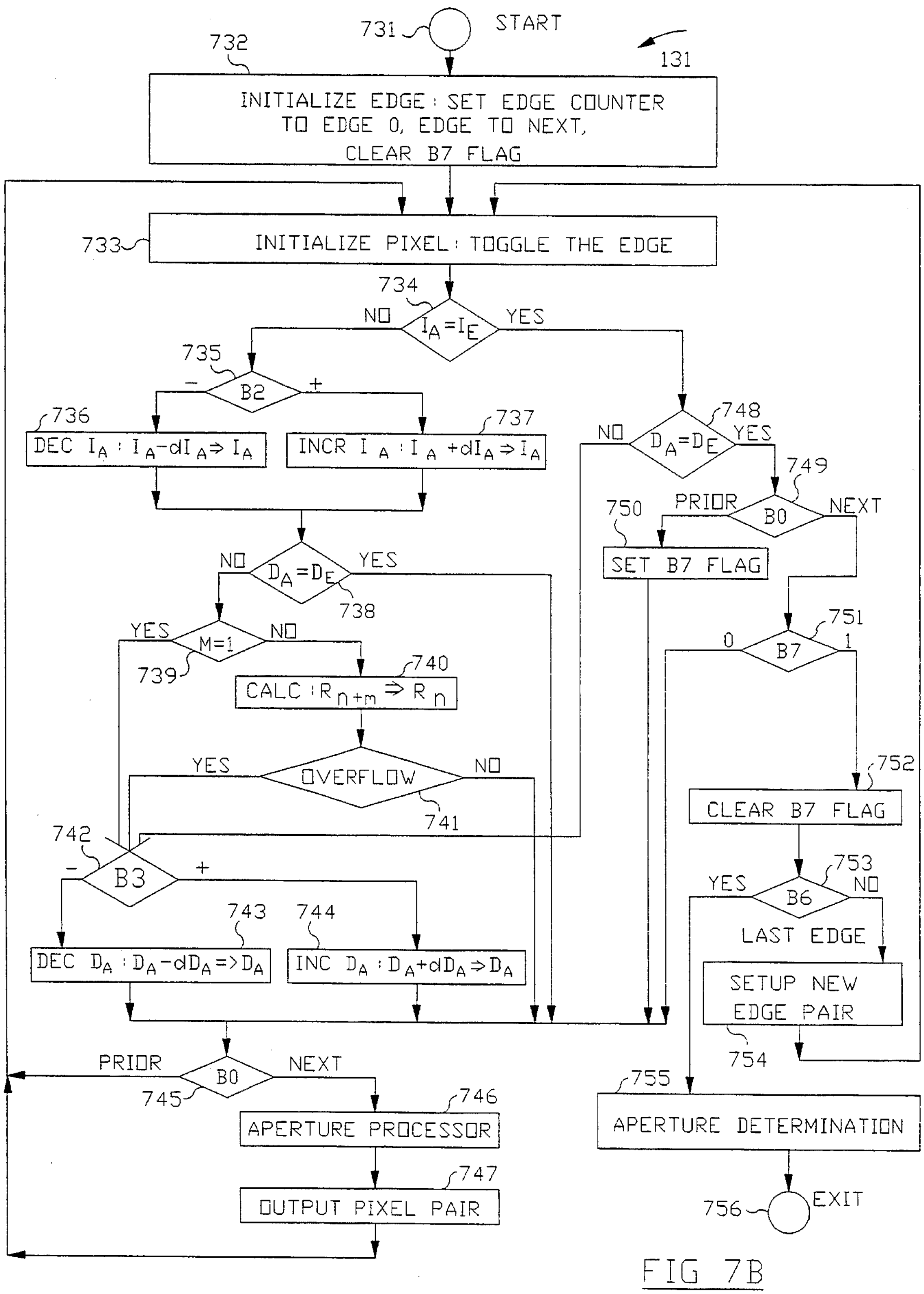
Figures 1A, 7C:
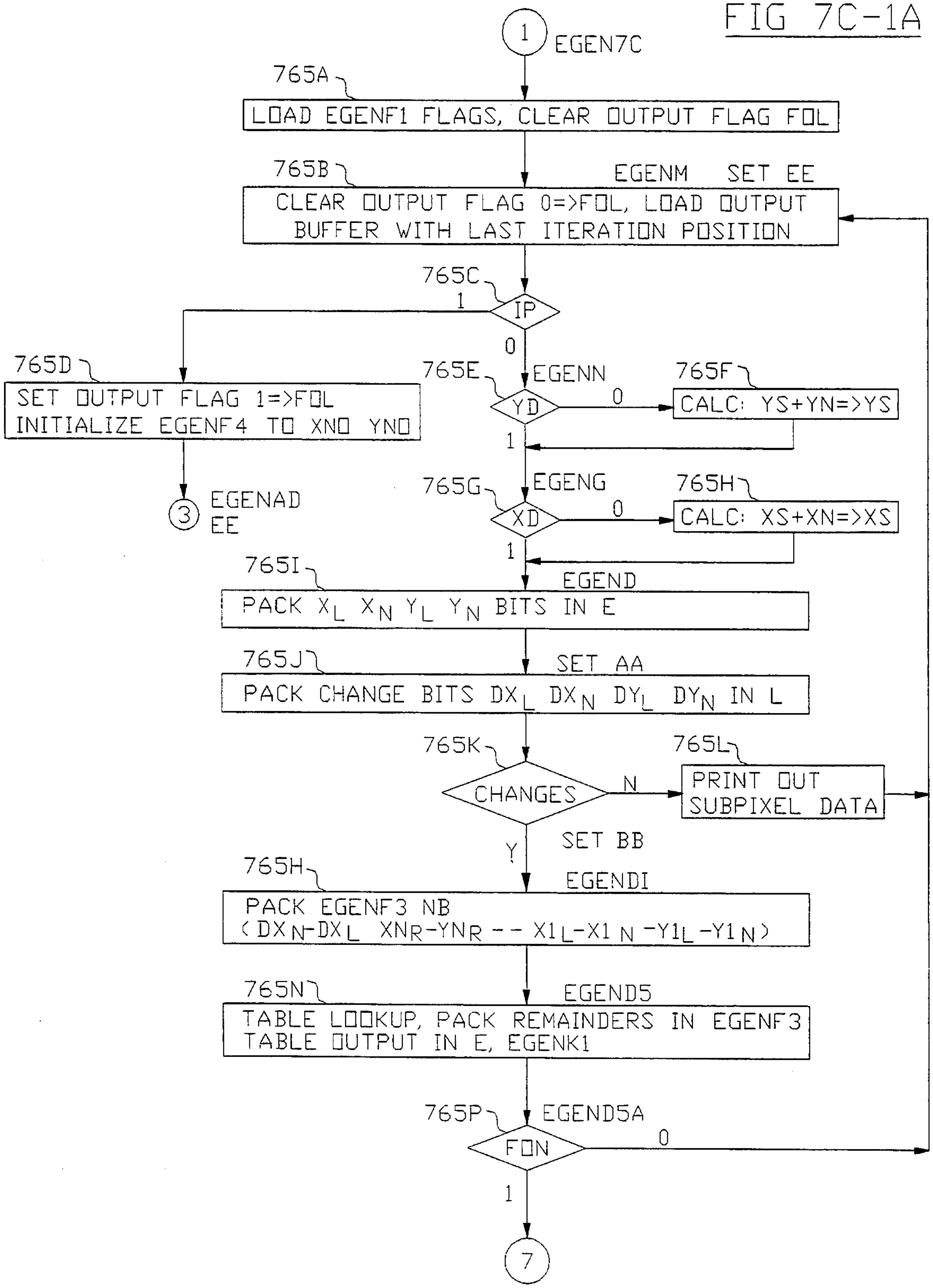
Figures 1B, 7C:
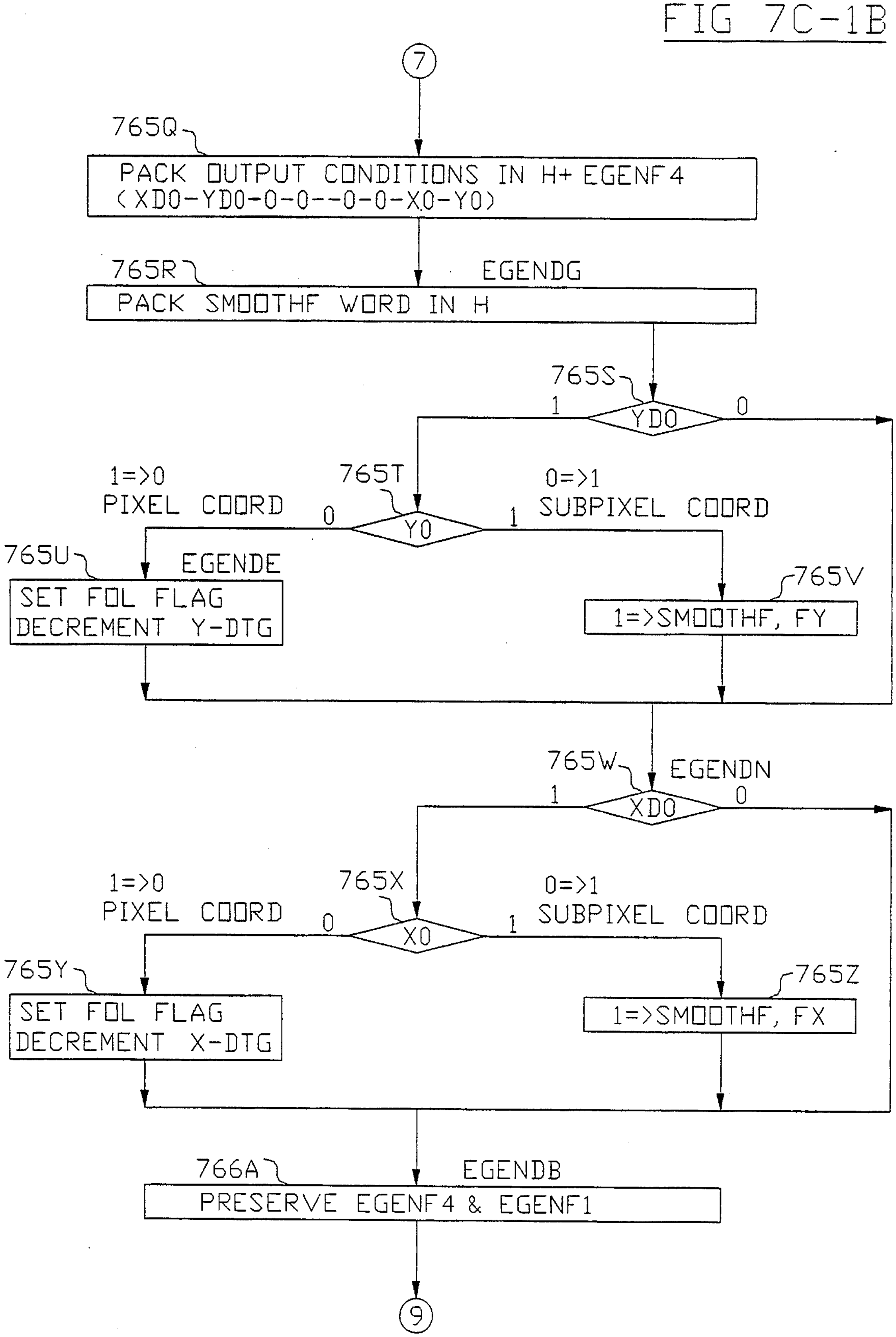
Figures 2A, 7C:
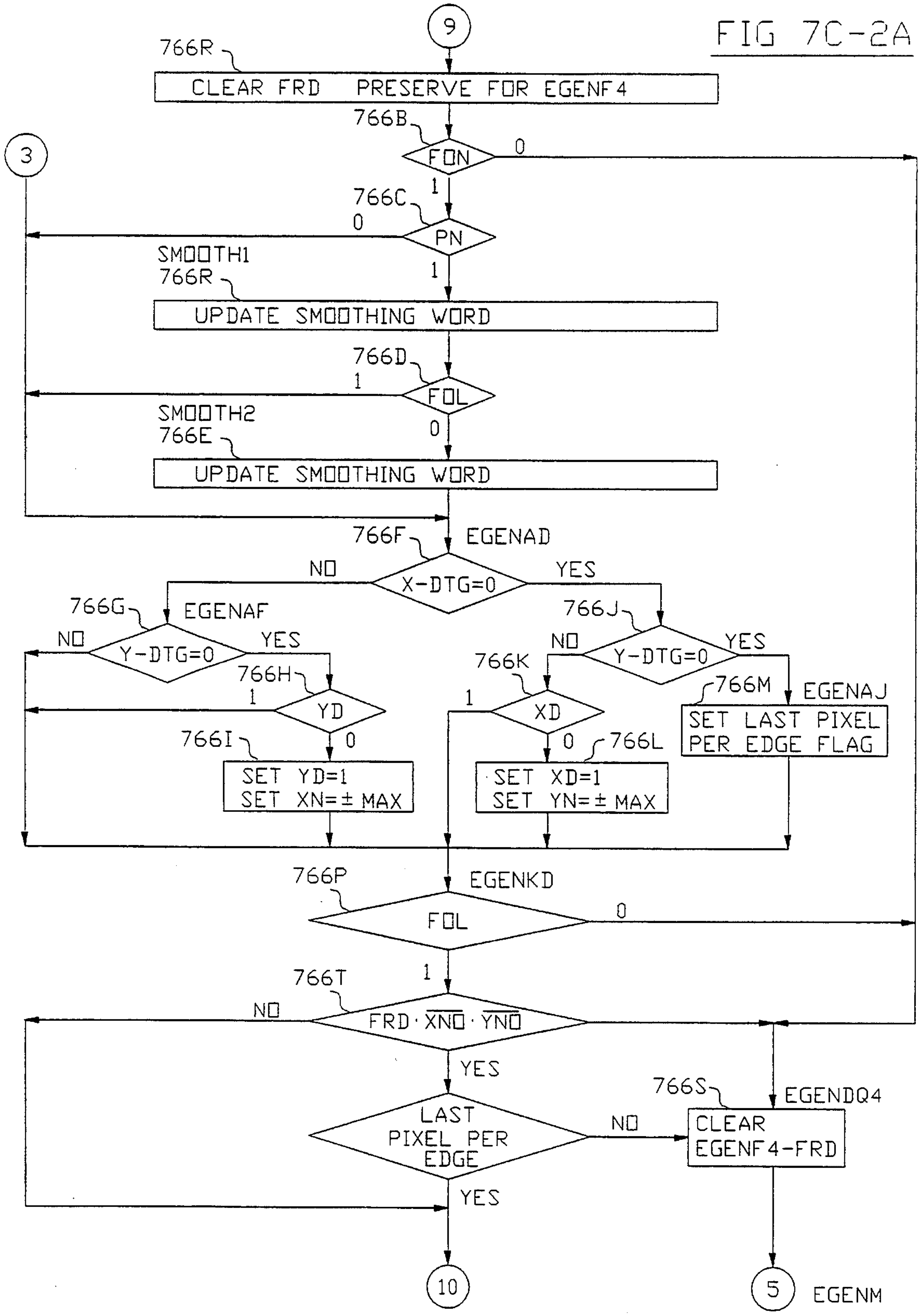
Figures 2B, 7C:
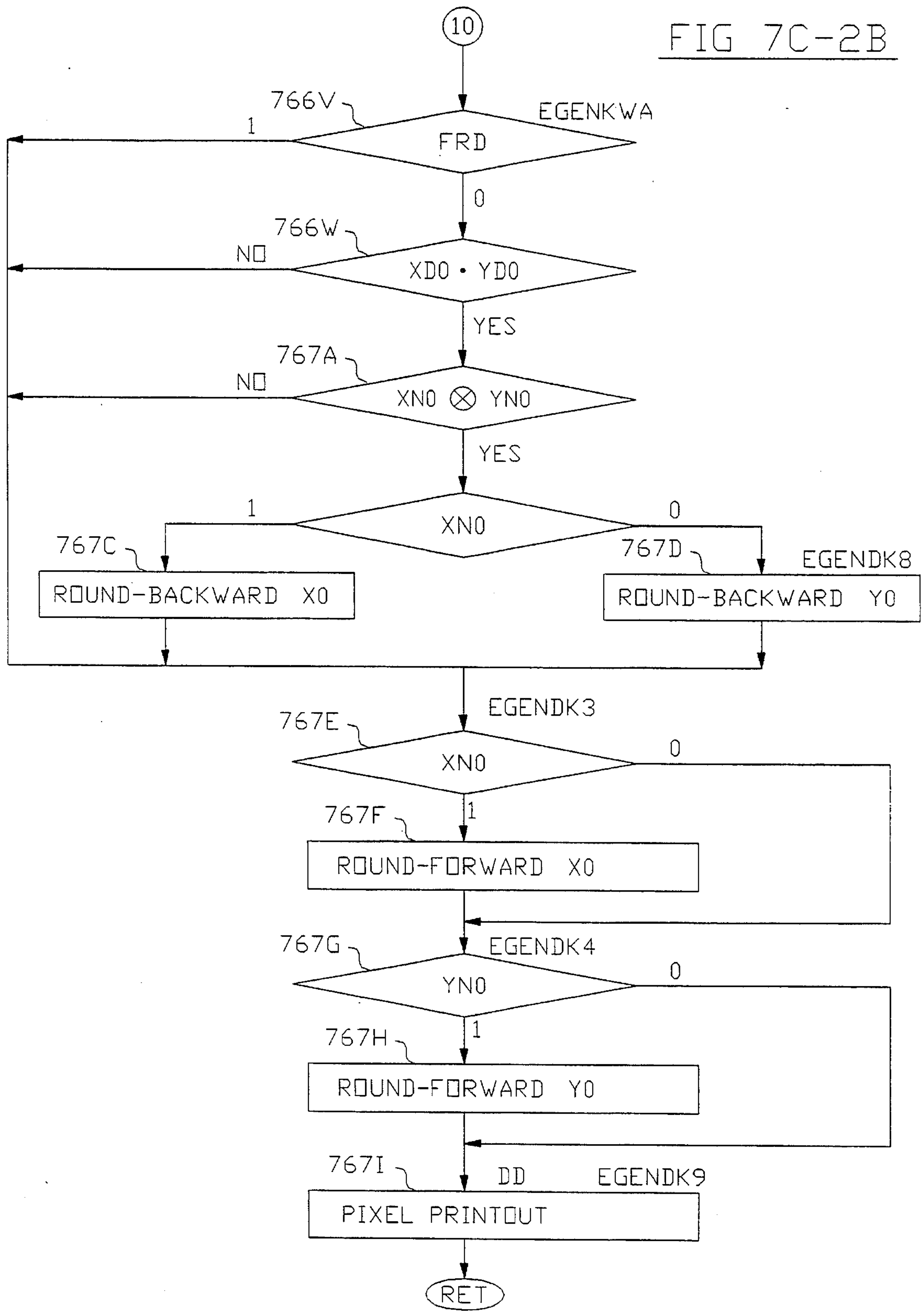
Figure 7D:
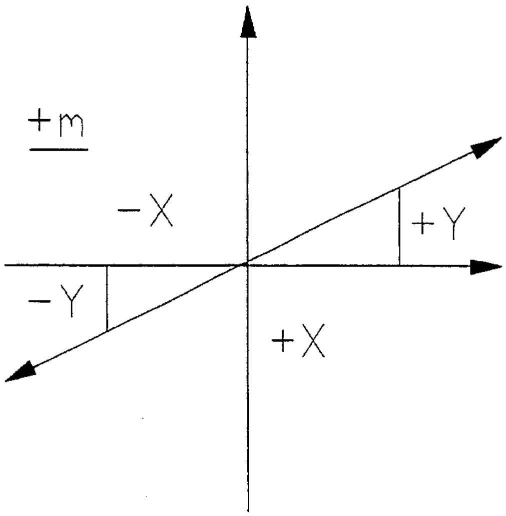

Geometry of the edge is shown in FIG. 7C for a positive slope and FIG. 7D for a negative slope. For a positive slope and X as the independent variable, a positive X-increment generates a positive Y-increment and a negative X-increment generates a negative Y-increment. For a negative slope and X as the independent variable, a positive X-increment generates a negative Y-increment and a negative X-increment generates a positive Y-increment. Similar conditions exist for Y being the independent variable.

A determination of whether X or Y is the independent variable is based upon the magnitude of the slope. To simplify scaling, the ratio of the dependent variable to the independent variable is maintained less than unity. Therefore, if the slope m is less than unity, then X is the independent variable and Y is the dependent variable. If the slope m is greater than unity, then Y is the dependent variable and X is the dependent variable.

In one configuration, overflow/underflow logic can be implemented with exclusive-OR logic to test for a change in the sign bit of the R-register with exclusive-OR logic. If a change condition is detected, an overflow/underflow condition is generated. If a non-change condition is detected, a non-overflow/underflow condition is generated. The dependent variable is incremented for a positive slope, called an overflow, and is decremented for a negative slope, called an underflow. Other overflow/underflow and increment/decrement logic may be used in other configurations. Overflow/underflow logic is illustrated with the examples set forth in the Overflow/Underflow Logic Table herein. Other overflow/underflow logical arrangements may also be used.

OVERFLOW/UNDERFLOW LOGIC TABLE

BOTH SIGNS POSITIVE

| | | | | | | | | | |
|---|---|---|---|---|---|---|---|---|---|
| CARRY | 1 | | 1 | 1 | 0 | 0 | 0 | 0 | |
| $R_n$ | 0 | . | 1 | 1 | 1 | 1 | 1 | 1 | 1 |
| $m_n$ | 0 | . | 0 | 1 | 1 | 0 | 0 | 0 | 0 |
| $R_{n+1}$ | 1 | . | 0 | 1 | 0 | 1 | 1 | 1 | 1 |

SIGN CHANGE
OVERFLOW

| | | | | | | | | | |
|---|---|---|---|---|---|---|---|---|---|
| CARRY | 0 | | 0 | 1 | 1 | 0 | 1 | 1 | |
| $R_n$ | 0 | . | 0 | 0 | 1 | 1 | 1 | 1 | 1 |
| $m_n$ | 0 | . | 0 | 0 | 0 | 1 | 0 | 1 | 1 |
| $R_{n+1}$ | 0 | . | 0 | 1 | 0 | 0 | 0 | 0 | 0 |

NO SIGN CHANGE
NO OVERFLOW

BOTH SIGNS NEGATIVE

| | | | | | | | | | |
|---|---|---|---|---|---|---|---|---|---|
| CARRY | 0 | | 1 | 1 | 1 | 1 | 1 | 1 | |
| $R_n$ | 1 | . | 0 | 0 | 1 | 1 | 1 | 1 | 1 |
| $m_n$ | 1 | . | 0 | 1 | 0 | 1 | 1 | 1 | 1 |
| $R_{n+1}$ | 0 | . | 1 | 0 | 0 | 1 | 1 | 1 | 0 |

SIGN CHANGE
UNDERFLOW

| | | | | | | | | | |
|---|---|---|---|---|---|---|---|---|---|
| CARRY | 1 | | 1 | 1 | 1 | 0 | 0 | 0 | |
| $R_n$ | 1 | . | 1 | 1 | 1 | 1 | 1 | 1 | 1 |
| $m_n$ | 1 | . | 1 | 0 | 1 | 1 | 0 | 0 | 0 |
| $R_{n+1}$ | 1 | . | 1 | 0 | 1 | 1 | 1 | 1 | 1 |

NO SIGN CHANGE
NO UNDERFLOW

| SIGN m | SIGN $R_n$ | SIGN $R_{n+1}$ | OVERFLOW | UNDERFLOW | NEITHER |
|---|---|---|---|---|---|
| 0 | 0 | 0 | 0 | 0 | 1 |
| 0 | 0 | 1 | 1 | 0 | 0 |
| 0 | 1 | 0 | 0 | 0 | 1 |
| 0 | 1 | 1 | 0 | 0 | 1 |
| 1 | 0 | 0 | 0 | 0 | 1 |
| 1 | 0 | 1 | 0 | 0 | 1 |
| 1 | 1 | 0 | 0 | 1 | 0 |
| 1 | 1 | 1 | 0 | 0 | 1 |

Edge Processor Operation (FIG. 7B)

An edge processor configuration in accordance with the arrangement shown in FIG. 7A will now be discussed in greater detail with reference to the flow diagram and state diagram shown in FIG. 7B. This implementation is exemplary of many alternate implementations that may be provided.

The edge processor arrangement shown in FIG. 7B may also be used for aperture processing to determine if a pixel or group of pixels is encompassed by the surface having the edges that are being generated. Elements 746 and 755 are specific to this aperture processing. Alternately, the edge processor can operate without such aperture processor capability.

Edge processor 131 (FIG. 7B) generates a plurality of edges for a multi-edge surface. The surface may be convex or concave and may have complex configurations, where the arrangement of edges forming the surface has few limitations imposed by edge processor 131. Edges may be generated as edge pairs, being a prior-edge and a next-edge pair. Pixel addresses along the edges are generated as prior-edge and next-edge pixel pairs. Operation proceeds by generating a sequence of prior-pixel and next-pixel pairs along an edge pair from the startpoints to the endpoints. Detection of edge pair endpoints results in initialization of the next subsequent edge pair and generation of the next subsequent edge pair on a sequential pixel pair by pixel pair basis. Slopes can be accomodated that are less than 45°, equal to 45°, and greater than 45°. The dimension (X or Y) that has the greater placement is identified as the independent variable. The dimension (X or Y) that has the lesser displacement is identified as the dependent variable. Therefore, for slopes less than 45°, X is the independent variable and Y is the dependent variable. Similarly, for slopes greater than 45°, Y is the independent variable and X is the dependent variable. For slopes equal to 45°, X is the independent variable and Y is the dependent variable.

Operation proceeds by driving the independent variable at the maxiumm rate and by driving the dependent variable at a lesser rate, as determined by the slope, for conditions where the slope is greater than 45° or less than 45° and driving dependent variable at a rate equal to the rate of the independent variable for conditions where the slope is equal to 45°.

The ratio of the pulse rate of the dependent variable to the pulse rate of the independent variable represents the slope. Edge processor 731 operates by multiplying by a slope of less than unity, where limitation to a fractional slope simplifies scaling and enhances performance. Therefore, the rate of the dependent variable is less than or equal to the rate of the independent variable for this implementation. However, alternate configurations can be provided, such as for multiplying by a slope greater than unity. Errors such as roundoff errors and processing errors are reduced by terminating edge processing when all edge coordinates, the prior-edge X and Y coordinates and the next-edge X and Y coordinates, all arrive at the endpoint coordinates. If one edge endpoint coordinate is achieved before others, it is held until the other edge endpoint coordinates are arrived at to complete the edge pair. This may be called edge endpoint runout, which compensates for slope errors such as due to roundoff, errors in edge generation such as due to initial conditions and iterative processing, and other conditions.

Initial conditions for edge processor 131 include the independent variable startpoint coordinate $I_A$, the dependent variable startpoint coordinate $D_A$, the independent variable endpoint coordinate $I_E$, and the dependent variable endpoint coordinate $D_E$, for each of the edge pairs, the prior-edge and the next-edge pairs. Initial conditions also include the slope for each of the edge pairs and a set of flags. The flags include the B7-flag, which establishes when the prior-edge has reached the prior edge-endpoints; slope flags to establish if the slope is less than unity, equal to unity, or greater than unity; the B2-flag to establish if the incremental motion for the independent variable is positive or negative; the B3-flag to establish if the incremental motion for the dependent variable is positive or negative; the B0-flag to establish if the edge being processed is the prior-edge or the next-edge; and the B6-flag to establish if the edge pair is the last edge pair for the surface being processed. Initial conditions may be generated by supervisory processor 125. Startpoint and endpoint coordinates may be processed in real time processor 126 and may be further processed With supervisory processor 125 or with other processors to derive the initial conditions therefrom. This further processing may include determination of independent and dependent variables from the larger and smaller of the X and Y displacements and determining of flags. Initial conditions may be accessed by edge processor 131 to generate edges for a surface.

Edge processor 131 (FIGS. 7A and 7B) can operate on absolute position numbers $X_A$ and $Y_A$ and $X_E$ and $Y_E$ which can represent the absolute screen coordinates of the startpoint and the endpoint of the edge respectively. Slope can be computed from the incremental coordinates of the edge, the quotient of X and Y. X is the relative distance of the X endpoint coordinate from the X startpoint coordinate and Y is relative distance from the Y endpoint coordinate to the Y startpoint coordinate.

The edge processor increment flag determines the sign of the increment, being a positive increment or a negative increment. Logical equations for the incremental sign are provided below.

$$+dI_A=(I_A<I_E)\cdot(+m)+(I_A<I_E)\cdot(-m)=(I_A<I_E)$$

$$-dI_A=(I_A>I_E)\cdot(-m)+(I_A>I_E)\cdot(+m)=(I_A>I_E)$$

Figure 7E:
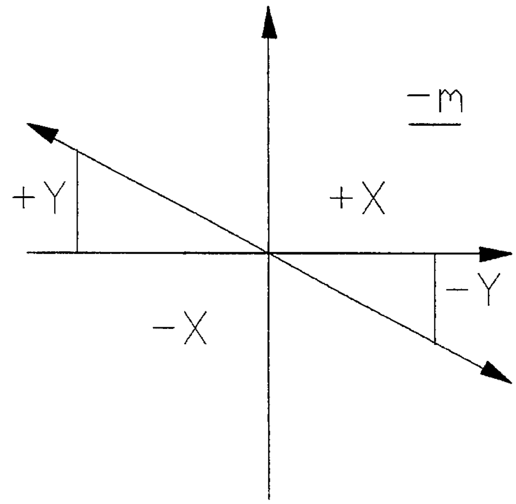
Figure 7F:
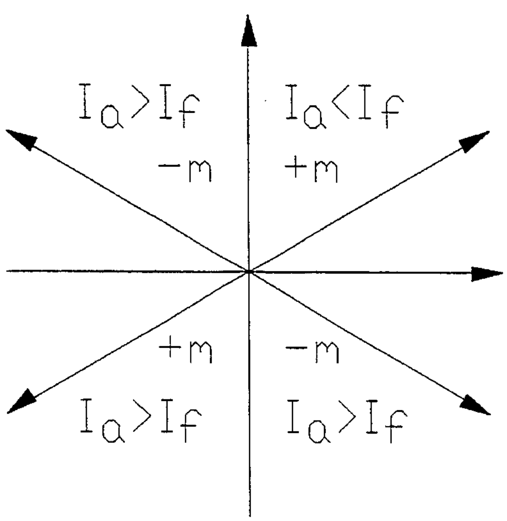
Figure 7G:
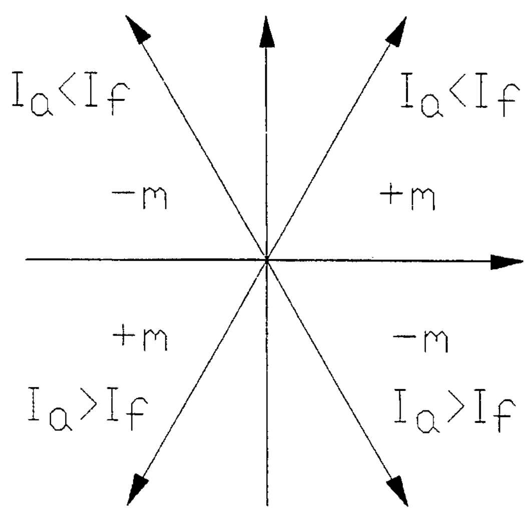

These equations are derived from the arrangement shown in FIGS. 7E and 7F. FIG. 7E shows the condition where the independent variable is X and the dependent variable is Y. FIG. 7F shows the condition where the independent variable is Y and the dependent variable is X. The incremental conditions are a function of the independent and dependent variables and the sign of the slope.

Edge processor 131 (FIG. 7B) commences with operation 731 and initializes edge conditions with operation 732. Initialization includes setting the edge counter to the first edge, edge-0, for generation of a complete surface; setting the edge flag to the next-edge; and resetting the B7-flag to zero. Initialization for each pixel is performed in operation 733, where the B0-flag is toggled from prior edge to next-edge and from next-edge to prior-edge.

The independent variable is tested and incremented or decremented in operations 734 to 737. The independent variable is tested in test operation 734 to determine if the independent variable has arrived at the endpoint, implicit in the actual independent variable coordinate $I_A$ being equal to the final independent variable coordinate $I_E$. If $I_A$ is equal to $I_E$, operation branches to endpoint processing operations 748 to 756 along the YES path and the independent variable for that particular edge is not again incremented or decremented. If $I_A$ is not equal to $I_E$, operation branches along the NO path to increment or decrement the independent variable. The sign of the independent variable increment (B2) is tested in operation 735. If the sign of the independent variable increment (B2) is positive, operation branches along the plus path to operation 737 to increment the independent variable. If the sign of the independent variable increment is negative, operation branches along the minus path to operation 736 to decrement the independent variable.

The dependent variable is tested and incremented or decremented in operations 738 to 744. The dependent variable is tested in test operation 738 to determine if the dependent variable has arrived at the endpoint, implicit in the actual dependent variable coordinates $D_A$ being equal to the final dependent variable coordinates $D_E$. If $D_A$ is equal to $D_E$, operation branches around increment and decrement operations 739 to 744 along the YES path and the dependent variable for that particular edge is not again incremented or decremented. If $D_A$ is not equal to $D_E$, operation branches along the NO path to increment or decrement the dependent variable with operations 739 to 744. The slope is tested in operation 739. Because the dependent variable is selected to have a displacement less than the independent variable, the slope parameter (m) is either unity or less than unity. Slopes greater than unity are processed with a Y-independent and an X-dependent variable, as discussed above. If the slope is unity, operation branches along the YES path to operations 742 to 744 to increment or decrement the dependent variable. If the slope is not unity, operation branches along the NO path to operation 740 where the slope parameter is incrementally integrated by adding to the remainder (R) register in operation 740 and testing for an overflow in operation 741. For this overflow determination, slopes may be absolute magnitude, always positive, or signed, positive or negative. If an overflow has not occurred, operation branches along the NO path to bypass operations 742 to 744 and therefore the dependent variable is not incremented or decremented. If an overflow has occurred, operation branches along the YES path to operations 742 to 744 to increment or decrement the dependent variable. The sign of the dependent variable increment (B3) is tested in operation 742. If the sign of the dependent variable increment (B3) is positive, operation branches along the plus path to operation 744 to increment the dependent variable. If the sign of the dependent variable increment is negative, operation branches along the minus path to operation 743 to decrement the dependent variable.

After the independent variable and dependent variable for a next edge has been incremented or decremented with operations 734 to 744; operation iterates back from test opertion 745 along the PRIOR edge path to operation 733 to toggle the edge from the prior-edge for the first iteration of a pair of pixel iterations to the next-edge for the second iteration of a pair of pixel iterations. After a pair of edge pixels, a prior-edge pixel and a next-edge pixel, have been processed with operations 733 to 744, the processor branches from test operation 745 along the NEXT edge path to perform aperture processing in operation 746 and to output the pixel pair in operation 747 before iterating back to operations 733 to 745 to process the next subsequent pixel pair. Outputting of a pixel pair in operation 747 provides the pixel pair for subsequent processing, such as for filling processing and smoothing processing for updating refresh memory 116.

Edge endpoint processing is performed with operations 748 to 756. After detecting an independent variable endpoint for an edge in operation 734, a test is made to detect a dependent variable endpoint for the same edge in operation 748. If the dependent variable endpoint is not detected in operation 748, operation branches along the NO path to operations 742 to 744 to increment or decrement the dependent variable at the maximum rate to drive the dependent variable to the edge endpoint. Operation for that edge will continue to branch along the YES path from operation 734 and along the NO path from operation 748 to increment or decrement the dependent variable at the maximum rate, bypassing the slope calculation in operations 739 to 741 until the dependent variable for that edge arrives at the edge endpoint. When the dependent variable endpoint has been reached (in addition to the independent variable endpoint having been reached), as determined with operation 748, operation branches along the YES path to operation 749 to determine if the edge having arrived at the edge endpoint is a prior-edge or a next-edge. If a prior-edge, operation branches along the PRIOR path to operation 750 to set the B7-flag, indicative of having arrived at a prior edge endpoint, and iterating back through the edge processor to also arrive at a next-edge endpoint before exiting the processing for that edge. If the next-edge endpoint has not as yet been reached, the processor proceeds through operations 734 to 747 for updating the next-edge until the next-edge endpoint is reached. When the next-edge endpoint has been reached, in addition to the prior-edge endpoint having been reached; then operation branches along the YES path from operation 734, along the YES path from operation 748, and along the NEXT path from operation 749 to test operation 751. In test operation 751, the B7-flag is tested to determine if both, the prior-edge and the next-edge, have arrived at the edge endpoints. The B7-flag is set in operation 750 by the prior-edge having arrived at the endpoint. If the prior-edge has not yet arrived at the endpoint, operation branches from test operation 751 along the "0" path to iterate through operations 733 to 747 to drive the prior-edge to its endpoint. When the prior edge endpoint is reached, indicated by the B7-flag being one set in operation 750, together with the next-edge endpoint being reached, indicated by branching from operation 749 along the NEXT path to operation 751; then the processor branches from test operation 751 along the "1" path to operation 752 to clear the B7-flag. The processor then proceeds to test operation 753 to test the B6-flag for determining whether the edge pair just completed is the last edge for the surface. If the edge pair just completed is not the last edge for the surface, operation branches along the NO path to operation 754 where the new-edge pair is setup and operation loops back to process the new edge pair through operations 733 to 747. If the last edge pair has been processed, the processor branches from test operation 753 along the YES path to exit the edge processor routine through operations 755 and 756. Operation 755 performs an aperture determination, testing the quadrant flags associated with the aperture processor. The aperture flags were set in aperture processor operation 746 to establish whether the selected aperture pixel is encompassed by the edges of the surface just processed.

Single Loop Edge Processor Configuration (FIG. 7C)

An alternate edge processor configuration will now be discussed with reference to FIG. 7C. This configuration operates in conjunction with an executive processor (FIG. 7D), which generates the initial conditions for an edge and accesses the edge processor to generate sequential pixels along the edge. This edge processor configuration performs pixel processing, such as generation of subpixel coordinates and smoothing information, and returns to the executive processor when a next sequential pixel is generated. Therefore, this configuration can be considered to be an iterative single pixel processor that generates another pixel in sequence when accessed by the executive processor. Also, when taken in combination with the executive processor, it provides a complete edge processor generating all pixels along an edge and generating auxiliary information, such as smoothing information. Alternately, it can be implemented as a self contained edge processor by including the portion of the executive processor that closes the multiple pixel loop for processing subsequent pixels within the edge processor logic. This configuration has various important inventive features. It generates both pixel and subpixel resolution coordinates; it performs smoothing operations in conjunction with the subpixel coordinates; it has a novel position processor that provides greater performance at lower cost, such as improved overflow logic; it improves edge generation by suppressing right angle transitions; it insures that the startpoint pixel and the endpoint pixel are generated with initial pixel and zero distance to go (DTG) logic respectively; it insures that all intermediate pixels are generated; it enhances surface fill operations; it has improved roundoff and remainder arrangements; and it provides other inventive features.

The edge processor configuration shown in FIG. 7C will now be discussed. Edge processor operations commence with element 765A which loads the EGENF1 flag word from memory into the C-register. Operation then proceeds to outer loop processing commencing with element 765B, which initializes outer loop operations by clearing the pixel output flag FOL and by loading the output buffer with the calculated position coordinates from the last iteration. In the first iteration, the output buffer is loaded with the startpoint coordinates. Operation then proceeds to element 765C to check if the present pixel is an initial pixel (IP) for the edge.

If the present pixel is an initial pixel, the IP flag will have been set with the executive processor; causing operation to branch along the "1" path to element 765D to set output flag FOL which commands the initial pixel to be output and to initialize the EGENF4 word to the initial values of the subpixel components of the output buffer coordinates XNO and YNO. Operation proceeds to element EGENAD 766F for output processing of the initial pixel. For subsequent pixels, the IP flag has been reset in the executive processor. Consequently, operation branches from element 765C along the 0 path to element EGENN 765E to initiate coordinate updating.

A check of the YD-flag condition is performed in element 765E to determine if the Y-pixel coordinate YS is to be updated or bypassed. Bypassing is performed for an endpoint runout disabling of Y-axis motion. If the YD-flag is one-set, operation branches along the 1 path around element 765F to element 765G so as not to update the YS-coordinate. If the YD-flag is zero-set, operation branches along the 0 path to element 765F to update the YS-coordinate.

A check of the XD-flag condition is performed in element 765G to determine if the X-pixel coordinate XS is to be updated or bypassed. Bypassing is performed for an endpoint runout disabling of X-axis motion. If the XD-flag is one-set, operation branches along the 1 path around element 765H to element 765I so as not to update the XS-coordinate. If the XD-flag is zero-set, operation branches along the 0 path to element 765H to update the XS-coordinate.

The updating operation implements a novel update processor arrangement that increases performance and simplifies circuitry, such as using an improved overflow arrangement. This is accomplished by providing a double precision twos-compliment addition operation where a first parameter, composed of the pixel coordinate YS (or XS) as the most significant half and the remainder YR (or XR respectively) as the least significant half, is added to the slope-related parameter, composed of the delta parameter YN (or XN respectively) as the least significant half the sign of the slope parameter YN (or XN respectively) as the most significant half. The least significant bit of the pixel coordinate YS (or XS respectively) has a half pixel resolution, the second least significant bit of the pixel coordinate parameter YS (or XS respectively) has a pixel resolution, and the least significant bit of the coordinate parameter YS (or XS respectively) has a 1/512th pixel resolution. Adding of the slope parameter YN (or XN respectively) to the remainder parameter YR (or XR respectively) generates the new remainder parameter YR (or XR respectively). The overflow from this least significant half summation is preserved and carried to the most significant half, where it is added to the pixel coordinate parameter YS (or XS respectively) together with a word composed of the sign bits of the slope parameter YN (or XN respectively) to facilitate a twos-complement double precision addition operation. This carry represents a simplified implementation of an incremental overflow operation. The slope parameter YN (or XN respectively) is preserved and the pixel coordinate parameter YS (or XS respectively) and remainder parameter YR (or XR respectively) are updated, representative of the new calculated position YS (or XS respectively) and the new remainder YR (or XR respectively).

After performing the X-coordinate and Y-coordinate computations in elements 765E to 765H, operation proceeds to element EGEND 765I, where the half pixel resolution bits XN and YN and the pixel resolution bits XL and YL are packed together in the E register in element 765I and where the changes in the half pixel resolution bits DXN and DYN and in the pixel resolution bits DXL and DYL are packed together in the L register in element 765J. Operation then branches to element 765K to determine if changes have occurred in the half pixel resolution bits XN and YN and consequently in the pixel resolution bits XL and YL. If changes have not occurred, the position computation has not resulted in an overflow to the half pixel resolution bits; where operation branches along the NO path from element 765K to element 765L to print out subpixel data for demonstration purposes and then to branch back to element EGENM 765B for another position update operation. If changes have occurred, the position computation has resulted in an overflow to the half pixel resolution bit; where operation branches along the YES path from element 765K to element EGENDI 765M to proceed with the processing of the changes.

In element EGENDI 765M, EGENF3 is updated and stored in the B-register. The most significant half of EGENF3 represents the pointer for the table lookup to be performed in element EGEND5 765N.

Operation proceeds to element EGEND5 765N, where a table lookup operation is performed (see Table X). The input conditions are the changes DX and DY and the old remainders XR and YR. The outputs are the subpixel output flag FON, the new remainders XR and YR, and the buffer update flags XSO and YSO. The don't care functions shown in the table with dashes are filled with zeros, as indicated by the hexidecimal code for each output shown in the HEX column. This table provides for suppressing of right angle transitions by storing remainders that would have caused a right angle transition and by outputting the transition on a subsequent iteration when the right angle transition is updated to a 45 degree transition. For example, generation of first an X-incremental change and then a Y-incremental change results in a right angle transition. However, for generation in accordance with the right angle suppression implementation; generation of an X-incremental change represents a table index of 8 which suppresses the output FON and stores an X-remainder XR and subsequently generation of a Y-incremental change, considering the X-remainder XR, generates a table index of 6. The table index of 6 sets the output flag FON, clears the remainders, and updates the Y-output buffer with the newly generated Y-incremental position. Because the X-output buffer had already been updated with the change that was stored as a remainder when operation branched back to element EGENM 765B and the output buffer was loaded with the last iteration position; both the X-incremental change and the Y-incremental change are stored in the output buffer and consequently the one-set output flag FON causes a 45 degree transition to be generated in place of a right angle transition.

Operation proceeds to EGEND5A 765P to test the output flag FON derived with the table lookup operation EGEND5. If the output flag FON is zero-set, operation loops back to EGENM 765B along the 0 path for a new iteration. If the output flag FON is one-set, operation branches along the 1 path to element 765Q and to element 765R to execute the output condition. In elements 765Q and 765R, the EGENF4 flag word and the SMOOTHF flag word are updated for subsequent processing; such as roundoff processing and smoothing processing.

Operation then proceeds to elements 765S and 765T to check for pixel and subpixel motion and to pack the FY and FX flags in the SMOOTHF word for subpixel motion and to set the FOL flag and decrement the DTG parameter for pixel motion.

A check is made of Y-axis half pixel resolution change bit YDO in element 765S. If Y-axis change bit YDO is zero-set, operation branches along the 0 path to bypass the Y-axis pixel and subpixel processing because there is no change in the Y-axis half pixel resolution output coordinate YDO. If Y-axis change bit YDO is one-set, operation branches along the 1 path to element 765T to perform Y-axis pixel and subpixel change processing because the Y-axis half pixel resolution coordinate YDO has changed, thereby establishing either a half pixel resolution change or a pixel resolution change. A check is made of Y-axis half pixel resolution position bit Y0 in element 765T. If Y-axis position bit Y0 is one-set, it represents a 0 to 1 transition; which is a half pixel transition. Therefore, operation branches along the 1 path to element 765V to one-set the FY flag in the SMOOTHF word, indicative of a Y-axis transition to a half pixel resolution coordinate. If Y-axis position bit Y0 is zero-set, it represents a 1 to 0 transition; which is a pixel transition. Therefore, operation branches along the 0 path to element 765U to set the pixel output flag FOL and to decrement the Y-DTG parameter, indicative of a Y-axis transition to a pixel resolution coordinate.

A check is made of X-axis half pixel resolution change bit XDO in element 765W. If X-axis change bit XDO is zero-set, operation branches along the 0 path to bypass the X-axis pixel and subpixel processing because there is no change in the X-axis half pixel resolution output coordinate XDO. If X-axis change bit XDO is one-set, operation branches along the 1 path to element 765X to perform X-axis pixel and subpixel change processing because the X-axis half pixel resolution coordinate XDO has changed, thereby establishing either a half pixel resolution change or a pixel resolution change. A check is made of X-axis half pixel resolution position bit X0 in element 765X. If X-axis position bit X0 is one-set, it represents a 0 to 1 transition; which is a half pixel transition. Therefore, operation branches along the 1 path to element 765Z to one-set the FX-flag in the SMOOTHF word, indicative of a X-axis transition to a half pixel resolution coordinate. If X-axis position bit X0 is zero-set, it represents a 1 to 0 transition; which is a pixel transition. Therefore, operation branches along the 0 path to element 765Y to set the pixel output flag FOL and to decrement the X-DTG parameter, indicative of a X-axis transition to a pixel resolution coordinate.

The pixel output flag FOL defines a pixel transition and commands a subsequent output pixel coordinate and processing associated with a pixel coordinate, such as generating the smoothing weight parameter and storing the pixel coordinate in the FIFO. Decrementing the DTG parameter advances the distance-to-go (DTG) towards the endpoint coordinate for subsequent detection of a zero DTG, indicative of arriving at the endpoint coordinate and discontinuation of motion along that axis for the present edge.

Operation then proceeds to element EGENDB 766A to preserve the SMOOTHF and EGENF1 flag words, then to element 766R to clear the roundoff-up flag FRU in flag word EGENF4, and then to element 766B to perform roundoff and edge endpoint processing.

Operation then proceeds to element 766B to check the subpixel output flag FON from the table lookup operation and to proceed with the subpixel and pixel processing if the FON flag is one-set. If the FON-flag is zero-set, operation branches along the 0 path to EGENDQ4 766S to clear the roundoff down flag FRD in the EGENF4 word, to generate a demonstration printout, and to loop back to EGENM 765B for another iteration. If the FON-flag is one-set, operation proceeds along the 1 path to element 766C to check the PN flag. If the PN flag is zero-set, indicative of a prior edge; operation branches along the 0 path around smoothing processing elements 766R and 766E which need not be performed for a prior edge, to EGENAD 766F to perform endpoint DTG processing. If the PN flag is one-set, indicative of a next edge; operation proceeds along the 1 path to update the smoothing conditions in element SMOOTH1 766R. Operation then proceeds to element 766D to test the pixel output flag FOL. If the FOL-flag is one-set, operation proceeds along the "1" path, branching around the additional smoothing processing in element SMOOTH2 766E because, with a one-set FOL-flag, operation will execute smoothing processing in element SMOOTH5 which includes execution of element SMOOTH2. If the FOL flag is zero-set, operation proceeds along the 0 path to element SMOOTH2 766E to update additional smoothing words for a half pixel resolution coordinate and then to proceed to EGENAD 766F to perform endpoint processing.

Operation proceeds to EGENAD 766F to detect an endpoint and to disable motion along an axis if it has reached the endpoint. This insures that the endpoint will actually be reached, even if the two coordinate axes reach the endpoint at different times. Also, an endpoint runout at maximum rate is provided to insure that, when one coordinate axis reaches the endpoint, the other coordinate axis will runout to the endpoint at maximum rate.

A check is made of the X-DTG parameter in element EGENAD 766F. If X-DTG is not equal to zero, operation proceeds along the NO path to element EGENAF 766G where a check is made of the Y-DTG parameter. If the Y-DTG parameter is not equal to zero, operation loops around endpoint processing to element EGENKD 766P because neither the X-coordinate nor the Y-coordinate has reached the endpoint; as indicated by neither of the DTG parameters being equal to zero. If the Y-DTG parameter is equal to zero, operation proceeds along the YES path from element 766G to element 766H to check the YD-flag, as indicative of a prior determination that the Y-axis coordinate had reached the endpoint. If the YD-flag is one-set, operation branches to element EGENAD 766P, looping around Y-endpoint processing in element 766I because this processing has already been performed, as indicated by the YD-flag being one-set. If the YD-flag is zero-set, operation proceeds along the 0 path to element 766I to perform Y-endpoint processing, as indicative of the first iteration for the present edge for the Y-axis being at the edge endpoint. In element

766I, the YD-flag is one-set; indicative of the Y-axis having reached the endpoint to control discontinuing of Y-axis motion by branching around element 765F and for discontinuing subsequent Y-axis endpoint processing by branching around element 766I. Also, the X-axis slope parameter XN is set to maximum to cause X-axis motion to rapidly move towards the endpoint to terminate processing for the present edge. If the X-axis slope parameter XN is negative, XN is set to a maximum negative value. If the X-axis slope parameter XN is positive, XN is set to a maximum-positive value.

If X-DTG is equal to zero, operation proceeds along the YES path to element EGENAE 766J where a check is made of the Y-DTG parameter. If the Y-DTG parameter is not equal to zero, operation proceeds along the NO path from element 766J to element 766K to check the XD-flag, as indicative of a prior determination that the X-axis coordinate had reached the endpoint. If the XD-flag is one-set, operation branches to element EGENKD 766P, looping around X-endpoint processing in element 766L because this processing has already been performed, as indicated by the XD-flag being one-set. If the XD-flag is zero-set, operation proceeds along the 0 path to element 766L to perform X-endpoint processing, as indicative of the first iteration for the present edge for the X-axis being at the edge endpoint. In element 766L, the XD-flag is one-set; indicative of the X-axis having reached the endpoint to control discontinuing of X-axis motion by branching around element 765H and for discontinuing subsequent Y-axis endpoint processing by branching around element 766L. Also, the Y-axis slope parameter YN is set to maximum to cause Y-axis motion to rapidly move towards the endpoint to terminate processing for the present edge. If the Y-axis slope parameter YN is negative, YN is set to a maximum negative value. If the Y-axis slope parameter YN is positive, YN is set to a maximum positive value.

If the X-DTG parameter and the Y-DTG parameter are both zero, operation proceeds along the YES path from element EGENAD 766F and along the YES path from element EGENAE 766J to element EGENAJ 766M to set the last pixel per edge flag, which causes the executive processor to discontinue processing of the present edge and to initialize another edge.

The above-discussed half pixel resolution processing may cause a pixel output condition where one coordinate axis reaches a pixel coordinate with a half pixel resolution, a transition of 1 to 0, and the other coordinate axis being at a half pixel resolution coordinate with a half pixel resolution bit X0 or Y0 being one-set. Therefore, roundoff processing is provided to insure that both the coordinates will be rounded-off to the appropriate pixel centerpoint coordinates. Roundoff processing is provided to roundoff output pixels to pixel resolution, where the X0 and Y0 half pixel resolution bits of the EGENX0 and EGENY0 output words are zero-set, indicative of a pixel centerpoint coordinate. Also, a clipped corner condition can cause bypassing of a pixel center coordinate, where roundoff can correct this condition. Roundoff conditions are discussed in greater detain hereinafter.

Operation proceeds to element EGENKD 766P to check for a pixel output condition. If the pixel output flag FOL is zero-set, operation proceeds along the 0 path to EGENDQ4 to clear the roundoff-down flag FRD and to branch back to EGENM 765B for another iteration. If the pixel output flag FOL is one-set, operation proceeds along the 1 path to element 766T to suppress double pixel conditions. A double pixel condition can occur if, during the previous iteration, a roundoff-up flag FRU was generated and, during the present iteration, the edge made a transition to the center pixel coordinate. This could result in outputting of two pixels for the same pixel coordinate. This condition is overcome by detecting if the roundoff-up flag FRU is one-set, indicative of a roundoff-up in the prior iteration, and detecting of the XNO and YNO coordinates both being zero, indicative of the present edge making a transition through the center of the pixel. If this condition is met, operation proceeds along the YES path to element 766U to test for a last pixel per edge condition. If the last pixel per edge flag is zero-set, operation proceeds along the NO path to element EGENDQ4 766S to clear the roundoff-down flag FRD and to loop back to EGENM 765B for another iteration. If the double pixel condition is not met, operation proceeds along the NO path from element 766T to element EGENKWA 766V for roundoff processing. If the double pixel condition is met but the last pixel per edge flag is zero-set, operation proceeds along the YES path from element 766U to element EGENKWA 766V for roundoff processing.

Operation proceeds to element EGENKWA 766V to initiate roundoff processing. The roundoff-down flag FRD is checked in element 766V to determine if a roundoff-down condition had been generated for a clipped corner condition. If the FRD-flag is one-set, operation proceeds along the 1 path to element EGENDK3 767E, bypassing clipped corner roundoff processing. If the FRD-flag is zero-set, operation proceeds along the 0 path to element 766W to test whether both of the half pixel coordinates have changed. As discussed for clipped corner roundoff processing, both half pixel coordinates should change to have a clipped corner condition. If one or both of the half pixel coordinates have not changed, operation proceeds along the NO path to element EGENDK3 767E, bypassing clipped corner processing. If both half pixel coordinates have changed, indicative of a potential clipped corner condition; operation proceeds along the YES path to element 767A to check if both half pixel coordinates are different. As discussed for clipped corner processing, both half pixel coordinates should have changed and should have changed to different values, the first half pixel coordinate being a 1 and the second half pixel coordinate being a 0, for a clipped corner condition to exist. If the half pixel coordinates are the same, operation proceeds along the NO path from element 767A to bypass clipped corner roundoff processing because a clipped corner condition does not exist. If the half pixel coordinates are different, operation proceeds along the YES path from element 767A to element 767B, indicative of a clipped corner condition, to determine if the roundoff-down for the clipped corner condition is along the X-axis of the Y-axis. If the X-axis half pixel coordinate XNO is one-set, operation proceeds along the 1 path from element 767B to element 767C to roundoff-down the X-axis because XNO is 1 and therefore YNO must be 0. If the X-axis half pixel coordinate XNO is zero-set, operation proceeds along the 0 path from element 767B to element EGENDKB 767D to roundoff backwards the Y-axis because XNO is 0 and therefore YNO must be 1.

After roundoff processing for clipped corner conditions from elements 766V, 766W, and 767A to 767D; operation proceeds to element EGENDK3 767E to initiate roundoff-up processing. The X-axis half pixel coordinate XNO is checked in element 767E. If XNO is zero-set, operation proceeds along the 0 path from element 767E to element EGENDK4 767G to bypass roundoff-up processing for the X-axis because the X-axis coordinate is already at the pixel center. If XNO is one-set, operation proceeds along the 1 path from element 767E to element 767F where the X-coordinate output parameter is rounded off-up to the pixel coordinate; where a subpixel X-coordinate is indicated by XNO being one-set. Roundoff-up involves either incrementing or decrementing the X-coordinate with a half pixel resolution increment or decrement. To insure roundoff in the up direction along the path of motion; if the X-pixel motion is positive, the x-coordinate is incremented, and if the X-pixel motion is negative, the X-coordinate is decremented. After X-coordinate roundoff-up processing with operations 767E and 767F, operation proceeds to Y-coordinate roundoff-up processing with element EGENDK4 767G.

The X-axis half pixel coordinate YNO is checked in element 767G. If YNO is zero-set, operation proceeds along the 0 path from element 767G to element EGENDK9 767I to bypass roundoff-up processing for the Y-axis because the Y-axis coordinate is already at the pixel center. If YNO is one-set, operation proceeds along the 1 path from element 767G to element 767H where the Y-coordinate output parameter is rounded-off up to the pixel coordinate; where a subpixel Y-coordinate is indicated by YNO being one-set. Roundoff-up involves either incrementing or decrementing the Y-coordinate with a half pixel resolution increment or decrement. To insure roundoff in the up direction along the path of motion; if the Y-pixel motion is positive, the Y-coordinate is incremented, and if the Y-pixel motion is negative, the Y-coordinate is decremented.

After roundoff processing, operation proceeds to element EGENDK9 767I to printout the pixel information for demonstration purposes and additional pixel coordinate processing.

The above discussed configuration has been reduced to practice with an emulator executing the program shown in the listings hereinafter and discussed herein, such as with reference to FIG. 17. Computer listings used to demonstrate the edge processor are attached hereto in the Tables Of Computer Listings in the subtable entitled Edge Processor And Smoothing Processor. These listings are compatible with various edge processor descriptions herein, such as using common mneumonics and symbols, and provide extensive supplemental details, such as in the annotations in the left hand columns and the details of the assembly language code in the middle column. Graphical and tabular printouts of the edge processor parameters are provided in the Edge Processor Tables hereinafter to demonstrate edge processor operation; which is discussed in detail in the section entitled Edge Processor Demonstration hereinafter.

EDGE PROCESSOR LOOKUP TABLE

| | TABLE INPUTS | | | | TABLE OUTPUTS | | | | | | | | |
|---|---|---|---|---|---|---|---|---|---|---|---|---|---|
| | NEW CHANGES | | OLD REMAINDERS | | OUTPUT FLAG | | NEW REMAINDERS | | | | UPDATE BUFFER | | |
| INDEX | DX | DY | XR | YR | FON | | XR | YR | SPARES | | XSO | YSO | HEX |
| 0 | 0 | 0 | 0 | 0 | 0 | 0 | 0 | 0 | — | — | — | — | 00H |
| 1 | 0 | 0 | 0 | 0 | 0 | 0 | 0 | 1 | — | — | — | — | 10H |
| 2 | 0 | 0 | 1 | 0 | 0 | 0 | 1 | 0 | — | — | — | — | 20H |
| 3 | 0 | 0 | 1 | 1 | 1 | — | — | — | — | — | — | — | 80H |
| 4 | 0 | 1 | 0 | 0 | 0 | 0 | 0 | 1 | — | — | — | — | 10H |
| 5 | 0 | 1 | 0 | 1 | 0 | 1 | 0 | 1 | — | — | — | 0 | 50H |
| 6 | 0 | 1 | 1 | 0 | 0 | 1 | 0 | 0 | — | — | — | 1 | 41H |
| 7 | 0 | 1 | 1 | 1 | 1 | — | — | — | — | — | — | — | 80H |
| 8 | 1 | 0 | 0 | 0 | 0 | 0 | 1 | 0 | — | — | — | — | 20H |
| 9 | 1 | 0 | 0 | 1 | 0 | 1 | 0 | 0 | — | — | 1 | — | 42H |
| A | 1 | 0 | 1 | 0 | 0 | 1 | 1 | 0 | — | — | 0 | — | 60H |
| B | 1 | 0 | 1 | 1 | 1 | — | — | — | — | — | — | — | 80H |
| C | 1 | 1 | 0 | 0 | 0 | 1 | 0 | 0 | — | — | 1 | 1 | 43H |
| D | 1 | 1 | 0 | 1 | 0 | 1 | 0 | 1 | — | — | 1 | 0 | 52H |
| E | 1 | 1 | 1 | 0 | 0 | 1 | 1 | 0 | — | — | 0 | 1 | 61H |
| F | 1 | 1 | 1 | 1 | 1 | — | — | — | — | — | — | — | 80H |

TABLE OF PACKED WORDS

| WORD | SEQ | REG | B7 | B6 | B5 | B4 | B3 | B2 | B1 | B0 | NOTES |
|---|---|---|---|---|---|---|---|---|---|---|---|
| EGENF3 | | B | DXN | DYN | XNR | YNR | X1L | X1N | Y1L | Y1N | Subpixel |
| EGENK1 | | | ERROR | OUT | XR | YR | 0 | 0 | XSO | YSO | Subpixel |
| EGEN TABLE IN | | A | 0 | 0 | 0 | 0 | DXN | DYN | XNR | YNR | |
| EGEN TABLE OUT | | A | ERROR | OUT | XR | YR | 0 | 0 | XSO | YSO | |
| EGENF4 | | | XDO | YDO | 0 | 0 | FRD | FRU | XNO | YNO | Pixel |
| GSFLAG | 1 | | | LES | | | | F1 | F0 | FN1 | |
| IPOBCF | 0 | | X | X | X | X | X | X | X | X | |
| | 1 | | — | LES | — | — | | ID/COLOR | | | |
| | 2 | | — | LES | SV | EV | | ID/COLOR | | | |
| IPOBF7 | 0 | | X | X | X | X | X | X | X | X | |
| | 1 | | 0 | 0 | 0 | 0 | LES | F1 | F0 | PN1 | |
| | 2 | | LPE | 0 | 0 | 0 | LES | F1 | F0 | PN1 | |
| | 3 | | LPE | XNS | YNS | FS | LES | F1 | F0 | PN1 | |
| | 4 | | LPE | XNS | YNS | FS | LES | F1 | F0 | PN1 | |
| EGENF7 | 0 | | 0 | 0 | 0 | 0 | 0 | 0 | 0 | 0 | |
| | 1 | | 0 | 0 | 0 | 0 | LES | 0 | 0 | PN1 | |
| | 2 | | LPE | XNS | YNS | FS | LES | F1 | F0 | PN1 | |
| EGENCF | | | — | LES | SV | EV | | ID/COLOR | | | |
| EGENF1 | 0 | C | 0 | 0 | 0 | 0 | 0 | 0 | 0 | 0 | |
| | 1 | C | 0 | 0 | 0 | 0 | XD | YD | 0 | FSO | |
| | 2 | C | 0 | 0 | 0 | 0 | XD | YD | 0 | FSO | |
| | 3 | C | 0 | F0 | IP | 0 | XD | YD | 0 | FSO | |
| PIXEL MEMORY | | D | PV | C2 | C1 | C0 | N1 | N0 | P1 | P0 | |
| PIXEL WORD | | E | V1 | V0 | BUG | 0 | | ID/COLOR | | | |
| | | B | | | | X ADDRESS | | | | | |
| | | C | | | | Y ADDRESS | | | | | |
| LHLD SURFM0 | | L | OBJECT ID | | | | | FLAGS | | | |
| | | H | FXD.PRIOR | | | | | RANGE | | | |
| LHLD SURFM1 | | L | | | | COLOR | | | | | |
| | | H | | | SURFACE ID | | | | FLAGS | | |
| OCMFIN | | | | | | N-SURFACE START POINTER | | | | | |
| OCMFIP | | | | | | P-SURFACE START POINTER | | | | | |
| OCMFFA | | | | | | PRESENT PIXEL POINTER | | | | | |
| OCMFIA | | | VF | PV0 | V0 | SV0 | — | FPS | FPE | FV0 | |
| SEH0 | | | $\overline{CA}$ | CB | SV | EV | — | F1 | F0 | PN1 | |
| SEH1 | | | | | SURFACE ID | | | | FLAGS | | SURFM1 (MSH) |
| SEH2 | | | OBJECT ID | | | | | FLAGS | | | SURFM0 (LSH) |
| SEH3 | | | FXD.PRIOR. | | | | | RANGE | | | SURFM0 (MSH) |
| SEH4 | | | — | — | — | — | — | — | — | — | |
| SEH5 | | | — | XNS | YNS | FS | LES | — | — | — | |
| PXLB0 | PRIOR | | CA | $\overline{CB}$ | VF | V | | OUTSIDE SURF.ID. | | | |
| PXLB0 | NEXT | | CA | $\overline{CB}$ | — | — | W3 | W2 | W1 | W0 | |
| PXLB1 | | | LPE | — | — | — | — | FI7 | FI6 | FI5 | |
| PXLB2 | | D | PV | C2 | C1 | C0 | N1 | N0 | P1 | P0 | PIXEL WORD |
| PXLB3 | | E | V1 | V0 | 0 | 0 | | SMOOTHED COLOR | | | PIXEL WORD |
| PXLB4 | | B | | | | XS | | | | | |
| PXLB5 | | C | | | | YS | | | | | |
| SMOOTHA,C | | | 7 | 6 | 5 | 4 | 3 | 2 | 1 | 0 | LSH Smoothing |
| SMOOTHB,D | | | — | — | — | — | — | — | — | 8 | MSH buffer |
| SMOOTHE AND | | | 0 | 0 | 0 | SA | XNS | YNS | FX | FY | |
| XOR | | | 0 | 0 | 0 | SA | XNS | YNS | XIN | FXY | |
| SMOOTHF | | | 0 | 0 | 0 | 0 | 0 | 0 | FX | FY | |

Edge Processor Demonstration

Operation of the edge processor is demonstrated with printouts generated with demonstration software. The demonstration software is provided in Disclosure Document No. 117,613 filed on May 27, 1983 with listings provided at pages 53 to 144 therein; traced operation provided at pages 145 to 251 therein, and printouts provided at pages 32 to 61 therein. In particular, CALL TEST1A and CALL TEST1C instructions are inserted in the edge processor routine for subpixel printouts and for pixel printouts respectively. These instructions inserted in the edge processor code generate a subpixel coordinate identified with a '5' and a pixel coordinate identified with a '1' respectively to be printed out in graphical form and, as adapted with SID changes that are input from the keyboard, cause tables of edge parameters to be printed out for subpixel and pixel coordinates.

Demonstration printouts, included as the Edge Processor Tables herein and included as Tables II to VIII in said Disclosure Document No. 117,613, have been generated with a consistent metholology. They include a graphical printout showing pixel and subpixel coordinates and a tabular printout showing the EGEN register contents for each pixel and subpixel coordinate.

A manually drawn pixel representation of the graphical printout is provided for Tables II to VI to supplement the graphical printout. This drawing shows the pixels as squares, the center coordinate of the pixel in the center of the square, and the subpixel coordinates about the center and on the outline of the square.

Changes are made to the program using SID to select graphical or tabular printouts and to modify the surface geometry. These SID-generated changes are printed out and included as the SID commands in the Edge Processor Tables in the sequence that they were generated for the printouts. For example, for Surface-I the SID instructions that change from graphical to tabular printouts are included in the table inbetween the Surface-I Graphics and the Surface-I Edge Parameters-A. The tabular printouts are generated in two portions in different tables, Edge Parameters-A and Edge Parameters-B, consistent with a more effective demonstration. These two tables have an overlapping pixel row for continuity therebetween.

In order to minimize interaction between pixel coordinates on the graphical printout, the coordinates are printed along a horizontal line for slopes greater than 45 degrees radially outward from the actual pixel coordinate. For example, for the Surface-I Graphics table, the first edge along the left hand side starts with the pixel or subpixel coordinate '1' or '5' respectively and progresses radially outward to the left with the subpixel coordinate number; the second edge along the bottom starts with the pixel or subpixel coordinate '1' or '5' respectively and progresses radially downward with the subpixel coordinate number; and the third edge along the right hand side starts with the pixel or subpixel coordinate '1' or '5' respectively and progresses radially outward to the right with the subpixel coordinate number.

Various general considerations associated with Surface-I to Surface-VII will now be discussed.

A subpixel coordinate number is provided for each pixel on the graphical printout and for each row on the tabular printout for cross referencing therebetween. Some of the subpixel numbers are not shown on the graphical printout. This is because two subpixels are generated having the same output coordinates, where the subsequent output pixel wrote over the prior output pixel. These overwritten pixels can be identified by correlating the graphical printout with the tabular printout. For example, in Table II the graphical printout for subpixel 14 is not shown, where subpixel 15 immediately follows subpixel 13. However, with reference to the tabular printout for Table II, the X0 and Y0 coordinates for subpixel 14 and subpixel 15 are the same, X0 is 15 and Y0 is 11. Therefore, subpixel 14 is under subpixel 15 on the graphical printout.

Spaces can be seen in the graphical printout. For example, in the graphical printout for Surface-I, a space is seen between subpixel 47 and subpixel 49. This is caused by roundoff processing; where the subpixel coordinate is rounded either up or down to a pixel coordinate or alternately a pixel coordinate is suppressed due to a previous roundoff, as discussed with reference to FIG. 7C. For such a condition, the X0 and Y0 coordinates in the table reflect the roundoff position. The non-roundoff position can be determined by reading the XNS and YNS bits, the non-roundoff half pixel coordinate bits for the X0 and Y0 coordinates, respectively. The XNS and YNS bits are the two least significant bits of the F4 word in the tabular printout.

The F4 word contains packed information pertaining to the half pixel resolution bits of the two output words X0 and Y0 and pertaining to roundoff flags. The F4 word is not included in the tabular printout for Surface-I to Surface-V and Surface-VII. The F4 word is printed out for Surface-VI.

The columns in the tabular printout will now be discussed. The columns for the tabular printout are labeled in Table II and, although not again labeled for Surfaces-II to Surface-VII, are the same as shown for Surface-I. The first column identifies the subpixel number. The second and third columns are the output buffer coordinates EGENX0 and EGENY0.

The progression of the graphical printouts can be seen in the second and third columns as the EGENX0 and EGENY0 parameters are incremented or decremented from the startpoint coordinate toward the endpoint coordinate.

The fourth and seventh columns are the calculated Y and X coordinate parameters EGENYS and EGENXS respectively. The calculated coordinates EGENYS and EGENXS are often different from the output buffer coordinates EGENY0 and EGENX0 because the output buffer coordinates reflect the suppressed right angle transitions and also reflect roundoff conditions resulting from roundoff processing.

The progression of the calculated edge coordinates with right angle suppression can be seen in the forth and seventh columns as the EGENYS and EGENXS coordinates respectively progress from the startpoint to the endpoint coordinates.

The fifth and eighth columns identify the Y distance-to-go and X distance-to-go parameters respectively. The changes in distance-to-go can be seen as the distance-to-go parameters are decremented from the initial distance-to-go parameter to zero and terminating the edge when both distance-to-go parameters reach zero.

The endpoint runout condition can be seen with both the EGENX0 and EGENY0 coordinates in the second and third columns and the EGENYS and EGENXS coordinates in the forth and seventh columns. When one coordinate reaches the endpoint with a zero DTG parameter, changes in that coordinate cease until the other coordinate also reaches the endpoint with a zero DTG parameter, at which time a new edge is then initiated.

The sixth and ninth columns provide the slope parameters for the Y-axis and X-axis respectively EGENYN and EGENXN respectively. The slope parameters represent the least significant half of a twos complement binary number, where the slope parameters may be positive or negative. For example, for the first edge shown for Surface-I, Y-slope parameter is positive 'A' and the X-slope parameter is negative '7'; where a least significant half twos complement '7' having ones for the most significant half is a negative '9' number. The sign bits, '0' for positive and '1' for negative, in the most significant half of the slope numbers are derived from the EGENF7 word, where the YNS and XNS bits define the signs of the vectors.

For endpoint runout, one of the slope parameters is set to the maximum positive or maximum negative parameter, depending upon the vector direction of that axis, to provide a maximum runout rate. For example, for the first edge shown for Surface-I, the X-axis reaches the endpoint first and the Y-axis is runout to the endpoint in a positive direction, indicated by the EGENYN least significant half of the Y-slope parameter shown in the subpixels 1C, 1D, and 1E as 'FF'.

The tenth to fourteenth columns set forth packed words, defined in the Table Of Packed Words herein. As discussed above, the EGENF4 column is only shown for Surface-VI due to a change in the packed discrete word from a previous word designation to an EGENF4 word designation.

The fifteenth and sixteenth columns provide the remainders EGENYR and EGENXR respectively. The new remainder can be derived by adding the slope parameter for the corresponding axis to the prior remainder. This summation derives the new remainder and generates an overflow to the calculated coordinate, where the calculated coordinate is the most significant half of the double precision coordinate word and where the remainder word is the least significant half of the double precision coordinate word. A gap may occasionally occur in the remainder words because the loopback path from element 765L to element 765B (FIG. 7C) causes a change in the remainder but is not printed out. Suppression of this particular loopback printout yields, a better demonstration printout but causes the remainder gap.

The seventeenth column is used for demonstration purposes, where the path that the operation follows is reflected in the symbols. For example, the 'DD' symbol represents a pixel coordinate exiting FIG. 7C through element 767I, the 'BB' symbol represents a subpixel coordinate looping back from elements, 766B or 766P to element 765B, the 'CC' symbol represents a subpixel coordinate looping back from element 765P to element 765B, and the '11' symbol represents a subpixel coordinate looping back from element 766U to element 765B (FIG. 7C).

The eighteenth column represents the output word from the table lookup, performed in element EGEND5 765N (FIG. 7C).

Surface-I on the bottom edge at the left hand side illustrates roundoff processing.

Surface-I at subpixel coordinates 2A and 2B shows the EGENX0 coordinate making a transition from 0EH to 10H; which is a double subpixel transition or a pixel transition. This occurs because of a combination of a single half pixel increment from X equals 0EH to X equals 0FH and a roundoff-up increment from X equals 0FH to X equals 10H.

Surface-II at the left hand sloping line shows the slope slightly offset from the pixel center points, clipping the pixel corners one half pixel increment to the right. The roundoff-down processing translates the edge to the pixel center coordinates traversing the center of the pixel. Also, about the middle of this edge, right angle transitions occur as a result of roundoff-up processing.

The pixel memory wrap around feature can be seen in the graphical printout of Surface-V. The vertex at the lower left exceeds the left hand boundary and wraps around to the right hand boundary at the far right.

For Surface-VII at pixels 10, 11 and 12; the EGENX0 parameter makes a transition from 16 to 15 to 16; an apparent reversal in direction. This is due to a roundoff-up from EGENX0 equals 15 to EGENX0 equals 16 at subpixel 10, a non-roundoff remaining at EGENX0 equals 15 at subpixel 11, and then a transition at EGENX0 equals 16 at subpixel 12.

Figure 8A:
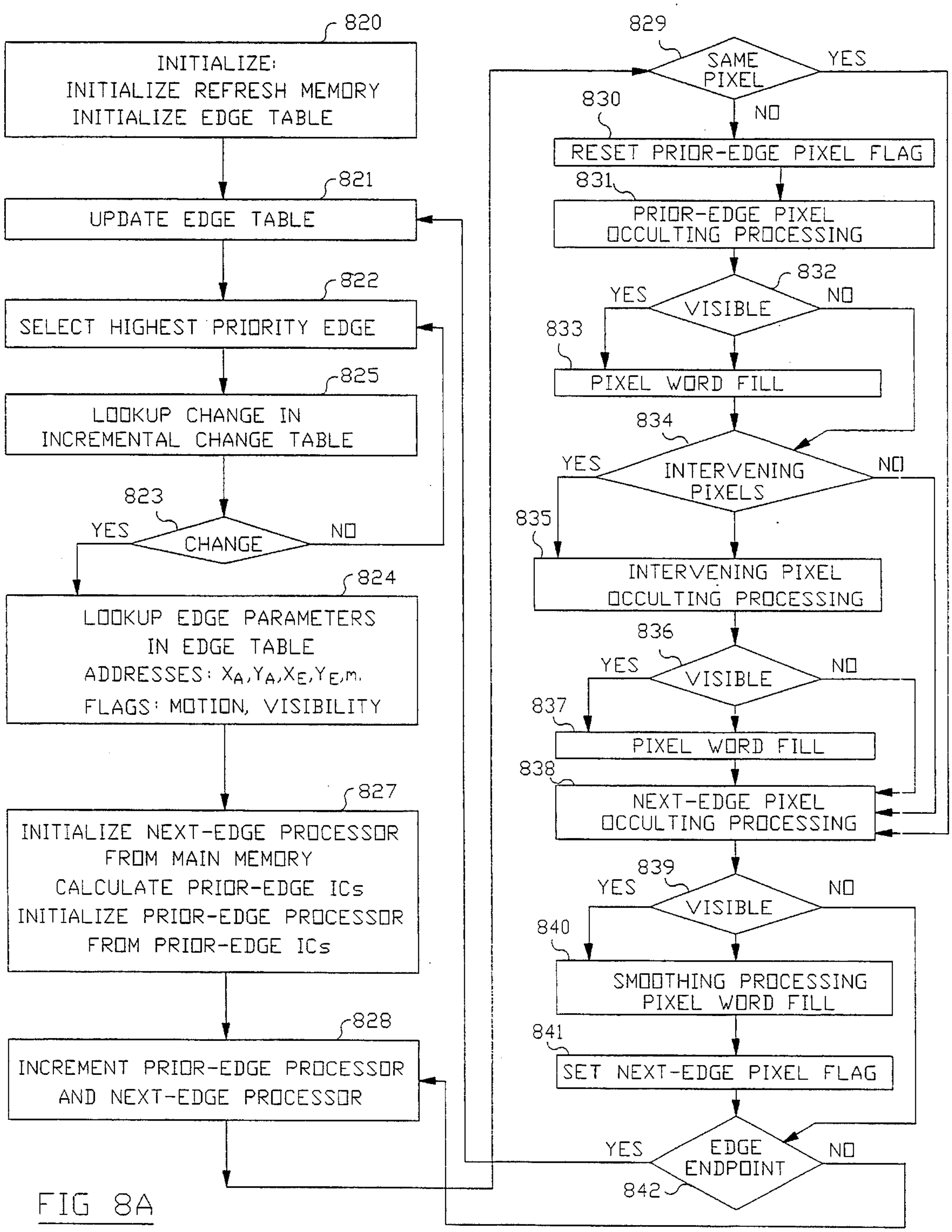
FIGS. 8A, 8B and 8C, shows various edge processor configurations, where

Edge Processor Operation (FIG. 8A)

Another configuration of edge processor operation will now be described with reference to FIG. 8A.

Edge processor operation is initiated in operation 820 including initializing the refresh memory and initializing the edge table. This initialization can be accomplished with the incremental initial condition driving functions, discussed herein with reference to FIG. 5, or with whole number initial condition generation, such as under control of supervisory processor 125. The highest priority edge can be identified in operation 822, such as by using priority processing as discussed herein. The edge is then processed in subsequent operations. Edge processor 131 then proceeds to operation 821 for updating the edge table with any new edges that have been selected.

Edge processor 131 executes operation 825 to lookup the edge in increment memory to determine if the edge has moved and therefore requires updating and a test thereof is made in operation 823. If the edge has not moved, indicated by the absence of a change increment in increment memory, processing loops back along the NO path from operation 823 to operation 822 to select another edge in accordance with the priority processing. If the edge has moved, indicated by the presence of a change increment in increment memory, processing proceeds along the YES path to lookup the edge parameters in the edge table in operation 824. The edge table is accessed for parameters of the selected edge for loading the edge processor, discussed herein with reference to FIG. 7A. The edge table may include addresses of edge parameter initial conditions; which may include actual position coordinates XA and YA corresponding to endpoint coordinates of the edge terminating at the surface vertex associated with the selected edge, addresses of the endpoint coordinates XE and YE for the selected edge, and the address of the slope m for the selected edge. These addresses may be the absolute addresses of these parameters in the incremental processor main memory. However, greater storage efficiency may be achieved using relative addressing and implicit addresses in a fixed format main memory arrangement. For example, a base address may be provided, where the addresses for the XA and YA parameters (the endpoint of the edge terminating thereon) for the XE and YE endpoints, and for the slope m of the selected edge may be provided. The X and Y coordinates and the slope of each edge may be fixed address locations relative to the base address.

The base address implementation can result in a saving of edge table memory requirements. For example, assuming a twenty bit address parameter for the memory, use of five absolute addresses would require 100-bits per edge and 200,000 bits for 2,000 edges in the edge table. However, use of the base address arrangement may require only two base addresses of 10-bits each, the base address for the terminating edge and the base address for the starting edge, thereby reducing edge table memory requirements to 20% of the above calculated amount.

The edge table may be updated consistent with the entering or removing of edges from the geometric processor main memory. For example, supervisory processor 125 may perform the initialization of the geometric processor main memory by loading edge-related information therein; where supervisory processor 125 may update the edge table cotemporaneously therewith.

The edge table may include other information, such as flags associated with the edge to identify if the edge is moving or visible. Such a motion flag may be set when a driving function is initiated for that object and may be reset when a driving function is discontinued for that object.

Edge processor 131 then proceeds to operation 827 to initialize the next-edge processor and the prior-edge processor. The next-edge processor is initialized from the new-edge conditions which can be accessed directly from the geometric processor main memory. However, the prior-edge parameters may no longer be available in the main memory, having been replaced by the next-edge parameters therein. Therefore, prior-edge parameters may be calculated from the next-edge parameters and the incremental changes by subtracting the incremental changes from the next-edge parameters. Alternately, prior-edge parameters can be stored in a buffer memory until processed with the edge processor to overcome the need to computationally rederive the prior-edge parameters.

Edge processor 131 then proceeds to operation 828, where the next-edge processor and prior-edge processor are double incremented to half-pixel resolution to obtain the subpixel quadrant and subpixel edge information for the pixel traversed to be used for area weighting information for edge smoothing. This double incrementing operation 828 steps the edge processor from pixel to pixel at half-pixel resolution. Edge processor 131 tests whether the next-pixel and prior-pixel are the same pixel in operation 829. If they are the same pixel, the processor branches along the YES path to operation 838, skipping processing of a different edge pixel and intervening pixel in operations 830 through 837. However, if they are not the same pixel, the processor branches along the NO path to operation 830 to initiate processing of a different edge pixel and of intervening pixels.

In operation 830, edge processor 131 accesses the prior-pixel word and resets the edge flag in the prior-pixel word; where the prior-pixel is no longer an edge pixel. Edge processor 131 then proceeds to operation 831, where occulting processing for the prior edge pixel is performed. Occulting processing is discussed herein, such as with reference to FIGS. 9 and 10. A determination is made in operation 832 from the occulting processing in operation 831 whether the prior edge pixel is visible or non-visible. If the prior edge pixel is non-visible, edge processor 131 proceeds along the NO path to test for intervening pixels in operation 834. If the prior edge pixel is visible, edge processor 131 proceeds along the YES path to fill the prior edge pixel in operation 833 and then to test for intervening pixels in operation 834. If visible, edge processor 131 determines which surface fills the prior edge pixel and loads the pixel word related thereto into the prior edge pixel in operation 833. Edge processor 131 then proceeds to operation 834 to determine whether intervening pixels between the prior-edge pixel and the next-edge pixel exists as a result of multi-pixel motion.

If intervening pixels do not exist, edge processor 131 proceeds along the NO path to operation 838 for next-edge pixel processing. If intervening pixels exist, edge processor 131 proceeds along the YES path performing operations 835–837 to process the intervening pixels and then proceeds to process the next-edge pixel in operation 838. Edge processor 131 proceeds to operation 835, where occulting processing for the intervening pixels is performed. A determination is made in operation 836 from the occulting processing in operation 835 whether the intervening pixels are visible or non-visible. Occulting processing is discussed herein, such as with reference to FIGS. 9 and 10. If intervening pixels are non-visible, edge processor 131 proceeds along the NO path to operation 838 for next-edge pixel processing. If intervening pixels are visible, edge processor 131 proceeds along the YES path to fill the intervening pixels in operation 837 and then to process the next-edge pixel in operation 838. If visible, edge processor 131 determines which surface fills the intervening pixels and loads the pixel word related thereto into the intervening pixels in operation 837.

The processing of a next-edge pixel is performed with operations 838 to 841. Edge processor 131 proceeds to operation 838, where occulting processing for the next pixel is performed. A determination is made in operation 839 from the occulting processing in operation 838 whether the next-edge pixel is visible or non-visible. Occulting processing is discussed herein such as with reference to FIGS. 9 and 10. If the next-edge pixel is non-visible, edge processor 131 proceeds along the NO path to operation 842 to test the edge endpoint for looping back to process another pixel or to terminate operations for this edge. If the next-edge pixel is visible, edge processor 131 proceeds along the YES path to perform smoothing in operation 840 and then to test for completion of processing of the edge in operation 842. Smoothing operations are discussed herein, such as with reference to FIGS. 11 and 12. Edge processor 131 then proceeds to operation 841 to set the pixel flag in the next-edge pixel word. Edge processor 131 then proceeds to operation 842 to determine if this pixel is an edge endpoint pixel. If not, edge processor 131 proceeds along the NO path to operation 828 to again increment the edge processors to the next edge pixel for processing thereof with operations 829 to 841.

Edge processor 131 continues to iterate through operations 828–842 for each sequential pixel along the edge until the edge endpoints for the prior edge and the next-edge have been reached. At that time, edge processor 131 proceeds along the YES path from operation 842 back to operation 821 for updating the edge table and for selecting and processing another edge.

Figures 1, 8B:
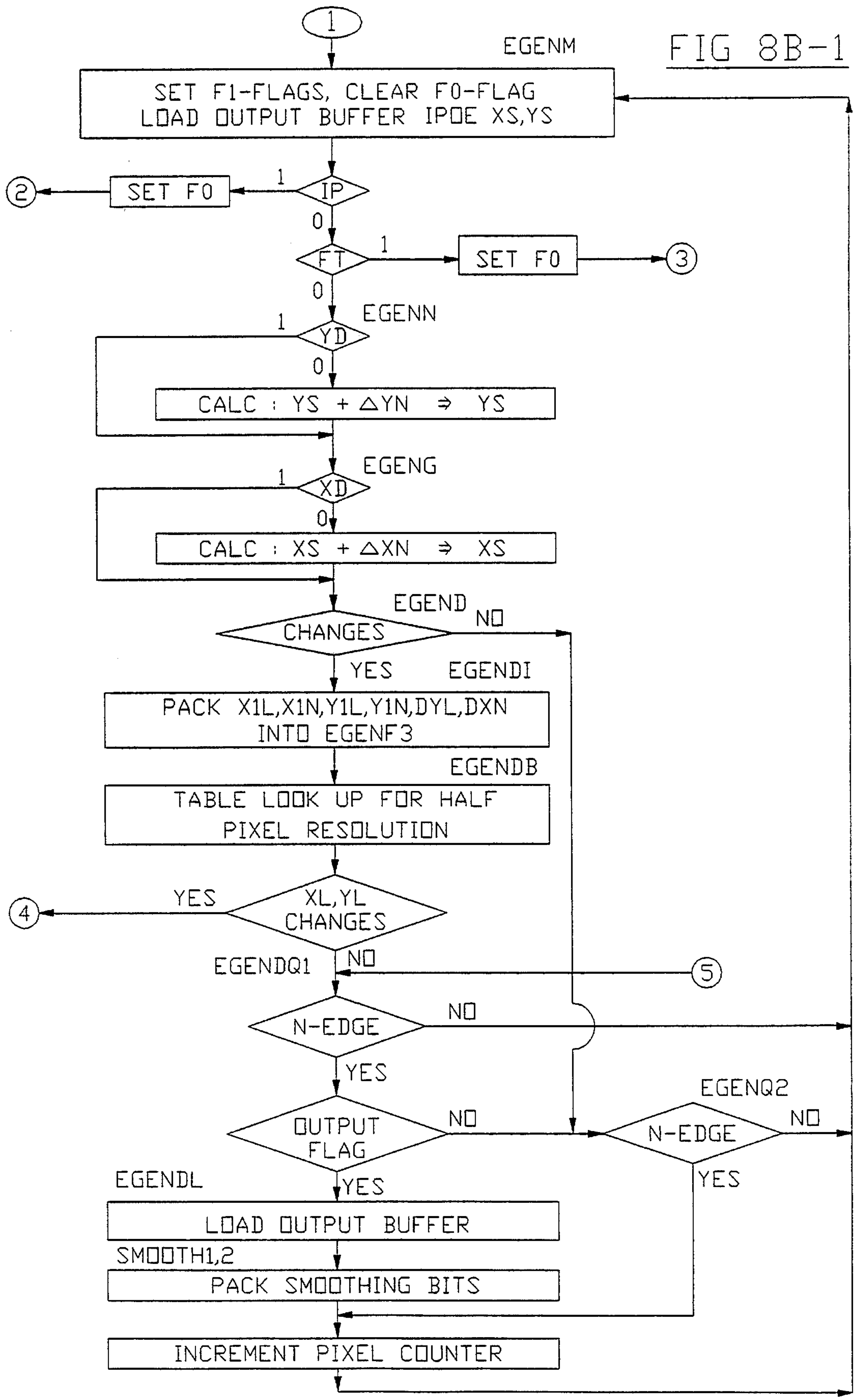
FIG. 1, comprising
Figures 2, 8B:
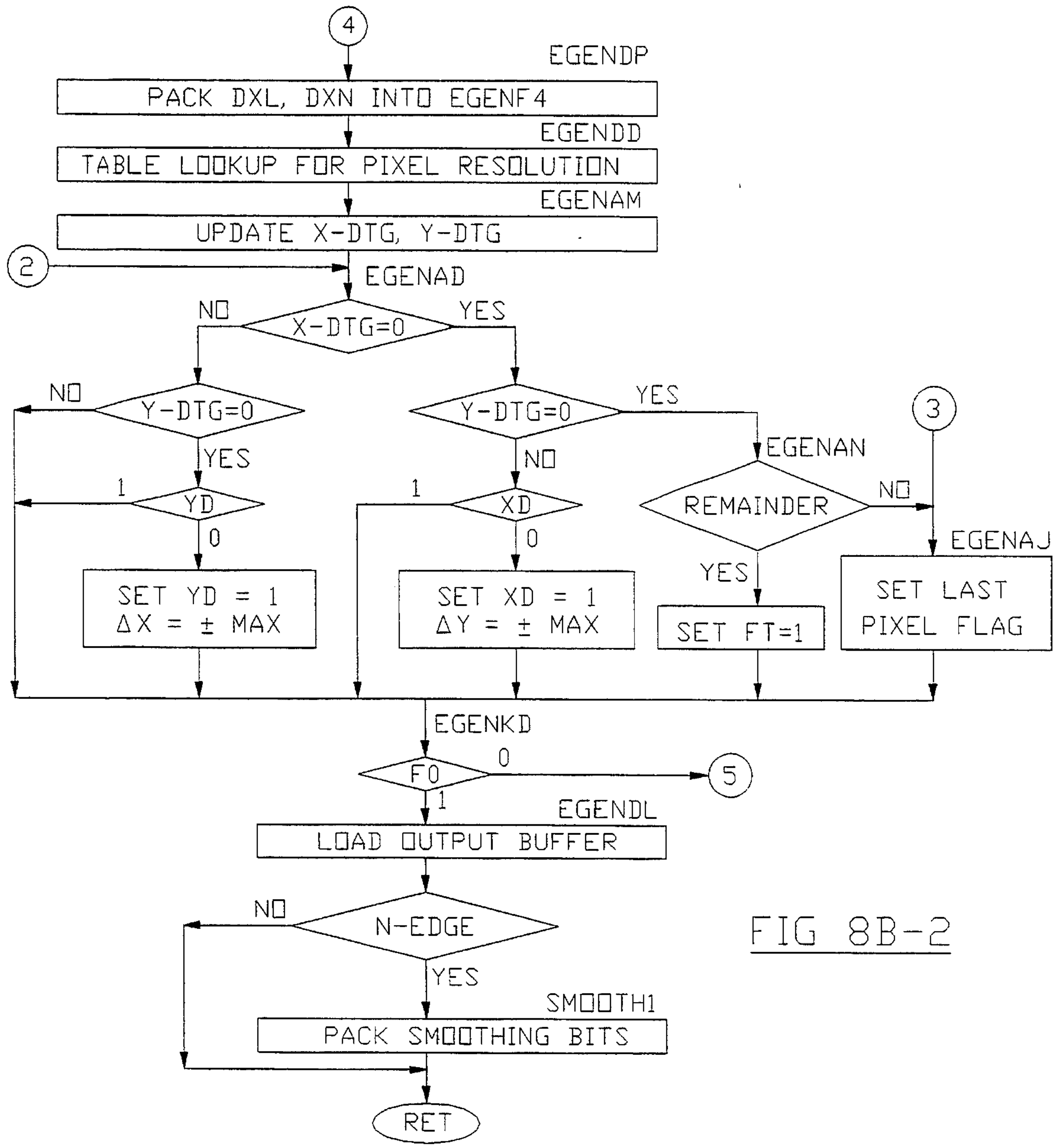
FIG. 2 is a block diagram and schematic representation of a program controlled configuration.
Figures 1, 8C:
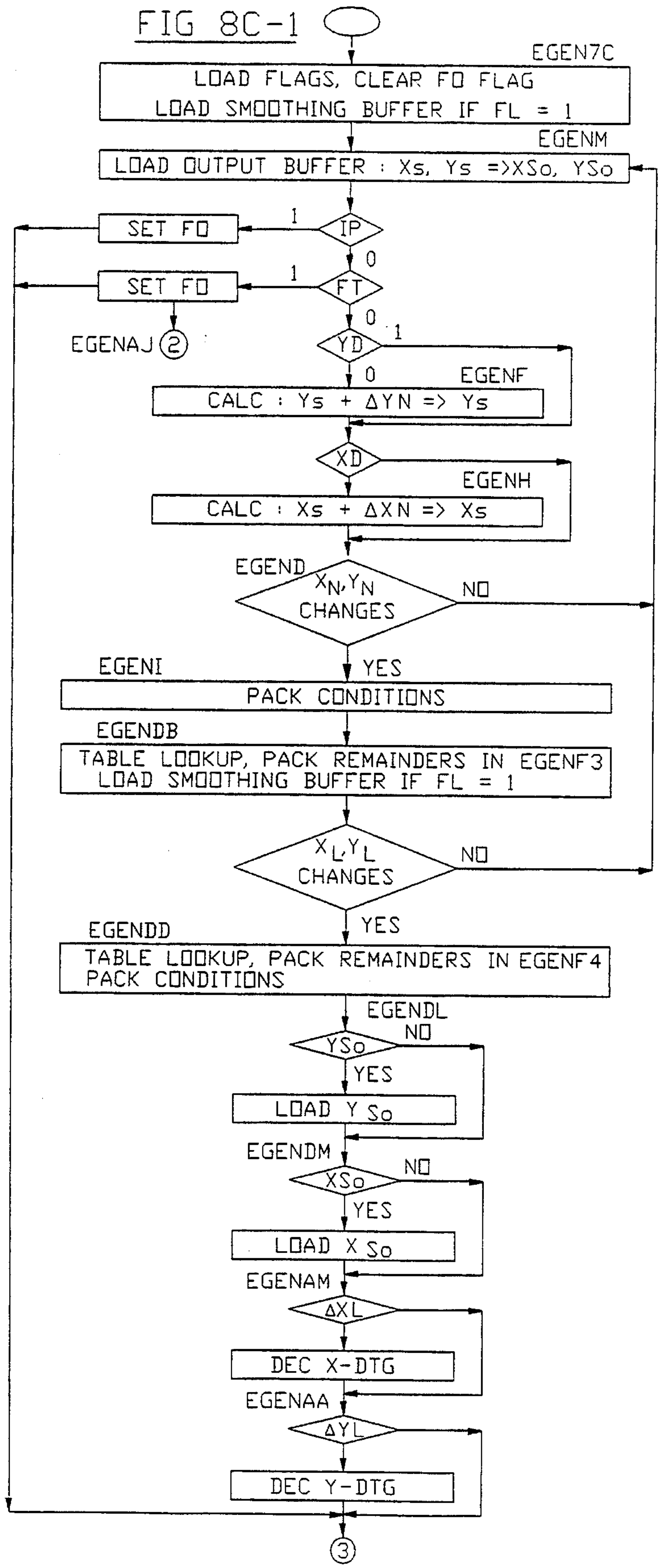
Figures 2, 8C:
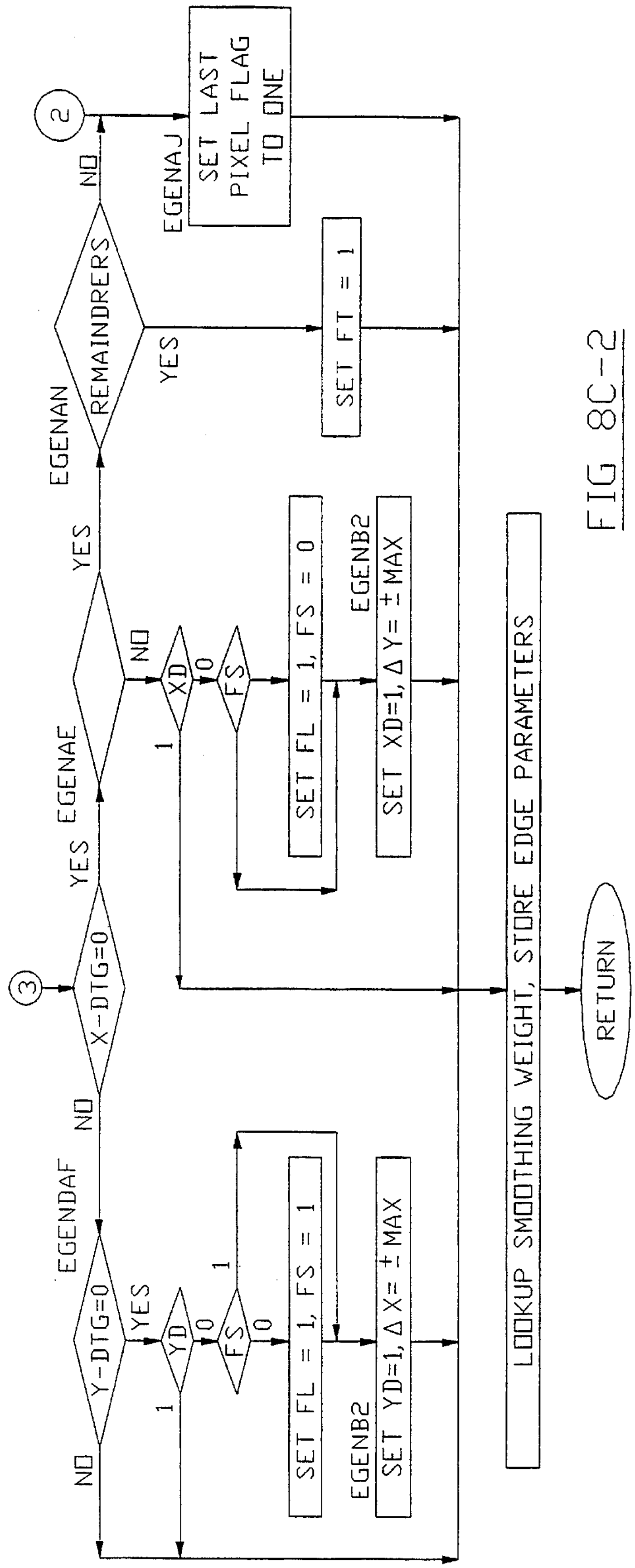

Alternate Edge Processor Configurations (FIGS. 8B and 8C)

Alternate edge processor configurations are shown in FIGS. 8B and 8C, where many of the elements in FIGS. 8B and 8C are similar to elements already described in detail with reference to FIG. 7C. FIGS. 8B and 8C show an edge processor arrangement for dual loop processing, where an inner loop is provided for half pixel iterations and an outer loop is provided for pixel resolution iterations. Inner loop operations are shown within FIGS. 8B and 8C. Outer loop operations are shown exiting from the bottom of FIGS. 8B and 8C to return to the executive processor, discussed with reference to FIG. 4 above, for completing outer loop operations. FIGS. 8B and 8C illustrate different methods of performing the processing and of partitioning the processing previously discussed with reference to FIGS. 4 and 7C. However, the similarities between the processing previously discussed in detail with reference to FIGS. 4 and 7C and the processing shown in FIG. 8B and 8C permits one skilled in the art to readily understand the arrangements shown in FIGS. 8B and 8C.

Smoothing Processor (FIGS. 11 and 12)

Figure 11A:
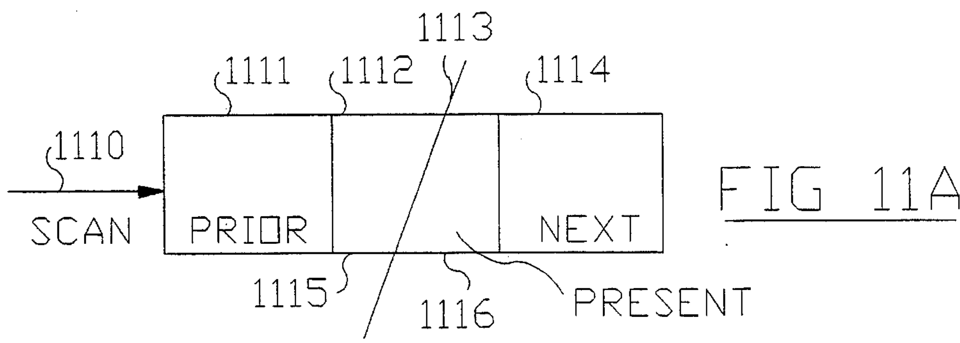

Introduction (FIG. 11A)

Edge smoothing is a technique used to reduce aliasing, such as staircasing, associated with discontinuities in a raster scan in order to generate a smooth edge. In one configuration, edge smoothing can be implemented as an area weighting and mixing of colors of adjacent surfaces. A determining is made of how an edge divides a pixel into areas. This determination can be made to sub-pixel resolution. The color of that pixel is then derived as a function of the percentages of area of that pixel contained in each of the adjacent surfaces. For example, if an edge splits a pixel into ⅓ and ⅔ area portions, the color of the pixel is a weighted sum of the colors of the two adjacent surfaces, being ⅓ of the surface color having the smaller area and ⅔ of the surface color having the greater area of the pixel. Color weighting by area reduces aliasing and provides a smooth edge to good resolution. The visual effect can be excellent.

Edge smoothing is provided in most CIG systems. It is conventionally implemented as an independent operation, having special dedicated edge smoothing logic. In the present invention, edge smoothing may be implemented as an auxiliary operation to edge and fill processing. In one configuration, fill processing is an edge-related operation. Therefore, edge smoothing may be a simple addition to fill processing. Also, edge smoothing need not be regenerated for non-moving edges; where previously established edge smoothing for stationary edges can be reused. Therefore, edge smoothing may be significantly simpler than in conventional visual systems.

Edge smoothing may be implemented in conjunction with fill processing. Only edges that have changed need smoothing processing. Static edges need not have smoothing processing, being able to re-use the previously derived smoothing parameters. Edges having changes may be identified with changes derived in geometric processor 130. During fill processing for a pixel, the pixel areas covered by the two adjacent surfaces, determined by the sub-pixel resolution of the edge in that pixel, can be used to establish area weighting. A smoothing parameter can be stored in the pixel word in refresh memory 116 for each edge pixel. Edge pixels need not have surface fill parameters stored therein because the parameters may be a weighted average of the parameters of the two adjacent surfaces forming the edge. Therefore, a weighting parameter can be stored in the edge pixel word. The edge flag in the flag field can be set as indicative of an edge pixel requiring smoothing. A buffer register and look ahead arrangement can be used to simultaneously provide the prior pixel color byte, the present pixel color byte, and the next pixel color byte. The prior pixel and next pixel color bytes can be weighted with the area byte to form the present pixel color byte. Alternately, smoothing can be performed in conjunction with occulting processing with selective accessing of pixels adjacent to the edge.

Edge smoothing is discussed herein in a digital configuration in the section entitled Digital Edge Smoothing and in a hybrid configuration in the section entitled Display Interface, sub-section Hybrid Edge Smoothing.

Edge smoothing is implemented in the prior art in various forms. One prior art embodiment of edge smoothing involves variations in color of a pixel to facilitate smoothing of the relatively low resolution pixels with a color-related interpolation. Improvements thereon in accordance with the present invention will now be described.

Incremental motion often involves sub-pixel motion; where an object may move one pixel or less per frame and therefore may involve changing of sub-pixel color within the same pixel more often than moving to another pixel. However, for higher speed motion, such as for a high speed aircraft, multiple pixel per frame motion may be encountered.

Motion of a single pixel per frame will now be calculated as a reference. A system having a 525 by 525 pixel screen and a thirty frame per second refresh will cause an object moving at one pixel per frame to traverse the screen 17.5 seconds (525 pixels/30 frames/second). An object moving slower than this rate will exhibit sub-pixel motion per frame. An object moving faster then this rate will exhibit pixel multiple pixel motion per frame. For objects having sub-pixel motion, incremental changes of less than one pixel may simplify occulting processing.

For the case of a stationary observer, smoothing for the stationary objects in the environment may only have to be calculated once as initial conditions. Then, the changes in the scene may be caused by incremental motion of moving objects. However, observer motion causes relative motion of stationary objects because observer motion is provided by changing the observer's translational and orientational position relative to the scene and, therefore, changing the positions and orientations of stationary objects relative to the observer. Consequently, observer motion involves relative motion of stationary objects, necessitating additional processing. However, unless the observer is rapidly turning or rapidly translating, relative motion 0f many objects in the scene may be sub-pixel motion.

Edge smoothing can be a relatively low resolution computation, such as a 3-bit computation; which may be compared to the 12-bit, 16-bit, and 24-bit processing performed in supervisory processor 125 and geometric processor 130. A low resolution scaling multiplication or division is relatively simple to implement. A low resolution multiplier can be used to area-weight the three colors of each of the adjacent pixels with the respective edge pixel area weighting number. A parallel adder can be used to add each of the three pairs of area-weighted color bytes to derive the three smoothed color bytes of the edge pixel and the three smoothed color bytes can be stored in the edge pixel word in refresh memory 116.

Weighted color parameters stored in an edge pixel can be recognized with the edge flag in the edge pixel word being set. The edge flag and weighted color parameters can be stored in the pixel word as an edge progresses into a pixel and can be removed to a non-smoothed non-edge pixel word as the edge passes beyond that pixel in successive frames.

Edge smoothing can be performed during refresh memory updating. Edge processor 131 identifies edge pixels for updating. Occulting processor 132 determines occulting, such as filling of pixels that are entered and vacated by moving edges. Smoothing processor 132 determines smoothing of edges newly filling pixels. In one configuration (FIG. 11C), edge processor 131 first identifies an edge pixel for processing, occulting processor 132 then performs occulting processing for that identified pixel, and smoothing processor 133 then performs smoothing processing for the new occulting surface conditions for that identified edge pixel. Edge processor 131 is then incremented to iteratively step to the next pixel. For half-pixel resolution, edge processor 131 may be double incremented to iteratively step to quadrants of the next pixel at half-pixel resolution. Buffer registers may be used to buffer edge and quadrant information for edge processing, including occulting and smoothing processing.

One edge smoothing configuration uses area weighting for color. As shown in FIG. 11A, edge 1113 divides pixel 1112 into two pixel areas 1115 and 1116. Colors of adjacent pixels 1111 and 1114 are mixed in the portions of divided pixel areas 1115 and 1116. For example, if a surface associated with prior pixel 1111 covers a first area portion 1115 of divided edge pixel 1112 and if a surface associated with a next pixel 1114 covers a second area portion 1116 of divided edge pixel 1112; the color of prior pixel 1111 is weighted in proportion to the size of the first area 1115 and the color of the next pixel 1114 is weighted in proportion to the size of the second area 1116 and the weighted colors are mixed to obtain the smoothed color of edge pixel 1112. Alternate methods of edge smoothing are described below.

Edge smoothing terminology will now be discussed with reference to FIG. 11A. Scan 1110 progresses from left to right along a scan line traversing prior pixel 1111 immediately prior to the edge pixel 1112, traversing edge pixel 1112 divided by edge 1113, and then traversing next pixel 1114 following edge pixel 1112. Edge 1113 divides edge pixel 1112 into two areas 1115 and 1116 comprising prior area 1115 adjacent to prior pixel 1111 and next area 1116 adjacent to next pixel 1114. Relative areas of prior area 1115 and next area 1116 are important for certain edge smoothing configurations. They may be determined with the arrangement discussed with reference to FIG. 11C. Prior area 1115 and next area 1116 are so named because of adjacencies to prior pixel 1111 and next pixel 1114. The size of prior area 1115 determines color weighting of the color of prior pixel 1111 that will be contributed to the color of edge pixel 1112 and the size of next area 1116 determines color weighting of the color of next pixel 1114 that will be contributed to the color of edge pixel 1112.

A hybrid method of edge smoothing uses an area or weight byte stored in the edge pixel word. The area byte is used to weight the color bytes of prior pixel 1111 and next pixel 1114 using circuitry in display interface 118, such as multiplying DACs, to obtain a smoothed color for edge pixel 1112.

A digital method of edge smoothing can also use an area byte for weighting of and summing of color bytes of prior pixel 1111 and next pixel 1114, performed digitally in the smoothing logic. The smoothed color may then be stored in the edge pixel word in refresh memory 116 for subsequent conversion to analog form with color DACs in display interface 118.

Various processing methods can be used to determine the area weighting byte for an edge pixel. In one arrangement discussed below with reference to FIG. 11B, a logical combination of subpixel quadrants, subpixel quadrant boundaries, and subpixel coordinates can be used to determine the area weighting byte. In another arrangement, the slope of the edge and the pixel entry and exit points can be used to determine the area weighting byte. In yet another arrangement, edge processor 131 operation to subpixel resolution can traverse a pixel to subpixel resolution, dividing the pixel into different areas; which areas can be used to weight colors for edge smoothing. Other arrangements can also be used.

Figure 11B:
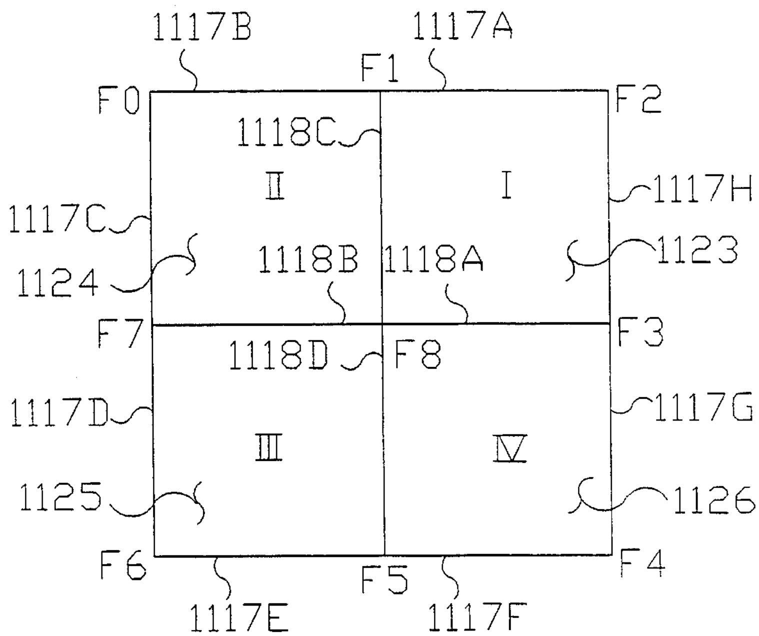

Quadrant Area Weighting (FIG. 11B)

A configuration of a smoothing processor using half-pixel resolution will now be discussed. Edge processor 131 can be implemented to operate with a resolution that has an additional least significant bit below the pixel resolution. Therefore, edge processor 131 can divide each pixel into sub-pixel quadrants, shown in FIG. 11B; which are quadrant-I 1123, quadrant-II 1124, quadrant-III 1125 and quadrant-IV 1126. Each quadrant is bounded by four quadrant boundaries, which provide twelve unique non-redundant boundaries 1117A to 1117H and 1118A to 1118D including eight non-shared boundaries 1117A to 1117H around the outer periphery of edge pixel 1112 and four shared boundaries 1118A to 1118D within edge pixel 1112. The-manner in which an edge traverses quadrants 1123 to 1126 and the quadrant boundaries 1117A to 1117H and 1118A to 1118F establishes the relative areas of prior area 1115 and the next area 1116. As edge processor 131 traverses an edge pixel to half-pixel resolution, the X and Y increments processed by edge processor 131 define the boundaries traversed and the X and Y numbers processed by the edge processor 131 define the quadrants traversed.

As discussed with reference to FIG. 11B, an edge may be generated to half-pixel resolution to divide a pixel into quadrants using edge processor 131. Interception of quadrants and quadrant boundaries with edge 1113 establishes pixel areas 1115 and 1116 to acceptable resolution and precision. Output signals 136 from edge processor 131 may b e processed with a quadrant and boundary area detector 1130 (FIG. 11C) to detect the pixel quadrants and boundaries traversed by the edge. The twelve pixel quadrant edges and the four quadrants can be assigned binary signal lines 1131 which can be one-set for traversing of a related quadrant or boundary with edge 1113 and can be zero-set for not traversing of a related quadrant of boundary with edge 1113; as determined by quadrant and boundary detector 1130. The 16 quadrant and boundary signals 1131 access decoder 113 for encoding of the 16 signals for conversion into edge pixel area bytes 1133 with decoder 1132. Decoder 1132 may be implemented as a 16-bit bit input ROM having 65,536 internal conditions; implicit in the 16-bit input lines.

Many of these input conditions are "don't care" conditions because the combination of certain quadrants and boundaries cannot exist for an edge traversing an edge pixel. However, for simplicity of illustration, a 16-bit ROM is discussed. The resultant area weighting parameter can be used for edge smoothing, such as digital edge smoothing (FIG. 11C) or hybrid edge smoothing (FIG. 16A).

Figure 11D:
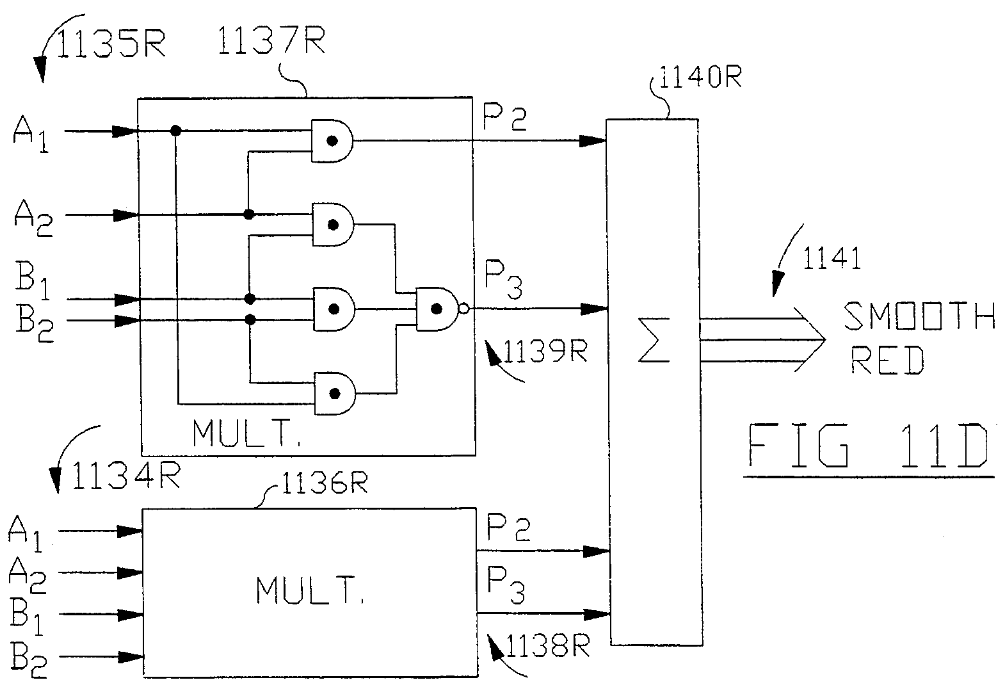
Figure 11C:
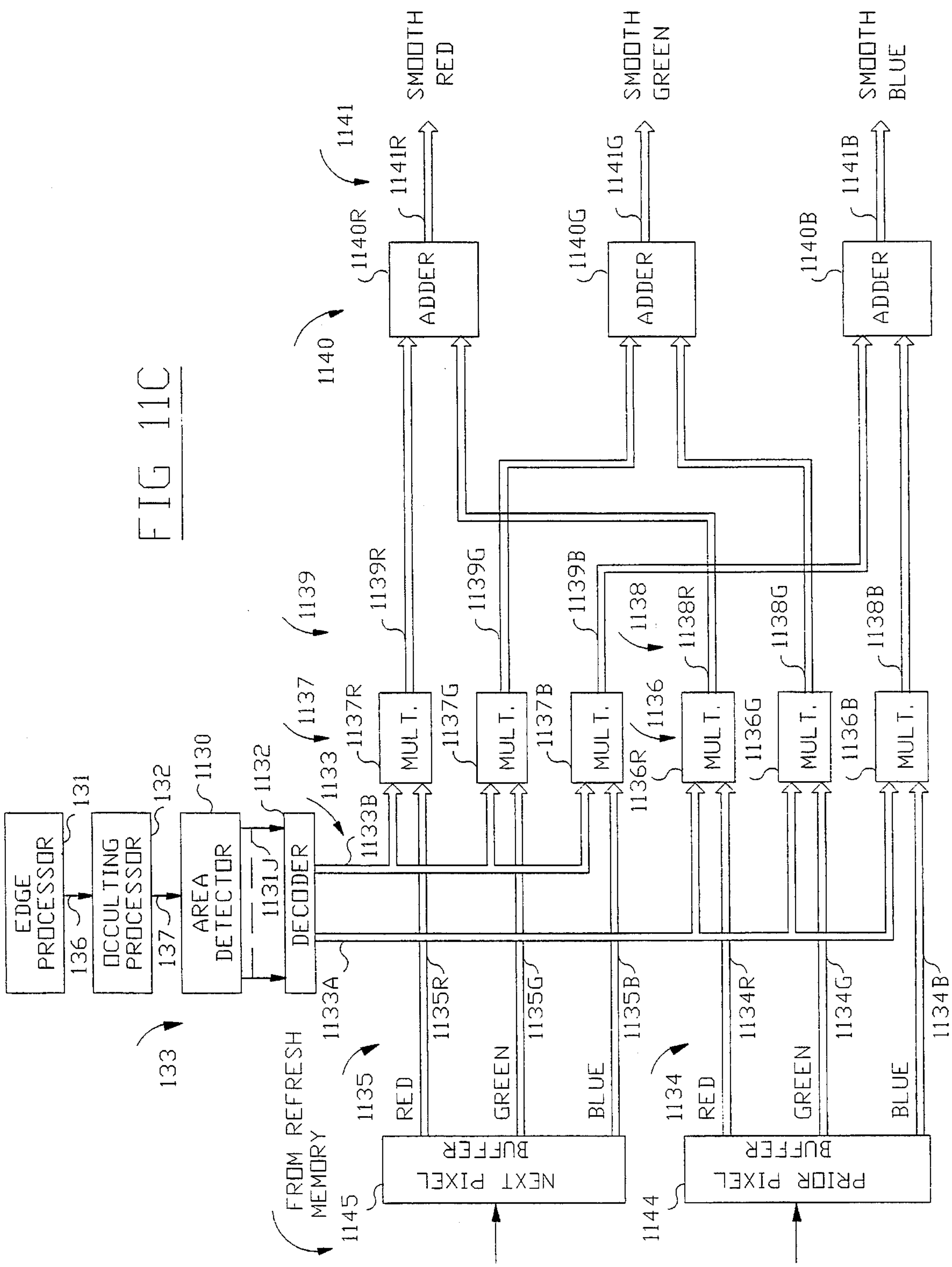

Digital Edge Smoothing (FIGS. 11C and 11D)

One configuration of digital edge smoothing will now be discussed with reference to FIG. 11C. As discussed herein, such as with reference to FIG. 11B, an area weighting byte can be derived relative to the areas that an edge divides a pixel. Output signals 136 from edge processor 131 may be processed with area detector 1130 to derive pixel areas generated by edge 1113. The area-related conditions 1131 can access decoder 1132 for encoding of signal 1131 for conversion into edge pixel area bytes 1133 with decoder 1132. Decoder 1132 may be implemented as an ROM for table look-up type decoding. Area bytes 1133 from decoder 1132 may include prior area byte 1133A representative of prior area 1115 and next area byte 1133B representative of next area 1116 of the pixel. Prior area 1115 is the area adjacent to prior pixel 1111 and next area 1116 is the area adjacent to next pixel 1114 (FIG. 11A). Area bytes 1133A and 1133B may be complement signals, where next area byte 1133B may represent the balance of the edge pixel area not covered by the prior area byte 1133A. However, in an alternate configuration, decoder 1132 can generate a single one of the two sets of area bytes 1133A and 1133B and a complement circuit such as a subtractor circuit can be used to generate the second of the two sets of area bytes 1133A and 1133B.

For a configuration where an area weighting byte is stored in the edge pixel word, area bytes 1133 from decoder 1132 can be stored therein. For a configuration where the smoothed color byte is stored in the edge pixel word, prior pixel color byte 1134 and next pixel color byte 1135 can be processed with area bytes 1133A and 1133B respectively using multipliers 1136 and 1137 respectively and adders 1140 to generate smoothed color byte 1141 for storage in the edge pixel word.

Multipliers 1136 multiply prior area byte 1133A by prior pixel color byte 1134 to derive weighted prior pixel color byte 1138 and multipliers 1137 multiply next area byte 1133B by next pixel color byte 1135 to derive weighted next pixel color byte 1139. The corresponding color nibbles 1138R, 1138G, and 1138B from prior pixel weighted color byte 1138 and the corresponding color nibbles 1139R, 1139G, and 1139B from next pixel weighted color byte 1139 are added with adders 1140R, 1140G, 1140B respectively to obtain smoothed color nibbles 1141R, 1141G, 1141B respectively.

Processing of each of the three channels of color nibbles is similar. Therefore, operation will be described for the red channel as an exemplary of each of the three (red, green, and blue) channels. Red prior pixel multiplier 1136R multiplies prior area byte 1133A by red prior pixel nibble 1134R from the prior pixel subfield to obtain weighted red prior pixel nibble 1138R. Red next pixel multiplier 1137R multiplies next area byte 1133B by red next pixel nibble 1135R from the next pixel subfield to obtain weighted red next pixel nibble 1139R. Weighted red prior pixel nibble 1138R and weighted red next pixel nibble 1139R are summed together with adder 1140R to generate smoothed edge red nibble 1141R for storage in the red subfield of the edge pixel word. Similarly, green prior pixel nibble 1134G and blue prior pixel nibble 1134B are multiplied by prior pixel area byte 1133A using multipliers 1136G and 1136B respectively to generate green prior pixel weighted nibble 1138G and blue prior pixel weighted nibble 1138B respectively. Similarly, green next pixel nibble 1135G and blue next pixel nibble 1135B are multiplied by next pixel area byte 1133B using multipliers 1137G and 1137B respectively to generate green next pixel weighted nibble 1139G and blue next pixel weighted nibble 1139B respectively. Green prior pixel weighted nibble 1138G is added to green next pixel weighted nibble 1139G with adder 1140G to generate smoothed green nibble 1141G for storage in the edge pixel word green color subfield and blue prior pixel weighted nibble 1138B is added to green next pixel weighted nibble 1139B with adder 1140B to generate smoothed blue nibble 1141B for storage in the edge pixel word blue color subfield.

Next pixel color byte 1135 and prior pixel color byte 1134 can be accessed from refresh memory 116 and stored in next pixel buffer register 1145 and prior pixel buffer register 1144 respectively. Smoothed color 1141 can be stored into the present pixel word in refresh memory 116.

Edge smoothing is an approximation method to minimize effects of aliasing, such as staircase effects. Therefore, it is often not necessary to process edge smoothing to high resolution. Considering three color nibbles each having 3-bits of resolution, the total color resolution maybe considered to be 9-bits. Therefore, smoothing of each color nibble to approximately 3-bits resolution may provide high resolution color. If some processing latitude is taken to approximate edge smoothing, the effects thereof may merely be a minor imperfection in smoothing. This imperfection may appear as a slightly imperfect straight edge. However, second or third order imperfections in the straightness of an edge may be unnoticeable or may enhance visual cues, similar to the manner in which textures enhance visual cues. However, such an approximation is certainly a significant improvement over non-smoothed implementations. For example, low resolution smoothing processing may provide good quality smoothing at very low cost, while high resolution smoothing processing may provide a virtually unnoticeable improvement over the alternate low resolution implementation and the high resolution smoothing processing may have a significantly higher cost than the low resolution implementation. For example, a low resolution smoothing implementation may provide 90% of the visual quality of a high resolution smoothing implementation at one-quarter of the cost of the high resolution smoothing implementation. Therefore, the lower quality may be permissible in view of the lower cost. One implementation based upon such an approximation will now be discussed with reference to FIGS. 11C and 11D and the multiplication table hereinafter.

The arrangement shown in FIG. 11C may appear to be implementable with 3-bit input multipliers 1136 and 1137 for each input nibble, resulting in 6-bit product nibbles 1138 and 1139 and consequently a 7-bit sum nibble 1141 in accordance with arithmetic build up of resolution through multiplication and addition. However, smoothed nibbles 1141 need only be 3-bit nibbles because of the 3-bit resolution for color nibbles in the refresh memory and the display interface. Therefore, working backwards from the 3-bit resolution of smoothed nibbles 1141 2-bit resolution nibbles 1138 and 1139 may be acceptable because addition of two 2-bit nibbles may provide 3-bit sum nibbles. Therefore, 2-bit resolution or less may be permissible for signals 1133, 1134, and 1135 input to multipliers 1136 and 1137; facilitating economy of logical circuitry. For example, detector 1130 and decoder 1132 may only have to derive area weighting signal 1133 to 2-bits of resolution, which represents a very simple implementation thereof. Further, multipliers 1136 and 1137 having a pair of 2-bit input nibbles and a 2-bit output nibble can be implemented with relatively simple circuitry.

One implementation of multipliers 1136 and 1137 will now be discussed with reference to the Multiplication Table and the logical equations for P2 and P3 set forth hereafter. The first 2-bit input nibble input-1 comprises binary signals $A_1$ and $B_1$ and the second 2-bit input nibble input-2 comprises binary signals $A_2$ and $B_2$; where A is the MSB and B is the LSB. The product of the input-1 nibble and the input-2 nibble is listed in the Normal Product column in both, decimal form and binary form. This product nibble may have greater resolution than necessary, shown represented with 4-binary bits $P_1$ to $P_4$ to provide products from 0 to 9, decimal. Therefore, it may be permissible to roundoff the 4-bit binary numbers to achieve the 2-bit binary product discussed above. In order to reduce the resolution in a way consistent with simplified logic and desired operation, the term 5 is roundedoff high and the term 15 is roundedoff low, as shown in the binary Approximation Product column. Then, the MSB ($P_1$) and the LSB ($P_4$) are dropped, leaving the second and third bits $P_2$ and $P_3$ respectively, as shown in the binary Roundoff Product column. Logical implementation of the rounded off product is shown as the P2 and P3 equations.

$$P_2=(A_1 \cdot A_2)$$

$$P_3=(A_2 \cdot B_1)+(B_1 \cdot B_2)+(A_1 \cdot B_2)$$

Implementation of these two equations ($P_2$ and $P_3$) to provide multiplication circuits and combination therewith for smoothing will now be discussed with reference to FIGS. 11C and 11D for the red channel smoothing, which is representative of green and blue channel smoothing. The logical diagram shown in multiplier block 1137R (FIG. 11D) is a logical implementation of the $P_2$ and $P_3$ logical equations. This arrangement may be replicated to implement the six multiplication blocks 1136 and 1137 (FIG. 11C) such as for multiplication blocks 1136R and 1137R (FIG. 11D). The 2-bit product output nibbles 1138R and 1139R from multiplication circuits 1136R and 1137R respectively are summed with adder 1140R to generate 3-bit red color nibble 1141R similar to that discussed for FIG. 11C. As discussed for the simplified multiplication circuit above, adders 1140 may also be configured as simplified adders using similar logical design techniques. Alternately, multipliers 1136 and 1137 may be high speed ROM multipliers or other known multipliers in place of the multiplier arrangements shown in FIG. 11D and adders 1140 may be known integrated circuit adders. Other types of components and other resolutions and configurations may be used in accordance with the broader teachings of the present invention to implement smoothing.

In an alternate configuration, the amount of approximation may be reduced. For example, input signals 1133, 1134, and 1135 may be processed with multipliers 1136 and 1137 having 3-bit by 3-bit input nibbles and generating 6-bit output nibbles 1138 and 1139 to 6-bit by 6-bit adder circuits 1140 which may generate high resolution smoothed output signals 1141, which may be rounded off to 3-bit resolution.

Detector 1130, decoder 1132, multipliers 1136 and 1137, and adder 1140 arrangements may be implemented with SSI and MSI circuits such as illustrated in FIG. 11D, or with LSI circuits such as are implemented with well known multiplication circuits, or with other arrangements. However, simplified implementations of detector 1130, decoder 1132, multipliers 1136 and 1137, and adders 1140 such as discussed for multipliers 1137R (FIG. 11D) may be provided and may be implemented with custom circuits such as custom gate arrays, custom LSI, and custom VLSI.

provided for weighting of programmable intensity and range variable intensity, included in decoder 1132. Alternately, incorporation of programmable intensity, range variable intensity, and other parameters in digital, hybrid, and analog smoothing processors may also be provided.

Figure 11E:
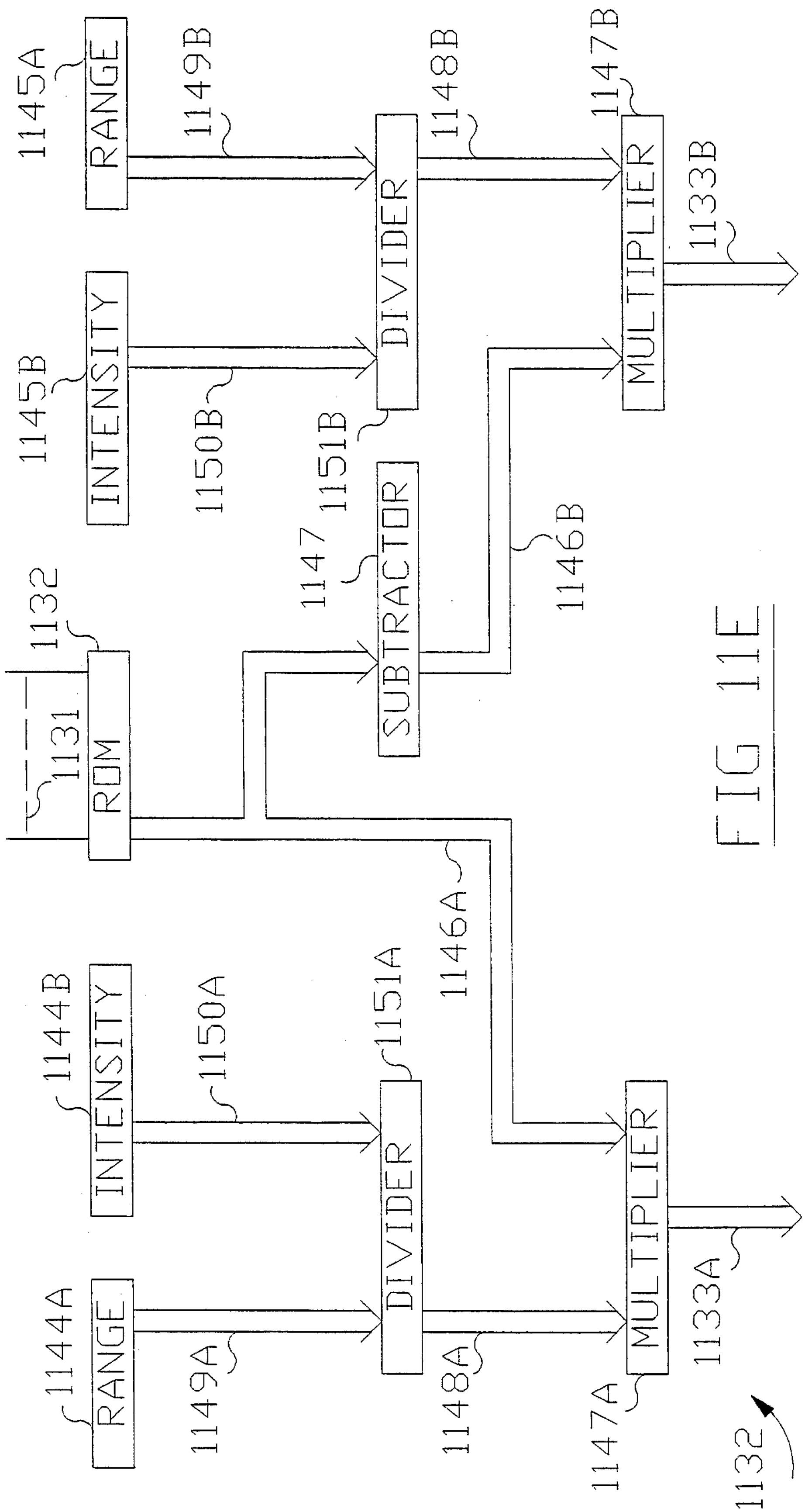

A digital smoothing processor configuration will now be discussed with reference to FIG. 11E, illustrating weighting of programmable intensity and range variable intensity that can be used in combination with the weighting of colors discussed above with reference to FIG. 11C. For convenience of illustration, this intensity weighting configuration is shown in FIG. 11E implemented within decoder 1132. However, other configurations thereof, such as placing of

MULTIPLICATION TABLE

| | | | PRODUCT | | | |
|---|---|---|---|---|---|---|
| TERM | INPUT · 1 $A_1$ $B_1$ (BINARY) | INPUT · 2 $A_2$ $B_2$ (BINARY) | NORMAL (DECIMAL) | NORMAL $P_1$ $P_2$ $P_3$ $P_4$ (BINARY) | APPROX. $P_1$ $P_2$ $P_3$ $P_4$ (BINARY) | ROUNDOFF $P_2$ $P_3$ (BINARY) |
| 0 | 00 | 00 | 0 | 0000 | 0000 | 00 |
| 1 | 00 | 01 | 0 | 0000 | 0000 | 00 |
| 2 | 00 | 10 | 0 | 0000 | 0000 | 00 |
| 3 | 00 | 11 | 0 | 0000 | 0000 | 00 |
| 4 | 01 | 00 | 0 | 0000 | 0000 | 00 |
| 5 | 01 | 01 | 1 | 0001 | 0010 | 01 |
| 6 | 01 | 10 | 2 | 0010 | 0010 | 01 |
| 7 | 01 | 11 | 3 | 0011 | 0011 | 01 |
| 8 | 10 | 00 | 0 | 0000 | 0000 | 00 |
| 9 | 10 | 01 | 2 | 0010 | 0010 | 01 |
| 10 | 10 | 10 | 4 | 0100 | 0100 | 10 |
| 11 | 10 | 11 | 6 | 0110 | 0110 | 11 |
| 12 | 11 | 00 | 0 | 0000 | 0000 | 00 |
| 13 | 11 | 01 | 3 | 0011 | 0011 | 01 |
| 14 | 11 | 10 | 6 | 0110 | 0110 | 11 |
| 15 | 11 | 11 | 9 | 1001 | 0111 | 11 |

Illumination Effects

Various configurations of smoothing processors have been described herein to illustrate edge smoothing in accordance with the present invention. A digital smoothing processor is discussed with reference to FIG. 11C to illustrate area weighting of colors for smoothing. Weighting of other parameters, such as programmable intensity and range variable intensity, have not yet been discussed with reference to FIG. 11C for simplicity of illustration. A configuration will now be discussed illustrating weighting of other parameters with reference to FIG. 11C for digital smoothing.

Discussions of edge smoothing, such as relative to FIG. 11C herein, are related to RGB color bytes for simplicity of discussion. Alternately, these color bytes may already include intensity information, such as for color intensification processing being performed in the digital domain, such as in real time processor 126 or supervisory processor 125. Therefore, color signals 1134 and 1135 discussed with reference to FIG. 11C may be intensified color signals. Hence, the area weighted smoothed colors 1141 (FIG. 11C) would also be intensity weighted colors, providing intensity weighted and area weighted smoothed and intensified pixel color signals 1141. Alternately, color signals 1134 and 1135 may be non-intensified color signals that are smoothed and weighted in the digital domain, such as discussed with reference to FIG. 11E, or in the hybrid or analog domain, such as discussed with reference to FIGS. 15 and 16.

Weighting of additional parameters for smoothing may be provided, similar to the description of area weighting of color with reference to FIG. 11C. An illustration will now be weighting circuits in different locations and weighting of different parameters, can also be provided in accordance with the present invention.

Edge processor related signals 1131, such as generated by area detector 1130, may be decoded, such as with an ROM 1132 or other decoder arrangement. Decoder 1132 can generate area-related or weighting-related signal 1146A. In this example, signal 1146A is related to area weighting for the prior-pixel. An area weighting signal for the next-pixel may be generated as the complement of area weighting signal for the prior pixel 1146A.

Subtracter 1147 may be used to generate compliment signal 1146B of area weighting signal 1146A. Therefore, if area weighting signal 1146A is related to the prior-pixel area weighting, then complement area weighting signal 1146B is related to the next-pixel area weighting. Prior-pixel area weighting signal 1146A and next-pixel area weighting signal 1146B may be processed with prior-pixel multiplier 1147A and next-pixel multiplier 1147B, respectively, to generate prior-pixel weighted intensity signal 1133A and next-pixel weighted intensity signal 1133B, respectively, by weighting prior-pixel intensity signal 1148A and next-pixel intensity signal 1148B, respectively. Intensity signals 1148A and 1148B may be generated by dividing programmable intensity signals 1150A and 1150B, respectively, by range signals 1149A and 1149B, respectively, to obtain quotient signals 1148A and 1148B, respectively, which are directly proportional to the programmable intensity and inversely proportional to the range.

Range and intensity signals for the prior-pixel and for the next-pixel may be derived by accessing the prior-pixel word and the next-pixel word from refresh memory 116, as discussed for prior-pixel color byte 1134 stored in prior-pixel buffer register 1144 and next-pixel color byte 1135 stored in next-pixel buffer register 1145. Prior-pixel buffer register 1144 may be extended to include prior-pixel range byte 1149A stored in prior-pixel range register 1144A and prior-pixel intensity byte 1150A stored in prior-pixel intensity register 1144B and next-pixel buffer register 1145 may be extended to include next-pixel range byte 1149B stored in next-pixel range register 1145A and next-pixel intensity byte 1150B stored in next-pixel intensity register 1145B. Intensity signals 1150A and 1150B can be divided by range signals 1149A and 1149B, respectively, with divider circuits 1151A and 1151B, respectively, to generate quotient intensity signals 1148A and 1148B, respectively, for weighting with multipliers 1147A and 1147B, respectively, to generate prior-pixel area weighted intensity signal 1133A and next-pixel area weighted intensity signal 1133B, respectively. Weighted intensity signals 1133A and 1133B may be used for color weighting, such as discussed with reference to FIG. 11C.

Multipliers 1147A and 1147B may be implemented as low resolution multipliers, such as discussed with reference to FIG. 11D, or may be implemented in other multiplier configurations. Similarly, dividers 1151A and 1151B may be implemented with design considerations similar to those discussed with reference to FIG. 11D or may be implemented in other configurations.

Smoothing Processor Logical Design

A detailed design of the smoothing logic will now be discussed with reference to FIG. 11. As discussed above, edge processor 131 can be configured to operate at subpixel resolution, such as half-pixel resolution as shown in FIG. 11B. Half-pixel resolution can divide each pixel into 4-quadrants I to IV and 9-half pixel coordinates F0 to F8. The subpixel coordinates that are traversed by an edge processor can be used to establish the subpixel areas formed by an edge and consequently the area weighting for smoothing. The 9-subpixel coordinates can be defined in a logical truth table, where the 9-subpixel coordinates for a pixel relate to 512 digital states. Subpixel transition tables and diagrams are provided herein for defining the comprehensive set of 512-states. For ease of illustration; a different table is provided for each of (1) an edge traversing a pixel, (2) a vertex traversing a pixel, and (3) a composite table combining edge and vertex conditions.

Many of the conditions in the subpixel transition tables are undefined because they cannot be achieved with a particular system implementation. For example, as listed in the notes column associated with subpixel transition tables for one disclosed configuration; a discontinuity, direction reversal, or right angle transition can render an edge pixel state to be undefined and bypassing of the center subpixel coordinate F8 can render a vertex pixel state to be undefined.

The subpixel transition tables are supplemented with subpixel transition diagrams (FIGS. 11I to 11L). Comprehensive subpixel transition diagrams (FIGS. 11I and 11J) are provided for edge and vertex conditions to illustrate the subpixel conditions for each of the 512-states. These diagrams make apparent which of the states are defined and the nature of the states that are undefined for the illustrated configuration. The conditions that render states to be undefined are referenced in the NOTES column of the tables. Detailed subpixel transition diagrams (FIGS. 11K and 11L) are provided for edge and vertex conditions to illustrate in more detail the subpixel conditions for each of the defined states. The differences between the comprehensive subpixel transition diagrams and the detailed subpixel transition diagrams is that the comprehensive subpixel transition diagrams illustrate both defined and undefined conditions in a qualitative manner with smaller diagrams and the detailed subpixel transition diagrams illustrate only the defined states in a quantitative manner with larger more precise diagrams. Comprehensive and detailed subpixel transition diagrams are provided for each edge and vertex condition.

The smoothing processor may be implemented in various configurations. One configuration uses a table lookup arrangement, such as defined with the subpixel transition tables. Another configuration uses processing logic, such as by reducing the subpixel transition tables to logical equation form, then optimization with DeMorgan's theoreom or with tabular methods such as Veitch diagrams and with Karnaugh diagrams, and then representing the optimized logical equations with processing logic (i.e.; AND-gates and OR-gates). Another configuration uses combinations of table lookup and processing logic. This latter approach will be discussed herein because it provides the convenience of table lookup and table simplification with processing logic. For example, the edge subpixel transition table is represented with plus and minus weights in order to make the table independent of vector direction thereby reducing table size; where plus and minus weights can be changed to inside and outside weights with processing logic. Also, processing logic can be used to reduce the size of the vertex subpixel transition table by detecting a vertex that does not make a transition through the pixel center coordinate F8 and by defining an error condition in response to such an undefined transition with processing logic.

The subpixel transition diagrams illustrate all of the possible combinations of half-pixel coordinates that can be generated by a particular configuration of edge processor. A pixel is shown in FIG. 11B having half-pixel verticies F0, F2, F4 and F6; half-pixel side coordinates F1, F3, F5, and F7; and pixel center coordinate F8. The edge processor, operating at half-pixel resolution, traverses a pixel through combinations of half-pixel coordinates F0 to F8. Practical geometric considerations permit only certain combinations of these subpixel coordinates to be traversed for a particular edge processor implementation. Every combination of the 9-subpixel coordinates F0 to F8 are shown in the comprehensive subpixel transition diagrams and comprehensive subpixel transition tables. The conditions that are possible are defined with vectors and a double underlined P-term in the diagrams and range and tolerance parameters in the tables. States that are undefined are marked with dashes in the tables. Undefined states can be identified by the following methods. One undefined state is shown by subpixel transition diagram P0, where the edge does not make a transition through the pixel. Another undefined state is shown by subpixel transition diagrams P2, P32, and 128; where the edge cannot make a transition that will encompass the midpoint of the pixel boundary without encompassing adjacent subpixel coordinates. Another undefined state is illustrated with subpixel transition diagrams P5, P9, P13, P17–P23, and P45; where continuity is not preserved because subpixel coordinates that are traversed are separated by a subpixel coordinate that is not traversed. Another undefined state is illustrated with subpixel transition diagrams P31 and P124; where a typical edge processor should make the transition through the center subpixel coordinate rather than making multiple pixel linear transitions around the periphery of the pixel. Another undefined state is illustrated with subpixel transition diagrams P62, P63, P110, P111, P123, P126, and P127; requiring a typical edge processor to back-up in the reverse direction. Many of the subpixel transition diagrams can be characterized as undefined for combinations of the above conditions and for other conditions that can now be derived from these examples.

The subpixel transition diagrams and truth tables are derived for edge processors that either permit or surpress right angle transitions. A right angle transition is a sequence of transitions first in the X-direction and then in the Y-direction or conversely; resulting in a right angle turn. A 45 transition is a simultaneous transition in the X-direction and Y-direction. One disclosed edge processor configuration does not permit right-angle transitions, but generates 45° transitions in place thereof. Therefore, for this edge processor configuration, the subpixel states requiring right-angle transitions are undefined, permitting further simplification of the smoothing processor.

The subpixel transition diagrams and truth tables illustrate the approximate vector orientation, pixel area division and weighting, and tolerance for each defined subpixel transition state. These are representative conditions selected for illustration purposes as representative of many other assignments of conditions that can be made.

Subpixel transition tables will now be discussed in greater detail. The subpixel transition tables define each possible state based upon a binary representation of the 9-subpixel conditions F0 to F8 represented in truth table form. A P-column is used for convenience of reference, which the P-term is the decimal equivalent of the weighted binary subpixel conditions. For example, the P2 state is a binary weighted representation of the F1 condition (being the binary weighted twos column) and the P8 state is a binary weighted representation of the F3 condition (being the binary weighted eights column). Each state has been analyzed with reference to the subpixel transition diagrams to derive the percent of area and the precision tolerance associated therewith. The results of this analysis are summarized in the subpixel transition tables and diagrams.

Figure 11G:
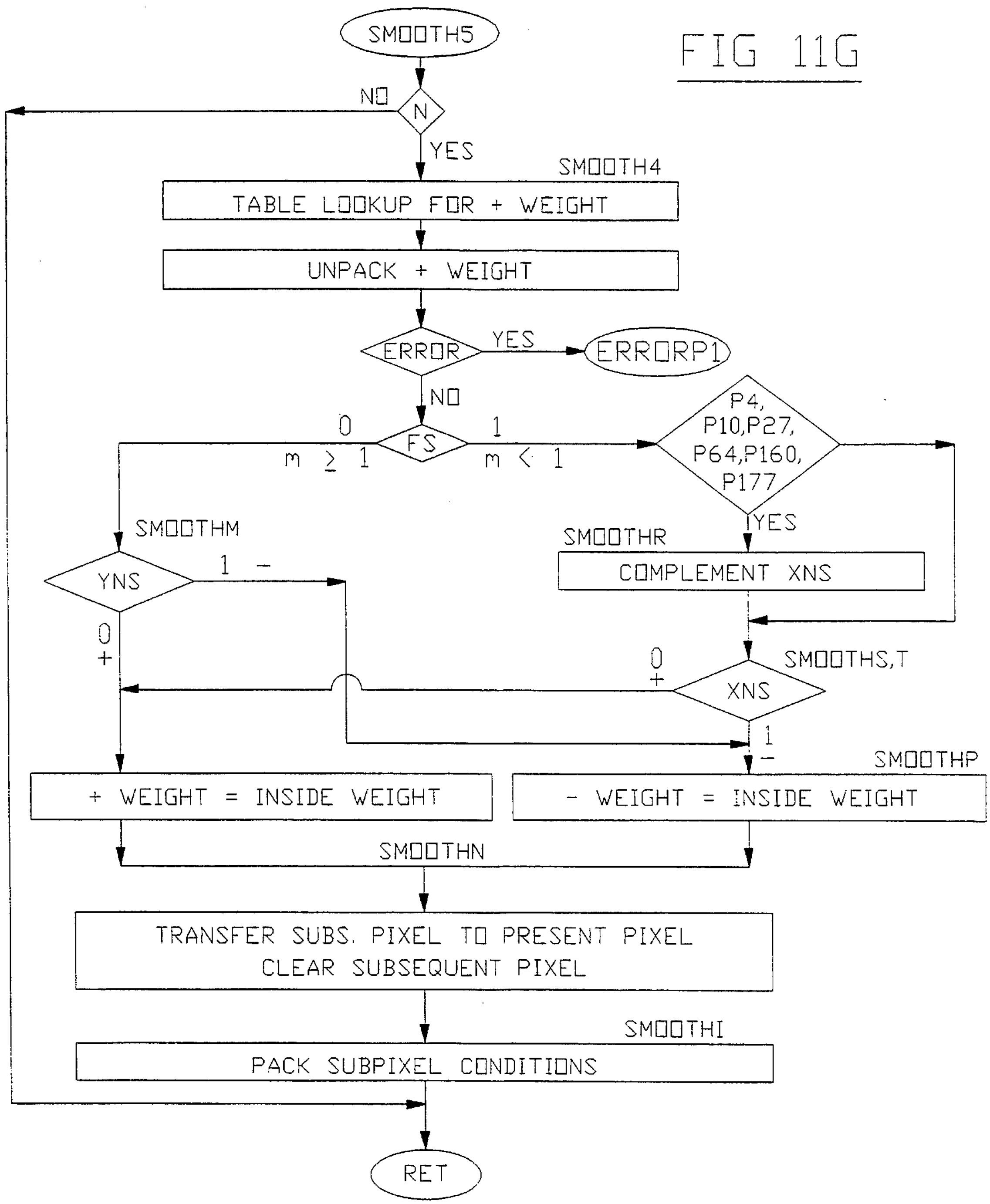
Figure 11H:
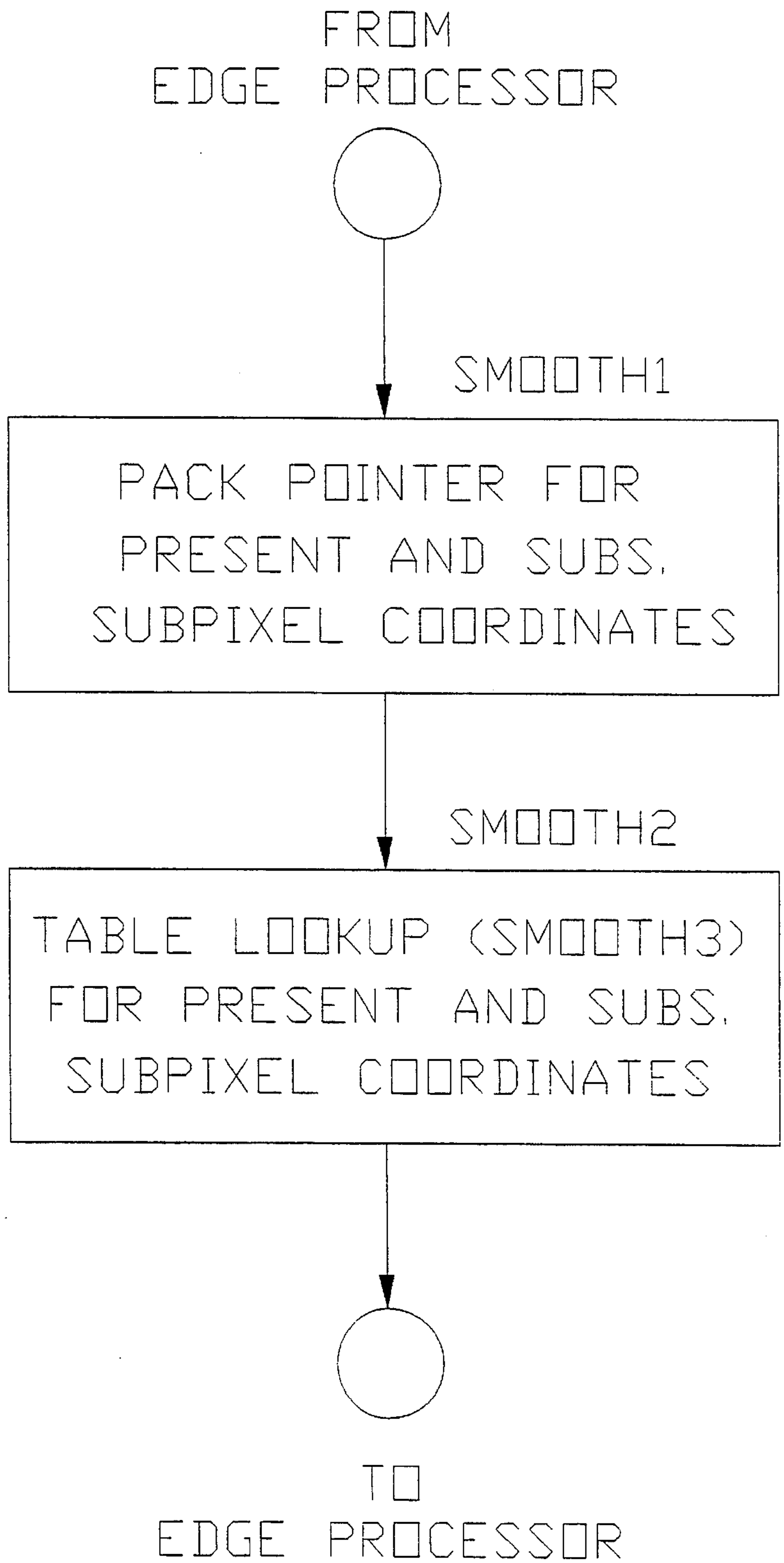
FIG. 11H shows a flow diagram and state diagram representation of sub-pixel table lookup.

The edge weights are defined as the plus and minus weights and the vertex weights are defined as inside and outside weights. The plus and minus weights for the edge tables can be converted to the inside and outside weights with processor logic. Plus and minus weights are used for the edge tables to reduce the size of the table. For the edge subpixel transition table, the inside and outside weights can be conditionally complemented conditioned upon the direction of the edge vector. Therefore, for the edge subpixel transition table, each state involves 2-substates related to two possible directions of the edge vector. This substate condition can be implemented in various ways. In one configuration, a table having all states and all substates can be provided having an additional input column representing edge vector direction. In another configuration, as illustrated with the present edge subpixel transition tables, plus and minus weights can be defined for selection based upon the edge vector direction condition defined with processor logic, as shown in the smoothing flow diagram (FIG 11G). The vertex subpixel transition tables can be represented directly in inside and outside weights because the geometric definition of unidirectional motion around a surface, such as clockwise motion, and convex surfaces uniquely defines the direction around the vertex; as illustrated in the detailed vertex subpixel transition diagrams.

One configuration discussed herein uses inside and outside weights (see the vertex subpixel transition table) pertaining to subpixel area inside of the surface and outside of the surface being processed. Also, a configuration using plus and minus weights (see the edge subpixel transition table) pertaining to the subpixel area in a plus direction and a minus direction (relative to edge direction and edge slope) is discussed herein. Other configurations can also be used. Inside and outside weights are convenient for moving edges in conjunction with filled surfaces. Also, inside and outside weights and plus and minus weights for a particular state are complements of each other, where knowledge of the weight for one portion of a pixel implicitly defines the weight for the other portion of the pixel, being the complement thereof. Therefore, the tables and logic need only consider one of the these complement conditions, either plus or minus weight or either inside or outside weight.

Considerations associated with characteristics of a particular configuration can be further simplified with the table. For example, one edge processor configuration permitting right-angle transitions is disclosed and another edge processor configuration supressing right angle transitions is disclosed. The subpixel transition tables are constructed to represent the edge processor configuration permitting right angle transitions and an hexidecimal representation of the weight is shown in the column entitled RIGHT ANGLE OK. However, implementation of an edge processor to supress right-angle transitions causes some of the states that are defined for the edge processor permitting right-angle transitions (the right-angle states) to be undefined for the edge processor supressing right-angle transitions. These right-angle states are identified in the NOTES Column with Note-3 and in the RIGHT ANGLE NOT OK column with an F error code. Except for these states identfied with Note-3, the other states are common to both right-angle transition permitted and right-angle transition supressed states.

One smoothing processor configuration implemented in table lookup form assigns numerical codes to the plus weight in the edge subpixel transition table and to the inside weight in the vertex subpixel transition table. Hexidecimal codes can be used to represent weights together with other conditions, such as defined in the hex code definition table. Twelve hex codes 0 to B can be used to provide approximately 8% resolution per code for the weights. Hex codes C to F are not used for numerical weights and are available for logical functions. Hex code F can be used to identify undefined states, where detection of an F code in a table lookup operation establishes an undefined state representing an error condition. Hex code C can be used to identify a state that has a significant difference between the weight of a vertex subpixel and the weight of an edge subpixel in the combined edge and vertex subpixel transition table, requiring further resolution.

The notes in the right hand column of the subpixel transition tables identify important features that are illustrated with the subpixel transition tables. Note-1 identifies an edge condition that is undefined due to an edge discontinuity. The states identified with Note-1 are shown in the edge subpixel transition diagrams which have traversed subpixel coordinates identified with Xs and separated with non-traversed subpixel coordinates shown by the absence of an X. Note-2 identifies an edge condition that is undefined due to an edge direction reversal. The states identified with Note-2 are shown in the edge subpixel transition diagrams which have traversed subpixel coordinates that necessitate the edge to move in the proper direction and then to change direction and move in the reverse direction in order to traverse the indicated subpixel coordinates. Note-3 identifies an edge condition that is defined if right-angle transitions are permitted and that is undefined if right-angle transitions are not permitted. The states identified with Note-3 are shown in the edge subpixel transition diagrams which have traversed subpixel coordinates that necessitate a right-angle transition. Note-4 identifies a vertex condition that is undefined due to non-traversing of the pixel center subpixel coordinate F8. The states identified with Note-4 (states P0 to P255) are shown in the vertex subpixel transition diagrams having traversed subpixel coordinates which do not include the F8 subpixel coordinate.

It might be assumed that smoothing processing for vertex pixels would be significantly more complex than processing for non-vertex pixels. For example, a non-vertex pixel requires a transition to be continuous along a linear edge in a fixed direction while a vertex pixel can change direction within the pixel. However, vertex smoothing processing can be simplified to be similar in simplicty to edge pixel smoothing processing in certain system configurations. For example, edges can be defined to start at the center of a pixel and to end at the center of a pixel, such as with edge initial conditions loaded into the edge processor being rounded to pixel resolution. Also, a requirement that edges shall traverse a surface in a clockwise direction and that surfaces shall be convex establishes direction vectors at a vertex necessary to preserve the convex requirement.

The vertex subpixel transition diagrams have certain noteworthy characteristics. In a configuration permitting only clockwise motion around a surface and permitting only convex surfaces, the subpixel transitions through a vertex are limited to being unidirectional and the inside area of the surface is limited to being the smaller of the two subpixel areas. This is because convex surfaces have internal angles less than 180°, thereby requiring the inside subpixel area to be smaller than the outside subpixel area of the vertex pixel and requiring the clockwise direction to be such as to enclose the smaller subpixel area within the surface. The boundary conditon of a 180° vertex angle can be resolved by detection thereof and by additional processing.

Relative to the subpixel transition diagrams, several construction-related considerations are noteworthy. If an edge passes within a quarter of a pixel of a half-pixel coordinate, that half-pixel coordinate is traversed. If an edge passes more than a quarter of a pixel away from a half pixel coordinate, that half-pixel coordinate is not traversed. Therefore, the subpixel transition diagrams show a traversed half-pixel coordinate having an edge passing within a quarter of a pixel thereof and show a non-traversed half-pixel coordinate having no edge passing within a quarter of pixel thereof.

Identification of subpixel coordinates F0 to F8 facilitates development of subpixel conditions, such as by packing of subpixel coordinates into a subpixel condition word. Subpixel coordinate identification can be provided with processing logic, table lookup, combinations of processing logic and table lookup, and other methods. One configuration using combinations of processing logic and table lookup will now be discussed as illustrative of other methods. A diagram showing a pixel surrounded by eight adjacent pixels identifying the subpixel coordinates is shown in FIG. 11F. Transitions from subpixel coordinates outside of the center pixel into the center pixel, from the center pixel to an adjacent pixel, and within the center pixel can be evaluated to identify subpixel transition conditions for packing into a subpixel condition word. As the edge processor generates the subpixel coordinates entering a pixel, progressing through the pixel, and exiting the pixel; these conditions can be packed into a subpixel condition word for that particular pixel. Also, peripheral subpixel coordinates for the center pixel are common to adjacent pixels, but have different subpixel identification in the adjacent pixels. For example, subpixel coordinate F1 in the center pixel is subpixel coordinate F5 in the adjacent pixel. Therefore, as the subpixel condition word for the present pixel is being constructed, a different subpixel coordinate word for the adjacent pixel, identified as the subsequent pixel, is also being constructed. This subsequent pixel will be traversed subsequent to the present pixel. When the edge processor makes the transition from the present pixel to the subsequent pixel, the area weight of the present pixel can be determined based upon the present subpixel condition word and the transition to the subsequent pixel, which will then become the present pixel, can be initialized by transferring the subpixel condition word of the subsequent pixel to the register that stores the subpixel condition word for the present pixel. Subpixel condition logic and tables are provided for identifying the new subpixel coordinate to be packed into the present pixel condition word and the subsequent pixel condition word for defined conditions.

Operation of smoothing logic is illustrated with the tables entitled Operations Of Smoothing Operation; including the Case I Operation Table and related FIG. 11M demonstrating smoothing of a first triangular image and the Case II Operation Table and related FIG. 11N demonstrating smoothing of a second triangular image.

The smoothing processing discussed with reference to the tables and diagrams provided herein, such as the sub-pixel transition tables and diagrams discussed in detail above, has been implemented in conjunction with the edge processor and is shown in detail in the program listings in the Table Of Computer Listings, Edge Processor And Smoothing Processor. In particular, the smoothing processing is composed of subroutines SMOOTH1 and SMOOTH2 accessed by the edge processor logic (FIG. 11H), discussed with reference to FIG. 7C, and subroutine SMOOTH5 accessed by the executive processor logic, discussed with reference to FIG. 4. The SMOOTH1 subroutine provides for packing of a pointer for table lookup. The SMOOTH2 subroutine performs the table lookup using the pointer for accessing present pixel and subsequent pixel conditions from the table, discussed with reference to the Sub-Pixel Transition Logic tables and other smoothing tables set forth herein for each subpixel transition. The SMOOTH5 subroutine performs a table lookup for the smoothing weight for a pixel, consistant with the description relative to the Sub-Pixel Transition tables discussed herein. The SMOOTH1, SMOOTH2, and SMOOTH5 subroutines have been implemented and demonstrated in conjunction with the program beginning with the mneunomic SMOOTH1, SMOOTH 2, and SMOOTH 5 in the program listing set forth in the Tables Of Computer Listings, Smoothing Processor. The annotations in the right hand margin of the listing provide a detailed description of the operations performed therein and the assembly language code in the middle column of the listing provides a very detailed description of the operations performed therein, which are reflected in a higher level form in the smoothing processor flow diagram of FIG. 10M.

The features of the system of the present invention have been demonstrated on an experimental system, which is discussed herein, such as with reference to FIG. 17. Computer listings used to demonstrate the smoothing processor are attached hereto in the Tables Of Computer Listings in the sub-table entitled Edge Processor And Smoothing Processor. These listings are compatible with various smoothing processor descriptions herein, such as using common mneumonics and symbols, and provide extensive supplemental details, such as in the annotations in the left hand columns and the details of the assembly language code in the middle column.

SUB-PIXEL CONDITION CHANGE TABLE (SMOOTH 3)

| INPUT CONDITIONS | | | | | OUTPUT CHANGES | | | | | | | | | | | | | | | | | | | | | |
|---|---|---|---|---|---|---|---|---|---|---|---|---|---|---|---|---|---|---|---|---|---|---|---|---|---|---|
| | | | | | PRESENT PIXEL | | | | | | | | | SUBSEQUENT PIXEL | | | | | | | | | | | | |
| P | XNS | YNS | X1N | Y1N | F8 | F7 | F6 | F5 | F4 | F3 | F2 | F1 | F0 | F8 | F7 | F6 | F5 | F4 | F3 | F2 | F1 | F0 | HEX | | | |
| P0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 01 | 00 | 00 | 00 |
| P1 | 0 | 0 | 0 | 1 | 0 | 0 | 0 | 0 | 0 | 0 | 0 | 1 | 0 | 0 | 0 | 0 | 1 | 0 | 0 | 0 | 0 | 0 | 00 | 02 | 00 | 20H |
| P2 | 0 | 0 | 1 | 0 | 0 | 0 | 0 | 0 | 0 | 1 | 0 | 0 | 0 | 0 | 1 | 0 | 0 | 0 | 0 | 0 | 0 | 0 | 00 | 08 | 00 | 80H |
| P3 | 0 | 0 | 1 | 1 | 0 | 0 | 0 | 0 | 0 | 0 | 1 | 0 | 0 | 0 | 0 | 1 | 0 | 0 | 0 | 0 | 0 | 0 | 00 | 04 | 00 | 40H |
| P4 | 0 | 1 | 0 | 0 | 1 | 0 | 0 | 0 | 0 | 0 | 0 | 0 | 0 | 0 | 0 | 0 | 0 | 0 | 0 | 0 | 0 | 0 | 01 | 00 | 00 | 00 |
| P5 | 0 | 1 | 0 | 1 | 0 | 0 | 0 | 1 | 0 | 0 | 0 | 0 | 0 | 0 | 0 | 0 | 0 | 0 | 0 | 0 | 1 | 0 | 00 | 20H | 00 | 02 |
| P6 | 0 | 1 | 1 | 0 | 0 | 0 | 0 | 0 | 0 | 1 | 0 | 0 | 0 | 0 | 1 | 0 | 0 | 0 | 0 | 0 | 0 | 0 | 00 | 08 | 00 | 80H |
| P7 | 0 | 1 | 1 | 1 | 0 | 0 | 0 | 0 | 1 | 0 | 0 | 0 | 0 | 0 | 0 | 0 | 0 | 0 | 0 | 0 | 0 | 1 | 00 | 10H | 00 | 01 |
| P8 | 1 | 0 | 0 | 0 | 1 | 0 | 0 | 0 | 0 | 0 | 0 | 0 | 0 | 0 | 0 | 0 | 0 | 0 | 0 | 0 | 0 | 0 | 01 | 00 | 00 | 00 |
| P9 | 1 | 0 | 0 | 1 | 0 | 0 | 0 | 0 | 0 | 0 | 0 | 1 | 0 | 0 | 0 | 0 | 1 | 0 | 0 | 0 | 0 | 0 | 00 | 02 | 00 | 20H |
| P10 | 1 | 0 | 1 | 0 | 0 | 1 | 0 | 0 | 0 | 0 | 0 | 0 | 0 | 0 | 0 | 0 | 0 | 0 | 1 | 0 | 0 | 0 | 00 | 80H | 00 | 08 |
| P11 | 1 | 0 | 1 | 1 | 0 | 0 | 0 | 0 | 0 | 0 | 0 | 0 | 1 | 0 | 0 | 0 | 0 | 1 | 0 | 0 | 0 | 0 | 00 | 01 | 00 | 10H |
| P12 | 1 | 1 | 0 | 0 | 1 | 0 | 0 | 0 | 0 | 0 | 0 | 0 | 0 | 0 | 0 | 0 | 0 | 0 | 0 | 0 | 0 | 0 | 01 | 00 | 00 | 00 |
| P13 | 1 | 1 | 0 | 1 | 0 | 0 | 0 | 1 | 0 | 0 | 0 | 0 | 0 | 0 | 0 | 0 | 0 | 0 | 0 | 0 | 1 | 0 | 00 | 20H | 00 | 02 |
| P14 | 1 | 1 | 1 | 0 | 0 | 1 | 0 | 0 | 0 | 0 | 0 | 0 | 0 | 0 | 0 | 0 | 0 | 0 | 1 | 0 | 0 | 0 | 00 | 80H | 00 | 08 |
| P15 | 1 | 1 | 1 | 1 | 0 | 0 | 1 | 0 | 0 | 0 | 0 | 0 | 0 | 0 | 0 | 0 | 0 | 0 | 0 | 1 | 0 | 0 | 00 | 40H | 00 | 04 |

NOTES:
Subsequent pixel B8 = 0
Present pixel bytes are reversed subsequent pixel bytes.

Smoothing Processor Logical Design

G,245

NOTES

SUB-PIXEL CONDITIONS

NOTE-1: Undefined edge condition due to edge discontinuity.

NOTE-2: Undefined edge condition due to edge direction reversal.

NOTE-3: Right angle transition. Undefined edge condition for an edge processor that surpresses right angle transitions.

NOTE-4: Center sub-pixel coordinate is not traversed. Undefined vertex condition for an edge processor that begins and completes an edge on the center sub-pixel coordinate.

NOTE-5: Defined edge and undefined vertex.

NOTE-6: Defined vertex and undefined edge.

NOTE-7: Defined edge and vertex together.

NOTE-8: Special logic used for P4, P10, P27, P64, P160, and P177 edge conditions.

HEX CODE DEFINITION TABLE

| HEX CODE | RANGE % | FUNCTION |
|---|---|---|
| 0 | 0–7 | WEIGHT |
| 1 | 8–16 | WEIGHT |
| 2 | 17–25 | WEIGHT |
| 3 | 26–33 | WEIGHT |
| 4 | 34–41 | WEIGHT |
| 5 | 42–50 | WEIGHT |
| 6 | 51–58 | WEIGHT |
| 7 | 59–67 | WEIGHT |
| 8 | 68–75 | WEIGHT |

-continued

HEX CODE DEFINITION TABLE

| HEX CODE | RANGE % | FUNCTION |
|---|---|---|
| 9 | 76–84 | WEIGHT |
| A | 85–92 | WEIGHT |
| B | 93–100 | WEIGHT |
| C | — | EDGE & VERTEX INCONSISTENT |
| D | — | SPARE |
| E | — | SPARE |
| F | — | ERROR |

SUB-PIXEL CONDITIONS

G,248

| | | | | | | | | | | OUTPUT WEIGHT | | | | | | |
|---|---|---|---|---|---|---|---|---|---|---|---|---|---|---|---|---|
| INPUT CONDITIONS | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P0 | 0 | 0 | 0 | 0 | 0 | 0 | 0 | 0 | 0 | — | — | — | — | F | F | 1 |
| P1 | 0 | 0 | 0 | 0 | 0 | 0 | 0 | 0 | 1 | 100 | −3,+0 | 0 | +3,−0 | B | B | |
| P2 | 0 | 0 | 0 | 0 | 0 | 0 | 0 | 1 | 0 | — | — | — | — | F | F | 1 |
| P3 | 0 | 0 | 0 | 0 | 0 | 0 | 0 | 1 | 1 | 98 | +2,−2 | 2 | −2,+2 | B | B | |
| P4 | 0 | 0 | 0 | 0 | 0 | 0 | 1 | 0 | 0 | 0 | +3,−0 | 100 | −3,+0 | 0 | 0 | 8 |
| P5 | 0 | 0 | 0 | 0 | 0 | 0 | 1 | 0 | 1 | — | — | — | — | F | F | 1 |
| P6 | 0 | 0 | 0 | 0 | 0 | 0 | 1 | 1 | 0 | 98 | +2,−2 | 2 | −2,+2 | B | B | |
| P7 | 0 | 0 | 0 | 0 | 0 | 0 | 1 | 1 | 1 | 100 | −25,+0 | 0 | +25,−0 | B | B | |
| P8 | 0 | 0 | 0 | 0 | 0 | 1 | 0 | 0 | 0 | — | — | — | — | F | F | 1 |
| P9 | 0 | 0 | 0 | 0 | 0 | 1 | 0 | 0 | 1 | — | — | — | — | F | F | 1 |
| P10 | 0 | 0 | 0 | 0 | 0 | 1 | 0 | 1 | 0 | 13 | +6,−9 | 87 | −6,+9 | 1 | 1 | 8 |
| P11 | 0 | 0 | 0 | 0 | 0 | 1 | 0 | 1 | 1 | 81 | +13,−6 | 19 | −13,+6 | 9 | 9 | |
| P12 | 0 | 0 | 0 | 0 | 0 | 1 | 1 | 0 | 0 | 2 | +2,−2 | 98 | −2,+2 | 0 | 0 | |
| P13 | 0 | 0 | 0 | 0 | 0 | 1 | 1 | 0 | 1 | — | — | — | — | F | F | 1 |
| P14 | 0 | 0 | 0 | 0 | 0 | 1 | 1 | 1 | 0 | 3 | +0,−0 | 97 | −0,+0 | 0 | F | 3 |
| P15 | 0 | 0 | 0 | 0 | 0 | 1 | 1 | 1 | 1 | 87 | +6,−12 | 13 | −6,+12 | A | F | 3 |
| P16 | 0 | 0 | 0 | 0 | 1 | 0 | 0 | 0 | 0 | 0 | +3,−12 | 100 | −3,+12 | 0 | 0 | |
| P17 | 0 | 0 | 0 | 0 | 1 | 0 | 0 | 0 | 1 | — | — | — | — | F | F | 1 |
| P18 | 0 | 0 | 0 | 0 | 1 | 0 | 0 | 1 | 0 | — | — | — | — | F | F | 1 |
| P19 | 0 | 0 | 0 | 0 | 1 | 0 | 0 | 1 | 1 | — | — | — | — | F | F | 1 |
| P20 | 0 | 0 | 0 | 0 | 1 | 0 | 1 | 0 | 0 | — | — | — | — | F | F | 1 |
| P21 | 0 | 0 | 0 | 0 | 1 | 0 | 1 | 0 | 1 | — | — | — | — | F | F | 1 |
| P22 | 0 | 0 | 0 | 0 | 1 | 0 | 1 | 1 | 0 | — | — | — | — | F | F | 1 |
| P23 | 0 | 0 | 0 | 0 | 1 | 0 | 1 | 1 | 1 | — | — | — | — | F | F | 1 |
| P24 | 0 | 0 | 0 | 0 | 1 | 1 | 0 | 0 | 0 | 2 | +2,−2 | 98 | −2,+2 | 0 | 0 | |
| P25 | 0 | 0 | 0 | 0 | 1 | 1 | 0 | 0 | 1 | — | — | — | — | F | F | 1 |
| P26 | 0 | 0 | 0 | 0 | 1 | 1 | 0 | 1 | 0 | 19 | −13,+6 | 81 | +13,−6 | 2 | 2 | |
| P27 | 0 | 0 | 0 | 0 | 1 | 1 | 0 | 1 | 1 | 28 | +0,−0 | 72 | −0,+0 | 3 | 3 | 8 |
| P28 | 0 | 0 | 0 | 0 | 1 | 1 | 1 | 0 | 0 | 0 | +25,−0 | 100 | −25,+0 | 0 | 0 | |
| P29 | 0 | 0 | 0 | 0 | 1 | 1 | 1 | 0 | 1 | — | — | — | — | F | F | 1 |
| P30 | 0 | 0 | 0 | 0 | 1 | 1 | 1 | 1 | 0 | 13 | −6,+12 | 87 | +6,−12 | 1 | F | 3 |
| P31 | 0 | 0 | 0 | 0 | 1 | 1 | 1 | 1 | 1 | — | — | — | — | F | F | 2 |
| P32 | 0 | 0 | 0 | 1 | 0 | 0 | 0 | 0 | 0 | — | — | — | — | F | F | 1 |
| P33 | 0 | 0 | 0 | 1 | 0 | 0 | 0 | 0 | 1 | — | — | — | — | F | F | 1 |
| P34 | 0 | 0 | 0 | 1 | 0 | 0 | 0 | 1 | 0 | — | — | — | — | F | F | 1 |
| P35 | 0 | 0 | 0 | 1 | 0 | 0 | 0 | 1 | 1 | — | — | — | — | F | F | 1 |
| P36 | 0 | 0 | 0 | 1 | 0 | 0 | 1 | 0 | 0 | — | — | — | — | F | F | 1 |
| P37 | 0 | 0 | 0 | 1 | 0 | 0 | 1 | 0 | 1 | — | — | — | — | F | F | 1,2 |
| P38 | 0 | 0 | 0 | 1 | 0 | 0 | 1 | 1 | 0 | — | — | — | — | F | F | 1 |
| P39 | 0 | 0 | 0 | 1 | 0 | 0 | 1 | 1 | 1 | — | — | — | — | F | F | 1,2 |
| P40 | 0 | 0 | 0 | 1 | 0 | 1 | 0 | 0 | 0 | 13 | +6,−9 | 87 | −6,+9 | 1 | 1 | |
| P41 | 0 | 0 | 0 | 1 | 0 | 1 | 0 | 0 | 1 | — | — | — | — | F | F | 1,2 |
| P42 | 0 | 0 | 0 | 1 | 0 | 1 | 0 | 1 | 0 | — | — | — | — | F | F | 2 |
| P43 | 0 | 0 | 0 | 1 | 0 | 1 | 0 | 1 | 1 | — | — | — | — | F | F | 2 |
| P44 | 0 | 0 | 0 | 1 | 0 | 1 | 1 | 0 | 0 | 19 | −12,+6 | 81 | +12,−6 | 2 | 2 | |
| P45 | 0 | 0 | 0 | 1 | 0 | 1 | 1 | 0 | 1 | — | — | — | — | F | F | 1,2 |
| P46 | 0 | 0 | 0 | 1 | 0 | 1 | 1 | 1 | 0 | — | — | — | — | F | F | 2 |
| P47 | 0 | 0 | 0 | 1 | 0 | 1 | 1 | 1 | 1 | — | — | — | — | F | F | 2 |
| P48 | 0 | 0 | 0 | 1 | 1 | 0 | 0 | 0 | 0 | 2 | +2,−2 | 98 | −2,+2 | 0 | 0 | |
| P49 | 0 | 0 | 0 | 1 | 1 | 0 | 0 | 0 | 1 | — | — | — | — | F | F | 1 |
| P50 | 0 | 0 | 0 | 1 | 1 | 0 | 0 | 1 | 0 | — | — | — | — | F | F | 1 |
| P51 | 0 | 0 | 0 | 1 | 1 | 0 | 0 | 1 | 1 | — | — | — | — | F | F | 1 |
| P52 | 0 | 0 | 0 | 1 | 1 | 0 | 1 | 0 | 0 | — | — | — | — | F | F | 1 |
| P53 | 0 | 0 | 0 | 1 | 1 | 0 | 1 | 0 | 1 | — | — | — | — | F | F | 1,2 |
| P54 | 0 | 0 | 0 | 1 | 1 | 0 | 1 | 1 | 0 | — | — | — | — | F | F | 1,2 |
| P55 | 0 | 0 | 0 | 1 | 1 | 0 | 1 | 1 | 1 | — | — | — | — | F | F | 1,2 |
| P56 | 0 | 0 | 0 | 1 | 1 | 1 | 0 | 0 | 0 | 3 | +0,−0 | 97 | −0,+0 | 0 | F | 3 |
| P57 | 0 | 0 | 0 | 1 | 1 | 1 | 0 | 0 | 1 | — | — | — | — | F | F | 1,2 |
| P58 | 0 | 0 | 0 | 1 | 1 | 1 | 0 | 1 | 0 | — | — | — | — | F | F | 2 |
| P59 | 0 | 0 | 0 | 1 | 1 | 1 | 0 | 1 | 1 | — | — | — | — | F | F | 2 |
| P60 | 0 | 0 | 0 | 1 | 1 | 1 | 1 | 0 | 0 | 13 | −6,+12 | 87 | +6,−12 | 1 | F | 3 |
| P61 | 0 | 0 | 0 | 1 | 1 | 1 | 1 | 0 | 1 | — | — | — | — | F | F | 1,2 |
| P62 | 0 | 0 | 0 | 1 | 1 | 1 | 1 | 1 | 0 | — | — | — | — | F | F | 2 |
| P63 | 0 | 0 | 0 | 1 | 1 | 1 | 1 | 1 | 1 | — | — | — | — | F | F | 2 |
| P64 | 0 | 0 | 1 | 0 | 0 | 0 | 0 | 0 | 0 | 100 | −3,+0 | 0 | +3,−0 | B | B | 8 |
| P65 | 0 | 0 | 1 | 0 | 0 | 0 | 0 | 0 | 1 | — | — | — | — | F | F | 1 |
| P66 | 0 | 0 | 1 | 0 | 0 | 0 | 0 | 1 | 0 | — | — | — | — | F | F | 1 |
| P67 | 0 | 0 | 1 | 0 | 0 | 0 | 0 | 1 | 1 | — | — | — | — | F | F | 1 |
| P68 | 0 | 0 | 1 | 0 | 0 | 0 | 1 | 0 | 0 | — | — | — | — | F | F | 1 |
| P69 | 0 | 0 | 1 | 0 | 0 | 0 | 1 | 0 | 1 | — | — | — | — | F | F | 1,2 |
| P70 | 0 | 0 | 1 | 0 | 0 | 0 | 1 | 1 | 0 | — | — | — | — | F | F | 1 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P71 | 0 | 0 | 1 | 0 | 0 | 0 | 1 | 1 | 1 | — | — | — | — | F | F | 1,2 |
| P72 | 0 | 0 | 1 | 0 | 0 | 1 | 0 | 0 | 0 | — | — | — | — | F | F | 1 |
| P73 | 0 | 0 | 1 | 0 | 0 | 1 | 0 | 0 | 1 | — | — | — | — | F | F | 1,2 |
| P74 | 0 | 0 | 1 | 0 | 0 | 1 | 0 | 1 | 0 | — | — | — | — | F | F | 1,2 |
| P75 | 0 | 0 | 1 | 0 | 0 | 1 | 0 | 1 | 1 | — | — | — | — | F | F | 1,2 |
| P76 | 0 | 0 | 1 | 0 | 0 | 1 | 1 | 0 | 0 | — | — | — | — | F | F | 1 |
| P77 | 0 | 0 | 1 | 0 | 0 | 1 | 1 | 0 | 1 | — | — | — | — | F | F | 1,2 |
| P78 | 0 | 0 | 1 | 0 | 0 | 1 | 1 | 1 | 0 | — | — | — | — | F | F | 1,2 |
| P79 | 0 | 0 | 1 | 0 | 0 | 1 | 1 | 1 | 1 | — | — | — | — | F | F | 1,2 |
| P80 | 0 | 0 | 1 | 0 | 1 | 0 | 0 | 0 | 0 | — | — | — | — | F | F | 1 |
| P81 | 0 | 0 | 1 | 0 | 1 | 0 | 0 | 0 | 1 | — | — | — | — | F | F | 1,2 |
| P82 | 0 | 0 | 1 | 0 | 1 | 0 | 0 | 1 | 0 | — | — | — | — | F | F | 1,2 |
| P83 | 0 | 0 | 1 | 0 | 1 | 0 | 0 | 1 | 1 | — | — | — | — | F | F | 1,2 |
| P84 | 0 | 0 | 1 | 0 | 1 | 0 | 1 | 0 | 0 | — | — | — | — | F | F | 1,2 |
| P85 | 0 | 0 | 1 | 0 | 1 | 0 | 1 | 0 | 1 | — | — | — | — | F | F | 1,2 |
| P86 | 0 | 0 | 1 | 0 | 1 | 0 | 1 | 1 | 0 | — | — | — | — | F | F | 1,2 |
| P87 | 0 | 0 | 1 | 0 | 1 | 0 | 1 | 1 | 1 | — | — | — | — | F | F | 1,2 |
| P88 | 0 | 0 | 1 | 0 | 1 | 1 | 0 | 0 | 0 | — | — | — | — | F | F | 1 |
| P89 | 0 | 0 | 1 | 0 | 1 | 1 | 0 | 0 | 1 | — | — | — | — | F | F | 1,2 |
| P90 | 0 | 0 | 1 | 0 | 1 | 1 | 0 | 1 | 0 | — | — | — | — | F | F | 1,2 |
| P91 | 0 | 0 | 1 | 0 | 1 | 1 | 0 | 1 | 1 | — | — | — | — | F | F | 1,2 |
| P92 | 0 | 0 | 1 | 0 | 1 | 1 | 1 | 0 | 0 | — | — | — | — | F | F | 1,2 |
| P93 | 0 | 0 | 1 | 0 | 1 | 1 | 1 | 0 | 1 | — | — | — | — | F | F | 1,2 |
| P94 | 0 | 0 | 1 | 0 | 1 | 1 | 1 | 1 | 0 | — | — | — | — | F | F | 1,2 |
| P95 | 0 | 0 | 1 | 0 | 1 | 1 | 1 | 1 | 1 | — | — | — | — | F | F | 1,2 |
| P96 | 0 | 0 | 1 | 1 | 0 | 0 | 0 | 0 | 0 | 2 | +2,−2 | 98 | +2,−2 | 0 | 0 | |
| P97 | 0 | 0 | 1 | 1 | 0 | 0 | 0 | 0 | 1 | — | — | — | — | F | F | 1 |
| P98 | 0 | 0 | 1 | 1 | 0 | 0 | 0 | 1 | 0 | — | — | — | — | F | F | 1 |
| P99 | 0 | 0 | 1 | 1 | 0 | 0 | 0 | 1 | 1 | — | — | — | — | F | F | 1,2 |
| P100 | 0 | 0 | 1 | 1 | 0 | 0 | 1 | 0 | 0 | — | — | — | — | F | F | 1 |
| P101 | 0 | 0 | 1 | 1 | 0 | 0 | 1 | 0 | 1 | — | — | — | — | F | F | 1,2 |
| P102 | 0 | 0 | 1 | 1 | 0 | 0 | 1 | 1 | 0 | — | — | — | — | F | F | 1 |
| P103 | 0 | 0 | 1 | 1 | 0 | 0 | 1 | 1 | 1 | — | — | — | — | F | F | 1,2 |
| P104 | 0 | 0 | 1 | 1 | 0 | 1 | 0 | 0 | 0 | 19 | −12,+6 | 81 | +12,−6 | 2 | 2 | |
| P105 | 0 | 0 | 1 | 1 | 0 | 1 | 0 | 0 | 1 | — | — | — | — | F | F | 1,2 |
| P106 | 0 | 0 | 1 | 1 | 0 | 1 | 0 | 1 | 0 | — | — | — | — | F | F | 2 |
| P107 | 0 | 0 | 1 | 1 | 0 | 1 | 0 | 1 | 1 | — | — | — | — | F | F | 2 |
| P108 | 0 | 0 | 1 | 1 | 0 | 1 | 1 | 0 | 0 | 28 | +0,−0 | 72 | −0,+0 | 3 | 3 | |
| P109 | 0 | 0 | 1 | 1 | 0 | 1 | 1 | 0 | 1 | — | — | — | — | F | F | 1,2 |
| P110 | 0 | 0 | 1 | 1 | 0 | 1 | 1 | 1 | 0 | — | — | — | — | F | F | 2 |
| P111 | 0 | 0 | 1 | 1 | 0 | 1 | 1 | 1 | 1 | — | — | — | — | F | F | 2 |
| P112 | 0 | 0 | 1 | 1 | 1 | 0 | 0 | 0 | 0 | 0 | +25,−0 | 100 | −25,+0 | 0 | 0 | |
| P113 | 0 | 0 | 1 | 1 | 1 | 0 | 0 | 0 | 1 | — | — | — | — | F | F | 1,2 |
| P114 | 0 | 0 | 1 | 1 | 1 | 0 | 0 | 1 | 0 | — | — | — | — | F | F | 1,2 |
| P115 | 0 | 0 | 1 | 1 | 1 | 0 | 0 | 1 | 1 | — | — | — | — | F | F | 1,2 |
| P116 | 0 | 0 | 1 | 1 | 1 | 0 | 1 | 0 | 0 | — | — | — | — | F | F | 1,2 |
| P117 | 0 | 0 | 1 | 1 | 1 | 0 | 1 | 0 | 1 | — | — | — | — | F | F | 1,2 |
| P118 | 0 | 0 | 1 | 1 | 1 | 0 | 1 | 1 | 0 | — | — | — | — | F | F | 1,2 |
| P119 | 0 | 0 | 1 | 1 | 1 | 0 | 1 | 1 | 1 | — | — | — | — | F | F | 1,2 |
| P120 | 0 | 0 | 1 | 1 | 1 | 1 | 0 | 0 | 0 | 13 | −6,+12 | 87 | +6,−12 | 1 | F | 3 |
| P121 | 0 | 0 | 1 | 1 | 1 | 1 | 0 | 0 | 1 | — | — | — | — | F | F | 1,2 |
| P122 | 0 | 0 | 1 | 1 | 1 | 1 | 0 | 1 | 0 | — | — | — | — | F | F | 2 |
| P123 | 0 | 0 | 1 | 1 | 1 | 1 | 0 | 1 | 1 | — | — | — | — | F | F | 2 |
| P124 | 0 | 0 | 1 | 1 | 1 | 1 | 1 | 0 | 0 | — | — | — | — | F | F | 2 |
| P125 | 0 | 0 | 1 | 1 | 1 | 1 | 1 | 0 | 1 | — | — | — | — | F | F | 1,2 |
| P126 | 0 | 0 | 1 | 1 | 1 | 1 | 1 | 1 | 0 | — | — | — | — | F | F | 2 |
| P127 | 0 | 0 | 1 | 1 | 1 | 1 | 1 | 1 | 1 | — | — | — | — | F | F | 2 |
| P128 | 0 | 1 | 0 | 0 | 0 | 0 | 0 | 0 | 0 | — | — | — | — | F | F | 1 |
| P129 | 0 | 1 | 0 | 0 | 0 | 0 | 0 | 0 | 1 | 98 | +2,−2 | 2 | −2,+2 | B | B | |
| P130 | 0 | 1 | 0 | 0 | 0 | 0 | 0 | 1 | 0 | 87 | −6,+9 | 13 | +6,−9 | A | A | |
| P131 | 0 | 1 | 0 | 0 | 0 | 0 | 0 | 1 | 1 | 97 | +0,−0 | 3 | −0,+0 | B | F | 3 |
| P132 | 0 | 1 | 0 | 0 | 0 | 0 | 1 | 0 | 0 | — | — | — | — | F | F | 1 |
| P133 | 0 | 1 | 0 | 0 | 0 | 0 | 1 | 0 | 1 | — | — | — | — | F | F | 1 |
| P134 | 0 | 1 | 0 | 0 | 0 | 0 | 1 | 1 | 0 | 81 | −6,+12 | 19 | +6,−12 | 9 | 9 | |
| P135 | 0 | 1 | 0 | 0 | 0 | 0 | 1 | 1 | 1 | 87 | −12,+6 | 13 | +12,−6 | A | F | 3 |
| P136 | 0 | 1 | 0 | 0 | 0 | 1 | 0 | 0 | 0 | — | — | — | — | F | F | 1 |
| P137 | 0 | 1 | 0 | 0 | 0 | 1 | 0 | 0 | 1 | — | — | — | — | F | F | 1 |
| P138 | 0 | 1 | 0 | 0 | 0 | 1 | 0 | 1 | 0 | — | — | — | — | F | F | 2 |
| P139 | 0 | 1 | 0 | 0 | 0 | 1 | 0 | 1 | 1 | — | — | — | — | F | F | 2 |
| P140 | 0 | 1 | 0 | 0 | 0 | 1 | 1 | 0 | 0 | — | — | — | — | F | F | 1 |
| P141 | 0 | 1 | 0 | 0 | 0 | 1 | 1 | 0 | 1 | — | — | — | — | F | F | 1,2 |

-continued

| | | | | | | | | | | | | | | | | |
|---|---|---|---|---|---|---|---|---|---|---|---|---|---|---|---|---|
| | | | | | | | | | | OUTPUT WEIGHT | | | | | | |
| INPUT CONDITIONS | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P142 | 0 | 1 | 0 | 0 | 0 | 1 | 1 | 1 | 0 | — | — | — | — | F | F | 2 |
| P143 | 0 | 1 | 0 | 0 | 0 | 1 | 1 | 1 | 1 | — | — | — | — | F | F | 2 |
| P144 | 0 | 1 | 0 | 0 | 1 | 0 | 0 | 0 | 0 | — | — | — | — | F | F | 1 |
| P145 | 0 | 1 | 0 | 0 | 1 | 0 | 0 | 0 | 1 | — | — | — | — | F | F | 1 |
| P146 | 0 | 1 | 0 | 0 | 1 | 0 | 0 | 1 | 0 | — | — | — | — | F | F | 1 |
| P147 | 0 | 1 | 0 | 0 | 1 | 0 | 0 | 1 | 1 | — | — | — | — | F | F | 1,2 |
| P148 | 0 | 1 | 0 | 0 | 1 | 0 | 1 | 0 | 0 | — | — | — | — | F | F | 1,2 |
| P149 | 0 | 1 | 0 | 0 | 1 | 0 | 1 | 0 | 1 | — | — | — | — | F | F | 1,2 |
| P150 | 0 | 1 | 0 | 0 | 1 | 0 | 1 | 1 | 0 | — | — | — | — | F | F | 1,2 |
| P151 | 0 | 1 | 0 | 0 | 1 | 0 | 1 | 1 | 1 | — | — | — | — | F | F | 1,2 |
| P152 | 0 | 1 | 0 | 0 | 1 | 1 | 0 | 0 | 0 | — | — | — | — | F | F | 1 |
| P153 | 0 | 1 | 0 | 0 | 1 | 1 | 0 | 0 | 1 | — | — | — | — | F | F | 1 |
| P154 | 0 | 1 | 0 | 0 | 1 | 1 | 0 | 1 | 0 | — | — | — | — | F | F | 2 |
| P155 | 0 | 1 | 0 | 0 | 1 | 1 | 0 | 1 | 1 | — | — | — | — | F | F | 2 |
| P156 | 0 | 1 | 0 | 0 | 1 | 1 | 1 | 0 | 0 | — | — | — | — | F | F | 1,2 |
| P157 | 0 | 1 | 0 | 0 | 1 | 1 | 1 | 0 | 1 | — | — | — | — | F | F | 1,2 |
| P158 | 0 | 1 | 0 | 0 | 1 | 1 | 1 | 1 | 0 | — | — | — | — | F | F | 2 |
| P159 | 0 | 1 | 0 | 0 | 1 | 1 | 1 | 1 | 1 | — | — | — | — | F | F | 2 |
| P160 | 0 | 1 | 0 | 1 | 0 | 0 | 0 | 0 | 0 | 87 | +9,−6 | 13 | −9,+6 | A | A | 8 |
| P161 | 0 | 1 | 0 | 1 | 0 | 0 | 0 | 0 | 1 | 81 | +12,−6 | 19 | −12,+6 | 9 | 9 | |
| P162 | 0 | 1 | 0 | 1 | 0 | 0 | 0 | 1 | 0 | — | — | — | — | F | F | 2 |
| P163 | 0 | 1 | 0 | 1 | 0 | 0 | 0 | 1 | 1 | — | — | — | — | F | F | 2 |
| P164 | 0 | 1 | 0 | 1 | 0 | 0 | 1 | 0 | 0 | — | — | — | — | F | F | 1,2 |
| P165 | 0 | 1 | 0 | 1 | 0 | 0 | 1 | 0 | 1 | — | — | — | — | F | F | 1,2 |
| P166 | 0 | 1 | 0 | 1 | 0 | 0 | 1 | 1 | 0 | — | — | — | — | F | F | 2 |
| P167 | 0 | 1 | 0 | 1 | 0 | 0 | 1 | 1 | 1 | — | — | — | — | F | F | 2 |
| P168 | 0 | 1 | 0 | 1 | 0 | 1 | 0 | 0 | 0 | — | — | — | — | F | F | 2 |
| P169 | 0 | 1 | 0 | 1 | 0 | 1 | 0 | 0 | 1 | — | — | — | — | F | F | 2 |
| P170 | 0 | 1 | 0 | 1 | 0 | 1 | 0 | 1 | 0 | — | — | — | — | F | F | 2 |
| P171 | 0 | 1 | 0 | 1 | 0 | 1 | 0 | 1 | 1 | — | — | — | — | F | F | 2 |
| P172 | 0 | 1 | 0 | 1 | 0 | 1 | 1 | 0 | 0 | — | — | — | — | F | F | 2 |
| P173 | 0 | 1 | 0 | 1 | 0 | 1 | 1 | 0 | 1 | — | — | — | — | F | F | 2 |
| P174 | 0 | 1 | 0 | 1 | 0 | 1 | 1 | 1 | 0 | — | — | — | — | F | F | 2 |
| P175 | 0 | 1 | 0 | 1 | 0 | 1 | 1 | 1 | 1 | — | — | — | — | F | F | 2 |
| P176 | 0 | 1 | 0 | 1 | 1 | 0 | 0 | 0 | 0 | 19 | −12,+6 | 81 | +12,−6 | 2 | 2 | |
| P177 | 0 | 1 | 0 | 1 | 1 | 0 | 0 | 0 | 1 | 72 | +0,−0 | 28 | −0,+0 | 8 | 8 | 8 |
| P178 | 0 | 1 | 0 | 1 | 1 | 0 | 0 | 1 | 0 | — | — | — | — | F | F | 2 |
| P179 | 0 | 1 | 0 | 1 | 1 | 0 | 0 | 1 | 1 | — | — | — | — | F | F | 2 |
| P180 | 0 | 1 | 0 | 1 | 1 | 0 | 1 | 0 | 0 | — | — | — | — | F | F | 1,2 |
| P181 | 0 | 1 | 0 | 1 | 1 | 0 | 1 | 0 | 1 | — | — | — | — | F | F | 1,2 |
| P182 | 0 | 1 | 0 | 1 | 1 | 0 | 1 | 1 | 0 | — | — | — | — | F | F | 2 |
| P183 | 0 | 1 | 0 | 1 | 1 | 0 | 1 | 1 | 1 | — | — | — | — | F | F | 2 |
| P184 | 0 | 1 | 0 | 1 | 1 | 1 | 0 | 0 | 0 | — | — | — | — | F | F | 2 |
| P185 | 0 | 1 | 0 | 1 | 1 | 1 | 0 | 0 | 1 | — | — | — | — | F | F | 2 |
| P186 | 0 | 1 | 0 | 1 | 1 | 1 | 0 | 1 | 0 | — | — | — | — | F | F | 2 |
| P187 | 0 | 1 | 0 | 1 | 1 | 1 | 0 | 1 | 0 | — | — | — | — | F | F | 2 |
| P188 | 0 | 1 | 0 | 1 | 1 | 1 | 1 | 0 | 0 | — | — | — | — | F | F | 2 |
| P189 | 0 | 1 | 0 | 1 | 1 | 1 | 1 | 0 | 0 | — | — | — | — | F | F | 2 |
| P190 | 0 | 1 | 0 | 1 | 1 | 1 | 1 | 1 | 0 | — | — | — | — | F | F | 2 |
| P191 | 0 | 1 | 0 | 1 | 1 | 1 | 1 | 1 | 1 | — | — | — | — | F | F | 2 |
| P192 | 0 | 1 | 1 | 0 | 0 | 0 | 0 | 0 | 0 | 98 | +2,−2 | 2 | −2,+2 | B | B | |
| P193 | 0 | 1 | 1 | 0 | 0 | 0 | 0 | 0 | 1 | 100 | −25,+0 | 0 | +25,−0 | B | B | |
| P194 | 0 | 1 | 1 | 0 | 0 | 0 | 0 | 1 | 0 | 81 | +12,−6 | 19 | −12,+6 | 9 | 9 | |
| P195 | 0 | 1 | 1 | 0 | 0 | 0 | 0 | 1 | 1 | 87 | +6,−12 | 13 | −6,+12 | A | F | 3 |
| P196 | 0 | 1 | 1 | 0 | 0 | 0 | 1 | 0 | 0 | — | — | — | — | F | F | 1 |
| P197 | 0 | 1 | 1 | 0 | 0 | 0 | 1 | 0 | 1 | — | — | — | — | F | F | 1,2 |
| P198 | 0 | 1 | 1 | 0 | 0 | 0 | 1 | 1 | 0 | 72 | +0,−0 | 28 | −0,+0 | 8 | 8 | |
| P199 | 0 | 1 | 1 | 0 | 0 | 0 | 1 | 1 | 1 | — | — | — | — | F | F | 2 |
| P200 | 0 | 1 | 1 | 0 | 0 | 1 | 0 | 0 | 0 | — | — | — | — | F | F | 1 |
| P201 | 0 | 1 | 1 | 0 | 0 | 1 | 0 | 0 | 1 | — | — | — | — | F | F | 1,2 |
| P202 | 0 | 1 | 1 | 0 | 0 | 1 | 0 | 1 | 0 | — | — | — | — | F | F | 2 |
| P203 | 0 | 1 | 1 | 0 | 0 | 1 | 0 | 1 | 1 | — | — | — | — | F | F | 2 |
| P204 | 0 | 1 | 1 | 0 | 0 | 1 | 1 | 0 | 0 | — | — | — | — | F | F | 1 |
| P205 | 0 | 1 | 1 | 0 | 0 | 1 | 1 | 0 | 1 | — | — | — | — | F | F | 1,2 |
| P206 | 0 | 1 | 1 | 0 | 0 | 1 | 1 | 1 | 0 | — | — | — | — | F | F | 2 |
| P207 | 0 | 1 | 1 | 0 | 0 | 1 | 1 | 1 | 1 | — | — | — | — | F | F | 2 |
| P208 | 0 | 1 | 1 | 0 | 1 | 0 | 0 | 0 | 0 | — | — | — | — | F | F | 1 |
| P209 | 0 | 1 | 1 | 0 | 1 | 0 | 0 | 0 | 1 | — | — | — | — | F | F | 1,2 |
| P210 | 0 | 1 | 1 | 0 | 1 | 0 | 0 | 1 | 0 | — | — | — | — | F | F | 1,2 |
| P211 | 0 | 1 | 1 | 0 | 1 | 0 | 0 | 1 | 1 | — | — | — | — | F | F | 1,2 |
| P212 | 0 | 1 | 1 | 0 | 1 | 0 | 1 | 0 | 0 | — | — | — | — | F | F | 1,2 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P213 | 0 | 1 | 1 | 0 | 1 | 0 | 1 | 0 | 1 | — | — | — | — | F | F | 1,2 |
| P214 | 0 | 1 | 1 | 0 | 1 | 0 | 1 | 1 | 0 | — | — | — | — | F | F | 1,2 |
| P215 | 0 | 1 | 1 | 0 | 1 | 0 | 1 | 1 | 1 | — | — | — | — | F | F | 1,2 |
| P216 | 0 | 1 | 1 | 0 | 1 | 1 | 0 | 0 | 0 | — | — | — | — | F | F | 1,2 |
| P217 | 0 | 1 | 1 | 0 | 1 | 1 | 0 | 0 | 1 | — | — | — | — | F | F | 1,2 |
| P218 | 0 | 1 | 1 | 0 | 1 | 1 | 0 | 1 | 0 | — | — | — | — | F | F | 2 |
| P219 | 0 | 1 | 1 | 0 | 1 | 1 | 0 | 1 | 1 | — | — | — | — | F | F | 2 |
| P220 | 0 | 1 | 1 | 0 | 1 | 1 | 1 | 0 | 0 | — | — | — | — | F | F | 1,2 |
| P221 | 0 | 1 | 1 | 0 | 1 | 1 | 1 | 0 | 1 | — | — | — | — | F | F | 1,2 |
| P222 | 0 | 1 | 1 | 0 | 1 | 1 | 1 | 1 | 0 | — | — | — | — | F | F | 2 |
| P223 | 0 | 1 | 1 | 0 | 1 | 1 | 1 | 1 | 1 | — | — | — | — | F | F | 2 |
| P224 | 0 | 1 | 1 | 1 | 0 | 0 | 0 | 0 | 0 | 97 | +0,−0 | 3 | −0,+0 | B | F | 3 |
| P225 | 0 | 1 | 1 | 1 | 0 | 0 | 0 | 0 | 1 | 87 | +6,−12 | 13 | −6,+12 | A | F | 3 |
| P226 | 0 | 1 | 1 | 1 | 0 | 0 | 0 | 1 | 0 | — | — | — | — | F | F | 2 |
| P227 | 0 | 1 | 1 | 1 | 0 | 0 | 0 | 1 | 1 | — | — | — | — | F | F | 2 |
| P228 | 0 | 1 | 1 | 1 | 0 | 0 | 1 | 0 | 0 | — | — | — | — | F | F | 1,2 |
| P229 | 0 | 1 | 1 | 1 | 0 | 0 | 1 | 0 | 1 | — | — | — | — | F | F | 1,2 |
| P230 | 0 | 1 | 1 | 1 | 0 | 0 | 1 | 1 | 0 | — | — | — | — | F | F | 2 |
| P231 | 0 | 1 | 1 | 1 | 0 | 0 | 1 | 1 | 1 | — | — | — | — | F | F | 2 |
| P232 | 0 | 1 | 1 | 1 | 0 | 1 | 0 | 0 | 0 | — | — | — | — | F | F | 2 |
| P233 | 0 | 1 | 1 | 1 | 0 | 1 | 0 | 0 | 1 | — | — | — | — | F | F | 2 |
| P234 | 0 | 1 | 1 | 1 | 0 | 1 | 0 | 1 | 0 | — | — | — | — | F | F | 2 |
| P235 | 0 | 1 | 1 | 1 | 0 | 1 | 0 | 1 | 1 | — | — | — | — | F | F | 2 |
| P236 | 0 | 1 | 1 | 1 | 0 | 1 | 1 | 0 | 0 | — | — | — | — | F | F | 2 |
| P237 | 0 | 1 | 1 | 1 | 0 | 1 | 1 | 0 | 1 | — | — | — | — | F | F | 2 |
| P238 | 0 | 1 | 1 | 1 | 0 | 1 | 1 | 1 | 0 | — | — | — | — | F | F | 2 |
| P239 | 0 | 1 | 1 | 1 | 0 | 1 | 1 | 1 | 1 | — | — | — | — | F | F | 2 |
| P240 | 0 | 1 | 1 | 1 | 1 | 0 | 0 | 0 | 0 | 13 | −6,+12 | 87 | +6,−12 | 1 | F | 3 |
| P241 | 0 | 1 | 1 | 1 | 1 | 0 | 0 | 0 | 1 | — | — | — | — | F | F | 2 |
| P242 | 0 | 1 | 1 | 1 | 1 | 0 | 0 | 1 | 0 | — | — | — | — | F | F | 2 |
| P243 | 0 | 1 | 1 | 1 | 1 | 0 | 0 | 1 | 1 | — | — | — | — | F | F | 2 |
| P244 | 0 | 1 | 1 | 1 | 1 | 0 | 1 | 0 | 0 | — | — | — | — | F | F | 1,2 |
| P245 | 0 | 1 | 1 | 1 | 1 | 0 | 1 | 0 | 1 | — | — | — | — | F | F | 1,2 |
| P246 | 0 | 1 | 1 | 1 | 1 | 0 | 1 | 1 | 0 | — | — | — | — | F | F | 2 |
| P247 | 0 | 1 | 1 | 1 | 1 | 0 | 1 | 1 | 1 | — | — | — | — | F | F | 2 |
| P248 | 0 | 1 | 1 | 1 | 1 | 1 | 0 | 0 | 0 | — | — | — | — | F | F | 2 |
| P249 | 0 | 1 | 1 | 1 | 1 | 1 | 0 | 0 | 1 | — | — | — | — | F | F | 2 |
| P250 | 0 | 1 | 1 | 1 | 1 | 1 | 0 | 1 | 0 | — | — | — | — | F | F | 2 |
| P251 | 0 | 1 | 1 | 1 | 1 | 1 | 0 | 1 | 1 | — | — | — | — | F | F | 2 |
| P252 | 0 | 1 | 1 | 1 | 1 | 1 | 1 | 0 | 0 | — | — | — | — | F | F | 2 |
| P253 | 0 | 1 | 1 | 1 | 1 | 1 | 1 | 0 | 1 | — | — | — | — | F | F | 2 |
| P254 | 0 | 1 | 1 | 1 | 1 | 1 | 1 | 1 | 0 | — | — | — | — | F | F | 2 |
| P255 | 0 | 1 | 1 | 1 | 1 | 1 | 1 | 1 | 1 | — | — | — | — | F | F | 2 |
| P256 | 1 | 0 | 0 | 0 | 0 | 0 | 0 | 0 | 0 | — | — | — | — | F | F | 1 |
| P257 | 1 | 0 | 0 | 0 | 0 | 0 | 0 | 0 | 1 | — | — | — | — | F | F | 1 |
| P258 | 1 | 0 | 0 | 0 | 0 | 0 | 0 | 1 | 0 | — | — | — | — | F | F | 1 |
| P259 | 1 | 0 | 0 | 0 | 0 | 0 | 0 | 1 | 1 | — | — | — | — | F | F | 2 |
| P260 | 1 | 0 | 0 | 0 | 0 | 0 | 1 | 0 | 0 | — | — | — | — | F | F | 1 |
| P261 | 1 | 0 | 0 | 0 | 0 | 0 | 1 | 0 | 1 | — | — | — | — | F | F | 2 |
| P262 | 1 | 0 | 0 | 0 | 0 | 0 | 1 | 1 | 0 | — | — | — | — | F | F | 2 |
| P263 | 1 | 0 | 0 | 0 | 0 | 0 | 1 | 1 | 1 | — | — | — | — | F | F | 2 |
| P264 | 1 | 0 | 0 | 0 | 0 | 1 | 0 | 0 | 0 | — | — | — | — | F | F | 1 |
| P265 | 1 | 0 | 0 | 0 | 0 | 1 | 0 | 0 | 1 | 62 | +12,−6 | 38 | −12,+0 | 7 | 7 | |
| P266 | 1 | 0 | 0 | 0 | 0 | 1 | 0 | 1 | 0 | 28 | +0,−0 | 72 | −0,+0 | 3 | F | 3 |
| P267 | 1 | 0 | 0 | 0 | 0 | 1 | 0 | 1 | 1 | 28 | −3,+0 | 72 | +3,−0 | 3 | F | 3 |
| P268 | 1 | 0 | 0 | 0 | 0 | 1 | 1 | 0 | 0 | — | — | — | — | F | F | 2 |
| P269 | 1 | 0 | 0 | 0 | 0 | 1 | 1 | 0 | 1 | — | — | — | — | F | F | 2 |
| P270 | 1 | 0 | 0 | 0 | 0 | 1 | 1 | 1 | 0 | — | — | — | — | F | F | 2 |
| P271 | 1 | 0 | 0 | 0 | 0 | 1 | 1 | 1 | 1 | — | — | — | — | F | F | 2 |
| P272 | 1 | 0 | 0 | 0 | 1 | 0 | 0 | 0 | 0 | — | — | — | — | F | F | 1 |
| P273 | 1 | 0 | 0 | 0 | 1 | 0 | 0 | 0 | 1 | 50 | +22,−22 | 50 | −22,+22 | 5 | 5 | |
| P274 | 1 | 0 | 0 | 0 | 1 | 0 | 0 | 1 | 0 | 38 | −12,+0 | 62 | +12,−0 | 4 | 4 | |
| P275 | 1 | 0 | 0 | 0 | 1 | 0 | 0 | 1 | 1 | 38 | −9,+0 | 62 | +9,−0 | 4 | F | 3 |
| P276 | 1 | 0 | 0 | 0 | 1 | 0 | 1 | 0 | 0 | — | — | — | — | F | F | 2 |
| P277 | 1 | 0 | 0 | 0 | 1 | 0 | 1 | 0 | 1 | — | — | — | — | F | F | 1,2 |
| P278 | 1 | 0 | 0 | 0 | 1 | 0 | 1 | 1 | 0 | — | — | — | — | F | F | 2 |
| P279 | 1 | 0 | 0 | 0 | 1 | 0 | 1 | 1 | 1 | — | — | — | — | F | F | 2 |
| P280 | 1 | 0 | 0 | 0 | 1 | 1 | 0 | 0 | 0 | — | — | — | — | F | F | 2 |
| P281 | 1 | 0 | 0 | 0 | 1 | 1 | 0 | 0 | 1 | 62 | −9,+0 | 38 | +9,−0 | 7 | F | 3 |
| P282 | 1 | 0 | 0 | 0 | 1 | 1 | 0 | 1 | 0 | 25 | +3,−0 | 75 | −3,+0 | 2 | F | 3 |
| P283 | 1 | 0 | 0 | 0 | 1 | 1 | 0 | 1 | 1 | 28 | +0,−0 | 72 | −0,+0 | 3 | F | 3 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P284 | 1 | 0 | 0 | 0 | 1 | 1 | 1 | 0 | 0 | — | — | — | — | F | F | 2 |
| P285 | 1 | 0 | 0 | 0 | 1 | 1 | 1 | 0 | 1 | — | — | — | — | F | F | 2 |
| P286 | 1 | 0 | 0 | 0 | 1 | 1 | 1 | 1 | 0 | — | — | — | — | F | F | 2 |
| P287 | 1 | 0 | 0 | 0 | 1 | 1 | 1 | 1 | 1 | — | — | — | — | F | F | 2 |
| P288 | 1 | 0 | 0 | 1 | 0 | 0 | 0 | 0 | 0 | — | — | — | — | F | F | 1 |
| P289 | 1 | 0 | 0 | 1 | 0 | 0 | 0 | 0 | 1 | 62 | +12,−0 | 38 | −12,+0 | 7 | 7 | |
| P290 | 1 | 0 | 0 | 1 | 0 | 0 | 0 | 1 | 0 | 50 | +25,−25 | 50 | −25,+25 | 5 | 5 | |
| P291 | 1 | 0 | 0 | 1 | 0 | 0 | 0 | 1 | 1 | 62 | +12,−6 | 38 | −12,+6 | 7 | F | 3 |
| P292 | 1 | 0 | 0 | 1 | 0 | 0 | 1 | 0 | 0 | 38 | −12,+0 | 62 | +12,−0 | 4 | 4 | |
| P293 | 1 | 0 | 0 | 1 | 0 | 0 | 1 | 0 | 1 | — | — | — | — | F | F | 1,2 |
| P294 | 1 | 0 | 0 | 1 | 0 | 0 | 1 | 1 | 0 | 38 | +6,−12 | 62 | −6,+12 | 4 | F | 3 |
| P295 | 1 | 0 | 0 | 1 | 0 | 0 | 1 | 1 | 1 | — | — | — | — | F | F | 1,2 |
| P296 | 1 | 0 | 0 | 1 | 0 | 1 | 0 | 0 | 0 | 28 | +0,−0 | 72 | −0,+0 | 3 | F | 3 |
| P297 | 1 | 0 | 0 | 1 | 0 | 1 | 0 | 0 | 1 | — | — | — | — | F | F | 2 |
| P298 | 1 | 0 | 0 | 1 | 0 | 1 | 0 | 1 | 0 | — | — | — | — | F | F | 2 |
| P299 | 1 | 0 | 0 | 1 | 0 | 1 | 0 | 1 | 1 | — | — | — | — | F | F | 2 |
| P300 | 1 | 0 | 0 | 1 | 0 | 1 | 1 | 0 | 0 | 28 | −3,+0 | 72 | +3,−0 | 3 | F | 3 |
| P301 | 1 | 0 | 0 | 1 | 0 | 1 | 1 | 0 | 1 | — | — | — | — | F | F | 2 |
| P302 | 1 | 0 | 0 | 1 | 0 | 1 | 1 | 1 | 0 | — | — | — | — | F | F | 2 |
| P303 | 1 | 0 | 0 | 1 | 0 | 1 | 1 | 1 | 1 | — | — | — | — | F | F | 2 |
| P304 | 1 | 0 | 0 | 1 | 1 | 0 | 0 | 0 | 0 | — | — | — | — | F | F | 2 |
| P305 | 1 | 0 | 0 | 1 | 1 | 0 | 0 | 0 | 1 | 62 | +9,−0 | 38 | −9,+0 | 7 | F | 3 |
| P306 | 1 | 0 | 0 | 1 | 1 | 0 | 0 | 1 | 0 | 38 | +6,−12 | 62 | −6,+12 | 4 | F | 3 |
| P307 | 1 | 0 | 0 | 1 | 1 | 0 | 0 | 1 | 1 | 50 | +0,−0 | 50 | −0,+0 | 5 | F | 3 |
| P308 | 1 | 0 | 0 | 1 | 1 | 0 | 1 | 0 | 0 | — | — | — | — | F | F | 2 |
| P309 | 1 | 0 | 0 | 1 | 1 | 0 | 1 | 0 | 1 | — | — | — | — | F | F | 1,2 |
| P310 | 1 | 0 | 0 | 1 | 1 | 0 | 1 | 1 | 0 | — | — | — | — | F | F | 2 |
| P311 | 1 | 0 | 0 | 1 | 1 | 0 | 1 | 1 | 1 | — | — | — | — | F | F | 2 |
| P312 | 1 | 0 | 0 | 1 | 1 | 1 | 0 | 0 | 0 | — | — | — | — | F | F | 2 |
| P313 | 1 | 0 | 0 | 1 | 1 | 1 | 0 | 0 | 1 | — | — | — | — | F | F | 2 |
| P314 | 1 | 0 | 0 | 1 | 1 | 1 | 0 | 1 | 0 | — | — | — | — | F | F | 2 |
| P315 | 1 | 0 | 0 | 1 | 1 | 1 | 0 | 1 | 1 | — | — | — | — | F | F | 2 |
| P316 | 1 | 0 | 0 | 1 | 1 | 1 | 1 | 0 | 0 | — | — | — | — | F | F | 2 |
| P317 | 1 | 0 | 0 | 1 | 1 | 1 | 1 | 0 | 1 | — | — | — | — | F | F | 2 |
| P318 | 1 | 0 | 0 | 1 | 1 | 1 | 1 | 1 | 0 | — | — | — | — | F | F | 2 |
| P319 | 1 | 0 | 0 | 1 | 1 | 1 | 1 | 1 | 1 | — | — | — | — | F | F | 2 |
| P320 | 1 | 0 | 1 | 0 | 0 | 0 | 0 | 0 | 0 | — | — | — | — | F | F | 1 |
| P321 | 1 | 0 | 1 | 0 | 0 | 0 | 0 | 0 | 1 | — | — | — | — | F | F | 2 |
| P322 | 1 | 0 | 1 | 0 | 0 | 0 | 0 | 1 | 0 | 62 | +12,−12 | 38 | −12,+12 | 7 | 7 | |
| P323 | 1 | 0 | 1 | 0 | 0 | 0 | 0 | 1 | 1 | — | — | — | — | F | F | 2 |
| P324 | 1 | 0 | 1 | 0 | 0 | 0 | 1 | 0 | 0 | 50 | +22,−22 | 50 | −22,+22 | 5 | 5 | |
| P325 | 1 | 0 | 1 | 0 | 0 | 0 | 1 | 0 | 1 | — | — | — | — | F | F | 1,2 |
| P326 | 1 | 0 | 1 | 0 | 0 | 0 | 1 | 1 | 0 | 62 | +9,−0 | 38 | −9,+0 | 7 | F | |
| P327 | 1 | 0 | 1 | 0 | 0 | 0 | 1 | 1 | 1 | — | — | — | — | F | F | 2 |
| P328 | 1 | 0 | 1 | 0 | 0 | 1 | 0 | 0 | 0 | 38 | −12,+0 | 62 | +12,−0 | 4 | 4 | |
| P329 | 1 | 0 | 1 | 0 | 0 | 1 | 0 | 0 | 1 | — | — | — | — | F | F | 1,2 |
| P330 | 1 | 0 | 1 | 0 | 0 | 1 | 0 | 1 | 0 | — | — | — | — | F | F | 2 |
| P331 | 1 | 0 | 1 | 0 | 0 | 1 | 0 | 1 | 1 | — | — | — | — | F | F | 2 |
| P332 | 1 | 0 | 1 | 0 | 0 | 1 | 1 | 0 | 0 | 38 | −9,+0 | 62 | +9,−0 | 4 | F | 3 |
| P333 | 1 | 0 | 1 | 0 | 0 | 1 | 1 | 0 | 1 | — | — | — | — | F | F | 1,2 |
| P334 | 1 | 0 | 1 | 0 | 0 | 1 | 1 | 1 | 0 | — | — | — | — | F | F | 2 |
| P335 | 1 | 0 | 1 | 0 | 0 | 1 | 1 | 1 | 1 | — | — | — | — | F | F | 2 |
| P336 | 1 | 0 | 1 | 0 | 1 | 0 | 0 | 0 | 0 | — | — | — | — | F | F | 2 |
| P337 | 1 | 0 | 1 | 0 | 1 | 0 | 0 | 0 | 1 | — | — | — | — | F | F | 1,2 |
| P338 | 1 | 0 | 1 | 0 | 1 | 0 | 0 | 1 | 0 | — | — | — | — | F | F | 1,2 |
| P339 | 1 | 0 | 1 | 0 | 1 | 0 | 0 | 1 | 1 | — | — | — | — | F | F | 1,2 |
| P340 | 1 | 0 | 1 | 0 | 1 | 0 | 1 | 0 | 0 | — | — | — | — | F | F | 1,2 |
| P341 | 1 | 0 | 1 | 0 | 1 | 0 | 1 | 0 | 1 | — | — | — | — | F | F | 1,2 |
| P342 | 1 | 0 | 1 | 0 | 1 | 0 | 1 | 1 | 0 | — | — | — | — | F | F | 1,2 |
| P343 | 1 | 0 | 1 | 0 | 1 | 0 | 1 | 1 | 1 | — | — | — | — | F | F | 1,2 |
| P344 | 1 | 0 | 1 | 0 | 1 | 1 | 0 | 0 | 0 | — | — | — | — | F | F | 2 |
| P345 | 1 | 0 | 1 | 0 | 1 | 1 | 0 | 0 | 1 | — | — | — | — | F | F | 1,2 |
| P346 | 1 | 0 | 1 | 0 | 1 | 1 | 0 | 1 | 0 | — | — | — | — | F | F | 1,2 |
| P347 | 1 | 0 | 1 | 0 | 1 | 1 | 0 | 1 | 1 | — | — | — | — | F | F | 1,2 |
| P348 | 1 | 0 | 1 | 0 | 1 | 1 | 1 | 0 | 0 | — | — | — | — | F | F | 2 |
| P349 | 1 | 0 | 1 | 0 | 1 | 1 | 1 | 0 | 1 | — | — | — | — | F | F | 1,2 |
| P350 | 1 | 0 | 1 | 0 | 1 | 1 | 1 | 1 | 0 | — | — | — | — | F | F | 2 |
| P351 | 1 | 0 | 1 | 0 | 1 | 1 | 1 | 1 | 1 | — | — | — | — | F | F | 1,2 |
| P352 | 1 | 0 | 1 | 1 | 0 | 0 | 0 | 0 | 0 | — | — | — | — | F | F | 2 |
| P353 | 1 | 0 | 1 | 1 | 0 | 0 | 0 | 0 | 1 | — | — | — | — | F | F | 2 |
| P354 | 1 | 0 | 1 | 1 | 0 | 0 | 0 | 1 | 0 | 62 | +12,−6 | 38 | −12,+6 | 7 | F | 3 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P355 | 1 | 0 | 1 | 1 | 0 | 0 | 0 | 1 | 1 | — | — | — | — | F | F | 2 |
| P356 | 1 | 0 | 1 | 1 | 0 | 0 | 1 | 0 | 0 | 38 | +9,–0 | 62 | –9,+0 | 4 | F | 3 |
| P357 | 1 | 0 | 1 | 1 | 0 | 0 | 1 | 0 | 1 | — | — | — | — | F | F | 1,2 |
| P358 | 1 | 0 | 1 | 1 | 0 | 0 | 1 | 1 | 0 | 50 | +0,–0 | 50 | –0,+0 | 5 | F | 3 |
| P359 | 1 | 0 | 1 | 1 | 0 | 0 | 1 | 1 | 1 | — | — | — | — | F | F | 2 |
| P360 | 1 | 0 | 1 | 1 | 0 | 1 | 0 | 0 | 0 | 28 | –3,+0 | 72 | +3,–0 | 3 | F | 3 |
| P361 | 1 | 0 | 1 | 1 | 0 | 1 | 0 | 0 | 1 | — | — | — | — | F | F | 2 |
| P362 | 1 | 0 | 1 | 1 | 0 | 1 | 0 | 1 | 0 | — | — | — | — | F | F | 2 |
| P363 | 1 | 0 | 1 | 1 | 0 | 1 | 0 | 1 | 1 | — | — | — | — | F | F | 2 |
| P364 | 1 | 0 | 1 | 1 | 0 | 1 | 1 | 0 | 0 | 28 | +0,–0 | 72 | –0,+0 | 3 | F | 3 |
| P365 | 1 | 0 | 1 | 1 | 0 | 1 | 1 | 0 | 1 | — | — | — | — | F | F | 1,2 |
| P366 | 1 | 0 | 1 | 1 | 0 | 1 | 1 | 1 | 0 | — | — | — | — | F | F | 2 |
| P367 | 1 | 0 | 1 | 1 | 0 | 1 | 1 | 1 | 1 | — | — | — | — | F | F | 2 |
| P368 | 1 | 0 | 1 | 1 | 1 | 0 | 0 | 0 | 0 | — | — | — | — | F | F | 2 |
| P369 | 1 | 0 | 1 | 1 | 1 | 0 | 0 | 0 | 1 | — | — | — | — | F | F | 2 |
| P370 | 1 | 0 | 1 | 1 | 1 | 0 | 0 | 1 | 0 | — | — | — | — | F | F | 2 |
| P371 | 1 | 0 | 1 | 1 | 1 | 0 | 0 | 1 | 1 | — | — | — | — | F | F | 2 |
| P372 | 1 | 0 | 1 | 1 | 1 | 0 | 1 | 0 | 0 | — | — | — | — | F | F | 2 |
| P373 | 1 | 0 | 1 | 1 | 1 | 0 | 1 | 0 | 1 | — | — | — | — | F | F | 1,2 |
| P374 | 1 | 0 | 1 | 1 | 1 | 0 | 1 | 1 | 0 | — | — | — | — | F | F | 2 |
| P375 | 1 | 0 | 1 | 1 | 1 | 0 | 1 | 1 | 1 | — | — | — | — | F | F | 2 |
| P376 | 1 | 0 | 1 | 1 | 1 | 1 | 0 | 0 | 0 | — | — | — | — | F | F | 2 |
| P377 | 1 | 0 | 1 | 1 | 1 | 1 | 0 | 0 | 1 | — | — | — | — | F | F | 2 |
| P378 | 1 | 0 | 1 | 1 | 1 | 1 | 0 | 1 | 0 | — | — | — | — | F | F | 2 |
| P379 | 1 | 0 | 1 | 1 | 1 | 1 | 0 | 1 | 1 | — | — | — | — | F | F | 2 |
| P380 | 1 | 0 | 1 | 1 | 1 | 1 | 1 | 0 | 0 | — | — | — | — | F | F | 2 |
| P381 | 1 | 0 | 1 | 1 | 1 | 1 | 1 | 0 | 1 | — | — | — | — | F | F | 1,2 |
| P382 | 1 | 0 | 1 | 1 | 1 | 1 | 1 | 1 | 0 | — | — | — | — | F | F | 2 |
| P383 | 1 | 0 | 1 | 1 | 1 | 1 | 1 | 1 | 1 | — | — | — | — | F | F | 2 |
| P384 | 1 | 1 | 0 | 0 | 0 | 0 | 0 | 0 | 0 | — | — | — | — | F | F | 1 |
| P385 | 1 | 1 | 0 | 0 | 0 | 0 | 0 | 0 | 1 | — | — | — | — | F | F | 2 |
| P386 | 1 | 1 | 0 | 0 | 0 | 0 | 0 | 1 | 0 | 72 | +0,–0 | 28 | –0,+0 | 8 | F | 3 |
| P387 | 1 | 1 | 0 | 0 | 0 | 0 | 0 | 1 | 1 | — | — | — | — | F | F | 2 |
| P388 | 1 | 1 | 0 | 0 | 0 | 0 | 1 | 0 | 0 | 62 | +12,–0 | 38 | –12,+0 | 7 | 7 | |
| P389 | 1 | 1 | 0 | 0 | 0 | 0 | 1 | 0 | 1 | — | — | — | — | F | F | 2 |
| P390 | 1 | 1 | 0 | 0 | 0 | 0 | 1 | 1 | 0 | 72 | +3,–0 | 28 | –3,+0 | 8 | F | 3 |
| P391 | 1 | 1 | 0 | 0 | 0 | 0 | 1 | 1 | 1 | — | — | — | — | F | F | 2 |
| P392 | 1 | 1 | 0 | 0 | 0 | 1 | 0 | 0 | 0 | 50 | +25,–25 | 50 | –25,+25 | 5 | 5 | |
| P393 | 1 | 1 | 0 | 0 | 0 | 1 | 0 | 0 | 1 | 62 | –6,+12 | 38 | +6,–12 | 7 | F | 3 |
| P394 | 1 | 1 | 0 | 0 | 0 | 1 | 0 | 1 | 0 | — | — | — | — | F | F | 2 |
| P395 | 1 | 1 | 0 | 0 | 0 | 1 | 0 | 1 | 1 | — | — | — | — | F | F | 2 |
| P396 | 1 | 1 | 0 | 0 | 0 | 1 | 1 | 0 | 0 | 62 | –6,+12 | 38 | –6,–12 | 7 | F | 3 |
| P397 | 1 | 1 | 0 | 0 | 0 | 1 | 1 | 0 | 1 | — | — | — | — | F | F | 2 |
| P398 | 1 | 1 | 0 | 0 | 0 | 1 | 1 | 1 | 0 | — | — | — | — | F | F | 2 |
| P399 | 1 | 1 | 0 | 0 | 0 | 1 | 1 | 1 | 1 | — | — | — | — | F | F | 2 |
| P400 | 1 | 1 | 0 | 0 | 1 | 0 | 0 | 0 | 0 | 38 | –12,+0 | 62 | +12,–0 | 4 | 4 | |
| P401 | 1 | 1 | 0 | 0 | 1 | 0 | 0 | 0 | 1 | 38 | +9,–0 | 62 | –9,+0 | 4 | F | 3 |
| P402 | 1 | 1 | 0 | 0 | 1 | 0 | 0 | 1 | 0 | — | — | — | — | F | F | 2 |
| P403 | 1 | 1 | 0 | 0 | 1 | 0 | 0 | 1 | 1 | — | — | — | — | F | F | 2 |
| P404 | 1 | 1 | 0 | 0 | 1 | 0 | 1 | 0 | 0 | — | — | — | — | F | F | 2 |
| P405 | 1 | 1 | 0 | 0 | 1 | 0 | 1 | 0 | 1 | — | — | — | — | F | F | 1,2 |
| P406 | 1 | 1 | 0 | 0 | 1 | 0 | 1 | 1 | 0 | — | — | — | — | F | F | 2 |
| P407 | 1 | 1 | 0 | 0 | 1 | 0 | 1 | 1 | 1 | — | — | — | — | F | F | 2 |
| P408 | 1 | 1 | 0 | 0 | 1 | 1 | 0 | 0 | 0 | 38 | –12,+6 | 62 | +12,–6 | 4 | F | 3 |
| P409 | 1 | 1 | 0 | 0 | 1 | 1 | 0 | 0 | 1 | 50 | +0,–0 | 50 | –0,+0 | 5 | F | 3 |
| P410 | 1 | 1 | 0 | 0 | 1 | 1 | 0 | 1 | 0 | — | — | — | — | F | F | 2 |
| P411 | 1 | 1 | 0 | 0 | 1 | 1 | 0 | 1 | 1 | — | — | — | — | F | F | 2 |
| P412 | 1 | 1 | 0 | 0 | 1 | 1 | 1 | 0 | 0 | — | — | — | — | F | F | 1,2 |
| P413 | 1 | 1 | 0 | 0 | 1 | 1 | 1 | 0 | 1 | — | — | — | — | F | F | 1,2 |
| P414 | 1 | 1 | 0 | 0 | 1 | 1 | 1 | 1 | 0 | — | — | — | — | F | F | 2 |
| P415 | 1 | 1 | 0 | 0 | 1 | 1 | 1 | 1 | 1 | — | — | — | — | F | F | 2 |
| P416 | 1 | 1 | 0 | 1 | 0 | 0 | 0 | 0 | 0 | 72 | +0,–0 | 28 | –0,+0 | 8 | F | 3 |
| P417 | 1 | 1 | 0 | 1 | 0 | 0 | 0 | 0 | 1 | 72 | +3,–0 | 28 | –3,+0 | 8 | F | 3 |
| P418 | 1 | 1 | 0 | 1 | 0 | 0 | 0 | 1 | 0 | — | — | — | — | F | F | 2 |
| P419 | 1 | 1 | 0 | 1 | 0 | 0 | 0 | 1 | 1 | — | — | — | — | F | F | 2 |
| P420 | 1 | 1 | 0 | 1 | 0 | 0 | 1 | 0 | 0 | — | — | — | — | F | F | 1,2 |
| P421 | 1 | 1 | 0 | 1 | 0 | 0 | 1 | 0 | 1 | — | — | — | — | F | F | 1,2 |
| P422 | 1 | 1 | 0 | 1 | 0 | 0 | 1 | 1 | 0 | — | — | — | — | F | F | 2 |
| P423 | 1 | 1 | 0 | 1 | 0 | 0 | 1 | 1 | 1 | — | — | — | — | F | F | 2 |
| P424 | 1 | 1 | 0 | 1 | 0 | 1 | 0 | 0 | 0 | — | — | — | — | F | F | 2 |
| P425 | 1 | 1 | 0 | 1 | 0 | 1 | 0 | 0 | 1 | — | — | — | — | F | F | 2 |

-continued

| | | | | | | | | | | | | | | | | |
|---|---|---|---|---|---|---|---|---|---|---|---|---|---|---|---|---|
| | | | | | | | | | OUTPUT WEIGHT | | | | | | | |
| INPUT CONDITIONS | | | | | | | | | PLUS | | MINUS | | RIGHT ANGLE | | | |
| | SUB-PIXEL CONDITIONS | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P426 | 1 | 1 | 0 | 1 | 0 | 1 | 0 | 1 | 0 | — | — | — | — | F | F | 2 |
| P427 | 1 | 1 | 0 | 1 | 0 | 1 | 0 | 1 | 1 | — | — | — | — | F | F | 2 |
| P428 | 1 | 1 | 0 | 1 | 0 | 1 | 1 | 0 | 0 | — | — | — | — | F | F | 2 |
| P429 | 1 | 1 | 0 | 1 | 0 | 1 | 1 | 0 | 1 | — | — | — | — | F | F | 1,2 |
| P430 | 1 | 1 | 0 | 1 | 0 | 1 | 1 | 1 | 0 | — | — | — | — | F | F | 2 |
| P431 | 1 | 1 | 0 | 1 | 0 | 1 | 1 | 1 | 1 | — | — | — | — | F | F | 2 |
| P432 | 1 | 1 | 0 | 1 | 1 | 0 | 0 | 0 | 0 | 75 | −3,+0 | 25 | +3,−0 | 8 | F | 3 |
| P433 | 1 | 1 | 0 | 1 | 1 | 0 | 0 | 0 | 1 | 72 | +0,−0 | 28 | −0,+0 | 8 | F | 3 |
| P434 | 1 | 1 | 0 | 1 | 1 | 0 | 0 | 1 | 0 | — | — | — | — | F | F | 2 |
| P435 | 1 | 1 | 0 | 1 | 1 | 0 | 0 | 1 | 1 | — | — | — | — | F | F | 2 |
| P436 | 1 | 1 | 0 | 1 | 1 | 0 | 1 | 0 | 0 | — | — | — | — | F | F | 2 |
| P437 | 1 | 1 | 0 | 1 | 1 | 0 | 1 | 0 | 1 | — | — | — | — | F | F | 1,2 |
| P438 | 1 | 1 | 0 | 1 | 1 | 0 | 1 | 1 | 0 | — | — | — | — | F | F | 1,2 |
| P439 | 1 | 1 | 0 | 1 | 1 | 0 | 1 | 1 | 1 | — | — | — | — | F | F | 2 |
| P440 | 1 | 1 | 0 | 1 | 1 | 1 | 0 | 0 | 0 | — | — | — | — | F | F | 2 |
| P441 | 1 | 1 | 0 | 1 | 1 | 1 | 0 | 0 | 1 | — | — | — | — | F | F | 2 |
| P442 | 1 | 1 | 0 | 1 | 1 | 1 | 0 | 1 | 0 | — | — | — | — | F | F | 2 |
| P443 | 1 | 1 | 0 | 1 | 1 | 1 | 0 | 1 | 1 | — | — | — | — | F | F | 2 |
| P444 | 1 | 1 | 0 | 1 | 1 | 1 | 1 | 0 | 0 | — | — | — | — | F | F | 2 |
| P445 | 1 | 1 | 0 | 1 | 1 | 1 | 1 | 0 | 1 | — | — | — | — | F | F | 1,2 |
| P446 | 1 | 1 | 0 | 1 | 1 | 1 | 1 | 1 | 0 | — | — | — | — | F | F | 2 |
| P447 | 1 | 1 | 0 | 1 | 1 | 1 | 1 | 1 | 1 | — | — | — | — | F | F | 2 |
| P448 | 1 | 1 | 1 | 0 | 0 | 0 | 0 | 0 | 0 | — | — | — | — | F | F | 2 |
| P449 | 1 | 1 | 1 | 0 | 0 | 0 | 0 | 0 | 1 | — | — | — | — | F | F | 2 |
| P450 | 1 | 1 | 1 | 0 | 0 | 0 | 0 | 1 | 0 | 72 | +3,−0 | 28 | −3,+0 | 8 | F | 3 |
| P451 | 1 | 1 | 1 | 0 | 0 | 0 | 0 | 1 | 1 | — | — | — | — | F | F | 2 |
| P452 | 1 | 1 | 1 | 0 | 0 | 0 | 1 | 0 | 0 | 62 | +9,−0 | 38 | −9,+0 | 7 | F | 3 |
| P453 | 1 | 1 | 1 | 0 | 0 | 0 | 1 | 0 | 1 | — | — | — | — | F | F | 2 |
| P454 | 1 | 1 | 1 | 0 | 0 | 0 | 1 | 1 | 0 | 72 | +0,−0 | 28 | −0,+0 | 8 | F | 3 |
| P455 | 1 | 1 | 1 | 0 | 0 | 0 | 1 | 1 | 1 | — | — | — | — | F | F | 2 |
| P456 | 1 | 1 | 1 | 0 | 0 | 1 | 0 | 0 | 0 | 38 | −12,+6 | 62 | +12,−6 | 4 | F | 3 |
| P457 | 1 | 1 | 1 | 0 | 0 | 1 | 0 | 0 | 1 | — | — | — | — | F | F | 1,2 |
| P458 | 1 | 1 | 1 | 0 | 0 | 1 | 0 | 1 | 0 | — | — | — | — | F | F | 2 |
| P459 | 1 | 1 | 1 | 0 | 0 | 1 | 0 | 1 | 1 | — | — | — | — | F | F | 1,2 |
| P460 | 1 | 1 | 1 | 0 | 0 | 1 | 1 | 0 | 0 | 50 | +0,−0 | 50 | −0,+0 | 5 | F | 3 |
| P461 | 1 | 1 | 1 | 0 | 0 | 1 | 1 | 0 | 1 | — | — | — | — | F | F | 1,2 |
| P462 | 1 | 1 | 1 | 0 | 0 | 1 | 1 | 1 | 0 | — | — | — | — | F | F | 2 |
| P463 | 1 | 1 | 1 | 0 | 0 | 1 | 1 | 1 | 1 | — | — | — | — | F | F | 2 |
| P464 | 1 | 1 | 1 | 0 | 1 | 0 | 0 | 0 | 0 | — | — | — | — | F | F | 2 |
| P465 | 1 | 1 | 1 | 0 | 1 | 0 | 0 | 0 | 1 | — | — | — | — | F | F | 2 |
| P466 | 1 | 1 | 1 | 0 | 1 | 0 | 0 | 1 | 0 | — | — | — | — | F | F | 1,2 |
| P467 | 1 | 1 | 1 | 0 | 1 | 0 | 0 | 1 | 1 | — | — | — | — | F | F | 2 |
| P468 | 1 | 1 | 1 | 0 | 1 | 0 | 1 | 0 | 0 | — | — | — | — | F | F | 1,2 |
| P469 | 1 | 1 | 1 | 0 | 1 | 0 | 1 | 0 | 1 | — | — | — | — | F | F | 1,2 |
| P470 | 1 | 1 | 1 | 0 | 1 | 0 | 1 | 1 | 0 | — | — | — | — | F | F | 1,2 |
| P471 | 1 | 1 | 1 | 0 | 1 | 0 | 1 | 1 | 1 | — | — | — | — | F | F | 1,2 |
| P472 | 1 | 1 | 1 | 0 | 1 | 1 | 0 | 0 | 0 | — | — | — | — | F | F | 2 |
| P473 | 1 | 1 | 1 | 0 | 1 | 1 | 0 | 0 | 1 | — | — | — | — | F | F | 2 |
| P474 | 1 | 1 | 1 | 0 | 1 | 1 | 0 | 1 | 0 | — | — | — | — | F | F | 2 |
| P475 | 1 | 1 | 1 | 0 | 1 | 1 | 0 | 1 | 1 | — | — | — | — | F | F | 2 |
| P476 | 1 | 1 | 1 | 0 | 1 | 1 | 1 | 0 | 0 | — | — | — | — | F | F | 2 |
| P477 | 1 | 1 | 1 | 0 | 1 | 1 | 1 | 0 | 1 | — | — | — | — | F | F | 2 |
| P478 | 1 | 1 | 1 | 0 | 1 | 1 | 1 | 1 | 0 | — | — | — | — | F | F | 2 |
| P479 | 1 | 1 | 1 | 0 | 1 | 1 | 1 | 1 | 1 | — | — | — | — | F | F | 2 |
| P480 | 1 | 1 | 1 | 1 | 0 | 0 | 0 | 0 | 0 | — | — | — | — | F | F | 2 |
| P481 | 1 | 1 | 1 | 1 | 0 | 0 | 0 | 0 | 1 | — | — | — | — | F | F | 2 |
| P482 | 1 | 1 | 1 | 1 | 0 | 0 | 0 | 1 | 0 | — | — | — | — | F | F | 2 |
| P483 | 1 | 1 | 1 | 1 | 0 | 0 | 0 | 1 | 1 | — | — | — | — | F | F | 2 |
| P484 | 1 | 1 | 1 | 1 | 0 | 0 | 1 | 0 | 0 | — | — | — | — | F | F | 2 |
| P485 | 1 | 1 | 1 | 1 | 0 | 0 | 1 | 0 | 1 | — | — | — | — | F | F | 2 |
| P486 | 1 | 1 | 1 | 1 | 0 | 0 | 1 | 1 | 0 | — | — | — | — | F | F | 2 |
| P487 | 1 | 1 | 1 | 1 | 0 | 0 | 1 | 1 | 1 | — | — | — | — | F | F | 2 |
| P488 | 1 | 1 | 1 | 1 | 0 | 1 | 0 | 0 | 0 | — | — | — | — | F | F | 2 |
| P489 | 1 | 1 | 1 | 1 | 0 | 1 | 0 | 0 | 1 | — | — | — | — | F | F | 2 |
| P490 | 1 | 1 | 1 | 1 | 0 | 1 | 0 | 1 | 0 | — | — | — | — | F | F | 2 |
| P491 | 1 | 1 | 1 | 1 | 0 | 1 | 0 | 1 | 1 | — | — | — | — | F | F | 2 |
| P492 | 1 | 1 | 1 | 1 | 0 | 1 | 1 | 0 | 0 | — | — | — | — | F | F | 2 |
| P493 | 1 | 1 | 1 | 1 | 0 | 1 | 1 | 0 | 1 | — | — | — | — | F | F | 1,2 |
| P494 | 1 | 1 | 1 | 1 | 0 | 1 | 1 | 1 | 0 | — | — | — | — | F | F | 2 |
| P495 | 1 | 1 | 1 | 1 | 0 | 1 | 1 | 1 | 1 | — | — | — | — | F | F | 2 |
| P496 | 1 | 1 | 1 | 1 | 1 | 0 | 0 | 0 | 0 | — | — | — | — | F | F | 2 |

-continued

| | | | | | | | | | | OUTPUT WEIGHT | | | | | | |
|---|---|---|---|---|---|---|---|---|---|---|---|---|---|---|---|---|
| INPUT CONDITIONS | | | | | | | | | | PLUS | | MINUS | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P497 | 1 | 1 | 1 | 1 | 1 | 0 | 0 | 0 | 1 | — | — | — | — | F | F | 2 |
| P498 | 1 | 1 | 1 | 1 | 1 | 0 | 0 | 1 | 0 | — | — | — | — | F | F | 2 |
| P499 | 1 | 1 | 1 | 1 | 1 | 0 | 0 | 1 | 1 | — | — | — | — | F | F | 2 |
| P500 | 1 | 1 | 1 | 1 | 1 | 0 | 1 | 0 | 0 | — | — | — | — | F | F | 2 |
| P501 | 1 | 1 | 1 | 1 | 1 | 0 | 1 | 0 | 1 | — | — | — | — | F | F | 1,2 |
| P502 | 1 | 1 | 1 | 1 | 1 | 0 | 1 | 1 | 0 | — | — | — | — | F | F | 2 |
| P503 | 1 | 1 | 1 | 1 | 1 | 0 | 1 | 1 | 1 | — | — | — | — | F | F | 2 |
| P504 | 1 | 1 | 1 | 1 | 1 | 1 | 0 | 0 | 0 | — | — | — | — | F | F | 2 |
| P505 | 1 | 1 | 1 | 1 | 1 | 1 | 0 | 0 | 1 | — | — | — | — | F | F | 2 |
| P506 | 1 | 1 | 1 | 1 | 1 | 1 | 0 | 1 | 0 | — | — | — | — | F | F | 2 |
| P507 | 1 | 1 | 1 | 1 | 1 | 1 | 0 | 1 | 1 | — | — | — | — | F | F | 2 |
| P508 | 1 | 1 | 1 | 1 | 1 | 1 | 1 | 0 | 0 | — | — | — | — | F | F | 2 |
| P509 | 1 | 1 | 1 | 1 | 1 | 1 | 1 | 0 | 1 | — | — | — | — | F | F | 2 |
| P510 | 1 | 1 | 1 | 1 | 1 | 1 | 1 | 1 | 0 | — | — | — | — | F | F | 2 |
| P511 | 1 | 1 | 1 | 1 | 1 | 1 | 1 | 1 | 1 | — | — | — | — | F | F | 2 |

SUB-PIXEL CONDITIONS

G,257

| | | | | | | | | | | OUTPUT WEIGHT | | | | | | |
|---|---|---|---|---|---|---|---|---|---|---|---|---|---|---|---|---|
| INPUT CONDITIONS | | | | | | | | | | INSIDE | | OUTSIDE | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ±% | % | ±% | HEX | HEX | NOTES |
| P0 | 0 | 0 | 0 | 0 | 0 | 0 | 0 | 0 | 0 | — | — | — | — | F | F | 4 |
| P1 | 0 | 0 | 0 | 0 | 0 | 0 | 0 | 0 | 1 | — | — | — | — | F | F | 4 |
| P2 | 0 | 0 | 0 | 0 | 0 | 0 | 0 | 1 | 0 | — | — | — | — | F | F | 4 |
| ↑↓ | | | | | ↑↓ | | | | | ↑↓ | ↑↓ | ↑↓ | ↑↓ | ↑↓ | ↑↓ | ↑↓ |
| P253 | 0 | 1 | 1 | 1 | 1 | 1 | 1 | 0 | 1 | — | — | — | — | F | F | 4 |
| P254 | 0 | 1 | 1 | 1 | 1 | 1 | 1 | 1 | 0 | — | — | — | — | F | F | 4 |
| P255 | 0 | 1 | 1 | 1 | 1 | 1 | 1 | 1 | 1 | — | — | — | — | F | F | 4 |
| P256 | 1 | 0 | 0 | 0 | 0 | 0 | 0 | 0 | 0 | — | — | — | — | F | F | 1 |
| P267 | 1 | 0 | 0 | 0 | 0 | 0 | 0 | 0 | 1 | — | — | — | — | F | F | 1 |
| P258 | 1 | 0 | 0 | 0 | 0 | 0 | 0 | 1 | 0 | — | — | — | — | F | F | 1 |
| P259 | 1 | 0 | 0 | 0 | 0 | 0 | 0 | 1 | 1 | 13 | +12,–6 | 87 | –12,+6 | 1 | 1 | |
| P260 | 1 | 0 | 0 | 0 | 0 | 0 | 1 | 0 | 0 | — | — | — | — | F | F | 1 |
| P261 | 1 | 0 | 0 | 0 | 0 | 0 | 1 | 0 | 1 | 25 | +12,–12 | 75 | –12,+12 | 2 | 2 | |
| P262 | 1 | 0 | 0 | 0 | 0 | 0 | 1 | 1 | 0 | 13 | +12,–6 | 87 | –12,+6 | 1 | 1 | |
| P263 | 1 | 0 | 0 | 0 | 0 | 0 | 1 | 1 | 1 | 13 | +0, –0 | 87 | –0, +0 | 1 | 1 | |
| P264 | 1 | 0 | 0 | 0 | 0 | 1 | 0 | 0 | 0 | — | — | — | — | F | F | 1 |
| P265 | 1 | 0 | 0 | 0 | 0 | 1 | 0 | 0 | 1 | 38 | +12,–12 | 62 | –12,+12 | 4 | 4 | |
| P266 | 1 | 0 | 0 | 0 | 0 | 1 | 0 | 1 | 0 | 25 | +12,–12 | 75 | –12,+12 | 2 | 2 | |
| P267 | 1 | 0 | 0 | 0 | 0 | 1 | 0 | 1 | 1 | 31 | +6,–6 | 69 | –6,+6 | 3 | 3 | |
| P268 | 1 | 0 | 0 | 0 | 0 | 1 | 1 | 0 | 0 | 13 | +12,–6 | 87 | –6,+12 | 1 | 1 | |
| P269 | 1 | 0 | 0 | 0 | 0 | 1 | 1 | 0 | 1 | 31 | +6,–6 | 69 | –6,+6 | 3 | 3 | |
| P270 | 1 | 0 | 0 | 0 | 0 | 1 | 1 | 1 | 0 | 13 | +0,–0 | 87 | –0,+0 | 1 | 1 | |
| P271 | 1 | 0 | 0 | 0 | 0 | 1 | 1 | 1 | 1 | 25 | +0,–0 | 75 | –0,–0 | 2 | 2 | |
| P272 | 1 | 0 | 0 | 0 | 1 | 0 | 0 | 0 | 0 | — | — | — | — | F | F | 1 |
| P273 | 1 | 0 | 0 | 0 | 1 | 0 | 0 | 0 | 1 | 50 | +0,–12 | 50 | –0,+12 | 5 | 5 | |
| P274 | 1 | 0 | 0 | 0 | 1 | 0 | 0 | 1 | 0 | 38 | +12,–12 | 62 | –12,+12 | 4 | 4 | |
| P275 | 1 | 0 | 0 | 0 | 1 | 0 | 0 | 1 | 1 | 44 | +6,–6 | 56 | –6,+6 | 5 | 5 | |
| P276 | 1 | 0 | 0 | 0 | 1 | 0 | 1 | 0 | 0 | 25 | +12,–12 | 75 | –12,+12 | 2 | 2 | |
| P277 | 1 | 0 | 0 | 0 | 1 | 0 | 1 | 0 | 1 | — | — | — | — | F | F | 1,2 |
| P278 | 1 | 0 | 0 | 0 | 1 | 0 | 1 | 1 | 0 | — | +6,–6 | 69 | –6,+6 | 3 | 3 | |
| P279 | 1 | 0 | 0 | 0 | 1 | 0 | 1 | 1 | 1 | — | — | — | — | F | F | 2 |
| P280 | 1 | 0 | 0 | 0 | 1 | 1 | 0 | 0 | 0 | 13 | +12,–6 | 87 | –12,+6 | 1 | 1 | |
| P281 | 1 | 0 | 0 | 0 | 1 | 1 | 0 | 0 | 1 | 44 | +6,–6 | 56 | –6,+6 | 5 | 5 | |
| P282 | 1 | 0 | 0 | 0 | 1 | 1 | 0 | 1 | 0 | 31 | +6,–6 | 69 | –6,+6 | 3 | 3 | |
| P283 | 1 | 0 | 0 | 0 | 1 | 1 | 0 | 1 | 1 | 38 | +0,–0 | 62 | –0,+0 | 4 | 4 | |
| P284 | 1 | 0 | 0 | 0 | 1 | 1 | 1 | 0 | 0 | 13 | +0,–0 | 87 | –0,+0 | 1 | 1 | |
| P285 | 1 | 0 | 0 | 0 | 1 | 1 | 1 | 0 | 1 | — | — | — | — | F | F | 2 |
| P286 | 1 | 0 | 0 | 0 | 1 | 1 | 1 | 1 | 0 | 25 | +0,–0 | 75 | –0,+0 | 2 | 2 | |

-continued

| | | | | | | | | | | OUTPUT WEIGHT | | | | | | |
|---|---|---|---|---|---|---|---|---|---|---|---|---|---|---|---|---|
| INPUT CONDITIONS | | | | | | | | | | INSIDE | | OUTSIDE | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ±% | % | ±% | HEX | HEX | NOTES |
| P287 | 1 | 0 | 0 | 0 | 1 | 1 | 1 | 1 | 1 | — | — | — | — | F | F | 2 |
| P288 | 1 | 0 | 0 | 1 | 0 | 0 | 0 | 0 | 0 | — | — | — | — | F | F | 2 |
| P289 | 1 | 0 | 0 | 1 | 0 | 0 | 0 | 0 | 1 | 38 | +12,–12 | 62 | –12,+12 | 4 | 4 | |
| P290 | 1 | 0 | 0 | 1 | 0 | 0 | 0 | 1 | 0 | 50 | +0,–12 | 50 | –0, +12 | 5 | 5 | |
| P291 | 1 | 0 | 0 | 1 | 0 | 0 | 0 | 1 | 1 | 44 | +6,–6 | 56 | –6,+6 | 5 | 5 | |
| P292 | 1 | 0 | 0 | 1 | 0 | 0 | 1 | 0 | 0 | 38 | +12,–12 | 62 | –12,+12 | 4 | 4 | |
| P293 | 1 | 0 | 0 | 1 | 0 | 0 | 1 | 0 | 1 | — | — | — | — | F | F | 1,2 |
| P294 | 1 | 0 | 0 | 1 | 0 | 0 | 1 | 1 | 0 | 44 | +6,–6 | 56 | –6,+6 | 5 | 5 | |
| P295 | 1 | 0 | 0 | 1 | 0 | 0 | 1 | 1 | 1 | — | — | — | — | F | F | 1,2 |
| P296 | 1 | 0 | 0 | 1 | 0 | 1 | 0 | 0 | 0 | 25 | +12,–12 | 75 | –12,+12 | 2 | 2 | |
| P297 | 1 | 0 | 0 | 1 | 0 | 1 | 0 | 0 | 1 | — | — | — | — | F | F | 1,2 |
| P298 | 1 | 0 | 0 | 1 | 0 | 1 | 0 | 1 | 0 | — | — | — | — | F | F | 1,2 |
| P299 | 1 | 0 | 0 | 1 | 0 | 1 | 0 | 1 | 1 | — | — | — | — | F | F | 2 |
| P300 | 1 | 0 | 0 | 1 | 0 | 1 | 1 | 0 | 0 | 31 | +6,–6 | 69 | –6,+6 | 3 | 3 | |
| P301 | 1 | 0 | 0 | 1 | 0 | 1 | 1 | 0 | 1 | — | — | — | — | F | F | 2 |
| P302 | 1 | 0 | 0 | 1 | 0 | 1 | 1 | 1 | 0 | — | — | — | — | F | F | 2 |
| P303 | 1 | 0 | 0 | 1 | 0 | 1 | 1 | 1 | 1 | — | — | — | — | F | F | 2 |
| P304 | 1 | 0 | 0 | 1 | 1 | 0 | 0 | 0 | 0 | 13 | +12,–6 | 87 | –12,+6 | 1 | 1 | |
| P305 | 1 | 0 | 0 | 1 | 1 | 0 | 0 | 0 | 1 | 44 | +6,–6 | 56 | –6,+6 | 5 | 5 | |
| P306 | 1 | 0 | 0 | 1 | 1 | 0 | 0 | 1 | 0 | 44 | +6,–6 | 56 | –6,+6 | 5 | 5 | |
| P307 | 1 | 0 | 0 | 1 | 1 | 0 | 0 | 1 | 1 | 50 | +0,–0 | 50 | –0,+0 | 5 | 5 | |
| P308 | 1 | 0 | 0 | 1 | 1 | 0 | 1 | 0 | 0 | 31 | +6,–6 | 69 | –6,+6 | 3 | 3 | |
| P309 | 1 | 0 | 0 | 1 | 1 | 0 | 1 | 0 | 1 | — | — | — | — | F | F | 2 |
| P310 | 1 | 0 | 0 | 1 | 1 | 0 | 1 | 1 | 0 | 38 | +0,–0 | 62 | –0,+0 | 4 | 4 | |
| P311 | 1 | 0 | 0 | 1 | 1 | 0 | 1 | 1 | 1 | — | — | — | — | F | F | 2 |
| P312 | 1 | 0 | 0 | 1 | 1 | 1 | 0 | 0 | 0 | 19 | +6,–6 | 81 | –6,+6 | 2 | 2 | |
| P313 | 1 | 0 | 0 | 1 | 1 | 1 | 0 | 0 | 1 | — | — | — | — | F | F | 2 |
| P314 | 1 | 0 | 0 | 1 | 1 | 1 | 0 | 1 | 0 | — | — | — | — | F | F | 2 |
| P315 | 1 | 0 | 0 | 1 | 1 | 1 | 0 | 1 | 1 | — | — | — | — | F | F | 2 |
| P316 | 1 | 0 | 0 | 1 | 1 | 1 | 1 | 0 | 0 | 25 | +0,–0 | 75 | –0,+0 | 2 | 2 | |
| P317 | 1 | 0 | 0 | 1 | 1 | 1 | 1 | 0 | 1 | — | — | — | — | F | F | 2 |
| P318 | 1 | 0 | 0 | 1 | 1 | 1 | 1 | 1 | 0 | — | — | — | — | F | F | 2 |
| P319 | 1 | 0 | 0 | 1 | 1 | 1 | 1 | 1 | 1 | — | — | — | — | F | F | 2 |
| P320 | 1 | 0 | 1 | 0 | 0 | 0 | 0 | 0 | 0 | — | — | — | — | F | F | 1 |
| P321 | 1 | 0 | 1 | 0 | 0 | 0 | 0 | 0 | 1 | 25 | +12,–12 | 75 | –12,+12 | 2 | 2 | |
| P322 | 1 | 0 | 1 | 0 | 0 | 0 | 0 | 1 | 0 | 38 | +12,–12 | 62 | –12,+12 | 4 | 4 | |
| P323 | 1 | 0 | 1 | 0 | 0 | 0 | 0 | 1 | 1 | 31 | +6,–6 | 69 | –6,+6 | 3 | 3 | |
| P324 | 1 | 0 | 1 | 0 | 0 | 0 | 1 | 0 | 0 | 50 | +0,–12 | 50 | –0,+12 | 5 | 5 | |
| P325 | 1 | 0 | 1 | 0 | 0 | 0 | 1 | 0 | 1 | — | — | — | — | F | F | 1,2 |
| P326 | 1 | 0 | 1 | 0 | 0 | 0 | 1 | 1 | 0 | 44 | +6,–6 | 56 | –6,+6 | 5 | 5 | |
| P327 | 1 | 0 | 1 | 0 | 0 | 0 | 1 | 1 | 1 | — | — | — | — | F | F | 2 |
| P328 | 1 | 0 | 1 | 0 | 0 | 1 | 0 | 0 | 0 | 38 | +12,–12 | 62 | –12,+12 | 4 | 4 | |
| P329 | 1 | 0 | 1 | 0 | 0 | 1 | 0 | 0 | 1 | — | — | — | — | F | F | 1,2 |
| P330 | 1 | 0 | 1 | 0 | 0 | 1 | 0 | 1 | 0 | — | — | — | — | F | F | 1,2 |
| P331 | 1 | 0 | 1 | 0 | 0 | 1 | 0 | 1 | 1 | — | — | — | — | F | F | 2 |
| P332 | 1 | 0 | 1 | 0 | 0 | 1 | 1 | 0 | 0 | 44 | +6,–6 | 56 | –6 | +6 | 5 | 5 |
| P333 | 1 | 0 | 1 | 0 | 0 | 1 | 1 | 0 | 1 | — | — | — | — | F | F | 2 |
| P334 | 1 | 0 | 1 | 0 | 0 | 1 | 1 | 1 | 0 | — | — | — | — | F | F | 2 |
| P335 | 1 | 0 | 1 | 0 | 0 | 1 | 1 | 1 | 1 | — | — | — | — | F | F | 2 |
| P336 | 1 | 0 | 1 | 0 | 1 | 0 | 0 | 0 | 0 | 25 | +12,–12 | 75 | –12,+12 | 2 | 2 | |
| P337 | 1 | 0 | 1 | 0 | 1 | 0 | 0 | 0 | 1 | — | — | — | — | F | F | 1,2 |
| P338 | 1 | 0 | 1 | 0 | 1 | 0 | 0 | 1 | 0 | — | — | — | — | F | F | 1,2 |
| P339 | 1 | 0 | 1 | 0 | 1 | 0 | 0 | 1 | 1 | — | — | — | — | F | F | 2 |
| P340 | 1 | 0 | 1 | 0 | 1 | 0 | 1 | 0 | 0 | — | — | — | — | F | F | 1,2 |
| P341 | 1 | 0 | 1 | 0 | 1 | 0 | 1 | 0 | 1 | — | — | — | — | F | F | 2 |
| P342 | 1 | 0 | 1 | 0 | 1 | 0 | 1 | 1 | 0 | — | — | — | — | F | F | 2 |
| P343 | 1 | 0 | 1 | 0 | 1 | 0 | 1 | 1 | 1 | — | — | — | — | F | F | 2 |
| P344 | 1 | 0 | 1 | 0 | 1 | 1 | 0 | 0 | 0 | 31 | +6,–6 | 69 | –6,+6 | 3 | 3 | |
| P345 | 1 | 0 | 1 | 0 | 1 | 1 | 0 | 0 | 1 | — | — | — | — | F | F | 2 |
| P346 | 1 | 0 | 1 | 0 | 1 | 1 | 0 | 1 | 0 | — | — | — | — | F | F | 2 |
| P347 | 1 | 0 | 1 | 0 | 1 | 1 | 0 | 1 | 1 | — | — | — | — | F | F | 2 |
| P348 | 1 | 0 | 1 | 0 | 1 | 1 | 1 | 0 | 0 | — | — | — | — | F | F | 2 |
| P349 | 1 | 0 | 1 | 0 | 1 | 1 | 1 | 0 | 1 | — | — | — | — | F | F | 2 |
| P350 | 1 | 0 | 1 | 0 | 1 | 1 | 1 | 1 | 0 | — | — | — | — | F | F | 2 |
| P351 | 1 | 0 | 1 | 0 | 1 | 1 | 1 | 1 | 1 | — | — | — | — | F | F | 2 |
| P352 | 1 | 0 | 1 | 1 | 0 | 0 | 0 | 0 | 0 | 13 | +12,–6 | 87 | –12,+6 | 1 | 1 | |
| P353 | 1 | 0 | 1 | 1 | 0 | 0 | 0 | 0 | 1 | 31 | +6,–6 | 69 | –6,+6 | 3 | 3 | |
| P354 | 1 | 0 | 1 | 1 | 0 | 0 | 0 | 1 | 0 | 44 | +6,–6 | 56 | –6,+6 | 5 | 5 | |
| P355 | 1 | 0 | 1 | 1 | 0 | 0 | 0 | 1 | 1 | 38 | +0,–0 | 62 | –0,+0 | 4 | 4 | |
| P356 | 1 | 0 | 1 | 1 | 0 | 0 | 1 | 0 | 0 | 44 | +6,–6 | 56 | –6,+6 | 5 | 5 | |
| P357 | 1 | 0 | 1 | 1 | 0 | 0 | 1 | 0 | 1 | — | — | — | — | F | F | 2 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | INSIDE | | OUTSIDE | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ±% | % | ±% | HEX | HEX | NOTES |
| P358 | 1 | 0 | 1 | 1 | 0 | 0 | 1 | 1 | 0 | 50 | +0,–0 | 50 | –0,+0 | 5 | 5 | |
| P359 | 1 | 0 | 1 | 1 | 0 | 0 | 1 | 1 | 1 | — | — | — | — | F | F | 2 |
| P360 | 1 | 0 | 1 | 1 | 0 | 1 | 0 | 0 | 0 | 31 | +6,–6 | 69 | –6,+6 | 3 | 3 | |
| P361 | 1 | 0 | 1 | 1 | 0 | 1 | 0 | 0 | 1 | — | — | — | — | F | F | 2 |
| P362 | 1 | 0 | 1 | 1 | 0 | 1 | 0 | 1 | 0 | — | — | — | — | F | F | 2 |
| P363 | 1 | 0 | 1 | 1 | 0 | 1 | 0 | 1 | 1 | — | — | — | — | F | F | 2 |
| P364 | 1 | 0 | 1 | 1 | 0 | 1 | 1 | 0 | 0 | 38 | +0,–0 | 62 | –0,+0 | 4 | 4 | |
| P365 | 1 | 0 | 1 | 1 | 0 | 1 | 1 | 0 | 1 | — | — | — | — | F | F | 2 |
| P366 | 1 | 0 | 1 | 1 | 0 | 1 | 1 | 1 | 0 | — | — | — | — | F | F | 2 |
| P367 | 1 | 0 | 1 | 1 | 0 | 1 | 1 | 1 | 1 | — | — | — | — | F | F | 2 |
| P368 | 1 | 0 | 1 | 1 | 1 | 0 | 0 | 0 | 0 | 13 | +0,–0 | 87 | –0,+0 | 1 | 1 | |
| P369 | 1 | 0 | 1 | 1 | 1 | 0 | 0 | 0 | 1 | — | — | — | — | F | F | 2 |
| P370 | 1 | 0 | 1 | 1 | 1 | 0 | 0 | 1 | 0 | — | — | — | — | F | F | 2 |
| P371 | 1 | 0 | 1 | 1 | 1 | 0 | 0 | 1 | 1 | — | — | — | — | F | F | 2 |
| P372 | 1 | 0 | 1 | 1 | 1 | 0 | 1 | 0 | 0 | — | — | — | — | F | F | 2 |
| P373 | 1 | 0 | 1 | 1 | 1 | 0 | 1 | 0 | 1 | — | — | — | — | F | F | 2 |
| P374 | 1 | 0 | 1 | 1 | 1 | 0 | 1 | 1 | 0 | — | — | — | — | F | F | 2 |
| P375 | 1 | 0 | 1 | 1 | 1 | 0 | 1 | 1 | 1 | — | — | — | — | F | F | 2 |
| P376 | 1 | 0 | 1 | 1 | 1 | 1 | 0 | 0 | 0 | — | — | — | — | F | F | 2 |
| P377 | 1 | 0 | 1 | 1 | 1 | 1 | 0 | 0 | 1 | — | — | — | — | F | F | 2 |
| P378 | 1 | 0 | 1 | 1 | 1 | 1 | 0 | 1 | 0 | — | — | — | — | F | F | 2 |
| P379 | 1 | 0 | 1 | 1 | 1 | 1 | 0 | 1 | 1 | — | — | — | — | F | F | 2 |
| P380 | 1 | 0 | 1 | 1 | 1 | 1 | 1 | 0 | 0 | — | — | — | — | F | F | 2 |
| P381 | 1 | 0 | 1 | 1 | 1 | 1 | 1 | 0 | 1 | — | — | — | — | F | F | 2 |
| P382 | 1 | 0 | 1 | 1 | 1 | 1 | 1 | 1 | 0 | — | — | — | — | F | F | 2 |
| P383 | 1 | 0 | 1 | 1 | 1 | 1 | 1 | 1 | 1 | — | — | — | — | F | F | 2 |
| P384 | 1 | 0 | 0 | 0 | 0 | 0 | 0 | 0 | 0 | — | — | — | — | F | F | 1 |
| P385 | 1 | 0 | 0 | 0 | 0 | 0 | 0 | 0 | 1 | 13 | +12,–6 | 13 | –12,+6 | 1 | 1 | |
| P386 | 1 | 0 | 0 | 0 | 0 | 0 | 0 | 1 | 0 | 25 | +12,–12 | 75 | –12,+12 | 2 | 2 | |
| P387 | 1 | 0 | 0 | 0 | 0 | 0 | 0 | 1 | 1 | 13 | +0,–0 | 87 | –0,+0 | 1 | 1 | |
| P388 | 1 | 0 | 0 | 0 | 0 | 0 | 1 | 0 | 0 | 38 | +12,–12 | 62 | –12,+12 | 4 | 4 | |
| P389 | 1 | 0 | 0 | 0 | 0 | 0 | 1 | 0 | 1 | 31 | +6,–6 | 69 | –6,+6 | 3 | 3 | |
| P390 | 1 | 0 | 0 | 0 | 0 | 0 | 1 | 1 | 0 | 31 | +6,–6Z | 69 | –6,+6 | 3 | 3 | |
| P391 | 1 | 0 | 0 | 0 | 0 | 0 | 1 | 1 | 1 | — | — | — | — | F | F | 2 |
| P392 | 1 | 0 | 0 | 0 | 0 | 1 | 0 | 0 | 0 | 50 | +0,–12 | 50 | –0,+12 | 5 | 5 | |
| P393 | 1 | 0 | 0 | 0 | 0 | 1 | 0 | 0 | 1 | 44 | +6,–6 | 56 | –6,+6 | 5 | 5 | |
| P394 | 1 | 0 | 0 | 0 | 0 | 1 | 0 | 1 | 0 | — | — | — | — | F | F | 1,2 |
| P395 | 1 | 0 | 0 | 0 | 0 | 1 | 0 | 1 | 1 | — | — | — | — | F | F | 2 |
| P396 | 1 | 0 | 0 | 0 | 0 | 1 | 1 | 0 | 0 | 44 | +6,–6 | 56 | –6,+6 | 5 | 5 | |
| P397 | 1 | 0 | 0 | 0 | 0 | 1 | 1 | 0 | 1 | 38 | +0,–0 | 62 | –0,+0 | 4 | 4 | |
| P398 | 1 | 0 | 0 | 0 | 0 | 1 | 1 | 1 | 0 | — | — | — | — | F | F | 2 |
| P399 | 1 | 0 | 0 | 0 | 0 | 1 | 1 | 1 | 1 | — | — | — | — | F | F | 2 |
| P400 | 1 | 0 | 0 | 0 | 1 | 0 | 0 | 0 | 0 | 38 | +12,–12 | 62 | –12,+12 | 4 | 4 | |
| P401 | 1 | 0 | 0 | 0 | 1 | 0 | 0 | 0 | 1 | 44 | +6,–6 | 56 | –6,+6 | 5 | 5 | |
| P402 | 1 | 0 | 0 | 0 | 1 | 0 | 0 | 1 | 0 | — | — | — | — | F | F | 1,2 |
| P403 | 1 | 0 | 0 | 0 | 1 | 0 | 0 | 1 | 1 | — | — | — | — | F | F | 2 |
| P404 | 1 | 0 | 0 | 0 | 1 | 0 | 1 | 0 | 0 | — | — | — | — | F | F | 1,2 |
| P405 | 1 | 0 | 0 | 0 | 1 | 0 | 1 | 0 | 1 | — | — | — | — | F | F | 2 |
| P406 | 1 | 0 | 0 | 0 | 1 | 0 | 1 | 1 | 0 | — | — | — | — | F | F | 2 |
| P407 | 1 | 0 | 0 | 0 | 1 | 0 | 1 | 1 | 1 | — | — | — | — | F | F | 2 |
| P408 | 1 | 0 | 0 | 0 | 1 | 1 | 0 | 0 | 0 | 44 | +6,–6 | 56 | –6,+6 | 5 | 5 | |
| P409 | 1 | 0 | 0 | 0 | 1 | 1 | 0 | 0 | 1 | 50 | +0,–0 | 50 | –0,+0 | 5 | 5 | |
| P410 | 1 | 0 | 0 | 0 | 1 | 1 | 0 | 1 | 0 | — | — | — | — | F | F | 2 |
| P411 | 1 | 0 | 0 | 0 | 1 | 1 | 0 | 1 | 1 | — | — | — | — | F | F | 2 |
| P412 | 1 | 0 | 0 | 0 | 1 | 1 | 1 | 0 | 0 | — | — | — | — | F | F | 2 |
| P413 | 1 | 0 | 0 | 0 | 1 | 1 | 1 | 0 | 1 | — | — | — | — | F | F | 2 |
| P414 | 1 | 0 | 0 | 0 | 1 | 1 | 1 | 1 | 0 | — | — | — | — | F | F | 2 |
| P415 | 1 | 0 | 0 | 0 | 1 | 1 | 1 | 1 | 1 | — | — | — | — | F | F | 2 |
| P416 | 1 | 0 | 0 | 1 | 0 | 0 | 0 | 0 | 0 | 25 | +12,–12 | 75 | –12,+12 | 2 | 2 | |
| P417 | 1 | 0 | 0 | 1 | 0 | 0 | 0 | 0 | 1 | 31 | +6,–6 | 69 | –6,+6 | 3 | 3 | |
| P418 | 1 | 0 | 0 | 1 | 0 | 0 | 0 | 1 | 0 | — | — | — | — | F | F | 1,2 |
| P419 | 1 | 0 | 0 | 1 | 0 | 0 | 0 | 1 | 1 | — | — | — | — | F | F | 2 |
| P420 | 1 | 0 | 0 | 1 | 0 | 0 | 1 | 0 | 0 | — | — | — | — | F | F | 1,2 |
| P421 | 1 | 0 | 0 | 1 | 0 | 0 | 1 | 0 | 1 | — | — | — | — | F | F | 2 |
| P422 | 1 | 0 | 0 | 1 | 0 | 0 | 1 | 1 | 0 | — | — | — | — | F | F | 2 |
| P423 | 1 | 0 | 0 | 1 | 0 | 0 | 1 | 1 | 1 | — | — | — | — | F | F | 2 |
| P424 | 1 | 0 | 0 | 1 | 0 | 1 | 0 | 0 | 0 | — | — | — | — | F | F | 1,2 |
| P425 | 1 | 0 | 0 | 1 | 0 | 1 | 0 | 0 | 1 | — | — | — | — | F | F | 2 |
| P426 | 1 | 0 | 0 | 1 | 0 | 1 | 0 | 1 | 0 | — | — | — | — | F | F | 2 |
| P427 | 1 | 0 | 0 | 1 | 0 | 1 | 0 | 1 | 1 | — | — | — | — | F | F | 2 |
| P428 | 1 | 0 | 0 | 1 | 0 | 1 | 1 | 0 | 0 | — | — | — | — | F | F | 2 |

-continued

| | | | | | | | | | OUTPUT WEIGHT | | | | | | |
|---|---|---|---|---|---|---|---|---|---|---|---|---|---|---|---|
| INPUT CONDITIONS | | | | | | | | | INSIDE | | OUTSIDE | | RIGHT ANGLE | | |
| | SUB-PIXEL CONDITIONS | | | | | | | | RANGE | TOL. | RANGE | TOL. | OK | NOT OK | |
| P | F8 | F7 | F6 | F5 | F4 | F3 | F2 | F1 | F0 | % | ±% | % | ±% | HEX | HEX | NOTES |
| P429 | 1 | 0 | 0 | 1 | 0 | 1 | 1 | 0 | 1 | — | — | — | — | F | F | 2 |
| P430 | 1 | 0 | 0 | 1 | 0 | 1 | 1 | 1 | 0 | — | — | — | — | F | F | 2 |
| P431 | 1 | 0 | 0 | 1 | 0 | 1 | 1 | 1 | 1 | — | — | — | — | F | F | 2 |
| P432 | 1 | 0 | 0 | 1 | 1 | 0 | 0 | 0 | 0 | 31 | +6,−6 | 69 | −6,+6 | 3 | 3 | 2 |
| P433 | 1 | 0 | 0 | 1 | 1 | 0 | 0 | 0 | 1 | 38 | +0,−0 | 62 | −0,+0 | 4 | 4 | |
| P434 | 1 | 0 | 0 | 1 | 1 | 0 | 0 | 1 | 0 | — | — | — | — | F | F | 2 |
| P435 | 1 | 0 | 0 | 1 | 1 | 0 | 0 | 1 | 1 | — | — | — | — | F | F | 2 |
| P436 | 1 | 0 | 0 | 1 | 1 | 0 | 1 | 0 | 0 | — | — | — | — | F | F | 2 |
| P437 | 1 | 0 | 0 | 1 | 1 | 0 | 1 | 0 | 1 | — | — | — | — | F | F | 2 |
| P438 | 1 | 0 | 0 | 1 | 1 | 0 | 1 | 1 | 0 | — | — | — | — | F | F | 2 |
| P439 | 1 | 0 | 0 | 1 | 1 | 0 | 1 | 1 | 1 | — | — | — | — | F | F | 2 |
| P440 | 1 | 0 | 0 | 1 | 1 | 1 | 0 | 0 | 0 | — | — | — | — | F | F | 2 |
| P441 | 1 | 0 | 0 | 1 | 1 | 1 | 0 | 0 | 1 | — | — | — | — | F | F | 2 |
| P442 | 1 | 0 | 0 | 1 | 1 | 1 | 0 | 1 | 0 | — | — | — | — | F | F | 2 |
| P443 | 1 | 0 | 0 | 1 | 1 | 1 | 0 | 1 | 1 | — | — | — | — | F | F | 2 |
| P444 | 1 | 0 | 0 | 1 | 1 | 1 | 1 | 0 | 0 | — | — | — | — | F | F | 2 |
| P445 | 1 | 0 | 0 | 1 | 1 | 1 | 1 | 0 | 1 | — | — | — | — | F | F | 2 |
| P446 | 1 | 0 | 0 | 1 | 1 | 1 | 1 | 1 | 0 | — | — | — | — | F | F | 2 |
| P447 | 1 | 0 | 0 | 1 | 1 | 1 | 1 | 1 | 1 | — | — | — | — | F | F | 2 |
| P448 | 1 | 1 | 1 | 0 | 0 | 0 | 0 | 0 | 0 | 13 | +12,−6 | 87 | −12,+6 | 1 | 1 | |
| P449 | 1 | 1 | 1 | 0 | 0 | 0 | 0 | 0 | 1 | 13 | +0,−0 | 87 | −0,+0 | 1 | 1 | |
| P450 | 1 | 1 | 1 | 0 | 0 | 0 | 0 | 1 | 0 | 31 | +6,−6 | 69 | −6,+6 | 3 | 3 | |
| P451 | 1 | 1 | 1 | 0 | 0 | 0 | 0 | 1 | 1 | 25 | +0,−0 | 75 | −0,+0 | 2 | 2 | |
| P452 | 1 | 1 | 1 | 0 | 0 | 0 | 1 | 0 | 0 | 44 | +6,−6 | 56 | −6,+6 | 5 | 5 | |
| P453 | 1 | 1 | 1 | 0 | 0 | 0 | 1 | 0 | 1 | — | — | — | — | F | F | 2 |
| P454 | 1 | 1 | 1 | 0 | 0 | 0 | 1 | 1 | 0 | 38 | +0,−0 | 63 | −0,+0 | 4 | 4 | |
| P455 | 1 | 1 | 1 | 0 | 0 | 0 | 1 | 1 | 1 | — | — | — | — | F | F | 2 |
| P456 | 1 | 1 | 1 | 0 | 0 | 1 | 0 | 0 | 0 | 44 | +6,−6 | 56 | −6,+6 | 5 | 5 | |
| P457 | 1 | 1 | 1 | 0 | 0 | 1 | 0 | 0 | 1 | — | — | — | — | F | F | 2 |
| P458 | 1 | 1 | 1 | 0 | 0 | 1 | 0 | 1 | 0 | — | — | — | — | F | F | 2 |
| P459 | 1 | 1 | 1 | 0 | 0 | 1 | 0 | 1 | 1 | — | — | — | — | F | F | 2 |
| P460 | 1 | 1 | 1 | 0 | 0 | 1 | 1 | 0 | 0 | 50 | +0,−0 | 50 | −0,+0 | 5 | 5 | |
| P461 | 1 | 1 | 1 | 0 | 0 | 1 | 1 | 0 | 1 | — | — | — | — | F | F | 2 |
| P462 | 1 | 1 | 1 | 0 | 0 | 1 | 1 | 1 | 0 | — | — | — | — | F | F | 2 |
| P463 | 1 | 1 | 1 | 0 | 0 | 1 | 1 | 1 | 1 | — | — | — | — | F | F | 2 |
| P464 | 1 | 1 | 1 | 0 | 1 | 0 | 0 | 0 | 0 | 31 | +6,−6 | 69 | −6,+6 | 3 | 3 | |
| P465 | 1 | 1 | 1 | 0 | 1 | 0 | 0 | 0 | 1 | — | — | — | — | F | F | 2 |
| P466 | 1 | 1 | 1 | 0 | 1 | 0 | 0 | 1 | 0 | — | — | — | — | F | F | 2 |
| P467 | 1 | 1 | 1 | 0 | 1 | 0 | 0 | 1 | 1 | — | — | — | — | F | F | 2 |
| P468 | 1 | 1 | 1 | 0 | 1 | 0 | 1 | 0 | 0 | — | — | — | — | F | F | 2 |
| P469 | 1 | 1 | 1 | 0 | 1 | 0 | 1 | 0 | 1 | — | — | — | — | F | F | 2 |
| P470 | 1 | 1 | 1 | 0 | 1 | 0 | 1 | 1 | 0 | — | — | — | — | F | F | 2 |
| P471 | 1 | 1 | 1 | 0 | 1 | 0 | 1 | 1 | 1 | — | — | — | — | F | F | 2 |
| P472 | 1 | 1 | 1 | 0 | 1 | 1 | 0 | 0 | 0 | 38 | +0,−0 | 62 | −0,+0 | 4 | 4 | |
| P473 | 1 | 1 | 1 | 0 | 1 | 1 | 0 | 0 | 1 | — | — | — | — | F | F | 2 |
| P474 | 1 | 1 | 1 | 0 | 1 | 1 | 0 | 1 | 0 | — | — | — | — | F | F | 2 |
| P475 | 1 | 1 | 1 | 0 | 1 | 1 | 0 | 1 | 1 | — | — | — | — | F | F | 2 |
| P476 | 1 | 1 | 1 | 0 | 1 | 1 | 1 | 0 | 0 | — | — | — | — | F | F | 2 |
| P477 | 1 | 1 | 1 | 0 | 1 | 1 | 1 | 0 | 1 | — | — | — | — | F | F | 2 |
| P478 | 1 | 1 | 1 | 0 | 1 | 1 | 1 | 1 | 0 | — | — | — | — | F | F | 2 |
| P479 | 1 | 1 | 1 | 0 | 1 | 1 | 1 | 1 | 1 | — | — | — | — | F | F | 2 |
| P480 | 1 | 1 | 1 | 1 | 0 | 0 | 0 | 0 | 0 | 19 | +6,−6 | 81 | −6,+6 | 2 | 2 | |
| P481 | 1 | 1 | 1 | 1 | 0 | 0 | 0 | 0 | 1 | 25 | +0,−0 | 75 | −0,+0 | 2 | 2 | |
| P482 | 1 | 1 | 1 | 1 | 0 | 0 | 0 | 1 | 0 | — | — | — | — | F | F | 2 |
| P483 | 1 | 1 | 1 | 1 | 0 | 0 | 0 | 1 | 1 | — | — | — | — | F | F | 2 |
| P484 | 1 | 1 | 1 | 1 | 0 | 0 | 1 | 0 | 0 | — | — | — | — | F | F | 2 |
| P485 | 1 | 1 | 1 | 1 | 0 | 0 | 1 | 0 | 1 | — | — | — | — | F | F | 2 |
| P486 | 1 | 1 | 1 | 1 | 0 | 0 | 1 | 1 | 0 | — | — | — | — | F | F | 2 |
| P487 | 1 | 1 | 1 | 1 | 0 | 0 | 1 | 1 | 1 | — | — | — | — | F | F | 2 |
| P488 | 1 | 1 | 1 | 1 | 0 | 1 | 0 | 0 | 0 | — | — | — | — | F | F | 2 |
| P489 | 1 | 1 | 1 | 1 | 0 | 1 | 0 | 0 | 1 | — | — | — | — | F | F | 2 |
| P490 | 1 | 1 | 1 | 1 | 0 | 1 | 0 | 1 | 0 | — | — | — | — | F | F | 2 |
| P491 | 1 | 1 | 1 | 1 | 0 | 1 | 0 | 1 | 1 | — | — | — | — | F | F | 2 |
| P492 | 1 | 1 | 1 | 1 | 0 | 1 | 1 | 0 | 0 | — | — | — | — | F | F | 2 |
| P493 | 1 | 1 | 1 | 1 | 0 | 1 | 1 | 0 | 1 | — | — | — | — | F | F | 2 |
| P494 | 1 | 1 | 1 | 1 | 0 | 1 | 1 | 1 | 0 | — | — | — | — | F | F | 2 |
| P495 | 1 | 1 | 1 | 1 | 0 | 1 | 1 | 1 | 1 | — | — | — | — | F | F | 2 |
| P496 | 1 | 1 | 1 | 1 | 1 | 0 | 0 | 0 | 0 | 25 | +0,−0 | 75 | −0,+0 | 2 | 2 | |
| P497 | 1 | 1 | 1 | 1 | 1 | 0 | 0 | 0 | 1 | — | — | — | — | F | F | 2 |
| P498 | 1 | 1 | 1 | 1 | 1 | 0 | 0 | 1 | 0 | — | — | — | — | F | F | 2 |
| P499 | 1 | 1 | 1 | 1 | 1 | 0 | 0 | 1 | 1 | — | — | — | — | F | F | 2 |

-continued

| | | | | | | | | | | | | | | | | |
|---|---|---|---|---|---|---|---|---|---|---|---|---|---|---|---|---|
| | | | | | | | | | OUTPUT WEIGHT | | | | | | | |
| INPUT CONDITIONS | | | | | | | | | INSIDE | | OUTSIDE | | RIGHT ANGLE | | | |
| | SUB-PIXEL CONDITIONS | | | | | | | | RANGE | TOL. | RANGE | TOL. | OK | NOT OK | | |
| P | F8 | F7 | F6 | F5 | F4 | F3 | F2 | F1 | F0 | % | ±% | % | ±% | HEX | HEX | NOTES |
| P500 | 1 | 1 | 1 | 1 | 1 | 0 | 1 | 0 | 0 | — | — | — | — | F | F | 2 |
| P501 | 1 | 1 | 1 | 1 | 1 | 0 | 1 | 0 | 1 | — | — | — | — | F | F | 2 |
| P502 | 1 | 1 | 1 | 1 | 1 | 0 | 1 | 1 | 0 | — | — | — | — | F | F | 2 |
| P503 | 1 | 1 | 1 | 1 | 1 | 0 | 1 | 1 | 1 | — | — | — | — | F | F | 2 |
| P504 | 1 | 1 | 1 | 1 | 1 | 1 | 0 | 0 | 0 | — | — | — | — | F | F | 2 |
| P505 | 1 | 1 | 1 | 1 | 1 | 1 | 0 | 0 | 1 | — | — | — | — | F | F | 2 |
| P506 | 1 | 1 | 1 | 1 | 1 | 1 | 0 | 1 | 0 | — | — | — | — | F | F | 2 |
| P507 | 1 | 1 | 1 | 1 | 1 | 1 | 0 | 1 | 1 | — | — | — | — | F | F | 2 |
| P508 | 1 | 1 | 1 | 1 | 1 | 1 | 1 | 0 | 0 | — | — | — | — | F | F | 2 |
| P509 | 1 | 1 | 1 | 1 | 1 | 1 | 1 | 0 | 1 | — | — | — | — | F | F | 2 |
| P510 | 1 | 1 | 1 | 1 | 1 | 1 | 1 | 1 | 0 | — | — | — | — | F | F | 2 |
| P511 | 1 | 1 | 1 | 1 | 1 | 1 | 1 | 1 | 1 | — | — | — | — | F | F | 2 |

SUB-PIXEL CONDITIONS

G,263

| | | | | | | | | | | | | | | | | |
|---|---|---|---|---|---|---|---|---|---|---|---|---|---|---|---|---|
| | | | | | | | | | OUTPUT WEIGHT | | | | | | | |
| INPUT CONDITIONS | | | | | | | | | PLUS FOR EDGE | | INSIDE FOR VERTEX | | RIGHT ANGLE | | | |
| | SUB-PIXEL CONDITIONS | | | | | | | | RANGE | TOL. | RANGE | TOL. | OK | NOT OK | | |
| P | F8 | F7 | F6 | F5 | F4 | F3 | F2 | F1 | F0 | % | ± % | % | ± % | HEX | HEX | NOTES |
| P0 | 0 | 0 | 0 | 0 | 0 | 0 | 0 | 0 | 0 | — | — | — | — | F | F | 1,4 |
| P1 | 0 | 0 | 0 | 0 | 0 | 0 | 0 | 0 | 1 | 100 | −3,+0 | — | — | B | B | 4,5 |
| P2 | 0 | 0 | 0 | 0 | 0 | 0 | 0 | 1 | 0 | — | — | — | — | F | F | 1,4 |
| P3 | 0 | 0 | 0 | 0 | 0 | 0 | 0 | 1 | 1 | 98 | +2,−2 | — | — | B | B | 4,5 |
| P4 | 0 | 0 | 0 | 0 | 0 | 0 | 1 | 0 | 0 | 0 | +3,−0 | — | — | O | O | 4,5,8 |
| P5 | 0 | 0 | 0 | 0 | 0 | 0 | 1 | 0 | 1 | — | — | — | — | F | F | 1,4 |
| P6 | 0 | 0 | 0 | 0 | 0 | 0 | 1 | 1 | 0 | 98 | +2,−2 | — | — | B | B | 4,5 |
| P7 | 0 | 0 | 0 | 0 | 0 | 0 | 1 | 1 | 1 | 100 | −25,+0 | — | — | B | B | 4,5 |
| P8 | 0 | 0 | 0 | 0 | 0 | 1 | 0 | 0 | 0 | — | — | — | — | F | F | 1,4 |
| P9 | 0 | 0 | 0 | 0 | 0 | 1 | 0 | 0 | 1 | — | — | — | — | F | F | 1,4 |
| P10 | 0 | 0 | 0 | 0 | 0 | 1 | 0 | 1 | 0 | 13 | +6,−9 | — | — | 1 | 1 | 4,5,8 |
| P11 | 0 | 0 | 0 | 0 | 0 | 1 | 0 | 1 | 1 | 81 | +13,−6 | — | — | 9 | 9 | 4,5 |
| P12 | 0 | 0 | a | 0 | 0 | 1 | 1 | 0 | 0 | 2 | +2,−2 | — | — | 0 | 0 | 4,5 |
| P13 | 0 | 0 | 0 | 0 | 0 | 1 | 1 | 0 | 1 | — | — | — | — | F | F | 1,4 |
| P14 | 0 | 0 | 0 | 0 | 0 | 1 | 1 | 1 | 0 | 3 | +0,−0 | — | — | 0 | F | 3,4,5 |
| P15 | 0 | 0 | 0 | 0 | 0 | 1 | 1 | 1 | 1 | 87 | +6,−12 | — | — | A | F | 3,4,5 |
| P16 | 0 | 0 | 0 | 0 | 1 | 0 | 0 | 0 | 0 | 0 | +3,−12 | — | — | 0 | 0 | 4,5 |
| P17 | 0 | 0 | 0 | 0 | 1 | 0 | 0 | 0 | 1 | — | — | — | — | F | F | 1,4 |
| P18 | 0 | 0 | 0 | 0 | 1 | 0 | 0 | 1 | 0 | — | — | — | — | F | F | 1,4 |
| P19 | 0 | 0 | 0 | 0 | 1 | 0 | 0 | 1 | 1 | — | — | — | — | F | F | 1,4 |
| P20 | 0 | 0 | 0 | 0 | 1 | 0 | 1 | 0 | 0 | — | — | — | — | F | F | 1,4 |
| P21 | 0 | 0 | 0 | 0 | 1 | 0 | 1 | 0 | 1 | — | — | — | — | F | F | 1,4 |
| P22 | 0 | 0 | 0 | 0 | 1 | 0 | 1 | 1 | 0 | — | — | — | — | F | F | 1,4 |
| P23 | 0 | 0 | 0 | 0 | 1 | 0 | 1 | 1 | 1 | — | — | — | — | F | F | 1,4 |
| P24 | 0 | 0 | 0 | 0 | 1 | 1 | 0 | 0 | 0 | 2 | +2,−2 | — | — | 0 | 0 | 4,5 |
| P25 | 0 | 0 | 0 | 0 | 1 | 1 | 0 | 0 | 1 | — | — | — | — | F | F | 1,4 |
| P26 | 0 | 0 | 0 | 0 | 1 | 1 | 0 | 1 | 0 | 19 | −13,+6 | — | — | 2 | 2 | 4,5 |
| P27 | 0 | 0 | 0 | 0 | 1 | 1 | 0 | 1 | 1 | 28 | +0,−0 | — | — | 3 | 3 | 4,5,8 |
| P28 | 0 | 0 | 0 | 0 | 1 | 1 | 1 | 0 | 0 | 0 | +25,−0 | — | — | 0 | 0 | 4,5 |
| P29 | 0 | 0 | 0 | 0 | 1 | 1 | 1 | 0 | 1 | — | — | — | — | F | F | 1,4 |
| P30 | 0 | 0 | 0 | 0 | 1 | 1 | 1 | 1 | 0 | 13 | −6,+12 | — | — | 1 | F | 3,4,5 |
| P31 | 0 | 0 | 0 | 0 | 1 | 1 | 1 | 1 | 1 | — | — | — | — | F | F | 2,4 |
| P32 | 0 | 0 | 0 | 1 | 0 | 0 | 0 | 0 | 0 | — | — | — | — | F | F | 1,4 |
| P33 | 0 | 0 | 0 | 1 | 0 | 0 | 0 | 0 | 1 | — | — | — | — | F | F | 1,4 |
| P34 | 0 | 0 | 0 | 1 | 0 | 0 | 0 | 1 | 0 | — | — | — | — | F | F | 1,4 |
| P35 | 0 | 0 | 0 | 1 | 0 | 0 | 0 | 1 | 1 | — | — | — | — | F | F | 1,4 |
| P36 | 0 | 0 | 0 | 1 | 0 | 0 | 1 | 0 | 0 | — | — | — | — | F | F | 1,4 |
| P37 | 0 | 0 | 0 | 1 | 0 | 0 | 1 | 0 | 1 | — | — | — | — | F | F | 1,2,4 |
| P38 | 0 | 0 | 0 | 1 | 0 | 0 | 1 | 1 | 0 | — | — | — | — | F | F | 1,4 |
| P39 | 0 | 0 | 0 | 1 | 0 | 0 | 1 | 1 | 1 | — | — | — | — | F | F | 1,2,4 |
| P40 | 0 | 0 | 0 | 1 | 0 | 1 | 0 | 0 | 0 | 13 | +6,−9 | — | — | 1 | 1 | 4,5 |
| P41 | 0 | 0 | 0 | 1 | 0 | 1 | 0 | 0 | 1 | — | — | — | — | F | F | 1,2,4 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS FOR EDGE | | INSIDE FOR VERTEX | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P42 | 0 | 0 | 0 | 1 | 0 | 1 | 0 | 1 | 0 | — | — | — | — | F | F | 2 3,4 |
| P43 | 0 | 0 | 0 | 1 | 0 | 1 | 0 | 1 | 1 | — | — | — | — | F | F | 2,4 |
| P44 | 0 | 0 | 0 | 1 | 0 | 1 | 1 | 0 | 0 | 19 | −12,+6 | — | — | 2 | 2 | 4,5 |
| P45 | 0 | 0 | 0 | 1 | 0 | 1 | 1 | 0 | 1 | — | — | — | — | F | F | 1,2,4 |
| P46 | 0 | 0 | 0 | 1 | 0 | 1 | 1 | 1 | 0 | — | — | — | — | F | F | 2,4 |
| P47 | 0 | 0 | 0 | 1 | 0 | 1 | 1 | 1 | 1 | — | — | — | — | F | F | 2,4 |
| P48 | 0 | 0 | 0 | 1 | 1 | 0 | 0 | 0 | 0 | 2 | +2,−2 | — | — | 0 | 0 | 4,5 |
| P49 | 0 | 0 | 0 | 1 | 1 | 0 | 0 | 0 | 1 | — | — | — | — | F | F | 1,4 |
| P50 | 0 | 0 | 0 | 1 | 1 | 0 | 0 | 1 | 0 | — | — | — | — | F | F | 1,4 |
| P51 | 0 | 0 | 0 | 1 | 1 | 0 | 0 | 1 | 1 | — | — | — | — | F | F | 1,4 |
| P52 | 0 | 0 | 0 | 1 | 1 | 0 | 1 | 0 | 0 | — | — | — | — | F | F | 1,4 |
| P53 | 0 | 0 | 0 | 1 | 1 | 0 | 1 | 0 | 1 | — | — | — | — | F | F | 1,2,4 |
| P54 | 0 | 0 | 0 | 1 | 1 | 0 | 1 | 1 | 0 | — | — | — | — | F | F | 1,2,4 |
| P55 | 0 | 0 | 0 | 1 | 1 | 0 | 1 | 1 | 1 | — | — | — | — | F | F | 1,2,4 |
| P56 | 0 | 0 | 0 | 1 | 1 | 1 | 0 | 0 | 0 | 3 | +0,−0 | — | — | 0 | F | 3,4 |
| P57 | 0 | 0 | 0 | 1 | 1 | 1 | 0 | 0 | 1 | — | — | — | — | F | F | 1,4 |
| P58 | 0 | 0 | 0 | 1 | 1 | 1 | 0 | 1 | 0 | — | — | — | — | F | F | 2,4 |
| P59 | 0 | 0 | 0 | 1 | 1 | 1 | 0 | 1 | 1 | — | — | — | — | F | F | 2,4 |
| P60 | 0 | 0 | 0 | 1 | 1 | 1 | 1 | 0 | 0 | 13 | −6,+12 | — | — | 1 | F | 3,5 |
| P61 | 0 | 0 | 0 | 1 | 1 | 1 | 1 | 0 | 1 | — | — | — | — | F | F | 1,2,4 |
| P62 | 0 | 0 | 0 | 1 | 1 | 1 | 1 | 1 | 0 | — | — | — | — | F | F | 2,4 |
| P63 | 0 | 0 | 0 | 1 | 1 | 1 | 1 | 1 | 1 | — | — | — | — | F | F | 2,4 |
| P64 | 0 | 0 | 1 | 0 | 0 | 0 | 0 | 0 | 0 | 100 | −3,+0 | — | — | 8 | 8 | 8 |
| P65 | 0 | 0 | 1 | 0 | 0 | 0 | 0 | 0 | 1 | — | — | — | — | F | F | 1,4 |
| P66 | 0 | 0 | 1 | 0 | 0 | 0 | 0 | 1 | 0 | — | — | — | — | F | F | 1,4 |
| P67 | 0 | 0 | 1 | 0 | 0 | 0 | 0 | 1 | 1 | — | — | — | — | F | F | 1,4 |
| P68 | 0 | 0 | 1 | 0 | 0 | 0 | 1 | 0 | 0 | — | — | — | — | F | F | 1,4 |
| P69 | 0 | 0 | 1 | 0 | 0 | 0 | 1 | 0 | 1 | — | — | — | — | F | F | 1,2,4 |
| P70 | 0 | 0 | 1 | 0 | 0 | 0 | 1 | 1 | 0 | — | — | — | — | F | F. | 1,4 |
| P71 | 0 | 0 | 1 | 0 | 0 | 0 | 1 | 1 | 1 | — | — | — | — | F | F | 1,2,4 |
| P72 | 0 | 0 | 1 | 0 | 0 | 1 | 0 | 0 | 0 | — | — | — | — | F | F | 1,4 |
| P73 | 0 | 0 | 1 | 0 | 0 | 1 | 0 | 0 | 1 | — | — | — | — | F | F | 1,2,4 |
| P74 | 0 | 0 | 1 | 0 | 0 | 1 | 0 | 1 | 0 | — | — | — | — | F | F | 1,2,4 |
| P75 | 0 | 0 | 1 | 0 | 0 | 1 | 0 | 1 | 1 | — | — | — | — | F | F | 1,2,4 |
| P76 | 0 | 0 | 1 | 0 | 0 | 1 | 1 | 0 | 0 | — | — | — | — | F | F | 1,4 |
| P77 | 0 | 0 | 1 | 0 | 0 | 1 | 1 | 0 | 1 | — | — | — | — | F | F | 1,2,4 |
| P78 | 0 | 0 | 1 | 0 | 0 | 1 | 1 | 1 | 0 | — | — | — | — | F | F | 1,2,4 |
| P79 | 0 | 0 | 1 | 0 | 0 | 1 | 1 | 1 | 1 | — | — | — | — | F | F | 1,2,4 |
| P80 | 0 | 0 | 1 | 0 | 1 | 0 | 0 | 0 | 0 | — | — | — | — | F | F | 1,4 |
| P81 | 0 | 0 | 1 | 0 | 1 | 0 | 0 | 0 | 1 | — | — | — | — | F | F | 1,2,4 |
| P82 | 0 | 0 | 1 | 0 | 1 | 0 | 0 | 1 | 0 | — | — | — | — | F | F | 1,2,4 |
| P83 | 0 | 0 | 1 | 0 | 1 | 0 | 0 | 1 | 1 | — | — | — | — | F | F | 1,2,4 |
| P84 | 0 | 0 | 1 | 0 | 1 | 0 | 1 | 0 | 0 | — | — | — | — | F | F | 1,2,4 |
| P85 | 0 | 0 | 1 | 0 | 1 | 0 | 1 | 0 | 1 | — | — | — | — | F | F | 1,2,4 |
| P86 | 0 | 0 | 1 | 0 | 1 | 0 | 1 | 1 | 0 | — | — | — | — | F | F | 1,2,4 |
| P87 | 0 | 0 | 1 | 0 | 1 | 0 | 1 | 1 | 1 | — | — | — | — | F | F | 1,2,4 |
| P88 | 0 | 0 | 1 | 0 | 1 | 1 | 0 | 0 | 0 | — | — | — | — | F | F | 1,4 |
| P89 | 0 | 0 | 1 | 0 | 1 | 1 | 0 | 0 | 1 | — | — | — | — | F | F | 1,2,4 |
| P90 | 0 | 0 | 1 | 0 | 1 | 1 | 0 | 1 | 0 | — | — | — | — | F | F | 1,2,4 |
| P91 | 0 | 0 | 1 | 0 | 1 | 1 | 0 | 1 | 1 | — | — | — | — | F | F | 1,2,4 |
| P92 | 0 | 0 | 1 | 0 | 1 | 1 | 1 | 0 | 0 | — | — | — | — | F | F | 1,2,4 |
| P93 | 0 | 0 | 1 | 0 | 1 | 1 | 1 | 0 | 1 | — | — | — | — | F | F | 1,2,4 |
| P94 | 0 | 0 | 1 | 0 | 1 | 1 | 1 | 1 | 0 | — | — | — | — | F | F | 1,2,4 |
| P95 | 0 | 0 | 1 | 0 | 1 | 1 | 1 | 1 | 1 | — | — | — | — | F | F | 1,2,4 |
| P96 | 0 | 0 | 1 | 1 | 0 | 0 | 0 | 0 | 0 | 2 | +2,−2 | — | — | 0 | 0 | 4,5 |
| P97 | 0 | 0 | 1 | 1 | 0 | 0 | 0 | 0 | 1 | — | — | — | — | F | F | 1,4 |
| P98 | 0 | 0 | 1 | 1 | 0 | 0 | 0 | 1 | 0 | — | — | — | — | F | F | 1,4 |
| P99 | 0 | 0 | 1 | 1 | 0 | 0 | 0 | 1 | 1 | — | — | — | — | F | F | 1,2,4 |
| P100 | 0 | 0 | 1 | 1 | 0 | 0 | 1 | 0 | 0 | — | — | — | — | F | F | 1,4 |
| P101 | 0 | 0 | 1 | 1 | 0 | 0 | 1 | 0 | 1 | — | — | — | — | F | F | 1,2,4 |
| P102 | 0 | 0 | 1 | 1 | 0 | 0 | 1 | 1 | 0 | — | — | — | — | F | F | 1,4 |
| P103 | 0 | 0 | 1 | 1 | 0 | 0 | 1 | 1 | 1 | — | — | — | — | F | F | 1,2,4 |
| P104 | 0 | 0 | 1 | 1 | 0 | 1 | 0 | 0 | 0 | 19 | −12,+6 | — | — | 2 | 2 | 4,5 |
| P105 | 0 | 0 | 1 | 1 | 0 | 1 | 0 | 0 | 1 | — | — | — | — | F | F | 1,2,4 |
| P106 | 0 | 0 | 1 | 1 | 0 | 1 | 0 | 1 | 0 | — | — | — | — | F | F | 2,4 |
| P107 | 0 | 0 | 1 | 1 | 0 | 1 | 0 | 1 | 1 | — | — | — | — | F | F | 2,4 |
| P108 | 0 | 0 | 1 | 1 | 0 | 1 | 1 | 0 | 0 | 28 | +0,−0 | — | — | 3 | 3 | 4,5 |
| P109 | 0 | 0 | 1 | 1 | 0 | 1 | 1 | 0 | 1 | — | — | — | — | F | F | 1,2,4 |
| P110 | 0 | 0 | 1 | 1 | 0 | 1 | 1 | 1 | 0 | — | — | — | — | F | F | 2,4 |
| P111 | 0 | 0 | 1 | 1 | 0 | 1 | 1 | 1 | 1 | — | — | — | — | F | F | 2,4 |
| P112 | 0 | 0 | 1 | 1 | 1 | 0 | 0 | 0 | 0 | 0 | +25,−0 | — | — | 0 | 0 | 4,5 |

-continued

| | INPUT CONDITIONS | | | | | | | | | OUTPUT WEIGHT | | | | | | |
|---|---|---|---|---|---|---|---|---|---|---|---|---|---|---|---|---|
| | SUB-PIXEL CONDITIONS | | | | | | | | | PLUS FOR EDGE | | INSIDE FOR VERTEX | | RIGHT ANGLE | | |
| | | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P113 | 0 | 0 | 1 | 1 | 1 | 0 | 0 | 0 | 1 | — | — | — | — | F | F | 1,2,4 |
| P1,4 | 0 | 0 | 1 | 1 | 1 | 0 | 0 | 1 | 0 | — | — | — | — | F | F | 1,2,4 |
| P115 | 0 | 0 | 1 | 1 | 1 | 0 | 0 | 1 | 1 | — | — | — | — | F | F | 1,2,4 |
| P116 | 0 | 0 | 1 | 1 | 1 | 0 | 1 | 0 | 0 | — | — | — | — | F | F | 1,2,4 |
| P117 | 0 | 0 | 1 | 1 | 1 | 0 | 1 | 0 | 1 | — | — | — | — | F | F | 1,2,4 |
| P118 | 0 | 0 | 1 | 1 | 1 | 0 | 1 | 1 | 0 | — | — | — | — | F | F | 1,2,4 |
| P119 | 0 | 0 | 1 | 1 | 1 | 0 | 1 | 1 | 1 | — | — | — | — | F | F | 1,2,4 |
| P120 | 0 | 0 | 1 | 1 | 1 | 1 | 0 | 0 | 0 | 13 | −6,+12 | — | — | 1 | F | 3,4,5 |
| P121 | 0 | 0 | 1 | 1 | 1 | 1 | 0 | 0 | 1 | — | — | — | — | F | F | 1,2,4 |
| P122 | 0 | 0 | 1 | 1 | 1 | 1 | 0 | 1 | 0 | — | — | — | — | F | F | 2,4 |
| P123 | 0 | 0 | 1 | 1 | 1 | 1 | 0 | 1 | 1 | — | — | — | — | F | F | 2,4 |
| P124 | 0 | 0 | 1 | 1 | 1 | 1 | 1 | 0 | 0 | — | — | — | — | F | F | 2,4 |
| P125 | 0 | 0 | 1 | 1 | 1 | 1 | 1 | 0 | 1 | — | — | — | — | F | F | 1,2,4 |
| P126 | 0 | 0 | 1 | 1 | 1 | 1 | 1 | 1 | 0 | — | — | — | — | F | F | 2,4 |
| P127 | 0 | 0 | 1 | 1 | 1 | 1 | 1 | 1 | 1 | — | — | — | — | F | F | 2,4 |
| P128 | 0 | 1 | 0 | 0 | 0 | 0 | 0 | 0 | 0 | — | — | — | — | F | F | 1,4 |
| P129 | 0 | 1 | 0 | 0 | 0 | 0 | 0 | 0 | 1 | 98 | +2,−2 | — | — | B | B | 4,5 |
| P130 | 0 | 1 | 0 | 0 | 0 | 0 | 0 | 1 | 0 | 87 | −6,+9 | — | — | A | A | 4,5 |
| P131 | 0 | 1 | 0 | 0 | 0 | 0 | 0 | 1 | 1 | 97 | +0,−0 | — | — | B | F | 3,4,5 |
| P132 | 0 | 1 | 0 | 0 | 0 | 0 | 1 | 0 | 0 | — | — | — | — | F | F | 1,4 |
| P133 | 0 | 1 | 0 | 0 | 0 | 0 | 1 | 0 | 1 | — | — | — | — | F | F | 1,4 |
| P134 | 0 | 1 | 0 | 0 | 0 | 0 | 1 | 1 | 0 | 81 | −6,+12 | — | — | 9 | 9 | 4,5 |
| P135 | 0 | 1 | 0 | 0 | 0 | 0 | 1 | 1 | 1 | 87 | −12,+6 | — | — | A | F | 3,4,5 |
| P136 | 0 | 1 | 0 | 0 | 0 | 1 | 0 | 0 | 0 | — | — | — | — | F | F | 1,4 |
| P137 | 0 | 1 | 0 | 0 | 0 | 1 | 0 | 0 | 1 | — | — | — | — | F | F | 1,4 |
| P138 | 0 | 1 | 0 | 0 | b | 1 | 0 | 1 | 0 | — | — | — | — | F | F | 2,4 |
| P139 | 0 | 1 | 0 | 0 | 0 | 1 | 0 | 1 | 1 | — | — | — | — | F | F | 2,4 |
| P140 | 0 | 1 | 0 | 0 | 0 | 1 | 1 | 0 | 0 | — | — | — | — | F | F | 1,4 |
| P141 | 0 | 1 | 0 | 0 | 0 | 1 | 1 | 0 | 1 | — | — | — | — | F | F | 1,2,4 |
| P142 | 0 | 1 | 0 | 0 | 0 | 1 | 1 | 1 | 0 | — | — | — | — | F | F | 2,4 |
| P143 | 0 | 1 | 0 | 0 | 0 | 1 | 1 | 1 | 1 | — | — | — | — | F | F | 2,4 |
| P144 | 0 | 1 | 0 | 0 | 1 | 0 | 0 | 0 | 0 | — | — | — | — | F | F | 1,4 |
| P145 | 0 | 1 | 0 | 0 | 1 | 0 | 0 | 0 | 1 | — | — | — | — | F | F | 1,4 |
| P146 | 0 | 1 | 0 | 0 | 1 | 0 | 0 | 1 | 0 | — | — | — | — | F | F | 1,4 |
| P147 | 0 | 1 | 0 | 0 | 1 | 0 | 0 | 1 | 1 | — | — | — | — | F | F | 1,2,4 |
| P148 | 0 | 1 | 0 | 0 | 1 | 0 | 1 | 0 | 0 | — | — | — | — | F | F | 1,2,4 |
| P149 | 0 | 1 | 0 | 0 | 1 | 0 | 1 | 0 | 1 | — | — | — | — | F | F | 1,2,4 |
| P150 | 0 | 1 | 0 | 0 | 1 | 0 | 1 | 1 | 0 | — | — | — | — | F | F | 1,2,4 |
| P151 | 0 | 1 | 0 | 0 | 1 | 0 | 1 | 1 | 1 | — | — | — | — | F | F | 1,2,4 |
| P152 | 0 | 1 | 0 | 0 | 1 | 1 | 0 | 0 | 0 | — | — | — | — | F | F | 1,4 |
| P153 | 0 | 1 | 0 | 0 | 1 | 1 | 0 | 0 | 1 | — | — | — | — | F | F | 1,4 |
| P154 | 0 | 1 | 0 | 0 | 1 | 1 | 0 | 1 | 0 | — | — | — | — | F | F | 2,4 |
| P155 | 0 | 1 | 0 | 0 | 1 | 1 | 0 | 1 | 1 | — | — | — | — | F | F | 2,4 |
| P156 | 0 | 1 | 0 | 0 | 1 | 1 | 1 | 0 | 0 | — | — | — | — | F | F | 1,2,4 |
| P157 | 0 | 1 | 0 | 0 | 1 | 1 | 1 | 0 | 1 | — | — | — | — | F | F | 1,2,4 |
| P158 | 0 | 1 | 0 | 0 | 1 | 1 | 1 | 1 | 0 | — | — | — | — | F | F | 2,4 |
| P159 | 0 | 1 | 0 | 0 | 1 | 1 | 1 | 1 | 1 | — | — | — | — | F | F | 2,4 |
| P160 | 0 | 1 | 0 | 1 | 0 | 0 | 0 | 0 | 0 | 87 | +9,−6 | — | — | A | A | 4,5,8 |
| P161 | 0 | 1 | 0 | 1 | 0 | 0 | 0 | 0 | 1 | 81 | +12,−6 | — | — | 9 | 9 | 4,5 |
| P162 | 0 | 1 | 0 | 1 | 0 | 0 | 0 | 1 | 0 | — | — | — | — | F | F | 2,4 |
| P163 | 0 | 1 | 0 | 1 | 0 | 0 | 0 | 1 | 1 | — | — | — | — | F | F | 2,4 |
| P164 | 0 | 1 | 0 | 1 | 0 | 0 | 1 | 0 | 0 | — | — | — | — | F | F | 1,2,4 |
| P165 | 0 | 1 | 0 | 1 | 0 | 0 | 1 | 0 | 1 | — | — | — | — | F | F | 1,2,4 |
| P166 | 0 | 1 | 0 | 1 | 0 | 0 | 1 | 1 | 0 | — | — | — | — | F | F | 2,4 |
| P167 | 0 | 1 | 0 | 1 | 0 | 0 | 1 | 1 | 1 | — | — | — | — | F | F | 2,4 |
| P168 | 0 | 1 | 0 | 1 | 0 | 1 | 0 | 0 | 0 | — | — | — | — | F | F | 2,4 |
| P169 | 0 | 1 | 0 | 1 | 0 | 1 | 0 | 0 | 1 | — | — | — | — | F | F | 2,4 |
| P170 | 0 | 1 | 0 | 1 | 0 | 1 | 0 | 1 | 0 | — | — | — | — | F | F | 2,4 |
| P171 | 0 | 1 | 0 | 1 | 0 | 1 | 0 | 1 | 1 | — | — | — | — | F | F | 2,4 |
| P172 | 0 | 1 | 0 | 1 | 0 | 1 | 1 | 0 | 0 | — | — | — | — | P | F | 2,4 |
| P173 | 0 | 1 | 0 | 1 | 0 | 1 | 1 | 0 | 1 | — | — | — | — | F | F | 2,4 |
| P174 | 0 | 1 | 0 | 1 | 0 | 1 | 1 | 1 | 0 | — | — | — | — | F | F | 2,4 |
| P175 | 0 | 1 | 0 | 1 | 0 | 1 | 1 | 1 | 1 | — | — | — | — | F | F | 2,4 |
| P176 | 0 | 1 | 0 | 1 | 1 | 0 | 0 | 0 | 0 | 19 | −123 +6 | — | — | 2 | 2 | 4,5 |
| P177 | 0 | 1 | 0 | 1 | 1 | 0 | 0 | 0 | 1 | 72 | +0,−0 | — | — | 8 | 8 | 4,5,8 |
| P178 | 0 | 1 | 0 | 1 | 1 | 0 | 0 | 1 | 0 | — | — | — | — | F | F | 2,4 |
| P179 | 0 | 1 | 0 | 1 | 1 | 0 | 0 | 1 | 1 | — | — | — | — | F | F | 2,4 |
| P180 | 0 | 1 | 0 | 1 | 1 | 0 | 1 | 0 | 0 | — | — | — | — | F | F | 1,2,4 |
| P181 | 0 | 1 | 0 | 1 | 1 | 0 | 1 | 0 | 1 | — | — | — | — | F | F | 1,2,4 |
| P182 | 0 | 1 | 0 | 1 | 1 | 0 | 1 | 1 | 0 | — | — | — | — | F | F | 2,4 |
| P183 | 0 | 1 | 0 | 1 | 1 | 0 | 1 | 1 | 1 | — | — | — | — | F | F | 2,4 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS FOR EDGE | | INSIDE FOR VERTEX | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P184 | 0 | 1 | 0 | 1 | 1 | 1 | 0 | 0 | 0 | — | — | — | — | F | F | 2,4 |
| P185 | 0 | 1 | 0 | 1 | 1 | 1 | 0 | 0 | 1 | — | — | — | — | F | F | 2,4 |
| P186 | 0 | 1 | 0 | 1 | 1 | 1 | 0 | 1 | 0 | — | — | — | — | F | F | 2,4 |
| P187 | 0 | 1 | 0 | 1 | 1 | 1 | 0 | 1 | 0 | — | — | — | — | F | F | 2,4 |
| P188 | 0 | 1 | 0 | 1 | 1 | 1 | 1 | 0 | 0 | — | — | — | — | F | F | 2,4 |
| P189 | 0 | 1 | 0 | 1 | 1 | 1 | 1 | 0 | 0 | — | — | — | — | F | F | 2,4 |
| P190 | 0 | 1 | 0 | 1 | 1 | 1 | 1 | 1 | 0 | — | — | — | — | F | F | 2,4 |
| P191 | 0 | 1 | 0 | 1 | 1 | 1 | 1 | 1 | 1 | — | — | — | — | F | F | 2,4 |
| P192 | 0 | 1 | 1 | 0 | 0 | 0 | a | 0 | 0 | 98 | +2,−2 | — | — | B | B | 4,5 |
| P193 | 0 | 1 | 1 | 0 | 0 | 0 | 0 | 0 | 1 | 100 | −25,+0 | — | — | B | B | 4,5 |
| P194 | 0 | 1 | 1 | 0 | 0 | 0 | 0 | 1 | 0 | 81 | +12,−6 | — | — | 9 | 9 | 4,5 |
| P195 | 0 | 1 | 1 | 0 | 0 | 0 | 0 | 1 | 1 | 87 | +6,−12 | — | — | A | F | 3,4,5 |
| P196 | 0 | 1 | 1 | 0 | 0 | 0 | 1 | 0 | 0 | — | — | — | — | F | F | 1,4 |
| P197 | 0 | 1 | 1 | 0 | 0 | 0 | 1 | 0 | 1 | — | — | — | — | F | F | 1,2,4 |
| P198 | 0 | 1 | 1 | 0 | 0 | 0 | 1 | 1 | 0 | 72 | +0,−0 | — | — | 8 | 8 | 4,5 |
| P199 | 0 | 1 | 1 | 0 | 0 | 0 | 1 | 1 | 1 | — | — | — | — | F | F | 2,4 |
| P200 | 0 | 1 | 1 | 0 | 0 | 1 | 0 | 0 | 0 | — | — | — | — | F | F | 1,4 |
| P201 | 0 | 1 | 1 | 0 | 0 | 1 | 0 | 0 | 1 | — | — | — | — | F | F | 1,2,4 |
| P202 | 0 | 1 | 1 | 0 | 0 | 1 | 0 | 1 | 0 | — | — | — | — | F | F | 2,4 |
| P203 | 0 | 1 | 1 | 0 | 0 | 1 | 0 | 1 | 1 | — | — | — | — | F | F | 2,4 |
| P204 | 0 | 1 | 1 | 0 | 0 | 1 | 1 | 0 | 0 | — | — | — | — | F | F | 1,4 |
| P205 | 0 | 1 | 1 | 0 | 0 | 1 | 1 | 0 | 1 | — | — | — | — | F | F | 1,2,4 |
| P206 | 0 | 1 | 1 | 0 | 0 | 1 | 1 | 1 | 0 | — | — | — | — | F | F | 2,4 |
| P207 | 0 | 1 | 1 | 0 | 0 | 1 | 1 | 1 | 1 | — | — | — | — | F | F | 2,4 |
| P208 | 0 | 1 | 1 | 0 | 1 | 0 | 0 | 0 | 0 | — | — | — | — | F | F | 1,4 |
| P209 | 0 | 1 | 1 | 0 | 1 | 0 | 0 | 0 | 1 | — | — | — | — | F | F | 1,2,4 |
| P210 | 0 | 1 | 1 | 0 | 1 | 0 | 0 | 1 | 0 | — | — | — | — | F | F | 1,2,4 |
| P211 | 0 | 1 | 1 | 0 | 1 | 0 | 0 | 1 | 1 | — | — | — | — | F | F | 1,2,4 |
| P212 | 0 | 1 | 1 | 0 | 1 | 0 | 1 | 0 | 0 | — | — | — | — | F | F | 1,2,4 |
| P213 | 0 | 1 | 1 | 0 | 1 | 0 | 1 | 0 | 1 | — | — | — | — | F | F | 1,2,4 |
| P2,4 | 0 | 1 | 1 | 0 | 1 | 0 | 1 | 1 | 0 | — | — | — | — | F | F | 1,2,4 |
| P215 | 0 | 1 | 1 | 0 | 1 | 0 | 1 | 1 | 1 | — | — | — | — | F | F | 1,2,4 |
| P216 | 0 | 1 | 1 | 0 | 1 | 1 | 0 | 0 | 0 | — | — | — | — | F | F | 1,2,4 |
| P217 | 0 | 1 | 1 | 0 | 1 | 1 | 0 | 0 | 1 | — | — | — | — | F | F | 1,2,4 |
| P218 | 0 | 1 | 1 | 0 | 1 | 1 | 0 | 1 | 0 | — | — | — | — | F | F | 2,4 |
| P219 | 0 | 1 | 1 | 0 | 1 | 1 | 0 | 1 | 1 | — | — | — | — | F | F | 2,4 |
| P220 | 0 | 1 | 1 | 0 | 1 | 1 | 1 | 0 | 0 | — | — | — | — | F | F | 1,2,4 |
| P221 | 0 | 1 | 1 | 0 | 1 | 1 | 1 | 0 | 1 | — | — | — | — | F | F | 1,2,4 |
| P222 | 0 | 1 | 1 | 0 | 1 | 1 | 1 | 1 | 0 | — | — | — | — | F | F | 2,4 |
| P223 | 0 | 1 | 1 | 0 | 1 | 1 | 1 | 1 | 1 | — | — | — | — | F | F | 2,4 |
| P224 | 0 | 1 | 1 | 1 | 0 | 0 | 0 | 0 | 0 | 97 | +0,−0 | — | — | B | F | 3,4,5 |
| P225 | 0 | 1 | 1 | 1 | 0 | 0 | 0 | 0 | 1 | 87 | +6,−12 | — | — | A | F | 3,4,5 |
| P226 | 0 | 1 | 1 | 1 | 0 | 0 | 0 | 1 | 0 | — | — | — | — | F | F | 4,5 |
| P227 | 0 | 1 | 1 | 1 | 0 | 0 | 0 | 1 | 1 | — | — | — | — | F | F | 2 |
| P228 | 0 | 1 | 1 | 1 | 0 | 0 | 1 | 0 | 0 | — | — | — | — | F | F | 1,2,4 |
| P229 | 0 | 1 | 1 | 1 | 0 | 0 | 1 | 0 | 1 | — | — | — | — | F | F | 2,4 |
| P230 | 0 | 1 | 1 | 1 | 0 | 0 | 1 | 1 | 0 | — | — | — | — | F | F | 2,4 |
| P231 | 0 | 1 | 1 | 1 | 0 | 0 | 1 | 1 | 1 | — | — | — | — | F | F | 2,4 |
| P232 | 0 | 1 | 1 | 1 | 0 | 1 | 0 | 0 | 0 | — | — | — | — | F | F | 2,4 |
| P233 | 0 | 1 | 1 | 1 | 0 | 1 | 0 | 0 | 1 | — | — | — | — | F | F | 2,4 |
| P234 | 0 | 1 | 1 | 1 | 0 | 1 | 0 | 1 | 0 | — | — | — | — | F | F | 2,4 |
| P235 | 0 | 1 | 1 | 1 | 0 | 1 | 0 | 1 | 1 | — | — | — | — | F | F | 2,4 |
| P236 | 0 | 1 | 1 | 1 | 0 | 1 | 1 | 0 | 0 | — | — | — | — | F | F | 2,4 |
| P237 | 0 | 1 | 1 | 1 | 0 | 1 | 1 | 0 | 1 | — | — | — | — | F | F | 2,4 |
| P238 | 0 | 1 | 1 | 1 | 0 | 1 | 1 | 1 | 0 | — | — | — | — | F | F | 2,4 |
| P239 | 0 | 1 | 1 | 1 | 0 | 1 | 1 | 1 | 1 | — | — | — | — | F | F | 2,4 |
| P240 | 0 | 1 | 1 | 1 | 1 | 0 | 0 | 0 | 0 | 13 | −6,+12 | — | — | 1 | F | 3,4 |
| P241 | 0 | 1 | 1 | 1 | 1 | 0 | 0 | 0 | 1 | — | — | — | — | F | F | 2,4 |
| P242 | 0 | 1 | 1 | 1 | 1 | 0 | 0 | 1 | 0 | — | — | — | — | F | F | 2,4 |
| P243 | 0 | 1 | 1 | 1 | 1 | 0 | 0 | 1 | 1 | — | — | — | — | F | F | 2,4 |
| P244 | 0 | 1 | 1 | 1 | 1 | 0 | 1 | 0 | 0 | — | — | — | — | F | F | 1,2,4 |
| P245 | 0 | 1 | 1 | 1 | 1 | 0 | 1 | 0 | 1 | — | — | — | — | F | F | 1,2,4 |
| P246 | 0 | 1 | 1 | 1 | 1 | 0 | 1 | 1 | 0 | — | — | — | — | F | F | 2,4 |
| P247 | 0 | 1 | 1 | 1 | 1 | 0 | 1 | 1 | 1 | — | — | — | — | F | F | 2,4 |
| P248 | 0 | 1 | 1 | 1 | 1 | 1 | 0 | 0 | 0 | — | — | — | — | F | F | 2,4 |
| P249 | 0 | 1 | 1 | 1 | 1 | 1 | 0 | 0 | 1 | — | — | — | — | F | F | 2,4 |
| P250 | 0 | 1 | 1 | 1 | 1 | 1 | 0 | 1 | 0 | — | — | — | — | F | F | 2,4 |
| P251 | 0 | 1 | 1 | 1 | 1 | 1 | 0 | 1 | 1 | — | — | — | — | F | F | 2,4 |
| P252 | 0 | 1 | 1 | 1 | 1 | 1 | 1 | 0 | 0 | — | — | — | — | F | F | 2,4 |
| P253 | 0 | 1 | 1 | 1 | 1 | 1 | 1 | 0 | 1 | — | — | — | — | F | F | 2,4 |
| P254 | 0 | 1 | 1 | 1 | 1 | 1 | 1 | 1 | 0 | — | — | — | — | F | F | 2,4 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS FOR EDGE | | INSIDE FOR VERTEX | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P255 | 0 | 1 | 1 | 1 | 1 | 1 | 1 | 1 | 1 | — | — | — | — | F | F | 2,4 |
| P256 | 1 | 0 | 0 | 0 | 0 | 0 | 0 | 0 | 0 | — | — | — | — | F | F | 1 |
| P257 | 1 | 0 | 0 | 0 | 0 | 0 | 0 | 0 | 1 | — | — | — | — | F | F | 1 |
| P258 | 1 | 0 | 0 | 0 | 0 | 0 | 0 | 1 | 0 | — | — | — | — | F | F | 1 |
| P259 | 1 | 0 | 0 | 0 | 0 | 0 | 0 | 1 | 1 | — | — | 13 | +12,–6 | 1 | 1 | 2,6 |
| P260 | 1 | 0 | 0 | 0 | 0 | 0 | 1 | 0 | 0 | — | — | — | — | F | F | 1 |
| P261 | 1 | 0 | 0 | 0 | 0 | 0 | 1 | 0 | 1 | — | — | 25 | +12,–12 | 2 | 2 | 2,6 |
| P262 | 1 | 0 | 0 | 0 | 0 | 0 | 1 | 1 | 0 | — | — | 13 | +12,–6 | 1 | 1 | 2,6 |
| P263 | 1 | 0 | 0 | 0 | 0 | 0 | 1 | 1 | 1 | — | — | 13 | +0,–0 | 1 | 1 | 2,6 |
| P264 | 1 | 0 | 0 | 0 | 0 | 1 | 0 | 0 | 0 | — | — | — | — | F | F | 1 |
| P265 | 1 | 0 | 0 | 0 | 0 | 1 | 0 | 0 | 1 | 62 | +12,–6 | 38 | +12,–12 | C | C | 7 |
| P266 | 1 | 0 | 0 | 0 | 0 | 1 | 0 | 1 | 0 | 28 | +0,–0 | 25 | +12,–12 | –1 | 2 | 3,6,7 |
| P267 | 1 | 0 | 0 | 0 | 0 | 1 | 0 | 1 | 1 | 28 | –3,+0 | 31 | +6,–6 | 0 | 3 | 3,6,7 |
| P268 | 1 | 0 | 0 | 0 | 0 | 1 | 1 | 0 | 0 | — | — | 13 | +12,–6 | 1 | 1 | 2,6 |
| P269 | 1 | 0 | 0 | 0 | 0 | 1 | 1 | 0 | 1 | — | — | 31 | +6,–6 | 3 | 3 | 2,6 |
| P270 | 1 | 0 | 0 | 0 | 0 | 1 | 1 | 1 | 0 | — | — | 13 | +0,–0 | 1 | 1 | 2,6 |
| P271 | 1 | 0 | 0 | 0 | 0 | 1 | 1 | 1 | 1 | — | — | 25 | +0,–0 | 2 | 2 | 2,6 |
| P272 | 1 | 0 | 0 | 0 | 1 | 0 | 0 | 0 | 0 | — | — | — | — | F | F | 1 |
| P273 | 1 | 0 | 0 | 0 | 1 | 0 | 0 | 0 | 1 | 50 | +22,–22 | 50 | +0,–12 | 5 | 5 | 7 |
| P274 | 1 | 0 | 0 | 0 | 1 | 0 | 0 | 1 | 0 | 38 | –12,+0 | 38 | +12,–12 | 4 | 4 | 7 |
| P275 | 1 | 0 | 0 | 0 | 1 | 0 | 0 | 1 | 1 | 38 | –9,+0 | 44 | +63–6 | 0 | 5 | 3,6,7 |
| P276 | 1 | 0 | 0 | 0 | 1 | 0 | 1 | 0 | 0 | — | — | 25 | +12,–12 | 2 | 2 | 2,6 |
| P277 | 1 | 0 | 0 | 0 | 1 | 0 | 1 | 0 | 1 | — | — | — | — | F | F | 1,2 |
| P278 | 1 | 0 | 0 | 0 | 1 | 0 | 1 | 1 | 0 | — | — | 31 | +6,–6 | 3 | 3 | 2,6 |
| P279 | 1 | 0 | 0 | 0 | 1 | 0 | 1 | 1 | 1 | — | — | — | — | F | F | 2 |
| P280 | 1 | 0 | 0 | 0 | 1 | 1 | 0 | 0 | 0 | — | — | 13 | +12,–6 | 1 | 1 | 2,6 |
| P281 | 1 | 0 | 0 | 0 | 1 | 1 | 0 | 0 | 1 | 62 | –9,+0 | 44 | +6,–6 | 0 | 5 | 3,6,7 |
| P282 | 1 | 0 | 0 | 0 | 1 | 1 | 0 | 1 | 0 | 25 | +3,–0 | 31 | +6,–6 | 0 | 3 | 3,6,7 |
| P283 | 1 | 0 | 0 | 0 | 1 | 1 | 0 | 1 | 1 | 28 | +0,–0 | 38 | +0,–0 | C | 4 | 3,6,7 |
| P284 | 1 | 0 | 0 | 0 | 1 | 1 | 1 | 0 | 0 | — | — | — | — | 1 | 1 | 2,6 |
| P285 | 1 | 0 | 0 | 0 | 1 | 1 | 1 | 0 | 1 | — | — | — | — | F | F | 2 |
| P286 | 1 | 0 | 0 | 0 | 1 | 1 | 1 | 1 | 0 | — | — | 25 | +0,–0 | 2 | 2 | 2,6 |
| P287 | 1 | 0 | 0 | 0 | 1 | 1 | 1 | 1 | 1 | — | — | — | — | F | F | 2 |
| P288 | 1 | 0 | 0 | 1 | 0 | 0 | 0 | 0 | 0 | — | — | — | — | F | F | 1 |
| P289 | 1 | 0 | 0 | 1 | 0 | 0 | 0 | 0 | 1 | 62 | +12,–0 | 38 | +12,–12 | C | C | 7 |
| P290 | 1 | 0 | 0 | 1 | 0 | 0 | 0 | 1 | 0 | 50 | +25,–25 | 50 | +0,–12 | 5 | 5 | 7 |
| P291 | 1 | 3 | 0 | 1 | 0 | 0 | 0 | 1 | 1 | 62 | +12,–6 | 44 | +6,–6 | C | 5 | 3,6,7 |
| P292 | 1 | 0 | 0 | 1 | 0 | 0 | 1 | 0 | 0 | 38 | –12,+0 | 38 | +12,–12 | 4 | 4 | 7 |
| P293 | 1 | 0 | 0 | 1 | 0 | 0 | 1 | 0 | 1 | — | — | — | — | F | F | 1,2 |
| P294 | 1 | 0 | 0 | 1 | 0 | 0 | 1 | 1 | 0 | 38 | +6,–IP | 44 | +6,–6 | C | 5 | 3,6,7 |
| P295 | 1 | 0 | 0 | 1 | 0 | 0 | 1 | 1 | 1 | — | — | — | — | F | F | 1,2 |
| P296 | 1 | 0 | 0 | 1 | 0 | 1 | 0 | 0 | 0 | 28 | +0,–0 | 25 | +12,–12 | C | 2 | 3,6,7 |
| P297 | 1 | 0 | 0 | 1 | 0 | 1 | 0 | 0 | 1 | — | — | — | — | F | F | 2 |
| P298 | 1 | 0 | 0 | 1 | 0 | 1 | 0 | 1 | 0 | — | — | — | — | F | F | 2 |
| P299 | 1 | 0 | 0 | 1 | 0 | 1 | 0 | 1 | 1 | — | — | — | — | F | F | 2 |
| P300 | 1 | 0 | 0 | 1 | 0 | 1 | 1 | 0 | 0 | 28 | –3,+0 | 31 | +6,–6 | 3 | 3 | 3,6,7 |
| P301 | 1 | 0 | 0 | 1 | 0 | 1 | 1 | 0 | 1 | — | — | — | — | F | F | 2 |
| P302 | 1 | 0 | 0 | 1 | 0 | 1 | 1 | 1 | 0 | — | — | — | — | F | F | 2 |
| P303 | 1 | 0 | 0 | 1 | 0 | 1 | 1 | 1 | 1 | — | — | — | — | F | F | 2 |
| P304 | 1 | 0 | 0 | 1 | 1 | 0 | 0 | 0 | 0 | — | — | 13 | +12,–6 | 1 | 1 | 2,6 |
| P305 | 1 | 0 | 0 | 1 | 1 | 0 | 0 | 0 | 1 | 62 | +9,–0 | 44 | +6,–6 | C | 5 | 3,6,7 |
| P306 | 1 | 0 | 0 | 1 | 1 | 0 | 0 | 1 | 0 | 38 | +6,–12 | 44 | +6,–6 | C | 5 | 3,6,7 |
| P307 | 1 | 0 | 0 | 1 | 1 | 0 | 0 | 1 | 1 | 50 | +0,–0 | 50 | +0,–0 | 5 | 5 | 3,6,7 |
| P308 | 1 | 0 | 0 | 1 | 1 | 0 | 1 | 0 | 0 | — | — | 31 | +6,–6 | 3 | 3 | 2,6 |
| P309 | 1 | 0 | 0 | 1 | 1 | 0 | 1 | 0 | 1 | — | — | — | — | F | F | 1,2 |
| P310 | 1 | 0 | 0 | 1 | 1 | 0 | 1 | 1 | 0 | — | — | 38 | +0,–0 | 4 | 4 | 2,6 |
| P311 | 1 | 0 | 0 | 1 | 1 | 0 | 1 | 1 | 1 | — | — | — | — | F | F | 2 |
| P312 | 1 | 0 | 0 | 1 | 1 | 1 | 0 | 0 | 0 | — | — | 19 | +6,–6 | 2 | 2 | 2,6 |
| P313 | 1 | 0 | 0 | 1 | 1 | 1 | 0 | 0 | 1 | — | — | — | — | F | F | 2 |
| P314 | 1 | 0 | 0 | 1 | 1 | 1 | 0 | 1 | 0 | — | — | — | — | F | F | 2 |
| P315 | 1 | 0 | 0 | 1 | 1 | 1 | 0 | 1 | 1 | — | — | — | — | F | F | 2 |
| P316 | 1 | 0 | 0 | 1 | 1 | 1 | 1 | 0 | 0 | — | — | 25 | +0,–0 | 2 | 2 | 2,6 |
| P317 | 1 | 0 | 0 | 1 | 1 | 1 | 1 | 0 | 1 | — | — | — | — | F | F | 2 |
| P318 | 1 | 0 | 0 | 1 | 1 | 1 | 1 | 1 | 0 | — | — | — | — | F | F | 2 |
| P319 | 1 | 0 | 0 | 1 | 1 | 1 | 1 | 1 | 1 | — | — | — | — | F | F | 2 |
| P320 | 1 | 0 | 1 | 0 | 0 | 0 | 0 | 0 | 0 | — | — | — | — | F | F | 1 |
| P321 | 1 | 0 | 1 | 0 | 0 | 0 | 0 | 0 | 1 | — | — | 25 | +12,–12 | 2 | 2 | 2,6 |
| P322 | 1 | 0 | 1 | 0 | 0 | 0 | 0 | 1 | 0 | 62 | +12,–12 | 38 | +12,–12 | C | 0 | 7 |
| P323 | 1 | 0 | 1 | 0 | 0 | 0 | 0 | 1 | 1 | — | — | 31 | +6,–6 | 3 | 3 | 2,6 |
| P324 | 1 | 0 | 1 | 0 | 0 | 0 | 1 | 0 | 0 | 50 | +22,–22 | 50 | +0,–12 | 5 | 5 | 7 |
| P325 | 1 | 0 | 1 | 0 | 0 | 0 | 1 | 0 | 1 | — | — | — | — | F | F | 1,2 |

-continued

| | | | | | | | | | | OUTPUT WEIGHT | | | | | | |
|---|---|---|---|---|---|---|---|---|---|---|---|---|---|---|---|---|
| INPUT CONDITIONS | | | | | | | | | | PLUS FOR EDGE | | INSIDE FOR VERTEX | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P326 | 1 | 0 | 1 | 0 | 0 | 0 | 1 | 1 | 0 | 62 | 4–9,–0 | 44 | +6,–6 | 0 | 5 | 6,7 |
| P327 | 1 | 0 | 1 | 0 | 0 | 0 | 1 | 1 | 1 | — | — | — | — | F | F | 2 |
| P328 | 1 | 0 | 1 | 0 | 0 | 1 | 0 | 0 | 0 | 38 | –12,+0 | 38 | +12,–12 | 4 | 4 | 7 |
| P329 | 1 | 0 | 1 | 0 | 0 | 1 | 0 | 0 | 1 | — | — | — | — | F | F | 1,2 |
| P330 | 1 | 0 | 1 | 0 | 0 | 1 | 0 | 1 | 0 | — | — | — | — | F | F | 2 |
| P331 | 1 | 0 | 1 | 0 | 0 | 1 | 0 | 1 | 1 | — | — | — | — | F | F | 2 |
| P332 | 1 | 0 | 1 | 0 | 0 | 1 | 1 | 0 | 0 | 38 | –9,+0 | 44 | +6,–6 | C | 5 | 3,6,7 |
| P333 | 1 | 0 | 1 | 0 | 0 | 1 | 1 | 0 | 1 | — | — | — | — | F | F | 1,2 |
| P334 | 1 | 0 | 1 | 0 | 0 | 1 | 1 | 1 | 0 | — | — | — | — | F | F | 2 |
| F335 | 1 | 0 | 1 | 0 | 0 | 1 | 1 | 1 | 1 | — | — | — | — | F | F | 2 |
| P336 | 1 | 0 | 1 | 0 | 1 | 0 | 0 | 0 | 0 | — | — | 25 | +12,–12 | 2 | 2 | 2,6 |
| P337 | 1 | 0 | 1 | 0 | 1 | 0 | 0 | 0 | 1 | — | — | — | — | F | F | 1,2 |
| P338 | 1 | 0 | 1 | 0 | 1 | 0 | 0 | 1 | 0 | — | — | — | — | F | F | 1,2 |
| P339 | 1 | 0 | 1 | 0 | 1 | 0 | 0 | 1 | 1 | — | — | — | — | F | F | 1,2 |
| P340 | 1 | 0 | 1 | 0 | 1 | 0 | 1 | 0 | 0 | — | — | — | — | F | F | 1,2 |
| P341 | 1 | 0 | 1 | 0 | 1 | 0 | 1 | 0 | 1 | — | — | — | — | F | F | 1,2 |
| P342 | 1 | 0 | 1 | 0 | 1 | 0 | 1 | 1 | 0 | — | — | — | — | F | F | 1,2 |
| P343 | 1 | 0 | 1 | 0 | 1 | 0 | 1 | 1 | 1 | — | — | — | — | F | F | 1,2 |
| P344 | 1 | 0 | 1 | 0 | 1 | 1 | 0 | 0 | 0 | — | — | 31 | +6,–6 | 3 | 3 | 2,6 |
| P345 | 1 | 0 | 1 | 0 | 1 | 1 | 0 | 0 | 1 | — | — | — | — | F | F | 1,2 |
| P346 | 1 | 0 | 1 | 0 | 1 | 1 | 0 | 1 | 0 | — | — | — | — | F | F | 1,2 |
| P347 | 1 | 0 | 1 | 0 | 1 | 1 | 0 | 1 | 1 | — | — | — | — | F | F | 1,2 |
| P348 | 1 | 0 | 1 | 0 | 1 | 1 | 1 | 0 | 0 | — | — | — | — | F | F | 2 |
| P349 | 1 | 0 | 1 | 0 | 1 | 1 | 1 | 0 | 1 | — | — | — | — | F | F | 1,2 |
| P350 | 1 | 0 | 1 | 0 | 1 | 1 | 1 | 1 | 0 | — | — | — | — | F | F | 2 |
| P351 | 1 | 0 | 1 | 0 | 1 | 1 | 1 | 1 | 1 | — | — | — | — | F | F | 1,2 |
| P352 | 1 | 0 | 1 | 1 | 0 | 0 | 0 | 0 | 0 | — | — | 13 | +12,–6 | 1 | 1 | 2,6 |
| P353 | 1 | 0 | 1 | 1 | 0 | 0 | 0 | 0 | 1 | — | — | 31 | +6,–6 | 3 | 3 | 2,6 |
| P354 | 1 | 0 | 1 | 1 | 0 | 0 | 0 | 1 | 0 | 62 | +12,–6 | 44 | +6,–6 | C | 5 | 3,6,7 |
| P355 | 1 | 0 | 1 | 1 | 0 | 0 | 0 | 1 | 1 | — | — | 38 | +0,–0 | 4 | 4 | 2,6 |
| P356 | 1 | 0 | 1 | 1 | 0 | 0 | 1 | 0 | 0 | 38 | +9,–0 | 44 | +6,–6 | C | 5 | 3,6,7 |
| P357 | 1 | 0 | 1 | 1 | 0 | 0 | 1 | 0 | 1 | — | — | — | — | F | F | 1,2 |
| P358 | 1 | 0 | 1 | 1 | 0 | 0 | 1 | 1 | 0 | 50 | +0,–0 | 50 | +0,–0 | 5 | 5 | 3,6,7 |
| P359 | 1 | 0 | 1 | 1 | 0 | 0 | 1 | 1 | 1 | — | — | — | — | F | F | 2 |
| P360 | 1 | 0 | 1 | 1 | 0 | 1 | 0 | 0 | 0 | 28 | –3,+0 | 31 | +6,–6 | 3 | 3 | 3,6,7 |
| P361 | 1 | 0 | 1 | 1 | 0 | 1 | 0 | 0 | 1 | — | — | — | — | F | F | 2 |
| P362 | 1 | 0 | 1 | 1 | 0 | 1 | 0 | 1 | 0 | — | — | — | — | F | F | 2 |
| P363 | 1 | 0 | 1 | 1 | 0 | 1 | 0 | 1 | 1 | — | — | — | — | F | F | 2 |
| P364 | 1 | 0 | 1 | 1 | 0 | 1 | 1 | 0 | 0 | 28 | +0,–0 | 38 | +0,–0 | C | 4 | 3,6,7 |
| P365 | 1 | 0 | 1 | 1 | 0 | 1 | 1 | 0 | 1 | — | — | — | — | F | F | 1,2 |
| P366 | 1 | 0 | 1 | 1 | 0 | 1 | 1 | 1 | 0 | — | — | — | — | F | F | 2 |
| P367 | 1 | 0 | 1 | 1 | 0 | 1 | 1 | 1 | 1 | — | — | — | — | F | F | 2 |
| P368 | 1 | 0 | 1 | 1 | 1 | 0 | 0 | 0 | 0 | — | — | 13 | +0,–0 | 1 | 1 | 2,6 |
| P369 | 1 | 0 | 1 | 1 | 1 | 0 | 0 | 0 | 1 | — | — | — | — | F | F | 2 |
| P370 | 1 | 0 | 1 | 1 | 1 | 0 | 0 | 1 | 0 | — | — | — | — | F | F | 2 |
| P371 | 1 | 0 | 1 | 1 | 1 | 0 | 0 | 1 | 1 | — | — | — | — | F | F | 2 |
| P372 | 1 | 0 | 1 | 1 | 1 | 0 | 1 | 0 | 0 | — | — | — | — | F | F | 2 |
| P373 | 1 | 0 | 1 | 1 | 1 | 0 | 1 | 0 | 1 | — | — | — | — | F | F | 1,2 |
| P374 | 1 | 0 | 1 | 1 | 1 | 0 | 1 | 1 | 0 | — | — | — | — | F | F | 2 |
| P375 | 1 | 0 | 1 | 1 | 1 | 0 | 1 | 1 | 1 | — | — | — | — | F | F | 2 |
| P376 | 1 | 0 | 1 | 1 | 1 | 1 | 0 | 0 | 0 | — | — | — | — | F | F | 2 |
| P377 | 1 | 0 | 1 | 1 | 1 | 1 | 0 | 0 | 1 | — | — | — | — | F | F | 2 |
| P378 | 1 | 0 | 1 | 1 | 1 | 1 | 0 | 1 | 0 | — | — | — | — | F | F | 2 |
| P379 | 1 | 0 | 1 | 1 | 1 | 1 | 0 | 1 | 1 | — | — | — | — | F | F | 2 |
| P380 | 1 | 0 | 1 | 1 | 1 | 1 | 1 | 0 | 0 | — | — | — | — | F | F | 2 |
| P381 | 1 | 0 | 1 | 1 | 1 | 1 | 1 | 0 | 1 | — | — | — | — | F | F | 1,2 |
| P382 | 1 | 0 | 1 | 1 | 1 | 1 | 1 | 1 | 0 | — | — | — | — | F | F | 2 |
| P383 | 1 | 0 | 1 | 1 | 1 | 1 | 1 | 1 | 1 | — | — | — | — | F | F | 2 |
| P384 | 1 | 1 | 0 | 0 | 0 | 0 | 0 | 0 | 0 | — | — | — | — | F | F | 1 |
| P385 | 1 | 1 | 0 | 0 | 0 | 0 | 0 | 0 | 1 | — | — | 13 | +12,–6 | 1 | 1 | 2,6 |
| P386 | 1 | 1 | 0 | 0 | 0 | 0 | 0 | 1 | 0 | 72 | +0,–0 | 25 | +12,–12 | C | 2 | 3,6,7 |
| P387 | 1 | 1 | 0 | 0 | 0 | 0 | 0 | 1 | 1 | — | — | 13 | +0,–0 | 1 | 1 | 2,6 |
| P388 | 1 | 1 | 0 | 0 | 0 | 0 | 1 | 0 | 0 | 62 | +12,–0 | 38 | +12,–12 | C | C | 7 |
| P389 | 1 | 1 | 0 | 0 | 0 | 0 | 1 | 0 | 1 | — | — | 31 | +6,–6 | 3 | 3 | 2,6 |
| P390 | 1 | 1 | 0 | 0 | 0 | 0 | 1 | 1 | 0 | 72 | +3,–0 | 31 | +6,–6 | C | 3 | 3,6,7 |
| P391 | 1 | 1 | 0 | 0 | 0 | 0 | 1 | 1 | 1 | — | — | — | — | F | F | 2 |
| P392 | 1 | 1 | 0 | 0 | 0 | 1 | 0 | 0 | 0 | 50 | +25,–25 | 50 | +0,–12 | 5 | 5 | 7 |
| P393 | 1 | 1 | 0 | 0 | 0 | 1 | 0 | 0 | 1 | 62, | –61+12 | 44 | +6,–6 | C | 5 | 3,6,7 |
| P394 | 1 | 1 | 0 | 0 | 0 | 1 | 0 | 1 | 0 | — | — | — | — | F | F | 2 |
| P395 | 1 | 1 | 0 | 0 | 0 | 1 | 0 | 1 | 1 | — | — | — | — | F | F | 2 |
| P396 | 1 | 1 | 0 | 0 | 0 | 1 | 1 | 0 | 0 | 62 | –6,+12 | 44 | +6,–6 | C | 5 | 3,6,7 |

-continued

| P | F8 | F7 | F6 | F5 | F4 | F3 | F2 | F1 | F0 | PLUS FOR EDGE RANGE % | PLUS FOR EDGE TOL. ± % | INSIDE FOR VERTEX RANGE % | INSIDE FOR VERTEX TOL. ± % | RIGHT ANGLE OK HEX | RIGHT ANGLE NOT OK HEX | NOTES |
|---|---|---|---|---|---|---|---|---|---|---|---|---|---|---|---|---|
| P397 | 1 | 1 | 0 | 0 | 0 | 1 | 1 | 0 | 1 | — | — | 38 | +0,–0 | 4 | 4 | 2,6 |
| P398 | 1 | 1 | 0 | 0 | 0 | 1 | 1 | 1 | 0 | — | — | — | — | F | F | 2 |
| P399 | 1 | 1 | 0 | 0 | 0 | 1 | 1 | 1 | 1 | — | — | — | — | F | F | 2 |
| P400 | 1 | 1 | 0 | 0 | 1 | 0 | 0 | 0 | 0 | 38 | –12,+0 | 38 | +12,–12 | 4 | 4 | 7 |
| P401 | 1 | 1 | 0 | 0 | 1 | 0 | 0 | 0 | 1 | 38 | +9,–0 | 44 | +6,–6 | C | 5 | 3,6,7 |
| P402 | 1 | 1 | 0 | 0 | 1 | 0 | 0 | 1 | 0 | — | — | — | — | F | F | 2 |
| P403 | 1 | 1 | 0 | 0 | 1 | 0 | 0 | 1 | 1 | — | — | — | — | F | F | 2 |
| P404 | 1 | 1 | 0 | 0 | 1 | 0 | 1 | 0 | 0 | — | — | — | — | F | F | 3 |
| P405 | 1 | 1 | 0 | 0 | 1 | 0 | 1 | 0 | 1 | — | — | — | — | F | F | 1,2 |
| P406 | 1 | 1 | 0 | 0 | 1 | 0 | 1 | 1 | 0 | — | — | — | — | F | F | 2 |
| P407 | 1 | 1 | 0 | 0 | 1 | 0 | 1 | 1 | 1 | — | — | — | — | F | F | 2 |
| P408 | 1 | 1 | 0 | 0 | 1 | 1 | 0 | 0 | 0 | 38 | –12,+6 | 44 | +6,–6 | C | 5 | 3,6,7 |
| P409 | 1 | 1 | 0 | 0 | 1 | 1 | 0 | 0 | 1 | 50 | +0,–0 | 50 | +0,–0 | 5 | 5 | 3,6,7 |
| P410 | 1 | 1 | 0 | 0 | 1 | 1 | 0 | 1 | 0 | — | — | — | — | F | F | 2 |
| P411 | 1 | 1 | 0 | 0 | 1 | 1 | 0 | 1 | 1 | — | — | — | — | F | F | 2 |
| P412 | 1 | 1 | 0 | 0 | 1 | 1 | 1 | 0 | 0 | — | — | — | — | F | F | 1,2 |
| P413 | 1 | 1 | 0 | 0 | 1 | 1 | 1 | 0 | 1 | — | — | — | — | F | F | 1,2 |
| P414 | 1 | 1 | 0 | 0 | 1 | 1 | 1 | 1 | 0 | — | — | — | — | F | F | 2 |
| P415 | 1 | 1 | 0 | 0 | 1 | 1 | 1 | 1 | 1 | — | — | — | — | F | F | 2 |
| P416 | 1 | 1 | 0 | 1 | 0 | 0 | 0 | 0 | 0 | 72 | +0,–0 | 25 | +12,–12 | C | 2 | 3 6,7 |
| P417 | 1 | 1 | 0 | 1 | 0 | 0 | 0 | 0 | 1 | 72 | +3,–0 | 31 | +6,–6 | C | 3 | 3,6,7 |
| P418 | 1 | 1 | 0 | 1 | 0 | 0 | 0 | 1 | 0 | — | — | — | — | F | F | 2 |
| P419 | 1 | 1 | 0 | 1 | 0 | 0 | 0 | 1 | 1 | — | — | — | — | F | F | 2 |
| P420 | 1 | 1 | 0 | 1 | 0 | 0 | 1 | 0 | 0 | — | — | — | — | F | F | 1,2 |
| P421 | 1 | 1 | 0 | 1 | 0 | 0 | 1 | 0 | 1 | — | — | — | — | F | F | 1,2 |
| P422 | 1 | 1 | 0 | 1 | 0 | 0 | 1 | 1 | 0 | — | — | — | — | F | F | 2 |
| P423 | 1 | 1 | 0 | 1 | 0 | 0 | 1 | 1 | 1 | — | — | — | — | F | F | 2 |
| P424 | 1 | 1 | 0 | 1 | 0 | 1 | 0 | 0 | 0 | — | — | — | — | F | F | 2 |
| P425 | 1 | 1 | 0 | 1 | 0 | 1 | 0 | 0 | 1 | — | — | — | — | F | F | 2 |
| P426 | 1 | 1 | 0 | 1 | 0 | 1 | 0 | 1 | 0 | — | — | — | — | F | F | 2 |
| P427 | 1 | 1 | 0 | 1 | 0 | 1 | 0 | 1 | 1 | — | — | — | — | F | F | 2 |
| P428 | 1 | 1 | 0 | 1 | 0 | 1 | 1 | 0 | 0 | — | — | — | — | F | F | 2 |
| P429 | 1 | 1 | 0 | 1 | 0 | 1 | 1 | 0 | 1 | — | — | — | — | F | F | 1,2 |
| P430 | 1 | 1 | 0 | 1 | 0 | 1 | 1 | 1 | 0 | — | — | — | — | F | F | 2 |
| P431 | 1 | 1 | 0 | 1 | 0 | 1 | 1 | 1 | 1 | — | — | — | — | F | F | 3 |
| P432 | 1 | 1 | 0 | 1 | 1 | 0 | 0 | 0 | 0 | 75 | –3,+0 | 31 | +6,–6 | C | 3 | 6,7 |
| P433 | 1 | 1 | 0 | 1 | 1 | 0 | 0 | 0 | 1 | 72 | +0,–0 | 38 | +0,–0 | C | 4 | 3,6,7 |
| P434 | 1 | 1 | 0 | 1 | 1 | 0 | 0 | 1 | 0 | — | — | — | — | F | F | 2 |
| P435 | 1 | 1 | 0 | 1 | 1 | 0 | 0 | 1 | 1 | — | — | — | — | F | F | 2 |
| P436 | 1 | 1 | 0 | 1 | 1 | 0 | 1 | 0 | 0 | — | — | — | — | F | F | 2 |
| P437 | 1 | 1 | 0 | 1 | 1 | 0 | 1 | 0 | 1 | — | — | — | — | F | F | 1,2 |
| P438 | 1 | 1 | 0 | 1 | 1 | 0 | 1 | 1 | 0 | — | — | — | — | F | F | 1,2 |
| P439 | 1 | 1 | 0 | 1 | 1 | 0 | 1 | 1 | 1 | — | — | — | — | F | F | 2 |
| P440 | 1 | 1 | 0 | 1 | 1 | 1 | 0 | 0 | 0 | — | — | — | — | F | F | 2 |
| P441 | 1 | 1 | 0 | 1 | 1 | 1 | 0 | 0 | 1 | — | — | — | — | F | F | 2 |
| P442 | 1 | 1 | 0 | 1 | 1 | 1 | 0 | 1 | 0 | — | — | — | — | F | F | 2 |
| P443 | 1 | 1 | 0 | 1 | 1 | 1 | 0 | 1 | 1 | — | — | — | — | F | F | 2 |
| P444 | 1 | 1 | 0 | 1 | 1 | 1 | 1 | 0 | 0 | — | — | — | — | F | F | 2 |
| P445 | 1 | 1 | 0 | 1 | 1 | 1 | 1 | 0 | 1 | — | — | — | — | F | F | 1,2 |
| P446 | 1 | 1 | 0 | 1 | 1 | 1 | 1 | 1 | 0 | — | — | — | — | F | F | 2 |
| P447 | 1 | 1 | 0 | 1 | 1 | 1 | 1 | 1 | 1 | — | — | — | — | F | F | 2 |
| P448 | 1 | 1 | 1 | 0 | 0 | 0 | 0 | 0 | 0 | — | — | 13 | +12,–6 | 1 | 1 | 2,6 |
| P449 | 1 | 1 | 1 | 0 | 0 | 0 | 0 | 0 | 1 | — | — | 13 | +0,–0 | 1 | 1 | 2,6 |
| P450 | 1 | 1 | 1 | 0 | 0 | 0 | 0 | 1 | 0 | 72 | +3,–0 | 31 | +6,–6 | C | 3 | 3,6,7 |
| P451 | 1 | 1 | 1 | 0 | 0 | 0 | 0 | 1 | 1 | — | — | 25 | +01–0 | 2 | 2 | 2,6 |
| P452 | 1 | 1 | 1 | 0 | 0 | 0 | 1 | 0 | 0 | 62 | +9,–0 | 44 | +6,–6 | C | 5 | 3,6,7 |
| P453 | 1 | 1 | 1 | 0 | 0 | 0 | 1 | 0 | 1 | — | — | — | — | F | F | 2 |
| P454 | 1 | 1 | 1 | 0 | 0 | 0 | 1 | 1 | 0 | 72 | +0,–0 | 38 | +0,–0 | C | 4 | 3,6,7 |
| P455 | 1 | 1 | 1 | 0 | 0 | 0 | 1 | 1 | 1 | — | — | — | — | F | F | 2 |
| P456 | 1 | 1 | 1 | 0 | 0 | 1 | 0 | 0 | 0 | 38 | –12,+6 | 44 | +6,–6 | C | 5 | 3,6,7 |
| P457 | 1 | 1 | 1 | 0 | 0 | 1 | 0 | 0 | 1 | — | — | — | — | F | F | 1,2 |
| P458 | 1 | 1 | 1 | 0 | 0 | 1 | 0 | 1 | 0 | — | — | — | — | F | F | 2 |
| P459 | 1 | 1 | 1 | 0 | 0 | 1 | 0 | 1 | 1 | — | — | — | — | F | F | 1,2 |
| P460 | 1 | 1 | 1 | 0 | 0 | 1 | 1 | 0 | 0 | 50 | +0,–0 | 50 | +0,–0 | 5 | 5 | 3,6,7 |
| P461 | 1 | 1 | 1 | 0 | 0 | 1 | 1 | 0 | 1 | — | — | — | — | F | F | 1,2 |
| P462 | 1 | 1 | 1 | 0 | 0 | 1 | 1 | 1 | 0 | — | — | — | — | F | F | 2 |
| P463 | 1 | 1 | 1 | 0 | 0 | 1 | 1 | 1 | 1 | — | — | — | — | F | F | 2 |
| P464 | 1 | 1 | 1 | 0 | 1 | 0 | 0 | 0 | 0 | — | — | 31 | +6,–6 | 3 | 3 | 2,6 |
| P465 | 1 | 1 | 1 | 0 | 1 | 0 | 0 | 0 | 1 | — | — | — | — | F | F | 2 |
| P466 | 1 | 1 | 1 | 0 | 1 | 0 | 0 | 1 | 0 | — | — | — | — | F | F | 1,2 |
| P467 | 1 | 1 | 1 | 0 | 1 | 0 | 0 | 1 | 1 | — | — | — | — | F | F | 2 |

-continued

| | INPUT CONDITIONS | | | | | | | | | OUTPUT WEIGHT | | | | | | |
|---|---|---|---|---|---|---|---|---|---|---|---|---|---|---|---|---|
| | | | | | | | | | | PLUS FOR EDGE | | INSIDE FOR VERTEX | | RIGHT ANGLE | | |
| | SUB-PIXEL CONDITIONS | | | | | | | | | RANGE | TOL. | RANGE | TOL. | OK | NOT OK | |
| P | F8 | F7 | F6 | F5 | F4 | F3 | F2 | F1 | F0 | % | ± % | % | ± % | HEX | HEX | NOTES |
| P468 | 1 | 1 | 1 | 0 | 1 | 0 | 1 | 0 | 0 | — | — | — | — | F | F | 1,2 |
| P469 | 1 | 1 | 1 | 0 | 1 | 0 | 1 | 0 | 1 | — | — | — | — | F | F | 1,2 |
| P470 | 1 | 1 | 1 | 0 | 1 | 0 | 1 | 1 | 0 | — | — | — | — | F | F | 1,2 |
| P471 | 1 | 1 | 1 | 0 | 1 | 0 | 1 | 1 | 1 | — | — | — | — | F | F | 1,2 |
| P472 | 1 | 1 | 1 | 0 | 1 | 1 | 0 | 0 | 0 | — | — | 38 | +0,−0 | 4 | 4 | 2,6 |
| P473 | 1 | 1 | 1 | 0 | 1 | 1 | 0 | 0 | 0 | — | — | — | — | F | F | 2 |
| P474 | 1 | 1 | 1 | 0 | 1 | 1 | 0 | 1 | 0 | — | — | — | — | F | F | 2 |
| P475 | 1 | 1 | 1 | 0 | 1 | 1 | 0 | 1 | 1 | — | — | — | — | F | F | 2 |
| P476 | 1 | 1 | 1 | 0 | 1 | 1 | 1 | 0 | 0 | — | — | — | — | F | F | 2 |
| P477 | 1 | 1 | 1 | 0 | 1 | 1 | 1 | 0 | 1 | — | — | — | — | F | F | 2 |
| P478 | 1 | 1 | 1 | 0 | 1 | 1 | 1 | 1 | 0 | — | — | — | — | F | F | 2 |
| P479 | 1 | 1 | 1 | 0 | 1 | 1 | 1 | 1 | 1 | — | — | — | — | F | F | 2 |
| P480 | 1 | 1 | 1 | 1 | 0 | 0 | 0 | 0 | 0 | — | — | 19 | +6,−6 | 2 | 2 | 2,6 |
| P481 | 1 | 1 | 1 | 1 | 0 | 0 | 0 | 0 | 1 | — | — | 25 | +0,−0 | 2 | 2 | 2,6 |
| P482 | 1 | 1 | 1 | 1 | 0 | 0 | 0 | 1 | 0 | — | — | — | — | F | F | 2 |
| P483 | 1 | 1 | 1 | 1 | 0 | 0 | 0 | 1 | 1 | — | — | — | — | F | F | 2 |
| P484 | 1 | 1 | 1 | 1 | 0 | 0 | 1 | 0 | 0 | — | — | — | — | F | F | 2 |
| P485 | 1 | 1 | 1 | 1 | 0 | 0 | 1 | 0 | 1 | — | — | — | — | F | F | 2 |
| P486 | 1 | 1 | 1 | 1 | 0 | 0 | 1 | 1 | 0 | — | — | — | — | F | F | 2 |
| P487 | 1 | 1 | 1 | 1 | 0 | 0 | 1 | 1 | 1 | — | — | — | — | F | F | 2 |
| P488 | 1 | 1 | 1 | 1 | 0 | 1 | 0 | 0 | 0 | — | — | — | — | F | F | 2 |
| P489 | 1 | 1 | 1 | 1 | 0 | 1 | 0 | 0 | 1 | — | — | — | — | F | F | 2 |
| P490 | 1 | 1 | 1 | 1 | 0 | 1 | 0 | 1 | 0 | — | — | — | — | F | F | 2 |
| P491 | 1 | 1 | 1 | 1 | 0 | 1 | 0 | 1 | 1 | — | — | — | — | F | F | 2 |
| P492 | 1 | 1 | 1 | 1 | 0 | 1 | 1 | 0 | 0 | — | — | — | — | F | F | 2 |
| P493 | 1 | 1 | 1 | 1 | 0 | 1 | 1 | 0 | 1 | — | — | — | — | F | F | 1,2 |
| P494 | 1 | 1 | 1 | 1 | 0 | 1 | 1 | 1 | 0 | — | — | — | — | F | F | 2 |
| P495 | 1 | 1 | 1 | 1 | 0 | 1 | 1 | 1 | 1 | — | — | — | — | F | F | 2 |
| P496 | 1 | 1 | 1 | 1 | 1 | 0 | 0 | 0 | 0 | — | — | 25 | +0,−0 | 2 | 2 | 2,6 |
| P497 | 1 | 1 | 1 | 1 | 1 | 0 | 0 | 0 | 1 | — | — | — | — | F | F | 2 |
| P498 | 1 | 1 | 1 | 1 | 1 | 0 | 0 | 1 | 0 | — | — | — | — | p | F | 2 |
| P499 | 1 | 1 | 1 | 1 | 1 | 0 | 0 | 1 | 1 | — | — | — | — | F | F | 2 |
| P500 | 1 | 1 | 1 | 1 | 1 | 0 | 1 | 0 | 0 | — | — | — | — | F | F | 2 |
| P501 | 1 | 1 | 1 | 1 | 1 | 0 | 1 | 0 | 1 | — | — | — | — | F | F | 1,2 |
| P502 | 1 | 1 | 1 | 1 | 1 | 0 | 1 | 1 | 0 | — | — | — | — | F | F | 2 |
| P503 | 1 | 1 | 1 | 1 | 1 | 0 | 1 | 1 | 1 | — | — | — | — | F | F | 2 |
| P504 | 1 | 1 | 1 | 1 | 1 | 1 | 0 | 0 | 0 | — | — | — | — | F | F | 2 |
| P505 | 1 | 1 | 1 | 1 | 1 | 1 | 0 | 0 | 1 | — | — | — | — | F | F | 2 |
| P506 | 1 | 1 | 1 | 1 | 1 | 1 | 0 | 1 | 0 | — | — | — | — | F | F | 2 |
| P507 | 1 | 1 | 1 | 1 | 1 | 1 | 0 | 1 | 1 | — | — | — | — | F | F | 2 |
| P508 | 1 | 1 | 1 | 1 | 1 | 1 | 1 | 0 | 0 | — | — | — | — | F | F | 2 |
| P509 | 1 | 1 | 1 | 1 | 1 | 1 | 1 | 0 | 1 | — | — | — | — | F | F | 2 |
| P510 | 1 | 1 | 1 | 1 | 1 | 1 | 1 | 1 | 0 | — | — | — | — | F | F | 2 |
| P511 | 1 | 1 | 1 | 1 | 1 | 1 | 1 | 1 | 1 | — | — | — | — | F | F | 2 |

| SUBPIXEL TRANSITION LOGIC | | |
|---|---|---|
| DETERMINATION OF SUBPIXEL CONDITIONS TO PACK INTO A PRESENT AND A SUBSEQUENT SUB-PIXEL CONDITION WORD FOR A PARTICULAR SUB-PIXEL TRANSITION: $X_L \cdot Y_L (X_N + Y_N)$ NOTES: | | |
| FX=0 | ; | $X1N \rightarrow \overline{X1N}$ |
| | | $X1N \rightarrow X1N$ |

-continued

| SUBPIXEL TRANSITION LOGIC | | |
|---|---|---|
| | | $\overline{X1N} \rightarrow \overline{X1N}$ |
| FX=1 | ; | $\overline{X1N} \rightarrow X1N$ |
| FY=0 | ; | $Y1N \rightarrow \overline{Y1N}$ |
| | | $Y1N \rightarrow Y1N$ |
| | | $\overline{Y1N} \rightarrow \overline{Y1N}$ |
| FY=1 | ; | $\overline{Y1N} \rightarrow Y1N$ |
| FXY | = | FX + FY |

SUBPIXEL CORNER CONDITION TABLE
YIN · YIN = 1

| | | | | | OUTPUT | | | | | | | | | | | | | | | | | | |
|---|---|---|---|---|---|---|---|---|---|---|---|---|---|---|---|---|---|---|---|---|---|---|---|
| INPUT | | | | | PRESENT | | | | | | | | | SUBSEQUENT | | | | | | | | | |
| P | XNS | YNS | FX | FY | F8 | F7 | F6 | F5 | F4 | F3 | F2 | F1 | F0 | F8 | F7 | F6 | F5 | F4 | F3 | F2 | F1 | F0 | NOTES |
| P0 | 0 | 0 | 0 | 0 | 0 | 0 | 1 | 0 | 0 | 0 | 0 | 0 | 0 | — | — | — | — | — | — | — | — | — | |
| P1 | 0 | 0 | 0 | 1 | 0 | 0 | 0 | 0 | 0 | 0 | 0 | 0 | 1 | 0 | 0 | 1 | 0 | 0 | 0 | 0 | 0 | 0 | |
| P2 | 0 | 0 | 1 | 0 | 0 | 0 | 0 | 0 | 1 | 0 | 0 | 0 | 0 | 0 | 0 | 1 | 0 | 0 | 0 | 0 | 0 | 0 | |
| P3 | 0 | 0 | 1 | 1 | 0 | 0 | 0 | 0 | 0 | 0 | 1 | 0 | 0 | 0 | 0 | 1 | 0 | 0 | 0 | 0 | 0 | 0 | |
| P4 | 0 | 1 | 0 | 0 | 0 | 0 | 0 | 0 | 0 | 0 | 0 | 0 | 1 | — | — | — | — | — | — | — | — | — | |
| P5 | 0 | 1 | 0 | 1 | 0 | 0 | 1 | 0 | 0 | 0 | 0 | 0 | 0 | 0 | 0 | 0 | 0 | 0 | 0 | 0 | 0 | 1 | |
| P6 | 0 | 1 | 1 | 0 | 0 | 0 | 0 | 0 | 0 | 0 | 1 | 0 | 0 | 0 | 0 | 0 | 0 | 0 | 0 | 0 | 0 | 1 | |
| P7 | 0 | 1 | 1 | 1 | 0 | 0 | 0 | 0 | 1 | 0 | 0 | 0 | 0 | 0 | 0 | 0 | 0 | 0 | 0 | 0 | 0 | 1 | |
| P8 | 1 | 0 | 0 | 0 | 0 | 0 | 0 | 0 | 1 | 0 | 0 | 0 | 0 | — | — | — | — | — | — | — | — | — | |
| P9 | 1 | 0 | 0 | 1 | 0 | 0 | 0 | 0 | 0 | 0 | 1 | 0 | 0 | 0 | 0 | 0 | 0 | 1 | 0 | 0 | 0 | 0 | |
| P10 | 1 | 0 | 1 | 0 | 0 | 0 | 1 | 0 | 0 | 0 | 0 | 0 | 0 | 0 | 0 | 0 | 0 | 1 | 0 | 0 | 0 | 0 | |
| P11 | 1 | 0 | 1 | 1 | 0 | 0 | 0 | 0 | 0 | 0 | 0 | 0 | 1 | 0 | 0 | 0 | 0 | 1 | 0 | 0 | 0 | 0 | |
| P12 | 1 | 1 | 0 | 0 | 0 | 0 | 0 | 0 | 0 | 0 | 1 | 0 | 0 | — | — | — | — | — | — | — | — | — | |
| P13 | 1 | 1 | 0 | 1 | 0 | 0 | 0 | 0 | 1 | 0 | 0 | 0 | 0 | 0 | 0 | 0 | 0 | 0 | 0 | 1 | 0 | 0 | |
| P14 | 1 | 1 | 1 | 0 | 0 | 0 | 0 | 0 | 0 | 0 | 0 | 0 | 1 | 0 | 0 | 0 | 0 | 0 | 0 | 1 | 0 | 0 | |
| P15 | 1 | 1 | 1 | 1 | 0 | 0 | 1 | 0 | 0 | 0 | 0 | 0 | 0 | 0 | 0 | 0 | 0 | 0 | 0 | 1 | 0 | 0. | |

SUBPIXEL MIDPOINT CONDITION TABLE
YIN + YIN = 1

| | | | | | OUTPUT | | | | | | | | | | | | | | | | | | |
|---|---|---|---|---|---|---|---|---|---|---|---|---|---|---|---|---|---|---|---|---|---|---|---|
| INPUT | | | | | PRESENT | | | | | | | | | SUBSEQUENT | | | | | | | | | |
| P | XNS | YNS | FX | FY | F8 | F7 | F6 | F5 | F4 | F3 | F2 | F1 | F0 | F8 | F7 | F6 | F5 | F4 | F3 | F2 | F1 | F0 | NOTES |
| P0 | 0 | 0 | 0 | 0 | 0 | 0 | 0 | 1 | 0 | 0 | 0 | 0 | 0 | 0 | — | — | — | — | — | — | — | — | |
| P1 | 0 | 0 | 0 | 1 | 0 | 0 | 0 | 0 | 0 | 0 | 0 | 1 | 0 | 0 | 0 | 0 | 1 | 0 | 0 | 0 | 0 | 0 | |
| P2 | 0 | 0 | 1 | 0 | 0 | 1 | 0 | 0 | 0 | 0 | 0 | 0 | 0 | — | — | — | — | — | — | — | — | — | |
| P3 | 0 | 0 | 1 | 1 | 0 | 0 | 0 | 0 | 0 | 1 | 0 | 0 | 0 | 0 | 1 | 0 | 0 | 0 | 0 | 0 | 0 | 0 | |
| P4 | 0 | 1 | 0 | 0 | 0 | 0 | 0 | 0 | 0 | 0 | 0 | 1 | 0 | — | — | — | — | — | — | — | — | — | |
| P5 | 0 | 1 | 0 | 1 | 0 | 0 | 0 | 1 | 0 | 0 | 0 | 0 | 0 | 0 | 0 | 0 | 0 | 0 | 0 | 0 | 1 | 0 | |
| P6 | 0 | 1 | 1 | 0 | 0 | 1 | 0 | 0 | 0 | 0 | 0 | 0 | 0 | — | — | — | — | — | — | — | — | — | |
| P7 | 0 | 1 | 1 | 1 | 0 | 0 | 0 | 0 | 0 | 1 | 0 | 0 | 0 | 0 | 1 | 0 | 0 | 0 | 0 | 0 | 0 | 0 | |
| P8 | 1 | 0 | 0 | 0 | 0 | 0 | 0 | 1 | 0 | 0 | 0 | 0 | 0 | — | — | — | — | — | — | — | — | — | |
| P9 | 1 | 0 | 0 | 1 | 0 | 0 | 0 | 0 | 0 | 0 | 0 | 1 | 0 | 0 | 0 | 0 | 1 | 0 | 0 | 0 | 0 | 0 | |
| P10 | 1 | 0 | 1 | 0 | 0 | 0 | 0 | 0 | 0 | 1 | 0 | 0 | 0 | — | — | — | — | — | — | — | — | — | |
| P11 | 1 | 0 | 1 | 1 | 0 | 1 | 0 | 0 | 0 | 0 | 0 | 0 | 0 | 0 | 0 | 0 | 0 | 0 | 1 | 0 | 0 | 0 | |
| P12 | 1 | 1 | 0 | 0 | 0 | 0 | 0 | 0 | 0 | 0 | 0 | 0 | 0 | — | — | — | — | — | — | — | — | — | |
| P13 | 1 | 1 | 0 | 1 | 0 | 0 | 0 | 1 | 0 | 0 | 0 | 0 | 0 | 0 | 0 | 0 | 0 | 0 | 0 | 0 | 1 | 0 | |
| P14 | 1 | 1 | 1 | 0 | 0 | 0 | 0 | 0 | 0 | 1 | 0 | 0 | 0 | — | — | — | — | — | — | — | — | — | |
| P15 | 1 | 1 | 1 | 1 | 0 | 1 | 0 | 0 | 0 | 0 | 0 | 0 | 0 | 0 | 0 | 0 | 0 | 0 | 1 | 0 | 0 | 0 | |

NOTES:
XIN = 0; TEST FY, X DOES NOT CHANGE
XIN = 1; TEST FX, Y DOES NOT CHANGE

NOTES

EXAMPLES OF SMOOTHING OPERATION

NOTE-A: Stored condition.

NOTE-B: Table output condition.

NOTE-C: Updated stored condition.

NOTE-D: Pixel completion processing.

NOTE-E: Initialize present pixel and subsequent pixel condition words.

NOTE-F: Vertex.

NOTE-G: Pixel complete processing. Store vertex condition.

NOTE-H: Fetch stored vertex condition and combine with overlapping vertex condition.

SEE FIG. 11M FOR CASE I OPERATION

SEE FIG. 11N FOR CASE II OPERATION

CASE I OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| — | — | — | — | — | — | — | — | — | — | 0 | 0 | 0 | 0 | 0 | 0 | 0 | 0 | 0 | 0 | 0 | 0 | 0 | 0 | 0 | 0 | 0 | 0 | | | | | A |
| 2 | 4 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 2 | 4 | — | — | — | — | — | — | — | — | 1 | 0 | 0 | 0 | 0 | 0 | 0 | 0 | 0 | 0 | 0 | 0 | 0 | 0 | 0 | 0 | 0 | 0 | | | | | C,F |
| 2 | 5 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B,F |
| 2 | 5 | — | — | — | — | — | — | — | — | 1 | 0 | 0 | 0 | 0 | 0 | 0 | 1 | 0 | 0 | 0 | 0 | 1 | 0 | 0 | 0 | 0 | 0 | | | | | C,F,G |
| 2 | 5 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | | | | | D,E,F |
| 3 | 6 | 1 | 0 | 0 | 0 | 1 | 1 | — | — | 0 | 0 | 0 | 0 | 0 | 1 | 0 | 0 | 0 | 0 | 0 | 0 | 0 | 0 | 0 | 0 | 0 | 0 | | | | | B |
| 3 | 6 | — | — | — | — | — | — | — | — | 0 | 0 | 0 | 1 | 0 | 1 | 0 | 0 | 0 | 0 | 0 | 0 | 0 | 0 | 0 | 0 | 0 | 0 | | | | | C |
| 3 | 7 | 1 | ·1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | B | |
| 3 | 7 | — | — | — | — | — | — | — | — | 0 | 0 | 0 | 1 | 0 | 1 | 1 | 0 | 0 | 0 | 1 | 0 | 0 | 0 | 0 | 0 | 0 | | | | | C | |
| 3 | 7 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P44 | 2 | P44 | 2 | D,E |
| 4 | 8 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 4 | 8 | — | — | — | — | — | — | — | — | 1 | 0 | 1 | 0 | 0 | 0 | 0 | 0 | 0 | 0 | 0 | 0 | 0 | 0 | 0 | 0 | 0 | 0 | | | | | C |
| 4 | 9 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 4 | 9 | — | — | — | — | — | — | — | — | 1 | 0 | 1 | 0 | 0 | 0 | 0 | 1 | 0 | 0 | 0 | 0 | 1 | 0 | 0 | 0 | 0 | 0 | | | | | C |
| 4 | 9 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P322 | 6 | P322 | | D,E |
| 5 | 10 | 1 | 0 | 0 | 0 | 1 | | — | — | 0 | 0 | 0 | 0 | 0 | 1 | 0 | 0 | 0 | 0 | 0 | 0 | 0 | 0 | 0 | 0 | 0 | 0 | | | | | B |
| 5 | 10 | — | — | — | — | — | — | — | — | 0 | 0 | 0 | 1 | 0 | 1 | 0 | 0 | 0 | 0 | 0 | 0 | 0 | 0 | 0 | 0 | 0 | 0 | | | | | C |
| 5 | 11 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 5 | 11 | — | — | — | — | — | — | — | — | 0 | 0 | 0 | 1 | 0 | 1 | 1 | 0 | 0 | 0 | 0 | 1 | 0 | 0 | 0 | 0 | 0 | 0 | | | | | C |
| 5 | 11 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P44 | 2 | P44 | 2 | D,E |
| 6 | 12 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 6 | 12 | — | — | — | — | — | — | — | — | 1 | 0 | 1 | 0 | 0 | 0 | 0 | 0 | 0 | 0 | 0 | 0 | 0 | 0 | 0 | 0 | 0 | 0 | | | | | C |
| 6 | 13 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | B | | | | |
| 6 | 13 | — | — | — | — | — | — | — | — | 1 | 0 | 1 | 0 | 0 | 0 | 0 | 1 | 0 | 0 | 0 | 0 | 1 | 0 | 0 | 0 | 0 | 0 | | | | | C |
| 6 | 13 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P322 | 6 | P322 | 6 | D,E |
| 6 | 14 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 6 | 14 | — | — | — | — | — | — | — | — | 1 | 0 | 0 | 1 | 0 | 0 | 0 | 0 | 0 | 0 | 0 | 0 | 0 | 0 | 0 | 0 | 0 | 0 | | | | | C |
| 7 | 15 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 7 | 15 | — | — | — | — | — | — | — | — | 1 | 0 | 0 | 1 | 0 | 0 | 1 | 0 | 0 | 0 | 0 | 1 | 0 | 0 | 0 | 0 | 0 | 0 | | | | | C |
| 7 | 15 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P292 | 4 | P292 | 4 | D,E |
| 7 | 16 | 1 | 0 | 0 | 0 | 1 | 0 | — | — | 0 | 1 | 0 | 0 | 0 | 0 | 0 | 0 | 0 | 0 | 0 | 0 | 0 | 0 | 0 | 0 | 0 | 0 | | | | | B |
| 7 | 16 | — | — | — | — | — | — | — | — | 0 | 1 | 1 | 0 | 0 | 0 | 0 | 0 | 0 | 0 | 0 | 0 | 0 | 0 | 0 | 0 | 0 | 0 | | | | | C |
| 8 | 17 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 8 | 17 | — | — | — | — | — | — | — | — | 0 | 1 | 1 | 0 | 0 | 0 | 0 | 1 | 0 | 0 | 0 | 0 | 1 | 0 | 0 | 0 | 0 | 0 | | | | | C |
| 8 | 17 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P194 | 9 | P194 | 2 | D,E |
| 8 | 18 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | P194 | 9 | P194 | 2 | B |
| 8 | 18 | — | — | — | — | — | — | — | — | 1 | 0 | 0 | 1 | 0 | 0 | 0 | 0 | 0 | 0 | 0 | 0 | 0 | 0 | 0 | 0 | 0 | 0 | | | | | C |
| 9 | 19 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 9 | 19 | — | — | — | — | — | — | — | 1 | 0 | 0 | 1 | 0 | 0 | 1 | 0 | 0 | 0 | 0 | 1 | 0 | 0 | 0 | 0 | 0 | 0 | | | | | C | |
| 9 | 19 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P292 | 4 | P292 | 7 | D,E |
| 9 | 20 | 1 | 0 | 0 | 0 | 1 | 0 | — | — | 0 | 1 | 0 | 0 | 0 | 0 | 0 | 0 | 0 | 0 | 0 | 0 | 0 | 0 | 0 | 0 | 0 | 0 | | | | | B |
| 9 | 20 | — | — | — | — | — | — | — | — | 0 | 1 | 1 | 0 | 0 | 0 | 0 | 0 | 0 | 0 | 0 | 0 | 0 | 0 | 0 | 0 | 0 | 0 | C | | | | |
| 10 | 21 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |

-continued

CASE I OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 10 | 21 | — | — | — | — | — | — | — | — | 0 | 1 | 1 | 0 | 0 | 0 | 0 | 1 | 0 | 0 | 0 | 0 | 1 | 0 | 0 | 0 | 0 | 0 | | | | | C |
| 10 | 21 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P194 | 9 | P194 | 2 | D,E |
| 10 | 22 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 10 | 22 | 0 | 0 | 0 | 1 | — | — | — | — | 1 | 0 | 0 | 1 | 0 | 0 | 0 | 0 | 0 | 0 | 0 | 0 | 0 | 0 | 0 | 0 | 0 | 0 | | | | | C,F |
| 11 | 21 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B,F |
| 11 | 21 | — | — | — | — | — | — | — | — | 1 | 0 | 0 | 1 | 1 | 0 | 0 | 0 | 0 | 0 | 0 | 0 | 0 | 0 | 0 | 0 | 0 | 1 | | | | | C,F,G |
| 11 | 21 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | — | — | P304 | 1 | D,E,F |
| 12 | 20 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 12 | 20 | — | — | — | — | — | — | — | — | 1 | 0 | 0 | 0 | 0 | 0 | 0 | 0 | 1 | 0 | 0 | 0 | 0 | 0 | 0 | 0 | 0 | 0 | | | | | C |
| 13 | 19 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 13 | 19 | — | — | — | — | — | — | — | — | 1 | 0 | 0 | 0 | 1 | 0 | 0 | 0 | 1 | 0 | 0 | 0 | 0 | 0 | 0 | 0 | 0 | 1 | | | | | c |
| 13 | 19 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P273 | 5 | P273 | 6 | D,E |
| 14 | 18 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 14 | 18 | — | — | — | — | — | — | — | — | 1 | 0 | 0 | 0 | 0 | 0 | 0 | 0 | 1 | 0 | 0 | 0 | 0 | 0 | 0 | 0 | 0 | 0 | | | | | C |
| 15 | 17 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 15 | 17 | — | — | — | — | — | — | — | — | 1 | 0 | 0 | 0 | 1 | 0 | 0 | 0 | | 0 | 0 | 0 | 0 | 0 | 0 | 0 | 0 | 1 | | | | | C |
| 15 | 17 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P273 | 5 | P273 | 6 | D,E |
| 15 | 16 | 1 | 0 | 0 | 1 | 1 | 0 | — | — | 0 | 1 | 0 | 0 | 0 | 0 | 0 | 0 | 0 | 0 | 0 | 0 | 0 | 0 | 0 | 0 | 0 | 0 | | | | | B |
| 15 | 16 | — | — | — | — | — | — | — | — | 0 | 1 | 0 | 0 | 0 | 0 | 0 | 0 | 1 | 0 | 0 | 0 | 0 | 0 | 0 | 0 | 0 | 0 | | | | | C |
| 16 | 15 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 16 | 15 | — | — | — | — | — | — | — | — | 0 | 1 | 0 | 1 | 0 | 0 | 0 | 0 | 1 | 0 | 0 | 0 | 0 | 0 | 0 | 0 | 1 | 0 | | | | | C |
| 16 | 15 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P161 | 9 | p161 | 2 | D,E |
| 17 | 14 | 1 | 0 | 0 | 1 | 1 | 1 | — | — | 0 | 0 | 0 | 0 | 0 | 1 | 0 | 0 | 0 | 0 | 1 | 0 | 0 | 0 | 0 | 0 | 0 | 0 | | | | | B |
| 17 | 14 | — | — | — | — | — | — | — | — | 0 | 0 | 0 | 0 | 0 | 1 | 0 | 1 | 0 | 0 | 1 | 0 | 0 | 0 | 0 | 0 | 0 | 0 | | | | | C |
| 17 | 14 | — | — | — | — | — | — | — | — | 0 | 1 | 0 | 0 | 0 | 0 | 0 | 0 | 0 | 0 | 0 | 0 | 0 | 0 | 0 | 0 | 0 | 0 | P10 | 1 | P10 | A | D,E |
| 18 | 13 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 18 | 13 | — | — | — | — | — | — | — | — | 0 | 1 | 0 | 1 | 0 | 0 | 0 | 0 | 0 | 0 | 0 | 0 | 0 | 0 | 0 | 0 | 1 | 0 | | | | | C |
| 18 | 13 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P60 | A | P160 | 1 | D,E |
| 19 | 12 | 1 | 0 | 0 | 1 | 1 | 1 | — | — | 0 | 0 | 0 | 0 | 0 | 1 | 0 | 0 | 0 | 0 | 1 | 0 | 0 | 0 | 0 | 0 | 0 | 0 | | | | | B |
| 19 | 12 | — | — | — | — | — | — | — | — | 0 | 0 | 0 | 0 | 0 | 1 | 0 | 1 | 0 | 0 | 1 | 0 | 0 | 0 | 0 | 0 | 0 | 0 | | | | | C |
| 19 | 12 | — | — | — | — | — | — | — | — | 0 | 1 | 0 | 0 | 0 | 0 | 0 | 0 | 0 | 0 | 0 | 0 | 0 | 0 | 0 | 0 | 0 | 0 | P10 | 1 | P10 | A | D,E |
| 20 | 11 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 20 | 11 | — | — | — | — | — | — | — | — | 0 | 1 | 0 | 1 | 0 | 0 | 0 | 0 | 0 | 0 | 0 | 0 | 0 | 0 | 0 | 0 | 1 | | 0 | | | | C |
| 20 | 11 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P160 | A | P160 | 1 | D,E |
| 21 | 10 | 1 | 0 | 0 | 1 | 1 | 1 | — | — | 0 | 0 | 0 | 0 | 0 | 1 | 0 | 0 | 0 | 0 | 0 | 0 | 0 | 0 | 0 | 0 | 0 | 0 | | | | | B |
| 21 | 10 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | | | | | C |
| 21 | 9 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 21 | 9 | — | — | — | — | — | — | — | — | 0 | 0 | 0 | 0 | 1 | 1 | 0 | 1 | 0 | 0 | 0 | 0 | 0 | 0 | 0 | 0 | 0 | 1 | | | | | C |
| 21 | 9 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P26 | 2 | P26 | 9 | D,E |
| 22 | 8 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 22 | 8 | — | — | — | — | — | — | — | — | 1 | 0 | 0 | 0 | 0 | 0 | 0 | 0 | 1 | 0 | 0 | 0 | 0 | 0 | 0 | 0 | 0 | 0 | | | | | C |
| 23 | 7 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 23 | 7 | — | — | — | — | — | — | — | — | 1 | 0 | 0 | 0 | 1 | 0 | 0 | 0 | 1 | 0 | 0 | 0 | 0 | 0 | 0 | 0 | 0 | 1 | | | | | C |
| 23 | 7 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P273 | 5 | P273 | 6 | D,E |
| 24 | 6 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |

-continued

CASE I OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 24 | 6 | 0 | 0 | 1 | 1 | — | — | — | — | 1 | 0 | 0 | 0 | 0 | 0 | 0 | 0 | 1 | 0 | 0 | 0 | 0 | 0 | 0 | 0 | 0 | 0 | | | | | C,F |
| 23 | 6 | 1 | 0 | 1 | 1 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B,F |
| 23 | 6 | — | — | — | — | — | — | — | — | 1 | 1 | 0 | 0 | 0 | 0 | 0 | 0 | 1 | 0 | 0 | 0 | 0 | 0 | 1 | 0 | 0 | 0 | | | | | C,F,G |
| 23 | 6 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | — | — | P385 | 1 | D,E,F |
| 22 | 6 | 0 | 0 | 1 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 22 | 6 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 21 | 6 | | 0 | 1 | 1 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 21 | 6 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |
| 21 | 6 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | B392 | 6 | D,E |
| 20 | 6 | 0 | 0 | 1 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 20 | 6 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 19 | 6 | 1 | 0 | 1 | 1 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 19 | 6 | — | — | — | — | — | — | — | — | 1 | 1 | 0 | 0 | 0 | 1 | 0 | 0 | 0 | 0 | 0 | 0 | 0 | 0 | | 0 | 0 | 0 | | | | | C |
| 19 | 6 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 18 | 5 | 0 | 1 | 1 | 1 | 0 | 1 | — | — | 0 | 0 | 0 | 1 | 0 | 0 | 0 | 0 | 0 | 0 | 0 | 0 | 0 | 0 | 0 | 0 | 0 | 0 | | | | | B |
| 18 | 5 | — | — | — | — | — | — | — | — | 0 | 0 | 0 | | 0 | | 0 | 0 | 0 | 0 | 0 | 0 | 0 | 0 | 0 | 0 | 0 | 0 | | | | | C |
| 17 | 5 | 1 | 1 | 1 | 1 | — | — | 1 | 1 | 0 | 0 | 1 | 0 | 0 | 0 | 0 | 0 | 0 | 0 | 0 | 0 | 0 | 0 | 0 | 1 | 0 | 0 | | | | | B |
| 17 | 5 | — | — | — | — | — | — | — | — | 0 | 0 | 1 | 1 | 0 | 1 | 0 | 0 | 0 | 0 | 0 | 0 | 0 | 0 | 0 | 1 | 0 | 0 | | | | | C |
| 17 | 5 | — | — | — | — | — | — | — | — | 0 | 0 | 0 | 0 | 0 | 0 | 1 | 0 | 0 | 0 | 0 | 0 | 0 | 0 | 0 | 0 | 0 | 0 | P104 | 2 | P104 | 9 | D,E |
| 16 | 5 | 0 | 1 | 1 | 1 | 0 | 0 | — | — | 0 | 0 | 0 | 0 | 0 | 0 | 0 | 1 | 0 | 0 | 0 | 0 | 0 | 0 | 0 | 0 | 0 | 0 | | | | | B |
| 16 | 5 | — | — | — | — | — | — | — | — | 0 | 0 | 0 | 0 | 0 | 0 | 1 | 1 | 0 | 0 | 0 | 0 | 0 | 0 | 0 | 0 | 0 | 0 | | | | | C |
| 15 | 5 | 1 | 1 | 1 | 1 | — | — | 1 | 0 | 0 | 0 | 0 | 0 | 0 | 0 | 0 | 0 | 1 | 0 | 0 | 0 | 0 | 0 | 0 | 1 | 0 | 0 | | | | | B |
| 15 | 5 | — | — | — | — | — | — | — | — | 0 | 0 | 0 | 0 | 0 | 0 | 1 | 1 | | 0 | 0 | 0 | 0 | 0 | 0 | 1 | 0 | 0 | | | | | C |
| 15 | 5 | — | — | — | — | — | — | — | — | 0 | 0 | 0 | 0 | 0 | 0 | 1 | 0 | 0 | 0 | 0 | 0 | 0 | 0 | 0 | 0 | 0 | 0 | P7 | B | P7 | 0 | D,E |
| 14 | 5 | 0 | 1 | 1 | 1 | 0 | 0 | — | — | 0 | 0 | 0 | 0 | 0 | 0 | 0 | 1 | 0 | 0 | 0 | 0 | 0 | 0 | 0 | 0 | 0 | 0 | | | | | B |
| 14 | 5 | — | — | — | — | — | — | — | — | 0 | 0 | 0 | 0 | 0 | 0 | 1 | 1 | 0 | 0 | 0 | 0 | 0 | 0 | 0 | 0 | 0 | 0 | | | | | C |
| 13 | 5 | 1 | 1 | 1 | 1 | — | — | 1 | 0 | 0 | 0 | 0 | 0 | 0 | 0 | 0 | 1 | 0 | 0 | 0 | 0 | 0 | 0 | 1 | 0 | 0 | 0 | | | | | B |
| 13 | 5 | — | — | — | — | — | — | — | — | 0 | 0 | 0 | 0 | 0 | 0 | 1 | 1 | 1 | 0 | 0 | 0 | 0 | 0 | 1 | 0 | 0 | 0 | P7 | | | | C |
| 13 | 5 | — | — | — | — | — | — | — | — | 0 | 0 | 0 | 0 | 0 | 0 | 1 | 0 | 0 | 0 | 0 | 0 | 0 | 0 | 0 | | 0 | 0 | P7 | B | p7 | 0 | D,E |
| 12 | 5 | 0 | 1 | 1 | 1 | 0 | 0 | — | — | 0 | 0 | 0 | 0 | 0 | 0 | 0 | 1 | 0 | 0 | 0 | 0 | 0 | 0 | 0 | 0 | 0 | 0 | | | | | B |
| 12 | 5 | — | — | — | — | — | — | — | — | 0 | 0 | 0 | 0 | 0 | 0 | 1 | 1 | 0 | 0 | 0 | 0 | 0 | 0 | 0 | 0 | 0 | 0 | | | | | C |
| 11 | 5 | 1 | 1 | 1 | 1 | — | — | 1 | 0 | 0 | 0 | 0 | 0 | 0 | 0 | 0 | 0 | 1 | 0 | 0 | 0 | 0 | 0 | 0 | 1 | 0 | 0 | | | | | B |
| 11 | 5 | — | — | — | — | — | — | — | — | 0 | 0 | 0 | 0 | 0 | 0 | 1 | 1 | 1 | 0 | 0 | 0 | 0 | 0 | 0 | 1 | 0 | 0 | | | | | C |
| 11 | 5 | — | — | — | — | — | — | — | — | 0 | 0 | 0 | 0 | 0 | 0 | 1 | 0 | 0 | 0 | 0 | 0 | 0 | 0 | 0 | 0 | 0 | 0 | P7 | B | P7 | 0 | D,E |
| 10 | 5 | 0 | 1 | 1 | 1 | 0 | 0 | — | — | 0 | 0 | 0 | 0 | 0 | 0 | 0 | 1 | 0 | 0 | 0 | 0 | 0 | 0 | 0 | 0 | 0 | 0 | | | | | B |
| 10 | 5 | — | — | — | — | — | — | — | — | 0 | 0 | 0 | 0 | 0 | 0 | 1 | | 0 | 0 | 0 | 0 | 0 | 0 | 0 | 0 | 0 | 0 | | | | | C |
| 9 | 5 | 1 | 1 | 1 | 1 | — | — | 1 | 0 | 0 | 0 | 0 | 0 | 0 | 0 | 0 | 0 | 1 | 0 | 0 | 0 | 0 | 0 | 0 | 1 | 0 | 0 | | | | | B |
| 9 | 5 | — | — | — | — | — | — | — | — | 0 | 0 | 0 | 0 | 0 | 0 | 1 | 0 | 0 | 0 | 0 | 0 | 0 | 0 | 0 | 0 | 0 | 0 | P7 | B | P7 | 0 | D,E |
| 8 | 5 | 0 | 1 | 1 | 1 | 0 | 0 | — | — | 0 | 0 | 0 | 0 | 0 | 0 | 0 | 1 | 0 | 0 | 0 | 0 | 0 | 0 | 0 | 0 | 0 | 0 | | | | | B |
| 8 | 5 | — | — | — | — | — | — | — | — | 0 | 0 | 0 | 0 | 0 | 0 | 1 | | 0 | 0 | 0 | 0 | 0 | 0 | 0 | 0 | 0 | 0 | | | | | C |
| 7 | 5 | 1 | 1 | 1 | 1 | — | — | 1 | 0 | 0 | 0 | 0 | 0 | 0 | 0 | 0 | 0 | 1 | 0 | 0 | 0 | 0 | 0 | 0 | 1 | 0 | 0 | | | | | B |
| 7 | 5 | — | — | — | — | — | — | — | — | 0 | 0 | 0 | 0 | 0 | 0 | 1 | 1 | 1 | 0 | 0 | 0 | 0 | 0 | 0 | 1 | 0 | 0 | | | | | C |
| 7 | 5 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P7 | B | P7 | 0 | D,E |
| 6 | 4 | 0 | 0 | | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 6 | 4 | — | — | — | — | — | — | — | — | 1 | 0 | 0 | 0 | 0 | 0 | 1 | 0 | 0 | 0 | 0 | 0 | 0 | 0 | 0 | 0 | 0 | 0 | | | | | C |

-continued

CASE I OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 5 | 4 | 1 | 0 | 1 | 1 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 5 | 4 | — | — | — | — | — | — | — | — | 1 | 1 | 0 | 0 | 0 | 0 | 1 | 0 | 0 | 0 | 0 | 0 | 0 | 0 | 1 | 0 | 0 | 0 | | | | | C |
| 5 | 4 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P388 | 6 | P388 | 5 | D,E |
| 4 | 4 | 0 | 0 | 1 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 4 | 4 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 3 | 4 | 1 | 0 | 1 | 1 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 3 | 4 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |
| 3 | 4 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 2 | 4 | 0 | 0 | 1 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 2 | 4 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C,F |
| 2 | 4 | — | — | — | — | — | — | — | — | 1 | 0 | 0 | 0 | 0 | 0 | 0 | 1 | 0 | 0 | 0 | 0 | 0 | 0 | 0 | 0 | 0 | 0 | | | | | F,H |
| 2 | 4 | — | — | — | — | — | — | — | — | 1 | 0 | 0 | 0 | 0 | 1 | 0 | 1 | 0 | 0 | 0 | 0 | 0 | 0 | 0 | 0 | 0 | 0 | — | — | P266 | 2 | C,F |

CASE II OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| — | — | — | — | — | — | — | — | — | — | 0 | 0 | 0 | 0 | 0 | 0 | 0 | 0 | 0 | 0 | 0 | 0 | 0 | 0 | 0 | 0 | 0 | 0 | | | | | A |
| 2 | 8 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 2 | 8 | — | — | — | — | — | — | — | — | 1 | 0 | 0 | 0 | 0 | 0 | 0 | 0 | 0 | 0 | 0 | 0 | 0 | 0 | 0 | 0 | 0 | 0 | | | | | C,F |
| 3 | 9 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B,F |
| 3 | 9 | — | — | — | — | — | — | — | — | 1 | 0 | 0 | 0 | 0 | 0 | 1 | 0 | 0 | 0 | 0 | 1 | 0 | 0 | 0 | 0 | 0 | 0 | | | | | C,F,G |
| 3 | 9 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | | | | | D,E,F |
| 4 | 10 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 4 | 10 | — | — | — | — | — | — | — | — | 1 | 0 | 1 | 0 | 0 | 0 | 0 | 0 | 0 | 0 | 0 | 0 | 0 | 0 | 0 | 0 | 0 | 0 | | | | | C |
| 5 | 11 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 5 | 11 | — | — | — | — | — | — | — | — | 1 | 0 | 1 | 0 | 0 | 0 | 1 | 0 | 0 | 0 | 0 | 1 | 0 | 0 | 0 | 0 | 0 | 0 | C | | | | |
| 5 | 11 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P324 | 5 | P324 | 5 | D,E |
| 6 | 12 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 6 | 12 | — | — | — | — | — | — | — | — | 1 | 0 | 1 | 0 | 0 | 0 | 0 | 0 | 0 | 0 | 0 | 0 | 0 | 0 | 0 | 0 | 0 | 0 | | | | | C |
| 7 | 13 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 7 | 13 | — | — | — | — | — | — | — | — | 1 | 0 | 1 | 0 | 0 | 0 | 1 | 0 | 0 | 0 | 0 | 1 | 0 | 0 | 0 | 0 | 0 | 0 | | | | | C |
| 7 | 13 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P324 | 5 | P324 | 5 | D,E |
| 7 | 14 | 1 | 0 | 0 | 0 | 1 | 0 | — | — | 0 | 1 | 0 | 0 | 0 | 0 | 0 | 0 | 0 | 0 | 0 | 0 | 0 | 0 | 0 | 0 | 0 | | | | | B | |
| 7 | 14 | — | — | — | — | — | — | — | — | 0 | 1 | 1 | 0 | 0 | 0 | 0 | 0 | 0 | 0 | 0 | 0 | 0 | 0 | 0 | 0 | 0 | 0 | | | | | C |
| 8 | 15 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 8 | 15 | — | — | — | — | — | — | — | — | 0 | 1 | 1 | 0 | 0 | 0 | 0 | 1 | 0 | 0 | 0 | 0 | 1 | 0 | 0 | 0 | 0 | 0 | | | | | C |
| 8 | 15 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P194 | 9 | P194 | 9 | D,E |
| 9 | 16 | 1 | 0 | 0 | 0 | 1 | 1 | — | — | 0 | 0 | 0 | 0 | 0 | 1 | 0 | 0 | 0 | 0 | 1 | 0 | 0 | 0 | 0 | 0 | 0 | 0 | | | | | B |
| 9 | 16 | — | — | — | — | — | — | — | — | 0 | 0 | 0 | 1 | 0 | 1 | 0 | 0 | 0 | 0 | 1 | 0 | 0 | 0 | 0 | 0 | 0 | 0 | | | | | C |
| 9 | 16 | — | — | — | — | — | — | — | — | 0 | 1 | 0 | 0 | 0 | 0 | 0 | 0 | 0 | 0 | 0 | 0 | 0 | 0 | 0 | 0 | 0 | 0 | P40 | 1 | P40 | 1 | D,E |
| 10 | 17 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 10 | 17 | — | — | — | — | — | — | — | — | 0 | 1 | 0 | 0 | 0 | 0 | 0 | 1 | 0 | 0 | 0 | 0 | 1 | 0 | 0 | 0 | 0 | 0 | | | | | C |
| 10 | 17 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P130 | A | P130 | A | D,E |
| 11 | 18 | 1 | 0 | 0 | 0 | 1 | 1 | — | — | 0 | 0 | 0 | 0 | 0 | 1 | 0 | 0 | 0 | 0 | 1 | 0 | 0 | 0 | 0 | 0 | 0 | 0 | | | | | B |
| 11 | 18 | — | — | — | — | — | — | — | — | 0 | 0 | 0 | 1 | 0 | 1 | 0 | 0 | 0 | 0 | 1 | 0 | 0 | 0 | 0 | 0 | 0 | 0 | | | | | C |
| 11 | 18 | — | — | — | — | — | — | — | — | 0 | 1 | 0 | 0 | 0 | 0 | 0 | 0 | 0 | 0 | 0 | 0 | 0 | 0 | 0 | 0 | 0 | 0 | P40 | 1 | P40 | 1 | D,E |
| 12 | 19 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 12 | 19 | — | — | — | — | — | — | — | — | 0 | 1 | 0 | 0 | 0 | 0 | 0 | 1 | 0 | 0 | 0 | 0 | 1 | 0 | 0 | 0 | 0 | 0 | | | | | C |
| 12 | 19 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P130 | A | P130 | A | D,E |
| 13 | 20 | 1 | 0 | 0 | 0 | 1 | 1 | — | — | 0 | 0 | 0 | 0 | 0 | 1 | 0 | 0 | 0 | 0 | 1 | 0 | 0 | 0 | 0 | 0 | 0 | 0 | | | | | B |
| 13 | 20 | — | — | — | — | — | — | — | — | 0 | 0 | 0 | 1 | 0 | 1 | 0 | 0 | 0 | 0 | 1 | 0 | 0 | 0 | 0 | 0 | 0 | 0 | | | | | C |
| 13 | 20 | — | — | — | — | — | — | — | — | 0 | 1 | 0 | 0 | 0 | 0 | 0 | 0 | 0 | 0 | 0 | 0 | 0 | 0 | 0 | 0 | 0 | 0 | P40 | 1 | P40 | 1 | D,E |
| 14 | 21 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 14 | 21 | — | — | — | — | — | — | — | — | 0 | 1 | 0 | 0 | 0 | 0 | 0 | 1 | 0 | 0 | 0 | 0 | 1 | 0 | 0 | 0 | 0 | 0 | | | | | C |
| 14 | 21 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P130 | A | P130 | A | D,E |
| 15 | 22 | 1 | 0 | 0 | 0 | 1 | 1 | — | — | 0 | 0 | 0 | 0 | 0 | 1 | 0 | 0 | 0 | 0 | 1 | 0 | 0 | 0 | 0 | 0 | 0 | 0 | | | | | B |
| 15 | 22 | — | — | — | — | — | — | — | — | 0 | 0 | 0 | 1 | 0 | 1 | 0 | 0 | 0 | 0 | 1 | 0 | 0 | 0 | 0 | 0 | 0 | 0 | | | | | C |
| 15 | 22 | — | — | — | — | — | — | — | — | 0 | 1 | 0 | 0 | 0 | 0 | 0 | 0 | 0 | 0 | 0 | 0 | 0 | 0 | 0 | 0 | 0 | 0 | P40 | 1 | P40 | 1 | D,E |
| 16 | 23 | 0 | 1 | 0 | 0 | 0 | 1 | — | — | 0 | 0 | 0 | 0 | 0 | 0 | 0 | 1 | 0 | 0 | 0 | 0 | 1 | 0 | 0 | 0 | 0 | 0 | | | | | B |
| 16 | 23 | — | — | — | — | — | — | — | — | 0 | 1 | 0 | 0 | 0 | 0 | 0 | 1 | 0 | 0 | 0 | 0 | 1 | 0 | 0 | 0 | 0 | 0 | | | | | C |

-continued

CASE II OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 16 | 23 | — | — | — | — | — | — | — | — | 0 | 0 | 0 | 1 | 0 | 0 | 0 | 0 | 0 | 0 | 0 | 0 | 0 | 0 | 0 | 0 | 0 | 0 | P130 | A | P130 | A | D,E |
| 17 | 24 | 1 | 0 | 0 | 0 | 1 | 1 | — | — | 0 | 0 | 0 | 0 | 0 | 1 | 0 | 0 | 0 | 0 | 0 | 0 | 0 | 0 | 0 | 0 | 0 | 0 | | | | | B |
| 17 | 24 | — | — | — | — | — | — | — | — | 0 | 0 | 0 | 1 | 0 | 1 | 0 | 0 | 0 | 0 | 0 | 0 | 0 | 0 | 0 | 0 | 0 | 0 | | | | | C |
| 17 | 25 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 17 | 25 | — | — | — | — | — | — | — | — | 0 | 0 | 0 | 1 | 0 | 1 | 1 | 0 | 0 | 0 | 0 | 1 | 0 | 0 | 0 | 0 | 0 | 0 | | | | | C |
| 17 | 25 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P44 | 2 | P44 | 2 | D,E |
| 18 | 26 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 18 | 26 | — | — | — | — | — | — | — | — | 1 | 0 | 1 | 0 | 0 | 0 | 0 | 0 | 0 | 0 | 0 | 0 | 0 | 0 | 0 | 0 | 0 | 0 | | | | | C |
| 19 | 27 | 1 | 1 | 0 | 0 | — | — | 1 | 1 | 0 | 0 | 0 | 0 | 0 | 0 | 1 | 0 | 0 | 0 | 0 | 1 | 0 | 0 | 0 | 0 | 0 | 0 | | | | | B |
| 19 | 27 | — | — | — | — | — | — | — | — | 1 | 0 | 1 | 0 | 0 | 0 | 1 | 0 | 0 | 0 | 0 | 1 | 0 | 0 | 0 | 0 | 0 | 0 | | | | | C |
| 19 | 27 | — | — | — | — | — | — | — | — | 0 | 0 | 1 | 0 | 0 | 0 | 0 | 0 | 0 | 0 | 0 | 0 | 0 | 0 | 0 | 0 | 0 | 0 | P324 | 5 | P324 | 5 | D,E |
| 20 | 28 | 0 | 0 | 0 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 20 | 28 | 0 | 0 | 0 | 1 | — | — | — | — | 1 | 0 | 1 | 0 | 0 | 0 | 0 | 0 | 0 | 0 | 0 | 0 | 0 | 0 | 0 | 0 | 0 | 0 | | | | | C,F |
| 20 | 27 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B,F |
| 20 | 27 | — | — | — | — | — | — | — | — | 1 | 0 | 1 | 1 | 0 | 0 | 0 | 0 | 0 | 0 | 0 | 0 | 0 | 0 | 0 | 0 | 1 | 0 | | | | | C,F,G |
| 20 | 27 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | — | — | P352 | 1 | D,E,F |
| 21 | 26 | 1 | 0 | 0 | 1 | 1 | 1 | — | — | 0 | 0 | 0 | 0 | 0 | 1 | 0 | 0 | 0 | 0 | 0 | 0 | 0 | 0 | 0 | 0 | 0 | 0 | | | | | B |
| 21 | 26 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | | | | | C |
| 21 | 25 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 21 | 25 | — | — | — | — | — | — | — | — | 0 | 0 | 0 | 0 | 1 | 1 | 0 | 1 | 0 | 0 | 0 | 0 | 0 | 0 | 0 | 0 | 0 | 1 | | | | | C |
| 21 | 25 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P26 | 2 | P26 | 9 | D,E |
| 22 | 24 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 22 | 24 | — | — | — | — | — | — | — | — | 1 | 0 | 0 | 0 | 0 | 0 | 0 | 0 | 1 | 0 | 0 | 0 | 0 | 0 | 0 | 0 | 0 | 0 | | | | | B |
| 22 | 23 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 22 | 23 | — | — | — | — | — | — | — | — | 1 | 0 | 0 | 1 | 0 | 0 | 0 | 0 | 1 | 0 | 0 | 0 | 0 | 0 | 0 | 0 | 1 | 0 | | | | | C |
| 22 | 23 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P289 | 7 | P289 | 4 | D,E |
| 23 | 22 | 1 | 0 | 0 | 1 | 1 | 1 | — | — | 0 | 0 | 0 | 0 | 0 | 1 | 0 | 0 | 0 | 0 | 0 | 0 | 0 | 0 | 0 | 0 | 0 | 0 | | | | | B |
| 23 | 22 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | | | | | C |
| 23 | 21 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 23 | 21 | — | — | — | — | — | — | — | — | 0 | 0 | 0 | 0 | 1 | 1 | 0 | 1 | 0 | 0 | 0 | 0 | 0 | 0 | 0 | 0 | 0 | 1 | | | | | C |
| 23 | 21 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P26 | 2 | P26 | 9 | D,E |
| 24 | 20 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 24 | 20 | — | — | — | — | — | — | — | — | 1 | 0 | 0 | 0 | 0 | 0 | 0 | 0 | 1 | 0 | 0 | 0 | 0 | 0 | 0 | 0 | 0 | 0 | | | | | C |
| 24 | 19 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 24 | 19 | — | — | — | — | — | — | — | — | 1 | 0 | 0 | 1 | 0 | 0 | 0 | 0 | 1 | 0 | 0 | 0 | 0 | 0 | 0 | 0 | 1 | 0 | | | | | C |
| 24 | 19 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P289 | 7 | P289 | 4 | C |
| 25 | 18 | 1 | 0 | 0 | 1 | 1 | 1 | — | — | 0 | 0 | 0 | 0 | 0 | 1 | 0 | 0 | 0 | 0 | 0 | 0 | 0 | 0 | 0 | 0 | 0 | 0 | | | | | B |
| 25 | 18 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | | | | | C |
| 25 | 17 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 25 | 17 | — | — | — | — | — | — | — | — | 0 | 0 | 0 | 0 | 1 | 1 | 0 | 1 | 0 | 0 | 0 | 0 | 0 | 0 | 0 | 0 | 0 | 1 | | | | | C |
| 25 | 17 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P26 | 9 | P26 | 9 | D,E |
| 26 | 16 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 26 | 16 | — | — | — | — | — | — | — | — | 1 | 0 | 0 | 0 | 0 | 0 | 0 | 0 | 1 | 0 | 0 | 0 | 0 | 0 | 0 | 0 | 0 | 0 | | | | | C |
| 26 | 15 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 26 | 15 | — | — | — | — | — | — | — | — | 1 | 0 | 0 | 1 | 0 | 0 | 0 | 0 | 1 | 0 | 0 | 0 | 0 | 0 | 0 | 0 | 1 | 0 | | | | | C |

-continued

CASE II OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | XIN ⊕ YIN | | XIN · YIN | | PRESENT PIXEL | | | | | | | | | SUBSEQUENT PIXEL | | | | | | | | | +WEIGHT | | INSIDE WT | | |
| X | Y | XIN | YIN | XNS | YNS | XIN | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 26 | 15 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P289 | 7 | p289 | 4 | D,E |
| 26 | 14 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 26 | 14 | — | — | — | — | — | — | — | — | 1 | 0 | 0 | 0 | 0 | 0 | 0 | 1 | 0 | 0 | 0 | 0 | 0 | 0 | 0 | 0 | 0 | 0 | | | | | C |
| 27 | 13 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 27 | 13 | — | — | — | — | — | — | — | — | 1 | 0 | 0 | 0 | 1 | 0 | 0 | 1 | 0 | 0 | 0 | 0 | 0 | 0 | 0 | 0 | 0 | 1 | | | | | C |
| 27 | 13 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P274 | 6 | P274 | 7 | D,E |
| 27 | 12 | 1 | 0 | 0 | 1 | 1 | 0 | — | — | 0 | 1 | 0 | 0 | 0 | 0 | 0 | 0 | 0 | 0 | 0 | 0 | 0 | 0 | 0 | 0 | 0 | 0 | | | | | B |
| 27 | 12 | — | — | — | — | — | — | — | — | 0 | 1 | 0 | 0 | 0 | 0 | 0 | 0 | 1 | 0 | 0 | 0 | 0 | 0 | 0 | 0 | 0 | 0 | | | | | C |
| 28 | 11 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 28 | 11 | — | — | — | — | — | — | — | — | 0 | 1 | 0 | 1 | 0 | 0 | 0 | 0 | 1 | 0 | 0 | 0 | 0 | 0 | 0 | 0 | 1 | 0 | | | | | C |
| 28 | 11 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P161 | 9 | P161 | 2 | D,E |
| 28 | 10 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 28 | 10 | — | — | — | — | — | — | — | — | 1 | 0 | 0 | 0 | 0 | 0 | 0 | 1 | 0 | 0 | 0 | 0 | 0 | 0 | 0 | 0 | 0 | 0 | | | | | C |
| 29 | 9 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 29 | 9 | — | — | — | — | — | — | — | — | 1 | 0 | 0 | 0 | 1 | 0 | 0 | 1 | 0 | 0 | 0 | 0 | 0 | 0 | 0 | 0 | 0 | 1 | | | | | C |
| 29 | 9 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P274 | 4 | P274 | 7 | D,E |
| 29 | 8 | 1 | 0 | 0 | 1 | 0 | 0 | — | — | 0 | 1 | 0 | 0 | 0 | 0 | 0 | 0 | 0 | 0 | 0 | 0 | 0 | 0 | 0 | 0 | 0 | 0 | | | | | B |
| 29 | 8 | — | — | — | — | — | — | — | — | 0 | 1 | 0 | 0 | 0 | 0 | 0 | 0 | 1 | 0 | 0 | 0 | 0 | 0 | 0 | 0 | 0 | 0 | | | | | C |
| 30 | 7 | 0 | 1 | 0 | 1 | 0 | 1 | — | — | 0 | 0 | 0 | 1 | 0 | 0 | 0 | 0 | 0 | 0 | 0 | 0 | 0 | 0 | 0 | 0 | 1 | 0 | | | | | B |
| 30 | 7 | — | — | — | — | — | — | — | — | 0 | 1 | 0 | 1 | 0 | 0 | 0 | 0 | 1 | 0 | 0 | 0 | 0 | 0 | 0 | 0 | 1 | 0 | | | | | C |
| 30 | 7 | — | — | — | — | — | — | — | — | 0 | 0 | 0 | 0 | 0 | 0 | 0 | 1 | 0 | 0 | 0 | 0 | 0 | 0 | 0 | 0 | 0 | 0 | P161 | 9 | P161 | 2 | D,E |
| 30 | 6 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 30 | 6 | — | — | — | — | — | — | — | — | 1 | 0 | 0 | 0 | 0 | 0 | 0 | 1 | 0 | 0 | 0 | 0 | 0 | 0 | 0 | 0 | 0 | 0 | | | | | C |
| 31 | 5 | 1 | 1 | 0 | 1 | — | — | 1 | 1 | 0 | 0 | 0 | 0 | 1 | 0 | 0 | 0 | 0 | 0 | 0 | 0 | 0 | 0 | 0 | 0 | 0 | 1 | | | | | B |
| 31 | 5 | — | — | — | — | — | — | — | — | 1 | 0 | 0 | 0 | 1 | 0 | 0 | 1 | 0 | 0 | 0 | 0 | 0 | 0 | 0 | 0 | 0 | 1 | | | | | C |
| 31 | 5 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P274 | 4 | P274 | 7 | D,E |
| 31 | 4 | 1 | 0 | 0 | 1 | 1 | 0 | — | — | 0 | 1 | 0 | 0 | 0 | 0 | 0 | 0 | 0 | 0 | 0 | 0 | 0 | 0 | 0 | 0 | 0 | 0 | | | | | B |
| 31 | 4 | — | — | — | — | — | — | — | — | 0 | 1 | 0 | 0 | 0 | 0 | 0 | 0 | 1 | 0 | 0 | 0 | 0 | 0 | 0 | 0 | 0 | 0 | | | | | C |
| 31 | 3 | 1 | 1 | 0 | 1 | — | — | 0 | 1 | 0 | 0 | 1 | 0 | 0 | 0 | 0 | 0 | 0 | 0 | 0 | 0 | 0 | 0 | 0 | 0 | 0 | 1 | | | | | B |
| 31 | 3 | — | — | — | — | — | — | — | — | 0 | 1 | 1 | 0 | 0 | 0 | 0 | 0 | 1 | 0 | 0 | 0 | 0 | 0 | 0 | 0 | 0 | 1 | | | | | C |
| 31 | 3 | — | — | — | — | — | — | — | — | 0 | 0 | 0 | 0 | 0 | 0 | 0 | 0 | 1 | 0 | 0 | 0 | 0 | 0 | 0 | 0 | 0 | 0 | P193 | B | P193 | 0 | D,E |
| 32 | 2 | 0 | 0 | 0 | 1 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 32 | 2 | 0 | 0 | 1 | 0 | — | — | — | — | 1 | 0 | 0 | 0 | 0 | 0 | 0 | 0 | 1 | 0 | 0 | 0 | 0 | 0 | 0 | 0 | 0 | 0 | | | | | C,F |
| 31 | 2 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B,F |
| 31 | 2 | — | — | — | — | — | — | — | — | 1 | 1 | 0 | 0 | 0 | 0 | 0 | 0 | 1 | 0 | 0 | 0 | 0 | 0 | 1 | 0 | 0 | 0 | | | | | C,F,G |
| 31 | 2 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | — | — | P385 | | D,E,F |
| 30 | 2 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 30 | 2 | — | — | — | — | — | — | — | — | 1 | 0 | 0 | 0 | 1 | 0 | 0 | 0 | 0 | 0 | 0 | 0 | 0 | 0 | 0 | 0 | 0 | 0 | | | | | C |
| 29 | 2 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 29 | 2 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |
| 29 | 2 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 28 | 3 | 0 | 1 | 1 | 0 | 0 | 1 | — | — | 0 | 0 | 0 | 0 | 0 | 0 | 0 | 1 | 0 | 0 | 0 | 0 | 0 | 0 | 0 | 0 | 0 | 0 | | | | | B |
| 28 | 3 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | | | | | C |
| 27 | 3 | 1 | 1 | 1 | 0 | — | — | 1 | 1 | 0 | 0 | 0 | 0 | 0 | 0 | 0 | 0 | 1 | 0 | 0 | 0 | 0 | 1 | 0 | 0 | 0 | 0 | | | | | B |
| 27 | 3 | — | — | — | — | — | — | — | — | 0 | 0 | 0 | 0 | 0 | 1 | 0 | 1 | 1 | 0 | 0 | 0 | 0 | 1 | 0 | 0 | 0 | 0 | | | | | C |

-continued

CASE II OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 27 | 3 | — | — | — | — | — | — | — | — | 0 | 0 | 0 | 0 | 1 | 0 | 0 | 0 | 0 | 0 | 0 | 0 | 0 | 0 | 0 | 0 | 0 | 0 | P11 | 9 | P11 | 2 | D,E |
| 26 | 3 | 0 | 1 | 1 | 0 | 0 | 0 | — | — | 0 | 0 | 0 | 1 | 0 | 0 | 0 | 0 | 0 | 0 | 0 | 0 | 0 | 0 | 0 | 0 | 0 | 0 | | | | | B |
| 26 | 3 | — | — | — | — | — | — | — | — | 0 | 0 | 0 | 1 | 1 | 0 | 0 | 0 | 0 | 0 | 0 | 0 | 0 | 0 | 0 | 0 | 0 | 0 | | | | | C |
| 25 | 3 | 1 | 1 | 1 | 0 | — | — | 1 | 0 | 0 | 0 | 1 | 0 | 0 | 0 | 0 | 0 | 0 | 0 | 0 | 0 | 0 | 1 | 0 | 0 | 0 | 0 | | | | | B |
| 25 | 3 | — | — | — | — | — | — | — | — | 0 | 0 | 1 | 1 | 1 | 0 | 0 | 0 | 0 | 0 | 0 | 0 | 0 | 1 | 0 | 0 | 0 | 0 | | | | | C |
| 25 | 3 | — | — | — | — | — | — | — | — | 0 | 0 | 0 | 0 | 1 | 0 | 0 | 0 | 0 | 0 | 0 | 0 | 0 | 0 | 0 | 0 | 0 | 0 | P112 | 0 | P112 | B | D,E |
| 24 | 3 | 0 | 1 | 1 | 0 | 0 | 0 | — | — | 0 | 0 | 0 | 1 | 0 | 0 | 0 | 0 | 0 | 0 | 0 | 0 | 0 | 0 | 0 | 0 | 0 | 0 | | | | | B |
| 24 | 3 | — | — | — | — | — | — | — | — | 0 | 0 | 0 | 1 | 1 | 0 | 0 | 0 | 0 | 0 | 0 | 0 | 0 | 0 | 0 | 0 | 0 | 0 | | | | | C |
| 23 | 4 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 23 | 4 | — | — | — | — | — | — | — | — | 0 | 1 | 0 | 1 | 1 | 0 | 0 | 0 | 0 | 0 | 0 | 0 | 0 | 0 | 1 | 0 | 0 | 0 | | | | | C |
| 23 | 4 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P176 | 2 | P176 | 9 | D,E |
| 22 | 4 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 22 | 4 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 21 | 4 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 21 | 4 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |
| 21 | 4 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 20 | 4 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 20 | 4 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 19 | 4 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 19 | 4 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |
| 19 | 4 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 18 | 5 | 0 | 1 | 1 | 0 | 0 | 1 | — | — | 0 | 0 | 0 | 0 | 0 | 0 | 0 | 1 | 0 | 0 | 0 | 0 | 0 | 0 | 0 | 0 | 0 | 0 | | | | | B |
| 18 | 5 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | 0 | | | | C |
| 17 | 5 | 1 | 1 | 1 | 0 | — | — | 1 | 1 | 0 | 0 | 0 | 0 | 0 | 0 | 0 | 0 | 1 | 0 | 0 | 0 | 0 | 1 | 0 | 0 | 0 | 0 | | 0 | | | B |
| 17 | 5 | — | — | — | — | — | — | — | — | 0 | 0 | 0 | 0 | 0 | 1 | 0 | 1 | 1 | 0 | 0 | 0 | 0 | 1 | 0 | 0 | 0 | 0 | | | | | C |
| 17 | 5 | — | — | — | — | — | — | — | — | 0 | 0 | 0 | 0 | 1 | 0 | 0 | 0 | 0 | 0 | 0 | 0 | 0 | 0 | 0 | 0 | 0 | 0 | P11 | 9 | P11 | 2 | D,E |
| 16 | 5 | 0 | 1 | 1 | 0 | 0 | 0 | — | — | 0 | 0 | 0 | 1 | 0 | 0 | 0 | 0 | 0 | 0 | 0 | 0 | 0 | 0 | 0 | 0 | 0 | 0 | | | | | B |
| 16 | 5 | — | — | — | — | — | — | — | — | 0 | 0 | 0 | 1 | 1 | 0 | 0 | 0 | 0 | 0 | 0 | 0 | 0 | 0 | 0 | 0 | 0 | 0 | | | | | C |
| 15 | 5 | 1 | 1 | 1 | 0 | — | — | 1 | 0 | 0 | 0 | 1 | 0 | 0 | 0 | 0 | 0 | 0 | 0 | 0 | 0 | 0 | 1 | 0 | 0 | 0 | 0 | | | | | B |
| 15 | 5 | — | — | — | — | — | — | — | — | 0 | 0 | 1 | 1 | 1 | 0 | 0 | 0 | 0 | 0 | 0 | 0 | 0 | 1 | 0 | 0 | 0 | 0 | | | | | C |
| 15 | 5 | — | — | — | — | — | — | — | — | 0 | 0 | 0 | 0 | 1 | 0 | 0 | 0 | 0 | 0 | 0 | 0 | 0 | 0 | 0 | 0 | 0 | 0 | P112 | 0 | P112 | B | D,E |
| 14 | 5 | 0 | 1 | 1 | 0 | 0 | 0 | — | — | 0 | 0 | 0 | 1 | 0 | 0 | 0 | 0 | 0 | 0 | 0 | 0 | 0 | 0 | 0 | 0 | 0 | 0 | | | | | B |
| 14 | 5 | — | — | — | — | — | — | — | — | 0 | 0 | 0 | 1 | 1 | 0 | 0 | 0 | 0 | 0 | 0 | 0 | 0 | 0 | 0 | 0 | 0 | 0 | | | | | C |
| 13 | 6 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 13 | 6 | — | — | — | — | — | — | — | — | 0 | 1 | 0 | 1 | 1 | 0 | 0 | 0 | 0 | 0 | 0 | 0 | 0 | 0 | 1 | 0 | 0 | 0 | | | | | C |
| 13 | 6 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P176 | 2 | P176 | 9 | D,E |
| 12 | 6 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 12 | 6 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 11 | 6 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 11 | 6 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |
| 11 | 6 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 10 | 6 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 10 | 6 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C |
| 9 | 6 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 9 | 6 | — | — | — | — | — | — | — | — | 1 | 1 | 0 | 0 | 0 | 1 | 0 | 0 | 0 | 0 | 0 | 0 | 0 | 0 | 1 | 0 | 0 | 0 | | | | | C |

-continued

CASE II OPERATION TABLE

| INPUT | | | | | | | | | | OUTPUT | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| COORD. | | SUBPIXEL | | COMMON | | X1N ⊕ Y1N | | X1N · Y1N | | PRESENT PIXEL | | | | | | | | | SUBSEQUENT PIXEL | | | | | | | | | +WEIGHT | | INSIDE WT | | |
| X | Y | X1N | Y1N | XNS | YNS | X1N | EE | FX | FY | F8 | F7 | F6 | F5 | F4 | F3 | F2 | F1 | F0 | F8 | F7 | F6 | F5 | F4 | F3 | F2 | F1 | F0 | P | HEX | P | HEX | NOTES |
| 9 | 6 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P392 | 5 | P392 | 6 | D,E |
| 8 | 7 | 0 | 1 | 1 | 0 | 0 | 1 | — | — | 0 | 0 | 0 | 0 | 0 | 0 | 0 | 1 | 0 | 0 | 0 | 0 | 0 | 0 | 0 | 0 | 0 | 0 | | | | | B |
| 8 | 7 | — | — | — | — | — | — | — | — | 0 | 0 | 0 | 0 | 0 | 1 | 0 | 1 | 0 | 0 | 0 | 0 | 0 | 0 | 0 | 0 | 0 | 0 | | | | | C |
| 7 | 7 | 1 | 1 | 1 | 0 | — | — | 1 | 1 | 0 | 0 | 0 | 0 | 0 | 0 | 0 | 0 | 1 | 0 | 0 | 0 | 0 | 1 | 0 | 0 | 0 | 0 | | | | | B |
| 7 | 7 | — | — | — | — | — | — | — | — | 0 | 0 | 0 | 0 | 0 | 1 | 0 | 1 | 1 | 0 | 0 | 0 | 0 | 1 | 0 | 0 | 0 | 0 | | | | | C |
| 7 | 7 | — | — | — | — | — | — | — | — | 0 | 0 | 0 | 0 | 1 | 0 | 0 | 0 | 0 | 0 | 0 | 0 | 0 | 0 | 0 | 0 | 0 | 0 | P11 | 9 | P11 | 2 | D,E |
| 6 | 7 | 0 | 1 | 1 | 0 | 0 | 0 | — | — | 0 | 0 | 0 | 1 | 0 | 0 | 0 | 0 | 0 | 0 | 0 | 0 | 0 | 0 | 0 | 0 | 0 | 0 | | | | | B |
| 6 | 7 | — | — | — | — | — | — | — | — | 0 | 0 | 0 | 1 | 1 | 0 | 0 | 0 | 0 | 0 | 0 | 0 | 0 | 0 | 0 | 0 | 0 | 0 | | | | | C |
| 5 | 7 | 1 | 1 | 1 | 0 | — | — | 1 | 0 | 0 | 0 | 1 | 0 | 0 | 0 | 0 | 0 | 0 | 0 | 0 | 0 | 0 | 1 | 0 | 0 | 0 | 0 | | | | | B |
| 5 | 7 | — | — | — | — | — | — | — | — | 0 | 0 | 1 | 1 | 1 | 0 | 0 | 0 | 0 | 0 | 0 | 0 | 0 | 1 | 0 | 0 | 0 | 0 | | | | | C |
| 5 | 7 | — | — | — | — | — | — | — | — | 0 | 0 | 0 | 0 | 1 | 0 | 0 | 0 | 0 | 0 | 0 | 0 | 0 | 0 | 0 | 0 | 0 | 0 | P112 | 0 | P112 | B | D,E |
| 4 | 8 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B |
| 4 | 8 | — | — | — | — | — | — | — | — | 1 | 0 | 0 | 0 | 1 | 0 | 0 | 0 | 0 | 0 | 0 | 0 | 0 | 0 | 0 | 0 | 0 | 0 | | | | | C |
| 3 | 8 | 1 | 0 | 1 | 0 | 1 | 1 | — | — | 0 | 1 | 0 | 0 | 0 | 0 | 0 | 0 | 0 | 0 | 0 | 0 | 0 | 0 | 1 | 0 | 0 | 0 | | | | | B |
| 3 | 8 | — | — | — | — | — | — | — | — | 1 | 1 | 0 | 0 | 1 | 0 | 0 | 0 | 0 | 0 | 0 | 0 | 0 | 0 | 1 | 0 | 0 | 0 | | | | | C |
| 3 | 8 | — | — | — | — | — | — | — | — | 0 | 0 | 0 | 0 | 0 | 1 | 0 | 0 | 0 | 0 | 0 | 0 | 0 | 0 | 0 | 0 | 0 | 0 | P400 | 4 | P400 | 7 | D,E |
| 2 | 8 | 0 | 0 | 1 | 0 | — | — | — | — | 1 | 0 | 0 | 0 | 0 | 0 | 0 | 0 | 0 | 0 | 0 | 0 | 0 | 0 | 0 | 0 | 0 | 0 | | | | | B,F |
| 2 | 8 | — | — | — | — | — | — | — | — | 1 | 0 | 0 | 0 | 0 | 1 | 0 | 0 | 0 | 0 | 0 | 0 | 0 | 0 | 0 | 0 | 0 | 0 | | | | | C,F |
| 2 | 8 | — | — | — | — | — | — | — | — | 1 | 0 | 0 | 0 | 0 | 0 | 1 | 0 | 0 | 0 | 0 | 0 | 0 | 0 | 0 | 0 | 0 | 0 | | | | | F,H |
| 2 | 8 | — | — | — | — | — | — | — | — | 1 | 0 | 0 | 0 | 0 | 1 | 1 | 0 | 0 | 0 | 0 | 0 | 0 | 0 | 0 | 0 | 0 | 0 | | | P268 | 1 | |

SMOOTHING FOR AN UNKNOWN EDGE

It is often necessary to derive smoothing weights for an unknown edge, where an unknown edge may be an edge that has been previously generated and where the edge pixels in sequence have been stored in memory map form, such as in refresh memory 116, but have not been stored in list form, such as in a FIFO. Following and smoothing of an unknown edge can be used in occulting processing; such as to follow and to smooth a visible edge in the leading area and to follow and smooth an edge, either visible or non-visible, in the trailing area.

An unknown edge can be edge "B/C" that is uncovered by erasing of a moving prior surface "A" (FIGS. 9E–IV) or can be edge "A/C" that is modified by a next moving surface "B" under a visible edge "B/C" and occulting surface "C" previously outside of that visible edge (FIG. 9G). A processor for following the unknown edge can be implemented by investigating adjacent pixels and determining which way the edge is proceeding. A processor for smoothing the unknown edge can be implemented by investigating adjacent pixels in the four directions; delta Y=+1, delta Y=–1, delta X=+1, and delta X=–1; and determining the smoothing weight for the pixel.

A truth table representation of the smoothing weight and the edge follower is provided in the Unknown Edge Logic Table. The A and B symbols represent adjacent surfaces and the E symbol represents the edge therebetween. Smoothing weights for each surface, surface-A and surface-B, are provided for each adjacent pixel condition. Also, motion to translate along the edge is shown, defining the delta-X and delta-Y step increment to the next edge pixel for plus delta-X motion or for minus delta-X motion.

The table entitled Smoothing Of An Unknown Edge shows surface adjacencies and edges for each pixel condition in the Unknown Edge Logic Table. The Tables, Unknown Edge Example-I to Unknown Edge Example-IV, show the sequence of pixel transitions together with the edge follower logic and smoothing logic.

UNKNOWN EDGE LOGIC TABLE

| | ADJACENT PIXEL | | | | WEIGHT (%) | | MOTION TO SUBSEQUENT PIXEL | | | |
|---|---|---|---|---|---|---|---|---|---|---|
| | | | | | | | −ΔX DIRECTION | | +ΔX DIRECTION | |
| P | −Y | +Y | −X | +X | SURFACE A | SURFACE B | ΔX | ΔY | ΔX | ΔY |
| P0 | A | A | A | A | — | — | — | — | — | — |
| P1 | A | A | A | B | — | — | — | — | — | — |
| P2 | A | A | A | E | — | — | — | — | — | — |
| P3 | A | A | B | A | — | — | — | — | — | — |
| P4 | A | A | B | B | — | — | — | — | — | — |
| P5 | A | A | B | E | — | — | — | — | — | — |
| P6 | A | A | E | A | — | — | — | — | — | — |
| P7 | A | A | E | B | — | — | — | — | — | — |
| P8 | A | A | E | E | — | — | — | — | — | — |
| P9 | A | B | A | A | — | — | — | — | — | — |
| P10 | A | B | A | B | 50 | 50 | −1 | +1 | +1 | −1 |
| P11 | A | B | A | E | 75 | 25 | −1 | +1 | +1 | +0 |
| P12 | A | B | B | A | 50 | 50 | −1 | −1 | +1 | +1 |
| P13 | A | B | B | B | — | — | — | — | — | — |
| P14 | A | B | B | E | 25 | 75 | −1 | −1 | +1 | +0 |
| P15 | A | B | E | A | 75 | 25 | −1 | +0 | +1 | +1 |
| P16 | A | B | E | B | 25 | 75 | −1 | +0 | +1 | −1 |
| P17 | A | B | E | E | 50 | 50 | −1 | +0 | +1 | +0 |
| P18 | A | E | A | A | — | — | — | — | — | — |
| P19 | A | E | A | B | 75 | 25 | +0 | +1 | +1 | −1 |
| P20 | A | E | A | E | 75 | 25 | +0 | +1 | +1 | +0 |
| P21 | A | E | B | A | 75 | 25 | −1 | −1 | +0 | +1 |
| P22 | A | E | B | B | — | — | — | — | — | — |
| P23 | A | E | B | E | — | — | — | — | — | — |
| P24 | A | E | E | A | 75 | 25 | −1 | +0 | +0 | +1 |
| P25 | A | E | E | B | — | — | — | — | — | — |
| P26 | A | E | E | E | — | — | — | — | — | — |
| P27 | B | A | A | A | — | — | — | — | | |
| P28 | B | A | A | B | 50 | 50 | −1 | −1 | +1 | +1 |
| P29 | B | A | A | E | 75 | 25 | −1 | −1 | +1 | +0 |
| P30 | B | A | B | A | 50 | 50 | −1 | +1 | +1 | −1 |
| P31 | B | A | B | B | — | — | — | — | — | — |
| P32 | B | A | B | E | 25 | 75 | −1 | +1 | +1 | +0 |
| P33 | B | A | E | A | 75 | 25 | −1 | +0 | +1 | −1 |
| P34 | B | A | E | B | 25 | 75 | −1 | +0 | +1 | +1 |
| P35 | B | A | E | E | 50 | 50 | −1 | +0 | +1 | +1 |
| P36 | B | B | A | A | — | — | — | — | — | — |
| P37 | B | B | A | B | — | — | — | — | — | — |
| P38 | B | B | A | E | — | — | — | — | — | — |
| P39 | B | B | B | A | — | — | — | — | — | — |
| P40 | B | B | B | B | — | — | — | — | — | — |
| P41 | B | B | B | E | — | — | — | — | — | — |
| P42 | B | B | E | A | — | — | — | — | — | — |
| P43 | B | B | E | B | — | — | — | — | — | — |

-continued

UNKNOWN EDGE LOGIC TABLE

| | ADJACENT PIXEL | | | | WEIGHT (%) | | MOTION TO SUBSEQUENT PIXEL | | | |
|---|---|---|---|---|---|---|---|---|---|---|
| | | | | | | | −ΔX DIRECTION | | +ΔX DIRECTION | |
| P | −Y | +Y | −X | +X | SURFACE A | SURFACE B | ΔX | ΔY | ΔX | ΔY |
| P44 | B | B | E | E | — | — | — | — | — | — |
| P45 | B | E | A | A | — | — | — | — | — | — |
| P46 | B | E | A | B | 25 | 75 | −1 | −1 | +0 | +1 |
| P47 | B | E | A | E | — | — | — | — | — | — |
| P48 | B | E | B | A | 25 | 75 | +0 | +1 | +1 | −1 |
| P49 | B | E | B | B | — | — | — | — | — | — |
| P50 | B | E | B | E | 25 | 75 | +0 | +1 | +1 | +0 |
| P51 | B | E | E | A | — | — | — | — | — | — |
| P52 | B | E | E | B | 25 | 75 | −1 | +0 | +0 | +1 |
| P53 | B | E | E | E | — | — | — | — | — | — |
| P54 | E | A | A | A | — | — | — | | | |
| P55 | E | A | A | B | 75 | 25 | +0 | −1 | +1 | +1 |
| P56 | E | A | A | E | 75 | 25 | +0 | −1 | +1 | +0 |
| P57 | E | A | B | A | 75 | 25 | −1 | +1 | +0 | −1 |
| P58 | E | A | B | B | — | — | — | — | — | — |
| P59 | E | A | B | E | — | — | — | — | — | — |
| P60 | E | A | E | A | 75 | 25 | −1 | +0 | +0 | −1 |
| P61 | E | A | E | B | — | — | — | — | — | — |
| P62 | E | A | E | E | — | — | — | — | — | — |
| P63 | E | B | A | A | — | — | — | — | — | — |
| P64 | E | B | A | B | 25 | 75 | −1 | +1 | +0 | −1 |
| P65 | E | B | A | E | — | — | — | — | — | — |
| P66 | E | B | B | A | 25 | 75 | +0 | −1 | +1 | +1 |
| P67 | E | B | B | B | — | — | — | — | — | — |
| P68 | E | B | B | E | 25 | 75 | +0 | −1 | +1 | +0 |
| P69 | E | B | E | A | — | — | — | — | — | — |
| P70 | E | B | E | B | 25 | 75 | −1 | +0 | +0 | −1 |
| P71 | E | B | E | E | — | — | — | — | — | — |
| P72 | E | E | A | A | — | — | — | — | — | — |
| P73 | E | E | A | B | 50 | 50 | +0 | −1 | +0 | +1 |
| P74 | E | E | A | E | — | — | — | — | — | — |
| P75 | E | E | B | A | 50 | 50 | +0 | −1 | +0 | +1 |
| P76 | E | E | B | B | — | — | — | — | — | — |
| P77 | E | E | B | E | — | — | — | — | — | — |
| P78 | E | E | E | A | — | — | — | — | — | — |
| P79 | E | E | E | B | — | — | — | — | — | — |
| P80 | E | E | E | E | — | — | — | — | — | — |

SMOOTHING OF UNKNOWN EDGE TABLE

| | | | |
|---|---|---|---|
| A<br>A X A<br>A<br>P0: CAN'T OCCUR | A<br>A X B<br>A<br>P1: CAN'T OCCUR | A<br>A X E<br>A<br>P2: CAN'T OCCUR | A<br>B X A<br>A<br>P3: CAN'T OCCUR |
| A<br>B X B<br>A<br>P4: CAN'T OCCUR | A<br>B X E<br>A<br>P5: CAN'T OCCUR | A<br>E X A<br>A<br>P6: CAN'T OCCUR | A<br>E X B<br>A<br>P7: CAN'T OCCUR |
| A<br>E X E<br>A<br>P8: CAN'T OCCUR | B<br>A X A<br>A<br>P6: CAN'T OCCUR | B<br>A X B<br>A<br>P10: A=50% | B<br>A X E<br>A<br>P11: A=75% |
| B<br>B X A<br>A<br>P12: A=50% | B<br>B X B<br>A<br>P13: CAN'T OCCUR | B<br>B X E<br>A<br>P14: B=75% | B<br>E X A<br>A<br>P15: A=75% |
| B<br>E X B<br>A<br>P16: B=75% | B<br>E X E<br>A<br>P17: 50% | E<br>A X A<br>A<br>P18: CAN'T OCCUR | E<br>A X B<br>A<br>P19: A=75% |
| E<br>A X E<br>A<br>P20: A=75% | E<br>B X A<br>A<br>P21: A=75% | E<br>B X B<br>A<br>P22: CAN'T OCCUR | E<br>B X E<br>A<br>P23: CAN'T OCCUR |
| E<br>E X A<br>A | E<br>E X B<br>A | E<br>E X E<br>A | A<br>A X A<br>B |

-continued

SMOOTHING OF UNKNOWN EDGE TABLE

| | | | |
|---|---|---|---|
| P24: A=75% | P25: CAN'T OCCUR | P26: CAN'T OCCUR | P27: CAN'T OCCUR |
| A | A | A | A |
| A X B | A X C | B X A | B X B |
| B | B | B | B |
| P28 50% | P29: A=75% | P30: 50% | P31: CAN'T OCCUR |
| A | A | A | A |
| B X E | E X A | E X B | E X E |
| B | B | B | B |
| P32: B=75% | P33: A=75% | P34 B=75% | P35: 50% |
| B | B | B | B |
| A X A | A X B | A X E | B X A |
| B | B | B | B |
| P36: CAN'T OCCUR | P37: CAN'T OCCUR | P38: CAN'T OCCUR | P39: CAN'T OCCUR |
| B | B | B | B |
| B X B | B X E | E X A | E X B |
| B | B | B | B |
| P40: CAN'T OCCUR | P41: CAN'T OCCUR | P42: CAN'T OCCUR | P43: CAN'T OCCUR |
| B | E | E | E |
| E X E | A X A | A X B | A X E |
| B | B | B | B |
| P44: CAN'T OCCUR | P45: CAN'T OCCUR | P46: B=75% | P47: CAN'T OCCUR |
| E | E | E | E |
| B X A | B X B | B X E | E X A |
| B | B | B | B |
| P48 B=75% | P49: CAN'T OCCUR | P50: 3=75% | P51: CAN'T OCCUR |
| E | E | A | A |
| E X B | E X E | A X A | A X B |
| B | B | E | E |
| P52 B=.75% | P53: CAN'T OCCUR | P54: CAN'T OCCUR | P55: A=75% |
| A | A | A | A |
| A X E | B X A | B X B | B X E |
| E | E | E | E |
| P56: A=75% | P57: A=75% | P58: CAN'T OCCUR | P59: CAN'T OCCUR |
| A | A | A | B |
| E X A | E X B | E X E | A X A |
| E | E | E | E |
| P60: A=75% | P61: CAN'T OCCUR | P62: CAN'T OCCUR | P63: CAN'T OCCUR |
| B | B | B | B |
| A X B | A X E | B X A | B X B |
| E | E | E | E |
| P64: B=75% | P65: CAN'T OCCUR | P66: B=75% | P67: CAN'T OCCUR |
| B | B | B | B |
| B X E | E X A | E X B | E X E |
| E | E | E | E |
| P68: B=75% | P69: CAN'T OCCUR | P70: B=75% | P71: CAN'T OCCUR |
| E | E | E | E |
| A X A | A X B | A X E | B X A |
| E | E | E | E |
| P72: CAN'T OCCUR | P73: 50% | P74: CAN'T OCCUR | P75: 50% |
| E | E | E | E |
| B X B | B X E | E X A | E X B |
| E | E | E | E |
| P76: CAN'T OCCUR | P77: CAN'T OCCUR | P78: CAN'T OCCUR | P79: CAN'T OCCUR |
| E | | | |
| E X E | | | |
| E | | | |
| P80: CAN'T OCCUR | | | |

MOTION ALONG AN UNKNOWN EDGE TABLE

| | | | | | | | | |
|---|---|---|---|---|---|---|---|---|
| | | | B | | | B | | |
| A X B | | | A X E | | | B X A | | |
| A | | | A | | | A | | |
| P10: | − Δ X | + Δ X | P11: | − Δ X | + Δ X | P12: | − Δ X | + Δ X |
| | X=X−1 | X=X+1 | X=X−1 | X=X+1 | X=X−1 | X=X+1 | | |
| | Y=Y+1 | Y=Y−1 | Y=Y+1 | Y=Y | Y=Y−1 | Y=Y+1 | | |
| B | | | B | | | B | | |
| B X E | | | E X A | | | E X B | | |
| A | | | A | | | A | | |
| P14: | − Δ X | + Δ X | P15: | − Δ X | + Δ X | P16: | − Δ X | + Δ X |
| | X=X−1 | X=X+1 | | X=X−1 | X=X+1 | | X=X−1 | X=X+1 |
| | Y=Y−1 | Y=Y | | Y=Y | Y=Y+1 | | Y=Y | Y=Y−1 |
| B | | | E | | | E | | |
| E X E | | | A X B | | | A X E | | |
| A | | | A | | | A | | |
| P17: | − Δ X | + Δ X | P19: | − Δ X | + Δ X | P20: | − Δ X | + Δ X |

-continued

MOTION ALONG AN UNKNOWN EDGE TABLE

| | | | | | | | | |
|---|---|---|---|---|---|---|---|---|
| | X=X−1<br>Y=Y | X=X+1<br>Y=Y | | X=X<br>Y=Y+1 | X=X+1<br>Y=Y−1 | | X=X<br>Y=Y+1 | X=X+1<br>Y=Y |
| E<br>B X A<br>A<br>P21: | E X<br>− Δ X<br>X=X−1<br>Y=Y−1 | A X B<br>+ Δ X<br>X=X<br>Y=Y+1 | E<br><br>A<br>P24: | − Δ X<br>X=X−1<br>Y=Y | + Δ X<br>X=X<br>Y=Y+1 | A<br><br>B<br>P28: | − Δ X<br>X=X−1<br>Y=Y−1 | + Δ X<br>X=X+1<br>Y=Y+1 |
| A<br>A X E<br>B<br>P29: | − Δ X<br>X=X−1<br>Y=Y−1 | + Δ X<br>X=X+1<br>Y=Y | A<br>B X A<br>B<br>P30: | − Δ X<br>Y=X−1<br>Y=Y+1 | + Δ X<br>X=X+1<br>Y=Y−1 | A<br>B X E<br>B<br>P32: | − Δ X<br>X=X−1<br>Y=Y+; | + Δ X<br>X=X+1<br>Y=Y |
| A<br>E X A<br>B<br>P33: | − Δ X<br>X=X+1<br>Y=Y | + Δ X<br>X=X+1<br>Y=Y−1 | A<br>E X B<br>B<br>P34: | − Δ X<br>X=X−1<br>Y=Y | + Δ X<br>X=X+1<br>Y=Y+1 | A<br>E X E<br>B<br>P35:<br>X=X−1<br>Y=Y | − Δ X<br>X=X+1<br>Y=Y | + Δ X |
| E<br>A X B<br>B<br>P46 | − Δ X<br>X=X−1<br>Y=Y−1 | + Δ X<br>X=X<br>Y=Y+1 | E<br>B X A<br>B<br>P48: | − Δ X<br>X=X<br>Y=Y+1 | + Δ X<br>X=X+1<br>Y=Y−1 | E<br>B X E<br>B<br>P50: | − Δ X<br>X=X<br>Y=Y+1 | + Δ X<br>X=X+1<br>Y=Y |
| E<br>E X B<br>B<br>P52: | − Δ X<br>X=X−1<br>Y=Y | + Δ X<br>X=X<br>Y=Y+1 | A<br>A X B<br>E<br>P55: | − Δ X<br>X=X<br>Y=Y−1 | + Δ X<br>X=X+1<br>Y=Y+1 | A<br>A X E<br>E<br>P56: | − Δ X<br>X=X<br>Y=Y−1 | + Δ X<br>X=X+1<br>Y=Y |
| A<br>B X A<br>E<br>P57: | − Δ X<br>X=X−1<br>Y=Y+1 | + Δ X<br>X=X<br>Y=Y−1 | A<br>E X A<br>E<br>P60: | − Δ X<br>X=X−1<br>Y=Y | + Δ X<br>X=X<br>Y=Y−1 | B<br>A X B<br>E<br>P64: | − Δ X<br>X=X−1<br>Y=Y+1 | + Δ X<br>X=X<br>Y=Y−1 |
| B<br>B X A<br>E<br>P66: | − Δ X<br>X=X<br>Y=Y−1 | + Δ X<br>X=X+1<br>Y=Y+1 | B<br>B X E<br>E<br>P68: | − Δ X<br>X=X<br>Y=Y−1 | + Δ X<br>X=X+1<br>Y=Y | B<br>E X B<br>E<br>P70: | − Δ X<br>X=X−1<br>Y=Y | + Δ X<br>X=X<br>Y=Y−1 |
| E<br>A X B<br>E<br>P73: | − Δ X<br>X=X<br>Y=Y−1 | + Δ X<br>X=X<br>Y=Y+1 | E<br>B X A<br>E<br>P75: | − Δ X<br>X=X<br>Y=Y−1 | + Δ X<br>X=X<br>Y=Y+1 | | | |

| 16 17 18<br>13 14 15<br>10 11 12<br>7 8 9<br>4 5 6<br>1 2 3 | | UNKNOWN<br>EDGE<br>EXAMPLE-I | |
|---|---|---|---|
| B<br>B 1 E<br>E<br>P68: 75% B<br>ΔX= +1<br>ΔY+ +0 | B<br>E 2 E<br>A<br>P17: 50%<br>ΔX= +1<br>ΔY= +0 | E<br>E 3 A<br>A<br>P24: 75% A<br>ΔX= +0<br>ΔY= +1 | B<br>B 4 E<br>E<br>P68: 75% B<br>ΔX= +1<br>≠Y= +0 |
| B<br>E 5 E<br>A<br>P17: 50%<br>≠X= +1<br>ΔY= +0 | E<br>E 6 A<br>A<br>P24: 75% A<br>ΔX= +0<br>ΔY= +1 | B<br>B 7 E<br>E<br>P68: 8[7]5% B<br>ΔX= +1<br>ΔY= +0 | E<br>E 8'E<br>A<br>P18: 50%<br>ΔX= +1<br>ΔY= +0 |
| E<br>E 9 A<br>A<br>P24: 75% A | B<br>B 10 E<br>E<br>P68: 75% B | B<br>E 11 E<br>A<br>P17: 50% | E<br>E 12 A<br>A<br>P24: 75% A |

-continued

| 16 17 18<br>13 14 15<br>10 11 12<br>7 8 9<br>4 5 6<br>1 2 3 | | UNKNOWN<br>EDGE<br>EXAMPLE-I | |
|---|---|---|---|
| ΔX= +0<br>ΔY= +1 | ΔX= +1<br>ΔY= +0 | ΔX= +1<br>ΔY= +0 | ΔX= +0<br>ΔY= +1 |
| B<br>B 13 E<br>E<br>P68: 75% B<br>ΔX= +1<br>ΔY= +0 | B<br>E'14 E<br>A<br>P17: 50%<br>ΔX= +1<br>ΔY= +0 | E<br>E 15 A<br>A<br>P24: 75% A<br>ΔX= +0<br>ΔY= +1 | B<br>B 16 E<br>E<br>P68: 75% B<br>ΔX= +1<br>ΔY= +0 |
| B<br>E 17 E<br>A<br>P17: 50%<br>ΔX= +1<br>ΔY= +0 | | | |

| 12 13 14 15<br>8 9 10 11<br>4 5 6 7<br>1 2 3 | | | 16 UNKNOWN EDGE EXAMPLE-II |
|---|---|---|---|
| B<br>E 1 E<br>A<br>P17: 50%<br>ΔX= +1<br>ΔY= +0 | B<br>E 2 E<br>A<br>P17: 50%<br>ΔX= +1<br>ΔY= +0 | B<br>E 3 A<br>A<br>P15: 75% A<br>ΔX= +1<br>ΔY= +1 | B<br>B 4 E<br>A<br>P14: 75% B<br>ΔX= +1<br>≠Y= +0 |
| B<br>E 5 E<br>A<br>P17: 50%<br>ΔX= +1<br>ΔY= +0 | B<br>E 6 E<br>A<br>P17: 50%<br>ΔX= +1<br>ΔY= +0 | E<br>E 7 A<br>A<br>P24: 75% A<br>ΔX= +0<br>ΔY= +1 | B<br>B 8 E<br>E<br>P68: 75% B<br>ΔX= +1<br>ΔY= +0 |
| B<br>E 9 E<br>A<br>P17: 50%<br>ΔX= +1<br>≠Y= +0 | B<br>E 10 E<br>A<br>P17: 50%<br>ΔX= +1<br>ΔY= +0 | B<br>E 11 A<br>A<br>P15: 75% A<br>ΔX= +1<br>ΔY= +1 | B<br>B 12 E<br>A<br>P14: 75% B<br>ΔX= +1<br>ΔY+ +0 |
| B<br>E 13 E<br>A<br>P17: 50%<br>ΔX= +1<br>ΔY= +0 | B<br>E 14 E<br>A<br>P17: 50%<br>ΔX= +1<br>ΔY+ +0 | E<br>E 15 A<br>A<br>P24: 75% A<br>ΔX=0<br>ΔY= +1 | B<br>B 16 E<br>A<br>P68: 75% B<br>{X= +1<br>ΔY= +0 |

-continued

| 11 10<br>9 8<br>7<br>6 5<br>4 3<br>2 1 | | | |
|---|---|---|---|
| A<br>E 1 A<br>B<br>P33: 75% A<br>ΔX= −1<br>ΔY= +0 | E<br>B 2 E<br>B<br>P50% 75% B<br>ΔX= +0<br>ΔY= +1 | A<br>E 3 A<br>B<br>P50: 75% A<br>ΔX= −1<br>ΔY= +0 | E<br>B 4 E<br>B<br>P50: 75% B<br>≠X= +0<br>≠Y= +1 |
| A<br>E 5 A<br>E<br>P60: 75% A<br>≠X= −1<br>ΔY= +0 | A<br>B 6 E<br>B<br>P32: 75% B<br>ΔX= −1<br>ΔY= +1 | A<br>B 7 A<br>B<br>P30: 50%<br>ΔX= −1<br>ΔY= +1 | A<br>E 8 A<br>B<br>P33: 75% A<br>ΔX= −1<br>ΔY= +0 |
| E<br>B 9 E<br>B<br>P50: 75% B<br>ΔX= +0<br>ΔY= +1 | A<br>E 10 A<br>E<br>P60: 75% A<br>ΔX= −1<br>ΔY= +0 | E<br>B 11 E<br>B<br>P20: 75% B<br>ΔX= +0<br>≠Y= +1 | A<br>E 12 A<br>E<br>P60: 75% A<br>ΔX= −1<br>ΔY= +0 |
| A<br>B 13 E<br>B<br>P32: 75% B<br>ΔX= −1<br>ΔY= +1 | A<br>E 14 A<br>B<br>P30: 50%<br>ΔX= −1<br>ΔY= +0 | E<br>B 15 E<br>B<br>P50: 75% B<br>ΔX= +0<br>ΔY= +1 | A<br>E 16 A<br>E<br>P60: 75% A<br>ΔX= −1<br>ΔY= +0 |
| E<br>B 17 E<br>B<br>P50: 75% B<br>ΔX= +0<br>ΔY= +1 | A<br>E 18 A<br>E<br>P60: 75% A<br>ΔX= −1<br>ΔX= +0 | A<br>B 19 E<br>B<br>P32: 75% B<br>ΔX= −1<br>ΔY= +; | A<br>E 20 A<br>B<br>P30: 50% A<br>ΔX= −1<br>ΔY= +0 |

| 1 2<br>3 4 5 6 7<br>8 9 10 11 12 13<br>14 15 16 17 18 19<br>20 21 22 23 24 | | | UNKNOWN EDGE EXAMPLE III |
|---|---|---|---|
| B<br>E 1 E<br>A<br>P17: 50%<br>ΔX= +1<br>ΔY= +0 | B<br>E 2 B<br>A<br>P16: 75% B<br>ΔX= +1<br>≠Y= −1 | B<br>A 3 E<br>A<br>P11: 75% A<br>ΔX= +1<br>ΔY= +0 | B<br>E 4 E<br>A<br>P17: 50%<br>≠X= +1<br>ΔY= +0 |
| B<br>E 5 E<br>A<br>P17: 50%<br>ΔX= +1<br>ΔY= +0 | B<br>E 6 E<br>A<br>P17: 50%<br>ΔX= +1<br>ΔY= +0 | B<br>E 7 B<br>A<br>P16: 75% B<br>ΔX= +1<br>ΔY= −1 | B<br>A 8 E<br>A<br>P11: 75% A<br>ΔX= +1<br>ΔY= +0 |
| B<br>E 9 E<br>A<br>P17: 50%<br>ΔX= +1<br>ΔY= +0 | B<br>E 10 E<br>A<br>P17: 80%<br>ΔX= +1<br>ΔY= +0 | B<br>E 11 E<br>A<br>P17: 50%<br>ΔX= +1<br>ΔY= +0 | B<br>E 12 E<br>A<br>P17: 50%<br>≠X= +1<br>ΔY= +0 |
| B<br>E 13 B<br>E<br>P70: 75% B<br>ΔX= +0<br>≠Y= +−1 | E<br>A 14 E<br>A<br>P20: 75% A<br>ΔX= +1<br>ΔY= +0 | B<br>E 15 E<br>A<br>P17: 50%<br>ΔX= +1<br>ΔY= +0 | B<br>E 16 E<br>A<br>P17: 50%<br>ΔX= +1<br>ΔY= +0 |
| B<br>E 17 E<br>A | B<br>E 18 E<br>A | B<br>E 19 B<br>A | B<br>A'20 E<br>A |
| B<br>E 21 E<br>A<br>P17: 50%<br>ΔX= +1<br>ΔY= +0 | B<br>E 22 E<br>A<br>P17: 50%<br>ΔX= +1<br>ΔY= +0 | B<br>E 23 E<br>A<br>P17: 50%<br>ΔX= +1<br>ΔY= +0 | |

| 21 20<br>19 18<br>17 16<br>15 14<br>13 12 | UNKNOWN EDGE EXAMPLE IV |
|---|---|

OCCULTING PROCESSOR

General Description

Occulting processing involves determination of visible images for display and determination of non-visible images and hidden lines for removal from the display. Non-visible images include images on the back side of an object and images obscured by less remote images in front thereof. Images on the back side of an object can be identified with the visibility determination provided with geometric processor 130. Obscured images can be identified with occulting processor 132.

Moving visible edges can be identified with geometric processor 130 for processing with edge processor 131, occulting processor 132, and smoothing processor 133 for updating refresh memory 116. Non-moving edges can be identified with geometric processor 130 and need not be processed with edge processor 131, occulting processor 132, and smoothing processor 133 and need not update refresh memory 116. Non-visible edges may be processed with edge processor 131 to determine if a non-visible edge has become visible due to motion of an occulted or an occulted or an occulting object.

Conventional systems implement occulting processing with what may be referred to as 3D occulting processing. This processing involves sorting and prioritizing of objects in a 3D environment. In contrast, one occulting processing configuration discussed herein may be referred to as memory map occulting processing or 2D occulting processing. This processing involves projecting 3D images on a 2D plane and then determining occulting therebetween. The 2D plane may be considered to be the refresh memory. Occulting determination can be performed by preserving range associated with images for performing range comparisons to determine occulting relationships. Therefore, occulting processing discussed herein, such as with reference to FIG. 9, may be discussed in the form of 2D images representing projections on a plane. Relationships between images may be shown by providing images in a sequence of increasing range along a line-of-sight (LOS) vector or increasing range vector.

Occulting and hidden line removal involves displaying the nearest object in a particular pixel location and non-displaying of more remote objects in that pixel location. A refresh memory architecture having individual pixel words provides occulting on a pixel-by-pixel bases. With a change-related refresh memory, such as discussed herein, changes due to occulting occur at edges of moving objects. Therefore, once operation is established with initial conditions, occulting considerations for a particular pixel should change when that pixel is traversed by an edge of a different surface that is an occulting (less remote) surface. Therefore, occulting can be implemented for edges of moving objects.

Edge motion may be identified by reference to the increment memory 672 (FIG. 6) in geometric processor 130. Incremental changes in increment memory 672 can be processed for determination of updates to refresh memory 116. Edges having zero increment changes need not be processed for updating refresh memory 116 because they have no new or changed components and are therefore static.

Occulting is often implemented in conventional visual systems with complex processing, requiring investigating of surfaces in three-dimensional space, assigning occulting priorities, and sorting to establish occulting between surfaces. Partial occulting between surfaces can be a particular problem in such systems. For example, a primary surface may occult a more remote secondary surface, but the secondary surface may be visible beyond the edge of the primary surface. The visible edge of the secondary surface may occult a more remote tertiary surface, but the tertiary surface may be visible beyond the edge of the secondary surface. The compounding of this approach; where surfaces partially occult multiple other surfaces, which in turn partially occult multiple other surfaces, and so on; can require high processing bandwidth. Conventional visual systems perform this processing for each frame, regeneratively.

The change-related or extrapolative refresh memory discussed herein facilitates simpler occulting processing, which may be limited to changing objects and primarily at the edges of changing objects. Therefore, occulting in accordance with the present invention is significantly simpler then in conventional visual systems.

Occulting processing load can be characterized with the equation ($JN^K$) where N is the number of vectors (edges), J is the coefficient, and K is the exponent. Occulting processing is often considered to be an N-squared ($N^2$) problem. Conventional occulting processing is a sorting-related problem which has an ($N^2$) relationship. Lower-order occulting algorithms are believed to exist, such as (N in N) relationships. Also, conventional occulting processing has a relatively large coefficient (J) as a result of processing complexity. Therefore, for real time systems, even low levels of detail can be expensive; high levels of detail, such as required in CIG systems, can be very expensive; and the evolution to ultra-high levels of detail may not be practical with conventional occulting processing.

Change-related occulting departs from conventional methods; providing occulting processing that is believed to have a relatively small exponent (K) and a relatively small coefficient and also has "dynamic" occulting capability.

The small coefficient (J) of the present occulting processor is derived from the simplicity of processing of each vector. For example, filling of a pixel can use a simple logical determination or range comparison. The advantages are obtained from several sources; i.e.; extrapolating a known prior position of a moving edge stored in refresh memory in contrast to conventional methods that regenerate all pixels. Some auxiliary occulting processing may also be required, but on a lower bandwidth basis; thereby having relatively small impact on the occulting processing load.

The small exponent (K) of the present occulting processor is derived from the need to occulting process primarily changed pixels that are extrapolated along a moving and visible edge and the increase in the percentage of edge pixels that are occulted as detail increases; instead of the conventional method of sorting edges and regenerating all pixels in the scene each frame. The present occulting processor need not have to perform occulting processing for stationary edges, nor for non-visible surfaces. Therefore, an average scene having average motion may require processing on only 10% of the edges and only 2% of the pixels. This implies a low exponent (K) for the present occulting processor and an integer exponent for conventional occulting processing.

As the technology evolves, occulting capability is becoming more important. However, conventional occulting capability appears excessively expensive for business and industrial applications. Also, as the technology evolves, the level of detail for display systems is increasing. However, conventional occulting capability gets exponentially more expensive as the level of detail increases. Therefore, conventional systems may not be able to satisfy the future high detail display requirements for such applications. The present occulting processor provides efficient occulting capability that appears to be affordable on moderately detailed systems and permits efficient expansion to high detail systems.

Edge-related occulting determination has two primary conditions and various secondary conditions. The two primary conditions are motion of an edge into new pixels to fill these new pixels and motion of an edge out of previously filled pixels to vacate these previously filled pixels.

One configuration for filling of pixels will now be discussed. Motion of an edge to fill new pixels involves relatively simple processing as a result of the implementation of the pixel words in the refresh memory and as a result of the change-related refresh memory. When an edge moves to encompass a new pixel, the range byte associated with that moving edge is compared with the range byte of the pixel word from refresh memory. A range byte in the pixel word that is less than the range byte of the moving edge is indicative of the object in the pixel being closer than the moving edge. Therefore, the moving edge is moving under the pixel and the moving edge is occulted by the pixel. Consequently, the pixel is an occulting pixel and will not be changed by this more remote moving occulted edge. A range byte in the pixel word that is greater than the range byte of the moving edge is indicative of the object in the pixel being further away than the moving edge. Therefore, the moving edge is moving over this pixel and the pixel is occulted by the moving edge. Consequently, the pixel is an occulted pixel and the pixel word will be replaced by a new pixel word related to the less remote moving occulting edge. This occulting of a pixel by a moving edge can be performed by filling that pixel with the pixel word associated with the moving edge. Therefore, determination of occulting by an edge moving into a pixel position involves a simple arithmetic comparison between range bytes and conditional loading of a new pixel word, conditioned upon the outcome of that range byte comparison. This represents a simple processing operation.

One configuration for vacating of pixels will now be discussed. Motion of an occulting object so that the edge passes out of a pixel causes vacating of the pixel. Objects further away that were occulted by the vacating object are no longer occulted. A determination can be made to determine which other objects are in the line-of-sight to that pixel and to determine the least remote one of these objects for filling the pixel. This involves a determination of the proper occulting object to fill a pixel that is vacated by the previous occulting object.

One configuration for determining the proper occulting object to fill a pixel vacated by a previous occulting object will now be discussed. Surfaces may be relatively continuous in space and may have relatively few discontinuities, which discontinuities are represented by edges. Therefore, a pixel vacated by a moving edge of an occulting surface is often filled by a previously occulted pixel (now an occulting pixel) of the adjacent surface that is being uncovered by motion of the surface vacating the pixel. Alternately, a pixel vacated by the moving edge of one surface of an occulting object is often filled by an adjacent moving edge of another surface of that same occulting object. In either of these two cases, the vacated pixel can be filled with the pixel word of the surface adjacent to the moving edge that is vacating the pixel. However, if the pixel is only partially vacated and is therefore an edge pixel; an edge flag can be set and the area weighting number can be loaded into the pixel word, as discussed herein for edge smoothing.

An exception to the above vacated pixel fill implementations is the case where the edge that is vacating the pixel uncovers an edge of the adjacent surface that is being uncovered. When detected, the visual processor performs an occulting search to determine the next surface behind the surface that is vacating the pixel for filling this pixel. This may be a relatively low occurrence, where the related processing bandwidth may therefore be small. This occulting search may be performed by supervisory processor 125, occulting processor 132, aperture processor 134, or other processor.

Real time continuous displays are refreshed at a relatively high rate of thirty frames per second in order to reduce flicker and to reduce stepping of moving objects. This facilitates smooth continuous motion across the screen. However, from one frame to the next, a moving object may only move gradually across the screen, where small changes are usually at object edges and where object information away from the edges may be non-changing. Therefore, the occulting processor can determine pixels that change from frame to frame and can update those pixels for occulting. Otherwise stated, usually only the changing fringe around the periphery of a moving surface causes changes in occulting from frame to frame. This condition will now be illustrated with reference to FIG. 9A herein.

A square moving object is shown in a first position 910 corresponding to a first frame and second position 911 corresponding to a second frame. Motion 912 causes area 913, which was covered by the object in the first frame, to be vacated by the object in the second frame. Similarly, area 914, which was not covered by the object in the first frame, is caused to be covered by the object in the second frame. Internal area 915, which was covered by the object in the first frame is still occulted by the object in the second frame. Therefore, the changes in the scene (FIG. 9A) caused by object motion causes area 913 to be vacated by the object and area 914 to be covered or filled by the object, where only peripheral area 913 and 914 need be reprocessed for the second frame as a result of object motion. In scenes having many objects, there may be many peripheral areas generated by the motion of objects. However the total of all of the peripheral area for all of the objects is significantly less than the total 3D pixel volume or 2D pixel area that might be considered in a "brute force" approach.

The information for occulting processing is readily available in the system. For example, geometric processor 130 may have all of the edge conditions (visible, non-visible, moving, and stationary) in main memory and all of the changed conditions (visible and non-visible) in increment memory. Supervisory processor 125 has scenario controlling information, such as driving functions. Refresh memory 116 has scene-related visibility information. Therefore, occulting determinations may draw from a wide range of available information.

Occulting processing for edges of stationary objects will now be discussed. An edge of a moving object will fill or vacate pixels and therefore occulting determinations are important. However, edges of stationary objects do not move and therefore will maintain the previously determined occulting condition, except when interacting with the edge of a moving object. Stationary objects are implicitly considered in the discussion on occulting by moving objects, as discussed below. A first condition is a stationary edge that does not interact with a moving edge. For this condition, occulting processing may not be necessary because the prior occulting condition stored in the refresh memory will persist as long as the object remains stationary and does not interact with a moving edge. A second condition is a moving edge that interacts with a stationary edge. For this condition, the moving edge causes occulting processing to be performed and consequently the stationary edge interacting with the moving edge does not need additional occulting processing. Therefore, occulting processing may only have to consider changes in occulting caused by moving edges and may not have to consider occulting by stationary edges.

Filling of Pixels

Occulting processing for filling of pixels will now be discussed in greater detail. As discussed above, one occulting arrangement provided herein may be characterized as a 2D occulting configuration. This is because occulting is performed after projection processing (i.e.; orthogonal or perspective) and therefore may be considered to be performed in a 2D environment. This 2D environment may be considered to be implemented in memory map form with refresh memory 116, which may be considered to be a single 2D plane for storing a memory map of visible portions of images. As images move, they change occulting relationships with other images and therefore change image representations in refresh memory 116.

Various occulting arrangements for filling of leading edge and trailing edge pixels are illustrated in FIGS. 9B to 9G in a simplified schematic notation related to the 2D nature of such occulting processing. These examples are shown with the Y-axis into the page and the X-axis and Z-axis in the plane of the page. This provides a cross-section of 2D surfaces in the X-Y plane, shown as horizontal lines, and a schematic notation along the Z-axis, where surfaces are arranged along the Z-axis in order of increasing range. However, this increasing rage notation is in schematic notation for pictorially representing the range parameter associated with images in refresh memory, where the Z-direction may be considered to be collapsed to provide a single X-Y plane having visible portions of the surfaces projected into that plane. For simplicity of discussion, FIGS. 9B to 9G spread the surfaces in the Z-direction to provide a pictorial representation of the range relationship between the surfaces and therefore the occulting relationship between the surfaces.

A logical arrangement for filling vacated trailing edge pixels will now be discussed with reference to FIGS. 9B–9D. FIGS. 9B–9D show a plurality of surfaces 930, 931, 935,and 936 in the X-Y plane 939 and 940 and having occulting therebetween in the Z-direction 941. A moving occulting surface 930 having edge 933 moves incrementally 934 from position 932 to position 933, which may be considered to be one pixel dimension 929, exposing additional portions of occulted surface 931. Three examples of filling of a vacated pixel are shown in FIGS. 9B–9D, where occulting surface 930 is occulting the occulted surface 931, indicated by being vertically thereover. Occulting surface 930 has surface movement from position 932 to position 933, as indicated by arrow 934. The first case shown in FIG. 9B does not have an intervening surface between occulting surface 930 and occulted surface 931. The second case shown in FIG. 9C has intervening surface 935 between occulting surface 930 and occulted surface 931. The third case shown in FIG. 9D has a new occulting surface 936 exposed by the non-overlapping edges of occulting surface 930 and occulted surface 931. The second and third cases (FIGS. 9C and 9D) have different vacated pixel fill characteristics, as discussed hereinafter.

Motion of occulting surface 930 to vacate a pixel will often cause the vacated pixel to be filled by an occulted surface 931 adjacent to the occulting surface 930 and being "uncovered" 937 by the moving occulting surface 930 (FIG. 9B). Therefore, a first vacated pixel filling arrangement may be based upon an assumption that a vacated pixel is to be filled with the surface being adjacent to and occulted by the moving surface 930 that is vacating the pixel. This arrangement is generally accurate because an occulted surface 931 will often extend under the occulting surface 930 as the occulting surface moves 934 to expose more of the occulted surface 931. Various conditions may cause this assumption to be inaccurate. One such condition is shown is FIG. 9C, where an intervening surface 935 between occulting surface 930 and occulted surface 931 is first exposed by incremental motion 934 of occulting surface 930 so that intervening surface 935 has an edge 938 newly exposed by movement of occulting surface 930 and where newly exposed edge 938 of intervening surface 935 occults the more remote occulted surface 931. Another such condition is shown in FIG. 9C, where edge 942 of occulted surface 931 is uncovered by motion 934 of occulting surface 930 to first expose more remote new occulting surface 936. Other such conditions can also be found. However, such conditions can be overcome by various methods discussed hereinafter.

In view of the above, interaction of a moving edge 933 of an occulting surface 930 with an occulted surface 931 when there is no interaction with occulted edges permits a pixel vacated by an occulting surface to be filled with the occulted surface being exposed. However, if the occulting surface 930 vacates a pixel having an edge 938 and 942 of an occulted surface thereunder, then the pixel vacated by the moving occulting surface 930 may not be completely filled with the previously exposed occulted surface. For the first case (FIG. 9B) where the edge of occulting surface 930 interacts with occulted surface 931 but not with an occulted edge, filling of a pixel vacated by a moving surface is relatively simple to determine, where the vacated pixel may be filled by the adjacent occulted surface 931. However, in the second and third cases (FIGS. 9C and 9D) where the edge 933 of a moving occulting surface 930 interacts with an edge 938 and 942 of an occulted surface, a determination is needed as to the surface to fill the pixel that is vacated by the moving occulting surface.

Because a surface has substantial dimension compared to an edge, interaction between edge 933 of a moving occulting surface 930 and an occulted surface 931 (FIG. 9B) is more prevalent then interaction between an edge 933 of a moving occulting surface 930 and an edge of an occulted surface 938 and 942. Consequently, an assumption that is usually valid is that of the first case (FIG. 9B) where edge 933 of a moving occulting surface 930 interacts with another occulted surface 931 and not the edge 938 and 942 of an occulted surface 935 and 931 respectively (FIGS. 9C and 9D). Therefore, use of this simple filling arrangement that a pixel vacated by a moving occulting surface 930 will be filled by the adjacent occulted surface 931 will usually be accurate. However, as the moving occulting surface moves past an edge 938 and 942 of an occulted surface 935 and 931 respectively; the above filling arrangement may not be accurate. Such conditions can be corrected by various techniques discussed hereinafter.

The above conditions without correction may be permissible for a transitional period of time, where an inaccuracy that results in a minor transient perturbation of the change may be acceptable. In order to minimize the visual effects of such an inaccurate consideration, it is desireable to detect and to correct any such inaccuracies as soon as practical. Therefore, in addition to the above described fill mechanization assuming a first case condition (FIG. 9B), a continual check can be made to detect interaction between an edge 933 of a moving occulting surface 930 that is vacating a pixel and an edge 938 and 942 of an occulted surface 935 and 931 respectively in that same pixel. If this condition is detected, a redetermination of occulting, filling, and edge smoothing can be made for that pixel. However, until this edge interaction condition is detected, filling of pixels vacated by motion of occulting surfaces can be mechanized by filling with the adjacent occulted surface being exposed.

Additional examples for filling of pixels as a result of surface motion are shown in FIGS. 9E to 9G. The schematic notation used in these figures will now be discussed. Surfaces are shown projected into the X-Y plane, where the X-dimension is horizontal and the Y-dimension is into the plane of the page. Therefore, surfaces in the X-Y plane are shown as surface cross-sections in the form of horizontal lines in the plane of the page. One exception is Surface-B of FIG. 9F, shown schematically at an angle to the horizontal to illustrate the angular relationship between two surfaces, Surface-A and Surface-B of the same object. Surfaces located at increasing ranges are shown positioned in the Z-direction along the line-of-sight (LOS) vector to represent increasing range. The nearer surface is labeled as Surface-A and progressively more remote surfaces are labeled Surface-B, Surface-C, etc.

A plurality of conditions for the surfaces in each figure are shown, identified with roman numerals representing changing images as time progresses showing motion of the moving surface. Therefore, as a surface moves, the image changes from Condition-I to Condition-II, to Condition-III, etc. This permits visualization of the progressively changing image as a function of surface motion. The motion illustrated with FIGS. 9E to 9G generally represent single pixel motion as the images change from Condition-I, to Condition-II, to Condition-III, etc for simplicity of discussion. However, sub-pixel motion and multi-pixel motion can also be shown, such as with finer motion increments of the moving surfaces.

The visible image is represented by the capital alphabetical characters at the top of each condition. For example, the alphabetical characters shown in Condition-I of FIG. 9E, CCAAAABB, represent the surfaces visible in each pixel as a result of occulting by less remote surfaces (i.e., Surface-A) of more remote surfaces (i.e., Surface-C). Alternately stated, the alphabetical characters represent the less remote surface seen in that pixel along the line-of-sight vector, which occults other more remote surfaces. In certain images, surfaces are shown partially filling a pixel. This is indicated with the schematic notation of the alphabetical notation for each surface visible in the pixel separated by a slash (/) mark. For example, in Condition-IV of FIG. 9E, a pixel is shown having a "B/C" symbol because both surfaces B and C, are visible in that pixel. Therefore, the occulting relationship between the surfaces in a particular condition is presented by the capital alphabetical characters at the top of that condition.

Motion of a surface is indicated schematically by the changing position of that surface between conditions I, II, III, etc. For example, in FIG. 9E, Surface-A is shown as a moving surface progressing towards the left and exposing first Surface-B and then Surface-C as Surface-A progresses towards the left through conditions I to V. Image motion can be translational motion of a surface, rotational motion of a surface, translational motion of an observer, rotational motion of an observer, and combinations thereof. For simplicity of discussion, motion may be limited to a single surface or set of surfaces. However, these illustrations of motion are representative of other conditions, such as relative motion of all surfaces causes by observer motion.

A moving occulting surface is illustrated in FIG. 9E. Moving occulting Surface-A is shown moving towards the left as the scene progresses from Condition-I through Condition-V. In Condition-I, moving Surface-A partially occults stationary Surface-B and stationary Surface-C, but Surface-C can be seen exposed to the left of Surface-A and Surface-B can be seen exposed to the right of Surface-A. In Condition II, moving Surface-A has moved one pixel to the left, exposing more of Surface-B and occulting more of Surface-C. In Condition III, moving Surface-A has moved another pixel to the left, exposing more of Surface-B and occulting the remaining portion of Surface-C. In Condition-IV, moving Surface-A has moved another pixel to the left, exposing the remainder of Surface-B and creating an aperture inbetween the adjacent edges of Surface-A and Surface-B and exposing a portion of Surface-C through that aperture. In Condition-V, moving Surface-A has moved another pixel to the left, exposing more of Surface-C and expanding the aperture created in Condition-IV.

Filling of pixels along the leading edge of moving Surface-A can be seen in FIG. 9E. Moving Surface-A has the shortest range and therefore fills pixels along its leading edges.

Filling of pixels along the trailing edge of moving Surface-A can be seen in FIG. 9E. Adjacent occulted Surface-B fills vacated pixels of moving Surface-A until an aperture is detected. After the aperture is detected and Surface-C is identified as filling the aperture, such as with aperture processor 134, then the adjacent occulted surface is Surface-C which fills vacated pixels.

A pair of occulting surfaces that are part of the same object are illustrated in FIG. 9F. Occulting Surface-A and Surface-B are shown attached together and are shown moving towards the left as the scene progresses from Condition-I through Condition-IV. In Condition-I, moving Surface-A and Surface-B partially occult Surface-C, but Surface-C can be seen exposed to the left of Surface-A. In Condition-II, moving Surface-A and Surface-B have moved one pixel to the left, occulting more of Surface-C. In Condition-III, moving Surface-A and Surface-B have moved another pixel to the left, occulting more of Surface-C. In Condition-IV, Surface-A and Surface-B have moved another pixel to the left, occulting the remainder of Surface-C.

Filling of pixels along the leading edges of moving Surface-A and moving Surface-B can be seen in FIG. 9F, Moving Surface-A has a shorter range than Surface-C and therefore fills pixels along its leading edge.

Filling of pixels along the trailing edge of moving Surface-A having an attached adjacent moving Surface-B can be seen in FIG. 9F. Adjacent and attached Surface-B fills vacated pixels of moving Surface-A. However, there is no possibility of an aperture opening up therebetween because they are attached and move together.

A moving occulted surface becoming visible is illustrated in FIG. 9G. Moving occulted Surface-B is shogun moving towards the left as the scene progresses from Condition-I through Condition-IV. In Condition-I, stationary Surface-B fully occults moving Surface-B and partially occults stationary Surface-C, where Surface-C can be seen exposed to the left of Surface-A. In Condition-II, moving Surface-B has moved one pixel to the left, now being partially exposed to the left of Surface-A and now occulting part of Surface-C. In Condition III, moving Surface-B has moved another pixel to the left, being exposed more from under Surface-A and occulting more of Surface-C. In Condition IV, Surface-B has moved another pixel to the left, being exposed more from under Surface-A and occulting the remainder of Surface-C.

Filling of pixels along the leading edge of a moving but occulted surface becoming visible is illustrated in FIG. 9G. Moving occulted Surface-B does not fill pixels along its leading edge until it becomes visible. When the leading edge of moving Surface-B becomes visible after passing beyond occulting Surface-A, moving Surface-B has a shorter range then Surface-C and therefore fills pixels along its leading edge.

Filling of pixels along the trailing edge of moving occulted Surface-B can be seen in FIG. 9G. The trailing edge of Surface-B continues to be occulted by occulting Surface-A and therefore the trailing edge of Surface-B does not fill any pixels.

The processing discussed for occulting determination for vacating a pixel applies whether the adjacent surface is an occulting surface that is occulting the moving surface being considered or is an occulted surface occulted by the moving surface being considered. For an adjacent occulted surface, the adjacent occulted surface will fill the vacated pixels until an edge of the adjacent occulted surface is detected. Then a determination can be made to identify the next more remote occulting surface that is uncovered and that can be used to fill the pixel. For an adjacent occulting surface, the edge of the moving surface is occulted by this occulting surface.

Therefore, the moving occulted surface does not vacate pixels until the moving edge of the occulted surfaces passes the edge of the occulting surface. Then a determination is necessary to identify the next more remote occulting surface that is uncovered by both, the adjacent occulting surface and the moving surface, that will be used to fill the pixel. This search for the next more remote occulting surface may be the same as for the above described condition of an adjacent occulted surface. Therefore, these two vacating pixel edge interaction conditions, adjacent occulting and adjacent occulted surfaces, may be processed in similar fashion.

Another condition that should be considered is the condition where a moving surface is an occulted moving surface that vacates an edge pixel of an intervening surface that is also occulted by the moving surface and that is occulting the adjacent surface. This consideration can be treated in the following manner, discussed as an exposing of an intervening occulted edge. Exposing of an intervening occulted edge can be processed with supervisory processor 125, aperture processor 134, or other processor to identify intervening edges between occulting and occulted surfaces and to set an intervening edge flag in the pixel word having pixels traversed by the intervening occulted edge. Motion of that intervening occulted edge can be tracked as the edge moves, based upon geometric processor 130 determining motion thereof in a manner similar to the updating of visible moving edge. However, the intervening occulted edge motion results in setting and resetting of an intervening edge flag in intervening edge pixel words without requiring determination of occulting and edge smoothing. Occulting and edge smoothing determination for an intervening edge may be made if an intervening edge is exposed and therefore becomes visible.

Setting of an intervening edge flag can be performed automatically upon motion of an intervening edge into a new pixel. Resetting of an intervening edge flag can be performed automatically upon motion of an intervening edge out of a pixel or upon an intervening edge becoming visible and therefore no longer being an intervening edge. However, resetting of the intervening edge flag may be conditioned upon the intervening edge pixel not being an intervening edge for another surface. Detection of intervening edges for multiple intervening surfaces traversing the same pixel can be detected by examining the intervening edge flags for adjacent pixels and determining if the intervening edge flag for the instant pixel should be left set, even in the presence of motion of an intervening edge therefrom due to another intervening edge still traversing that same pixel.

The condition of filling a vacated pixel for the edge interaction occulting determination can be readily implemented with a supervisory processor lookahead arrangement. Supervisory processor 125 has the information needed to perform the lookahead. For example, supervisory processor 125 may be controlling the scenario with the driving functions. Therefore, supervisory processor 125 may already have determined the uncovered occulted surface for this vacated pixel condition. Also, supervisory processor 125 or real time processor 126 can store supplemental information on surfaces and edges to simplify the search for uncovered surfaces that become occulting surfaces.

The three conditions of intervening edge exposure, moving non-visible edge exposure, and exposing an edge by vacating a pixel can be detected by generating all non-visible edges with edge processor 131 and determining if these non-visible edges have become visible. A non-visible edge becomes visible when the range for that non-visible edge is equal to the range of the surface filling that non-visible edge pixel (uncovering of a non-visible edge of a partially visible surface) or the range of the pixel is greater than the range of the non-visible edge traversing that pixel (exposure of a non-visible intervening edge or non-visible moving edge). Such a newly exposed edge can be processed in various ways. It can fill the new edge pixels and may share the edge pixels with the edge of the previously occulting surface, such as for sub-pixel motion. It can fill other edge pixels then filled by the previously occulting edge, such as for pixel or multi-pixel motion. It can fill combinations thereof, such as for the new exposed edge and the previously occulting edge intersecting at an angle; thereby having the combination of multi-pixel, pixel, and sub-pixel spacing therebetween.

In a configuration having smoothing processing capability, smoothing processing need not be implemented in the same frame as the above occulting processing, but can be implemented in a subsequent frame. For newly exposed edges that are not moving, such as for an intervening edge exposed by a moving surface vacating a pixel; a pseudo-motion flag can be set in the pixel word to process the stationary edge to have proper occulting and smoothing in the next frame in order to compensate for any simplifying assumptions that may have been made during exposure processing for that edge. Alternately, a visible-edge generator may be assigned hereto immediately upon detection of such a condition to immediately provide occulting and smoothing processing, consistent with that discussed for a moving visible edge.

Edge processors having available time can be assigned to perform background processing, such as occulting processing for non-visible and stationary edges, in order to compensate for any approximations or error buildup that may have occurred and in order to detect exposure of a previously non-visible surface.

The condition of uncovering an edge of a partially occulted surface by a moving surface vacating a pixel may need additional processing. For example, this edge exposure during vacating of a pixel may open up an aperture between the previously occulted edge and the previously occulting edge. A search may be performed to determine the surface or surfaces that are exposed through this aperture. This search may be performed using various types of occulting processing and geometric relationships, such as under control of real time processor 125 in whole number form, or under control of real time processor 126 in incremental form, or under control of special purpose logic in geometric form. Alternately, a special purpose logic arrangement, called an aperture processor may be used. One aperture processor configuration is discussed with reference to FIGS. 10A to 10F.

Pixel Fill Operations

Filling of pixels may be performed by testing various related pixels as representative of the fill conditions. This is illustrative of other geometric and pattern related techniques that may be enhanced with these teachings. Such techniques will be exemplified with pixel fill and inside/outside pixel processing discussed herein with reference to FIGS. 9J to 9L.

One configuration for filling of pixels inbetween the prior edge and the next edge of a moving surface will now be discussed with reference to FIG. 9J. As discussed herein, changing pixels inbetween a prior edge position as a next edge position are filled from the surface on the side of the prior edge that is opposite to the side of the prior edge having the next edge. This is independent of whether the moving edge is a leading edge moving into the changing pixels or a trailing edge vacating the changing pixels. The case of a leading edge filling pixels will be discussed relative to FIG. 9J. However, the discussion is also applicable to a trailing edge vacating pixels.

Figure 9H:
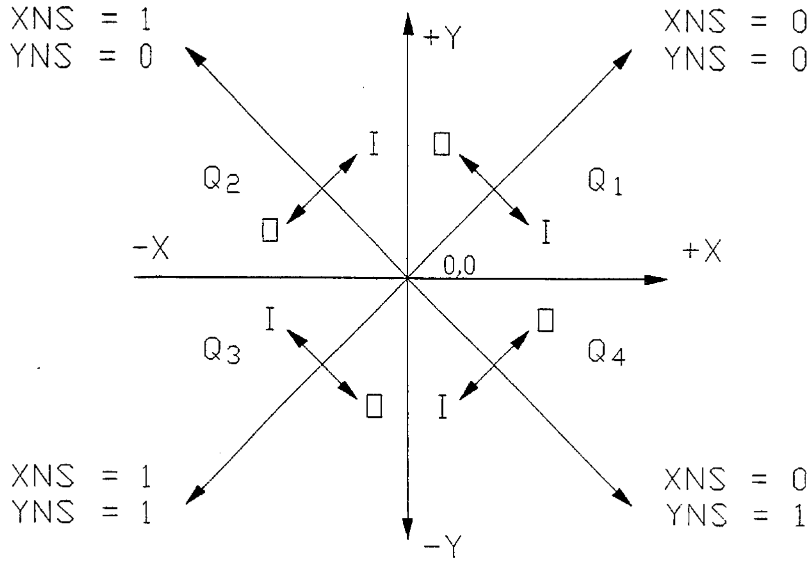
Figure 9J:
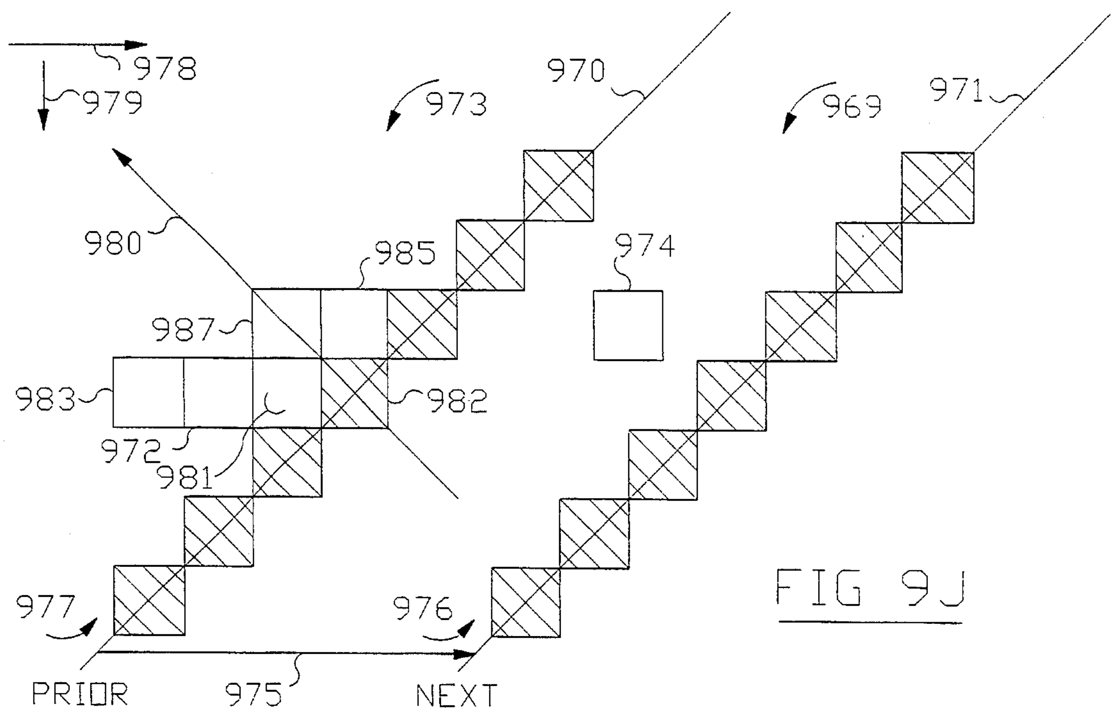

The nature of the adjacent pixels used to fill changing pixels and the direction of the surface from which they are accessed may be determined, as illustrated by the arrangement in FIG. 9J. The motion of the edge is from the prior edge position 970 to the next pixel position 971. The changing pixels between the prior edge position 970 and the next edge position 971 are to be filled with the pixel word determined by adjacent pixel processing. An adjacent pixel may be selected by the pixel word of the adjacent surface 973 filling the changing pixels 969 independent of whether it is a moving leading edge or a moving trailing edge. The adjacent pixels 973 that can be used to fill the changing pixels 969 are the pixels 973 on the opposite side of the prior edge 970 away from the next edge 971. This is opposite to the location of the changing pixels 969, which are on the side of the prior edge 970 towards the next edge 970.

Moving surface 973 having pixels such as pixel 972 and having edges such as edge 970 moves as shown by arrow 975 from prior edge 970 position to next edge position 971 to cover changing pixels such as pixel 974 in area 969 inbetween prior edge 970 and next edge 971. Edge pixels 976 are shown in cross-hatched form. Filling of changing pixels 969 between prior edge 970 and next edge 971 (FIG. 9J) may be accomplished by reading the pixel word of a pixel of adjacent surface 973 and storing this pixel word in a changing pixel. For example, as the leading edge 970 and 971 of a moving occulting surface 973 encompasses pixels 969, these pixel scan be loaded with the pixel word associated with the moving occulting surface 973. Similarly, for a moving trailing occulting edge, pixel words associated with the adjacent surface can be used to fill a pixel vacated by a trailing edge of a moving occulting surface. Configurations for monitoring the contents of a pixel associated with an adjacent surface and for storing pixel words in changing pixels will now be discussed.

One configuration for fill processing discussed herein involves generating next and prior edge pixels 976 and 977 respectively for a moving edge. The prior edge pixels 977 contain smooth color information and therefore may not be adequately representative of the pixel words of adjacent surface. However, pixels adjacent to the prior edge (pixels to the left of edge pixels 977) may be properly representative of the characteristic of adjacent surface 973. Therefore, accessing of words of edge pixels 976 and 977 for updating can include accessing of adjacent pixel words for occulting determination. In one configuration, adjacent pixel words may be accessed automatically with an edge pixel word because a plurality of pixel words may be accessed simultaneously in order to reduce access bandwidth of the refresh memory. Alternately, edge pixels and adjacent pixels may be individually identified and individually accessed, such as for greater flexibility in selecting the adjacent pixel words.

A determination of the adjacent edge pixels to be accessed for proper fill processing can improve fill processing. In one configuration, adjacent pixels may be pixels adjacent to the edge pixel along a horizontal scan line 978. Alternately, adjacent pixels may be pixels adjacent to the edge pixel along a vertical pixel column 979. Alternately, adjacent pixels may be pixels adjacent to the edge pixel along a perpendicular line 980 to the moving edge through the edge pixel. Adjacency may be direct adjacency, such as with an adjacent pixel 981 actually in contact with an edge pixel 982, or may be adjacent pixels removed one or more pixels from the edge pixel. For example, if pixel 982 along a scan line is an edge pixel, a pixel directly adjacent thereto along the horizontal line will be pixel 981, an adjacent pixel once-removed along the horizontal scan line will be pixel 972, an adjacent pixel twice-removed along the horizontal scan line will be pixel 983, and so on. The more removed adjacent pixels 981, 972, and 983 are from edge pixel 982; the less perturbed by edge effects such as slope of the edge, sub-pixel position of the related edge pixel, and other such effects. The less removed adjacent pixels 981, 972 and 983 are from edge pixel 982; the more precise is the determination for narrow images, such as for surfaces approaching a vertex. Therefore, in one configuration, a directly adjacent pixel 981 may be used to provide changing pixel fill information. In other configurations other adjacency conditions may be used such as removed pixels 972 and 983.

Fill processing may be sensitive to the slope of the edge. For example, a near horizontal edge may not properly permit selection of adjacent pixels along the horizontal scan line even if many pixels removed, because such adjacent pixels may be edge pixels due to the very small slope of the line. In one configuration, a slope test may be made to establish the direction of the more desireable adjacent pixels. Adjacent pixels may be selected along a perpendicular to the edge 980 at the edge pixel position to minimize effects of the adjacent pixels being edge pixels. However, determining adjacent pixels along a perpendicular to the edge may involve undesireable computations. Alternately, adjacent pixels may be selected along either a horizontal scan line 978 or a vertical column 979, depending upon slope of the edge. If slope of the edge is equal to or greater than 45 degrees, then adjacent pixels can be selected along a horizontal scan line 978. If slope of the edge is less than 45 degrees, then adjacent pixels can be selected along a vertical column line 979. Determination of the slope being greater than 45 degrees or less than 45 degrees may be made relatively simple, by comparing the delta-X and delta-Y dimensions of the edge to determine which dimension is greater or alternately by testing a slope parameter when available. This horizontal and vertical adjacency arrangement provides a simple determination of preferred adjacent pixels, reduces ambiguities due to an edge slope, and is relatively simple to process. Other adjacency criteria can also be provided.

Determination of adjacent pixel addresses will now be discussed. Assuming the edge pixel address to be considered is edge pixel 982, then adjacent pixels thereto can be readily determined along horizontal scan lines and vertical column lines with simple addition and subtraction operations. For example, addresses of immediately adjacent pixels on the same horizontal scan line can be determined by adding (or subtracting) unity from the X-coordinate of the edge pixel to yield the X-coordinates of the immediately adjacent pixel and having the same Y-coordinate as the edge pixel 982. Similarly, the address of the immediately adjacent pixel 985 along the same vertical column line can be determined by adding (or subtracting) unity from the Y-coordinate of the edge pixel 982 to yield the Y-coordinate of the immediately adjacent pixel and having the same X-coordinate as the edge pixel 982. Similarly, addresses of immediately adjacent pixel 987 on a perpendicular line can also be determined by the geometric relationship and slope of the edge. Similarly, the address of a once-removed adjacent pixel 972 on a horizontal scan line can be determined by adding (or subtracting) two from the X-coordinate of the edge pixel 982 to yield the X-coordinate of the twice-removed adjacent pixel and having the same Y-coordinate as the edge pixel 982.

An edge pixel test may be made for selected adjacent pixels to establish the validity thereof. When an adjacent pixel is selected, such as with one of the configurations discussed above, a test may be made of that pixel by examining the edge flag in the pixel word to determine if it is an edge pixel. If it is not an edge pixel, it may be considered to be a valid adjacent pixel having valid fill information and therefore may be used for fill processing. If it is an edge pixel, it may be considered to be an invalid adjacent pixel having invalid fill-information and therefore may not be used for fill processing. If an invalid adjacent pixel is identified, then a determination may be initiated to select an alternate adjacent pixel in place thereof. This selection may be implemented by testing pixels adjacent to the invalid adjacent pixel to attempt to find a valid adjacent pixel that is not an edge pixel. If such a valid adjacent pixel is found, then it may be used for fill processing. The search for a valid adjacent pixel may continue by testing more removed adjacent pixels until a valid adjacent pixel is identified. Care must be taken to prevent crossing another edge of that surface and selecting an adjacent pixel from another surface. If such a valid adjacent pixel is not found, then alternate adjacent pixel determination processing may be used; such as by using the adjacent pixel that was used for fill processing for the edge pixel that had been processed immediately therebefor.

Figure 10T:
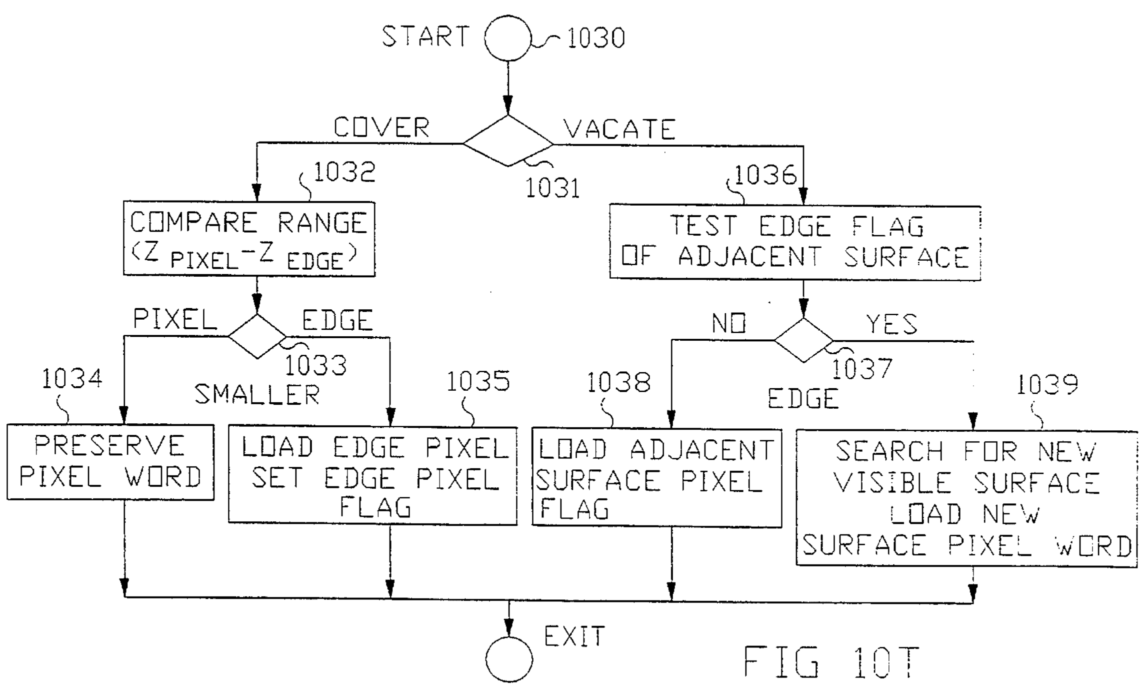
FIG. 10, comprising
Figure 10E:
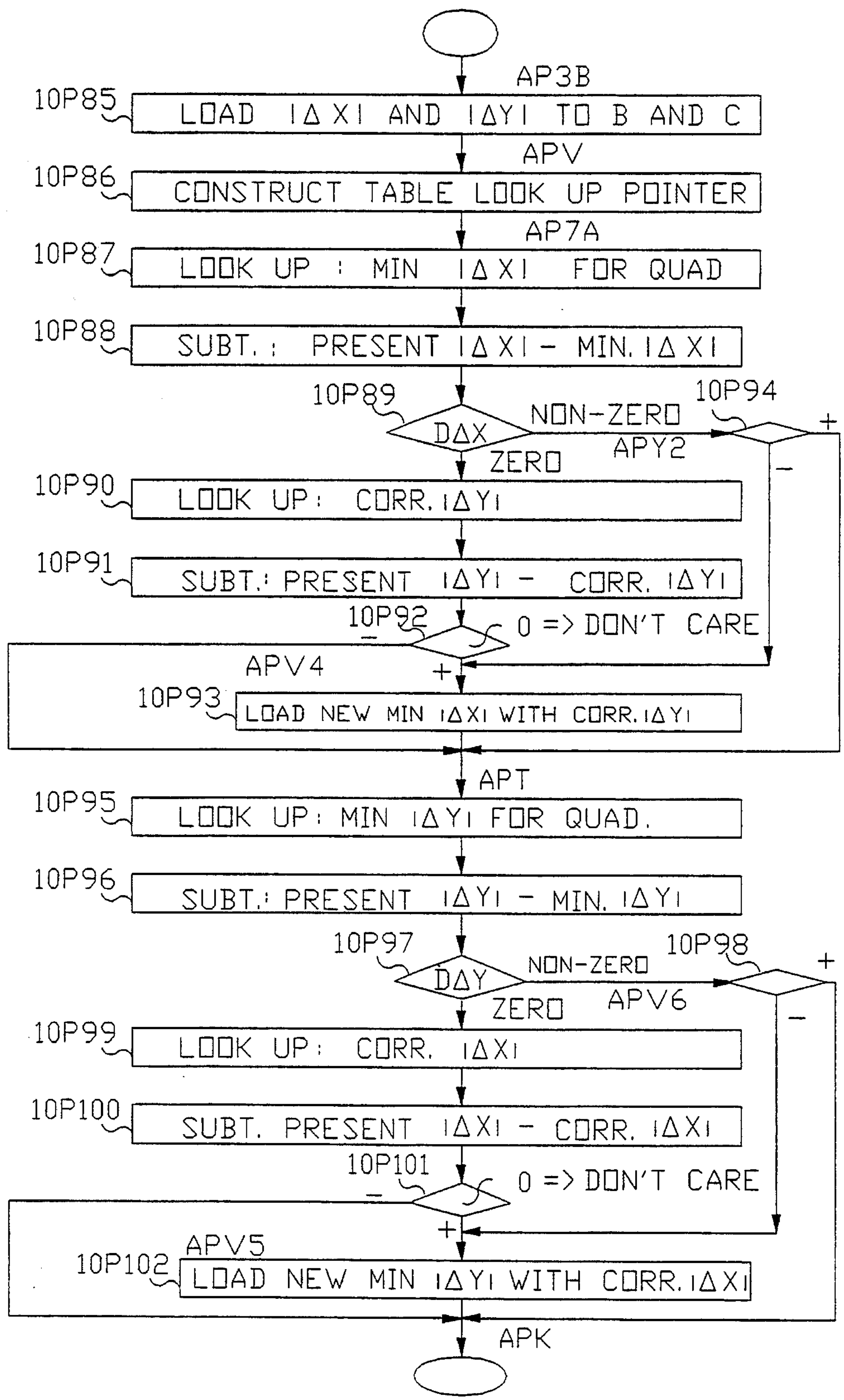

Occulting Processing (FIGS. 10T and 8A)

One example of occulting processing will now be discussed with reference to FIG. 10T. Occulting processing discussed herein may be implemented in simplified form such as with the processing shown in FIG. 10T and discussed hereafter. In this configuration, occulting processor 132 starts occulting processing with operation 1030, proceeding to decision operation 1031 to determine if the edge pixel is being filled by the moving edge or vacated by the moving edge. If the edge pixel is being filled by the moving edge, the processor proceeds along the FILL PIXEL path to operations 1032–1035 vacated by the moving edge, the processor proceeds along the VACATE PIXEL path to operations 1036–1039 for vacated pixel occulting processing.

Fill pixel occulting processing will now be discussed. In operation 1032, the processor compares the range byte for the surface associated with the moving edge and the range byte of the associated edge pixel word in refresh memory. The processor makes a determination in operation 1033 which range is smaller and therefore which surface is occulting. If the pixel word from refresh memory has a smaller range byte, it occults the moving edge and therefore the processor proceeds along the PIXEL path to operation 1034 which preserves the pixel word previously stored in the refresh memory. The processor then exits the occulting processing operation. If the range of the moving edge pixel has a smaller range byte, it occults the pixel word and therefore the processor proceeds along the EDGE path to operation 1035, where the processor loads the edge pixel word associated with the moving edge and sets the edge pixel flag in the new pixel word. The processor then exits the occulting processing operation.

Vacate pixel occulting processing will now be discussed. If the pixel is being vacated, the processor proceeds along the VACATE PIXEL path from operation 1031 to operation 1036. In operations 1036 and 1037, the processor tests the adjacent pixel to determine if it has an edge flag associated with the adjacent surface. If an adjacent surface edge is not detected, the processor branches along the NO path to operation 1038 to load the pixel word of the adjacent surface into the vacated pixel and then exits from occulting processing for that pixel. However, if an adjacent pixel contains an edge flag of the adjacent surface, the processor proceeds along the YES path to operation 1039 for processing of this edge interaction condition and then exits from occulting processing for that pixel. In operation 1039, the processor searches for a new visible surface exposed by the moving edge vacating the pixel because the adjacent surface has an edge adjacent thereto and therefore does not fill that vacated pixel. This search may be performed by supervisory processor 125 or aperture processor 134 to identify the previously occulted but now visible surface that has been exposed by the moving edge vacating the pixel. The pixel word associated with the new visible surface is loaded into the refresh memory for that pixel. The processor then exits-the occulting processing for that pixel.

Two conditions are considered with the above edge interaction processing. One is the condition of an intervening edge between a moving occulting surface and an occulted surface that is being exposed by the moving edge. This condition exists when the edge of the moving occulting surface that is exposing the occulted surface also exposes an edge of a surface intervening between the moving occulting surface and the surface being exposed. The other is a moving occulted edge that moves beyond the edge of an occulting surface so that it becomes visible. These two conditions are detected with auxiliary edge processor operations. Such processing may be implemented by using the edge processor to trace the occulted and non-visible edges to determine if these edges have become visible, such as by the above mentioned conditions. If an intervening edge has been exposed by a moving edge vacating a pixel, tracing of the intervening edge will show a visibility condition because the range byte associated with that intervening edge is smaller than the range byte of the pixel word in refresh memory, which is related to a more remote surface uncovered by the nearer occulting moving edge and occulted by the intervening edge. Similarly, a new occulted edge that moves into visibility can be detected by comparing the range byte of that moving edge with the range byte for that pixel in refresh memory and determining that the moving edge has a smaller range byte and therefore occults the surface being compared therewith. The frequency of occurrence of these conditions may be relatively small because they involve interaction between an edge of a moving occulting surface vacating a pixel and an edge of an intervening surface or the edge of a moving occulted surface moving through an edge pixel of the occulting surface. Therefore, these conditions involve interaction of edges of an occulting and an occulted surface, where one or both of these surfaces is moving in a direction to expose the edge of the occulted surface.

Another example of occulting processing will now be discussed with reference to FIG. 8A using the edge processor configuration discussed with reference to FIGS. 7A and 7B. Edge processor operation is initiated in operation 820 including initializing the refresh memory and initializing the edge table. This initialization can be accomplished with the incremental initial condition driving functions, such as discussed herein, or with whole number initial condition generation, such as under control of supervisory processor 125. The highest priority edge is identified in operation 822, such as by using priority processing as discussed herein. This highest priority edge is then processed in subsequent operations. Edge processor 131 then proceeds to operation 821 for updating the edge table with any new edges that may have entered the refresh memory.

Edge processor 131 executes operation 825 to lookup the edge in increment memory to determine if the edge has moved and therefore requires updating and a test thereof is made in operation 823. If the edge has not moved, indicated by the absence of a change increment in increment memory 672, the processing loops back along the NO path from operation 823 to operation 822 to select another edge in accordance with the priority processing. If the edge has moved, indicated by the presence of a change increment in the increment memory, the processing proceeds along the YES path to lookup the edge parameters in the edge table in operation 824. The edge table is accessed for parameters of the selected edge for loading the edge processor, discussed herein with reference to FIG. 7A. The edge table may include addresses of edge parameter initial conditions; which may include actual position coordinates XA and YA corresponding to endpoint coordinates of the edge terminating at the surface vertex associated with the selected edge, addresses of the endpoint coordinates XE and YE for the selected edge, and the address of the slope m for the selected edge. These addresses may be the absolute addresses of these parameters in the geometric processor main memory. However, greater storage efficiency may be achieved using relative addressing and implicit addresses in a fixed format main memory arrangement. For example, a base address may be provided, where the addresses for the XA and YA parameters (the endpoint of the edge terminating thereon), for the XE and YE end points, and for the slope m of the selected edge may be provided. The X and Y coordinates and the slope of each edge may be fixed address locations relative to the base address.

The base address implementation can result in a saving of edge table memory requirements. For example, assuming a twenty bit address parameter for the geometric processor main memory, use of five absolute addresses would require 100-bits per edge and 200,000 bits for 2,000 edges in the edge table. However, use of the base address arrangement may require only two base addresses of 10-bits each, the base address for the terminating edge and the base address for the starting edge, thereby reducing edge table memory requirements to 20% of the above calculated amount.

The edge table may be updated consistent with the entering or removing of edges from the geometric processor main memory. For example, supervisory processor 125 may perform the initialization of the geometric processor main memory by loading edge-related information therein; where supervisory processor 125 may update the edge table contemporaneously therewith.

The edge table may include other information such as flags associated with the edge to identify if the edge is moving or visible. Such a motion flag may be set when a driving function is initiated for that object and may be reset when a driving function is discontinued for that object.

Edge processor 131 then proceeds to operation 827 to initialize the next-edge processor and the prior-edge processor. The next-edge processor is initialized from the new-edge conditions which can be accessed directly from the geometric processor main memory. However, the prior-edge parameters may no longer be available in the main memory, having been replaced by the next-edge parameters therein. Therefore, prior-edge parameters may be calculated from the next-edge parameters and the incremental changes by subtracting the incremental changes from the next-edge parameters. Alternately, prior-edge parameters can be stored in a buffer memory until processed with the edge processor to overcome the need to computationally rederive the prior-edge parameters.

Edge processor 131 then proceeds to operation 828, where the next-edge processor and prior-edge processor are double incremented to half-pixel resolution to obtain the quadrant and quadrant edge information for the pixel traversed to be used for area weighting information for edge smoothing. This double incrementing operation 828 steps the edge processor from pixel to pixel at half-pixel resolution. Edge processor 131 tests whether the next-pixel and prior-pixel are the same pixel in operation 829. If they are the same pixel, the processor branches along the YES path to operation 838, skipping processing of a different edge pixel and intervening pixel in operations 830 through 837. However, if they are not the same pixel, the processor branches along the NO path to operation 830 to initiate processing of a different edge pixel and of intervening pixels.

In operation 830, edge processor 131 accesses the prior-pixel word and resets the edge flag in the prior-pixel word; where the prior-pixel is no longer an edge pixel. Edge processor 131 then proceeds to operation 831, where occulting processing for the prior edge pixel is performed. A determination is made in operation 832 from the occulting processing in operation 831 whether the prior edge pixel is visible or non-visible. If the prior edge pixel is non-visible, edge processor 131 proceeds along the NO path to test for intervening pixels in operation 834. If the prior edge pixel is visible, edge processor 131 proceeds along the YES path to fill the prior edge pixel in operation 833 and then to test for intervening pixels in operation 834. If visible, edge processor 131 determines which surface fills the prior edge pixel and loads the pixel word related thereto into the prior edge pixel in operation 833. Edge processor 131 then proceeds to operation 834 to determine whether intervening pixels between the prior-edge pixel and the next-edge pixel exists as a result of multi-pixel motion.

If intervening pixels do not exist, edge processor 131 proceeds along the NO path to operation 838 for next-edge pixel processing. If intervening pixels exit edge processor 131 proceeds along the YES path performing operations 835–837 to process the intervening pixels and then proceeds to process the next-edge pixel in operation 838. Edge processor 131 proceeds to operation 835, where occulting processing for the intervening pixels in performed. A determination is made in operation 836 from the occulting processing in operation 835 whether the intervening pixels are visible or non-visible. If intervening pixels are non-visible, edge processor 131 proceeds along the NO path to operation 838 for next-edge pixel processing. If intervening pixels are visible, edge processor 131 proceeds along the YES path to fill the intervening pixels in operation 837 and then to process the next-edge pixel in operation 838. If visible, edge processor 131 determines which surface fills the intervening pixels and loads the pixel word related thereto into the intervening pixels in operation 837.

The processing of a next-edge pixel is performed with operation 838 to 841. Edge processor 131 proceeds to operation 838, where occulting processing for the next-edge pixel is performed. A determination is made in operation 839 from the occulting processing in operation 838 whether the next-edge pixel is visible or non-visible. If the next-edge pixel is non-visible, edge processor 131 proceeds along the NO path to operation 842 to test for the edge endpoint for looping back to process another pixel or to terminate operations for this edge. If the next-edge pixel is visible, edge processor 131 proceeds along the YES path to perform smoothing in operation 840 and then to test for completion of processing of the edge in operation 842. Smoothing operations are discussed herein, such as with reference to FIGS. 11 and 12. Edge processor 131 then proceeds to operation 841 to set the pixel flag in the next-edge pixel word. Edge processor 131 then proceeds to operation 842 to determine if this pixel is an edge endpoint pixel. If not, edge processor 131 proceeds along the NO path to operation 828 to again increment the edge processors to the next edge pixel for processing thereof with operations 829 to 841. Edge processor 131 continues to iterate through operations 828–842 for each sequential pixel along the edge until the edge endpoints for the prior edge and the next-edge have been reached. At that time, edge processor 131 proceeds along the YES path from operation 842 back to operation 821 for updating the edge table and for selecting and processing another edge.

Background Scenes

Backgrounds have various characteristics that simplify processing. For example, a background may be occulted by nearer objects and may never be occulting for more remote objects because there may be no more remote objects. Also, a background may be like a backdrop for a stage play, being the most remote portions of the scene. Therefore, the background may be configured as a 2D stationary backdrop that can neither move, nor occult other objects, nor rotate, nor translate. Observer rotation or translation may cause relative motion of the line-of-sight with the background. Therefore, observer motion may cause relative motion of the background relative to the scene. However, such relative background motion cannot occult other objects and cannot cause rotation of 2D represented back-ground objects. Therefore, background processing may be relatively simple compared to non-background processing of 3D occulting objects.

Object Interaction

Objects may be at the same range and may interact in range. For example, a first object may be partially occulting a second object and the second object may be partially occulting the first object. However, such a visual effect may be automatically eliminated, where each object, in total, may be assigned a range byte different from other objects. Therefore, different parts of different objects occulting each other may not occur. For example, an object cannot therefore have a first part occulting a first part of another object and a second part being occulted by a second part of the other object. This is because each object may be assigned a different occulting priority or a different range byte, even though parts of each may extend beyond the range resolution into other range increments. As an occulting object changes range to become occulted by an object it previously occulted, it may instantaneously change from being occulting to being occulted in one frame rather than gradually change. However, it may not be necessary for one object to go through another object without a "crash" or "collision". Crash processing is treated separately herein. If an object is going between other objects, such as separate trees; the trees may be implemented as different objects and may have different object ranges or occulting priorities. However, for an object to go through a single tree (instead of between different trees), it may be a crash type of effect. If objects are to go between portions of other objects, the portions of other objects may be listed as separate objects.

Crash Processing

Moving objects introduce crash considerations between objects. Occulting processing may include crash processing to determine if a crash has occurred. Vacating a pixel can't cause a crash and therefore does not need crash processing. Filling a pixel can cause a crash and motion in range can cause a crash, which conditions need crash processing.

Crash processing is easily implemented for pixel filling occulting processing. This processing compares range words of the prior object (the object filling the pixel) and the moving object being processed. If the prior object has a nearer range, it occults the moving object and the moving object does not fill the pixel. If the prior object has a farther range, it is occulted by the moving object and the moving object fills the pixel. If the prior object and the moving object have equal ranges (or similar ranges), a crash may be indicated.

Crash determination can be implemented for range motion crashes. An object moving in range and therefore getting nearer or farther away needs consideration for occulting and for crash determination. If a moving object changing in range, either newly occulting a nearer object because it gets in front of it or being newly occulted by a further previously occulted object because it gets behind it as a result of the range motion, may have caused a crash. This condition can be detected by comparing all object ranges to find out if such a condition has occurred. If it has occurred, it may be a crash condition and should be flagged. However, this may be a low occurrence type condition. A crash table may be used to keep track of the range of all objects for sorting in range.

Crash processing may be implemented with range comparisons. Alternately, aperture processor 134 can identify all surfaces encompassing a pixel, therefore permitting range comparisons between such surfaces for crash determination.

A crash announciator may be used to identify a crash. Alternately, the scenario may be permitted to proceed to further evaluated and to confirm the crash. One crash announciator may be a visual announciator, such as a red crash mark at the crash location. Another crash announciator may be an audio announciator such as generating a crash sound.

Extrapolative Occulting Processing

Extrapolative occulting processing is based upon deriving the next (N) image from the prior (P) image. There are many advantages associated therewith; such as reduction in redundant processing, simplification of processing, and reduction in refresh memory traffic. For example, the stationery portions of the image do not have to be updated, stationery objects do not have to updated, and non-changing portions of moving objects, such as within the intersection, do not have to be updated. Processing is simplified because extrapolating small changes from a known condition is simplier than regenerating the image such as from database information.

In one configuration, extrapolative occulting processing involves filling of leading area pixels and erasing of the trailing area pixels of a moving surface to move that surface from a prior position to a next position.

Filling of leading area pixels can be performed (a) by filling the leading area pixels with the moving surface information when the moving surface occults the image previously in those pixels by being nearer in range and (b) by not filling the leading area pixels with the moving surface information, but leaving the previous leading surface pixel information as it previously was, when the moving surface is occulted by the image previously in those leading area pixels by being further in range. A simple range check will determine whether the moving surface will fill or will not fill the leading area pixels.

Erasing of trailing area pixels can be performed by filling the trailing area pixels with the surface that was previously adjacent to the trailing area and that becomes exposed as the moving surface moves out of these trailing area pixels. This can be achieved by the unconditional filling of the trailing area pixels with the adjacent surface information. Such processing is valid independent of interaction between a moving surface and a stationery surface or a moving surface and another moving surface.

Certain contingencies occur with the above discussed extrapolative occulting processing as a result of the interaction between edges. Therefore, additional extrapolative occulting processing can be provided to take care of contingency conditions.

One configuration of occulting processing discussed herein is implemented with memory map occulting processing, where occulting information is placed in a memory map and processed in memory map form. The memory map may be refresh memory 116, may be an offline memory map, or may be other memory map form. Some information may be permanently stored for the frame period in the memory map, such as surface identification and edge smoothing information, and other information may be temporarily stored for transitionary occulting processing in the memory map, such as P-flags and N-flags. A set of flags may be provided to store conditions pertinent to occulting. For example, visible edge flags (V-flags) can be stored as representative of a visible edge occurring in the image. Comprehensive edge flags (C-flags) can be stored as representative of either a visible edge or a non-visible occurring in the image. Prior edge flags (P-flags) can be stored as representative of a prior edge that is to be erased. Next edge flags (N-flags) can be stored as representative a next edge that is to be drawn.

In one configuration of extrapolative occulting processing discussed with reference to FIGS. 10M–10R; a plurality of modes of occulting processing are provided to sequentially process a surface to move through the environment. In this configuration, Mode-0 draws P-edges to outline a P-surface in the memory map. Mode-1 draws N-edges to outline an N-surface in the memory map. Mode-2 fills the leading area contained between N-edges and P-edges based upon a range comparison between the moving surface and the surface previously contained in the leading area pixels. Mode-3 erases the trailing area contained between N-edges and P-edges based upon filling with adjacent outside surface information. Mode-4 erases the P-flags and erases the visible P-edge (V-flag) and the P-edge related C-flag to erase the trailing area. Mode-5 erases the N-flags and smoothes visible N-edge pixels.

Additional processing is performed in the above modes to cover the contigencies of interaction between edges. For example, if the outside pixel for a trailing area is a visible edge pixel, outside surface information may not be available from that outside pixel for filling of trailing area. However, a search scan be performed to find a valid outside surface to fill the trailing area. Similarly, smoothing of visible N-edges may involve searching for an appropriate surface adjacent thereto for smoothing color weighting and mixing. Also, filling of leading area pixels inside the N-edge and erasing of trailing area pixels inside the P-edge may involve searching or scanning for these inside pixels. Various processing arrangements discussed herein can be provided to perform these functions. For example, inside and outside determination can be achieved with inside/outside processing logic discussed with reference to FIGS. 9H and 9I herein. Also, various search arrangements may be provided to locate pixels associated with surfaces and to detect edges. For example, a linear search can be performed by incrementing or decrementing the pixel address in the X-direction, Y-direction, or X-direction and Y-direction. Other search arrangements can be provided, such as a circular search by incrementing and decrementing the X-address and the Y-address to access pixels adjacent to and around a center pixel or a spiral search by incrementing and decrementing the X-address and the Y-address to access pixels around a center pixel at increasing distances from the center pixel.

In one configuration, surfaces may be bounded by edge pixels and may have a constant color for internal pixels. For such surfaces, internal surface pixels can be filled with the same information unless separated by an edge. Therefore, knowledge of the information filling a reference pixel of a surface can be used for filling other pixels of that surface that are not separated from that reference pixel by an edge. This can be used to enhance extrapolative occulting processing for interaction between edges. For example, for trailing edge erasing, where an outside pixel is sought to fill an inside pixel; finding a single outside pixel that may properly be used for filling a single reference inside pixel permits use of that same outside pixels for filling all inside pixels that are not seperated from that reference inside pixel by an edge. Therefore, even if only a single outside pixel for a trailing area is appropriate, such as caused by an edge in the outside pixel or occulting of the outside pixel; the single appropriate outside pixel may be sufficient information for filling the trailing area if there are no edges traversing the trailing area. For a trailing area traversed by edges, additional outside pixels can be accessed to fill trailing areas seperated by edges that become visible when the P-surface is erased. If a group of pixels in the trailing area are completely surrounded by edges, herein called an aperture; it may not be appropriate to fill this area with adjacent outside pixel information because the area may be associated with a different surface seperated from the outside pixels by the edges. For this condition, an aperture processor can be used to determine which surface can be seen through this aperture and therefore which surface information should fill the pixels therein.

When erasing a trailing area, edges traversing the trailing area that were previously non-visible, defined with C-edge flags, may or may not become visible. Visibility of such edges can be determined by filling the areas adjacent to the edges as discussed above and by using these adjacent surfaces to determine edge visibility. For example, if the same surface occurs on different sides of an edge, then that surface also covers the edge and the edge is non-visible. If different surfaces occur on different sides of an edge, then the edge seperates the two surfaces and is therefore visible. Consequently, edge interaction for occulting processing can be readily accomodated.

Occulting processing can be performed in an iterative manner in conjunction with edge pixels as an edge is traced around the periphery of a surface. Occulting processing can be performed for each edge pixel and for pixels adjacent to the edge pixel as generation of the edge around the surface proceeds. The surface can be represented as a pair of surfaces, a P-surface and an N-surface, for providing motion of an edge from the P-surface condition to the N-surface condition in accordance with the change-related refresh memory updating feature of the present invention. This involves erasing of the P-surface and generation of the N-surface to facilitate motion from the P-position to the N-position. However, as discussed herein, there may be considerable overlapping between the P-surface and the N-surface, called the intersection between the P-surface and the N-surface; where the pixels in the intersection need not be changed for certain configurations, such as for a monochromatic surface. Therefore, only pixels outside of the intersection and within either the P-surface or the N-surface need be updated. These portions of the surface may be called the leading edge, leading area, leading surface, or leading pixels of the N-surface pertaining to non-intersection pixels of the surface and may be called the trailing edge, trailing area, trailing surface, or trailing pixels of the P-surface pertaining to non-intersection pixels of the P-surface. Leading area pixels are at the edge of the surface in the direction of motion and trailing area pixels are at the edge of the surface in the direction away from the motion.

In one configuration of iterative occulting processing, the edge pixels for the P-surface and the edge pixels for the N-surface are traced through a pixel memory memory map and intervening pixels between the P-edges and the N-edges are accessed and filled in accordance with leading area processing and trailing area processing to fill pixels of the moving surface in the leading area and to erase pixels of the moving surface in the trailing area.

Intersection processing can be performed to provide improved efficiency. In this configuration, pixels within the intersection of the P-surface and the N-surface need not be changed. For certain conditions, such as for small motion per frame, the intersection may include the majority of the pixels encompassed by the moving surface. Therefore, detection of the intersection and not processing of the pixels in the intersection can provide efficiencies in refresh memory traffic and occulting processing bandwidth. Hence, for configurations where intersection processing is implemented, occulting processing is primarily involved with smoothing of the N-surface edge, erasing of the P-surface edge, filling of leading area pixels, and erasing of trailing area pixels; but not processing pixels in the intersection.

Occulting processing can be enhanced if it is performed in multiple dimensions, such as in two dimensions with a memory map. For example, a refresh memory implemented as a two dimensional memory map: such as for refreshing a CRT monitor; can be used for change-related occulting processing. The refresh memory can be implemented as a multi-ported refresh memory having an output port for refreshing the display monitor and an input port for updating the information in the memory map; such as discussed with reference the FIGS. 13 and 14 herein. One manner of implementing occulting in conjunction with a memory map is to provide occulting-related flags stored in the memory map, such as being stored in each pixel, to facilitate two dimensional memory map operations; such as bounding a surface with edge pixels, scanning a two dimensional area to detect bounding edges, and filling N-area pixels, and erasing P-area pixels.

A configuration for memory map occulting processing using occulting flags in the pixel words stored in refresh memory will now be discussed as illustrative of other arrangements of memory map occulting processing.

A visible edge flag (V-flag) can be provided in each visible edge pixel as representative of a visible edge appearing in the viewport. In the illustrative configuration discussed herein, the visible edge flags are provided as a 2-bit visible edge flag (V1V0) permitting identification of zero visible edges (V1V0=00), one visible edge (V1V0=01), two visible edges (V1V0=10), and three or more visible edges (V1V0=11) for the particular pixel. The visible edge flags may be incremented and decremented as visible edges enter a pixel and exit a pixel, respectively. Multiple visible edges per pixel can identify a vertex of a surface having two edges meeting therein and/or multiple edges of different surfaces traversing the same pixel.

A comprehensive edge flag (C-flag) can be provided in each edge pixel as representative of either a visible or non-visible edge in the viewport. In the illustrative configuration discussed herein, the C-flags are provided as a 3-bit C-edge flag, (C2C1C0) permitting identification of zero C-edges (C2C1C0=000), one C-edge (C2C1C0=001) to six C-edges (C2C1C0=110), and seven or more C-edges (C2CLC0=111) for the particular pixel. The C-edge flags may be incremented and decremented as visible and non-visible edges enter a pixel and exit a pixel, respectively. Multiple C-edges per pixel can identify a vertex of a surface having two edges meeting therein and multiple edges of different surfaces traversing the same pixel.

A prior edge flag (P-flag) can be provided in each prior edge pixel as representative of a prior edge of a moving surface being processed. In the illustrative configuration discussed herein, the prior edge flags are provided as a 2-bit prior edge flags (P1P0) permitting identification of zero prior edges (PIP0=00), one prior edge (PIP0=01), two prior edges (P1P0=10), and three or more prior edges (P1P0=11) for the particular pixel. Multiple prior edges per pixel can identify a vertex of a surface having two edges meeting therein.

A next edge flag (N-flag) can be provided in each next edge pixel as representative of a next edge of a moving surface being processed. In the illustrative configuration discussed herein, the next edge flags are provided as a 2-bit next edge flag (N1N0), permitting identification of zero next edges (N1N0=00), one next edge (N1N0=01), two next edges (N1N0=10), and three or more next edges (N1N0=11) for the particular pixel. Multiple next edges per pixel can identify a vertex of a surface having two edges meeting therein. Memory map occulting processing using the above described pixel flags provides flexibility in testing and updating changing pixels; such as leading area and trailing area, pixels for a moving surface. For example, leading area pixels and the trailing area pixels for a moving surface are typically the pixels contained between P-edges and N-edges. Therefore, tracing of an N-edge and a P-edge through pixel memory permits testing of adjacent pixels and scanning of leading area pixels and trailing area pixels for updating. Scanning can begin at an N-edge pixel or P-edge pixel on the edge that is being followed and can continue inwardly until detection of another N-edge or P-edge pixel to identify the inside pixels to be updated in the leading area or trailing area. If an edge pixel contains both, an N-flag and a P-flag, it can be considered to be at the intersection and therefore may not involve scanning of leading area and trailing area inside pixels.

For simplicity of implementation of the configuration discussed with reference to FIGS. 10M to 10R; a single moving surface at a time is processed to minimize occulting processing interaction between multiple moving surfaces. However, in other configurations, multiple moving surfaces can be processed simultaneously with a multi-processor configuration of an occulting processor, an overlapping pipeline configuration of an occulting processor, or other configurations of an occulting processor. In this illustrative configuration, time sharing is provided for a single occulting processor shared between different moving surfaces in sequences. Temporary information specific to a moving surface that is stored in a pixel word for occulting processing may be first written for commencement of occulting processing and then erased after completion of occulting processing to facilitate time sharing of the occulting processor and the flag fields in refresh memory between multiple moving surfaces. For example, the occulting processor can write the P-flags and N-flags for a particular moving surface into refresh memory, can perform occulting processing relative to that particular moving surface, and can then erase the P-flags and N-flags for that particular moving surface after completion of occulting processing to facilitate use of the same flag fields for other moving surfaces. This can be accomplished with a sequence of modes of operation, herein discussed with reference to FIGS. 10L to 10R; for writing information into refresh memory, performing occulting processing, and erasing information from refresh memory. One configuration is shown in FIG. 10L, comprising Mode-0 thru Mode-5 identified with mneumonics OCM0A thru OCM5A at the start of each mode of operation for a software emulation of this configuration. Each of these modes will now be briefly discussed to illustrate this configuration.

Memory map occulting processing can be performed by tracing or following edge pixels around the periphery of a surface and processing edge pixels and the related internal leading area and trailing area pixels as the edge pixels are identified. The edge pixels can be identified by the X-coordinate and Y-coordinate of the pixel. Edge processor 131 generates edge pixels by identifying the address for each pixel along the edge and by identifying other pertinent edge-related information associated with each edge pixel. Edge processor 131 can be used to generate an edge and to follow the edge through a memory map. The addresses of the edge pixels can be used to access the edge pixel words from the memory map.

Scanning of a surface can be performed by incrementing or decrementing the X-address and/or Y-address of an edge pixel to identify the X-coordinate and Y-coordinate of adjacent pixels near the edge. For example, decrementing the X-address of an edge pixel can cause a scanning operation to proceed in the minus X-direction starting with that edge pixel, to be terminated when another edge pixel is detected. As the scan progresses, the pixels addressed by the scan can be accessed from the memory map and evaluated, such as to detect an edge flag contained therein. Consequently, this edge generation and surface scanning arrangement facilitates a two dimensional implementation for identifying surfaces and investigating surfaces in memory map form.

In a configuration discussed with reference to FIGS. 10L to 10R herein, multiple modes of memory map occulting processing are implemented, involving tracing of the edges around the periphery of the same moving surface for a plurality of times. In one configuration, the edge processor may be used to repetitively regenerate the edge pixels for the same surface. In an alternate configuration, the edge pixels generated by the edge processor can be stored for subsequent use and can then be accessed from storage as required for multiple iterations around the same edge. One storage configuration is a first in first out (FIFO) memory. In this FIFO configuration, each edge pixel generated by the edge processor is stored in the FIFO in sequence, consisting of a pixel word including the pixel X-address and Y-address and various other parameters associated with that pixel. Then, as the occulting processor progresses through its iterative operations, it accesses the sequence of edge pixels for the surface to trace the edge through the memory map for a plurality of times as needed for the iterative occulting processing. For example, the sequence of N-edge pixels can be accessed a first time to store N-flags in N-edge pixels; can be accessed a second time for leading area occulting processing to fill leading area pixels; and can be accessed a third time to smooth N-edge pixels and to erase N-edge flags from N-edge pixels.

A FIFO format is provided, where a block of surface-related words is stored at the start of each vector and where a block of pixel-related words is stored in sequence for each pixel along the edge. For example, a triangular surface would include three surface header blocks related to the three edges of the triangle and a plurality of pixel word blocks following each surface header block for the pixels along each edge.

The features of the system of the present invention have been demonstrated on an experimental system, which is discussed herein, such as with reference to FIG. 17. Computer listings used to demonstrate a FIFO memory are attached hereto in the Table Of Computer Listings in the sub-table entitled FIFO memory. These listings are compatible with various FIFO descriptions herein, such as using common mneumonics and symbols, and provide extensive supplemental details, such as in the annotations in the left hand columns and the details of the assembly language code in the middle column.

A FIFO word format for one configuration discussed herein is shown in the table of packed words. This FIFO format provides a surface header SEH0 to SEH5 for each surface followed by a sequence of edge pixel words PXLB0 to PXLB5 to define the pixels around the periphery of the edge. The group of surface header words SEH0 to SEH5 contains information specific to the surface and edges of the surface. The group of pixel words PXLB0 to PXLB5 contain information specific to a particular edge pixel.

Surface header word SEH0 contains the F1-flag and F0-flag, which identify whether the surface is to be drawn and whether the surface is to be filled, and contains the PN1-flag, which identifies whether the surface is a P-surface or an N-surface. It also contains the SV-flag and EV-flag pertaining to anti-streaking processing. Surface header word SEH1 contains the surface identification for table lookup of surface-related parameters in surface memory and includes various surface-related flags. Surface header word SEH2 contains the object identification and includes various object-related flags. Surface header word SEH3 contains occulting priority information, including range of the surface and an auxiliary fixed occulting priority parameter. Surface header word SEH4 is a spare word. Surface header word SEH5 contains various edge-related flags, where the XNS-flag and YNS-flag identify the X-vector and Y-vector directions respectively, the FS-flag identifies whether the slope of the edge is greater or less than 45 degrees, and the LES-flag identifies whether the edge is the last edge per surface.

Pixel word PXLB0 is different for P-edges and N-edges, as shown in the Table Of Packed Words. For a P-edge, PXLB0 contains an outside surface identification to aid in erasing of a P-edge. For an N-edge, PXLB0 contains a smoothing weight for smoothing an N-edge. The PXLB0 word also contains various spare flag words. Pixel word PXLB1 contains various flag words; including the FI5, FI6, and FI7 flag words associated with intersection processing and the LPE-flag which identifies the last pixel per edge condition. Pixel words PXLB2 and PXLB3 contain replications of the pixel words stored in refresh memory. Pixel word PXLB2 contains comprehensive edge flag COC1C2, representative of visible and non-visible edges traversing that pixel: N-edge flag N1N0 representative of a next-edge traversing that pixel: and P-edge flag P1P0 representative of a prior-edge traversing that pixel. Pixel word PXLB3 contains visible edge flag V1V0 representative of a visible edge traversing that pixel and contains a shared field having either the surface identification or the smoothed color for that pixel. If the V-flag is non-zero, then a visible edge traverses the pixel and a smoothed color is contained in the shared field. If the V-flag is zero, then there is no visible edge traversing the pixel and a surface identification pertaining to the occulting surface seen in that pixel is contained in the shared field. Pixel words PXLB4 and PXLB5 contain the X-address and Y-address of the edge pixel respectively for accessing information from and storing information into the edge pixel in the memory map.

The occulting processor can access the edge information from the FIFO by setting the start address of the edge into the FIFO address counter and by accessing sequential blocks of words therefrom. For example, for each mode, the occulting processor can set the surface startpoint address into the FIFO address counter for an iteration around that edge and can sequentially access the surface, edge, and pixel information for that iteration. Such operations can be repeated for the same edge for a plurality of iterations.

The features of the system of the present invention have been demonstrated on an experimental system, which is discussed herein, such as with reference to FIG. 17. Computer listings used to demonstrate the occulting processor are attached hereto in the Tables Of Computer Listings in the sub-table entitled Occulting Processor These listings are compatible with the various occulting processor descriptions herein, such as using common mneumonics and symbols, and provide extensive supplemental details, such as in the annotations in the left hand columns and the details of the assembly language code in the middle column.

Mode-0 Processing

Figure 10F:
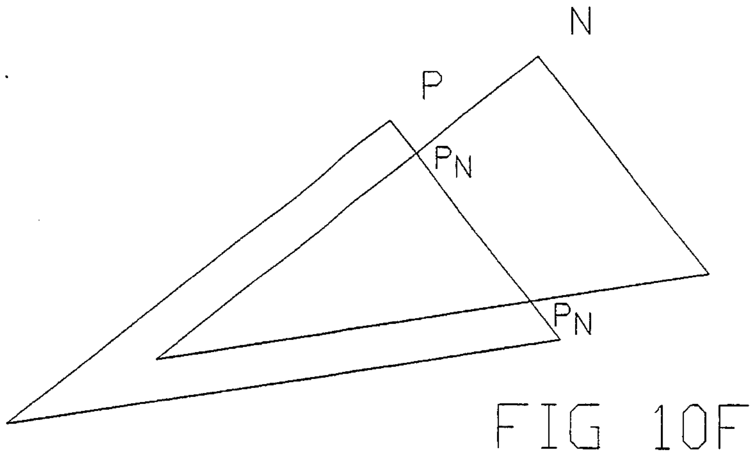
Figure 10G:
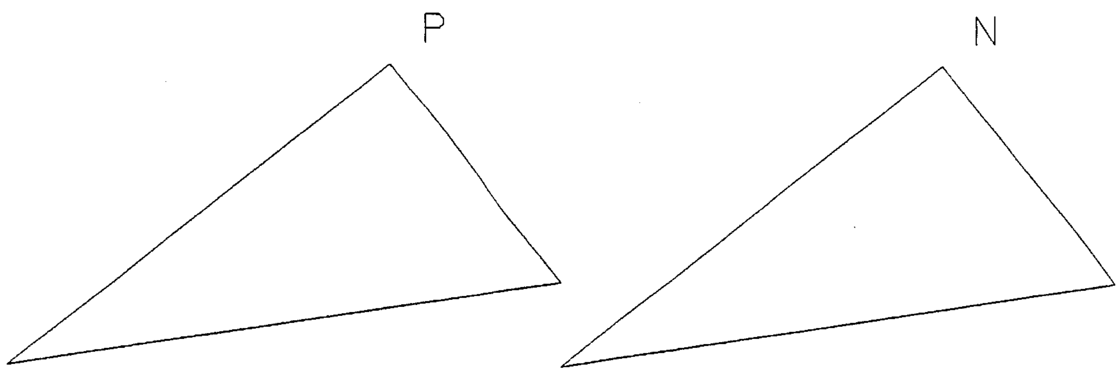
Figure 10H:
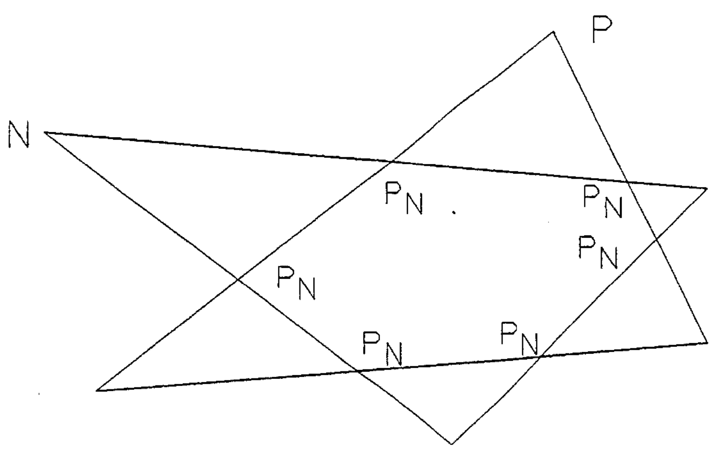
Figure 10I:
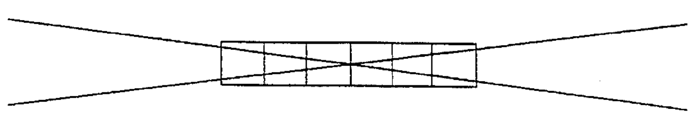
Figures 1, 10K:
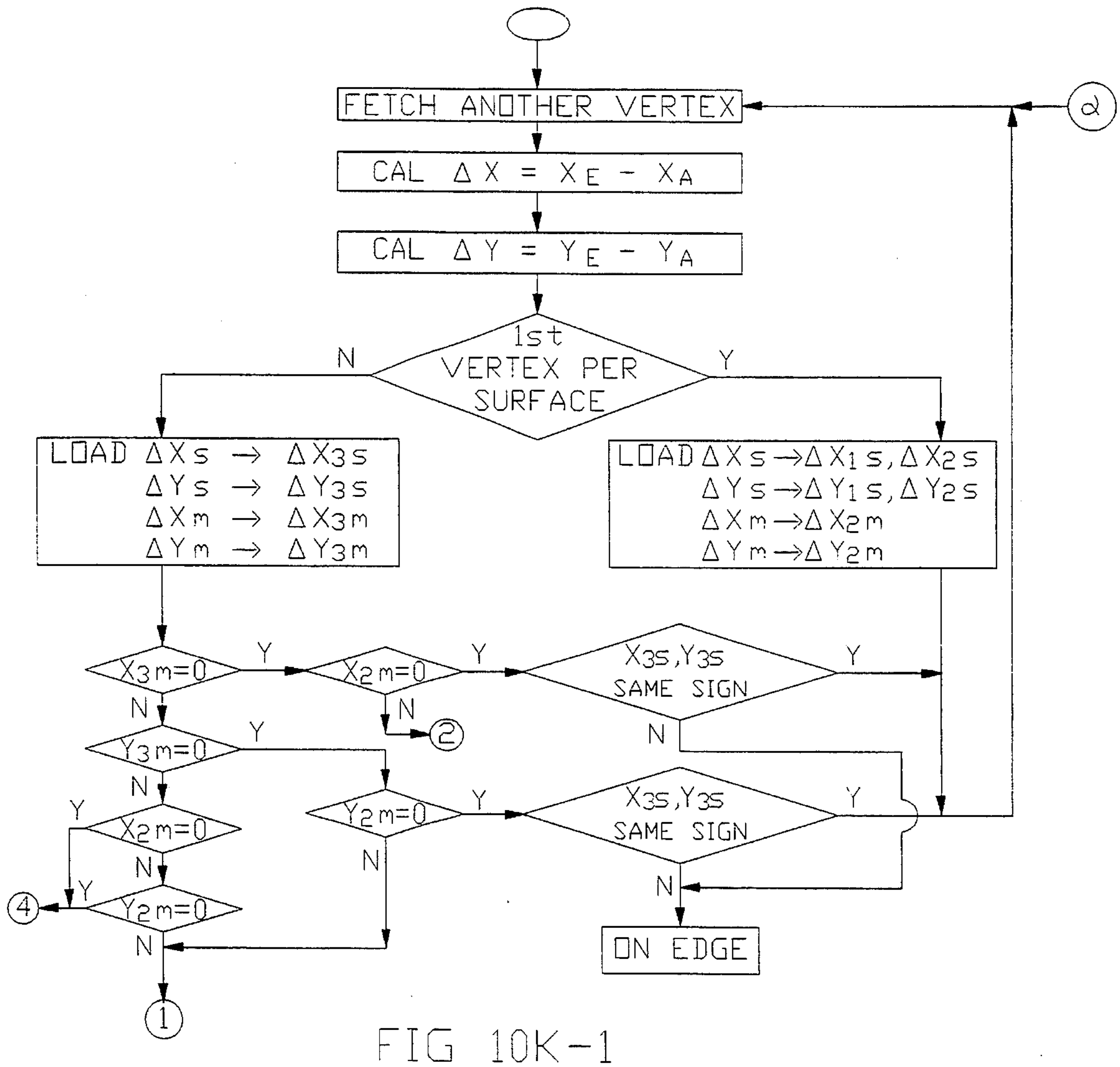
Figures 2, 10K:
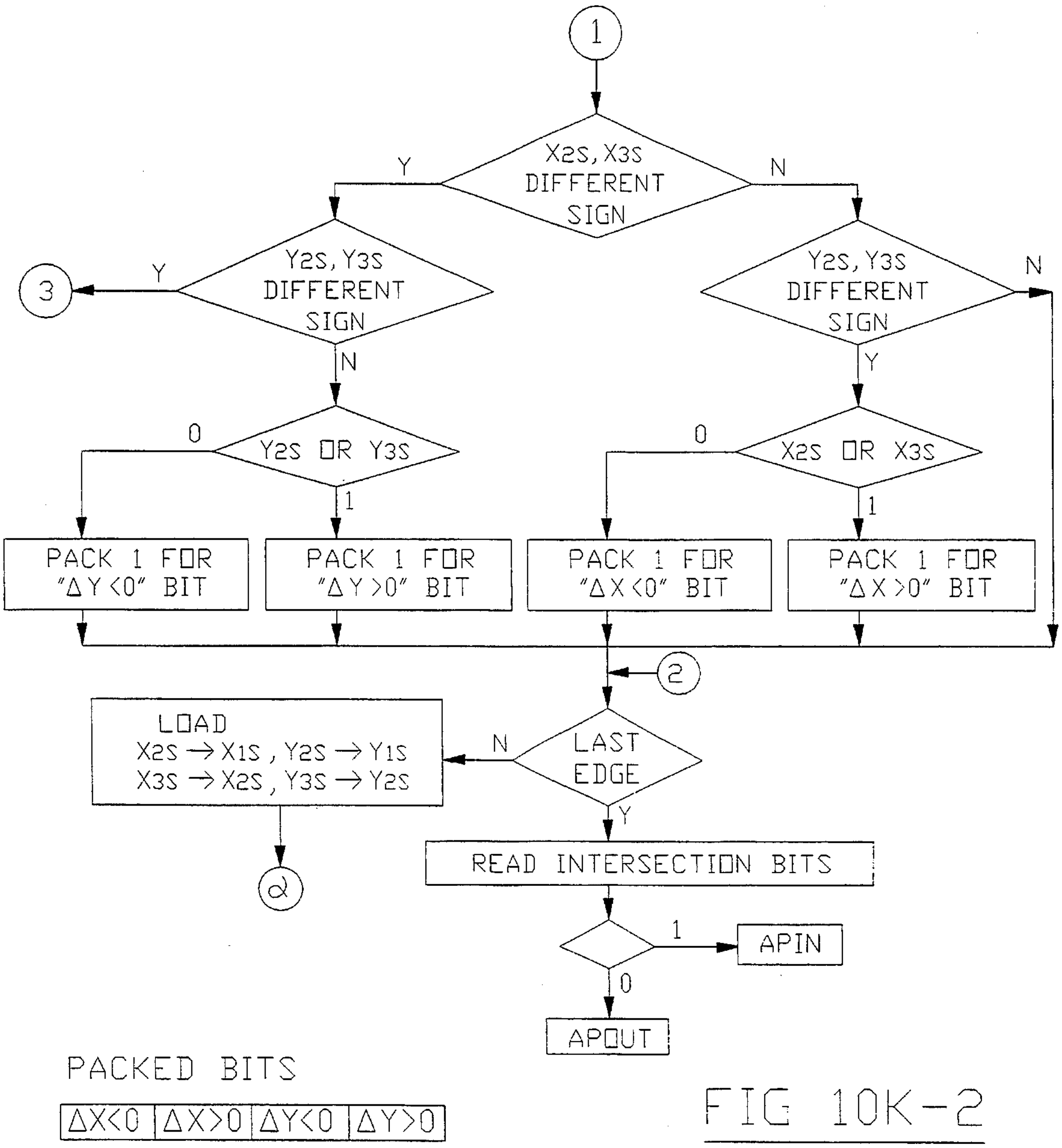
Figures 3, 10K:
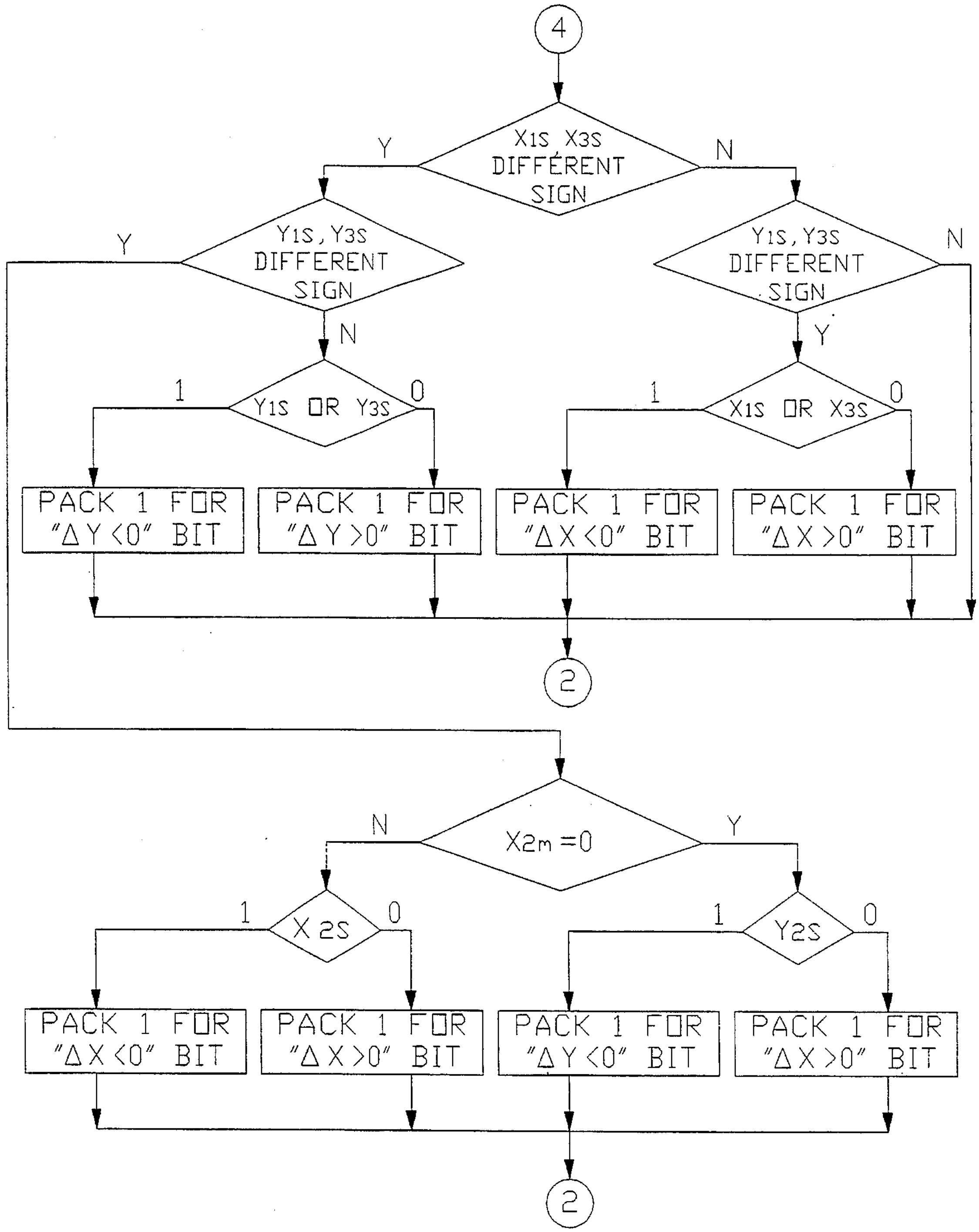
FIG. 3 is a block diagram and schematic representation of a supervisory processor implementation.
Figures 4, 10K:
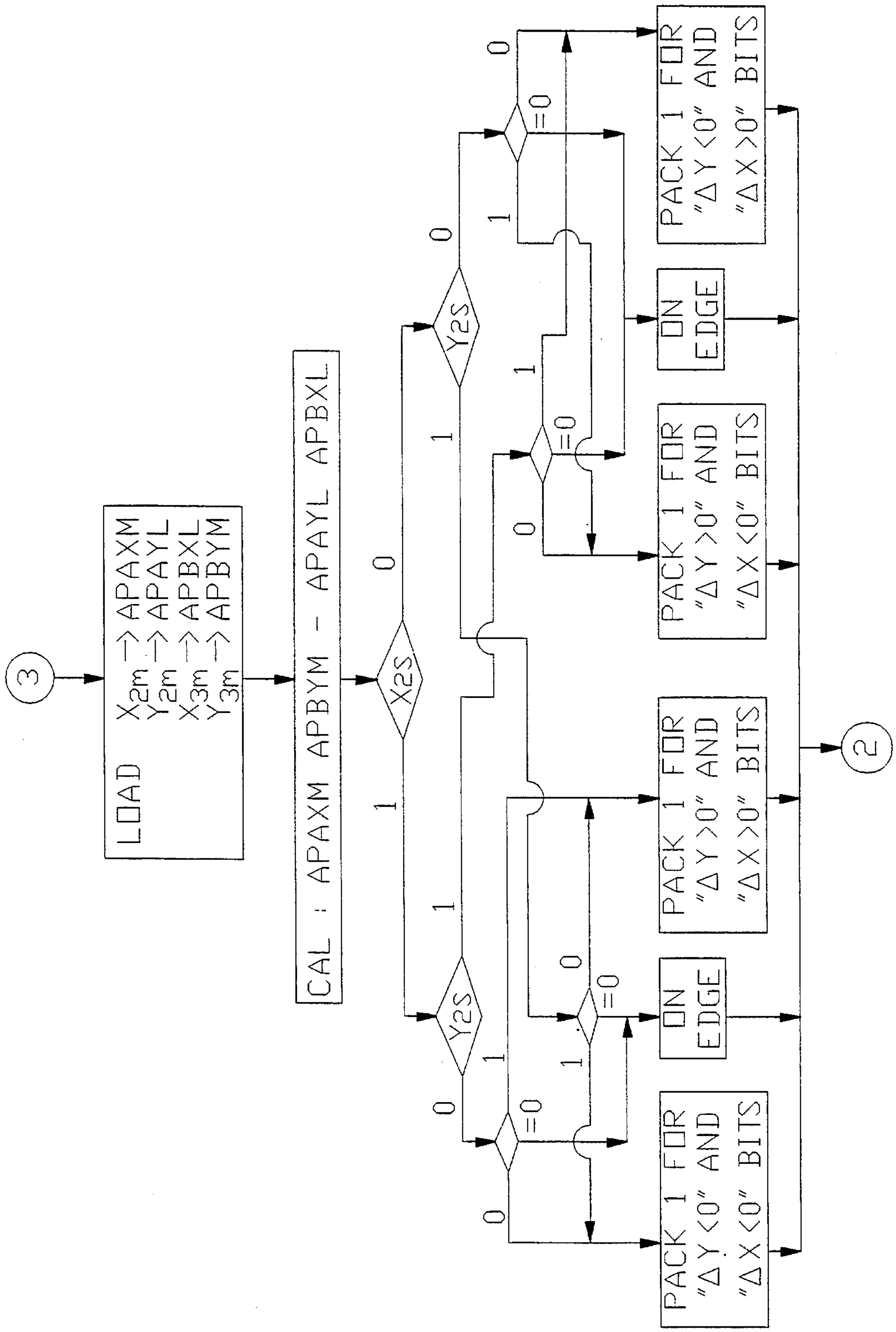
FIG. 4 is a flow diagram and state diagram of executive processor operations.
Figure 10M:
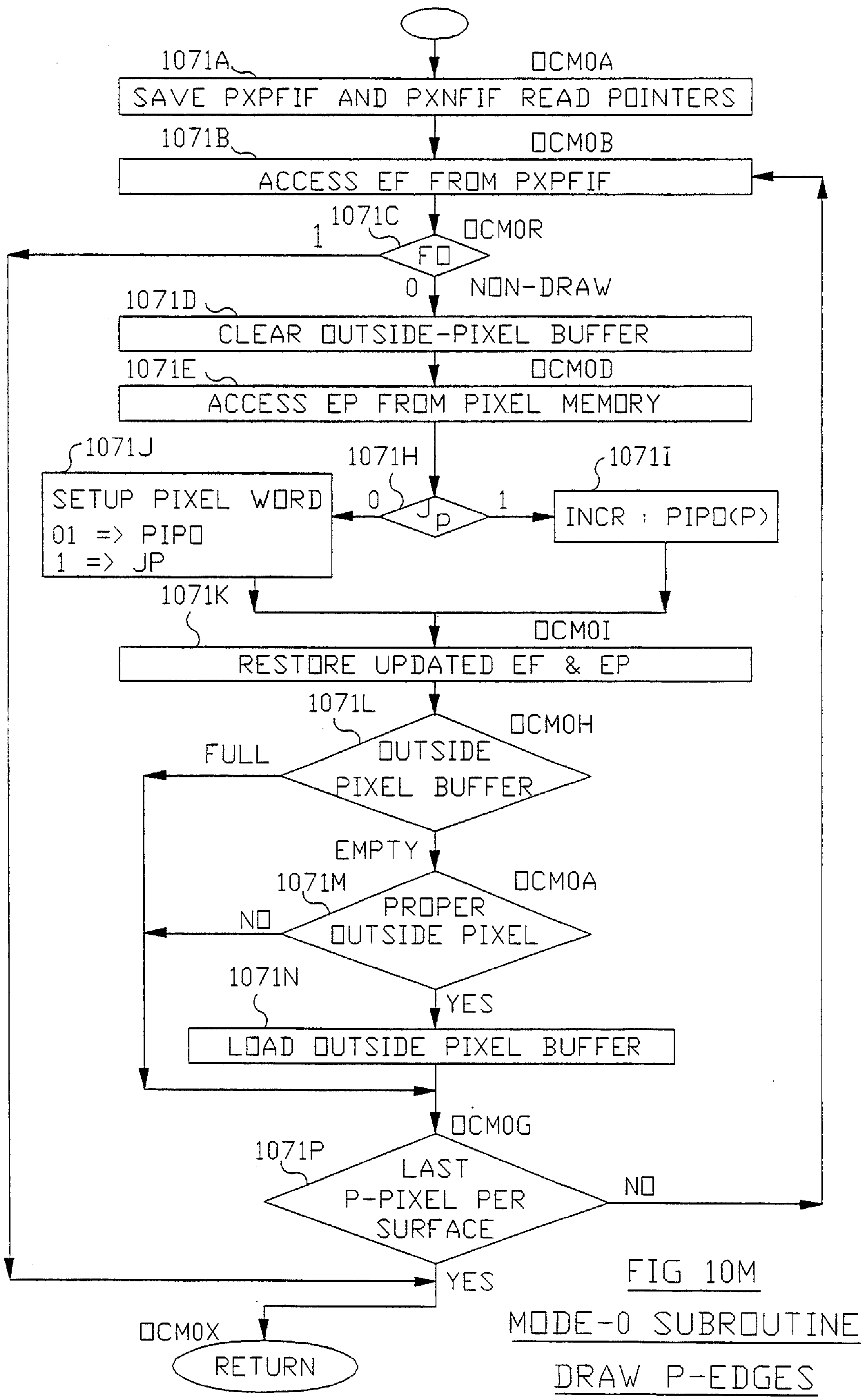

Mode-0 processing will now be discussed with reference to FIG. 10M for drawing P-edges into edge pixels of refresh memory. Operation proceeds to element 1071A to save the read pointers (start addresses) for the FIFOs, PXPFIF for the P-edge information and PXNFIF for the N-edge information. Operation then proceeds to element 1071B to access an edge pixel from P-edge FIFO PXPFIF. Operation then proceeds to element 1071C to test the non-draw flag F0. If the F0-flag is one-set, commanding a non-draw operation; operation proceeds along the '1' path, branching around Mode-0 processing for not drawing the surface. If the F0-flag is zero-set, commanding a draw operation; operation proceeds along the '0' path to element 1071D to clear the outside pixel buffer. The outside pixel buffer may be used to identify the first appropriate outside pixel that can be located for subsequent use in Mode-3 for filling inside pixels.

Operation proceeds to element 1071E to access a pixel from refresh memory corresponding to the edge pixel address accessed from the FIFO, where a P-flag is to be stored in the pixel word. Operation proceeds to element 1071H to test the Jp-flag for updating the P-flag P1P0. If the Jp-flag is zero-set, the P-flag had not as yet been set for this pixel; where operation proceeds along the '0' path to element 1071J to load a first P-flag condition into the pixel word and to one-set the Jp-flag for subsequent P-edges traversing this pixel. If the Jp-flag is one-set, it represents a previous P-edge traversing the same pixel; where the P-flag had previously been set. Therefore, the P-flag P1P0 is incremented in element 1071I.

After updating the P-flag in elements 1071I and 1071J, operation proceeds to element 1071K to restore the updated edge pixel words to the refresh memory and to the FIFO. Updated edge pixel information for the refresh memory involves the updated P-flag P1P0. Updated edge pixel information for the FIFO involves storing of pixel information read from the pixel word accessed from the refresh memory into the FIFO pixel block; such as shown in pixel words PXLB2 and PXLB3 in the Table Of Packed Words; which then corresponds with the information in the pixel word from refresh memory. Storage of this refresh memory pixel word information in the FIFO pixel word can reduce traffic to the refresh memory because some of the information needed for subsequent occulting processing is now available in the FIFO and therefore can be accessed from the FIFO in place of accessing from refresh memory.

Operation proceeds to element 1071L to test whether the outside pixel buffer is full or empty, as indicative of detection of a first appropriate outside pixel parameter. If empty, which may be indicative of the first edge pixel or near first edge pixel for the surface being processed prior to detection of a first appropriate outside pixel; operation proceeds along the EMPTY path to check the outside pixel for the present edge pixel for updating the outside pixel buffer. In element 1071M, the outside pixel is accessed and monitored for being an appropriate outside pixel. If it is not appropriate, operation proceeds along the NO path to branch around element 1071N. If it is appropriate, operation proceeds along the YES path to element 1071N to load the outside pixel information into the outside pixel buffer.

After outside buffer processing with elements 1071L to 1071N, operation proceeds to element 1071P to test the last pixel per surface flag. If it is not the last pixel for the surface, operation proceeds along the NO path to loop back to access the next edge pixel from the FIFO in element 1071B and to again iterate through elements 1071C to 1071P to process other P-edge pixels for this surface. If it is the last pixel for the surface, operation proceeds along the YES path to exit Mode-0 operations and to proceed to Mode-1 operations.

Mode-1 Processing

Figure 10N:
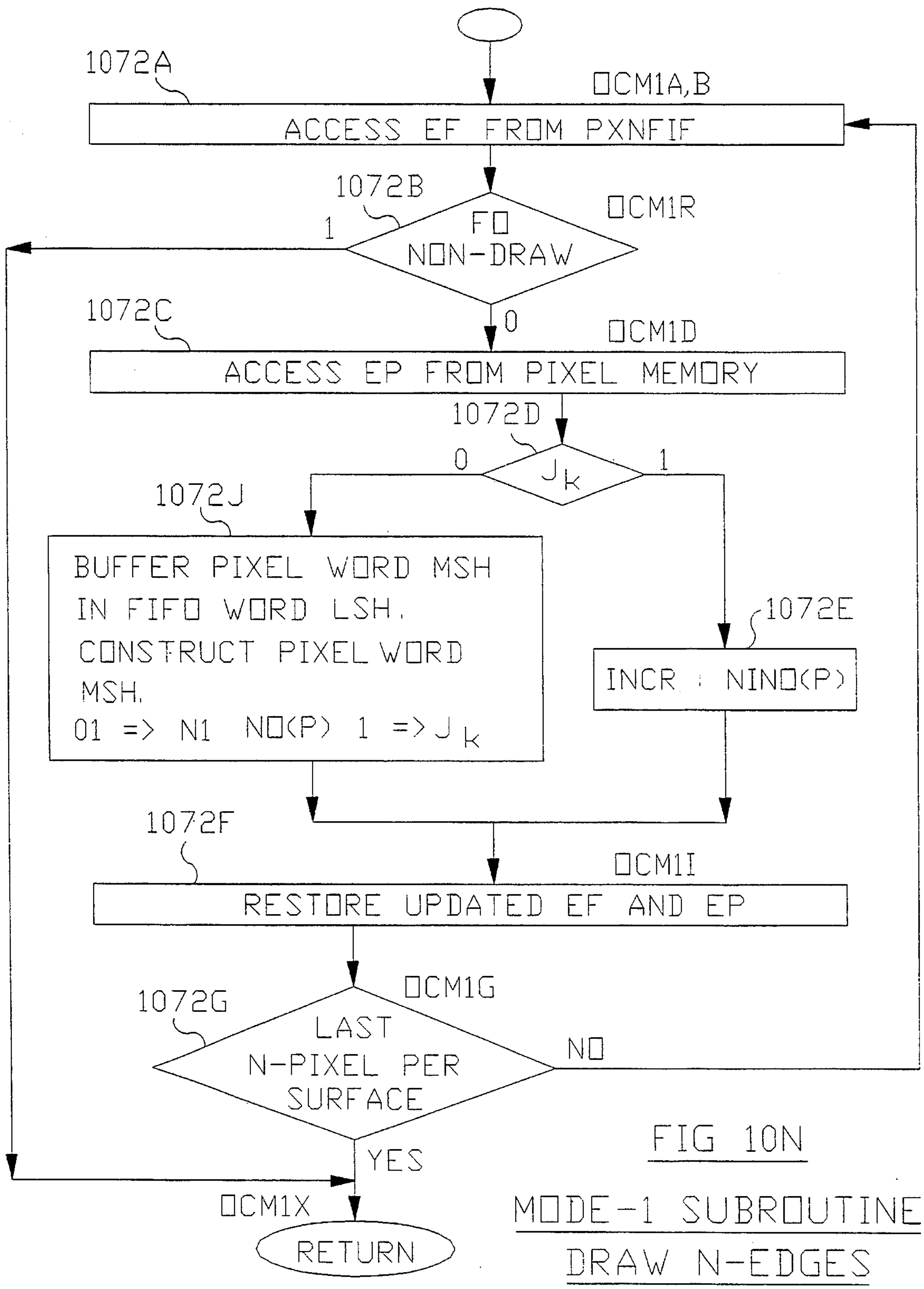

Mode-1 processing will now be discussed with reference to FIG. 10N for drawing N-edges into edge pixels of refresh memory. Operation proceeds to element 1072A to access an edge pixel from N-edge FIFO PXNFIF. Operation then proceeds to element 1072B to test the non-draw flag F0. If the F0-flag is one-set, commanding a non-draw operation; operation proceeds along the '1' path, branching around Mode-1 processing for not drawing the surface. If the F0-flag is zero-set, commanding a draw operation; operation proceeds along the '0' path to element 1072C to access a pixel from refresh memory corresponding to the edge pixel address accessed from the FIFO, where an N-flag is to be stored in the pixel word. Operation proceeds to element 1072D to test the Jk-flag for updating the N-flag N1N0. If the Jk-flag is zero-set, the N-flag had not as yet been set for this pixel; where operation proceeds along the '0' path to element 1072J to 10ad a first N-flag condition into the pixel word and to one-set the Jk-flag for subsequent N-edges traversing this pixel. If the Jk-flag is one-set, it represents a previous N-edge traversing the same pixel, where the N-flag had previously been set. Therefore, the N-flag N1N0 is incremented in element 1072E.

After updating the N-flag N1N0 in elements 1072J and 1072E, operation proceeds to element 1072F to restore the updated edge pixel words to the refresh memory and to the FIFO. Updated edge pixel information for the refresh memory involves the updated N-flag N1N0. Updated edge pixel information for the FIFO involves storing of pixel information read from the pixel word accessed from the refresh memory into the FIFO pixel block; such as shown in pixel words PXLB2 and PXLB3 in the Table Of Packed Words; which then corresponds with the information in the pixel word from refresh memory. As discussed for Mode-0 operations, storage of this refresh memory pixel word information in the FIFO pixel word can reduce traffic to the refresh memory because some of the information needed for subsequent occulting processing is now available in the FIFO and therefore can be accessed from the FIFO in place of accessing from refresh memory.

Operation proceeds to element 1072G to test the last pixel per surface flag. If it is not the last pixel for the surface, operation proceeds along the NO path to loop back to access the next edge pixel from the FIFO in element 1072A and to again iterate through elements 1072B to 1072G to process other N-edge pixels for this surface. If it is the last pixel for the surface, operation proceeds along the YES path to exit Mode-1 processing and to proceed to Mode-2 processing.

Mode-2 Processing

Figure 10O:
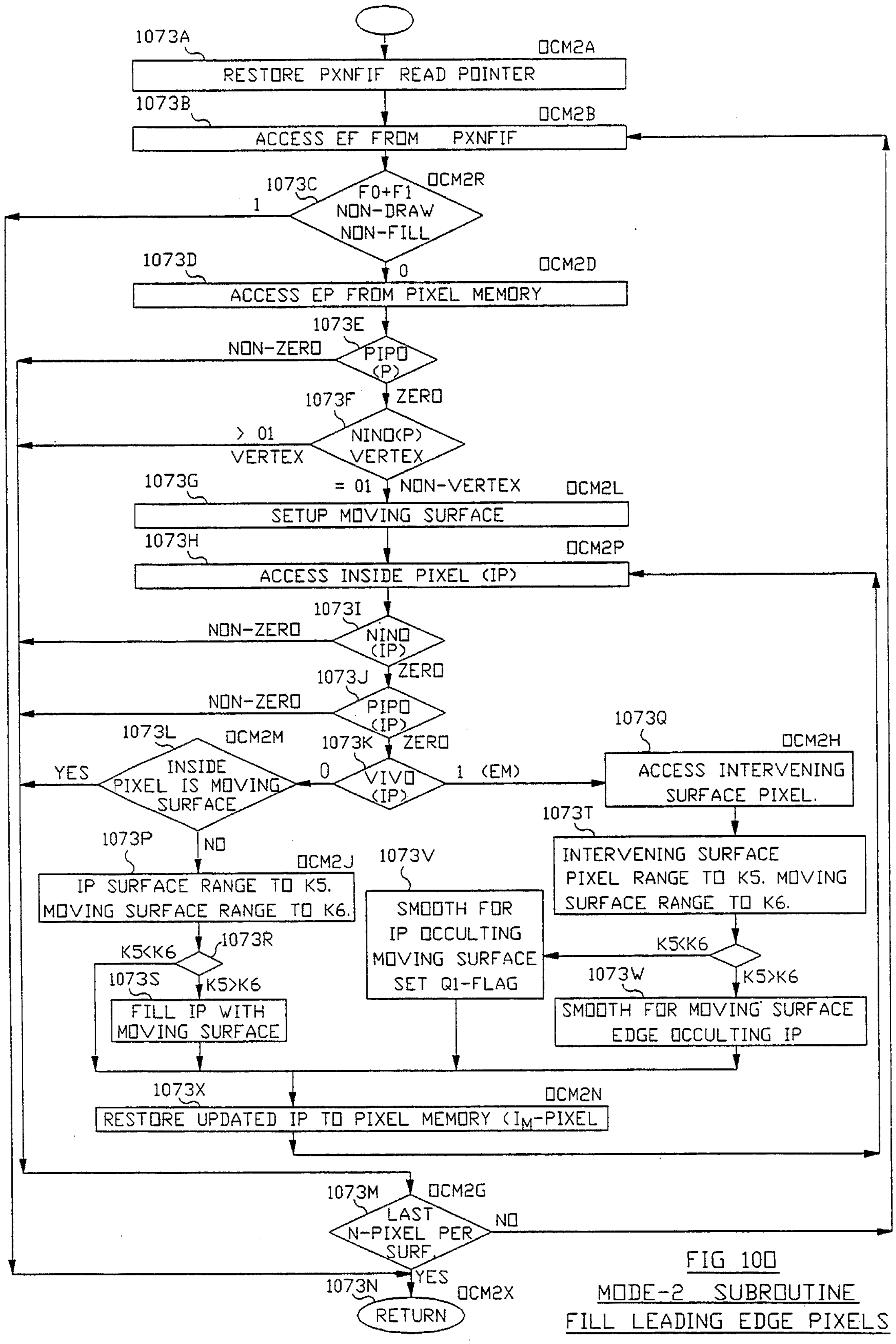

Mode-2 processing will now be discussed with reference to FIG. 10O for filling leading edge pixels along an N-edge. Operation proceeds to element 1073A to restore the read pointer for again accessing the N-edge FIFO. Operation then proceeds to element 1073B to access an edge pixel from N-edge FIFO PXNFIF. Operation then proceeds to element 1073C to test the non-draw flag F0 and the non-fill flag F1. If either the F0-flag or F1-flag is one-set, commanding a non-draw or a non-fill operation; operation proceeds along the '1' path, branching around Mode-2 processing for not filling the leading edge pixels. If both the F0-flag and F1-flags are zero-set, commanding a fill operation; operation proceeds along the '0' path to element 1073D to access a pixel from refresh memory corresponding to the edge pixel address accessed from the FIFO.

Operation proceeds to element 1073E to test for a P-flag contained in the N-edge pixel accessed from refresh memory. If a P-flag is detected, then the pixel is an intersection pixel containing both an N-edge and a P-edge and therefore does not need leading area pixel fill operations. Therefore, if a P-flag is detected in element 1073E, operation proceeds along the NON-ZERO path to branch past processing for that N-edge pixel, proceeding to element 1073M to test for the last pixel on the surface and to iterate back to complete processing for all other edge pixels on the surface. If the P-flag in the N-edge pixel accessed from refresh memory is zero, operation proceeds along the ZERO path to perform further leading area pixel processing. Operation proceeds to element 1073F to test for multiple N-edge flags in the N-edge pixel accessed from refresh memory. Such multiple N-flags in the refresh memory pixel indicates an N-edge vertex condition. If multiple N-flag counts are present, operation proceeds along the VERTEX path to branch past processing for the N-edge pixel, proceeding to element 1073M to test for the last pixel on the surface and to iterate back to complete processing for other edge pixels on the surface. If multiple N-flag counts are not present in the N-edge pixel accessed from refresh memory, operation proceeds along the NON-VERTEX path to element 1073G to set up the moving surface conditions for inside pixel processing.

Operation proceeds to elements 1073H through 1073X to iterate through a sequence of inside pixels in the leading area until the end of the leading area is detected in elements 1073I through 1073L, proceeding to element 1073M to test for the last pixel on the surface and to iterate back to complete processing for other edge pixels on the surface.

In element 1073H, the inside pixel is determined as being the next sequential inside pixel. If the first inside pixel for the N-edge pixel is being processed, it is the pixel inside of the N-edge pixel being processed. If an inside pixel for the N-edge pixel has already been processed, the next inside pixel is the pixel that is inside of the inside pixel that has already been processed. In this manner, elements 1073H to 1073X iteratively process a sequence of inside pixels progressing inside of the N-edge pixel being processed. Inside pixel identification is discussed in the section pertaining to inside and outside pixel determination herein, as discussed with reference to FIGS. 9H and 9I.

Operation proceeds to element 1073I to test for an N-flag in the inside pixel. An N-flag in the inside pixel is indicative of the end of the leading edge inside pixels to be filled, pertaining to the present N-edge pixel. If an N-flag is detected in the inside pixel, operation proceeds along the NON-ZERO path from element 1073I to branch past additional processing for inside pixels for that particular N-edge pixel, proceeding to element 1073M to test for the last pixel on the surface and to iterate back to complete processing for other edge pixels on the surface. If an N-edge is not detected in the inside pixel, operation proceeds along the ZERO path from element 1073I to element 1073J to test for a P-flag in the inside pixel. A P-flag in the inside pixel is indicative of the end of the leading edge pixels to be filled; pertaining to the present N-edge pixel and the start of the intersection between the N-surface and the P-surface. If a non-zero P-flag for the inside pixel is detected, operation proceeds along the NON-ZERO path to branch past further processing for the leading edge pixels pertaining to the present N-edge pixel, proceeding to element 1073M to test for the last pixel on the surface and to iterate back to complete processing for other edge pixels on the surface.

If the inside pixel does not have a P-flag, operation proceeds along the ZERO path to element 1073K to test for a V-flag in the inside pixel. A V-flag in the inside pixel is indicative of the need for re-smoothing of the inside pixel for the new condition of the leading edge pixels entering a visible edge pixel. If a V-flag is detected in element 1073K, operation proceeds along the '1' path to elements 1073Q through 1073W to re-smooth the V-edge inside pixel.

Operation proceeds to element 1073Q to access a surface pixel associated with the intervening V-edge pixel to determine the identification and color of this intervening surface for re-smoothing. Accessing of the intervening surface pixel can be performed by searching around the visible edge inside pixel to detect the surface having the visible edge. A range comparison is made between the surface having the visible edge and the moving surface being processed in elements 1073T to 1073W. Operation proceeds to element 1073T, where the range of the intervening visible surface is placed in register K5 and the range of the moving surface being processed is placed in register K6 for a range comparison. Operation proceeds to element 1073U to perform a range comparison. If the intervening visible surface is nearer than the moving surface being processed, operation proceeds to element 1073V to smooth the V-edge inside pixel for the condition of the intervening surface occulting the moving surface. The Q1-flag is set in element 1073V as indicative of this condition. If the moving surface being processed is nearer than the intervening surface having the visible edge in the inside pixel, operation proceeds to element 1073W from element 1073U to smooth the inside pixel for the condition of the moving surface occulting the visible surface in the inside pixel. After smoothing the inside pixel for a V-edge condition in elements 1073V and 1073W, operation proceeds to element 1073X to store the updated inside pixel into pixel memory and then to loop back to element 1073H to continue processing inside pixels.

If the inside pixel does not have a V-flag, as determined in element 1073K, operation proceeds along the '0' path to element 1073L to test whether the inside pixel is filled with the moving surface being processed. If the inside pixel is filled with the moving surface, then the leading area pixels for the present N-edge pixel being processed have already been filled, such as from occulting processing for other N-edge pixels; where operation proceeds from element 1073L along the YES path to branch past processing for the inside pixels for the present N-edge pixel, proceeding to element 1073M to test for the last pixel on the surface and to iterate back to complete processing for other edge pixels on the surface. If the inside pixel is not filled with the moving surface, operation proceeds along the NO path to element 1073P and a range comparison is made between the surface associated with the inside pixel and the moving surface being processed in elements 1073J to 1073S. Operation proceeds to element 1073J, where the range of the surface in the inside pixel is placed in register K5 and the range of the moving surface being processed is placed in register K6 for a range comparison. Operation proceeds to element 1073R to perform the range comparison. If the surface in the inside pixel is nearer than the moving surface being processed, operation proceeds to element 1073X, branching around filling of the inside pixel in element 1073S. If the moving surface being processed is nearer than the surface in the inside pixel, operation proceeds to element 1073S from element 1073R to fill the inside pixel with the moving surface as occulting the surface in the inside pixel. After filling the inside pixel in elements 1073R and 1073S, operation proceeds to element 1073X to store the updated inside pixel into pixel memory and then to loop back to element 1073H to continue processing inside pixels.

After leading edge pixel processing, operation proceeds to element 1073M to test the last pixel per surface flag. If it is not the last pixel for the surface, operation proceeds along the NO path to loop back to access the next edge pixel from the FIFO in element 1073B and to again iterate through elements 1073D to 1073X to process other leading edge pixels for this surface. If it is the last pixel for the surface, operation proceeds along the YES path to exit Mode-2 operations and to proceed to Mode-3 operations.

Mode-3 Processing

Figure 10P:
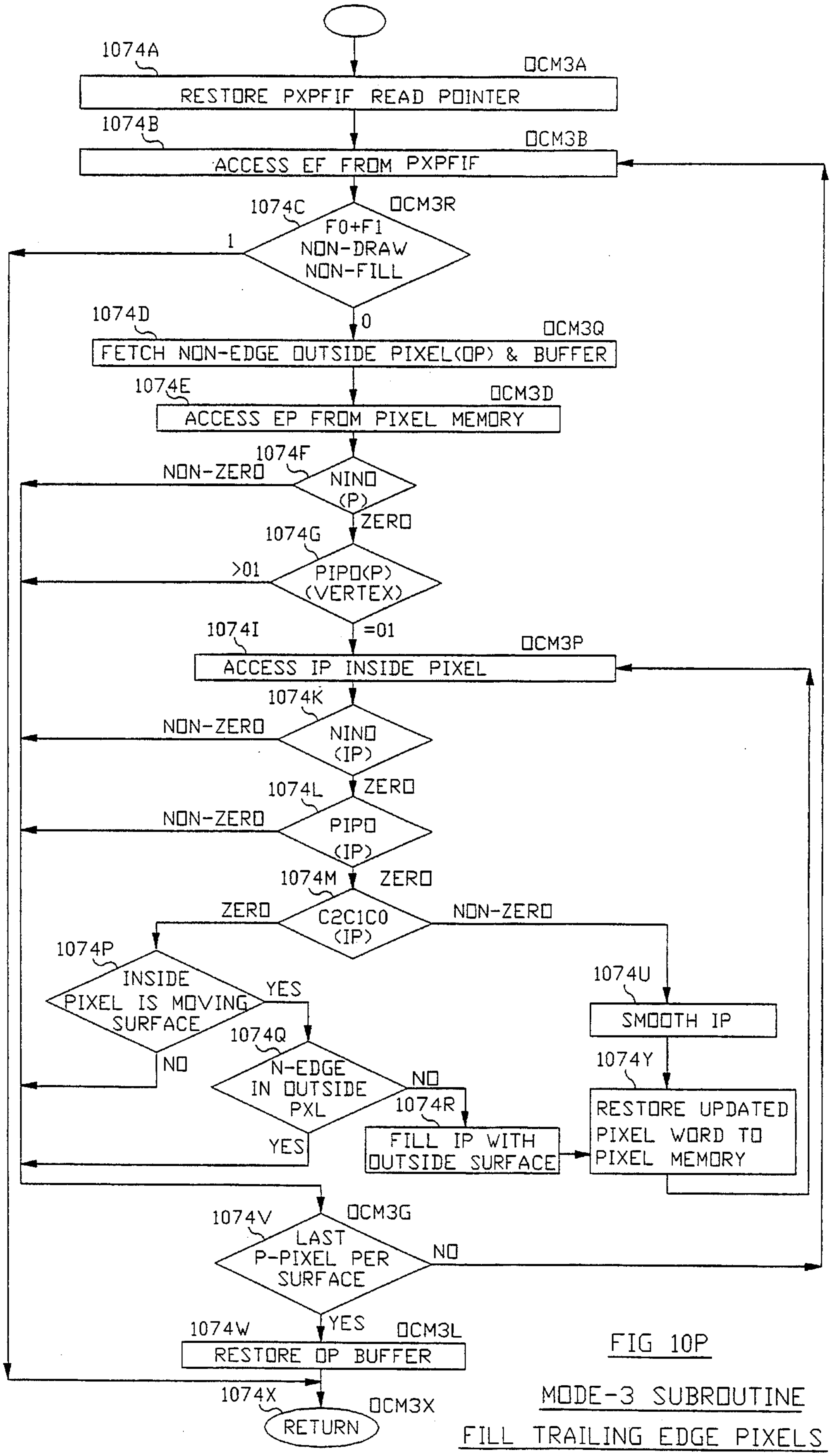

Mode-3 processing will now be discussed with reference to FIG. 10P for erasing trailing edge pixels along a P-edge. Operation proceeds to element 1074A to restore the read pointer for again accessing the P-edge FIFO. Operation then proceeds to element 1074B to access an edge pixel from P-edge FIFO PXPFIF. Operation then proceeds to element 1074C to test the non-draw flag F0 and the non-fill flag F1. If either the F0-flag or F1-flag is one-set, commanding a non-draw or a non-fill operation; operation proceeds along the '1' path, branching around Mode-3 processing for not erasing the trailing edge pixels. If both the F0-flag and F1-flags are zero-set, commanding trailing edge erase; operation proceeds along the '0' path to element 1074D to access an appropriate outside pixel. An appropriate outside pixel is an outside pixel that does not have a visible edge therein. Because the outside pixel is used for filling of the inside pixels being vacated by the prior area, an appropriate outside pixel having outside adjacent surface identification information is needed for filling inside pixels. An outside pixel having a visible edge flag being set contains smoothing information, not outside surface information, and therefore is inappropriate for filling of the inside pixels. If the immediate outside pixel is a visible edge pixel, then a search can be performed to locate an appropriate outside pixel. Alternately, as discussed herein, determination of a single appropriate outside pixel for an inside area not traversed by edges permits that inside area to be filled with the single outside pixel information.

Operation then proceeds to element 1074E to access a pixel from refresh memory corresponding to the edge pixel address accessed from the FIFO. Operation then proceeds to element 1074F to test for an N-flag contained in the P-edge pixel accessed from refresh memory. If an N-flag is detected, then the pixel is an intersection pixel containing both an N-edge and a P-edge and therefore does not need trailing area pixel erase operations. Therefore, if a P-flag is detected in element 1074F, operation proceeds along the NON-ZERO path to branch past processing for that P-edge pixel, proceeding to element 1074V to test for the last pixel on the surface and to iterate back to element 1074B to complete processing for other P-edge pixels on the surface. If the P-flag in the P-edge pixel accessed from refresh memory is zero, operation proceeds along the ZERO path to perform further trailing area pixel processing for the same P-edge pixel.

Operation proceeds to element 1074G to test for multiple P-edge flags in the P-edge pixel accessed from refresh memory. Such multiple P-flags in the refresh memory pixel indicates a P-edge vertex condition. If multiple P-flags are present in the pixel accessed from refresh memory, operation proceeds along the VERTEX path to branch past processing for the P-edge pixel, proceeding to element 1074V to test for the last pixel on the surface and to iterate back to complete processing for other P-edge pixels on the surface. If multiple P-edge flags are not present in the P-edge pixel accessed from refresh memory, operation proceeds along the NON-VERTEX path to elements 1074I through 1074Y to iterate through a sequence of inside pixels in the trailing area, related to the current P-edge pixel, until the end of the trailing area is detected in elements 1074K to 1074Q; then proceeding to element 1074V to test for the last pixel on the surface and to iterate back to complete processing for other edge pixels on the surface.

In element 1074I, the inside pixel is determined as being the next sequential inside pixel. If the first inside pixel for the edge pixel is being processed, the next sequential inside pixel is the pixel inside of the P-edge pixel being processed. If an inside pixel for the P-edge pixel has already been processed, the next sequential inside pixel is the pixel that is inside of the inside pixel that has already been processed. In this manner, elements 1074I to 1074Q iteratively process a sequence of inside pixels progressing inside of the current P-edge pixel. Inside pixel identification is discussed in the section pertaining to inside and outside pixel determination herein, as discussed with reference to FIGS. 9H and 9I.

Operation proceeds to element 1074K to test for an N-flag in the inside pixel. An N-flag in the inside pixel is indicative of the end of the trailing area inside pixels to be erased pertaining to the current P-edge pixel and the start of the intersection between the N-surface and the P-surface. If an N-flag is detected in the inside pixel, operation proceeds along the NON-ZERO path from element 1074K to branch past additional processing for inside pixels pertaining to the current P-edge pixel, proceeding to element 1074V to test for the last pixel on the surface and to iterate back to elements 1074B to complete processing for other P-edge pixels on the surface. If an N-flag is not detected in the inside pixel, operation proceeds along the ZERO path from element 1074K to element 1074L to test for a P-flag in the inside pixel. A P-flag in the inside pixel is indicative of the end of the trailing area pixels to be erased pertaining to the current P-edge pixel. If a P-flag is detected in the inside pixel, operation proceeds along the NON-ZERO path from element 1074L to branch past additional processing for inside pixels pertaining to the current P-edge pixel, proceeding to element 1074V to test for the last pixel on the surface and to iterate back to element 1074B to complete processing for other P-edge pixels on the surface.

If a P-flag is not detected in the inside pixel, Operation proceeds along the ZERO path to element 1074M to test for a C-flag in the inside pixel. A C-flag in the inside pixel is indicative of an edge traversing the trailing area. This edge may be a visible edge related to an occulting surface, defined by a V-flag in the same inside pixel, or may be a non-visible edge related an occulted surface, defined by the absence of a V-flag in the same inside pixel. A visible edge will remain visible after erasure of the trailing area. A non-visible edge may become visible after erasure of the trailing area or may remain non-visible after erasure of the trailing area. Whether the non-visible edge becomes visible after erasure of the trailing area can be determined by filling on an individual edge pixel bases, as discussed below. Alternately, such edge visibility can be determined by filling the areas on both sides of the edge; where the same surface being on both sides of the edge is indicative of a non-visible edge and different surfaces being on both sides of the edge is indicative of a visible edge.

Operation proceeds to element 1074M to test if the inside pixel has an edge, either visible or non-visible, contained therein. If the inside pixel does not have an edge contained therein, indicated by a zero C-flag; operation proceeds along the ZERO path to element 1074P to test if the inside pixel is filled by the moving surface, as being indicative of a trailing area pixel to be erased. If the inside pixel contains the moving surface, operation proceeds along the YES path from element 1074P to element 1074Q to determine if the inside pixel is within the intersection. If the inside pixel is not within the intersection, operation proceeds along the NO path to element 1074R to fill the inside pixel with the appropriate outside pixel, then to element 1074Y to restore the updated inside pixel word to pixel memory, and then to loop back to element 1074I for processing another inside pixel associated with the current P-edge pixel.

If the test in element 1074Q determines that the inside pixel is in the intersection, operation proceeds along the YES path to element 1074V as indicative of the last inside pixel associated with the current P-edge pixel to iterate back to element 1074B to complete processing for other P-edge pixels on the surface.

If the determination in element 1074P is that the inside pixel does not contain the moving surface, it is indicative of the inside pixel being filled with an occulting surface that occults the moving surface vacating that pixel and therefore also occults more remote surfaces that may be, in turn, occulted by the moving surface. Therefore, operation proceeds along the NO path from element 1074P to element 1074V to loop back to element 1074B to complete processing for other P-edge pixels on the same surface.

If a C-flag is detected in element 1074M, operation proceeds along the NON-ZERO path to element 1074T for smoothing of the edge in the inside pixel. In a configuration implementing smoothing, smoothing may be performed by detecting the surfaces adjacent to the inside pixel and weighting and mixing the colors related thereto. Operation then proceeds to element 1074Y to restore the updated smoothed inside pixel word to pixel memory and then to loop back to element 1074I for processing of the next inside pixel.

In an alternate configuration, occulting processing can be simplified by removing smoothing processing therefrom, where inside pixels having visible flags therethrough need not be processed with occulting processing but can have an edge related parameter, such as a-dark pixel color for a dark outline edge proceeding therethrough or alternately can have the visible surface associated with the visible edge filling the inside pixel.

After erasing the inside pixel in elements 1074U and 1074R, operation proceeds to element 1074Y to store the updated inside pixel into pixel memory and then to loop back to element 1074I to continue processing inside pixels.

After trailing edge pixel processing for the current P-edge pixel is completed, operation proceeds to element 1074V to test the last pixel on the surface flag. If it is not the last pixel on the surface, operation proceeds along the NO path to loop back to access the next edge pixel from the FIFO in element 1074B and to again iterate through elements 1074C et seq to process other P-edge pixels for this surface. If it is the last pixel on the surface, operation proceeds along the YES path to exit Mode-3 operations and to proceed to Mode-4 operations.

Mode-4 Processing

Figure 10Q:
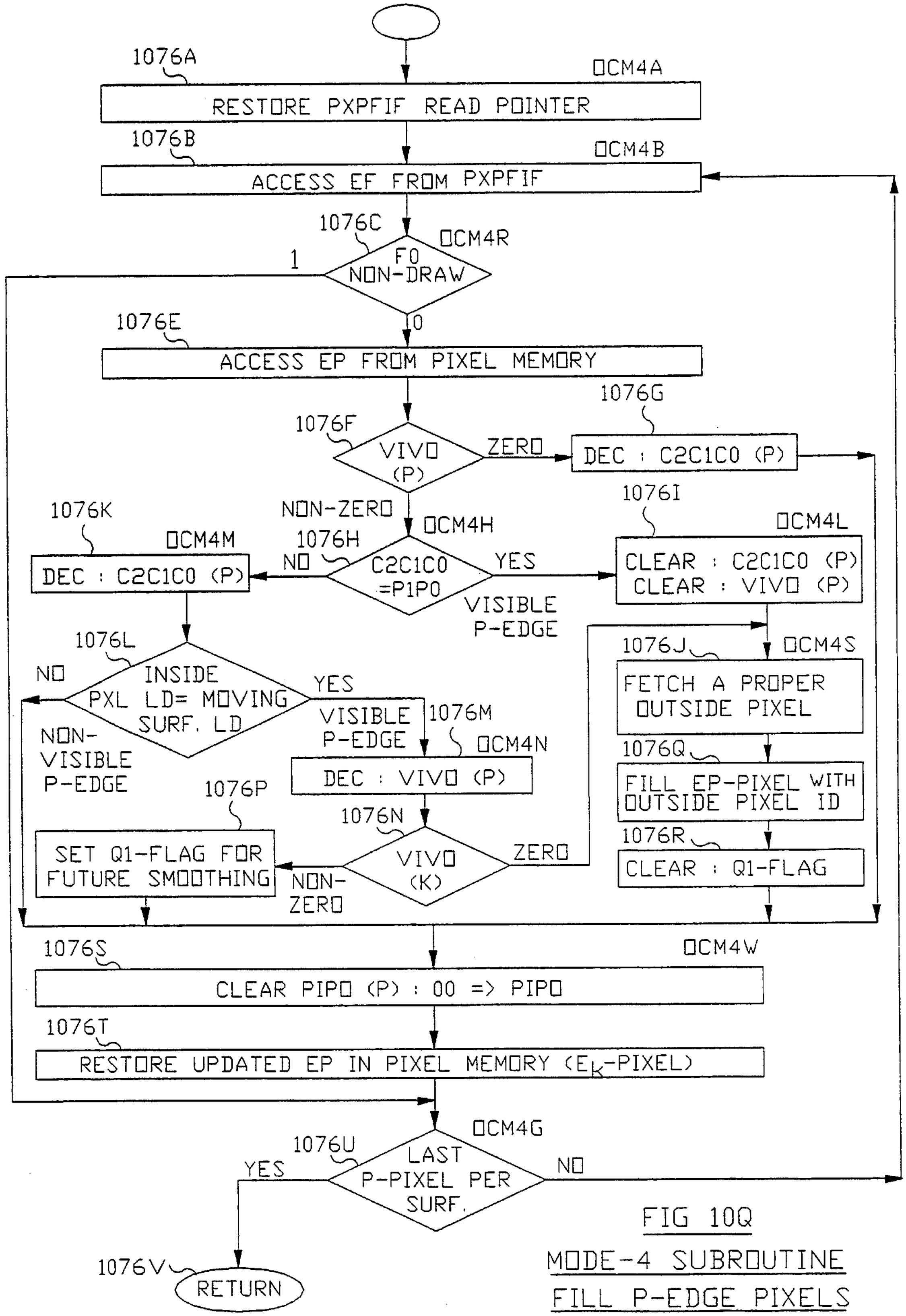

Mode-4 processing will now be discussed with reference to FIG. 10Q for erasing P-edge pixels. Operation proceeds to element 1076A to restore the read pointer for again accessing the P-edge FIFO. Operation then proceeds to element 1076B to access an edge pixel from P-edge FIFO PXPFIF. Operation then proceeds to element 1076C to test the non-draw flag F0. If the F0-flag is one-set, commanding a non-draw operation; operation proceeds along the '1' path, branching around Mode-4 processing for not drawing the surface. If the F0-flag is zero-set, commanding a draw operation; operation proceeds along the '0' path to element 1076E to access a pixel from refresh memory corresponding to the edge pixel address accessed from the FIFO. Operation proceeds to element 1076F to test for a visible edge flag in the P-edge pixel accessed from refresh memory. A visible P-edge will have a V-flag which was set in a previous update of the edge. Therefore, a zero V-flag in a P-edge pixel is indicative of an occulted P.-edge pixel. If the V-flag is zero, operation proceeds along the ZERO path from element 1076F to element 1076G, indicative of an occulted P-edge pixel. In element 1076G, the C-flag is decremented, indicative of a C-edge passing out of the P-edge pixel, and the V-flag is not decremented because it has been determined to be zero in element 1076F. Operation then proceeds to elements 1076S through 1076U to complete Mode-4 processing for the present P-edge pixel.

if the test of the V-flag in element 1076F shows that a V-flag is present, operation proceeds along the NON-ZERO path to element 1076H to determine if the visible edge is associated with the moving surface being processed. A check is made in element 1076H to determine if the number of C-edges is equal to the number of P-edges in the N-edge pixel being processed. If the number of C-edges is equal to the number of P-edges, then the V-edge is associated with the moving surface being processed; where operation proceeds along the YES path from element 1076H to element 1076L to clear the C-flags and the V-flags; which is appropriate because the C-flags and V-flags pertain only to the P-edge being processed, as determined in element 1076H, and the P-edge being processed is being erased from the edge pixel in Mode-4. Operation then proceeds to element 1076J to fetch an appropriate outside pixel, to element 1076Q to fill the P-edge pixel with the appropriate outside pixel information, and to element 1076R to clear the Q1-flag for the P-edge pixel. This is because the P-edge erasure causes filling of the P-edge pixel with adjacent outside surface information, where the adjacent outside surface is being exposed by erasure of the trailing edge of the P-surface. Fetching of an appropriate outside pixel can be performed with outside pixel processing, as discussed with reference to FIGS. H and I. If the adjacent outside pixel is an edge pixel, then an outside pixel scan can be performed to select an appropriate outside pixel. Operation then proceeds to elements 1076S through 1076U to complete Mode-4 processing for the present P-edge pixel.

In element 1076H, if the C-flags are not equal to the P-flags for the current P-edge pixel, then there are additional edges traversing the P-edge pixel. which may be visible or non-visible edges having both C-flags and V-flags or which may be non-visible edges having only C-flags. If the number of C-edges is not equal to the number of P-edges, operation proceeds along the NO path from element 1076H to element 1076K to decrement the C-flag, indicative of the P-edge passing out of the pixel. Operation then proceeds to element 1076L to test the inside pixel. If the inside pixel is not filled by the moving surface being processed, then the V-edge detected in element 1076F does not belong to the P-edge of the moving surface being processed, but belongs to an occulting surface; where operation proceeds along the NO path from element 1076L to bypass subsequent trailing area processing in elements 1076M to 1076R. Operation then proceeds to elements 1076S through 1076O to complete Mode-4 processing for the present P-edge pixel.

If the inside pixel is filled with the moving surface, as determined in element 1076L; then the V-edge in the P-edge pixel being processed represents a visible edge for the moving surface; where operation proceeds along the YES path to element 1076M for processing of this visible P-edge. In element 1076M, the V-flag is decremented, indicative of the visible P-edge passing out of the pixel. Operation proceeds to element 1076N to test for a zero V-flag. If the V-flag is non-zero, operation proceeds along the NON-ZERO path from element 1076N to set the Q1-flag for smoothing of a V-edge remaining in the pixel after the P-edge has been erased; indicative of multiple visible edges traversing that P-edge pixel. Operation then proceeds to elements 1076S through 1076U to complete Mode-4 processing for the present P-edge pixel.

If the V-flag is zero after erasing the visible P-edge in element 1076M, as determined in element 1076N; operation proceeds along the ZERO path to element 1076J to fetch an appropriate outside pixel, to element 1076Q to fill the P-edge pixel with the appropriate outside pixel information, and to element 1076R to clear the Q1-flag for the P-edge pixel. This is because the P-edge erasure causes filling of the P-edge pixel with adjacent outside surface information, where the adjacent outside surface is being exposed by erasure of the trailing edge of the P-surface. Fetching of an appropriate outside pixel can be performed with outside pixel processing as discussed with reference to FIGS. H and I. If the adjacent outside pixel is an edge pixel, then an outside pixel scan can be performed to select an appropriate outside pixel. Operation then proceeds to elements 1076S through 1076O to complete Mode-4 processing for the present P-edge pixel.

After erasing of the V-flags and C-flags for the P-edge from the P-edge pixel, operation proceeds to element 1076S to clear the P-flag from the P-edge pixel and to element 1076T to restore the updated edge pixel having the P-edge erased therefrom into pixel memory.

Operation then proceeds to element l©76U-to test for the last pixel per surface flag. If it is not the last pixel on the surface, operation proceeds along the NO path to loop back to access another edge pixel from the FIFO in element 1076B and to again iterate through elements 1076C to 1076T to process other P-edge pixels for this surface. If it is the last pixel for the surface, operation proceeds along the YES path to exit Mode-4 operations and to proceed to Mode-5 operations.

Mode-5 Processing

Figure 10R:
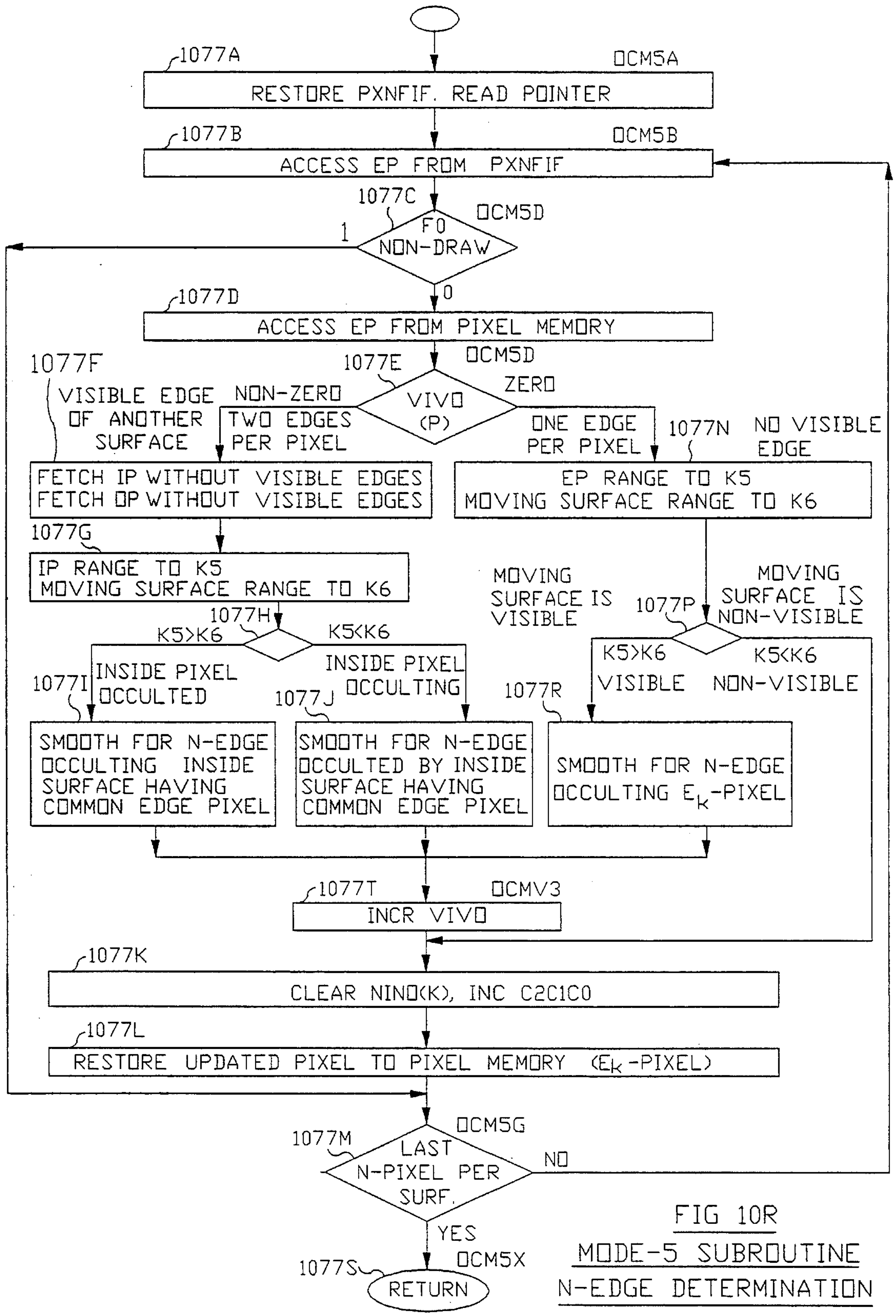

Mode-5 processing will now be discussed with reference to FIG. 10R for generating N-edge pixels. Operation proceeds to element 1077A to restore the read pointer for again accessing the P-edge FIFO. Operation then proceeds to element 1077B to access an edge pixel from P-edge FIFO PXNFIF. Operation then proceeds to element 1076C to test the non-draw flag F0. If the F0-flag is one-set, commanding a non-draw operation; operation proceeds along the '1' path, branching around Mode-5 processing for not drawing the surface. If the F0-flag is zero-set, commanding a draw operation; Operation proceeds along the '0' path to element 1077D to access a pixel from refresh memory corresponding to the edge pixel address accessed from the FIFO.

Operation proceeds to element 1077E to test for a visible edge flag in the N-edge pixel accessed from refresh memory. A visible N-edge defines a visible edge of another surface in the N-edge pixel. If the V-flag is not set in element 1077E, operation proceeds along the ZERO path to element 1077N to smooth for a single edge, the edge of the current N-surface, in the pixel. A range comparison is made between the surface in the pixel accessed from refresh memory and the moving surface being processed in elements 1077N and 1077P. In element 1077N, the range of the pixel from refresh memory is placed in register K5 and the range of the moving surface being processed is placed in register K6 for a range comparison. Operation proceeds to element 1077P to perform a range comparison. If the range of the pixel accessed from refresh memory is less than the range of the moving surface, the edge of the moving surface is occulted; where operation proceeds along NON-VISIBLE path to bypass smoothing processing associated with a visible moving surface edge pixel and to bypass incrementing of the V-flag in element 1077T because the edge of the moving surface is non-visible. If the range of the pixel accessed from refresh memory is greater than the range of the moving surface, the edge of the moving surface is occulting; where operation proceeds along the VISIBLE path to element 1077R to smooth for the N-edge occulting the current pixel. Operation then proceeds to elements 1077T to 1077M to increment the V-flag, increment the C-flag, clear the N-flags, restore the updated pixels to pixel memory, and to loop back for processing of additional N-edge pixels; as discussed in more detail below.

If a V-flag is detected in element 1077E, it is indicative of two edges traversing the same pixel, an edge of another surface currently in pixel memory and the N-edge of the moving surface being processed. In a configuration implemented for smoothing of multiple edges in a single pixel, the two surfaces separated by the existing edge and the moving surface can be smoothed together in various ways; such as with a fixed weighting of ⅓ for each color, or with the weight that was determined for the moving surface weighting of the moving surface color and the previously smoothed color stored in the pixel, or with various other smoothing arrangements. In the configuration shown in FIG. 10R, operation proceeds to element 1077F to smooth for the three surfaces. In element 1077F, the color of a first surface is determined by fetching an appropriate inside pixel and the color of a second surface is determined by fetching an appropriate outside pixel for the N-edge pixel; where the appropriate inside pixel and outside pixel are pixels that do not have visible edges contained therein. As discussed herein, visible edge pixels contain a smoothed color in place of a surface color or surface identification, where pixels are needed for the present smoothing that do not have the edges contained therein. If a V-edge pixel is detected, an alternate appropriate pixel can be identified; as discussed herein, such as with a scan operation.

Operation then proceeds to element 1077G, where the range of the inside pixel is placed in register K5 and the range of the moving surface being processed is placed in register K6 for a range comparison. Operation proceeds to element 1077H to perform a range comparison. If the range of the inside pixel is less than the range of the moving surface, the inside pixel is an occulting pixel that occults the moving surface. Operation proceeds along the path INSIDE PIXEL OCCULTING to element 1077J to smooth for the N-edge occulted by the inside surface having a common edge pixel. If the range of the inside pixel is greater than the range of the moving surface, the moving surface is an occulting pixel that occults the surface in the inside pixel. Operation proceeds along the path INSIDE PIXEL OCCULTED to element 1077I to smooth for the N-edge occulting the inside surface having a common edge pixel.

Smoothing is discussed in detail with reference to FIG. 11. However, as discussed above; edge smoothing need not be implemented, where an edge can be filled with a color representative of a line, or with a color of one of the adjacent surfaces, or otherwise. In a configuration providing smoothing for a single edge traversing a pixel, the two representative surfaces of that edge can be smoothed in accordance with the weight associated with the N-edge pixel. In a configuration providing smoothing for multiple edges traversing a pixel; the various surfaces associated with the edges can be identified, such as with scan operations, and the pixel color can be smoothed by weighting and mixing of the surface colors. One weighting approach is to smooth the moving surface color with the already smoothed color in the edge pixel; providing a weighted mixing of the colors of all surfaces. Alternately, an arrangement is provided herein for smoothing of an unknown edge, where the N-edge can be smoothed in accordance therewith.

Approximation approaches for smoothing are appropriate because smoothing is an approximation method that provides better spacial resolution than inherently available in the display monitor and because smoothing is a transitionary condition for an edge of a moving surface that will be continually re-derived, typically on a frame-to-frame basis as the moving surface progresses through the pixel and from pixel-to-pixel. Consequently, approximations made with smoothing typically do not have accumulative errors, where smoothing is re-derived for each new frame having surface motion.

After smoothing of the N-edge in elements 1077I, 1077J, and 1077R; operation proceeds to element 1077T to increment the V-flag, as indicative of a visible edge of the moving surface traversing that pixel. If the moving surface is moving with subpixel motion and has previously moved into that pixel, there will not be an accumulation of N-edges in that pixel because the previous position of the moving surface edge in that pixel is identified with a P-edge of the moving surface, where P-edge processing in Mode-4 erases the V-edge of the current moving surface that had been drawn into refresh memory on a previous frame. The V-flag is not incremented for a non-visible moving surface proceeding along the NON-VISIBLE path from element 1077P because the increment V-flag operation in element 1077T is bypassed thereby.

Operation proceeds to element 1077K to clear the N-flags in the N-edge pixel, as indicative of the completion of leading area fill operations for that moving surface, and to increment the C-flag for this N-edge pixel, including a non-visible N-edge pixel following the NON-VISIBLE path from element 1077P, as being indicative of an edge traversing the pixel independent of whether that edge is visible or non-visible.

Operation proceeds to element 1077L to restore the updated smoothed pixel to refresh memory and then to proceed with the processing of other N-edge pixels for the current N-surface. Operation proceeds to element 1077M to test the last pixel per surface flag. If the last pixel per surface flag is not set, operation proceeds along the NO path to loop back to element 1077B for processing of additional N-edge pixels for the moving surface. If the last pixel per surface is set, operation proceeds along the YES path from element 1077M as indicative of completion of occulting processing for the current moving surface; returning to the executive processor for additional processing assignments.

Fill Processing

Fill processing can include a configuration for filling a surface inbetween edges. For example, a closed surface bounded by edges of the surface can be filled with a fill processor; an aperture composed of edges of different surfaces can be filled with a fill processor; areas encompassed by edge motion, such as the area bounded by a prior-pixel edge and a next-pixel edge, can be filled with a fill processor; and other images can be filled with fill processing. Such fill processing can include an arrangement for determining a pixel word for filling and then filling the pixels in the surface with that pixel word.

Simplified fill processing may be used for small areas, such as a single pixel area between a next-edge and a prior-edge due to subpixel or pixel motion. For example, such pixels are adjacent to the edge and therefore are identified in pixel addresses adjacent to the edge pixel addresses. Larger areas can be filled with a scan processor arrangement. A scan processor (FIG. 12A) can start at a pixel address 1210 identified as being within the surface 1211, such as identified with an aperture processor, and can proceed to scan the surface 1213 between bounding edges. A scan can be a raster scan, a Palmer scan, or other scan. One scan may sequentially increment the X address and fill pixels addressed thereby 1214 until an edge pixel 1215 is detected, such as by detection of an edge flag in the pixel word. When an edge pixel is detected, the pixel address can be incremented in Y 1216 to change to the next scan line 1217 and the X address can then be sequentially decremented to access adjacent pixels along that scan line 1217 in the reverse direction for filling. In this manner, a surface can be scanned line-by-line until a vertex or bounding edge 1218 is detected, which limits Y incrementing.

A reverse scan may be provided to fill the remaining portions of a surface, such as by restarting at start pixel 1210 and scanning in a direction. This can be accomplished by starting with decrementing the X-address 1219 and decrementing the Y-address 1220 when an edge is detected at the end of a scan line 1219 in reverse of the above described scan 1214–1217.

The side of an edge inside of a surface can be defined in various ways, including use of edge processor 131, occulting processor 132, and aperture processor 134. The inside side of an edge can be defined during edge generation as the area enclosed by the surface. Also, inside sides of edges can be defined by flags associated with database-resident polygons, such as implicit in the direction of the bounding edges around the surface (i.e, clockwise or counterclockwise).

The aperture arrangement can be used to establish inside and outside pixels for a surface. Pixels may be selected for processing with the aperture arrangement to be selected for processing with the aperture arrangement to determine if they are inside or outside of the surface. For example, a pixel may be selected on one side of an edge, or on both sides of an edge, or on selected sides of different edges for processing with aperture processor 134. Aperture processor 134 explicitly determines whether a particular pixel is bounded by the processed edges and hence outside the surface.

Occulting processing involves filling of leading area pixels and erasing of trailing area pixels. Scanning of leading area and trailing area pixels can aid in filling and erasing operations. One scan processing arrangement will now be discussed with reference to FIG. 12. A triangular surface having edges 1211 and vertices 1218 can be scanned to evaluate pixels contained therein. A startpoint 1210 can be selected and a scan can be initiated therefrom, such as in the positive X direction 1214. The scan can proceed until an edge 1211 is detected, resulting in incrementing up to the next scan line 1216 and scanning in the reverse direction along scan line 1217. This horizontal scan can proceed with other scan lines 1213 until a vertex 1218 is detected. When a terminating vertex 1218 is detected, scanning operation can return to the startpoint pixel 1210 and scanning can be initiated in the reverse direction (negative X-direction) 1219. The scan can proceed until an edge is detected, resulting in incrementing down to the next scan line and scanning in the reverse direction along the next scan line. This horizontal scan can proceed with other scan lines until a vertex is detected. When a second terminating vertex is detected, scanning operation can be terminated.

A horizontal scan, for example, in the positive X-direction can be performed by incrementing the X-address of the present pixel to arrive at the address of the adjacent pixel in the plus X-direction therefrom. A vertical increment to another horizontal scan line can be performed by the unknown edge follower operation, discussed with reference to the Unknown Edge Logic Table and the Smoothing Of Unknown Edge Table herein, to follow the edge one pixel in the vertical direction and then to initiate a horizontal scan in the negative X-direction by decrementing the X-address of the present pixel to arrive at the address of the adjacent pixel in the minus X-direction.

A vertical scan, for example, in the positive Y-direction can be performed by incrementing the Y-address of the present pixel to arrive at the address of the adjacent pixel in the plus Y-direction therefrom. A horizontal increment to another vertical scan line can be performed by the unknown edge follower operation, discussed with reference to the abovereferenced unknown edge tables, to follow the edge one pixel in the horizontal direction and then to initiate a vertical scan in the negative Y-direction by decrementing the Y-address of the present pixel to arrive at the address of the adjacent pixel in the minus Y-direction.

Edges can be detected by testing of flags contained in pixel words, such as for detection of a C-edge, V-edge, N-edge, or P-edge.

The above described linear scan can be implemented in non-linear form, such as in spiral form by tracing the edges around the periphery, by processing the inside pixels adjacent to the traced edge pixels, and by then spiraling in to the center of the surface by similarly following the inside pixels that have been processed in increasingly smaller spirals. This arrangement is illustrated in detail in the Tables Of Computer Listings, Spiral Fill Processor. These listings are illustrative of the spiral processor and provide extensive supplemental details, such as in the annotations in the left hand columns and the details of the assembly language code in the middle column.

Inside and Outside Determinations

Determination of the inside and the outside of an element such as a surface, has many applications, such as for a visual system application in the occulting processor as discussed herein. One configuration of inside and outside processing will be discussed herein with reference to FIGS. 9H and 9I as representative of other forms of inside and outside processing and other applications thereof.

One geometric processing arrangement discussed herein uses vectors to represent edges of closed surfaces. It may be desireable to identify which direction to move relative to a point on the vector to reach a position inside-of the surface and outside of the surface. For a display configuration, an edge processor can generate addresses of the edge pixels, where it is desireable to determine the addresses of an inside pixel and an outside pixel.

For simplicity of implementation for a configuration discussed herein, the sequence of edge vectors around a surface are defined as having a sequence representative of clockwise motion around that surface. Alternately., a sequence having counterclockwise motion around a surface or other sequential or non-sequential edge representations can be derived from the teachings herein.

For one display configuration discussed herein, a clockwise peripheral surface motion is shown represented in quadrant form in FIG. 9H. The four quadrants Q1 to Q4 are shown in a rectilinear coordinate system. Edge vectors in each of the four quadrants are shown, with the vector direction for that quadrant represented by the sign bits, XNS for the sign of the X-component and YNS for the sign of the Y-component of the vector. A 'zero' sign bit is representative of a positive component and a 'one' sign bit is representative of a negative component. The clockwise peripheral motion rule establishes that, as the surface periphery is traversed in the direction of the edge vectors, the inside of the surface will be to the right and the outside of the surface will be to the left. Therefore, looking along each of the four vectors shown in FIG. 9H from the origin (0,0) towards the vector endpoint; the inside of the surface is to the right, shown by the arrow identified with an 'I' and the outside of the surface is to the left, shown by the arrow identified with an 'O'.

Figure 9I:
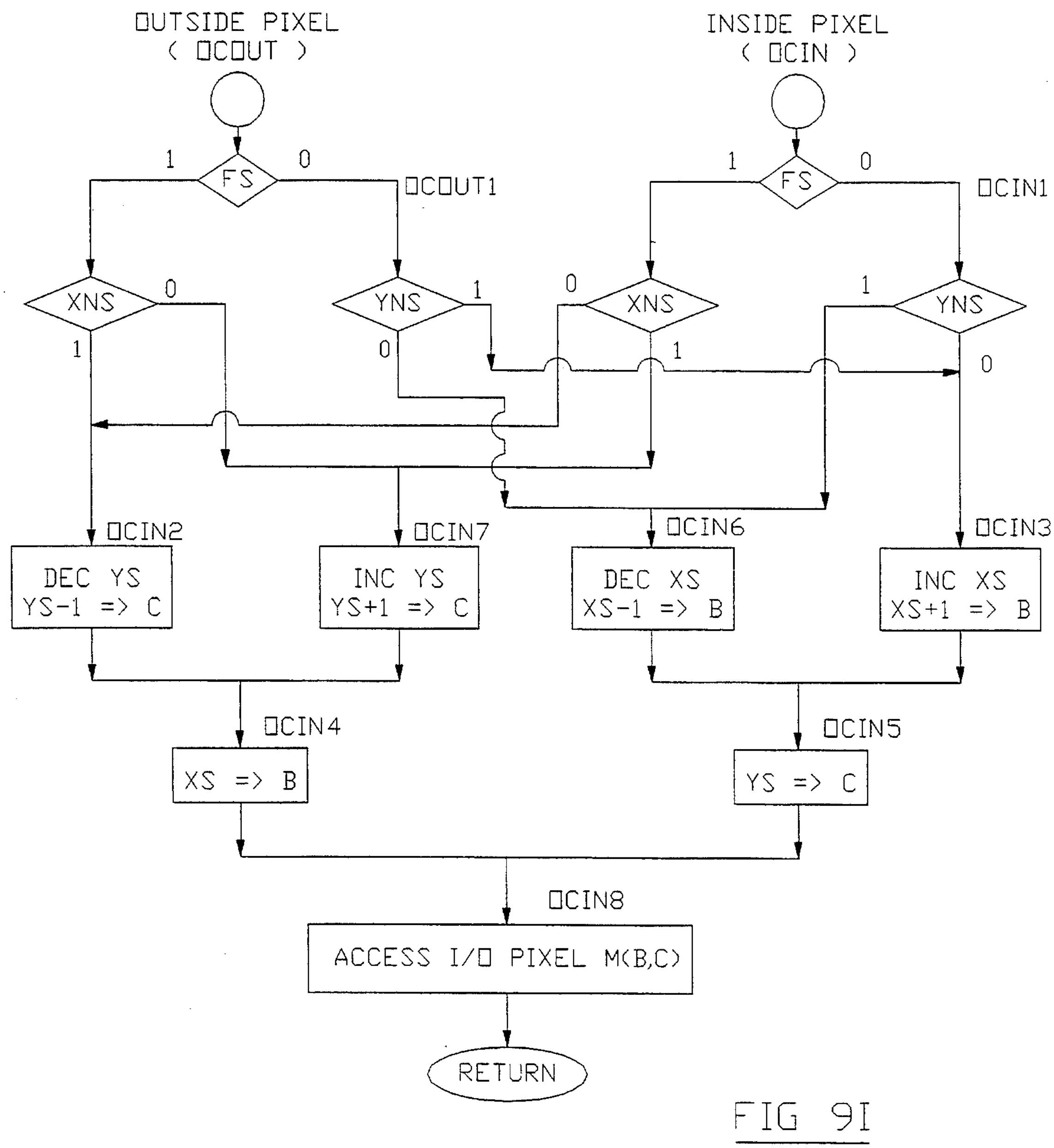

A tabular representation of an inside and outside determination consistent with the vector definition shown in FIG. 9H and the flow diagram and state diagram representation shown in FIG. 9I will now be discussed with reference to the Inside/Outside Location Table shown in truth table form. The input columns of the truth table are the vector direction sign bits YNS and XNS; identifying the edge vector directions; and the slope bit FS; identifying the slope being equal to, less than, or greater than 45°. These conditions may be derived for use by edge processor 131. One method of deriving these input signals is provided in the program listing filed with the Disclosure Document No. 110,457 filed on Aug. 17, 1982 and in disclosure documents filed subsequent thereto referenced herein in the routine entitled EGEN1 therein particularly at page 112 therein and identified symbolically with the terms YNS, XNS, and FS in the list of annotations therein. A P number is assigned to each of the three inputs, representing the binary numerical value of the 3 inputs, and a quadrant is assigned to each of the three inputs, derived from the information shown in FIG. 9H. The output columns of the truth table identify whether the X-pixel coordinate or the Y-pixel coordinate should be changed to address the inside or outside pixel and whether the selected coordinate should be incremented or decremented to address the inside or outside pixel. A flow diagram or state diagram for implementing the processing shown in the inside/Outside Location Table is shown in FIG. 9I and is discussed in detail below. A program listing implementing FIG. 9I is set forth in Disclosure Document No. 110,457 filed on Aug. 17, 1982 at pages 111–112 therein and in subsequent disclosure documents as subroutines identified as OCIN and OCOUT for determining the outside pixel location. Operation of these subroutines for occulting processing is set forth therein. It should be noted that the inside and outside pixel location determinations are similar to each other, where the difference is in the sign of the change to the edge pixel address. For example, for the PO term, the X-coordinate of the edge pixel is incremented for the inside pixel location and the X-coordinate of the edge pixel is decremented for the outside pixel. This can be observed in FIG. 9H, where the outside pixel direction is shown as the opposite direction of the inside pixel direction.

The flow diagram and state diagram shown in FIG. 9I will now be discussed. As discussed above, the inside pixel logic is similar to the outside pixel logic except that incrementing and decrementing of the selected coordinates are reversed for inside and outside pixel locations. Therefore, the inside pixel logic will be discussed as being representative of both the inside and outside pixel logic. Mneumonic representations shown in FIG. 9I are mneumonics used in said program listing.

Operation commences by entering the logic tree at OCIN and testing the FS bit condition. If the FS-bit is 'zero', indicative of the slope being equal to or greater than 45°, operation branches along the 'zero' path to OCIN1 to test the YNS condition to determine whether to increment or decrement the X-coordinate. If the YNS condition is 'zero', representative of a positive vector Y-component, operation branches along the 'zero' path to OCIN3 to increment the X-coordinate of the edge pixel to arrive at the inside pixel. If the YNS condition is 'one', representative of a negative vector Y-component, operation branches along the 'one' path to OCIN6 to decrement the X-coordinate of the edge pixel to arrive at the inside pixel. The incremented or decremented X-coordinate of the edge pixel can be combined with the Y-coordinate of the edge pixel in OCIN5, which can be used as the pixel address to access the inside pixel in operation OCIN8.

If the FS bit is 'one', indicative of the slope being less than 45°, operation branches along the 'one' path to test the YNS condition to determine whether to increment or decrement the Y-coordinate. If the XNS condition is 'zero', representative of a positive vector X-component, operation branches along the zero path to OCIN2 to decrement the X-coordinate of the edge pixel to arrive at the inside Pixel. If the XNS condition is 'one', representative of a negative vector X-component, operation branches along the 'one' path to OCIN7 to increment the X-coordinate of the edge pixel to arrive at the inside pixel. The incremented or decremented Y-coordinate of the edge pixel can be combined with the X-coordinate of the edge pixel is OCIN4, which can be used as the pixel address to access the inside pixel in operation OCIN8.

INSIDE/OUTSIDE LOCATION TABLE

| | | | | | OUTPUT | | | |
|---|---|---|---|---|---|---|---|---|
| | | INPUTS | | | INSIDE | | OUTSIDE | |
| P | QUADRANT | YNS | XNS | FS | XS | YS | XS | YS |
| P0 | 1 | 0 | 0 | 0 | +1 | | −1 | |
| P1 | 1 | 0 | 0 | 1 | | −1 | | +1 |
| P2 | 2 | 0 | 1 | 0 | +1 | | −1 | |
| P3 | 2 | 0 | 1 | 1 | | +1 | | −1 |
| P4 | 4 | 1 | 0 | 0 | −1 | | +1 | |
| P5 | 4 | 1 | 0 | 1 | | −1 | | +1 |
| P6 | 3 | 1 | 1 | 0 | −1 | | +1 | |
| P7 | 3 | 1 | 1 | 1 | | +1 | | −1 |

XNS = 0; Edge has positive X vector direction.
XNS = 1; Edge has negative X vector direction.
YNS = 0; Edge has positive Y vector direction.
YNS = 1; Edge has negative Y vector direction.
FS = 0; delta Y greater than delta-X, slope greater than or equal to 45°.
FS = 1; delta X greater than delta-Y, slope less than 45°.
*Clockwise vector sequence around surface periphery is assumed

Antistreaking Processor

Figure 10S:
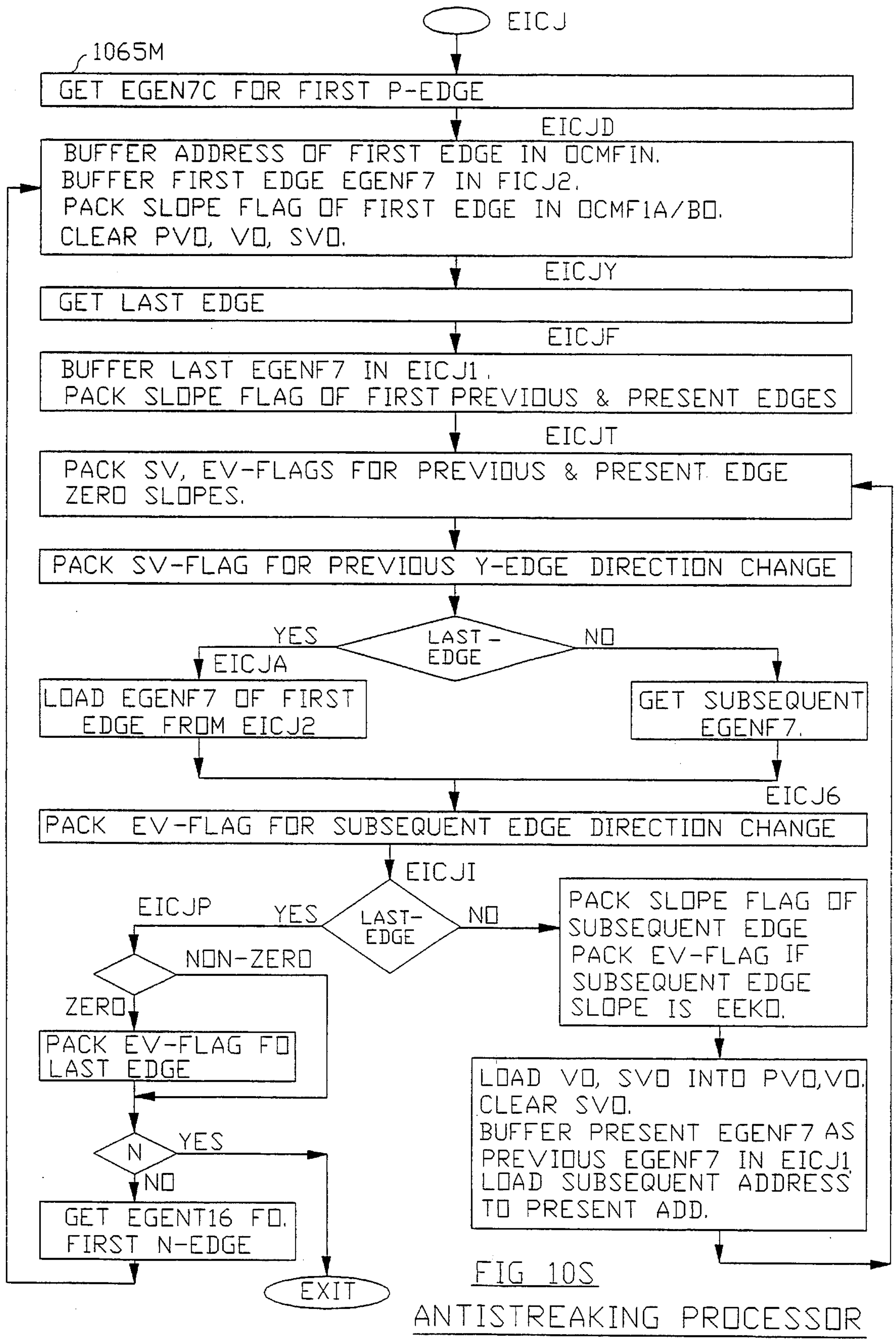

Various forms of visual processing can provide streaks. For example, an attempt to fill at a vertex may cause a streak to occur in the direction that the vertex does not bound an area. A horizontal fill at a vertex at the top extreme of a surface or at the bottom extreme of a surface will not find an area in the horizontal direction to fill within the surface and therefore will attempt to fill the area outside of the surface, resulting in a streak. Also, a vertical fill at a vertex at the right extreme of a surface or at the left extreme of a surface will not find an area in the vertical direction to fill within the surface and therefore will attempt to fill the area outside of the surface, resulting in a vertical streak. Streaks can be eliminated by streaking processing, such as shown in FIG. 10S, which has been implemented and demonstrated in conjunction with the program beginning with the mneunomic EICJ in the program listing set forth in the Tables Of Computer Listings, Antistreaking Processor. The annotations in the right hand margin of the listing provide a detailed description of the operations performed therein and the assembly language code in the middle column of the listing provides a very detailed description of the operations performed therein, which are reflected in a higher level form in the antistreaking processor flow diagram of FIG. 10M. Therefore, one skilled in the art can readily understand the antistreaking processor flow diagram of FIG. 10M, particularly when taken in conjunction with the annotations and code of the program listings.

Surface Intersection Processing

The intersection between the P-surface and the N-surface; that surface area common to or overlapping therebetween; is relatively large compared to the leading edge area; that area to be filled for the P-surface, and the trailing edge area, that area to be filled for the N-surface; for certain conditions. For example, for the condition of (a) relatively large surface, (b) multiple pixels across the surface, and (c) relatively small pixel motion; the area of the intersection is significantly larger than the area of the leading and trailing edges of the moving surface. Because the intersection need not be changed during occulting processing, a significant enhancement in processing bandwidth and pixel memory traffic can be obtained by not processing and not scanning pixels in the intersection. Therefore, it is desireable to identify the Surface intersection and to inhibit pixel processing therein.

In order to inhibit processing in the surface intersection, it is desireable to know whether a particular edge pixel is bordering the surface intersection or is not bordering the surface intersection. A transition from an intersection bordering edge pixel and from an intersection non-bordering edge pixel can be identified by an edge intersection between the P-edge and N-edge. This is because a transition from a surface intersection bordering condition and a surface intersection non-bordering condition is characterized by a crossing of an N-edge and a P-edge (FIG. 10F). For motion smaller than surface dimensions, there are typically two edge intersections at the surface intersection (FIG. 10F). For certain types of motion, such as large motion relative to surface dimensions, the N-surface can pass the P-surface and hence there can be conditions with no PN edge intersections and no surface intersections (FIG. 10G). For certain types of motion, such as rotation, multiple PN edge intersections bordering the surface intersection can be formed (FIG. 10H).

While traversing an edge, detection of a PN edge intersection, characterized by a P-edge flag and an N-edge flag in the same pixel; identifies a transition from an intersection bordering pixel to an intersection non-bordering pixel or from an intersection non-bordering pixel to an intersection bordering pixel for the surface intersection. Detection of a PN edge intersection can effectively toggle (if in the one state, change to the zero state, and if in the zero state, change to the one state) the condition from a bordering to a non-bordering or from a non-bordering to a bordering edge pixel for the surface intersection. Therefore, an intersection flag FI-6 can be used to identify a bordering or a non-bordering condition for a surface intersection and can be toggled each time a PN edge intersection is detected.

Certain conditions can cause a plurality of adjacent pixels to be intersecting edge pixels for the same edge. For example, if a P-edge and an N-edge intersect with a small angle therebetween, the N-edge and the P-edge may share common pixels for pixels prior to and subsequent to the actual intersection pixel (FIG. 10I). Therefore, toggling of the surface intersection flag FI-6 could yield improper results. This condition can be corrected by toggling the surface intersection flag only once for each group of adjacent edge intersection pixels. This can be implemented by setting a multiple intersection pixel flag FI-7 each time an intersection edge intersection pixel is detected and resetting the multiple intersection pixel flag each time a non-edge intersection pixel is detected while traversing an N-edge or a P-edge. The multiple intersection pixel flag can be tested for toggling the intersection flag before setting or resetting the multiple pixel intersection flag and the multiple intersection flag can be tested for a toggling determination. If the multiple intersection pixel flag has not as yet been set, the intersection boundary pixel flag can be toggled. However, if the multiple edge intersection pixel flag is set, indicative of the intersection boundary pixel flag already having been toggled for that edge intersection, then toggling is inhibited. When the adjacent edge intersection pixels have been passed and a non-edge intersection pixel is detected, the multiple edge intersection flag is reset, indicative of passing the edge intersection to again enable toggling of the intersection boundary pixel flag when another edge intersection is again detected.

The toggling of the intersection boundary pixel flag assumes that the proper boundary condition has been initially Set into that flag. One method of boundary pixel flag initialization will now be discussed as exemplary of other methods that may be used. An intersection boundary condition can be detected by several methods. One method is to monitor the inside pixel for the moving surface and setting an intersection boundary condition if the inside pixel is the moving surface. If the inside pixel is not the moving surface, then a range check can be made to determine if the surface filling the inside pixel has a range greater than or less than the moving surface. This is because, in the surface intersection, the inside pixel is the moving surface unless it is occulted by a nearer surface. If the range of the inside pixel is greater than the range of the moving surface, then the surface in the inside pixel cannot be occulting the moving surface and therefore the edge pixel must be a non-intersection boundary edge pixel. Similarly, if the range of the inside pixel is less than the range of the moving surface, then the surface in the inside pixel is occulting the moving surface; where the intersection condition is obscured. During certain conditions, such as complex occulting conditions; many inside pixels may be occulted by nearer surfaces and, therefore, an intersection condition cannot be determined for the related edge pixel. However, a single boundary pixel condition determination for a single edge pixel will permit other intersection boundary pixel conditions to be derived therefrom. For example, setting of the intersection boundary pixel flag for a particular edge pixel and toggling that flag for each edge intersection traversed, as discussed above, permits the intersection boundary pixel condition for other pixels on that edge to be identified. Therefore, extrapolating the intersection boundary pixel condition around the edge as the edge pixels are processed until the end of the edge and then storage of this last pixel per surface intersection boundary condition permits the first pixel per edge intersection boundary condition to be readily derived therefrom. For example, if the first pixel per surface is not an edge intersection pixel, then the intersection boundary pixel condition for the last pixel per surface may be used for the first pixel per surface as an initial condition. Conversely, if the first pixel per surface is an edge intersection pixel and the multiple pixel flag has been reset, then the intersection boundary condition of the first pixel for the surface should be the toggled or complemented condition of the intersection boundary pixel flag for the last pixel per surface.

In view of the above, the condition of a P-edge and an N-edge pixel as being an intersection boundary pixel or a non-intersection boundary pixel can be determined with a single boundary flag that is initialized at the start of the mode to a boundary or non-boundary condition and toggled once for each intersection condition will un-ambiguously identify the intersection boundary or non-boundary conditions of a particular edge pixel. This intersection boundary flag can be used to enable processing of the leading surface and trailing surface for filling and to disable processing of the surface intersection during occulting processing.

Operation of one configuration of an intersection processor is shown in FIG. 10J implementing the above described configuration. The intersection processor flags; FI5 defining that an intersection has been properly determined for the particular surface, FI6 defining an intersection pixel condition, and FI7 defining toggle disable for an intersection pixel condition; are shown in the Table Of Packed Words packed into pixel word-1 in the occulting FIFO buffer PXLB1. These flags may be set, reset, and tested in accordance with the above intersection processing discussion and may be used for occulting processing.

Range Related Detail

In many applications, it may be desirable to generate visual detail inversely proportional to range. As the object becomes more remote, the level of detail may be reduced. For example, primary details such as major features may always be displayed; intermediate details such as secondary features may be displayed when nearer than a secondary range threshold but not when more remote than a secondary range threshold; and finer details such as tertiary features may be displayed when nearer than a tertiary range threshold but not when more remote than a teritary range threshold. Therefore, as an object moves closer through a secondary range threshold, secondary details may appear and, as an object moves closer through a tertiary range threshold tertiary details may appear. Conversely, as an object moves to a greater range through the tertiary range threshold tertiary details may disappear and as an object moves to a greater range through the secondary range threshold secondary details may disappear.

Range-variable details may be implemented through occulting processing. Tertiary details may be given the greatest occulting priority, secondary details may be given a lower occulting priority (less than the tertiary occulting priority), and primary details may be given a still lower occulting priority (less than the secondary occulting priority). Therefore, tertiary details may be superimposed on or occult secondary details and secondary details may be superimposed on or occult primary details, The range byte in each pixel word can establish occulting priorities. Ranges for different occulting priorities in the same object may vary by least significant increments in the range bytes (i.e.; 576, 577, and 578 for tertiary, secondary, and primary priorities), Threshold flags may be used for range variable details. Flags may be used in the database memory, visual processor, and refresh memory. In one embodiment, the supervisory processor, in a low priority background routine, can examine the range threshold and range number for various details to determine if the range is greater than the range threshold. If the range of the detail is greater than the range threshold for this detail, those details can be removed from the real time processor and the refresh memory. If the range of the detail is less than the range threshold for this detail, corrective action need not be initiated. If the level of detail is being displayed but is at a range greater than the controlling range threshold, this level of detail can be discontinued in the real time processor to make available processing resources related thereto and in the refresh memory to reduce the level of detail for more remote objects. If the level of detail is being displayed but is at a range less than the controlling range threshold, this level of detail can be continued.

One objective of range-related details is to reduce the computational burden on the visual processor. Therefore, as range-related detail gets out of range, they can be removed from the real time processor and not processed further. In background processing with the microprocessor, the range-related details can be continually checked for again becoming visible, resulting in reinitializing them in the geometric processor. If the real time processor is slow in reestablishing newly visible range variable details, it may not matter. Very fast moving objects can bring range-related details rapidly into visibility. Therefore, fast moving objects can be specially treated more rapidly and at higher priority. For slower moving objects, when they come into view may be flexible. Therefore, it may not matter if range-related details appear after a delay.

The microprocessor may give higher processing priority to range-related details to determine if any of these non-visible range-related details have become visible. Range-related details becoming visible may be a rare occasion. Therefore, the computational load on the microprocessor therefor may be very slight. Range-related detail processing may be simplified by performing translations on database information without rotations to determine whether the range-related details are within visible range and hence need to be rotated or whether the range-related details are outside of the visible range and hence do not need to be rotated. The occurrence of objects changing range as a function of rotation may be relatively small and may be disregarded. Separate objects may have a small enough dimension so that, at all but the very closest range, rotation of an object will not change its range beyond the resolution therefor. This is consistent with an assumption that an object has a constant range for all parts thereof; such as for the two wing tips, the tail, and the nose of an aircraft which may, conceptually, overlap several range resolution increments, particularly at nearer range, but which may be located at the same range in refresh memory. However, in the geometric processor, each point may have a different range. Therefore, for range-related details at any but the closest range, they may be tested for the translation range without the rotational component of range to determine visibility. For nearer objects where rotational-related range components are more important, all range-related details may be visible because of the closeness to the observer. Therefore, this consideration may be automatically satisfied when range-related details are all visible. Therefore, an approximation that rotating the component does not contribute to range may be appropriate. Consequently, the consideration that only the translational range component need be tested for visibility of range-related details may he pertinent because the range-related details that are close enough to have a range component caused by rotation are close enough to be visible, as determined by the translation parameter.

An important consideration is that range threshold can he set so that objects more remote do not permit rotation to contribute to range because all points on the object are effectively at the same range. However, when an object gets closer than the threshold range, then the range for each remote point on the object may be treated differently. This permits a "near field" type effect, where the closer wing of an aircraft is much larger than the more remote wing of the aircraft due to this "near field" range consideration. An important consideration for the above assumption is that an object has constant range and range is being controlled in the incremental processor as constant for each object. However, a range for each object controlled by the rotation component and a different range for each surface of the object, where different surfaces have different range-related sizes, facilitate this "near field" range-related size and near surface emphasis effects. Therefore, a geometric processor implementation for certain selected or flagged objects may have a special range-related size effect when they get within a range threshold and if they have a flag indicating the need for this special type of range-related size.

In view of the above, a consideration is that the true range of an object may be contained in the geometric processor main memory and the occulting and relative range of an object may be contained in refresh memory, where refresh memory pixel word range fields may be a good approximation of actual ranges but may have some latitude in range definition in order to discriminate between objects when the refresh memory-pixel word range field is used to identify different objects and to provide occultation therebetween.

In an alternate embodiment size of an object as a function of range may vary even though the pixel word range field may not vary. This is because the geometric processor, keeping track of actual range may be controlling intensity and size, but it may not be necessary to change the relative range in pixel memory therefor. However, range-related intensity using the pixel range field and the DAC implementation of the display interface may have a low enough resolution so that the effects thereof may not be noticeable.

Range-variable detail can be implemented with the system of present invention because the excellent range resolution (i.e.; 12-bits or 4,096 ranges) facilitates this range-variable detail feature. Range-variable detail reduces the computational load on the real time processor.

Display of high levels of detail for objects may be desireable at close range but may be unnecessary at longer ranges. The amount of detail can be varied inversely with range, where details may be selected for display as a function of the fineness of the detail and the range of the object. This facilitates high levels of detail for close objects and lower levels of detail for far objects, where lower levels of detail reduces processing load when objects are at greater ranges. An improved method for range-related detail will now be discussed.

Range-related detail involves generation of finer levels of detail at closer ranges and coarser levels of detail at further ranges. It can be implemented by occulting of courser levels of detail with finer levels of detail at nearer ranges and not occulting of coarser levels of detail with finer levels of detail at further ranges.

Range-related details for objects can be implemented by superimposing the less important finer details, those which may be dispensed with at nearer ranges, on top of the more important details, those which may be dispensed with at farther range or that may not be dispensed with at any range. For example, rivets may be superimposed on an aileron and may be dispensed with at a range greater than one-half mile; an aileron may be superimposed on a wing and may be dispensed with at a range greater than three miles; and a wing may be superimposed on an aircraft and may not be dispensed with even at distant ranges.

The feature of range-related detail can be implemented by setting a range-related detail flag for each superimposed level of detail for deleting at a range threshold and storing a range threshold for that level of detail; where an object having a range greater than the range threshold will dispense with that level of detail. Levels of detail may be superimposed on other levels of detail. This superimposing may be configured as different objects having different range thresholds such as for increasing levels of detail to permit occulting of coarser levels of detail having greater range thresholds by finer levels of detail having lesser range thresholds. The availability of a large number of occulting ranges, such as the 256 occulting ranges associated with the 8-bit range number in the range field of each pixel word, facilitates high resolution range determination and permits fine range resolution and occultation between different levels of detail.

The range related detail discussed above can enhance processing capability. For example, if a level of detail is being processed in the incremental processor and is determined to have a range greater than the range threshold, then it need not be considered for subsequent processing occultation, edge smoothing, pixel memory operations, and other subsequent processing. However, these non-visible details may still be updated with range scaling, transformation, and other front-end processing in order to facilitate again displaying these details if the range approaches below the threshold range. In an alternate embodiment, range-related details may be removed from the visual system when the range exceeds the range threshold of the details and may be again introduced into the visual system when the range approaches the threshold range.

One embodiment or range-related details may be implemented as discussed with reference to FIG. 9K. A general outline of an object and details 985A that are visible at a greatest range 985B will have a lowest occulting priority of all of the details of that object. Coarse details 985C of the object that are visible at a great range 985D but not at said greatest range 985B will be generated having a higher occulting priority then the occulting priority of said general outline 985A of the object. Finer details 985E of the object that are visible at a nearer range 985F but not at said great range 985D of the coarse details 985C of the object discussed above can be generated having a still higher occulting priority then the occulting priority of said coarse details 985C. Still finer details 985G of the object that are visible at a still nearer range 985H but not at said nearer range 985F of the finer details 985E of the object discussed above can be generated having a yet still higher occulting priority than the occulting priority of said finer details 985E. The finest details 985I of the object that are visible at a very close range 985J but not at said still nearer range 985H of said still finer details 985G of the object discussed above can be generated having the greatest occulting priority of all of the details of the object.

Occulting priorities may be established by setting the range of the level of detail and treating the level of detail as if it is an occulting object. Introduction of the level of detail when within the visible range threshold will cause occulting of coarser levels of detail having lower occulting priorities. Therefore, this configuration will superimpose a finer-level of detail within its visible range on coarser levels of detail. As the range exceeds the visible range threshold of a level of detail, this level of detail will become non-visible and therefore will not be displayed.

APERTURE PROCESSOR

Introduction

A processor for evaluating geometric relationships will now be discussed. For illustrative purposes, this processor will be called an aperture processor and will be discussed in the context of processing of image information to aid in occulting processing. This processor is generally applicable to processing of geometric relationships and may be applied to processing of other types of image information, processing of mechanical geometries, processing of navigation and guidance geometries, processing of fire control geometries, and other forms of geometric processing. The aperture processor may be used in the context and environment discussed herein, or alternately may be used in other contexts and environments; such as a separate processor or in combination with other processors to facilitate other tasks.

In an illustrative configuration, the aperture processor is used in a visual system to determine the relationship between a geometry, such as a surface, and a point, such as a pixel. Alternately, comparisons of geometries; such as objects, surfaces, points, and combinations thereof; can be provided. For example, a fire control application may involve interaction between a point projectile and a point target, a mapping application may involve interaction between two mapping areas, and a mechanical problem may involved interaction between two mechanical assemblies. For convenience of illustration herein, a configuration of comparing a surface with a point, a surface with a plurality of points, a plurality of surfaces with a point, and a plurality of surfaces with a plurality of points will be discussed in the configuration of a graphical display system.

Aperture Processor Optimization

A configuration for reducing the number of surfaces processed for classification of an aperture condition will now be discussed.

One application of the aperture processor is in conjunction with the occulting processor in the mode that fills the prior surface, Mode-3. When a surface is detected that is internal to the prior surface and that is separated from known surfaces by C-edges (which can be called an aperture), the aperture processor can be used to identify the surface that should be used to fill this area (aperture). The surface seen through the aperture is an occulted surface that is further in range than the moving surface. This is because the aperture would be occulted by any nearer surface, an occulting surface, that encompassed the aperture, and consequently would not be visible; thereby eliminating the need for aperture processing. Also, a single surface is used to fill the aperture, where the filling surface is the nearest occulted surface that is more distant in range than the moving surface and encompasses the aperture pixel. A single surface fills the aperture because an aperture is an area that is not traversed by C-edges, but is bounded by C edges. Therefore, because different surfaces are separated by C-edges, an aperture has only a single surface contained therein.

If multiple surfaces encompass an aperture; i.e., the filling surface and the occulted encompassing surface; the nearest surface is visible and occults the more remote surfaces encompassing the same aperture. Therefore, aperture processing for Mode-3 can disregard objects that are nearer than the moving surface and aperture processing for Mode-3 need only process surfaces at increasing ranges from the moving surface until a surface is found that encompasses the aperture. There is no need to process other more distance surfaces because there is only one surface that fills an aperture, which is the nearer surface that encompasses the aperture. Therefore, aperture processing can be performed in the sequence of increasing range, nearest surface first; and commencing with surfaces having greater ranges than the moving surface; where detection of a nearest surface encompassing the aperture pre-empts the need for further processing of surfaces at greater ranges for that aperture.

For an aperture surrounded by C-edges and having a plurality of pixels therein but having no C-edges traversing therethrough, all pixels in that aperture can be defined as having the same surface. Therefore, all pixels therein can be defined by defining the surface in the other aperture pixels in the same aperture. This is because different surfaces are separated by edges; where pixels that are not separated by an edge can be assumed to belong to the same surface. Therefore, determination of the filling surface for any pixel in an aperture can represent a determination of the filling surface for all pixels in that aperture.

For the above aperture characterization, a plurality of pixels in an aperture can each be used in combination with others to define the aperture. For example, an aperture determination for a triangular surface having three verticies can be made by comparing any one of the aperture pixels with the verticies. For example, different aperture pixels in the same aperture can be compared with different verticies of the same surface. This is because the aperture processing criterion between any one aperture pixel and the verticies of a surface is the same for all pixels of the same aperture and the verticies of that surface. Therefore, aperture pixels can be selected optimally for comparison with the verticies of a surface, where a first aperture pixel can be selected for comparison with a first vertex for a surface and a second aperture pixel can be selected for comparison with a second vertex for the surface. Superposition can be used to combine the determination of any one of the aperture pixels with any one of the verticies of the surface. Therefore, careful selection of the aperture pixels can reduce aperture processing. However, if an aperture is significantly smaller than a surface, there may be little advantage to selecting different aperture pixels. Also, in a system where the majority of the apertures are very small compared to the majority of the surfaces, the logic to implement optimum aperture pixel selection and a comparison of the verticies of a surface with the multiple aperture pixels may not yield significant improvements. Therefore, in one configuration discussed herein, it may be assumed that most apertures are much smaller than most surfaces and that optimum selection of aperture pixels and superposition of the processing of a plurality of aperture pixels need not be used. However, in alternate configurations, such optimal selection of aperture pixels and such superposition may be used.

Detailed Implementation

The aperture processor can be implemented in various alternate configurations. One configuration is discussed herein based upon processing the verticies in sequence around the periphery and detecting quadrant transitions that need further processing. In addition, configurations are provided which check the quadrant traversed by the surface to determine the inside and outside or temporary indeterminancy of the aperture condition for the combination of conditions for a surface. The temporary indeterminancy can be resolved in various ways, such as with slope comparison processing. Slope comparison processing can be performed for edges that make the transition between two non-adjacent quadrants.

Various configurations of the aperture processor discussed herein have been implemented and demonstrated as an actual reduction to practice and demonstration of the capability. A flow diagram of one of these configuration is shown in FIGS. 10A to 10D and will now be discussed in detail as illustrative of various configurations and uses of the aperture processor. The configuration shown in FIGS. 10A to 10D was implemented under program control and presented on a CRT display in graphical form. Alternately, the aperture processor can be implemented in hardware, such as with digital logic. The diagrams shown in FIGS. 10A to 10D may be considered to be a program flow diagram or a hardware state diagram, where either a program configuration or a hardware configuration or a combination thereof may be implemented therefrom. An annotated program listing together with graphical printouts of operation are provided herewith. The listing and printouts have a revision date of Feb. 11, 1983. This listing operates with related listings, such as for FIFO operations, as discussed herein. Terminology, flag conditions, and other considerations are summarized in tabular form hereinafter. Terminology such as APF-2 means bit-2 of word APF.

The AP terms in FIG. 10A to FIG. 10D, such as AP3A, are mneumonic representations that correspond with the mneumonic representations in the listing. The description herein is supplemented by the annotations in the listing.

The configuration discussed with reference to FIGS. 10A to 10D is implemented in a scanning form, where a single surface is compared sequentially with each of the pixels in the viewport. This scanning configuration demonstrates operation of one configuration of the aperture processor and is illustrative of other configurations thereof.

The aperture processor can be configured to determine if a pixel is contained within a surface. In addition, optional processing capability can be provided to determine if an aperture pixel is on-the-edge of a surface. This optional capability is enabled with the APF-1 flag being one-set and disabled with the APF-1 flag being zero-set.

The aperture processor is discussed in conjunction with a FIFO for storing surface vertex coordinates and in conjunction with a pixel memory for storing an image. Coordinates of the surface verticies are sequentially accessed from the FIFO and processed with the aperture processor to determine the conditions for the present pixel. The condition for the present pixel is stored in the corresponding location of pixel memory. The FIFO pointer is then reset to again access the surface from the FIFO for the next subsequent pixel.

The aperture processor configuration shown in FIGS. 10A to 10D will now be discussed. Aperture processor operations commence with element 10P1 and initially execute element AP. In element AP, the APAX and APAY coordinate registers are cleared for setting the initial pixel coordinate and the pointer for the FIFO is preserved in a buffer register. Operation then proceeds to outer loop processing commencing with element APDF, which initializes outer loop operations, and the proceeds to inner loop processing commencing with element AP8F, which initializes inner loop operations. Outer loop operations are executed once per pixel, proceeding on to subsequent pixels when the condition for the present aperture pixel has been determined. Inner loop operations are executed once per edge for a particular surface until all edges for that surface have been processed; proceeding on to subsequent aperture determinations to be performed for the present aperture pixel.

In element APDF, packed aperture words APA and APF-2 are zero- set. Flag word APA contains the packed conditions associated with the quadrant of each vertex of a surface relative to the aperture pixel, Q1 to Q4, and the signs of the absolute values of the vertex coordinates relative to the vertex coordinate pixel, ABDX and ABDY.

Operation proceeds to element AP8F, where edge parameters are loaded from the FIFO into the EGEN table for subsequent calculation of the delta-X and delta-Y coordinates. The delta-X coordinate is calculated to be the difference between the vertex coordinate and the aperture pixel coordinate in element AP8F and tested for zero in element 10P2. If delta-X is zero, indicative of the vertex being vertically aligned with the aperture pixel, operation proceeds along the YES path to element 10P4 where flag bit APF-2 is set, indicative of a zero delta parameter. If delta-X is non-zero, operation proceeds along NO path to bypass setting of the APF-2 flag in operation 10P4. Operation proceeds to element 10P5, where the sign of delta-X is packed into APC1-6 for subsequent on-the-edge processing.

Operation proceeds to element 10P6, where edge parameters that were previously loaded from the FIFO into the EGEN table in element 10P3 for subsequent calculation of the delta-X and delta-Y coordinates, are used to calculate the delta-Y coordinate as the difference between the vertex coordinate and the aperture pixel coordinate, operation proceeds to element 10P7, where the delta-Y coordinate is tested for zero. If delta-Y is zero, indicative of the vertex being horizontally aligned with the aperture pixel, operation proceeds along the YES path to element 10P8 where flag bit. APF-2 is set, indicative of a zero delta parameter. If delta-Y is non-zero, operation proceeds along NO path to bypass setting of the APF-2 flag in operation 10P8. Operation proceeds to element 10P9, where the sign of delta-Y is packed into APC1-7 for subsequent on-the-edge processing.

Operation then proceeds to element AP3AF and elements 10P10 to 10P15 to pack the quadrant condition for the particular vertex into the least significant half of flag word APA. The quadrant of the vertex relative to the aperture pixel can be defined by the sign of delta-X and the sign of delta-Y measured from the aperture pixel to the vertex. For example, a positive delta-X and a positive delta-Y vector indicates the first quadrant, a negative delta-X and a positive delta-Y vector indicates the second quadrant, a negative delta-X and a negative delta-Y vector indicates the third quadrant, and a positive delta-X and a negative delta-Y vector indicates the fourth quadrant. This determination is made in element 10P3AF, where operation proceeds along the appropriate path to pack a quadrant bit into the APA flag word in operations 10P11 to 10P15. A test is made for the last vertex of that surface in element 10P16 to determine if the last vertex for that surface has been processed. If the last vertex has not been processed, operation proceeds along the NO path to loop back around the inner loop to element AP8F for processing of subsequent verticies. If the last vertex has been processed, as determined in element 10P16, operation proceeds along the YES path to determine the aperture conditions for the particular surface relative to the aperture pixel using subsequent processing.

In accordance with the hierarchial aperture processing arrangement discussed herein, a determination if on-the-edge aperture processing is appropriate is made in element 10P17. This test is based upon whether the two flags APF-1 and APF-2 are one-set, indicative of on-the-edge processing being required. If a single one of these two flags APF-1 or APF-2 is zero-set, it is indicative of bypassing of on-the-edge processing. The APF-1 bit enables edge processing and the APF-2 bit is set in elements 10P4 or 10P8 if a zero delta parameter is detected. Without being enabled with APF-1, on-the-edge processing is not performed. Without having a zero-delta condition, indicated by APF-2, on-the-edge processing is not performed.

If on-the-edge aperture processing is not selected, operation proceeds along the NO path from element 10P17 to element 10P18 at APTDF where quadrant bits Q1 to Q4 are packed into a pointer that is used to perform a table lookup, as indicative of aperture conditions. The combination of quadrant conditions for the verticies of the surface are ORed together into the least significant half of the APA word in operations 10P10–10P15. After all of the verticies of the surface have been processed and the APA word contains the combination of all quadrant conditions for all of the verticies for the surface, a determination can be made of the type of aperture condition that exists and processing consistent with this condition can then be performed.

A table lookup is made to determine if the quadrant conditions can identify the aperture pixel as being inside or outside of the surface or if further processing is necessary. The table lookup is implicit in element 10P19, where operation proceeds along the INSIDE path for an inside condition, operation proceeds along the OUTSIDE path for an outside condition, and operation proceeds along the OTHER path to AP3 for subsequent processing of non-adjacent double and triple quadrant conditions. The Aperture Processor Condition Table summarizes the input conditions, which are the packed quadrant conditions, and summarizes the output conditions, which are codes representative of the aperture conditions. The P0 condition, where not one of the quadrants around the aperture was traversed by the surface,is a "can't happen" condition because the surface must traverse at least a single quadrant relative to an aperture pixel conditions P1, P2, P4, and P8 represent a surface being contained in a single quadrant relative to the aperture pixel, where the aperture pixel is outside of the surface. Conditions P3, P6, and P12 represent a surface being contained in two adjacent quadrants relative to the aperture pixel, where the aperture pixel is outside of the surface. Condition P15 represents the verticies of the surface traversing all four quadrants around the aperture pixel; where, for convex surfaces, the aperture pixel is inside of the surface. Conditions P5, P7, P10, P11, P13, and P14 have verticies in two non-adjacent quadrants; conditions P5 and P10 in two opposite quadrants and conditions P7, P11, P13, and P14 in three quadrants. This causes one or two edges to make a transition between non-adjacent quadrants; which involves further processing to determine inside or outside conditions.

The output column of the APB table has codes in the least significant hexidecimal character (H) which are representative of the aperture condition. Code 0000 represents a "can't happen" condition; code 001X represents an immediately determinable inside or outside condition; code 10XX represents a triple quadrant condition needing further processing; and code 11XX represents a double quadrant condition needing further processing. For the immediately determinable conditions, code 0111 (7H) is representative of an outside condition and code 0010 (6H) is representative of an inside condition. Codes 1100 (CH) and 1101 (DH) are representative of the two non-adjacent double quadrant conditions, P10 and P5 respectively. Codes 1010 (AH), 1000 (8H), 1011 (BH), and 1001 (9H) are representative of the four triple quadrant conditions P7, P11, P13, and P14 respectively. For convenience of demonstration, codes are chosen for display representative of the condition determined. Code 06 represents an "I" in the pixel table lookup for an inside condition and code 07 represents an "O" in the pixel table lookup of an outside condition. An "N" represents an edge condition. Hexidecimal characters 9 through D need further processing to determine if they are inside, outside, or on-the-edge; as will be discussed hereinafter.

The Aperture Processor Condition Table includes slope comparison register identification for subsequent slope comparison processing for non-adjacent double and triple quadrant conditions. Slope comparison registers for these conditions are shown in the Slope Comparison Register Table for the triple quadrant conditions and for the double quadrant conditions; discussed in detail hereinafter.

Double non-adjacent quadrant and triple quadrant processing will now be discussed. If a non-adjacent double quadrant or triple quadrant condition is detected, operation proceeds to element AP3 to perform the processing shown for elements 10P20 to 10P38. In accordance with the hierarchial aperture processing discussed herein and assuming that many surfaces and apertures will not require such double or triple quadrant processing, some of the processing specific to such double and triple quadrant conditions but not necessary for initial determination of inside and outside conditions is not performed in operations 10P1 to 10P19 (FIG. 10A). If it is subsequently determined that such double or triple quadrant processing is necessary, this additional processing is performed as needed. In accordance therewith, the FIFO pointer is reloaded in element 10P20 to re-access the surface verticies for this additional processing and the minimum delta table is initialized to a maximum positive delta condition. This maximum positive condition insures that any deltas identified will be smaller than the initial conditions and therefore will be loaded into the table in place of the initial conditions.

As discussed herein, double and triple quadrant conditions involve selection of particular verticies traversed by an edge for slope comparison processing to determine inside and outside conditions. Vertex selection is simple if there is only a single vertex in each of the non-adjacent traversed quadrants. If there are multiple verticies in either or both of these quadrants, a selection of the appropriate verticies for slope comparison is made. This selection can be made based upon the minimum delta parameters. For example, a vertex is selected based upon having the minimum delta coordinate for that quadrant. This approach is discussed in greater detail with reference to FIG. 10E. The method discussed herein stores the vertex having a minimum delta-X or a minimum delta-Y for a particular quadrant in the minimum delta table for subsequent comparison with coordinates of other verticies in that quadrant to keep track of the minimum delta coordinates for that quadrant. After all verticies for the surfaces have been processed, the verticies having the minimum delta coordinate remain in the table, independent of the number of verticies that occur in that quadrant.

A minimum delta table is loaded with inner loop processing elements 10P22–10P27. Each vertex is accessed from a FIFO in element 10P22 and the delta-X and delta-Y coordinate for the vertex are calculated in elements 10P22 and 10P24, as discussed for operations 10P3 and 10P6 above. The absolute magnitude of each delta coordinate is calculated in elements 10P23 and 10P24 and used to update the minimum absolute delta table in element 10P25; which is discussed in Greater detail with reference to FIG. 10E herein. A test is made for the last vertex for the surface in element 10P27 and used to control inner loop operations, looping back along the NO path from element 10P27 for each vertex until the last vertex is detected and then proceeding along the YES path from element 10P27 after the last vertex for the surface has been processed; as discussed for element 10P16 above.

A minimum delta table is configured having minimum terms AP1XM, AP1YM AP2XM, AP2YM, AP3XM, AP3YM, AP4XM, and AP4YM for the minimum coordinates and registers AP1Y, AP1X, AP2Y, AP2X, AP3Y, AP3X, AP4Y, and AP4X respectively being the other delta coordinate corresponding to each minimum delta coordinate. The numeric terms 1 to 4 pertain to the quadrant, the X or Y term pertains to the X or Y component of the coordinate, the presence of an M-character identifies a minimum coordinate, and the absence of an M-character identifies the coordinate corresponding to the minimum coordinate. If both X and Y components for a particular coordinate are minimum for the quadrant, such as for a single vertex in that quadrant, then the coordinates of that vertex occupy the four registers APqXM, APqYM, APqX and APqY for that quadrant q.

Updating of the minimum absolute delta table is performed by comparing the absolute delta-X and absolute delta-Y parameters for a particular vertex with the minimum absolute delta-X and minimum absolute delta-Y parameters respectively stored in the minimum absolute delta table. If the previously stored minimum absolute delta parameter is equal to or less than the current absolute delta parameter, the table is not updated for that parameter. If the previously stored minimum absolute delta parameter is greater than the current absolute delta parameter, the table is updated with that current parameter. If an absolute delta parameter is used to update the table, the corresponding coordinate related thereto is used to update the corresponding coordinate table. For example, if a quadrant-2 vertex component is used to update the AP2XM parameter, the Y-component of that vertex coordinate is used to update the AP2Y parameter.

After the last vertex has been processed and operation has proceeded along the YES path from element 10P27 to APTD, the minimum absolute delta table contains the minimum absolute delta coordinates for the verticies in each quadrant and the corresponding coordinate table contains the corresponding to the minimum absolute delta coordinates for the verticies in each quadrant. A table lookup is performed in elements 10P28 and 10P29 to determine the aperture conditions, as discussed for elements 10P18 and 10P19 above. Inside and outside conditions are determined in element 10P29 even though they may have been previously performed in table lookup elements 10P18 and 10P19. However, if operations proceeded along the YES path from element 10P17 to AP2 operations, as discussed hereinafter, before this inside and outside determination was made in elements 10P18 and 10P19 and then proceeded along the AP4 path to element 10P28 after performing the special aperture edge processing; the table lookup in element 10P18 would have been bypassed. Hence, this table lookup operation needs to be performed in operations 10P28 and 10P29.

Processing of double quadrant and triple quadrant conditions are similar in that they both use slope comparison processing. The primary difference is that the double quadrant condition involves two slope comparisons while the triple quadrant condition involves a single slope comparison. This is because double quadrant conditions have two edges traversing between non-adjacent quadrants while triple quadrant conditions have a single edge traversing between non-adjacent quadrants; where the slope comparison is needed to resolve whether the traverse of an edge between non-adjacent quadrants locates the aperture pixel inside or outside of the surface.

Slope comparison processing, briefly stated, compares the slopes between each endpoint of the edge and the aperture to determine if these slopes indicate concaveness for an outside condition or convexness for an inside condition. This test does not permit concave surfaces; which can be imposed as a graphical generation constraint on the system. This configuration of slope comparison will be described in greater detail hereinafter.

The quadrants populated by the combination of verticies of the surface determines which verticies will be involved in the slope comparison. The Aperture Processor Comparison Table and the two Slope Comparison Register Tables identify the slope comparison registers; APAXM, APAYL, APBXM, and APBYL; that are involved in the slope comparison. Slope comparison is performed by calculating the product of the contents of the APBYM and APAXM registers and subtracting it from the product of the contents of the APAYL and APBXL registers. A zero slope comparison represents an on-the-edge condition, a positive slope comparison represents an inside condition, and a negative slope comparison represents an outside condition.

For a triple quadrant condition, a single slope comparison is indicated. Operation proceeds along the triple quadrant path from element 10P29 to element 10P30, where the slope registers are loaded based upon the table lookup from the Aperture Processor Condition Table. A slope comparison is performed in element 10P31 by multiplying the selected coordinates and subtracting the products to determine if a positive condition exists for an outside pixel, a negative condition exits for an inside pixel, or a zero condition exists for an on-the-edge condition.

For a double quadrant condition, a single or double slope comparison is indicated. Operation proceeds along the double quadrant path from element 10P29 to element 10P33, where the slope registers are loaded based upon the table lookup from the Aperture Processor Condition Table. A slope comparison is performed in element 10P34 by multiplying the selected coordinates and subtracting the products to determine if a positive condition exists for an outside pixel, a zero condition exits for an on the edge condition, or a negative condition exists that involves a second slope comparison for resolution. If a second slope comparison is needed, operation proceeds along the minus path from element 10P35 to element 10P36, where the slope registers are loaded based upon the table lookup from the Aperture Processor Condition Table. A slope comparison is performed in element 10P37 by multiplying the selected coordinates and subtracting the products to determine if a positive condition exists for an outside pixel, a negative condition exits for an inside pixel, or a zero condition exists for an on-the-edge condition.

The Slope Comparison Register Tables for the triple quadrant condition and double quadrant condition represent the parameter from the minimum absolute coordinate table and from the corresponding coordinate table that are selected for slope comparison with the four slope registers. In the program listing set forth in the Tables Of Computer Listings, Aperture Processor, a table lookup is used to transfer the appropriate coordinates from the minimum absolute coordinate table and corresponding coordinate table into the four slope comparison registers. The four selected parameters for loading the slope comparison registers are identified with hexidecimal characters under each slope register column in the slope comparison register table. The hexidecimal character for each register is identified in the register identification table. The register associated with the hexidecimal character identified in the register identification table can be substituted for that hexidecimal character in each of slope comparison register tables under the slope registers. Hexidecimal characters are used for consistency with the table lookup configuration in the program listing, but may be readily replaced with the corresponding register term in the slope comparison register table and the aperture processor condition table.

A program routine for the system demonstrating the aperture processing capability is shown in FIG. 10D. The outside, inside, and edge condition can be displayed by identifying an "O" for an outside pixel in the APOUT element, an "I" for an inside pixel in the APIN element, and an "N" for an edge pixel in the APEDGE element. The selected character is shown displayed with the APZ routine. The pixel address is tested with the TESTP6 element to determine if the last pixel in the viewport has been processed. If the last pixel in the viewport has not been processed, operation proceeds along the NOT LAST path to set up for the next aperture pixel, such as by incrementing the pixel counters to the next pixel in sequence, resetting the FIFO pointer to the first vertex of the surface, and then looping back to APDF through element AP5. If the last pixel in the viewport has been processed, as determined in element TESTP6, operation proceeds along the LAST path to print the screen on a peripheral printer and then to exit the aperture routine.

On-the-edge processing will now be discussed. If aperture edge processing was selected and a zero delta condition was detected, on-the-edge aperture processing will be performed; entered through element AP2 to FIG. 10C. This processing again accesses the FIFO to process the verticies to obtain the additional information necessary for aperture edge processing and then performs on-the-edge processing operations to determine if the aperture pixel is on the edge of the surface.

The processing related to on-the-edge conditions will now be discussed with reference to FIG. 10C. The operations shown in FIG. 10C include the double and triple quadrant processing, discussed with reference to FIG. 10B above, in addition to the aperture on-the-edge processing.

A brief description of FIG. 10C will now be provided. On-the-edge processing operations begin with element 10P50, which reloads the FIFO pointer that was preserved in the first operation AB (FIG. 10A) to permit accessing of the first vertex in the FIFO. The APC1 and APD1 flag words are initialized to zero to permit building up of the flag conditions for the new surface to be processed. Also, the minimum delta table is set to the maximum positive initial conditions, as discussed for element 10P21 above.

The logic to pack the APC1 and APD1 words is included within the loop (elements 10P52 to 10P76) for each edge of a surface, where the APC1 and APD1 words contain composite information of all edges of a surface. After the APC1 and APD1 words have been constructed for all verticies of the surface, operation branches to APT logic element 10P77 to process the APC1 and APD1 words.

If a delta-X of zero is detected in element 10P54, the signs for the corresponding Y-coordinate has not as yet been generated. Therefore, a zero DX0-flag is packed into the ADC1 word in element 10P59 to store this zero delta-X condition until the delta-Y condition is determined in element 10P61. At such time, the sign of the delta-Y condition is available and is packed into the two LSBs of the APC1 word for a zero delta-Y condition.

if zero delta-X and zero delta-Y conditions are detected for the same vertex in element 10P64, the vertex is on the aperture pixel and hence it represents an edge condition. An edge associated with that surface may or may not be on the coordinate axis of the aperture. For such a coincident aperture and vertex condition, the aperture is on an edge (the vertex) of the surface and therefore is neither inside nor outside of the surface. Therefore, it is not necessary to further process subsequent verticies of that surface. The FIFO can be advanced or set to the next surface and the program can exit the aperture processor for that surface in element 10P65.

The pair of N-bits for the APC1 and APD1 flags are used to count the number of zero delta-X and zero delta-Y conditions respectively for the particular surface. However, the logic only requires determinations of whether the number of zero delta-X or zero delta-Y conditions are (a) equal to or greater than two or (b) less than two. Therefore, a 2-bit counter can be used (elements 10P58 and 10P67), being initially set to zero and counting to a one-state for the first zero value of that coordinate axis component and to the two-state for the second zero value of the coordinate axis component. The logic reflects the two conditions and saturates thereon with elements 10P57 and 10P66 in order to preclude the need for higher resolution for the zero delta counter.

The APT logic processes the APC1 and APD1 words with elements 10P77 to 10P82 to determine edge and outside conditions with preprocessing. If either (a) all of the delta-X coordinates do not extend into either the right or the left hand double quadrant regions or if (b) all of the delta-Y conditions do not extend either into the upper or lower double quadrant regions, then the aperture is either outside of the surface or is on the edge of the surface, which can be determined with the APC1 logic. If the delta-X coordinates are on both sides of the Y-axis, further processing is provided to establish aperture conditions. This condition of both plus and minus delta-X vectors and both plus and minds delta-Y vectors can yield the double quadrant and triple quadrant conditions that may be either inside, outside, or edge apertures or the four quadrant condition, which is an inside aperture condition. For example, the four quadrant condition involves plus X-vector, plus Y-vector, minus X-vector, and minus Y-vector components because each quadrant has a vertex. Similarly, double quadrant and triple quadrant verticies yield plus delta-X, minus delta-X, plus delta-Y, and minus delta-Y vector components because they have verticies in opposite non-adjacent quadrants; such as the first and third or the second and fourth quadrants which include plus delta-X, minus delta-X, plus delta-Y, and minus delta-Y vector components.

For the determination of whether the corresponding coordinates of the zero conditions are the same sign, only non-zero (plus and minus) corresponding coordinates need be processed. This is because the processing of corresponding coordinates need only be performed when the other coordinate direction is zero. Therefore, a zero corresponding coordinate characterizes an aperture on a vertex and hence would have been processed in the AP8L logic. Consequently, it is not necessary to consider zero corresponding coordinates in the APT logic. This is achieved by determining the corresponding coordinate signs for a zero coordinate condition as the negative corresponding coordinate or as a positive non-zero coordinate, expressly excluding the zero corresponding coordinate condition. Therefore, because of the independent detection of the aperture on the vertex condition AP8L, the counting of the plus corresponding coordinates plus delta-Y for the APC1 word for the zero delta-X condition and plus delta-X for the APD1 word for the zero delta-Y condition; the zero corresponding coordinate condition processing need not be performed.

A more detailed description of FIG. 10C will now be provided. Elements 10P54 to 10P59 determine if delta-X is positive, negative, or zero and keeps track of the quantity of zero conditions and the occurrence of positive and negative conditions. It is not necessary to determine if more than two delta-X conditions occurred. Therefore, the zero delta-X count is truncated at a count of two zero delta-X counts. Also, it is not necessary to determine how many positive or negative delta-X conditions occurred, just if any positive or negative delta-X conditions occurred. Therefore, the positive and negative delta-X conditions are all grouped together as packed flag conditions into the APC1 word.

The edge table is loaded from the FIFO and the absolute delta-X and absolute delta X coordinates are calculated in elements 10P52 and 10P53, as discussed for elements 10P22 and 10P23 above. On-the-edge processing operations 10P54 to 10P59 are then performed relative to delta-X. The sign condition for delta-X is packed into the APC1 word in operations 10P54 to 10P59. A test is made of delta-X in element 10P54. If delta-X is positive, operation proceeds to element 10P56 to pack a one-flag into the positive delta-X bit, APC1-80, then proceeding to delta-Y processing. If delta-X is negative, operation proceeds to element 10P55 to pack a one-flag into the negative delta-X bit, APC1-40, then proceeding to delta-Y processing. If delta-X is found to be zero in element 10P54, operation proceeds to element 10P57 to preserve the count of the zero conditions. If the zero-X counter NIX N0X has counted to the second state, N1X being one; then operation proceeds around element 10P58 to element 10P59 along the 1 path from element 10P57 to disable subsequent counting. If the zero-X counter N1X N0X has not counted to the second state, N1X being zero; then operation proceeds to element 10P58 along the zero path from element 10P57 to increment the counter.

Detection of a zero delta-X condition in element 10P54 also involves packing of the one for the DX0 flag in the APC1-10 bit in element 10P59 to identify a zero delta-X condition for subsequent processing in combination with delta-Y processing in element 10P59.

The APC1 and APD1 flag words are defined in the Aperture Flag Word Table. The APC1 flag word pertains to the zero delta-X conditions and the APD1 flag word pertains to the zero delta-Y conditions. The APC1 and APD1 flag words are similar, except that the APC1 flag word has the DX0 condition stored in APC1-4. For each non-zero delta condition detected, a one condition is ORed into the plus or minus bit positions, bits 6 and 7. For example, if a positive delta-X vector is detected, a one-bit is ORed into APC1-7 and, if a negative delta-Y vector is detected, a one-bit is ORed into APC1-6. Therefore, for a particular surface, the occurrence of positive and negative delta-X and delta-Y components relative to the aperture pixel are detected and preserved. This facilitates determination of whether a vertex is lined up either horizontally or vertically with an aperture pixel and whether the surface extends to both sides of the coordinate axis.

If a zero delta condition is detected, the zero delta counters for the X-component, NIX N0X, or for the Y-component, N1Y N0Y, are incremented to keep track of the quantity of zero-delta components to a maximum of two zero-delta components. The zero delta counters are truncated at the count of two in order to keep the counter from overflowing, where it is not necessary to keep track of more than two zero deltas. The sign of the corresponding coordinate for a zero delta is stored in the least significant two bits to keep track of the displacement of the surface relative to the coordinate axis for a zero-delta condition. If a zero delta-X condition is detected, then the zero delta-X counter, N1X N0X, is incremented; unless it is already at a maximum count of two. Also, the DX0-flag is set to record a new zero delta-X condition being detected; to keep track of the quantity of-zero delta-X conditions to the maximum count of two and to keep track of the sign of the delta-Y coordinate corresponding to a zero delta-X coordinate. For example, if a zero delta-X coordinate has a positive delta-Y flag, APC1-1 is set and, if a zero delta-X coordinate has a negative delta-Y flag, APC1-2 is set. Processing associated with APD1 shown with reference to elements 10P61 mto 10P70 is similar to the processing discussed above for APC1 with reference to elements 10P54 to 10P59.

The delta-Y component processing elements 10P61 to 10P70 are similar to that discussed for the delta-X processing elements 10P54 to 10P59, with additional processing provided. Additional processing includes detection of a vertex on-an-edge condtion with elements 10P64 and 10P65 and includes determination of the sign of the corresponding coordinate for the delta-Y processing with elements 10P68 to 10P70. The sign of the corresponding coordinate for delta-X was not processed during delta-X processing because the delta-Y corresponding coordinate had not as yet been derived. Therefore, the processing of the corresponding coordinate for the delta-X coordinate is performed subsequently in elements 10P71 to 10P74.

The DX0-flag is tested in element 10P64 to determine if a zero delta-X coordinate is present together with a zero delta-Y coordinate. If the zero delta-X and zero delta-Y coordinates are both present, the vertex is on the aperture; causing operation to proceed to element 10P65 for this vertex. The FIFO can be advanced to another edge because the determination of a vertex on the aperture is an early determination of the conditions for that aperture and for that surface. If the DX0-flag is not set, operation proceeds along the ZERO path from element 10P64 to element 10P66 to increment the zero delta-Y counter. After conditionally incrementing the zero delta-Y counter in elements 10P66 and 10P67, determination of the sign of the corresponding coordinate, the delta-X coordinate, is performed in elements 10P68 to 10P70. The sign of the delta-X coordinate is detected in element 10P68. If positive, operation proceeds along the positive path to element 10P70 where the APD1-2 flag is packed into the APD1 word. If negative, operation proceeds along the negative path to element 10P69 where the APD1-1 flag is packed into the APD1 word.

After processing of the delta-Y coordinates, operation proceeds to element 10P71 to set the corresponding delta-Y sign flags for the APC1 flag word. If the DX0 flag is zero-set, a zero delta-X coordinate was not detected and operation proceeds along the zero path from element 10P71 to exit the operations setting on-the-edge flag bits. If the DX0 flag is one-set, a zero delta-X coordinate was detected and operation proceeds along the one path from element 10P71 to element 10P72 to clear the DX0-flag and to elements 10P84, 10P73, and 10P74 to pack the corresponding coordinate flags.

After processing of flag words APC1 and APD1, operation proceeds to element 10P75 to update the minimum absolute delta table, as discussed for element 10P25 above, and to test for the last vertex per surface with element 10P76, as discussed for element 10P27 above.

After the last vertex per surface has been processed with inner loop elements 10P52 to 10P76, operation proceeds along the YES path from elements 10P76 to 10P82 to evaluate on-the-edge aperture conditions. For this evaluation, an on-the-edge aperture condition exists if all zero delta-Xs are not the same sign or if all zero delta-Ys are not the same sign. This is because, for an edge to traverse the aperture at the relative origin, the edge must traverse from a positive to a negative coordinate or from a negative to a positive coordinate along the axis of the relative origin.

The edge logic at APT is appropriate only if there is one or more zero deltas because a zero delta is needed for this type of horizontal or vertical edge condition. However, the operation would only enter the on-the-edge processing routine APT if a zero delta condition APF-2 was detected in elements 10P4 and 10P8, causing operation to proceed to element AP2 from element 10P17.

If all of the deltas for the coordinate corresponding to each zero delta coordinate are on the same side of the aperture, an edge does not traverse the aperture. Operation proceeds from APT to APTB to APTD to perform slope comparison processing associated with double quadrant or triple quadrant conditions. If zero deltas exist and if the corresponding coordinates have both positive and negative signs, then a test is made in operations 10P79 and 10P81 to determine whether there is two or more zero deltas. If there are two or more zero deltas and if they are on both sides of the aperture, then the edge traverses the aperture. However, if there is only one zero delta, then the aperture is outside of the surface.

This on-the-edge logic is based upon the rationale that, if a zero delta exists, it is on the edge if there is a vertex of a corresponding coordinate axis on each side of the relative aperture origin causing an edge to traverse therethrough.

A table lookup arrangement in accordance with the program listing will now be discussed as illustrative of other methods of upgrading the minimum absolute delta table. The description of the minimum absolute delta table operations will now be discussed with reference to FIG. 10E. Operation proceeds to element AP3B for loading the absolute delta-X and delta-Y coordinates into registers B and C in element 10P85; then constructing the table lookup pointer in element 10P86. The pointer is constructed by placing the sign bit of the X and Y coordinate for the delta vertex in the least significant bit positions of the pointer register, multiplied by two, and accessing the absolute delta table therewith. The factor of two is used because this table has been constructed with pairs of coordinates, minimum absolute delta-X and minimum absolute delta-Y coordinates. Therefore, pairs of coordinates are processed with the factor of two. The sign of the delta-X and delta-Y components are related to the quadrant, as described above. A table lookup for the absolute delta-X coordinate is performed in element 10P87 and the previous minimum absolute delta-X and the present absolute delta-X coordinates are subtracted to determine the smaller coordinate in element 10P88. If the difference is non-zero, then operation proceeds along the NON-ZERO path from element 10P89 to element 10P94 to determine which component is smaller. If the difference is positive, the absolute delta-X previously stored is smaller; where operation proceeds along the plus path from 10P94 to conclude the minimum absolute delta-X processing. If the difference is negative, the absolute delta-X previously stored is larger; where operation proceeds along the minus path from element 10P94 to replace the previous minimum absolute delta-X coordinate in the table with the present absolute delta-X coordinate and to replace the previous corresponding delta-Y coordinate in the table with the present corresponding delta-Y coordinate in element 10P93; to conclude the minimum absolute delta-X processing. If the minimum absolute delta-Y coordinate from the table and the present delta-X coordinate are equal, operation proceeds along this zero path from element 10P89 to check the corresponding absolute delta-Y coordinate in operations 10P90 to 10P93 by accessing the corresponding absolute delta-Y coordinate from the table in operation 10P90, by subtracting the table parameter from the present absolute delta-Y coordinate in element 10P91, and by testing the sign of the difference therebetween in element 10P92. If the absolute delta-Y coordinate, from the table is smaller than the present absolute delta-Y coordinate, operation proceeds along the minus path from element 10P92 to conclude the absolute minimum delta-X processing. If the present corresponding absolute delta-Y coordinate is greater than the previous corresponding absolute delta-Y coordinate from the table, operation proceeds along the plus path from element 10P92 to element 10P93 to load the present absolute delta-X and delta-Y coordinates into the table and then to exit the minimum absolute delta-X processing.

The features of the system of the present invention have been demonstrated on an experimental system, which is discussed herein, such as with reference to FIG. 17. Computer listings used to demonstrate the aperture processor are attached hereto in the Tables Of Computer Listings in the sub-table entitled Aperture Processor. These listings are compatible with various aperture processor descriptions herein, such as using common mneumonics and symbols, and provide extensive supplemental details, such as in the annotations in the left hand columns and the details of the assembly language code in the middle column.

Hierarchial Aperture Processing

Aperture processors can be partitioned to perform a type of hierarchial processing, where more probable conditions involving lower processing bandwidth can be performed first and less probable conditions involving higher processing bandwidth can be performed in a sequence of (a) probability of occurrence and (b) processing bandwidth involvement.

Aperture processing will now be discussed for an illustrative application. In this application, there are multitudes of small surfaces distributed throughout the viewport. Therefore, a simpler initial determination of inside and outside conditions can be performed, resulting in classification of most surfaces as inside or outside aperture conditions; with only a minority of surfaces involving further processing; i.e.; slope comparison processing. Surfaces involving further processing may have a higher proportion of triple quadrant conditions then double quadrant conditions. Triple quadrant slope comparison processing is simpler than double quadrant slope comparison processing because only a single slope comparison is needed for a triple quadrant condition and a double slope comparison may be needed for a double quadrant condition. The relatively small percentage of surfaces involving double quadrant slope processing can be categorized as either a single slope comparison or a double slope comparison, dependent upon surface and aperture conditions. If the aperture condition cannot be determined from a single slope comparison, a second slope comparison can be performed to then resolve the aperture condition.

Aperture Scanner Demonstration

The aperture processor can be used to find whether a surface encompasses a pixel. In this mode of operation, a single pixel may be compared with a plurality of surfaces to find which of the surfaces encompasses the pixel. For demonstration purposes, the aperture processor configuration shown in FIGS. 10A to 10E compares an aperture pixel against a plurality of surfaces stored in the GPFIF FIFO. This is achieved by sequentially accessing a plurality of surfaces stored in the FIFO and comparing each set of the surface verticies with the aperture pixel using the aperture processor to determine inside, outside, or edge conditions. This capability was demonstrated with printouts in disclosure documents referenced herein to demonstrate that a pixel inside of a triangular surface can be identified as an inside or an outside pixel for that triangular surface.

A demonstration was provided in Disclosure Document No. 115,301 (Mar. 2, 1983) at pages 24 to 70 therein; providing a determination of the conditions for all pixels in the viewport relative to a particular surface for aperture processing. This is achieved by comparing each pixel in the viewport as the aperture pixel with the verticies of a surface to determine if it is inside, outside, or on the edge of the surface and displaying an I, O, or N character respectively for that pixel position. This comparison and display is provided for each pixel in the viewport in a Scanned manner starting with pixel 00 at the upper left hand corner of the screen and processing to pixel 23, 63 in the lower portion of the screen. After each comparison, the FIFO is reset to the start of the surface information and the aperture pixel scanner is advance one pixel for the next comparison. In this manner, a comprehensive view of operation of the aperture processor is obtained as the aperture processor classifies each pixel in the viewport. Therefore, if the occulting processor selected a particular pixel for a comparison with a surface, the condition of that aperture pixel relative to that surface, could be obtained by viewing the printouts on the comprehensive aperture processor printouts. A copy of the above described printouts are provided in the Aperture Processor Tables hereinafter.

Concave Surfaces

The configuration of the aperture processor discussed with reference to FIGS. 10A to 10E herein is based upon processing of convex surfaces. It can be adapted to processing of concave surfaces in applications requiring such capability. Various arrangements for aperture processing of concave surfaces will now be discussed.

An aperture processor configuration for generating the edge pixels between surface verticies can be adapted to aperture processing for concave surfaces. It can be used in conjunction with the inside/outside processor, determining whether the pixel is inside of the surface or outside of the surface based upon edge vector directions. The edge pixels around the periphery of the surface are generated in sequence using the edge processor, as previously discussed. Each edge pixel is compared with the aperture pixel to determine if the aperture pixel is inside or outside of the surface bounded by the edge pixels. A relationship can be derived for determining the inside or outside condition of a pixel based upon the signs of the vector from the edge pixel to the aperture pixel and based upon the sign of the vector from the edge startpoint to the edge endpoint, considering clockwise (or alternately counterclockwise) motion around the surface. For example, for clockwise motion and for an edge vector of +X and +Y, an aperture vector of +X and −Y represents an inside aperture pixel and an aperture vector of −X and +Y represents an outside aperture pixel. If the aperture pixel is inside for each and every one of the edge pixels, then the aperture may be encompassed by the surface. If a single one or more outside vectors for the same aperture pixel are detected, then the aperture may be outside of the surface. However, the condition where an inside aperture can have a vector to an edge pixel going through a concaveness can appear to be an outside pixel. Therefore, this condition can be detected with additional processing.

An alternate configuration for performing aperture processing for concave surfaces will now be discussed. The edge processor can be used to generate the edge pixels for a particular surface and an aperture processing flag can be stored in each edge pixel for this surface in pixel memory; similar to that discussed for the P-flag or N-flag in the occulting processor. The delta-X and delta-Y vector components can be derived for each edge pixel during edge generation and the address of edge pixels having zero delta-X and zero delta-Y vector components can be stored in a buffer register. A vector can be generated from the zero delta pixel to the aperture pixel on a pixel by pixel basis by incrementing the coordinate in the inside direction. If the aperture pixel is encountered before an edge pixel is encountered, then the aperture is inside of the surface. If an edge pixel is encountered before the aperture pixel is encountered, the condition is indeterminate.

An aperture processor configuration that will perform with convex surfaces is shown in the flow diagrams of FIGS. 10K-1, 10K-2, 10K-3, and 10K-4. This configuration is based upon detection of transitions across coordinate axes, characterizing such transitions, counting transitions across each axis, and performing slope comparisons for transitions between non-adjacent axes.

SLOPE COMPARISON REGISTER TABLES

TRIPLE QUADRANT REGISTER TABLE

| QUADRANTS | | | | | SLOPE REGISTERS | | | |
|---|---|---|---|---|---|---|---|---|
| P | 1 | 2 | 3 | 4 | APAXM | APAYL | APBXM | APBYL |
| 7 | 0 | 1 | 1 | 1 | 2 | A | D | 5 |
| 11 | 1 | 0 | 1 | 1 | 0 | 8 | F | 7 |
| 13 | 1 | 1 | 0 | 1 | 4 | C | B | 3 |
| 14 | 1 | 1 | 1 | 0 | 6 | E | 9 | 1 |

DOUBLE QUADRANT REGISTER TABLE

| | SLOPE REGISTERS | |
|---|---|---|
| QUADRANTS | FIRST ITERATION | SECOND ITERATION |

-continued

SLOPE COMPARISON REGISTER TABLES

| P | 1 | 2 | 3 | 4 | APAXM | APAYL | ADBXM | APBYL | APAXM | APAYL | APBXM | APBYL |
|---|---|---|---|---|---|---|---|---|---|---|---|---|
| 5 | 0 | 1 | 0 | 1 | 0 | 8 | F | 7 | 6 | E | 9 | 1 |
| 10 | 1 | 0 | 1 | 0 | 2 | A | D | 5 | 4 | C | B | 3 |

APERTURE PROCESSOR CONDITION TABLE

| INPUT QUADRANTS | | | | | OUTPUT | SLOPE COMPARISON REGISTERS | | | | |
|---|---|---|---|---|---|---|---|---|---|---|
| P | 1 | 2 | 3 | 4 | APB TABLE | APAXM | APAYL | APBXM | APBYL | NOTES |
| 0 | 0 | 0 | 0 | 0 | 00 | | | | | Can't happen. |
| 1 | 0 | 0 | 0 | 1 | 07 | | | | | Aperture outside of surface |
| 2 | 0 | 0 | 1 | 0 | 07 | | | | | Aperture outside of surface |
| 3 | 0 | 0 | 1 | 1 | 07 | | | | | Aperture outside of surface |
| 4 | 0 | 1 | 0 | 0 | 07 | | | | | Aperture outside of surface |
| 5 | 0 | 1 | 0 | 1 | 0D | 2 | A | D | 5 | Indeterminate (double |
| | | | | | | 4 | C | B | 3 | quadrant condition) |
| 6 | 0 | 1 | 1 | 0 | 07 | | | | | Aperture outside of surface |
| 7 | 0 | 1 | 1 | 1 | 0A | 2 | A | D | 5 | Indeterminate (triple quadrant condition) |
| 8 | 1 | 0 | 0 | 0 | 07 | | | | | Aperture outside of surface |
| 9 | 1 | 0 | 0 | 1 | 07 | | | | | Aperture outside of surface |
| 10 | 1 | 0 | 1 | 0 | 0C | 0 | 8 | F | 7 | Indeterminate (double |
| | | | | | | 6 | E | 9 | 1 | quadrant condition) |
| 11 | 1 | 0 | 1 | 1 | 08 | 0 | 8 | F | 7 | Indeterminate (triple) quadrant condition) |
| 12 | 1 | 1 | 0 | 0 | 07 | | | | | Aperture outside of surface |
| 13 | 1 | 1 | 0 | 1 | 0B | 4 | C | B | 3 | Indeterminate (triple quadrant condition) |
| 14 | 1 | 1 | 1 | 0 | 09 | 6 | E | 9 | 1 | Indeterminate (triple quadrant condition) |
| 15 | 1 | 1 | 1 | 1 | 06 | | | | | Aperture inside surface |

REFRESH MEMORY (FIGS. 13 AND 14)

Figure 13F:
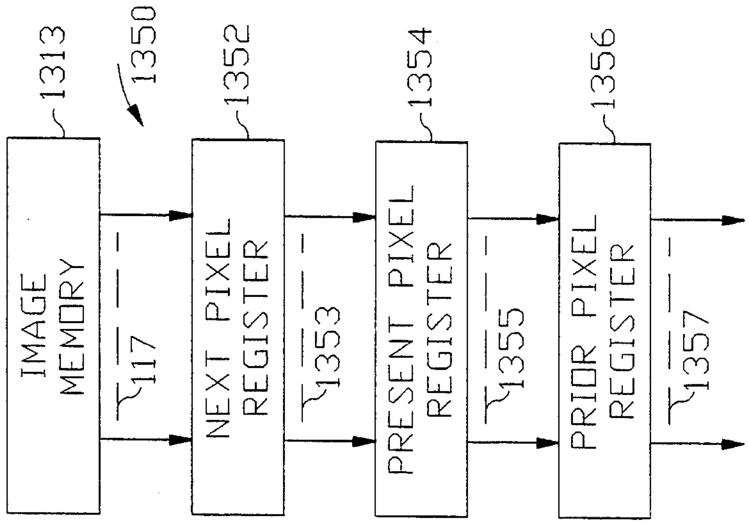
FIGS. 13A, 13B, 13C, 13D, 13E and 13F, illustrates refresh memory configurations; where
Figure 13C:
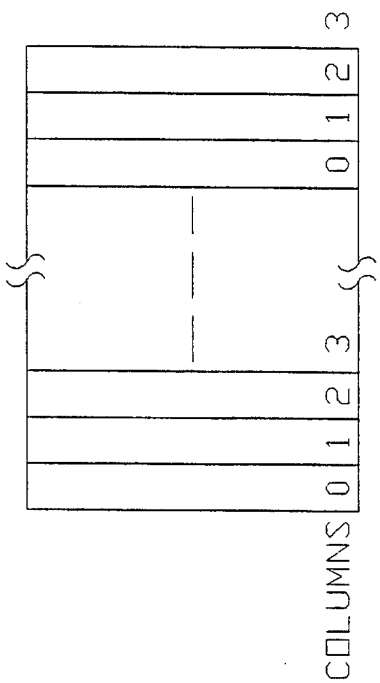
Figure 13D:
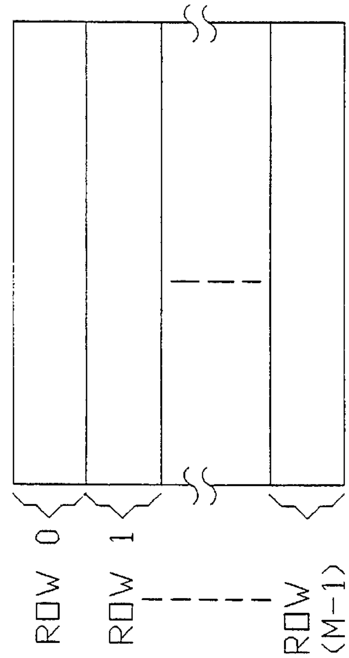
Figure 13A:
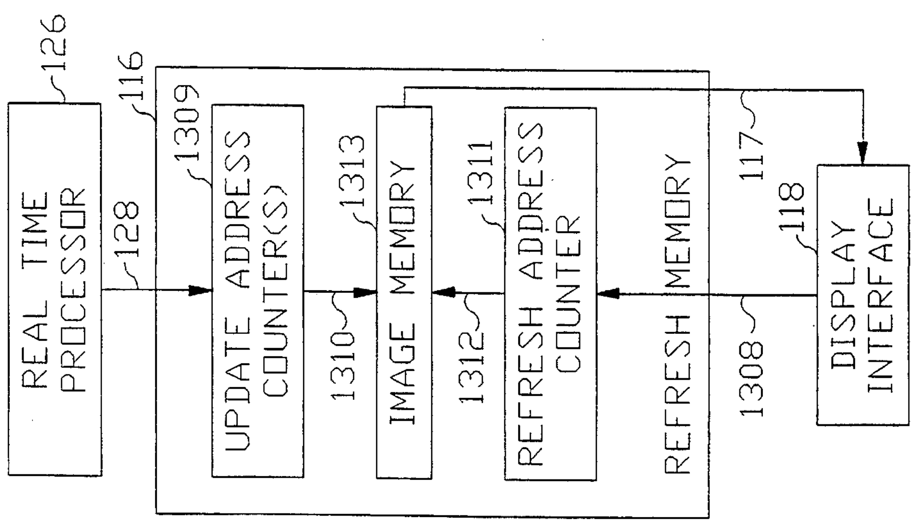

Introduction (FIG. 13A)

Refresh memory 116 provides image storage for interfacing a visual processor to a display monitor. Several refresh memory configurations will be discussed as being exemplary of the broader features of the present invention. These discussed configurations involve digital, random access, memory mapped, asynchronous update and refresh, single buffer features. However, other arrangements may be provided; such as analog and hybrid storage, sequential access, non-memory mapped, Synchronous update and refresh, and double buffer arrangements. The discussed configurations involve excitation of a color CRT display monitor with raster scan red-green-blue (RGB) color signals. However, other arrangements may be provided, such as refreshing with calligraphic vector signals instead of raster scan signals, refreshing with black and white signals or non-RGB color signals for a display monitor using a non-color CRT display monitor (i.e., a black and white CRT monitor); and refreshing a non-CRT display monitor such as liquid crystal, plasma, or other display monitor.

A refresh memory 116 (FIG. 1) can be provided for interfacing visual processor 114 to display monitor 118. Although direct interfacing of visual processor 114 to display monitor 118 may be provided without using a refresh memory, refresh memory 116 can provide advantages such as storing of information that has not changed to reduce redundant processing, permitting asynchronous operation between update operations and refresh operations, performing scan conversion from vector updating to raster scan refreshing, and providing other capabilities.

The refresh memory configuration is an important feature of the present invention that contributes to a significant reduction in the processing bandwidth. Visual systems represent continuous operations, where changes are second order considerations. First order considerations are the static scene features, much of which do not change from frame-to-frame. Conventional visual systems regenerate the whole scene each frame, involving redundant processing of static information. However, refresh memory 116 can store static information from frame-to-frame, thereby reducing redundant processing of static information. Also, extrapolative processing is relatively simple. Changes are usually not independent and arbitrary, but are usually continuations of already processed conditions. For example, fill processing is a heavy processing load in conventional visual systems. However, in the present configuration, fill may be merely a determination of which of two adjacent surfaces fill a pixel. In one condition, the surface with the smaller range fills the pixel. This is a simple arithmetic subtraction of ranges. In another condition, the adjacent surface fills the pixel without any arithmetic operations. These simple extrapolative operations can be used to replace complex time-consuming regenerative operations, such as implemented in conventional visual systems.

Refresh memory 116 may be implemented as an asynchronous refresh memory, permitting substantially simultaneous and relatively unsynchronized inputting for updating and outputting for refresh. One refresh memory configuration multiplexes update address 1310 from update address counter 1309 together with refresh address 1312 from refresh address counter 1311 for interleaved update and refresh operations (FIG. 13A). Alternately, refresh memory 116 can be partitioned into segments, where segments that are being accessed by refresh address counter 1311 are not being addressed by update address counter 1309; permitting different segments of memory to be used simultaneously for different operations. Because update operations may be random access operations and therefore may have greater operational flexibility, the task of contention resolution may be assigned to update operations to avoid contention with sequential accessing by refresh operations.

One configuration of refresh memory 116 is shown in more detail in FIG. 13A. Refresh memory 116 can include image memory 1313 for storing image information, refresh address counter 1311 for scanning image information 117 out of image memory 1313 to display interface 118, and update address counter 1309 for updating the image information in image memory 1313. Update address counter 1309 may be included as part of real time processor 126, such as derived from processing with edge processor 131 or associated with fill processing logic and smoothing processing logic. However, for simplicity of illustration, update address counter 1309 is shown included in refresh memory 116.

In one configuration, image memory 1313 may be composed of a pixel memory having a memory map of the image, discussed herein with reference to FIGS. 13A to 14D. The memory map may include a separate pixel word for each pixel in memory map form. A pixel memory is discussed in detail with reference to FIGS. 14A to 14D herein. Image memory 1313 can also include surface memory 1421 in combination with pixel memory 1405, as discussed herein with reference to FIG. 14E.

Refresh address counter 1311 may be characterized as a sequential access counter and update address counter 1309 may be characterized as random access counter. Refresh address counter 1311 may sequence through a set of fixed addresses to trace a raster scan through an image stored in image memory 1313, where image memory 1313 may represent a map of a raster scanned scene. Update address counter 1309 may access pixels to be tested and pixels to be updated in accordance with updating, as determined by real time processor 126. This updating may be the accessing of a pixel word along the edge of a moving object for filling the line and smoothing determination and updating. The pixels along the edge may be along an arbitrary defined line making an arbitrary angle with the raster scan lines, therefore involving random access of image memory 1313.

Refresh memory 116 can be addressed with two address counters, which are refresh address counter 1311 and update address counter 1309. Refresh address counter 1311 can be implemented as an sequential address counter for counting through lines of pixels and pixels per line in synchronism with raster scan of a CRT. Update address counter 1309 can be implemented as a random address counter for random accessing of pixels for updating. A memory multiplex arrangement may be used to reduce memory access bandwidth requirements for refreshing. Also, the raster scan lines may be grouped into rows to reduce contention between updating and refreshing. Refreshing may be synchronous with the raster scan and may have priority over updating if contention occurs. Under preferred operations, updating and refreshing proceed in different rows. However, if updating should proceed into a refresh row, priority may be given to refreshing if contention occurs. Update buffer registers may be provided to buffer update information in the event of contention to permit refreshing to take control in configurations where refreshing has priority.

Refresh memory architecture facilitates updating from real time processor 126 and refreshing of display monitor 120. Updating may be asynchronous with refresh. Refresh may be synchronous with the CRT raster scan. Therefore, refresh may have priority over updating if contention occurs. Circumvention and resolution of contention can be achieved with many configurations. One configuration provides for buffering of update information if contention occurs. Another configuration provides for updating a row of the refresh memory that is different from the refresh row to minimize contention. Various configurations are discussed herein to facilitate such memory architecture.

Alternate memory configurations may be provided in place of refresh memory 116. For example, visual processor 114 may store visual information 115 in an auxiliary memory such as a disk memory, tape memory, optical memory, or other memory; which can be accessed as required to excite a display monitor. This may be a non-real time system for generating images from the auxiliary memory and accessing the auxiliary memory when it is desired to display the images. This arrangement can be characterized by a video tape recorder recording output signals from visual processor 114, such as for eventual playback to display monitor 120.

Refresh memory 116 has been discussed in the form of a digital refresh memory using integrated circuits RAMS. However, other arrangements may be used. For example, refresh memory 116 can be implemented with other types of digital memory circuits and can be implemented with analog memory circuits. Other types of digital memory circuits include digital shift registers, digital EROMs, magnetic core memories, digital bubble memories, and other digital memories. Analog memory circuits may be implemented with charge transfer devices (CTD) such as charge coupled devices (CCDs), analog bubble memories, and other analog memories such as described in the related patent application Ser. No. 889,301 now U.S. Pat. No. 4,322,819 and parent applications referenced therein.

A refresh memory arrangement has been discussed using update address counter logic for updating an image stored in refresh memory 116 and refresh logic for refreshing display monitor 120. Other configurations thereof may be provided, such as updating during refreshing under control of the refresh address counter in place of or in addition to updating with an update address counter.

Various calculations associated with color, intensity, and visual effects; such as smoothing, range variable intensity, programmable intensity, and others; may be processed in the digital domain and stored in refresh memory 116. For example, the RGB color nibbles can be preprocessed in the digital domain for smoothing, intensity, and other illumination effects as an alternate to being processed in the hybrid domain, such as shown in FIGS. 15 and 16.

For a configuration where color, intensity, and other conditions are precalculated in the digital domain and stored in refresh memory 116, it may be desireable to store the unprocessed parameters together with processed parameters, such as for making changes to the original parameters. For example, each color nibble may be multiplied by each programmable intensity parameter, multiplied by each inverse intensity parameter, adapted for shading and other illumination effects, and stored in refresh memory 116 as processed color nibbles for outputting to display interface 118 (FIG. 15). However, in addition to storing processed color nibbles; it may be desireable to store unprocessed or semi-processed color nibbles and various intensity and other illumination parameters used to process the color nibbles in image memory 1313 or parameter memory 1361.

Refresh memory may be considered to be a multiported memory, such as having one or more update ports and one or more refresh ports. Contension between refresh memory accesses can be improved with various methods, such as by partitioning of refresh memory, as discussed with reference to FIGS. 13 and 14. Contension can be further resolved using priority and arbitration logic. For example, refresh operations may have a high priority, update processing may have a lower priority, and verification processing may have a yet lower priority. Contension can be resolved in favor the the higher priority.

Double buffer arrangements are sometimes used in the prior art, such as described in the Dichter article referenced hereinafter. However, double buffers may result in an unnecessary duplication of memory. This is because the refresh memory can be updated on the fly substantially simultaneously with the outputting thereof to the raster scan display. Implicit in the integration of the eye and the thirty frame per second real time continuous visual features, it may not be possible for an operator to determine if objects were updated periodically at a different time during a previous frame or were updated simultaneously with the start of a new frame. For example, if the raster scan has progressed to a position one-half way down the face of the display and correspondingly one-half of the way through the pixel map memory; changes made in the top half of the pixel map memory may not be displayed to the observer until the next frame, as in the case of a double buffer arrangement. Changes made in the lower half of the pixel map memory may be displayed during the frame in progress. However, the human eye may not be able to resolve in which of two adjacent frames an object was updated; implicit in the reason for refreshing and updating at thirty frames per second rate for continuous flicker free displays.

The features of the system of the present invention have been demonstrated on an experimental system, which is discussed herein, such as with reference to FIG. 17. Computer listings used to demonstrate the refresh memory are attached hereto in the Tables Of Computer Listings in the sub-table entitled Refresh Memory and Surface Memory. These listings are related to various refresh memory and surface memory descriptions herein and provide supplemental materials, such as in the annotations in the left hand columns and the details of the assembly language code in the middle column.

Refresh Memory Bandwidth Consideration

The refresh memory configuration discussed herein has important advantages for read and write cycle bandwidth considerations. Systems implemented without a refresh memory are relatively independent of these considerations, but have higher processing bandwidth requirements. Systems implemented with a double buffer refresh memory are also relatively independent of these considerations, but have higher memory storage requirements. Systems implemented with single buffer refresh memory that recalculates the whole environment for each frame having significant disadvantages. This is because such single buffer systems require update of all refresh memory information for a frame in addition to the read-out memory information for the same frame; thereby requiring an excessive amount of read and write cycles (memory cycle bandwidth per frame).

One configuration of the present system reads out all the visible refresh memory information each refresh frame. However, it updates only a relatively small amount of information for each frame, being the changes in the refresh memory information. Updating for changes in information, as discussed for the present system, represents a significant reduction in refresh memory cycle bandwidth requirements compared to a system updating all information in the refresh memory for each frame. For example, if a scene has 100 objects and only one of these objects is moving; conventional systems require update of information pertaining to all 100-objects, whether stationary or moving, while the present system only requires update of information pertaining to the single moving object. This represents a significant reduction in memory cycle bandwidth requirements for the present system.

Figure 13B:
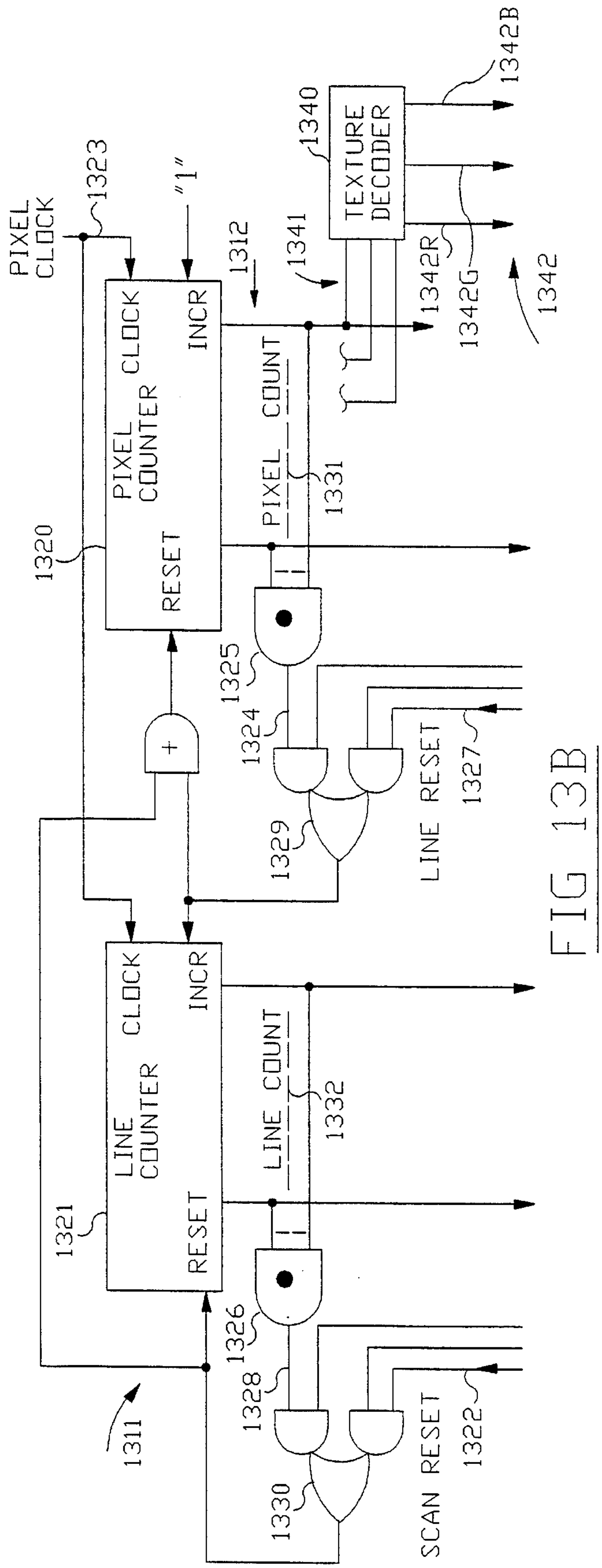

Refresh Address Counter (FIG. 13B)

A refresh address counter may be used for accessing the refresh memory in a raster scan format to generate a sequence of pixel words consistent with a raster scan through the refresh memory. The refresh address counter may be implemented in various configurations. In one configuration, it may be implemented as a single counter for counting through both, the raster scan lines and the pixels per line. In another configuration it may be implemented as separate counters for raster scan lines and pixels per line. Other configurations may also be used.

An arrangement having separate counters for raster scan lines and for pixels per line will now be discussed with reference to FIG. 13E. Refresh address counter 1311 has pixel counter 1320 for counting pixels as the raster scan line progresses from left to right of the display and line counter 1321 for counting lines as the raster scan progresses from top to bottom of the display. In one configuration, the display has 600-pixels per line and 525-lines per scene. This 600-pixels per line and 525-lines per scene arrangement accesses 315,000 pixels (525 lines by 600 pixels per line) in raster scan from. Address counter 1311 can be synchronized to the raster scan by detecting the start of the scan as the electron beam retraces to the top left-hand corner of the scan for resetting line counter 1321 and pixel counter 1320 with scan reset signal 1322 to initiate start of a new scan. Image memory 1313 may be configured as a memory map of a CRT face and, therefore, may be accessed in raster scan form with line counter 1321 and pixel counter 1320.

Pixel counter 1320 is enabled to count pixel clock pulses 1323, where the incremental input INCR to pixel counter 1320 is shown one-set and where pixel clock pulses 1323 are used for clocking pixel counter 1320. Pixel counter 1320 counts from the reset condition to the last pixel per line, resulting in overflow signal 1324 detected with AND-gate 1325 to synchronously reset pixel counter 1320 for the start of the next line and to increment line counter 1321 to the next line. Line counter 1321 is incremented with the pixel clock signal when the increment input INCR is true, indicative of the end of the last line as detected with AND-gate 1325. In this manner, pixel counter 1320 counts the pixels for line after line. The last pixel in a line causes line counter 1321 to be incremented to the next line.

Line counter 1321 is incremented vertically downward in the display until the last line is detected with AND-gate 1326, which synchronously resets line counter 1321 and pixel counter 1320 for returning to the upper left hand corner pixel to restart the raster scan. Alternately, counter reset with AND-gate 1325 and AND-gate 1326 can be supplemented or replaced by external synchronization signals. New scan reset signal 1322 can reset line counter 1321 and pixel counter 1320 to the start of a scan and new line reset signal 1327 can reset pixel counter 1320 to the start of a line and increment line counter 1321 to the next line. Internal reset signals 1324 and 1328 and external reset signals 1327 and 1322 may be used together or separately, depending upon the implementation, and may be selected with gates 1329 and 1330 for selection of one or the other or both together.

Refresh counter operation will now be illustrated using a configuration having 600-pixels per line and 525-lines per scene. Pixel counter 1320 may be a 10-bit modulo-599 counter for counting from 0 to 599 for 600 counts and line counter 1321 may be a 10-bit modulo-524 counter for counting from 0 to 524 for 525 counts. One form of implementing a modulo-599 and a modulo-524 counter is with AND-gate 1325 and AND-gate 1326 respectively for detecting count-599 of pixel counter 1320 and count-524 of line counter 1321 respectively to generate modulo-599 output signal 1324 and modulo-524 output signal 1328 respectively for resetting pixel counter 1320 and incrementing line counter 1321 with modulo-599 signal 1324 and for resetting line counter 1321 and resetting pixel counter 1320 with modulo-524 signal 1328 respectively. Pixel counter 1320 generates binary pixel count signals 1331 and line counter 1321 generates binary line count signals 1332 which are used to access image memory 1313 to obtain raster format stored pixel words for output to display interface 118. As line counter 1321 increments through the raster scan lines, memory locations pertaining to the selected lines are enabled with line count binary signals 1332. As pixel counter 1320 increments through the pixels pertaining to the line enabled with line counter signals 1332; memory locations pertaining to the sequential pixels along the enabled line are accessed from memory 1313.

Counting of pixels per line and lines per frame has been discussed with reference to FIG. 13B. As is well known in the art, CRT displays have a retrace after each line to the start of the next line and a retrace at the end of the frame to the start of the next frame. These features are conventionally implemented in the CRT monitor with raster scan circuits. In some CRT monitors, synchronization (sync) signals are generated to indicated the start of a new scan line and the start of new frame. Alternately, some CRT monitors make provision for receiving line and frame sync signals from a visual processor. Sync signal generating circuits are well known in the art. Also, integrated circuit chips providing such synchronization are commercially available. Therefore, line and frame sync signals may be readily available, either from the CRT monitor or from an interface circuit, to synchronize refresh address counter 1311 (FIG. 13B) with the raster scan of the CRT monitor. In one configuration, an external sync signal may be received by refresh address counter 1311, where the line sync signal may be input as line reset signal 1327 and the frame sync signal may be input as scan reset signal 1322 to synchronize each line in each frame with the monitor. Alternately, refresh address counter 1311 may be used to generate the sync signals, such as using a properly decoded line signal, as with signal 1324, to generate the line sync signal to the CRT monitor and such as using a properly decoded frame signal, as with signal 1328, to generate the frame sync signal to the CRT monitor. Pixel counter 1320 may include additional counts at the end of the line of pixels to control the line retrace operation and line counter 1321 may include additional counts at the end of the last line to control the frame retrace operation.

Figure 13E:
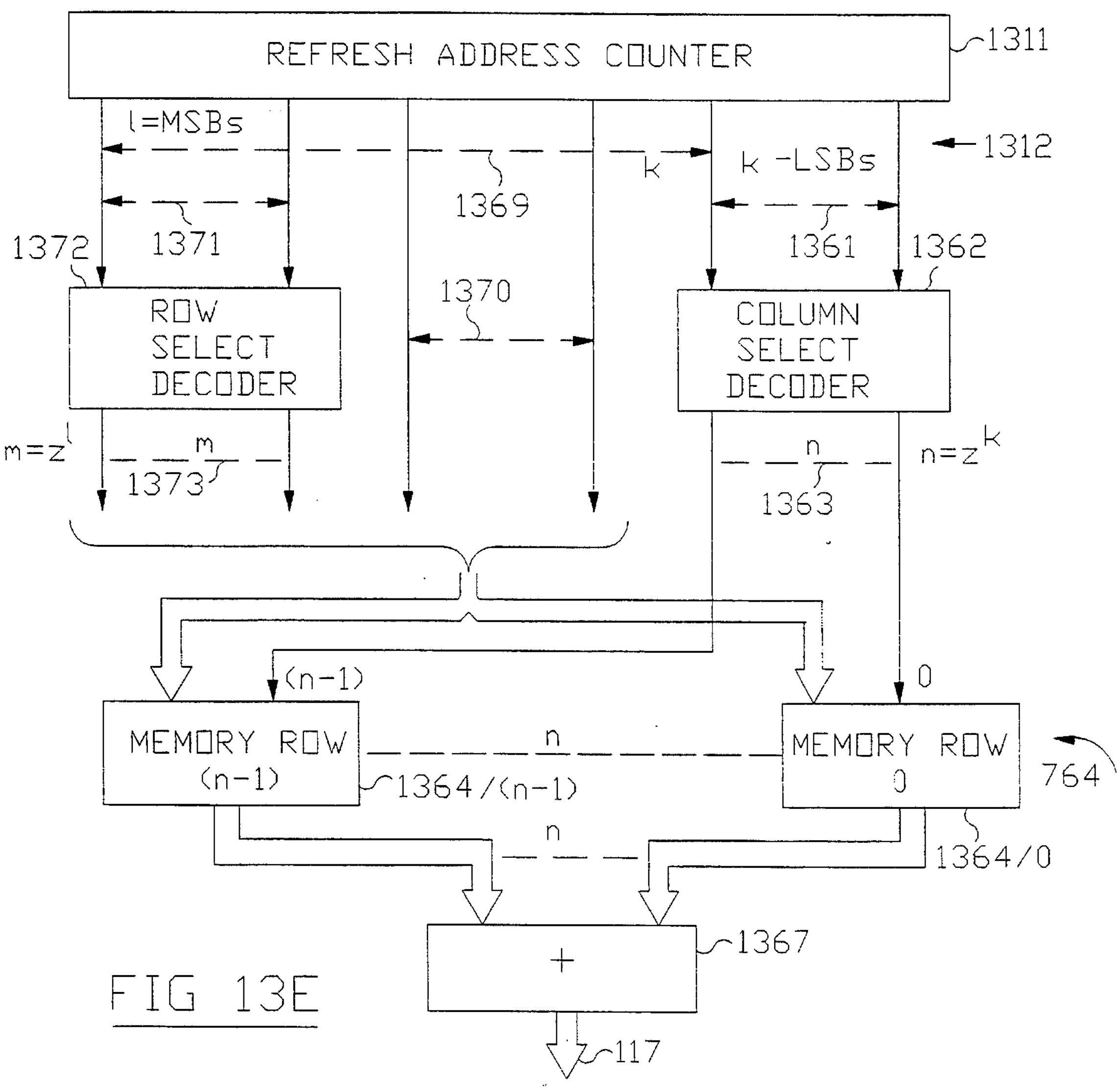

Memory Multiplexing (FIGS. 13C–13E)

Memory multiplexing may be provided to enhance memory operation. For example, vertical column multiplexing (FIG. 13C) may be provided for memory access bandwidth reduction and horizontal row multiplexing (FIG. 13D) may be provided for memory refresh and update contention resolution. One implementation thereof will now be discussed with reference to FIGS. 13C–13E.

Refresh rates may be relatively high, approaching and possibly exceeding memory cycle rates. Multiplexing of memory chips can reduce refresh access rates for any one chip. For example, multiplexing of four different memory columns can reduce refresh memory access bandwidth by four times. This can be implemented by establishing four different vertical refresh memory columns (FIG. 13C), one column for each forth pixel along a refresh line; where a memory column stores each fourth pixel. Therefore, each fourth pixel accessed from memory 1313 can be stored in the same memory column.

A four column multiplexing arrangement will now be discussed in greater detail. Refresh address counter 1311 may be used to select the four vertical memory columns in sequence, where the two LSBs of refresh address counter 1311 can be decoded to provide four demultiplexed select lines. Therefore, sequencing of refresh address counter 1311 selects the four memory columns in sequence and repetitively as the raster scan progresses across the scan line. Other forms of multiplexing may be provided, such as a dual memory column arrangement for two times reduction in memory access bandwidth or other such form. Non-binary multiplexing configurations, such as a six memory column arrangement can be provided with address counter decoding as a modulo-5 decoder; 0 to 5 for a 6 count decoder. Modulo-1, modulo-3, modulo-6, modulo-8, and other modulo decoders can be readily provided to facilitate the desired number of multiplexed memory columns.

A horizontal row multiplexing arrangement, shown in FIG. 13D, may be implemented similar to that discussed above for vertical column multiplexing in order to reduce contention between update and refresh operations. For example, multiplexing of five different memory rows each having 105 raster lines can extensively reduce contention for memory accesses. This can be implemented in a 525 line refresh system by establishing five different horizontal refresh memory rows, each having 105 lines.

Refresh address counter 1311 may be used to select the five horizontal memory rows in sequence, where MSBs of refresh address counter 1311 can be decoded to provide five demultiplexed row select lines. Therefore, sequencing of refresh address counter 1311 can select the five memory rows in sequence. Other forms of multiplexing may be provided, such as a dual row arrangement, a four row arrangement, a six row arrangement, an eight row arrangement, a ten row arrangement, or other arrangements. Non-binary multiplexing configurations, such as the above mentioned five row arrangement can be provided with address counter decoding as a modulo-4 decoder, 0 to 4 for a 5 counter decoder. Modulo-1, modulo-3, modulo-6, modulo-8, and other modulo decoders can be readily provided to facilitate the desired number of multiplexed memory groups.

One memory multiplexing arrangement is shown in FIG. 13E. Refresh address counter 1311 counters through a sequence of pixels, where LSBs 1331 represent pixels along a scan line and MSBs 1332 represent scan lines. LSBs 1361 and MSBs 1371 may be decoded with the decoders 1362 and 1372 respectively to generate decoded signals 1363 and 1373 respectively. There is a binary exponential relationship between the binary input bits 1361 and 1371 respectively and the decoded output lines 1363 and 1373 respectively. For example, The k-LSBs may be decoded to n-lines based upon the relationship of 2. Hence, 2-lines can be decoded to 4n-lines and 4k-lines can be decoded to 16n-lines. Memories 1364 may be accessed with decoded LSB signal 1363 for selecting the memory column and undecoded MSB signals 1369 selecting the word in the memory column. Decoded lines 1363 and 1373 may be used to select the memory columns and horizontal rows respectively, such as with the chip select line on commercially available memory chips. Non-decoded lines 1370 may be used to select the pixel word in the memory chips. The output of the memories may be ORed together so that the pixel word in the selected memory is output from OR-gate 1367 as signals 117. Alternate, OR-gate 1367 may be implemented as a wired-OR or other implementation thereof.

For convenience of illustration, a memory multiplexing arrangement having 4-columns of 150-pixels per column and 5-rows having 105-lines per row for a display having 600-pixels per line and 525-lines will now be discussed. However, other multiplexing arrangements may be provided. For example, column multiplexing may be provided without row multiplexing, row multiplexing may be provided without column multiplexing, and column and row multiplexing may be provided together having various multiplexing configurations. The multiplexing configuration discussed above has 150-pixels per column and 150-lines per row. Alternately, other quantities of pixels per column and lines per row may be provided for various display monitor configurations. For example, the Column Multiplexing Table shows different quantities of columns per memory and the related pixels per column for different display configurations of pixels per line; including 525, 600 and 1200 pixels per line configurations. For example, the Column Multiplexing Table shows different quantities of columns per memory and the related pixels per column for different configurations of pixels per lines.

Also, the Row Multiplexing Table shows different quantities of lines per row for different display configurations of lines per display; including 525 and 1200 lines per display configurations. For example, the Row Multiplexing Table shows different quantities of lines per row and the related rows per memory for different configurations of line per display. The Column Multiplexing Table and Row Multiplexing Table list exemplary configurations having integer quantities. Other configurations may be provided having integer quantities and having non-integer quantities.

Refresh memory 116 may be configured with memory blocks organized into rows and columns as discussed with reference to FIGS. 13C–13E. Each block may be implemented with one or more memory chips to provide the desired memory architecture. Memory

COLUMN MULTIPLEXING TABLE

| PIXELS PER LINE | COLUMNS PER MEMORY | PIXELS PER COLUMN |
|---|---|---|
| 525 | 5 | 105 |
| 525 | 7 | 75 |
| 525 | 15 | 35 |
| 525 | 24 | 25 |
| 525 | 25 | 21 |
| 525 | 35 | 15 |
| 525 | 75 | 7 |
| 525 | 105 | 5 |
| 600 | 2 | 300 |
| 600 | 3 | 200 |
| 600 | 4 | 150 |
| 600 | 5 | 120 |
| 600 | 6 | 100 |
| 600 | 8 | 75 |
| 600 | 10 | 60 |
| 600 | 12 | 50 |
| 600 | 15 | 40 |
| 600 | 20 | 30 |
| 600 | 24 | 25 |
| 600 | 25 | 24 |
| 600 | 30 | 20 |
| 600 | 40 | 15 |
| 600 | 50 | 12 |
| 600 | 60 | 10 |
| 600 | 75 | 8 |
| 600 | 100 | 6 |
| 600 | 120 | 5 |
| 600 | 150 | 4 |
| 600 | 200 | 3 |
| 600 | 300 | 2 |
| 1200 | 2 | 600 |
| 1200 | 3 | 400 |
| 1200 | 4 | 300 |
| 1200 | 5 | 240 |
| 1200 | 6 | 200 |
| 1200 | 8 | 150 |
| 1200 | 10 | 120 |

ROW MULTIPLEXING TABLE

| LINES PER DISPLAY | LINES PER ROW | ROWS PER MEMORY |
|---|---|---|
| 525 | 5 | 105 |
| 525 | 7 | 75 |
| 525 | 15 | 35 |
| 525 | 21 | 25 |
| 525 | 25 | 21 |
| 525 | 35 | 15 |
| 525 | 75 | 7 |
| 525 | 105 | 5 |
| 1200 | 2 | 600 |
| 1200 | 3 | 400 |
| 1200 | 4 | 300 |
| 1200 | 5 | 240 |
| 1200 | 6 | 200 |
| 1200 | 8 | 150 |
| 1200 | 10 | 120 |
| 1200 | 12 | 100 |
| 1200 | 15 | 80 |
| 1200 | 20 | 60 |
| 1200 | 24 | 50 |
| 1200 | 25 | 48 |
| 1200 | 30 | 40 |
| 1200 | 40 | 30 |
| 1200 | 50 | 24 |
| 1200 | 60 | 20 |
| 1200 | 75 | 16 |
| 1200 | 100 | 12 |
| 1200 | 120 | 10 |
| 1200 | 150 | 8 |
| 1200 | 200 | 6 |

-continued

| ROW MULTIPLEXING TABLE | | |
|---|---|---|
| LINES PER DISPLAY | LINES PER ROW | ROWS PER MEMORY |
| 1200 | 300 | 4 |

chips may be implemented in various forms; such as 1K, 2K, 4K, 8K, 16K, 64K, 256K, and other capacity memory chips. These memory chips maybe implemented as random access memories (RAMs), as CCD memories, or as other memories. In one illustrated configuration discussed with reference to the Memory Architecture Table and with reference to FIGS. 14A–14C herein, a memory architecture configured around 65K RAM chips will be described; where this description is exemplary of other chip configurations. Also, various chip architectures will be discussed including 65K by 1-bit, 16K by 4-bit, and 8K by 8-bit chip architecture; which are exemplary of other chip architectures.

For convenience of illustration, binary numbers herein may be rounded-off, where this roundoff is consistent with well known terminology and terms of art and will be apparent herein to one skilled in the art. For example, a 65K binary number is a roundoff of a 65,536 number; a 16K binary number is a roundoff of a 16,384 number; and an 8K binary number is a roundoff of an 8,192 number. Also, for simplicity of illustration, display resolution may be discussed in convenient dimensions. For example, a 512-line and 512-pixels per line configuration may be discussed for simplicity of binary number manipulations. However, there numbers may be readily converted to other numbers; such as 525-lines by 525-pixels per line, 525-lines by 640-pixels per line, 1050-lines by 1200-pixels per line, or other configurations.

Various memory architectures are summarized in the Memory Architecture Table to illustrate adaptation of one architecture discussed in detail herein to other memory architectures. Many other memory architectures may also be configured in accordance with the teachings herein to satisfy other requirements. The table is configured around 65K RAM chip configurations having 65,536 by 1-bit; 16,384 by 4-bit; and 8,192 by 8-bit configurations as noted in the Chip Configuration column. Assuming a 32-bit pixel word and assuming the need for parallel access of the pixel word, a quantity of chips may be grouped together to provide a parallel 32-bit word and groupings thereof may also be provided to implement the desired block size. Configurations of exemplary blocks are listed in the Bits/Block column; For example, four 8K by 8-bit chips may be grouped together to provide an 8K by 32-bit block and two grouping thereof provide a 16K by 32-bit block.

Exemplary numbers of pixels per block are listed in the Pixel/Block column. The number of pixels per block correspond to the number of 32-bit pixel words per block listed in the Bits/Block column. The number of chips per block may be calculated from the total number of 32-bit words in the Bit/Block column and dividing by 2,048; which is the number of 32-bit words in a 65K memory chip. The number of chips per block is summarized in the Chips/Block column. The combination of blocks per row and blocks per column for various memory architectures are listed in the Block/Row and Blocks/Column columns. The product of the Chips/Block, Block/Row, and Blocks/Column parameters for a particular memory configuration equals 128, which is the number of 65K chips needed to provide 262,144 (512-lines by 512-pixels per line) 32-bit pixel words; or 81,388,608 bits of memory. The number of lines per row may be calculated by multiplying the number of pixels per block in the Pixel/Block column by the number of blocks per row in the Block/Row column to get the total number of pixels per row and then dividing by 512-pixels per line.

Asynchronous Refresh and Update

The refresh memory implementation of the present invention achieves important advantages with asynchronous update and refresh. These advantages include reduction of dependence on double buffer memories and on synchronization control logic and increased tolerance to overload conditions. These advantages also include a significant processing bandwidth improvement, such as from an update rate lower than the refresh rate and from processor overload tolerance.

Updating is the process of changing information in refresh memory. In this configuration, updating can be performed on a pixel-by-pixel basis under control of the real time processor. Refreshing is the process of reading out information from refresh memory. In this configuration, refreshing can be performed on a pixel-by-pixel basis along a raster scan line in synchronism with the CRT raster scan signals. Use of interleaved read and write controls and use of buffer registers avoids conflicts between storing of update information and accessing of refresh information. Use of individual pixel words each storing object-related information avoids streaks and other undesireable visual effects.

Double buffering can be used to reduce memory contension for simultaneous update and refresh operations. Double buffering permits updating of an offline image in a first buffer while refreshing with an online previously updated image in a second buffer. Therefore, the refreshed image need not be changed during the refresh operation. Double buffering synchronizes update and refresh operations, but increases hardware by requiring two refresh memories and related control logic and degrades overload tolerance. However, asynchronous refresh and update architecture in accordance with the present invention reduces memory contension problems and does not require double buffering.

Asynchronous refresh and update operation can be achieved with refresh memory 116 being implemented to permit partial updates during a refresh frame. Systems that are intolerant of partial updates exhibit loss of non-updated images, streaks flashing across the screen, and other undesireable affects. However, the refresh memory arrangement of the present invention, such as the color fill method on a pixel-by-pixel basis, accomodates partial updates. A partial update can be handled in the same manner that a full update is handled. There need be no penalty for displaying of partial updates.

Important advantages can be derived from a system architecture that provides an optimum combination of update rates and refresh rates. In prior art CIG systems, the update rate may be the same as the refresh rate. Typically, prior art CIG systems require a thirty frame per second update rate and refresh rate. The system architecture of such prior art systems is based upon the update rate and refresh rate being the same. Consequently, such system architecture is oriented towards updating the display for each refresh, typically thirty frames per second. However, the human eye is more sensitive to flicker than to update changes. Therefore, in accordance with another feature of the present invention, which is discussed in the related applications referenced herein; a refresh rate greater than the update rate is provided. However, an embodiment where the refresh rate is the same as the update rate may be an alternate embodiment thereto and is not herein precluded.

Refreshing may be characterized as outputting of stored information from the refresh memory while updating may be characterized as storing updated information in refresh memory and then outputting the updated information from refresh memory. Some prior art systems do not use refresh memory and therefore are constrained to updating or recomputing the visual information for each refresh operation. In the system of the present invention; use of a refresh memory that preserves non-changing visual information and updating of changed information facilitates the higher refresh rate and lower update rate to achieve a better price and performance characteristic.

A refresh rate of thirty frames per second reduces flicker to an acceptable level. This is exemplified with the common television thirty picture per second rate. However, experience has shown that a thirty frame per second update rate is not necessary for acceptable continuous motion. Therefore, in accordance with this feature of the present invention, a visual system update rate less than the refresh rate may be provided. For example, the system may have a twenty times per second update rate, or a fifteen times per second update rate, or a ten times per second update rate or other update rate together with higher refresh rate; i.e., a thirty times per second refresh rate. In one configuration having a thirty times per second refresh rate and a ten times per second update rate, the computational loading on the visual processor may be reduced by about a factor of three. Alternately, the computational capability such as the number of edges may be increased by a factor of three. This is because refresh is a relatively simple operation and update is a relatively complex operation. For example, refresh may involve reading out and displaying an image that was previously stored in refresh memory while updating may involve coordinate transformations, occulting determinations, edge smoothing, and filling of refresh memory.

Enhanced processing bandwidth is achieved by optimizing refresh and update rates. Human vision is more sensitive to refresh flicker then to update discontinuities. Certain systems require an update rate equal to the refresh rate. However, human vision is significantly more sensitive to refresh flicker then to update discontinuities. Also, refresh operations can be implemented with simple processing requirements while update operations involve more complex processing. Therefore, another feature of the present invention provides a higher refresh rate than update rate; such as thirty times per second refresh rate and ten times per second update rate for an illustrated configuration. Updating at ten times per second instead of the usual thirty times per second yields a three-fold reduction in processing bandwidth without degradation of visual capabilities. Alternately, other refresh and update rates may be provided yielding other processing bandwidth enhancements, as shown in the Memory Architecture Table.

A refresh rate of thirty frames per second eliminates flicker caused by the integration time-constant of the human eye. An update rate of ten times per second (each third frame) eliminates discontinuities also caused by the integration time-constant of the human eye. Asynchronous refresh and update operations facilitates refreshing independent of updating. Therefore, real time processor 126 can asynchronously update refresh memory 116 at a processor determined rate while refresh memory 116 can refresh display monitor 120 at a thirty frame per second refresh rate.

Update operations can be performed at a rate and with a priority governed by the processing load. For lower load conditions, refresh memory 116 can be updated more often then the minimum required update rate (i.e., more often then ten times per second). For example, for a light processing load, the update rate may equal the refresh rate. However, for conditions of heavy processing load, the update rate may slowed down to one-third of the refresh rate (ten updates per second); which is an acceptable rate.

Even if the update rate slowed to ten times per second, only slowly changing edges or lower priority slowly moving objects would be slowed to this lower update rate. Non-moving (stationary) surfaces need not be updated. Inner portions of slowly moving surfaces do not change and consequently need not be updated. Therefore, such images do not have critical update rate considerations. Rapidly moving surfaces (including both inner portions and edges) can be assigned processing priority and, therefore, can be updated at higher rates. Therefore, edge portions of the slowest moving surfaces may be the only images updated at a lower update rate. However, these slow moving edges may have the lowest processing requirements. Also, these edges of slowly moving surfaces may only have lower update rates during occasional periods of high processing logic.

Asynchronous update and refresh architecture facilitates flexibility in optimizing the system for different applications. For example, some applications may require higher refresh rates in order to reduce flicker. Other applications may require interlaced refresh, which is well known in the television art, to further reduce flicker. These capabilities can be achieved by upgrading the refresh address counters and output circuitry, with a minimum impact on the real time processor. Similarly, motion may be smoothed by increasing update rates such as from ten updates per second to twenty updates per second. Additional processing capability can be provided in the real time processor to facilitate this greater update rate with a minimum impact on refresh processing.

Processors may be implemented in a modular form, where each processor in the real time processor may operate relatively independent of other processors. In this way, update rates can be increased, such as on an average basis or on a priority basis, by adding processing modules without changing update rates and refresh memory circuitry.

REFRESH/UPDATE RATE TABLE

| REFRESH RATE | UPDATE RATE | ENHANCEMENT |
|---|---|---|
| 30 | 25 | 1.20 |
| 30 | 20 | 1.5 |
| 30 | 15 | 2.0 |
| 30 | 10 | 3.0 |
| 30 | 5 | 6.0 |
| 30 | 2 | 15.0 |
| 30 | 1 | 30.0 |
| 60 | 50 | 1.2 |
| 60 | 40 | 1.5 |
| 60 | 30 | 2.0 |
| 60 | 20 | 3.0 |
| 60 | 10 | 6.0 |
| 60 | 5 | 12.0 |
| 60 | 2 | 30.0 |
| 60 | 1 | 60.0 |

Refresh Memory Lookahead (FIG. 13F)

Refresh address counter 1311 may be offset from the actual raster scan by one or more pixel counts. This facilitates lookahead accessing of pixel words; such as for smoothing, occulting, and other processing. For example, edge smoothing may be implemented with the prior pixel word that was previously accessed and buffered, the present pixel word that was previously accessed and buffered, and the next pixel word that was most recently accessed and buffered to faciliate storing of all three pixel words (the prior pixel words, present pixel word, and next pixel word) to permit simultaneous processing thereof. One such arrangement is shown in FIG. 13F. Pixel words for one or more pixels may be accessed ahead of the raster scan. Accessed pixel words may be loaded into a-parallel in, serial shift, and parallel out register 1350. The pixel words may be shifted through register 1350 so that the next pixel word is being loaded into the register when the second most remote prior pixel word in being shifted out of the register. On the shift clock pulse, pixel word 117 output from memory 1313 may be loaded into next pixel register 1352, next pixel word 1353 stored in next pixel register 1352 may be transferred to present pixel register 1354, and present pixel word 1355 stored in present pixel register 1354 may be transferred to prior pixel word register 1356. Therefore, next pixel word 1353, present pixel word 1355, and prior pixel word 1357 are all available simultaneously; such as for use by smoothing, occulting, and other processing.

The lookahead arrangement shown in FIG. 13F may be expanded to provide a more extensive lookahead configuration. For example, three pixel buffer 1350 may be expanded to provide a full raster line buffer to facilitate more extensive lookahead capability for various types of processing. Also, more extensive lookahead capability facilitates reduced refresh memory access traffic reduction and reduced contention. Traffic reduction is facilitated by accessing larger refresh memory words at a lower rate, such as simultaneous accessing eight pixel words in parallel, permitting one eighth memory access rate. Contention reduction is facilitated by lookahead accessing and buffering of pixel words so that other operations, such as update operations can "cycle steal" from the refresh counter without interfering with refresh operations from the buffered pixel words. "Cycle stealing" is the process of disabling a cycle of accessing of refresh memory under control of the refresh address counter to permit another processor, such as an update processor, to access refresh memory.

In certain configurations, several prior pixel words and several next pixel words may be needed for occulting, edge smoothing, and other processing. Therefore, the arrangement shown in FIG. 13F may be expanded for storing two prior pixel words and two next pixel words in addition to the present pixel word, operating with a two pixel lookahead. Alternately, other quantities of storage may be provided.

Refresh memory lookahead may be implemented by offsetting refresh address counter 1311 by the number of lookahead pixels. This may be implemented with an adder at the output of refresh address counter 1311 for adding a lookahead quantity to the refresh address counter number; or by presetting refresh address counter 1311 to a lookahead amount ahead of the refresh pixel location; or by initiating refresh address counter 1311 before the raster scan commences; or otherwise.

The arrangement of starting refresh address counter 1311 ahead of the raster scan will now be discussed in more detail. This may be achieved by synchronizing to synchronization signals 1322 and 1327 (FIG. 13B), which in this illustration is implemented to lead the raster scan by the lookahead amount. This approach insures that pixel registers 1350 have been loaded with pixel words at the beginning of a scan line for processing thereof. At the beginning of a scan line, pixel words from a non-visible refresh memory frame pixels may be loaded into pixel register 1350 as if these pixels were visible. This is because non-visible frame pixels affect the visible pixels at the start of a scan line such as for determining the transition for an edge moving into or out of the visible portion of the refresh memory. Therefore, refresh address counter 1311 may be preset to a negative number, such as to pixel word addresses below the address of the pixel word at the start of the raster scan line, to facilitate loading of negative lookahead pixels from the refresh memory frame into pixel register 1350 prior to starting the raster line with the raster scan on the CRT. This lookahead starting in the non-visible frame of the refresh memory facilitates lookahead for occulting and edge smoothing at the screen edge with a minimum of discontinuity due to the screen edge. This is particularly important for objects moving onto the screen from the left hand edge where the raster scan lines start, providing a minimum of discontinuity at this edge.

Figure 14A:
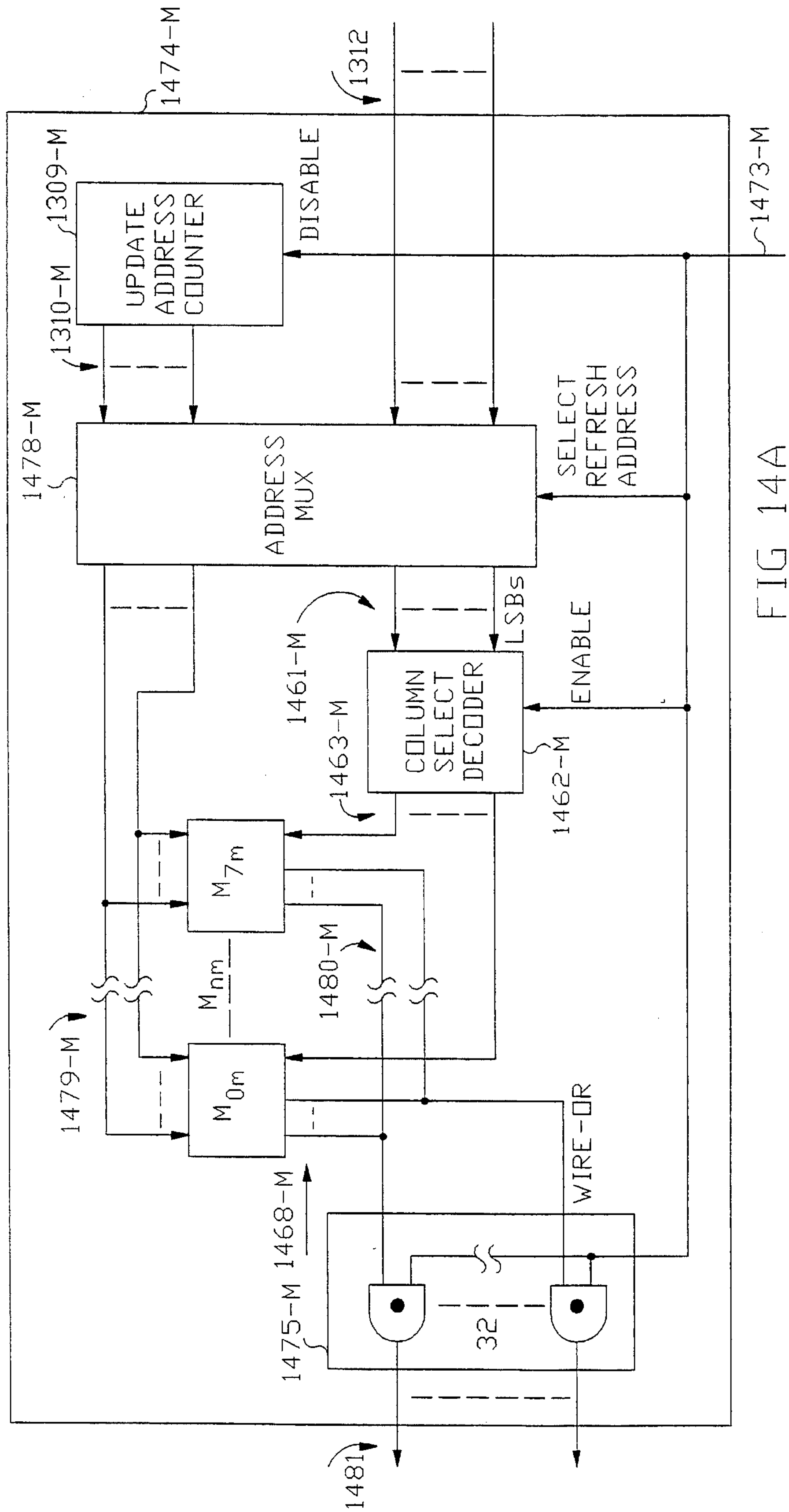
FIGS. 14A, 14B, 14C, 14D and 14E, illustrates a refresh memory configuration; where
Figure 14B:
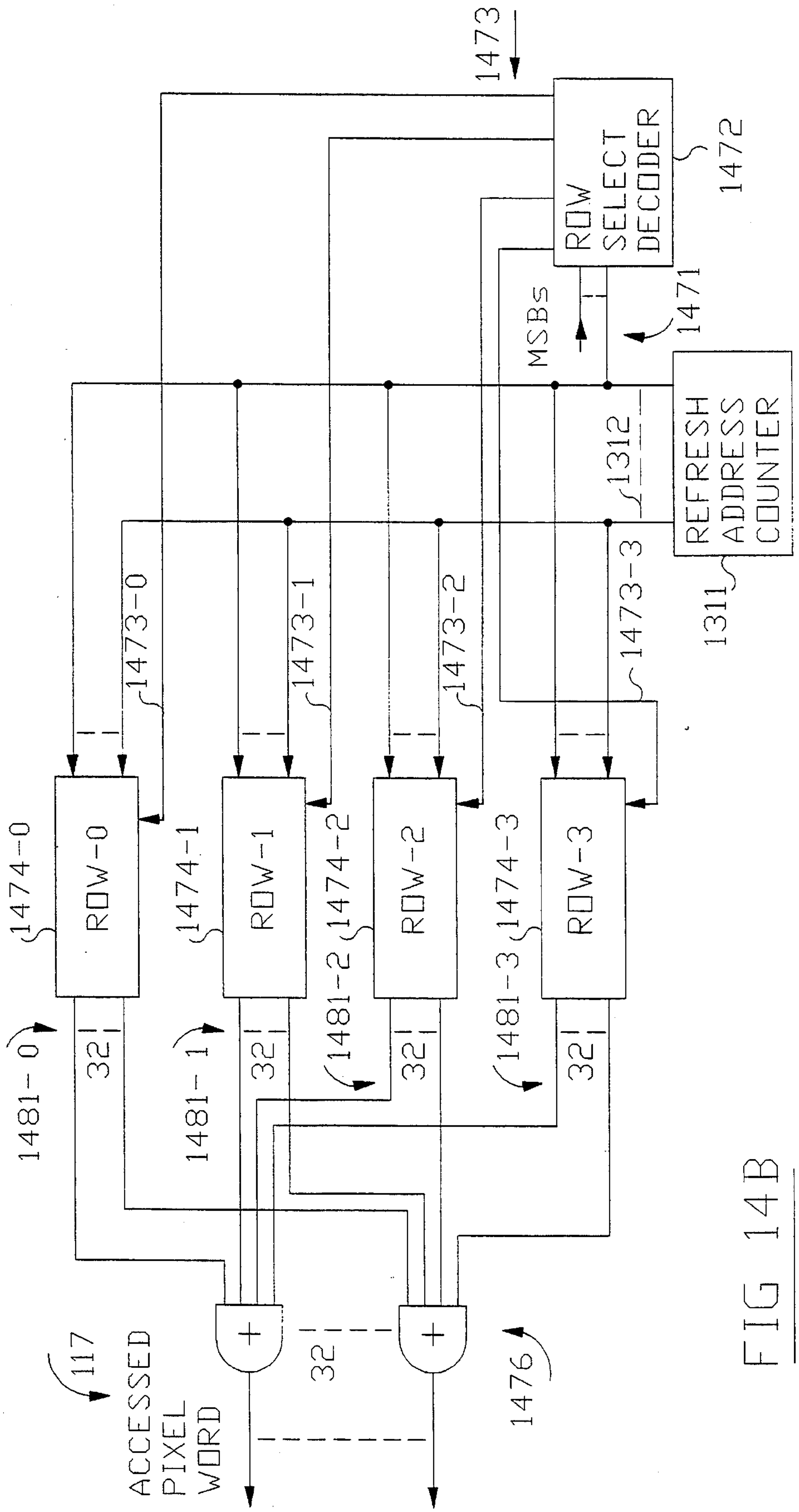
Figure 14C:
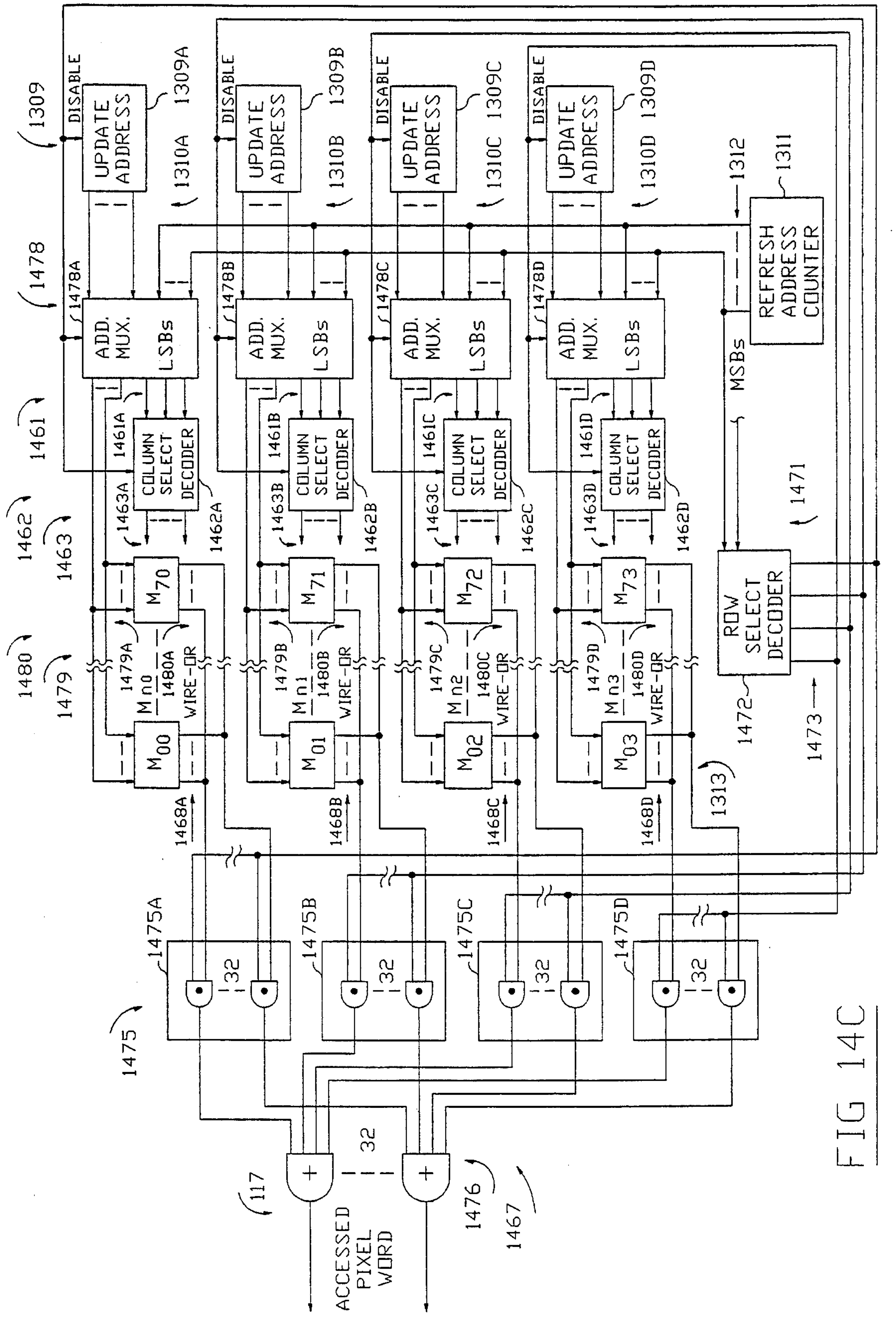

Memory Multiplexing Configuration (FIGS. 14A–14C)

Memory multiplexing architecture will now be illustrated with a detailed description of one configuration with reference to FIGS. 14A–14C. A single row is shown in FIG. 14A, a simplified grouping of four rows is shown in FIG. 14B, and a detailed grouping of four rows is shown in FIG. 14C. Descriptions with reference to FIGS. 14A and 14B are applicable to FIG. 14C, which is a composite representation of FIGS. 14A and 14B.

The arrangement shown in FIGS. 14A–14C is a more detailed representation of the memory multiplexing architecture configuration. A typical row is shown in FIG. 14A and four columns of such rows are shown in FIG. 14B. The subscript notation 1m such as $M_{1m}$ designates column and row, where 1 designates the column and m designates the row. Also, reference numerals having an "-M" notation implies repetition thereof for each row and assignment of row numeral for the "m" notation where applicable for designation thereof. When a reference numeral is shown without the 'M" designation, it is related to general discussion for all rows. When a reference numeral is shown with a "-m" designation, it is related to a discussion about a particular row.

Refresh duty cycle enhancement, summarized in the Refresh Duty Cycle column, may be calculated as the reciprocal of the number of blocks per row listed in the Blocks/Row column. The greater the number of blocks per row, the greater the amount of multiplexing of memory chips and therefore the less the duty cycle of the memory chips. Similarly, update contention summarized in the Update Contention column for each configuration is the reciprocal of the blocks per column listed in the Blocks/Column column; where the more blocks per column, the lower the amount of time that the refresh operation utilizes any particular row. However, optimum assignment of update processor resources may further reduce and may almost eliminate update contention using the multiple row architecture discussed herein. Memory architecture will be further exemplified with the configuration identified with the asterisk in the Memory Architecture table having an 8,192 by 8-bit chip configuration for an 8K-pixels per block configuration and a 4-block per row and 8-block per column configuration. This provides a refresh duty cycle reduction by 4-times and update contention enhancement by 8-times. A detailed illustration thereof is provided in FIGS. 7G and 7H and will be discussed in detail hereinafter.

The arrangement shown in FIGS. 14A–14C is a more detailed representation of the memory architecture shown in FIG. 13E. Memory groups 0 to (n-1) 1364 (FIG. 13F) are shown in greater detail as 8-columns of memory blocks $M_{0m}$ to $M_{7m}$ (FIG. 14A). Output OR-gate 1367 (FIG. 13E) may be implemented with wired-OR connections 1480-M for each row of memory blocks and with selection AND-gates 1475-M and output-OR gates 1476 generating the accessed pixel word 117 to display interface 118 (FIGS. 14A–14C); which in one embodiment may be pixel buffer register 1350 (FIG. 13F). Refresh address counter 1311 (FIGS. 13A, 13B, and 13E) is shown in the lower right hand corner of FIG. 14B for sequentially accessing memory 1313. Update address counter 1309 (FIG. 13A) may be the update processor discussed with reference to FIGS. 7–12 and may be replicated with a plurality of update address counters 1309-M (FIG. 14A and 14C) to generate update addresses to update image memory 1313.

Image memory 1313 may be structured as a two dimensional (2D) array of memory blocks having 4-rows of blocks, row-0 to row-3, (FIGS. 14B and 14C) and having columns of blocks, column-0 to column 7, (FIGS. 14A and 14C). Multiplexing of columns of blocks my be achieved with column select decoders 1462 for selecting column-0 to column-7 in sequence under control of the 3-LSBs of the refresh address from refresh address counter 1311. The 3-LSBs 1461 may be decoded into 8 select lines 1463. Each of the eight select lines 1463 may be connected to the chip select input for the chips in a particular block of the corresponding row for selecting 8-blocks in sequence as refresh address counter 1311 progresses through its count. Memory output lines 1468 may have corresponding bit lines of each block connected together in a wire-OR configuration 1480 AND-gate 1475 and OR-gate 1476 may be used to select the output of the selected row as refresh signal 117 from image memory 1313 display interface 118.

The MSBs of address counter 1311 may be used to selectively identify the row of memory blocks being used for refresh and therefore to identify the other rows of memory blocks available for updating. In the four row configuration of FIG. 14B. 2-MSBs 1471 of refresh address counter 1311 may be used to select one of four rows of memory blocks with four select signals 1473. Select signals 1473 select one of four address multiplexers 1478 to select output signal 1312 from refresh address counter 1311 to be applied to the selected row of memory blocks as address signals 1479. Row select signals 1473 may also be used to disable update address counter 1309associated with a selected row of memory blocks being used for refresh to resolve contention therebetween. Non-selecting of update address counter 1309 may include disabling the update processor for that particular row of memory blocks until refresh operations have passed to another row, thereby enabling the update processor and permitting updating in that row to proceed. Row select signals 1473 may also be used to select the appropriate output logic 1475 in order to enable a selected row of memory blocks to output refresh pixel words and to disable non-selected rows of memory blocks which are being updated not to output refresh signals. Row select signals 1473 may also be used to control column select decoder 1462 associated with a selected row of memory blocks being used for refreshing. Therefore, for the particular row of memory blocks being used for refreshing, as selected by refresh address counter 1311; update address counter 1309 will be disabled, address multiplexer 1478 will be controlled to pass refresh address 1312 to address lines 1479, column select decoder 1462 will be enabled to sequentially select columns of memory blocks in the selected row of memory blocks, and output logic 1475 for the selected row of memory blocks will be enabled to output pixel words from the selected row of memory blocks. Also, for each of the rows of memory blocks not being used for refreshing, as selected by refresh address counter 1311; update address counter 1309 will be enabled, address multiplexer 1478 will be controlled to pass the update address 1310 to address lines 1479, column select multiplexer 1462 will be disabled from selecting columns of memory blocks in the non-selected rows of memory blocks, and output logic 1475 for the non-selected rows of memory blocks will be disabled so as not to output pixel words from the non-selected rows of memory blocks.

Although signal 1463 from column select decoder 1462 is shown directly connected to chip select inputs for related memory blocks (FIG. 14A), logic may be provided therebetween for selectively making this connection for control of row decoder select signal 1473 so that column select decoder 1462 controls the memory blocks when the row is being used for refresh operations and where the update address counter 1309 controls the chip select line when the row is not being used for refresh operations.

Update address generation and update processor operation will now be discussed with reference to FIG. 14A. In the configuration shown in FIG. 14A, a separate update processor 1309 is shown for each row of memory blocks. For the row being used for refresh operations, the update processor is disabled. For the rows not being used for refresh operations, the update processors are used to process edge information to facilitate updating. When refresh operations pass out of a row, the update processor for that row is again enabled and permitted to continue its updating operations. When refresh operations pass into another row, the update processor for that row is disabled, holding its prior state until refresh operations have passed out of that row. Therefore, at any one time all but one of the update processors is operating without having contention with refresh operations. For the arrangement shown in FIG. 14B having four rows, three update processors are enabled and one update processor is disabled using three quarters of the edge processing capability without contention with one quarter of the edge processing capability being disabled due to contention.

The arrangement shown in FIG. 14A has been discussed in simplified form for ease of discussion. However, additional capability can be provided therewith as discussed hereinafter.

The arrangement discussed with reference to FIGS. 14A and 14C multiplexing of refresh accesses between a plurality of columns of memory blocks reduces accessing rates for any one block by the number of columns, which is eight in the arrangement shown in FIGS. 14A and 14C. It may be desireable to provide auxiliary logic such as a buffer memory in the output of each memory block and to utilize a lookahead access of each memory block to provide buffering for the pixel word and lookahead for accessing of relatively slow memory chips.

An arrangement has been discussed with reference to FIGS. 14A and 14C for updating of rows of memory blocks not being used for refresh and for not updating a row of memory blocks being used for refresh. Greater utilization can be made of update processors by assigning update processors to rows of memory blocks not being used for refresh instead of dedicating update processor to rows of memory blocks. When refresh operations enter a row of memory blocks being updated by an update processor, the update processor related thereto may be interrupted. Row select signal 773 may cause information in the interrupted update processor to be loaded into a buffer memory to make that interrupted update processor available for assignment to operations in rows of memory blocks not being used for refresh. After refresh operation s pass out of the row of memory blocks associated with the interrupted update processing, an update processor can be reassigned thereto, accessing the update related parameters from the buffer memory and proceeding with the interrupted update operations for the particular update.

The arrangement shown in FIGS. 14A and 14C has been discussed for disabling of an update processor assigned to a row being used for refresh operations. However, in accordance with the column multiplexing arrangement associated with refresh address counter 1311, only one of a plurality of columns of memory blocks in the row of memory blocks selected for refresh operations may actually be accessed for a refresh pixel word at a particular time. Consequently, other columns therein may be available for update operations. Therefore, similar to the arrangement of updating of rows not being used for refresh, the update processor in a row being used for refresh operations may be enabled to update memory blocks in columns not being used for refresh operations. In this manner, the update processor associated with a row being used for refresh operations may continue updating operations until the refresh counter selects the particular block being updated with the update processor and thereby disabling the update processor until the refresh counter 1311 passes beyond that block that is being updated. In this manner, the update processor may continue to update information in image memory 1313 until contention for a particular block is detected, in which instance the update processor may be disabled until the refresh operations pass out of that block. This arrangement provides an individual block contention control and therefore may reduce the need for the use of rows for contention avoidance that was discussed above with reference to FIGS. 14A and 14C.

Figure 14D:
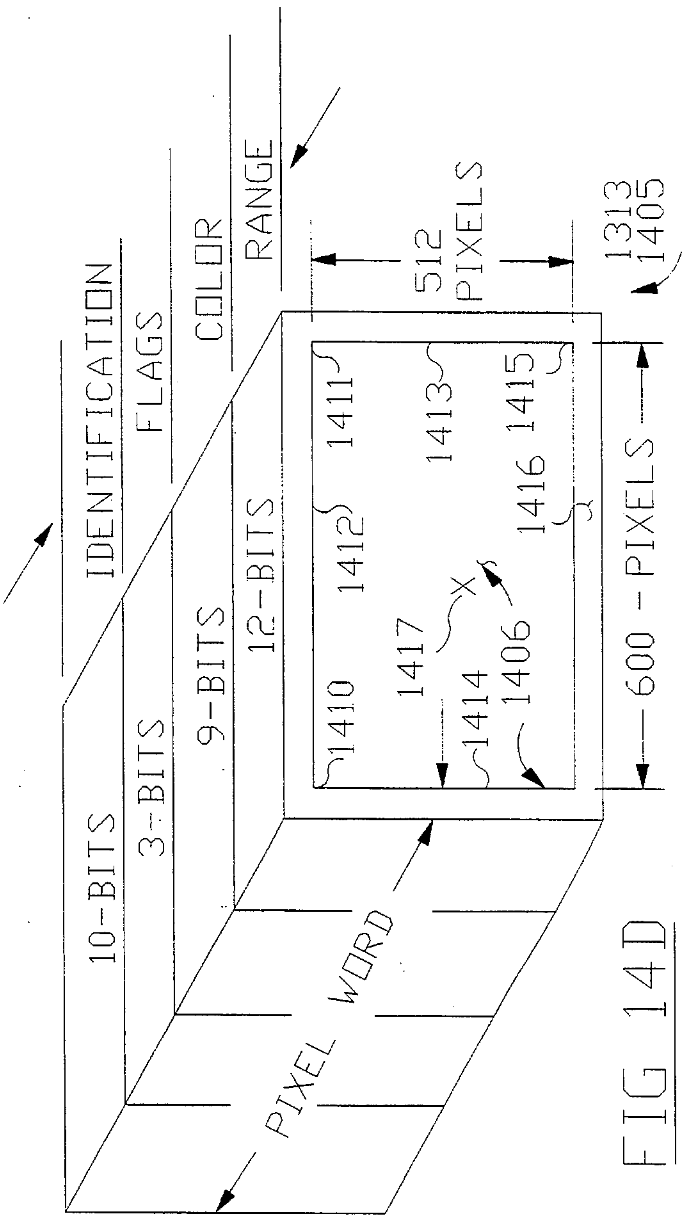

Refresh Memory Map (FIG. 14D)

Image memory 1313 may be configured as a pixel memory 1405 in memory map form (FIG. 14D). A memory map provides correspondence between addresses of pixel words stored in pixel memory 1405 and addresses of corresponding pixels of display monitor 120. For example, pixel counter 1320 (FIG. 13B) addresses a sequence of pixel words along a scan line in pixel memory 1405 as monitor 120 is scanning the corresponding line. Similarly, line counter 1321 addresses a sequence of scan lines from pixel memory 1405 as monitor 120 is scanning the corresponding lines. Therefore, a pixel word is output from refresh memory 116 at the same time the corresponding pixel on display monitor 120 related thereto is being scanned by the CRT electron beam. This facilitates synchronizing of refresh memory operations and. CRT scan operations. Memory map arrangements will now be discussed with reference to FIG. 14D.

FIG. 14D illustrates a pictorial representation of a pixel memory map 1405, where sequential pixel words along a line are stored in adjacent addresses progressing from the upper left hand corner 1410 to the upper right hand corner 1411 to generate a single line of pixels 1412. At the end of scan line 1412, pixel counter 1320 is reset and line counter 1321 is incremented, as discussed with reference to FIG. 13B. This causes a retrace of the pixel counter from the right hand edge of the visible image 1413 back to the left hand edge of the visible image 1414 and increments to the next line vertically downward. This scanning procedure progresses as visible image 1406 is scanned in raster form starting from the beginning of the first line 1410 and concluding at the end of the last line 1415.

Refresh memory architecture in accordance with one feature of the present invention will now be illustrated for a particular example with reference to FIG. 14D. In this example, a 600-pixel per line by 525-line configuration will be provided. Each pixel word has 34-bits for purposes of illustration. A non-visible frame 1416 will also be discussed.

MEMORY ARCHITECTURE TABLE

| CHIP CONF. | BITS/ BLOCK | PIXELS/ BLOCK | CHIPS/ BLOCK | BLOCKS/ ROW | BLOCKS/ COLUMN | LINES/ ROW | REFRESH DUTY CYCLE | UPDATE COMPENSATION |
|---|---|---|---|---|---|---|---|---|
| 65,536 × 1 | 65,536 × 32 | 65,536 | 32 | 1 | 4 | 128 | 1 | ¼ |
| 65,536 × 1 | 65,536 × 32 | 65,536 | 32 | 2 | 2 | 256 | ½ | ½ |
| 65,536 × 1 | 65,536 × 32 | 65.536 | 32 | 4 | 1 | 512 | ¼ | 1 |
| 16,384 × 4 | 16,384 × 32 | 16,384 | 8 | 1 | 16 | 32 | 1 | 1/16 |
| 16,384 × 4 | 16,384 × 32 | 16,384 | 8 | 2 | 8 | 64 | ½ | ⅛ |
| 16,384 × 4 | 16,384 × 32 | 16,384 | 8 | 4 | 4 | 128 | ¼ | ¼ |
| 16,384 × 4 | 16,384 × 32 | 16,384 | 8 | 8 | 2 | 256 | ⅛ | ½ |
| 16,384 × 4 | 16,384 × 32 | 16,384 | 8 | 16 | 1 | 512 | 1/16 | 1 |
| 16,384 × 4 | 32,768 × 32 | 32,768 | 16 | 1 | 8 | 64 | 1 | ⅛ |
| 16,384 × 4 | 32,768 × 32 | 32,768 | 16 | 2 | 4 | 128 | ½ | ¼ |
| 16,384 × 4 | 32,768 × 32 | 32,768 | 16 | 4 | 2 | 256 | ¼ | ½ |
| 16,384 × 4 | 32,768 × 32 | 32,768 | 16 | 8 | 1 | 512 | ⅛ | 1 |
| 16,384 × 4 | 65,536 × 32 | 65,536 | 32 | 1 | 4 | 128 | 1 | ¼ |
| 16,384 × 4 | 65,536 × 32 | 65,536 | 32 | 2 | 2 | 256 | ½ | ½ |
| 16,384 × 4 | 65,536 × 32 | 65,536 | 32 | 4 | 1 | 512 | ¼ | 1 |
| 8,192 × 8 | 8,192 × 32 | 8,192 | 4 | 1 | 32 | 16 | 1 | 1/32 |
| 8,192 × 8 | 8,192 × 32 | 8,192 | 4 | 2 | 16 | 32 | ½ | 1/16 |
| 8,192 × 8* | 8,192 × 32 | 8,192 | 4 | 4 | 8 | 64 | ¼ | ⅛ |
| 8,192 × 8 | 8,192 × 32 | 8,192 | 4 | 8 | 4 | 128 | ⅛ | ¼ |
| 8,192 × 8 | 8,192 × 32 | 8,192 | 4 | 16 | 2 | 256 | 1/16 | ½ |
| 8,192 × 8 | 8,192 × 32 | 8,192 | 4 | 32 | 1 | 512 | 1/32 | 1 |
| 8,192 × 8 | 16,384 × 32 | 16,384 | 8 | 1 | 16 | 32 | 1 | 1/16 |
| 8,192 × 8 | 16,384 × 32 | 16,384 | 8 | 2 | 8 | 64 | ½ | ⅛ |
| 8,192 × 8 | 16,384 × 32 | 16,384 | 8 | 4 | 4 | 128 | ¼ | ¼ |
| 8,192 × 8 | 16 384 × 32 | 16,384 | 8 | 8 | 2 | 256 | ⅛ | ½ |
| 8,192 × 8 | 16,384 × 32 | 16,384 | 8 | 16 | 1 | 512 | 1/16 | 1 |

This arrangement is illustrative of other configurations such as having 512-pixels per line by 512-lines, 525-pixels per line by 525-lines, 1200-pixels per line by 1200-lines, and other configurations. Also, this 34-bit pixel word configuration is exemplary of many other pixel word configurations such as discussed with reference to the Pixel Word Table herein.

Each pixel word can have a plurality of bytes of information, such as illustrated in the Pixel Word Table herein. One illustrative configuration has a range byte of 12-bits, a color byte of 9-bits, an identification byte of 10-bits, and a flag byte of 3-bits; totaling 34-bits per pixel word. The 12-bits of the range byte defines range of an object portrayed with the particular pixel to a resolution of one part in 4,096. The range byte can be used for determination of occulting, range variable intensity, and other range related functions. The identification byte can define the surface, object, or other element filling the pixel. The 9-bit color byte represents the color portrayed with the pixel. The color byte is divided into three nibbles, each having 3-bits. Each of the 3-bit color nibbles represents a different one of the red, green and blue color components. The color byte can be used for color filling, color interpolation for edge smoothing, and range variable intensity. The flag byte can be used for various control operations, comprising various flag bits. For example, an edge flag bit can define an edge pixel. Therefore, in this example, each pixel word contains information on range, color, and control operations associated with the object portrayed with the pixel. The configuration in this example has a visible environment of 315,000 pixels (525-lines by 600-pixels per line) and a non-visible peripheral frame of 46,600-pixels (20-pixels wide) for a total pixel memory of 361,600-pixels. This relates to 12.2944 million bits (361,600-words by 34-bits per word) or 193 memory chips of 64K-bits per chip.

Pixel words can be updated by the real time processor as a function of image dynamics. For example, as a display object translates in range, the range byte of the object's pixels can be extrapolatively updated. Also, when a nearer object occults a previously displayed object; the related pixel words are changed to reflect the new occulting object. Also, as object relative motion causes an edge to extrapolatively translate, the edge flag for each edge-related pixel change is updated together with range and color fields as new occulting objects fill pixels. Such edge motion can be caused by translational or rotational motion in the plane of the display screen and by translational motion in range causing changes in the object size in response to range variable scaling. Most pixels will not usually change from frame-to-frame. For example, static objects having no motion will maintain the pixel words constant. A moving occulting surface moving into a position to occult a pixel of a static surface will change the pixel of the static surface. Even for moving surfaces, most pixels will not change between frames. This is because changes in a moving surface are changes at peripheral edges, not internal to the surface. However, pixels in the inner portion of a displayed surface remain constant even though edge pixels of that surface change due to relative motion. This can be better understood from the following discussion of color filling.

Surfaces can be portrayed as constant color surfaces. Therefore, all pixels within a visible surface may have the same color. As a visible surface moves in the environment, edge pixels of the surface can be changed, but internal pixels of the surface remain constant. Pixel words may not change until an edge of the surface moves through the pixel, thereby causing effects such as edge smoothing and occulting processing to change the edge pixel word. Except for pixels representing moving edges, pixels of the same surface may not change as the object translates and rotates in the environment. Changes caused by a moving edge are either the edge of the surface moving from pixel-to-pixel or the edge of another surface moving into occultation of and therefore filling pixels of a previously displayed surface.

The above described pixel memory map approach yields important advantages. For example, each pixel has its own color information stored in its own pixel word, which is read out to the CRT interface circuitry in raster scan form on a pixel-by-pixel basis. Therefore, color is implicit in each pixel. This eliminates color fill techniques requiring turning-on a particular surface color when the raster scan crosses the left-most edge of the surface and turning-off the surface color when the raster scan crosses the right-most edge of the surface. This reduces the need for clipping, pseudo-edge generation, and anti-streaking processing. Also, it facilitates asynchronous update and refresh operations, yielding simplicity of implementation and good overload tolerance.

PIXEL WORD TABLE

| BYTE | FORMAT (BITS) | | | | | | | | | | | | |
|---|---|---|---|---|---|---|---|---|---|---|---|---|---|
| CONFIGURATION | A | B | C | D | E | F | G | H | I | J | K | L | M |
| IDENTIFICATION | 10 | 10 | 8 | 0 | 8 | 5 | 0 | 2 | 10 | 0 | 34 | 0 | 10 |
| COLOR | — | — | — | — | 6 | — | — | — | — | 3 | — | — | — |
| RED | 3 | 4 | 2 | 3 | — | 5 | 3 | 4 | 4 | — | 3 | 3 | 4 |
| GREEN | 3 | 4 | 2 | 3 | — | 2 | 3 | 4 | 3 | — | 3 | 3 | 4 |
| BLUE | 3 | 4 | 2 | 3 | — | 3 | 3 | 4 | 2 | — | 3 | 3 | 4 |
| RANGE | 14 | 20 | 10 | 12 | 10 | 12 | 15 | 10 | 6 | 14 | 12 | 7 | 3 |
| INTENSITY | 6 | 8 | 0 | 0 | 0 | 3 | 4 | 7 | 2 | 0 | 5 | 3 | 4 |
| TINT | — | — | — | — | — | — | — | — | — | — | — | — | — |
| RED | 0 | 4 | 0 | 0 | 0 | 1 | 0 | 0 | 2 | 0 | 2 | 2 | 2 |
| GREEN | 0 | 4 | 0 | 0 | 0 | 1 | 0 | 0 | 2 | 0 | 3 | 2 | 2 |
| BLUE | 0 | 4 | 0 | 0 | 0 | 1 | 0 | 0 | 2 | 0 | 4 | 0 | 2 |
| SHADING | 0 | 8 | 0 | 0 | 0 | 0 | 4 | 0 | 3 | 0 | 0 | 5 | 0 |
| SHADOWING | 0 | 8 | 0 | 0 | 0 | 0 | 4 | 0 | 8 | 0 | 0 | 16 | 0 |
| FLAGS | | | | | | | | | | | | | |
| EDGE PIXEL | 1 | 1 | 1 | 1 | 1 | 1 | 1 | 0 | 1 | 1 | 0 | 2 | 1 |
| APERATURE PIXEL | 0 | 1 | 0 | 0 | 0 | 1 | 0 | 0 | 1 | 0 | 1 | 0 | 1 |
| INTERVENING EDGE PIXEL | 0 | 1 | 0 | 0 | 0 | 1 | 0 | 1 | 0 | 0 | 0 | 1 | 0 |

-continued

PIXEL WORD TABLE

| | | | | | | | | | | | | | |
|---|---|---|---|---|---|---|---|---|---|---|---|---|---|
| TEST EDGE PIXEL | 0 | 1 | 0 | 0 | 0 | 1 | 0 | 1 | 1 | 0 | 1 | 1 | 0 |
| STATIC TEXTURE | 0 | 1 | 0 | 0 | 0 | 1 | 1 | 0 | 0 | 1 | 1 | 1 | 0 |
| DYNAMIC TEXTURE | 0 | 1 | 0 | 0 | 0 | 1 | 0 | 1 | 1 | 1 | 0 | 1 | 1 |
| TRANSPARENCY | 0 | 1 | 0 | 0 | 0 | 1 | 0 | 0 | 0 | 0 | 0 | 1 | 1 |
| LIGHT POINT | 0 | 1 | 0 | 0 | 0 | 1 | 0 | 1 | 0 | 1 | 1 | 1 | 0 |
| CURSOR | 0 | 1 | 0 | 0 | 0 | 1 | 0 | 0 | 1 | 0 | 0 | 1 | 0 |
| RETICLE | 0 | 1 | 0 | 0 | 0 | 1 | 1 | 0 | 1 | 1 | 0 | 1 | 0 |
| COMMON EDGE | 0 | 1 | 0 | 0 | 0 | 1 | 0 | 0 | 1 | 0 | 0 | 1 | 0 |
| TOTAL | 40 | 89 | 25 | 22 | 25 | 44 | 29 | 35 | 53 | 14 | 75 | 60 | 43 |

| BYTE | LOCATION | | | | | | | | | | | |
|---|---|---|---|---|---|---|---|---|---|---|---|---|
| CONFIGURATION | 1 | 2 | 3 | 4 | 5 | 6 | 7 | 8 | 9 | 10 | 11 | 12 |
| IDENTIFICATION | P | P | P | P | P | S | P | P | S | P | P | P |
| COLOR | S | P | S | S | P | S | S | P | P | S | S | P |
| RED | S | P | S | S | P | S | S | P | P | S | P | P |
| GREEN | S | P | S | S | P | S | S | P | P | P | S | P |
| BLUE | S | P | S | S | P | S | S | P | P | P | S | P |
| RANGE | S | P | S | P | S | P | S | P | S | S | P | S |
| INTENSITY | S | P | S | S | S | S | P | S | S | P | S | P |
| TINT | | — | — | — | — | — | — | — | — | — | — | — |
| RED | S | P | S | S | S | P | S | P | S | P | S | P |
| GREEN | S | P | S | S | S | P | S | P | S | S | S | P |
| BLUE | S | P | S | S | S | P | S | P | P | S | S | P |
| SHADING | S | P | S | S | S | P | P | S | P | P | S | P |
| SHADOWING | S | P | S | S | S | P | P | P | S | P | P | S |
| FLAGS | | | | | | | | | | | | |
| EDGE PIXEL | P | P | P | P | S | P | S | P | P | S | P | P |
| APERATURE PIXEL | P | P | S | S | S | P | P | S | S | S | P | S |
| INTERVENING EDGE PIXEL | P | P | S | S | S | P | S | P | P | P | S | S |
| TEST EDGE PIXEL | P | P | S | S | S | P | S | S | P | S | P | P |
| STATIC TEXTURE | S | P | S | P | S | S | P | S | P | P | S | S |
| DYNAMIC TEXTURE | S | P | S | P | S | P | S | S | P | S | P | P |
| TRANSPARENCY | S | P | S | P | S | S | S | P | S | S | P | S |
| LIGHT POINT | S | P | S | P | S | S | P | P | S | P | S | S |
| CURSOR | S | P | S | S | S | P | S | P | S | S | P | S |
| RETICLE | S | P | S | P | P | S | P | S | S | P | P | S |
| COMMON EDGE | S | P | S | P | P | P | S | P | P | P | S | P |
| TOTAL | | | | | | | | | | | | |

Figure 14E:
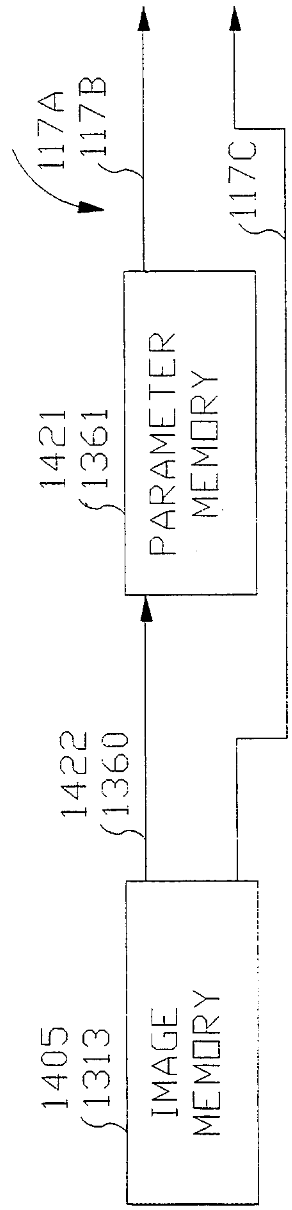

Surface Memory Configuration (FIG. 14E)

In one configuration, pixel memory 1405 can store a complete pixel word. In an alternate configuration, pixel memory 1405 can be supplemented with another memory, such as a parameter memory; where some of the bytes of the pixel words are stored in pixel memory 1405 and some of the bytes of the pixel word are stored in the other memory. Various configurations of this partitioning arrangement for partitioning a pixel word between pixel memory and a parameter memory are illustrated in the Pixel Word Table herein and described in the section related thereto. A configuration using pixel memory 1405 and a parameter memory in the form of a surface memory 1421 will be discussed hereinafter with reference to FIG. 14E. As indicated in the Pixel Word Table, all bytes may be stored in pixel memory 1405, all bytes may be stored in a parameter memory, or the bytes may be stored in a combination of pixel memory 1313 and a parameter memory. The configuration using surface memory 1421 is illustrative of other image memory partitioning configurations; such as lookup tables, buffer memories, queues, and other arrangements.

The arrangement shown in FIG. 14E illustrates operation of image memory 1331 and surface memory 1361. Surface memory 1361 may be included in refresh memory 116, such as being included in image memory 1313, illustrated in FIG. 13A.

As discussed herein relative to the Pixel Word Table, certain pixel word bytes may be located in pixel memory 1405 and other pixel word bytes may be located in surface memory 1421. Signals 117A (FIG. 14E) may include only pixel word bytes 117B from surface memory 1421 or only pixel word bytes 117C from pixel memory 1405. Alternately, signals. 117A may include a combination of pixel word bytes 117B from surface memory 1421 and pixel word bytes 117C from pixel memory 1405 where various combinations thereof are discussed with reference to the Pixel Word Table herein. For example, information 1422 accessed from pixel memory 1405 may be used to access pixel word bytes 117B from surface memory 1421; where each pixel in memory 1405 can include an identification (ID) byte which identifies the surface associated with that pixel. Identification byte 1422 may be used to access surface memory 1421 to provide pixel word bytes 117B stored in surface memory 1421. Pixel word bytes 117A may be communicated to display interface 118 as signals 117 (FIGS. 1 and 13). Pixel word bytes 117A can be communicated directly to display interface 118 or can be loaded into interface registers, such as discussed with reference to FIG. 13F for communication to display interface 118.

The identification byte may represent the address of the word pertaining to the information for an element filling a Pixel stored in the parameter memory. The element may be a surface, an object, a group of objects, or other element. For simplicity of discussion herein, the word stored in the parameter memory will be discussed in the form of a surface word having the parameter bytes associated with a surface identified with the identification byte. Therefore, the parameter memory will be called a surface memory for this illustration.

Words stored in surface memory 1421 may be assigned in various ways. In one configuration, surface memory 1421 may be loaded and erased by supervisory procesor 125. Words may be loaded into surface memory 1421 when the surface (or other element) enters the environment within the viewport and mapped into pixel memory 1405, or when the surface (or other element) is anticipated to become visible, or when the surface (or other element) is otherwise determined to be loaded into surface memory 1421. Similarly, words may be erased from surface memory 1421 when the surface (or other element) exits the environment covered by the viewport, or when the surface (or other element) is anticipated to become non-visible, or when the surface (or other element) is otherwise determined to be erased from surface memory 1421. Surfaces (or other elements) may be assigned identification addresses in surface memory 1421; such as in chronological sequence of loading into surface memory 1421, or in sequence of priority assignments, or in available locations such as resulting from words erased from surface memory 1421, or on other basis. Alternately, surfaces (or other elements) may be stored in surface memory 1421 having predetermined locations and accessed with predetermined identification bytes.

In one surface memory configuration, an identification byte can be stored in pixel memory 1405 for accessing parameters stored in surface memory 1421. The identification (ID) byte may be a surface ID byte and the parameters may be surface parameters such as surface color, range, texture, shading, illumination, and others. Other arrangements may be provided, such as an object arrangement having an object ID byte and object parameters. This surface memory configuration may provide advantages such as reduced refresh memory size, greater flexibility, and greater capability. For example; in a 1,000 polygon system, a 10-bit ID byte may be stored in each pixel word in place of the 9-bit color byte and 12-bit range byte; effectively replacing 21-bits of information with 10 bits of information. This advantage is slightly reduced by the memory used for the surface memory. However, the surface memory is relatively small compared to the pixel memory. For example the pixel memory may have 275,625 pixel words (525-lines by 525-pixels per line) and the surface memory may have 1,000 surface words; totaling 275,625 10-bit words plus 1,000 21-bit words. This is only about one half of the memory required for 275,625 21-bit words. Therefore, a significant reduction in memory usage may be achieved with this surface memory arrangement.

Significant flexibility enhancement can be obtained with this surface memory arrangement. For example, the surface associated with a particular pixel is identified, facilitating alternate types of image processing and additional visual features. Also, color and range information can be readily supplemented with aditional information, such as intensity and shading information, in the surface memory. Repeating these different parameters in each pixel word involves a substantial amount of pixel memory. However, the reduced storage requirements of the surface memory facilitates storing of such additional parameters with relatively s mall additional memory requirements. Similarly, parameters can be increased in resolution with only a small additional memory requirement; such as increasing the range byte from 12-bits to 20-bits to faciltiate greater range resolution.

Use of the surface memory facilitates simplified updating of displayed images. For example, for the arrangement having range stored in each pixel word, changing range of an object may necessitate updating of the range byte in many pixels associated with that object. However, with this surface memory arrangement; the range word for each polygon, surface, object, etc in the surface memory can be udpated with a lower processing requirement. For example, a configuration having a surface stored in a single surface memory location may need to update a range byte in only a single word for range motion of that surface while that surface may involve 100 visible pixels. Therefore, range of a large number of pixels can be updated by changing of a single range byte in a single surface memory word. Also, the surface in the surface memory may have a Fixed address and therefore may be updated with a minimum of memory traffic. For the non-surface memory configuration, words associated with a surface in pixel memory 1405 may be distributed over different portions of pixel memory 1405 as the scene changes, such as with object motion and observer motion, and may change as the fill color of the surface changes. Therefore, updating of a single parameter byte in a known position in a surface memory 1421 requires significantly less processing than updating of the parameter byte in each of a plurality of pixel words that may change in quantity and location as a function of image features, respectively.

The surface memory configuration (FIG. 14E) provides increased flexibility, such as with the storage of additional pixel bytes. Such additional pixel bytes may include an intensity byte, a shading byte, and other bytes such as discussed with reference to the Pixel Word Table herein.

Operation of one configuration of a parameter memory in a surface memory will now be discussed. Refresh counter 1311 accesses a sequence of pixel words in pixel memory 1405. A surface ID byte is stored in each pixel word and is used to access a surface ID byte identifying the surface that is visible in that pixel. The surface ID byte is used to access a surface word 117A from surface memory 1421. The surface word contains surface information; such as a range byte, a color byte, an intensity byte, and a shading byte. These bytes are then processed with display interface 118, such as discussed for the color and range bytes with reference to FIGS. 15 and 16.

The surface memory may operate in a lookahead form. For example, the surface memory may be accessed 16-pixels ahead of the pixel refreshing the CRT. This lookahead can be implemented in various forms, such as by accessing pixel memory 1405 to obtain the surface ID byte for a particular pixel ahead of when that pixel will be refreshed and then providing a time delay for the appropriate number of pixel times prior to refreshing that pixel. A buffer memory arrangement can be implemented for providing the time delay and also for reducing the access time of the surface memory, such as discussed for image memory 1405 with reference to FIGS. 13 and 14 herein.

Use of a surface memory buffer can reduce access requirements for the surface memory. This is because the average access time for the surface memory may be significantly less than the pixel rate, where a plurality of pixels in a scan line may all be related to the same surface, thereby necessitating only a single surface memory access for that plurality of pixels related to the same surface. However, the surface memory may also have to respond to peak access rates, such as for conditions where narrow surfaces and other considerations reduce the number of pixels along the scan line related to the same surface. The buffer facilitates reducing the peak access rate to be closer to the average access rate. The buffer memory in combination with the lookahead logic significantly reduces the peak access rates for surface memory 1421.

Surface memory 1421 may be initialized and updated under program control with supervisory processor 125. Initialization may take the form of deleting object or surface information from surface memory 1421 when the related object or surface respectively passes out of the scene, such as with relative object motion, and loading of object and surface information into unused locations in surface memory 1421 when new objects or surfaces enter the scene. Updating of surface memory 1421 can be performed by supervisory processor 125 updating the surface memory in accordance with changes.

Edge pixel words can be implemented with the smoothed color byte replacing the identification byte. An edge pixel is shared between two surfaces, thereby causing an ambiguity in the identification byte; where identification would be a combination of the parameter stored in the surface memory for the two adjacent surfaces. Therefore, the identification byte for an edge pixel may be used for storage of smoothed colors. In one smoothing configuration, the identification byte in the next edge pixel is accessed, the surface memory is accessed for the next pixel parameters in response to the next pixel identification byte, and the next pixel parameters are weighted in accordance with the area weighting of the edge pixel, similar to that described with reference to FIGS. 11 and 12. The smoothed colors may then be stored in the identification field of the edge pixel word. During refresh operations, detection of an edge flag in a pixel word controls the smoothed color byte in the pixel word to be output to the display interface in place of the color byte from the surface memory. Also, for the hybrid intensification configuration (FIG. 15); a scale factor, such as all ones, can be loaded into the range variable intensity and programmable intensity DACs; consistent with smoothed intensity already being implemented for the smoothed color byte, such as discussed with reference to FIG. 11C and 11E.

Intensity weighting can be implemented for edge pixels. For example, the range variable intensity byte and the programmable intensity byte can be accessed for the edge pixel, where the two intensity bytes and the area weighting byte of the edge pixel can be multiplied together to obtain an edge pixel weighting byte. The edge pixel weighting byte can be multiplied by each edge pixel color nibble, as shown in FIG. 11C and FIG. 11D, to obtain weighted edge pixel color nibbles for summing with adders 1140. In this manner, smoothed edges can be weighted by the programmable intensity and range variable intensity in addition to area prior to summing for smoothed pixel colors.

Pixel Words

Operation of one configuration of refresh memory is discussed herein having a plurality of pixel words that are updated under control of updating processing and that are used to refresh the display monitor under control of refresh processing. For example, each pixel may have a pixel word-associated therewith and each pixel word may be updated under control of update processing and may be used for refreshing under control of refresh processing. Pixel words may include a plurality of bytes related to different parameters. Pixel bytes may be stored in various locations, such as in pixel memory 1405 and in surface memory 1421 (FIG. 14E). Various implementations of image memory 1313 having different formats of pixel bytes and having different locations for storing pixel bytes are illustrated in the Pixel Word Table; having exemplary configurations which are illustrative of the flexibility in implementing these and other configurations. The descriptions herein selectively discuss certain pixel word configurations, as illustrative of the broader teachings of the present invention. Still more configurations are summarized in the Pixel Word Table. Yet more configurations can be provided, which are implicit in the teachings herein and are implicit in the examples provided in the Pixel Word Table; as discussed below.

The format columns set forth configurations A to M identifying the number of bits for each byte (or nibble) listed in the byte column. A zero quantity is indicative of that parameter not being implemented for that configuration. Availability of an identification byte facilitates storage of some pixel word parameters in surface memory in addition to storage of other pixel word parameters in pixel memory. However, the presence of an identification byte does not necessarily require use of a surface memory and the absence of in identification byte does not necessarily preclude use of a surface memory. Configuration-A may be considered to be a typical configuration having a degree of extended capability. Configuration-B may be considered to be a higher capability configuration. Configuration-C may be considered to be a lower capability configuration. Configuration-D may be considered to be a medium capability configuration, where the absence of an identification byte may imply storage of the complete pixel word in pixel memory. Configuration-E may be considered to be a monochromatic configuration having lower capability. Configuration-F to configuration-M illustrate other configurations that may be implemented.

The location columns set forth location configurations 1 to 12 identifying the storage location for each byte (or nibble) listed in the byte column. A "P" is indicative of storage in pixel memory. An "S" is indicative of storage in surface memory. Configuration-1 may be considered to be a combination pixel memory and surface memory configuration, where the identification byte and various pixel related flags are stored in pixel memory and the other pixel parameters are stored in sur-face memory. Configuration-2 may be considered to use pixel memory without surface memory. Configuration 3 may be considered to be a lower capability version of configuration-1. Configuration 4 to configuration-12 may be considered to illustrate distribution of various parameters between pixel memory and surface memory.

The various format configurations A to M may have various partitionings, with different parameters stored in different locations; as indicated with location configurations 1 to 12. Any of the format configurations can be partitioned between any of the location configurations. For example, format configuration-A may be partitioned with location configuration-1 herein designated configuration-A1. Also, format configuration-B may be partitioned with location configuration-3; here designated configuration-B3. Other combinations of format configurations and location configurations may be provided by combining any one of formats A to M (or other formats) with any one of locations 1 to 12 (or other locations) to provide the desired configuration. It should be noted that various format configurations identify zero-bits for certain parameter bytes and the location configuration establish locations for each listed byte. For a format configuration having zero bits for a particular byte, the location configuration combined therewith does not implement the storage for the zero-bit parameters. However, for generalized combining of formats configuration with location configurations, all locations are identified.

The Pixel Word Table shows a total number of bits for each format configuration. This total number of bits for each format may be distributed between pixel memory and surface memory in accordance with the location configuration selected.

Configuring of a refresh memory with format and location selection in accordance with the discussion with reference to the Pixel Word Table is shown for exemplary configurations in the Pixel Configuration Table. Location configurations 1 and 2 from the Pixel Word Table are selected as exemplary, where pixel memory 1405 is used without surface memory 1421 (location configuration 2) and where Pixel memory 1405 stores the identification byte and particular pixel related flags and surface memory 1421 stores all other pixel information (configuration 1). Format configurations A and B from the Pixel Word Table are selected as exemplary for illustrating tradeoffs associated with a typical format (format A) and an extensive format (Format B).

The Pixel Configuration Table illustrates that, for a particular refresh memory architecture, use of surface memory 1421 can reduce the amount of memory from less than a 4-fold improvement (configurations A1 and A2) to more than a 5-fold improvement (configurations B1 and B2). Calculations are made by totaling the number of bits per pixel partitioned to pixel memory 1405 and surface memory 1405 for a particular configuration, multiplying the number of bits per pixel times 0.276 million pixels per image in image memory, and multiplying the numbers of bits per surface word in parameter memory 1361 by 1,000 (or 0.001 million) surfaces in surface memory. Therefore, an improvement of about 276 times can be obtained for each bit that can be moved from a pixel-related word in pixel memory 1405 to a surface-related word in surface memory 1421. This is because, in this example, there are 276,000 pixels in pixel memory and 1,000 surfaces in surface memory; providing a 276-fold efficiency by storing information in surface memory 1421 compared to storing information in pixel memory 1405. Numbers in the subtotal row and above the subtotal row represent bits; bits per pixel in the pixel memory column (P) and bits per surface in the surface memory column (S). Numbers below the subtotal row represent millions of bits; where the 3-rows below the subtotal row represent millions of bits in pixel memory 1405, millions of bits in surface memory 1421, and millions of bits in total calculated by summing bits per pixel memory 1405 and bits per surface memory 1421.

PIXEL CONFIGURATION TABLE

| CONFIGURATION | A2 | | A1 | | B2 | | B1 | |
|---|---|---|---|---|---|---|---|---|
| LOCATION | P | S | P | S | P | S | P | S |
| IDENTIFICATION | 10 | | 10 | | 10 | | 10 | |
| COLOR | | | | | | | | |
| RED | 3 | | | 3 | 4 | | | 4 |
| GREEN | 3 | | | 3 | 4 | | | 4 |
| BLUE | 3 | | | 3 | 4 | | | 4 |
| RANGE | 14 | | | 14 | 20 | | | 20 |
| INTENSITY | 6 | | | 6 | 8 | | | 8 |
| TINT | | | | | | | | |
| RED | | | | | 4 | | | 4 |
| GREEN | | | | | 4 | | | 4 |
| BLUE | | | | | 4 | | | 4 |
| SHADING | | | | | 8 | | | 8 |
| SHADOWING | | | | | 8 | | | 8 |
| FLAGS | | | | | | | | |
| EDGE PIXEL | 1 | | 1 | | 1 | | 1 | |
| APERTURE PIXEL | | | | | 1 | | 1 | |
| INTERVENING EDGE PIXEL | | | | | 1 | | 1 | |
| TEST EDGE PIXEL | | | | | 1 | | 1 | |
| STATIC TEXTURE | | | | | 1 | | | 1 |
| DYNAMIC TEXTURE | | | | | 1 | | | 1 |
| TRANSPARENCY | | | | | 1 | | | 1 |
| LIGHT POINT | | | | | 1 | | | 1 |
| CURSOR | | | | | 1 | | | 1 |
| RETICLE | | | | | 1 | | | 1 |
| COMMON EDGE | | | | | 1 | | | 1 |
| SUBTOTAL | 40 | 0 | 11 | 29 | 89 | 0 | 14 | 75 |
| (0.276) P (MILLION) | 11 | | 3 | | 24 | | 4 | |
| (0.001) S (MILLION) | | 0 | | 0.03 | | 0 | | 0.07 |
| TOTAL (MILLION) | 11 | 3 | 24 | 4 | | | | |

CONSIDERATIONS:
Numbers are rounded off.
Assumptions: 1,000 surfaces
525 × 525 pixels

Image Identification

It is often desireable to identify objects, surfaces, or other images in pixel memory. One arrangement implementing object identification is to provide an identification field in the pixel word, as discussed herein. Various alternate arrangements of implementing identification in refresh memory without requiring an identification field will now be described. In one configuration, processing arrangements that do not require image identification in pixel memory may be provided. However, image identification may be desired for filling, range related details, etc.

In a first arrangement, each object may have a different occulting range. Therefore, it can be identified by the unique occulting range. For example, a 2,000 edge system may have 100 objects. If each object is located at a different range, then each object is uniquely identifiable thereby. Ranges of objects may be used for occulting priorities which may be an object-related ordering rather than an absolute range. Also, range-related size and range-related intensity may not be critical parameters, having low resolution. Therefore, the range field in refresh memory may be defined based upon the absolute range and then adapted to provide unique object identification so that objects have different and unique range codes. As the number of objects increase, the number of bits of range resolution can be increased without significant impact. For example, to facililtate this object identification consideration (and also the range related detail consideration), the range field can be increased in resolution with additional least significant bits (LSBs) or with additional non-significant bits (NSBs). This may not have a significant impact on pixel memory cost but may have a significant impact on object identification, range-related detail, and occulting priority capability. In one configuration, range-related motion, size, and intensity may be controlled without changing the range field in the pixel word. If there is high contention for pixel range field codes between objects, then the ordering or modifying of ranges of different objects in refresh memory to resolve this contention may be different from the actual ranges in real time processor memory. However, in the lower speed outer loop iteration of supervisory processor 125; this range adaptation can be re-established and re-initialized to preclude error buildup and to preclude losing track of object range between refresh memory and the geometric processor memory.

In an alternate configuration, additional bits can be added to the range field to resolve contention between objects at the same range. However, these additional bits may be considered to be the LSBs or NSBs of the range field.

Color Fill and Antistreaking

Color fill and antistreaking are implicit in the instant refresh memory implementation. Loading of color initial conditions in the pixel word color byte constitutes an initial color fill and updating of the color byte, as discussed for occultation and edge smoothing processing herein, updates the color byte to portray the latest dynamically changing scene. The color field for each pixel is read out on the pixel-by-pixel basis to a color converter in display interface 118, which uniquely defines the color for each pixel as the raster progresses through a line of pixels. Therefore, the color for each pixel is determined on a pixel-by-pixel basis. This facilitates features such as texturing, shading, and shadowing.

Antistreaking is used in CGI systems that turn on and turn off color at surface edges. However, the refresh memory arrangement discussed herein does not exhibit a streaking phenomenon; implicit in the above described color fill implementation. Streaking may be caused by the turning on of an improper color line at an edge or by not providing a second edge to turn off a color line. These conditions may be caused by geometric conditions, such as verticies of a surface, and can be caused by processor overloading. Therefore, conventional systems may need fill and antistreaking processing and may be intolerant to overloads. However, refresh memory architecture of the present invention eliminates such color fill and antistreaking processing and provides high tolerance to processor overloads.

Refresh Memory Contention Considerations

A refresh memory is typically accessed at a high rate for refreshing a CRT display. For a medium resolution 512-line CRT display, the pixel rate is about 10-MHz. For a high resolution 1024-line CRT display, the pixel rate is about 40-MHz. Therefore, even with special arrangements to reduce the memory access rate, such as multiplexing arrangements; refreshing places a heavy traffic load on the refresh memory. Consequently, it is desireable to reduce the refresh memory traffic associated with other operations, such as update operations.

Operations involving vector generation have relatively low traffic. However, operations involving fill processing can significantly increase update traffic. For example, edge processing may be considered to be linear processing and fill processing may be considered to be area processing, where fill processing may involve an exponential increase in traffic compared to edge processing. Further, fill processing may involve repetitive accessing from and storing into refresh memory for still further increases in traffic. Various methods can be used to reduce update traffic. These include use of an offline fill memory for fill processing in combination with an online refresh memoy for refresh operations; use of auxiliary memories, such as FIFOs, for offline storage of a limited subset of pixel memory information; and other such methods.

An offline fill memory used in conjunction with an online refresh memory can significantly reduce traffic to the online refresh memory. The offline fill memory can have a lower memory bandwidth requirement because it does not support refresh operations, such as required with the online refresh memory. Also, the offline fill memory may have lower pixel resolution than the online refresh memory to reduce the amount of offline fill memory required. The fill processor can operate with repetitive access and store operations in conjunction with the offline fill memory without increasing traffic with the online refresh memory. When a determination is made using the offline fill memory concerning the information to fill a pixel, then this fill information can be loaded into the online refresh memory. However, fill processing iterations for storing and fetching of information in conjunction with a memory map to determine this final update information can be performed with the offline fill memory; thereby reducing update traffic with the online refresh memory and reducing contention with refresh operations.

Use of an offline fill memory can reduce the amount of memory required for the online refresh memory. For example, many of the parameters stored in online refresh memory discussed herein; such as range, surface ID, and object ID; may be needed for fill operations but may not be needed for refresh operations. Refresh operations primarily need color words to load into the DACs in the display interface. Therefore, for a configuration having an offline fill memory for fill updating and an online refresh memory for refreshing, the offline fill memory can be implemented to store the information needed for fill operations and the online refresh memory can be implemented without the information needed for fill operations but not for refresh operations. In this configuration, the offline fill memory can be implemented as discussed herein having the fill-related information in addition to the color refresh information and the online refresh memory can be implemented so as not to store information that is not needed for refresh operations. For example, the offline fill memory can store range, ID, and color information for fill processing and the online refresh memory can store only color information or alternately can store color information with a limited amount of other information. The fill processors can operate in conjunction with the offline fill memory to determine the updated fill color per pixel and can then load the updated fill color into the online refresh memory to update the image being refreshed. Therefore, the storage requirements of the online refresh memory can be significantly reduced.

Use of auxiliary memories can reduce traffic to the online refresh memory and can provide other benefits, such as reducing processing bandwidth of the edge processor. Such use of auxiliary memories are illustrated with first-in-first-out (FIFO) memories. In this configuration, a FIFO can be loaded from the edge processor to store pixel information for edge pixels associated with a prior surface and a next surface. Fill operations access edge pixels from the FIFO, instead of from an edge processor, and perform fill processing. Information accessed from refresh memory can be temporarily stored with the related edge information in the FIFO to permit some of the fill operations to be performed with FIFO-based information instead of refresh memory-based information, thereby reducing update traffic to the refresh memory.

The features of the system of the present invention have been demonstrated on an experimental system, which is discussed herein, such as with reference to FIG. 17. Computer listings used to demonstrate the refresh memory are attached hereto in the Tables Of Computer Listings in the sub-table entitled Refresh Memory and Surface Memory. These listings illustrate various refresh memory descriptions herein, such as using a refresh memory for update processing and a seperate refresh memory for refreshing. For example, refresh memory is used for update operations substantially simultaneously with a seperate refresh memory in the CRT terminal performing refresh operations. Under control of the supervisory processor display routines; the information in the refresh memory that is being updated is transferred to the refresh memory in the CRT terminal that is refreshing the CRT display. The refresh memory that is being updated may be considered to be an offline memory and the refresh memory that is refreshing the display may be considered to be an online memory.

Various FIFO implementations have been reduced to practice, documented with computer listings referenced herein.

In a first configuration; a pair of FIFOs are implemented; one for storing next surface edge pixel information and the other for storing prior surface edge pixel information. The stored information contains edge-related flags, ID, and X and Y coordinates for each pixel. In another configuration; a hierarchial arrangement having surface, edge, and pixel information stored in a FIFO together with information accessed from refresh memory permits fill processing with the FIFO memory for reduced fill processing with refresh memory. For example, some information accessed from refresh memory, such as inside pixel and outside pixel information, can be stored in the FIFO with each edge pixel to permit accessing of such information from the FIFO to reduce pixel memory accesses related thereto.

The features of the system of the present invention have been demonstrated on an experimental system, which is discussed herein, such as with reference to FIG. 17. Computer listings used to demonstrate a FIFO memory are attached hereto in the Tables Of Computer Listings in the sub-table entitled FIFO memory. These listings are compatible with various FIFO descriptions herein and provide supplemental details, such as in the annotations in the left hand columns and the details of the assembly language code in the middle column.

Fill operations can be implemented using flags identifying pixels traversed by prior edges and next edges. Fill processing associated therewith is enhanced if contention between different moving surfaces is reduced, such as by limiting prior and next edge flags to a single moving surface to reduce interaction of multiple moving surfaces having prior and next edge flags that could cause ambiguity in the fill processing.

It may be desireable to process multiple moving surfaces simultaneously, such as for increasing the level of detail and the nature of the motion associated with an image. However it is also desireable to resolve ambiguities associated with interaction between multiple moving surfaces, such as overlapping of multiple moving surfaces being processed simultaneously. This can be achieved in various ways, illustrated by the following examples. In one configuration, a plurality of sets of prior and next edge flags and related information can be provided. For example, a first fill processor can use a first prior and next edge flag field, a second fill processor can use a second prior and next edge flag field, and additional fill processors can use additional prior and next edge flag fields in a refresh memory pixel word. For example, the P1P0 prior edge flag field and the NO next edge flag field can be replicated for different surfaces, where a separate group of such replicated fields can be dedicated to each fill processor operating simultaneously. Therefore, a plurality of seperate and dedicated flag fields reduces ambiguities associated with interaction of a plurality of fill processors operating simultaneously.

Multiple fill processor scans can be implemented with reduced contention by duplicating offline fill memories. A plurality of offline fill memories can be implemented and one or more fill processors can be assigned to the offline fill memories, as discussed above. Assignment can be fixed, dynamically allocated, or otherwise. Moving surfaces can be assigned to fill processors and fill processors can determine refresh memory updates. Fill processing can be performed with each of a plurality of offline fill memories and with each of a plurality of fill processors and updates can be loaded into the online refresh memory, as discussed above for a single offline fill memory used with an online refresh memory. This configuration provides several important advantages. First, it provides the advantages of the combination of an offline fill memory and an online refresh memory. Second, it facilitates multiple fill processors, such as for high detail images, with a minimum of increased traffic with the online refresh memory. This permits expansion from a basic capability system to high levels of capability by paralleling fill processing channels having a plurality of fill processors and offline fill memories. The parallel fill processing channels converge on a single back end; comprising the online refresh memory, display interface, and display monitor in a non-parallel single channel. Contention associated with multiple channels of fill processors updating a single back end channel is enhanced by each fill channel having a dedicated offline fill memory; where traffic to the online refresh memory involves primarily final update information, but does not include much of the auxiliary and iterative processing needed to derive that final update information.

Initialization Of Refresh Memory

Initial conditions may be placed into refresh memory 116 in various forms. One form is discussed herein with reference to driving of objects into the refresh memory, such as through a non-visible border around the refresh memory. Alternately, a configuration of the occulting processor permits surfaces to be drawn into refresh memory without being driven in incrementally. Both of these arrangements are discussed herein and are illustrative of other arrangements for initializing refresh memory 116 prior to beginning a visual scenario and also for entering objects into refresh memory 116 as objects enter the viewport environment.

Initialization of refresh memory 116 can be achieved by using occulting processor 132 to write initial condition information therein. This can be achieved first by clearing refresh memory and second by inserting surfaces into refresh memory with the occulting processor. The primary differences between initial condition generation and normal occulting operations is (a) that normal occulting operations may be performed for only moving objects while initial condition generation may be performed for all objects, moving and stationary, and (b) that normal occulting operations may involve both P-edges and N-edges while initial condition generation may involve only N-edges. Drawing of only an N-edge can be achieved with the F1-flag being set for P-edges to facilitate non-drawing of the P-surface. As the surfaces are drawn into refresh memory, occulting processing for N-surfaces will insure that the more distant surfaces are occulted by the overlapping less distant surfaces in accordance with leading area N-edge occulting processing. In this manner, all surfaces in geometric processor 130 can be drawn into refresh memory 116, consistant with occulting between surfaces, to generate an initial condition image in refresh memory 116. Then, initiation of driving functions will drive objects through the environment in accordance with geometric processor operations to generate the P-edges and N-edges for erasing of trailing areas and filling of leading areas respectively for moving edges to change the initial conditions in refresh memory in accordance with the scenario implemented with the driving functions.

Initial condition generation may be provided in conjunction with a non-visible refresh memory frame used to introduce initial conditions to the visible portion of the refresh memory. Use of this non-visible frame for initial condition generation will now be discussed in greater detail.

An object can be placed into a portion of the non-visible frame when there are not other objects therein. Therefore, occulting can be assumed to be by the object placed therein without any other objects or background. Therefore, the incremental occulting of the moving of the object's edges is not then a requirement. Hence, the object may be placed in the non-visible frame in whole number (non-incremental) form by generating the edges with the edge processor and by placing these edges in the refresh memory frame and by filling the pixel words for range and color between the edges. Then the object can be incrementally slewed from the non-visible frame into the visible portion of the refresh memory.

In order to reduce memory costs, it may be desireable to minimize the width of the non-visible frame. For objects larger than the frame, part of the object may not fit on the frame and may therefore be off the end of the frame. This condition may be readily accomodated with another feature of the present invention. Placing of an object in the non-visible frame may be accomplished by generating object edges with an edge processor and storing the edge information in the pixels identified by the edge processor. If the edge processor identifies pixel addresses that are not implemented, being beyond the end of the non-visible frame; these edge pixels and the surface pixels adjacent thereto cannot be filled because they are not implemented. However, the edge pixels and surface pixels that are within the non-visible frame may be filled in accordance with the edge processing and surface filling methods discussed herein. As an object is slewed into the visible portion of the frame, portions of the object off the end of the frame become located on the frame and therefore may be properly filled. In one configuration, the end of the frame may be considered to be the edge of an object moving into the frame and therefore may be considered to be filling the pixels therein. As an edge of an object that was beyond the end of the frame moves onto the frame, the edge processor generating this edge and fills the edge pixels with the appropriate edge words. Therefore, an object may be driven into the refresh memory even though the dimensions of the object may be greater than the dimensions of the non-visible frame.

In an alternate configuration, one portion of try-non-visible frame may be larger than other portions of the non-visible frame to facilitate loading of objects therein that have relatively large dimensions and slewing such objects into the visible portion of the refresh memory. This larger frame portion embodiment may also be used in combination with the above clipped object configuration to facilitate generation of initial conditions for still larger objects.

In still another configuration, objects that are to be initialized in accordance with the non-visible frame feature may be initialized in small size in accordance with the scaling feature of the present invention. As the object is moved onto the non-visible frame and slewed into the refresh memory, it may also be slewed in size to increase from a size that more readily fits in the non-visible frame to a size consistent with the desired object conditions.

In accordance with the initial condition scaling feature and other sclaing features discussed herein, various portions of the system may have resolution consistent with preserving dimensional precision that may be scaled to 1/16th of its normal size may have 4-bits of extra computational resolution to preserve the less significant details in the LSBs, even when the object is scaled to a small size; where the detail in the LSBs may be below the resolution of the refresh memory.

Whole number initial conditions can be generated by a host computer, or by initial condition slew processing, or by other architectures described herein. Generation of initial conditions, such as for visual system startup or for introducing a new object into the display environment, does not require continuity with prior images, but represents an instantaneous change that is inherently discontinuous. Therefore, slight processing delays or discontinuities during generation of initial conditions is consistent with system requirements for continuous operation. Continuous operation may be interpreted to mean continuous operation after an object has been introduced into the display environment. Therefore, whole number processing and other relatively time consuming processing can be used for discontinuous initial condition generation and less time consuming real time incremental processing can be used for updating of the already displayed continuous information.

Objects often enter the edge of the display and progress into the display. Initial introduction of a point or an edge of a newly introduced object can be provided with whole number processing as an initial condition, as discussed herein; while the progression of that object into the display environment once initialized can be implemented with continuous incremental processing.

Incremental slew processing can be used for initial condition generation as an alternate to the above described whole number initial condition generation. An object in database coordinates can be transformed to observer coordinates by incrementally updating the object coordinate information until it has been updated to its assigned position in the observer's coordinate system. For example, if database coordinates are zero translational position and zero angular orientation, the geometric processor can be slewed from this zero database coordinate condition by incrementally updating translational and rotational positions until the translational and rotational positions are equal to the assigned positions in the observer's coordinate system.

Initial condition generation, whether whole number or incremental slew, or other form can be performed automatically during system turnon and for step or discontinuous changes in the scene. Scene step or discontinuous changes includes selection of new and different scenes as may be performed during visual system operation. Also, step or discontinuous changes include new objects that might be required to appear instantaneously within the scene as contrasted to moving into the scene incrementally.

Alternate Configurations

A refresh memory based system (FIG. 1) is discussed herein to illustrate various features of the present invention. Many other system architectures may be provided and many other refresh memory architectures may be provided. For example, visual processor 114 may be directly interfaced to display monitor 120, such as through display interface 118 without refresh memory 116. Also, refresh memory 116 need not be implemented as digital random access, memory mapped, single buffer refresh memories. For example, refresh memory 116 can use an analog memory such as a continuous magnetostrictive or SAW memory or a sampled analog CCD memory; can use a hybrid memory such as a hybrid CCD memory; can use a sequential access memory such as a serial CCD memory; can use a delta modulated refresh memory instead of a mapped refresh memory; can use multiple buffers such as a double buffer memory; and can use other refresh memory configurations.

A system architecture can be configured without a refresh memory, such as by direct interfacing of visual processor 114 to display monitor 120 through display interface 118. Such an architecture may need to synchronize visual processor operations with display monitor signal requirements, particularly if display monitor 120 is a raster scan monitor. Other types of display monitors; such as memory tube monitors, calligraphic vector generation, and others; may simplify interfacing such as direct interfacing of visual processor 114 to display monitor 120. In such an arrangement, signals from visual processor 114 can be applied directly to display interface 118 for exciting display monitor 120. For example, in a configuration using a calligraphic display monitor, edge processors discussed herein with reference to FIGS. 7 and 8 can be used to generate vectors which are compatible with calligraphic display monitor requirements.

DISPLAY INTERFACE (FIGS. 15 AND 16)

Introduction

The display interface 118 (FIG. 1A) performs signal processing for interfacing a visual processor to a display monitor. Several display interface configurations will be discussed as being exemplary of the broader features of the present invention. These discussed configurations involve hybrid signal processing, such as receiving digital signals from a digital refresh memory or digital visual processor and generating analog signals to excite a display monitor. However, other arrangements may be provided; such as receiving analog signals from an analog refresh memory or analog visual processor and generating analog signals to excite a display monitor and such as receiving digital signals from a digital refresh memory or digital visual processor and generating digital signals to excite a display monitor. The discussed configurations involve excitation of a color CRT display monitor with raster scan red-green-blue (RGB) color signals. However, other arrangements may be provided such as generating calligraphic vector signal instead of raster scan signals generating black and signals or non-RGB color signals to a display monitor using a non-color CRT display monitor (i.e., a black and white CRT monitor); and using a non-CRT display monitor; such as a liquid crystal, plasma, or other display monitor.

Raster Scan Operation

Raster scan signal generation can be implemented by reading pixel words out of refresh memory in a raster scan form, pixel-by-pixel in a line and then line-by-line. The implementation of the refresh memory as a memory map of the display screen facilitates this scan signal generation. Each of three digital color nibbles from the color field of a pixel word can be converted to analog signal form with a DAC, yielding separate channels of red, green, and blue analog signals. All three channels can be scaled with a common analog scale factor signal to control intensity.

In one configuration, the refresh counter counts raster lines and counts pixels along the raster lines, consistent with the raster scan of a CRT. The refresh counter accesses the proper pixel words in raster scan format from refresh memory. The color field containing the red, green, and blue subfield nibbles excites three color DACs. As the raster scans through a sequence of pixels on the CRT face, the refresh counter counts through a corresponding set of pixel addresses in the refresh memory, accessing the pixel words related to these addresses in sequence and applying the color field information to the color DACs to generate the analog color signals for each pixel at the proper time.

RGB Color Circuits

Color circuits generating red, green and blue (RGB) signals can be used to interface a visual processor to a RGB display monitor. In this hybrid configuration, each color circuit may be implemented with a digital-to-analog converter (DAC) for converting a digital color nibble from the visual processor into an analog color signal to excite the display monitor. Digital color signals to excite color circuits may be accessed from a refresh memory in the form of pixel words and may be accessed from a parameter memory for a particular surface to be displayed. Alternately, digital color signals may be obtained from a digital processor directly generating these signals, or from a digital recorder storing these signals, or from other sources.

Figures 15A, 15B, 15C, 15D:
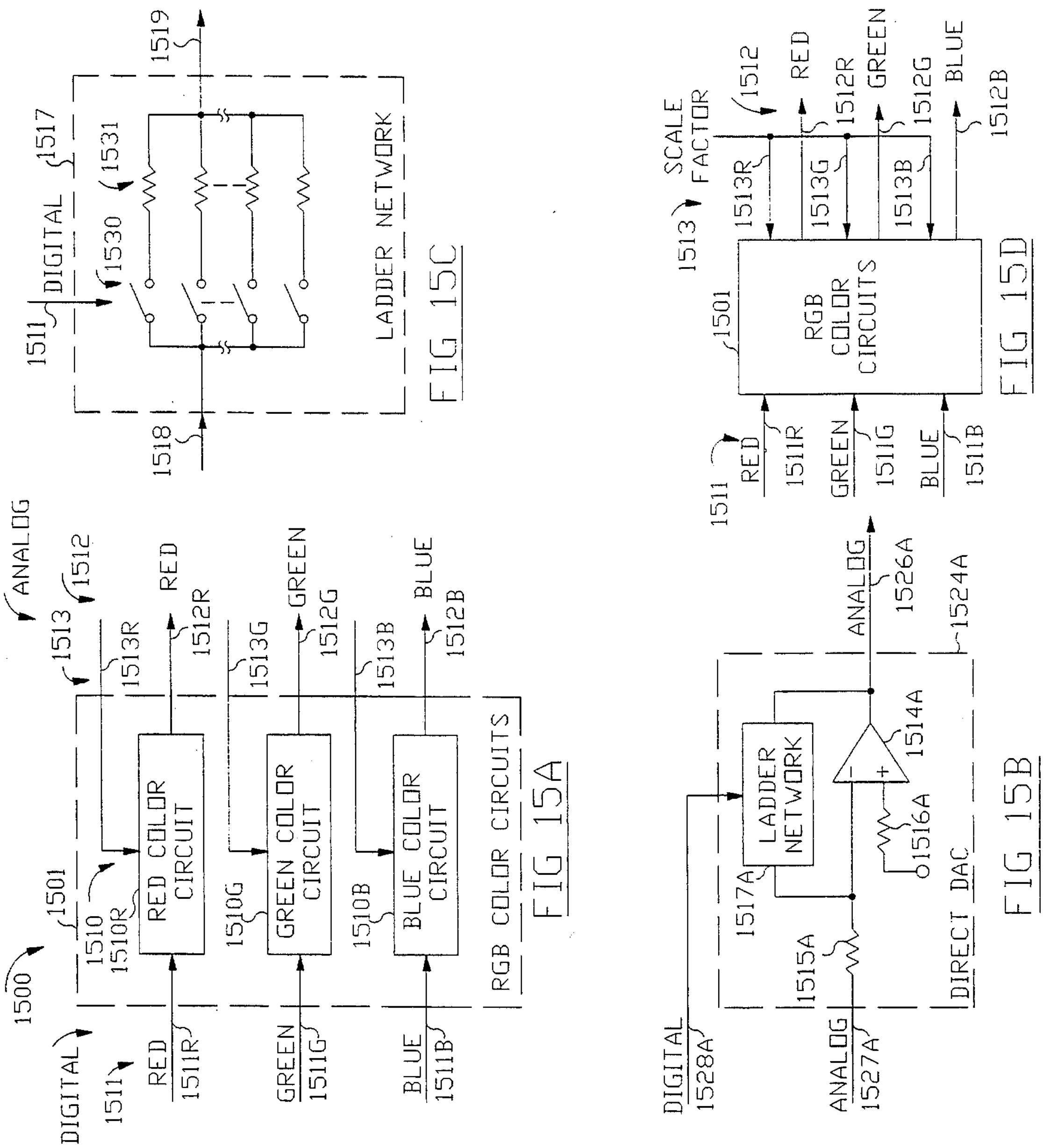
FIGS. 15A, 15B, 15C, 15D, 15E, 15F, 15G, 15H and 15I, is a block diagram and schematic diagram representation of a display interface; where
Figure 16:
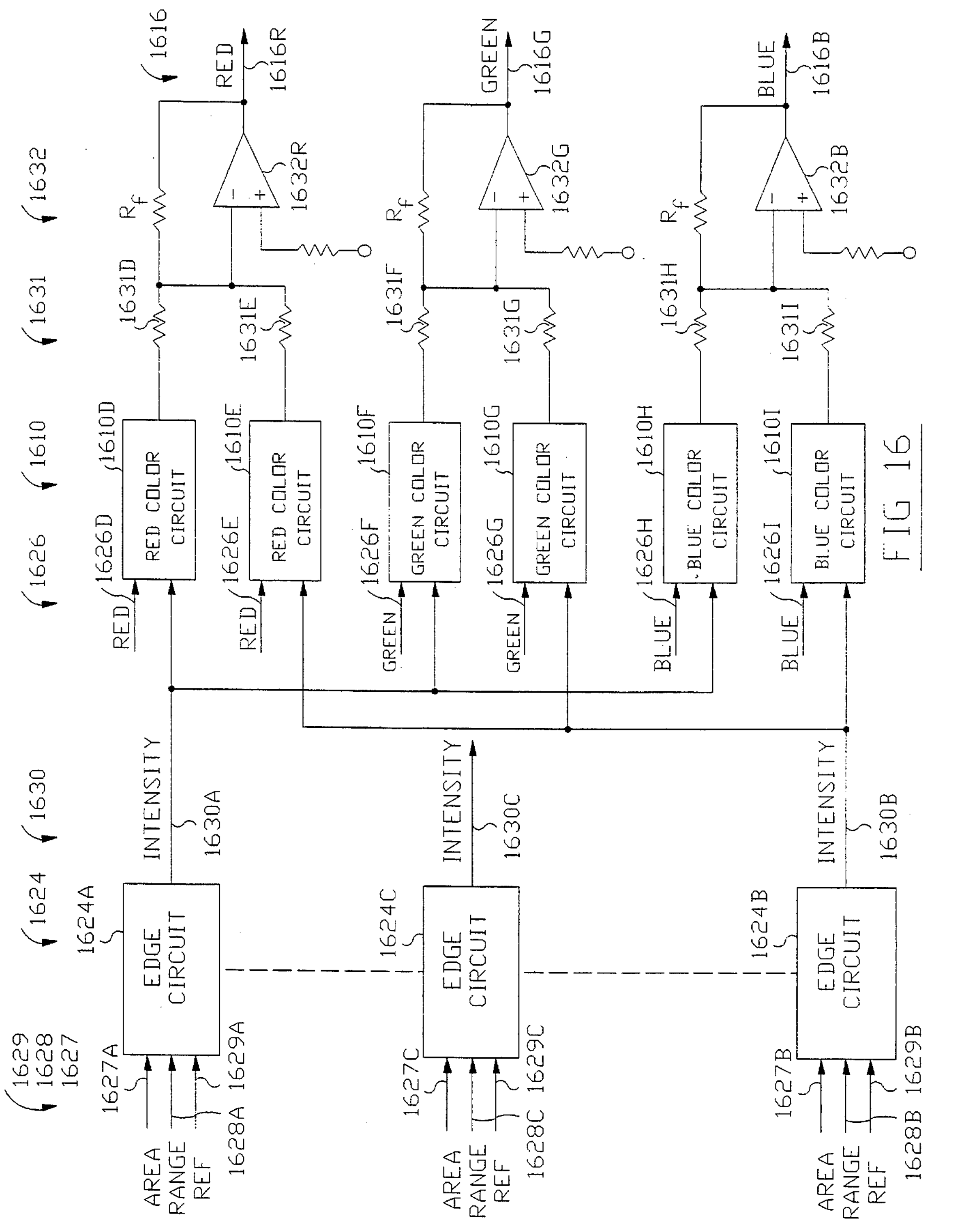
FIG. 16 is a block diagram and schematic representation of a hybrid edge smoothing arrangement.

One configuration of an RGB color circuit 1500 is shown in FIG. 15A. Color circuits 1501 can include a plurality of individual color circuits 1510 such as including red color circuit 1510R, green color circuit 1510G, and blue color circuit 1510B. Each color circuit may contain a DAC for converting digital input signals 1511 to an analog output signal 1512. For example, red color circuit 1510R can generate red analog color signal 1512R in response to red digital color nibble 1511R, green color circuit 1510G can generate green analog color signal 1512G in response to green digital color nibble 1511F, and blue color circuit 1510B can generate blue analog color signal 1512B in response to blue digital color nibble 1511B. As the raster scan progresses, a sequence of digital RGB signals 1511 may be accessed from refresh memory, parameter memory, or elsewhere and applied to color circuits 1510 to generate analog color signals 1512 having analog amplitudes related to the images being scanned.

A DAC may have an analog reference signal which may be used to provide a scale factor for the output analog signal. Such an arrangement may be called a multiplying DAC, where analog output signal 1512 is proportional to the product of digital input signal 1511 and analog scale factor signal 1513. In one configuration, scale factor signal 1513 may be connected to a reference signal for setting a scale factor. In alternate configurations; scale factor signals 1513 may be controlled to provide variable scale factor, intensity, or other conditions.

Color circuits 1510 may be implemented in various forms. A multiplying DAC form is shown in FIG. 15B. Each color circuit 1510 may be a DAC comprising operation amplifier 1514A having differential inputs. Analog scale factor signal 1527A may be connected to the negative input of operational amplifier 1514A through input resistor 1515A. A reference such as ground or alternately a bias voltage may be connected through resistor 1516 to the positive input of operation amplifier 1514A. A digitally programmable ladder network 1517A may be connected as a feedback network from analog output line 1526A to the input summing junction of amplifier 1514A. Ladder network 1517A can be controlled with digital signal 1512A to set the magnitude of feedback resistance and therefore to set the gain of amplifier 1514A and to set the amplitude of analog output signal 1526A proportional to digital signal 1528A. Hence, as analog scale factor signal 1527A varies, analog output signal 1526A varies proportionally, and as digital signal 1528A varies, the gain of amplifier 1514A varies proportionally and consequently analog output signal 1526A varies proportionally. Therefore, analog output signal 1526A is proportional to analog input signal 1527A and digital input signal 1528A.

Figure 15F:
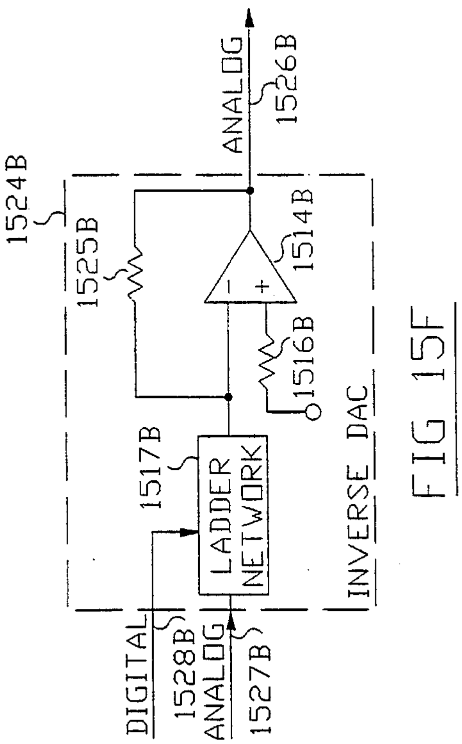
Figure 15H:
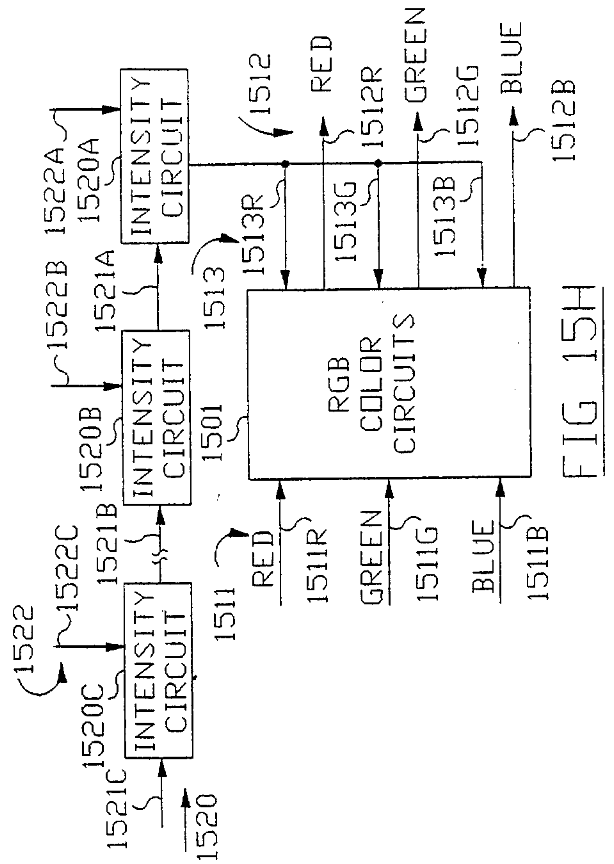

Ladder network 1517 (FIG. 15C) may be used in the arrangement discussed herein such as ladder network 1519 (FIG. 15B) discussed above; such as ladder networks 1517B, 1517C, and 1517D discussed hereinafter; and other ladder networks that may be discussed herein. Ladder network 1517 (FIG. 15C) may include a plurality of circuits connected in parallel each having a switch 1530 and an impedance 1531 connected in series. Switches 1530 may be implemented with electronic analog switches, such as FET switches or other electronic analog switches. Switches 1530 may be controlled with digital signal 1511, such as from a digital register, to provide a combination of open and closed switches 1530 consistent with the one and zero pattern in the digital word. Impedances 1531 may be weighted resistors such as having a binary weighting or may be other impedances. Circuits having a switch and impedance may be connected in parallel between input terminal 1518 and output terminal 1519, such as for connecting to the input of an operational amplifier (FIGS. 15F and 15G) and in the feedback of an operational amplifier (FIGS. 15B and 15G).

The display interface can communicate with other system devices in various ways. For example, FIG. 15 shows RGB color circuits 1501 receiving RGB digital input signals 1511 and RGB analog scale factor input signals 1513 generating RGB analog output signals 1512. Various interfacing arrangements may be provided to interface display monitor 120 with refresh memory 116, visual processor 114, and other system devices; such as with display interface 118. Typical interfacing arrangements will now be discussed.

Digital input signals 1511 can be derived from the digital color bytes stored in a pixel word in refresh memory 116. Interfacing may directly connect output lines 117 from refresh memory 116 to a display interface 118; or by providing interface registers, such as shown in FIG. 13F, to interface refresh memory 116 with display interface 118. Pixel words stored in registers 1350 may be connected to display interface 118 to connect the color byte to RGB color circuits 1501 and to connect range and intensity bytes to intensity circuits 1520 (FIG. 15). In the lookahead arrangement discussed with reference to FIG. 13F, the present-pixel output line 1355 from present pixel register 1354 may be connected to RGB color circuits 1301 for refreshing of the present pixel. Alternately, other pixel bytes, such the next pixel output line 1353 from next pixel register 1352 or the prior pixel output line 1357 from prior pixel register 1356 may be connected to excite display interface 118.

A digital color signal 1311 and digital intensity signals 1522 (FIG. 15H) can be derived from various sources. In one configuration discussed herein; the color byte, intensity byte, and range byte signals are derived from refresh memory 116. Alternately, these signals may be derived from other sources, such as from supervisory processor 125 communicating directly with display interface 118 with signals 127C (FIGS. 1A and 1B).

Interfacing of display interface 118 to display monitor 120 will now be discussed. This discussion is illustrative of interfacing of display interface 118 with other system devices and interfacing of refresh memory 116 with other system devices. RGB analog signals 1512 generated with RGB color circuits 1501 (FIGS. 15 and 16) can be interfaced to display monitor 120, video tape recorders, and other devices. Conventional display monitors are configured to receive analog RGB signals and therefore may directly use analog RGB signals 1512. Synchronization with display monitor 120 may be performed with well known devices; such as an NTSC synchronization generator, which is well known in the art; or may be provided with synchronization signals derived from refresh address counter 1311 (FIG. 13B); or may be provided with signals generated in the display monitor itself.

Hybrid Intensity Control

Intensity control can be provided in various forms; such as implemented in the analog, digital, and hybrid domains. A hybrid intensity control Configuration is discussed below with reference to FIGS. 15E and 15F. Various digital intensity control configurations have been discussed above. An analog intensity control configuration is discussed hereinafter.

Various applications of visual systems may require intensity control. For example; visual atmospheric effects, such as haze, reduces intensity of illumination as a function of range of an object from an observer. A controlled intensity arrangement will now be discussed with reference to FIGS. 15E and 15F.

Range variable intensity may be implemented as a variation of the intensity control arrangement discussed herein.

Each color DAC may be excited by a range-related analog intensity voltage (FIGS. 15A, 15D, 15E, and 15H). The color video signal can be generated as a function of the input digital color nibble and an input analog intensity signal. The same intensity signal can be applied to all three DACs. These three DACs can be "multiplying" DACs, each generating an analog output signal that is the product of the digital color nibble and the analog intensity signal. DACs can provide reciprocal operations of multiplication and division, depending upon whether the digital ladder is in the feedback circuit for multiplication (FIG. 15B) or in the input circuit for division (FIG. 15F). The analog intensity signal can be generated with a range variable intensity DAC (FIG. 15F). The input to the intensity DAC can be the range byte from the pixel word. Therefore, as the three digital color nibbles are input to the three color DACs, the range byte from the same pixel word can be input to the range variable intensity DAC. Hence, intensity of the three color analog signals is inversely proportional to the range. Consequently, as the range of an object increases, the color of that object remains constant and the intensity of that color decreases.

Figure 15E:
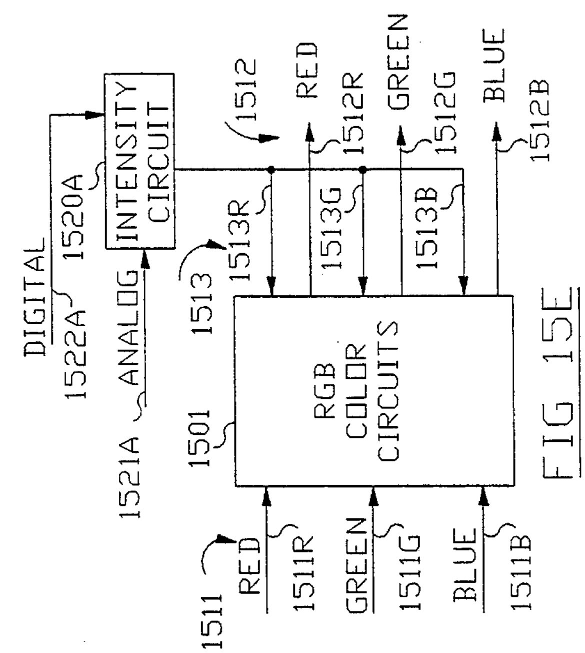
Figure 15G:
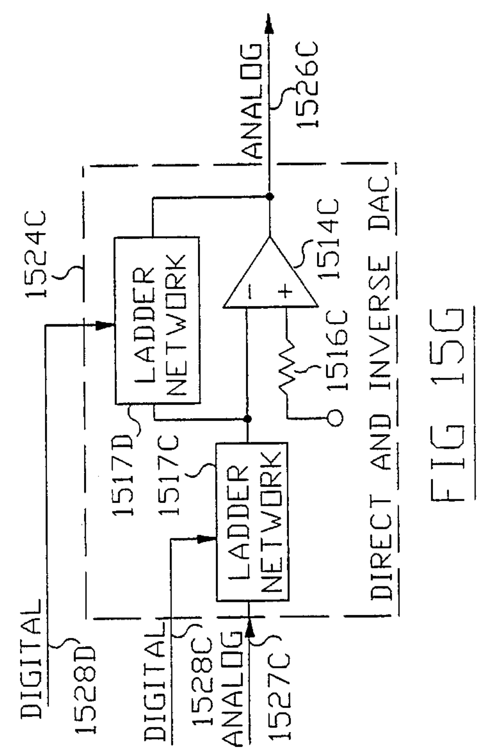

The variable intensity arrangement shown in FIG. 15E combines the RGB color circuit arrangement of FIG. 15A with intensity circuit 1520A for generating analog intensity signal 1513 (FIGS. 15A and 15E). A digital parameter 1522A controls intensity circuit 1520A to generate intensity signal 1513 to control intensity of color video signals 1512. Digital parameter 1522A may be derived from various sources and input as intensity signal 1522A for controlling intensity circuit 1520A to vary intensity of color circuits 1501. One configuration of a hybrid intensity circuit 1520A will now be discussed with reference to FIG. 15F.

Intensity circuit 1520A (FIG. 15E) may be implemented as shown for intensity circuit 1524B (FIG. 15F). Intensity circuit 1524B may include an operation amplifier 1514B having a ladder network 1517B in the input circuit thereof. Digital input signal 1522B controls ladder network 1517B to provide an analog output signal 1526B inversely proportional to the digital code of digital signal 1522B. Feedback impedance 1522B may be a gain setting resistor, where the gain of amplifier 1514B is established by the ratio of feedback impedance 1525B and input impedance 1517B. An analog input signal 1527A may be used to set the scale factor of the output intensity signal 1526B. Alternately, signal 1527A may be a bias signal for constant scale factor. Amplifier 1514B may have a differential input, where feedback impedance 1525B and input impedance 1517B may be connected to the negative input and a bias resistor may be connected to the positive input, as shown in FIG. 15F. Alternately, other bias and control arrangements for operational amplifiers may be used. Intensity circuit 1524B provides an intensity output signal having a magnitude that is inversely proportional to the magnitude of digital input signal 1522B and directly proportional to the magnitude of analog input signal 1527A.

A combination direct and inverse DAC will now be discussed with reference to FIG. 15G. DAC 1524C includes an operational amplifier 1514C having ladder networks 1517C and 1517D in the input and feedback thereof. Digital input signals 1528D and 1528C control ladder network 1517D and 1517C respectively to provide analog output signal 1526C directly proportional to the digital code of signal 1528D and inversely proportional to the digital code of signal 1528C. An input signal 1526C may be used to set the scale factor of the output intensity signal 1526C. Amplifier 1514C may have a differential input; where the feedback network including ladder network 1517D, and the input network, including ladder network 1517C, may be connected to the negative input and a bias resistor may be connected to the positive input, as shown in FIG. 15G. Alternately, other bias and control arrangement for operational amplifiers may be used. DAC 1524C can provide an intensity analog output signal 1526C that has a magnitude that is directly proportional to the magnitude of digital input signal 1528D, inversely proportional to the magnitude of digital input signal 1528C, and directly proportional to the magnitude of analog reference input signal 1527C.

The intensity control arrangement discussed with reference to FIG. 15E may be expanded to the arrangement shown in FIG. 15H to accomodate multiple intensity control signals. A plurality of intensity circuits 1520A to 1520C (1520) may be provided having analog input signals 1522A to 1522C respectively and digital input signals 1522A to 1522C respectively. The break in line 1521B is illustrative of the inclusion of additional intensity control circuits, as may be desired to implement additional intensity control operations. Intensity circuits 1520A to 1520C are shown connected in the form of multiplying DACs for generating an output intensity signal 1513 that is the product of digital signals 1522A to 1522C and analog signal 1521C. For example, in a triple intensity circuit configuration; signal 1521B is proportional to the product of analog signal 1521C and digital signal 1522C as generated with multiplying DAC 1520C, analog signal 1521A is proportional to the product of analog signal 1521B and digital signal 1522B (and therefore to the product of analog signal 1521C and digital signals 1522B and 1522C) as generated with multiplying DAC 1520B, and analog signal 1513 is proportional to the product of analog signal 1521A and digital-signal 1522A (and therefore to the product of analog signal 1521C and digital signals 1522A, 1522B, and 1522C) as generated with multiplying DAC 1520A. Therefore, intensity signal 1513 is proportional to the multiple digital intensity signals 1522A to 1522C and analog signal 1521C. These digital and analog intensity signals may be derived in various forms. Proportionality may be direct, inverse, combinations of direct and inverse, and other forms thereof. Implementation of direct and inverse proportional circuits is discussed below.

Intensity parameters may be directly or inversely proportional to intensity. For example, an intensity byte may be directly proportional to the desired intensity, where the greater the magnitude of the intensity byte the greater the intensity. Also, an intensity byte may be inversely proportional to the desired intensity, where the greater the magnitude of the intensity byte, the lesser the intensity. For example, a range variable intensity implementation may decrease intensity as range increases, such as caused by haze and other atmospheric effects; where intensity may be inversely proportional to the range byte.

A direct DAC for generating analog color signals 1512 that are directly proportional to the magnitude of digital input signal 1511 (FIG. 15A) is discussed herein with reference to FIG. 15B. Similarly, an inverse DAC for generating analog intensity signals 1513 that are inversely proportional to the magnitude of digital input signal 1522B is discussed herein relative to FIGS. 15D, 15E, and 15H. Direct DAC 1524A (FIG. 15B) and inverse DAC 1524B (FIG. 15F) may be used as required for intensity circuit 1520A (FIG. 15E) and may be used in combinations therebetween for a plurality of intensity circuits 1520 (FIG. 15H).

Intensity circuits 1520 may have combinations of both direct and inverse digital parameters, such as using the implementation shown in FIG. 15G. In such a configuration, an intensity circuit 1520 may have two digital inputs, one being a direct digital input 1528D and the other being an inverse digital input 1528C. For example, the arrangement shown in FIG. 15G may have a direct digital input intensity signal 1528D, such as a programmable intensity byte input, and an inverse digital input intensity signal 1528C, such as a range byte input, to generate an output analog signal 1526C directly proportional to the programmable intensity byte and inversely proportional to the range byte. Also, the arrangement shown in FIG. 15G may be used for a color circuit 1510 (FIG. 15A) and may have a color nibble input as the direct digital input 1528D and may have a range byte input as the inverse digital input 1528C for generating analog output signal 1526C that has a range variable intensity compensated color nibble. Alternately, various circuit arrangements can be provided for sharing a single inverse ladder 1517C between all three color circuits 1510, such as with one ladder network 1517C shared between all three color DACs in conjunction with input resistor 1515A for each color DAC.

Digital words can be adapted to the desired form; such as with roundoff, packing, unpacking, and other digital processing. For example, a 12-bit range byte used for range variable intensity can be rounded-off to a 6-bit digital number to be input to a 6-bit intensity DAC. Roundoff can be implemented by using the most significant six bits of the 12-bit range byte or by other roundoff methods. Also, a 3-bit color nibble can be packed together with a 2-bit texture nibble by applying the 3-bit color nibble to the 3-MSBs of a 5-bit color DAC and by applying the 2-bit texture nibble to the 2-LSBs of the 5-bit color DAC.

Figure 15I:
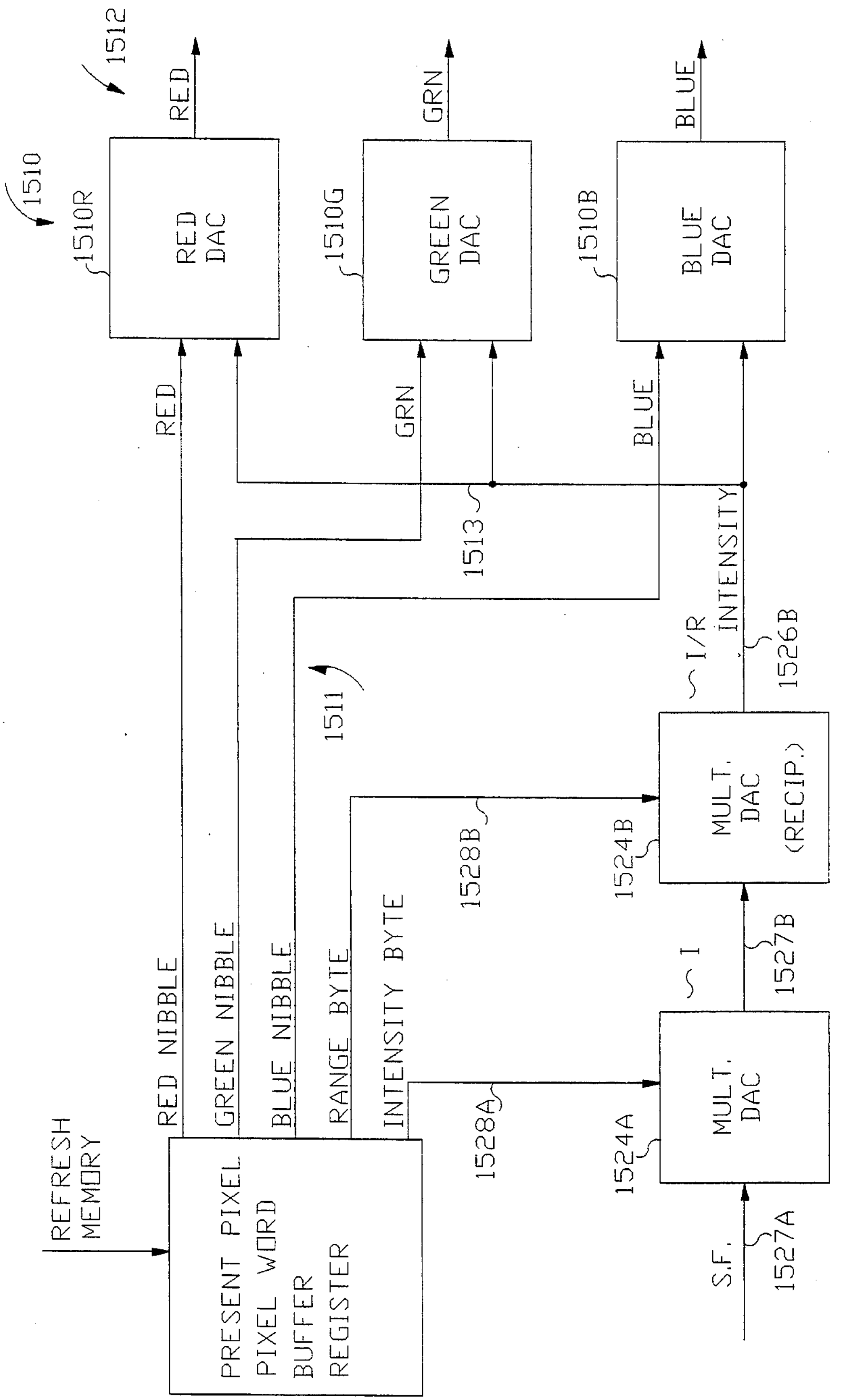

A block diagram of the display interface, previously discussed with reference to FIGS. 15A to 15H will now be discussed with reference to FIG. 15I. Pixel information from refresh memory can be loaded into the present pixel word buffer registers for buffering the red nibble, green nibble, blue nibble, range byte, and intensity byte. The intensity byte can excite a multiplying DAC, implemented as a direct DAC, to generate an analog signal directly proportional to scale factor and directly proportioned to intensity, in response to the analog scale factor signal and the digital intensity byte. The range byte can exite a multiplying DAC, implemented as an inverse DAC, to generate an analog signal inversely proportional to range and directly proportional to intensity in response to the analog intensity signal and the digital range byte. The range variable intensity signal can be used as a scale factor signal to the red color DAC, green color DAC, and blue color DAC. The red, green, and blue nibbles from the buffer registers can be used to exite the red, green, and blue color DACs respectively to generate red, green, and blue analog signals directly proportional to the related color nibble, directly proportional to the intensity byte, and inversely proportional to the range byte.

Analog Intensity Control

The hybrid intensity control arrangement discussed with reference to FIGS. 15E and 15H can be adapted to an analog intensity control arrangement, such as by removing digital intensity control signals 1522 (or changing to analog intensity control signals) and adapting intensity control circuits 1520 to analog signal processing circuits. Analog input signals 1521A to 1521C may be a single analog signal or a plurality of analog signals related to controlling intensity parameters. Intensity circuits 1520 may comprise analog signal processing circuits; such as analog multipliers, dividers, summers, amplifiers, non-linear circuits, and other analog circuits. Intensity controlling signals discussed herein; such as range-related, scenario-related, and others; may be provided in analog signal form to be input to intensity circuits 1520 as analog signals 1521A to 1521C for processing with analog intensity circuits 1520 to generate analog intensity signals 1513 to RGB color circuits 1501.

Various digital and hybrid intensity control arrangements have been discussed herein, such as hybrid and digital range variable intensity arrangements. These digital and hybrid arrangements can be adapted to analog arrangements, such as by converting digital signals to analog signals with DACs and by performing the indicated processing in the analog domain with analog intensity circuits, similar to the form indicated to be performed with digital and hybrid intensity circuits.

Hybrid Edge Smoothing

Edge smoothing has been discussed with reference to FIG. 11C herein for digital smoothing using digital area weighting circuitry. Similarly, hybrid edge smoothing may be provided with area weighting parameters, the generation of which is discussed in the section related to smoothing, and a hybrid circuit exemplified by the circuit shown in FIG. 16A. This arrangement is discussed for smoothing using an area weighting parameter and a range parameter for weighting the color nibbles for a plurality of surfaces dissecting at an edge pixel. These discussions are exemplary of smoothing of other parameters; such as programmable intensity, shading, and other such parameters.

Edge smoothing can be implemented by area weighting the colors of a plurality of adjacent surfaces and summing the weighted colors. An edge flag in a pixel word can identify an edge pixel if the edge flag is set, the colors can be the weighted sum of the two adjacent pixels on that horizontal raster scan line and the area weighting factor can be a byte stored in the color field of the edge-pixel. Three pixels can be used for edge smoothing; which are the prior pixel immediately adjacent to and to the left of the edge pixel, the next pixel immediately adjacent to and to the right of the edge pixel, and the edge pixel itself inbetween and adjacent to the prior-pixel and the next-pixel (FIG. 11A). The prior pixel and next pixel contain the colors in the color field that are to be mixed to provide the smoothed edge color for the edge-pixel. The edge pixel, identified by the edge flag being set, may contain the area weighting number in the color field for weighting of the colors.

Various contingency processing arrangements can be provided to take advantage of special conditions that may be detected. For example, if the next pixel or prior pixel is an edge pixel, such as with a horizontal edge along a raster scan line, additional processing may be performed. This additional processing may include redetermining the prior pixel and the next pixel. Redetermine may include defining the prior pixel as the pixel immediately adjacent to and above the present edge pixel and defining the next pixel as the pixel immediately adjacent to and below the present edge pixel.

Hybrid edge smoothing can be implemented with multiplying DACs (FIGS. 15G and 16A) similar to that discussed above for intensity control. The colors of two adjacent surfaces that are traversing the same pixel can be mixed, weighted by the related subpixel areas. This can be implemented by fetching the color byte from the prior pixel and next pixel adjacent to the edge-pixel (corresponding to the adjacent surfaces intersecting at the edge-pixel) and by fetching an area weighting parameter from the edge pixel that is stored in refresh memory. A two pixel word buffer, such as buffer 1144 and 1145 (FIG. 11C) can be used to store the prior pixel word and the edge pixel word. A pixel lookahead can be used to fetch the next-pixel word. The two color bytes can be obtained from the buffered prior pixel word and the fetched next-pixel word. These bytes can be applied to a pair of RGB color DACs, which generate the RGB colors for each of the adjacent pixels. The area weighting byte can be obtained from the color field of the buffered edge pixel word and applied to the intensity control of the multiplying DAC for the prior pixel DACs. Its complement can be applied to the intensity control of the multiplying DAC for the next pixel DACs. Therefore, two sets of three color components can be generated, being the three color components of the prior pixel adjacent to the edge pixel and three color components of the next pixel adjacent to the edge pixel; each weighted by the corresponding area of the divided pixel.

The weighted colors can be mixed or added to provide three smoothed color components for the edge pixel. For example, the direct weighted prior pixel red signal is mixed with the complement weighted next pixel red signal to generate the smoothed edge pixel red signal. Similarly, the green and blue signals are mixed to provide smoothed edge pixel green and blue color signals.

The above described hybrid signal processing uses components such as digital-to-analog ladder networks and operation amplifiers for summing, feedback, and gain. They can be integrated together into a single circuit having color conversion, intensity, and edge smoothing signal processing. Intensity is selectable, such as by the supervisory processor setting an intensity enable/disable control bit. Edge smoothing is selectable, such as by the supervisory processor setting an edge smoothing enable/disable control bit. When edge smoothing is enabled and simultaneously an edge pixel flag is detected, smoothing can be provided by transferring the prior pixel and next pixel color bytes into the prior pixel and next pixel DACs and transferring the area weighting number and the complement of this area weighting number into the prior pixel and next pixel DACs, respectively. When edge smoothing is disabled or when an edge pixel flag is not detected, smoothing is disabled by transferring the present pixel color byte into the prior pixel and next pixel color DACs and transferring a half-area weighting number into the prior pixel and next pixel DACs, respectively. In this manner, the same circuitry can be used when edge smoothing is either enabled or disabled.

Hybrid edge smoothing may be implemented as shown in FIG. 16A for smoothing between two surfaces. The arrangement shown in FIG. 16A may be expanded to incorporate edge smoothing between more than two surfaces dissecting the same edge pixel. A plurality of edge circuits 1624 can be implemented with DAC 1524C (FIG. 15G); where each surface dissecting a pixel can be assigned a different edge circuit 1624. Therefore, in a two surface smoothing arrangement, a first surface is assigned edge circuit 1624A and a second surface is assigned edge circuit 1624B. Each of edge circuits 1624A and 1624B receive an area number 1627A and 1627B respectively for generating an output intensity signal 1630A and 1630B respectively that is directly proportional to the area and inversely proportional to the range of the pixel word for the related surface. The direct proportionality with area is derived from the rationale that the greater the edge pixel area of a dissecting surface, the greater will be the contribution of the color from that surface. The inverse proportionality with range is derived from the rationale that the greater the edge pixel range of a dissecting surface, the lesser will be the contribution of the color for that surface. Therefore, intensity signals 1630A and 1630B from each circuit 1624A and 1624B respectively is a signal that is directly proportional to the area of the edge pixel covered by the related surface and is inversely proportional to the range of the related surface dissecting that pixel.

The color contributions of each surface dissecting an edge pixel are derived from the area and range-related intensity signals and the color components for each surface. For example, the red video signal 1616R may be the sum of the red color contribution of the first surface 1626D and the red color contribution of the second surface 1626E dissecting the edge pixel. This is derived by multiplying the area signal and range-related intensity signal 1630A of the first surface by the red color component 1626D of the first surface with one color circuit 1610D and multiplying the area signal and range-related intensity signal 1630B of the second surface by the red color component 1626E of the second surface with the other color circuit 1610E; then summing these two red color signals through summing resistors 1631D and 1631E with operational amplifier 1632R to generate red video signal 1616R. Therefore, red video signal 1616R is the weighted or interpolated sum or area weighted components of the red video signal from each of the two surfaces dissecting the edge pixel. Similarly, the green and blue video signals 1616G and 1616B respectively may be generated with color circuits 1610F and 1610G and with color circuits 1610H and 1610I respectively, as discussed for generation of the red video signal 1616R with color circuits 1610D and 1610E above.

The arrangement shown in FIG. 16A may be expanded to accomodate more than two surfaces dissecting an edge pixel. For example, addition of a third dissecting surface can be implemented by adding a third edge circuit 1624C and by adding a hybrid color circuit 1610 to each of the grouping of the red, green, and blue color circuits. The third color circuits receives green, and blue color numbers from the third dissecting surface and receives intensity signal 1630C from the third edge circuit 1624C. Similarly, more than three surfaces dissecting an edge pixel may be accomodated based on extrapolating these teachings Of the present invention.

The arrangement shown in FIG. 16A may be expanded to accomodate the smoothing of additional parameters. For example, the configuration shown in FIG. 16A has been discussed for weighting of area range signal 1628 to provide weighted range variable intensity. Other parameters can similarly be area weighted. For example, an arrangement is discussed with reference to FIG. 15H having a plurality of intensity circuits 1520 which can include an inverse intensity circuit, such as for inverse range variable intensity, and a direct intensity circuit, such as for programmable intensity; as discussed with reference to FIG. 15H above. Additionally, other parameters such as shading, tinting, shadowing, and other parameters can be processed with circuits discussed with reference to FIG. 15 and can be area weighted, such as discussed with reference to FIG. 16A. For example, cascaded intensity circuits 1520 can generate intensity signal 1513 having various relationships to digital signals 1522 and analog signals 1521 that can be summed, multiplied, divided, and otherwise processed with intensity circuits 1520. Analog signals 1513 can be applied as reference signals 1629 (FIG. 16A) to provide an intensity scale factor for area weighting.

Various other analog, hybrid, and digital signal processing arrangements, such as shown in FIG. 15, can be used in conjunction with edge circuits 1624 shown in FIG. 16A. For example, other digital inputs can be provided in addition to area signals 1627 and range signals 1628 by cascading, paralleling, or otherwise combining ladder networks; such as discussed with reference to FIG. 15. Also, other analog input signals 1629 can be provided, such as by cascading and paralleling ladder networks as discussed with reference to FIG. 15. Edge circuits 1624 (FIG. 16A) are shown in one configuration in FIG. 15G, such as for area and range weighting of colors. Also, multiple intensity circuits 1520 (FIG. 15H) can be used in addition to or in place of the direct and inverse DAC 1524C (FIG. 15G) to facilitate processing of other parameters. For example, direct and inverse DAC 1524C (FIG. 15G) may be one of intensity circuits 1520 (FIG. 15H) for providing area weighted inverse range signal 1526C for processing with other intensity circuits 1520 for area weighting of multiple parameters.

ILLUMINATION EFFECTS

General

Illumination effects can be implemented with the arrangements disclosed herein. Intensity, color, shading, shadowing, transparency and other illumination effect s may be implemented independently or in combinations. For example, these effects can be implemented as separate bytes. Alternately, these effects can be combined. For example, the product of intensity and color parameters may be stored as an intensity adapted color byte. Also, the product of intensity and shading parameters may be stored as a shaded intensity byte.

These effects can be partitioned into components. For example, intensity can include a surface intensity byte, a source intensity byte, and an ambient illumination intensity byte.

Color can be mixed to provide tinting and other coloring effects. For example, tinting source illumination can be mixed with surface colors to provide tinting effects as encountered from a sunset, from a colored spotlight, or from other illumination conditions.

Reflections

Reflections, such as glint, may be implemented by deriving the angles between the surface normal vector and the source of light (the incident angle) and the observer's line of sight (the reflection angle). When the angle of incidence is equal to the angle of reelection (asuming proper sign notation), then a reflection or glint command may be generated and the surface can generate a high surface brightness that may be a high intensity parameter, or a source intensity parameter, or a mixing of surface and source colors to provide a high intensity mixture thereof.

Intensity

Intensity may be implemented by accessing one or more stored intensity bytes for an item; such as a pixel, surface, object, or other item; from memory and outputting to an intensity processor; such as intensity DAC 1524 (FIG. 15 and 16).

Shading can be implemented as an intensity effect. The visual processor may update intensity as a function of the scenario; such as a function of time of day, illumination of the surface, and other parameters. For example, as the scenario approaches sunset, the intensity may be reduced. As the object increases in range, the intensity may also be reduced. As a shadow is projected on a surface, the intensity may be reduced. Therefore, intensity may be controlled by the visual processor for each surface, or for each object, or for a plurality of surfaces and objects. These intensity effects can be implemented with one of more intensity bytes provided to an intensity DAC, such as discussed for range variable intensity with reference to FIGS. 15 and 16.

A programmable intensity capability can be provided in addition to or in place of range variable intensity. One implementation thereof will now be discussed. An intensity byte in refresh memory can be used to establish intensity of a surface. The intensity byte can be stored together with the color byte for a pixel or surface. This programmable intensity parameter can be used in a way similar to use of the range parameter for range variable intensity. As a pixel word is accessed from refresh memory, the intensity byte can be loaded into a DAC for supplying a reference voltage, as discussed for range variable intensity with reference to FIGS. 15 and 16. Range variable intensity and programmable intensity may be used individually or together. When used together, a pair of cascaded DACs may be used where each intensity byte can be loaded into a different one of cascaded DACs. Cascaded DACs may be implemented by applying a reference voltage to a first DAC for generating an analog output signal, where the analog output signal can then be applied to a multiplying DAC for generating a second analog output signal proportional to the product of the two intensity parameters. The second analog output signal can be used as the reference signal for the color DAC, as shown in FIGS. 15 and 16.

Surface Shading

Surface shading may be implemented by deriving the angle between the light source vector and the surface normal vector. If the angle therebetween is greater than 90°, then the illumination is incident on the surface and the surface may be unshaded. If the angle therebetween is less than 90°, then the source of light is behind the surface and the surface may be unshaded. Shading may be a binary function, where an unshaded surface may have-full intensity and a shaded surface may have a fraction of full intensity, such as ½ of full intensity. Alternately, shading may be a magnitude function, where an unshaded surface may have variable shading and a shaded surface may have variable shading. Shading may be a programmable or derivable fraction of full intensity. For example, intensity and shading may be trigonometric functions of the various angles; i.e. the angles between the surface normal vector, the source of the light vector, and the observer line of sight vector.

Shading can be controlled as various functions of angles. The angles may be the angle between the source of illumination and the surface normal vector, the angle between the source of illumination and the observer line of sight, the angle between the observer line of sight and the surface normal vector, or other angles. The functions may be arithmetic or other functions of the angles. The function of the angle may be the angle itself, a sine of the angle or other trigonmetric function of the angle or other non-trigonmetric functions thereof. The controlled parameter may be intensity, darkness, tinting, and other controlled parameters. For example, intensity may be controlled through a multiplying DAC, as discussed for range variable intensity with reference to FIGS. 15 and 16.

Surface shading may be implemented by determination of the degree of shading of a surface and deriving a shading parameter related thereto. For example, a shading parameter can be derived as a function of the angle between the observer's line of sight, the source of illumination, and the angle of the surface. This geometric relationship can be readily established, such as in the incremental processor portion of the real time processor. Geometric relationships between the surface normal vector and the observer's line of sight have been discussed for determining surface visibility. Similarly; the relationships between the observer's line of sight, the surface normal vector, and the angle of incidence of the incident illumination can be implemented. For example, surface visibility determination is a function of the angle between the surface normal vector and the observer's line of sight. Similarly, surface shading can be derived as a function of the angle between the surface normal vector and the incident illumination. For shading a surface, a shading byte may be used for shading such as storing a shading byte in a pixel word in refresh memory or storing a shading byte in a surface word stored in parameter memory. The shading byte can be updated as a function of relative motion, scenario considerations, occulting processing, and other considerations. The shading byte may be applied to a multiplying DAC in the display interface, similar to that discussed for the range variable intensity DAC with reference to FIGS. 15 and 16.

Transparency and Tinting

A transparent or semi-transparent object effecting the images seen therethrough such as tinting, reducing intensity, or otherwise effecting the images can be implemented. This can be achieved by adding a byte to the refresh memory or parameter memory. The transparency byte can be accessed for color mixing and intensity modification related thereto. Color mixing may be implemented in a manner similar to that discussed for smoothing processing, where the tint byte could be added to or multiplied by the color byte of the surface seen therethrough.

The refresh memory may include a tint byte and an intensity byte. The tint byte may modify the color of the images seen therethrough such as for a tinted window. The intensity byte may reduce the intensity such as for a partially transparent window.

Tinting can be provided by adding a component of color to one or more color DACs. For example, a green tint may be provided by adding a green tint nibble to the green color signal in the digital domain or the analog domain or otherwise. Adding a tint color in the digital domain can be implemented with a full adder for adding the tint nibble to the appropriate color nibble. Adding a tint color in the analog domain can be implemented with a DAC to obtain an analog tint signal proportional to the digital tint nibble and then adding the analog tint signal to the appropriate color channel.

Tint color may be any color that can be formed with a combination of three basic colors, where a tint byte may include three color nibbles having 3-bits for each color nibble (similar to the color byte) and corresponding analog color nibbles may be summed together in the analog or digital domain. Alternately, tinting or otherwise modifying the colors cna be performed by multiplying the tint color instead of adding the tint color using digital multipliers in place of digital adders for digital domain tinting and using multiplying DACs for multiplying analog signals as discussed for intensity control (FIGS. 15 and 16) for analog domain multiplication. Other tinting operations may be performed in addition to summation tinting and multiplication tinting discussed above. Tinting as discussed herein may be provided for shadowing, transparent surfaces, variations in ambient light, and other effects.

Texturing

Computer graphic and visual systems conventionally use solid color surfaces. Texturing can be used to change solid surfaces to patterned surfaces to simulate more natural textures. An arrangement will now be discussed that is simple and effective.

Natural objects have textures which are often secondary effects. Primary effects are object shapes and object colors. Variations in color or texture may be considered to be secondary. Based upon this consideration, a texture implementation is provided that varies the secondary or least significant portions of the color information. The least significant portions of color information may be the least significant bit (LSB) or least significant bits (LSBs) of each of the three color nibbles 1511 into the DACs in color circuits 1510 to texture the three analog color signals 1513 (FIG. 15). Alternately, the least significant portions may be more than one LSB such as 2-LSBs or 3-LSBs. However, for simplification of discussion, modulation of a single LSB per color nibble will be discussed hereinafter.

The LSB of a color nibble may be the LSB of a color nibble stored in refresh memory or may be an additional LSB added to each color nibble after accessing from refresh memory (i.e; a fourth less significant bit added to a stored 3-bit nibble) to provide a texture LSB into each color circuit 1510 that can be modulated for texturing.

Modulation may be performed with a pattern generator, random generator, pseudo-random generator, noise generator, or other modulator. A pattern generator may be a counter such as an address counter. A random generator may use a random implementation for gaussian or other random pattern generation. A pseudo-random generator may be a shift register having feedfoward and feedback signals. A noise generator may generate white noise signals, pink noise signals, or other noise signals. Many other modulation generators can be used.

Modulation may be introduced at various points. In a preferred embodiment, modulation is introduced after the color nibbles have been accessed from refresh memory, where modulation thereof doesn't modify the stored pixel word information. Modulation thereof may involve modifying each color nibble for a pixel word or adding a modulated LSB to each color nibble for a pixel word. However, in alternate configurations modulation may be introduced at other points. For example, modulation may be introduced during updating of a pixel word by modifying the LSB of each color nibble stored in refresh memory. Alternately, modulation may be introduced after updating but prior to refreshing by modifying the LSB of nibbles stored in refresh memory. In an arrangement that modulates color information stored in refresh memory, an extra LSB may be added to each color nibble for texturing. Alternately, a configuration can be provided for modulation of color information after accessing of the refresh memory during refresh operations, because this embodiment does not modify color information stored in refresh memory and does not require additional texture bits in refresh memory.

Texturing may be enabled or disabled with a texture command signal. This signal may be stored in the database with surface or object information, may be derived during operation by the microprocessor, may be input from a host system, or may be input from an operator. Texturing may be selectively enabled and disabled for different scenarios, different portions of a scenario, different objects, different surfaces, or on other basis.

Range of modulation is a function of the number of bits that are modulated. When a single LSB for each of the three color nibbles is modulated, then 3-bits per pixel are available for modulation; providing a range of eight modulation conditions. When two LSBs for each of the three color nibbles is modulated, then 6-bits per pixel are available for modulation; providing a range of sixteen modulation conditions. Other patterns may be provided such as 9-bit and 12-bit patterns for modulation of 3-LSBs and 4-LSBs respectively for each nibble. Alternately, modulation may not be evenly distributed between color nibbles and may not be provided as factors of 3-bits, 1-bit for each of three nibbles. However, in a preferred embodiment, an extra bit or extra bits per nibble for a pixel word provides a convenient implementation.

Modulation may be on a time-domain basis, spacial-domain basis, object-domain basis, or combination thereof. For time-domain modulation, modulation varies as a function of time. Therefore, time-domain modulation for a particular pixel on successive refreshes may be different for each refresh. Spacial-domain modulation may be a function of location of the pixel in the raster scan. Therefore, spacial-domain modulation may be the same for the particular pixel for each successive frame. A combination thereof may provide 1-bit of spacial-domain modulation and 1-bit of time-domain modulation per nibble. Time-domain modulation may be controlled by a time variable modulator such as a noise generator or pseudo-random generator, which may not provide repetitive patterns for successive frames of information. Spacial-domain modulation may be controlled by the address of the pixels being accessed during refresh and may be repetitive for the same pixel on successive frames. Object-domain texturing moves texture with the object. Texturing can be implemented as a planar texture in a 3D environment. Therefore, as a surface translates or rotates in 3D, the text are pattern will move therewith. Such an object texture pattern can be implemented, but may involve complications over the above described time-domain and spacial-domain texturing. For example, it may be necessary to move the texture pattern with the moving object by fetching pixel words from prior pixels and storing them in subsequent pixels to,move the pattern therewith. Alternately, real time circuitry generating a pattern might have to track motion of an object.

One embodiment of a spacial-domain modulator will now be discussed. The refresh address counter defines the raster scan pattern and the spacial orientation of each pixel. Therefore, the refresh address counter may be used as the modulator for spacial-domain texturing. For example, the 3-LSBs of the refresh address counter may be used as the 3-LSBs signals for the three color nibbles. These 3-LSBs of the refresh address counter will repeat the same pattern (the pixel address) for each frame, providing the same modulation code for each pixel on successive frames.

The 3-LSBs of the refresh address counter may not have an optimum 3-bit sequential pattern. Therefore, texture decoder 1340 (FIG. 13B) may be placed inbetween address counter 1311 and color circuits 1510 (FIG. 15), for decoding the 3-LSBs of the refresh address counter into a code more pertinent to texturing. For example, the 3-LSBs from refresh address counter 1311 may be decoded by texture decoder 1340 to form three texture modulation signals 1342 (FIG. 13B); each applied to an LSB input of a color circuit 1510 (FIG. 15). A first decoded modulation signal 1342R may be applied to the LSB of red color circuit 1510B, a second decoded modulation signal 1342R may be applied to the LSB of green color circuit 1510G, and a third decoded modulation signal 1342B may be applied to the LSB of blue color circuit 1510B. Decoder 1340 may be a linear binary to grey code decoder or a 2D binary to grey code decoder, or other decoder. A linear grey code decoder provides for only a single bit change between states in a sequence of states. A 2D grey code decoder establishes a pattern around a pixel so that no other adjacent pixel in the area contains the same modulation code. Other spacial-domain modulators may be configured, such as to decode additional bits of refresh address counter 1311 to provide different spacial modulation patterns or to use other sources of spacial definition then the refresh address counter source.

In another embodiment, texture decoder 1340 may have more input signals than output signals such as 4-input signals and 3-output signals. The 4-input signals may be the 4-LSBs of refresh counter 711 and the 3-output signals may be a pattern of LSB inputs to color circuits 1510, similar to that discussed above. The greater number of decoder input signals facilitates more flexibility in establishing modulation patterns with the 3-output signals.

Modulation may be digital-domain or analog-domain modulation. For example, the above discussed modulation generators may be digital modulation generators such as the refresh address counter and decoder discussed with reference to FIG. 13B, a feedforward and feedback shift register, a digital noise generator, and a digital random number generator. Alternately, modulation generators may be analog circuits generating analog modulation signals. For example, time-domain modulation may be provided with analog signal generators such as analog noise generators, analog function generators, analog random signal generators, or other analog signal generators. The analog modulation signals may be introduced into color circuits 1510, such as with intensity signal 1513 for modulating color analog signals 1512.

Combinations of digital and analog signal generators may be provided such as the combination of a digital spacial-domain modulator discussed above with reference to FIG. 15 and an analog time-domain modulator such as providing analog time-domain noise signals to intensity signal line 1513. Other combinations and variations of time-domain modulation, spacial-domain modulation, digital-domain modulation, and analog-domain modulation may be provided to facilitate texturing.

Texture modulation signals may be common to all three color nibbles for a particular pixel or may be different for each color nibble for a particular pixel. For example, the arrangement discussed above with reference to FIG. 15 provides a different modulation signal for each color nibble for the same pixel. Alternately, the above analog modulation signal applied to intensity signal line 1513 can modulate all three color circuits 1510 with the same signal and therefore has consistent modulation on all three color signals 1512. These teachings may be used to provide other variations of modulation. For example, the same digital modulating signal may be applied to all three color circuits 1510 to provide the same modulation on all three color signals 1512 Also, three different analog signals may be provided, such as from three different analog noise generators or analog function generators. Each of the three modulation generators may control a different color circuit 1510 through separate intensity inputs 1512 (FIG. 15). These three modulation inputs may be separate therebetween, not connected as shown in FIG. 15. Other configurations can also be used for providing the same modulating signals or different modulating signals for different color channels for the same pixel.

Various texturing embodiments have been discussed herein including control of the LSBs of the color DACs and control of the LSBs of the intensity DAC. Control of the LSBs of all three video DACs with the same signals was discussed for simplicity of illustration. However, this may appear to be intensity modulation, as with control of the LSBs of the intensity DAC. An arrangement can be provided that modulates the color tones for texturing. This can be achieved in various ways, such as by modulating the LSBs differently for each DAC so that each color component has a different relative intensity and therefore the combination of all three colors has a different color tone. This can be achieved in various ways. In one way, the texture bits connected to each DAC may be connected to different bits of that DAC. For example, the LSB of the refresh address counter may be connected to the LSB of the red DAC, the second LSB of the refresh address counter can be connected to the LSB of the blue DAC, and the third LSB of the refresh address counter can be connected to the LSB of the green DAC. Other bits of the refresh address counter may be connected to other combinations of input bits of the color DACs to control the texturing effect to be different for each color DAC. This will vary the color tone and the color intensity as a function of the number provided by the refresh address counter. In another configuration, a different bit from the refresh address counter may be connected to different LSBs of the color DACs. For example; the LSB, second LSB, and third LSB of the refresh address counter may be connected to the LSB of the red DAC, LSB of the green DAC, and LSB of the blue DAC respectively.

Therefore, in different configurations, each texture control line can be connected to the color DACs in different manners. For example, each texture control line can be connected (a) to the same bit position of each color DAC, (b) to a different bit position of each color DAC, or (c) to a bit position of one or more DACs but not all DACs. This will modulate color intensity and color tone as a function of the codes of the texture control signals.

Although texture control signals have been discussed as being derived from the refresh address counter, a random count generator, or other refresh control sources; these refresh control devices and signals are exemplary of the broader teachings of this invention; where such refresh control arrangements and signals may be provided in other configurations such as with available signal generators (i.e., the refresh counter) or special signal generators (i.e., a random number generator).

Zoom

Zoom capability can be important for enchancing the ability of an operator to investigate an image. For example, high resolution processed information may be available that has a dynamic range greater than available in the display terminal. The operator can zoom out to view more of the environment with less detail and the operator can zoom in as on a particular region to view less of the environment in greater detail. For example, during a search mode, the operator can monitor the whole processed environment to lower levels of detail for greater coverage and therefore greater productivity. When an event is identified, the operator can zoom in on the region of the event to provide greater detail in a more limited environment of interest. Therefore, zoom capability can be a important aid, enhancing the compromises between area of coverage and precision.

Zoom is often implemented with a "pixel replication" method. For magnification, pixel replication increases the image size by replicating each full resolution pixel in multiple pixels. This capability increases the image size, but does not increase the image detail. Therefore, it does not increase the dynamic range. True zoom capability provides the most significant enhancement, where the displayed dynamic range of the image is preserved and where the resolution of the image is preserved.

Zoom capability can be implemented in memory map form. Pixels in the image can be stored in memory map form to the full range and full resolution of the available image. Therefore, images can be displayed to the finest resolution by downloading selected portions of this memory map to the refresh memory. The image can be zoomed outward by combining pixels using spacial compression to reduce the amount of detail.

Spacial compression involves the reduction of the level of detail in order to increase the display range, such as zooming outward in range. The simplest spacial compression approach is undersampling, where pixels are "thrown away" in order to reduce the resolution of the image. However, undersampling has important constraints, such as introducing aliasing effects. Aliasing can cause optical effects that obscure important events and that introduce fictitious events. These effects can seriously detract from the productivity and precision of the system. Integration can be used to overcome aliasing. Integration involves adding of multiple adjacent pixels together to reduce the numbers of pixels. However, simple integration can cause windowing effects, such patterns dynamically moving across the screen, distracting the operator and obscuring important events. Windowing can be reduced or eliminated with weighting or shading type processing. Such processing weights the pixels before they are integrated together to increase the significance of the center-most pixel and to decrease the significance of the pixels as they are distributed away from the center-most pixel in the group being integrated together.

Zoom capability significantly enhances an operator's ability to combine the apparently inconsistent capabilities of long range and high resolution for high productivity and high precision. Therefore, zoom capability can be an important feature for operator enchancement.

DISPLAY MONITOR

Display monitor 120 may be any of a large variety of types of display monitors. For simplicity of discussion, a color CRT monitor has been discussed herein. Other types of display monitors; such as plasma, liquid crystal, and light emitting diode display monitors may also be used. A large screen display system may also be used. Various displays, including liquid crystal displays and large screen displays, are disclosed in the referenced parent patent applications.

Interfaces between a visual system and a display monitor are well known in the art. These interfaces include NTSC standard interfaces and RGB interfaces. Synchronization therebetween can be provided with conventional circuits, such as commercially available NTSC circuits. Synchronization circuits, such as generating horizontal and vertical clock pulses, are readily available. Synchronization pulses generated for the CRT may be used as inputs to the refresh address counter for synchronization thereof; i.e., signals 1322 and 1327 (FIG. 13B). Alternately, refresh address counter 1311 (FIG. 13) may be used to generate such synchronization pulses for the display monitor, such as discussed relative to the refresh address counter herein.

Three Dimensional Display Medium

Various 3D display media are known in the art or are disclosed in the referenced patent applications. These 3D display media can display 3D information generated with the arrangements discussed herein in 3D form as an alternate to the display of this 3D display information with a 2D display media.

A 3D medium may be controlled from the present visual system. For example, a 3D medium, such as an oscillating mirror medium, portrays images having different ranges. A visual system for a 3D medium may be implemented with a plurality of refresh memories corresponding to each different range and being output to the oscillating mirror medium in the sequence of increasing (or, alternately, decreasing) range. Occulting determination for each range can be determined by the stereoscopic line-of-sight from the observer's two eyes and therefore changes as a function of the range. Consequently, the same object portrayed on different range planes is portrayed in slightly different form in each range plane to facilitate the stereoscopic effect of vision as a function or range. In this configuration, the refresh memory may have 525-lines and 600-pixels per line for each range plane and 16-range planes at different ranges for a total of about 5-million pixel words. Assuming a 24-bit pixel word, this involves about 12-million bits of refresh memory. As a result of the stereoscopic effects provided herein, the range byte for each pixel word may be reduced in resolution from the 12-bits described herein. Also, in certain configurations, the range byte may even be eliminated.

Figure 18:
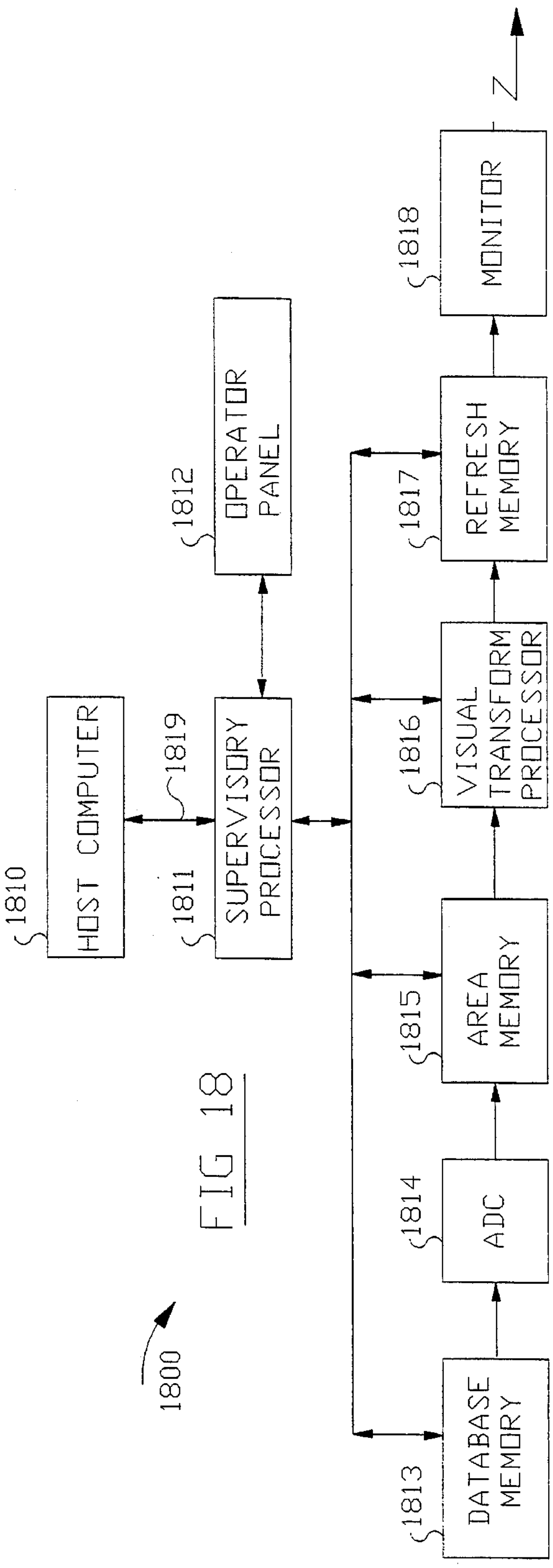
FIG. 18 illustrates a memory map image processing arrangement for high detailed image generation.
Figure 19:
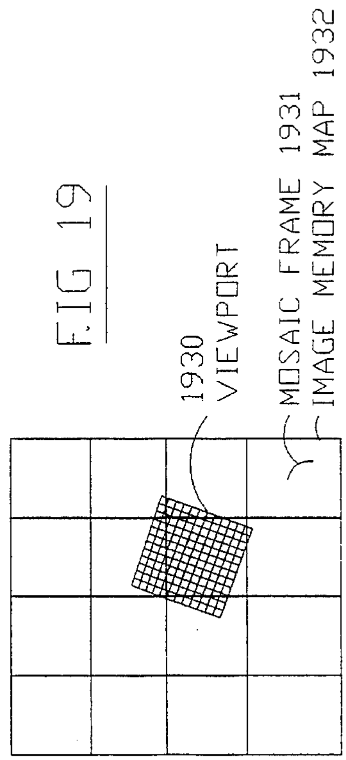
FIG. 19 illustrates the relationship between a viewport and a mosaic memory map in accordance with the arrangement shown in FIG. 18.

MEMORY MAP IMAGE PROCESSOR (FIGS. 18 and 19)

The Memory Map Image Processor (MMIP) provides an important improvement for image processing, particularly for processing of detailed images in real time. It provides for constructing a dynamically changing image having high detail and realism and covering a very large dynamic range. Conventional mechanical and analog solutions; such as mechanical servos, optical plotting boards, and analog display generators; are unwieldy, inflexible and complicate computer control. Conventional digital solutions; such as the E&S CT5 computer image generation (CIG) system; are extremely expensive and are directed towards construction of environments having relatively low detail and low realism for environmental images, such as terrain. The MMIP provides the high detail and realism associated with photographic and video images in combination with the ability to dynamically adapt a highly detailed photographic or video image for real time simulation of complex dynamics. Compared to mechanical and analog systems; MMIP system cost, realism, and detail are estimated to be comparable and dynamics and flexibility are estimated to be significantly greater. Compared to digital systems; MMIP system cost and texture detail is estimated to be significantly better and digital control is estimated to be comparable. Each type of system; mechanical systems, analog systems, CIG systems, and the MMIP, have areas where they are optimum. For example, CIG systems are optimum for low detail graphic images, such as flight simulation systems, that can be constructed with thousands of vectors having high dynamics. The MMIP system is optimum for very high detailed images, such as textured terrain involving nearly a million pixels and having high dynamics. Texturing used in CIG systems is notoriously ineffective and unrealistic. The MMIP can dynamically manipulate large groups of pixels; typically 250,000 pixels; in real time for high dynamic simulations.

The MMIP can take various forms, consistent with the basic teachings herein. One configuration is discussed in detail to illustrate the basic teachings. Alternate arrangements are then discussed as illustrative of variations of the configuration.

A block diagram of the MMIP 1800 is shown in FIG. 18. Supervisory processor 1811 controls system operation. It provides interactive communication with an operator through operator panel 1812 and with host computer 1810 through data link 1819. Supervisory processor 1811 controls the simulation scenario under control of scenario driving functions generated by the operator and by the host computer. High detail information, such as terrain information, is stored in database memory 1813. A hierarchial memory map architecture can be used; comprising database memory 1813, area memory 1815, and refresh memory 1817. Database memory 1813 can be implemented to contain large amounts of high detail information in memory map form, which is selectively accessed for loading into area memory 1815. Area memory 1815 can be implemented in memory map form for an area of the environment that is larger than the viewport area. Refresh memory 1817 can be implemented in memory map form and clipped to the viewport for display on a CRT monitor.

The hierarchial memory map architecture extends to memory traffic. Database memory traffic is lowest, being used to update area memory 1815 as a function of scenario progression between mosaic frames for motion past frames. Area memory traffic is higher, being used to update the refresh memory 1817 as a function scenario progression within a mosaic frame for motion past pixels. Refresh memory traffic is highest, being used to refresh monitor 1818 at about a 10 MHz pixel rate for medium resolution display (512 lines) and at about a 40 MHz pixel rate for a high resolution display (1024 lines).

Visual transform processor (VTP) 1816 accesses static area information from area memory 1815 and transforms this static area information to real time dynamic information for storage in refresh memory 1817. VTP 1816 can translate, rotate, warp, spacially compress, and otherwise transform the static area information in order to provide the appearance of high dynamics. One implementation of a VTP is discussed with reference to FIG. 22 herein.

Database memory 1813 can store large amounts of high detail information, such as textured terrain information. This information can be stored on a video disk in analog form as video frames of information representing a mosaic of images. Frames can be selected by supervisory processor 1811, such as in real time under control of a dynamic allocation program using a lookahead for frames of information to be loaded into area memory 1815. Database memory 1813 can be used in conjunction with an analog-to-digital converter (ADC) 1814, such as a flash ADC, to provide digital frame information for storage in area memory 1815.

A video disk can store about 50,000 mosaic frames (about 10 billion pixels) per side. This represents a very high dynamic range. The frames can be stored having the highest spacial resolution that is required, then can be spacially compressed with VTP 1816 to form an image suitable for the particular simulation scenario. For example, in a flight simulator application, frames can be stored for the highest zoom magnification and lowest aircraft altitude required, then can be spacially compressed to the lower zoom magnification and the higher aircraft altitude as they vary through the dynamic simulation scenario.

Area memory 1815 can store multiple frames of information connected in mosaic form. A viewport window can be controlled by VTP 1816 for selecting pixels to be displayed. VTP 1816 can perform transform processing in real time to display the pixels in the viewport having appropriate dynamic conditions. The transformed pixels in the viewport can be loaded into refresh memory 1817 and used to refresh a CRT monitor. Area memory 1815 and refresh memory 1817 can be implemented with DRAM chips having random access capability.

Area memory 1815 can be configured as a mosaic of video frames, as shown in FIG. 19. The observer's viewport is implied by the crosshatched window 1930, which can be rotated and translated over memory map 1892 in area memory 1815 by VTP 1816 to simulate dynamic motion. As viewport 1930 translates towards an edge of the area memory map 1932, supervisory processor 1811 identifies the frames to be accessed from database memory 1813 for extending that edge of the area memory map 1932. Area memory 1815 can be implemented in a wrap-around form, where adding of mosaic frames to an edge of memory map 1892 extends that edge and overwrites the opposite edge. This has the effect of keeping viewport 1930 near the center of area memory map 1932. Wraparound capability can be provided in all four coordinate directions, where area memory map 1932 may be considered to be spherical in nature. This permits viewport 1930 to continuously move in a particular direction proceeded by new mosaic elements selected for progressively extending area memory map 1832 in the direction of motion.

VTP 1816 uses a novel architecture to provide real time rotation, translation, spacial compression, anti-aliasing, and other transform operations to achieve a dynamic image derived from the static image in area memory 1815 under control of the driving functions generated by supervisory processor 1811. VTP 1816 also provides the capability to perturbate the image; such as to introduce perturbations for simulation applications or to remove perturbations for display precision. Spacial compression can be implemented as a function of range to provide a 3D distance perspective. Viewport 1930 can be panned over area memory map 1932 as a function of tilt or aircraft bank angle in conjunction with range-related spacial compression to suitably compressed an image as a function of range. Such panning and spacial compression can be along lines of constant slant range, which necessarily crosses lines and columns of area memory map 1932 at angles consistent with aircraft roll, pitch, and heading angles. Consequentially, spacial compression represents the superposition of various parameters; such as slant range, altitude, zoom, and other related parameters.

VTP 1816 can be implemented in various alternate configurations. In one configuration VTP 1816 can be implemented in digital form. Alternately, analog and hybrid configurations thereof can be provided.

In a digital VTP configuration, digital processing can be implemented in special purpose or general purpose forms. Special purpose logic, such as digital differential analyzers (DDAs), can provide rotation, translation, spacial compression, and other processing. General purpose processors, such as a stored program computer and a microcomputer, can be used for a software implementation and a firmware implementation respectively. For example, an AMD 2900 bit-slice microprocessor can be used for a firmware implementation. Alternately, such processing can be performed with special purpose logic. Processing can take the form of two dimensional matrix transformations or incremental processing. Matrix transformations can include a group of two dimensional rotation, translation, scaling, and compression matricies.

In an analog configuration, analog signals can be generated relating to translation, rotation, and compression parameters and can be manipulated with analog circuits; such as analog differential amplifiers for addition and subtraction, analog non-linear processors for multiplication and division, and analog function generators.

In a hybrid configuration, parameters can be generated in analog and digital form and can be processed with hybrid processing circuits, such as multiplying digital-to-analog converters (DACs). For example, addition and subtraction can be performed in the analog domain, such as with differential amplifiers, and nonlinear functions, such as multiplication, can be performed in the hybrid domain, such as with multiplying DACs.

Initial conditions and intermediate parameters can be generated with supervisory processor 1811 to support VTP operations. For example, initial conditions can be generated for incremental elements, such as the arc center parameters and endpoint parameters for a DDA circle generator and slope parameters and endpoint parameters for a DDA vector generator.

Figure 22A:
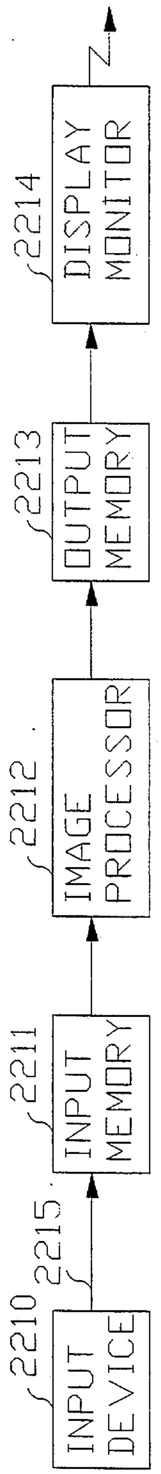
FIGS. 22A, 22B, 22C, and 22D, represents an image processing arrangement where

One VTP configuration is discussed in detail with reference to FIG. 22. In FIG. 22A; input device 2210 may be database memory 1813, input memory 2211 may be area memory 1815, image processor 2212 may be VTP 1816, output memory 2213 may be refresh memory 1817, and display monitor 2214 may be monitor 1818.

The consideration of parallel accessing of multiple pixels from area memory 1815 in the presence of rotation will now be discussed. A configuration can be provided to simultaneously access multiple adjacent pixels from area memory for compression (with weighting) into a single output pixel. Area memory 1815 can be partitioned into planes and/or blocks for parallel accessing of multiple pixels. Rotation will not cut across boundaries of memory planes and/or blocks relative to parallel accessing of pixels. This is because adjacency between pixels is fixed and will not vary as a function of rotation. In one configuration, the processing selects the center pixel of a group of pixels in area memory 1815, accesses the selected pixel and adjacent pixels from area memory in parallel, weights the accessed pixels in parallel, sums the weighted pixels, and transfers the resultant compressed and anti-aliased pixel to the appropriate rotated pixel address in refresh memory 1817. The relationship between the address of the center pixel in area memory and the address of the compressed and anti-aliased pixel in refresh memory 1817 changes as a function of rotation. However, the pixels adjacent to the selected center pixel in area memory do not change as a function of rotation. Therefore, the above described parallel accessing, weighting, and summing of adjacent pixels from area memory 1815 need not change as a function of image rotation.

The configuration discussed with reference to FIG. 18 can be implemented in the form of a single terminal or multiple terminal configuration. In a multiple terminal configuration, resources can be shared between terminals, such as to handle peak loads. This can reduce costs and increase capabilities.

Costs can be reduced because each terminal needs the dedicated processing resources to handle the average processing load, but does not need the additional dedicated processing resources to handle the peak processing load. Capabilities are increased because a global peak load processor shared between multiple terminals can have significantly greater processing capability, such as based upon cost constraints, then a dedicated peak load processor at each terminal.

Zoom capability provides a good example of advantages of a global peak-load processor. Zoom appears to be a peak load task because of the need to rapidly compress or decompress an image by a large factor. This can involve integrating and anti-aliasing of a large number of pixels in a short period. However, the duty cycle for zoom processing may be very low. The possibility of contention between two terminals generating zoom commands simultaneously appears small. Therefore, a single zoom processor can be shared between all terminals, providing significant peak load capability yet having a low cost per terminal i.e.; one sixteenth of the zoom processor cost assessed against each terminal in a sixteen terminal system.

In addition to peak load considerations discussed above, other considerations can be optimized for a multiple terminal system. For example, if each of a group of terminals is constrained to the same general drone scenario; then database memory 1813, ADC 1810, and area memory 1815 can be implemented as a global front end and can be shared between all terminals in the group. Use of a dedicated VTP 1816 and refresh memory 1817 for each terminal in combination with the global front end permits independent operation of each terminal.

Use of global front end can reduce costs and increase capabilities. Costs can be reduced by providing a single front end shared by all terminals. Capabilities can be increased because a global front end shared between multiple terminals can have significantly greater capability, such as based upon cost constraints, then a dedicated front end for each terminal.

Area memory 1815 provides a good example of advantages of a global front end. Area memory size is an important cost and performance consideration. A larger area memory reduces traffic between database memory 1813 and area memory 1815 and reduces lookahead processing in supervisory processor 1811.

The system discussed above with reference to FIGS. 18 and 19 can be provided in various alternate configurations. For example, the system can be implemented as a stand alone system without an external host computer 1810 or alternately with the host computer functions being performed internally, such as in supervisory processor 1811. Database memory 1813, discussed above in the configuration of an analog video disk, can be implemented with the other analog memory devices. For example, an analog video tape can be used as an alternate to an analog video disk. Alternately, database memory 1813 can be implemented with an analog CCD memory; such as discussed in U.S. Pat. Nos. 4,209,853; 4,209,852; Nos. 4,209,843; and 4,322,819 and U.S. patent application Ser. No. 812,285; Ser. No. 844,765; and Ser. No. 160,871.

Alternately, database memory 1813 can be implemented with digital memories; such as digital video disk memories, digital magnetic disk memories, digital integrated circuit memories, digital magnetic tape, and other digital memories. For example, a large digital magnetic disk memory having about 400-megabytes of storage is available from Fujitsu and can be used for a digital database memory. Photographic and optical memories can be used for database memory 1813. For example, the environment can be recorded on frames of film which can be selected and scanned with a video camera to generate database information.

Area memory 1815 and refresh memory 1817 have been discussed above in the form of IC-DRAM-based memories. Alternately, area memory 1815 and refresh memory 1817 can be implemented with other memory devices. For example, area memory 1815 and refresh memory 1817 can be implemented with CCD memories, such as described in the above-referenced patents and patent applications. The CCD memory may be an analog or a digital CCD memory. For example, an analog CCD memory may be used in conjunction with an analog database memory for storing analog information in the area memory that is accessed from an analog database memory without an interfacing ADC. In this configuration, analog refresh information can be loaded from the analog area memory and stored in an analog refresh memory.

VTP 1816 can be a digital processor, as discussed with reference to FIG. 22, or alternately can be a hybrid (analog and digital) or analog processor. Hybrid and analog processors can be readily interfaced to an analog memory, such as an analog area memory and an analog refresh memory, for analog or hybrid transform processing. Various forms of analog and hybrid processing are discussed in the above referenced patents and patent applications.

The configuration discussed with reference to FIG. 18 above has a three tier memory hierarchy. Alternately, other hierarchial arrangements can be provided. For example, area memory 1815 can be supplemented with a fourth memory tier, a dynamic memory map; where the static image of the area memory map can be converted to a dynamic image and loaded into the dynamic memory map. For example, the static memory map can have a mosaic of the images accessed from database memory and the dynamic memory map can have this mosaic of images converted to dynamic form as a function of rotation, translation, spacial compression, and other VTP updates. The viewport can be positioned within the dynamic memory map, which can be a dynamically updated version of the static memory map (FIG. 19). As the dynamic conditions change, the dynamic memory map can be regenerated from the static memory map in the area memory. This provides the advantages of having an area memory map that has not been modified for dynamic conditions, such as with the database memory information, and that has rapid access (more rapid than database memory access) for restructuring the dynamic memory map as a function of scenario dynamics. The dynamic memory can be smaller than the area memory and larger than the refresh memory. For example, the dynamic memory can be smaller than the area memory because the dynamic memory has faster access to the image in the area memory then the area memory has to the image in the database memory. The dynamic memory can be larger than the refresh memory to provide a multiple frame mosaic. The dynamic memory and refresh memory combination can be implemented with a double buffered refresh memory, where an old image is being used to refresh the display while a new image is being transformed from the area memory.

The present invention can be used for various types of systems. It can be used as simulator for training of personnel; as a display for a vehicle, such as for an aircraft cockpit display; for investigation and evaluation of large dynamic range database information, such as with LANDSAT images; and for many other applications. A training simulator application is characterized by a drone aircraft having a remotely controlled video camera for communicating with a ground-based crew. Camera images can be simulated; dynamically driven as a function of vehicle roll, pitch, and yaw dynamics; vehicle altitude; and other parameters. A map display can be provided for displaying a terrain map, such as on a cockpit display for a pilot. The map can be dynamically updated as a function of vehicle latitude and longitude and the map display can also be dynamically modified to simulate heading, roll, pitch, and other dynamic parameters. This permits a pilot to preserve his perspective of the outside world by viewing a terrain image that changes in spacial compression as a function of altitude, changes in orientation as a function of heading, and that provides tilting capability with range-related spacial compression as a function of pitch and roll. Such a map display can have superimposed overlays, such as topographical overlays for terrain and radar overlays for registering of radar images with terrain map images.

Image evaluation applications can store a large image having high dynamic range in database memory, can selectively pan through the image to select the appropriate area, and can zoom on the image to select the appropriate magnification to investigate details and to preserve the observer's perspective. For example, panning over a highly compressed image preserves the perspective from which the observer is viewing and then zooming on a point of interest provides high detail for a particular point within that image. Then zooming back out and again panning permits investigation of other areas of interest.

In a medical application, the medical investigator can investigate tomographic, X-ray, and ultrasound images. Investigation can be provided by accessing image information, such as mosaics pertaining to a large image, from database memory and providing rotation, translation, zoom, and image processing functions to enhance diagnosis. For example, a large highly detailed medical image, such as a tomographic image, can be stored as a group of mosaics in database memory. A medical investigator can control the system to roam through the image and zoom on key points of the image, similar to the image evaluation application discussed above. The medical investigator can zoom out to see a large portion of the image to provide a perspective, roam across the image to an area of interest, and then zoom in on the area of interest for more detailed investigations. The zooming out can be performed with spacial compression, as discussed for other applications herein.

In an animation application, images such as background images can be stored in database memory and accessed as the animation scenario progresses. It can be overlaid with graphic images; such as images of cartoon characters, vehicles, trees, and other graphical images. As the scenario progresses, the detailed images accessed from video disk can be translated, rotated, spacially compressed or decompressed, and otherwise processed to enhance the animation scenario. For example, graphic overlays can be provided for translating across the background, being overlayed on background images which are rotated and translated in conjunction with the viewport position and spacially compressed and decompressed as a function of range and other parameters. Also, synthesized terrain images can be processed with translation, rotation, and spacial compression or decompression to animate motion across terrain from an airplane, similar to that discussed for the simulation application above. Processed images in animation can include terrain, clouds, water, and other texture type images. This animation feature can be used for video games, movies, television, and other applications.

In a satellite application, an investigator can investigate land resources, military groupings, weather, and other such images using methods discussed above for image evaluation applications.

MEMORY MAP BASED IMAGE PROCESSING (FIG. 22)

An arrangement will now be discussed for image processing using memory map techniques. This arrangement will be discussed relative to rotation and translation of an image to illustrate the important features. This discussion is exemplary of the broader inventive features of processing of images in memory map form.

One form of this arrangement will be characterized as transferring memory map information from a first memory to a second memory and transforming the nature of the memory map; such as with translation, rotation, and spacial compression; during the transfer. Edge processing may be performed by selectively accessing pixels from the input memory map and selectively storing these pixels in the output memory map; where the selection of the input and output pixels facilitates image processing.

A system configuration is set forth in FIG. 22. An input device 2210 generates an input signal to an input memory 2211 for storage in memory form. Image processor 2212 processes the input memory map stored in input memory 2211 to generate an output memory map for storage in memory 2213. Alternately, input signals 2215 may be processed directly with image processor 2212 without use of input memory 2211. The memory map in output memory 2213 can be used to refresh display monitor 2214 for display of a processed image. Input device 2210 may be a data acquisition system such as a radar, sonar, video, or other System for acquiring an image, a database memory as discussed with reference to FIG. 18, or other input device. The image can be stored in memory map form in input memory 2211 for processing with image processor 2112. Input signals 2215 may be scan-related signals; such as raster scan signals for a video input, PPI or polar coordinate scan signals for sonar and radar systems, or other scan-related signals. Alternately, input signals 2215 may be obtained from a host computer, a database, or other source of image information.

Two memories, input memory 2211 and output memory 2213, are shown for storing memory map information. In one configuration, image processor 2212 accesses memory map information from input memory 2211 for processing and subsequent storage in output memory 2213 in memory map form. Alternately, the input memory map and the output memory map may be stored in the same memory, such as for in-place processing; may be stored in other than memory map form; or may otherwise be stored.

Image processor 2212 may include edge processors, such as discussed with reference to FIG. 22D herein. The edge processors can be used to map pixels from an input memory map into an output memory map. Such mapping may include selection of an array of pixel words from an input memory map and storing the selected array of pixel words in an output memory map. Transferring of arrays in this manner can be used to provide translation, rotation, zooming, panning, and other such operations.

Edge processors can be used to map an input rectangular array of pixels into an output rectangular array of pixels, such as for translation; can be used to map an input rectangular array of pixels into an output non-rectangular array of pixels, such as for rotation and translation; can be used to map an input non-rectangular array of pixels into an output rectangular array of pixels, such as for rotation and-translation; and can be used to map an input non-rectangular array of pixels into an output rectangular array of pixels, such as for rotation and translation; can be used to map an input non-rectangular array of pixels into an output rectangular array of pixels, such as for rotation and translation; and can be used to map an input non-rectangular array of pixels into an output non-rectangular array of pixels, such as for rotation and translation. Similarly, mapping of one array of pixels into another array of pixels can be used to transform coordinates, such as polar coordinates to rectilinear coordinates and rectilinear coordinates to polar coordinates, and can be used to perform other transformation and image processing operations.

Memory map image processing can use one or more edge processors, such as the various edge processors discussed herein. For example, a pair of edge processors (an edge generator and a startpoint generator) may be used to address arrays of pixels 2220 to 2222. An edge generator begins at the startpoint of the line, such as at the left hand pixel of the line, and increments across the line at the selected slope. The selected slope is zero for array 2220 and is 0.5 for arrays 2221 and 2222. The startpoint generator selects the startpoint of the line. It is incremented at the completion of a line, generated with the edge generator, to generate the selected slope of the startpoints 2224. This selected slope is zero for arrays 2220 and 2221 and 0.5 for array 2222. Operation proceeds by transferring a startpoint coordinate in the startpoint generator to the edge generator, generating the coordinates of the pixels along the line with the edge generator, and clocking the startpoint generator at the end of the increment the startpoint generator to the next startpoint pixel coordinate of the next subsequent line. This next startpoint pixel coordinate is transferred to the edge generator as the initial condition for the next line. The edge generator is clocked to generate the coordinates of the pixels along the next line. A distance-to-go (DTG) or endpoint calculation may be used for each edge processor, as discussed with reference to FIG. 7 herein. The last pixel in each line can be identified with such a DTG endpoint implementation. Similarly, the last line of the array can be defined with such a DTG or endpoint implementation in the startpoint edge processor. Simultaneous generation of a last pixel per line condition and a last line condition identifies the completion of the operation scanning the array.

Each memory, input memory 2211 and output memory 2213, can have corresponding sets of edge processors. The input edge processors associated with input memory 2211 can be used to address an array of pixels from input memory 2211 for accessing. The output edge processors associated with output memory 2213 can be used to address an array of pixels in output memory 2213 for storing. Therefore, separate arrays in input memory 2211 and output memory 2213 can be independently addressed by separate edge processors. In this way, an input array of pixels and an output array of pixels may be independently and separately identified and addressed in a pixel-by-pixel fashion to map selected pixels from input memory 2211 into selected pixels in output memory 2213.

Spacial compression and decompression can be performed by undersampling an input array in input memory 2211 or an output array in output memory 2213. For example, the edge processors for the input array can be multiple clocked; such as double clocked, triple clocked, or quadruple clocked; for undersampling of an input array for spacial compression when loading input memory 2211 into output memory 2213. Alternately, the edge processors for the output array can be multiple clocked; such as double clocked, triple clocked, or quadruple clocked for spacial decompression when loading input memory 2211 into output memory 2213. Integration and weighting of a plurality of pixels can be performed to reduce effects such as aliasing and windowing. Such integration and weighting can be performed as each subsequent pixel is scanned. Weighting and integration techniques are discussed for a process-on-the-fly arrangement in U.S. Pat. No. 4,209,843. For example, the input samples T therein may be a scanned pixel array stored in input memory 2211 herein, the weighting may be performed with elements 625 and 626 therein, and the output memory 614 therein may be output memory 2213 herein for accessing and integrating weighted samples (FIG. 6D therein and FIG. 22 herein).

An aircraft map following navigation application will now be discussed to illustrate use of the arrangement discussed with reference to FIG. 22. This application presents a dynamic map display from a pre-mapped recorded database for aiding in navigation. An image of the terrain below an airplane is stored in memory map form in input memory 2211. This can be a prerecorded image stored in database and loaded into input memory 2211. The database may be self contained in the system or may be transmitted from a remote source. Input device 2210 can be a map database generating map video signals 2215 for storage in input memory 2211 in memory mapped form. Loading of signals 2215 into input memory 2211 can be performed with an edge processor identifying the pixels along the scan line for storing of scan line information or with various other methods for loading a memory map with image information. The memory map in input memory 2211 may be a composite of many map images or mosaics over a larger area. Arrays in the input memory map in input memory 2211 may be selected and processed with image processor 2212 for loading into output memory 2213. As the aircraft translates over the terrain, the startpoint pixel of the array is translated over the input memory map in input memory 2211 to translate the viewing window displayed on display monitor 2214 consistent with aircraft motion. Similarly, as the aircraft rotates in azimuth, the edge processors are loaded with the slopes of the lines of the array, thereby effectively rotating the displayed window in the memory map stored in input memory 2211. Therefore, as the aircraft translates and rotates over the terrain, the display window similarly translates and rotates over the memory map to present an image depicting the environment below the plane.

The azimuth angle of the aircraft can be used as a driving function for the edge processors. The heading angle can be processed with an arc tangent calculation to obtain the slope of the line and the component rectilinear vectors. Alternate edge processor embodiments using either slope or rectilinear component vectors can be provided. Therefore, the initial conditions for the edge processor can be derived from the azimuth angle for rotation.

Overlays may be provided with the memory map image processing architecture. For example, overlays including vectors points, alphanumerics, and symbols can be generated in input memory 2211 in memory map form. These overlays can be loaded destructively over the processed image, effectively erasing the information contained thereunder, or nondestructive by loading output memory map bit planes for overlays. The memory mapped overlays correspond to the memory mapped image and therefore can be translated, rotated, and otherwise processed with the image.

Therefore, overlays may be processed in similar manner to and in conjunction with the images discussed above. Alternately, over lays can be rotated, translated, and otherwise processed, such as with a geometric processor in line endpoint form and then generated with vector generators and character generators for introduction into output memory 2213.

Figure 22B:
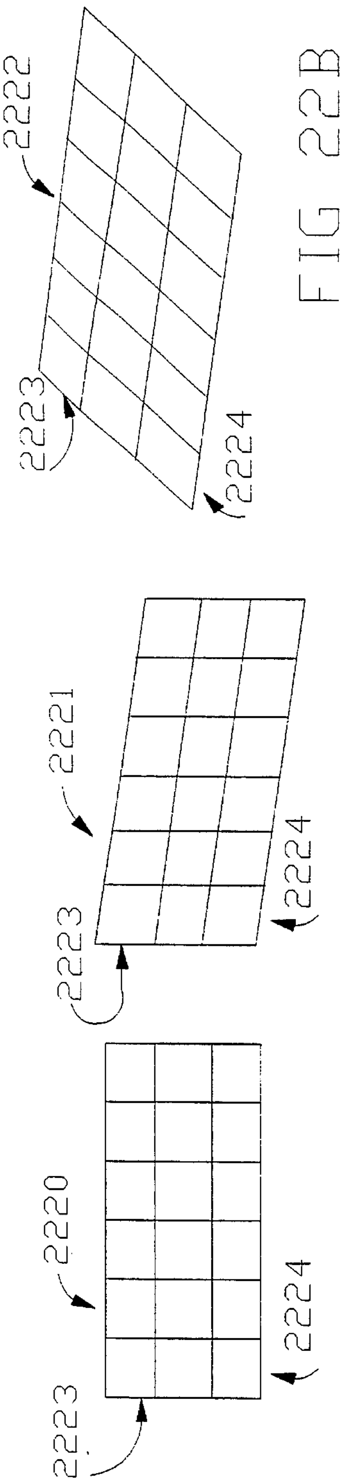

Various arrays of pixels will now be discussed with reference to FIG. 22B. A rectangular array of pixels 2220 contains horizontal rows and vertical columns of pixels organized in a rectilinear coordinate system. A non-rectangular array of pixels 2221 contains lines of pixels crossing rectilinear lines at an angle. Array 2221 has lines in the rectilinear coordinate system and lines not in the rectilinear coordinate system. Array 2222 has no line in the rectilinear coordinate system. Each line of array 2220 can be scanned with an edge processor having a slope of zero and each line of arrays 2221 and 2222 can be scanned with an edge processor having a slope of ½. Subsequent lines progressing downward in each of the arrays 2220 to 2222 can be scanned by decrementing (or incrementing) the startpoint pixel address of the prior line to address the startpoint pixel for the next subsequent line. For example, the startpoint pixel for arrays 2220 and 2221 can be decremented in Y and the startpoint for array 2222 can be decremented in Y and partially decremented in X to arrive at the startpoint pixel for the next subsequent line. Decrementing in rectilinear coordinates, such as for arrays 2220 and 2221, can be provided with an address counter. Decrementing along a slope, such as for array 2222, can be provided with edge processors. Therefore, array 2220 can be generated by incrementing the X-pixel address register to generate a rectilinear line of pixels and then decrementing the Y-pixel address register to address the next line of pixel addresses. Array 2221 can be generated by updating pixel addresses along a line in accordance with the line slope, such as implemented with an edge processor, and then decrementing the Y-pixel address register to address the next line of pixel addresses. Array 2222 can be generated by updating pixel addresses along a line in accordance with the line slope and then addressing the next line of pixels and updating the pixel address registers with a startpoint generator using a second edge processor along another slope. In this way, edge processors can be used to load one array of pixels into another array of pixels. Also, spacial compression can be implemented by undersampling, such as selecting every second pixel, every third pixel and every fourth pixel, etc along the scan line and similarly selecting equal steps in the scan line for mapping a smaller array into a larger array for spacial expansion and mapping a larger array into a smaller array for spacial compression. Such spacial expansion and compression can be performed along rectilinear coordinates or non-rectilinear coordinates, such as discussed with reference to FIG. 22B above.

In alternate configurations, the input memory map in memory 2211 can be larger than, equal to, or smaller than the output memory map in memory 2213. In a configuration where the input memory map is larger than the output memory map, the output image can roam through the input memory map; such as by transferring a portion of the input memory map; properly rotated, translated, scaled, and otherwise processed; into the output memory map for displaying of a rotated, translated, scaled and otherwise processed portion of the image in the memory map stored in input memory 2211 on display monitor 2214. For example, input memory 2211 may store a large map of an environment (either sonar, radar, video, or otherwise) and output memory 2213 may store a portion of the environment pertinent to the operation in progress, such as the portion of the environment around a vehicle being navigated. The array selected from the large memory map stored in input memory 2211 can be translated and rotated consistent with the position and orientation of the vehicle for storing as a rotated and translated portion of the image in output memory 2213.

Figure 22C:
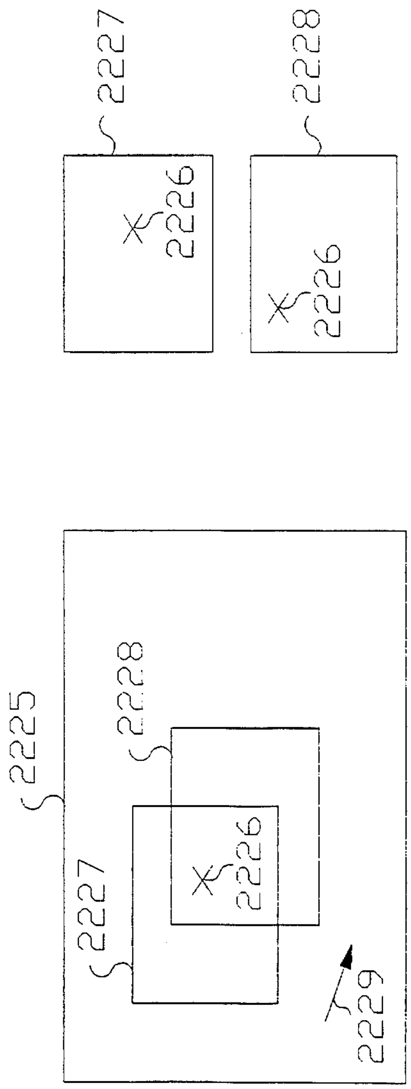

A translation example will now be discussed with reference to FIG. 22C as illustrative of rotation and other processing. The larger memory map stored in input memory 2211 is illustrated with pixel array 2225 having a visual event 2226 contained therein. A first array of pixels 2227 is selected and transferred to output memory 2213 in memory map form having event 2226 contained therein. For subsequent processing, the selected array is translated in X and Y to array position 2228 having event 2226 in the upper left hand corner. This is an apparent translation of the image to the lower right, from array 2227 to array 2228 within input array 2225 and an apparent translation of event 2226 towards the upper left of the output arrays 2227 and 2228. Output arrays 2227 and 2228 are shown superimposed on input array 2225 and are also shown separately to illustrate the translation of output arrays 2227 and 2228 relative to input array 2225 and to illustrate the apparent motion of event 2226 from the near center position in output array 2227 to the upper left position in output array 2228. Similarly, image rotation, compression, decompression, and other image processing can be performed by manipulating memory maps.

A memory map image processing arrangement will now be discussed relative to the flow and state diagram of FIG. 22D. Two sets of edge processors will be used. The first set generates addresses for accessing a selected array of pixels from input memory 2211. The second set generates addresses for storing the accessed pixels in an array in output memory 2213. Each set has two edge processors, an edge generator for generating a line of pixel addresses beginning at a startpoint and a startpoint generator for generating the startpoint pixel addresses. Each of the edge processors can be implemented as discussed for edge processor 131 discussed with reference to FIG. 7 and as implemented with the edge processor routine in the program listings set forth in the referenced disclosure documents.

Initial conditions are generated for the edge processors in operation 2230. Initial conditions include the startpoint pixel for the array, the delta-X and delta-Y components for the slope of each line of pixels for each edge generator, the X-DTG and Y-DTG parameters for each edge generator, the delta-X and delta-Y parameters for the slope of the startpoints of the lines of pixels for each startpoint generator, and the X-DTG and Y-DTG parameters for each startpoint generator. Initial conditions may be generated as discussed for the EGEN1 initial condition routine used with the EGEN7C edge processor routine.

The X-DTG and Y-DTG parameters for the edge generator are loaded in operation 2231. For an array having equal length lines, such as shown in FIG. 22B, the X-DTG and Y-DTG parameters are the same for each line. In other configurations, these parameters may be varied to provide different types of arrays.

The edge generator is clocked in operation 2232 to generate the new output conditions; such as described in the EGEN7C routine clocking the edge generator in the EGENN and EGENG routines and generating the output conditions with the table lookup in the EGEND5 routine and related logic.

The edge generators for both, input memory 2211 and output memory 2213, are clocked in operation 2232 to advance to the next pixel along the input line and output line of pixels. The output conditions are generated, such as with a table lookup, and the X-DTG and Y-DTG parameters and decremented in operation 2233. In operation 2234, a pixel word is accessed from input memory 2211, as addressed by the input edge generator, and stored in output memory 2213, as addressed by the output edge generator. A test is then made in operation 2235 to detect the last pixel in the line. If it is not the last pixel in the line, the logic loops back along the NO path to again clock the edge generator in operation 2232 to process the next pixel in the line. When the last pixel in the line is detected in operation 2235, the logic branches along the YES path to operation 2236 to detect the last line. If the last line is not present, the logic branches along the NO path to initialize processing of the next line of pixels with operations 2237 and 2238. If the last line is present, the logic branches along the YES path to exit the iterative loops as completing the transfer of the selected array of pixels.

A new line is initialized by clocking the startpoint generator in operation 2237 and loading the new startpoint initial conditions generated with the startpoint generator into the edge generator for each memory to initiate transfer of the next line of pixels. The logic then loops back to operation 2231 to load the X-DTG and Y-DTG parameters for the next line of pixels and then generates the next line with operations 2232 to 2235 as discussed above.

Figure 22D:
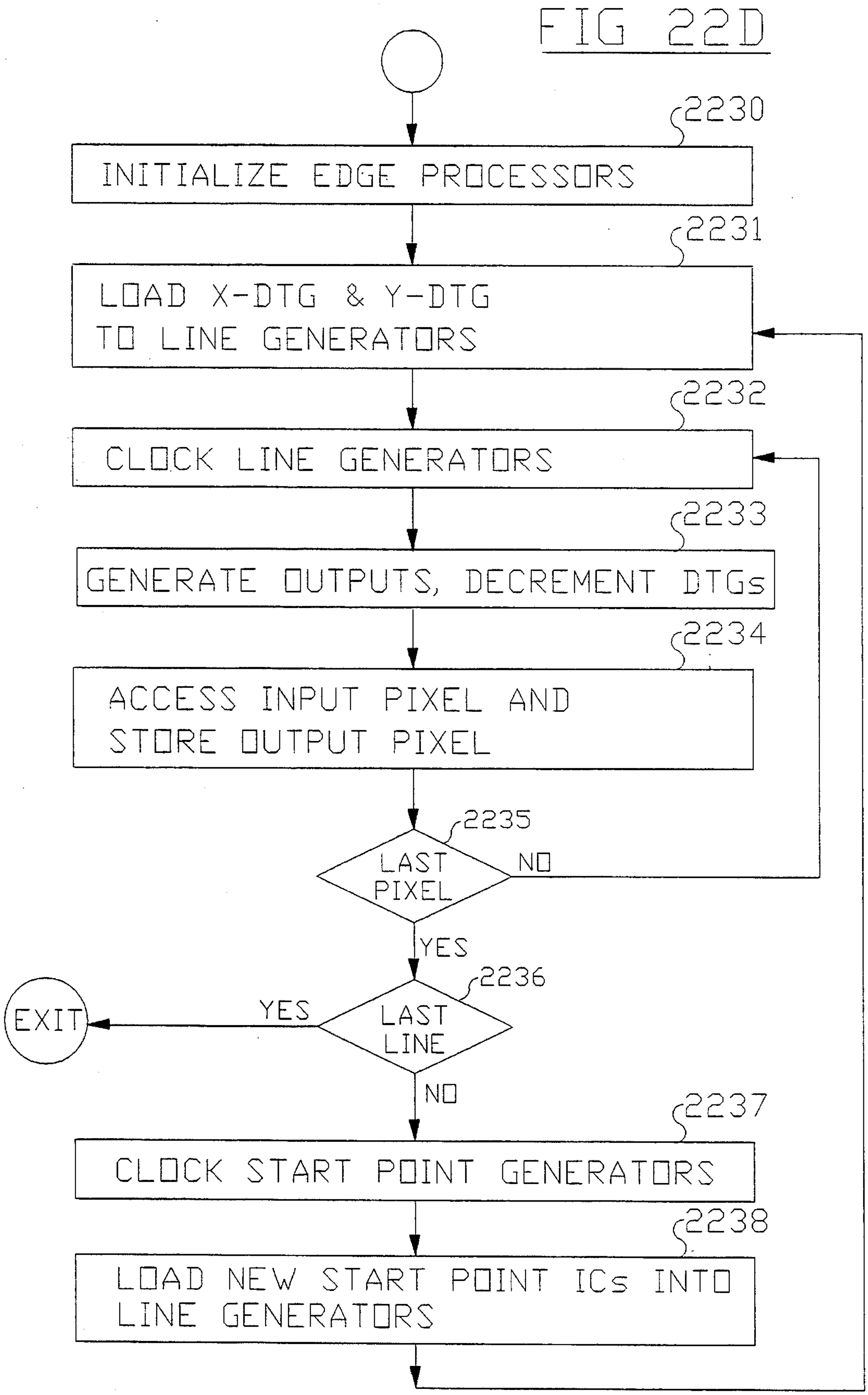

Edge processor operations discussed with reference to FIG. 22D provide for iteratively scanning an input array in input memory 2211 and an output array in output memory 2213 for transferring pixel words from the input array to the output array. As discussed herein; the input and output arrays may have translation, rotation, scaling, and other differences there between to perform such operations on the image displayed with monitor 2214.

IMAGE RECORDING

An image recording device permits convenient demonstrations and permits long distance remote demonstrations. For example, a reel of photographic film or a reel of video tape can be conveniently transported to a remote location having an accomodating demonstration environment and can be played back on a photographic movie projector, or a video tape recorder, respectively.

Image recording can be used to enhance demonstration ability of a developmental system. This is because the operating environment may not be suitable for demonstrations and because system performance may be in non-real time; which can detract from demonstration effectiveness. However, use of video or photographic recording techniques overcomes these problems by permitting demonstrations to be provided outside of the operating environment and permits time-lapse recordings to demonstrate the effects of real time operation.

Recording can be performed with video equipment or with photographic equipment. Photographic cameras have single frame capability, permitting time-lapse photography to provide playback in real time. Most video tape recorders and video cameras are configured as consumer products for recording conventional television images at 30-frames per second on video tape. Consumer-grade video equipment is not adequate for time-lapse recording. However, a consumer-grade video tape recorder is a good recording medium for systems that can operate in real time. Professional grade video equipment is available that permits good quality recording and single frame capability. Such professional equipment is significantly more expensive then consumer-grade-equipment. Another important consideration is quality. Consumer-grade video equipment has low quality, consistent with the low quality of conventional television receivers. In contrast, photographic equipment has very high quality that can preserve the full quality of a high resolution display terminal.

Image recording is facilitated if the display terminals contain recording-related features. For example, a frame synchronization feature which synchronizes the display of a frame of information from the video display terminal to a shutter switch for synchronization with the shutter of a photographic camera, can be a valuable feature. Also, an NTSC or, RS-170 interface option for interfacing to a video tape recorder can be valuable features.

It may be desireable to record portions of the scenario. This may be performed in several ways, as discussed below.

It may be desireable to re-establish a scenario at a particular point and continue therefrom. This may be provided by loading important information onto a database disk memory or other memory for eventual reloading into the visual processors to resume the scenario at a later time. Storing of real time processor main memory information and refresh memory information facilitates re-establishing operation at a later time. Also, many intermediate parameters can be stored such as files from microprocessor memory, contents of the incremental processor increment memory, and contents of various buffer memories and registers. A stop operation control may be incorporated to discontinue operation of the visual scenario at a convenient point; such as when updating of the refresh memory has completed a cycle (or iteration), when an iteration of the real time processor is completed, or when processing in the microprocessor has completed an iteration. After completion thereof, the progression of the scenario may be discontinued and pertinent information can be stored. Resumption of the visual scenario can be provided by reloading the visual processor and refresh memory with the stored information and then re-initiating operation of the scenario.

A frame of the visual scene may be stored or output for record keeping, checking, and other purposes. The contents of refresh memory may be stored on disk memory for a record-of the image. This information may be reloaded into the refresh memory at a later time for presentation of the previously generated image. Also, the stored frame may be output to an external system for storage, display, archival, or other purpose. Information may be transferred to an auxiliary memory, either directly such as from refresh memory or indirectly such as by first being buffered on disk memory. Offline storage such as magnetic tape or magnetic disk may be used to store such information.

The system may be implemented as a master-slave system having at least one master terminal and a plurality of slave terminals. The slave terminals can display images generated for the master terminal by transferring refresh memory information and other pertinent information thereto. Alternately, the monitor signals from the display interface may be distributed to both master and slave monitors.

Visual information may be output for hard copy recording. For example, the analog video signals may be output to a well known CRT hard copy printer. Alternately, refresh memory information may be output to a digital printer or plotter for generating a hard copy representative thereof.

The visual information may be recorded, either in addition to displaying with a display monitor or in place of displaying with a display monitor. A video tape recorder may be an analog tape recorder or a digital tape recorder. An analog tape recorder may record the analog video signals out of the display interface. A digital tape recorder may record the digital refresh signals into the display interface, which may be the digital pixel words out of refresh memory. A video tape recorder can store visual information in real time or in non-real time. For example, the scenario may progress in non-real time for recording on a video tape recorder and may then be played back in real time for an improved presentation. Alternately, video information may be recorded on a video tape recorder in real time such as for fulfilling a real time scenario with an observer, played back in non-real time for editing purposes, and then played back in real time as edited for presentation to an audience. Many other variations thereof can be provided.

SYSTEM APPLICATIONS

Introduction

The system applications discussed herein and system applications implied thereby may be implemented in accordance with the teachings of the present invention. The systems may be implemented as discussed with reference to FIG. 1A having a database memory 112 generating database signals 113 and observer controls 110 generating observer signals 111 to supervisory processor 125. Supervisory processor 125 can control the rest of the system including real time processor 126, refresh memory 116, and display interface 118; such as by providing initial conditions thereto and providing control signals thereto. Real time processor 126 can include an incremental processor, such as for providing orientation, translation, scaling, and other operations in a 3D environment.

The information derived by the incremental processor can be processed with an edge processor to generate edges by identifying the address of the edge pixels along that edge in order to facilitate changes in the display image. An occulting processor can determine new occulting conditions from changes in the edge conditions and can provide for filling of pixels with the appropriate surface-related parameters. A smoothing processor can perform smoothing of edge pixels to reduce aliasing effects. The filled and smoothed pixel information for changed pixels can be loaded into the appropriate pixel words in refresh memory 116 for updating of the image.

A refresh address counter can scan pixel information out of refresh memory 116 and can access auxiliary information, such as from a parameter memory, in a raster scan form to excite display interface 118; which converts digital information 117 from refresh memory 116 into analog video information 119 to excite display monitor 120.

This implementation and variations thereof may be used in various system applications discussed herein and implied thereby. Further, various other features; such as dynamic overlays, roaming, and illumination effects; may be used in such system applications. For example, dynamics overlays, such as for use with an image processing system, may be used therewith. Also, illumination effects; such as shading, reflections, refractions, glint, shadowing, and others; may be used therewith. Many other features disclosed herein may also be used therewith.

The disclosures herein, when used in conjunction with prior art knowledge, teach one skilled in the art how to construct and use various configurations of the system of the present invention and teach one skilled in the art how to develop databases, driving functions, operational scenarios, and other operations associated with use of this system. Therefore, a description of images to be displayed and scenarios to be provided is sufficient, when taken in combination with the teachings herein for implementation thereof, for one skilled in the art to provide such images and scenarios.

The information derived by the incremental processor can be processed with an edge processor to generate edges by identifying the address of the edge pixels along that edge in order to facilitate changes in the display image. An occulting processor can determine new occulting conditions from changes in the edge conditions and can provide for filling of pixels to reduce aliasing effects. The filled and smoothed pixel information for changed pixels can be loaded into the appropriate pixel words in refresh memory 116 for updating of the image.

A refresh address counter can scan pixel information out of refresh memory 116 and can access auxiliary information, such as from a parameter memory,.in a raster scan form to excite display interface 118; which converts digital information 117 from refresh memory 116 into analog video information 119 to excite display monitor 120.

This implementation and variations thereof may be used in various system applications discussed herein and implied thereby. Further, various other features; such as dynamic overlays, roaming, and illumination effects; discussed herein may be used in such system applications. For example, dynamics overlays, such as for use with an image processing system, may be used therewith. Many other features disclosed herein may also be used therewith.

The disclosures herein teach one skilled in the art how to construct and use various configurations of the system of the present invention and teaches one skilled in the art how to develop database, driving functions, operational scenarios, and other operations associated with use of this system. Therefore, a description of images to be displayed and scenarios to be provided is sufficient, when taken in combination with the teachings herein for implementation thereof, for one skilled in the art to provide such images and scenarios.

General Applications

The visual system of the present invention has many features that enhance usefulness. Simplified host system software reduces host system development cost and risk. Reduced host computer loading reduces host system cost and increases host system capability. Real-time capability and visual features increases system capability and increases productivity. Visual features also avoids obsolescence and enhances aesthetics.

Many host systems need visual capability. For example, many CAD/CAM systems do not have visual 3D capability and most sophisticated CAD/CAM systems have only a limited subset of visual 3D capability, which is implemented in software therein. This limited software-implemented visual capability places a heavy burden on the host computer.

The visual system of the present invention has many features important to host systems, such as CAD/CAM systems. For example, visual features are implemented in hardware and operate in real-time, which relieves part of the host system software development burden; provides greater detail in real-time then practical with software-implemented visual capability; reduces the processing load on the host computer for permitting more host system features, more terminals, and a lower cost host computer; provides many visual features such as providing edge smoothing, occulting, 3D perspective, distance variable intensity, and others not available with software-implemented visual systems; increases host system capability; reduces host computer cost; and avoids obsolescense.

The dual CG and visual capability of one configuration of the present invention provides an important application advantage. CG capability and visual capability are generally considered to be different. Therefore, conventional visual systems are incompatible with conventional CG systems. However, a configuration of the system of the present invention is provided with CG capability as a subset of visual capability. Consequently, this configuration can be used interchangeably as a visual system and as a CG system. This dual capability may not have a cost impact, such as for CG capability being implemented as a subset of visual capability.

One configuration of the system of the present invention is estimated to be cost competitive with conventional medium priced CG systems and is usable as a conventional CG system. Therefore, a customer (OEM or end user) can purchase this system in place of a conventional CG system without cost penalty or operational penalty. However, this customer also obtains, at virtually no extra cost, state of the art visual capability. The customer is not forced to change his modus operandi because this system has familiar CG capability. At his option, the customer can use the visual capability, either partially or fully and either separate from or in conjunction with the CG capability. As the user's capabilities and requirements evolve, he can use the Visual capability. However, he can always fall back on the familiar CG capability. He has the visual capability but he has not given up the CG capability and he has not paid a penalty for the visual capability. Therefore, he can apply this system with minimum risk.

In view of the above, applicability is enhanced by providing visual capability in addition to and compatible with CG capability (not in place of CG capability) and for a total price (CG and visual capability) estimated to be comparable to prices of medium priced CG systems.

The dual CG and visual capability facilitates retrofit and plug-compatible operation. Retrofit of obsolete host systems (such as CAD/CAM systems) to upgrade capability for in-place host systems and plug-compatibility with existing CG terminals for new host systems provide advantages in applicability.

This configuration provides many system benefits; such as reduced obsolescence, standardization, improved productivity and return on investment, improved capability and flexibility, enhanced host system development, reduced host system cost, and increased host system performance and capability.

This configuration enhances host computer software. For example, CAD/CAM software is a major development problem and a major cost consideration. Contemporary CAD/CAM systems perform some visual processing under software control in the host computer. This complicates host software, loads computational resources, and limits visual capability. The present invention provides highly sophisticated visual capabilities with powerful, self-contained visual processors. Therefore, a host system using this system is relieved of the burden of visual processing in software. This results in significantly simplified host software and significantly improved host performance. Simplified host software reduces development time for more rapid new product introduction and reduces development effort and risk, thereby enhancing new product introduction. Enhanced host performance reduces processing loads, permitting use of a smaller lower cost host computer and permitting greater performance and capability.

Design Applications

The visual system of the present invention may be used by designers, such as for configuring architectural works. This includes building architects, landscape architects, bridge architects, building layout architects, and other architectures and designs.

Aesthetic considerations are very important for architectural works. Buildings, landscapes, and other architectural works are configured to have aesthetically pleasing characteristics. Most designs are generated as paper designs. However, it is difficult to get the proper perspective from a paper design. Models are sometimes used to provide a degree of 3D perspective and to indicate aesthetics. However, models are inadequate because of the miniature size, difficulty of modification, and other such characteristics.

A visual system can provide an architectural 3D perspective together with ease of architectural modification to enhance architectural works. For example, a visual system can provide a perspective of a person moving around a building. Also a visual system permits rapid modification of object positions, object configurations, and portions of objects to enhance the architectural work. For example, bushes and trees can be easily moved around for landscape architecture; buildings can be translated and rotated to new positions for building architecture; facades such as brick work and masonry, can be added to surfaces; window designs, such as wood frame and by window designs, can be interchanged; and other modifications can be rapidly made.

A library of objects may be provided in the database for positioning and orienting as desired. Objects can be selected from the database; assigned parameters such as size, color, and texture; oriented to the particular attitudes; and placed at particular locations in the environment. The observer can roam through the environment; visually inspecting features of the environment. Perspective use can include a closeup of a building looming overhead; a distant view of building in the foreground, intermediate ground, or background; an aerial view with the building against the terrain; and other such views. 3D objects may be relocated, reoriented, and resized within the environment to the desired clearances, spaces, and other characteristics of object to be located therein. For example, in a landscape environment; trees, bushes, rocks, and other objects may be located therein and relocated therein to provide the desired esthetic effects.

The flexibility of the visual system of the present invention can enhance the capabilities of an architectural firm. For example, development of a database for a building and landscaping or a residence permits prospective residents to roam through the environment to obtain different perspectives of the building and grounds. Different configurations may be readily investigated, such as relocating the building on the grounds and modifying the landscaping by placement of different types of trees, bushes, walls, etc. in the environment. The generated visual images can be recorded on video tape. The resident can roam through the environment to obtain different perspectives, which can be recorded on the video tape. The video tape can be played back by the resident on a video tape recorder for display on a conventional TV receiver. This facilitates a personalized capability to enhance client relationships and to facilitate better designs and satisfied customers.

Layout Applications

The visual system of the present invention may be used for layouts; such as layout of offices, factories, warehouses, and other spaces. A library of objects may be provided in the database for positioning and orienting as desired. Objects can be selected from the database; assigned parameters such as size, color, and texture; oriented to the particular attitudes; and placed at particular locations in the environment. The observer can roam through the environment; visually inspecting clearances, interferences, work space dimensions, and other characteristics of the environment. Perspective use can include a closeup of a building looming overhead; a distant view of building in the foreground, intermediate ground, or background; an aerial view with the building against the terrain; and other such views. 3D objects may be relocated, reoriented, and resized within the environment to the desired clearances, spaces, and other characteristics of object to be located therein. For example, in an office layout environment; desks, file cabinets, typewriter, and other objects may be located therein and relocated therein to provide the desired clearances such as for checking aisles, clearances for personnel, and clearances for objects. Similarly, in a factory layout environment; machines, work tables, machinery, materials. and other objects may be located therein and relocated therein to provide the desired clearances, such as for checking operator access, material delivery, clearances for objects, and other conditions.

The flexibility of the visual system of the present invention can enhance the capabilities of an interior decorator. For example, development of a database for internal configuration of a building permits prospective clients to roam through the environment to obtain different perspectives of the layout. Different configurations may be readily investigated, such as relocating of partitions and placement of different types of desks and cabinets in the environment. The generated visual images can be recorded on video tape for enhanced client satisfaction.

Business Graphics

Business graphics may be enhanced with the visual system of the present invention. Conventionally, business graphics are implemented with 2D display capability. However, the 3D capability of the visual system of the present invention can significantly enhance business graphics systems. Business graphics systems conventionally use 2D images, such as pie charts and bar charts. However, 3D charts, such as 3D pie charts and 3D bar charts, can provide another dimension of perspective.

3D pie charts may be stacked one above the other in a 3D configuration. Lower level pie charts can be investigated by removing upper level pie charts that are occulting the lower level pie carts to be investigated. Also, upper level pie charts can be made transparent with visible edges to show the relationship and super position on lower level pie charts without providing occulting thereon.

3D bar charts may provide an additional dimension of bar chart for traversing into the 3rd dimension of display or may expand the single dimensional bars to 2D surfaces, where the 2D boundary of the surfaces can be related to the magnitudes of the parameter being displayed in 2D.

THREE DIMENSIONAL COMPUTER AIDED DESIGN SYSTEM

The visual system of the present invention finds wide applicability in computer aided design (CAD). Most CAD applications can be enhanced by 3D visual capability, thereby facilitating improved general purpose CAD systems and high quality 3D perspective capability is essential to a range of CAD applications. A brief description of such CAD applications are set forth hereinafter.

Animation CAD System

An animation CAD system using the visual system of the present invention permits automation of cartoon-type animation processes. Animations are widely used to generate cartoons for movies and television and to generate commercials for television. Cartoons are conventionally generated manually by artists with special-effects photographic equipment. Resolution and detail is poor,yielding degraded realism. The system of the present invention permits animations having very high resolution and detail for excellent realism that are generated in real time for high productivity and low cost per frame. Special-effects photographic equipment is unnecessary where this system generates animations that are TV raster scan compatable for direct recording on video tape.

Parts Programming CAD System

A parts programming CAD system of the present invention permits improved automation of parts programming. Parts programs are conventionally used to control machine tools to cut metal parts. They are usually generated on large computers which accept cutter path commands from a parts programmer and generate a machine language parts program to control a machine. Interaction between the cutter, part, fixturing, and machine structure is often difficult to visualize in a two dimensional perspective. Therefore, excessive testing on a machine tool is necessary to find parts programming errors. This can involve tying-up an expensive machine tool for days during reprogramming iterations and scrapping expensive parts used for test cuts. The system of the present invention permits detailed analysis of machine motions and mechanical interferences in 3D perspective efficiently, without tying up a machine or scrapping test parts. Extensive "trial cuts" can be made "electronically" to identify programming errors "off-line" at the display console rather than "on-line" at a machine tool.

Mechanical CAD System

A mechanical CAD system using the visual system of the present invention permits improved automation of mechanical designs. Mechanical designers must often consider fit, interference, and clearance between various parts during complex motions. Current CAD systems are partially effective for such determinations, but such systems require large computers and have only a limited 3D perspective. The system of the present invention provides a more effective 3D perspective in real time for more efficient design.

Integrated Circuit CAD System

Integrated circuit (IC) design is conventionally implemented with computer aided design (CAD) systems having mask making capability. ICs are generally considered to be two dimensional (2D) devices. Production is facilitated by a plurality of 2D masks having registration therebetween.

Sometimes these masks are stacked up one on top of the other as an indication of registration therebetween. However, this represents a merging of a plurality of 2D masks into a 2D registration image.

A treatment of IC design in a three-dimensional (3D) configuration can provide significant advantages such as for a CAD system. Although masks themselves are 2D in nature, the processes to which the masks are applied are 3D in nature. For example, a diffusion is performed through spaces etched in a photoresist using a photolithographic mask. Even though a mask is 2D, a diffusion into wafer material controlled by the masking tends to be 3D. For example, a diffusion propogates into an IC wafer at a rate and depth and with a depth gradient determined by materials, temperature, time, and other parameters. These parameter can be varied to achieve different effects for a particular mask. Therefore, a mask itself does not completly control the nature of the product. The mask only controls the 2D spacial characteristics. Control of the other characteristics such as material, temperature, time, and others establishes the 3D aspect and the electrical characteristics of the IC. An improved CAD system will now be discussed which assists a designer in configuring multi-dimensional parameters associated with IC manufacturing.

Propogation of diffusions and other monolithic processes are generally known such as the rate of diffusion as a function of material, temperatures, and other parameters. Often, these parameters are expressed as parametric differential equations, where the nature of the diffusion is a function of the various parameters. The diffusion will propogate into the material and, to a certain degree, under the mask. It is important for the designer to characterize the diffusion as a function of the parameters so that the parameters may be adjusted to provide the desired characteristics. The results of the process can be displayed to the designer as it progresses in real time, or as it progresses in non-real time, or as it progresses as a function of designer control to facilitate controlled progression at a rate convenient to the designer. However, it may be difficult for the designer to determine the effects of the progression in the third dimension using conventional 2D CAD mask-making software. IC designs can be significantly enhanced by permitting an IC designer to view the process in 3D. Therefore, a 3D display cpaability as applied to IC process design will now be discussed using a 3D perspective display.

A 3D IC design CAD program may include three different operations. The first may be designing of a mask in 2D form as it is conventionally performed. The second may be defining the process parameters such as materials, temperatures, and times to permit the processor to propogate the progression of the process into the third dimension. The third may be display of the 3D features of the process as it propogates using a 3D perspective display.

Definition of process parameters permits synthesis and simulation of the propogation of the process. For example, selection of a particular mask, a particular diffusion material, and a particular temperature permits the processor to simulate diffusion as it progresses through the mask and into the wafer. Simulated diffusion can progress as a function of time under control of the processor either in real time or programmed time. The diffusion can be controlled by boundary conditions such as a mask, a prior deposition or diffusion, or other boundary conditions.

The 3D perspective display can be used to monitor the process in 3D as it progresses. The visual system can transform visual information as the process progresses in order to provide the designer with the proper perspective. For example, as the designer "moves through" the environment by manipulation of designer controls, the 3D information can be rotated and translated to provide the proper visual prospective. Further, if the designer is concerned about diffusion undercutting the masks and thereby exceeding a design rule by progressing into a guard band, the designer can reorient his position or perspective in the 3D environment by "moving through" the displayed wafer environment until he can view the portion of the environment of interest. The designer can monitor the environment of interest as the diffusion process continues, changing his prospective to obtain a better view of critical features. The designer can stop the process, advance the process, or otherwise control the process in order to provide the desired information from the desired perspective. It may be desireable to stop real time operation as the process propogates and to move through the environment changing the visual perspective in order to monitor the relative progression of the process in different areas.

A CAD system having the above IC process design capability can greatly facilitate IC design, process setup, and process optimizing.

Consumer Animation System

The animation system of the present invention permits implementation of new generation consumer games for replacing prior art video games and prior art hand held games. This feature of the present invention will now be exemplified with a football game embodiment.

Prior art football games are implemented with single dimensional spots or 2D player image representations, played on a 2D play field with the observer viewing the play field in a "plan view", from a top view perspective. The present invention facilitates 3D perspective for game action. In one embodiment, a projection display arrangement is provided such as a well known projection CRT arrangement or a projection liquid crystal arrangement as is described in the patent applications referenced hereinafter. Non-projection display arrangements and other display arrangement may also be used.

In this embodiment a play field is displayed projected on a wall from a ground level perspective. Adversary images are projected life size and viewed from a horizontal perspective. The observer is portrayed in the midst of the play environment. Adversary images are distributed about the projected environment consistent with game strategy. The projected adversary images are portrayed as being about the observer who is involved in the play field, not below the observer as a spectator. The observer sits within the perspective of the play field of projected images and controls relative position of the projected images with a manual control. When the observer moves the control forward and sideways, the projected images are made to translate and to rotate consistent with the commanded motion in the related direction. Therefore, the observer's visual perspective is consistent with his motion through a field of players, not the usual prior art downward viewing of a field of players, to appear to the observer that he is within the game activities rather than above the game.

The observer moving the control towards the left causes the display environment to shift to the right as if the observer were actually moving towards the left in the display environment. As the operator's perspective moves towards the left and as the adversary images move toward the right, the 3D perspective of viewing the adversary images from different angles is facilitated.

The observer controls the display environment with a direction control and a velocity control. Position of the direction control rotates the observer's perspective in the display environment. Use of the velocity control propels the observer through the environment in the direction in which he is pointing. Consequently, the observer moves in the direction he is pointed and can be pointed in any direction for dodging adversary images. Rotation of the direction control causes a corresponding rotation of the display perspective environment to give the appearance that the observer is rotating in the display environment. Use of the velocity control to propel the observer in the direction that he is facing causes translation in the perspective environment such as by objects moving past and changing the perspective of objects as they are approached and passed.

As the projected players approach the observer, they get larger and more challenging. As the observer approaches the projected players, they similarly get larger and more challenging. The observer controls motion to attempt to evade the projected players. The observer controls motion to go around the projected players, where the scene translates and rotates consistent with the observer's commanded motion as viewed from within the game, not viewed from without as in prior art games. When the observer is "tackled" by a projected player, translation and rotation of objects is controlled consistent with the observer "falling" to the ground and viewing the projected players from below as they pile on him.

Other actions such as catching a football can be commanded by the observer attempting to move into the line of motion of the ball image for catching the ball image. If the observer is able to move the control to center the ball sideways in the display and to move the control perpendicular to the display to keep the ball image from falling too short or falling too long, it is recorded as a caught ball.

Sound effects can be provided to facilitate realistic type operation. These sound effects can be computer generated using techniques described in the patent applications referenced hereinafter and also using techniques evolving in the technology.

The method discussed for football above is equally applicable to other sports, games, simulations and adversary interactions such as hockey, baseball, soccer, and others. This implementation can also be used to facilitate combat games such as dueling, jousting, boxing, wrestling, combating, and otherwise interacting with an adversary.

The above football description can similarly be used to operate vehicular games such as with airplanes, tanks, cars, and others. These vehicular games can be combat games such as an airplane in combat, race games such as an automobile in an automotive race, and others.

3D Operator Control Panel

A 3D operator control panel may be provided in accordance with the teachings of the present invention for enhanced operator interaction. Prior art control panels are conventionally 2D panels, having 2D control arrangements, such as arrays for switches. The prior art also provides 2D control arrangements such as with light pen and touch panel inputs. Although prior art CGI systems do provide. 3D displays such as for simulation, 3D control panels in accordance with this feature of the present invention are not provided therewith.

A 3D control panel in accordance with the present invention displays 3D control devices for selection by an observer in a 3D displayed environment. This provides flexibility of control and excellent control capability and takes advantages of implicit characteristics of human vision which are not properly utilized by the prior art. For example, human vision is highly sensitive to a changing perspective, but is relatively insensitive to presentation of a new image instantaneously being introduced in place of the old image. This is believed to be derived from the sensitivity of human vision to continuous motion and the relative insensitivity of human vision to presentation of a new image that is not a change to the image. For example, an arrangement will be discussed herein where one control configuration is changed to a second control configuration by movement of 3D objects to provide visual continuity to "bridge" the change. Prior art systems in contrast provide separate discrete images on a screen without providing a visual "bridge" between the two images. It is believed that this visual "bridge" provided by object motion provides an important visual cue to maintain an observer's perspective, minimizing discontinuities and minimizing other visually disturbing operations; thereby preserving an observer's visual perspective and enhancing observer operation.

Experiments made in accordance with the present invention indicate that human vision is highly sensitive to continuous motion and is relatively insensitive to and often disturbed by discontinuous presentations. Therefore, in accordance With various features of the present invention, opt-rations implemented in the prior art with discontinuous displays are provided herein in a preferred continuous form. For example, prior art systems may change from one panel image to another panel image, discontinuously erasing the first panel image and presenting the second panel image in place thereof. However, in accordance with one feature of the present invention; replacement of one panel image by a second panel image may be implemented by rotation, translation, or combinations or rotation and translation to provide continuous motion from one image to another such as to maintain the observer's visual perspective. For example, a control panel arrangement having a plurality of sub-control panels may be implemented with a multi-surfaced object, where each of the surfaces contains a different sub-panel. Therefore, the total panel is implemented on the multi-surfaced object. Changing of one panel image to another panel image may be implemented by rotating the object in a manner that rotates a first sub-panel image away from direct viewing by the observer and rotates a second panel image on another side or facet of the object into direct viewing by the observer. The observer can view the rotary motion, anticipating presentation of a new image and viewing the new image as it rotates into a more direct viewing position; thereby providing continuity of a visual "bridge" instead of discontinuous changes in the images.

A visual control panel in accordance with The present invention may be implemented by displaying a panel image having visual control devices such as switch images and having a pointer such as a light pen; touch panel overlay; keyboard, joystick, or track ball cursor; or other pointer for selecting of a visual control device. The observer may select a control device with the pointer and may actuate the control device with the pointer such as with a light pen actuation switch or with an auxiliary actuator such as an auxiliary switch. Therefore, an observer can readily select a visual control device and can readily actuate the visual control device.

Visual control devices may take various forms. Visual panels may be of the form conventionally implemented with hardware where switches, potentiometers, and other control devices may be displayed in visual form with the visual control panel. Alternately, visual control devices may take unconventional forms. For example, a visual control panel may be implemented in visual form such as visual, pictorial, schematic, or other visual form and may not display conventional discrete control devices such as switches. Control operation can be provided by selecting portions of the image with a pointer and providing control operations such as with the auxiliary actutator switch. For example, a light pen may be used to select a portion of a schematic image, a Joystick may be used to select an image of a tank as a target, and a keyboard slew switch may be used to select an object for presentation of more detailed pictorial information or more detailed representation thereof. Other visual control panel presentations may be configured as cartoon representations, artistic representations, abstract representations, and other representations of control devices, environments, and images.

The 3D control panel may be implemented with a plurality of sub-panels distributed within a 3D environment. An observer may roam through the environment to view visual control sub-panels and may actuate control devices thereon. The computer may portray desired sub-panels to the observer by automatically roaming through the environment to provide the selected sub-panel for direct viewing by the observer. Sub-panels may be distributed in range, asmuth (right and left), elevation (up and down), different sides of objects having different normal vector directions, about the surface of an object such as an object having curved surfaces,and other such distributions. A selected sub-panel may be brought into more direct viewing by the observer under observer control, under system control, or under other control. Sub-panels may be provided in relatively small size and with relatively low details, such as to portray a larger number of sub-panels to an observer. Then, a selected sub-panel may be provided in greater detail and in greater size and for more direct viewing by zooming, panning, and roaming through the environment. Range variable details can be provided as a function of range (as discussed herein) or as a function of other parameters, such as under pointer control or other control. Consequently, this arrangement facilitates continuous presentation to an observer, in contrast to widely used arrangements having discontinuous presentation.

A 3D operator panel can provide panning and zooming capabilities to permit movement within the environment. Panning and zooming represent polar coordinate motion, as contrasted to rectilinear motion. Alternately, rectilinear translation motion can be provided. However, panning can cover more ground than translation.

The panel environment can be full of control devices that are accessed with panning and zooming. Also, the panel can provide variable controls, where panning and zooming can rotate hybrid control, magnitude control, etc. This panel capability provides a very large 3D panel capability and can include motion, color, and even sound.

Generated Environment Applications

Observer interaction can be enhanced with a Visual system generating images, such as for assisting the observer to perform his tasks. A vehicular application is discussed herein, which is intended to be exemplary of other applications that may not be vehicular oriented; such as medical, design, simulation, and other applications. For simplicity of discussion, this feature may be discussed in the form of an aircraft control arrangement for use by a pilot. Other applications are also discussed herein.

Generation of an image environment facilitates vehicular operations. A generated environment can provide various views, perspectives, scenarios, clarifications, and adaptations of an actual environment together with an actual environment or in place of an actual environment. A generated environment has many advantages, such as being independent of actual conditions including atmospheric effects and vehicle dynamics; thereby permitting different perspectives and different scenarios to be generated independent of an actual observer perspective or an actual scenario, such as through a windshield in an actual vehicle. It can also provide other valuable capabilities to aid an observer. A visual system may be used in conjunction with a data link for receiving communicated environment information to aid in defining an environment. For example, an initials environment and database can be communicated to an aircraft from a ground command post.

In one configuration, the system may have self-contained initial database and environmental information anticipating the environment; which may be replaced or updated with information communicated from a host system, with information received from an observer, and from other sources.

The image generation system can use environmental information to synthesize a generated environment and to facilitate synthesized scenarios to aid an observer for control, operation, investigation, classification, identification, and other purposes. The observer can use panning and zooming capability to synthesize operations in the environment, such as to investigate the environment from different perspectives and with different scenarios to better define the environment and to better operate within the environment.

A description of an exemplary vehicular scenario will now be discussed with reference to FIG. 21A. An observer in vehicle 2110 may investigate environment 2111 comprising objects 2112. Vehicle 2110 contains a visual system, such as visual system 100 (FIG. 1). System 100 can have a basic database contained therein and can receive additional environmental information and additional database information from host system 102 over data link 2114, which may represent host system communication channel 103 (FIG. 1A). Visual system 100 can generate an image representative of environment 2111 having objects 2112 therein from this information. In addition, other sources of information 2115 may provide additional database and environmental information to vehicle 2110, such as with communication link 2116. This database and environmental information may be used to generate images related to the environment to aid the observer. Generated images may have greater flexibility than actual images. For example, generated images may be used to synthesize a special environment, implement special scenarios, and otherwise provide flexibility in using the database and environmental information.

Driving functions may be provided by external systems or remote systems. For example, host system 102 (FIG. 1A) can provide driving functions for the environment and for objects within the environment. Host system 102 may be remotely located and may provide driving function updates based upon independent or external analysis of the environment. Vehicle 2110 may provide remotely acquired environmental information to host system 102 over communication link 2114 (FIG. 21A). Received environmental information may be used to update the generated environment in vehicle 2110 to better match the actual environment and to facilitate enhanced operational scenarios.

The arrangement discussed herein may be used in various types of vehicles having various types of acquisitions systems. Vehicles include aircraft (i.e.; fixed wing and helicopter); ground vehicles (i.e.; tanks, cannons, and automobiles); ocean vehicles (i.e.; ships, submarines, and RPVs); spacecraft (i.e.; satellites); and other vehicles. Also, the teachings herein are applicable to non-vehicular configurations; such as air traffic controllers, command posts (i.e.; forward, rear, and airborne); training simulators; and others. Observers may be crew members of a vehicle; such as a pilot, copilot, navigator, captain, astronaut and others; and may be an air traffic controller, pilot trainee, ground-based forward observer, and other personnel. Also, some configurations may not require a local observer; such as a system for automatically acquiring actual environmental images, automatically generating and updating generated images, and automatically transmitting updated generated image information to a remote location for analysis or for display.

Constructing of a generated environment may be performed in accordance with the means and methods discussed in the section herein related thereto. Generated images may be moved within the environment in accordance with the means and methods discussed in the section herein related thereto.

The 3D object dynamic overlay arrangement described herein is a significant improvement over static overlays and 2D overlays. A 3D dynamic overlay can be implemented to facilitate sophisticated visual capability that is more effective than static overlays and 2D overlays.

Investigation of an environment with generated images provides important advantages. For example, generated images have significantly greater dynamics than vehicles or than processed images. This is because processed images may be actual images obtained with sources, such as radar and infra-red sensors. These processed image sources may have dynamics related to vehicle dynamic limitations and mechanical dynamics of gimbals and other mounting structures for the sources, such as antenna slew rates for a radar system. However, a generated image is not thus limited. A generated image can be slewed through the environment; such as with panning, zooming, and roaming capability, discussed herein in the section related thereto; to facilitate rapid investigation of a generated image environment. Consequently, it may be practical to investigate more rapidly and more flexibly with generated images than with an actual vehicle and processed images. Also, a generated image capability permits perspectives that may be impossible with a generated image capability or with visual observation. This is because many portions of an actual environment may be inaccessible due to topological features, such as hills and mountains; territorial constraints, such as being in enemy territory; and environmental constraints, such as fog, overcast, and rain. However, generated images are not thus limited. Obstructions, such as hills and mountains, can be made transparent, can be removed, or can otherwise be circumvented with image generation. Also, territorial considerations, such as enemy territory, are not a constraint when investigating with an image generation system because the vehicle does not have to penetrate the territory being investigated. Also, atmospheric conditions, such as fog and overcast, can be eliminated with image generation; thereby facilitating investigation thereof even if the actual environment is obscured. Therefore, image generation facilitates capabilities that may not be possible with image processing and visual observation.

A visual system in a cockpit environment can provide many important capabilities. For example, a pilot can fly an exploratory (preview) scenario to gain a different perspective. A pilot can fly a preview attack scenario in advance of making an actual attack flight in order to gain insight into the visual cues that will be presented. Based upon his analysis of that preview scenario, he can fly other preview scenarios in an attempt to obtain a better result. After selecting a scenario, he can then fly various previews thereof to condition his reflexes and become familiar with the environment.

Combining of actual images and generated images may provide important advantages. Images may be combined in various forms. Generated images may be projected onto an observation window or projected into the observation line-of-sight to be superimposed on an actual image. In this configuration, an observer may see the actual image through a superimposed or overlayed generated image.

A preview scenario will now be discussed. A preview scenario is herein intended to mean obtaining advanced visual information from generated images that previews what is expected to be encountered in an actual scenario. For example, in a pilot landing scenario, a preview scenario can provide advanced information to a pilot on appearance of airport conditions during an approach prior to making the actual approach or ahead of encountering those conditions in the actual environment. Such a preview scenario facilitates alerting and conditioning the observer to conditions that may be encountered during an actual scenario. In an aircraft landing scenario, a preview can give advanced information to a pilot including airport conditions during the approach prior to making the approach or ahead of encountering those conditions in the actual landing environment. In an attack scenario, a preview can give advanced information to a pilot including attack approach and battlefield conditions during the attack prior to making the attack or ahead of encountering those conditions in the actual attack environment. In a tank attack scenario, a preview can give advanced information to the tank commander on the appearance of battlefield conditions during a tank attack prior to making the attack or ahead of encountering those attack conditions in the actual environment. In a sonar scenario, a preview can give advanced information to a sonar operator to cause the appearance of underwater conditions during operations prior to encountering those conditions in the actual underwater environment. In an ATC scenario, a preview can give advanced information to the ATC to cause the appearance of airport conditions during a landing approach prior to controlling the landing approach or ahead of encountering those conditions in the actual environment.

Acquired Environment Applications

Observer interaction can be enhanced with a visual system generating images for use in combination with acquired and processed images, such as for assisting the observer to perform his tasks. A vehicular application is discussed herein, which is intended to be exemplary of other applications that may not be vehicular oriented; such as medical, design, simulation, and other applications. For simplicity of discussion, this feature may be discussed in the form of an aircraft control arrangement for use by a pilot. Other applications are also discussed herein.

One configuration may be in the form of a 2D to 3D image generator. Acquired information that is preprocessed may be considered to be 2D information, such as radar information portrayed on a radar screen and infra-red information portrayed on an infra-red screen. Classification and identification of objects therein facilitates fetching of an image generation 3D object from a database corresponding thereto and placing that 3D object in a 3D image generated environment. Therefore, the image generated environment may be a 3D representation of a 3D actual environment received as a 2D acquired image. This permits reconstruction of the 3D nature of an actual environment and portrayal thereof with a generated environment, notwithstanding the 2D nature of the acquired information.

Display of an acquired image environment facilitates vehicular operations, similar to those discussed for the generated environment herein.

In a one configuration, the system may have self-contained initial database and environmental information; which may be replaced or updated with information communicated from a host system, with information received from a data acquisition system, and with information received from an observer, and from other sources.

A data acquisition "front end" may be provided for generating actual environmental information. The user of actual environment image information in combination with generated image information provides important capabilities therewith. For example, a radar system can present actual environmental information as raw radar information or as preprocessed radar information on a CRT monitor and an image generation system can provide generated images superimposed thereon to aid in reading the radar images. Also, actual environmental information can be used to define the environment for the image generation system and then the image generation system can use the generated environment to synthesize scenarios and to provide other information therefrom. In one configuration, a signal acquisition system can acquire actual environmental information, which can be preprocessed (such as with filters, classifiers, and identifiers) to provide actual environmental information to the image generation system. The image generation system can use this actual environmental information to synthesize a generated environment and to facilitate synthesized scenarios to aid an observer for control, operation, investigation, classification, identification, and other purposes. The observer can use panning and zooming capability, to synthesize operations in the environment, such as to investigate the environment from different perspectives and with different scenarios to better define the environment and to better operate within the environment.

A description of an exemplary vehicular scenario has been discussed herein with reference to FIG. 21A in the configuration of an image generation system. A description of a configuration having a combined image generation and image processing capability will now be discussed. An observer in vehicle 2110 may investigate environment 2111 comprising objects 2112; as discussed above in the context of an image generation system. In addition, vehicle 2110 may receive environmental information 2113 with sensors; such as radar, infra-red, and visual methods; indicative of the actual environment 2111 for updating environmental and database information used for image generation. Acquired image information 2113 may be preprocessed, such as with filtering and other processing techniques, to provide preprocessed actual environmental information, which may then be used to update database and environmental information. This database and environmental information may be used to generate images related to the environment for use in combination with processed images.

Driving functions may be provided by external systems or remote systems. For example, host system 102 (FIG. 1A) can provide driving functions for the environment and for objects within the environment. Host system 102 may be remotely located and may provide driving function updates based upon independent or external analysis of the environment. Vehicle 2110 may provide remotely acquired environmental information to host system 102 over communication link 2114 in addition to receiving updated actual environmental information from host system 102 over communication link 2114 (FIG. 21A). Received environmental information may be used to update the generated environment in vehicle 2110 to better match the actual environment and to facilitate enhanced operational scenarios.

The arrangement discussed herein may be used in various types of vehicles having various types of acquisition systems. Vehicles include aircraft (i.e.; fixed wing and helicopter); ground vehicles (i.e.; tanks, trucks, cannons, and automobiles); ocean vehicles (i.e.; ships, submarines, and RPVs); spacecraft (i.e.; satellites); and other vehicles. Also, the teachings herein are applicable to non-vehicular enbodiments such as air traffic controllers, command posts (i.e.; forward, rear, and airborne); training simulators;-and others. The actual environment may be determined through various systems such as radar, infra-red, visual, sonar, and command link systems. Observers may be crew members of a vehicle; such as a pilot, copilot, navigator, captain, astronaut and others and may be an air traffic controller, pilot trainee, ground-based forward observer, and other personnel. Also, some configurations may not require a local observer; such as a system for automatically acquiring actual environmental images, automatically generating and updating generated images, and automatically transmitted updated generated image information to a remote location for analysis or for display.

Construction of a generated environment may be performed in accordance with the means and methods discussed in the section herein related thereto, Generated images may be moved within the environment in accordance with the means and methods discussed in the section herein related thereto.

Updating of a generated environment may take various forms. For example, objects may be accessed from the image generation database and introduced into the environment. Objects in the environment may be updated; such as by changing position, orientation, and size. Objects in the environment may be replaced with objects from the database, such as resulting from reclassification of a sensed pattern from one type of object to another type of object. Objects not in the database may be generated from preprocessed patterns. For example, edge enhancement may be used to identify edges and then to configure them into a multi-edge synthesized object to be introduced into the generated environment. As an actual perspective is changed, additional information on actual objects (such as details on the back side) may be determined, permitting updating of synthesized objects to provide improved 3D features. As synthesized objects become better defined, they may become classifiable as an object in the database and may be replaced in the environment with database objects.

Objects may be classified as ground-based objects; such as trucks, tanks, and troops; thereby implying contact with the generated topography. Such ground-based objects may be repositioned if not in contact with the terrain to properly orient them in contact with the terrain. Other adaptations may be made to facilitate improved image generation synthesizing an environment.

A database assembler may be provided to assemble input information, such as edges, into the proper format for the image generation system. For example, edges may be combined to form surfaces, surface normal vectors, and surface colors and other database information may be provided and stored in the proper object format in the database. A library of objects may be included in the database. Natural objects such as trees and rocks may be provided in various general configurations for use throughout the terrain. Ground-based vehicles; such as tanks, trucks, and aircraft; have standard configurations, and are well documented in military classification documents, may be included in the database. Further, various different forms of the type objects such as different makes and models of aircraft may be included in the database for more precise generation of the environment.

Pattern recognition is a well developed art that is documented in many textbooks and articles. Actual images can be analyzed and recognized with well known pattern recognition techniques. Recognition of a pattern by a computer can be used to select a related object image from a database for placement as an overlay or in place of the image pattern in a generated environment facilitating automatic overlaying of generated object images on processed image patterns.

The 3D object overlay described herein is a significant improvement over prior art 2D overlays. The 3D overlay can be implemented to facilitate sophisticated visual capability in contrast to prior art 2D overlay operations.

Single sources of processed images may be discussed herein for simplicity of discussion. However, multiple sources of processed information may also be used and may provide advantages for certain applications. For example, in an aircraft environment, sources of processed images may include radar, infra-red, television, and others. Multiple sources may be used together simultaneously to better investigate the environment and to better achieve matching between processed images and generated images. For example, many sources of processed images have different perspectives; such as a search radar, a side looking radar, a terrain clearance radar, and forward looking infra-red sensor, and a television camera. Different perspectives can be reconciled with generate images which can be rotated, translated and scaled to provide the desired perspective. Multiple perspectives of the same environment can be generated simultaneously, such as in accordance with the multiple terminal capability discussed herein in the section related thereto. Therefore, each of multiple monitors can have portrayed thereon processed images, generated images, and overlayed processed and generated images, generated images, and overlayed processed and generated images; such as discussed herein for a single processed image source. Use of multiple perspectives simultaneously with multiple sources of processed images facilitates improved updating and matching of the generated images to the actual environment.

Combining of acquired images and generated images may provide important advantages. Images may be combined in various forms. Generated images may be projected onto a processed image display or projected into the observation line-of-sight to be superimposed on an acquired image. In this configuration, an observer may see the acquired image through a superimposed or overlayed generated image. In another configuration, acquired images and generated images may be superimposed on a display monitor such as a CRT monitor. Many acquired images may be presented on a CRT monitor such as television images, radar images, infra-red images, sonar images, and other images. Images not ordinarily portrayed on a CRT monitor may be converted for display thereon such as with a television camera scanning the image to generate appropriate electronic signals for portrayal on a television-type CRT monitor. Also, other display monitors may be used, exemplified by the above CRT monitor configuration. Superimposing or overlaying of a generated image on an acquired image is implicit in the ability to portray acquired images on a display monitor and generated images on a display monitor. Portrayal of both of these types of images on the same CRT monitor facilitates superimposing or overlaying thereof.

Overlaying of acquired images and generated images provides important advantages. For example, an observer may be able to better register the generated environmental image with the acquired environmental image and for correction of errors and perturbations therein. Also. an observer may better classify, recognize, identify, and otherwise evaluate objects by overlaying of acquired and generated images. For example. an observer may select a generated image object of overlaying on a pattern in the acquired image environment and may scale, rotate, and translate the generated image object in an attempt to obtain a match therebetween. Such matching may be performed with various images to determine the best match. The generated object that best matches the pattern in the acquired image may be introduced into the generated environment for representation of the acquired image pattern.

The acquired image pattern may be used to fill objects in the generated image environment with acquired images so that an observer has the benefit of the clearly defined and easily recognizable generated images superimposed on actual patterns acquired from the actual environment. This arrangement of both acquired and superimposed generated images facilitates improved observer operations and facilitates precise upgrading of a generated image to precisely match the acquired image in order to more precisely synthesize the actual environment. Matching can be performed throughout a scenario from different perspectives to facilitate image generation accurately representing the acquired actual environment. Such a precise generated representation of an actual environment can be of significant value in many applications such as evaluating, mapping, investigating, and otherwise using an environment. For example, an observer aircraft can use this matching and updating method to validate and improve a representation of a battlefield synthesized by a host system located at a command post.

Acquisition of signals for use with an image processing and image generation will now be discussed. Acquisition of signals may be performed with known sensor arrangements for providing input image information. Different applications of this system may use different types of signal acquisition. Various exemplary sensors are described below.

Acquisition of image information for a range of applications may include visual information; either sensed by an observer for providing system inputs or sensed automatically such as with a television camera, photographic camera, and other visual inputs. An observer's visual input may include preprocessing with an observer optical system and then utilizing observer controls 110 (FIG. 1A) to facilitate image generation with visual system 100. Television image information may be presented on a television monitor such as a conventional CRT monitor, which is compatible with a generated image monitor. Generated images may be superimposed or overlayed on acquired images for a combined acquired image and generated image display, discussed in detail herein in the section related thereto. Photographic acquired image information may be converted to electronic form and processed with scanners, digitizers, and other conversion equipment. One form of scanner is a television camera which can scan a photographic image to convert it to an electronic image for preprocessing. Alternately, a photographic image may be evaluated by an observer and used to control image generation system 100 with observer controls 110 (FIG. 1A). An observer may have two different images, an acquired image through an observation window and a generated image through a "CRT window". He may observe the actual environment through the observation window and use this information to update the generated image in the display "window". Both of these windows may be superimposed, such as by projecting a generated image on an observation window to superimpose the generated image on the acquired image for improved operation and control and for improved updating of generated images. Other sources of acquired information include radar, sonar, and infra-red systems; which may be implemented similar to that discussed herein for the visual acquired information.

Preprocessing of acquired visual information will now be discussed. Preprocessing of acquired information has various forms including data processing, signal processing, logical processing, and processing with observer intervention. Data processing may include sorting, filing, organizing, and manipulating acquired information. Signal processing may include filtering, such as correlation; transforms, such as Fourier (discrete, fast, and others) and Walsch; integration; and other forms of filtering. Operator intervention may include monitoring and changing of information, such as in response to the generated image outputs. Preprocessing may take various form including single pass processing, iterative processing, and recursive processing. Examples thereof are provided herein and in patents and applications referenced herein.

U.S. Pat. No. 4,209,852 and No. 4,209,853 set forth an arrangement for acquisition and preprocessing of signals (FIGS. 1, 2A, 9A, and 9B) and display thereof (FIGS. 2B and 3–7) in a sonar system embodiment. U.S. Pat. No. 4,209,843 sets forth an arrangement for acquiring information (FIG. 1), preprocessing information (FIGS. 1–5,6A–6G, 7A–7I, and 9) and displaying information (FIG. 6H). Application Ser. No. 754,660 filed on Dec. 27, 1976 sets forth acquisition (FIG. 1) and preprocessing (FIGS. 1–5). Also, output device 122 (FIG. 1) may include a display, as discussed for the parent patents referenced above. Therefore, these patents and this application are pertinent hereto and are herein incorporated by reference.

Various types of signal processing and filtering can be utilized in the present configuration. Transformation processing; such as Fourier transforms, including discrete and fast Fourier transforms, and Walsch transforms; can be used. Correlation and convolution processing can be used. Classification can be facilitated with histogram processing, pattern processing, minimum distance processing, and cluster processing. Edge enhancement can be implemented with linear spacial filtering and various forms of edge detection processing. Image compression can be used for enhanced communication of image information. Various types of image enhancement facilitates classification and edge detection.

Classification of images facilitates formation of an image generation environment. As patterns are classified; they may be replaced, overlayed, or otherwise facilitated with image generation. Edge processing facilitates identification of edges on detected images, such as for classification and for adding to the image generation database. For example, classified images may be entered into the image generation environment with the corresponding image generation objects. However, an inability to classify an object may permit an alternate characterization thereof by detecting edges with edge processing and synthesizing an object from the detected edges for introduction into the image generation environment, possibly to be replaced later when the object or pattern can be classified. Formation of an image generation environment from the preprocessed image information is discussed herein.

Overlaying of images may be provided at a plurality of location. For example, an aircraft cockpit may have different display monitors for radar, infra-red, and visual information having different perspectives. The radar may be a side looking radar (SLR), the infra-red may be forward looking infra-red (FLIR) system, and the visual display may be a downward looking television camera. Overlaying of generated images thereon may be provided with generated images having different perspective therebetween corresponding to the different perspectives of the different acquired images being overlayed. For example, the generated image overlayed on the FLIR display may have a forward looking perspective corresponding to the FLIR display perspective; the generated image overlayed on the SLR may have a side looking perspective corresponding to the SLR display perspective; and the generated image overlayed on the downward looking television may have a downward looking perspective corresponding to the downward looking perspective of the television camera. Multiple generated images of different display monitors may be provided in accordance with the arrangements discussed herein in the section related to multiple terminals. Therefore, images having different perspectives for different overlays may be readily generated.

One overlay configuration may provide a composite of processed images and generated images overlayed therebetween to present both the processed image and the generated image for the particular object simultaneously and superimposed. An alternate configuration thereof may provide for portrayal of an overlayed processed and generated environment, where the overlaying of a generated object image over a processed object image deletes the processed object image encompassed therewith so that the environment includes processed images and generated images as alternates, not as being superimposed. This facilitates removal of a processed object image when sufficiently defined by substitution of a generated object image therefore. However, processed object images not yet identified and not yet having generated object images provided therefore may be portrayed in processed image form until a generated image can be substituted therefore.

An arrangement for superimposing 3D generated images on processed images will now be discussed. 3D generated images may be generated with methods discussed herein having rotation, translation, and occulting processing. Visible edges may be generated for overlaying on processed images. This overlaying can be performed with well known 2D notation techniques such as used with common television systems. The overlaying of edges, such as transparent surfaces and non-transparent edges or wire frame edges on processed images permits processed images to be seen through the generated visible edges. In this manner, generated images may be superimposed on processed images for simultaneous display thereof.

Alternately, in the above configuration of displaying processed or generated images, the generated images may have surfaces in addition to edges and may be superimposed on the processed images being replaced thereby and thereby occulting the processed images. Therefore, objects having generated images may show only the generated images which occult the processed images but processed images not having generated images generated therefor may not be occulted thereby and may therefore be visible. Therefore, overlaying of generated images and processed images can be provided for simultaneous presentation thereof using generated images with transparent surfaces and for alternate presentation thereof using generated images with non-transparent surfaces.

Generated And Acquired Environment Applications

Various modes of operation can be used to facilitate different operational objectives. A processed image mode permits an observer to monitor displayed processed images in an environment in processed form for evaluation without suggestions introduced by generated image overlays. An overlayed processed image and generated image mode permits an observer to obtain suggestions with the generated images to facilitate ease of interpretation of the environment and to facilitate checking validity of the generated environment for updating thereof. A generated image mode facilitates a clear display without complication by processed images and facilitates obtaining of different perspectives, such as by roaming through the environment to investigate the environment from different perspectives, and facilitates preview scenarios, such as for alerting the observer about what can be expected from an actual scenario using processed images or raw visual information. Many other uses of these modes can be provided, as exemplified with the discussions herein.

A sonar configuration will now be discussed. A general sonar environment may be configured and updated with the various methods discussed herein using sonar processed images and observer intervention and may be portrayed in processed image form, generated image form, and overlayed processed and generated image form. The environment may initially be defined by a long range search sonar, maps, and previously acquired information and may be updated by a shorter range investigation sonar and observer intervention. Sonar signals may tend to provide specular highlights instead of a pictorial representation of an environment. As the processed images are received and evaluated, they may be preliminarily classified and generated object images may be preliminarily selected therefor. As the information becomes more refined through more comprehensive investigation of the environment; updated information, such as new generated object images, may be selected in place of the preliminary generated object images and location, orientations, and sizes thereof may be updated.

Another sonar configuration will now be discussed. It may be implemented with all investigating sonar in a form of a dip sonar from a helicopter, a towed sonar from a helicopter or surface craft, an underwater remotely piloted vehicle (RPV), a manned underwater vehicle such as a submarine, or other device. As the perspective of the processed image changes, such as with motion of the sonar system, driving functions can drive the generated image perspective to track the sonar processed image perspective for overlays correspondence therebetween. As the generated image is updated to better match the processed image, the definition of the environment improves, thereby facilitating improved overlays and facilitating better generate simulated scenarios. This sonar configuration may be used for mine hunting such as for buried mines, bottom mines, and tethered mines; anti-submarine warfare; natural resource prospecting such as for nodules, oil, and minerals; oceanographic research such as mapping the ocean bottom and tracking of ocean life forms; and other applications.

An air traffic controller (ATC) configuration will now be discussed. A generalized ATC environment may be configured and updated with the various methods discussed herein using radar processed images and observer intervention and may be portrayed in processed image from, generated image form, and overlayed processed and generated image form. The environment may initially be defined by radar, topographical maps, and previously acquired information and may be updated by radar processed images and observer intervention. An ATC may be located at a display console having acquired radar information pertaining to an actual environment and having an overlayed generated environment superimposed thereon. The ATC may use operator controls; such as a light pen and keyboard; for introducing, removing, and modifying generated objects to update the generated environment. Automatic updating may also be provided, such as with driving functions for generated aircraft objects derived from the radar system tracking of those aircraft. The ATC monitoring the overlayed actual and generated environments may evaluate automatic updates and may provide manual updates in order to better match the overlayed environments. In this manner, a generated environment may be matched to an actual environment.

Availability of a generated environment facilitates novel operational scenarios for the ATC. For example, an ATC may change his perspective by panning and zooming. This provides alternate perspectives of the environment for improved visualization of the environment and improved control of the aircraft therein. For example, if the relationship between two aircraft, or between an aircraft and the airport, or between an aircraft and an obstruction is not clear from radar images; the ATC may change his perspective by roaming through the environment, such as with with panning and zooming, until he is better able to evaluate the circumstances.

The ATC may operate from either the processed (radar) image, or the generated image, or a combination thereof as his normal mode of operation. When additional information is needed for different perspectives, the generated image mode can be selected for roaming through the environment until the desired visual information is obtained. The normal mode of operation may then again be selected. In one configuration, the normal mode may be the overlaying of the generate environment on the radar-derived processed environment to simultaneously provide to the ATC information contained in both, the radar processed image and the generated image. This facilitates updating of the generated image such as in preparation for switching to a generated image mode to investigate the environment from different perspectives. In the overlay mode, various generated images may assist the ATC in rapidly evaluating the environment. For example, an aircraft symbol superimposed on a radar blip facilitates rapid identification of the blip by the observer. Similarly, rapid identification can-be enhanced by superimposing generated objects representative of building, runways; obstructions, and other objects on the related blips.

An ATC may better perform his tasks if he can perceive the image seen by the pilot in a controlled aircraft. Consequently, the ATC may be able to select a pilot mode for displaying a generated image of a cockpit environment and a cockpit perspective of an aircraft being controlled. The ATC may be able to monitor the landing approach, ground environment, and objects in that environment including other aircraft from the pilot's perspective. This could be an important aid for control of aircraft with an ATC and for training of ATCs.

The above discussed ATC features and operations may be adapted to other applications, exemplified with the other applications discussed herein.

An aircraft approach configuration will now be discussed. An aircraft approach may be for landing, attack, or other such purpose. A generated approach environment may be configured and updated with various methods discussed herein using processed image from various sensors such as radar, infra-red, television, instrument landing systems (ILS), and others and using observer intervention. Information may be portrayed in processed image form, generated image form, and overlayed processed and generated image form. The environment may initially be defined with processed images from radar, infra-red, topographical maps, battlefield observers, and previously obtained information and communicated to the aircraft or pre-stored in the database. It may be updated by an aircraft-based radar and observer intervention. The pilot can fly in response to a processed image display, a generated image display, or a superimposed processed and generated image display. The pilot can fly simulated scenarios using the generated images in order to investigate alternate landing patterns or alternate attack scenarios and can fly simulated preview approaches to evaluate a selected approach and to be alerted to conditions and circumstances that may be encountered in advance. A preview approach may result in modification of the prior approach or selection of new approach based upon observations.

An attack aircraft configuration operating in a tank battlefield environment will now be discussed. Sensors may include a search radar on the attack aircraft, a fire control radar on the attack aircraft, a forward looking infra-red (FLIR) system, an observer aircraft, a ground observer, and many other sources. The location and characterization of objects; including tanks, trucks, command posts, and others; can be located and characterized. The location and characterization can be used to construct the environment in the image generation system. The image generation driving functions from the motion of the attack aircraft will maintain the displayed environment consistent with the actual aircraft dynamics. Also, input data can be used to update the environment, such as radar data and motion of objects in the environment. The generated images can be presented as superimposed images; such as projected onto cockpit windows, superimposed on a radar or FLIR display, or otherwise presented to the aircraft crew. Another driving function may be an observer line-of-sight driving function; which may be detected by an observer head position and eye direction sensor. For example, a pilot looking through a cockpit window may see projected thereon a generated image of the environment superimposed on the actual visual environment to facilitate his evaluation of the actual environment.

Objects in the generated image may be identified with colors, shapes, symbols, and other identifying characteristics. For example, tanks identified as having been neutralized may be identified with symbols; such as X-symbol, a green color, or a broken tank symbol.

If the observer were to rotate his head to change his perspective, this could provide a driving function input to drive the objects to portray the environment from this new perspective.

An observer control may be used to match generated images with actual images to better index or line up the images. This indexing control may generate a driving function to drive the generated image into coincidence with the actual image.

The observer may change his generated image perspective to better investigate the environment without changing his actual image perspective. For example, if the pilot of the above discussed attack aircraft wants to evaluate different attack scenarios, the generated image could be panned and zoomed to provide the pilot a perspective related to a scenario for evaluation. Also, if the pilot wants to evaluate the environment behind a large hill (which was placed in the generated image environment) that obscured his vision, he could pan and zoom into a perspective that provides the desired visual information as a generated image without the need to actually fly to that perspective.

In the above example, external inputs can be used to construct the environment, including placement of objects contained in the database and placement of objects synthesized during operation. The source of the environmental information might be a military command post which receives environment information from surveillance and other sources, constructs the environment in generated image form, and then communicates this image generated environment over a digital communication link to the image generation system. For example, the communication link may be a command link to a forward command post, a microwave data link to a satellite for wide area repeater operation, a radio communication link to an attack aircraft, and other arrangements.

Different sources of actual images may have different perspectives. For example, a pilot's perspective through a cockpit windshield, an FLIR, an attack radar, and a side looking radar (SLR) may all have different perspectives. However, the image generator can generate multiple environment images providing correspondence for the multiple actual images. For example, one environmental image may be generated on the cockpit windshield from its perspective, another on the FLIR display from its perspective, another on the side looking radar display from its perspective, and another on the attack radar display from its perspective.

A tank configuration will now be discussed. A generalized tank environment can be configured and updated with the various methods discussed herein using radar processed images and observer intervention and may be portrayed in processed image form, generated image form, and overlayed processed and generated image form. The environment may be initially defined by long range search radar, topographical maps, battlefield observers, and previously acquired information and may be updated by tank-based radar, infra-red sensors, and observer intervention. The limited field-of-view of a tank periscope may degrade the ability of a tank crew to properly evaluate a battlefield environment. Therefore, a generated image of the battlefield environment can provide an important perspective of the whole battlefield environment to facilitate decision making and control. Various perspectives can be used including an air view perspective for evaluation of different attack scenarios and preview scenarios to alert and condition a crew to the situations that may be encountered during a selected attack scenario.

An environmental investigation configuration will now be discussed. An investigation system may perform surveillance, reconnaissance, and intelligence operations. A generalized environmental investigation system may be configured and updated with various methods discussed herein; such as using radar, infra-red, and television processed images and observer intervention and may be portrayed in processed image form, generated image form, and overlayed processed and generated image form. The environment may initially be defined by radar, topographical maps, observers, and previously acquired information and may be updated by investigation radar and observer intervention. In an aircraft investigation configuration, a pilot can fly various scenarios to investigate portions of the environment and receive processed information related thereto. The processed information may be used to update the generated environment automatically and with observer intervention. Portions of the environment that are not properly defined may be further investigated by the pilot flying investigatory scenarios to acquire information to update that portion of the environment. This investigatory configuration may be used to provide generated image information for systems operating in conjunction with that environment; including systems operating in the environment, such as tanks and aircraft in the battlefield environment, and systems operating outside of the environment, such as a remote command post.

A plotting board configuration, such as for a military command post, will now be discussed. A generated plotting board environment may be configured and updated with the various methods discussed herein, such as using radar processed images and observer intervention. Also, an investigatory system such as discussed herein may be used to provide information for the plotting board. Information may be portrayed in processed image form, generated image form, and overlay processed and generated image form. The environment may initially be defined by radar, topographical maps, and previously acquired information and may be updated by investigatory system inputs and observer intervention. A plotting board can be used for military command posts, mine hunting, construction, fire fighting, and other applications. It can provide a centralized command post to coordinate activities and to provide cognizance by command level personnel. It can also acquire image information from various sources to provide comprehensive environmental information and distribution thereof to remote sources over a communication link, such as discussed with reference to FIG. 21A herein.

The 3D terrain configuration discussed herein in the section related thereto has been discussed in the context of a physical 3D presentation in a visual system. The visual system therein can be implemented with the environmental presentation herein. Entering of topological information and information related to objects in the environment can be used to generate a visual plotting board type of presentation at a command post and can be communicated to remote locations; such as remote command posts, attack aircraft, tanks, and other remote locations for presentation thereto. Presentation thereof may be from a perspective related to the actual location and orientation of the remote location. Alternately, the perspective may be controlled by the observer to provide a desired perspective, such as for visually investigating a simulated environment.

A medical configuration; such as a radiology, computer aided tomography (CAT), or ultra-sound configuration; will now be discussed. A generated medical environment, such as an image of a patient, can be configured with various methods discussed herein by using X-ray, ultra-sonic, and other images and medical observer intervention; which may be portrayed in processed image form, generated image form, and overlayed processed and generated image form. The environment may initially be defined by X-rays, sonar, biological models, and previously acquired information and may be updated by X-ray, sonar, and medical observer intervention. Generated object images may be internal organs, bones, muscles, and other biological objects. As processed images of objects are identified, they may be overlayed or substituted with generated object images.

A crew station configuration; such as a crew station of an aircraft, a surface vehicle, or an oceanic vehicle will not be discussed. A generated crew-related environment may be configured and updated with the various methods discussed herein using the various processed images and observer intervention, such as discussed herein, and may be portrayed in processed image form, generated image form, and overlay processed and generated image form. The environment may be initially defined and updated as discussed herein for other vehicular applications. Crew stations may include navigator, engineer, fire control, and other stations and may have display systems appropriate thereto which can be configured from the teachings herein, such as from teachings related to the pilot station for an aircraft.

A terrain-related configuration, such as for mapping and navigation, will now be discussed. A generated terrain environment may be configured and updated with various methods discussed herein using radar, infra-red, television, celestial, and other processed images and observer intervention. This environment may be portrayed in processed image form, generated image form, and overlayed processed and generated image form. The environment may initially be defined by radar, maps, and previously acquired information and may be updated by radar, sonar, and observer intervention. The 3D aspects of the terrain may be particularly valuable for low level conditions; such as under terrain clearance control of a terrain clearance radar, and for low level approaches; such as for landing, attack, and investigation.

A seismic configuration will now be discussed. A generated seismic configuration may be generated and updated with various methods discussed herein using seismic processed images and observer intervention and may be portrayed in processed image form, generated image form, and overlayed processed and generated image form. The environment may initially be defined by seismic signals, underground maps, and previously acquired information and may be updated by seismic investigation and observer intervention. The underground environment can be portrayed in the form of underground objects and areas including rocks, layers, salt domes, and other underground structures. This environment can be investigated with seismic signals to better characterize portions thereof. A seismologist can visually roam through the underground environment to investigate and characterize this environment. This seismic environment may be used for oil and gas exploration, mineral exploration, earthquake exploration, and other purposes.

A remotely piloted vehicle (RPV) configuration will now be discussed. A generated RPV environment may be configured and upgraded in various methods discussed herein using radar, infrared, television, and other processed images and observer intervention and may be portrayed in processed image form, generated image form, and overlayed processed and generated image form. The environment may initially be defined by investigatory systems and previously acquired information and may be updated by radar and television information from the RPV and observer intervention. The observer may be a ground-based observer piloting a RPV. The RPV may be controlled to investigate an environment which can be monitored by a ground-based observer for controlling the RPV. Also, the displayed environment may be used to guide an RPV to a target or an area for surveillance.

A spacecraft configuration; such as a manned spacecraft, unmanned spacecraft, or satellite; will now be discussed. A generated space-related environment may be configured and updated with the various methods discussed herein using radar and optical processed images and observer intervention and may be portrayed in processed image form, generated image form, and overlayed processed and generated image form. The environment may initially be defined by radar, maps, ephemeris charts, and previously acquired information and may be updated by a visual image and observer intervention. Images portrayed may be space bodies; such as planets, stars, and asteroids; and may include other spacecraft and man-made objects. Also, the features of the aircraft embodiment discussed herein may be applicable to this spacecraft configuration, such as for lower altitude spacecraft operations during launch and landing.

An observer configuration, such as a forward observer on foot or in a vehicle or an observer with an infantry unit, will now be discussed. A general ground-based observer environment may be configured and updated with various methods described herein using visual observations and observer intervention and may be portrayed in processed image form, generated image form, and overlayed processed and generated image form. The environment may initially be defined by a database preloaded into the system, maps, and previously acquired information and may be updated by visual observations and observer intervention. This configuration may be implemented in backpack form or with a vehicular carrier for transporting with the observer. As observations are made, updates may be entered. At appropriate times, environmental information may be communicated to a remote destination, such as a command post.

Vehicle Training System

An improved vehicle training system will now be discussed. A vehicle trainer may be a pilot trainer for an aircraft, such as a fixed wing aircraft or helicopter; a driver trainer such as for an automobile; a driver trainer for a military tank; an officer trainer for a submarine; or other vehicle training systems. Such systems will be illustrated with a plot training system discussed thereafter.

A pilot training system can be provided with the arrangement shown in FIG. 1A. Host system 102 can provide scenario information and simulation information. Visual system 100 can provide images of the external environment and cockpit instrument images. In one configuration, a dual visual system arrangement may be provided having environment display monitor 120 for displaying an external environment, such as an airport for training of takeoffs and landings, and a cockpit display monitor 120 for displaying cockpit devices, such as flight instruments. High flexibility is provided including the capability to change the external environment to correspond to different airports and to change the cockpit display to correspond to different aircraft. Instrument functions can be driven by the same driving functions discussed herein to drive the visual external environment display. For example, instruments; such as a compass, an artificial horizon, an instrument landing system (ILS), and other instruments; can be portrayed visually to provide the desired representation of the driving functions to track the changes in the external environment displayed on the environment monitor.

Instrument objects can be provided in the database in the form of well known configurations; such as a compass, an artificial horizon, a tachometer, an air speed indicator, and other cockpit instruments. These instrument objects can be displayed on a cockpit display monitor to simulate instrument placement in the form of a particular aircraft cockpit being simulated. Different placements of standard instrument objects can be used to simulate different aircraft cockpits.

In a low cost training simulator, host system 102 can be integrated with visual system 100 to reduce costs. Geometric processor 130 in real time processor 126 provides an efficient implementation for instrument simulation, vehicle dynamic simulation, and other related continuous applications. For example, the system can be provided in a common set of racks having common power supplies and common overhead structure for mounting together host system 102 and visual system 100. Supervisory processor 125 and real time processor 126 can perform host computer operations in addition to visual processor operations. For example, simulation of aircraft instrument operations can be performed with an incremental geometric processor in real time processor 126. Also, aircraft dynamics can be simulated with an incremental geometric processor. Therefore, operations associated with host system 102 can be integrated into visual system 100 to reduce system complexity and cost.

Terrain Presentation

Terrain presentation, such as a background map image, may be desireable for many applications, such as for an aircraft application. For example, it may be desireable to portray terrain for training, navigation, attack, and other scenarios. Terrain information is readily available in the form of topographical maps, documentation developed by the Defense Mapping Agency (DMA), and other sources. However, this information may be voluminous, where reducing map type information to database form may require a large database memory. Therefore, an alternate embodiment of terrain information for displays will now be discussed. This terrain display embodiment is exemplary of other display embodiments such as backdrops for other types of scenes and for other applications.

An optical backdrop arrangement will now be discussed in the form of a terrain backdrop. A backdrop for an airborne scene may be the ground terrain. The ground terrain may be available in map form, which may be provided on an optical medium such as microfilm, photographic slides, or other media. This optical medium can be used to optically or electronically provide the backdrop. An optical backdrop image may comprise projecting of the optical image onto the display medium, such as implemented with plasma displays manufactured by Interstate Electronics Corporation of Anaheim, Calif. Alternately, an electronic backdrop image may be provided by scanning an optical image such as with a Vidicon scanner to convert an optical backdrop image to electronic signal form. The electronic signal can be input to the display signals as a video backdrop presentation, where generated images are superimposed thereon. This electronic backdrop arrangement may be similar to the overlaying of generated images on processed images discussed herein. Alternately, other methods of providing a backdrop may be used such as storing of terrain information in the database for presentation as a backdrop. 3D Terrain Presentation A 3D terrain presentation can be provided in accordance with the system of the present invention to enhance terrain-related activities, such as a pilot plotting a course over terrain and such as army officer planning and executing a battle. Many activities involve map-related operations, such as following topographical lines of terrain on a topographical map. A map is a 2D presentation that degrades a 3D perspective. The instant feature of the present invention is directed to providing an improved 3D perspective, such as in conjunction with a topographical map. For simplicity of discussion, the instant feature of the present invention will be discussed with reference to two configurations, a terrain following configuration for a CRT visual system and for a cutting machine generating a 3D topological model. These configurations are illustrative of the general terrain presentation feature of the present invention.

Figure 20:
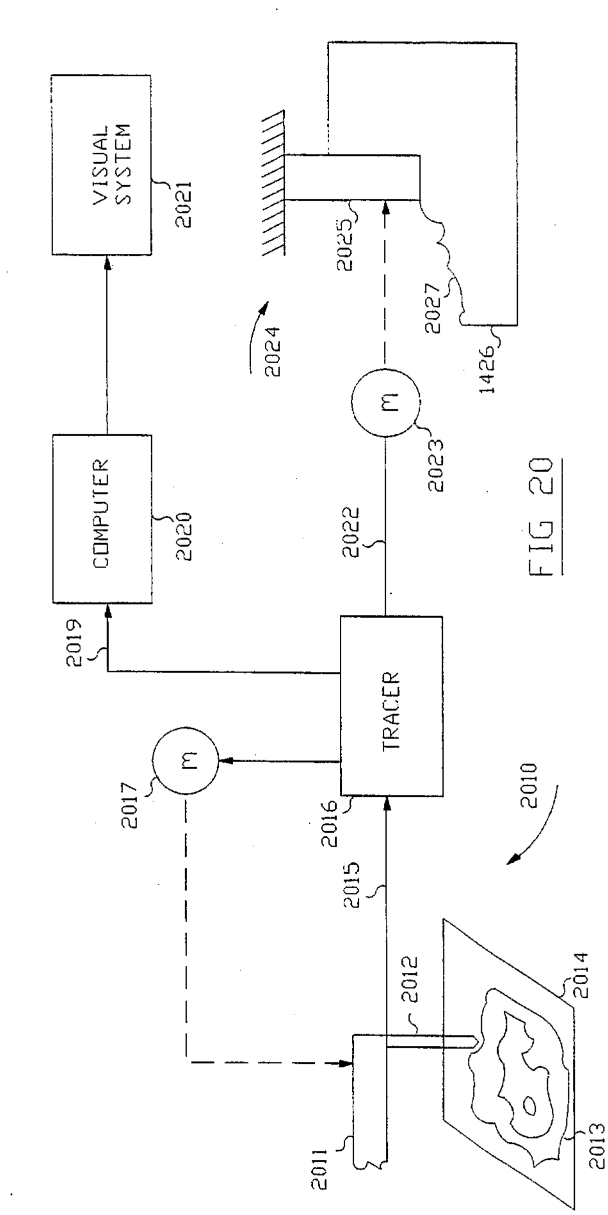
FIG. 20 illustrates an arrangement for generating three-dimensional models and displaying three-dimensional images using a tracer arrangement.
Figure 21:
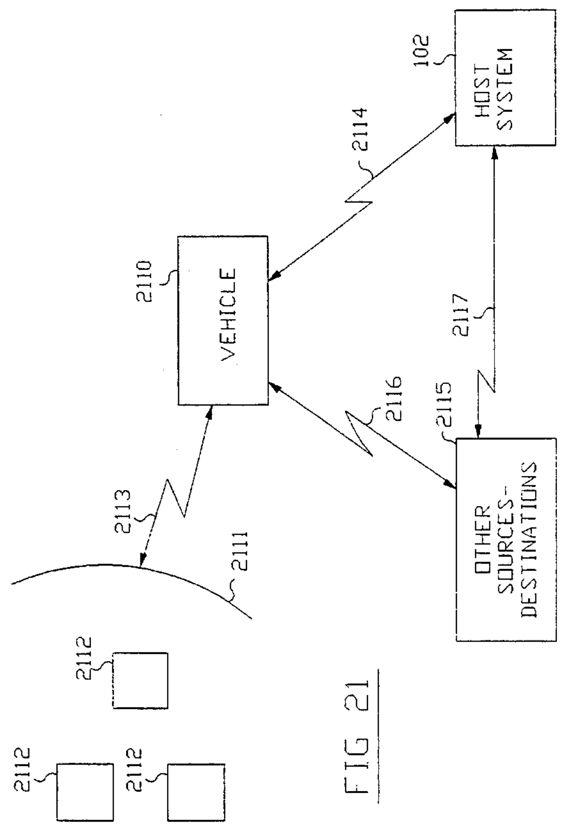
FIG. 21 is a block diagram representation of vehicular applications.

An arrangement for tracing topological lines on a topological map will now be discussed with reference to FIG. 20. A tracing machine 2010 may include mechanical structure 2011 connected to a tracing head 2012. Tracing head 2012 contains a sensor, such as a photo-electric sensor for tracing terrain line 2013 on topological map 2014. Output signals 2015, which are related to tracing of the lines, are generated with sensor 2012 for controlling tracer 2016. Tracer 2016 can control motor 2017 to position sensor 2012 in response to control signal 2017 to position sensor 2012 in response to control signal 2018 from tracer 2016. Therefore, tracer 2016 controls sensor 2012 to translate along a terrain line 2013 on topological map 2014. Tracer 2016 may digitize the motion signal 2015 to generate digitized signal 2019 to computer 2020 for display of terrain information with visual system 2021. Alternately, tracer 2016 may generate control signal 2022, such as to motor 2023, for controlling a machine, such as milling machine 2024, to drive cutter 2025 to cut the terrain pattern on material 2026.

In the visual system configuration, tracer 2016 may be controlled to trace a plurality of terrain lines 2013 and computer 2020 may sense the terrain line digital signal 2019 for displaying the terrain in a 3D perspective form with visual system 2021. Although visual system 2021 is a 2D perspective of a 3D terrain; an operator, such as an army officer, can operate visual system 2021 to get a 3D perspective, such as by translating and rotating the terrain with a display on visual system 2021 in a 3D perspective. Also, visual system 2021 may display objects on the terrain not contained on the topological map. For example; tanks, soldiers, troops, trees, and other objects may be superimposed on the terrain displayed with visual system 2021. In this way, an army officer may plan or control army activities with a 3D perspective, providing an important improvement over 2D topological maps.

In an alternate configuration, tracer 2016 may control cutting machine motor 2023 to drive cutter 2025 over a material 2026 to cut a terrain pattern 2027 to provide a full 3D model. Material 2026 may be a type of polyurathane for lightweight, rigidity, and ease of cutting. Alternately, material 2026 may be other materials; such as wood, metal, rubber, plaster, plastic foam, etc. In one configuration, terrain model 2026 may be a large scale model and may not be cut in one piece but in a plurality of pieces with cutter 2025. In this configüration, material 2026 may be cut in sections, where the sections may be connected together to provide the complete model. In this configuration, tracer 2016 may store the terrain information derived from sensor 2012. Then, tracer 2016 may control motor 2023 to cut sections of the terrain, consistent with the size of material 2026.

Controls may be provided to permit an operator, such as an army officer, to move objects around the terrain. Use of a light pen, touch panel, keyboard, cursor, and other operator controls may be used to identify objects to be moved and the location therefore.

The arrangement discussed with reference to FIG. 20 may be enhanced by interpolating between terrain lines on topological map 2014. This may be provided with the fairing contour discussed in patent application Ser. No. 232,459 referenced herein.

In an alternate configuration, photo-optical line follower and tracer 2010 may be a photo-optical line follower, such as used on flame cutter machines. The output of line follower 2010 can be connected to a tracer machine, such as a tracer milling machine, for cutting surface 2026 or can be connected to a digitizer, such as implemented with computer 2020, for digitizing information. Digitized information can be used to drive a numerical control machine tool to cut the surface 2026 or can be used by computer 2020 for presentation on visual system 2021 in visual form.

Pattern Recognition

The system of the present invention can be used for enhanced pattern recognition applications. Recognition of patterns is often achieved by matching an acquired pattern with a reference pattern. Pattern recognition is often complicated by the perspective of the acquired pattern being different from the perspective of the stored pattern. For example, a pattern of a part in an automotive assembly operation will vary as a function of the location, orientation, and distance of the part from the monitoring image processing system. Pattern recognition can be enhanced with the ability to change the perspective of the reference information to better match the perspective of the part. For example, a generated image can be closely matched to a related processed image by translating, rotating, and scaling the generated image to overlay the processed image; such as discussed in the sections for Acquired Environment Applications and Generated And Acquired Environment Applications herein. The generated image can be matched to the processed image with automatic driving functions and with observer generated driving functions. Automatic driving functions can be generated from external sources, image processing, and other forms. External feedback signals can be derived from external sensors, such as position transducers on a robot and on a transfer line to generate the relative positions therebetween. The relative positions permit characterizing the perspective of the processed image for driving the perspective generated image to provide a match. For example, driving functions can be derived from a comparison of the processed image and generated image to drive the generated image to better match the processed image. Driving functions can also be generated with operator intervention, such as with an operator monitoring a superimposed processed image and generated image on a display monitor; as discussed in the sections Acquired Environment Applications and Generated And Acquired Environment Applications herein; and using operator controls to match the generated image with processed image.

Image generation capability can be used to generate image information for matching with a processed image. The generated image can be rotated, scaled, translated, and otherwise adjusted to match a processed image to be recognized. When an acceptable match is obtained or a best match is obtained between a generated image and a processed image, a figure-of-merit can be calculated relative to the degree of match therebetween, such as with correlation processing as discussed in U.S. Pat. No. 4,209,843. Matching between processed images and generated images can be used for control; such as controlling a robot to be oriented with respect to a device to be operated upon, controlling an aircraft to fly a ground path over mapped terrain, or other such arrangement.

An operator may be located at a display having processed and generated images displayed thereon. The operator can intervene by using operator controls, such as a joystick, to move the generated images and the processed images into desired relative positions. This may be used for initial condition generation to provide initial matchup for subsequent tracking, or may be performed as-required, such as if automatic lockon cannot be achieved, or otherwise. A single operator can operate a plurality of terminals, monitoring and intervening when necessary. The system may not need continuous intervention, where automatic tracking can be used for normal operation.

Automatic Operations

Automatic operations can be enhanced with a visual system generating images for use in combination with acquired and processed images, such as for automatically performing tasks. A robotic application is discussed herein, which is intended to be exemplary of other applications that may not be robotic oriented; such as vehicular, medical, design, simulation, and other applications. For simplicity of discussion, this feature may be discussed in the form of a robotic control arrangement for use on a production line. Other applications are also discussed herein.

One configuration may be in the form of a 2D to 3D image generator. Acquired information that is preprocessed may be considered to be 2D information, such as video information portrayed on a CRT or organized in an image memory. Classification, identification, and matching of objects therein facilitates fetching of a generated 3D object derived from a database corresponding thereto and placing that 3D generated object in a 3D image generated environment. Therefore, the image generated environment may be a 3D representation of a 3D actual environment received as a 2D acquired image. This permits reconstruction of the 3D nature of an actual environment and portrayed thereof with a generated environment, notwithstanding the 2D nature of the acquired information.

Generation of an image environment facilitates robotic operations. A generated environment can provide various views, perspectives, scenarios, clarifications, and adaptations of an actual environment together with an actual environment or in place of an actual environment. A generated environment has many advantages, such as being independent of actual conditions including production line contaminants and robot dynamics; thereby permitting different perspectives and different scenarios to be generated independent of an actual perspective or scenario. It can also provide other valuable capabilities to aid a robot.

A data acquisition "front end" may be provided for generating actual environment information. The use of actual environment image information in combination with generated image information provides important capabilities therewith. For example, a video system can present actual environmental information as raw video information or as preprocessed video information and an image generation system can provide generated images superimposed thereon to aid in matching the video images. In one configuration, a signal acquisition system can acquire actual environmental information, which can be preprocessed (such as with filters, classifiers, and identifiers) to provide actual environmental information to the image generation system. The image generation system can match this actual environmental information with generated environment information for control, operation, investigation, classification, identification, and other purposes. An observer can use the visual display capability to control operations in the environment; such as to program robotic operations from different perspectives and with different scenarios to better define the robotic scenario.

A description of an exemplary vehicular scenario has been discussed herein with reference to FIG. 21A in the configuration of an image generation and combined image generation and image processing system. A description of a robotic configuration having a combined image generation and image processing capability will now be discussed. A robot 2110 may receive environmental information 2113 with sensors, such as video sensors, as indicative of the actual environment 2111. Acquired image information 2113 may be preprocessed, such as with filtering and other processing techniques discussed herein to provide preprocessed actual environmental information, which may then be matched with generated images related to the environment for use in pattern recognition and control.

Driving functions may be provided by internal or external devices. For example, host system 102 (FIG. 1A) can provide translation, rotation, and scaling driving functions for the generated images to cause them to match or align with the processed images. Host system 102 may provide driving function updates based upon independent or external analysis of the environment, such as feedback from the matching processing. Robot 2110 may feedback acquired environmental information to host system 102 over communication link 2114 and may receive updated command information from host system 102 over communication link 2114 (FIG. 21A). Received environmental information may be used to control the generated environment in robot 2110 to better match the actual environment and to facilitate robotic operational scenarios.

The arrangement discussed herein may be used in various types of devices having various types of acquisition systems. Devices include robots (i.e.; production line robots and free moving robots); remotely piloted vehicles (i.e.; aircraft, undersea and land based); and other devices. The actual environment may be determined through various systems such as video, scanners (i.e. CCDs), infra-red, visual, sonar, and command link systems. Many embodiments may not require a local observer; such as a system for automatically acquiring actual environmental images, automatically generating and updating generated images, and automatically transmitting updated generated image information to a remote location for analysis or for display.

Construction of a generated environment may be performed in accordance with the means and methods discussed in the section herein related thereto. Generated images may be moved within the environment in accordance with the means and methods discussed in the section herein related thereto.

Single sources of processed images may be discussed herein for simplicity of discussion. However, multiple sources or processed information may also be used and may provide advantages for certain applications. For example, in a robotic environment sources of processed images may include video, ultrasonic, observer, vision, and others. Multiple sources may be used together simultaneously to better characterize the environment and to better achieve matching between processed images and generated image. For example, many sources of processed images may have different perspectives. Different perspectives can be reconciled with generated images which can be rotated, translated and scaled to provide the desired perspective. Multiple perspectives of the same environment can be generated simultaneously, such as in accordance with the multiple terminal capability discussed herein in the section related thereto. Therefore, each of multiple monitors can have portrayed thereon processed images, generated images, and combined processed and generated images; such as discussed herein for a single processed image source. Use of multiple perspectives simultaneously with multiple sources of processed images facilitates improved matching of the generated images to the actual environment.

Combining of acquired images and generated images provides important advantages. For example, a processor can match the generated image with the acquired image. Also, a processor may better classify, recognize, identify, and otherwise evaluate objects by comparing acquired and generated images. For example, a generated image object can be selected for comparing with a pattern in an acquired image environment. The selected generated image can be scaled, rotated, and translated to obtain a match with the processed image. Such matching may be performed with various different generated images to determine the best match. The generated object that best matches the pattern in the acquired image may be used for representation of the acquired image pattern.

The acquired image pattern may be used to fill objects in the generated image environment with acquired images so that an observer has the benefit of the clearly defined and easily recognizable generated images superimposed on actual patterns acquired from the actual environment. This arrangement of both acquired and superimposed generated images facilitates observer intervention and facilitates precise matching of a generated image to an acquired image. Matching can be performed from different perspectives to facilitate image generation accurately representing the acquired actual environment. Such a precise generated representation of an actual environment can be of significant value in many applications; such as identifying, controlling, and otherwise using an environment. For example, a robot can use this matching method for control.

Observer intervention may be provided to enhance pattern recognition. Observer intervention can be provided by use of a visual terminal, such as discussed in the sections Acquired Environment Applications and Generated And Acquired Environment Applications herein. Preprocessing, processing, and filtering of acquired signals is discussed in the section Acquired Environment Applications herein.

In a robotic application, as the perspective of the processed image changes, such as with motion of a robot system; driving functions can drive the generated image perspective to track the processed image perspective for overlay correspondence therewith. An observer may be located at a display console having acquired information pertaining to an actual environment and having an overlayed generated environment superimposed thereon. Automatic updating can be provided, such as with driving functions for generated aircraft objects derived from video processed images. The observer may intervene using operator controls, such as a light pen and keyboard, for modifying generated objects to update the generated environment. The observer monitoring of the overlayed actual and generated environments may evaluate the automatic updating and may provide manual updates therefore in order to better match the overlayed environments. In this manner, a generated environment may be matched to an actual environment.

CROSS REFERENCE TO PERTINENT MATERIALS

Textbooks

Various textbooks supplement the disclosure herein; being listed below and being incorporated herein by reference.

1. Perception of Display Data by R. H. Cornsweet.
2. Methods For Solving Engineering Problems by Leon Levine for McGraw Hill (1964).
3. Digital Computer Design by Edward L. Braun for Academic Press (1963).

Articles and Patents

Various articles and other published materials supplement the disclosure herein; being listed below and being incorporated herein by reference.

1. The Computer Graphics Revolution by Eric J. Lerner; IEEE Spectrum; Feb. 1981; pages 35–39.
2. Fast Graphics Use Parallel Techniques by Eric J. Lerner; IEEE Spectrum; March 1981; pages 34–38.
3. Video Display Processor Simulates Three Dimensions by Karl Guttag et al; Electronics; Nov. 20, 1980; pages 123–126.
4. Compu-Scene-Modular Approach To Day-Night Computer Image Simulation by R. R. Raike; Advanced Visual Systems; General Electric Co.; Daytona Beach, Fla. 32015.
5. The Use of Greyscale For Improved Raster Display Of Vectors And Characters by Franklin C. Crow; University of Texas; Austin, Tex.
6. The Aliasing Problem In Computer-Generated Shaded Images by Franklin C. Crow; Communications Of The ACM; Nov. 1977; pages 799–805.
7. Digital Image Anomalies; Static And Dynamic; SPIE volume 162; Visual Simulation & Image Realism; 1978; pages 13–15.
8. A Hidden Surface Algorithm With Anti-Aliasing by Edwin Catnull; Computer Graphics Laboratory; New York Institute of Technology; Old Westbury, N.Y.
9. Computer Graphics: Reading The User by Ware Myers; IEEE Computer; March 1981; pages 7–17.
10. A New Approach To CGI Systems by Wilhelm Dichter et al; Technical Conference at Salt Lake City; Nov. 18, 1980.
11. The Continuing Quest For 3-D Television by Nicolas Nokhoff; IEEE Spectrum, Feb. 1981; pages 48–51.
12. Electrically Alterable Digital Differential Analyzer; U.S. Pat. No. 3,586,837 issued on Jun. 22, 1971 by Gilbert P. Hyatt and Eugene Ohlberg.

Disclosure Documents Various features disclosed herein were disclosed in the following disclosure documents filed in the U.S. Patent and Trademark Office (PTO):

1. Disclosure Document No. 099,319 filed on Apr. 16, 1981;
2. Disclosure Document No. 100,319 filed on May 18, 1981;
3. Disclosure Document No. 100,843 filed on Jun. 17, 1981;
4. Disclosure Document No. 101,599 filed on Jul. 20, 1981;
5. Disclosure Document No. 102,238 filed on Aug. 17, 1981;
6. Disclosure Document No. 102,867 filed on Sep. 17, 1981;
7. Disclosure Document No. 103,318 filed on Oct. 8, 1981;
8. Disclosure Document No. 104,055 filed on Nov. 9, 1981;
9. Disclosure Document No. 104,507 filed on Nov. 30, 1981;
10. Disclosure Document No. 105,339 filed on Jan. 12, 1982;
11. Disclosure Document No. 106,056 filed on Feb. 12, 1982;
12. Disclosure Document No. 106,697 filed on Mar. 10, 1982;
13. Disclosure Document No. 107,525 filed on Apr. 12, 1982;
14. Disclosure Document No. 108,347 filed on May 17, 1982;

15. Disclosure Document No. 109,065 filed on Jun. 18, 1982;
16. Disclosure Document No. 109,837 filed on Jul. 19, 1982;
17. Disclosure Document No. 110,457 filed on Aug. 17, 1982;
18. Disclosure Document No. 111,128 filed on Sep. 16, 1982;
19. Disclosure Document No. 111,980 filed on Oct. 21, 1982;
20. Disclosure Document No. 112,841 filed on Nov. 22, 1982;
21. Disclosure Document No. 113,628 filed on Dec. 27, 1982;
22. Disclosure Document No. 114,269 filed on Jan. 26, 1983;
23. Disclosure Document No, 115,301 filed on Mar. 2, 1983;
24. Disclosure Document No. 116,392 filed on Apr. 14, 1983;
25. Disclosure Document No. 117,613 filed on May 27, 1983; which disclosure documents are herein incorporated by reference.

The above listed disclosure documents No. 1 and No. 2 have already been retained by the PTO.

The above listed disclosure documents No. 3 through No. 25. should be retained in accordance with MPEP 1706. These disclosure documents were properly filed in accordance with the PTO requirements. The present patent application is being filed less than two years from the filing date of said disclosure documents No. 3. through No. 25. Hence retention of these disclosure documents is appropriate.

EDGE PROCESSOR TABLES

SURFACE-I GRAPHICS

```
#.............................................................
..............................................................
..............................................................
..............................................................
................................21E5..........................
...............................355D5..........................
..............................41.1C5..........................
.............................65..5B5..........................
............................71...5A55.........................
...........................95.....585.........................
..........................B5.......175........................
.........................C5.........565.......................
........................D1..........5555......................
.......................F5............535......................
.....................1.1.............525......................
....................115.......................................
...................135...............1.5......................
..................155.................5F4.....................
.................161...................5E4....................
................185...........................................
...............1A5.....................1C4....................
..............1B5.......................5B4...................
.............1C1.........................594..................
.............1D5..............................................
.............1E55151.....................174..................
................12345.5...................564..................
...............222225171.55151.............144................
....................2628.ABCDE5.5..........534................
.....................2.2.22222F111.55151...124................
..............................2.32.456785.5.514...............
...............................3.3.3333391B1.1F3..............
........................................3A3C.E................
.........................................3.3.3................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
..............................................................
```

SURFACE-I SID COMMANDS

```
*
#
#S.ETST1
345E FE
345F 00 .
#S.ETST2
3464 FE
3465 3C 34
3466 D0 .
#
#S.TEST1B
341D CD
341E 39 5B
341F 34 .
#S.TEST1D
342A CD
342B 47 5B
342C 34 .
```

```
#                       EGEN
...XP.YO.YS.YD.YN.XS.XP.XW.F1.CF.F7.F3.F4.YR.XR.F2.KI..........
.1.22..4..4..A.A..22..9.7..6...8.41..8.........DD.............
.2.22..4..4..A.A..21..9.7..4...8.41.A4....A..7..CC.2...........
.3.21..5..5..A.A..2...9.7......8.41.E1....4..E..BB.61..........
.4.2...6..6..9.A..1F..8.7..4...8.41.EE....8..C..DD.61..........
.5.1F..7..7..9.A..1F..8.7......8.41.4F....2..3..BB.41..........
.6.1F..7..7..9.A..1E..8.7......8.41.AB....C..A..CC.2...........
.7.1E..8..8..8.A..1E..7.7..4...8.41.48....6..1..DD.41..........
.8.1D..9..9..8.A..1D..7.7......8.41.C5.......8..BB.43..........
.9.1D..9..9..8.A..1C..7.7......8.41.A1....A..F..CC.2...........
.A.1C..A..A..7.A..1C..6.7..4...8.41.42....4..6..DD.41..........
.B.1C..A..A..7.A..1B..6.7..4...8.41.AE....E..D..CC.2...........
.C.1B..B..B..7.A..1B..6.7......8.41.4F....8..4..BB.41..........
.D.1A..C..C..6.A.;1A..5.7..4...8.41.C8....2..B..DD.43..........
.E.19..D..D..6.A..19..5.7......8.41.C5....6..9..BB.43..........
.F.19..D..E..6.A..19..5.7......8.41.56.........CC.1............
1..18..E..E..5.A..18..4.7..4...8.41.82....A..7..DD.42..........
11.17..F..F..5.A..17..4.7......8.41.CF....4..E..BB.43..........
12.16.1..1...4.A..16..3.7..4...8.41.C8....8..C..DD.43..........
13.16.1..11..4.A..16..3.7..4...8.41.59....2..3..CC.1...........
14.15.11.11..4.A..15..3.7......8.41.85....C..A..BB.42..........
15.15.11.12..4.A..15..3.7......8.41.56....6..1..CC.1...........
16.14.12.13..3.A..14..2.7..4...8.41.D3.......8..DD.52..........
17.13.13.13..3.A..13..2.7......8.41.8F....A..F..BB.42..........
18.13.13.14..3.A..13..2.7......8.41.5C....4..6..CC.1...........
19.12.14.14..2.A..12..1.7..4...8.41.88....E..D..DD.42..........
1A.12.14.15..2.A..12..1.7..4...8.41.59....8..4..CC.1...........
1B.11.15.16..2.A..11..1.7......8.41.D6....2..B..BB.52..........
1C.1..16.17..1.FF.1.....7..48..8.41.D3....6..9..DD.52..........
1D.1..17.18..1.FF.1.....7...8..8.41.5.....5F.9..BB.5...........
1E.1..18.19....FF.1.....7..48..8.C1.51....5E.9..DD.5...........
1F.1..18.18..3.3..1...F.F..6...8.11............DD.............
2..1..18.18..3.3..11..F.F..4...8.11.A4....6..E..CC.2...........
21.11.18.18..3.3..12..F.F......8.11.A8....9..D..BB.6...........
22.12.18.18..3.3..13..E.F..4...8.11.AC....C..C..DD.6...........
23.13.18.18..3.3..14..E.F......8.11.A.....F..B..BB.6...........
24.14.18.19..3.3..15..D.F..4...8.11.E5....2..A..DD.61..........
25.15.19.19..3.3..16..D.F......8.11.A9....5..9..BB.6...........
26.16.1A.19..3.3..17..C.F..4...8.11.AD....8..8..DD.6...........
27.17.19.19..3.3..18..C.F......8.11.A1....B..7..BB.6...........
28.18.1A.19..3.3..19..B.F..4...8.11.A5....E..6..DD.6...........
29.1A.1A.1A..2.3..1A..B.F..4...8.11.EA....1..5..DD.61..........
2A.1A.1A.1A..2.3..1B..A.F..4...8.11.AE....4..4..11.6...........
2B.1B.1A.1A..2.3..1C..A.F......8.11.A2....7..3..BB.6...........
2C.1C.1A.1A..2.3..1D..9.F..4...8.11.A6....A..2..DD.6...........
2D.1D.1A.1A..2.3..1E..9.F......8.11.AA....D..1..BB.6...........
2E.1E.1A.1B..2.3..1F..8.F..4...8.11.EF.........DD.61..........
2F.1F.1B.1B..2.3..2...8.F......8.11.A3....6..E..BB.6...........
3..2..1C.1B..2.3..21..7.F..4...8.11.A7....9..D..DD.6...........
31.21.1B.1B..2.3..22..7.F......8.11.AB....C..C..BB.6...........
32.22.1C.1B..2.3..23..6.F..4...8.11.AF....F..B..DD.6...........
33.24.1C.1C..1.3..24..6.F..4...8.11.E.....2..A..DD.61..........
...............................................................
```

SURFACE-I EDGE PARAMETERS-A

```
................................................................
................................................................
33.24.1C.1C..1.3..24..6.F..4...8.11.E.....2..A..DD.61...........
34.24.1C.1C..1.3..25..5.F..4...8.11.A4....5..9..11.6............
35.25.1C.1C..1.3..26..5.F......8.11.A8....8..8..BB.6............
36.26.1C.1C..1.3..27..4.F..4...8.11.AC....B..7..DD.6............
37.27.1C.1C..1.3..28..4.F......8.11.A.....E..6..BB.6............
38.28.1C.1D..1.3..29..3.F..4...8.11.E5....1..5..DD.61...........
39.29.1D.1D..1.3..2A..3.F......8.11.A9....4..4..BB.6............
3A.2A.1E.1D..1.3..2B..2.F..4...8.11.AD....7..3..DD.6............
3B.2B.1D.1D..1.3..2C..2.F......8.11.A1....A..2..BB.6............
3C.2C.1E.1D..1.3..2D..1.F..4...8.11.A5....D..1..DD.6............
3D.2E.1E.1E....3..2E..1.FF.44..8.11.EA..........DD.61...........
3E.2E.1E.1E....3..2F....FF.44..8.91.AE.......FE.DD.6............
3F.2E.1E.1E..D.3..2E..6.A..6...8.69..A..........DD..............
4..2D.1D.1D..D.3..2D..6.A......8.69.C5....3..A..BB.43...........
41.2D.1D.1C..D.3..2D..6.A......8.69.54....6..4..CC.1............
42.2C.1C.1B..C.3..2C..5.A..4...8.69.D3....9..E..DD.52...........
43.2C.1B.1A..C.3..2C..5.A......8.69.52....C..8..BB.5............
44.2C.1A.19..B.3..2C..5.A..4...8.69.51....F..2..DD.5............
45.2B.19.19..B.3..2B..5.A......8.69.8D....2..C..BB.42...........
46.2B.19.18..B.3..2B..5.A......8.69.5C....5..6..CC.1............
47.2A.18.17..A.3..2B..5.A..4...8.69.5F....8.....DD.5............
48.2A.16.16..A.3..2A..4.A..4...8.69.DA....B..A..DD.52...........
49.2A.16.15..9.3..2A..4.A..4...8.69.59....E..4..11.5............
4A.29.15.15..9.3..29..4.A......8.69.85....1..E..BB.42...........
4B.29.15.14..9.3..29..4.A......8.69.54....4..8..CC.1............
4C.28.14.13..8.3..29..4.A..4...8.69.57....7..2..DD.5............
4D.28.12.12..8.3..28..3.A..4...8.69.D2....A..C..DD.52...........
4E.28.12.11..7.3..28..3.A..4...8.69.51....D..6..11.5............
4F.27.11.1...7.3..27..3.A......8.69.DC....3..A..BB.52...........
5..26.1...F..6.3..27..3.A..4...8.69.5F....6..4..DD.5............
51.26..E..E..6.3..26..2.A..4...8.69.DA....9..E..DD.52...........
52.26..E..D..5.3..26..2.A..4...8.69.59....C..8..11.5............
53.26..D..C..5.3..26..2.A......8.69.58....F..2..BB.5............
54.26..C..C..4.3..25..2.A..4...8.69.84....2..C..DD.42...........
55.25..C..B..4.3..25..2.A..4...8.69.57....5..6..CC.1............
56.25..B..A..4.3..25..2.A......8.69.56....8.....BB.5............
57.24..A..9..3.3..24..1.A..4...8.69.D1....B..A..DD.52...........
58.24..9..8..3.3..24..1.A......8.69.5.....E..4..BB.5............
59.24..8..8..2.3..23..1.A..4...8.69.8C....1..E..DD.42...........
5A.23..8..7..2.3..23..1.A..4...8.69.5F....4..8..CC.1............
5B.23..7..6..2.3..23..1.A......8.69.5E....7..2..BB.5............
5C.22..6..5..1..1.22....A..48..8.69.D9....A..C..DD.52...........
5D.22..5..4..1..1.22....A...8..8.69.58....A1.C..BB.5............
5E.22..4..3.....1.22....A..48..8.E9.5B....A2.C..DD.5............
................................................................
................................................................
................................................................
................................................................
................................................................
................................................................
................................................................
................................................................
```

SURFACE-I EDGE PARAMETERS-B

SURFACE-II SID COMMANDS

```
#^C
#
#S9901
9901 08 02
9902 0C 02
9903 00
9904 00
9905 17 10
9906 0F 0E
9907 80
9908 01
9909 11 10
990A 02 02
990B 40 .
```

SURFACE-II GRAPHICS

```
9903
9905
9907
9909
990B
                     ...........................................
...............................................................
....111111111111111............................................
....EDCBA987654321.FEDCBA98765432..............................
....1515151515151515151515151515165............................
....F5.........................555.............................
....1.1........................145.............................
.....215.......................535.............................
......231......................125.............................
.......245.....................515.............................
........251....................1.5.............................
.........265...................5F4.............................
..........271..................1E4.............................
...........285.................5D4.............................
............291.1..............1C4.............................
.............2A.B..............5B4.............................
..............2.1.1............1A4.............................
................C.D............594.............................
................2.1.1..........184.............................
.................E.F5..........574.............................
.................2.115.........164.............................
.....................325.......554.............................
....................3.331......144.............................
......................345......534.............................
.......................351.....124.............................
........................365....514.............................
.........................371.1.1.4.............................
..........................38.9.5F3.............................
...........................3.1.5E3.............................
.............................A.C...............................
.............................3.3...............................
...............................................................
...............................................................
...............................................................
...............................................................
...............................................................
...............................................................
...............................................................
...............................................................
...............................................................
...............................................................
...............................................................
...............................................................
...............................................................
...............................................................
...............................................................
...............................................................
...............................................................
...............................................................
...............................................................
...............................................................
```

```
                                                         .......
.................................................................
.1.2...4..4.......2...E..1.64..8.51.............DD..............
.2.2...4..4.......1F..E..1.44..8.51.AC........1.CC.2............
.3.1F..4..4.......1E..E..1..4..8.51.A8........2.BB.6............
.4.1E..4..4.......1D..D..1.44..8.51.A4........3.DD.6............
.5.1D..4..4.......1C..D..1..4..8.51.A.........4.BB.6............
.6.1C..4..4.......1B..C..1.44..8.51.AC........5.DD.6............
.7.1B..4..4.......1A..C..1..4..8.51.A8........6.BB.6............
.8.1A..4..4.......19..B..1.44..8.51.A4........7.DD.6............
.9.19..4..4.......18..B..1..4..8.51.A.........8.BB.6............
.A.18..4..4.......17..A..1.44..8.51.AC........9.DD.6............
.B.17..4..4.......16..A..1..4..8.51.A8........A.BB.6............
.C.16..4..4.......15..9..1.44..8.51.A4........B.DD.6............
.D.15..4..4.......14..9..1..4..8.51.A.........C.BB.6............
.E.14..4..4.......13..8..1.44..8.51.AC........D.DD.6............
.F.13..4..4.......12..8..1..4..8.51.A8........E.BB.6............
1..12..4..4.......11..7..1.44..8.51.A4........F.DD.6............
11.11..4..4.......1...7..1..4..8.51.A........1..BB.6............
12.1...4..4........F..6..1.44..8.51.AC.......11.DD.6............
13..F..4..4........E..6..1..4..8.51.A8.......12.BB.6............
14..E..4..4........D..5..1.44..8.51.A4.......13.DD.6............
15..D..4..4........C..5..1..4..8.51.A........14.BB.6............
16..C..4..4........B..4..1.44..8.51.AC.......15.DD.6............
17..B..4..4........A..4..1..4..8.51.A8.......16.BB.6............
18..A..4..4........9..3..1.44..8.51.A4.......17.DD.6............
19..9..4..4........8..3..1..4..8.51.A........18.BB.6............
1A..8..4..4........7..2..1.44..8.51.AC.......19.DD.6............
1B..7..4..4........6..2..1..4..8.51.A8.......1A.BB.6............
1C..6..4..4........5..1..1.44..8.51.A4.......1B.DD.6............
1D..5..4..4........4..1..1..4..8.51.A........1C.BB.6............
1E..4..4..4........3.....1.44..8.D1.AC.......1D.DD.6............
1F..4..4..4..C.C...4..E.E..6...8.11.............DD..............
2...5..5..5..C.C...5..E.E......8.11.C5....8..C..BB.43...........
21..6..6..6..B.C...6..D.E..4...8.11.CA....4..A..DD.43...........
22..7..7..7..B.C...7..D.E......8.11.CF.......8..BB.43...........
23..7..7..7..B.C...8..D.E......8.11.A3....C..6..CC.2............
24..8..8..8..A.C...9..C.E..4...8.11.E4....8..4..DD.61...........
25..9..9..9..A.C...A..C.E......8.11.E9....4..2..BB.61...........
26..A..A..A..9.C...B..B.E..4...8.11.EE..........DD.61...........
27..B..B..B..9.C...C..B.E......8.11.E3....8..C..BB.61...........
28..C..C..C..8.C...D..A.E..4...8.11.E4....4..A..DD.61...........
29..D..D..D..8.C...E..A.E......8.11.E9.......8..BB.61...........
2A..E..E..D..8.C...F..9.E..4...8.11.AD....C..6..DD.6............
2B.1...E..E..7.C..1...9.E..4...8.11.E2....8..4..DD.61...........
2C.1..1...F..7.C..11..8.E..4...8.11.E7....4..2..DD.61...........
2D.12.1..1...6.C..12..8.E..4...8.11.E8..........DD.61...........
2E.12.12.11..6.C..13..7.E..4...8.11.ED....8..C..DD.61...........
2F.14.12.12..5.C..14..7.E..4...8.11.E2....4..A..DD.61...........
3..14.14.13..5.C..15..6.E..4...8.11.E7.......8..DD.61...........
31.15.13.13..5.C..16..6.E......8.11.AB....C..6..BB.6............
32.16.14.14..4.C..17..5.E..4...8.11.EC....8..4..11.61...........
33.17.15.15..4.C..18..5.E......8.11.E1....4..2..BB.61...........
.................................................................
```

SURFACE-II EDGE PARAMETERS-A

```
      ..................................................
................................................................
33.17.15.15..4.C..18..5.E......8.11.E1....4..2..BB.61...........
34.18.16.16..3.C..19..4.E..4...8.11.E6..........DD.61...........
35.19.17.17..3.C..1A..4.E......8.11.EB....8..C..BB.61...........
36.1A.18.18..2.C..1B..3.E..4...8.11.EC....4..A..DD.61...........
37.1B.19.19..2.C..1C..3.E......8.11.E1........8..BB.61..........
38.1C.1A.19..2.C..1D..2.E..4...8.11.A5....C..6..DD.6............
39.1E.1A.1A..1.C..1E..2.E..4...8.11.EA....8..4..DD.61...........
3A.1E.1C.1B..1.C..1F..1.E..4...8.11.EF....4..2..DD.61...........
3B.2..1C.1C....C..2...1.FF.44..8.11.E...........DD.61...........
3C.2..1C.1C....C..21....FF.44..8.91.A4.......FE.DD.6............
3D.2..1C.1C..C..1.2........68..8.29.............DD..............
3E.2..1C.1B..C..1.2........48..8.29.53.....1....CC.1............
3F.2..1B.1A..C..1.2.........8..8.29.52.....2....BB.5............
4..2..1A.19..B..1.2........48..8.29.51.....3....DD.5............
41.2..19.18..B..1.2.........8..8.29.5......4....BB.5............
42.2..18.17..A..1.2........48..8.29.53.....5....DD.5............
43.2..17.16..A..1.2.........8..8.29.52.....6....BB.5............
44.2..16.15..9..1.2........48..8.29.51.....7....DD.5............
45.2..15.14..9..1.2.........8..8.29.5......8....BB.5............
46.2..14.13..8..1.2........48..8.29.53.....9....DD.5............
47.2..13.12..8..1.2.........8..8.29.52.....A....BB.5............
48.2..12.11..7..1.2........48..8.29.51.....B....DD.5............
49.2..11.1...7..1.2.........8..8.29.5......C....BB.5............
4A.2..1...F..6..1.2........48..8.29.53.....D....DD.5............
4B.2...F..E..6..1.2.........8..8.29.52.....E....BB.5............
4C.2...E..D..5..1.2........48..8.29.51.....F....DD.5............
4D.2...D..C..5..1.2.........8..8.29.5.....1.....BB.5............
4E.2...C..B..4..1.2........48..8.29.53....11....DD.5............
4F.2...B..A..4..1.2.........8..8.29.52....12....BB.5............
5..2...A..9..3..1.2........48..8.29.51....13....DD.5............
51.2...9..8..3..1.2.........8..8.29.5.....14....BB.5............
52.2...8..7..2..1.2........48..8.29.53....15....DD.5............
53.2...7..6..2..1.2.........8..8.29.52....16....BB.5............
54.2...6..5..1..1.2........48..8.29.51....17....DD.5............
55.2...5..4..1..1.2.........8..8.29.5.....18....BB.5............
56.2...4..3.....1.2........48..8.A9.53....19....DD.5............
................................................................
................................................................
................................................................
................................................................
................................................................
................................................................
................................................................
................................................................
................................................................
................................................................
................................................................
................................................................
................................................................
................................................................
................................................................
................................................................
```

SURFACE II EDGE PARAMETERS-B

```
..................................................................
..................................................................
..................................................................
..................................................................
..................................................................
..................................................................
..................................................................
..................................................................
..................................................................
..................................................................
..................................................................
..................................................................
...................2124...........................................
..................45514...........................................
.................51.1.4...........................................
..................65.5F3..........................................
.................85...1E3.........................................
.................95...5D3.........................................
.................A1...1C3.........................................
.................B5....5B3........................................
................D51.....1A3.......................................
................E5......593.......................................
...............F1.......183.......................................
...............1.5.......573......................................
..............125.........163.....................................
..............135.........553.....................................
..............141.........143.....................................
..............155..........533....................................
..............165...........123...................................
................85..........513...................................
................191.5.......1.3...................................
.................1A.C5.......5F2..................................
..................1.1D1.5.....1E2.................................
.....................1E..5....5D2.................................
......................1.211.5.1C2.................................
.........................22.45.5B2................................
..........................2.251.192...............................
.............................26.8.................................
..............................2.2.................................
..................................................................
..................................................................
..................................................................
..................................................................
..................................................................
..................................................................
..................................................................
..................................................................
..................................................................
..................................................................
..................................................................
..................................................................
..................................................................
..................................................................
..................................................................
```

SURFACE-III GRAPHICS

```
...............................................................
...............................................................
.1.14..C..C..8.8..14..2.E..6...8.41.............DD.............
.2.14..C..C..8.8..13..2.E..4...8.41.AC....8..E..CC.2...........
.3.13..D..D..8.8..13..2.E......8.41.4D.......C..BB.41..........
.4.13..D..E..8.8..13..2.E......8.41.5E.......8..CC.1...........
.5.12..E..F..7.8..13..2.E..4...8.41.5F.......4..DD.5...........
.6.13..F.1...7.8..13..2.E......8.41.5C..........BB.5...........
.7.12.1..1...6.8..12..1.E..4...8.41.88....8..E..11.42..........
.8.12.1..11..6.8..12..1.E..4...8.41.59.......C..CC.1...........
.9.12.11.12..6.8..12..1.E......8.41.5A.......8..BB.5...........
.A.12.12.13..5.8..12..1.E..4...8.41.5B.......4..DD.5...........
.B.12.13.14..5.8..12..1.E......8.41.58..........BB.5...........
.C.12.14.14..4.8..11..1.E..4...8.41.84....8..E..DD.42..........
.D.11.14.15..4.8..11..1.E..4...8.41.55.......C..CC.1...........
.E.11.15.16..4.8..11..1.E......8.41.56.......8..BB.5...........
.F.1..16.17..3.8..11..1.E..4...8.41.57.......4..DD.5...........
1..11.17.18..3.8..11..1.E......8.41.54..........BB.5...........
11.1..18.18..2.FF.1.....E..48..8.41.8.....8..E..11.42..........
12.1..18.19..2.FF.1.....E..48..8.41.51....7F.E..CC.1...........
13.1..19.1A..2.FF.1.....E...8..8.41.52....7E.E..BB.5...........
14.1..1A.1B..1.FF.1.....E..48..8.41.53....7D.E..DD.5...........
15.1..1B.1C..1.FF.1.....E...8..8.41.5.....7C.E..BB.5...........
16.1..1C.1D....FF.1.....E..48..8.C1.51....7B.E..DD.5...........
17.1..1C.1C..4.4..1...8.8..6...8.11.............DD.............
18.1..1C.1C..4.4..11..8.8..4...8.11.A4....8.....CC.2...........
19.11.1D.1D..4.4..12..8.8......8.11.E9..........BB.61..........
1A.12.1E.1D..4.4..13..7.8..4...8.11.AD....8.....DD.6...........
1B.14.1E.1E..3.4..14..7.8..4...8.11.E2..........DD.61..........
1C.14.1E.1E..3.4..15..6.8..4...8.11.A6....8.....11.6...........
1D.15.1F.1F..3.4..16..6.8......8.11.EB..........BB.61..........
1E.16.2..1F..3.4..17..5.8..4...8.11.AF....8.....DD.6...........
1F.18.2..2...2.4..18..5.8..4...8.11.E...........DD.61..........
2..18.2..2...2.4..19..4.8..4...8.11.A4....8.....11.6...........
21.19.21.21..2.4..1A..4.8......8.11.E9..........BB.61..........
22.1A.22.21..2.4..1B..3.8..4...8.11.AD....8.....DD.6...........
23.1C.22.22..1.4..1C..3.8..4...8.11.E2..........DD.61..........
24.1C.22.22..1.4..1D..2.8..4...8.11.A6....8.....11.6...........
25.1D.23.23..1.4..1E..2.8......8.11.EB..........BB.61..........
26.1E.24.23..1.4..1F..1.8..4...8.11.AF....8.....DD.6...........
27.2..24.24....4..2...1.FF.44..8.11.E...........DD.61..........
28.2..24.24....4..21....FF.44..8.91.A4.......FE.DD.6...........
29.2..24.24..C.4..2...6.A..6...8.69.............DD.............
2A.1F.23.23..C.4..1F..6.A......8.69.CF....4..A..BB.43..........
2B.1F.23.22..C.4..1F..6.A......8.69.5E....8..4..CC.1...........
2C.1E.22.21..B.4..1E..5.A..4...8.69.D9....C..E..DD.52..........
2D.1E.21.2...B.4..1E..5.A......8.69.58....4..2..BB.5...........
2E.1E.2..1F..A.4..1D..5.A..4...8.69.D7....8..C..DD.52..........
2F.1D.1F.1E..A.4..1D..5.A......8.69.56....C..6..BB.5...........
3..1C.1E.1D..9.4..1C..4.A..4...8.69.D1....4..A..DD.52..........
31.1C.1D.1C..9.4..1C..4.A......8.69.5.....8..4..BB.5...........
32.1C.1C.1B..8.4..1B..4.A..4...8.69.DF....C..E..DD.52..........
33.1B.1B.1A..8.4..1B..4.A......8.69.5E....4..2..BB.5...........
...............................................................
```

```
................................................................
................................................................
33.1B.1B.1A..8.4..1B..4.A......8.69.5E....4..2..BB.5............
34.1A.1A.19..7.4..1A..3.A..4...8.69.D9....8..C..DD.52...........
35.1A.19.18..7.4..1A..3.A......8.69.58....C..6..BB.5............
36.1A.18.17..6.4..19..3.A..4...8.69.D7....4..A..DD.52...........
37.19.17.16..6.4..19..3.A......8.69.56....8..4..BB.5............
38.18.16.15..5.4..18..2.A..4...8.69.D1....C..E..DD.52...........
39.18.15.14..5.4..18..2.A......8.69.5.....4..2..BB.5............
3A.18.14.13..4.4..17..2.A..4...8.69.DF....8..C..DD.52...........
3B.17.13.12..4.4..17..2.A......8.69.5E....C..6..BB.5............
3C.16.12.11..3.4..16..1.A..4...8.69.D9....4..A..DD.52...........
3D.16.11.1...3.4..16..1.A......8.69.58....8..4..BB.5............
3E.16.1...F..2.4..15..1.A..4...8.69.D7....C..E..DD.52...........
3F.15..F..E..2.4..15..1.A......8.69.56....4..2..BB.5............
4..14..E..D..1..1.14....A..48..8.69.D1....8..C..DD.52...........
41.14..D..C..1..1.14....A...8..8.69.5.....81.C..BB.5............
42.14..C..B.....1.14....A..48..8.E9.53....82.C..DD.5............
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
```

SURFACE-III EDGE PARAMETERS-B

SURFACE-IV GRAPHICS

```
#S9901
9901 08 14
9902 16 12
9903 00
9904 00
9905 16 02
9906 12 14
9907 80
9908 01
9909 0C 0A
990A 02 0A
990B 40 .
#................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
....................1.6.........................................
...................5F5..........................................
..................5D525.........................................
......................45........................................
................191B5..61.......................................
................5A5....75.......................................
..............1585.......8151...................................
..............565.........9A5...................................
..............155...........C.1.................................
.............545..............D.................................
............535...............1.5...............................
...........515................E..5..............................
..........5F4...................121.............................
.................................135............................
........1B1D4...................222221111.......................
........5C4............2.2.2.2.24321.FEDC.......................
......15A4...3333333333E2C2A2826151515155.......................
.....45843.3.387654321.5D5B59575......1.A.......................
....42174E3C3A151515155.1.1.1.1.........1.......................
....3564F5D5B5..................................................
....554.1.1.1...................................................
................................................................
................................................................
................................................................
................................................................
................................................................
................................................................
................................................................
................................................................
................................................................
```

```
................................................................
................................................................
.1.14.14.14..8.8..14..A.A..6...8.11.............DD..............
.2.15.15.15..8.8..15..A.A......8.11.C5.......4..BB.43...........
.3.16.16.16..7.8..16..9.A..4...8.11.CA.......8..DD.43...........
.4.16.16.16..7.8..17..9.A..4...8.11.AE....8..2..CC.2............
.5.17.17.17..7.8..17..9.A......8.11.4F.......C..BB.41...........
.6.17.17.17..7.8..18..9.A......8.11.A3....8..6..CC.2............
.7.18.18.18..6.8..19..8.A..4...8.11.E4..........DD.61...........
.8.19.19.19..6.8..1A..8.A......8.11.E9.......4..BB.61...........
.9.1A.1A.1A..5.8..1B..7.A..4...8.11.EE.......8..DD.61...........
.A.1B.1A.1A..5.8..1C..7.A......8.11.A2....8..2..BB.6............
.B.1C.1A.1B..5.8..1C..6.A..4...8.11.43.......C..DD.41...........
.C.1C.1B.1B..5.8..1D..6.A..4...8.11.A7....8..6..CC.2............
.D.1E.1C.1C..4.8..1E..6.A..4...8.11.E8..........DD.61...........
.E.1E.1E.1D..4.8..1F..5.A..4...8.11.ED.......4..DD.61...........
.F.2..1E.1E..3.8..2...5.A..4...8.11.E2.......8..DD.61...........
1..2..1E.1E..3.8..21..4.A..4...8.11.A6....8..2..11.6............
11.21.1F.1F..3.8..21..4.A......8.11.47.......C..BB.41...........
12.21.1F.1F..3.8..22..4.A......8.11.AB....8..6..CC.2............
13.22.2..2...2.8..23..3.A..4...8.11.EC..........DD.61...........
14.23.21.21..2.8..24..3.A......8.11.E1.......4..BB.61...........
15.24.22.22..1.8..25..2.A..4...8.11.E6.......8..DD.61...........
16.25.22.22..1.8..26..2.A......8.11.AA....8..2..BB.6............
17.26.22.23..1.8..26..1.A..4...8.11.4B.......C..DD.41...........
18.26.23.23..1.8..27..1.A..4...8.11.AF....8..6..CC.2............
19.28.24.24....8..28..1.FF.44..8.11.E...........DD.61...........
1A.28.24.24....8..29....FF.44..8.91.A4.......FE.DD.6............
1B.28.24.24..2.1..28.12.7..6...8.51.............DD..............
1C.28.24.24..2.1..27.12.7..4...8.51.AC....1..7..CC.2............
1D.27.24.24..2.1..26.12.7......8.51.A8....2..E..BB.6............
1E.26.24.24..2.1..25.11.7..4...8.51.A4....4..C..DD.6............
1F.25.24.24..2.1..24.11.7......8.51.A.....6..A..BB.6............
2..24.24.24..2.1..23.1..7..4...8.51.AC....8..8..DD.6............
21.23.24.24..2.1..22.1..7......8.51.A8....9..F..BB.6............
22.22.24.24..2.1..21..F.7..4...8.51.A4....B..D..DD.6............
23.21.24.24..2.1..2...F.7......8.51.A.....D..B..BB.6............
24.2..24.24..2.1..1F..E.7..4...8.51.AC....F..9..DD.6............
25.1F.25.25..2.1..1F..E.7......8.51.4D..........BB.41...........
26.1F.25.25..2.1..1E..E.7......8.51.A9....1..7..CC.2............
27.1E.26.25..2.1..1D..D.7..4...8.51.A5....2..E..DD.6............
28.1D.25.25..2.1..1C..D.7......8.51.A1....4..C..BB.6............
29.1C.26.25..2.1..1B..C.7..4...8.51.AD....6..A..DD.6............
2A.1B.25.25..2.1..1A..C.7......8.51.A9....8..8..BB.6............
2B.1A.26.25..2.1..19..B.7..4...8.51.A5....9..F..DD.6............
2C.19.25.25..2.1..18..B.7......8.51.A1....B..D..BB.6............
2D.18.26.25..2.1..17..A.7..4...8.51.AD....D..B..DD.6............
2E.17.25.25..2.1..16..A.7......8.51.A9....F..9..BB.6............
2F.16.26.26..1.1..16..9.7..4...8.51.4A..........11.41...........
3..16.26.26..1.1..15..9.7..4...8.51.A6....1..7..CC.2............
31.15.26.26..1.1..14..9.7......8.51.A2....2..E..BB.6............
32.14.26.26..1.1..13..8.7..4...8.51.AE....4..C..DD.6............
33.13.26.26..1.1..12..8.7......8.51.AA....6..A..BB.6............
................................................................
```

SURFACE-IV EDGE PARAMETERS-A

```
................................................................
................................................................
33.13.26.26..1.1..12..8.7......8.51.AA....6..A..BB.6............
34.12.26.26..1.1..11..7.7..4...8.51.A6....8..8..DD.6............
35.11.26.26..1.1..1...7.7......8.51.A2....9..F..BB.6............
36.1..26.26..1.1...F..6.7..4...8.51.AE....B..D..DD.6............
37..F.26.26..1.1...E..6.7......8.51.AA....D..B..BB.6............
38..E.26.26..1.1...D..5.7..4...8.51.A6....F..9..DD.6............
39..D.27.27..1.1...D..5.7......8.51.47..........BB.41...........
3A..D.27.27..1.1...C..5.7......8.51.A3....1..7..CC.2............
3B..C.28.27..1.1...B..4.7..4...8.51.AF....2..E..DD.6............
3C..B.27.27..1.1...A..4.7......8.51.AB....4..C..BB.6............
3D..A.28.27..1.1...9..3.7..4...8.51.A7....6..A..DD.6............
3E..9.27.27..1.1...8..3.7......8.51.A3....8..8..BB.6............
3F..8.28.27..1.1...7..2.7..4...8.51.AF....9..F..DD.6............
4...7.27.27..1.1...6..2.7......8.51.AB....B..D..BB.6............
41..6.28.27..1.1...5..1.7..4...8.51.A7....D..B..DD.6............
42..5.27.27..1.1...4..1.7......8.51.A3....F..9..BB.6............
43..4.28.28....1...4....7..4...8.D1.4...........DD.41...........
44..4.28.28..A.6...4..8.8..6...8.29.............DD..............
45..4.28.27..A.6...4..8.8..4...8.29.53....6..8..CC.1............
46..5.27.26..A.6...5..8.8......8.29.D6....C.....BB.52...........
47..6.26.25..9.6...6..7.8..4...8.29.D9....8.....DD.52...........
48..6.25.24..9.6...6..7.8......8.29.58....E..8..BB.5............
49..6.24.24..8.6...7..7.8..4...8.29.8C....4.....DD.42...........
4A..7.24.23..8.6...7..7.8..4...8.29.5F....A..8..CC.1............
4B..8.22.23..8.6...8..6.8..4...8.29.83..........DD.42...........
4C..8.23.22..8.6...8..6.8..4...8.29.52....6..8..CC.1............
4D..A.22.21..7.6...9..6.8..4...8.29.D5....C.....DD.52...........
4E..A.2..2...7.6...A..5.8..4...8.29.D8....8.....DD.52...........
4F..A.2..1F..6.6...A..5.8..4...8.29.5B....E..8..11.5............
5...B.1F.1F..6.6...B..5.8......8.29.8F....4.....BB.42...........
51..B.1F.1E..6.6...B..5.8......8.29.5E....A..8..CC.1............
52..C.1E.1E..5.6...C..4.8..4...8.29.82..........DD.42...........
53..C.1E.1D..5.6...C..4.8..4...8.29.51....6..8..CC.1............
54..D.1D.1C..5.6...D..4.8......8.29.D4....C.....BB.52...........
55..E.1C.1B..4.6...E..3.8..4...8.29.DB....8.....DD.52...........
56..E.1B.1A..4.6...E..3.8......8.29.5A....E..8..BB.5............
57..E.1A.1A..3.6...F..3.8..4...8.29.8E....4.....DD.42...........
58..F.1A.19..3.6...F..3.8..4...8.29.5D....A..8..CC.1............
59.1..18.19..3.6..1...2.8..4...8.29.81..........DD.42...........
5A.1..19.18..3.6..1...2.8..4...8.29.5.....6..8..CC.1............
5B.12.18.17..2.6..11..2.8..4...8.29.D7....C.....DD.52...........
5C.12.16.16..2.6..12..1.8..4...8.29.DA....8.....DD.52...........
5D.12.16.15..1.6..12..1.8..4...8.29.59....E..8..11.5............
5E.13.15.15..1.6..13..1.8......8.29.8D....4.....BB.42...........
5F.13.15.14..1.6..13..1.8......8.29.5C....A..8..CC.1............
6..14.14.14....6..14....8..4...8.A9.8...........DD.42...........
................................................................
................................................................
................................................................
................................................................
................................................................
................................................................
```

SURFACE-V GRAPHICS

```
#S.TEST1C
3415 CD
3416 53 31
3417 34 .
#S.TEST1D
3422 CD
3423 53 3F
3424 34 .
#S9901
9901 08 0A
9902 08 00
9903 00
9904 00
9905 14 00
9906 06 0A
9907 80
9908 01
9909 04 14
990A 16 0A
990B 40 .
#..................17551........................................
.................185.541........................................
................191...131.......................................
...............1A5.....521......................................
..............1B1.......111.....................................
.............1D5.........5.1....................................
............1E1...........1F....................................
...........1F5.............5E...................................
..........2.1...............1D..................................
.........215.................5C.................................
........235...................1B................................
.......245.....................5A...............................
......251.......................19..............................
.....265.........................58.............................
....271...........................17............................
...295.............................56...........................
..2A1...............................15..........................
.2B5.................................54.........................
2C1...................................13........................
D5.....................................52......................2
5515151515151515151515151515151515151511......................2E
.123456789ABCDEF.123456789ABCDEF.12345678.......................
33333333333333334444444444444444555555555.......................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
................................................................
```

643

SURFACE-V EDGE PARAMETERS-A

```
S.ETST1
3456 FE
3457 33 00
3458 D8 .
#S.ETST2
345C FE
345D 70 30
345E D0 .
#S.TEST1B
3415 CD
3416 31 53
3417 34 .
#S.TEST1D
3422 CD
3423 3F 53
3424 34 .
#.............................................................
............................................................
.1.28.14.14..A.6..28..A.6..6...8.61.............DD..............
.2.27.13.13..A.6..27..A.6......8.61.CF....6..6..BB.43...........
.3.26.12.12..9.6..26..9.6..4...8.61.CA....C..C..DD.43...........
.4.25.11.11..9.6..25..9.6......8.61.C5....8..8..BB.43...........
.5.24.1..1...8.6..24..8.6..4...8.61.C.....E..E..DD.43...........
.6.23..F..F..8.6..23..8.6......8.61.CF....A..A..BB.43...........
.7.22..E..E..7.6..22..7.6..4...8.61.CA....6..6..DD.43...........
.8.21..D..D..7.6..21..7.6......8.61.C5....C..C..BB.43...........
.9.2...C..C..6.6..2...6.6..4...8.61.C.....8..8..DD.43...........
.A.1F..B..B..6.6..1F..6.6......8.61.CF....E..E..BB.43...........
.B.1E..A..A..5.6..1E..5.6..4...8.61.CA....A..A..DD.43...........
.C.1D..9..9..5.6..1D..5.6......8.61.C5....6..6..BB.43...........
.D.1C..8..8..4.6..1C..4.6..4...8.61.C.....C..C..DD.43...........
.E.1B..7..7..4.6..1B..4.6......8.61.CF....8..8..BB.43...........
.F.1A..6..6..3.6..1A..3.6..4...8.61.CA....E..E..DD.43...........
1..19..5..5..3.6..19..3.6......8.61.C5....A..A..BB.43...........
11.18..4..4..2.6..18..2.6..4...8.61.C.....6..6..DD.43...........
12.17..3..3..2.6..17..2.6......8.61.CF....C..C..BB.43...........
13.16..2..2..1.6..16..1.6..4...8.61.CA....8..8..DD.43...........
14.15..1..1..1.6..15..1.6......8.61.C5....E..E..BB.43...........
15.14.........6..14....6..4...8.E1.C.....A..A..DD.43...........
16.14........A.A..14..A.6..6...8.41.............DD..............
17.14........A.A..13..A.6..4...8.41.AC....A..6..CC.2............
18.13..1..1..A.A..12..A.6......8.41.E9....4..C..BB.61...........
19.12..2..2..9.A..11..9.6..4...8.41.E6....8..8..DD.61...........
1A.11..3..3..9.A..1...9.6......8.41.E3....2..E..BB.61...........
1B.1...4..4..8.A...F..8.6..4...8.41.EC....6..A..DD.61...........
1C..F..5..5..8.A...F..8.6......8.41.4D..........BB.41...........
1D..F..5..5..8.A...E..8.6......8.41.A9....A..6..CC.2............
1E..E..6..6..7.A...D..7.6..4...8.41.E6....4..C..DD.61...........
1F..D..7..7..7.A...C..7.6......8.41.E3....8..8..BB.61...........
2...C..8..8..6.A...B..6.6..4...8.41.EC....2..E..DD.61...........
21..B..9..9..6.A...A..6.6......8.41.E9....6..A..BB.61...........
22..A..A..A..5.A...A..5.6..4...8.41.4A..........DD.41...........
23..A..A..A..5.A...9..5.6..4...8.41.A6....A..6..CC.2............
24..9..B..B..5.A...8..5.6......8.41.E3....4..C..BB.61...........
25..8..C..C..4.A...7..4.6..4...8.41.EC....8..8..DD.61...........
26..7..D..D..4.A...6..4.6......8.41.E9....2..E..BB.61...........
27..6..E..E..3.A...5..3.6..4...8.41.E6....6..A..DD.61...........
28..5..F..F..3.A...5..3.6......8.41.47..........BB.41...........
29..5..F..F..3.A...4..3.6......8.41.A3....A..6..CC.2............
2A..4.1..1...2.A...3..2.6..4...8.41.EC....4..C..DD.61...........
2B..3.11.11..2.A...2..2.6......8.41.E9....8..8..BB.61...........
2C..2.12.12..1.A...1..1.6..4...8.41.E6....2..E..DD.61...........
2D..1.13.13..1.A.....1.6......8.41.E3....6..A..BB.61...........
```

644

```
2E....14.14....H.........8..4...8.E1.4............DD.41.............
2F....14.14..........14.FF.64..8.19..............DD..............
................................................................
................................................................
................................................................
................................................................
................................................................
```

SURFACE-V EDGE PARAMETERS-B

SURFACE-V EDGE PARAMETERS-C

```
#S.ETST1
3456 FE
3457 00 33
3458 D8 .
#S.ETST2
345C FE
345D 30 70
345E D0 .
#...............................................................
................................................................
33..3.14.14........4.13.FF..4..8.19.A........FB.BB.6............
34..4.14.14........5.12.FF.44..8.19.A4.......FA.DD.6............
35..5.14.14........6.12.FF..4..8.19.A8.......F9.BB.6............
36..6.14.14........7.11.FF.44..8.19.AC.......F8.DD.6............
37..7.14.14........8.11.FF..4..8.19.A........F7.BB.6............
38..8.14.14........9.1..FF.44..8.19.A4.......F6.DD.6............
39..9.14.14........A.1..FF..4..8.19.A8.......F5.BB.6............
3A..A.14.14........B..F.FF.44..8.19.AC.......F4.DD.6............
3B..B.14.14........C..F.FF..4..8.19.A........F3.BB.6............
3C..C.14.14........D..E.FF.44..8.19.A4.......F2.DD.6............
3D..D.14.14........E..E.FF..4..8.19.A8.......F1.BB.6............
3E..E.14.14........F..D.FF.44..8.19.AC.......F..DD.6............
3F..F.14.14.......1...D.FF..4..8.19.A........EF.BB.6............
4..1..14.14.......11..C.FF.44..8.19.A4.......EE.DD.6............
41.11.14.14.......12..C.FF..4..8.19.A8.......ED.BB.6............
42.12.14.14.......13..B.FF.44..8.19.AC.......EC.DD.6............
43.13.14.14.......14..B.FF..4..8.19.A........EB.BB.6............
44.14.14.14.......15..A.FF.44..8.19.A4.......EA.DD.6............
45.15.14.14.......16..A.FF..4..8.19.A8.......E9.BB.6............
46.16.14.14.......17..9.FF.44..8.19.AC.......E8.DD.6............
47.17.14.14.......18..9.FF..4..8.19.A........E7.BB.6............
48.18.14.14.......19..8.FF.44..8.19.A4.......E6.DD.6............
49.19.14.14.......1A..8.FF..4..8.19.A8.......E5.BB.6............
4A.1A.14.14.......1B..7.FF.44..8.19.AC.......E4.DD.6............
4B.1B.14.14.......1C..7.FF..4..8.19.A........E3.BB.6............
4C.1C.14.14.......1D..6.FF.44..8.19.A4.......E2.DD.6............
4D.1D.14.14.......1E..6.FF..4..8.19.A8.......E1.BB.6............
4E.1E.14.14.......1F..5.FF.44..8.19.AC.......E..DD.6............
4F.1F.14.14.......2...5.FF..4..8.19.A........DF.BB.6............
5..2..14.14.......21..4.FF.44..8.19.A4.......DE.DD.6............
51.21.14.14.......22..4.FF..4..8.19.A8.......DD.BB.6............
52.22.14.14.......23..3.FF.44..8.19.AC.......DC.DD.6............
53.23.14.14.......24..3.FF..4..8.19.A........DB.BB.6............
54.24.14.14.......25..2.FF.44..8.19.A4.......DA.DD.6............
55.25.14.14.......26..2.FF..4..8.19.A8.......D9.BB.6............
56.26.14.14.......27..1.FF.44..8.19.AC.......D8.DD.6............
57.27.14.14.......28..1.FF..4..8.19.A........D7.BB.6............
58.28.14.14.......29....FF.44..8.99.A4.......D6.DD.6............
................................................................
................................................................
................................................................
................................................................
................................................................
................................................................
................................................................
................................................................
................................................................
................................................................
................................................................
................................................................
................................................................
                                ................................
```

SURFACE-VI GRAPHICS-A

```
#S9901
9901 02 04
9902 02 16
9903 00
9904 00
9905 10
9906 0E 0C
9907 80
9908 01
9909 10 0E
990A 02
990B 40 .
#
#
#
#S9901
9901 08 04
9902 0C 16
9903 00
9904 00
9905 17 10
9906 0F 10C
9907 80
9908 01
9909 11 0E
990A 02 .
#..................................................................
..................................................................
..................................................................
..................................................................
............................2166..................................
...........................35556..................................
..........................55.146..................................
.........................65..536..................................
........................71...526..................................
..................................................................
........................95...1.6..................................
.......................A5.....5F5.................................
......................B1.....1E5..................................
.......................C5.....5D5.................................
......................E5.......1C5................................
.....................F5........5B5................................
...................1.1.........1A5................................
...............................595................................
...................125.........585................................
..................135.............................................
.................141...........165................................
................................555...............................
.................165...........145................................
.................175............535...............................
................1951...........15115..............................
..............................5EF.................................
...............1B5...........1D445................................
..............1C5...........5B4...................................
.............1D1.........1.1A4...................................
.........................6584.....................................
.............1F5.......15474......................................
............2.5........3544.......................................
...........211........5444........................................
............225.......21..........................................
...........245.....15144..........................................
..........255.....5EF.............................................
```

64

```
...............5B3..............................................................
........285...1A3...............................................................
.......295...5B3................................................................
......2A1...173.................................................................
...........553..................................................................
......2C5.143...................................................................
......2D5523....................................................................
......2E513.....................................................................
.........3......................................................................
........3.......................................................................
................................................................................
................................................................................
................................................................................
................................................................................
................................................................................
................................................................................
................................................................................
```

SURFACE-VI GRAPHICS-B

```
................................................................
................................................................
.1.1C..4..4.14.A..1C..A.B..6...8.41.............DD..............
.2.1C..4..4.14.A..1B..A.B..4...8.41.AC..8.A..B..CC.2............
.3.1B..5..5.14.A..1B..A.B......8.41.4D.C3.4..6..BB.41...........
.4.1A..6..6.13.A..1A..9.B..4...8.41.CA.C..8..C..DD.43...........
.5.1A..6..7.13.A..1A..9.B..4...8.41.5B.C8.2..7..CC.1............
.6.19..7..8.13.A..19..9.B......8.41.D4.C3.6..D..BB.52...........
.7.18..8..9.12.A..19..9.B..4...8.41.55.46....8..DD.5............
.8.18..A..A.12.A..18..8.B..4...8.41.D2.CD.4..E..DD.52...........
.9.18..A..B.11.A..18..8.B..4...8.41.53.4..8..4..11.5............
.A.17..B..C.11.A..17..8.B......8.41.DC.C3.2..F..BB.52...........
.B.16..C..D.1..A..17..8.B..4...8.41.5D.46.6..5..DD.5............
.C.17..D..E.1..A..17..8.B......8.41.5E.43.......BB.5............
.D.16..E..E..F.A..16..7.B..4...8.41.8A.C..A..B..DD.42...........
.E.16..E..F..F.A..16..7.B..4...8.41.5B.C8.4..6..CC.1............
.F.15..F.1...F.A..15..7.B......8.41.D4.C3.8..C..BB.52...........
1..14.1..11..E.A..15..7.B..4...8.41.55.46.2..7..DD.5............
11.14.12.12..E.A..14..6.B..4...8.41.D2.CD.6..D..DD.52...........
12.14.12.13..D.A..14..6.B..4...8.41.53.4.....8..11.5............
13.13.13.14..D.A..13..6.B......8.41.DC.C3.4..E..BB.52...........
14.12.14.15..C.A..13..6.B..4...8.41.5D.46.8..4..DD.5............
15.12.16.16..C.A..12..5.B..4...8.41.DA.CD.2..F..DD.52...........
16.12.16.17..B.A..12..5.B..4...8.41.5B.4..6..5..11.5............
17.12.17.18..B.A..12..5.B......8.41.58.41.......BB.5............
18.12.18.18..A.A..11..5.B..4...8.41.84.C2.A..B..DD.42...........
19.11.18.19..A.A..11..5.B..4...8.41.55.CA.4..6..CC.1............
1A.1..1A.1A..A.A..1...4.B..4...8.41.D2.CD.8..C..DD.52...........
1B.1..1A.1B..9.A..1...4.B..4...8.41.53.4..2..7..11.5............
1C..F.1B.1C..9.A...F..4.B......8.41.DC.C3.6..D..BB.52...........
1D..E.1C.1D..8.A...F..4.B..4...8.41.5D.46....8..DD.5............
1E..E.1E.1E..8.A...E..3.B..4...8.41.DA.CD.4..E..DD.52...........
1F..E.1E.1F..7.A...E..3.B..4...8.41.5B.4..8..4..11.5............
2...D.1F.2...7.A...D..3.B......8.41.D4.C3.2..F..BB.52...........
21..C.2..21..6.A...D..3.B..4...8.41.55.46.6..5..DD.5............
22..D.21.22..6.A...D..3.B......8.41.56.43.......BB.5............
23..C.22.22..5.A...C..2.B..4...8.41.82.C..A..B..DD.42...........
24..C.22.23..5.A...C..2.B..4...8.41.53.CB.4..6..CC.1............
25..B.23.24..5.A...B..2.B......8.41.DC.C3.8..C..BB.52...........
26..A.24.25..4.A...B..2.B..4...8.41.5D.46.2..7..DD.5............
27..A.26.26..4.A...A..1.B..4...8.41.DA.CD.6..D..DD.52...........
28..A.26.27..3.A...A..1.B..4...8.41.5B.4.....8..11.5............
29..9.27.28..3.A...9..1.B......8.41.D4.C3.4..E..BB.52...........
2A..8.28.29..2.A...9..1.B..4...8.41.55.46.8..4..DD.5............
2B..8.2A.2A..2.FF..8....B..48..8.41.D2.CD.2..F..DD.52...........
2C..8.2A.2B..1.FF..8....B..48..8.41.53.4..1F.F..11.5............
2D..8.2B.2C..1.FF..8....B...8..8.41.5..41.1E.F..BB.5............
2E..8.2C.2D....FF..8....B..48..8.C1.51.4..1D.F..DD.5............
2F..8.2C.2C..A.6...8..C.C..6...8.31.............DD..............
3...8.2C.2B..A.6...8..C.C..4...8.31.53..8.6..C..CC.1............
31..9.2B.2A..A.6...9..C.C......8.31.D6.C3.C..8..BB.52...........
32..A.2A.2A..9.6...A..B.C..4...8.31.8A.C..2..4..DD.42...........
33..B.29.29..9.6...B..B.C......8.31.CD.C3.8.....BB.43...........
................................................................
```

SURFACE-VI EDGE PARAMETERS-A

```
...............................................................
...............................................................
33..B.29.29..9.6...B..B.C......8.31.CD.C3.8.....BB.43...........
34..B.29.28..9.6...B..B.C......8.31.5C.C3.E..C..CC.1............
35..C.28.28..8.6...C..A.C..4...8.31.8..C..4..8..DD.42...........
36..D.27.27..8.6...D..A.C......8.31.C7.C3.A..4..BB.43...........
37..D.27.27..8.6...E..A.C......8.31.AB.C3.......CC.2............
38..E.26.26..7.6...E..9.C..4...8.31.4A.C..6..C..DD.41...........
39..F.25.25..7.6...F..9.C......8.31.CD.C3.C..8..BB.43...........
3A..F.25.25..7.6..1...9.C......8.31.A1.C3.2..4..CC.2............
3B.1..24.24..6.6..11..8.C..4...8.31.E4.C..8.....DD.61...........
3C.11.23.23..6.6..11..8.C......8.31.47.C3.E..C..BB.41...........
3D.11.23.23..6.6..12..8.C......8.31.AB.C3.4..8..CC.2............
3E.12.22.22..5.6..13..7.C..4...8.31.EE.C..A..4..DD.61...........
3F.13.22.22..5.6..14..7.C......8.31.A2.82.......BB.6............
4..14.22.21..5.6..14..6.C..4...8.31.41.C1.6..C..DD.41...........
41.16.2..2...4.6..15..6.C..4...8.31.C4.CE.C..8..DD.43...........
42.15.2..2...4.6..16..6.C..4...8.31.A8.CE.2..4..CC.2............
43.16.1E.1F..4.6..17..5.C..4...8.31.EF.CD.8.....DD.61...........
44.18.1E.1E..3.6..17..5.C..4...8.31.4E.CE.E..C..DD.41...........
45.17.1E.1E..3.6..18..5.C..4...8.31.A2.CE.4..8..CC.2............
46.18.1C.1D..3.6..19..4.C..4...8.31.E5.CD.A..4..DD.61...........
47.19.1D.1D..3.6..1A..4.C......8.31.A9.83.......BB.6............
48.1A.1C.1C..2.6..1A..3.C..4...8.31.48.C..6..C..DD.41...........
49.1B.1B.1B..2.6..1B..3.C......8.31.CF.C3.C..8..BB.43...........
4A.1B.1B.1B..2.6..1C..3.C......8.31.A3.C3.2..4..CC.2............
4B.1C.1A.1A..1.6..1D..2.C..4...8.31.E6.C..8.....DD.61...........
4C.1D.19.19..1.6..1D..2.C......8.31.45.C3.E..C..BB.41...........
4D.1D.19.19..1.6..1E..2.C......8.31.A9.C3.4..8..CC.2............
4E.1E.18.18....6..1F..1.FF.44..8.31.EC.C..A..4..DD.61...........
4F.1F.18.18....6..2...1.FF..4..8.31.A..82.A..3F.BB.6............
5..2..18.18....6..21....FF.44..8.B1.A4.8..A..3E.DD.6............
51.2..18.18..A.6..2...2.E..6...8.69.............DD..............
52.1F.17.17..A.6..1F..2.E......8.69.CF.C3.6..E..BB.43...........
53.1F.17.16..A.6..1F..2.E......8.69.5E.C3.C..C..CC.1............
54.1E.16.15..9.6..1F..2.E..4...8.69.5D.46.8..8..DD.5............
55.1F.15.14..9.6..1F..2.E......8.69.5C.43.E..6..BB.5............
56.1E.14.13..8.6..1F..2.E..4...8.69.5F.46.A..2..DD.5............
57.1E.12.12..8.6..1E..1.E..4...8.69.DA.CD.6..E..DD.52...........
58.1E.12.11..7.6..1E..1.E..4...8.69.59.4..C..C..11.5............
59.1E.11.1...7.6..1E..1.E......8.69.58.41.8..8..BB.5............
5A.1E.1...F..6.6..1E..1.E..4...8.69.5B.4..E..6..DD.5............
5B.1E..F..E..6.6..1E..1.E......8.69.5A.41.A..2..BB.5............
5C.1E..E..D..5.6..1D..1.E..4...8.69.D5.C2.6..E..DD.52...........
5D.1D..D..C..5.6..1D..1.E......8.69.54.43.C..C..BB.5............
5E.1C..C..B..4.6..1D..1.E..4...8.69.57.46.8..8..DD.5............
5F.1D..B..A..4.6..1D..1.E......8.69.56.43.E..6..BB.5............
6..1C..A..9..3.6..1D..1.E..4...8.69.55.46.A..2..DD.5............
61.1C..8..8..3..1.1C....E..48..8.69.D..CD.6..E..DD.52...........
62.1C..8..7..2..1.1C....E..48..8.69.53.4..61.E..11.5............
63.1C..7..6..2..1.1C....E...8..8.69.52.41.62.E..BB.5............
64.1C..6..5..1..1.1C....E..48..8.69.51.4..63.E..DD.5............
65.1C..5..4..1..1.1C....E...8..8.69.5..41.64.E..BB.5............
66.1C..4..3.....1.1C....E..48..8.E9.53.4..65.E..DD.5............
```

SURFACE-VI EDGE PARAMETERS-B

SURFACE-VII GRAPHICS

```
#S9901
9901 14
9902 14
9903 00
9904 00
9905 04
9906 08
9907 80
9908 01
9909 06
990A 04 .
#...............................................................
................................................................
................................................................
................................................................
................................................................
................................................................
................................................................
................................................................
..........2156..................................................
..........546...................................................
.........15365..................................................
.........516.85.................................................
.........5.6..91................................................
........5E5...A5................................................
.......15D5.....B1..............................................
.......5B55......C5.............................................
.......5A545......D1............................................
..........535....F5.............................................
...........125.4..1151..........................................
............5..E...135..........................................
.............5.144.12141........................................
...............CDB4.............................................
...............151A4.15161......................................
.................594............................................
..................184.485.......................................
...................56.41A5......................................
....................5.144C5.....................................
......................2314E5....................................
......................151.3F1...................................
........................5F3.5...................................
.........................1E313..................................
..........................5C2A5.................................
...........................5.133................................
.............................8973...............................
.............................15163..............................
..............................2553..............................
..............................28143.............................
.................................523............................
................................2B5.2...........................
...................................5F...........................
..................................2E1...........................
................................................................
................................................................
................................................................
................................................................
................................................................
................................................................
................................................................
................................................................
................................................................
................................................................
```

```
..............................................................
..............................................................
.1..C..8..8.1..8...C..E.7..6...8..1.............DD............
.2..C..8..9.1..8...C..E.7..4...8..1.51.......E..CC.1..........
.3..D..9..9.1..8...D..E.7......8..1.85....8..5..BB.42.........
.4..D..9..A.1..8...D..E.7......8..1.56.......C..CC.1..........
.5..E..A..A..F.8...E..D.7..4...8..1.8A....8..3..DD.42.........
.6..E..A..B..F.8...E..D.7..4...8..1.5B.......A..CC.1..........
.7..F..B..B..F.8...F..D.7......8..1.8F....8..1..BB.42.........
.8..F..B..C..F.8...F..D.7......8..1.5C.......8..CC.1..........
.9.1...C..D..E.8..1...C.7..4...8..1.D1.......6..DD.52.........
.A.11..D..E..E.8..11..C.7......8..1.D6.......4..BB.52.........
.B.12..E..F..D.8..12..B.7..4...8..1.DB.......2..DD.52.........
.C.13..F.1...D.8..13..B.7......8..1.DC..........BB.52.........
.D.14.1..11..C.8..13..B.7..4...8..1.5D.......E..DD.5..........
.E.14.12.11..C.8..14..A.7..4...8..1.81....8..5..DD.42.........
.F.14.11.12..C.8..14..A.7..4...8..1.52.......C..CC.1..........
1..16.12.12..B.8..15..A.7..4...8..1.86....8..3..DD.42.........
11.15.12.13..B.8..15..A.7..4...8..1.57.......A..CC.1..........
12.16.14.13..B.8..16..9.7..4...8..1.8B....8..1..DD.42.........
13.16.13.14..B.8..16..9.7..4...8..1.58.......8..CC.1..........
14.18.14.15..A.8..17..9.7..4...8..1.DD.......6..DD.52.........
15.18.16.16..A.8..18..8.7..4...8..1.D2.......4..DD.52.........
16.1A.16.17..9.8..19..8.7..4...8..1.D7.......2..DD.52.........
17.1A.18.18..9.8..1A..7.7..4...8..1.D8..........DD.52.........
18.1A.18.19..8.8..1A..7.7..4...8..1.59.......E..11.5..........
19.1B.19.19..8.8..1B..7.7......8..1.8D....8..5..BB.42.........
1A.1B.19.1A..8.8..1B..7.7......8..1.5E.......C..CC.1..........
1B.1C.1A.1A..7.8..1C..6.7..4...8..1.82....8..3..DD.42.........
1C.1C.1A.1B..7.8..1C..6.7..4...8..1.53.......A..CC.1..........
1D.1D.1B.1B..7.8..1D..6.7......8..1.87....8..1..BB.42.........
1E.1D.1B.1C..7.8..1D..6.7......8..1.54.......8..CC.1..........
1F.1E.1C.1D..6.8..1E..5.7..4...8..1.D9.......6..DD.52.........
2..1F.1D.1E..6.8..1F..5.7......8..1.DE.......4..BB.52.........
21.2..1E.1F..5.8..2...4.7..4...8..1.D3.......2..DD.52.........
22.21.1F.2...5.8..21..4.7......8..1.D4..........BB.52.........
23.22.2..21..4.8..21..4.7..4...8..1.55.......E..DD.5..........
24.22.22.21..4.8..22..3.7..4...8..1.89....8..5..DD.42.........
25.22.21.22..4.8..22..3.7..4...8..1.5A.......C..CC.1..........
26.24.22.22..3.8..23..3.7..4...8..1.8E....8..3..DD.42.........
27.23.22.23..3.8..23..3.7..4...8..1.5F.......A..CC.1..........
28.24.24.23..3.8..24..2.7..4...8..1.83....8..1..DD.42.........
29.24.23.24..3.8..24..2.7..4...8..1.5........8..CC.1..........
2A.26.24.25..2.8..25..2.7..4...8..1.D5.......6..DD.52.........
2B.26.26.26..2.8..26..1.7..4...8..1.DA.......4..DD.52.........
2C.28.26.27..1.8..27..1.7..4...8..1.DF.......2..DD.52.........
2D.28.28.28..1.FF.28....7..48..8..1.D...........DD.52.........
2E.28.28.29....FF.28....7..48..8.81.51....FE....DD.5..........
2F.28.28.28..C.A..28.1..8..6...8.71.............DD............
3..27.27.27..C.A..27.1..8......8.71.CF....A..8..BB.43.........
31.26.26.26..B.A..26..F.8..4...8.71.CA....E..8..DD.43.........
32.26.26.26..B.A..25..F.8..4...8.71.A6....2..8..CC.2..........
33.25.25.25..B.A..25..F.8......8.71.45....C.....BB.41.........
..............................................................
```

SURFACE-VII EDGE PARAMETERS-A

```
..............................................................
..............................................................
33.25.25.25..B.A..25..F.8......8.71.45....C.....BB.41...........
34.25.25.25..B.A..24..F.8......8.71.A1....6..8..CC.2............
35.24.24.24..A.A..23..E.8..4...8.71.EC....A..8..DD.61...........
36.23.23.23..A.A..22..E.8......8.71.EB....E..8..BB.61...........
37.22.22.23..A.A..21..D.8..4...8.71.A7....2..8..DD.6............
38.2..22.22..9.A..21..D.8..4...8.71.46....C.....DD.41...........
39.21.22.22..9.A..2...D.8..4...8.71.A2....6..8..CC.2............
3A.2..2..21..9.A..1F..C.8..4...8.71.ED....A..8..DD.61...........
3B.1E.2..2...8.A..1E..C.8..4...8.71.E8....E..8..DD.61...........
3C.1E.2..2...8.A..1D..B.8..4...8.71.A4....2..8..11.6............
3D.1D.1F.1F..8.A..1D..B.8......8.71.47....C.....BB.41...........
3E.1D.1F.1F..8.A..1C..B.8......8.71.A3....6..8..CC.2............
3F.1C.1E.1E..7.A..1B..A.8..4...8.71.EE....A..8..DD.61...........
4..1B.1D.1D..7.A..1A..A.8......8.71.E9....E..8..BB.61...........
41.1A.1C.1D..7.A..19..9.8..4...8.71.A5....2..8..DD.6............
42.18.1C.1C..6.A..19..9.8..4...8.71.44....C.....DD.41...........
43.19.1C.1C..6.A..18..9.8..4...8.71.A.....6..8..CC.2............
44.18.1A.1B..6.A..17..8.8..4...8.71.EF....A..8..DD.61...........
45.16.1A.1A..5.A..16..8.8..4...8.71.EA....E..8..DD.61...........
46.16.1A.1A..5.A..15..7.8..4...8.71.A6....2..8..11.6............
47.15.19.19..5.A..15..7.8......8.71.45....C.....BB.41...........
48.15.19.19..5.A..14..7.8......8.71.A1....6..8..CC.2............
49.14.18.18..4.A..13..6.8..4...8.71.EC....A..8..DD.61...........
4A.13.17.17..4.A..12..6.8......8.71.EB....E..8..BB.61...........
4B.12.16.17..4.A..11..5.8..4...8.71.A7....2..8..DD.6............
4C.1..16.16..3.A..11..5.8..4...8.71.46....C.....DD.41...........
4D.11.16.16..3.A..1...5.8..4...8.71.A2....6..8..CC.2............
4E.1..14.15..3.A...F..4.8..4...8.71.ED....A..8..DD.61...........
4F..E.14.14..2.A...E..4.8..4...8.71.E8....E..8..DD.61...........
5...E.14.14..2.A...D..3.8..4...8.71.A4....2..8..11.6............
51..D.13.13..2.A...D..3.8......8.71.47....C.....BB.41...........
52..D.13.13..2.A...C..3.8......8.71.A3....6..8..CC.2............
53..C.12.12..1.A...B..2.8..4...8.71.EE....A..8..DD.61...........
54..B.11.11..1.A...A..2.8......8.71.E9....E..8..BB.61...........
55..A.1..11..1.A...9..1.8..4...8.71.A5....2..8..DD.6............
56..8.1..1.....A...9..1..1.44..8.71.44....C.....DD.41...........
57..9.1..1.....A...8..1..1.44..8.71.A.....C...1.CC.2............
58..8.1..1.....A...7.....1.44..8.F1.AC....C...2.DD.6............
59..8.1..1...4.8...8..2.4..6...8.29.............DD..............
5A..8.1...F..4.8...8..2.4..4...8.29.53....8..4..CC.1............
5B..8..F..E..4.8...8..2.4......8.29.52....8..C..BB.5............
5C..8..E..E..3.8...9..2.4..4...8.29.86..........DD.42...........
5D..9..E..D..3.8...9..2.4..4...8.29.55....8..4..CC.1............
5E..9..D..C..3.8...9..2.4......8.29.54....8..C..BB.5............
5F..A..C..C..2.8...A..1.4..4...8.29.88..........DD.42...........
6...A..C..B..2.8...A..1.4..4...8.29.5B....8..4..CC.1............
61..A..B..A..2.8...A..1.4......8.29.5A....8..C..BB.5............
62..A..A..A..1.8...B..1.4..4...8.29.8E..........DD.42...........
63..B..A..9..1.8...B..1.4..4...8.29.5D....8..4..CC.1............
64..B..9..8..1.8...B..1.4......8.29.5C....8..C..BB.5............
65..C..8..8....8...C....4..4...8.A9.8...........DD.42...........
..............................................................
```

SURFACE-VII EDGE PARAMETERS-B

APERTURE PROCESSOR TABLES

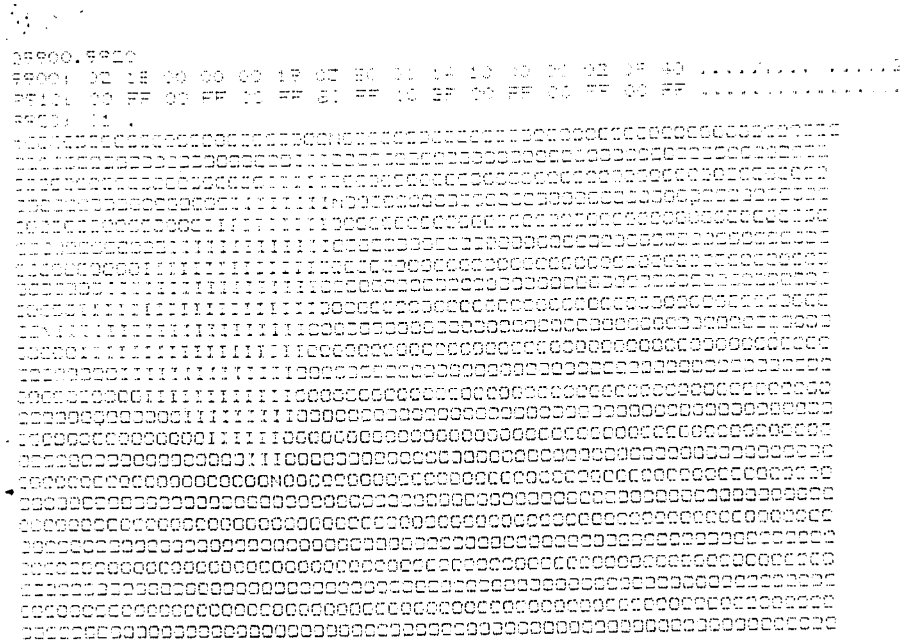

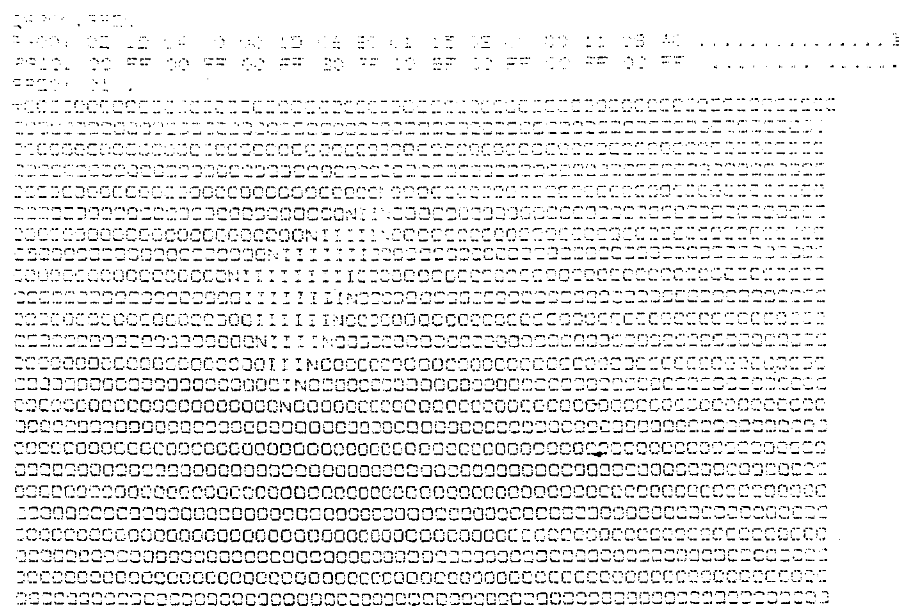

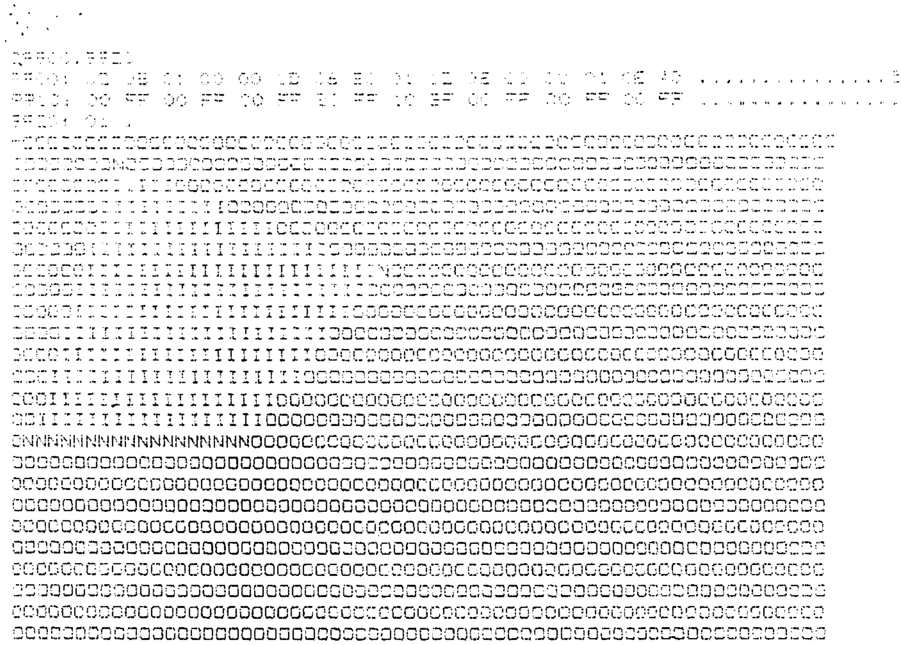

```
#4 IIB1 .AFCX
#DFF00.FFF0
FF00: 02 10 04 00 00 22 1E 80 01 14 0F 40 00 FF 1E FF ....'.....@....
FF10: 00 FF 00 FF 00 FF 80 FF 10 BF 00 FF 00 FF 1E FF ................
FF20: 01 .
#
=
#=
11 IIB2 .AFCX
#
#OOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
OOOOOOOOOOOOOOOOOOOONOOOOOOOOOOOOOOOOOOOOOOOOOOOOOOOOOOOOOOOOOOOOOO
OOOOOOOOOOOOOOOONIIIIOOOOOOOOOOOOOOOOOOOOOOOOOOOOOOOOOOOOOOOOOOOOOO
OOOOOOOOOOOOOOOOOOIIIIOOOOOOOOOOOOOOOOOOOOOOOOOOOOOOOOOOOOOOOOOOOOO
OOOOOOOOOOOOOOOOOOOIIIIOOOOOOOOOOOOOOOOOOOOOOOOOOOOOOOOOOOOOOOOOOOO
OOOOOOOOOOOOOOOOOOOOIIIIOOOOOOOOOOOOOOOOOOOOOOOOOOOOOOOOOOOOOOOOOOO
OOOOOOOOOOOOOOOOOOOOOOIIIOOOOOOOOOOOOOOOOOOOOOOOOOOOOOOOOOOOOOOOOOO
OOOOOOOOOOOOOOOOOOOOOOOIIIOOOOOOOOOOOOOOOOOOOOOOOOOOOOOOOOOOOOOOOOO
OOOOOOOOOOOOOOOOOOOOOOOOIIIOOOOOOOOOOOOOOOOOOOOOOOOOOOOOOOOOOOOOOOO
OOOOOOOOOOOOOOOOOOOOOOOOOOIIOOOOOOOOOOOOOOOOOOOOOOOOOOOOOOOOOOOOOOO
OOOOOOOOOOOOOOOOOOOOOOOOOOOIIOOOOOOOOOOOOOOOOOOOOOOOOOOOOOOOOOOOOOO
OOOOOOOOOOOOOOOOOOOOOOOOOOOOIIOOOOOOOOOOOOOOOOOOOOOOOOOOOOOOOOOOOOO
OOOOOOOOOOOOOOOOOOOOOOOOOOOOOIIOOOOOOOOOOOOOOOOOOOOOOOOOOOOOOOOOOOO
OOOOOOOOOOOOOOOOOOOOOOOOOOOOOOOIOOOOOOOOOOOOOOOOOOOOOOOOOOOOOOOOOOO
OOOOOOOOOOOOOOOOOOOOOOOOOOOOOOOOIOOOOOOOOOOOOOOOOOOOOOOOOOOOOOOOOOO
OOOOOOOOOOOOOOOOOOOOOOOOOOOOOOOOOIOOOOOOOOOOOOOOOOOOOOOOOOOOOOOOOOO
OOOOOOOOOOOOOOOOOOOOOOOOOOOOOOOOOONOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOO
```

```
[illegible]
FF10 1C 18 02 00 00 0F 3C B0 01 0E 0F 0C 00 0E 0D 4C ...............2
FF11 00 FF 00 FF 00 FF 81 FF 10 BF 00 FF 00 FF 00 FF ................
FF12 01 .
[illegible]
```

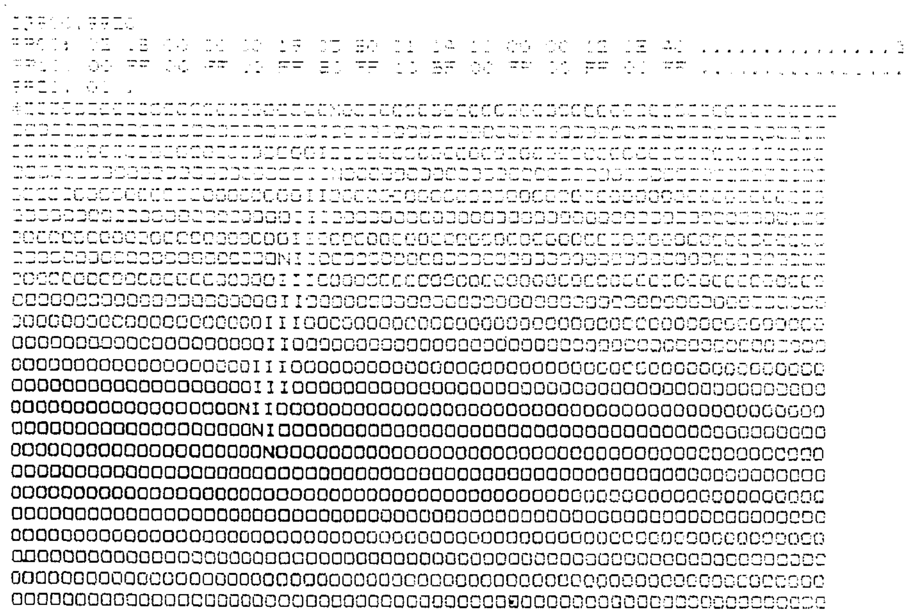

```
FF00: 02 02 1A 00 C0 17 01 E0 01 7E 01 40 00 FF 02 FB ..........2.3....
FF10: 00 FF 00 FF 00 FF 00 FF 10 EF 00 FF 00 FF 02 FF ................
FF20: 01 .
#
#
#
#OOOOOOOOOOOOOOOOOOOOOOOOOOOOOOOOOOOOOOOOOOOOOOOOOOOOOOOOOOOOOOO
OOOOOOOOOOOOOOOOOOOOOOONNNNNNNNNNNNNNNNNNNNNNNNNNNNOOOOOOOOOOOOOO
OOOOOOOOOOOOOOOOOOOOOONIIIIIIIIIIIIIIIIIIIIIIIIOOOOOOOOOOOOOOOOO
OOOOOOOOOOOOOOOOOOOOONIIIIIIIIIIIIIIIIIIIIIIIIOOOOOOOOOOOOOOOOOO
OOOOOOOOOOOOOOOOOOOONIIIIIIIIIIIIIIIIIIIIIIIIOOOOOOOOOOOOOOOOOOO
OOOOOOOOOOOOOOOOOOONIIIIIIIIIIIIIIIIIIIIIOOOOOOOOOOOOOOOOOOOOOOO
OOOOOOOOOOOOOOOOOONIIIIIIIIIIIIIIIIIIIIOOOOOOOOOOOOOOOOOOOOOOOOO
OOOOOOOOOOOOOOOOONIIIIIIIIIIIIIIIIIIIOOOOOOOOOOOOOOOOOOOOOOOOOOO
OOOOOOOOOOOOOOOONIIIIIIIIIIIIIIIINOOOOOOOOOOOOOOOOOOOOOOOOOOOOOO
OOOOOOOOOOOOOOONIIIIIIIIIIIIIIIIOOOOOOOOOOOOOOOOOOOOOOOOOOOOOOOO
OOOOOOOOOOOOOONIIIIIIIIIIIIIIIOOOOOOOOOOOOOOOOOOOOOOOOOOOOOOOOOO
OOOOOOOOOOOOONIIIIIIIIIIIIIIOOOOOOOOOOOOOOOOOOOOOOOOOOOOOOOOOOOO
OOOOOOOOOOOONIIIIIIIIIIIIOOOOOOOOOOOOOOOOOOOOOOOOOOOOOOOOOOOOOOO
OOOOOOOOOOONIIIIIIIIIIIOOOOOOOOOOOOOOOOOOOOOOOOOOOOOOOOOOOOOOOOO
OOOOOOOOOONIIIIIIIIIIOOOOOOOOOOOOOOOOOOOOOOOOOOOOOOOOOOOOOOOOOOO
OOOOOOOOONIIIIIIIIOOOOOOOOOOOOOOOOOOOOOOOOOOOOOOOOOOOOOOOOOOOOOO
OOOOOOOONIIIIIIOOOOOOOOOOOOOOOOOOOOOOOOOOOOOOOOOOOOOOOOOOOOOOOOO
OOOOOOONIIIIIOOOOOOOOOOOOOOOOOOOOOOOOOOOOOOOOOOOOOOOOOOOOOOOOOOO
OOOOOONIIIIOOOOOOOOOOOOOOOOOOOOOOOOOOOOOOOOOOOOOOOOOOOOOOOOOOOOO
OOOOONIIIOOOOOOOOOOOOOOOOOOOOOOOOOOOOOOOOOOOOOOOOOOOOOOOOOOOOOOO
OOOONIIOOOOOOOOOOOOOOOOOOOOOOOOOOOOOOOOOOOOOOOOOOOOOOOOOOOOOOOOO
OOONIOOOOOOOOOOOOOOOOOOOOOOOOOOOOOOOOOOOOOOOOOOOOOOOOOOOOOOOOOOO
OONOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
```

[illegible]

```
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOONOOOOOOOOOOOOOOOOOOOOOOOOOOOOOOOOOOOOOOOOOOOO
OOOOOOOOOOOOOOOOIOOOOOOOOOOOOOOOOOOOOOOOOOOOOOOOOOOOOOOOOOO
OOOOOOOOOOOOOOOIIOOOOOOOOOOOOOOOOOOOOOOOOOOOOOOOOOOOOOOOOOOO
OOOOOOOOOOOOOOOIIIOOOOOOOOOOOOOOOOOOOOOOOOOOOOOOOOOOOOOOOOOO
OOOOOOOOOOOOIIIIOOOOOOOOOOOOOOOOOOOOOOOOOOOOOOOOOOOOOOOOOOOO
OOOOOOOOOOOOIIIIIIOOOOOOOOOOOOOOOOOOOOOOOOOOOOOOOOOOOOOOOOOO
OOOOOOOOOOOIIIIIIIOOOOOOOOOOOOOOOOOOOOOOOOOOOOOOOOOOOOOOOOOO
OOOOOOOOOOIIIIIIIIOOOOOOOOOOOOOOOOOOOOOOOOOOOOOOOOOOOOOOOOOO
OOOOOOOOIIIIIIIIIIOOOOOOOOOOOOOOOOOOOOOOOOOOOOOOOOOOOOOOOOOO
OOOOOOOOIIIIIIIIIIIIOOOOOOOOOOOOOOOOOOOOOOOOOOOOOOOOOOOOOOOO
OOOOOOONIIIIIIIIIIIIOOOOOOOOOOOOOOOOOOOOOOOOOOOOOOOOOOOOOOOO
OOOOOOOOOOOONIIIIIIIIOOOOOOOOOOOOOOOOOOOOOOOOOOOOOOOOOOOOOOO
OOOOOOOOOOOOOOOOOIIIOOOOOOOOOOOOOOOOOOOOOOOOOOOOOOOOOOOOOOOO
OOOOOOOOOOOOOOOOOOOOONOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOO
```

```
D9900,9920
9900: 02 0A 15 00 00 37 0A 80 01 0A 04 40 00 FF 02 FB .....7.....@....
9910: 00 FF 00 FF 00 FF 80 FF 10 BF 00 FF 00 FF 02 FF ................
9920: 01 .
#
#
#
#OOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOO
OOOOOOOOOONOOOOOOOOOOOOOOOOOOOOOOOOOOOOOOOOOOOOOOOOOOOOOOOOOOOOOOO
OOOOOOOOOONIIIIIIIOOOOOOOOOOOOOOOOOOOOOOOOOOOOOOOOOOOOOOOOOOOOOOOO
OOOOOOOOOONIIIIIIIIIIIIIINOOOOOOOOOOOOOOOOOOOOOOOOOOOOOOOOOOOOOOOO
OOOOOOOOOONIIIIIIIIIIIIIIIIIIIIIIIOOOOOOOOOOOOOOOOOOOOOOOOOOOOOOOO
OOOOOOOOOONIIIIIIIIIIIIIIIIIIIIIIIIIIIIIINOOOOOOOOOOOOOOOOOOOOOOOO
OOOOOOOOOONIIIIIIIIIIIIIIIIIIIIIIIIIIIIIIIIIIIIIIIIOOOOOOOOOOOOOOOO
OOOOOOOOOONIIIIIIIIIIIIIIIIIIIIIIIIIIIIIIIIIIIIIIIIIIIIIIINOOOOOOOOO
OOOOOOOOOONIIIIIIIIIIIIIIIIIIIIIIIIIIIIIIIIIIIIIIIIIIIIIOOOOOOOOOOOOOO
OOOOOOOOOONIIIIIIIIIIIIIIIIIIIIIIIIIIIIIIIIIIIIIIIOOOOOOOOOOOOOOOOOO
OOOOOOOOOONIIIIIIIIIIIIIIIIIIIIIIIIIIIIIIIIIIOOOOOOOOOOOOOOOOOOOOOO
OOOOOOOOOONIIIIIIIIIIIIIIIIIIIIIIIIIIIIIOOOOOOOOOOOOOOOOOOOOOOOOOO
OOOOOOOOOONIIIIIIIIIIIIIIIIIIIIIIIIIOOOOOOOOOOOOOOOOOOOOOOOOOOOOOO
OOOOOOOOOONIIIIIIIIIIIIIIIIIIIIIOOOOOOOOOOOOOOOOOOOOOOOOOOOOOOOOOO
OOOOOOOOOONIIIIIIIIIIIIIIIIIOOOOOOOOOOOOOOOOOOOOOOOOOOOOOOOOOOOOOO
OOOOOOOOOONIIIIIIIIIIIIOOOOOOOOOOOOOOOOOOOOOOOOOOOOOOOOOOOOOOOOOOO
OOOOOOOOOONIIIIIIIIOOOOOOOOOOOOOOOOOOOOOOOOOOOOOOOOOOOOOOOOOOOOOOO
OOOOOOOOOONIIIOOOOOOOOOOOOOOOOOOOOOOOOOOOOOOOOOOOOOOOOOOOOOOOOOOOO
OOOOOOOOOONOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOO
```

```
FF00: 01 0A 1E 00 00 77 04 80 01 0A 04 40 00 FF 01 FE ......~.....a....
FF10: 00 FF 00 FF 00 FF 80 FF 10 BF 00 FF 01 FF 00 FF ................
FF20: 01 .
#
#
#
=0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000NNNNNNNNNNNNNNNNNNNNNNNNNNNNNNNNNNNNNNNNNNNNNN00000000
0000000000NIIIIIIIIIIIIIIIIIIIIIIIIIIIIIIIIIIIIIIIIII00000000000
0000000000NIIIIIIIIIIIIIIIIIIIIIIIIIIIIIIIIIIIIIII00000000000000
0000000000NIIIIIIIIIIIIIIIIIIIIIIIIIIIIIIIIIIIII0000000000000000
0000000000NIIIIIIIIIIIIIIIIIIIIIIIIIIIIIIIII0000000000000000000
0000000000NIIIIIIIIIIIIIIIIIIIIIIIIIIIIIII0000000000000000000000
0000000000NIIIIIIIIIIIIIIIIIIIIIIIIIIIII000000000000000000000000
0000000000NIIIIIIIIIIIIIIIIIIIIIIIIII000000000000000000000000000
0000000000NIIIIIIIIIIIIIIIIIIIIIII000000000000000000000000000000
0000000000NIIIIIIIIIIIIIIIIIIIII00000000000000000000000000000000
0000000000NIIIIIIIIIIIIIIIIII00000000000000000000000000000000000
0000000000NIIIIIIIIIIIIIII00000000000000000000000000000000000000
0000000000NIIIIIIIIIIIII0000000000000000000000000000000000000000
0000000000NIIIIIIIIII0000000000000000000000000000000000000000000
0000000000NIIIIIII0000000000000000000000000000000000000000000000
0000000000NIIIII000000000000000000000000000000000000000000000000
0000000000NII000000000000000000000000000000000000000000000000000
0000000000N00000000000000000000000000000000000000000000000000000
0000000000000000000000000000000000000000000000000000000000000000
0000000000000000000000000000000000000000000000000000000000000000
```

```
[illegible] 1I 1D 15 00 00 07 04 80 01 0A 04 40 00 FF 02 FB .....?.....B....
?F10: 00 FF 00 FF 00 FF 20 FF 10 BF 00 FF 00 FF 02 FF ................
FFC0: 01 .
```

```
FF00: 0C 16 15 00 00 37 04 80 01 04 04 4C 00 FF 0C FB .....7.....2....
FF10: 00 FF 00 FF 00 FF 80 FF 10 8F 00 FF 00 FF 02 FF ................
FF20: 01 .
=
=
=
=OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOONNNNNNNNNNNNNNNNNNNNNNNNNNNNNNNNNNNNNNNNNNNNNNNNNNNOOOOOOOOO
OOOOOOOOOOOOOIIIIIIIIIIIIIIIIIIIIIIIIIIIIIIIIIIIIIIIIIIIIIIIOOOOOOOOOOO
OOOOOOOOOOOOOIIIIIIIIIIIIIIIIIIIIIIIIIIIIIIIIIIIIIIIIIIOOOOOOOOOOOOOOOO
OOOOOOOOOOOOOOIIIIIIIIIIIIIIIIIIIIIIIIIIIIIIIIIIIIIIIOOOOOOOOOOOOOOOOO
OOOOOOOOOOOOOOIIIIIIIIIIIIIIIIIIIIIIIIIIIIIIIIIIIIIIOOOOOOOOOOOOOOOOOO
OOOOOOOOOOOOOOOIIIIIIIIIIIIIIIIIIIIIIIIIIIIIIIIIIOOOOOOOOOOOOOOOOOOOOO
OOOOOOOOOOOOOOOOIIIIIIIIIIIIIIIIIIIIIIIIIIIIIIIIOOOOOOOOOOOOOOOOOOOOOO
OOOOOOOOOOOOOOOOOIIIIIIIIIIIIIIIIIIIIIIIIIIIIIOOOOOOOOOOOOOOOOOOOOOOOO
OOOOOOOOOOOOOOOOOOIIIIIIIIIIIIIIIIIIIIIIIIIOOOOOOOOOOOOOOOOOOOOOOOOOOO
OOOOOOOOOOOOOOOOOOOIIIIIIIIIIIIIIIIIIIIIIOOOOOOOOOOOOOOOOOOOOOOOOOOOOO
OOOOOOOOOOOOOOOOOOOOIIIIIIIIIIIIIIIIIIOOOOOOOOOOOOOOOOOOOOOOOOOOOOOOOO
OOOOOOOOOOOOOOOOOOOOIIIIIIIIIIIIIIIIOOOOOOOOOOOOOOOOOOOOOOOOOOOOOOOOOO
OOOOOOOOOOOOOOOOOOOOOIIIIIIIIIIIIIOOOOOOOOOOOOOOOOOOOOOOOOOOOOOOOOOOOO
OOOOOOOOOOOOOOOOOOOOOOIIIIIIIIIIOOOOOOOOOOOOOOOOOOOOOOOOOOOOOOOOOOOOOO
OOOOOOOOOOOOOOOOOOOOOOIIIIIIIIOOOOOOOOOOOOOOOOOOOOOOOOOOOOOOOOOOOOOOOO
OOOOOOOOOOOOOOOOOOOOOOOIIIIIOOOOOOOOOOOOOOOOOOOOOOOOOOOOOOOOOOOOOOOOOO
OOOOOOOOOOOOOOOOOOOOOOOOIIOOOOOOOOOOOOOOOOOOOOOOOOOOOOOOOOOOOOOOOOOOOO
OOOOOOOOOOOOOOOOOOOOOOOONOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
```

```
FF00: 02 21 15 00 C0 37 04 80 01 0A 04 A0 00 FF 02 FB .!..7......!....
FF10: 00 FF 00 FF 00 FF 30 FF 10 5F 00 FF 00 FF 00 FF ................
FF20: 01 .
#
#
#
=OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOONNNNNNNNNNNNNNNNNNNNNNNNNNNNNNNNNNNNNNNNNNNNNNNNNNNNOOOOOOOO
OOOOOOOOOOOOOOIIIIIIIIIIIIIIIIIIIIIIIIIIIIIIIIIIIIIIIIIIIIIIIOOOOOOOOOOO
OOOOOOOOOOOOOOIIIIIIIIIIIIIIIIIIIIIIIIIIIIIIIIIIIIIIIIIIIIIIOOOOOOOOOOOO
OOOOOOOOOOOOOOOOOIIIIIIIIIIIIIIIIIIIIIIIIIIIIIIIIIIIIIIIIOOOOOOOOOOOOO
OOOOOOOOOOOOOOOOOOIIIIIIIIIIIIIIIIIIIIIIIIIIIIIIIIIIIIIOOOOOOOOOOOOOOO
OOOOOOOOOOOOOOOOOOOIIIIIIIIIIIIIIIIIIIIIIIIIIIIIIIIIIIOOOOOOOOOOOOOOOO
OOOOOOOOOOOOOOOOOOOOOIIIIIIIIIIIIIIIIIIIIIIIIIIIIIIIOOOOOOOOOOOOOOOOOO
OOOOOOOOOOOOOOOOOOOOOOIIIIIIIIIIIIIIIIIIIIIIIIIIIIOOOOOOOOOOOOOOOOOOOO
OOOOOOOOOOOOOOOOOOOOOOOIIIIIIIIIIIIIIIIIIIIIIIIIOOOOOOOOOOOOOOOOOOOOOO
OOOOOOOOOOOOOOOOOOOOOOOOOOIIIIIIIIIIIIIIIIIIIIIIOOOOOOOOOOOOOOOOOOOOOO
OOOOOOOOOOOOOOOOOOOOOOOOOOOIIIIIIIIIIIIIIIIIIIIOOOOOOOOOOOOOOOOOOOOOOO
OOOOOOOOOOOOOOOOOOOOOOOOOOOOIIIIIIIIIIIIIIIIIIIOOOOOOOOOOOOOOOOOOOOOOOOO
OOOOOOOOOOOOOOOOOOOOOOOOOOOOOOIIIIIIIIIIIIIIOOOOOOOOOOOOOOOOOOOOOOOOOO
OOOOOOOOOOOOOOOOOOOOOOOOOOOOOOOIIIIIIIIIIIIOOOOOOOOOOOOOOOOOOOOOOOOOOO
OOOOOOOOOOOOOOOOOOOOOOOOOOOOOOOOIIIIIIIOOOOOOOOOOOOOOOOOOOOOOOOOOOOOOOO
OOOOOOOOOOOOOOOOOOOOOOOOOOOOOOOOOOOIIIIOOOOOOOOOOOOOOOOOOOOOOOOOOOOOOO
OOOOOOOOOOOOOOOOOOOOOOOOOOOOOOOOOOOIIIOOOOOOOOOOOOOOOOOOOOOOOOOOOOOOOOO
OOOOOOOOOOOOOOOOOOOOOOOOOOOOOOOOOOOONOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOOOOOOO
```

```
FF00: 02 21 15 00 00 E7 0A 80 01 0A 04 40 00 FF 02 FB .!...7.....@....
FF10: 00 FF 00 FF 00 FF 30 FF 10 BF 00 FF 00 FF 02 FF ................
FF20: 01 .
#
#
#OOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOO
OOOOOOOOOONOOOOOOOOOOOOOOOOOOOOOOOOOOOOOOOOOOOOOOOOOOOOOOOOOOOO
OOOOOOOOOOOOIIIIIOOOOOOOOOOOOOOOOOOOOOOOOOOOOOOOOOOOOOOOOOOOOOO
OOOOOOOOOOOOOIIIIIIIIIIINOOOOOOOOOOOOOOOOOOOOOOOOOOOOOOOOOOOOOO
OOOOOOOOOOOOOOOIIIIIIIIIIIIIIIIIOOOOOOOOOOOOOOOOOOOOOOOOOOOOOOO
OOOOOOOOOOOOOOOOIIIIIIIIIIIIIIIIIIIIIINOOOOOOOOOOOOOOOOOOOOOOOO
OOOOOOOOOOOOOOOOOIIIIIIIIIIIIIIIIIIIIIIIIIIIIIOOOOOOOOOOOOOOOOO
OOOOOOOOOOOOOOOOOOIIIIIIIIIIIIIIIIIIIIIIIIIIIIIIIIIIINOOOOOOOOO
OOOOOOOOOOOOOOOOOOOIIIIIIIIIIIIIIIIIIIIIIIIIIIIIIIIINOOOOOOOOOO
OOOOOOOOOOOOOOOOOOOOIIIIIIIIIIIIIIIIIIIIIIIIIIIIIINOOOOOOOOOOOO
OOOOOOOOOOOOOOOOOOOOOOIIIIIIIIIIIIIIIIIIIIIIIIIINOOOOOOOOOOOOOO
OOOOOOOOOOOOOOOOOOOOOOOIIIIIIIIIIIIIIIIIIIIIIINOOOOOOOOOOOOOOOO
OOOOOOOOOOOOOOOOOOOOOOOOIIIIIIIIIIIIIIIIIIIINOOOOOOOOOOOOOOOOOO
OOOOOOOOOOOOOOOOOOOOOOOOOOIIIIIIIIIIIIIIIINOOOOOOOOOOOOOOOOOOOO
OOOOOOOOOOOOOOOOOOOOOOOOOOOIIIIIIIIIIIIINOOOOOOOOOOOOOOOOOOOOOO
OOOOOOOOOOOOOOOOOOOOOOOOOOOOIIIIIIIIIINOOOOOOOOOOOOOOOOOOOOOOOO
OOOOOOOOOOOOOOOOOOOOOOOOOOOOOIIIIINOOOOOOOOOOOOOOOOOOOOOOOOOOOO
OOOOOOOOOOOOOOOOOOOOOOOOOOOOOOOOIINOOOOOOOOOOOOOOOOOOOOOOOOOOOO
OOOOOOOOOOOOOOOOOOOOOOOOOOOOOOOONOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOO
```

```
7700: 02 21 0D 00 00 37 0A 80 01 0A 04 40 00 FF 02 FB .!...7.....@....
7710: 00 FF 00 FF 00 FF 80 FF 10 BF 00 FF 00 FF 02 FF ................
7720: 01 .
#
#
#0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000N00000000000000000000000000000000000000000000000000000
0000000000000IIIII0000000000000000000000000000000000000000000000
0000000000000000IIIIIIIIIN00000000000000000000000000000000000000
000000000000000000IIIIIIIIIIIIIII0000000000000000000000000000000
000000000000000000000IIIIIIIIIIIIIIIIIIIN00000000000000000000000
00000000000000000000000IIIIIIIIIIIIIIIIIIIIIIIII0000000000000000
00000000000000000000000000IIIIIIIIIIIIIIIIIIIIIIIIIIIIIN00000000
0000000000000000000000000000IIIIIIIIIIIIIIIIIIII0000000000000000
0000000000000000000000000000000IIIIIIIIII00000000000000000000000
000000000000000000000000000000000N000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
0000000000000000000000000000000000000000000000000000000000000000
```

```
F900: 02 21 0D 00 00 D7 0A E0 01 D6 14 40 00 FF 02 FE .....7...6.@....
F910: 0C FF 00 FF 00 7F E0 FF 10 BF 00 FF 00 FF 02 FF ................
F920: 01 .
#
#
#
#OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOONOOOOOOOO
OOOOOOOOOOOOOOOOOOOOOOOOOOOOOOOOOOOOOOOOOOOOOOOOIIIIIIIOOOOOOOOO
OOOOOOOOOOOOOOOOOOOOOOOOOOOOOOOOOOOOOOOOOIIIIIIIIIIIIIIOOOOOOOOO
OOOOOOOOOOOOOOOOOOOOOOOOOOOOOOOOONIIIIIIIIIIIIIIIIIIIIIOOOOOOOOO
OOOOOOOOOOOOOOOOOOOOOOOOOOOOOOOOOOOONIIIIIIIIIIIIIIIIIIOOOOOOOOO
OOOOOOOOOOOOOOOOOOOOOOOOOOOOOOOOOOOOOOONIIIIIIIIIIIIIIIOOOOOOOOO
OOOOOOOOOOOOOOOOOOOOOOOOOOOOOOOOOOOOOOOOOONIIIIIIIIIIIIOOOOOOOOO
OOOOOOOOOOOOOOOOOOOOOOOOOOOOOOOOOOOOOOOOOOOOONIIIIIIIIIOOOOOOOOO
OOOOOOOOOOOOOOOOOOOOOOOOOOOOOOOOOOOOOOOOOOOOOOOONIIIIIIOOOOOOOOO
OOOOOOOOOOOOOOOOOOOOOOOOOOOOOOOOOOOOOOOOOOOOOOOOOOONIIOOOOOOOOOO
OOOOOOOOOOOOOOOOOOOOOOOOOOOOOOOOOOOOOOOOOOOOOOOOOOOOOOONOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
```

```
9900: 02 05 14 00 00 14 05 80 01 37 05 47 00 FF 12 FB .........7.G....
9910: 00 FF 00 FF 00 FF 80 FF 10 BF 00 FF 00 FF 02 FF ................
9920: 01 .
#
#
#
+OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOONNNNNNNNNNNNNNNNNNNNNNNNNNNNNNNNNNNNOOOOOOOO
OOOOOOOOOOOOOOOOOOOOOIIIIIIIIIIIIIIIIIIIIIIIIIIIIIIIOOOOOOOOOOOO
OOOOOOOOOOOOOOOOOOOOOIIIIIIIIIIIIIIIIIIIIIIIIIIIOOOOOOOOOOOOOOOO
OOOOOOOOOOOOOOOOOOOOOIIIIIIIIIIIIIIIIIIIIIIINOOOOOOOOOOOOOOOOOOO
OOOOOOOOOOOOOOOOOOOOOIIIIIIIIIIIIIIIIIIIIIOOOOOOOOOOOOOOOOOOOOOO
OOOOOOOOOOOOOOOOOOOOOIIIIIIIIIIIIIIIIIIOOOOOOOOOOOOOOOOOOOOOOOOO
OOOOOOOOOOOOOOOOOOOOOIIIIIIIIIIIIIINOOOOOOOOOOOOOOOOOOOOOOOOOOOO
OOOOOOOOOOOOOOOOOOOOOIIIIIIIIIIIOOOOOOOOOOOOOOOOOOOOOOOOOOOOOOOO
OOOOOOOOOOOOOOOOOOOOOIIIIIIIIOOOOOOOOOOOOOOOOOOOOOOOOOOOOOOOOOOO
OOOOOOOOOOOOOOOOOOOOOIIINOOOOOOOOOOOOOOOOOOOOOOOOOOOOOOOOOOOOOOO
OOOOOOOOOOOOOOOOOOOOOIOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOONOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOO
```

```
[illegible]
FF00: 12 11 1E 00 CC 1E 24 B0 01 24 D0 00 00 74 0C 40 ......$..#0..#.$
FF10: 00 FF 00 FF 00 FF 80 FF 10 BF 00 FF 00 FF 12 FF ................
FF20: 01 .
=OOOOOOOOOOOOOOOOOOOOOOOOOOOOOOOOIONOOOOOOOOOOOOOOOOOOOOOOOOOO
OOOOOOOOOOOOOOOOOOOOOOOOOOOOOOOOOOONOOOOOOOOOOOOOOOOOOOOOOOOOO
OOOOOOOOOOOOOOOOOOOOOOOOOOOOOOOOOOINOOOOOOOOOOOOOOOOOOOOOOOOOO
OOOOOOOOOOOOOOOOOOOOOOOOOOOOOOOOOIINOOOOOOOOOOOOOOOOOOOOOOOOOO
OOOOOOOOOOOOOOOOOOOOOOOOOOOOOOOOIIINOOOOOOOOOOOOOOOOOOOOOOOOOO
OOOOOOOOOOOOOOOOOOOOOOOOOOOOOOOIIIINOOOOOOOOOOOOOOOOOOOOOOOOOO
OOOOOOOOOOOOOOOOOOOOOOOOOOOOOOOIIIINOOOOOOOOOOOOOOOOOOOOOOOOOO
OOOOOOOOOOOOOOOOOOOOOOOOOOOOOOIIIIINOOOOOOOOOOOOOOOOOOOOOOOOOO
OOOOOOOOOOOOOOOOOOOOOOOOOOOOOIIIIIINOOOOOOOOOOOOOOOOOOOOOOOOOO
OOOOOOOOOOOOOOOOOOOOOOOOOOOOIIIIIIINOOOOOOOOOOOOOOOOOOOOOOOOOO
OOOOOOOOOOOOOOOOOOOOOOOOOOOIIIIIIIINOOOOOOOOOOOOOOOOOOOOOOOOOO
OOOOOOOOOOOOOOOOOOOOOOOOOONIIIIIIIINOOOOOOOOOOOOOOOOOOOOOOOOOO
OOOOOOOOOOOOOOOOOOOOOOOOOOIIIIIIIIINOOOOOOOOOOOOOOOOOOOOOOOOOO
OOOOOOOOOOOOOOOOOOOOOOOOOIIIIIIIIIINOOOOOOOOOOOOOOOOOOOOOOOOOO
OOOOOOOOOOOOOOOOOOOOOOOOIIIIIIIIIIINOOOOOOOOOOOOOOOOOOOOOOOOOO
OOOOOOOOOOOOOOOOOOOOOOOIIIIIIIIIIIINOOOOOOOOOOOOOOOOOOOOOOOOOO
OOOOOOOOOOOOOOOOOOOOOOIIIIIIIIIIIIINOOOOOOOOOOOOOOOOOOOOOOOOOO
OOOOOOOOOOOOOOOOOOOOOOIIIIIIIIIIIIINOOOOOOOOOOOOOOOOOOOOOOOOOO
OOOOOOOOOOOOOOOOOOOOOIIIIIIIIIIIIIINOOOOOOOOOOOOOOOOOOOOOOOOOO
OOOOOOOOOOOOOOOOOOOOOIIIIIIIIIIIIIINOOOOOOOOOOOOOOOOOOOOOOOOOO
OOOOOOOOOOOOOOOOOOOOIIIIIIIIIIIIIIINOOOOOOOOOOOOOOOOOOOOOOOOOO
OOOOOOOOOOOOOOOOOOOIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOONIIIIIIIIIIIIIIIIINOOOOOOOOOOOOOOOOOOOOOOOOOO
OOOOOOOOOOOOOOOOOOOIIIIIIIIIIIIIIIINOOOOOOOOOOOOOOOOOOOOOOOOOO
OOOOOOOOOOOOOOOOOOOONIIIIIIIIIIIIIINOOOOOOOOOOOOOOOOOOOOOOOOOO
OOOOOOOOOOOOOOOOOOOOOOIIIIIIIIIIIIINOOOOOOOOOOOOOOOOOOOOOOOOOO
OOOOOOOOOOOOOOOOOOOOOOONIIIIIIIIIIINOOOOOOOOOOOOOOOOOOOOOOOOOO
OOOOOOOOOOOOOOOOOOOOOOOOOIIIIIIIIIINOOOOOOOOOOOOOOOOOOOOOOOOOO
OOOOOOOOOOOOOOOOOOOOOOOOOONIIIIIIIINOOOOOOOOOOOOOOOOOOOOOOOOOO
OOOOOOOOOOOOOOOOOOOOOOOOOOOOIIIIIIINOOOOOOOOOOOOOOOOOOOOOOOOOO
OOOOOOOOOOOOOOOOOOOOOOOOOOOOONIIIIINOOOOOOOOOOOOOOOOOOOOOOOOOO
OOOOOOOOOOOOOOOOOOOOOOOOOOOOOOOOIIINOOOOOOOOOOOOOOOOOOOOOOOOOO
OOOOOOOOOOOOOOOOOOOOOOOOOOOOOOOONIINOOOOOOOOOOOOOOOOOOOOOOOOOO
OOOOOOOOOOOOOOOOOOOOOOOOOOOOOOOOOOINOOOOOOOOOOOOOOOOOOOOOOOOOO
OOOOOOOOOOOOOOOOOOOOOOOOOOOOOOOOOOONOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOO
```

```
DF700,0F20
0F700: 02 [illegible] 01 00 00 02 28 B0 01 24 [illegible] 00 00 0F 00 40 ..........#0..".B
0F710: 00 FF 10 FF 00 FF 80 FF 10 BF [illegible] FF [illegible] FF 02 FF ................
0F720: 01 .
```
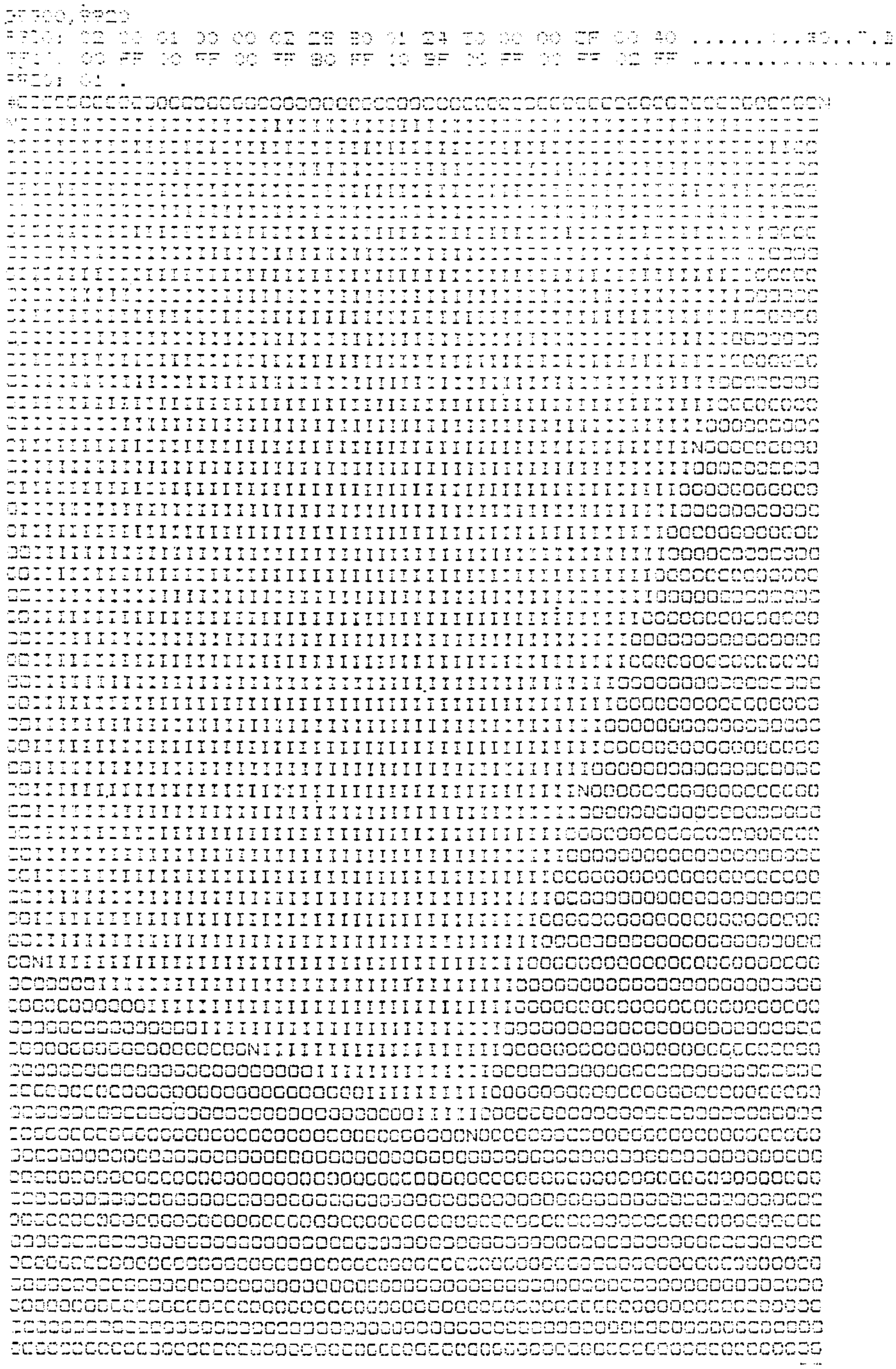
674

```
D9F00,F920
F9F0: 11 06 02 00 00 02 06 80 01 16 18 00 00 22 10 40 ..............2.@
F9..: 00 FF 00 FF 00 FF 80 FF 10 8F 00 FF 00 FF 02 FF ................
F920: 11 .
*OOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOONOOOOOOOOOOOOOOOOOOOOOOOOOOOOOOOOOOOOOOOOOOOOOOOOOOO
OOOOONIIIOOOOOOOOOOOOOOOOOOOOOOOOOOOOOOOOOOOOOOOOOOOOOOOOOO
OOOONIIIIIIIOOOOOOOOOOOOOOOOOOOOOOOOOOOOOOOOOOOOOOOOOOOOOOO
OOONIIIIIIIIIIIOOOOOOOOOOOOOOOOOOOOOOOOOOOOOOOOOOOOOOOOOOOO
OONIIIIIIIIIIIIIIOOOOOOOOOOOOOOOOOOOOOOOOOOOOOOOOOOOOOOOOOO
OOOOIIIIIIIIIIIIIIIIOOOOOOOOOOOOOOOOOOOOOOOOOOOOOOOOOOOOOOO
OOOOOIIIIIIIIIIIIIIIIIIOOOOOOOOOOOOOOOOOOOOOOOOOOOOOOOOOOOO
OOOOOIIIIIIIIIIIIIIIIIIIIINOOOOOOOOOOOOOOOOOOOOOOOOOOOOOOOO
OOOOOOIIIIIIIIIIIIIIIIIIIIIIIOOOOOOOOOOOOOOOOOOOOOOOOOOOOOO
OOOOOOOOIIIIIIIIIIIIIIIIIIIIIIIIOOOOOOOOOOOOOOOOOOOOOOOOOOO
OOOOOOOOIIIIIIIIIIIIIIIIIIIIIIIIIIIOOOOOOOOOOOOOOOOOOOOOOOO
OOOOOOOOOIIIIIIIIIIIIIIIIIIIIIIIIIIIIOOOOOOOOOOOOOOOOOOOOOO
OOOOOOOOOOIIIIIIIIIIIIIIIIIIIIIIIIIIIIIIOOOOOOOOOOOOOOOOOOO
OOOOOOOOOOOOIIIIIIIIIIIIIIIIIIIIIIIIIIIIIIIOOOOOOOOOOOOOOOO
OOOOOOOOOOOOOIIIIIIIIIIIIIIIIIIIIIIIIIIIIIIIINOOOOOOOOOOOOO
OOOOOOOOOOOOOOIIIIIIIIIIIIIIIIIIIIIIIIIIIIIOOOOOOOOOOOOOOOO
OOOOOOOOOOOOOOOIIIIIIIIIIIIIIIIIIIIIIIINOOOOOOOOOOOOOOOOOOO
OOOOOOOOOOOOOOOOIIIIIIIIIIIIIIIIIIIIOOOOOOOOOOOOOOOOOOOOOOO
OOOOOOOOOOOOOOOOOIIIIIIIIIIIIIINOOOOOOOOOOOOOOOOOOOOOOOOOOO
OOOOOOOOOOOOOOOOOOIIIIIIIIIIIOOOOOOOOOOOOOOOOOOOOOOOOOOOOOO
OOOOOOOOOOOOOOOOOOOIIIIIIINOOOOOOOOOOOOOOOOOOOOOOOOOOOOOOOO
OOOOOOOOOOOOOOOOOOOOIIIIOOOOOOOOOOOOOOOOOOOOOOOOOOOOOOOOOOO
OOOOOOOOOOOOOOOOOOOONOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOO
```

```
D9900,9920
9900: 02 06 02 00 00 02 16 80 01 16 1E 10 00 CF 1E 40 ..............?.8
9910: 00 FF 00 FF 00 FF 20 FF 10 BF 00 FF 00 FF 02 FF ................
9920: 01 .
#OOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOONOOOOOOOOOOOOOOOOOOOOOOOOOOOOOOOOOOOOOOOOOOOOOOOOOOOOOOOOOO
OOOOOOIIIOOOOOOOOOOOOOOOOOOOOOOOOOOOOOOOOOOOOOOOOOOOOOOOOOOOOOOOO
OOOOOOIIIIIIOOOOOOOOOOOOOOOOOOOOOOOOOOOOOOOOOOOOOOOOOOOOOOOOOOOOO
OOOOOOIIIIIIIIOOOOOOOOOOOOOOOOOOOOOOOOOOOOOOOOOOOOOOOOOOOOOOOOOOO
OOOOOOIIIIIIIIIIIOOOOOOOOOOOOOOOOOOOOOOOOOOOOOOOOOOOOOOOOOOOOOOOO
OOOOONIIIIIIIIIIIIIOOOOOOOOOOOOOOOOOOOOOOOOOOOOOOOOOOOOOOOOOOOOOO
OOOOOIIIIIIIIIIIIIIIIIOOOOOOOOOOOOOOOOOOOOOOOOOOOOOOOOOOOOOOOOOOO
OOOOOIIIIIIIIIIIIIIIIIIIIOOOOOOOOOOOOOOOOOOOOOOOOOOOOOOOOOOOOOOOO
OOOOOIIIIIIIIIIIIIIIIIIIIIIOOOOOOOOOOOOOOOOOOOOOOOOOOOOOOOOOOOOOO
OOOOOIIIIIIIIIIIIIIIIIIIIIIIIIOOOOOOOOOOOOOOOOOOOOOOOOOOOOOOOOOOO
OOOONIIIIIIIIIIIIIIIIIIIIIIIIIIIOOOOOOOOOOOOOOOOOOOOOOOOOOOOOOOOO
OOOOIIIIIIIIIIIIIIIIIIIIIIIIIIIIIIIOOOOOOOOOOOOOOOOOOOOOOOOOOOOOO
OOOOIIIIIIIIIIIIIIIIIIIIIIIIIIIIIIIIIIOOOOOOOOOOOOOOOOOOOOOOOOOOO
OOOOIIIIIIIIIIIIIIIIIIIIIIIIIIIIIIIIIIIIOOOOOOOOOOOOOOOOOOOOOOOOO
OOOOIIIIIIIIIIIIIIIIIIIIIIIIIIIIIIIIIIIIIIIOOOOOOOOOOOOOOOOOOOOOO
OOONIIIIIIIIIIIIIIIIIIIIIIIIIIIIIIIIIIIIIIIIIIOOOOOOOOOOOOOOOOOOO
OOOIIIIIIIIIIIIIIIIIIIIIIIIIIIIIIIIIIIIIIIIIIIIIOOOOOOOOOOOOOOOO
OOOIIIIIIIIIIIIIIIIIIIIIIIIIIIIIIIIIIIIIIIIIIIIIIIIIOOOOOOOOOOOOO
OOOIIIIIIIIIIIIIIIIIIIIIIIIIIIIIIIIIIIIIIIIIIIIIIIIIIIOOOOOOOOOOO
OOOIIIIIIIIIIIIIIIIIIIIIIIIIIIIIIIIIIIIIIIIIIIIIIIIIIIIIOOOOOOOOO
OONIIIIIIIIIIIIIIIIIIIIIIIIIIIIIIIIIIIIIIIIIIIIIIIIIIIIIIOOOOOOO
OOOOOOOOOOOOOIIIIIIIIIIIIIIIIIIIIIIIIIIIIIIIIIIIIIIIIIIIIIIIIIOOO
OOOOOOOOOOOOOOOOOOOOOONNNNNNNNNNNNNNNNNNNNNNNNNNNNNNNNNNNNNNNNNNNNN
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
OOOOOOOOOOOOOOOOOOOOOOOOOOOOOOOOOOOOOOOOOOOOOOOOOOOOOOOOOOOOOOOOO
-----------------------------------------------------------------
```

676

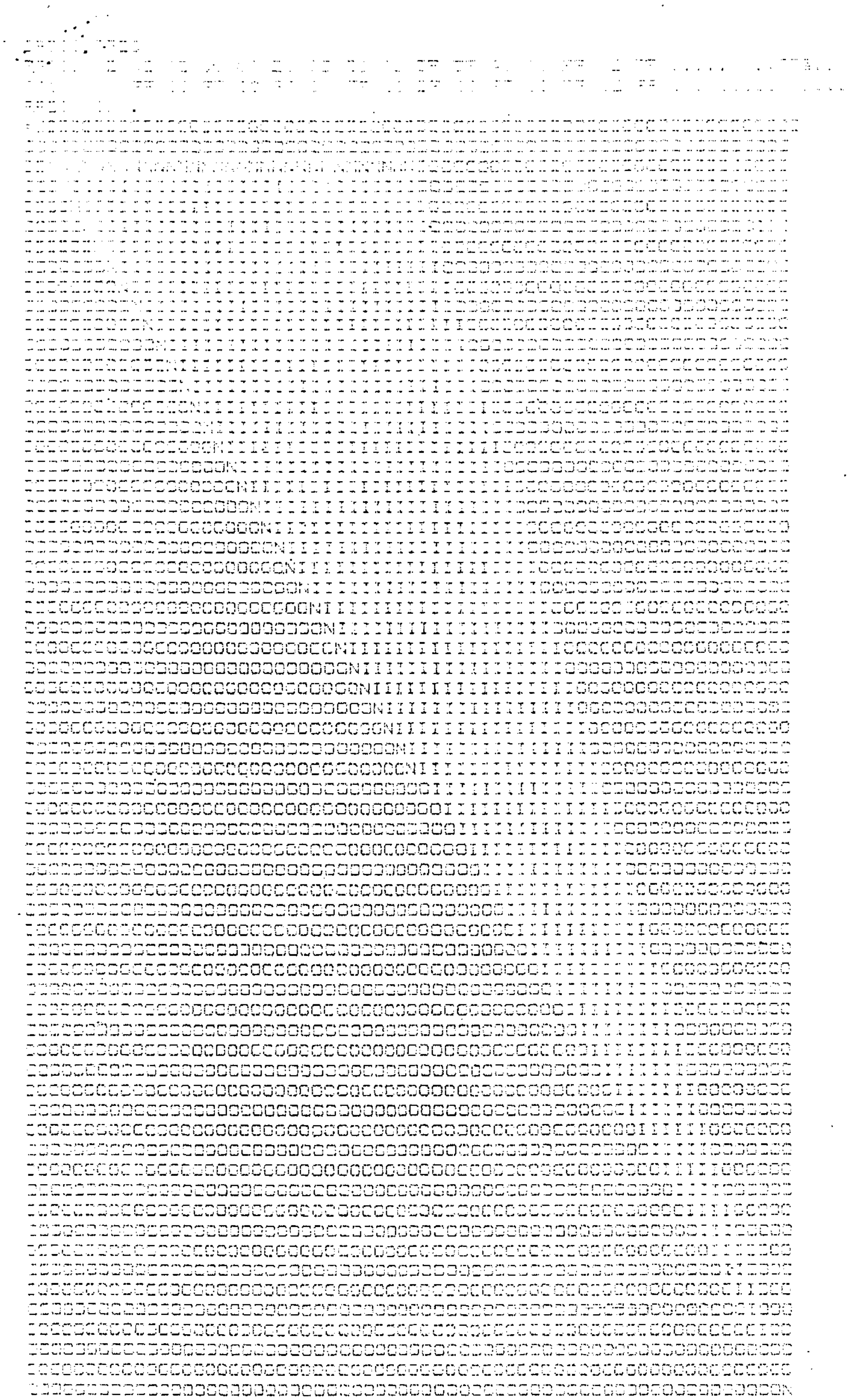

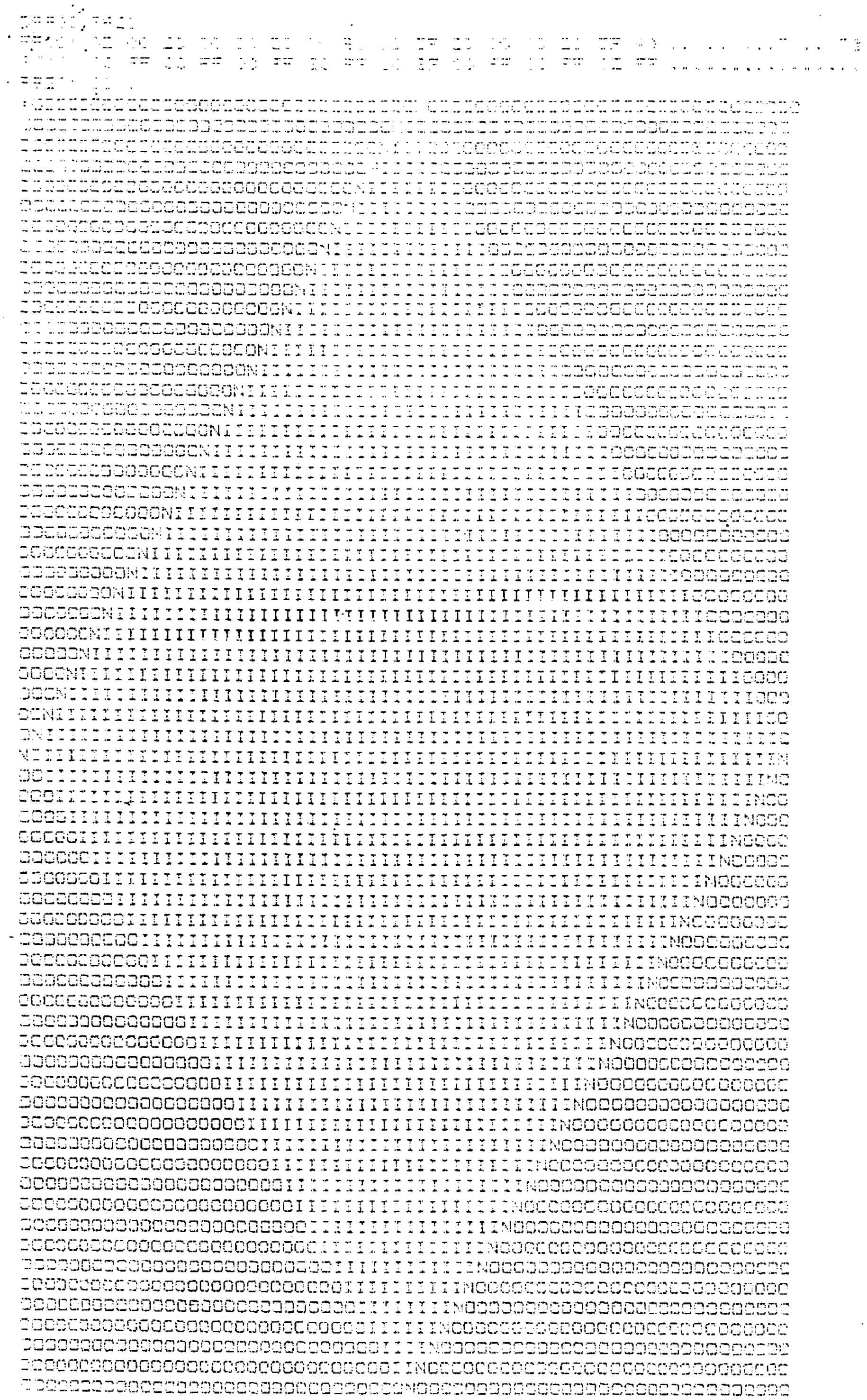

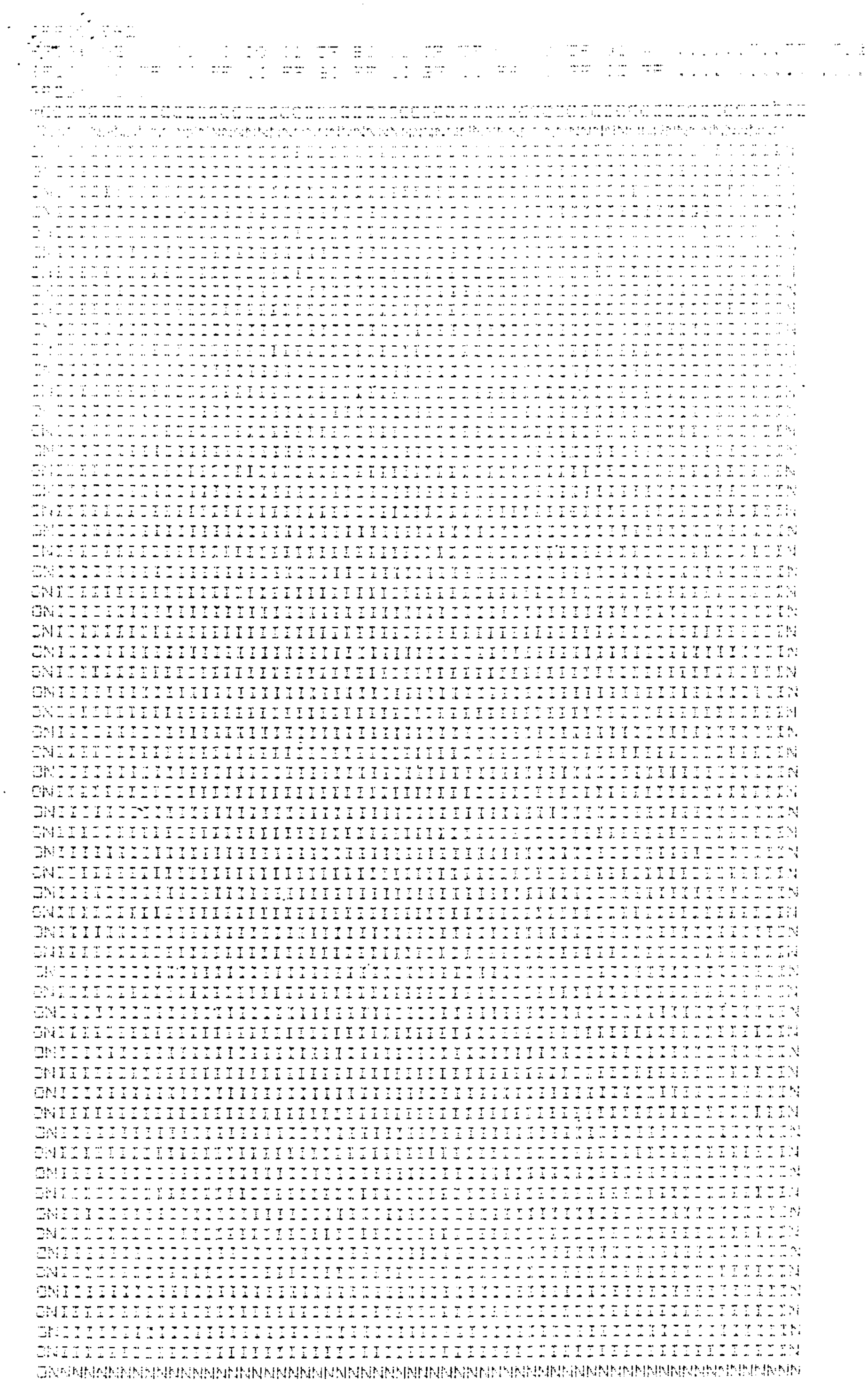

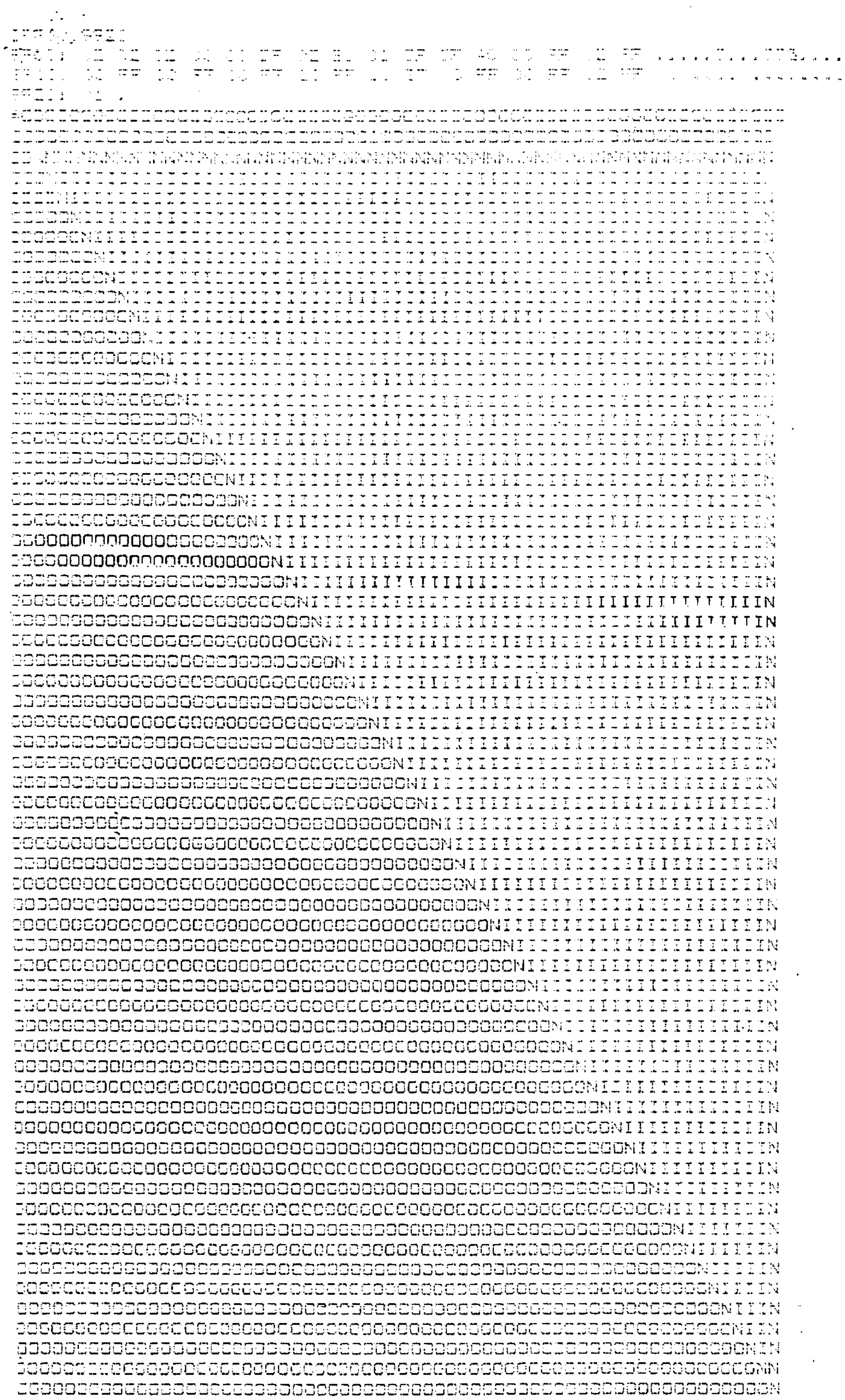

TABLES OF COMPUTER LISTINGS

TABLES OF COMPUTER LISTINGS

SUPERVISORY PROCESSOR

```
CP/M MACRO ASSEM 2.0     #001     VIPER-X.  GIL HYATT SYSTEM

                ;
                ;                                    CONFIDENTIAL
                ;                                    ------------
                ;                                    EXPERIMENTAL
                ;                                    ------------
                ;THIS IS THE DISPLAY EVALUATION PROGRAM FOR THE VIPER-X PROGRAM
                ;
                ;  FILE NAME: BAR.ASM
                ;
                ;          ORIGIN DATE: NOVEMBER 6,1981
                ;
                ;          REVISION DATE: MAY 17, 1983
                ;          REVISION TIME: 13:30
                ;
                ;
                ;     THIS PROGRAM SIMULATES THE OPERATION OF THE VIPER DISPLAY
                ;IN SOFTWARE.  THE KEYBOARD INPUT IS ASSUMED TO BE THE HOST COM-
                ;PUTER INTERFACE.  THE KEYBOARD PROVIDES INPUTS IN THE FORM OF
                ;SPECIAL PRIMATIVES WHICH CONTROL SIMULATED COLOR COMMANDS AS
                ;WELL AS MOTION, OBJECT SELECTION, AND DISPLAY MENUS.  THE
                ;PROGRAM IS DIVIDED INTO THREE MAIN SECTIONS.  THE FIRST SECTIO
                ;IS THE SUBROUTINE ROUTINE LIBRARY.  THE SECOND SECTION IS THE
                ;EXECUTIVE PROGRAM AND THE THIRD IS THE VARIOUS MEMORY
                ;ALLOCATIONS FOR SIMULATION OF SYSTEM REGISTERS AND MEMORY
                ;BLOCKS.
                ;
                ;
FFFF =          TRUE    EQU OFFFFH       ;DEFINE "TRUE"
0000 =          FALSE   EQU NOT TRUE     ;DEFINE "FALSE"
0000 =          JAMES   EQU FALSE        ;SET FOR BARRY'S SYSTEM
6FC0 =          STKPT   EQU 6FC0H
7000 =          STMEM   EQU 7000H
0000 =          BOOT    EQU 0000H
0100 =          BEGIN   EQU 0100H
                        IF JAMES         ;ASSEMBLE FOR JAMES'S SYSTEM
                        TITLE            'VIPER-X.  JAMES CHAN SYSTEM'
                DSIZE   EQU 2043
                DPLINE  EQU 64
                        ELSE             ;ASSEMBLE FOR GIL'S OR BARRY'S SYSTEM
                        TITLE            'VIPER-X.  GIL HYATT SYSTEM'
0BFF =          DSIZE   EQU 0BFFH
0040 =          DPLINE  EQU 0040H
                        ENDIF
6400 =          LOCSUB  EQU 6400H
1000 =          LOCBAR  EQU 1000H
2000 =          LOCGEN  EQU 2000H
3000 =          LOCGIL  EQU 3000H
2000 =          GEOA    EQU 2000H
2003 =          GEOB    EQU 2003H
2006 =          GEOC    EQU 2006H
642D =          CURHM   EQU 642DH
641E =          REFRSH  EQU 641EH
6439 =          CLMEM   EQU 6439H
6430 =          LDMEM   EQU 6430H
6433 =          RDMEM   EQU 6433H
644B =          MOTION  EQU 644BH
```

```
CP/M MACRO ASSEM 2.0     #001     VIPER-X.  GIL HYATT SYSTEM

                  ;
                  ;                                     CONFIDENTIAL
                  ;                                     ------------
                  ;                                     EXPERIMENTAL
                  ;                                     ------------
                  ;THIS IS THE DISPLAY EVALUATION PROGRAM FOR THE VIPER-X PROGRAM
                  ;
                  ;  FILE NAME: BAR.ASM
                  ;
                  ;          ORIGIN DATE: NOVEMBER 6,1981
                  ;
                  ;          REVISION DATE: MAY 17, 1983
                  ;          REVISION TIME: 13:30
                  ;
                  ;
                  ;      THIS PROGRAM SIMULATES THE OPERATION OF THE VIPER DISPLAY
                  ;IN SOFTWARE.  THE KEYBOARD INPUT IS ASSUMED TO BE THE HOST COM-
                  ;PUTER INTERFACE.  THE KEYBOARD PROVIDES INPUTS IN THE FORM OF
                  ;SPECIAL PRIMATIVES WHICH CONTROL SIMULATED COLOR COMMANDS AS
                  ;WELL AS MOTION, OBJECT SELECTION, AND DISPLAY MENUS.  THE
                  ;PROGRAM IS DIVIDED INTO THREE MAIN SECTIONS.  THE FIRST SECTION
                  ;IS THE SUBROUTINE ROUTINE LIBRARY.  THE SECOND SECTION IS THE
                  ;EXECUTIVE PROGRAM AND THE THIRD IS THE VARIOUS MEMORY
                  ;ALLOCATIONS FOR SIMULATION OF SYSTEM REGISTERS AND MEMORY
                  ;BLOCKS.
                  ;
                  ;
FFFF =            TRUE     EQU 0FFFFH      ;DEFINE "TRUE"
0000 =            FALSE    EQU NOT TRUE    ;DEFINE "FALSE"
0000 =            JAMES    EQU FALSE       ;SET FOR BARRY'S SYSTEM
6FC0 =            STKPT    EQU 6FC0H
7000 =            STMEM    EQU 7000H
0000 =            BOOT     EQU 0000H
0100 =            BEGIN    EQU 0100H
                           IF JAMES        ;ASSEMBLE FOR JAMES'S SYSTEM
                           TITLE           'VIPER-X.  JAMES CHAN SYSTEM'
                  DSIZE    EQU 2043
                  DPLINE   EQU 64
                           ELSE            ;ASSEMBLE FOR BARRY'S SYSTEM
                           TITLE           'VIPER-X.  GIL HYATT SYSTEM'
0BFF =            DSIZE    EQU 0BFFH
0040 =            DPLINE   EQU 0040H
                           ENDIF
6400 =            LOCSUB   EQU 6400H
1000 =            LOCBAR   EQU 1000H
2000 =            LOCGEN   EQU 2000H
3000 =            LOCGIL   EQU 3000H
2000 =            GEDA     EQU 2000H
2003 =            GEDB     EQU 2003H
2006 =            GEDC     EQU 2006H
642D =            CURHM    EQU 642DH
641E =            REFRSH   EQU 641EH
6439 =            CLMEM    EQU 6439H
6430 =            LDMEM    EQU 6430H
6433 =            RDMEM    EQU 6433H
644B =            MOTION   EQU 644BH
```

```
CP/M MACRO ASSEM 2.0     #002     VIPER-X.  GIL HYATT SYSTEM

 6454 =          MOTCLR  EQU 6454H
 6409 =          OUTTY   EQU 6409H
 6445 =          RBUFF   EQU 6445H
 6427 =          CRLF    EQU 6427H
 640C =          INTTY   EQU 640CH
 643C =          BUFFR   EQU 643CH
 6442 =          READI   EQU 6442H
 6415 =          INITP   EQU 6415H
 97C0 =          INBUF   EQU STMEM+27C0H
 97F0 =          STORBF  EQU STMEM+27F0H
 9820 =          CMDBFR  EQU STMEM+2820H
 6424 =          PRTCON  EQU 6424H
 6FC1 =          SFWORD  EQU STKPT+1
 6FC2 =          DSTART  EQU STKPT+2      ;16 BITS
 6FC4 =          STOREX  EQU STKPT+4
 6FC5 =          STOREY  EQU STKPT+5
 6FC6 =          SPSTOR  EQU STKPT+6      ;16 BITS
 6FC8 =          SVALUE  EQU STKPT+8      ;16 BITS
 6FCA =          FLAGG1  EQU STKPT+0AH    ;8 BITS
 6FCB =          FLAGG2  EQU STKPT+0BH
 6FCC =          SXSTAT  EQU STKPT+0CH
 6FCD =          SXNUM   EQU STKPT+0DH
 6CFF =          GEOSTK  EQU 6CFFH
 4C00 =          SURFTB  EQU 4C00H          ;SURFACE TABLE ORIGIN (TO 4E00H)
 5200 =          GPFIF   EQU 5200H          ;MOVING EDGE ENDPOINT FIFO
 5800 =          PXPFIF  EQU 5800H          ;P-EDGE PIXEL FIFO (MOVING)
 5D00 =          PXNFIF  EQU 5D00H          ;N-EDGE PIXEL FIFO (MOVING)
 000F =          IDMSK1  EQU 0FH            ;ID MASK FOR SURFACE MEMORY
 00F0 =          IDMSK2  EQU 0F0H
 6457 =          SURMEM  EQU 6457H
 645A =          RDSURM  EQU 645AH
                 ;
 0100                     ORG BEGIN
                 ;
                 ;   ENTRY JUMP
                 ;
 0100 31C06F               LXI SP,STKPT
 0103 3E80                 MVI A,80H        ;SET 1 ST. PASS FLAG TO "1"
 0105 32C16F               STA SFWORD       ; IN SYSTEM FLAG BITE
 0108 210200               LXI H,2          ;SET FIFO WRITE POINTERS
 010B 22FE51               SHLD GPFIF-2
 010E 22FE57               SHLD PXPFIF-2
 0111 22FE5C               SHLD PXNFIF-2
 0114 210000               LXI H,0          ;SET FIFO READ POINTERS AND
 0117 22FC51               SHLD GPFIF-4
 011A 22FC57               SHLD PXPFIF-4
 011D 22FC5C               SHLD PXNFIF-4
 0120 22FF6C               SHLD GEOSTK
 0123 217F00               LXI H,7FH        ;SET FIFO MODULO MASK (128)
 0126 22FA51               SHLD GPFIF-6
 0129 21FF03               LXI H, 3FFH      ;SET FIFO MODULO MASK (1024)
 012C 22FA57               SHLD PXPFIF-6
 012F 22FA5C               SHLD PXNFIF-6
                 ;
 0132 C30910               JMP START        ;START IS THE BEGINING OF THE
                                            ;  INITIALIZATION ROUTINE
```

```
CP/M MACRO ASSEM 2.0    #003    VIPER-X.  GIL HYATT SYSTEM

                 ;**********************************************************
                 ;----------------------------------------------------------
                 ;  PLACE TEMPORARY PROGRAMS AND SYMBOL TABLES BELOW THIS LINE
                 ;----------------------------------------------------------
                 ;
0135 3E06        TEST    MVI A,6
0137 0626                MVI B,38
0139 0E0E                MVI C,14
013B 1600                MVI D,0
013D 5F                  MOV E,A
013E CD3064              CALL LDMEM
0141 CDE314              CALL FINDPX
0144 CD2764              CALL CRLF
0147 C30912              JMP XSTRT1
                 ;
014A F5          MULTBC  PUSH PSW        ;SAVE A+F
014B D5                  PUSH D          ;SAVE D+E
014C 78                  MOV A,B         ;LOAD "B"
014D A7                  ANA A           ;TEST FOR NEGATIVE
014E FC8801              CM MTWOS        ;JUMP IF "B" IS NEGATIVE
0151 5F                  MOV E,A         ;"B" TO REG. E
0152 79                  MOV A,C         ;LOAD "C"
0153 A7                  ANA A           ;TEST FOR NEGATIVE
0154 FC8801              CM MTWOS        ;JUMP IF "C" IS NEGATIVE
0157 210000              LXI H,0         ;CLEAR REG. H+L
015A 54                  MOV D,H         ;CLEAR REG. D
015B C5                  PUSH B          ;SAVE B+C
015C 0607                MVI B,7
015E 0F          MULTLP  RRC             ;SHIFT "C" RIGHT TO CARRY
015F D26301              JNC MULTL1      ;ADD "B" TO REG
0162 19                  DAD D           ;H+L IF CARRY=1
0163 EB          MULTL1  XCHG            ;SHIFT "B" LEFT
0164 29                  DAD H           ;ONE BIT
0165 EB                  XCHG
0166 05                  DCR B
0167 C25E01              JNZ MULTLP      ;LOOP FOR 7 PASSES
016A C1                  POP B           ;TEST FOR SIGN
016B 78                  MOV A,B
016C 07                  RLC
016D DA7F01              JC MUBNEG       ;JUMP IF "B" IS NEG
0170 79                  MOV A,C         ;"B" IS POSITIVE
0171 07                  RLC
0172 D28401              JNC MULPOS      ;JUMP IF "C" IS POS
0175 7C          MULNEG  MOV A,H         ;COMPLIMENT H
0176 2F                  CMA
0177 67                  MOV H,A
0178 7D                  MOV A,L         ;COMPLIMENT L
0179 2F                  CMA
017A 6F                  MOV L,A
017B 23                  INX H           ;ADD ONE TO H+L FOR 2'S COMPLIMENT
017C D1                  POP D
017D F1                  POP PSW
017E C9                  RET
017F 79          MUBNEG  MOV A,C         ;"B" IS NEG
0180 07                  RLC
0181 D27501              JNC MULNEG      ;JUMP IF "C" IS POS
```

```
CP/M MACRO ASSEM 2.0     #004     VIPER-X.  GIL HYATT SYSTEM

 0184 D1          MULPOS  POP D
 0185 F1                  POP PSW
 0186 3F                  CMC             ;SET CARRY TO "0"
 0187 C9                  RET
 0188 3D          MTWOS   DCR A           ;SUBTRACT 1
 0189 2F                  CMA             ;COMPLIMENT A
 018A C9                  RET
                  ;-----------------------------------------------------------
                  ;          END OF TEMPORARY WORK AREA
                  ;-----------------------------------------------------------
                  ;
                  ;**************************************************************
                  ;
 1000                     ORG LOCBAR
                  ;
                  ;       JUMP TABLE
                  ;
 1000 C39B10      SUPINT  JMP XSPINT
 1003 C3B610      SUPMOT  JMP XSPMOT
 1006 C3C810      DRAW    JMP XDRAW
 1009 C3BF11      START   JMP XSTART
 100C C30912      START1  JMP XSTRT1
                  ;
                  ;
 1080                     ORG LOCBAR+80H
                  ;
                  ;
                  ;--------------SUPERVISORY PROCESSOR STORAGE------------------
                  ;
 1080 0000        STMPST  DW 0            ;TEMPORARY STORAGE (16 BITS)
 1082 0000        SXOBPT  DW 0            ;OBJECT POINTER (16 BITS)
 1084 0000        SXVEPT  DW 0            ;VECTOR POINTER (16 BITS)
 1086 0000        SXORPT  DW 0            ;ORIGIN POINTER (16 BITS)
 1088 00          SMOTNX  DB 0            ;"X" ORIGIN MOTION
 1089 00          SMOTNY  DB 0            ;"Y" ORIGIN MOTION
 108A 00          SMOTNZ  DB 0            ;"Z" ORIGIN MOTION
 108B 00          SSAXSX  DB 0            ;"X" AXIS START POINT
 108C 00          SSAXSY  DB 0            ;"Y" AXIS START POINT
 108D 00          SSAXSZ  DB 0            ;"Z" AXIS START POINT
 108E 00          SEAXSX  DB 0            ;"X" AXIS END POINT
 108F 00          SEAXSY  DB 0            ;"Y" AXIS END POINT
 1090 00          SEAXSZ  DB 0            ;"Z" AXIS END POINT
 1091 00          SDELTX  DB 0            ;"X" AXIS DELTA
 1092 00          SDELTY  DB 0            ;"Y" AXIS DELTA
 1093 00          SDELTZ  DB 0            ;"Z" AXIS DELTA
 1094 00          SSTART  DB 0            ;NUMBER OF START POINT VECTOR
 1095 00          SCOLOR  DB 0            ;COLOR WORD FROM ORIGIN MEMORY
 1096 00          SSFLAG  DB 0            ;GEOMETRIC PROCESSOR FLAG BYTE
 1097 00          SXFLAG  DB 0            ;BUFFER FLAG BYTE
 1098 00          SXORIG  DB 0            ;ORIGIN NUMBER
 1099 00          SXSTR0  DB 0            ;"X","Y",OR "Z"
 109A 00          SXSTR1  DB 0            ;MOTION DISPLACEMENT IN AXIS DEF. BY 0
                  ;
                  ;       SUPERVISORY PROCESSOR INITIALIZATION SUBROUTINE
                  ;
 109B CD5464      XSPINT  CALL MOTCLR     ;CLEAR MOTION BUFFER
```

```
CP/M MACRO ASSEM 2.0      #005     VIPER-X.  GIL HYATT SYSTEM

109E 3A9710             LDA SXFLAG
10A1 E6FE               ANI OFEH        ;SET FLAG BIT 0 TO "0" (PRIOR SURFACE)
10A3 329710             STA SXFLAG
10A6 CD0610             CALL DRAW       ;LOAD INITIAL SURFACE
10A9 CD0320             CALL GEOB       ;PATCH FOR NEXT ROUTINE CALL
10AC CD2D64             CALL CURHM      ;HOME DISPLAY CURSOR
10AF CD1E64             CALL REFRSH     ;DISPLAY SURFACE PAIR
10B2 CD2D64             CALL CURHM      ;HOME DISPLAY CURSOR
10B5 C9                 RET
                ;
                ;               SUPERVISORY PROCESSOR ROUTINE
                ;
10B6 CD4B64     XSPMOT  CALL MOTION     ;GET KEYBOARD MOTION COMMAND
10B9 CD0620             CALL GEOC       ;CALL GEOMETRIC PROCESSOR
10BC CD5464             CALL MOTCLR     ;CLEAR MOTION BUFFER
10BF CD2D64             CALL CURHM      ;HOME DISPLAY CURSOR
10C2 CD1E64             CALL REFRSH     ;DISPLAY PIXEL MEMORY
10C5 C30310             JMP SUPMOT      ;LOOP FOR NEXT MOTION COMMAND
                ;
                ;               DRAW SURFACE SUBROUTINE
                ;
10C8 11009A     XDRAW   LXI D,DBICON    ;GET ORIGIN BASE ADDRESS
10CB 2600               MVI H,0
10CD 3A9810             LDA SXORIG      ;GET ORIGIN NUMBER
10D0 6F                 MOV L,A
10D1 29                 DAD H           ;MULTIPLY ORIGIN NUMBER BY 8
10D2 29                 DAD H
10D3 29                 DAD H
10D4 19                 DAD D           ;ADD TO ORIGIN BASE ADDRESS
10D5 228610             SHLD SXORPT     ;STORE ORIGIN POINTER
10D8 6E                 MOV L,M         ;GET OBJECT NUMBER
10D9 2600               MVI H,0
10DB 110099             LXI D,DBOBJK    ;GET OBJECT BASE ADDRESS
10DE 29                 DAD H           ;MULTIPLY OBJECT NUMBER BY 32
10DF 29                 DAD H
10E0 29                 DAD H
10E1 29                 DAD H
10E2 29                 DAD H
10E3 19                 DAD D           ;ADD TO OBJECT BASE ADDRESS
10E4 228210             SHLD SXOBPT     ;STORE OBJECT POINTER
10E7 228410             SHLD SXVEPT     ;STORE INITIAL VECTOR POINTER
10EA 7E         DRAWLP  MOV A,M
10EB 329410             STA SSTART      ;STORE START VECTOR
10EE 23                 INX H
10EF 7E                 MOV A,M
10F0 328E10             STA SEAXSX      ;STORE END "X"
10F3 23                 INX H
10F4 7E                 MOV A,M
10F5 328F10             STA SEAXSY      ;STORE END "Y"
10F8 23                 INX H
10F9 7E                 MOV A,M         ;GET FLAG WORD FROM OBJECT MEMORY
10FA E6C0               ANI OCOH        ;MASK BIT 6 AND 7
10FC 47                 MOV B,A         ;SAVE IN REG B
10FD 3A9710             LDA SXFLAG      ;GET BUFFER FLAG BYTE
1100 E63F               ANI 3FH         ;ZERO BITS 6 AND 7
1102 B0                 ORA B           ;"OR" BIT 6 AND 7
```

```
CP/M MACRO ASSEM 2.0      #006      VIPER-X.  GIL HYATT SYSTEM

1103 329710         STA SXFLAG       ;STORE IN BUFFER FLAG BYTE
1106 2A8210         LHLD SXOBPT      ;GET OBJECT POINTER
1109 EB             XCHG             ;  AND STORE IN REG D,E
110A 2600           MVI H,0          ;CLEAR REG H
110C 3A9410         LDA SSTART       ;GET START VECTOR AND
110F 6F             MOV L,A          ;  MOVE TO REG. L
1110 29             DAD H            ;MULTIPLY START VECTOR BY 4
1111 29             DAD H
1112 19             DAD D            ;ADD TO OBJECT POINTER
1113 228010         SHLD STMPST      ;TEMPORARILY STORE POINTER IN MEMORY
1116 23             INX H
1117 7E             MOV A,M
1118 328B10         STA SSAXSX       ;STORE START "X"
111B 23             INX H
111C 7E             MOV A,M
111D 328C10         STA SSAXSY       ;STORE START "Y"
1120 2A8610         LHLD SXORPT      ;GET ORIGIN POINTER
1123 23             INX H
1124 46             MOV B,M          ;GET "X" ORIGIN
1125 3A8810         LDA SMOTNX
1128 80             ADD B            ;ADD MOTION TO ORIGIN
1129 47             MOV B,A
112A 3A8B10         LDA SSAXSX       ;GET START "X" OBJECT
112D 80             ADD B            ;ADD ORIGIN TO OBJECT
112E 328B10         STA SSAXSX       ;STORE SUM
1131 23             INX H
1132 46             MOV B,M          ;GET "Y" ORIGIN
1133 3A8910         LDA SMOTNY
1136 80             ADD B            ;ADD MOTION TO ORIGIN
1137 47             MOV B,A
1138 3A8C10         LDA SSAXSY       ;GET START "Y" OBJECT
113B 80             ADD B            ;ADD ORIGIN TO OBJECT
113C 328C10         STA SSAXSY       ;STORE SUM
113F 23             INX H
1140 46             MOV B,M          ;GET "Z" ORIGIN
1141 3A8A10         LDA SMOTNZ
1144 80             ADD B            ;ADD MOTION TO ORIGIN
1145 47             MOV B,A
1146 3A8D10         LDA SSAXSZ       ;GET START "Z" OBJECT
1149 80             ADD B            ;ADD ORIGIN TO OBJECT
114A 328D10         STA SSAXSZ       ;STORE SUM
114D 23             INX H
114E 7E             MOV A,M          ;GET COLOR WORD
114F 329510         STA SCOLOR       ;STORE COLOR BYTE IN BUFFER
1152 2A8610         LHLD SXORPT      ;GET ORIGIN POINTER
1155 23             INX H
1156 46             MOV B,M          ;GET "X" ORIGIN
1157 3A8810         LDA SMOTNX
115A 80             ADD B            ;ADD MOTION TO ORIGIN
115B 47             MOV B,A
115C 3A8E10         LDA SEAXSX       ;GET END "X" OBJECT
115F 80             ADD B            ;ADD ORIGIN TO OBJECT
1160 328E10         STA SEAXSX       ;STORE SUM
1163 23             INX H
1164 46             MOV B,M          ;GET "Y" ORIGIN
1165 3A8910         LDA SMOTNY
```

```
CP/M MACRO ASSEM 2.0     #007     VIPER-X.  GIL HYATT SYSTEM

1168 80                  ADD B            ;ADD MOTION TO ORIGIN
1169 47                  MOV B,A
116A 3A8F10              LDA SEAXSY       ;GET END "Y" OBJECT
116D 80                  ADD B            ;ADD ORIGIN TO OBJECT
116E 328F10              STA SEAXSY       ;STORE SUM
1171 23                  INX H
1172 46                  MOV B,M          ;GET "Z" ORIGIN
1173 3A8A10              LDA SMOTNZ
1176 80                  ADD B            ;ADD MOTION TO ORIGIN
1177 47                  MOV B,A
1178 3A9010              LDA SEAXSZ       ;GET END "Z" ORIGIN
117B 80                  ADD B            ;ADD ORIGIN TO OBJECT
117C 329010              STA SEAXSZ       ;STORE SUM
117F 3A8B10              LDA SSAXSX       ;GET START "X"
1182 47                  MOV B,A
1183 3A8E10              LDA SEAXSX       ;GET END "X"
1186 90                  SUB B            ;SUBTRACT START FROM END
1187 329110              STA SDELTX       ;STORE DIFFERENCE
118A 3A8C10              LDA SSAXSY       ;GET START "Y"
118D 47                  MOV B,A
118E 3A8F10              LDA SEAXSY       ;GET END "Y"
1191 90                  SUB B            ;SUBTRACT START FROM END
1192 329210              STA SDELTY       ;STORE DIFFERENCE
1195 3A8D10              LDA SSAXSZ       ;GET START "Z"
1198 47                  MOV B,A
1199 3A9010              LDA SEAXSZ       ;GET END "Z"
119C 90                  SUB B            ;SUBTRACT START FROM END
119D 329310              STA SDELTZ       ;STORE DIFFERENCE
11A0 3A9710              LDA SXFLAG       ;MOVE BUFFER FLAG BYTE TO
11A3 329610              STA SSFLAG       ;  GEOMETRIC PROCESSOR FLAG BYTE
11A6 CD0020              CALL GEOA        ;DRAW INITIAL VECTOR
11A9 3A9710              LDA SXFLAG
11AC E640                ANI 40H          ;TEST FOR LAST VECTOR
11AE C2BE11              JNZ DRDONE       ;EXIT IF DONE
11B1 2A8410              LHLD SXVEPT      ;IF NOT LAST VECTOR
11B4 23                  INX H            ;  MOVE VECTOR POINTER TO NEXT
11B5 23                  INX H            ;  VECTOR
11B6 23                  INX H
11B7 23                  INX H
11B8 228410              SHLD SXVEPT
11BB C3EA10              JMP DRAWLP       ;LOOP FOR NEXT VECTOR
11BE C9           DRDONE RET              ;LOOP FOR NEXT MOTION COMMAND
                  ;
                  ;  INITIALIZATION ROUTINES
                  ;
                  ;     THIS STARTS THE DISPLAY PROGRAM FROM A COLD START AS
                  ;REQUIRED AFTER POWER UP.  THE IMAGE MEMORY IS CLEARED (SET
                  ;TO BLACK) AND ALL CONTROL REGISTERS AND FLAGS ARE SET TO
                  ;THEIR INITIAL CONDITIONS.  THE REFRESH CRT SUBROUTINE
                  ;IS CALLED TO CLEAR THE DISPLAY.
                  ;
                  ;  CLEAR IMAGE MEMORY AND DISPLAY
                  ;
                  ;  SPECIAL INITIALIZATION ROUTINE FOR JAMES'S MEMORY MAPPED
                  ;DISPLAY--MUST REPLACE THE STANDARD "START" ROUTINES.
                  ;
```

```
CP/M MACRO ASSEM 2.0     #008     VIPER-X.  GIL HYATT SYSTEM

                    IF JAMES
          XSTART    LXI H,0CC00H
                    MVI B,20H
          STARM1    MOV M,B
                    INX H
                    MOV A,H
                    CPI 0D0H
                    JNZ STARM1
                    CALL 0D6A1H
                    MVI  C,7FH
                    CALL 0D006H
          ;
          ;  STANDARD INITIALIZATION ROUTINES FOR EXTERNAL DISPLAY
          ;
                    ELSE
11BF 3E1B XSTART    MVI  A,1BH        ;CLEAR SCREEN BY SENDING AN
11C1 CD0964         CALL OUTTY        ;  ESCAPE (1BH) FOLLOWED BY AN
11C4 3E2A           MVI  A,2AH        ;  "*" (2AH) TO THE DISPLAY.
11C6 CD0964         CALL OUTTY
                    ENDIF
          ;
11C9 CD3964         CALL CLMEM        ;CLEAR IMAGE MEMORY
          ;
          ;  SET REGISTERS AND CLEAR DISPLAY
          ;
11CC 210070         LXI  H,IMAGE      ;LOAD (IMAGE) INTO MEMORY DE-
11CF 22C26F         SHLD DSTART       ;  FINED BY (DSTART)
11D2 3E00           MVI A,0           ;CLEAR REGISTERS
11D4 57             MOV D,A
11D5 5F             MOV E,A
11D6 67             MOV H,A
11D7 2E2E           MVI L,'.'
11D9 CD5764         CALL SURMEM       ;LOAD SURFACE COLOR TABLE
11DC 3C             INR A
11DD 2E41           MVI L,'A'
11DF CD5764 STLOOP  CALL SURMEM
11E2 3C             INR A
11E3 2C             INR L
11E4 FE10           CPI 10H           ;LOAD TILL 16 BIT WORD IS FILLED
11E6 CAEC11         JZ STARTZ
11E9 C3DF11         JMP STLOOP
11EC CD1E64 STARTZ  CALL REFRSH       ;CLEAR DISPLAY
11EF CD2D64         CALL CURHM        ;HOME DISPLAY CURSOR
11F2 216B90 STARTO  LXI H,MES01       ;SIGN ON MESSAGE
11F5 CD4564         CALL RBUFF
11F8 3AC16F         LDA SFWORD
11FB E680           ANI 80H           ;IF FLAG IS SET THEN BUFFER IS FULL
11FD CA0912         JZ XSTRT1
1200 CD2764         CALL CRLF
1203 219890         LXI H,MES02       ;BUFFER NOT CLEARED MESSAGE
1206 CD4564         CALL RBUFF
1209 3ACA6F XSTRT1  LDA FLAGG1        ;SET DELETE ERROR FLAG TO ZERO
120C E67F           ANI 7FH
120E 32CA6F         STA FLAGG1
1211 212298         LXI H,CMDBFR+2    ;H=BUFFER TO HOLD ALL COMMANDS
1214 EB             XCHG
```

```
 1215 2A2098            LHLD CMDBFR      ;CMDBFR=POINTER OF LAST ENTRY
 1218 19                DAD D
 1219 22C66F            SHLD SPSTOR      ;SAVE LOCATION WHERE NEW ENTRY STARTED
 121C E5                PUSH H
 121D 110467            LXI D,6704H      ;2S COMP OF 98FAH
 1220 19                DAD D
 1221 AC                XRA H            ;BUFFER IS ALMOST FULL IF EQUAL
 1222 C22F12            JNZ XSTRT2
 1225 217790            LXI H,MES03      ;WARNING ABOUT FULL BUFFER
 1228 CD4564            CALL RBUFF
 122B CD2764            CALL CRLF
 122E E1                POP H
 122F CD2764   XSTRT2   CALL CRLF
 1232 21D690            LXI H,MES05      ;GET COMMAND
 1235 CD4564            CALL RBUFF
 1238 CD2764            CALL CRLF
 123B CD3C64   START2   CALL BUFFR       ;KEYBOARD INPUT TO BUFFER
 123E CD4264            CALL READI       ;READ INPUT TO DISPLAY
 1241 CD2764            CALL CRLF
 1244 110093            LXI D,NEWCMD     ;LOAD NEW COMMAND TABLE
 1247 0600              MVI B,0
 1249 21C097   EXTBL    LXI H,INBUF      ;COMPARE COMMAND TO TABLE
 124C 0E00              MVI C,0
 124E EB       EXTBL1   XCHG
 124F 7E                MOV A,M
 1250 EB                XCHG
 1251 FE0D              CPI 0DH
 1253 CA6012            JZ EXTBL2
 1256 FE0A              CPI 0AH
 1258 CA7E12            JZ RSTRT2
 125B BE                CMP M
 125C CA6012            JZ EXTBL2
 125F 0C                INR C
 1260 23       EXTBL2   INX H
 1261 13                INX D
 1262 FE0D              CPI 0DH
 1264 C24E12            JNZ EXTBL1
 1267 AF                XRA A
 1268 B9                CMP C
 1269 CA7312            JZ EXTBL3
 126C 3E03              MVI A,3
 126E 80                ADD B
 126F 47                MOV B,A
 1270 C34912            JMP EXTBL
 1273 210095   EXTBL3   LXI H,NEWJTB     ;LOAD NEW JUMP TABLE
 1276 1600              MVI D,0
 1278 58                MOV E,B
 1279 19                DAD D
 127A E9                PCHL             ;JUMP AND EXECUTE DO NOT ENTER IN
 127B C30912            JMP XSTRT1       ;CMDBFR. RETURN FOR NEW COMMAND
 127E 0600     RSTRT2   MVI B,0          ;CLEAR B
 1280 11C097            LXI D,INBUF
 1283 212298            LXI H,CMDBFR+2   ;SET H+L TO BEGINNING OF BUFFER
 1286 D5                PUSH D
 1287 EB                XCHG             ;D+E=H+L
 1288 2A2098            LHLD CMDBFR      ;LOAD BYTE CNTR
```

```
CP/M MACRO ASSEM 2.0     #010     VIPER-X.  GIL HYATT SYSTEM

 128B 19                 DAD D            ;SET H+L TO BUFFER+BYTE CNTR
 128C D1                 POP D
 128D EB          START3 XCHG             ;H+L=INBUF
 128E 7E                 MOV A,M
 128F EB                 XCHG
 1290 77                 MOV M,A          ;INBUF TO CMDBFR
 1291 E5                 PUSH H
 1292 2A2098             LHLD CMDBFR      ;INCR BYTE CNTR
 1295 23                 INX H
 1296 222098             SHLD CMDBFR
 1299 13                 INX D
 129A FE0A               CPI 0AH
 129C CAA912             JZ RCMBF         ;JMP IF 0A TO CMP TABLE TO COMMAND
 129F FE0D               CPI 0DH          ;CHECK FOR RETURN
 12A1 CA2F12             JZ XSTRT2        ;GET ANOTHER COMMAND
 12A4 E1                 POP H
 12A5 23                 INX H
 12A6 C38D12             JMP START3
 12A9 212298      RCMBF  LXI H,CMDBFR+2   ;BEGINNING OF CMDBFR
 12AC 11F097             LXI D,STORBF     ;D+E =TEMP STORAGE
 12AF 22CB6F             SHLD FLAGG2      ;PNTR TO BEGINNING OF COMMAND IN CMDBFR
 12B2 7E                 MOV A,M
 12B3 FE3A               CPI ':'          ;IF COMMAND STARTS WITH : THEN SKIP
 12B5 CAE213             JZ STSM
 12B8 7E          START4 MOV A,M          ;A=COMMAND CHAR
 12B9 FE2C               CPI ','
 12BB CA2413             JZ START8        ;EXECUTE COMMAND
 12BE FE0A               CPI 0AH
 12C0 CA2413             JZ START8
 12C3 FE0D               CPI 0DH
 12C5 CA2413             JZ START8
 12C8 EB                 XCHG
 12C9 77                 MOV M,A          ;LOAD CHAR TO STORBF
 12CA EB                 XCHG
 12CB FE3A               CPI ':'
 12CD CAD512             JZ START5        ;LOAD VALUE
 12D0 23                 INX H
 12D1 13                 INX D
 12D2 C3B812             JMP START4       ;GET NEXT COMMAND CHAR
 12D5 E5          START5 PUSH H           ;LOAD SVALUE WITH OBJECT OR DISPLACEMENT
#
 12D6 210000             LXI H,0
 12D9 22C86F             SHLD SVALUE
 12DC E1                 POP H
 12DD 23          STRTV  INX H
 12DE 7E                 MOV A,M
 12DF FE0A               CPI 0AH
 12E1 CA2F12             JZ XSTRT2        ;ILLIMINATE OLD ENTRY AND GET NEW
 12E4 FE2C               CPI ','
 12E6 22C66F             SHLD SPSTOR
 12E9 CA8B13             JZ STSAME        ;IGNOR AND GET NEXT COMMAND
 12EC FE0D               CPI 0DH
 12EE C2F412             JNZ STARTV
 12F1 C3DD12             JMP STRTV        ;LOOK FOR #
 12F4 7E          STARTV MOV A,M
 12F5 FE2C               CPI ','
 12F7 CA2413             JZ START8        ;EXECUTE COMMAND
```

CP/M MACRO ASSEM 2.0 #011 VIPER-X. GIL HYATT SYSTEM

```
 12FA FE0A              CPI 0AH
 12FC CA2413            JZ START8          ;EXECUTE COMMAND
 12FF FE0D              CPI 0DH
 1301 CA2413            JZ START8
 1304 FE41              CPI 41H            ;CMP IF EQUAL TO 10
 1306 D20E13            JNC START6
 1309 E60F              ANI 0FH
 130B C31013            JMP START7
 130E D637     START6   SUI 37H            ;16 BIT NUMBER IN RANGE
 1310 E5       START7   PUSH H
 1311 2AC86F            LHLD SVALUE
 1314 29                DAD H
 1315 29                DAD H
 1316 29                DAD H
 1317 29                DAD H
 1318 1600              MVI D,0
 131A 5F                MOV E,A
 131B 19                DAD D
 131C 22C86F            SHLD SVALUE
 131F E1                POP H
 1320 23                INX H
 1321 C3F412            JMP STARTV         ;NEXT CHAR=VALUE
 1324 22C66F   START8   SHLD SPSTOR        ;SAVE CMDBFR POINTER
 1327 110092            LXI D,COMND        ;D+E = COMMAND TABLE
 132A 0600              MVI B,0
 132C 21F097   STRT1    LXI H,STORBF       ;H+L = TEMP STORAGE
 132F 7E                MOV A,M
 1330 FE00              CPI 00H
 1332 CA8B13            JZ STSAME
 1335 0E00              MVI C,0
 1337 EB       STRT2    XCHG
 1338 7E                MOV A,M
 1339 EB                XCHG
 133A FE0D              CPI 0DH
 133C CA4913            JZ STRT3
 133F FE0A              CPI 0AH
 1341 CA5C13            JZ NOTFD
 1344 BE                CMP M              ;CHECK COMND TABLE
 1345 CA4913            JZ STRT3
 1348 0C                INR C
 1349 23       STRT3    INX H              ;INCR STORBF
 134A 13                INX D              ;INCR COMND TBL
 134B FE0D              CPI 0DH
 134D C23713            JNZ STRT2          ;TABLE<>0DH
 1350 AF                XRA A
 1351 B9                CMP C
 1352 CA7613            JZ STEXEC          ;BEGIN EXECUTION
 1355 3E03              MVI A,3
 1357 80                ADD B              ;JMP TABLE COUNTER
 1358 47                MOV B,A
 1359 C32C13            JMP STRT1          ;REPEAT UNTILL C=0
 135C 3E07     NOTFD    MVI A,07H          ;COMMAND NOT IN TABLE
 135E CD0964            CALL OUTTY
 1361 21F097            LXI H,STORBF
 1364 CD0214            CALL READTB
 1367 CD2764            CALL CRLF
```

```
CP/M MACRO ASSEM 2.0    #012    VIPER-X.  GIL HYATT SYSTEM

 136A 216090            LXI H,MESOO     ;OUTPUT ERROR MESSAGE
 136D CD4564            CALL RBUFF
 1370 CD2764            CALL CRLF
 1373 C38B13            JMP STSAME      ;START OVER
 1376 21F097    STEXEC  LXI H,STORBF
 1379 11E167            LXI D,67E1H     ;2 S COMP OF 981FH
 137C CDE813            CALL IOBFC      ;CLEAR STORBF
 137F 218B13            LXI H,STSAME    ;LOAD FOR RETURN POINTER
 1382 E5                PUSH H
 1383 210094            LXI H,JMPTB     ;LOAD JMP TABLE
 1386 1600              MVI D,0
 1388 58                MOV E,B
 1389 19                DAD D           ;DETERMINE JMP ROUTINE
 138A E9                PCHL
 138B 2AC66F    STSAME  LHLD SPSTOR     ;GET CMDBFR POINTER
 138E 7E                MOV A,M         ;LAST ENTRY CANNOT BE A OA
 138F FE3A              CPI ':'         ;   OR :
 1391 CAE213            JZ STSM
 1394 FE0A              CPI 0AH
 1396 CAE213            JZ STSM
 1399 FE0D              CPI 0DH
 139B CABE13            JZ RECHK        ;DOUBLE CHECK ENDING
 139E FE2C              CPI 2CH
 13A0 CABE13            JZ RECHK
 13A3 23                INX H
 13A4 7E                MOV A,M
 13A5 FE0A              CPI 0AH
 13A7 CAE213            JZ STSM
 13AA 11F097            LXI D,STORBF
 13AD 7E                MOV A,M
 13AE FE0D              CPI 0DH
 13B0 CA8B13            JZ STSAME
 13B3 FE00              CPI 00H
 13B5 CA0912            JZ XSTRT1       ;NEW COMMAND
 13B8 22CB6F            SHLD FLAGG2     ;POINTER TO BEGINNING OF COMMAND IN CMDE
FR
 13BB C3B812            JMP START4      ;NEXT COMMAND
 13BE 23        RECHK   INX H
 13BF 7E                MOV A,M
 13C0 FE3A              CPI ':'
 13C2 CAE213            JZ STSM
 13C5 FE0D              CPI 0DH
 13C7 CABE13            JZ RECHK
 13CA FE2C              CPI 2CH
 13CC CABE13            JZ RECHK
 13CF FE0A              CPI 0AH
 13D1 CAE213            JZ STSM
 13D4 FE00              CPI 00H
 13D6 CA0912            JZ XSTRT1
 13D9 11F097            LXI D,STORBF
 13DC 22CB6F            SHLD FLAGG2     ;POINTER TO BEGINNING OF NEXT COMMAND
 13DF C3B812            JMP START4
 13E2 3E2C      STSM    MVI A,2CH       ;CHANGE OA TO (,)
 13E4 77                MOV M,A
 13E5 C30912            JMP XSTRT1
                :
                :
```

```
CP/M MACRO ASSEM 2.0    #013    VIPER-X.  GIL HYATT SYSTEM

                    ;     CLEAR BUFFER SUBROUTINE
 13E8 F5            IOBFC   PUSH PSW
 13E9 D5                    PUSH D
 13EA E5                    PUSH H
 13EB AF            IOBFC1  XRA A           ;A=0
 13EC 77                    MOV M,A         ;ZERO TO MEM
 13ED 23                    INX H           ;MOV NEXT LOCATION
 13EE E5                    PUSH H
 13EF 19                    DAD D
 13F0 AC                    XRA H           ;TEST H
 13F1 CAF813                JZ IOBFC2       ;JUMP IF H=0
 13F4 E1                    POP H
 13F5 C3EB13                JMP IOBFC1
 13F8 AF            IOBFC2  XRA A           ;ZERO TO A
 13F9 AD                    XRA L           ;TEST L
 13FA E1                    POP H
 13FB C2EB13                JNZ IOBFC1      ;JUMP IF L=1
 13FE E1                    POP H
 13FF D1                    POP D
 1400 F1                    POP PSW
 1401 C9                    RET
                    ;
                    ;         THIS ROUTINE READS STORBF
                    ;
 1402 7E            READTB  MOV A,M         ;MEMORY IS AT STORBF
 1403 FE0D                  CPI 0DH
 1405 C8                    RZ
 1406 FE3A                  CPI ':'
 1408 C8                    RZ
 1409 FE2C                  CPI ','
 140B C8                    RZ
 140C FE0A                  CPI 0AH
 140E C8                    RZ
 140F FE00                  CPI 00H
 1411 C8                    RZ
 1412 CD0964                CALL OUTTY
 1415 3ACA6F                LDA FLAGG1      ;IF FLAG IS SET THAN DELETE ERRORS
 1418 E680                  ANI 80H
 141A C42114                CNZ DELTER
 141D 23                    INX H
 141E C30214                JMP READTB
 1421 E5            DELTER  PUSH H
 1422 2ACB6F                LHLD FLAGG2     ;BEGINNING OF COMMAND
 1425 3E2C                  MVI A,2CH       ;REPLACE ERROR WITH A COMMA
 1427 77                    MOV M,A
 1428 23                    INX H           ;INC POINTER
 1429 22CB6F                SHLD FLAGG2     ;STORE NEW POINTER
 142C E1                    POP H
 142D C9                    RET
                    ;
                    ;       OBJECT SELECT SUBROUTINE
                    ;
 142E 2AC86F        OBJSEL  LHLD SVALUE
 1431 7D                    MOV A,L
 1432 F5                    PUSH PSW
 1433 C6F8                  ADI 0F8H        ;ADD -7 SVALUE
```

```
CP/M MACRO ASSEM 2.0    #014    VIPER-X.  GIL HYATT SYSTEM

 1435 F23D14            JP OBJSL1       ;IF > THAN 7 DO NOT FILL SXORIG
 1438 F1                POP PSW
 1439 329810            STA SXORIG
 143C C9                RET
 143D F1        OBJSL1  POP PSW
 143E 21B990            LXI H,MES04     ;LOAD ERROR MESSAGE
 1441 CD4564            CALL RBUFF
 1444 CD2764            CALL CRLF
 1447 C9                RET
                ;
                ;       DISPLACEMENT VALUE SUBROUTINE
                ;
 1448 2AC86F    DISPMT  LHLD SVALUE
 144B 7D                MOV A,L
 144C 329A10            STA SXSTR1
 144F C9                RET
                ;
                ;       EXECUTE VIPER PROGRAM
                ;
 1450 2AC66F    RUNVIP  LHLD SPSTOR
 1453 7E        RNVIP   MOV A,M
 1454 FE0A              CPI 0AH
 1456 CA6814            JZ RNVIP2       ;EXECUTE IF 0AH
 1459 FE0D              CPI 0DH
 145B C26214            JNZ RNVIP1
 145E 23                INX H
 145F C35314            JMP RNVIP
 1462 11F097    RNVIP1  LXI D,STORBF
 1465 C3B812     .      JMP START4      ;NEXT COMMAND, IF NOT 0AH
 1468 3E2C      RNVIP2  MVI A,2CH
 146A 77                MOV M,A
 146B CD0010            CALL SUPINT
 146E 3ACA6F            LDA FLAGG1      ;RESET FLAG FOR DELETEING ERRORS
 1471 E67F              ANI 7FH
 1473 32CA6F            STA FLAGG1
 1476 E1                POP H
 1477 C30310            JMP SUPMOT
                ;
                ;       CLEAR BUFFER
                ;
 147A 210097    CLEARB  LXI H,INBUF
 147D 110067            LXI D,6700H     ;2S COMP OF 9900H
 1480 CDE813            CALL IOBFC
 1483 3AC16F            LDA SFWORD      ;SET 1ST PASS FLAG TO ZERO
 1486 E67F              ANI 7FH
 1488 32C16F            STA SFWORD
 148B C30912            JMP XSTRT1
                ;
                ;    READ HELP FILE
                ;
 148E 210096    RDHELP  LXI H,HELP00
 1491 CD9714            CALL RDTEXT
 1494 C30912            JMP XSTRT1
                ;
                ;    READ ASCII TEXT FROM FILE POINTED TO BY REGISTERS H AND L.
                ;  A BACKSLASH "\" IN THE FILE CAUSES THE DISPLAY TO START A NEW
```

```
CP/M MACRO ASSEM 2.0    #015    VIPER-X.  GIL HYATT SYSTEM

                ;  LINE.  A "OA" HEX (LINEFEED) MARKS THE END OF FILE.
                ;
1497 F5         RDTEXT  PUSH PSW        ;SAVE ACC
1498 7E         RDTXT1  MOV A,M         ;GET CHARACTER
1499 FE5C               CPI '\'         ;IF BACKSLASH THEN
149B CAAA14             JZ RDTXT3       ;NEXT DISPLAY LINE
149E FEOA               CPI OAH         ;EXIT ON END OF
14A0 CAB014             JZ RDTXTE       ;FILE CHARACTER
14A3 CD0964             CALL OUTTY      ;OUTPUT CHARACTER
14A6 23         RDTXT2  INX H           ;LOOP FOR NEXT CHAR.
14A7 C39814             JMP RDTXT1      ;LOOP GOT NEXT CHAR.
14AA CD2764     RDTXT3  CALL CRLF       ;OUTPUT A CAR. RET. + LINE FEED
14AD C3A614             JMP RDTXT2      ;SKIP CHARACTER OUTPUT
14B0 F1         RDTXTE  POP PSW         ;RESTORE ACC
14B1 C9                 RET
                ;
                ;    OUTPUT CMDBFR ON COMMAND "READBF"
                ;
14B2 212298     RDCMDB  LXI H,CMDBFR+2
14B5 7E         RDCMB1  MOV A,M
14B6 23                 INX H
14B7 FEOA               CPI OAH
14B9 CAD214             JZ LFRT
14BC FE00               CPI OOH
14BE CAD214             JZ LFRT
14C1 FE0D               CPI ODH
14C3 CACC14             JZ LINFD        ;LINE FEED WHEN RETURN IS READ
14C6 CD0964             CALL OUTTY
14C9 C3B514             JMP RDCMB1
14CC CD2764     LINFD   CALL CRLF
14CF C3B514             JMP RDCMB1
14D2 CD2764     LFRT    CALL CRLF       ;LINE FEED, RETURN TO START BEGINNING
14D5 C30912             JMP XSTRT1
                ;
                ;    DELETE ALL ERRORS IN CMDBFR
                ;
14D8 3ACA6F     DELERR  LDA FLAGG1      ;SET FLAG TO 1
14DB 3E80               MVI A,80H
14DD 32CA6F             STA FLAGG1
14E0 C3A912             JMP RCMBF       ;JMP TO READ CMDBFR
                ;
```

```
                   ;
                   ;   PRIMARY COMMAND TABLE
                   ;
9300 4950          NEWCMD   DB 'IP'
9302 0D                     DB 0DH
9303 43504D                 DB 'CPM'
9306 0D                     DB 0DH
9307 494E4954               DB 'INIT'
930B 0D                     DB 0DH
930C 50                     DB 'P'
930D 0D                     DB 0DH
930E 434C425546             DB 'CLBUF'
9313 0D                     DB 0DH
9314 5245535441             DB 'RESTART'
```

```
CP/M MACRO ASSEM 2.0     #020     VIPER-X.  GIL HYATT SYSTEM

 931B OD                  DB ODH
 931C 48454C50            DB 'HELP'
 9320 OD                  DB ODH
 9321 5245414442          DB 'READBF'
 9327 OD                  DB ODH
 9328 44455252            DB 'DERR'
 932C OD                  DB ODH
 932D 54455354            DB 'TEST'
 9331 OD                  DB ODH
 9332 434C504958          DB 'CLPIX'
 9337 OD                  DB ODH
 9338 OA                  DB OAH
                ;
 9400                     ORG STMEM+2400H
                ;
                ;  PARAMETER JUMP TABLE
                ;
 9400 C35014    JMPTB     JMP RUNVIP
 9403 C32E14              JMP OBJSEL
 9406 C34814              JMP DISPMT
                ;
 9500                     ORG STMEM+2500H
                ;
                ;  PRIMARY JUMP TABLE
                ;
 9500 C31564    NEWJTB    JMP INITP
 9503 C30000              JMP BOOT
 9506 C30001              JMP BEGIN
 9509 C32464              JMP PRTCON
 950C C37A14              JMP CLEARB
 950F C3BF11              JMP XSTART
 9512 C38E14              JMP RDHELP
 9515 C3B214              JMP RDCMDB
 9518 C3D814              JMP DELERR
 951B C33501              JMP TEST
 951E C30E16              JMP CLPIX
                ;
 9600                     ORG STMEM+2600H
                ;
                ;         HELP FILE
                ;
 9600 224F423A23HELP00    DB '"OB:#," - Object Value Select        '
 9624 22494E4954          DB '"INIT" - Reinitialize Program\'
 9642 2244583A23          DB '"DX:#," - Displacement value select '
 9666 2252455354          DB '"RESTART" - Clear Screen\'
 967F 224720646F          DB '"G down arrow" - Begin Execution     '
 96A3 225022202D          DB '"P" - Turn Printer ON\'
 96B9 22434C4255          DB '"CLBUF" - Clear All Data In Buffers '
 96DD 2249502220          DB '"IP" - Initialize The Printer\'
 96FB 2243504D22          DB '"CPM" - Exit To Operating System     '
 971F 2252454144          DB '"READBF" - Read Data In Buffer\'
 973E 2244455252          DB '"DERR" - Delete All Errors           '
 9762 22434C5049          DB '"CLPIX" - Clear pixel Mem.\'
 977D OA                  DB OAH
                ;
                ;
```

```
CP/M MACRO ASSEM 2.0    #021    VIPER-X.  GIL HYATT SYSTEM

                ; INPUT BUFFER AREA DEFINED BY EQU STATEMENTS AT TOP OF LISTIN
                ;
                ;       INBUF  EQU STMEM+27C0H-- .
                ;       STORBF EQU STMEM+27F0H-- FOR REF.  SEE TOP OF LISTING
                ;       CMDBFR EQU STMEM+2820H--
                ;
```

```
                ;
                ;  DOUBLE PRECISION SUBTRACT
                ;     THIS ROUTINE REQUIRES REGISTERS D,E,H, AND L.
                ;ALL OTHER REGISTERS EXCEPT THE CARRY FLAG ARE SAVED.
                ;
                ;     A CALL TO THIS ROUTINE SUBTRACTS THE CONTENTS OF
                ;REGISTERS H AND L FROM THE CONTENTS OF D AND E AND
                ;LEAVES THE VALUE IN REGISTERS H AND L.  IF AN UNDER-
                ;FLOW IS GENERATED THE CARRY FLAG IS SET TO ZERO.
                ;OTHERWISE, THE CARRY FLAG IS SET TO ONE.
                ;
6681 F5         XDBSUB  PUSH PSW        ;SAVE A AND FLAGS.
6682 7D                 MOV A,L         ;COMPLIMENT REGISTER L.
6683 2F                 CMA
6684 6F                 MOV L,A
6685 7C                 MOV A,H         ;COMPLIMENT REGISTER H.
6686 2F                 CMA
6687 67                 MOV H,A
6688 23                 INX H           ;ADD ONE TO REGISTERS H AND L.
6689 F1                 POP PSW         ;LOAD A AND FLAGS.
668A 19                 DAD D           ;ADD (D,E) TO (H,L)
668B C9                 RET
                ;
                ;  HOME DISPLAY CURSOR TO ZERO SUBROUTINE
                ;
                ;      THIS RE-ENTRANT SUBROUTINE SAVES ALL REGISTERS
                ;AND FLAGS AND SENDS THE DISPLAY CURSOR TO IT'S HOME
                ;POSITION.
                ;
                ;  THIS PROGRAM IS A SPECIAL ROUTINE TO INTERFACE TO
                ;JAMES CHAN'S MEMORY MAPPED DISPLAY--CALLS G. RUSSELL'S
                ;BIOS
                ;
                        IF JAMES
                XCURHM  PUSH PSW        ;SAVE ACCUMULATOR AND FLAGS
                        PUSH B
                        PUSH D
                        PUSH H
                        MVI A,0EH
                        CALL OUTTY
                        POP H
                        POP D
                        POP B
                        POP  PSW        ;RESTORE ACCUMULATOR AND FLAGS
                        RET
                ;
                ;  VERSION FOR BARRY LEE'S SOROC DISPLAY
                ;
```

```
CP/M MACRO ASSEM 2.0     #012     VIPER-X.  GIL HYATT SYSTEM

                         ELSE
 668C F5        XCURHM   PUSH PSW         ;SAVE ACCUMULATOR AND FLAGS
 668D 3E1E               MVI  A,1EH       ;LOAD HOME CHARACTER
 668F CD0964             CALL OUTTY       ;OUTPUT TO DISPLAY
 6692 F1                 POP  PSW         ;RESTORE ACCUMULATOR AND FLAGS
 6693 C9                 RET
                         ENDIF
                ;
                ;  STORE A DISPLAY CHARACTER IN IMAGE MEMORY SUBROUTINE
                ;
                ;    ALL REGISTERS AND FLAGS SAVED.  RE-ENTRANT.
                ;      PASSING REGISTERS:
                ;        B= "X" POSITION
                ;        C= "Y" POSITION
                ;        A= TEMPORARY (SAME AS E)
                ;        D= THE M.S.BYTE OF THE PIXEL WORD
                ;        E= THE L.S.BYTE OF THE PIXEL WORD
                ;
                ;     THIS SUBROUTINE STORES THE 16 BIT VALUE IN REGISTERS
                ;D AND E IN IMAGE MEMORY WHICH IS DECODED BY THE COLOR TABLE
                ;AND DISPLAYED AS AN ASCII CHARACTER ON THE DISPLAY.  THE
                ;NUMBER IS STORED IN THE IMAGE MEMORY LOCATION DEFINED BY
                ;BY THE 12 BIT CONCATENATION OF THE 6 LSB'S OF REG. C
                ;(MSBYTE) AND REG. B (LSBYTE).  REG. B AND C ARE THE "X"
                ;AND "Y" POSITION OF THE DISPLAY RESPECTIVELY.
                ;
 6694 E5        XLDMEM   PUSH H           ;SAVE REGISTERS H,L
 6695 CD2D64             CALL CURHM       ;DISPLAY CURSOR TO HOME
 6698 CD0F64             CALL INPUT       ;SYSTEM IF "ESCAPE KEY"
 669B CD4864             CALL IMADD       ;FORM MEMORY ADDRESS.
 669E 73                 MOV  M,E         ;STORE L.S.BYTE IN MEMORY
 669F 7B                 MOV  A,E         ;TEMPORARY
 66A0 23                 INX  H
 66A1 72                 MOV  M,D         ;STORE M.S.BYTE IN MEMORY
 66A2 CD3664             CALL DISPLY      ;STORE CHARACTER IN DISPLAY
 66A5 E1                 POP  H           ;RESTORE REG. H,L
 66A6 C9                 RET
                ;
                ;  READ A DISPLAY CHARACTER IN IMAGE MEMORY SUBROUTINE
                ;
 66A7 E5        XRDMEM   PUSH H
 66A8 CD4864             CALL IMADD
 66AB 5E                 MOV  E,M
 66AC 7B                 MOV  A,E         ;TEMPORARY
 66AD 23                 INX  H
 66AE 56                 MOV  D,M
 66AF E1                 POP  H
 66B0 C9                 RET
                ;
                ;  OUTPUT A CHARACTER TO DISPLAY SUBROUTINE
                ;
                ;    ALL REGISTERS AND FLAGS ARE SAVED.  RE-ENTRANT
                ;      PASSING REGISTERS:
                ;        A= THE SYMBOL NUMBER TO BE DISPLAYED
                ;        B= COLUMN COORDINATE= "X" POSITION (64 MAX.)
                ;        C= ROW COORDINATE= "Y" POSITION (24 MAX.)
```

```
CP/M MACRO ASSEM 2.0     #013     VIPER-X.  GIL HYATT SYSTEM

                 ;
                 ;    THIS ROUTINE SETS THE DISPLAY CURSOR TO THE LOCATION
                 ;DEFINED BY REGISTERS "B" AND "C".  THE SYMBOL NUMBER IN
                 ;REGISTER "A" IS USED AS A POINTER TO OBTAIN THE THE DISPLAY
                 ;CHARACTER FROM THE COLOR TABLE.  THE CHARACTER OBTAINED FROM
                 ;THE COLOR TABLE IS OUTPUT TO THE DISPLAY WHICH WILL PLACE THE
                 ;CHARACTER ON THE DISPLAY AT THE CURSOR POSITION.  IF "B" IS
                 ;GREATER THAN 64 OR "C" IS GREATER THAN 24, THE ROUTINE WILL
                 ;RETURN WITHOUT POSITIONING THE CURSOR OR OUTPUTING A CHARACTER.
                 ;
                 ;
                 ;  THIS PROGRAM IS A SPECIAL ROUTINE TO INTERFACE TO
                 ;JAMES CHAN'S MEMORY MAPPED DISPLAY--CALLS G. RUSSELL'S
                 ;BIOS
                 ;
                         IF JAMES
                 XDISPY  PUSH PSW         ;SAVE ACCUMULATOR AND FLAGS
                         MOV A,C          ;EXIT IF "Y" > 16
                         CPI 10H
                         JNC DISPEX
                         MOV A,B          ;EXIT IF "X" > 64
                         CPI 40H
                         JNC DISPEX
                         STA 0CB61H       ;X NUMBER STORAGE
                         MOV A,C          ;GET Y POSITION
                         STA 0CB60H       ;Y NUMBER STORAGE
                         CALL 0D6E6H      ;CURSOR POSITIONING DRIVER LOCATION
                         POP PSW          ;GET SYMBOL NUMBER
                         PUSH PSW
                         PUSH D           ;SAVE REGISTERS "D,E" AND "H,L"
                         PUSH H
                         ANI 0FH          ;MASK FOR SURFACE NO. (BITS 0-3)
                         RLC              ;MULT A BY 4
                         RLC
                         INR A            ;INC BY 2
                         INR A
                         MOV E,A          ;SET D,E TO VALUE OF SURFACE NO.
                         MVI D,0
                         LXI H,SURFAC     ;SET H,L TO BASE OF SURFACE TABLE
                         DAD D            ;(H,L) + A = SURFACE POINTER
                         MOV A,M          ;GET AND OUTPUT CHARACTER
                         CALL OUTTY
                         POP H            ;RESTORE REGISTERS AND EXIT
                         POP D
                 DISPEX  POP PSW
                         RET
                 ;
                 ;  THIS VERSION INTERFACES TO BARRY LEE'S SOROC DISPLAY
                 ;
                         ELSE
66B1 F5          XDISPY  PUSH PSW         ;SAVE ACCUMULATOR AND FLAGS
66B2 79                  MOV A,C          ;EXIT IF "Y" > 24
66B3 FE18                CPI 18H
66B5 D2EB66              JNC DISPEX
66B8 78                  MOV A,B          ;EXIT IF "X" > 64
66B9 FE40                CPI 40H
```

```
CP/M MACRO ASSEM 2.0     #014     VIPER-X.  GIL HYATT SYSTEM

66BB D2EB66              JNC DISPEX
66BE 3E1B                MVI A,1BH       ;OUTPUT CURSOR POSITION ACCESS CODE
66C0 CD0964              CALL OUTTY
66C3 3E3D                MVI A,3DH
66C5 CD0964              CALL OUTTY
66C8 79                  MOV A,C         ;OUTPUT "Y" POSITION
66C9 C620                ADI 20H
66CB CD0964              CALL OUTTY
66CE 78                  MOV A,B         ;OUTPUT "X" POSITION
66CF C620                ADI 20H
66D1 CD0964              CALL OUTTY
66D4 F1                  POP PSW         ;GET SYMBOL NUMBER
66D5 F5                  PUSH PSW
66D6 D5                  PUSH D          ;SAVE REGISTERS "D,E" AND "H,L"
66D7 E5                  PUSH H
66D8 E60F                ANI OFH         ;MASK FOR SURFACE NO. (BITS 0-3)
66DA 07                  RLC             ;MULT A BY 4
66DB 07                  RLC
66DC 3C                  INR A           ;INC A BY 2
66DD 3C                  INR A
66DE 5F                  MOV E,A         ;SET D,E TO VALUE OF SURFACE NO.
66DF 1600                MVI D,0
66E1 210090              LXI H,SURFAC    ;SET H,L TO BASE OF SURFACE TABLE
66E4 19                  DAD D           ;(H,L)+A = SURFACE POINTER
66E5 7E                  MOV A,M         ;GET AND OUTPUT CHARACTER
66E6 CD0964              CALL OUTTY
66E9 E1                  POP H           ;RESTORE REGISTERS AND EXIT
66EA D1                  POP D
66EB F1         DISPEX   POP PSW
66EC C9                  RET
                         ENDIF
                ;
                ;  CLEAR IMAGE MEMORY SUBROUTINE
                ;
66ED F5         XCLMEM   PUSH PSW
66EE C5                  PUSH B
66EF D5                  PUSH D          ;SAVE ALL REGISTERS
66F0 E5                  PUSH H
66F1 210070              LXI H,IMAGE     ;SET H,L TO BASE OF IMAGE MEMORY
66F4 11FF8F              LXI D,IMAGE+1FFFH      ;SET D,E TO TOP
66F7 3E00                MVI A,0         ;CLEAR REGISTER "A"
66F9 E5         CLMEM1   PUSH H          ;SAVE H,L
66FA CD2A64              CALL DBSUB      ;CARRY=0 IF (H,L) > (D,E)
66FD E1                  POP H           ;LOAD H,L
66FE D20667              JNC CLMEM2      ;EXIT IF DONE
6701 77                  MOV M,A         ;ZERO MEMORY BITE DEFINED BY (H.L)
6702 23                  INX H           ;(H,L)=(H,L)+1
6703 C3F966              JMP CLMEM1      ;LOOP FOR NEXT MEMORY BITE
6706 E1         CLMEM2   POP H
6707 D1                  POP D
6708 C1                  POP B           ;RESTORE ALL REGISTERS
6709 F1                  POP PSW
670A C9                  RET             ;RETURN TO CALLING ROUTINE
                ;
                ;  XBUFFR=  WRITE INTO INPUT BUFFER.
                ;  XSTRNG=  WRITE A STRING INTO MEMORY STARTING AT A LOCATION
```

```
CP/M MACRO ASSEM 2.0     #015     VIPER-X.  GIL HYATT SYSTEM

                    ;        DEFINED BY REGISTERS (H.L)
                    ;
 670B 21C097        XBUFFR  LXI H,INBUF
 670E 0600          XSTRNG  MVI B.0
 6710 CD0C64        STRG1   CALL INTTY
 6713 FE7F                  CPI 7FH
 6715 CA2467                JZ RUBOT
 6718 77                    MOV M,A
 6719 23                    INX H
 671A 04                    INR B
 671B FE0D                  CPI 0DH
 671D C8                    RZ
 671E FE0A                  CPI 0AH
 6720 C8                    RZ
 6721 C31067                JMP STRG1
 6724 AF            RUBOT   XRA A
 6725 90                    SUB B
 6726 CA3C67                JZ BGBUF
 6729 2B                    DCX H
 672A 05                    DCR B
 672B 3E5C                  MVI A,5CH
 672D CD0964                CALL OUTTY
 6730 7E                    MOV A,M
 6731 CD0964                CALL OUTTY
 6734 3E5C                  MVI A,5CH
 6736 CD0964                CALL OUTTY
 6739 C31067                JMP STRG1
 673C 3E07          BGBUF   MVI A,07H
 673E CD0964                CALL OUTTY
 6741 C33F64                JMP STRNG
                    ;
                    ;  READI=  READ INPUT BUFFER
                    ;  RBUFF=  READ ASCII DATA STARTING AT A LOCATION DEFINED BY
                    ;          REGISTERS (H.L) AND ENDING WHEN A "CR" IS READ.
                    ;
 6744 CD2764        XREADI  CALL CRLF
 6747 21C097                LXI H,INBUF
 674A 7E            XRBUFF  MOV A,M
 674B 23                    INX H
 674C CD0964                CALL OUTTY
 674F FE0D                  CPI 0DH
 6751 C8                    RZ
 6752 FE0A                  CPI 0AH
 6754 C8                    RZ
 6755 C34564                JMP RBUFF
                    ;
```

TABLES OF COMPUTER LISTINGS

DATABASE MEMORY

```
                  ;--------DATA BASE MEMORY-------------------------------------
                  ;
                  ;                   DBM OBJECT LIBRARY
                  ;
                  ;     OBJECT MEMORY CONTAINS 8 POSSIBLE OBJECTS WITH 8 POSSIBLE
                  ;  VECTORS PER OBJECT.  EACH VECTOR REQUIRES 4 EIGHT BIT BYTES.
                  ;
9900                      ORG STMEM+2900H
                  ;
                  ;  OBJECT 0
                  ;     VECTOR 0
9900 02           DBOBJK  DB 2
9901 19                   DB 25
9902 0C                   DB 12
9903 00                   DB 0
                  ;     VECTOR 1
9904 00                   DB 0
9905 28                   DB 40
9906 0F                   DB 15
9907 80                   DB 80H
                  ;     VECTOR 2
9908 01                   DB 1
9909 22                   DB 34
990A 02                   DB 2
990B 40                   DB 40H
990C                      DS 20
                  ;  OBJECT 1
                  ;     VECTOR 0
9920 07100700             DB 7,16,7,0
                  ;     VECTOR 1
9924 000B0B00             DB 0,11,11,0
                  ;     VECTOR 2
9928 010E1000             DB 1,14,16,0
                  ;     VECTOR 3
992C 020A1400             DB 2,10,20,0
                  ;     VECTOR 4
9930 03141000             DB 3,20,16,0
                  ;     VECTOR 5
9934 04120D00             DB 4,18,13,0
                  ;     VECTOR 6
9938 05140900             DB 5,20,9,0
                  ;     VECTOR 7
993C 06100340             DB 6,16,3,40H
                  ;  OBJECT 2
                  ;     VECTOR 0
9940 03                   DB 3
9941 10                   DB 16
9942 0A                   DB 10
9943 00                   DB 0
                  ;     VECTOR 1
```

```
CP/M MACRO ASSEM 2.0     #022     VIPER-X.   GIL HYATT SYSTEM

9944 00                       DB 0
9945 0C                       DB 12
9946 0A                       DB 10
9947 80                       DB 80H
                   ;        VECTOR 2
9948 01                       DB 1
9949 0C                       DB 12
994A 14                       DB 20
994B 80                       DB 80H
                   ;        VECTOR 3
994C 02                       DB 2
994D 10                       DB 16
994E 14                       DB 20
994F C0                       DB 0C0H
9950                          DS 16
                   ;    OBJECT 3
                   ;        VECTOR 0
9960 070D0800                 DB 7,13,8,0
                   ;        VECTOR 1
9964 00070B00                 DB 0,7,11,0
                   ;        VECTOR 2
9968 010D0E00                 DB 1,13,14,0
                   ;        VECTOR 3
996C 02101400                 DB 2,16,20,0
                   ;        VECTOR 4
9970 03130E00                 DB 3,19,14,0
                   ;        VECTOR 5
9974 04190B00                 DB 4,25,11,0
                   ;        VECTOR 6
9978 05130800                 DB 5,19,8,0
                   ;        VECTOR 7
997C 06100240                 DB 6,16,2,40H
                   ;    OBJECT 4
                   ;        VECTOR 0
9980 07090600                 DB 7,9,6,0
                   ;        VECTOR 1
9984 000C0600                 DB 0,12,6,0
                   ;        VECTOR 2
9988 010C1200                 DB 1,12,18,0
                   ;        VECTOR 3
998C 02091200                 DB 2,9,18,0
                   ;        VECTOR 4
9990 03090D00                 DB 3,9,13,0
                   ;        VECTOR 5
9994 04041600                 DB 4,4,22,0
                   ;        VECTOR 6
9998 050F1600                 DB 5,15,22,0
                   ;        VECTOR 7
999C 060F0240                 DB 6,15,2,40H
                   ;    OBJECT 5
                   ;        V 0
99A0 060C1600                 DB 6,12,22,0
                   ;        V 1
99A4 000D1100                 DB 0,13,17,0
                   ;        V2
99A8 010F1100                 DB 1,15,17,0
```

```
CP/M MACRO ASSEM 2.0    #023    VIPER-X.  GIL HYATT SYSTEM

                    ;       V3
 99AC 02101600              DB 2,16,22,0
                    ;       V4
 99B0 03140200              DB 3,20,2,0
                    ;       V5
 99B4 040E0A00              DB 4,14,10,0
                    ;       V6
 99B8 05080240              DB 5,8,2,40H
 99BC                       DS 4
                    ;  OBJECT 6
                    ;    V0
 99C0 03190F00              DB 3,25,15,0
                    ;    V1
 99C4 001E1200              DB 0,30,18,0
                    ;    V2
 99C8 01230F00              DB 1,35,15,0
                    ;    V3
 99CC 021E0C40              DB 2,30,12,40H
 99D0                       DS 16
                    ;    OBJECT 7
 99E0 06180B00              DB 6,24,11,0
 99E4 00230B00              DB 0,35,11,0
 99E8 01230F00              DB 1,35,15,0
 99EC 02280A00              DB 2,40,10,0
 99F0 03230500              DB 3,35,5,0
 99F4 04230900              DB 4,35,9,0
 99F8 05180940              DB 5,24,9,40H
 99FC                       DS 4
                    ;
                    ;                     DATA BASE INITIAL CONDITIONS
                    ;
                    ;      DBICON MEMORY CONTAINS 8 POSSIBLE ENTRIES WITH 8 BYTES
                    ;   PER ENTRY.
                    ;
                    ;
                    ;   DBICON 0
 9A00 00            DBICON  DB 0
 9A01 00                    DB 0
 9A02 00                    DB 0
 9A03 00                    DB 0
 9A04 18                    DB 18H
 9A05 00                    DB 0
 9A06 00                    DB 0
 9A07 00                    DB 0
                    ;   DBICON 1
 9A08 01                    DB 1
 9A09 14                    DB 20
 9A0A 02                    DB 2
 9A0B 04                    DB 4
 9A0C 19                    DB 19H
 9A0D 00                    DB 0
 9A0E 00                    DB 0
 9A0F 00                    DB 0
                    ;   DBICON 2
 9A10 02                    DB 2
 9A11 18                    DB 24
```

```
CP/M MACRO ASSEM 2.0     #024     VIPER-X.  GIL HYATT SYSTEM

9A12 00                  DB 0
9A13 00                  DB 0
9A14 19                  DB 19H
9A15 00                  DB 0
9A16 00                  DB 0
9A17 00                  DB 0
              ;   DBICON 3
9A18 03                  DB 3
9A19 18                  DB 24
9A1A 00                  DB 0
9A1B 00                  DB 0
9A1C 01                  DB 01H
9A1D 00                  DB 0
9A1E 00                  DB 0
9A1F 00                  DB 0
              ;   DBICON 4
9A20 04                  DB 4
9A21 19                  DB 25
9A22 00                  DB 0
9A23 00                  DB 0
9A24 0A                  DB 0AH
9A25 00                  DB 0
9A26 00                  DB 0
9A27 00                  DB 0
              ;   DBICON 5
9A28 05                  DB 5
9A29 18                  DB 24
9A2A 00                  DB 0
9A2B 00                  DB 0
9A2C 0D                  DB 0DH
9A2D 00                  DB 0
9A2E 00                  DB 0
9A2F 00                  DB 0
              ;   DBICON 6
9A30 06                  DB 6
9A31 08                  DB 8
9A32 00                  DB 0
9A33 00                  DB 0
9A34 0C                  DB 0CH
9A35 00                  DB 0
9A36 00                  DB 0
9A37 00                  DB 0
              ;   DBICON 7
9A38 07                  DB 7
9A39 01                  DB 1
9A3A 03                  DB 3
9A3B 00                  DB 0
9A3C 01                  DB 01H
9A3D 00                  DB 0
9A3E 00                  DB 0
9A3F 00                  DB 0
              ;
9A40                     END BEGIN
```

TABLES OF COMPUTER LISTINGS

GEOMETRIC PROCESSOR

```
CP/M MACRO ASSEM 2.0     #001     VIPER-X.  GIL HYATT SYSTEM

                  ;
                  ;                                    CONFIDENTIAL
                  ;                                    ------------
                  ;                                    EXPERIMENTAL
                  ;                                    ------------
                  ;THIS IS THE DISPLAY EVALUATION PROGRAM FOR THE VIPER-X PROGRAM
                  ;
                  ;  FILE NAME: GEN.ASM
                  ;
                  ;          ORIGIN DATE: NOVEMBER 6,1981
                  ;
                  ;          REVISION DATE: MAY 17,1983
                  ;          REVISION TIME: 14:000
                  ;
                  ;
                  ;     THIS PROGRAM SIMULATES THE OPERATION OF THE VIPER DISPLAY
                  ;IN SOFTWARE.  THE KEYBOARD INPUT IS ASSUMED TO BE THE HOST COM-
                  ;PUTER INTERFACE.  THE KEYBOARD PROVIDES INPUTS IN THE FORM OF
                  ;SPECIAL PRIMATIVES WHICH CONTROL SIMULATED COLOR COMMANDS AS
                  ;WELL AS MOTION, OBJECT SELECTION, AND DISPLAY MENUS.  THE
                  ;PROGRAM IS DIVIDED INTO THREE MAIN SECTIONS.  THE FIRST SECTION
                  ;IS THE SUBROUTINE ROUTINE LIBRARY.  THE SECOND SECTION IS THE
                  ;EXECUTIVE PROGRAM AND THE THIRD IS THE VARIOUS MEMORY
                  ;ALLOCATIONS FOR SIMULATION OF SYSTEM REGISTERS AND MEMORY
                  ;BLOCKS.
                  ;
                  ;
 FFFF =           TRUE    EQU OFFFFH       ;DEFINE "TRUE"
 0000 =           FALSE   EQU NOT TRUE     ;DEFINE "FALSE"
 0000 =           JAMES   EQU FALSE        ;SET FOR BARRY'S SYSTEM
 6FC0 =           STKPT   EQU 6FC0H
 7000 =           STMEM   EQU 7000H
 0000 =           BOOT    EQU 0000H
 0100 =           BEGIN   EQU 0100H
                          IF JAMES         ;ASSEMBLE FOR JAMES'S SYSTEM
                          TITLE            'VIPER-X.  JAMES CHAN SYSTEM'
                  DSIZE   EQU 2043
                  DPLINE  EQU 64
                          ELSE             ;ASSEMBLE FOR GIL'S OR BARRY'S SYSTEM
                          TITLE            'VIPER-X.  GIL HYATT SYSTEM'
 0BFF =           DSIZE   EQU 0BFFH
 0040 =           DPLINE  EQU 0040H
                          ENDIF
 6400 =           LOCSUB  EQU 6400H
 1000 =           LOCBAR  EQU 1000H
 2000 =           LOCGEN  EQU 2000H
 3000 =           LOCGIL  EQU 3000H
 1009 =           START   EQU 1009H
 1098 =           SXORIG  EQU 1098H
 1095 =           SCOLOR  EQU 1095H
 1096 =           SSFLAG  EQU 1096H
 108E =           SEAXSX  EQU 108EH
 108F =           SEAXSY  EQU 108FH
 1090 =           SEAXSZ  EQU 1090H
 3000 =           EGEN    EQU 3000H
 3003 =           EICJ    EQU 3003H
```

```
CP/M MACRO ASSEM 2.0     #002     VIPER-X.  GIL HYATT SYSTEM

6480 =          MOTONX  EQU 6480H
6481 =          MOTONY  EQU 6481H
6482 =          MOTONZ  EQU 6482H
1003 =          SUPMOT  EQU 1003H
6415 =          INITP   EQU 6415H
6424 =          PRTCON  EQU 6424H
6FC1 =          SFWORD  EQU STKPT+1
6FC2 =          DSTART  EQU STKPT+2       ;16 BITS
6FC4 =          STOREX  EQU STKPT+4
6FC5 =          STOREY  EQU STKPT+5
6CFF =          GEOSTK  EQU 6CFFH
4C00 =          SURFTB  EQU 4C00H         ;SURFACE TABLE ORIGIN (TO 4E00H)
5200 =          GPFIF   EQU 5200H         ;MOVING EDGE ENDPOINT FIFO
5800 =          PXPFIF  EQU 5800H         ;P-EDGE PIXEL FIFO (MOVING)
5D00 =          PXNFIF  EQU 5D00H         ;N-EDGE PIXEL FIFO (MOVING)
000F =          IDMSK1  EQU 0FH           ;ID MASK FOR SURFACE MEMORY
00F0 =          IDMSK2  EQU 0F0H
                ;
                ;
                ;
0100                    ORG BEGIN
                ;
                ;  ENTRY JUMP
                ;
0100 31C06F             LXI SP,STKPT
0103 3E80               MVI A,80H         ;SET 1 ST. PASS FLAG TO "1"
0105 32C16F             STA SFWORD        ; IN SYSTEM FLAG BITE
0108 210200             LXI H,2           ;SET FIFO WRITE POINTERS
010B 22FE51             SHLD GPFIF-2
010E 22FE57             SHLD PXPFIF-2
0111 22FE5C             SHLD PXNFIF-2
0114 210000             LXI H,0           ;SET FIFO READ POINTERS AND
0117 22FC51             SHLD GPFIF-4
011A 22FC57             SHLD PXPFIF-4
011D 22FC5C             SHLD PXNFIF-4
0120 22FF6C             SHLD GEOSTK
0123 217F00             LXI H,7FH         ;SET FIFO MODULO MASK (128)
0126 22FA51             SHLD GPFIF-6
0129 21FF03             LXI H, 3FFH       ;SET FIFO MODULO MASK (1024)
012C 22FA57             SHLD PXPFIF-6
012F 22FA5C             SHLD PXNFIF-6
                ;
0132 C30910             JMP START         ;START IS THE BEGINING OF THE
                                          ;  INITIALIZATION ROUTINE
                ;*************************************************************
                ;-------------------------------------------------------------
                ;  PLACE TEMPORARY PROGRAMS AND SYMBOL TABLES BELOW THIS LINE
                ;-------------------------------------------------------------
                ;
0135 0E85       TEST    MVI C,85H         ;# TO BE MULT
0137 0604               MVI B,4           ;2ND # TO BE MULT
0139 CD3F01             CALL MULTBC
013C C33501             JMP TEST
                ;
013F F5         MULTBC  PUSH PSW          ;SAVE A+F
0140 D5                 PUSH D            ;SAVE D+E
```

```
CP/M MACRO ASSEM 2.0    #003    VIPER-X.  GIL HYATT SYSTEM

 0141 78                MOV A,B          ;LOAD "B"
 0142 A7                ANA A            ;TEST FOR NEGATIVE
 0143 FC7D01            CM MTWOS         ;JUMP IF "B" IS NEGATIVE
 0146 5F                MOV E,A          ;"B" TO REG. E
 0147 79                MOV A,C          ;LOAD "C"
 0148 A7                ANA A            ;TEST FOR NEGATIVE
 0149 FC7D01            CM MTWOS         ;JUMP IF "C" IS NEGATIVE
 014C 210000            LXI H,0          ;CLEAR REG. H+L
 014F 54                MOV D,H          ;CLEAR REG. D
 0150 C5                PUSH B           ;SAVE B+C
 0151 0607              MVI B,7
 0153 0F        MULTLP  RRC              ;SHIFT "C" RIGHT TO CARRY
 0154 D25801            JNC MULTL1       ;ADD "B" TO REG
 0157 19                DAD D            ;H+L IF CARRY=1
 0158 EB        MULTL1  XCHG             ;SHIFT "B" LEFT
 0159 29                DAD H            ;ONE BIT
 015A EB                XCHG
 015B 05                DCR B
 015C C25301            JNZ MULTLP       ;LOOP FOR 7 PASSES
 015F C1                POP B            ;TEST FOR SIGN
 0160 78                MOV A,B
 0161 07                RLC
 0162 DA7401            JC MUBNEG        ;JUMP IF "B" IS NEG
 0165 79                MOV A,C          ;"B" IS POSITIVE
 0166 07                RLC
 0167 D27901            JNC MULPOS       ;JUMP IF "C" IS POS
 016A 7C        MULNEG  MOV A,H          ;COMPLIMENT H
 016B 2F                CMA
 016C 67                MOV H,A
 016D 7D                MOV A,L          ;COMPLIMENT L
 016E 2F                CMA
 016F 6F                MOV L,A
 0170 23                INX H            ;ADD ONE TO H+L FOR 2'S COMPLIMENT
 0171 D1                POP D
 0172 F1                POP PSW
 0173 C9                RET
 0174 79        MUBNEG  MOV A,C          ;"B" IS NEG
 0175 07                RLC
 0176 D26A01            JNC MULNEG       ;JUMP IF "C" IS POS
 0179 D1        MULPOS  POP D
 017A F1                POP PSW
 017B 3F                CMC              ;SET CARRY TO "0"
 017C C9                RET
 017D 3D        MTWOS   DCR A
 017E 2F                CMA              ;COMPLIMENT A
 017F C9                RET
                ;-------------------------------------------------------------
                ;         END OF TEMPORARY WORK AREA
                ;-------------------------------------------------------------
                ;
                ;***************************************************************
                ;
 2000                   ORG LOCGEN
                ;
                ;       JUMP TABLE
                ;
```

```
CP/M MACRO ASSEM 2.0     #004     VIPER-X.   GIL HYATT SYSTEM

 2000 C39B20     GEOA     JMP XGEOA
 2003 C3F220     GEOB     JMP XGEOB
 2006 C33621     GEOC     JMP XGEOC
                 ;
 2080                     ORG LOCGEN+80H
                 ;
                 ;
                 ;---------------GEOMETRIC PROCESSOR STORAGE--------------------
                 ;
 2080 0000       GTMPST   DW 0             ;TEMPORARY STORAGE (16 BITS)
 2082 0000       GXOBPT   DW 0             ;OBJECT POINTER (16 BITS)
 2084 0000       GXVEPT   DW 0             ;VECTOR POINTER (16 BITS)
 2086 0000       GXORPT   DW 0             ;ORIGIN POINTER (16 BITS)
 2088 00         GMOTNX   DB 0             ;"X" ORIGIN MOTION
 2089 00         GMOTNY   DB 0             ;"Y" ORIGIN MOTION
 208A 00         GMOTNZ   DB 0             ;"Z" ORIGIN MOTION
 208B 00         GSAXSX   DB 0             ;"X" AXIS START POINT
 208C 00         GSAXSY   DB 0             ;"Y" AXIS START POINT
 208D 00         GSAXSZ   DB 0             ;"Z" AXIS START POINT
 208E 00         GEAXSX   DB 0             ;"X" AXIS END POINT
 208F 00         GEAXSY   DB 0             ;"Y" AXIS END POINT
 2090 00         GEAXSZ   DB 0             ;"Z" AXIS END POINT
 2091 00         GDELTX   DB 0             ;"X" AXIS DELTA
 2092 00         GDELTY   DB 0             ;"Y" AXIS DELTA
 2093 00         GDELTZ   DB 0             ;"Z" AXIS DELTA
 2094 00         GSTART   DB 0             ;NUMBER OF START POINT VECTOR
 2095 00         GCOLOR   DB 0             ;COLOR WORD FROM ORIGIN MEMORY
 2096 00         GSFLAG   DB 0             ;GEOMETRIC PROCESSOR FLAG BYTE
 2097 00         GXFLAG   DB 0             ;BUFFER FLAG BYTE
 2098 00         GXORIG   DB 0             ;ORIGIN NUMBER
 2099 00         GXSTR0   DB 0             ;"X","Y",OR "Z"
 209A 00         GXSTR1   DB 0             ;MOTION DISPLACEMENT IN AXIS DEF. BY 0
                 ;
                 ;        GEOMETRIC PROCESSOR ROUTINE
                 ;
 209B C5         XGEOA    PUSH B
 209C D5                  PUSH D
 209D E5                  PUSH H
 209E 3A9810              LDA SXORIG       ;GET OBJECT ID
 20A1 327822              STA GEORG
 20A4 CDE421              CALL GEOADR      ;GEO MEM ADDRESS
 20A7 3A9810              LDA SXORIG
 20AA 77                  MOV M,A          ;STORE OBJECT ID
 20AB 23                  INX H            ;HL+1
 20AC 3A9510              LDA SCOLOR
 20AF 77                  MOV M,A          ;STORE COLOR
 20B0 23                  INX H            ;HL+2
 20B1 3A9610              LDA SSFLAG
 20B4 77                  MOV M,A          ;STORE FLAGS
 20B5 23                  INX H            ;HL+3
 20B6 3A8E10              LDA SEAXSX
 20B9 77                  MOV M,A          ;STORE END X
 20BA 23                  INX H            ;HL+4
 20BB 3A8F10              LDA SEAXSY
 20BE 77                  MOV M,A          ;STORE END Y
 20BF 23                  INX H            ;HL+5
```

```
CP/M MACRO ASSEM 2.0     #005     VIPER-X.  GIL HYATT SYSTEM

20C0 3A9010              LDA SEAXSZ
20C3 77                  MOV M,A            ;STORE END Z
20C4 3A7922              LDA GEREG          ;VECTOR REGISTER
20C7 3C                  INR A              ;REG+1
20C8 327922              STA GEREG
20CB 3A9610              LDA SSFLAG
20CE E640                ANI 40H            ;MASK ALL BUT BIT 6
20D0 C2D720              JNZ GEOAA          ;JMP IF LAST
20D3 E1                  POP H
20D4 D1                  POP D
20D5 C1                  POP B
20D6 C9                  RET
20D7 3E00        GEOAA   MVI A,0            ;0 IN VCT REGISTER
20D9 327922              STA GEREG
20DC 3A8E10              LDA SEAXSX         ;LOAD LAST ENDPOINT AS
20DF 327A22              STA GEOSTX         ;FIRST STARTPOINT
20E2 3A8F10              LDA SEAXSY
20E5 327B22              STA GEOSTY
20E8 3A9010              LDA SEAXSZ
20EB 327C22              STA GEOSTZ
20EE E1                  POP H
20EF D1                  POP D
20F0 C1                  POP B
20F1 C9                  RET
20F2 C5          XGEOB   PUSH B
20F3 D5                  PUSH D
20F4 E5                  PUSH H
20F5 3E00                MVI A,0
20F7 327F22              STA GEMOX
20FA 328022              STA GEMOY
20FD 328122              STA GEMOZ
2100 CD0022              CALL GEOBUF
2103 CD0030              CALL EGEN
2106 3A7922              LDA GEREG          ;VECTOR REGISTER
2109 3C                  INR A              ;REG +1
210A 327922              STA GEREG
210D E1                  POP H
210E D1                  POP D
210F C1                  POP B
2110 3A7E22              LDA GEOFLG
2113 E640                ANI 40H            ;MASK ALL BUT BIT 6
2115 CA0320              JZ GEOB            ;JUMP IF NOT LAST
2118 3E00                MVI A,0
211A 327922              STA GEREG          ;0 IN REGISTER
211D 3A9620              LDA GSFLAG
2120 E601                ANI 1H             ;MASK ALL BUT BIT 0
2122 C22D21              JNZ GEOBA          ;JUMP IF NEXT
2125 3E01                MVI A,1H
2127 327D22              STA GEONXT         ;SET "NEXT" FLAG
212A C30320              JMP GEOB
212D 3E00        GEOBA   MVI A,0
212F 327D22              STA GEONXT         ;0 "NEXT" FLAG
2132 CD0330              CALL E1CJ
2135 C9                  RET
2136 C5          XGEOC   PUSH B
2137 D5                  PUSH D
```

```
CP/M MACRO ASSEM 2.0     #006     VIFER-X.  GIL HYATT SYSTEM

2138 E5                   PUSH H
2139 3A9810      GEOCA    LDA SXORIG        ;GET OBJECT ID
213C 327822               STA GEORG
213F CDE421               CALL GEOADR       ;GEO MEM IN HL
2142 23                   INX H             ;HL+1
2143 23                   INX H             ;HL+2
2144 3A7922               LDA GEREG         ;REG +1
2147 3C                   INR A
2148 327922               STA GEREG
214B 7E                   MOV A,M           ;GET FLAGS
214C E640                 ANI 40H           ;MASK ALL BUT BIT 6
214E CA3921               JZ GEOCA          ;JUMP IF NOT LAST
2151 23                   INX H             ;HL+3
2152 7E                   MOV A,M           ;LAST VCT END X
2153 327A22               STA GEOSTX        ;ST AS FST VCT START X
2156 23                   INX H             ;HL+4
2157 7E                   MOV A,M           ;Y
2158 327B22               STA GEOSTY
215B 23                   INX H             ;HL+5
215C 7E                   MOV A,M
215D 327C22               STA GEOSTZ        ;Z
2160 3E00                 MVI A,0           ;0 IN REG , MOTION
2162 327922               STA GEREG
2165 327F22               STA GEMOX
2168 328022               STA GEMOY
216B 328122               STA GEMOZ
216E CD0022      GEOCB    CALL GEOBUF       ;LOADS BUFFER
2171 CD0030               CALL EGEN
2174 3A7922               LDA GEREG
2177 3C                   INR A             ;REGISTER + 1
2178 327922               STA GEREG
217B 3A7E22               LDA GEOFLG        ;GET FLAGS
217E E640                 ANI 40H           ;MASK ALL BUT BIT 6
2180 CA6E21               JZ GEOCB          ;JUMP IF NOT LAST
2183 3A8064               LDA MOTONX        ;X MOTION
2186 327F22               STA GEMOX
2189 47                   MOV B,A
218A 3A7A22               LDA GEOSTX        ;GET START X
218D 80                   ADD B             ;X + X MOTION
218E 327A22               STA GEOSTX
2191 3A8164               LDA MOTONY        ;Y MOTION
2194 328022               STA GEMOY
2197 47                   MOV B,A
2198 3A7B22               LDA GEOSTY        ;START Y
219B 80                   ADD B             ;Y + Y MOTION
219C 327B22               STA GEOSTY
219F 3A8264               LDA MOTONZ        ;Z MOTION
21A2 328122               STA GEMOZ
21A5 47                   MOV B,A
21A6 3A7C22               LDA GEOSTZ        ;START Z
21A9 80                   ADD B             ;Z + Z MOTION
21AA 327C22               STA GEOSTZ
21AD 3E00                 MVI A,0           ;0 IN REGISTER
21AF 327922               STA GEREG
21B2 3E01                 MVI A,1H          ;LOAD NEXT FLAG
21B4 3A7D22               LDA GEONXT
```

```
CP/M MACRO ASSEM 2.0     #007     VIPER-X.  GIL HYATT SYSTEM

21B7 CD0022     GEOCC    CALL GEOBUF       ;LOADS "NEXT" BUFFER
21BA CD0030              CALL EGEN
21BD 3A7922              LDA GEREG         ;REGISTER + 1
21C0 3C                  INR A
21C1 327922              STA GEREG
21C4 3A7E22              LDA GEOFLG        ;GET FLAGS
21C7 E640                ANI 40H           ;MASK ALL BUT BIT 6
21C9 CAB721              JZ GEOCC          ;JUMP IF NOT LAST
21CC 3E00                MVI A,0           ;0 IN REGISTER,NEXT FLAG
21CE 327922              STA GEREG         ;AND MOTION
21D1 327D22              STA GEONXT
21D4 327F22              STA GEMOX
21D7 328022              STA GEMOY
21DA 328122              STA GEMOZ
21DD E1                  POP H
21DE D1                  POP D
21DF C1                  POP B
21E0 CD0330              CALL EICJ
21E3 C9                  RET
21E4 D5         GEOADR   PUSH D            ;START WITH ID IN A
21E5 2600                MVI H,0
21E7 6F                  MOV L,A           ;OBJECT ID IN HL
21E8 29                  DAD H             ;ID X 64
21E9 29                  DAD H
21EA 29                  DAD H
21EB 29                  DAD H
21EC 29                  DAD H
21ED 29                  DAD H
21EE EB                  XCHG              ;ID IN DE
21EF 21004C              LXI H,SURFTB      ;SURFACE MEMORY LOCATION
21F2 19                  DAD D             ;IDX64 + SURFTB IN HL
21F3 EB                  XCHG              ;IN DE
21F4 3A7922              LDA GEREG         ;VECTOR REGISTER
21F7 2600                MVI H,0
21F9 6F                  MOV L,A
21FA 29                  DAD H             ;REG X 8
21FB 29                  DAD H
21FC 29                  DAD H
21FD 19                  DAD D             ;IDX64+S+REGX8 IN HL
21FE D1                  POP D
21FF C9                  RET
2200 3A7822     GEOBUF   LDA GEORG         ;GET OBJECT ID
2203 CDE421              CALL GEOADR       ;GEO MEMORY
2206 7E                  MOV A,M           ;GET OBJECT ID
2207 329820              STA GXORIG
220A 0E00                MVI C,0           ;CLEAR C
220C 23                  INX H             ;HL + 1
220D 7E                  MOV A,M           ;GET COLOR
220E 329520              STA GCOLOR
2211 23                  INX H             ;HL + 2
2212 46                  MOV B,M           ;GET FLAGS
2213 3A7D22              LDA GEONXT        ;NEXT FLAGS
2216 B0                  ORA B             ;ADD TO FLAGS
2217 329620              STA GSFLAG
221A 327E22              STA GEOFLG
221D 23                  INX H             ;HL + 3
```

```
CP/M MACRO ASSEM 2.0     #008     VIPER-X.  GIL HYATT SYSTEM

221E 3A7F22              LDA GEMOX        ;X MOTION
2221 4E                  MOV C,M          ;X IN C
2222 81                  ADD C            ;X + X MOTION IN A
2223 77                  MOV M,A          ;IN GEO MEMORY
2224 47                  MOV B,A
2225 3A7A22              LDA GEOSTX       ;START X + X MOTION
2228 328B20              STA GSAXSX
222B 4F                  MOV C,A
222C 78                  MOV A,B
222D 91                  SUB C            ;END X - START X
222E 329120              STA GDELTX
2231 78                  MOV A,B
2232 328E20              STA GEAXSX
2235 23                  INX H            ;HL + 4
2236 3A8022              LDA GEMOY        ;Y MOTION
2239 4E                  MOV C,M          ;Y IN C
223A 81                  ADD C            ;Y + Y MOT IN A
223B 77                  MOV M,A          ;IN GEO MEM
223C 47                  MOV B,A
223D 3A7B22              LDA GEOSTY       ;GET START Y
2240 328C20              STA GSAXSY
2243 4F                  MOV C,A
2244 78                  MOV A,B
2245 91                  SUB C            ;END Y - START Y
2246 329220              STA GDELTY
2249 78                  MOV A,B
224A 328F20              STA GEAXSY
224D 23                  INX H            ;HL + 5
224E 3A8122              LDA GEMOZ        ;Z MOTION
2251 4E                  MOV C,M          ;Z IN C
2252 81                  ADD C            ;Z + Z MOT IN A
2253 77                  MOV M,A          ;IN GEO MEM
2254 47                  MOV B,A
2255 3A7C22              LDA GEOSTZ       ;GET START Z
2258 328D20              STA GSAXSZ
225B 4F                  MOV C,A
225C 78                  MOV A,B
225D 91                  SUB C            ;END Z -START Z
225E 329320              STA GDELTZ
2261 78                  MOV A,B
2262 329020              STA GEAXSZ
2265 3A8E20              LDA GEAXSX       ;LOAD ENDPOINT AS
2268 327A22              STA GEOSTX       ;STARTPOINT
226B 3A8F20              LDA GEAXSY
226E 327B22              STA GEOSTY
2271 3A9020              LDA GEAXSZ
2274 327C22              STA GEOSTZ
2277 C9                  RET
                ;
                ;          GEO TEMPORARY STORAGE
                ;          ---------------------
2278 00         GEORG    DB 0     ;OBJECT IDENTIFICATION
2279 00         GEREG    DB 0     ;REGISTER FOR VECTOR ID
227A 00         GEOSTX   DB 0     ;X START POINT
227B 00         GEOSTY   DB 0     ;Y START POINT
227C 00         GEOSTZ   DB 0     ;Z START POINT
```

```
CP/M MACRO ASSEM 2.0     #009     VIPER-X.  GIL HYATT SYSTEM

 227D 00         GEONXT  DB 0      ;"NEXT" FLAG
 227E 00         GEOFLG  DB 0      ;FLAGS
 227F 00         GEMOX   DB 0      ;X MOTION
 2280 00         GEMOY   DB 0      ;Y MOTION
 2281 00         GEMOZ   DB 0      ;Z MOTION
                 ;
                 ;    DISPLAY STORAGE AREA
                 ;
 7000                    ORG  STMEM
 7000            IMAGE   DS   2000H
                 ;
                 ;  LOAD SURFACE COLOR TABLE
                 ;
 9000            SURFAC  DS 40H
                 ;
                 ;---------DATA BASE MEMORY--------------------------------------
                 ;
                 ;                    DBM OBJECT LIBRARY
                 ;
                 ;     OBJECT MEMORY CONTAINS 8 POSSIBLE OBJECTS WITH 8 POSSIBLE
                 ;  VECTORS PER OBJECT.  EACH VECTOR REQUIRES 4 EIGHT BIT BYTES.
                 ;
 9900                    ORG STMEM+2900H
                 ;
                 ;  OBJECT 0
                 ;     VECTOR 0
 9900 02         DBOBJK  DB 2
 9901 19                 DB 25
 9902 0C                 DB 12
 9903 00                 DB 0
                 ;     VECTOR 1
 9904 00                 DB 0
 9905 28                 DB 40
 9906 0F                 DB 15
 9907 80                 DB 80H
                 ;     VECTOR 2
 9908 01                 DB 1
 9909 22                 DB 34
 990A 02                 DB 2
 990B 40                 DB 40H
 990C                    DS 20
                 ;  OBJECT 1
                 ;     VECTOR 0
 9920 01                 DB 1
 9921 14                 DB 20
 9922 14                 DB 20
 9923 40                 DB 40H
                 ;     VECTOR 1
 9924 00                 DB 0
 9925 04                 DB 4
 9926 0C                 DB 12
 9927 00                 DB 0
 9928                    DS 24
                 ;  OBJECT 2
                 ;     VECTOR 0
 9940 03                 DB 3
```

```
CP/M MACRO ASSEM 2.0     #010     VIPER-X.  GIL HYATT SYSTEM

 9941 10              DB 16
 9942 0A              DB 10
 9943 00              DB 0
               ;      VECTOR 1
 9944 00              DB 0
 9945 0C              DB 12
 9946 0A              DB 10
 9947 80              DB 80H
               ;      VECTOR 2
 9948 01              DB 1
 9949 0C              DB 12
 994A 14              DB 20
 994B 80              DB 80H
               ;      VECTOR 3
 994C 02              DB 2
 994D 10              DB 16
 994E 14              DB 20
 994F C0              DB 0C0H
 9950                 DS 16
               ;  OBJECT 3
                      VECTOR 0
 9960                 DS 64
               ;
               ;                    DATA BASE INITIAL CONDITIONS
               ;
               ;      DBICON MEMORY CONTAINS 8 POSSIBLE ENTRIES WITH 8 BYTES
               ;  PER ENTRY.
               ;
               ;
               ;  DBICON 0
 99A0 00       DBICON  DB 0
 99A1 00              DB 0
 99A2 00              DB 0
 99A3 00              DB 0
 99A4 18              DB 18H
 99A5 00              DB 0
 99A6 00              DB 0
 99A7 00              DB 0
               ;  DBICON 1
 99A8 01              DB 1
 99A9 0A              DB 10
 99AA 02              DB 2
 99AB 04              DB 4
 99AC 19              DB 19H
 99AD 00              DB 0
 99AE 00              DB 0
 99AF 00              DB 0
               ;  DBICON 2
 99B0 02              DB 2
 99B1 00              DB 0
 99B2 00              DB 0
 99B3 00              DB 0
 99B4 19              DB 19H
 99B5 00              DB 0
 99B6 00              DB 0
 99B7 00              DB 0
```

```
CP/M MACRO ASSEM 2.0    #011     VIPER-X.  GIL HYATT SYSTEM

                   :
 99B8                       DS 16
                   :
 99C8                       END BEGIN
```

```
                    ;
                    ;             MOTION INPUT SUBROUTINE
                    ;
6774 F5             XMOTON  PUSH PSW
6775 C5                     PUSH B
6776 3A9A10                 LDA SXSTR1
6779 47                     MOV B,A
677A CD0C64                 CALL INTTY
677D 00                     NOP
677E 00                     NOP
677F 00                     NOP
6780 FE53                   CPI 'S'
6782 CA9767                 JZ EXMINS
6785 FE44                   CPI 'D'
6787 CAA167                 JZ EXPLUS
678A FE45                   CPI 'E'
678C CAAB67                 JZ EYMINS
678F FE58                   CPI 'X'
6791 CAB567                 JZ EYPLUS
6794 C3BC67                 JMP EXITRT
6797 3A8064         EXMINS  LDA MOTONX
679A 90                     SUB B
679B 328064                 STA MOTONX
679E C3BC67                 JMP EXITRT
67A1 3A8064         EXPLUS  LDA MOTONX
67A4 80                     ADD B
67A5 328064                 STA MOTONX
67A8 C3BC67                 JMP EXITRT
67AB 3A8164         EYMINS  LDA MOTONY
67AE 90                     SUB B
67AF 328164                 STA MOTONY
67B2 C3BC67                 JMP EXITRT
```

```
CP/M MACRO ASSEM 2.0     #017     VIPER-X.  GIL HYATT SYSTEM

 67B5 3A8164     EYPLUS  LDA MOTONY
 67B8 80                 ADD B
 67B9 328164             STA MOTONY
 67BC C1         EXITRT  POP B
 67BD F1                 POP PSW
 67BE C9                 RET
                 ;
                 ;                 CLEAR DRAW MOTION BUFFER SUBROUTINE
                 ;
 67BF 3E00       XCLMTN  MVI A,0
 67C1 328810             STA SMOTNX
 67C4 328910             STA SMOTNY
 67C7 328A10             STA SMOTNZ
 67CA C9                 RET
                 ;
                 ;                 LOAD DRAW MOTION BUFFER SUBROUTINE
                 ;
 67CB 3A8064     XLDMTN  LDA MOTONX
 67CE 328810             STA SMOTNX
 67D1 3A8164             LDA MOTONY
 67D4 328910             STA SMOTNY
 67D7 3A8264             LDA MOTONZ
 67DA 328A10             STA SMOTNZ
 67DD C9                 RET
                 ;
                 ;                 CLEAR MOTION BUFFER SUBROUTINE
                 ;
 67DE 3E00       XMOTCL  MVI A,0
 67E0 328064             STA MOTONX
 67E3 328164             STA MOTONY
 67E6 328264             STA MOTONZ
 67E9 C9                 RET
                 .
```

```
2000                  ;          ORG 2000H
                      ;
                      ;                  GEOMETRIC PROCESSOR ROUTINE
                      ;
2000 CDF124           GEOMPR     CALL MOTION     ;GET KEYBORD MOTION COMMAND
2003 3A1798                      LDA GXFLAG
2006 E6FE                        ANI 0FEH        ;SET FLAG BIT 0 TO "0" (PRIOR SURFACE)
2008 321798                      STA GXFLAG
200B CD4A20                      CALL DRAW       ;DRAW PRIOR SURFACE
200E CD4825                      CALL LDMOTN     ;ADD MOTION TO MOTION BUFFER (EMOTN?)
2011 3A1798                      LDA GXFLAG
2014 F601                        ORI 1           ;SET FLAG BIT 0 (NEXT SURFACE) TO "1"
2016 E6FD                        ANI 0FDH        ;SET FLAG BIT 1 (INITIAL PASS) TO "0"
2018 321798                      STA GXFLAG
201B CD4A20                      CALL DRAW       ;DRAW NEXT SURFACE
201E CD3C25                      CALL CLMOTN     ;CLEAR MOTION BUFFER
2021 2A0698                      LHLD GXORPT     ;GET ORIGIN POINTER
2024 23                          INX H
2025 3A1B98                      LDA MOTONX
2028 86                          ADD M           ;ADD MOTION TO ORIGIN "X"
2029 77                          MOV M.A
202A 23                          INX H
202B 3A1C98                      LDA MOTONY
```

```
202E 86               ADD M            ;ADD MOTION TO ORIGIN "Y"
202F 77               MOV M.A
2030 23               INX H
2031 3A1D98           LDA MOTONZ
2034 86               ADD M            ;ADD MOTION TO ORIGIN "Z"
2035 77               MOV M.A
2036 3E00             MVI A.0
2038 321B98           STA MOTONX       ;CLEAR MOTION VALUE
203B 321C98           STA MOTONY
203E 321D98           STA MOTONZ
2041 CDCD10           CALL EICJ        ;PATCH FOR NEXT ROUTINE CALL
2044 CD0224           CALL CURHM       ;HOME DISPLAY CURSOR
2047 C30020           JMP GEOMPR       ;LOOP FOR NEXT MOTION COMMAND
               ;
               ;               DRAW SURFACE SUBROUTINE
               ;
204A 11C099    DRAW   LXI D.DBICON     ;GET ORIGIN BASE ADDRESS
204D 2600             MVI H.0
204F 3A1898           LDA GXORIG       ;GET ORIGIN NUMBER
2052 6F               MOV L.A
2053 29               DAD H            ;MULTIPLY ORIGIN NUMBER BY 8
2054 29               DAD H
2055 29               DAD H
2056 19               DAD D            ;ADD TO ORIGIN BASE ADDRESS
2057 220698           SHLD GXORPT      ;STORE ORIGIN POINTER
205A 6E               MOV L.M          ;GET OBJECT NUMBER
205B 2600             MVI H.0
205D 110099           LXI D.DBOBJK     ;GET OBJECT BASE ADDRESS
2060 29               DAD H            ;MULTIPLY OBJECT NUMBER BY 32
2061 29               DAD H
2062 29               DAD H
2063 29               DAD H
2064 29               DAD H
2065 19               DAD D            ;ADD TO OBJECT BASE ADDRESS
2066 220298           SHLD GXOBPT      ;STORE OBJECT POINTER
2069 220498           SHLD GXVEPT      ;STORE INITIAL VECTOR POINTER
206C 7E        DRAWLP MOV A.M
206D 321498           STA GSTART       ;STORE START VECTOR
2070 23               INX H
2071 7E               MOV A.M
2072 320E98           STA GEAXSX       ;STORE END "X"
2075 23               INX H
2076 7E               MOV A.M
2077 320F98           STA GEAXSY       ;STORE END "Y"
207A 23               INX H
207B 7E               MOV A.M          ;GET FLAG WORD FROM OBJECT MEMORY
207C E6C0             ANI 0C0H         ;MASK BIT 6 AND 7
207E 47               MOV B.A          ;SAVE IN REG B
207F 3A1798           LDA GXFLAG       ;GET BUFFER FLAG BYTE
2082 E63F             ANI 3FH          ;ZERO BITS 6 AND 7
2084 B0               ORA B            ;"OR" BIT 6 AND 7
2085 321798           STA GXFLAG       ;STORE IN BUFFER FLAG BYTE
2088 2A0298           LHLD GXOBPT      ;GET OBJECT POINTER
208B EB               XCHG             ;  AND STORE IN REG D.E
208C 2600             MVI H.0          ;CLEAR REG H
208E 3A1498           LDA GSTART       ;GET START VECTOR AND
```

```
2091 6F        MOV L.A        :  MOVE TO REG. L
2092 29        DAD H          :MULTIPLY START VECTOR BY 4
2093 29        DAD H
2094 19        DAD D          :ADD TO OBJECT POINTER
2095 220098    SHLD GTMPST    :TEMPORARILY STORE POINTER IN MEMORY
2098 23        INX H
2099 7E        MOV A.M
209A 320B98    STA GSAXSX     :STORE START "X"
209D 23        INX H
209E 7E        MOV A.M
209F 320C98    STA GSAXSY     :STORE START "Y"
20A2 2A0698    LHLD GXORPT    :GET ORIGIN POINTER
20A5 23        INX H
20A6 46        MOV B.M        :GET "X" ORIGIN
20A7 3A0898    LDA GMOTNX
20AA 80        ADD B          :ADD MOTION TO ORIGIN
20AB 47        MOV B.A
20AC 3A0B98    LDA GSAXSX     :GET START "X" OBJECT
20AF 80        ADD B          :ADD ORIGIN TO OBJECT
20B0 320B98    STA GSAXSX     :STORE SUM
20B3 23        INX H
20B4 46        MOV B.M        :GET "Y" ORIGIN
20B5 3A0998    LDA GMOTNY
20B8 80        ADD B          :ADD MOTION TO ORIGIN
20B9 47        MOV B.A
20BA 3A0C98    LDA GSAXSY     :GET START "Y" OBJECT
20BD 80        ADD B          :ADD ORIGIN TO OBJECT
20BE 320C98    STA GSAXSY     :STORE SUM
20C1 23        INX H
20C2 46        MOV B.M        :GET "Z" ORIGIN
20C3 3A0A98    LDA GMOTNZ
20C6 80        ADD B          :ADD MOTION TO ORIGIN
20C7 47        MOV B.A
20C8 3A0D98    LDA GSAXSZ     :GET START "Z" OBJECT
20CB 80        ADD B          :ADD ORIGIN TO OBJECT
20CC 320D98    STA GSAXSZ     :STORE SUM
20CF 23        INX H
20D0 7E        MOV A.M        :GET COLOR WORD
20D1 321598    STA GCOLOR     :STORE COLOR BYTE IN BUFFER
20D4 2A0698    LHLD GXORPT    :GET ORIGIN POINTER
20D7 23        INX H
20D8 46        MOV B.M        :GET "X" ORIGIN
20D9 3A0898    LDA GMOTNX
20DC 80        ADD B          :ADD MOTION TO ORIGIN
20DD 47        MOV B.A
20DE 3A0E98    LDA GEAXSX     :GET END "X" OBJECT
20E1 80        ADD B          :ADD ORIGIN TO OBJECT
20E2 320E98    STA GEAXSX     :STORE SUM
20E5 23        INX H
20E6 46        MOV B.M        :GET "Y" ORIGIN
20E7 3A0998    LDA GMOTNY
20EA 80        ADD B          :ADD MOTION TO ORIGIN
20EB 47        MOV B.A
20EC 3A0F98    LDA GEAXSY     :GET END "Y" OBJECT
20EF 80        ADD B          :ADD ORIGIN TO OBJECT
20F0 320F98    STA GEAXSY     :STORE SUM
```

```
20F3 23                 INX H
20F4 46                 MOV B,M         ;GET "Z" ORIGIN
20F5 3A0A98             LDA GMOTNZ
20F8 80                 ADD B           ;ADD MOTION TO ORIGIN
20F9 47                 MOV B,A
20FA 3A1098             LDA GEAXSZ      ;GET END "Z" ORIGIN
20FD 80                 ADD B           ;ADD ORIGIN TO OBJECT
20FE 321098             STA GEAXSZ      ;STORE SUM
2101 3A0B98             LDA GSAXSX      ;GET START "X"
2104 47                 MOV B,A
2105 3A0E98             LDA GEAXSX      ;GET END "X"
2108 90                 SUB B           ;SUBTRACT START FROM END
2109 321198             STA GDELTX      ;STORE DIFFERENCE
210C 3A0C98             LDA GSAXSY      ;GET START "Y"
210F 47                 MOV B,A
2110 3A0F98             LDA GEAXSY      ;GET END "Y"
2113 90                 SUB B           ;SUBTRACT START FROM END
2114 321298             STA GDELTY      ;STORE DIFFERENCE
2117 3A0D98             LDA GSAXSZ      ;GET START "Z"
211A 47                 MOV B,A
211B 3A1098             LDA GEAXSZ      ;GET END "Z"
211E 90                 SUB B           ;SUBTRACT START FROM END
211F 321398             STA GDELTZ      ;STORE DIFFERENCE
2122 3A1798             LDA GXFLAG      ;MOVE BUFFER FLAG BYTE TO
2125 321698             STA GSFLAG      ;  GEOMETRIC PROCESSOR FLAG BYTE
2128 CD0010             CALL EGEN       ;DRAW VECTOR
212B 3A1798             LDA GXFLAG
212E E640               ANI 40H         ;TEST FOR LAST VECTOR
2130 C24021             JNZ DRDONE      ;EXIT IF DONE
2133 2A0498             LHLD GXVEPT     ;IF NOT LAST VECTOR
2136 23                 INX H           ;  MOVE VECTOR POINTER TO NEXT
2137 23                 INX H           ;  VECTOR
2138 23                 INX H
2139 23                 INX H
213A 220498             SHLD GXVEPT
213D C36C20             JMP DRAWLP      ;LOOP FOR NEXT VECTOR
2140 C9         DRDONE  RET             ;LOOP FOR NEXT MOTION COMMAND
                ;
```

TABLES OF COMPUTER LISTINGS

EDGE PROCESSOR AND SMOOTHING PROCESSOR

CP/M MACRO ASSEM 2.0 #001 VIPER-X. GIL HYATT SYSTEM

```
                ;
                ;                                       CONFIDENTIAL
                ;                                       ------------
                ;                                       EXPERIMENTAL
                ;                                       ------------
                ;THIS IS THE DISPLAY EVALUATION PROGRAM FOR THE VIPER-X PROGRAM
                ;
                ;  FILE NAME: GIL.ASM
                ;
                ;          ORIGIN DATE: NOVEMBER 6,1981
                ;
                ;          REVISION DATE: MAY 19, 1983
                ;          REVISION TIME:    19:00
                ;
                ;
FFFF =          TRUE    EQU OFFFFH      ;DEFINE "TRUE"
0000 =          FALSE   EQU NOT TRUE    ;DEFINE "FALSE"
0000 =          JAMES   EQU FALSE       ;SET FOR GIL'S SYSTEM AND
                                        ;BARRY'S SYSTEM
6FC0 =          STKPT   EQU 6FC0H
7000 =          STMEM   EQU 7000H
0000 =          BOOT    EQU 0000H
0100 =          BEGIN   EQU 0100H
                        IF JAMES        ;ASSEMBLE FOR JAMES'S SYSTEM
                        TITLE           'VIPER-X.  JAMES CHAN SYSTEM'
                DSIZE   EQU 2043
                DPLINE  EQU 64
                        ELSE            ;ASSEMBLE FOR GIL'S SYSTEM AND
                                        ;BARRY'S SYSTEM
                        TITLE           'VIPER-X. GIL HYATT SYSTEM'
0BFF =          DSIZE   EQU 0BFFH
0040 =          DPLINE  EQU 0040H
                        ENDIF
6400 =          LOCSUB  EQU 6400H
1000 =          LOCBAR  EQU 1000H
2000 =          LOCGEN  EQU 2000H
3000 =          LOCGIL  EQU 3000H
1009 =          START   EQU 1009H
208B =          GSAXSX  EQU 208BH
208C =          GSAXSY  EQU 208CH
2091 =          GDELTX  EQU 2091H
2092 =          GDELTY  EQU 2092H
2096 =          GSFLAG  EQU 2096H
2095 =          GCOLOR  EQU 2095H
6421 =          PRINT   EQU 6421H
6403 =          FIFRD   EQU 6403H
6400 =          FIFWR   EQU 6400H
6430 =          LDMEM   EQU 6430H
6433 =          RDMEM   EQU 6433H
6406 =          RESTRT  EQU 6406H
1003 =          SUPMOT  EQU 1003H
6415 =          INITP   EQU 6415H
640C =          INTTY   EQU 640CH
6424 =          PRTCON  EQU 6424H
6FC1 =          SFWORD  EQU STKPT+1
6FC2 =          DSTART  EQU STKPT+2     ;16 BITS
```

```
CP/M MACRO ASSEM 2.0     #002     VIPER-X. GIL HYATT SYSTEM

 6FC4 =          STOREX  EQU STKPT+4
 6FC5 =          STOREY  EQU STKPT+5
 6CFF =          GEOSTK  EQU 6CFFH
 4000 =          SURFTB  EQU 4000H         ;SURFACE TABLE ORIGIN (TO 4200H)
 5000 =          GPFIF   EQU 5000H         ;MOVING EDGE ENDPOINT FIFO
 5400 =          PXLFIF  EQU 5400H         ;MOVING EDGE PIXEL FIFO
 000F =          IDMSK1  EQU 0FH           ;ID MASK FOR SURFACE MEMORY
 00F0 =          IDMSK2  EQU 0F0H
 6457 =          SURMEM  EQU 6457H
 100C =          START1  EQU 100CH
 6427 =          CRLF    EQU 6427H
 14E3 =          FINDPX  EQU 14E3H         ;EQUALITY STATEMENT WILL CHANGE WHEN
                                           ;RELINKING WITH BAR FILE
 65B7 =          PRNTO   EQU 65B7H
                 ;
 0100                   ORG BEGIN
                 ;
                 ;  ENTRY JUMP
                 ;
 0100 31C06F            LXI SP,STKPT
 0103 3E80              MVI A,80H          ;SET 1 ST. PASS FLAG TO "1"
 0105 32C16F            STA SFWORD         ; IN SYSTEM FLAG BITE
 0108 210200            LXI H,2            ;SET FIFO WRITE POINTERS
 010B 22FE4F            SHLD GPFIF-2
 010E 22FE53            SHLD PXLFIF-2
 0111 210000            LXI H,0            ;SET FIFO READ POINTERS AND
 0114 22FC4F            SHLD GPFIF-4
 0117 22FC53            SHLD PXLFIF-4
 011A 22FF6C            SHLD GEOSTK
 011D 21FF02            LXI H,2FFH         ;SET FIFO MODULO MASK (1K D)
 0120 22FA4F            SHLD GPFIF-6
 0123 21FF0F            LXI H,0FFFH        ;SET FIFO MODULO MASK (4K D)
 0126 22FA53            SHLD PXLFIF-6      ;MEMORY TO 6400H IS AVAILABLE
                 ;
 0129 C30910            JMP START          ;START IS THE BEGINING OF THE
                                           ;  INITIALIZATION ROUTINE
                 ;************************************************************
                 ;------------------------------------------------------------
                 ;  PLACE TEMPORARY PROGRAMS AND SYMBOL TABLES BELOW THIS LINE
                 ;------------------------------------------------------------
                 ;
                 ;
                 ;
                 ;
 012C 00         TEST    NOP
 012D C9         PASS    RET               ;TI. BREAKPOINT FOR LDMEM ROUTINE
                 ;
                 ;
                 ;       BUG TEST ROUTINE
                 ;
                 ;TEST   MVI A,6
                 ;       MVI B,38
                 ;       MVI C,14
                 ;       MVI D,0
                 ;       MOV E,A
                 ;       CALL LDMEM
```

```
CP/M MACRO ASSEM 2.0    #003    VIPER-X. GIL HYATT SYSTEM

                 ;       CALL FINDPX
                 ;       CALL CRLF
                 ;       JMP START1
                 ;
                 ;
012E CD3064      TLDMEM  CALL LDMEM      ;SINGLE STEP ROUTINE
0131 C9          TESTXX  RET
0132 F5                  PUSH PSW        ;TI,KEYBOARD ADVANCE AND T-KEY BKPT
0133 CD0C64              CALL INTTY      ;TI,TEST LOCKS UP ON KEYBOARD
0136 FE54                CPI 'T'         ;TI,CALL TO TEST IF T-KEY IS PRESSED
0138 CC2C01              CZ TEST         ;TI,PLACE A SID BREAKPOINT AT TEST
013B F1                  POP PSW         ;TI
013C CD4001              CALL COUNTN     ;TI,INCREMENT ITERATION COUNTER
013F C9                  RET
                 ;
0140 E5          COUNTN  PUSH H
0141 214F01              LXI H,COUNTL
0144 34                  INR M
0145 E1                  POP H
0146 C9                  RET
0147 E5          COUNTZ  PUSH H
0148 214F01              LXI H,COUNTL
014B 3600                MVI M,0
014D E1                  POP H
014E C9                  RET
014F 00          COUNTL  DB 0
                 ;
                 ;
                 ;--------------------------------------------------------------
                 ;         END OF TEMPORARY WORK AREA
                 ;--------------------------------------------------------------
                 ;
                 ;****************************************************************
                 ;
3000                     ORG LOCGIL
                 ;
                 ;       JUMP TABLE
                 ;
3000 C3B437      EGEN    JMP XEGEN
3003 C36638      EICJ    JMP XEICJ
                 ;
3080                     ORG LOCGIL+80H
                 ;
                 ;EDGE PIXEL GENERATION ROUTINE, RE-ENTRANT, REGISTERS NOT SAVED
                 ;
3080 3A5933      EGEN7C  LDA EGENF1      ;ENTER,RESTORE FLAG WORD 1
3083 4F                  MOV C,A
3084 3EEE                MVI A,0EEH      ;TI,PATH ID
3086 326033              STA EGENF2      ;TI
3089 79          EGENM   MOV A,C         ;CLEAR  OUTPUT FLAG
308A E6BF                ANI 0BFH
308C 4F                  MOV C,A
308D 3A5333              LDA EGENYS      ;BUFFER XS0,YS0
3090 326333              STA EGENY0
3093 3A5633              LDA EGENXS
3096 326233              STA EGENX0
```

```
CP/M MACRO ASSEM 2.0    #004    VIPER-X. GIL HYATT SYSTEM

3099 79                 MOV A,C         ;CHECK FOR STARTPOINT PIXEL IF
309A E620               ANI 20H
309C CAAC30             JZ EGENN
309F 79                 MOV A,C         ;SET FO-FLAG TO OUTPUT STARTPOINT PXL
30A0 F640               ORI 40H
30A2 4F                 MOV C,A
30A3 CD9931             CALL EGENDK1    ;INIT. EGENF4 (0-0-0-0--0-0-XNO-YNO)
30A6 325D33             STA EGENF4
30A9 C31532             JMP EGENAD      ;OUTPUT THE STARTPOINT PIXEL
30AC 79         EGENN   MOV A,C         ;UPDATE YS
30AD E604               ANI 04          ;       CHECK YD
30AF C2D130             JNZ EGENG
30B2 3A5E33             LDA EGENYR      ;       YS+DELTA Y=>YS
30B5 47                 MOV B,A
30B6 3A5533             LDA EGENYN
30B9 80                 ADD B
30BA 325E33             STA EGENYR
30BD F5                 PUSH PSW        ;SAVE CARRY FLAG
30BE 3A5B33             LDA EGENF7      ;CHECK YNS FOR SIGN
30C1 E620               ANI 20H
30C3 CAC830             JZ EGENFA
30C6 3EFF               MVI A,0FFH
30C8 47         EGENFA  MOV B,A         ;A=0'S OR 1'S FOR PLUS OR MINUS DELTA
30C9 F1                 POP PSW
30CA 3A5333             LDA EGENYS
30CD 88                 ADC B
30CE 325333             STA EGENYS
30D1 79         EGENG   MOV A,C         ;UPDATE XS
30D2 E608               ANI 08          ;       CHECK XD
30D4 C2F630             JNZ EGEND
30D7 3A5F33             LDA EGENXR      ;       XS+DELTA X=>XS
30DA 47                 MOV B,A
30DB 3A5833             LDA EGENXN
30DE 80                 ADD B
30DF 325F33             STA EGENXR
30E2 F5                 PUSH PSW        ;SAVE CARRY FLAG
30E3 3A5B33             LDA EGENF7      ;CHECK XNS FOR SIGN
30E6 E640               ANI 40H
30E8 CAED30             JZ EGENFB
30EB 3EFF               MVI A,0FFH
30ED 47         EGENFB  MOV B,A         ;A=0'S OR 1'S FOR PLUS OR MINUS DELTA
30EE F1                 POP PSW
30EF 3A5633             LDA EGENXS
30F2 88                 ADC B
30F3 325633             STA EGENXS
30F6 CD3E33     EGEND   CALL EGENDK     ;DETERMINE IF CHANGES OCCURRED
30F9 5F                 MOV E,A         ;PUT NEW LSBS,NSBS IN E
                                        ;0-0-0-0--X1L-X1N-Y1L-Y1N
30FA 3EAA               MVI A,0AAH      ;TI,PATH ID
30FC 326033             STA EGENF2      ;TI
30FF 3A5C33             LDA EGENF3
3102 AB                 XRA E           ;COMPARE WITH OLD LSBS
3103 E60F               ANI 0FH
3105 CA8930             JZ EGENM        ;LOOP BACK ON NO CHANGE
3108 6F         EGENDI  MOV L,A         ;PUT LSB,NSB CHANGES INTO L
3109 3EBB               MVI A,0BBH      ;TI,PATH ID
```

```
CP/M MACRO ASSEM 2.0      #005     VIPER-X. GIL HYATT SYSTEM

 310B 326033              STA EGENF2        :TI
 310E 3A5C33              LDA EGENF3        ;CHANGES EXIST.DETERMINE CHANGES.CLEAR
 3111 E630                ANI 30H           ;OLD PARAMETERS. LEAVE REMAINDERS
                                            ;0-0-XNR-YNR--0-0-0-0
 3113 B3                  ORA E             ;PACK NEW X1L-X1N-Y1L-Y1N
                                            ;0-0-XNR-YNR--X1L-X1N-Y1L-Y1N
 3114 47                  MOV B,A
 3115 7D                  MOV A,L           ;PACK DXN, DYN
 3116 E601                ANI 01            ;PROCESS DYN. CHECK Y1N CHANGE
 3118 CA1F31              JZ EGENDA
 311B 78                  MOV A,B           ;PACK DYN=1 INTO EGENF3
 311C F640                ORI 40H
 311E 47                  MOV B,A           ;0-DYN-XNR-YNR--X1L-X1N-Y1L-Y1N
 311F 7D        EGENDA    MOV A,L           ;PROCESS DXN
 3120 E604                ANI 04            ;CHECK X1N CHANGE
 3122 CA2931              JZ EGEND5
 3125 78                  MOV A,B           ;PACK DXN=1 INTO EGENF3
 3126 F680                ORI 80H
 3128 47                  MOV B,A           ;DXN-DYN-XNR-YNR--X1L-X1N-Y1L-Y1N
 3129 E5        EGEND5    PUSH H
 312A 217533              LXI H,EGENT6      ;FORM TABLE POINTER IN H
 312D 78                  MOV A,B           :DX-DY-XR-YR--XL-XN-YL-YN
 312E 0F                  RRC
 312F 0F                  RRC
 3130 0F                  RRC
 3131 0F                  RRC
 3132 E60F                ANI 0FH
 3134 5F                  MOV E,A           ;0-0-0-0--DX-DY-XR-YR
 3135 1600                MVI D,0
 3137 19                  DAD D
 3138 5E                  MOV E,M           ;ER-OUT-XR-YR--0-0-XS0-YS0
 3139 7B                  MOV A,E           ;CHECK FOR ERROR
 313A E680                ANI 80H
 313C C29F3A              JNZ ERROR1
 313F E1                  POP H
 3140 78                  MOV A,B           ;CLEAR OLD REMAINDERS
 3141 E6CF                ANI 0CFH
 3143 47                  MOV B,A
 3144 7B                  MOV A,E
 3145 E630                ANI 30H           ;PACK NEW REMAINDERS
 3147 B0                  ORA B
 3148 325C33              STA EGENF3        ;PRESERVE EGENF3 UPDATES
 314B 7B                  MOV A,E
 314C 326133              STA EGENK1        ;STORE SUBPIXEL TABLE OUTPUT WORD
 314F E640      EGEND5A   ANI 40H           ;CHECK PON-FLAG
                ;*        JZ EGENM          ;LOOP BACK IF ZERO
 3151 C25F31              JNZ EGENMA        ;TI
 3154 3ECC                MVI A,0CCH        ;TI
 3156 326033              STA EGENF2        ;TI
 3159 CD1334              CALL TEST1A       ;TI
 315C C38930              JMP EGENM         ;TI
 315F CD6531    EGENMA    CALL EGENDL
 3162 C37F31              JMP EGENDL1
                ;
 3165 7B        EGENDL    MOV A,E           ;SELECTIVELY LOAD OUTPUT BUFFER
                ;EGENX0,Y0 ;CHECK 'XS0 AND YS0'; 'XS0 OR
```

```
CP/M MACRO ASSEM 2.0     #006     VIPER-X. GIL HYATT SYSTEM

                        ;YSO': IMPLIES FON. 'NOT-XSO AND NOT-YSO' IMPLIES
                        ;'NOT-FON'; BASED UPON EGENT6 TABLE LOGIC
 3166 E603                       ANI 03            ;TO SUPPRESS RIGHT ANGLES FOR PIXEL
 3168 C8                         RZ                ;AND SUBPIXEL TRANSITIONS
 3169 E601                       ANI 01            ;CHECK YSO
 316B CA7431                     JZ EGENDM
 316E 3A5333                     LDA EGENYS        ;       UPDATE YSO BUFFER
 3171 326333                     STA EGENYO
 3174 7B                EGENDM   MOV A,E
 3175 E602                       ANI 02            ;CHECK XSO
 3177 C8                         RZ
 3178 3A5633                     LDA EGENXS        ;       UPDATE XSO BUFFER
 317B 326233                     STA EGENXO
 317E C9                         RET
                        ;
 317F CD9931            EGENDL1  CALL EGENDK1      ;PACK NEW TRANSITION NSBS
 3182 67                         MOV H,A           ;DETERMINE DELTA XO,DELTA YO
 3183 3A5D33                     LDA EGENF4
 3186 AC                         XRA H             ;PACK CHANGE CONDITIONS
 3187 0F                         RRC
 3188 0F                         RRC
 3189 E6C0                       ANI 0C0H
 318B B4                         ORA H
 318C 67                         MOV H,A
 318D 3A5D33                     LDA EGENF4
 3190 E63C                       ANI 3CH           ;CLEAR OLD XDO,YDO,XNO,YNO
 3192 B4                         ORA H
 3193 325D33                     STA EGENF4        ;XDO-YDO-0-0--FRU-FRD-XO-YO
 3196 C3A731                     JMP EGEND6
 3199 3A6333            EGENDK1  LDA EGENYO        ;PACK XO, YO
 319C E601                       ANI 01
 319E 67                         MOV H,A
 319F 3A6233                     LDA EGENXO
 31A2 17                         RAL
 31A3 E602                       ANI 02
 31A5 B4                         ORA H
 31A6 C9                         RET
 31A7 2600              EGEND6   [illegible]       ;UPDATE SMOOTHF WORD
 31A9 3A5D33                     LDA EGENF4        ;CHECK FOR Y SUBPIXEL CHANGE
 31AC E640                       ANI 40H
 31AE CAC831                     JZ EGENDN
 31B1 3A5D33                     LDA EGENF4        ;Y TRANSITION PRESENT, SET FY-FLAG
                        ;IF Y1N,0->1, SET FON-FLAG IF Y1N,1->0 FOR OUTPUT
                        ;AND DECREMENT Y-DTG IF (DYN AND Y1N BAR=1) (Y1N,1->0)
 31B4 E601                       ANI 01
 31B6 CABE31                     JZ EGENDE         ;CHECK Y CHANGE
 31B9 2601                       [illegible]       ;SUBPIXEL CHANGE; SET FY, DYN AND Y1N=1
 31BB C3C831                     JMP EGENDN        ;(Y1N, 0->1)
 31BE 79                EGENDE   MOV A,C           ;SET FO-FLAG, PIXEL RESOLUTION CHANGE
 31BF F640                       ORI 40H
 31C1 4F                         MOV C,A
 31C2 E5                         PUSH H            ;DECREMENT Y-DTG
 31C3 215433                     LXI H,EGENYD
 31C6 35                         DCR M
 31C7 E1                         POP H
 31C8 3A5D33            EGENDN   LDA EGENF4        ;CHECK FOR X SUBPIXEL CHANGE
```

```
CP/M MACRO ASSEM 2.0     #007     VIPER-X. GIL HYATT SYSTEM

31CB E680            ANI 80H
31CD CAEB31          JZ EGENDB
31D0 3A5D33          LDA EGENF4      ;X SUBPIXEL TRANSITION
                ;IF X1N,0->1,SET FON-FLAG IF X1N,1->0 FOR OUTPUT AND
                ;DECREMENT X-DTG IF (DXN AND X1N BAR)=1 (X1N,1->0)
31D3 E602            ANI 02          ;CHECK X CHANGE
31D5 CAE131          JZ EGENDF
31D8 7C              MOV A,H
31D9 F602            ORI 02          ;SET FX, DXN AND X1N=1 (X1N,0->1)
31DB 32EE35          STA SMOOTHF     ;PRESERVE SMOOTHF
31DE C3EB31          JMP EGENDB
31E1 79     EGENDF   MOV A,C         ;SET FO-FLAG
31E2 F640            ORI 40H
31E4 4F              MOV C,A
31E5 E5              PUSH H          ;DECREMENT Y-DTG
31E6 215733          LXI H,EGENXD
31E9 35              DCR M
31EA E1              POP H
31EB 3A5D33 EGENDB   LDA EGENF4      ;BUFFER OLD EGENF4 AND CLEAR FRU-FLAG
31EE 47              MOV B,A
31EF E6FB            ANI 0FBH
31F1 325D33          STA EGENF4
31F4 79              MOV A,C         ;TI.FOR PRINTOUT TEST INST ONLY
31F5 325933          STA EGENF1      ;TI
31F8 3A6133          LDA EGENK1      ;CHECK SUBPIXEL OUTPUT FLAG
31FB 5F              MOV E,A         ;RESTORES E REG TO SUBPIXEL TABLE
31FC E640            ANI 40H         ;OUTPUT FOR LOOP FROM EGENKD
31FE CA3033          JZ EGENDQ4      ;LOOP BACK ON NO OUTPUT
            ;
3201 3A5B33          LDA EGENF7
3204 E601            ANI 01          ;OUTPUT, CHECK FOR N-EDGE
3206 CA1532          JZ EGENAD
3209 CDD634          CALL SMOOTH1    ;EXECUTED AFTER 'CALL EGENDL' INST.
320C 79              MOV A,C         ;CHECK FOL, DON'T PACK SMOOTH1,2 IF
                                     ;A NEW PIXEL IS DETECTED
320D E640            ANI 40H
320F C21532          JNZ EGENAD
            ;
3212 CD1535          CALL SMOOTH2    ;PACK PRESENT & SUBS SUBPIXEL BITS
3215 3A5733 EGENAD   LDA EGENXD      ;CHECK X-DTG=0
3218 B7              ORA A           ;        SET FLAGS
3219 CA4232          JZ EGENAE
321C 3A5433 EGENAF   LDA EGENYD      ;CHECK Y-DTG=0
321F B7              ORA A           ;        SET FLAGS
3220 C27032          JNZ EGENKD
3223 79              MOV A,C         ;CHECK YD
3224 E604            ANI 04
3226 C27032          JNZ EGENKD
3229 79              MOV A,C
322A F604            ORI 04          ;SET YD=1
322C 4F              MOV C,A
322D 3A5B33          LDA EGENF7      ;SET DELTA X TO MAX (SEQ-1)
3230 E640            ANI 40H
3232 CA3A32          JZ EGENAH
3235 3E01            MVI A,01        ;SET DELTAX TO MAX NEGATIVE
                                     ;        (MSBS ARE ALREADY NEG)
```

```
CP/M MACRO ASSEM 2.0     #008     VIPER-X. GIL HYATT SYSTEM

 3237 C33C32             JMP EGENAK        ;RUNOUT TO ENDPOINT
 323A 3EFF      EGENAH   MVI A,0FFH        ;SET DELTA X TO MAX POSITIVE
 323C 325833    EGENAK   STA EGENXN
 323F C37032             JMP EGENKD
 3242 3A5433    EGENAE   LDA EGENYD        ;CHECK Y-DTG
 3245 B7                 ORA A             :        SET FLAGS
 3246 CA6832             JZ EGENAJ         ;IF ZERO, THEN END OF EDGE
 3249 79                 MOV A,C           ;CHECK XD
 324A E608               ANI 08
 324C C27032             JNZ EGENKD
 324F 79                 MOV A,C
 3250 F608               ORI 08            ;SET XD=1
 3252 4F                 MOV C,A
 3253 3A5B33             LDA EGENF7        ;SET DELTA Y TO MAX
 3256 E620               ANI 20H
 3258 CA6032             JZ EGENAI
 325B 3E01               MVI A,01          ;SET DELTA Y TO MAX NEGATIVE
 325D C36232             JMP EGENAL
 3260 3EFF      EGENAI   MVI A,0FFH        ;SET DELTA Y TO MAX POSITIVE
 3262 325533    EGENAL   STA EGENYN
 3265 C37032             JMP EGENKD
 3268 3A5B33    EGENAJ   LDA EGENF7        ;PACK FLAG,LAST PIXEL PER EDGE
 326B F680               ORI 80H           ;(SEQ-2)
 326D 325B33             STA EGENF7
 3270 79        EGENKD   MOV A,C
 3271 325933             STA EGENF1
 3274 E640               ANI 40H           ;CHECK FOL FLAG
 3276 CA3033             JZ EGEND04        ;LOOP IF PIXEL OUTPUT FLAG IS ZERO
 3279 3E11               MVI A,11H         ;TI
 327B 326033             STA EGENF2        ;TI
 327E 78                 MOV A,B           ;CHECK FOR FRU,XNO-BAR,YNO-BAR
 327F E607               ANI 07            ;THIS CAN'T BE A CLIPPED CORNER
 3281 EE04               XRI 04            ;CONDITION BECAUSE FOL FLAG IS SET
                                           ;CLEAR FRU
 3283 C28E32             JNZ EGENKWA
 3286 3A5B33             LDA EGENF7        ;CHECK LAST PIXEL PER EDGE
 3289 E680               ANI 80H           ;LOOP BACK TO SURPRESS DOUBLE PIXEL
 328B CA3033             JZ EGEND04
 328E 3A5D33    EGENKWA  LDA EGENF4        ;CHECK ROUNDOFF DOWN FLAG-FRD TO
 3291 E608               ANI 08            ;SURPRESS CLIPPED CORNER DOUBLE PIXEL
 3293 C2D932             JNZ EGENDK3
 3296 3A5D33             LDA EGENF4        ;CHECK FOR CLIPPED CORNER CONDITION
 3299 E6C0               ANI 0C0H          ;CHECK XDO-AND-YDO
 329B EEC0               XRI 0C0H
 329D C2D932             JNZ EGENDK3
 32A0 3A5D33             LDA EGENF4        ;XDO-AND-YDO=1
 32A3 67                 MOV H,A           ;CHECK XNO-XOR-YNO
 32A4 0F                 RRC
 32A5 AC                 XRA H
 32A6 E601               ANI 01
 32A8 CAD932             JZ EGENDK3
 32AB 3A5D33             LDA EGENF4        ;XNO-XOR-YNO=1
 32AE E602               ANI 02            ;CORNER IS CLIPPED
 32B0 3A5B33             LDA EGENF7        ;NO DOUBLE PIXEL CONDITION TO SURPRESS
 32B3 CAC932             JZ EGENDKB        ;CHECK XNO
 32B6 E640               ANI 40H           ;INC/DEC XO
```

CP/M MACRO ASSEM 2.0 #009 VIPER-X. GIL HYATT SYSTEM

```
32B8 3A6233           LDA EGENX0      ;CHECK X-VECTOR DIRECTION
32BB CAC232           JZ EGENDKC
32BE 3C               INR A           ;NEGATIVE X-VECTOR DIRECTION
32BF C3C332           JMP EGENDKD
32C2 3D       EGENDKC DCR A
32C3 326233   EGENDKD STA EGENX0
32C6 C3D932           JMP EGENDK3     ;XNO=1 -> YNO=0
32C9 E620     EGENDKB ANI 20H         ;XNO=0 -> YNO=1
32CB 3A6333           LDA EGENY0      ;INC/DEC Y0
32CE CAD532           JZ EGENDKE
32D1 3C               INR A           ;NEGATIVE X-VECTOR DIRECTION
32D2 C3D632           JMP EGENDKF
32D5 3D       EGENDKE DCR A
32D6 326333   EGENDKF STA EGENY0
32D9 3A6233   EGENDK3 LDA EGENX0      ;ROUNDOFF TO PIXEL RESOLUTION
32DC E601             ANI 01          ;CHECK XNO
32DE CAFC32           JZ EGENDK4
32E1 3A5D33           LDA EGENF4      ;PACK ROUNDOFF UP FLAG-FRU FOR
32E4 F604             ORI 04          ;SURPRESSION OF DOUBLE PIXELS
32E6 325D33           STA EGENF4
32E9 3A5B33           LDA EGENF7      ;ROUNDOFF X-COORDINATE
32EC E640             ANI 40H         ;CHECK X-VECTOR DIRECTION
32EE 3A6233           LDA EGENX0
32F1 CAF832           JZ EGENDK6
32F4 3D               DCR A           ;NEGATIVE X-VECTOR DIRECTION
32F5 C3F932           JMP EGENDK8
32F8 3C       EGENDK6 INR A           ;POSITIVE X-VECTOR DIRECTION
32F9 326233   EGENDK8 STA EGENX0
32FC 3A6333   EGENDK4 LDA EGENY0
32FF E601             ANI 01
3301 CA1F33           JZ EGENDK9
3304 3A5D33           LDA EGENF4      ;PACK ROUNDOFF UP FLAG-FRU FOR
3307 F604             ORI 04          ;SURPRESSION OF DOUBLE PIXELS
3309 325D33           STA EGENF4
330C 3A5B33           LDA EGENF7      ;ROUNDOFF Y-COORDINATE
330F E620             ANI 20H         ;CHECK VECTOR DIRECTION
3311 3A6333           LDA EGENY0
3314 CA1B33           JZ EGENDK7
3317 3D               DCR A           ;NEGATIVE Y-VECTOR DIRECTION
3318 C31C33           JMP EGENDK5
331B 3C       EGENDK7 INR A           ;POSITIVE Y-VECTOR DIRECTION
331C 326333   EGENDK5 STA EGENY0
331F 3EDD     EGENDK9 MVI A,0DDH      ;TI,PATH ID
3321 326033           STA EGENF2      ;TI
3324 CD2034           CALL TEST1C     ;TI
3327 3A5D33           LDA EGENF4      ;PACK ROUNDOFF DOWN FLAG-FRD FOR
332A F608             ORI 08          ;SURPRESSION OF DOUBLE PIXELS WITH
332C 325D33           STA EGENF4      ;CLIPPED CORNER CONDITION
332F C9               RET             ;REGISTERS HAVE NOT BEEN SAVED
              ;
3330 3A5D33   EGENDQ4 LDA EGENF4      ;CLEAR ROUNDOFF DOWN FLAG-FRD
3333 E6F7             ANI 0F7H
3335 325D33           STA EGENF4
3338 CD1334           CALL TEST1A     ;TI
333B C38930           JMP EGENM       ;LOOP BACK
              ;
```

```
CP/M MACRO ASSEM 2.0     #010     VIPER-X. GIL HYATT SYSTEM

 333E 3A5333    EGENDK   LDA EGENYS         ;PACK XL-XN-YL-YN INTO EGENF3
 3341 E603               ANI 03             ;         1(YL YN)
 3343 5F                 MOV E,A
 3344 3A5633             LDA EGENXS
 3347 17                 RAL
 3348 17                 RAL
 3349 E60C               ANI 0CH            ;         4(XL XN)
 334B B3                 ORA E              ;PACK TOGETHER IN A
 334C C9                 RET
                ;
                ;ECMFIF AND GPFIF OUTPUT BUFFER
 334D 00        IPOBXS   DB 0               ;XS
 334E 00        IPOBYS   DB 0               ;YS
 334F 00        IPOBDX   DB 0               ;DELTA X
 3350 00        IPOBDY   DB 0               ;DELTA Y
 3351 00        IPOBCF   DB 0               ;COLOR AND FLAG BYTE,LEAST SIG BYTE
 3352 00        IPOBF7   DB 0               ;MOST SIG BYTE
                ;
                ;INITIALIZATION BUFFER
 3353 00        EGENYS   DB 0               ;YS MSBS (HALF PIXEL RESOLUTION)
 3354 00        EGENYD   DB 0               ;Y DTG MSBS (ABS DELTA Y)
 3355 00        EGENYN   DB 0               ;DELTA YN (LSBS)
 3356 00        EGENXS   DB 0               ;XS MSBS (HALF PIXEL RESOLUTION)
 3357 00        EGENXD   DB 0               ;X DTG MSBS (ABS DELTA X)
 3358 00        EGENXN   DB 0               ;DELTA XN (LSBS)
 3359 00        EGENF1   DB 0               ;FLAG WORD,C-REGISTER
 335A 00        EGENCF   DB 0               ;FLAG WORD ,COLOR AND FLAGS
 335B 00        EGENF7   DB 0               ;FLAG WORD
 335C 00        EGENF3   DB 0               ;FLAG WORD
 335D 00        EGENF4   DB 0               ;XDO-YDO-0-0--FRD-FRU-XNO-YNO
 335E 00        EGENYR   DB 0               ;YS LSB'S (R-REGISTER)
 335F 00        EGENXR   DB 0               ;XS LSB'S (R-REGISTER)
 3360 00        EGENF2   DB 0               ;TEMPORARY FLAG BUFFER
 3361 00        EGENK1   DB 0               ;SUBPIXEL OUTPUT WORD
 3362 00        EGENXO   DB 0               ;OUTPUT X COORDINATE
 3363 00        EGENYO   DB 0               ;OUTPUT Y COORDINATE
 3364 00        EGENK4   DB 0               ;SPARE
 3365 00        EGENK5   DB 0               ;SPARE
 3366 00        EGENK6   DB 0               ;SPARE
                ;
                ;GENERAL BUFFERS
                ;
 3367 0000      OCMFIN   DW 0               ;FIFO POINTERS
 3369 0000      OCMFIP   DW 0
 336B 0000      OCMFFA   DW 0
                ;
 336D 00        OCMXS    DB 0               ;I/O PIXEL ADDRESS BUFFER
 336E 00        OCMYS    DB 0
                ;
 336F 00        PXLXS    DB 0               ;PIXEL BUFFER
 3370 00        PXLYS    DB 0
 3371 00        PXLF7    DB 0
 3372 00        PXLCF    DB 0
                ;
 3373 00        OPXL     DB 0               ;PROPER OUTSIDE PIXEL BUFFER
 3374 00        OPXL1    DB 0
```

```
CP/M MACRO ASSEM 2.0     #011     VIPER-X. GIL HYATT SYSTEM

                    ;
                    ;
                                                  ;EDGE PROCESSOR TABLE
 3375 0010208010EGENT6  DB 00H,10H,20H,80H,10H,50H,41H,80H
 337D 2042608043        DB 20H,42H,60H,80H,43H,52H,61H,80H
                    ;
                    ;
                    ;DELETE SECOND 'CALL PRINT' WITH S660A: 0 0 0
                    ;INCREASE PRINTOUT LENGTH WITH S661F 0B->1F
                    ;
                    ;FOR SUBPIXEL RESOLUTION PRINTOUT, DELETE TWO 'CALL EICACA'
                    ;INSTRUCTIONS
                    ;FOR PIXEL RESOLUTION, PUT 'RET' IN 'TEST1A'
 3385 3A6233        EGENTST LDA EGENXO      ;TI
                    ;*EGENTS1       CALL EICACA     ;RESCALE TO PIXEL RESOLUTION
 3388 D600                  SUI 00          ;TI,X-BIAS, HALF-PIXEL RESOLUTION
 338A C600                  ADI 00          ;TI
 338C 47                    MOV B,A         ;TI
 338D 326D33                STA OCMXS       ;TI
 3390 3A6333                LDA EGENYO      ;TI
                    ;*EGENTS2       CALL EICACA     ;RESCALE TO PIXEL RESOLUTION
 3393 D600                  SUI 00          ;TI,Y-BIAS, HALF-PIXEL RESOLUTION
 3395 C600                  ADI 00          ;TI
 3397 4F                    MOV C,A         ;TI
 3398 326E33                STA OCMYS       ;TI
 339B C9                    RET             ;TI
                    ;
 339C CDB03B        SMTESTK CALL OCOUT4     ;NUMBER THE EDGE HALF PIXEL
 339F 3AAC33                LDA SMTESTN
 33A2 CDCC34                CALL SMTEST1
 33A5 3AAC33                LDA SMTESTN
 33A8 CDC834                CALL SMTEST2
 33AB C9                    RET
                    ;
 33AC 00            SMTESTN DB 0
 33AD 00            SMTESTY DB 0
                    ;
 33AE 3E0D          SMTESTL MVI A,0DH       ;CARRIAGE RETURN
 33B0 CDB765                CALL PRNTO
 33B3 3E50                  MVI A,'P'       ;PRINT HEADER
 33B5 CDBB33                CALL P1
 33B8 C3C533                JMP P3
                    ;
 33BB CDB765        P1      CALL PRNTO      ;PRINT CHARACTER
 33BE C9                    RET
                    ;
 33BF 3E20          P2      MVI A,20H       ;PRINT SPACE
 33C1 CDB765                CALL PRNTO
 33C4 C9                    RET
                    ;
 33C5 3E58          P3      MVI A,'X'
 33C7 CDBB33                CALL P1
 33CA CDBF33                CALL P2         ;SPACE
 33CD 3E58                  MVI A,'X'
 33CF CDBB33                CALL P1
 33D2 3E4F                  MVI A,'O'
```

```
CP/M MACRO ASSEM 2.0      #012    VIPER-X. GIL HYATT SYSTEM

 33D4 CDBB33            CALL P1
 33D7 CDBF33            CALL P2
 33DA 3E59              MVI A,'Y'
 33DC CDBB33            CALL P1
                  ;ADD ADDITIONAL INFORMATION
 33DF 3E0D              MVI A,0DH         ;PRINT A CARRIAGE RETURN
 33E1 CDB765            CALL PRNTO
 33E4 CD2164            CALL PRINT        }
 33E7 C30001      SMTESTM JMP BEGIN
                  ;
 33EA 0600        SMTEST3 MVI B,00        ;INITIALIZE X
 33EC 3AAD33            LDA SMTESTY
 33EF 4F                MOV C,A           ;INITIALIZE Y
 33F0 3C                INR A
 33F1 32AD33            STA SMTESTY
 33F4 3AAC33            LDA SMTESTN       ;PRINT SUBPIXEL NUMBER
 33F7 CDA234            CALL SMTESTD      ;DISPLAY MSH
 33FA 04                INR B
 33FB 3AAC33            LDA SMTESTN
 33FE CDA634            CALL SMTESTE      ;DISPLAY LSH
 3401 04                INR B
 3402 AF                XRA A             ;SPACE
 3403 CDA634            CALL SMTESTE
 3406 04                INR B
 3407 216233            LXI H,EGENXO      ;DISPLAY EGENXO TABLE
 340A 3E02              MVI A,02
 340C 327333            STA OPXL
 340F CDAD34            CALL SMTEST7
 3412 C9                RET
                  ;
 3413 3A5B33      TEST1A  LDA EGENF7      ;CHECK FOR N-EDGE
 3416 E601              ANI 01
 3418 C8                RZ
 3419 CD2D34            CALL TEST1K
 341C CD3834      TEST1B  CALL ETSTSPG    ;ETSTSPG, ETSTPG, ETSTSPT, ETSTST
 341F C9                RET
                  ;
 3420 3A5B33      TEST1C  LDA EGENF7      ;CHECK FOR N-EDGE
 3423 E601              ANI 01
 3425 C8                RZ
 3426 CD2D34            CALL TEST1K
 3429 CD4634      TEST1D  CALL ETSTPG
 342C C9                RET
                  ;
 342D CD8D3C      TEST1K  CALL OCMSUR2    ;SETUP HEX SURFACE MEMORY
 3430 3AAC33            LDA SMTESTN       ;INCREMENT SUBPIXEL COUNTER
 3433 3C                INR A
 3434 32AC33            STA SMTESTN
 3437 C9                RET
                  ;
 3438 C5          ETSTSPG PUSH B          ;DISPLAY SUBPIXEL GRAPHICS
 3439 CD8533            CALL EGENTST      ;LOAD DISPLAY BUFFER WITH
 343C 1E05              MVI E,05          ;SUBPIXEL COORDINATES
 343E CD2E01            CALL TLDMEM       ;DISPLAY A '5'
 3441 CD9C33            CALL SMTESTK
 3444 C1                POP B
```

```
CP/M MACRO ASSEM 2.0     #013    VIPER-X. GIL HYATT SYSTEM

 3445 C9                 RET
                 ;
 3446 C5         ETSTPG  PUSH B           ;DISPLAY PIXEL GRAPHICS
 3447 CD8533             CALL EGENTST     ;LOAD DISPLAY BUFFER WITH
 344A 1E01               MVI E,01         ;SUBPIXEL COORDINATES
 344C CD2E01             CALL TLDMEM      ;DISPLAY A '1'
 344F CD9C33             CALL SMTESTK
 3452 C1                 POP B
 3453 C9                 RET
                 ;
 3454 3E1F       ETSTES  MVI A,1FH        ;ENLARGE SCREEN PRINTOUT
                 ;*      STA 661F
 3456 C9                 RET
                 ;
 3457 3E0B       ETSTRS  MVI A,0BH        ;REDUCE SCREEN PRINTOUT
                 ;*      STA 661F
 3459 C9                 RET
                 ;
 345A 3AAC33     ETSTSPT LDA SMTESTN      ;DISPLAY EDGE TABLE
 345D FE00       ETST1   CPI 00H          ;START PRINTOUT OF THE PIXEL
 345F D8                 RC               ;(00 OR 37H) RETURN IF TOO EARLY
 3460 3AAC33             LDA SMTESTN
 3463 FE3C       ETST2   CPI 3CH          ;STOP PRINTOUT AT THIS PIXEL
 3465 D0                 RNC              ;(60D GREATER THAN START, 30H OR 40H)
 3466 C5                 PUSH B
 3467 D5                 PUSH D
 3468 E5                 PUSH H
 3469 CDEA33             CALL SMTEST3     ;DISPLAY SUBPIXEL NUMBER AND COORD
 346C 215333             LXI H,EGENYS     ;SETUP EDGE TABLE
 346F 3E0F               MVI A,15
 3471 327333             STA DPXL
 3474 CDAD34             CALL SMTEST7
 3477 E1                 POP H
 3478 D1                 POP D
 3479 C1                 POP B
 347A C9                 RET
                 ;
 347B 3AAC33     ETSTST  LDA SMTESTN      ;DISPLAY SMOOTHING TABLE
 347E FE00       ETST3   CPI 00H          ;START PRINTOUT OF THE PIXEL
 3480 D8                 RC               ;(00 OR 35H), RETURN IF TOO EARLY
 3481 3AAC33             LDA SMTESTN
 3484 FE3C       ETST4   CPI 3CH          ;STOP PRINTOUT AT THIS PIXEL
 3486 D0                 RNC              ;(60D GREATER THAN START, 34H OR 70H)
 3487 C5                 PUSH B
 3488 D5                 PUSH D
 3489 E5                 PUSH H
 348A CDEA33             CALL SMTEST3     ;DISPLAY SUBPIXEL NUMBER AND COORD
 348D 21E935             LXI H,SMOOTHA    ;SETUP SMOOTHING TABLE
 3490 3E0A               MVI A,10
 3492 327333             STA DPXL
 3495 CDAD34             CALL SMTEST7
 3498 3AE639             LDA PXLBO
 349B CDA634             CALL SMTESTE
 349E E1                 POP H
 349F D1                 POP D
 34A0 C1                 POP B
```

```
CP/M MACRO ASSEM 2.0    #014    VIPER-X. GIL HYATT SYSTEM

 34A1 C9                    RET
                    ;
                    ;
 34A2 0F            SMTESTD RRC
 34A3 0F                    RRC
 34A4 0F                    RRC
 34A5 0F                    RRC
 34A6 E60F          SMTESTE ANI 0FH
 34A8 5F                    MOV E,A
 34A9 CD2E01                CALL TLDMEM
 34AC C9                    RET
                    ;
 34AD 7E            SMTEST7 MOV A,M         ;DISPLAY TABLE
 34AE CDA234                CALL SMTESTD
 34B1 04                    INR B
 34B2 7E                    MOV A,M
 34B3 CDA634                CALL SMTESTE
 34B6 04                    INR B
 34B7 AF                    XRA A
 34B8 CDA634                CALL SMTESTE
 34BB 04                    INR B
 34BC 23                    INX H
 34BD 3A7333                LDA OPXL
 34C0 3D                    DCR A
 34C1 327333                STA OPXL
 34C4 C2AD34                JNZ SMTEST7
 34C7 C9                    RET
                    ;
 34C8 0F            SMTEST2 RRC
 34C9 0F                    RRC
 34CA 0F                    RRC
 34CB 0F                    RRC
 34CC E60F          SMTEST1 ANI 0FH
 34CE 5F                    MOV E,A
 34CF CD2E01                CALL TLDMEM
 34D2 CDB03B                CALL OCOUT4
 34D5 C9                    RET
                    ;
                    ;
                    ;SMOOTHING PROCESSOR
                    ;-------------------
                    ;UPDATE SMOOTHING BUFFER AND  PACK SUB-PIXEL CONDITIONS FOR
                    ;PRESENT AND SUBSEQUENT PIXELS
                    ;
                    ;CONSTRUCT ADDRESS POINTER FOR SMOOTH3 TABLE
 34D6 3A5B33        SMOOTH1 LDA EGENF7      ;CHECK FOR N-EDGE
 34D9 E601                  ANI 01
 34DB C8                    RZ
 34DC 3A5D33                LDA EGENF4      ;CHECK FOR CENTER COORD. F8
 34DF E603                  ANI 03          ;(F8)-->XN0=YN0=0
 34E1 C8                    RZ              ;RETURN IF CENTER COORD. (F8)
 34E2 3A5B33                LDA EGENF7      ;PACK ADDRESS POINTER
                    ;XNS-YNS-X1N-FXY OR XNS-YNS-FX-FY FOR SMOOTH3 TABLE
 34E5 0F                    RRC             ;PACK XNS & YNS
 34E6 0F                    RRC
 34E7 0F                    RRC
```

```
CP/M MACRO ASSEM 2.0     #015    VIPER-X. GIL HYATT SYSTEM

 34E8 E60C                ANI 0CH
 34EA 57                  MOV D,A
 34EB 3AEE35    SMOTHE    LDA SMOOTHF
 34EE 67                  MOV H,A
 34EF 3A5D33    SMOTH1    LDA EGENF4          ;CHECK IF CORNER OR MIDPT COORD.
 34F2 E603                ANI 03              ;CHECK FOR XNO = YNO = 1
 34F4 EE03                XRI 03
 34F6 7C                  MOV A,H
 34F7 C20035              JNZ SMOTHA
 34FA E603                ANI 03              ;CORNER COORD.,XNO=YNO=1
 34FC B2                  ORA D               ;PACK SMOOTH3=0-0-0-0--XNS-YNS-FX-FY
 34FD C31135              JMP SMOTHB
 3500 E603      SMOTHA    ANI 03              ;MIDPT. COORD.,X1N XOR Y1N=1
 3502 7A                  MOV A,D             ;PACK SMOOTH3=0-0-0-1--XNS-YNS-XNO-FXY
 3503 CA0835              JZ SMOTHC
 3506 F601                ORI 01              ;PACK FXY
 3508 F610      SMOTHC    ORI 10H             ;PACK ONE BIT
 350A 57                  MOV D,A
 350B 3A5D33              LDA EGENF4          ;PACK INITIAL XNO, OUTPUT BUFFER ALREAD
 350E E602                ANI 02              ;UPDATED IN EGENDL
 3510 B2                  ORA D
 3511 32ED35    SMOTHB    STA SMOOTHE         ;STORE ADDRESS POINTER
 3514 C9                  RET
                ;
                ;SMOOTH3 TABLE LOOKUP
 3515 3A5B33    SMOOTH2 LDA EGENF7            ;CHECK FOR N-EDGE
 3518 E601                ANI 01
 351A C8                  RZ
 351B 3AEE35              LDA [illegible]     ;CHECK FOR CENTER COORD.(F8)
 351E E610                ANI [illegible]     ;XNO=YNO=0?
 3520 CA2935              JZ SMOTHD
 3523 3E01                MVI A,01            ;CENTER COORD.PRESENT, SET F8 BIT
 3525 32EA35              STA SMOOTHB         ;PRESENT SUBPIXEL LS-BYTE.SUBS.
                ;SUBPIXEL MS-BYTE, & LS-BYTE ARE PROPERLY ZERO SET
 3528 C9                  RET
 3529 3AED35    SMOTHD    LDA SMOOTHE         ;ADDRESS POINTER FOR TABLE LOOKUP
 352C 07                  RLC                 ;CHANGE BYTE ADDRESS TO WORD ADDRESS
 352D E63E                ANI 3EH
 352F 5F                  MOV E,A
 3530 1600                MVI D,0             ;ZERO-SET D REGISTER
 3532 21F435              LXI H,SMOOTH3       ;BASE ADDRESS OF SUB-PXL COND. TABLE
 3535 19                  DAD D
 3536 5E                  MOV E,M             ;PACK LSB PRESENT SUBPIXEL CONDITION
 3537 3AE935              LDA SMOOTHA
 353A B3                  ORA E
 353B 32E935              STA SMOOTHA
 353E 23                  INX H
 353F 7E                  MOV A,M             ;LOAD LSH CONDITION OF SUBSEQ.SUBPIXEL,
 3540 32EB35              STA SMOOTHC         ;ONLY ONE SUBPIXEL CONDITION IS
 3543 C9                  RET                 ;PERMITTED IN SUBSEQ. SUBPIXEL WORD
                ;
                ;TABLE LOOKUP FOR WEIGHT AND SETUP FOR ANOTHER PIXEL
 3544 3A5B33    SMOOTH5 LDA EGENF7            ;CHECK FOR N-EDGE
 3547 E601                ANI 01
 3549 C8                  RZ
                                              ;TABLE LOOKUP FOR PIXEL WEIGHT
```

```
CP/M MACRO ASSEM 2.0     #016     VIPER-X. GIL HYATT SYSTEM

354A 213436              LXI H,SMOOTHL    ;ADDRESS OF EDGE PIXEL WEIGHT TABLE
354D CD5335              CALL SMOOTH4     ;TABLE LOOKUP OF WEIGHT,PROPERLY MASKED
3550 C37535              JMP TEST15
                 ;
                 ;
                 ;TABLE LOOKUP FOR SMOOTHING WEIGHT, PROPERLY MASKED
3553 3AEA35      SMOOTH4 LDA SMOOTHB      ;MSH
3556 0F                  RRC              ;PACK INTO ONE BYTE (A0=>CY)
3557 3AE935              LDA SMOOTHA      ;LSH, SHAVE OFF LSB
355A 1F                  RAR              ;DOUBLE PRECISION SHIFT (CY=>A7)
355B 5F                  MOV E,A
355C 1600                MVI D,0
355E 19                  DAD D
355F 5E                  MOV E,M          ;ACCESS PACKED DOUBLE WEIGHT BYTE
3560 3AE935              LDA SMOOTHA      ;CHECK LSB FOR UNPACKING
3563 E601                ANI 01
3565 7B                  MOV A,E
3566 C26D35              JNZ SMOOTH6      ;SELECT MSH OR LSH
3569 0F                  RRC              ;UNPACK MSH FOR LSB =0
356A 0F                  RRC
356B 0F                  RRC
356C 0F                  RRC
356D E60F        SMOOTH6 ANI 0FH
356F 5F                  MOV E,A          ;PUT MASKED SMOOTHING WEIGHT IN E
3570 E60C                ANI 0CH
3572 EE0C                XRI 0CH
                 ;*      CZ ERROR1        ;ERROR IF A CODE IS DETECTED INSTEAD
                                          ;OF A WEIGHT
3574 C9                  RET
                 ;
                 ;
3575 00          TEST15  NOP              ;CONVERT FROM PLUS-WEIGHT TO INSIDE WT
                                          ;WEIGHT IS STORED IN E
3576 3A5B33              LDA EGENF7       ;CHECK FS
3579 57                  MOV D,A
357A E610                ANI 10H
357C CAC735              JZ SMOOTHM
357F 3AEA35              LDA SMOOTHB      ;COMPLEMENT XNS FOR P4,P10,P27,P64,P160,
3582 E601                ANI 01           ;AND P177
3584 C2BD35              JNZ SMOOTHS      ;CHECK MSH
3587 3AE935              LDA SMOOTHA
358A EE04                XRI 04
358C CAB735              JZ SMOOTHR
358F 3AE935              LDA SMOOTHA
3592 EE0A                XRI 10
3594 CAB735              JZ SMOOTHR
3597 3AE935              LDA SMOOTHA
359A EE1B                XRI 27
359C CAB735              JZ SMOOTHR
359F 3AE935              LDA SMOOTHA
35A2 EE40                XRI 64
35A4 CAB735              JZ SMOOTHR
35A7 3AE935              LDA SMOOTHA
35AA EEA0                XRI 160
35AC CAB735              JZ SMOOTHR
35AF 3AE935              LDA SMOOTHA
```

```
CP/M MACRO ASSEM 2.0      #017     VIPER-X. GIL HYATT SYSTEM

35B2 EEB1                   XRI 177
35B4 C2BD35                 JNZ SMOOTHS
35B7 3EFF         SMOOTHR MVI A,0FFH        ;COMPLEMENT XNS
35B9 AA                     XRA D
35BA C3BE35                 JMP SMOOTHT
35BD 7A           SMOOTHS MOV A,D           ;DON'T COMPLEMENT XNS
35BE E640         SMOOTHT ANI 40H           ;CHECK XNS
35C0 C2CD35                 JNZ SMOOTHP
35C3 7B                     MOV A,E         ;ACCESS PLUS-WEIGHT
35C4 C3D035                 JMP SMOOTHN     ;DONT COMPLEMENT PLUS-WEIGHT
35C7 E620         SMOOTHM ANI 20H           ;CHECK YNS
35C9 7B                     MOV A,E
35CA CAD035                 JZ SMOOTHN      ;DONT COMPLEMENT PLUS-WEIGHT
35CD 3E0B         SMOOTHP MVI A,11          ;COMPLEMENT PLUS-WEIGHT
35CF 93                     SUB E
35D0 E60F         SMOOTHN ANI 0FH           ;MASK AND STORE INSIDE WEIGHT
35D2 32E639                 STA PXLB0
35D5 3AEB35                 LDA SMOOTHC     ;TRANSFER SUBSEQUENT PIXEL CONDITIONS
35D8 32E935                 STA SMOOTHA     ;TO PRESENT PIXEL BUFFER
35DB AF                     XRA A           ;CLEAR SUBSEQUENT PIXEL BUFFER
35DC 32EC35                 STA SMOOTHD
35DF 32EB35                 STA SMOOTHC
35E2 32EA35                 STA SMOOTHB
35E5 CD1535                 CALL SMOOTH2    ;PACK FIRST SUBPIXEL CONDITION
35E8 C9                     RET             ;FOLLOWING SUBSEQUENT PIXEL CONDITION
                  ;
                                      ;SMOOTHING BUFFER
                                      ;PRESENT PIXEL CONDITIONS
                  ;SMOOTHA TO SMOOTHF ARE CLEARED ONCE PER EDGE IN EICAB
                  ;SMOOTHB TO SMOOTHD ARE CLEARED ONCE PER PIXEL IN SMOOTHS
35E9 00           SMOOTHA DB 00             ;LSB    F7-F6-F5-F4--F3-F2-F1-F0
35EA 00           SMOOTHB DB 00             ;MSB    0-0-0-0--0-0-0-F8
                                      ;SUBSEQUENT PIXEL CONDITIONS
35EB 00           SMOOTHC DB 00             ;LSB    F7-F6-F5-F4--F3-F2-F1-F0
35EC 00           SMOOTHD DB 00             ;T1,MSB ALWAYS ZEROS
                                      ;GENERAL CONDITIONS
35ED 00           SMOOTHE DB 00             ;ADDRESS POINTER
35EE 00           SMOOTHF DB 00             ;FLAG WORD 0-0-0-0--0-0-FX-FY
                                      ;
                                      ;FIRST PIXEL PER SURFACE CONDITIONS
35EF 00           SMOOTHG DB 00       ;LSH
35F0 00           SMOOTHH DB 00       ;MSH
                                      ;LAST PIXEL PER EDGE CONDITIONS
35F1 00           SMOOTHI DB 00       ;LSH
35F2 00           SMOOTHJ DB 00       ;MSH
                  ;
35F3 00           STEST1  DB 00       ;T1,BUFFER PXLB1
                  ;
                  ;SUB-PIXEL CONDITION TABLE, ONLY THE LSH OF THE PRESENT PIXEL
                  ;NEED BE STORED. THE MSHS AND THE LSH OF THE SUBSEQUENT ARE
                  ;DERIVED
35F4 4000014010SMOOTH3 DB 40H,00,01,40H,10H,40H,04,40H
35FC 0100400104         DB 01,00,40H,01,04,01,10H,01
3604 1000041040         DB 10H,00,04,10H,40H,10H,01,10H
360C 0400100401         DB 04,00,10H,04,01,04,40H,04
3614 2000022080         DB 20H,00,02,20H,80H,00,08,80H
```

```
CP/M MACRO ASSEM 2.0     #018     VIPER-X. GIL HYATT SYSTEM

 361C 0200200280          DB 02,00,20H,02,80H,00,08,80H
 3624 2000022008          DB 20H,00,02,20H,08,00,80H,08
 362C 0200200208          DB 02,00,20H,02,08,00,80H,08
                 ;
                                   ;SMOOTHING WEIGHT TABLE FOR AN EDGE
 3634 FBFB0FBBFFSMOOTHL   DB 0FBH,0FBH,0FH,0BBH,0FFH,19H,0FH,0FFH
 363C 0FFFFFFF0F          DB 0FH,0FFH,0FFH,0FFH,0FH,23H,0FH,0FFH
 3644 FFFFFFFF1F          DB 0FFH,0FFH,0FFH,0FFH,1FH,0FFH,2FH,0FFH
 364C 0FFFFFFFFF          DB 0FH,0FFH,0FFH,0FFH,0FFH,0FFH,0FFH,0FFH
 3654 0FFFFFFFFF          DB 0FH,0FFH,0FFH,0FFH,0FFH,0FFH,0FFH,0FFH
 365C FFFFFFFFFF          DB 0FFH,0FFH,0FFH,0FFH,0FFH,0FFH,0FFH,0FFH
 3664 0FFFFFFF2F          DB 0FH,0FFH,0FFH,0FFH,2FH,0FFH,3FH,0FFH
 366C 0FFFFFFFFF          DB 0FH,0FFH,0FFH,0FFH,0FFH,0FFH,0FFH,0FFH
 3674 FBAFFF9FFF          DB 0FBH,0AFH,0FFH,9FH,0FFH,0FFH,0FFH,0FFH
 367C FFFFFFFFFF          DB 0FFH,0FFH,0FFH,0FFH,0FFH,0FFH,0FFH,0FFH
 3684 A9FFFFFFFF          DB 0A9H,0FFH,0FFH,0FFH,0FFH,0FFH,0FFH,0FFH
 368C 28FFFFFFFF          DB 28H,0FFH,0FFH,0FFH,0FFH,0FFH,0FFH,0FFH
 3694 BB9FFF8FFF          DB 0BBH,9FH,0FFH,8FH,0FFH,0FFH,0FFH,0FFH
 369C FFFFFFFFFF          DB 0FFH,0FFH,0FFH,0FFH,0FFH,0FFH,0FFH,0FFH
 36A4 FFFFFFFFFF          DB 0FFH,0FFH,0FFH,0FFH,0FFH,0FFH,0FFH,0FFH
 36AC FFFFFFFFFF          DB 0FFH,0FFH,0FFH,0FFH,0FFH,0FFH,0FFH,0FFH
 36B4 FFFFFFFFF6          DB 0FFH,0FFH,0FFH,0FFH,0F6H,0FFH,0FFH,0FFH
 36BC F54FFFFFFF          DB 0F5H,4FH,0FFH,0FFH,0FFH,0FFH,0FFH,0FFH
                 ;
 36C4 F65F4FFFFF          DB 0F6H,5FH,4FH,0FFH,0FFH,0FFH,0FFH,0FFH
 36CC FFFFFFFFFF          DB 0FFH,0FFH,0FFH,0FFH,0FFH,0FFH,0FFH,0FFH
 36D4 FF6F5FFF4F          DB 0FFH,6FH,5FH,0FFH,4FH,0FFH,0FFH,0FFH
 36DC FFFFFFFFFF          DB 0FFH,0FFH,0FFH,0FFH,0FFH,0FFH,0FFH,0FFH
 36E4 FFFFFFFFFF          DB 0FFH,0FFH,0FFH,0FFH,0FFH,0FFH,0FFH,0FFH
 36EC FFFFFFFFFF          DB 0FFH,0FFH,0FFH,0FFH,0FFH,0FFH,0FFH,0FFH
 36F4 FFFF6FFF5F          DB 0FFH,0FFH,6FH,0FFH,5FH,0FFH,0FFH,0FFH
 36FC 4FFFFFFFFF          DB 4FH,0FFH,0FFH,0FFH,0FFH,0FFH,0FFH,0FFH
 3704 FFFFFFFFFF          DB 0FFH,0FFH,0FFH,0FFH,0FFH,0FFH,0FFH,0FFH
 370C FFFFFFFFFF          DB 0FFH,0FFH,0FFH,0FFH,0FFH,0FFH,0FFH,0FFH
 3714 FFFFFFFFFF          DB 0FFH,0FFH,0FFH,0FFH,0FFH,0FFH,0FFH,0FFH
 371C FFFFFFFFFF          DB 0FFH,0FFH,0FFH,0FFH,0FFH,0FFH,0FFH,0FFH
 3724 FFFFFFFFFF          DB 0FFH,0FFH,0FFH,0FFH,0FFH,0FFH,0FFH,0FFH
 372C FFFFFFFFFF          DB 0FFH,0FFH,0FFH,0FFH,0FFH,0FFH,0FFH,0FFH
                 ;
                                   ;SMOOTHING WEIGHT TABLE FOR A VERTEX
                 ;XSMOOTHV          DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
                 ;X        DB 0FFH,0FFH,0FFH,0FFH,0FFH,0FFH,0FFH,0FFH
```

```
CP/M MACRO ASSEM 2.0     #019    VIPER-X. GIL HYATT SYSTEM

 3734 FFF1F211F4SMOOTHV DB OFFH,OF1H,OF2H,11H,OF4H,23H,13H,12H
 373C F5452F3F15        DB OF5H,45H,2FH,3FH,15H,34H,1FH,2FH
 3744 F4554F5F2F        DB OF4H,55H,4FH,5FH,2FH,OFFH,3FH,OFFH
 374C 15553F4F2F        DB 15H,55H,3FH,4FH,2FH,OFFH,2FH,OFFH
 3754 F2435F5F4F        DB OF2H,43H,5FH,5FH,4FH,OFFH,5FH,OFFH
 375C 2FFFFFFF3F        DB 2FH,OFFH,OFFH,OFFH,3FH,OFFH,OFFH,OFFH
 3764 13545F5F3F        DB 13H,54H,5FH,5FH,3FH,OFFH,4FH,OFFH
 376C 1FFFFFFFFF        DB 1FH,OFFH,OFFH,OFFH,OFFH,OFFH,OFFH,OFFH
 3774 F121433F55        DB OF1H,21H,43H,3FH,55H,OFFH,54H,OFFH
 377C 45FFFFFF55        DB 45H,OFFH,OFFH,OFFH,55H,OFFH,OFFH,OFFH
 3784 23FFFFFFFF        DB 23H,OFFH,OFFH,OFFH,OFFH,OFFH,OFFH,OFFH
 378C 34FFFFFFFF        DB 34H,OFFH,OFFH,OFFH,OFFH,OFFH,OFFH,OFFH
 3794 11325F4F5F        DB 11H,32H,5FH,4FH,5FH,OFFH,5FH,OFFH
 379C 3FFFFFFF4F        DB 3FH,OFFH,OFFH,OFFH,4FH,OFFH,OFFH,OFFH
 37A4 22FFFFFFFF        DB 22H,OFFH,OFFH,OFFH,OFFH,OFFH,OFFH,OFFH
 37AC 2FFFFFFFFF        DB 2FH,OFFH,OFFH,OFFH,OFFH,OFFH,OFFH,OFFH
                   ;
                   ;
                   ;
                   ;
                   ;EDGE IC GENERATOR ROUTINE (RE-ENTRANT)
                   ;
 37B4 00           XEGEN    NOP              ;REGISTERS NOT SAVED
 37B5 3E02                  MVI A,2          ;TI
 37B7 32AD33                STA SMTESTY      ;TI
 37BA AF                    XRA A            ;TI
 37BB 32AC33                STA SMTESTN      ;TI
                   ;
                   ;LOAD GPFIF WITH POSTPROCESSED EDGE PARAMETERS
                   ;
                   ;REQUIRED INPUT SEQUENCE.CW FIRST EDGE TO LAST EDGE,
                   ;P-EDGES FIRST BEFORE N-EDGES
                   ;
                   ;INITIAL CONDITION GENERATION
 37BE 215333                LXI H,EGENYS     ;CLEAR EGEN TABLE
 37C1 CDF039                CALL SPCL18
 37C4 3A8B20                LDA GSAXSX       ;LOAD XS
 37C7 07                    RLC              ;SCALE FOR SUBPIXEL RESOLUTION
 37C8 325633                STA EGENXS
 37CB 3A8C20                LDA GSAXSY       ;LOAD YS
 37CE 07                    RLC              ;SCALE FOR SUBPIXEL RESOLUTION
                   ;*       MOV B,A          ;TI,TO CHANGE 4TH TO 1ST QUAD DISPLAY
                   ;*       XRA A            ;TI
                   ;*       SUB B            ;TI,COMPLEMENT YS
                   ;*       ADI 29           ;TI,BIAS OF 29 TO BOTTOM OF SCREEN
 37CF 325333                STA EGENYS
                   ;*       LDA GDELTY
                   ;*       MOV B,A          ;TI,COMPLEMENT DELTAYS
                   ;*       XRA A            ;TI
                   ;*       SUB B            ;TI
                   ;*       STA IPOBDY
 37D2 3A9520                LDA GCOLOR       ;GET COLOR WORD
 37D5 E60F                  ANI IDMSK1       ;       MASK LOWER  BITS
 37D7 325A33                STA EGENCF       ;(SEQ-0 TO SEQ-1)
 37DA 3A9620       EGEN1    LDA GSFLAG
```

```
CP/M MACRO ASSEM 2.0     #020     VIPER-X. GIL HYAIT SYSTEM

 37DD 47                   MOV B,A         ;REPACK LES-FLAG
 37DE E640                 ANI 40H
 37E0 78                   MOV A,B
 37E1 CAE637               JZ EIC2
 37E4 F608                 ORI 08
 37E6 E60F        EIC2     ANI 0FH
 37E8 325B33               STA EGENF7
 37EB 210000               LXI H,00        ;CALC: DX=>B,ABDX=>C,0=>H,L
 37EE 3A9120               LDA GDELTX
 37F1 47                   MOV B,A
 37F2 B7                   ORA A           ;        SET FLAGS
 37F3 F20038               JP  EGEN2
 37F6 3A5B33               LDA EGENF7      ;DX IS NEG, SET XNS
 37F9 F640                 ORI 40H         ;(SEQ-2 TO SEQ-3)
 37FB 325B33               STA EGENF7
 37FE AF                   XRA A           ;COMPLEMENT DX TO ABS. MAG.
 37FF 90                   SUB B
 3800 4F          EGEN2    MOV C,A
 3801 325733               STA EGENXD
 3804 3A9220               LDA GDELTY      ;CALC:DY=>D,ABDY=>E
 3807 57                   MOV D,A
 3808 B7                   ORA A           ;        SET FLAGS
 3809 F21638               JP  EGEN3
 380C 3A5B33               LDA EGENF7      ;DY IS NEG, SET YNS
 380F F620                 ORI 20H         ;(SEQ-3)
 3811 325B33               STA EGENF7
 3814 AF                   XRA A
 3815 92                   SUB D
 3816 5F          EGEN3    MOV E,A
 3817 325433               STA EGENYD
 381A 7B                   MOV A,E         ;NORMALIZE DX,DY
 381B B9                   CMP C           ;CALC: ABDY-ABDX=>FLAGS
 381C D22B38               JNC EGEN6       ;        JUMP IF ABDX <= ABDY
 381F 3A5B33               LDA EGENF7      ;ABDX>ABDY,SET FS IN F7
 3822 F610                 ORI 10H
 3824 325B33               STA EGENF7
 3827 79                   MOV A,C
 3828 C32C38               JMP EGENC
 382B 7B          EGEN6    MOV A,E         ;ABDY>ABDX, ABDY=ABDX
 382C 07          EGENC    RLC             ;NORMALIZE A,
                                           ;GREATER ABS DELTA IN A,COUNT IN H
 382D 07          EGEN5    RLC             ;A7 => CY
 382E 24                   INR H
 382F D22D38               JNC EGEN5       ;        LOOP ON NO CARRY
 3832 AF          EGEN7    XRA A           ;        NORMALIZED COUNT IN H
 3833 84                   ADD H
 3834 CA4538               JZ EGEN8
 3837 25                   DCR H           ;SHIFT DX,DY;DEC H
 3838 78                   MOV A,B
 3839 07                   RLC
 383A E6FE                 ANI 0FEH        ;SHIFT IN ZEROS IF POS OR IF NEG
 383C 47                   MOV B,A
 383D 7A                   MOV A,D
 383E 07                   RLC
 383F E6FE                 ANI 0FEH        ;SHIFT IN ZEROS IF POS OR IF NEG
 3841 57                   MOV D,A
```

```
CP/M MACRO ASSEM 2.0    #021    VIPER-X. GIL HYATT SYSTEM

3842 C33238             JMP EGEN7
3845 78         EGEN8   MOV A,B             ;NORMALIZATION COMPLETE
3846 325833             STA EGENXN          ;STORE IN INITIALIZATION BUFFER
3849 7A                 MOV A,D
384A 325533             STA EGENYN
384D CD3E33             CALL EGENDK         ;PACK EGENF3 CONDITIONS
3850 325C33             STA EGENF3          ;MSH=0, REMAINDERS=0
3853 3A5B33             LDA EGENF7          ;T1,DELETE P-EDGES FROM FIFO----------
3856 E601               ANI 01              ;TI-----------------------------------
3858 C8                 RZ                  ;T1-----------------------------------
3859 CDD53A             CALL EICF7          ;LOAD GPFIF FROM TABLE
385C 210050             LXI H,GPFIF
385F CDBE3A             CALL EICU
3862 C9                 RET
                ;
                ;NOW.LOAD TABLE FROM GPFIF FOR EDGE PIXEL GENERATION AND
                ;STORE EDGE PIXELS IN PXPFIF OR PXNFIF
                ;
                ;
                ;
3863 00         EICJ1   DB 00               ;PREVIOUS EDGE EGENF7
3864 00         EICJ2   DB 00               ;EGENF7 OF FIRST EDGE ON SURFACE
                ;
3865 00         OCMFIA  DB 00               ;OCCULTING FLAG WORD
                ;               B7  B6  B5  B4  B3  B2  B1  B0
                ;               VF  PVO VO  SVO     FPS FPE FVO
                ;
                ;
3866 00         XEICJ   NOP
3867 3A6538             LDA OCMFIA          ;T1,NORMALLY PERFORMED IN EICJ
386A F604               ORI 04              ;TI
386C 326538             STA OCMFIA          ;TI
                ;
386F 215333     EICAB   LXI H,EGENYS        ;CLEAR EGEN TABLE
3872 CDF039             CALL SPCL18
3875 21E935             LXI H,SMOOTHA       ;CLEAR SMOOTHING BUFFER
3878 CDF739             CALL SPCL6
387B CDD53A             CALL EICF7          ;ACCESS GPFIF
387E 210050             LXI H,GPFIF
3881 CDA63A             CALL EICD
                                            ;LOAD SEH TABLE
3884 21E039             LXI H,SEHO          ;CLEAR SEH TABLE
3887 CDF739             CALL SPCL6
388A 3A5A33             LDA EGENCF          ;MASK SV,EV-FLAGS
388D E630               ANI 30H
388F 47                 MOV B,A
3890 3A5B33             LDA EGENF7
3893 E607               ANI 07              ;MASK FLAGS
3895 F640               ORI 40H             ;PACK CONTROL FLAGS
3897 B0                 ORA B               ;PACK SV,EV-FLAGS
3898 32E039             STA SEHO
389B 3A5A33             LDA EGENCF
389E E60F               ANI OFH
38A0 5F                 MOV E,A
                ;*      CALL SURMEM         ;PENDING SURFACE MEMORY IMPLEMENTATION
                ;*      LHLD SURFMO
```

```
CP/M MACRO ASSEM 2.0     #022    VIPER-X. GIL HYATT SYSTEM

                  ;*        SHLD SEH2
                  ;*        LHLD SURFM1
                  ;*        MOV A,H
 38A1 7B                    MOV A,E        ;TI,THIS IS A TEMPORARY SUBSTITUTE FOR
 38A2 07                    RLC            ;TI.THE ABOVE SURFACE MEMORY PENDING
 38A3 07                    RLC            ;TI.IMPLEMENTATION
 38A4 E63C                  ANI 3CH        ;TI
 38A6 32E139                STA SEH1
 38A9 3A5B33                LDA EGENF7
 38AC E678                  ANI 78H
 38AE 32E539                STA SEH5
 38B1 CDF53A                CALL EICF9     ;LOAD SURFACE/EDGE HEADER INTO FIFO
 38B4 210054                LXI H.PXLFIF
 38B7 3E03                  MVI A.03
 38B9 CDBE3A                CALL EICU      ;LOAD PXLFIF WITH SEH TABLE
 38BC 3A5933                LDA EGENF1     ;SET IP-FLAG FOR STARTPOINT PIXEL.
 38BF F620                  ORI 20H        ;2 EDGE FLAGS/VERTEX PREVENTS
 38C1 325933                STA EGENF1     ;VERTEX STRIPE AND PERMITS POINTS
                                           ;AND OPEN SURFACES TO BE GENERATED
 38C4 3A6538                LDA OCMFIA     ;SET FPE-FLAG FOR STARTPOINT PIXEL
 38C7 F602                  ORI 02
 38C9 326538                STA OCMFIA
                  ;-------  MVI A.80H       ;ZERO REMAINDER IC, PRESENT SMOOTHING
                  ;-------  STA EGENYR      ;PROCESSOR REQUIRES ZERO NSBS
                  ;-------  STA EGENXR
 38CC CD8030      EICAC     CALL EGEN7C    ;GENERATE AN EDGE PIXEL
                                           ;LOAD PXLB TABLE
 38CF 21E639                LXI H,PXLBO    ;CLEAR PXLB TABLE
 38D2 CDF739                CALL SPCLA
 38D5 CD4435                CALL SMOOTHS   ;LOOKUP PIXEL WEIGHT(E-REG)

 38D8 3AE639                LDA PXLBO
 38DB F680                  ORI 80H        ;PACK PXLB ID BITS
 38DD 32E639                STA PXLBO
                  ;FOR P-EDGE. SMOOTHING WEIGHT WILL BE OVERWRITTEN BY THE
                  ;OUTSIDE SURFACE ID IN MODE-0. FOR N-EDGE. SMOOTHING
                  ;WEIGHT WILL BE PRESERVED.
 38E0 3A5B33                LDA EGENF7     ;PACK LPE-FLAG
 38E3 E680                  ANI 80H
 38E5 32E739                STA PXLR1
                                           ;VERTEX PIXEL SMOOTHING
 38E8 3A5933                LDA EGENF1     ;CHECK IP-FLAG
 38EB E620                  ANI 20H
 38ED CAFB38                JZ EICAC1A
 38F0 3A5933                LDA EGENF1     ;CLEAR IP-FLAG
 38F3 E6DF                  ANI 0DFH
 38F5 325933                STA EGENF1
 38F8 C33C39                JMP EICAC1
 38FB 3A6538      EICAC1A   LDA OCMFIA     ;CHECK FPE-FLAG
 38FE E602                  ANI 02
 3900 CA3C39                JZ EICAC1
 3903 3A6538                LDA OCMFIA     ;CLEAR FPE-FLAG
 3906 E6FD                  ANI 0FDH
 3908 326538                STA OCMFIA
 390B 3A5B33                LDA EGENF7     ;CHECK N-EDGE FLAG
 390E E601                  ANI 01
```

```
CP/M MACRO ASSEM 2.0      #023     VIPER-X. GIL HYATT SYSTEM

3910 CA3C39            JZ EICAC1
3913 3A6538            LDA OCMFIA        ;CHECK FPS-FLAG
3916 E604              ANI 04
3918 CA2C39            JZ SMOOTHW
391B 3A6538            LDA OCMFIA        ;CLEAR FPS-FLAG
391E E6FB              ANI OFBH
3920 326538            STA OCMFIA
                ;THIS IS THE FIRST IP PER SURFACE, SO BUFFER PIXEL SMOOTHING
                ;CONDITIONS FOR SUBSEQUENT PROCESSING AND EXIT
3923 2AE935            LHLD SMOOTHA      ;ACCESS FIRST PIXEL CONDITION BUFFER
3926 22EF35            SHLD SMOOTHG
3929 C33C39            JMP EICAC1
                ;THIS IS NOT THE FIRST IP PER SURFACE. SO CALCULATE VERTEX
                ;SMOOTHING
392C 2AE935     SMOOTHW LHLD SMOOTHA     ;INTERMEDIATE VERTEX, LOGICALLY 'OR'
392F 3AF135            LDA SMOOTHI       ;TOGETHER FIRST AND LAST (OVERLAPPING)
3932 B5                ORA L             ;SUBPIXEL CONDITIONS
3933 32E935            STA SMOOTHA
3936 3AF235            LDA SMOOTHJ
3939 CD9639            CALL SMOOTH7
393C 3A6233     EICAC1 LDA EGENXU        ;PROCESS PIXEL COORDINATES
393F CDB639            CALL EICACA       ;RESCALE TO PIXEL RESOLUTION
3942 32EA39            STA PXLB4
3945 3A6333            LDA EGENYO
3948 CDB639            CALL EICACA       ;RESCALE TO PIXEL RESOLUTION
394B 32EB39            STA PXLB5
394E 3AE739     EICAG  LDA PXLB1         ;CHECK FOR LAST PIXEL ON EDGE (SEQ-2)
3951 E680              ANI 80H
3953 C25C39            JNZ EICAC7
3956 CDC139            CALL EICAC2       ;LOAD PXLB TABLE INTO PXLFIF
3959 C3CC38            JMP EICAC         ;LOOP BACK FOR ANOTHER PIXEL
395C 3AE039     EICAC7 LDA SEHO          ;PROCESS LAST PIXEL ON EDGE
395F E601              ANI 01            ;CHECK FOR N-EDGE
3961 CA6A39            JZ EICAC4
3964 2AE935            LHLD SMOOTHA      ;LOAD ENDPOINT PIXEL CONDITIONS
3967 22F135            SHLD SMOOTHI
396A 3AE539     EICAC4 LDA SEH5          ;CHECK FOR LES-FLAG
396D E608              ANI 08
396F CA7A39            JZ EICAC5
3972 3AE039            LDA SEHO          ;CHECK FOR N-EDGE
3975 E601              ANI 01
3977 C28039            JNZ EICAC6
397A CDC139     EICAC5 CALL EICAC2       ;LOAD PXLB TABLE INTO PXLFIF
397D C36F38            JMP EICAB         ;LOOP BACK FOR ANOTHER EDGE
3980 2AE935     EICAC6 LHLD SMOOTHA      ;LAST VERTEX, LOGICALLY 'OR' TOGETHER
3983 3AEF35            LDA SMOOTHG       ;FIRST AND LAST (OVERLAPPING) SUBPIXEL
3986 B5                ORA L             ;CONDITIONS
3987 32E935            STA SMOOTHA
398A 3AF035            LDA SMOOTHH
398D CD9639            CALL SMOOTH7
3990 CDC139            CALL EICAC2       ;LOAD PXLB TABLE INTO PXLFIF
3993 C3CD39            JMP EICX
                ;
3996 B4         SMOOTH7 ORA H            ;SMOOTH VERTEX PIXEL
3997 32EA35            STA SMOOTHB       ;BUFFER IS IMPLICITLY CLEARED BY LOADING
399A E601              ANI 01            ;CHECK F8 SUBPIXEL CONDITION
```

```
CP/M MACRO ASSEM 2.0     #024     VIPER-X. GIL HYATT SYSTEM

                 ;*       CZ ERROR1         ;F8=0,PACK OFFH INSTEAD OF TABLE LOOKUP
                 ;HALF OF VERTEX TABLE (F8=0) ARE 'CAN'T HAPPEN' CONDITIONS
399C C2A639               JNZ EICAC8        ;TI, TO CIRCUMVENT ERROR DETECTOR
399F 3AFF00               LDA OFFH          ;TI
39A2 5F                   MOV E,A           ;TI
39A3 C3AC39               JMP EICAC9        ;TI
39A6 21B436      EICAC8   LXI H,SMOOTHV-80H;THIS IS THE ADDRESS OF VERTEX WEIGHT
                                            ;TABLE MINUS 256D
39A9 CD5335               CALL SMOOTH4      ;TABLE LOOKUP OF WEIGHT,PROPERLY MASKED
39AC 3AE639      EICAC9   LDA PXLB0         ;WEIGHT IS STORED IN E
39AF E6F0                 ANI 0F0H          ;PACK VERTEX WEIGHT, WHICH OVERWRITES
39B1 B3                   ORA E             ;LPE SMOOTHED COLOR
39B2 32E639               STA PXLB0
39B5 C9                   RET
                 ;
39B6 B7          EICACA   ORA A             ;RESCALE FOR PIXEL RESOLUTION
39B7 0F                   RRC
39B8 F2BE39               JP EICACB
39BB F680                 ORI 80H           ;NEGATIVE, PACK B7=1
39BD C9                   RET
39BE E67F        EICACB   ANI 7FH           ;POSITIVE, PACK B7=0
39C0 C9                   RET
                 ;
39C1 CDEB3A      EICAC2   CALL EICFA        ;LOAD PXLB TABLE START ADDRESS
39C4 210054               LXI H,PXLFIF
39C7 3E03                 MVI A,03          ;3-WORDS
39C9 CDBE3A               CALL EICU         ;LOAD PXLFIF WITH PXLB TABLE
39CC C9                   RET
                 ;
39CD 3A5B33      EICX     LDA EGENF7        ;TI
39D0 E601                 ANI 01            ;TI
39D2 C8                   RZ                ;TI
39D3 CD8D3C      EICX2    CALL OCMSUR2      ;TI
39D6 CD5434               CALL ETSTES       ;TI ENLARGE SCREEN PRINTOUT
39D9 CD2164               CALL PRINT        ;TI
39DC CD5734               CALL ETSTRS       ;TI REDUCE SCREEN PRINTOUT
39DF C9          EICX1    RET
                 ;
                 ;TABLES
                 ;------
                 ;SURFACE/EDGE HEADER TABLE
39E0 00          SEH0     DB 0
39E1 00          SEH1     DB 0
39E2 00          SEH2     DB 0
39E3 00          SEH3     DB 0
39E4 00          SEH4     DB 0
39E5 00          SEH5     DB 0
                 ;
                 ;PIXEL BLOCK TABLE
39E6 00          PXLB0    DB 0
39E7 00          PXLB1    DB 0
39E8 00          PXLB2    DB 0
39E9 00          PXLB3    DB 0
39EA 00          PXLB4    DB 0
39EB 00          PXLB5    DB 0
                 ;
```

CP/M MACRO ASSEM 2.0 #025 VIPER-X. GIL HYATT SYSTEM

```
                ;SUBROUTINES
                ;-----------
39EC CD2164     EPRINT  CALL PRINT      ;TI
39EF C9                 RET             ;TI
                ;
                ;CLEAR TABLES
39F0 AF         SPCL18  XRA A           ;CLEAR 18-BYTE TABLE
39F1 47                 MOV B,A
39F2 3E12               MVI A,18
39F4 C3FB39             JMP SPCL1
39F7 AF         SPCL6   XRA A           ;CLEAR 6-BYTE TABLE
39F8 47                 MOV B,A
39F9 3E06               MVI A,06
39FB 70         SPCL1   MOV M,B
39FC 3D                 DCR A
39FD 23                 INX H
39FE C2FB39             JNZ SPCL1
3A01 C9                 RET
                ;
                ;INC./DEC. C2C1C0
                ;
3A02 7A         OCMS    MOV A,D         ;CHECK FOR P1P0=0, CONSERVE C2C1C0
3A03 E603               ANI 03
3A05 C8                 RZ              ;DON'T DEC C2C1C0 IF P1P0=0
3A06 CD203A             CALL OCMS2      ;DEC. C2C1C0
3A09 C8                 RZ              ;DON'T DEC C2C1C0 IF ZERO
3A0A D610               SUI 10H
3A0C B5         OCMS4   ORA L
3A0D 57                 MOV D,A
3A0E C9                 RET
                ;
3A0F 7A         OCMS3   MOV A,D         ;CHECK FOR N1N0=0, CONSERVE C2C1C0
3A10 E60C               ANI 0CH
3A12 C8                 RZ              ;DON'T INC C2C1C0 IF N1N0=0
3A13 CD203A             CALL OCMS2      ;INC. C2C1C0
3A16 67                 MOV H,A
3A17 EE70               XRI 70H
3A19 C8                 RZ              ;DON'T INC C2C1C0 IF MAX
3A1A 7C                 MOV A,H
3A1B C610               ADI 10H
3A1D C30C3A             JMP OCMS4
                ;
3A20 7A         OCMS2   MOV A,D         ;INC./DEC. C2C1C0
3A21 E68F               ANI 8FH
3A23 6F                 MOV L,A
3A24 7A                 MOV A,D
3A25 E670               ANI 70H
3A27 C9                 RET
                ;
                ;INC./DEC. V1V0
                ;
3A28 7A         OCMV    MOV A,D         ;CHECK FOR P1P0=0, CONSERVE V1V0
3A29 E603               ANI 03
3A2B C8                 RZ              ;DON'T DEC V1V0 IF P1P0=0
3A2C CD463A             CALL OCMV2      ;DEC. V1V0
3A2F C8                 RZ              ;DON'T DEC V1V0 IF ZERO
```

```
CP/M MACRO ASSEM 2.0    #026    VIPER-X. GIL HYATT SYSTEM

 3A30 D640              SUI 40H
 3A32 B5        OCMV4   ORA L
 3A33 5F                MOV E,A
 3A34 C9                RET
                ;
 3A35 7A        OCMV3   MOV A,D         ;CHECK FOR N1NO=0, CONSERVE V1VO
 3A36 E60C              ANI 0CH
 3A38 C8                RZ              ;DON'T INC V1VO IF N1NO=0
 3A39 CD463A            CALL OCMV2      ;INC.V1VO
 3A3C 67                MOV H,A
 3A3D EEC0              XRI 0C0H
 3A3F C8                RZ              ;DON'T INC V1VO IF MAX
 3A40 7C                MOV A,H
 3A41 C640              ADI 40H
 3A43 C3323A            JMP OCMV4
                ;
 3A46 7B        OCMV2   MOV A,E         ;INC./DEC. V1VO
 3A47 E63F              ANI 3FH
 3A49 6F                MOV L,A
 3A4A 7B                MOV A,E
 3A4B E6C0              ANI 0C0H
 3A4D C9                RET
                ;
                ;FILL IP WITH SURFACE IN H
 3A4E 3AE139    OCMR5   LDA SEH1        ;MOVING SURFACE ID TO H (OVERWRITES H)
 3A51 0F                RRC
 3A52 0F                RRC
 3A53 E60F      OCMR2   ANI IDMSK1
 3A55 67                MOV H,A
 3A56 7B        OCMR1   MOV A,E         ;FILL IP WITH SURFACE IN H
 3A57 E6F0              ANI IDMSK2
 3A59 B4                ORA H
 3A5A 5F                MOV E,A
 3A5B C9                RET
                ;
 3A5C 3AEA39    OCMP    LDA PXLB4       ;INITIALIZE I/O PIXEL BUFFER
 3A5F 326D33            STA OCMXS
 3A62 3AEB39            LDA PXLB5
 3A65 326E33            STA OCMYS
 3A68 C9                RET
                ;
 3A69 00        OCMQ    NOP             ;EM, COMPARE RANGES OF EP/IP AND
 3A6A C9                RET             ;MOVING SURFACE
                ;
 3A6B 7A        OCMB    MOV A,D         ;LOAD REG DE INTO PXLB2,3
 3A6C 32E839            STA PXLB2
 3A6F 7B                MOV A,E
 3A70 32E939            STA PXLB3
 3A73 C9                RET
                ;
 3A74 3AE839    OCMD    LDA PXLB2       ;LOAD REG DE WITH PXLB2,3
 3A77 57                MOV D,A
 3A78 3AE939            LDA PXLB3
 3A7B 5F                MOV E,A
 3A7C 3AEA39            LDA PXLB4       ;LOAD REG BC WITH PXLB4,5
 3A7F 47                MOV B,A
```

```
CP/M MACRO ASSEM 2.0      #027     VIPER-X. GIL HYATT SYSTEM

 3A80 3AEB39            LDA PXLB5
 3A83 4F                MOV C,A
 3A84 C9                RET
                ;
 3A85 E5        OCMT    PUSH H          ;BUFFER PIXEL WORD
 3A86 216F33            LXI H,PXLXS
 3A89 70                MOV M,B
 3A8A 23                INX H
 3A8B 71                MOV M,C
 3A8C 23                INX H
 3A8D 72                MOV M,D
 3A8E 23                INX H
 3A8F 73                MOV M,E
 3A90 E1                POP H
 3A91 C9                RET
                ;
 3A92 E5        OCMU    PUSH H          ;FETCH BUFFERED PIXEL WORD
 3A93 216F33            LXI H,PXLXS
 3A96 46                MOV B,M
 3A97 23                INX H
 3A98 4E                MOV C,M
 3A99 23                INX H
 3A9A 56                MOV D,M
 3A9B 23                INX H
 3A9C 5E                MOV E,M
 3A9D E1                POP H
 3A9E C9                RET
                ;
 3A9F E1        ERROR1  POP H           ;ERROR ROUTINE. RETURN ADDRESS IN HL
                                        ;PUT BREAKPOINT AT ERROR2 AND MONITOR HL
 3AA0 226433            SHLD EGENK4     ;ALTERNATELY, MONITOR EGENK4
 3AA3 C30664    ERROR2  JMP RESTRT      ;WARM BOOT
                ;
                ;SUBROUTINE.LOAD A TABLE FROM FIFO, RE-ENTRANT,
                ;REGISTERS NOT SAVED
                ;
 3AA6 CD0364    EICD    CALL FIFRD      ;NUMBER OF WORDS ARE IN A.
 3AA9 DC9F3A            CC ERROR1
 3AAC 3D                DCR A
 3AAD E5                PUSH H
 3AAE 2A6433            LHLD EGENK4     ;FETCH TABLE START ADDRESS
 3AB1 71                MOV M,C
 3AB2 23                INX H
 3AB3 70                MOV M,B
 3AB4 23                INX H
 3AB5 226433            SHLD EGENK4
 3AB8 E1                POP H
 3AB9 B7                ORA A           ;TEST A FOR ZERO
 3ABA C2A63A            JNZ EICD        ;LOOP FOR NEXT WORD FROM FIFO
 3ABD C9                RET
                ;
                ;SUBROUTINE.LOAD A TABLE INTO FIFO. RE-ENTRANT,
                ;REGISTERS NOT SAVED.
                ;
 3ABE E5        EICU    PUSH H          ;FIFO ADDRESS IN H.L;NO.OF WORDS IN A,
 3ABF 2A6433            LHLD EGENK4     ;TABLE ADDRESSED IN EGEN4.5
```

```
CP/M MACRO ASSEM 2.0      #028     VIPER-X. GIL HYATT SYSTEM

3AC2 4E                  MOV C,M
3AC3 23                  INX H
3AC4 46                  MOV B,M
3AC5 23                  INX H
3AC6 226433              SHLD EGENK4
3AC9 E1                  POP H
3ACA CD0064              CALL FIFWR
3ACD DC9F3A              CC ERROR1
3AD0 3D                  DCR A
3AD1 C8                  RZ               ;TEST A FOR ZERO TO RETURN
3AD2 C3BE3A              JMP EICU         ;LOOP FOR NEXT WORD INTO FIFO
                ;
3AD5 216433     EICF7    LXI H,EGENK4     ;ADDRESS OF EGEN TABLE INTO EGENK4
3AD8 115333              LXI D,EGENYS
3ADB 73                  MOV M,E
3ADC 23                  INX H
3ADD 72                  MOV M,D
3ADE 3E05                MVI A,05         ;5-WORDS
3AE0 C9                  RET
                ;
3AE1 216433     EICF8    LXI H,EGENK4     ;ADDRESS OF IPOB TABLE INTO EGENK4
3AE4 114D33              LXI D,IPOBXS
3AE7 73                  MOV M,E
3AE8 23                  INX H
3AE9 72                  MOV M,D
3AEA C9                  RET
                ;
3AEB 216433     EICFA    LXI H,EGENK4     ;LOAD PXLB TABLE START ADDRESS
3AEE 11E639              LXI D,PXLBO
3AF1 73         EICFB    MOV M,E
3AF2 23                  INX H
3AF3 72                  MOV M,D
3AF4 C9                  RET
3AF5 216433     EICF9    LXI H,EGENK4     ;LOAD SEH TABLE START ADDRESS
3AF8 11E039              LXI D,SEHO
3AFB C3F13A              JMP EICFB
                ;
                ;FIND PROPER OUTSIDE PIXEL ID
3AFE CD5C3A     OCMA     CALL OCMP        ;INITIALIZE I/O PIXEL ADDRESS
3B01 CDBB3B              CALL OCOUT       ;ACCESS OUTSIDE PIXEL
3B04 7B                  MOV A,E          ;CHECK FOR VISIBLE EDGE FLAG
3B05 E6C0                ANI 0C0H
3B07 C0                  RNZ              ;A IS NON-ZERO
3B08 7B                  MOV A,E          ;BUFFER THIS PROPER OUTSIDE PIXEL
3B09 E60F                ANI IDMSK1
3B0B F680                ORI 80H          ;SET BUFFER FULL FLAG
3B0D 5F                  MOV E,A
3B0E 7A                  MOV A,D          ;PACK N-FLAG
3B0F E60C                ANI 0CH
3B11 7B                  MOV A,E
3B12 CA173B              JZ OCMA1
3B15 F640                ORI 40H
3B17 327333     OCMA1    STA OPXL
3B1A C9                  RET
                ;
3B1B CDE13A     OCME     CALL EICF8       ;SETUP IPOB TABLE
```

```
CP/M MACRO ASSEM 2.0     #029     VIPER-X. GIL HYATT SYSTEM

 3B1E 210054           LXI H,PXLFIF
 3B21 3E03     OCME2   MVI A,03
 3B23 CDA63A           CALL EICD        ;LOAD IPOB FROM FIFO
 3B26 C9               RET
               ;
 3B27 CDE13A   OCME1   CALL EICF8       ;SETUP IPOB TABLE
 3B2A 210054           LXI H,PXLFIF
 3B2D C3213B           JMP OCME2
               ;
 3B30 CDF53A   OCMEH1  CALL EICF9       ;SETUP SEH TABLE
 3B33 C3393B           JMP OCMEH2
 3B36 CDEB3A   OCMEH   CALL EICFA       ;SETUP PXLB TABLE
 3B39 210054   OCMEH2  LXI H,PXLFIF
 3B3C 3E03             MVI A,03
 3B3E CDA63A           CALL EICD        ;LOAD TABLE FROM FIFO
 3B41 C9               RET
               ;
 3B42 3AEA39   OCMF    LDA PXLB4        ;ACCESS EDGE PIXEL FROM PIXEL MEMORY
 3B45 47               MOV B,A
 3B46 3AEB39           LDA PXLB5
 3B49 4F               MOV C,A
 3B4A CD3364           CALL RDMEM
 3B4D C9               RET
               ;
               ;COMPARE OBJECT FOR EF AND EP/IF PIXELS
               ;*OCMF1 LHLD SURFMO       ;IF WAS LAST PIXEL ACCESSED,INTO SURFM-
               ;*       LDA SURFMO      ;T1, OBJECT ID IS IN SURFMO
               ;*       RLC             ;END AROUND SHIFT
               ;*       RLC
               ;*       RLC
               ;*       XRA L
               ;*       ANI 07          ;T1,ASSUME MASK FOR OBJECT COMPARISON
               ;*       RET             ;RESULTS OF COMPARISON IN A
               ;
               ;CHECK FOR A STREAK
 3B4E 3A6538   OCMK    LDA OCMFIA       ;CHECK VERTEX FLAG
 3B51 E680             ANI 80H
 3B53 3AE039           LDA SEHO
 3B56 CA5C3B           JZ OCMK1
 3B59 E620             ANI 20H          ;CHECK SV-FLAG
 3B5B C9               RET
 3B5C E610     OCMK1   ANI 10H          ;CHECK EV-FLAG
 3B5E C9               RET
               ;
 3B5F 3AE739   OCML    LDA PXLB1        ;EM,SMOOTHING EMULATED WITH S
 3B62 E607             ANI 07
 3B64 00               NOP              ;EM
 3B65 7B               MOV A,E
 3B66 E6F0             ANI IDMSK2
 3B68 F605             ORI 05           ;PACK AN S
 3B6A 5F               MOV E,A
 3B6B C9               RET
               ;
               ;RE-ENTRANT SUBROUTINE, COMPUTE UNIDIRESTIONAL (HORIZ),
               ;START WITH BORDER PIXEL IN OCM BUFFER, FINISH WITH INSIDE
               ;PIXEL ADDRESS IN B&C AND COLOR/FLAGS IN D&E
```

```
CP/M MACRO ASSEM 2.0     #030     VIPER-X, GIL HYATT SYSTEM

                 ;
                 ;OCINU  LDA SEH5          ;CHECK YNS TO INC/DEC XS
                 ;-----  ANI 20H
                 ;-----  LDA OCMXS
                 ;------ JNZ OCINU3
                 ;------ INR A             ;INC XS ON PLUS Y
                 ;------ JMP OCIN5
                 ;OCINU3 DCR A             ;DEC XS ON MINUS Y
                 ;------ JMP OCIN5;
                 ;RE-ENTRANT SUBROUTINE, COMPUTE INSIDE PIXEL ADDRESS,
                 ;START WITH BORDER PIXEL IN OCM BUFFER, FINISH WITH
                 ;INSIDE PIXEL ADDRESS IN B&C AND COLOR/FLAGS IN D&E
                 ;
                 ;INSIDE PIXEL DURING OCCULTING PROCESSING
 3B6C 3AE539     OCIN    LDA SEH5
 3B6F E610               ANI 10H           ;CHECK FS
 3B71 3AE539             LDA SEH5          ;CHECK XNS,YNS
 3B74 CA8C3B     OCIN4A  JZ OCIN1
 3B77 E640               ANI 40H           ;CHECK XNS
 3B79 3A6E33             LDA OCMYS         ;INC/DEC YS
 3B7C CAA03B             JZ OCIN2
 3B7F 3C         OCIN7   INR A             ;INC YS
 3B80 4F         OCIN4   MOV C,A           ;YS+-1 TO C AND TO OCMYS
 3B81 326E33             STA OCMYS
 3B84 3A6D33             LDA OCMXS
 3B87 47                 MOV B,A           ;XS TO B
 3B88 CD3364     OCIN8   CALL RDMEM        ;B AND C REGISTERS SAVED
 3B8B C9                 RET
 3B8C E620       OCIN1   ANI 20H           ;CHECK YNS
 3B8E 3A6D33             LDA OCMXS         ;INC/DEC XS
 3B91 CAAC3B             JZ OCIN3
 3B94 3D         OCIN6   DCR A             ;DEC XS
 3B95 47         OCIN5   MOV B,A           ;XS +-1 TO B AND TO OCMXS
 3B96 326D33             STA OCMXS
 3B99 3A6E33             LDA OCMYS
 3B9C 4F                 MOV C,A
 3B9D C3883B             JMP OCIN8
 3BA0 3D         OCIN2   DCR A             ;DEC YS
 3BA1 C3803B             JMP OCIN4
 3BA4 E620       OCOUT1  ANI 20H           ;CHECK YNS
 3BA6 3A6D33             LDA OCMXS         ;INC/DEC XS
 3BA9 CA943B             JZ OCIN6
 3BAC 3C         OCIN3   INR A             ;INC XS
 3BAD C3953B             JMP OCIN5
                 ;
                 ;RE-ENTRANT SUBROUTINE,COMPUTE OUTSIDE ADDRESS,START WITH
                 ;BORDER PIXEL IN OCM BUFFER, FINISH WITH OUTSIDE PIXEL
                 ;ADDRESS IN B&C AND COLOR/FLAGS IN D&E
                 ;
                 ;INSIDE/OUTSIDE PIXEL DURING EDGE PROCESSING
 3BB0 3A5B33     OCOUT4  LDA EGENF7        ;CHECK FS
 3BB3 E610               ANI 10H
 3BB5 3A5B33             LDA EGENF7        ;CHECK XNS YNS
 3BB8 C3C33B     OCOUT4A JMP OCOUT2        ;FOR EGEN TEST INSTRUMENTATION GRAPHICS
                                           ;USE JMP OCOUT2 FOR OBJECTS 0 TO 3,
                                           ;USE JMP OCIN4A FOR OBJECT 4
```

```
CP/M MACRO ASSEM 2.0     #031     VIPER-X. GIL HYATT SYSTEM

                  ;OUTSIDE PIXEL DURING OCCULTING PROCESSING
 3BBB 3AE539      OCOUT    LDA SEH5
 3BBE E610                 ANI 10H          ;CHECK FS
 3BC0 3AE539               LDA SEH5         ;CHECK XNS YNS
 3BC3 CAA43B      OCOUT2   JZ OCOUT1
 3BC6 E640                 ANI 40H          ;CHECK XNS
 3BC8 3A6E33               LDA OCMYS        ;INC/DEC YS
 3BCB C2A03B               JNZ OCIN2        ;DEC YS
 3BCE C37F3B               JMP OCIN7        ;INC YS
                  ;
                  ;
                  ;PRINT A FLAG FIELD FOR EACH PIXEL IN 1/4 FRAME.
                  ;START WITH IP,^P,SELECT P IN SYSTEM,BREAKPOINT AT TESTRC,
                  ;G.TESTP1
                  ;
 3BD1 00          TESTP1   NOP
                  ;------  CALL PRINT       ;PRINT OLD SURFACE ID'S
 3BD2 CD8D3C               CALL OCMSUR2     ;LOAD HEX SURFACE TABLE
 3BD5 CD2164               CALL PRINT       ;PRINT NEW SURFACE ID'S
                                            ;PRINT V1V0
 3BD8 CDDE3C               CALL TESTP4      ;INITIALIZE A NEW FIELD
 3BDB CD3364      TESTPC   CALL RDMEM
 3BDE 7B                   MOV A,E
 3BDF CDE23C               CALL TESTP5      ;DISPLAY V1V0
 3BE2 CD2E01               CALL TLDMEM
 3BE5 CDEC3C               CALL TESTP6      ;EXIT LOGIC
 3BE8 C2DB3B               JNZ TESTPC       ;LOOP FOR ANOTHER PIXEL
 3BEB CD2164               CALL PRINT
                                            ;PRINT PV C2C1C0
 3BEE CDDE3C               CALL TESTP4      ;INITIALIZE A NEW FIELD
 3BF1 CD3364      TESTP3   CALL RDMEM
 3BF4 7A                   MOV A,D          ;DISPLAY PV C2C1C0
 3BF5 0F                   RRC
 3BF6 0F                   RRC
 3BF7 0F                   RRC
 3BF8 0F                   RRC
 3BF9 E60F                 ANI 0FH
 3BFB 5F                   MOV E,A
 3BFC CD2E01               CALL TLDMEM
 3BFF CDEC3C               CALL TESTP6      ;EXIT LOGIC
 3C02 C2F13B               JNZ TESTP3       ;LOOP FOR ANOTHER PIXEL
 3C05 CD2164               CALL PRINT
                                            ;PRINT P1P0
 3C08 CDDE3C               CALL TESTP4      ;INITIALIZE A NEW FIELD
 3C0B CD3364      TESTPA   CALL RDMEM
 3C0E 7A                   MOV A,D          ;DISPLAY P1P0
 3C0F E603                 ANI 03H
 3C11 5F                   MOV E,A
 3C12 CD2E01               CALL TLDMEM
 3C15 CDEC3C               CALL TESTP6
 3C18 C20B3C               JNZ TESTPA
 3C1B CD2164               CALL PRINT
                                            ;PRINT N1N0
 3C1E CDDE3C               CALL TESTP4
 3C21 CD3364      TESTPB   CALL RDMEM
 3C24 7A                   MOV A,D          ;DISPLAY N1N0
```

```
CP/M MACRO ASSEM 2.0     #032     VIPER-X. GIL HYATT SYSTEM

3C25 OF                     RRC                ;2 MSB'S TO LSB'S
3C26 OF                     RRC
3C27 E603                   ANI 03
3C29 5F                     MOV E,A
3C2A CD2E01                 CALL TLDMEM
3C2D CDEC3C                 CALL TESTP6
3C30 C2213C                 JNZ TESTPB
3C33 CD2164                 CALL PRINT
3C36 CD3C3C                 CALL OCMSUR1       ;LOAD INITIAL SURFACE TABLE
3C39 C3A13D                 JMP TESTRT
                  ;
                  ;
3C3C 3E2E         OCMSUR1   MVI A,'.'          ;LOAD COLORS INTO SURFACE MEMORY
3C3E 320290                 STA SURFAC+2
3C41 3E50                   MVI A,'P'
3C43 320690                 STA SURFAC+6
3C46 3E4E                   MVI A,'N'
3C48 320A90                 STA SURFAC+10
3C4B 3E58                   MVI A,'X'
3C4D 320E90                 STA SURFAC+14
3C50 3E59                   MVI A,'Y'
3C52 321290                 STA SURFAC+18
3C55 3E53                   MVI A,'S'
3C57 321690                 STA SURFAC+22
3C5A 3E49                   MVI A,'I'
3C5C 321A90                 STA SURFAC+26
3C5F 3E4F                   MVI A,'O'
3C61 321E90                 STA SURFAC+30
3C64 3E30                   MVI A,'0'          ;LOAD EDGE SMOOTHING SURFACE TABLE
3C66 322290                 STA SURFAC+34
3C69 3E31                   MVI A,'1'
3C6B 322690                 STA SURFAC+38
3C6E 3E32                   MVI A,'2'
3C70 322A90                 STA SURFAC+42
3C73 3E33                   MVI A,'3'
3C75 322E90                 STA SURFAC+46
3C78 3E34                   MVI A,'4'
3C7A 323290                 STA SURFAC+50
3C7D 3E35                   MVI A,'5'
3C7F 323690                 STA SURFAC+54
3C82 3E36                   MVI A,'6'
3C84 323A90                 STA SURFAC+58
3C87 3E37                   MVI A,'7'
3C89 323E90                 STA SURFAC+62
3C8C C9                     RET
                  ;
                  ;
3C8D 3E2E         OCMSUR2   MVI A,'.'          ;LOAD COLORS INTO SURFACE MEMORY
3C8F 320290                 STA SURFAC+2
3C92 3E31                   MVI A,'1'
3C94 320690                 STA SURFAC+6
3C97 3E32                   MVI A,'2'
3C99 320A90                 STA SURFAC+10
3C9C 3E33                   MVI A,'3'
3C9E 320E90                 STA SURFAC+14
3CA1 3E34                   MVI A,'4'
```

```
CP/M MACRO ASSEM 2.0      #033     VIPER-X, GIL HYATT SYSTEM

3CA3 321290          STA SURFAC+18
3CA6 3E35            MVI A,'5'
3CA8 321690          STA SURFAC+22
3CAB 3E36            MVI A,'6'
3CAD 321A90          STA SURFAC+26
3CB0 3E37            MVI A,'7'
3CB2 321E90          STA SURFAC+30
3CB5 3E38            MVI A,'8'          ;LOAD EDGE SMOOTHING SURFACE TABLE
3CB7 322290          STA SURFAC+34
3CBA 3E39            MVI A,'9'
3CBC 322690          STA SURFAC+38
3CBF 3E41            MVI A,'A'
3CC1 322A90          STA SURFAC+42
3CC4 3E42            MVI A,'B'
3CC6 322E90          STA SURFAC+46
3CC9 3E43            MVI A,'C'
3CCB 323290          STA SURFAC+50
3CCE 3E44            MVI A,'D'
3CD0 323690          STA SURFAC+54
3CD3 3E45            MVI A,'E'
3CD5 323A90          STA SURFAC+58
3CD8 3E46            MVI A,'F'
3CDA 323E90          STA SURFAC+62
3CDD C9              RET

                 ;
                 ;INITIALIZE A NEW FIELD
3CDE AF          TESTP4  XRA A          ;LOAD ADDRESS OF FIRST PIXEL
3CDF 47                  MOV B,A
3CE0 4F                  MOV C,A
3CE1 C9                  RET
                 ;
3CE2 0F          TESTP5  RRC            ;2 MSB'S TO LSB'S
3CE3 0F                  RRC
3CE4 0F                  RRC
3CE5 0F                  RRC
3CE6 0F                  RRC
3CE7 0F                  RRC
3CE8 E603                ANI 03H
3CEA 5F                  MOV E,A
3CEB C9                  RET
                 ;
                 ;EXIT LOGIC
3CEC 78          TESTP6  MOV A,B        ;CHECK FOR X=63D
3CED D63F                SUI 63
3CEF C2FA3C              JNZ TESTP7
3CF2 47                  MOV B,A        ;END OF THE LINE, 0=>X
3CF3 79                  MOV A,C        ;CHECK FOR Y=31D
3CF4 D61F                SUI 31
3CF6 C2FC3C              JNZ TESTP8
3CF9 C9                  RET            ;END OF FRAME, A=0
3CFA 04          TESTP7  INR B          ;NOT END OF LINE, X+1=>X
3CFB C9                  RET            ;A IS NOT ZERO
3CFC 0C          TESTP8  INR C          ;NOT LAST LINE,Y+1=>Y
3CFD C9                  RET            ;A IS NOT ZERO
                 ;
```

```
CP/M MACRO ASSEM 2.0     #034    VIPER-X. GIL HYATT SYSTEM

                ;DISPLAY FLAG FIELDS IN OUTSIDE PIXELS
3CFE 00         TESTR1  NOP             ;DISPLAY P-EDGE FLAGS
                ;------ CALL PRINT      ;PRINT OLD SURFACE ID'S
3CFF CD8D3C             CALL OCMSUR2    ;LOAD SURFACE TABLE
3D02 2A6933     TESTRA  LHLD OCMFIP     ;RESTORE FIFO READ POINTER
3D05 22FC53             SHLD PXLFIF-4
3D08 CD303B     TESTRE  CALL OCMEH1
3D0B CD363B     TESTRB  CALL OCMEH      ;ACCESS PIXEL FROM PXPFIF
3D0E CD533D             CALL TESTRK     ;PROCESS PIXEL
3D11 3AE739     TESTRG  LDA PXLB1
3D14 E680               ANI 80H
3D16 CA0B3D             JZ TESTRB
3D19 3AE539             LDA SEH5
3D1C E608               ANI 08
3D1E CA083D             JZ TESTRE
3D21 CD2164             CALL PRINT
3D24 C3A13D             JMP TESTRT
                ;
3D27 00         TESTR2  NOP             ;DISPLAY N-EDGE FLAGS
                ;------ CALL PRINT      ;PRINT OLD SURFACE ID'S
3D28 CD8D3C             CALL OCMSUR2    ;LOAD SURFACE TABLE
3D2B 2A6733     TESTRL  LHLD OCMFIN     ;RESTORE FIFO READ POINTER
3D2E 22FC53             SHLD PXLFIF-4
3D31 CD303B     OCMTE   CALL OCMEH1     ;ACCESS SEH HEADER FROM FIFO
3D34 CD363B     OCMTB   CALL OCMEH      ;ACCESS PXLB BLOCK FORM FIFO
3D37 CD533D             CALL TESTRK
3D3A 3AE739     TESTRN  LDA PXLB1
3D3D E680               ANI 80H
3D3F CA343D             JZ OCMTB
3D42 3AE539             LDA SEH5
3D45 E608               ANI 08
3D47 CA313D             JZ OCMTE
3D4A CD2164             CALL PRINT
3D4D CD3C3C             CALL OCMSUR1    ;LOAD INITIAL SURFACE TABLE
3D50 C3A13D             JMP TESTRT
                ;
3D53 CD423B     TESTRK  CALL OCMF       ;ACCESS EDGE PIXEL FROM PIXEL MEMORY
3D56 CD853A             CALL OCMT       ;BUFFER PIXEL WORD
3D59 CD5C3A             CALL OCMP       ;INITIALIZE I/O PIXEL ADDRESS
3D5C CDBB3B             CALL OCOUT      ;FETCH OUTSIDE PIXEL
3D5F 3A7233             LDA PXLCF       ;DISPLAY ID
3D62 E60F               ANI IDMSK1
3D64 CD8B3D             CALL TESTRC
3D67 CDBB3B             CALL OCOUT
3D6A 3A7233             LDA PXLCF       ;DISPLAY V1V0
3D6D CD953D             CALL TESTRD     ;PACK AND LOAD PIXEL WORD
3D70 CDBB3B             CALL OCOUT      ;FETCH ANOTHER OUTSIDE PIXEL
3D73 3A7133             LDA PXLF7       ;DISPLAY N1N0P1P0
3D76 E60F               ANI 0FH
3D78 CD8B3D             CALL TESTRC     ;PACK AND LOAD PIXEL WORD
3D7B CDBB3B             CALL OCOUT
3D7E 3A7133             LDA PXLF7       ;DISPLAY FV C2C1C0
3D81 0F                 RRC
3D82 0F                 RRC
3D83 0F                 RRC
3D84 0F                 RRC
```

```
CP/M MACRO ASSEM 2.0     #035     VIPER-X. GIL HYATT SYSTEM

 3D85 E60F              ANI 0FH
 3D87 CD8B3D            CALL TESTRC
 3D8A C9                RET
                ;
 3D8B 67        TESTRC  MOV H,A
 3D8C 7B                MOV A,E
 3D8D E6F0              ANI IDMSK2
 3D8F B4                ORA H
 3D90 5F                MOV E,A
 3D91 CD2E01            CALL TLDMEM
 3D94 C9                RET
                ;
 3D95 0F        TESTRD  RRC
 3D96 0F                RRC
 3D97 0F                RRC
 3D98 0F                RRC
 3D99 0F                RRC
 3D9A 0F                RRC
 3D9B E603              ANI 03H
 3D9D CD8B3D            CALL TESTRC
 3DA0 C9                RET
                ;
 3DA1 C9        TESTRT  RET              ;INSERT A SID BREAKPOINT HERE
                ;;
                ;    DISPLAY STORAGE AREA
                ;
 7000                   ORG  STMEM
 7000           IMAGE   DS   2000H
                ;
                ;  LOAD SURFACE COLOR TABLE
                ;
 9000           SURFAC  DS 40H
                ;
                ;--------DATA BASE MEMORY-------------------------------------
                ;
                ;                   DBM OBJECT LIBRARY
                ;
                ;     OBJECT MEMORY CONTAINS 8 POSSIBLE OBJECTS WITH 8 POSSIBLE
                ;  VECTORS PER OBJECT.  EACH VECTOR REQUIRES 4 EIGHT BIT BYTES.
                ;
 9900                   ORG STMEM+2900H
                ;
                ;  OBJECT 0
                ;     VECTOR 0
 9900 02        DBOBJK  DB 2             ;CONNECTED EDGE
 9901 08                DB 08            ;X-ENDPOINT
 9902 0C                DB 12            ;Y-ENDPOINT
 9903 00                DB 0
                ;     VECTOR 1
 9904 00                DB 0
 9905 17                DB 23
 9906 0F                DB 15
 9907 80                DB 80H
                ;     VECTOR 2
 9908 01                DB 1
 9909 11                DB 17
```

```
/M'MACRO ASSEM 2.0     #036     VIPER-X. GIL HYATT SYSTEM

990A 02              DB 2
990B 40              DB 40H
990C                 DS 20
            ;  OBJECT 1
            ;      VECTOR 0
9920 01              DB 1
9921 14              DB 20
9922 14              DB 20
9923 40              DB 40H
            ;      VECTOR 1
9924 00              DB 0
9925 04              DB 4
9926 0C              DB 12
9927 00              DB 0
9928                 DS 24
            ;  OBJECT 2
            ;      VECTOR 0
9940 03              DB 3
9941 10              DB 16
9942 06              DB 06
9943 00              DB 0
            ;      VECTOR 1
9944 00              DB 0
9945 0C              DB 12
9946 06              DB 06
9947 80              DB 80H
            ;      VECTOR 2
9948 01              DB 1
9949 0C              DB 12
994A 10              DB 16
994B 80              DB 80H
            ;      VECTOR 3
994C 02              DB 2
994D 10              DB 16
994E 10              DB 16
994F C0              DB 0C0H
9950                 DS 16
            ;  OBJECT 3
            ;        VECTOR 0
9960                 DS 32
            ;OBJECT 4
            ;          VECTOR 0
9980 02              DB 2
9981 11              DB 17
9982 02              DB 2
9983 00              DB 0
            ;          VECTOR 1
9984 00              DB 0
9985 17              DB 23
9986 0F              DB 15
9987 80              DB 80H
            ;          VECTOR 2
9988 01              DB 1
9989 08              DB 8
998A 0C              DB 12
998B 40              DB 40H
```

```
/M MACRO ASSEM 2.0     #037    VIPER-X. GIL HYATT SYSTEM

998C                DS 20
            ;
            ;                   DATA BASE INITIAL CONDITIONS
            ;
            ;     DBICON MEMORY CONTAINS 8 POSSIBLE ENTRIES WITH 8 BYTES
            ;   PER ENTRY.
            ;
            ;
            ;   DBICON 0                  ;8 ENTRIES PER OBJECT
99A0 00     DBICON  DB 0                  ;OBJECT NUMBER
99A1 00             DB 0
99A2 00             DB 0
99A3 00             DB 0
99A4 18             DB 18H                ;COLOR, SURFACE TABLE
99A5 00             DB 0
99A6 00             DB 0
99A7 00             DB 0
            ;   DBICON 1
99A8 01             DB 1
99A9 0A             DB 10
99AA 02             DB 2
99AB 04             DB 4
99AC 19             DB 19H
99AD 00             DB 0
99AE 00             DB 0
99AF 00             DB 0
            ;   DBICON 2
99B0 02             DB 2
99B1 00             DB 0
99B2 00             DB 0
99B3 00             DB 0
99B4 19             DB 19H
99B5 00             DB 0
99B6 00             DB 0
99B7 00             DB 0
            ;   DBICON 3
99B8 03             DB 3
99B9 00             DB 0
99BA 00             DB 0
99BB 00             DB 0
99BC 20             DB 20H
99BD 00             DB 0
99BE 00             DB 0
99BF 00             DB 0
            ;   DBICOM 4
99C0 04             DB 4
99C1 00             DB 0
99C2 00             DB 0
99C3 00             DB 0
99C4 21             DB 21H
99C5 00             DB 0
99C6 00             DB 0
99C7 00             DB 0
            ;
99C8                DS 16
            ;
```

```
/M'MACRO ASSEM 2.0     #038     VIPER-X. GIL HYATT SYSTEM

                 ;
                 ;TI => TEST INSTRUMENTATION
                 ;EM => EMULATED OPERATION
                 ;EP => EDGE PIXEL FROM PIXEL MEMORY
                 ;IP => INSIDE PIXEL FROM PIXEL MEMORY
                 ;OP => OUTSIDE PIXEL FROM PIXEL MEMORY
                 ;EF => EDGE PIXEL FROM FIFO
                 ;---=> NOT USED BUT PRESERVED FOR DOCUMENTATION
                 ;*  => NOT USED BUT PRESERVED FOR UPGRADE
                 ;X  => NOT USED, WITH DELETION PENDING
                 ;   => ANNOTATIONS
                 ;
99D8                     END BEGIN
```

TABLES OF COMPUTER LISTINGS

ANITSTREAKING PROCESSOR

```
10A0 C39010            JMP EGEN7
10A3 78       EGEN8    MOV A.B           :NORMALIZATION COMPLETE
10A4 32F303            STA EGENXN        :STORE IN INITIALIZATION BUFFER
10A7 7A                MOV A.D
10A8 32F003            STA EGENYN
10AB 3AE903            LDA IPOBYS        :STORE YS
10AE 32EE03            STA EGENYS
10B1 3AE803            LDA IPOBXS        :STORE XS
10B4 32F103            STA EGENXS
10B7 CDD903            CALL EGENDK       :PACK EGENF3 CONDITIONS
10BA 32F703            STA EGENF3        :MSH=0. REMAINDERS=0 (EGENF4 IS
10BD 3AEC03            LDA IPOBCF        :LOAD MOVING SURFACE COLOR TO EGENCF
10C0 32F503            STA EGENCF
10C3 CDCA16            CALL EICF7        :LOAD GPFIF FROM TABLE
10C6 210050            LXI H.GPFIF
10C9 CDB316            CALL EICU
10CC C9                RET
                       :
                       :NOW.LOAD TABLE FROM GPFIF FOR EDGE PIXEL GENERATION AND
                       :STORE EDGE PIXELS IN PXPFIF OR PXNFIF
                       :
                       :ANTISTREAKING PROCESSING
10CD 2AFC4F   EICJ     LHLD GPFIF-4      :GET FIRST P-EDGE EGENF7
10D0 110050            LXI D.GPFIF       :BASE ADDRESS
10D3 19                DAD D             :ABSOLUTE START ADDRESS MINUS 2
10D4 110A00            LXI D.10          :ABSOLUTE EGENF7 ADDRESS.
10D7 19                DAD D             :2+9 BYTES FROM POINTER (BYTE NO. 10)
10D8 220004   EICJD    SHLD OCMFIN       :BUFFER ADDRESS OF FIRST P/N-EDGE EGENF
10DB 7E                MOV A.M
10DC 32E011            STA EICJ2         :BUFFER FIRST P/N-EDGE EGENF7
10DF CDD511            CALL EICJH        :PACK SLOPE COND. OF FIRST P/N EDGE
10E2 C2E710            JNZ EICJW
10E5 F601              ORI 01
10E7 E68F     EICJW    ANI 8FH           :CLEAR PVO.VO.SVO FLAGS
10E9 32E111            STA OCMFIA
10EC 2A0004            LHLD OCMFIN
10EF 7E                MOV A.M
10F0 E608     EICJY    ANI 08            :FIND LAST EDGE
10F2 C2FB10            JNZ EICJF
10F5 CDA411            CALL EICJE        :GET SUBSEQUENT EGENF7
10F8 C3F010            JMP EICJY
10FB 7E       EICJF    MOV A.M           :GET LAST EGENF7
10FC 32DF11            STA EICJ1         :STORE PREVIOUS EGENF7
10FF CDD511            CALL EICJH        :PACK SLOPE CONDITION OF PREVIOUS EDGE
1102 C20A11            JNZ EICJJ
1105 F640              ORI 40H
1107 32E111            STA OCMFIA
110A 2A0004   EICJJ    LHLD OCMFIN       :GET ADDRESS OF PRESENT EGENF7
110D CDD511            CALL EICJH        :PACK SLOPE CONDITION OF PRESENT EDGE
1110 C21811            JNZ EICJT
1113 F620              ORI 20H
1115 32E111            STA OCMFIA
1118 2A0004   EICJT    LHLD OCMFIN       :GET ADDRESS OF PRESENT EGENF7
111B 3AE111            LDA OCMFIA        :CHECK VO-FLAG
111E E620              ANI 20H
1120 C4CE11            CNZ EICJM         :PACK EV-FLAG ON VO-FLAG NZ
```

```
1123 3AE111            LDA OCMFIA      ;CHECK PVO,VO FLAGS
1126 E660              ANI 60H
1128 C4C711            CNZ EICJC       ;PACK SV-FLAG ON PVO RO VO FLAGS NZ
112B 3ADF11            LDA EICJ1       ;GET PREVIOUS EDGE EGENF7
112E CDAA11            CALL EICJ9      ;CHECK SV-FLAG
1131 C4C711            CNZ EICJC       ;PACK SV-FLAG ON NZ (IPOBCF SEQ-2)
1134 7E                MOV A,M         ;CHECK FOR LAST EDGE
1135 E608              ANI 08
1137 C24311            JNZ EICJA
113A CDA411            CALL EICJE      ;GET SUBSEQUENT EGENF7
113D 2A0004            LHLD OCMFIN     ;GET ADDRESS OF PRESENT EGENF7
1140 C34611            JMP EICJG
1143 3AE011   EICJA    LDA EICJ2       ;LAST EDGE. GET FIRST EDGE
                                       ;AS SUBSEQUENT EDGE
1146 CDAA11   EICJG    CALL EICJ9      ;CHECK EV-FLAG
1149 C4CE11            CNZ EICJM       ;PACK EV-FLAG ON NZ (IPOBCF SEQ-2)
114C 7E       EICJI    MOV A,M         ;CHECK FOR LAST EDGE
114D E608              ANI 08
114F C28811            JNZ EICJP
1152 CDA411            CALL EICJE      ;PACK SLOPE OF SUBSEQUENT EDGE
1155 CDD511            CALL EICJH
1158 C26011            JNZ  EICJU
115B F610              ORI 10H
115D 32E111            STA OCMFIA
1160 2A0004   EICJU    LHLD OCMFIN     ;GET ADDRESS OF PRESENT EGENF7
1163 3AE111            LDA OCMFIA      ;PACK EV-FLAG ON SVO-FLAG NZ
1166 E610              ANI 10H
1168 C4CE11            CNZ EICJM
116B 3AE111            LDA OCMFIA      ;SHIFT LEFT VO,SVO FLAGS
116E E68F              ANI 8FH
1170 47                MOV B,A
1171 3AE111            LDA OCMFIA
1174 07                RLC
1175 E660              ANI 60H
1177 B0                ORA B
1178 32E111            STA OCMFIA
117B 7E                MOV A,M         ;LOOP FOR ANOTHER EDGE
117C 32DF11            STA EICJ1       ;STORE PRESENT EGENF7 AS PREVIOUS EGENF7
117F CDA411            CALL EICJE      ;GET ADDRESS OF SUBSEQUENT EGENF7
1182 220004            SHLD OCMFIN
1185 C31811            JMP EICJT
1188 3AE111   EICJP    LDA OCMFIA      ;CHECK FIRST VECTOR SLOPE
118B E601              ANI 01
118D C4CE11            CNZ EICJM       ;PACK EV-FLAG ON FVO-FLAG NZ
1190 3AE111            LDA OCMFIA      ;PACK FPS-FLAG
1193 F604              ORI 04
1195 32E111            STA OCMFIA
1198 7E                MOV A,M         ;CHECK FOR LAST EDGE BEING AN N-EDGE
1199 E601              ANI 01
119B C2E211            JNZ EICAB
119E CDA411            CALL EICJE      ;LAST P-EDGE. GET FIRST N-EDGE EGENF7
11A1 C3D810            JMP EICJD
              ;
11A4 110A00   EICJE    LXI D,10        ;GET SUBSEQUENT EGENF7
11A7 19                DAD D
11A8 7E                MOV A,M
```

```
11A9 C9                 RET
               ;
               ;CHECK FOR SV.EV FLAGS
11AA AE        EICJ9    XRA M            ;XOR WITH PRESENT EGENF7
11AB E660               ANI 60H          ;LOOK AT DELTA XNS.YNS
11AD C8                 RZ               ;ZERO IN A. NO CHANGE
11AE 47                 MOV B.A          ;BUFFER DELTA XNS.YNS
11AF E640               ANI 40H          ;CHECK DELTA XNS
11B1 CAB811             JZ EICJB
11B4 7E                 MOV A.M          ;XNS CHANGES
11B5 E610               ANI 10H          ;IF FS=1. PREVENT FILL
11B7 C0                 RNZ              ;NON-ZERO IN A = CHANGE
11B8 78        EICJB    MOV A.B          ;CHECK DELTA YNS
11B9 E620               ANI 20H
11BB C8                 RZ               ;ZERO IN A = NO CHANGE
11BC 7E                 MOV A.M          ;YNS CHANGED
11BD E610               ANI 10H          ;IF FS=0. PREVENT X-FILL
11BF C2C511             JNZ EICJL
11C2 F60F               ORI 0FH          ;CHANGE. SET A TO NON-ZERO
11C4 C9                 RET
11C5 AF        EICJL    XRA A            ;NO CHANGE. SET A TO ZERO
11C6 C9                 RET
               ;
11C7 2B        EICJC    DCX H            ;PACK SV=1 (IPOBCF SEQ-2)
11C8 7E                 MOV A.M
11C9 F620               ORI 20H
11CB 77                 MOV M.A
11CC 23                 INX H
11CD C9                 RET
               ;
11CE 2B        EICJM    DCX H            ;PACK EV=1 (IPOBCF SEQ-2)
11CF 7E                 MOV A.M
11D0 F610               ORI 10H
11D2 77                 MOV M.A
11D3 23                 INX H
11D4 C9                 RET
               ;
11D5 11F9FF    EICJH    LXI D.0FFF9H     ;CHECK SLOPE = 0
11D8 19                 DAD D            ;SUBT 7 FROM EGENF7 ADDRESS TO GET
11D9 7E                 MOV A.M          ;EGENYD ADDRESS
11DA B7                 ORA A
11DB 3AE111             LDA OCMFIA
11DE C9                 RET
               ;
11DF 00        EICJ1    DB 00            ;PREVIOUS EDGE EGENF7
11E0 00        EICJ2    DB 00            ;EGENF7 OF FIRST EDGE ON SURFACE
               ;
11E1 00        OCMFIA   DB 00            ;OCCULTING FLAG WORD
               ;                B7  B6  B5  B4  B3  B2  B1  B0
               ;                VF  PV0 V0  SV0     FPS     FV0
               ;LOAD FIFO
11E2 21EE03    EICAB    LXI H.EGENYS     ;CLEAR EGEN TABLE
11E5 CDE515             CALL SPCL18
11E8 218305             LXI H.SMOOTHA    ;CLEAR SMOOTHING BUFFER
11EB CDEC15             CALL SPCL6
11EE CDCA16             CALL EICF7       ;ACCESS GPFIF
```

```
11F1 210050         LXI H.GPFIF
11F4 CD9B16         CALL EICD
                                        :LOAD SEH TABLE
11F7 21D515         LXI H.SEH0          :CLEAR SEH TABLE
11FA CDEC15         CALL SFCL6
11FD 3AF503         LDA EGENCF          :MASK SV.EV-FLAGS
1200 E630           ANI 30H
1202 47             MOV B.A
1203 3AF603         LDA EGENF7
1206 E607           ANI 07              :MASK FLAGS
1208 F640           ORI 40H             :PACK CONTROL FLAGS
120A B0             ORA B               :PACK SV.EV-FLAGS
120B 32D515         STA SEH0
120E 3AF503         LDA EGENCF
1211 E60F           ANI 0FH
1213 5F             MOV E.A
            :*      CALL SURMEM         :PENDING SURFACE MEMORY IMPLEMENTATION
            :*      LHLD SURFM0
            :*      SHLD SEH2
            :*      LHLD SURFM1
            :*      MOV A.H
1214 7B             MOV A.E             :TI.THIS IS A TEMPORARY SUBSTITUTE FOR
1215 07             RLC                 :TI.THE ABOVE SURFACE MEMORY PENDING
1216 07             RLC                 :TI.IMPLEMENTATION
1217 E63C           ANI 3CH             :TI
1219 32D615         STA SEH1
121C 3AF603         LDA EGENF7
121F E678           ANI 78H
1221 32DA15         STA SEH5
1224 CDEA16         CALL EICF9          :LOAD SURFACE/EDGE HEADER INTO FIFO
1227 210052         LXI H.PXLFIF
122A 3E03           MVI A.03
122C CDB316         CALL EICU           :LOAD PXLFIF WITH SEH TABLE
122F 3AF403         LDA EGENF1          :SET IP-FLAG FOR STARTPOINT PIXEL.
1232 F620           ORI 20H             :2 EDGE FLAGS/VERTEX PREVENTS
1234 32F403         STA EGENF1          :VERTEX STRIPE AND PERMITS POINTS
                                        :AND OPEN SURFACES TO BE GENERATED
            :------- MVI A.80H          :ZERO REMAINDER IC. PRESENT SMOOTHING
            :------- STA EGENYR         :PROCESSOR REQUIRES ZERO NSBS FOR ICS
            :------- STA EGENXR
1237 CD3101 EICAC   CALL EGEN7C         :GENERATE AN EDGE PIXEL
                                        :LOAD PXLB TABLE
123A 21DB15         LXI H.PXLB0         :CLEAR PXLB TABLE
123D CDEC15         CALL SFCL6
1240 CDDE04         CALL SMOOTH5        :LOOKUP PIXEL WEIGHT(E-REG)
IXEL                                    :PACK INTO PXLB0 AND SETUP FOR ANOTHER P
1243 3ADB15         LDA PXLB0
1246 F680           ORI 80H             :PACK PXLB ID BITS
1248 32DB15         STA PXLB0
            :FOR P-EDGE. SMOOTHING WEIGHT WILL BE OVERWRITTEN BY THE OUTSIDE
            :SURFACE ID IN MODE-0. FOR N-EDGE. SMOOTHING WEIGHT WILL BE
            :PRESERVED.
124B 3AF603         LDA EGENF7          :PACK LPE-FLAG
124E E680           ANI 80H
1250 32DC15         STA PXLB1           :PXLB2.3 ARE LOADED IN OCM0.1
                                        :VERTEX PIXEL SMOOTHING
```

```
1253 3AF403          LDA EGENF1      ;CHECK IP-FLAG
1256 E620            ANI 20H
1258 CA9412          JZ EICAC1
125B 3AF403          LDA EGENF1      ;CLEAR IP-FLAG
125E E6DF            ANI ØDFH
1260 32F403          STA EGENF1
1263 3AF603          LDA EGENF7      ;CHECK N-EDGE FLAG
1266 E601            ANI Ø1
1268 CA9412          JZ EICAC1
126B 3AE111          LDA OCMFIA      ;CHECK FPS-FLAG
126E E604            ANI Ø4
1270 CA8412          JZ SMOOTHW
1273 3AE111          LDA OCMFIA      ;CLEAR FPS-FLAG
1276 E6DF            ANI ØDFH
1278 32E111          STA OCMFIA
              ;THIS IS THE FIRST IP PER SURFACE, SO BUFFER PIXEL SMOOTHING
              ;CONDITIONS FOR SUBSEQUENT PROCESSING AND EXIT
127B 2A8305          LHLD SMOOTHA    ;ACCESS FIRST PIXEL CONDITION BUFFER
127E 228905          SHLD SMOOTHG
1281 C39412          JMP EICAC1
              ;THIS IS NOT THE FIRST IP PER SURFACE, SO CALCULATE VERTEX
              ;SMOOTHING
1284 2A8305   SMOOTHW LHLD SMOOTHA   ;INTERMEDIATE VERTEX, LOGICALLY 'OR'
1287 3A8B05          LDA SMOOTHI     ;TOGETHER FIRST AND LAST (OVERLAPPING)
128A B5              ORA L           ;SUBPIXEL CONDITIONS
128B 328305          STA SMOOTHA
128E 3A8C05          LDA SMOOTHJ
1291 CDEE12          CALL SMOOTH7
1294 3AE803   EICAC1  LDA IPOBXS     ;PROCESS PIXEL COORDINATES
1297 CD0E13          CALL EICACA     ;RESCALE TO PIXEL RESOLUTION
129A 32DF15          STA PXLB4
129D 3AE903          LDA IPOBYS
12A0 CD0E13          CALL EICACA     ;RESCALE TO PIXEL RESOLUTION
12A3 32E015          STA PXLB5
12A6 3ADC15   EICAG   LDA PXLB1      ;CHECK FOR LAST PIXEL ON EDGE (SEQ-2)
12A9 E680            ANI 80H
12AB C2B412          JNZ EICAC7
12AE CD1913          CALL EICAC2     ;LOAD PXLB TABLE INTO PXLFIF
12B1 C33712          JMP EICAC       ;LOOP BACK FOR ANOTHER PIXEL
12B4 3AD515   EICAC7  LDA SEH0       ;PROCESS LAST PIXEL ON EDGE
12B7 E601            ANI Ø1          ;CHECK FOR N-EDGE
12B9 CAC212          JZ EICAC4
12BC 2A8305          LHLD SMOOTHA    ;LOAD ENDPOINT PIXEL CONDITIONS
12BF 228B05          SHLD SMOOTHI.
12C2 3ADA15   EICAC4  LDA SEH5       ;CHECK FOR LES-FLAG
12C5 E608            ANI Ø8
12C7 CAD212          JZ EICAC5
12CA 3AD515          LDA SEH0        ;CHECK FOR N-EDGE
12CD E601            ANI Ø1
12CF C2D812          JNZ EICAC6
12D2 CD1913   EICAC5  CALL EICAC2    ;LOAD PXLB TABLE INTO PXLFIF
12D5 C3E211          JMP EICAD       ;LOOP BACK FOR ANOTHER EDGE
12D8 2A8305   EICAC6  LHLD SMOOTHA   ;LAST VERTEX, LOGICALLY 'OR' TOGETHER
12DB 3A8905          LDA SMOOTHG     ;FIRST AND LAST (OVERLAPPING) SUBPIXEL
12DE B5              ORA L           ;CONDITIONS
12DF 328305          STA SMOOTHA
```

```
12E2 3ABA05          LDA SMOOTHH
12E5 CDEE12          CALL SMOOTH7
12E8 CD1913          CALL EICAC2       ;LOAD PXLB TABLE INTO PXLFIF
12EB C32513          JMP EICX
                ;
12EE B4         SMOOTH7 ORA H          ;SMOOTH VERTEX PIXEL
12EF 328405          STA SMOOTHB       ;BUFFER IS IMPLICITLY CLEARED BY LOADING
12F2 E601            ANI 01            ;CHECK F8 SUBPIXEL CONDITION
                ;*   CZ ERROR1         ;F8=0.PACK 0FFH INSTEAD OF TABLE LOOKUP
                ;HALF OF VERTEX TABLE (F8=0) ARE 'CAN'T HAPPEN' CONDITIONS
12F4 C2FE12          JNZ EICAC8        ;TI. TO CIRCUMVENT ERROR DETECTOR
12F7 3AFF00          LDA 0FFH          ;TI
12FA 5F              MOV E.A           ;TI
12FB C30413          JMP EICAC9        ;TI
12FE 214E06     EICAC8 LXI H.SMOOTHV-80H:THIS IS THE ADDRESS OF VERTEX WEIGHT
                                       ;TABLE MINUS 256D
1301 CDED04          CALL SMOOTH4      ;TABLE LOOKUP OF WEIGHT.PROPERLY MASKED
1304 3ADB15     EICAC9 LDA PXLB0       ;WEIGHT IS STORED IN E
1307 E6F0            ANI 0F0H          ;PACK VERTEX WEIGHT. WHICH OVERWRITES
1309 B3              ORA E             ;LPE SMOOTHED COLOR
130A 32DB15          STA PXLB0
130D C9              RET
                ;
130E B7         EICACA ORA A           ;RESCALE FOR PIXEL RESOLUTION
130F 0F              RRC
1310 F21613          JP EICACB
1313 F680            ORI 80H           ;NEGATIVE. PACK B7=1
1315 C9              RET
1316 E67F       EICACB ANI 7FH         ;POSITIVE. PACK B7=0
1318 C9              RET
                ;
1319 CDE016     EICAC2 CALL EICFA      ;LOAD PXLB TABLE START ADDRESS
131C 210052          LXI H.PXLFIF
131F 3E03            MVI A.03          ;3-WORDS
1321 CDB316          CALL EICU         ;LOAD PXLFIF WITH PXLB TABLE
1324 C9              RET
                ;
1325 CD8218     EICX   CALL OCMSUR2
1328 CD8823          CALL PRINT        ;TI
132B CD3118          CALL OCMSUR1
132E C9         EICX1  RET
                ;
```

TABLE OF COMPUTER LISTINGS

OCCULTING PROCESSOR

```
                :
                :
                :
                :
                :DRAW P-EDGES (MODE-Ø) SUBROUTINE. RE-ENTRANT.
                :REG. NOT SAVED. FIFO POINTER SAVED
                :
132F 2AFC51     OCMØA   LHLD PXLFIF-4    :SAVE P-EDGE READ POINTER
1332 220204             SHLD OCMFIP
1335 CD2517     OCMØE   CALL OCMEH1      :ACCESS SEH HEADER FROM FIFO
1338 CD2B17     OCMØB   CALL OCMEH       :ACCESS PXLB BLOCK FROM PXPFIF
133B 2AFC51             LHLD PXLFIF-4    :SAVE PRESENT PIXEL READ POINTER
133E 220404             SHLD OCMFFA
1341 3AD515     OCMØR   LDA SEHØ         :CHECK NON-DRAW FLAG. FØ
```

```
1344 E602               ANI 02          :OCM0R FOLLOWS OCM0B HERE FOR FIFO PNTR
1346 C28113             JNZ OCM0G       :TO ADVANCE TO N-EDGE ON F0-FLAG
1349 AF                 XRA A           :CLEAR OUTSIDE PIXEL BUFFER
134A 320C04             STA OPXL
134D CD3717     OCM0D   CALL OCMF       :ACCESS EP FROM PIXEL MEMORY
1350 14                 INR D           :INCR P1P0
1351 CD0A24     OCM0I   CALL LDMEM      :RESTORE EP TO PIXEL MEMORY
1354 CD6016             CALL OCMB       :LOAD PXL WORD TO PXLB2.3(EXCEPT COLOR
                                        :WHICH IS SMOOTHER)
1357 CD5116             CALL OCMP       :INITIALIZE I/O PIXEL ADDRESS
135A CDB017             CALL OCOUT      :ACCESS OUTSIDE PIXEL
135D 7B                 MOV A.E         :CHECK FOR VISIBLE EDGE FLAG
135E E6C0               ANI 0C0H
1360 CA6B13             JZ OCM0K
1363 3ADB15             LDA PXLB0       :PACK VISIBLE EDGE FLAG AND EXIT
1366 F610               ORI 10H
1368 C37513             JMP OCM0L
136B 7B         OCM0K   MOV A.E
136C E60F               ANI IDMSK1
136E 5F                 MOV E.A
136F 3ADB15             LDA PXLB0       :OUTSIDE SURFACE ID OVERWRITES SMOOTHIN(
1372 E6F0               ANI IDMSK2      :WEIGHT FOR P-EDGE
1374 B3                 ORA E
1375 32DB15     OCM0L   STA PXLB0
1378 3A0C04     OCM0H   LDA OPXL        :IS OUTSIDE PIXEL BUFFER FULL?
137B C28113             JNZ OCM0G
137E CDF316             CALL OCMA       :NO.THEN FIND FIRST PROPER OUTSIDE PXL
1381 3ADC15     OCM0G   LDA PXLB1       :LOOP FOR ANOTHER EDGE PIXEL
1384 E680               ANI 80H         :CHECK FOR LAST PIXEL/EDGE
1386 CA3813             JZ OCM0B        :LOOP FOR ANOTHER PIXEL
1389 3ADA15             LDA SEH5
138C E608               ANI 08          :CHECK FOR LAST EDGE/SURFACE
138E CA3513             JZ OCM0E        :LOOP FOR ANOTHER EDGE
1391 00         OCM0X   NOP             :TI
                :
                :DRAW N-EDGES (MODE-1) SUBROUTINE.
                :RE-ENTRANT. REG. NOT SAVED. FIFO POINTER SAVED
                :
1392 2AFC51     OCM1A   LHLD PXLFIF-4   :SABE N-EDGE READ POINTER
1395 220004             SHLD OCMFIN
1398 CD2517     OCM1E   CALL OCMEH1     :ACCESS SEH HEADER FROM FIFO
139B 3AD515     OCM1R   LDA SEH0        :CHECK FOR NON-DRAW FLAG
139E E602               ANI 02
13A0 C2C913             JNZ OCM1X
13A3 CD2B17     OCM1B   CALL OCMEH      :ACCESS PXLB BLOCK FROM PXNFIF
13A6 2AFC51             LHLD PXLFIF-4   :SAVE PRESENT PIXEL READ POINTER
13A9 220404             SHLD OCMFFA
13AC CD3717     OCM1D   CALL OCMF       :ACCESS EP FROM PIXEL MEMORY
13AF 7A                 MOV A.D         :INCR N1N0
13B0 C604               ADI 04
13B2 57                 MOV D.A
13B3 CD0A24     OCM1I   CALL LDMEM      :RESTORE EP TO PIXEL MEMORY
13B6 CD6016             CALL OCMB       :LOAD PIXEL WORD INTO PXLB2.3
13B9 3ADC15     OCM1G   LDA PXLB1       :LOOP FOR ANOTHER EDGE PIXEL
13BC E680               ANI 80H         :CHECK FOR LAST PIXEL/EDGE
13BE CAA313             JZ OCM1B        :LOOP FOR ANOTHER PIXEL
```

7'

```
13C1 3ADA15           LDA SEH5
13C4 E608             ANI 08          ;CHECK LAST EDGE/SURFACE
13C6 CA9813           JZ OCM1E        ;LOOP FOR ANOTHER EDGE
13C9 00        OCM1X  NOP             ;TI
               ;
               ;FILL LEADING EDGE INTERVENING PIXELS (MODE-2) SUBROUTINE.
               ;RE-ENTRANT. REG. NOT SAVED. FIFO POINTER SAVED
               ;
13CA 2A0004    OCM2A  LHLD OCMFIN     ;RESTORE READ POINTER
13CD 22FC51           SHLD PXLFIF-4
13D0 3AE111           LDA OCMFIA      ;SET VECTOR FLAG (VF)
13D3 F680             ORI 80H
13D5 32E111           STA OCMFIA
13D8 CD2517    OCM2E  CALL OCMEH1     ;ACCESS SEH HEADER FROM FIFO
13DB 3AD515    OCM2R  LDA SEH0        ;CHECK FOR NON-DRAW AND NON-FILL FLAGS
13DE E602             ANI 02          ;TI.LATER ANI 06
13E0 C24214           JNZ OCM2X
13E3 CD2B17    OCM2B  CALL OCMEH      ;ACCESS PXLB BLOCK FROM FIFO
13E6 2AFC51           LHLD PXLFIF-4   ;SAVE PRESENT PIXEL READ POINTER
13E9 220404           SHLD OCMFFA
13EC CD3717    OCM2D  CALL OCMF       ;ACCESS FROM PIXEL MEMORY
13EF 7A               MOV A.D         ;CHECK P1P0 (EP) = 0
13F0 E603             ANI 03
13F2 C23214           JNZ OCM2G
13F5 7A               MOV A.D         ;CHECK N1M0 (EP) >01=>10 (VERTEX)
13F6 E608             ANI 08
13F8 C22C14           JNZ OCM2K
13FB 3AE111           LDA OCMFIA      ;RESET VERTEX FLAG (VF)
13FE E67F             ANI 7FH
1400 32E111           STA OCMFIA
1403 CD5116    OCM2L  CALL OCMP       ;INITIALIZE I/O PIXEL ADDRESS
1406 CD6117    OCM2P  CALL OCIN       ;ACCESS IP FROM PIXEL MEMORY
1409 7A               MOV A.D         ;CHECK M1M0.P1P0 (IP) = 0
140A E60F             ANI 0FH
140C C23214           JNZ OCM2G
140F 3AD615    OCM2M  LDA SEH1        ;IF IP IS THE MOVING SURFACE. THEN LOOP
1412 0F               RRC             ;FOR ANOTHER EP FROM FIFO
1413 0F               RRC
1414 AB               XRA E
1415 E60F             ANI IDMSK1
1417 CA3214           JZ OCM2G
141A 7B               MOV A.E         ;CHECK V1V0 (IP) = 0
141B E6C0             ANI 0C0H
141D C2CC15           JNZ OCM2H       ;EM.CHECK FOR INTERVENING PIXEL EDGE
               ;#OCM2F CALL OCMF1      ;CHECK OBJECT ID FOR IP AND EP
               ;*     JZ OCM20
1420 CD5E16    OCM2J  CALL OCM0       ;EM:COMPARE RNG OF IP & MOVING SURF
               ;*     JNC OCM2K
1423 CD4316    OCM20  CALL OCMRS      ;FILL IP WITH MOVING SURFACE ID
1426 CD0A24    OCM2N  CALL LDMEM
1429 C30614           JMP OCM2P       ;LOOP FOR ANOTHER IP
142C CD4317    OCM2K  CALL OCMK       ;CHECK FOR STREAK
142F CA0314           JZ OCM2L
1432 3ADC15    OCM2G  LDA PXLB1       ;LOOP FOR ANOTHER EP
1435 E680             ANI 80H         ;CHECK FOR LAST PIXEL/EDGE
1437 CAE313           JZ OCM2B        ;LOOP FOR ANOTHER PIXEL
```

```
143A 3ADA15            LDA SEH5
143D E608              ANI 08          ;CHECK LAST EDGE/SURFACE
143F CAD813            JZ OCM2E        ;LOOP FOR ANOTHER EDGE
1442 00         OCM2X  NOP
                ;OCM2X CALL EPRINT     ;TI
                ;
                ;FILL TRAILING EDGE INTERVENING PIXELS (MODE-3) SUBROUTINE.
                ;RE-ENTRANT. REGISTERS NOT SAVED.FIFO POINTER SAVED
                ;
1443 2A0204     OCM3A  LHLD OCMFIP     ;RESTORE FIFO READ POINTER
1446 22FC51            SHLD PXLFIF-4
1449 3AE111            LDA OCMFIA      ;SET VERTEX FLAG (VF)
144C F680              ORI 80H
144E 32E111            STA OCMFIA
1451 CD2517     OCM3E  CALL OCMEH1     ;ACCESS SEH HEADER FROM FIFO
1454 3AD515     OCM3R  LDA SEH0        ;CHECK FOR NON-DRAW AND NON-FILL FLAGS
1457 E602              ANI 02          ;LATER 06
1459 C2ED14            JNZ OCM3X
145C CD2B17     OCM3B  CALL OCMEH      ;ACCESS PXLB BLOCK FROM FIFO
145F 2AFC51            LHLD PXLFIF-4   ;SAVE PRESENT PIXEL READ POINTER
1462 220404            SHLD OCMFFA
1465 3A0C04     OCM3Q  LDA OPXL        ;PRESERVE FIRST OP FOR MODE-4
1468 320D04            STA OPXL1
146B CDF316            CALL OCMA       ;UPDATE OP BUFFER
146E CD3717     OCM3D  CALL OCMF       ;ACCESS EP FROM PIXEL MEMORY
                ;*     CALL OCMT       ;STORE EP IN OCM BUFFER
1471 7A                MOV A.D         ;CHECK N1N0 (EP) = 0
1472 E60C              ANI 0CH
1474 C2D714            JNZ OCM3G
1477 7A                MOV A.D         ;CHECK P1P0 (EP) > 01 => 10
1478 E602              ANI 02H
147A C2D114            JNZ OCM3K
147D 3AE111            LDA OCMFIA      ;RESET VERTEX FLAG (VF)
1480 E67F              ANI 7FH
1482 32E111            STA OCMFIA
1485 3AFF03            LDA EGENK6      ;STORE IV CONDITION FOR P-EDGE PXL
1488 E6FE              ANI 0FEH
148A 32FF03            STA EGENK6
148D CDC414            CALL OCM3T
1490 CD5116     OCM3L  CALL OCMP       ;INITIALIZE I/O PIXEL ADDRESS
1493 CD6117     OCM3P  CALL OCIN       ;ACCESS IP
1496 7A                MOV A.D         ;CHECK N1N0.P1P0 (IP) = 0
1497 E60F              ANI 0FH
1499 C2D714            JNZ OCM3G
149C 7A                MOV A.D         ;CHECK C2C1C0 (IP) = 0
149D E670              ANI 70H
149F C2CF15            JNZ OCM3H       ;EM.CHECK FOR INTERVENING PIXEL EDGE
14A2 CDC414            CALL OCM3T      ;STORE IV CONDITION FOR IP
14A5 3AD615     OCM3I  LDA SEH1        ;IF THE IP IS NOT THE MOVING SURFACE.
14A8 0F                RRC             ;THEN LOOP FOR ANOTHER IP
14A9 0F                RRC
14AA AB                XRA E
14AB E60F              ANI IDMSK1
14AD C29314            JNZ OCM3P
14B0 3A0C04     OCM3M  LDA OPXL        ;TEST N-FLAG OF OP
14B3 E640              ANI 40H
```

```
14B5 C2D714          JNZ OCM3G
14B8 3A0C04          LDA OPXL        ;FILL IP WITH OP.THEN LOOP
14BB CD4816          CALL OCMR2      ;FILL IP WITH MOVING SURFACE ID
14BE CD0A24          CALL LDMEM
14C1 C39314          JMP OCM3P       ;LOOP FOR ANOTHER IP
14C4 7B      OCM3T   MOV A.E         ;STORE IV CONDITION
14C5 E6C0            ANI 0C0H
14C7 C8              RZ
14C8 3AFF03          LDA EGENK6
14CB F601            ORI 01
14CD 32FF03          STA EGENK6
14D0 C9              RET
14D1 CD4317  OCM3K   CALL OCMK       ;CHECK FOR STREAK
14D4 CA9014          JZ OCM3L
14D7 3ADC15  OCM3G   LDA PXLB1       ;LOOP FOR ANOTHER EDGE PIXEL
14DA E680            ANI 80H         ;CHECK FOR LAST PIXEL/EDGE
14DC CA5C14          JZ OCM3B        ;LOOP FOR ANOTHER PIXEL
14DF 3ADA15          LDA SEH5
14E2 E608            ANI 08          ;CHECK LAST EDGE/PIXEL
14E4 CA5114          JZ OCM3E        ;LOOP FOR ANOTHER EDGE
14E7 3A0D04  OCM3C   LDA OPXL1       ;RESTORE  OUTSIDE PIXEL
14EA 320C04          STA OPXL
14ED 00      OCM3X   NOP
             ;OCM3X  CALL EPRINT     ;TI
             ;
             ;FILL P-EDGE PIXELS (MODE-4) SUBROUTINE. RE-ENTRANT.
             ;REG. NOT SAVED. FIFO POINTER ADVANCED
             ;
14EE 2A0204  OCM4A   LHLD OCMFIP     ;RESTORE FIFO READ POINTER
14F1 22FC51          SHLD PXLFIF-4
14F4 CD2517  OCM4E   CALL OCMEH1     ;ACCESS SEH HEADER FORM FIFO
14F7 3AD515  OCM4R   LDA SEH0        ;CHECK FOR NON-DRAW FLAG
14FA E602            ANI 02
14FC C27C15          JNZ OCM4X       ;EXIT ON NZ.MS DELETES SURF FROM FIFO
14FF CD2B17  OCM4B   CALL OCMEH      ;ACCESS PXLB BLOCK FROM FIFO
1502 2AFC51          LHLD PXLFIF-4   ;SAVE PRESENT PIXEL READ POINTER
1505 220404          SHLD OCMFFA
1508 CD3717  OCM4D   CALL OCMF       ;ACCESS EP FROM PIXEL MEMORY
150B 7B              MOV A.E         ;CHECK V1V0 (EP)
150C E6C0            ANI 0C0H
150E C21715          JNZ OCM4H
1511 CDF715          CALL OCMS       ;DECR C2C1C0 (EP) IF P1P0 NOT ZERO
1514 C36515          JMP OCM4W
1517 7A      OCM4H   MOV A.D         ;CHECK C2C1C0 = 1 (EP)
1518 E670            ANI 70H
151A EE10            XRI 10H
151C CA4915          JZ OCM4L
151F CDF715  OCM4M   CALL OCMS       ;DECR C2C1C0 (EP) IF P1P0 NOT ZERO
1522 3AD615          LDA SEH1        ;CHECK FOR IP BEING MOV.SURF.
1525 0F              RRC
1526 0F              RRC
1527 E60F            ANI IDMSK1      ;MOVING SURFACE ID TO H
1529 67              MOV H.A
152A CD7A16          CALL OCMT       ;BUFFER EP IN OCM BUFFER
152D CD5116          CALL OCMP       ;FETCH IP
1530 CD6117          CALL OCIN
```

```
1533 7B                MOV A.E
1534 E60F              ANI IDMSK1
1536 BC                CMP H            :COMPARE ID'S OF IP AND MOV.SURF.
1537 C26515            JNZ OCM4W
153A CD8716   OCM4N    CALL OCMU        :FETCH PIXEL FROM OCM BUFFER
153D CD1D16            CALL OCMV        :DEC. V1V0 (EP) IF P1P0 NOT ZERO
1540 E6C0              ANI 0C0H         :CHECK V1V0 (EP) = 0
1542 CA5115            JZ OCM4S
1545 00                NOP              :EM. SET Q1 FLAG (EP)
1546 C36515            JMP OCM4W
1549 7A       OCM4L    MOV A.D          :CLEAR C2C1C0 (EP)
154A E68F              ANI 8FH
154C 57                MOV D.A
154D 7B                MOV A.E          :CLEAR V1V0 (EP)
154E E63F              ANI 3FH
1550 5F                MOV E.A
1551 CD7A16   OCM4S    CALL OCMT        :BUFFER P-PIXEL IN OCM BUFFER
1554 CD5116            CALL OCMP        :FETCH OP
1557 CDB017            CALL OCOUT       :LATER. TEST FOR VISIBLE EDGE AND LOOP--
155A 7B                MOV A.E          :FILL P-EDGE PIXEL WITH OP ID
155B E60F              ANI IDMSK1
155D 67                MOV H.A
155E CD8716            CALL OCMU        :FETCH P-EDGE PIXEL  FROM OCM BUFFER
1561 CD4B16            CALL OCMR1       :FILL IP WITH SURFACE IN H
1564 00                NOP              :EM. CLEAR Q1-FLAG (EP)
1565 7A       OCM4W    MOV A.D          :CLEAR P1P0 (EP)
1566 E6FC              ANI 0FCH
1568 57                MOV D.A
1569 CD0A24            CALL LDMEM       :STORE UPDATED EDGE PIXEL IN PXL MEMORY
156C 3ADC15   OCM4G    LDA PXLB1        :LOOP FOR ANOTHER EDGE PIXEL
156F E680              ANI 80H          :CHECK FOR LAST PIXEL/EDGE
1571 CAFF14            JZ OCM4B         :LOOP FOR ANOTHER PIXEL
1574 3ADA15            LDA SEH5
1577 E608              ANI 08           :CHECK LAST EDGE/SURFACE
1579 CAF414            JZ OCM4E         :LOOP FOR ANOTHER EDGE
157C 00       OCM4X    NOP
              :OCM4X   CALL EPRINT      :TI
              :
              :ERASE N-EDGES (MODE-5) SUBROUTINE. RE-ENTRANT.
              :REG.NOT SAVED. FIFO POINTER ADVANCED
              :
157D 2A0004   OCM5A    LHLD OCMFIN      :RESTORE FIFO READ POINTER
1580 22FC51            SHLD PXLFIF-4
1583 CD2517   OCM5E    CALL OCMEH1      :ACCESS SEH HEADER FROM FIFO
1586 3AD515   OCM5R    LDA SEH0         :CHECK FOR NON-DRAW FLAG
1589 E602              ANI 02
158B C2B215            JNZ OCM5G        :ADV FIFO PNTR TO NEXT SURF IF NZ
158E CD2B17   OCM5B    CALL OCMEH       :ACCESS PXLB BLOCK FROM FIFO
1591 2AFC51            LHLD PXLFIF-4    :SAVE PRESENT PIXEL READ POINTER
1594 220404            SHLD OCMFFA
1597 CD3717   OCM5D    CALL OCMF        :ACCESS EP FROM PIXEL MEMORY
159A CD2A16            CALL OCMV3       :INCR V1V0 (EP) IF N1N0 NOT ZERO
159D CD0416            CALL OCMS3       :INCR C2C1C0 (EP) IF N1N0 NOT ZERO
15A0 7A                MOV A.D          :CLEAR N1N0 (EP)
15A1 E6F3              ANI 0F3H
15A3 57                MOV D.A
```

```
15A4 7B                 MOV A.E         :EM.LOAD WEIGHT FOR SMOOTHED EDGE
15A5 E6F0               ANI IDMSK2
15A7 5F                 MOV E.A         :EM
15A8 3ADB15             LDA PXLB0       :EM. ACCESS WEIGHT (0 TO BH) ONLY
                                        :NO CODES (CH TO FH)
15AB E60F               ANI IDMSK1      :EM
15AD B3                 ORA E           :EM
15AE 5F                 MOV E.A
15AF CD0A24             CALL LDMEM
15B2 3ADC15    OCM5G    LDA PXLB1       :LOOP FOR ANOTHER EDGE PIXEL
15B5 E680               ANI 80H         :CHECK FOR LAST PIXEL/EDGE
15B7 CA8E15             JZ OCM5B        :LOOP FOR ANOTHER PIXEL
15BA 3ADA15             LDA SEH5
15BD E608               ANI 08          :CHECK LAST EDGE/SURFACE
15BF CA8315             JZ OCM5E        :LOOP FOR ANOTHER EDGE
15C2 CD6218             CALL OCMSUR2    :LOAD HEX SURFACE TABLE
15C5 CDE115             CALL EPRINT     :TI
15C8 CD3118             CALL OCMSUR1    :LOAD ORIGINAL SURFACE TABLE
15CB C9        OCM5X    RET
               ;
               ;JUMPS
               ;-----
15CC C30614    OCM2H    JMP OCM2P       :EM.CHECK FOR INTERVENING PIXEL EDGE
15CF C39314    OCM3H    JMP OCM3P       :EM.CHECK FOR INTERVENING PIXEL EDGE
15D2 C36C15    OCM4K    JMP OCM4G       :TI.N/P FLAG IN SAME PIXEL. SPECIAL OPS
               ;
               ;TABLES
               ;------
               ;SURFACE/EDGE HEADER TABLE
15D5 00        SEH0     DB 0
15D6 00        SEH1     DB 0
15D7 00        SEH2     DB 0
15D8 00        SEH3     DB 0
15D9 00        SEH4     DB 0
15DA 00        SEH5     DB 0
               ;
               ;PIXEL BLOCK TABLE
15DB 00        PXLB0    DB 0
15DC 00        PXLB1    DB 0
15DD 00        PXLB2    DB 0
15DE 00        PXLB3    DB 0
15DF 00        PXLB4    DB 0
15E0 00        PXLB5    DB 0
               ;
               ;SUBROUTINES
               ;-----------
15E1 CD8823    EPRINT   CALL PRINT      :TI
15E4 C9                 RET             :TI
               ;
               ;CLEAR TABLES
15E5 AF        SPCL18   XRA A           :CLEAR 18-BYTE TABLE
15E6 47                 MOV B.A
15E7 3E12               MVI A.18
15E9 C3F015             JMP SPCL1
15EC AF        SPCL6    XRA A           :CLEAR 6-BYTE TABLE
15ED 47                 MOV B.A
```

```
15EE 3E06                    MVI A.06
15F0 70          SPCL1       MOV M.B
15F1 3D                      DCR A
15F2 23                      INX H
15F3 C2F015                  JNZ SPCL1
15F6 C9                      RET
                 ;
                 ;INC./DEC. C2C1C0
                 ;
15F7 7A          OCMS        MOV A.D            ;CHECK FOR P1P0=0. CONSERVE C2C1C0
15F8 E603                    ANI 03
15FA C8                      RZ                 ;DON'T DEC C2C1C0 IF P1P0=0
15FB CD1516                  CALL OCMS2         ;DEC. C2C1C0
15FE C8                      RZ                 ;DON'T DEC C2C1C0 IF ZERO
15FF D610                    SUI 10H
1601 B5          OCMS4       ORA L
1602 57                      MOV D.A
1603 C9                      RET
                 ;
1604 7A          OCMS3       MOV A.D            ;CHECK FOR N1N0=0. CONSERVE C2C1C0
1605 E60C                    ANI 0CH
1607 C8                      RZ                 ;DON'T INC C2C1C0 IF N1N0=0
1608 CD1516                  CALL OCMS2         ;INC. C2C1C0
160B 67                      MOV H.A
160C EE70                    XRI 70H
160E C8                      RZ                 ;DON'T INC C2C1C0 IF MAX
160F 7C                      MOV A.H
1610 C610                    ADI 10H
1612 C30116                  JMP OCMS4
                 ;
1615 7A          OCMS2       MOV A.D            ;INC./DEC. C2C1C0
1616 E68F                    ANI 8FH
1618 6F                      MOV L.A
1619 7A                      MOV A.D
161A E670                    ANI 70H
161C C9                      RET
                 ;
                 ;INC./DEC. V1V0
                 ;
161D 7A          OCMV        MOV A.D            ;CHECK FOR P1P0=0. CONSERVE V1V0
161E E603                    ANI 03
1620 C8                      RZ                 ;DON'T DEC V1V0 IF P1P0=0
1621 CD3B16                  CALL OCMV2         ;DEC. V1V0
1624 C8                      RZ                 ;DON'T DEC V1V0 IF ZERO
1625 D640                    SUI 40H
1627 B5          OCMV4       ORA L
1628 5F                      MOV E.A
1629 C9                      RET
                 ;
162A 7A          OCMV3       MOV A.D            ;CHECK FOR N1N0=0. CONSERVE V1V0
162B E60C                    ANI 0CH
162D C8                      RZ                 ;DON'T INC V1V0 IF N1N0=0
162E CD3B16                  CALL OCMV2         ;INC.V1V0
1631 67                      MOV H.A
1632 EEC0                    XRI 0C0H
1634 C8                      RZ                 ;DON'T INC V1V0 IF MAX
```

```
1635 7C                  MOV A.H
1636 C640                ADI 40H
1638 C32716              JMP OCMV4
                ;
163B 7B         OCMV2    MOV A.E          ;INC./DEC. V1V0
163C E63F                ANI 3FH
163E 6F                  MOV L.A
163F 7B                  MOV A.E
1640 E6C0                ANI 0C0H
1642 C9                  RET
                ;
                ;FILL IP WITH SURFACE IN H
1643 3AD615     OCMR5    LDA SEH1         ;MOVING SURFACE ID TO H (OVERWRITES H)
1646 0F                  RRC
1647 0F                  RRC
1648 E60F       OCMR2    ANI IDMSK1
164A 67                  MOV H.A
164B 7B         OCMR1    MOV A.E          ;FILL IP WITH SURFACE IN H
164C E6F0                ANI IDMSK2
164E B4                  ORA H
164F 5F                  MOV E.A
1650 C9                  RET
                ;
1651 3ADF15     OCMP     LDA PXLB4        ;INITIALIZE I/O PIXEL BUFFER
1654 320604              STA OCMXS
1657 3AE015              LDA PXLB5
165A 320704              STA OCMYS
165D C9                  RET
                ;
165E 00         OCMQ     NOP              ;EM. COMPARE RANGES OF EP/IP AND
165F C9                  RET              ;MOVING SURFACE
                ;
1660 7A         OCMB     MOV A.D          ;LOAD REG DE INTO PXLB2.3
1661 32DD15              STA PXLB2
1664 7B                  MOV A.E
1665 32DE15              STA PXLB3
1668 C9                  RET
                ;
1669 3ADD15     OCMD     LDA PXLB2        ;LOAD REG DE WITH PXLB2.3
166C 57                  MOV D.A
166D 3ADE15              LDA PXLB3
1670 5F                  MOV E.A
1671 3ADF15              LDA PXLB4        ;LOAD REG BC WITH PXLB4.5
1674 47                  MOV B.A
1675 3AE015              LDA PXLB5
1678 4F                  MOV C.A
1679 C9                  RET
                ;
167A E5         OCMT     PUSH H           ;BUFFER PIXEL WORD
167B 210804              LXI H.PXLXS
167E 70                  MOV M.B
167F 23                  INX H
1680 71                  MOV M.C
1681 23                  INX H
1682 72                  MOV M.D
1683 23                  INX H
```

```
1684 73               MOV M.E
1685 E1               POP H
1686 C9               RET
               ;
1687 E5        OCMU   PUSH H          ;FETCH BUFFERED PIXEL WORD
1688 210804           LXI H.PXLXS
168B 46               MOV B.M
168C 23               INX H
168D 4E               MOV C.M
168E 23               INX H
168F 56               MOV D.M
1690 23               INX H
1691 5E               MOV E.M
1692 E1               POP H
1693 C9               RET
               ;
1694 E1        ERROR1 POP H           ;ERROR ROUTINE. RETURN ADDRESS IN HL
                                      ;PUT BREAKPOINT AT ERROR2 AND MONITOR HL
1695 22FD03           SHLD EGENK4     ;ALTERNATELY. MONITOR EGENK4
1698 C3BC22    ERROR2 JMP RESTRT      ;WARM BOOT
               ;
               ;SUBROUTINE.LOAD A TABLE FROM FIFO. RE-ENTRANT.
               ;REGISTERS NOT SAVED
               ;
169B CD6B21    EICD   CALL FIFRD      ;NUMBER OF WORDS ARE IN A.
169E DC9416           CC ERROR1
16A1 3D               DCR A
16A2 E5               PUSH H
16A3 2AFD03           LHLD EGENK4     ;FETCH TABLE START ADDRESS
16A6 71               MOV M.C
16A7 23               INX H
16A8 70               MOV M.B
16A9 23               INX H
16AA 22FD03           SHLD EGENK4
16AD E1               POP H
16AE B7               ORA A           ;TEST A FOR ZERO
16AF C29B16           JNZ EICD        ;LOOP FOR NEXT WORD FROM FIFO
16B2 C9               RET
               ;
               ;SUBROUTINE.LOAD A TABLE INTO FIFO. RE-ENTRANT.
               ;REGISTERS NOT SAVED.
               ;
16B3 E5        EICU   PUSH H          ;FIFO ADDRESS IN H.L;NO.OF WORDS IN A.
16B4 2AFD03           LHLD EGENK4     ;TABLE ADDRESSED IN EGEN4.5
16B7 4E               MOV C.M
16B8 23               INX H
16B9 46               MOV B.M
16BA 23               INX H
16BB 22FD03           SHLD EGENK4
16BE E1               POP H
16BF CD4121           CALL FIFWR
16C2 DC9416           CC ERROR1
16C5 3D               DCR A
16C6 C8               RZ              ;TEST A FOR ZERO TO RETURN
16C7 C3B316           JMP EICU        ;LOOP FOR NEXT WORD INTO FIFO
               ;
```

```
16CA 21FD03     EICF7   LXI H.EGENK4      :ADDRESS OF EGEN TABLE INTO EGENK4
16CD 11EE03             LXI D.EGENYS
16D0 73                 MOV M.E
16D1 23                 INX H
16D2 72                 MOV M.D
16D3 3E05               MVI A.05          :5-WORDS
16D5 C9                 RET
                :
16D6 21FD03     EICF8   LXI H.EGENK4      :ADDRESS OF EPOB TABLE INTO EGENK4
16D9 11E803             LXI D.IPOBXS
16DC 73                 MOV M.E
16DD 23                 INX H
16DE 72                 MOV M.D
16DF C9                 RET
                :
16E0 21FD03     EICFA   LXI H.EGENK4      :LOAD PXLB TABLE START ADDRESS
16E3 11DB15             LXI D.PXLB0
16E6 73         EICFB   MOV M.E
16E7 23                 INX H
16E8 72                 MOV M.D
16E9 C9                 RET
16EA 21FD03     EICF9   LXI H.EGENK4      :LOAD SEH TABLE START ADDRESS
16ED 11D515             LXI D.SEH0
16F0 C3E616             JMP EICFB
                :
                :FIND PROPER OUTSIDE PIXEL ID
16F3 CD5116     OCMA    CALL OCMP         :INITIALIZE I/O PIXEL ADDRESS
16F6 CDB017             CALL OCOUT        :ACCESS OUTSIDE PIXEL
16F9 7B                 MOV A.E           :CHECK FOR VISIBLE EDGE FLAG
16FA E6C0               ANI 0C0H
16FC C0                 RNZ               :A IS NON-ZERO
16FD 7B                 MOV A.E           :BUFFER THIS PROPER OUTSIDE PIXEL
16FE E60F               ANI IDMSK1
1700 F680               ORI 80H           :SET BUFFER FULL FLAG
1702 5F                 MOV E.A
1703 7A                 MOV A.D           :PACK N-FLAG
1704 E60C               ANI 0CH
1706 7B                 MOV A.E
1707 CA0C17             JZ OCMA1
170A F640               ORI 40H
170C 320C04     OCMA1   STA OPXL
170F C9                 RET
                :
1710 CDD616     OCME    CALL EICF8        :SETUP IPOB TABLE
1713 210052             LXI H.PXLFIF
1716 3E03       OCME2   MVI A.03
1718 CD9B16             CALL EICD         :LOAD IPOB FROM FIFO
171B C9                 RET
                :
171C CDD616     OCME1   CALL EICF8        :SETUP IPOB TABLE
171F 210052             LXI H.PXLFIF
1722 C31617             JMP OCME2
                :
1725 CDEA16     OCMEH1  CALL EICF9        :SETUP SEH TABLE
1728 C32E17             JMP OCMEH2
172B CDE016     OCMEH   CALL EICFA        :SETUP PXLB TABLE
```

```
172E 210052    OCMEH2  LXI H.PXLFIF
1731 3E03              MVI A.03
1733 CD9B16            CALL EICD         :LOAD TABLE FROM FIFO
1736 C9                RET
               :
1737 3ADF15    OCMF    LDA PXLB4         :ACCESS EDGE PIXEL FROM PIXEL MEMORY
173A 47                MOV B.A
173B 3AE015            LDA PXLB5
173E 4F                MOV C.A
173F CD2B24            CALL RDMEM
1742 C9                RET
               :
               :COMPARE OBJECT FOR EF AND EP/IP PIXELS
               :*OCMF1 LHLD SURFM0      :IP WAS LAST PIXEL ACCESSED.INTO SURFM-
               :*      LDA SURFM0        :TI. OBJECT ID IS IN SURFM0
               :*      RLC               :END AROUND SHIFT
               :*      RLC
               :*      RLC
               :*      XRA L
               :*      ANI 07            :TI.ASSUME MASK FOR OBJECT COMPARISON
               :*      RET               :RESULTS OF COMPARISON IN A
               :
               :CHECK FOR A STREAK
1743 3AE111    OCMK    LDA OCMFIA        :CHECK VERTEX FLAG
1746 E680              ANI 80H
1748 3AD515            LDA SEH0
174B CA5117            JZ OCMK1
174E E620              ANI 20H           :CHECK SV-FLAG
1750 C9                RET
1751 E610      OCMK1   ANI 10H           :CHECK EV-FLAG
1753 C9                RET
               :
1754 3ADC15    OCML    LDA PXLB1         :EM,SMOOTHING EMULATED WITH S
1757 E607              ANI 07
1759 00                NOP               :EM
175A 7B                MOV A.E
175B E6F0              ANI IDMSK2
175D F605              ORI 05            :PACK AN S
175F 5F                MOV E.A
1760 C9                RET
               :
               :RE-ENTRANT SUBROUTINE. COMPUTE UNIDIRESTIONAL (HORIZ).
               :START WITH BORDER PIXEL IN OCM BUFFER. FINISH WITH INSIDE
               :PIXEL ADDRESS IN B&C AND COLOR/FLAGS IN D&E
               :
               :OCINU  LDA SEH5          :CHECK YNS TO INC/DEC XS
               :-----  ANI 20H
               :-----  LDA OCMXS
               :------ JNZ OCINU3
               :------ INR A             :INC XS ON PLUS Y
               :------ JMP OCIN5
               :OCINU3 DCR A             :DEC XS ON MINUS Y
               :------ JMP OCIN5:
               :RE-ENTRANT SUBROUTINE. COMPUTE INSIDE PIXEL ADDRESS.
               :START WITH BORDER PIXEL IN OCM BUFFER. FINISH WITH
               :INSIDE PIXEL ADDRESS IN D&C AND COLOR/FLAGS IN D&E
```

```
                      ;
1761 3ADA15   OCIN    LDA SEH5
1764 E610             ANI 10H         ;CHECK FS
1766 3ADA15           LDA SEH5        ;CHECK XNS,YNS
1769 CA8117           JZ OCIN1
176C E640             ANI 40H         ;CHECK XNS
176E 3A0704           LDA OCMYS       ;INC/DEC YS
1771 CA9517           JZ OCIN2
1774 3C       OCIN7   INR A           ;INC YS
1775 4F       OCIN4   MOV C,A         ;YS+-1 TO C AND TO OCMYS
1776 320704           STA OCMYS
1779 3A0604           LDA OCMXS
177C 47               MOV B,A         ;XS TO B
177D CD2B24   OCIN8   CALL RDMEM      ;B AND C REGISTERS SAVED
1780 C9               RET
1781 E620     OCIN1   ANI 20H         ;CHECK YNS
1783 3A0604           LDA OCMXS       ;INC/DEC XS
1786 CAA117           JZ OCIN3
1789 3D       OCIN6   DCR A           ;DEC XS
178A 47       OCIN5   MOV B,A         ;XS +-1 TO B AND TO OCMXS
178B 320604           STA OCMXS
178E 3A0704           LDA OCMYS
1791 4F               MOV C,A
1792 C37D17           JMP OCIN8
1795 3D       OCIN2   DCR A           ;DEC YS
1796 C37517           JMP OCIN4
1799 E620     OCOUT1  ANI 20H         ;CHECK YNS
179B 3A0604           LDA OCMXS       ;INC/DEC XS
179E CA8917           JZ OCIN6
17A1 3C       OCIN3   INR A           ;INC XS
17A2 C38A17           JMP OCIN5
              ;
              ;RE-ENTRANT SUBROUTINE.COMPUTE OUTSIDE ADDRESS.START WITH
              ;BORDER PIXEL IN OCM BUFFER. FINISH WITH OUTSIDE PIXEL
              ;ADDRESS IN B&C AND COLOR/FLAGS IN D&E
              ;
              ;OUTPUT PIXEL DURING EDGE PROCESSING
17A5 3AF603   OCOUT4  LDA EGENF7      ;CHECK FS
17A8 E610             ANI 10H
17AA 3AF603           LDA EGENF7      ;CHECK XNS YNS
17AD C3B817           JMP OCOUT2
              ;OUTPUT PIXEL DURING OCCULTING PROCESSING
17B0 3ADA15   OCOUT   LDA SEH5
17B3 E610             ANI 10H         ;CHECK FS
17B5 3ADA15           LDA SEH5        ;CHECK XNS YNS
17B8 CA9917   OCOUT2  JZ OCOUT1
17BB E640             ANI 40H         ;CHECK XNS
17BD 3A0704           LDA OCMYS       ;INC/DEC YS
17C0 C29517           JNZ OCIN2       ;DEC YS
17C3 C37417           JMP OCIN7       ;INC YS
              ;
              ;
              ;PRINT A FLAG FIELD FOR EACH PIXEL IN 1/4 FRAME.
              ;START WITH IP.^P.SELECT P IN SYSTEM.BREAKPOINT AT TESTRT.
              ;G.TESTP1
              ;
```

```
17C6 ØØ         TESTP1  NOP
                :------ CALL PRINT      :PRINT OLD SURFACE ID'S
17C7 CD8218             CALL OCMSUR2    :LOAD HEX SURFACE TABLE
17CA CD8823             CALL PRINT      :PRINT NEW SURFACE ID'S
                                        :PRINT V1VØ
17CD CDC518             CALL TESTP4     :INITIALIZE A NEW FIELD
17DØ CD2B24     TESTPC  CALL RDMEM
17D3 7B                 MOV A.E
17D4 CDC918             CALL TESTP5     :DISPLAY V1VØ
17D7 CDØA24             CALL LDMEM
17DA CDD318             CALL TESTP6     :EXIT LOGIC
17DD C2DØ17             JNZ TESTPC      :LOOP FOR ANOTHER PIXEL
17EØ CD8823             CALL PRINT
                                        :PRINT PV C2C1CØ
17E3 CDC518             CALL TESTP4     :INITIALIZE A NEW FIELD
17E6 CD2B24     TESTP3  CALL RDMEM
17E9 7A                 MOV A.D         :DISPLAY PV C2C1CØ
17EA ØF                 RRC
17EB ØF                 RRC
17EC ØF                 RRC
17ED ØF                 RRC
17EE E6ØF               ANI ØFH
17FØ 5F                 MOV E.A
17F1 CDØA24             CALL LDMEM
17F4 CDD318             CALL TESTP6     :EXIT LOGIC
17F7 C2E617             JNZ TESTP3      :LOOP FOR ANOTHER PIXEL
17FA CD8823             CALL PRINT
                                        :PRINT P1PØ
17FD CDC518             CALL TESTP4     :INITIALIZE A NEW FIELD
18ØØ CD2B24     TESTPA  CALL RDMEM
18Ø3 7A                 MOV A.D         :DISPLAY P1PØ
18Ø4 E6Ø3               ANI Ø3H
18Ø6 5F                 MOV E.A
18Ø7 CDØA24             CALL LDMEM
18ØA CDD318             CALL TESTP6
18ØD C2ØØ18             JNZ TESTPA
181Ø CD8823             CALL PRINT
                                        :PRINT N1NØ
1813 CDC518             CALL TESTP4
1816 CD2B24     TESTPB  CALL RDMEM
1819 7A                 MOV A.D         :DISPLAY N1NØ
181A ØF                 RRC             :2 MSB'S TO LSB'S
181B ØF                 RRC
181C E6Ø3               ANI Ø3
181E 5F                 MOV E.A
181F CDØA24             CALL LDMEM
1822 CDD318             CALL TESTP6
1825 C21618             JNZ TESTPB
1828 CD8823             CALL PRINT
182B CD3118             CALL OCMSUR1    :LOAD INITIAL SURFACE TABLE
182E C38819             JMP TESTRT
                :
                :
1831 3E2E       OCMSUR1 MVI A.'.'       :LOAD COLORS INTO SURFACE MEMORY
1833 32ØØ9Ø             STA SURFAC
1836 3E5Ø               MVI A.'P'
```

```
1838 320190           STA SURFAC+1
183B 3E4E             MVI A,'N'
183D 320290           STA SURFAC+2
1840 3E58             MVI A,'X'
1842 320390           STA SURFAC+3
1845 3E59             MVI A,'Y'
1847 320490           STA SURFAC+4
184A 3E53             MVI A,'S'
184C 320590           STA SURFAC+5
184F 3E49             MVI A,'I'
1851 320690           STA SURFAC+6
1854 3E4F             MVI A,'O'
1856 320790           STA SURFAC+7
1859 3E30             MVI A,'0'          ;LOAD EDGE SMOOTHING SURFACE TABLE
185B 320890           STA SURFAC+8
185E 3E31             MVI A,'1'
1860 320990           STA SURFAC+9
1863 3E32             MVI A,'2'
1865 320A90           STA SURFAC+10
1868 3E33             MVI A,'3'
186A 320B90           STA SURFAC+11
186D 3E34             MVI A,'4'
186F 320C90           STA SURFAC+12
1872 3E35             MVI A,'5'
1874 320D90           STA SURFAC+13
1877 3E36             MVI A,'6'
1879 320E90           STA SURFAC+14
187C 3E37             MVI A,'7'
187E 320F90           STA SURFAC+15
1881 C9               RET

                ;
1882 210090     OCMSUR2 LXI H,SURFAC       ;LOAD HEX SURFACE MEMORY
1885 3E2E             MVI A,'.'
1887 77               MOV M,A
1888 23               INX H
1889 3E31             MVI A,'1'
188B 77               MOV M,A
188C 23               INX H
188D 3E32             MVI A,'2'
188F 77               MOV M,A
1890 23               INX H
1891 3E33             MVI A,'3'
1893 77               MOV M,A
1894 23               INX H
1895 3E34             MVI A,'4'
1897 77               MOV M,A
1898 23               INX H
1899 3E35             MVI A,'5'
189B 77               MOV M,A
189C 23               INX H
189D 3E36             MVI A,'6'
189F 77               MOV M,A
18A0 23               INX H
18A1 3E37             MVI A,'7'
18A3 77               MOV M,A
```

```
18A4 23                 INX H
18A5 3E38               MVI A,'8'
18A7 77                 MOV M,A
18A8 23                 INX H
18A9 3E39               MVI A,'9'
18AB 77                 MOV M,A
18AC 23                 INX H
18AD 3E41               MVI A,'A'
18AF 77                 MOV M,A
18B0 23                 INX H
18B1 3E42               MVI A,'B'
18B3 77                 MOV M,A
18B4 23                 INX H
18B5 3E43               MVI A,'C'
18B7 77                 MOV M,A
18B8 23                 INX H
18B9 3E44               MVI A,'D'
18BB 77                 MOV M,A
18BC 23                 INX H
18BD 3E45               MVI A,'E'
18BF 77                 MOV M,A
18C0 23                 INX H
18C1 3E46               MVI A,'F'
18C3 77                 MOV M,A
18C4 C9                 RET
              ;
              ;INITIALIZE A NEW FIELD
18C5 AF       TESTP4    XRA A              ;LOAD ADDRESS OF FIRST PIXEL
18C6 47                 MOV B,A
18C7 4F                 MOV C,A
18C8 C9                 RET
              ;
18C9 0F       TESTP5    RRC                ;2 MSB'S TO LSB'S
18CA 0F                 RRC
18CB 0F                 RRC
18CC 0F                 RRC
18CD 0F                 RRC
18CE 0F                 RRC
18CF E603               ANI 03H
18D1 5F                 MOV E,A
18D2 C9                 RET
              ;
              ;EXIT LOGIC
18D3 78       TESTP6    MOV A,B            ;CHECK FOR X=63D
18D4 D63F               SUI 63
18D6 C2E118             JNZ TESTP7
18D9 47                 MOV B,A            ;END OF THE LINE. 0=>X
18DA 79                 MOV A,C            ;CHECK FOR Y=31D
18DB D61F               SUI 31
18DD C2E318             JNZ TESTP8
18E0 C9                 RET                ;END OF FRAME. A=0
18E1 04       TESTP7    INR B              ;NOT END OF LINE. X+1=>X
18E2 C9                 RET                ;A IS NOT ZERO
18E3 0C       TESTP8    INR C              ;NOT LAST LINE.Y+1=>Y
18E4 C9                 RET                ;A IS NOT ZERO
              ;
```

```
                 ;DISPLAY FLAG FIELDS IN OUTSIDE PIXELS
18E5 00          TESTR1  NOP               ;DISPLAY P-EDGE FLAGS
                 ;------ CALL PRINT        ;PRINT OLD SURFACE ID'S
18E6 CD8218              CALL OCMSUR2      ;LOAD SURFACE TABLE
18E9 2A0204      TESTRA  LHLD OCMFIP       ;RESTORE FIFO READ POINTER
18EC 22FC51              SHLD PXLFIF-4
18EF CD2517      TESTRE  CALL OCMEH1
18F2 CD2B17      TESTRB  CALL OCMEH        ;ACCESS PIXEL FROM PXPFIF
18F5 CD3A19              CALL TESTRK       ;PROCESS PIXEL
18F8 3ADC15      TESTRG  LDA PXLB1
18FB E680                ANI 80H
18FD CAF218              JZ TESTRB
1900 3ADA15              LDA SEH5
1903 E608                ANI 08
1905 CAEF18              JZ TESTRE
1908 CD8823              CALL PRINT
190B C38819              JMP TESTRT
                 ;
190E 00          TESTR2  NOP               ;DISPLAY N-EDGE FLAGS
                 ;------ CALL PRINT        ;PRINT OLD SURFACE ID'S
190F CD8218              CALL OCMSUR2      ;LOAD SURFACE TABLE
1912 2A0004      TESTRL  LHLD OCMFIN       ;RESTORE FIFO READ POINTER
1915 22FC51              SHLD PXLFIF-4
1918 CD2517      OCMTE   CALL OCMEH1       ;ACCESS SEH HEADER FROM FIFO
191B CD2B17      OCMTB   CALL OCMEH        ;ACCESS PXLB BLOCK FORM FIFO
191E CD3A19              CALL TESTRK
1921 3ADC15      TESTRN  LDA PXLB1
1924 E680                ANI 80H
1926 CA1B19              JZ OCMTB
1929 3ADA15              LDA SEH5
192C E608                ANI 08
192E CA1819              JZ OCMTE
1931 CD8823              CALL PRINT
1934 CD3118              CALL OCMSUR1      ;LOAD INITIAL SURFACE TABLE
1937 C38819              JMP TESTRT
                 ;
193A CD3717      TESTRK  CALL OCMF         ;ACCESS EDGE PIXEL FROM PIXEL MEMORY
193D CD7A16              CALL OCMT         ;BUFFER PIXEL WORD
1940 CD5116              CALL OCMP         ;INITIALIZE I/O PIXEL ADDRESS
1943 CDB017              CALL OCOUT        ;FETCH OUTSIDE PIXEL
1946 3A0B04              LDA PXLCF         ;DISPLAY ID
1949 E60F                ANI IDMSK1
194B CD7219              CALL TESTRC
194E CDB017              CALL OCOUT
1951 3A0B04              LDA PXLCF         ;DISPLAY V1V0
1954 CD7C19              CALL TESTRD       ;PACK AND LOAD PIXEL WORD
1957 CDB017              CALL OCOUT        ;FETCH ANOTHER OUTSIDE PIXEL
195A 3A0A04              LDA PXLF7         ;DISPLAY N1N0P1P0
195D E60F                ANI 0FH
195F CD7219              CALL TESTRC       ;PACK AND LOAD PIXEL WORD
1962 CDB017              CALL OCOUT
1965 3A0A04              LDA PXLF7         ;DISPLAY PV C2C1C0
1968 0F                  RRC
1969 0F                  RRC
196A 0F                  RRC
196B 0F                  RRC
```

```
1960 E60F               ANI 0FH
196E CD7219             CALL TESTRC
1971 C9                 RET
                :
1972 67         TESTRC  MOV H.A
1973 7B                 MOV A.E
1974 E6F0               ANI IDMSK2
1976 B4                 ORA H
1977 5F                 MOV E.A
1978 CD0A24             CALL LDMEM
197B C9                 RET
                :
197C 0F         TESTRD  RRC
197D 0F                 RRC
197E 0F                 RRC
197F 0F                 RRC
1980 0F                 RRC
1981 0F                 RRC
1982 E603               ANI 03H
1984 CD7219             CALL TESTRC
1987 C9                 RET
                :
1988 C9         TESTRT  RET                 ;INSERT A SID BREAKPOINT HERE
                ;
                ;
```

TABLES OF COMPUTER LISTINGS

FIFO MEMORY

```
'P/M MACRO ASSEM 2.0    #001    VIPER-X.  GIL HYATT SYSTEM

                ;*************************************************************
                ;
                ;  FILE: SUB.ASM
                ;
                ;        ORIGIN DATE: NOVEMBER 6,1981
                ;
                ;        REVISION DATE: MAY 10,1983
                ;        REVISION TIME:     18:00
                ;
                ;
FFFF =          TRUE    EQU OFFFFH       ;DEFINE "TRUE"
0000 =          FALSE   EQU NOT TRUE     ;DEFINE "FALSE"
0000 =          JAMES   EQU FALSE        ;SET FOR BARRY'S SYSTEM
6FC0 =          STKPT   EQU 6FC0H
7000 =          STMEM   EQU 7000H
0000 =          BOOT    EQU 0000H
0100 =          BEGIN   EQU 0100H
                        IF JAMES         ;ASSEMBLE FOR JAMES'S SYSTEM
                        TITLE            'VIPER-X.  JAMES CHAN SYSTEM'
                DSIZE   EQU 2043
                DPLINE  EQU 64
                        ELSE             ;ASSEMBLE FOR GIL'S OR BARRY'S SYSTEM
                        TITLE            'VIPER-X.  GIL HYATT SYSTEM'
0BFF =          DSIZE   EQU 0BFFH
0040 =          DPLINE  EQU 0040H
                        ENDIF
6400 =          LOCSUB  EQU 6400H
1000 =          LOCBAR  EQU 1000H
2000 =          LOCGEN  EQU 2000H
3000 =          LOCGIL  EQU 3000H
100C =          START1  EQU 100CH
9000 =          SURFAC  EQU 9000H
7000 =          IMAGE   EQU 7000H
97C0 =          INBUF   EQU 97C0H
109A =          SXSTR1  EQU 109AH
1088 =          SMOTNX  EQU 1088H
1089 =          SMOTNY  EQU 1089H
108A =          SMOTNZ  EQU 108AH
2096 =          GSFLAG  EQU 2096H
2095 =          GCOLOR  EQU 2095H
208B =          GSAXSX  EQU 208BH
6FC1 =          SFWORD  EQU STKPT+1
6FC2 =          DSTART  EQU STKPT+2      ;16 BITS
6FC4 =          STOREX  EQU STKPT+4
6FC5 =          STOREY  EQU STKPT+5
6CFF =          GEOSTK  EQU 6CFFH
4000 =          SURFTB  EQU 4000H        ;SURFACE TABLE ORIGIN (TO 4200H)
5200 =          GPFIF   EQU 5200H        ;MOVING EDGE ENDPOINT FIFO
5800 =          PXPFIF  EQU 5800H        ;P-EDGE PIXEL FIFO (MOVING)
5D00 =          PXNFIF  EQU 5D00H        ;N-EDGE PIXEL FIFO (MOVING)
000F =          IDMSK1  EQU 0FH          ;ID MASK FOR SURFACE MEMORY
00F0 =          IDMSK2  EQU 0F0H
                ;
6400                    ORG LOCSUB
                ;
                ;  GENERAL SUBROUTINE AREA
```

```
CP/M MACRO ASSEM 2.0     #002     VIPER-X.  GIL HYATT SYSTEM

                   ;
                   ;        JUMP TABLE
                   ;
 6400 C38364       FIFWR    JMP XFIFWR
 6403 C3AD64       FIFRD    JMP XFIFRD
 6406 C32C65       RESTRT   JMP XRSTRT
 6409 C33565       OUTTY    JMP XOUTTY
 640C C34465       INTTY    JMP XINTTY
 640F C35765       INPUT    JMP XINPUT
 6412 C37C65       STRBE    JMP XSTRBE
 6415 C38765       INITP    JMP XINITP
 6418 C3AE65       DELAY    JMP XDELAY
 641B C3B765       PRNTO    JMP XPRNTO
 641E C3C665       REFRSH   JMP XREFSH
 6421 C30E66       PRINT    JMP XPRINT
 6424 C36766       PRTCON   JMP XPTCON
 6427 C37466       CRLF     JMP XCRLF
 642A C38166       DBSUB    JMP XDBSUB
 642D C38C66       CURHM    JMP XCURHM
 6430 C39466       LDMEM    JMP XLDMEM
 6433 C3A766       RDMEM    JMP XRDMEM
 6436 C3B166       DISPLY   JMP XDISPY
 6439 C3ED66       CLMEM    JMP XCLMEM
 643C C30B67       BUFFR    JMP XBUFFR
 643F C30E67       STRNG    JMP XSTRNG
 6442 C34467       READI    JMP XREADI
 6445 C34A67       RBUFF    JMP XRBUFF
 6448 C35867       IMADD    JMP XIMADD
 644B C37467       MOTION   JMP XMOTON
 644E C3BF67       CLMOTN   JMP XCLMTN
 6451 C3CB67       LDMOTN   JMP XLDMTN
 6454 C3DE67       MOTCLR   JMP XMOTCL
 6457 C3EA67       SURMEM   JMP XSURMM
 645A C30768       RDSURM   JMP XRDSRM
                   ;
                   ;
 6480                       ORG LOCSUB+80H
                   ;
                   ;
                   ;--------------MOTION VALUE----------------------------------
                   ;
 6480 00           MOTONX   DB 0
 6481 00           MOTONY   DB 0
 6482 00           MOTONZ   DB 0
                   ;
                   ;     FIRST IN FIRST OUT (FIFO) SUBROUTINES
                   ;
                   ;     THESE ROUTINES READ AND WRITE 16 BIT DATA TO OR FROM A
                   ;DEFINED DATA FIFO. THE FIFO IS STRUCTURED AS FOLLOWS:
                   ;
                   ;        BYTE NO            DATA IN 8 BIT BYTE
                   ;       ---------          ----------------------------------
                   ;          A-6              L.S  BYTE OF FIFO MASK
                   ;          A-5              M.S  BYTE OF FIFO MASK
                   ;          A-4              L.S  BYTE OF READ POINTER
                   ;          A-3              M.S  BYTE OF READ POINTER
```

```
CP/M MACRO ASSEM 2.0    #003    VIPER-X.  GIL HYATT SYSTEM

                 ;        A-2          L.S. BYTE OF WRITE POINTER
                 ;        A-1          M.S. BYTE OF WRITE POINTER
                 ;         A           L.S. BYTE OF FIRST DATA WORD
                 ;        A+1          M.S. BYTE OF FIRST DATA WORD
                 ;        A+2          L.S. BYTE OF SECOND DATA WORD
                 ;        A+3          M.S. BYTE OF SECOND DATA WORD
                 ;        A+N          L.S. BYTE OF N TH DATA WORD
                 ;        A+N+1        M.S. BYTE OF N TH DATA WORD
                 ;
                 ;    THE FIFO IS LOCATED IN MEMORY BY ITS SYMBOLIC NAME
                 ;ADDRESS (A).  (AS AN EXAMPLE, THE FIFO IS NAMED TESTFI AND
                 ;THE PROGRAM LOCATES TESTFI AT HEX 5000.)  THE  POINTERS
                 ;ARE INITIALIZED ON POWER UP TO THE VALUE 0 FOR THE READ
                 ;POINTER AND 2 FOR THE WRITE POINTER.  AS EACH DATA WORD
                 ;IS WRITTEN INTO THE FIFO THE POINTER IS INCREMENTED BY TWO.
                 ;AS EACH DATA WORD IS READ FROM THE STACK THE READ POINTER IS
                 ;INCREMENTED BY TWO.  THE SUBROUTINE FOR WRITING THE DATA
                 ;INTO THE FIFO IS "FIFWR" AND THE SUBROUTINE "FIFRD" IS
                 ;USED TO READ DATA FROM THE FIFO.
                 ;
                 ;    THE READ/WRITE ROUTINES ACCESS MEMORY AS FOLLOWS:
                 ;   ---------------------------------------------------
                 ;     WRITE LSBYTE= A + WRITE POINTER       (5002H)*
                 ;     WRITE MSBYTE= A + WRITE POINTER + 1   (5003H)*
                 ;     READ LSBYTE = A + READ POINTER + 2    (5002H)*
                 ;     READ MSBYTE = A + READ POINTER + 3    (5003H)*
                 ;
                 ;    * VALUES ASSUMING A= 5000H FOR FIRST READ WRITE.
                 ;
                 ;    THIS SUBROUTINE IS RE-ENTRANT.  ALL REGISTERS EXCEPT
                 ;"B" AND "C" ARE PRESERVED.  REGISTERS "B" AND "C" ARE THE
                 ;DATA PASSING REGISTERS AND ARE SAVED IN "FIFWR".  "FIFRD"
                 ;RETURNS WITH THE DATA WORD (16 BITS) IN REGISTER "B" AND "C".
                 ;
                 ;    REGISTER     FUNCTION
                 ;    ----------   -------------------------------------
                 ;      H,L      STACK ADDRESS (A)
                 ;       C       LEAST SIGNIFICANT BYTE (8 BITS) OF DATA WORD
                 ;       B       MOST SIGNIFICANT BYTE (8 BITS) OF DATA WORD
                 ;
                 ;
                 ;    FIRST IN FIRST OUT (FIFO) REGISTER SUBROUTINE
                 ;
                 ;    WRITE TO FIFO REGISTER SUBROUTINE
                 ;
6483 F5          XFIFWR  PUSH PSW
6484 D5                  PUSH D
6485 E5                  PUSH H
6486 CDE764              CALL FIFDAT
6489 CD0C65              CALL FIFCOM
648C CAE264              JZ FIFEX2
648F 2A2465              LHLD FIFADD
6492 EB                  XCHG
6493 2A2665              LHLD FIFWRP
6496 19                  DAD D
6497 71                  MOV M,C
```

```
CP/M MACRO ASSEM 2.0     #004     VIPER-X.  GIL HYATT SYSTEM

 6498 23                INX H
 6499 70                MOV M,B
 649A 2A2665            LHLD FIFWRP
 649D 23                INX H
 649E 23                INX H
 649F CD1765            CALL FIMASK
 64A2 EB                XCHG
 64A3 2A2465            LHLD FIFADD
 64A6 2B                DCX H
 64A7 72                MOV M,D
 64A8 2B                DCX H
 64A9 73                MOV M,E
 64AA C3DC64            JMP FIFEX1
                ;
                ;       READ FROM FIFO REGISTER SUBROUTINE
                ;
 64AD F5        XFIFRD  PUSH PSW
 64AE D5                PUSH D
 64AF E5                PUSH H
 64B0 CDE764            CALL FIFDAT
 64B3 EB                XCHG
 64B4 CD0C65            CALL FIFCOM
 64B7 CAE264            JZ FIFEX2
 64BA 2A2465            LHLD FIFADD
 64BD EB                XCHG
 64BE 2A2865            LHLD FIFRDP
 64C1 23                INX H
 64C2 23                INX H
 64C3 CD1765            CALL FIMASK
 64C6 19                DAD D
 64C7 4E                MOV C,M
 64C8 23                INX H
 64C9 46                MOV B,M
 64CA 2A2865            LHLD FIFRDP
 64CD 23                INX H
 64CE 23                INX H
 64CF CD1765            CALL FIMASK
 64D2 EB                XCHG
 64D3 2A2465            LHLD FIFADD
 64D6 2B                DCX H
 64D7 2B                DCX H
 64D8 2B                DCX H
 64D9 72                MOV M,D
 64DA 2B                DCX H
 64DB 73                MOV M,E
 64DC E1        FIFEX1  POP H
 64DD D1                POP D
 64DE F1                POP PSW
 64DF 37                STC
 64E0 3F                CMC
 64E1 C9                RET
 64E2 E1        FIFEX2  POP H
 64E3 D1                POP D
 64E4 F1                POP PSW
 64E5 37                STC
 64E6 C9                RET
```

```
CP/M MACRO ASSEM 2.0     #005     VIPER-X.  GIL HYATT SYSTEM

                  ;
                  ;    FIFO SUBROUTINES
                  ;
                  ;    GET REGISTER HEADER DATA SUBROUTINE
                  ;
 64E7 222465      FIFDAT  SHLD FIFADD
 64EA 2B                  DCX H
 64EB 56                  MOV D,M
 64EC 2B                  DCX H
 64ED 5E                  MOV E,M
 64EE EB                  XCHG
 64EF 222665              SHLD FIFWRP
 64F2 EB                  XCHG
 64F3 2B                  DCX H
 64F4 56                  MOV D,M
 64F5 2B                  DCX H
 64F6 5E                  MOV E,M
 64F7 EB                  XCHG
 64F8 222865              SHLD FIFRDP
 64FB EB                  XCHG
 64FC 2B                  DCX H
 64FD 56                  MOV D,M
 64FE 2B                  DCX H
 64FF 5E                  MOV E,M
 6500 EB                  XCHG
 6501 222A65              SHLD FIFMSK
 6504 2A2865              LHLD FIFRDP
 6507 EB                  XCHG
 6508 2A2665              LHLD FIFWRP
 650B C9                  RET
                  ;
                  ;    16 BIT COMPARE SUBROUTINE
                  ;
 650C 23          FIFCOM  INX H
 650D 23                  INX H
 650E CD1765              CALL FIMASK
 6511 7B                  MOV A,E
 6512 BD                  CMP L
 6513 C0                  RNZ
 6514 7A                  MOV A,D
 6515 BC                  CMP H
 6516 C9                  RET
                  ;
                  ;    16 BIT MASK SUBROUTINE
                  ;
 6517 D5          FIMASK  PUSH D
 6518 EB                  XCHG
 6519 2A2A65              LHLD FIFMSK
 651C 7C                  MOV A,H
 651D A2                  ANA D
 651E 67                  MOV H,A
 651F 7D                  MOV A,L
 6520 A3                  ANA E
 6521 6F                  MOV L,A
 6522 D1                  POP D
 6523 C9                  RET
```

```
CP/M MACRO ASSEM 2.0    #006    VIPER-X.  GIL HYATT SYSTEM

                  ;
                  ;     FIFO STORAGE BUFFER
                  ;
 6524 0000        FIFADD DW 0              ;REGISTER WORD ZERO ADDRESS
 6526 0000        FIFWRP DW 0              ;WRITE POINTER
 6528 0000        FIFRDP DW 0              ;READ POINTER
 652A 0000        FIFMSK DW 0              ;MODULO (M) MASK
                  ;
                  ;  WARM RESTART BACK TO COMMAND
                  ;     THIS ROUTINE ALLOWS A JUMP BACK TO THE COMMAND LEVEL
                  ;WITHOUT CORRECTING THE STACK POINTER.  USED BY THE "ESCAPE"
                  ;KEY, ETC.
                  ;
 652C 31C06F      XRSTRT  LXI SP,STKPT
 652F CD2D64              CALL CURHM
 6532 C30C10              JMP START1
                  ;
```

TABLES OF COMPUTER LISTINGS

APERTURE PROCESSOR

```
[illegible] ASSEMBLER [illegible] VIPER-X, GIL HYATT SYSTEM

                ;
                ;
                ;                                       CONFIDENTIAL
                ;                                       ------------
                ;                                       EXPERIMENTAL
                ;                                       ------------
                ;THIS IS THE DISPLAY EVALUATION PROGRAM FOR THE VIPER-X PROGRAM
                ;
                ;  FILE NAME: GIL.ASM
                ;
                ;          ORIGIN DATE: NOVEMBER 4,1981
                ;
                ;          REVISION DATE. FEBRUARY 11,1982
                ;          REVISION TIME.     20:[illegible]
                ;
                ;
                ;     THIS PROGRAM SIMULATES THE OPERATION OF THE VIPER DISPLAY
                ;IN SOFTWARE.  THE KEYBOARD INPUT IS ASSUMED TO BE THE HOST COM-
                ;PUTER INTERFACE.  THE KEYBOARD PROVIDES INPUTS IN THE FORM OF
                ;SPECIAL PRIMATIVES WHICH CONTROL SIMULATED COLOR COMMANDS AS
                ;WELL AS MOTION, OBJECT SELECTION, AND DISPLAY MENUS.  THE
                ;PROGRAM IS DIVIDED INTO THREE MAIN SECTIONS.  THE FIRST SECTION
                ;IS THE SUBROUTINE ROUTINE LIBRARY.  THE SECOND SECTION IS THE
                ;EXECUTIVE PROGRAM AND THE THIRD IS THE VARIOUS MEMORY
                ;ALLOCATIONS FOR SIMULATION OF SYSTEM REGISTERS AND MEMORY
                ;BLOCKS.
                ;
                ;
FFFF =          TRUE    EQU 0FFFFH      ;DEFINE "TRUE"
0000 =          FALSE   EQU NOT TRUE    ;DEFINE "FALSE"
0000 =          JAMES   EQU FALSE       ;SET FOR GIL'S SYSTEM AND
                                        ;BARRY'S SYSTEM
8F00 =          STKPT   EQU 8F00H
7100 =          STMEM   EQU 7100H
0000 =          BOOT    EQU 0000H
0100 =          BEGIN   EQU 0100H
                        IF JAMES        ;ASSEMBLE FOR JAMES'S SYSTEM
                        TITLE           'VIPER-X.  JAMES [illegible] SYSTEM'
                DSIZE   EQU [illegible]
                DPLINE  EQU 64
                        ELSE            ;ASSEMBLE FOR GIL'S SYSTEM AND
                                        ;BARRY'S SYSTEM
                        TITLE           'VIPER-X. GIL HYATT SYSTEM'
[illegible] =   DSIZE   EQU [illegible]
[illegible] =   DPLINE  EQU [illegible]
                        ENDIF
[illegible] =   LOCBLU  EQU [illegible]
[illegible] =   LOCBAR  EQU [illegible]
[illegible] =   LOCGRN  EQU [illegible]
[illegible] =   LOCGIL  EQU [illegible]
[illegible] =   START   EQU [illegible]
[illegible] =   SEAXEX  EQU [illegible]
[illegible] =   SEAXEY  EQU [illegible]
[illegible] =   SDELTX  EQU [illegible]
[illegible] =   SDELTY  EQU [illegible]
```

```
CP/M MACRO ASSEM 2.0    #002    VIPER-II, SIL HYATT SYSTEM
;
20F6 =          SEFLAG  EQU 20F6H
20F8 =          SCOLOR  EQU 20F8H
6421 =          PRINT   EQU 6421H
6403 =          FIFRD   EQU 6403H
6400 =          FIFWR   EQU 6400H
6430 =          LDMEM   EQU 6430H
6433 =          RDMEM   EQU 6433H
6406 =          RESTRT  EQU 6406H
1003 =          SUBMIT  EQU 1003H
6415 =          INITP   EQU 6415H
6403 =          INTTY   EQU 6403H
6424 =          PRTCON  EQU 6424H
6F01 =          SFWORD  EQU STKPT+1
6F02 =          DSTART  EQU STKPT+2      ;16 BITS
6F04 =          STOREX  EQU STKPT+4
6F05 =          STOREY  EQU STKPT+5
6DFF =          SEGSTK  EQU 6DFFH
4000 =          SURFTB  EQU 4000H        ;SURFACE TABLE ORIGIN (TO 4200H)
5000 =          SPFIF   EQU 5000H        ;MOVING EDGE ENDPOINT FIFO
5400 =          PXLFIF  EQU 5400H        ;MOVING EDGE PIXEL FIFO
000F =          IDMSK1  EQU 0FH          ;ID MASK FOR SURFACE MEMORY
00F0 =          IDMSK2  EQU 0F0H
6437 =          SURMEM  EQU 6437H
100C =          START1  EQU 100CH
6427 =          CRLF    EQU 6427H
14E3 =          FINDPX  EQU 14E3H        ;EQUALITY STATEMENT WILL CHANGE WHEN
                                         ;RELINKING WITH BAR FILE
                ;
0100                    ORG BEGIN
                ;
                ;  ENTRY JUMP
                ;
0100 31006F             LXI SP,STKPT
0103 3E80               MVI A,80H        ;SET 1 ST. PASS FLAG TO "1"
0105 32016F             STA SFWORD       ; IN SYSTEM FLAG BITE
0108 210200             LXI H,2          ;SET FIFO WRITE POINTERS
010B 22FE4F             SHLD SPFIF-2
010E 22FE53             SHLD PXLFIF-2
0111 210000             LXI H,0          ;SET FIFO READ POINTERS AND
0114 22FC4F             SHLD SPFIF-4
0117 22FC53             SHLD PXLFIF-4
011A 22FF6D             SHLD SEGSTK
011D 21FF03             LXI H,3FFH       ;SET FIFO MODULO MASK (1K D)
0120 22FA4F             SHLD SPFIF-6
0123 21FF0F             LXI H,0FFFH      ;SET FIFO MODULO MASK (4K D)
0126 22FA53             SHLD PXLFIF-6    ;MEMORY TO 6400H IS AVAILABLE
                ;
0129 C30910             JMP START        ;START IS THE BEGINING OF THE
                                         ;  INITIALIZATION ROUTINE
                ;*****************************************************************
                ;-----------------------------------------------------------------
                ;  PLACE TEMPORARY PROGRAMS AND SYMBOL TABLES BELOW THIS LINE
                ;-----------------------------------------------------------------
                ;
                ;
                ;
```

```
MCS-8 MACRO ASSEM 2.0    8080    VIPER-1, SOL WATT SYSTEM

                    ;
 012C 00            TEST    NOP
 012D C9            PASS    RET             ;TI. BREAKPOINT FOR LDMEM ROUTINE
                    ;
                    ;
                    ;       BUG TEST ROUTINE
                    ;
                    ;TEST   MVI A,E
                    ;       MVI B,3E
                    ;       MVI C,14
                    ;       MVI D,0
                    ;       MOV E,A
                    ;       CALL LDMEM
                    ;       CALL FINDFX
                    ;       CALL CRLF
                    ;       JMP START1
                    ;
                    ;
 012E CD3064        TLDMEM  CALL LDMEM      ;SINGLE STEP ROUTINE
 0131 C9            TESTXX  RET
 0132 F5                    PUSH PSW        ;TI;KEYBOARD ADVANCE AND T-KEY SHFT
 0133 CD0C64                CALL INTTY      ;TI.TEST LOOKS UP ON KEYBOARD
 0136 FE54                  CPI 'T'         ;TI.CALL TO TEST IF T-KEY IS PRESSED
 0138 CC2C01                CZ TEST         ;TI.PLACE A SII BREAKPOINT AT TEST
 013B F1                    POP PSW         ;TI
 013C CD4001                CALL COUNTN     ;TI.INCREMENT ITERATION COUNTER
 013F C9                    RET
                    ;
 0140 E5            COUNTN  PUSH H
 0141 214F01                LXI H,COUNTL
 0144 34                    INR M
 0145 E1                    POP H
 0146 C9                    RET
 0147 E5            COUNTZ  PUSH H
 0148 214F01                LXI H,COUNTL
 014B 3600                  MVI M,0
 014D E1                    POP H
 014E C9                    RET
 014F 00            COUNTL  DB 0
                    ;
                    ;
                    ;--------------------------------------------------------------
                    ;           END OF TEMPORARY WORK AREA
                    ;--------------------------------------------------------------
                    ;
                    ;**************************************************************
                    ;
 0000                       ORG LOCGIL
                    ;
                    ;       JUMP TABLE
                    ;
 0000 C37F34        ESEN    JMP XEGEN
 0003 C3B33E        EICI    JMP XEICI
                    ;
 0080                       ORG LOCGIL+80H
                    ;
```

```
CP/M MACRO ASSEM 2.0    #004    VIPER-X, GIL WATT SYSTEM

                    ;
                    ;
                    ;
                    ;
                    ;APERTURE PROCESSOR
                    ;------------------
                    ;
                    ;THE APERTURE PROCESSOR IDENTIFIES WHETHER A SURFACE ENCOMPASSES
                    ;AN APERTURE PIXEL.
                    ;
                    ;FOR A DEMONSTRATION IMPLEMENTATION, THE APERTURE PROCESSOR
                    ;ACCESSES A SINGLE SURFACE IN THE FIFO FOR EACH PIXEL IN
                    ;THE VIEWPORT AND THEN LOOPS FOR SELECTION OF ANOTHER
                    ;SURFACE, AS CODED BELOW.
                    ;
                    ;FOR AN OPERATIONAL IMPLEMENTATION, THE APERTURE PROCESSOR
                    ;ACCESSES ALL SURFACES IN THE FIFO FOR A SINGLE APERTURE
                    ;PIXEL OR FOR A SELECTED SET OF APERTURE PIXELS AND THEN
                    ;EXITS FROM THE ROUTINE BEFORE A FIFO EMPTY CONDITION IS
                    ;ENCOUNTERED (SEE THE APSL CODE AS AN EXAMPLE).
                    ;
                    ;SET SID BREAKPOINTS AT .APC AND .APCX FOR PRINT CONTROL
                    ;
3080 CDEE2E         AP      CALL CCMSUR1      ;SETUP OUTER LOOP, EACH PIXEL IN
                                              ;VIEWPORT IS AN APERTURE
3083 AF                     XRA A             ;INITIALIZE A NEW VIEWPORT
3084 32[illegible]                 STA APAX          ;ZERO SET ADDRESS TO FIRST APERTURE
3087 32[illegible]                 STA APAY          ;PIXEL AT X=0,Y=0
308A 2AFCAF                 LHLD SFFIF-4      ;SAVE FIRST P-EDGE READ PNTR
308D 22[illegible]                 SHLD CCMFIF
3090 AF             APOF    XRA A             ;CLEAR FLAGS FOR EACH APERTURE
3091 32[illegible]                 STA APA
3094 3A0734                 LDA APF
3097 E6FD                   ANI 0FDH
3099 320734                 STA APF
309C CD[illegible]          APSF    CALL APSF1        ;LOAD EGEN TABLE FROM FIFO
                                              ;CALCULATE DELTAX
309F CC[illegible]                 CZ APSSG          ;UPDATE ZERO-DELTA FLAG,APF-1
30A2 0F                     RRC
30A3 E640                   ANI 40H
30A5 5F                     MOV E,A
30A6 3A[illegible]                 LDA APAY          ;CALCULATE DELTAY
30A9 47                     MOV B,A
30AA 3AE734                 LDA EGENYS        ;DELTAY=YE-YA
30AD CD[illegible]                 CALL EICACA       ;RESCALE TO PIXEL RESOLUTION
30B0 90                     SUB B
30B1 CC[illegible]                 CZ APSSG          ;UPDATE ZERO-DELTA FLAG,APF-1
30B4 E680                   ANI 80H
30B6 B3                     ORA E
30B7 5F                     MOV E,A           ;D7 D6 = SIGN-Y SIGN-X
30B8 C2[illegible]          APIAF   JNZ AP2F          ;PACK QUADRANT BIT
30BB 3E08                   MVI A,08          ;FIRST QUADRANT
30BD C3[illegible]                 JMP APIF
30C0 7B             AP2F    MOV A,E
30C1 EE80                   XRI 80H
30C3 C2CB30                 JNZ APAF
```

```
CP/M MACRO ASSEM 2.0     #005     VIPER-X. GIL HYATT SYSTEM

30C6 3E01                MVI A.01         ;FORTH QUADRANT
30C8 C3D830              JMP AP3F
30CB 7B         AP4F     MOV A.E
30CC EE40                XRI 40H
30CE C2D630              JNZ AP5F
30D1 3E04                MVI A.04         ;SECOND QUADRANT
30D3 C3D830              JMP AP3F
30D6 3E02       AP5F     MVI A.02         ;THIRD QUADRANT
30D8 4F         AP3F     MOV C.A          ;PACK QUADRANT WORD
30D9 3A0334              LDA APA
30DC B1                  ORA C
30DD 320334              STA APA
30E0 3A5F34     APKF     LDA EGENF7       ;CHECK FOR LAST EDGE
30E3 E608                ANI 08
30E5 CA9C30              JZ AP9F          ;LOOP BACK FOR ANOTHER EDGE
30E8 3A0734              LDA APF          ;LAST EDGE, CHECK FOR ON-EDGE
                                          ;APERTURE PROCESSING
30EB E603                ANI 03
30ED EE03                XRI 03
30EF CA1B31              JZ AP8SH
30F2 CDD532              CALL APTDF       ;TABLE LOOKUP FOR QUADRANT DECODE
30F5 CA8E32              JZ APOUT         ;CHECK FOR OUTSIDE
30F8 78                  MOV A.B
30F9 E607                ANI 07
30FB EE06                XRI 06
30FD CA9C32              JZ APIN          ;CHECK FOR INSIDE
                ;DOUBLE OR TRIPLE QUADRANT CHECK
3100 2A6D34              LHLD COMFIF      ;RESET FIFO POINTER
3103 22FD4F              SHLD GPFIF-4
3106 CDE532              CALL APD2        ;STORE MAX-POS ABDX(TABLE INIT)
3109 CDB532     AP8      CALL AP8F1       ;LOAD EGEN TABLE FROM FIFO
                                          ;CALCULATE DELTAX
310C CDF632              CALL APD4        ;CALCULATE ABSOLUTE MAGNITUDE
310F CD0333              CALL APD3        ;CALCULATE DELTAY
3112 CD1B33              CALL AP3B        ;UPDATE MIN ABDX TABLE
                                          ;CHECK FOR LAST EDGE PER SURFACE
3115 CA0931              JZ AP8           ;LOOP BACK FOR ANOTHER EDGE
3118 C31932              JMP APTD

311B 2A6D34     AP8SH    LHLD COMFIF      ;RESET FIFO POINTER
311E 22FD4F              SHLD GPFIF-4
3121 AF         APD      XRA A
3122 320434              STA APC1
3125 320534              STA APD1
3128 CDE532              CALL APD2
312B CDB532     AP8S3    CALL AP8F1
312E CDF632              CALL APD4
3131 79                  MOV A.C          ;PACK APC1 FLAGS
3132 B7                  ORA A
3133 3A0434              LDA APC1
3136 FA4131              JM APBA
3139 CA4631              JZ APBB          ;POSITIVE OR ZERO DX
313C F680                ORI 80H          ;POSITIVE DX
313E C34B31              JMP APBC
3141 F640       APBA     ORI 40H          ;NEGATIVE DX
3143 C34B31              JMP APBC
```

```
ISIS-II 8080/8085 MACRO ASSEMBLER, V3.0    #018    VIPER-X. SIL [illegible] SYSTEM

3146 E608        APSE    ANI 8              ;ZERO DY
3148 3A0434              LDA APD1
314B C2B031              JNZ APSD           ;CHECK FOR [illegible] COUNT
314E C604                ADI 4              ;INCREMENT [illegible] COUNTER
3150 F610        APSD    ORI 10H            ;SET ZERO FLAG, D[illegible]
3152 320434      APSE    STA APD1
3155 CD[illegible]       CALL APD3
3158 7B                  MOV A,E            ;PACK APD FLAGS
3159 87                  [illegible] A
315A 3A0534              LDA APD1
315D FA6831              JM APSG
3160 CA6D31              JZ APSH            ;POSITIVE OR ZERO DY
3163 F680                ORI 80H            ;POSITIVE DY
3165 C39031              JMP APSI
3168 F640        APSG    ORI 40H            ;NEGATIVE DY
316A C39031              JMP APSI
316D 3A0434      APSH    LDA APD1           ;POSITIVE OR ZERO DX. CHECK FOR ZERO
3170 E610                ANI 10H
3172 C2BE31              JNZ APSL
3175 3A0534              LDA APD1           ;DY IS ZERO
3178 E608                ANI 8
317A 3A0534              LDA APD1
317D C28331              JNZ APSJ
3180 C604                ADI 04
3183 320534      APSJ    STA APD1
3185 7B                  MOV A,E            ;CHECK SIGN DX
3186 E640                ANI 40H
3188 3A0534              LDA APD1
318B CAB631              JZ APSK
318E F601                ORI 1              ;-DX0, PACK -DX0 FLAG
3190 320534      APSI    STA APD1
3193 3A0434              LDA APD1           ;CHECK DX0 FLAG
3196 E610                ANI 10H
3198 CAD331              JZ APSC
319B 3A0434              LDA APD1           ;CLEAR ZERO DX FLAG
319E E6EF                ANI 0EFH
31A0 320434              STA APD1
31A3 7B                  MOV A,E
31A4 E680                ANI 80H
31A6 3A0434              LDA APD1
31A9 CAB131              JZ APSM
31AC F601                ORI 1              ;+DX.ZERO
31AE C3D331              JMP APSP
31B1 F602        APSM    ORI 2              ;-DX
31B3 C3D331              JMP APSP
31B6 3A0534      APSK    LDA APD1           ;POSITIVE DX
31B9 F602                ORI 2
31BB C39031              JMP APSI
31BE 3AEF34      APSL    LDA EGENF7         ;APERTURE ON VERTEX
31C1 E608                ANI 08             ;CHECK FOR LAST EDGE PER SURFACE
31C3 C2[illegible]       JNZ APEDGE
31C6 CD[illegible]       CALL EICF7
31C9 21[illegible]       LXI H,GFFIF        ;ADVANCE FIFO TO NEXT SURFACE
31CC CD[illegible]       CALL EICD
31CF C3BE31              JMP APSL
31D3 320434      APSP    STA APD1
```

```
CP/M MACRO ASSEM 2.0     #067     VIPER-X. GIL HYATT SYSTEM

31D5 CD1E33     APFD    CALL APFE
31D8 CA2E31             JZ APSSB             ;LOOP BACK FOR ANOTHER EDGE
31DB 3A0434     APT     LDA APD1             ;CHECK ALL DX'S GREATER THAN
                ;ZERO OR LESS THAN ZERO
31DE E6C0               ANI 0C0H
31E0 EEC0               XRI 0C0H
31E2 C204C3             JNZ APTA
31E5 3A0534     APTB    LDA APD1             ;CHECK ALL DY'S GREATER THAN
                ;ZERO OR LESS THAN ZERO
31E8 E6C0               ANI 0C0H
31EA EEC0               XRI 0C0H
31EC CA1932             JZ APTD
31EF 3A0534     APTC    LDA APD1
31F2 E609               ANI 9
31F4 CA8E32             JZ APOUT
31F7 3A0334             LDA APD1             ;CHECK SIGNS OF DELTAX'S
31FA E603               ANI 3
31FC EE03               XRI 3
31FE CA8932             JZ APEDGE
3201 C38E32             JMP APOUT
3204 3A0434     APTA    LDA APC1
3207 E608               ANI 8
3209 CA8E32             JZ APOUT
320C 3A0434             LDA APC1             ;CHECK SIGNS OF DELTAY'S
320F E603               ANI 3
3211 EE03               XRI 3
3213 CA8932             JZ APEDGE
3216 C38E32             JMP APOUT
                ;
3219 CDD533     APTD    CALL APTDF           ;TABLE LOOKUP FOR QUADRANT DECODE
321C CA8E32             JZ APOUT
321F 78                 MOV A.B
3220 E607               ANI 07
3222 EE06               XRI 06
3224 CA9332             JZ APIN

3227 78                 MOV A.B              ;TEST FOR TRIPLE QUAD CONDITION
3228 E60C               ANI 0CH
322A EE08               XRI 08
322C CA3A32             JZ APTR1
322F 78                 MOV A.B              ;TEST FOR DOUBLE QUAD CONDITION
3230 E60C               ANI 0CH
3232 EE0C               XRI 0CH
3234 CA5232             JZ APDB1
3237 C34C35             JMP ERROR1
323A 78         APTR1   MOV A.B              ;TRIPLE QUAD COND. GENERATE POINTER
323B CD7233             CALL APLDR1          ;LOAD SLOPE REGISTERS
323E CDAF33             CALL APCMP           ;SLOPE COMPARISON
3241 CA4A32             JZ APCMPB
3244 F28E32             JP APOUT
3247 C39332             JMP APIN
324A 7D         APCMPB  MOV A.L              ;MSH IS ZERO. CHECK LSH
324B B7.                ORA A
324C CA8932             JZ APEDGE
324F C38E32             JMP APOUT
3252 78         APDB1   MOV A.B              ;DOUBLE QUAD COND. GENERATE POINTER
```

```
CP/M MACRO ASSEM 2.0     #018     VIPER-A. GIL HYATT SYSTEM

3253 07                        RLC
3254 E602                      ANI 02
3256 CD7033                    CALL APLDR1      ;LOAD SLOPE REGISTERS
3259 E5                        PUSH H
325A CDAF33                    CALL APCMP       ;SLOPE COMPARISON
325D E1                        POP H
325E CA6732                    JZ APCMPM
3261 FA6F32                    JM APCMPN
3264 C39332                    JMP APIN
3267 7D              APCMPM    MOV A.L
3268 B7                        ORA A
3269 CA8932                    JZ APEDGE
326C C38E32                    JMP APOUT
326F 23              APCMPN    INX H
3270 1600                      MVI D.0
3272 CD8733                    CALL APLDR2      ;LOAD SLOPE REGISTERS
3275 CDAF33                    CALL APCMP       ;SLOPE COMPARISON
3278 CA8132                    JZ APCMPP
327B F28E32                    JP APOUT
327E C39332                    JMP APIN
3281 7D              APCMPP    MOV A.L
3282 B7                        ORA A
3283 CA8932                    JZ APEDGE
3286 C38E32                    JMP APOUT
                     ;
3289 3E02            APEDGE    MVI A.02         ;APERATURE IS ON EDGE. DISPLAY AN 'N'
328B C39532                    JMP APIED
328E 3E07            APOUT     MVI A.07         ;APERATURE IS OUTSIDE. DISPLAY AN'O'
3290 C39532                    JMP APIED
3293 3E06            APIN      MVI A.06         ;APERATURE IS INSIDE.DISPLAY AN 'I'
3295 CDEE33          APIED     CALL APZ
3298 CDDF35          APK1      CALL TESTP6      ;INCREMENT APERTURE PIXEL ADDRESS
329B CAAF32                    JZ APC           ;EXIT IF A=0
329E 78                        MOV A.B
329F 322834                    STA APAX
32A2 79                        MOV A.C
32A3 322934                    STA APAY
32A6 2A6D34                    LHLD COMFIP      ;TI.RESET FIFO ON LAST EDGE
32A9 22FC4F                    SHLD GPFIF-4     ;TI
32AC C39030                    JMP APDF         ;LOOP BACK FOR ANOTHER APERTURE
32AF CD2164          APC       CALL PRINT       ;TI.EXIT FROM TEST ROUTINE
32B2 C30001          APCX      JMP BEGIN        ;TI.LOOP TO SELECT ANOTHER SURFACE
                                                ;FOR DEMONSTRATION
                     ;
                     ;SUBROUTINES
                     ;-----------
                     ;
32B5 CD8235          APSF1     CALL EICF7       ;LOAD GPFIF EDGE TO EGEN TABLE
32B8 210050                    LXI H.GPFIF
32BB CDE335                    CALL EICD
32BE 3A2834          APBSF     LDA APAX         ;CALC. DELTAX AND DELTAY
32C1 47                        MOV B.A
32C2 3A5A34                    LDA EGENXB       ;DELTAX=XE-XA
32C5 CD2E35                    CALL EIDACA      ;RESCALE TO PIXEL RESOLUTION
32C8 90                        SUB B
32C9 C9                        RET
```

```
8080 MACRO ASSEM 2.0    #009    VIPER-X. BIL WYATT SYSTEM

                      ;
32CA 47         APSBS     MOV B.A
32CB 3A0734               LDA APF         ;PACK ZERO DELTA FLAG
32CE F60C                 ORI 0C
32D0 320734               STA APF
32D3 78                   MOV A.B
32D4 C9                   RET
                      ;
                      ;TABLE LOOKUP FOR QUADRANT DECODE
32D5 3A0034     APTDF     LDA APA         ;PACK QUADRANT BYTE POINTER
32D8 E60F                 ANI 0FH
32DA 5F                   MOV E.A
32DB 1600                 MVI D.0
32DD 211B34               LXI H.APB
32E0 19                   DAD D
32E1 46                   MOV B,M         ;ACCESS TABLE PARAMETER
                                          ;DETERMINE INSIDE.OUTSIDE.
32E2 78                   MOV A.B         ;2-QUAD. OR 3-QUAD CONDITION
32E3 E607                 ANI 07
32E5 EE07                 XRI 07
32E7 C9                   RET
                      ;
32E8 212A34     APD2      LXI H.AP1XM     ;STORE MAX POSITIVE ABS DELTA
32EB 067F                 MVI B.7FH
32ED 3E08                 MVI A.08
32EF 70         AP6       MOV M.B
32F0 23                   INX H
32F1 3D                   DCR A
32F2 C2EF32               JNZ AP6
32F5 C9                   RET

32F6 4F         APD4      MOV C.A
32F7 CDFB33               CALL AP9        ;ABSOLUTE MAGNITUDE GENERATION
32FA 323E34               STA APABSX
32FD 79                   MOV A,C
32FE 0F                   RRC
32FF E640                 ANI 40H
3301 5F                   MOV E.A
3302 C9                   RET
                      ;
3303 3A2934     APD3      LDA APAY
3306 47                   MOV B.A
3307 3A5734               LDA ESENYS      ;DELTAY=YE-YA
330A CD2B35               CALL EICACA     ;RESCALE TO PIXEL RESOLUTION
330D 90                   SUB B
330E 4F                   MOV C.A
330F CDFB33               CALL AP9        ;ABSOLUTE MAGNITUDE GENERATION
3312 323F34               STA APABSY
3315 79                   MOV A,C
3316 E680                 ANI 80H
3318 B3                   ORA E
3319 5F                   MOV E.A         ;C7 C6 = SIGN-Y SIGN-X
331A C9                   RET
                      ;
331B 3A3E34     AP3B      LDA APABSX      ;ABSX =  B
331E 47                   MOV B.A
```

```
CP/M MACRO ASSEM 2.0    #010    VIPER-X, OIL -WATT SYSTEM

331F 3A3F34            LDA APABDY      ;ABDY #. 0
3322 4F                MOV C,A
3323 7B        APV     MOV A,E         ;CONSTRUCT POINTER
3324 07                RLC
3325 07                RLC
3326 07                RLC
3327 E6                ANI             ;WORD ADDRESS = (BYTE ADDRESS)
3329 5F                MOV E,A         ;[illegible]
332A 1600              MVI D,0
332C 21DA34            LXI H,AP1XM
332F 19                DAD D           ;ACCESS PROPER MIN. ABDX ADDRESS
3330 78        AP7A    MOV A,B
3331 96                SUB M
3332 C24733            JNZ APV2
3335 1E08              MVI E,08        ;XP-XM=0
3337 19                DAD D
3338 79                MOV A,C
3339 96                SUB M
333A 1EF8              MVI E,-8        ;RESET POINTER
333C 16FF              MVI D,0FFH
333E 19                DAD D
333F 1600              MVI D,00
3341 F25633            JP AP7
3344 C34A33            JMP APV4        ;RELOAD
3347 F25633    APV2    JP AP7
334A 70        APV4    MOV M,B         ;LOAD NEW MIN ABDX
334B 1E08              MVI E,08        ;LOAD CORRESPONDING Y-COORD.
334D 19                DAD D
334E 71                MOV M,C
334F 1EF8              MVI E,-8
3351 16FF              MVI D,0FFH
3353 19                DAD D
3354 1600              MVI D,00
3356 23        AP7     INX H           ;ACCESS PROPER MIN-ABDY ADDRESS
3357 79                MOV A,C
3358 96                SUB M
3359 C26E33            JNZ APV6
335C 1E08              MVI E,08        ;YP-YM=0
335E 19                DAD D
335F 78                MOV A,B
3360 96                SUB M
3361 1EF8              MVI E,-8        ;RESET POINTER
3363 16FF              MVI D,0FFH
3365 19                DAD D
3366 1600              MVI D,00
3368 F27633            JP APK
336B C37133            JMP APV5        ;RELOAD
336E F27633    APV6    JP APK
3371 71        APV5    MOV M,C         ;LOAD NEW MIN-ABDY
3372 1E08              MVI E,08        ;LOAD CORRESPONDING X-COORD
3374 19                DAD D
3375 70                MOV M,B         ;TABLE POINTER NEED NOT BE RESTORED
3376 3A5F34    APK     LDA EGENF7      ;CHECK FOR LAST EDGE
3379 E608              ANI 08
337B C9                RET
```

```
CP/M MACRO ASSEM 2.0     #011     VIPER-X. GIL HYATT SYSTEM

337C 07         APLDR1  RLC                    :LOAD SLOPE REGISTERS
337D 07                 RLC                    :POINTER IS IN A
337E 1600               MVI D,0
3380 E60C               ANI 0CH
3382 5F                 MOV E,A
3383 211834             LXI H,APSLP1
3386 19                 DAD D
3387 5E         APLDR2  MOV E,M
3388 CDA733             CALL APLDR3
338B 323A34             STA APAXM
338E 23                 INX H
338F 5E                 MOV E,M
3390 CDA733             CALL APLDR3
3393 323B34             STA APAYL
3396 23                 INX H
3397 5E                 MOV E,M
3398 CDA733             CALL APLDR3
339B 323C34             STA APBXL
339E 23                 INX H
339F 5E                 MOV E,M
33A0 CDA733             CALL APLDR3
33A3 323D34             STA APBYM
33A6 C9                 RET
                :
33A7 E5         APLDR3  PUSH H
33A8 212A34             LXI H,AP1XM
33AB 19                 DAD D
33AC 7E                 MOV A,M
33AD E1                 POP H
33AE C9                 RET
                :
                :       SLOPE COMPARISON SUBROUTINE
                :ALL PARAMETERS ARE POSITIVE (ABS MAG)
33AF 210000     APCMP   LXI H,0                :CLEAR SLOPE DIFFERENCE
33B2 1600               MVI D,0                :CLEAR MULTIPLICAND
33B4 3A3D34     APCMP6  LDA APBYM              :CALCULATE XA.YB PRODUCT
33B7 5F                 MOV E,A
33B8 0607               MVI B,07               :LOAD ITERATION COUNTER
33BA 3A3A34             LDA APAXM              :LOAD MULTIPLIER
33BD CDD933             CALL APCMP7            :CALCULATE XAYB PRODUCT
33C0 3A3B34             LDA APAYL              :CALCULATE XAYB-XBYA DIFFERENCE
33C3 B7                 ORA A
33C4 CAD633             JZ APCMP6A             :CHECK FOR ZERO MULTIPLICAND
33C7 5F                 MOV E,A
33C8 AF                 XRA A                  :STORE COMPLEMENT OF APAYL IN DE
33C9 57                 MOV D,A
33CA 93                 SUB E
33CB 5F                 MOV E,A
33CC 16FF               MVI D,0FFH
33CE 0607               MVI B,07
33D0 3A3C34             LDA APBXL
33D3 CDD933             CALL APCMP7
33D6 7C         APCMP6A MOV A,H
33D7 B7                 ORA A
33D8 C9                 RET
                :
```

```
8080 MACRO ASSEM 3.0    4012    VIPER-X, [illegible] SYSTEM

33D9 1F           APCMP7  RAR              ;SHIFT MULTIPLIER BIT INTO CY
33DA D2DE33               JNC APCMP9       ;CHECK MULTIPLIER BIT
33DD 19                   DAD D            ;UPDATE SLOPE DIFFERENCE
33DE 4F           APCMP9  MOV C.A
33DF 78                   MOV A.B
33E0 B7                   ORA A
33E1 C8                   RZ
33E2 47                   MOV B.A
33E3 AF                   XRA A            ;CLEAR CY FLAG
33E4 7B                   MOV A.E          ;SHIFT DE LEFT
33E5 17                   RAL
33E6 5F                   MOV E.A
33E7 7A                   MOV A.D
33E8 17                   RAL
33E9 57                   MOV D.A
33EA 79                   MOV A.C
33EB C3D933               JMP APCMP7
                  ;
                  ;EXIT CONDITION, PRINT APERTURE CHARACTER
33EE 5F           APZ     MOV E.A
33EF 3A2834               LDA APAX         ;APERTURE PIXEL ADDRESS
33F2 47                   MOV B.A
33F3 3A2934               LDA APAY
33F6 4F                   MOV C.A
33F7 CDDE01               CALL TLDMEM      ;DISPLAY APERTURE CONDITION
33FA C9                   RET
                  ;
                  ;       ABSOLUTE MAGNITUDE SUBROUTINE
33FB 57           AP9     MOV D.A          ;CHECK FOR NEGATIVE
33FC E680                 ANI 80H
33FE 7A                   MOV A.D
33FF C8                   RZ
3400 AF                   XRA A            ;NEGATIVE, TAKE 2'S COMPLIMENT
3401 92                   SUB D
3402 C9                   RET
                  ;
                  ;PARAMETER STORAGE
3403 00           APA     DB 00            ;TABLE INPUT
                                           ;+ABDX--ABDX-+ABDY--ABDY--Q1-Q2-Q3-Q4
3404 00           APC1    DB 0             ;+DX--DX-0-DX0--N1X-N0X--DY0--DY0
3405 00           APD1    DB 0             ;+DY--DY-0-0--N1Y-N0Y-+DX0--DX0
3406 00           APE     DB 0             ;TABLE OUTPUT
3407 01           APF     DB 01            ;MODE WORD:0-0-0-0--0-0-EI-ED
                  ;ED=0,DON'T PROCESS FOR APERTURE ON THE EDGE
                  ;ED=1,PROCESS FOR APERTURE ON THE EDGE IF ZERO DELTA DETECTED
3408 0007070707APB        DB 00.07.07.07.07.0DH.07.0AH
3410 07070C0807           DB 07.07.0CH.08.07.0BH.09.06
3418 00080F0706APSLP1     DB 00.08.0FH.07.06.0EH.05.01
3420 020A0D0E04           DB 02.0AH.0DH.0E.04.0CH.0BH.03
                  ;
3428 00           APAX    DB 00            ;APERTURE X-ADDRESS
3429 00           APAY    DB 00            ;APERTURE Y-ADDRESS
                  ;
                  ;       ABSOLUTE COORDINATE MINIMUM TABLE
342A 00           AP1XM   DB 00            ;QUAD-1, MIN-ABDX
342B 00           AP1YM   DB 00            ;QUAD-1, MIN-ABDY
```

```
8080 MACRO ASSEM 2.0    #010    VIPER-X. BIL WYATT SYSTEM

342C 00          AP2XM   DB 00              ;QUAD-2. MIN-ABDX
342D 00          AP2YM   DB 00              ;QUAD-2. MIN-ABDY
342E 00          AP4XM   DB 00              ;QUAD-4. MIN-ABDX
342F 00          AP4YM   DB 00              ;QUAD-4. MIN-ABDY
3430 00          AP3XM   DB 00              ;QUAD-3. MIN-ABDX
3431 00          AP3YM   DB 00              ;QUAD-3. MIN-ABXY
                 ;       CORRESPONDING COORDINATE TABLE
3432 00          AP1Y    DB 00              ;QUAD-1. MIN-ABDY
3433 00          AP1X    DB 00              ;QUAD-1. MIN-ABDX
3434 00          AP2Y    DB 00              ;QUAD-2. MIN-ABDY
3435 00          AP2X    DB 00              ;QUAD-2. MIN-ABDX
3436 00          AP4Y    DB 00              ;QUAD-4. MIN-ABDY
3437 00          AP4X    DB 00              ;QUAD-4. MIN-ABDX
3438 00          AP3Y    DB 00              ;QUAD-3. MIN-ABDY
3439 00          AP3X    DB 00              ;QUAD-3. MIN-ABDX
                 ;
                 ;SLOPE REGISTERS
343A 00          APAXM   DB 0
343B 00          APAYL   DB 0
343C 00          APBXL   DB 0
343D 00          APBYM   DB 0
                 ;
343E 00          APABDX  DB 0               ;ABS MAG DELTAX
343F 00          APABDY  DB 0               ;ABS MAG DELTAY
                 ;
                 ;.
3440 00          SMTESTN DB 0
3441 00          SMTESTY DB 0
                 ;
3442 3A5734      EGENDK  LDA EGENYS
3445 E603                ANI 03
3447 5F                  MOV E.A
3448 3A5A34              LDA EGENXS
344B 17                  RAL
344C 17                  RAL
344D E60C                ANI 0CH
344F B3                  ORA E
3450 C9                  RET
                 ;
                 ;ECMFIF AND GPFIF OUTPUT BUFFER
3451 00          IPOBXS  DB 0               ;XS
3452 00          IPOBYS  DB 0               ;YS
3453 00          IPOBDX  DB 0               ;DELTA X
3454 00          IPOBDY  DB 0               ;DELTA Y
3455 00          IPOBCF  DB 0               ;COLOR AND FLAG BYTE.LEAST SIG BYTE
3456 00          IPOBF7  DB 0               ;MOST SIG BYTE
                 ;
                 ;INITIALIZATION BUFFER
3457 00          EGENYS  DB 0               ;YS MSBS (HALF PIXEL RESOLUTION)
3458 00          EGENYD  DB 0               ;Y DTG MSBS (ABS DELTA Y)
3459 00          EGENYN  DB 0               ;DELTA YN (LSBS)
345A 00          EGENXS  DB 0               ;XS MSBS (HALF PIXEL RESOLUTION)
345B 00          EGENXD  DB 0               ;X DTG MSBS (ABS DELTA X)
345C 00          EGENXN  DB 0               ;DELTA XN (LSBS)
345D 00          EGENFL  DB 0               ;FLAG WORD.D-REGISTER
345E 00          EGENCF  DB 0               ;FLAG WORD .COLOR AND FLAGS
```

```
CP/M MACRO ASSEM 2.0    #014    VIPER-X, GIL HYATT SYSTEM

 345F 00        EGENF7  DB 0            ;FLAG WORD
 3460 00        EGENF3  DB 0            ;FLAG WORD
 3461 00        EGENF4  DB 0            ;FLAG WORD
 3462 00        EGENYR  DB 0            ;YS LSB'S (R-REGISTER)
 3463 00        EGENXR  DB 0            ;XS LSB'S (R-REGISTER)
 3464 00        EGENFD  DB 0            ;TEMPORARY FLAG BUFFER
 3465 00        EGENK1  DB 0            ;SUBPIXEL OUTPUT WORD
 3466 00        EGENXO  DB 0            ;OUTPUT X COORDINATE
 3467 00        EGENYO  DB 0            ;OUTPUT Y COORDINATE
 3468 00        EGENK4  DB 0            ;SPARE
 3469 00        EGENK5  DB 0            ;SPARE
 346A 00        EGENK6  DB 0            ;SPARE
                ;
                ;GENERAL BUFFERS
                ;
 346B 0000      OCMFIN  DW 0            ;FIFO POINTERS
 346D 0000      OCMFIF  DW 0
 346F 0000      OCMFFA  DW 0
                ;
 3471 00        OCMXS   DB 0            ;I/O PIXEL ADDRESS BUFFER
 3472 00        OCMYS   DB 0
                ;
 3473 00        PXLXS   DB 0            ;PIXEL BUFFER
 3474 00        PXLYS   DB 0
 3475 00        PXLF7   DB 0
 3476 00        PXLCF   DB 0
                ;
 3477 00        OPXL    DB 0            ;PROPER OUTSIDE PIXEL BUFFER
 3478 00        OPXL1   DB 0
                ;
                ;
                ;EDGE IC GENERATOR ROUTINE (RE-ENTRANT)
                ;
 3479 00        XEGEN   NOP             ;REGISTERS NOT SAVED
 347A 3E02              MVI A.2         ;TI
 347C 324134            STA SMTESTY     ;TI
 347F AF                XRA A           ;TI
 3480 324034            STA SMTESTN     ;TI
                ;
                ;LOAD SPFIF WITH POSTPROCESSED EDGE PARAMETERS
                ;
                ;REQUIRED INPUT SEQUENCE.CW FIRST EDGE TO LAST EDGE.
                ;P-EDGES FIRST BEFORE N-EDGES
                ;
                ;INITIAL CONDITION GENERATION
 3483 215734            LXI H.EGENYS    ;CLEAR EGEN TABLE
 3486 CD3A35            CALL SPCL18
 3489 3A5B30            LDA SSAXSX      ;LOAD XS
 348C 07                RLC             ;SCALE FOR SUBPIXEL RESOLUTION
 348D 325A34            STA EGENXS
 3490 3A5C30            LDA SSAXSY      ;LOAD YS
 3493 07                RLC             ;SCALE FOR SUBPIXEL RESOLUTION
                ;*      MOV B.A         ;TI.TO CHANGE 4TH TO 1ST QUAD DISPLAY
                ;*      XRA A           ;TI
                ;*      SUB B           ;TI.COMPLEMENT YS
                ;*      ADI 29          ;TI.BIAS OF 29 TO BOTTOM OF SCREEN
```

```
IF // MACRO ASSEM 2.0     #015    VIPER-X. GIL HYATT SYSTEM

3494 32E734                  STA EGENYS
                   ;*        LDA GDELTY
                   ;*        MOV B.A          ;TI.COMPLEMENT DELTAYS
                   ;*        XRA A            ;TI
                   ;*        SUB B            ;TI
                   ;*        STA IPOSDY
3497 3A9B20                  LDA GCCLCR       ;GET COLOR WORD
349A E60F                    ANI IDMSK1       ;        MASK LOWER  BITS
349C 32EE34                  STA EGENCF       ;(SEG-0 TO SEG-1)
349F 3A9620        EGEN1     LDA GSFLAG
34A2 47                      MOV B.A          ;REPACK LES-FLAG
34A3 E640                    ANI 40H
34A5 78                      MOV A.B
34A6 CAAB34                  JZ EIC2
34A9 F608                    ORI 08
34AB E60F          EIC2      ANI 0FH
34AD 325F34                  STA EGENF7
34B0 210000                  LXI H.00         ;CALC: DX=>B.ABDX=>C.0=>H.L
34B3 3A9120                  LDA GDELTX
34B6 47                      MOV B.A
34B7 B7                      ORA A            ;        SET FLAGS
34B8 F2C534                  JP  EGEN2
34BB 3A5F34                  LDA EGENF7       ;DX IS NEG. SET XNS
34BE F640                    ORI 40H          ;(SEG-2 TO SEG-3)
34C0 325F34                  STA EGENF7
34C3 AF                      XRA A            ;COMPLEMENT DX TO ABS. MAG.
34C4 90                      SUB B
34C5 4F            EGEN2     MOV C.A
34C6 325B34                  STA EGENXD
34C9 3A9220                  LDA GDELTY       ;CALC:DY=>D.ABDY=>E
34CC 57                      MOV D.A
34CD B7                      ORA A            ;        SET FLAGS
34CE F2DB34                  JP  EGEN3
34D1 3A5F34                  LDA EGENF7       ;DY IS NEG. SET YNS
34D4 F620                    ORI 20H          ;(SEG-3)
34D6 325F34                  STA EGENF7
34D9 AF                      XRA A
34DA 92                      SUB D
34DB 5F            EGEN3     MOV E.A
34DC 325B34                  STA EGENYD
34DF 7B                      MOV A.E          ;NORMALIZE DX,DY
34E0 B9                      CMP C            ;CALC: ABDY-ABDX=>FLAGS
34E1 D2F034                  JNC EGEN6        ;        JUMP IF ABDX <= ABDY
34E4 3A5F34                  LDA EGENF7       ;ABDX>ABDY.SET FS IN F7
34E7 F610                    ORI 10H
34E9 325F34                  STA EGENF7
34EC 79                      MOV A.C
34ED C3F134                  JMP EGENC
34F0 7B            EGEN6     MOV A.E          ;ABDY>ABDX. ABDY=ABDX
34F1 07            EGENC     RLC              ;NORMALIZE A.
                                              ;GREATER ABS DELTA IN A.COUNT IN H
34F2 07            EGEN5     RLC              ;A7 => CY
34F3 24                      INR H
34F4 D2F234                  JNC EGEN5        ;        LOOP ON NO CARRY
34F7 AF            EGEN7     XRA A            ;        NORMALIZED COUNT IN H
34F8 84                      ADD H
```

```
CP/M MACRO ASSEM 2.0      #016     VIPER-X, GIL HYATT SYSTEM

34FA CA0A35              JZ EGEN8
34FC 3D                  DCR A          ;SHIFT DX,DY:DEC A
34FD 78                  MOV A,B
34FE 07                  RLC
34FF E6FE                ANI 0FEH       ;SHIFT IN ZEROS IF POS OR IF NEG
3501 47                  MOV B,A
3502 7A                  MOV A,D
3503 07                  RLC
3504 E6FE                ANI 0FEH       ;SHIFT IN ZEROS IF POS OR IF NEG
3506 57                  MOV D,A
3507 C3F734              JMP EGEN7
350A 78         EGEN8    MOV A,B        ;NORMALIZATION COMPLETE
350B 32EC34              STA EGENXN     ;STORE IN INITIALIZATION BUFFER
350E 7A                  MOV A,D
350F 32E934              STA EGENYN
3512 CD4234              CALL EGENDK    ;PACK EGENFI CONDITIONS
3515 32A034              STA EGENFI     ;MSH=0, REMAINDERS=0 (EGENF4 IS
3518 3ADF34              LDA EGENF7     ;TI.DELETE P-EDGES FROM FIFO-----------
351B E601                ANI 01         ;TI------------------------------------
351D C8                  RZ             ;TI------------------------------------
351E CD8235              CALL EICF7     ;LOAD GPFIF FROM TABLE
3521 210050              LXI H,GPFIF
3524 CD6B35              CALL EICU
3527 C9                  RET
                ;
3528 C36030     XEICJ    JMP AP         ;ACCESS TO APERTURE PROCESSOR
                ;
352B B7         EICACA   ORA A          ;RESCALE FOR PIXEL RESOLUTION
352C 0F                  RRC
352D F23335              JP EICACB
3530 F680                ORI 80H        ;NEGATIVE. PACK B7=1
3532 C9                  RET
3533 E67F       EICACB   ANI 7FH        ;POSITIVE. PACK B7=0
3535 C9                  RET
                ;
3536 CDC164     EPRINT   CALL PRINT     ;TI
3539 C9                  RET            ;TI
                ;
                ;CLEAR TABLES
353A AF         SPCL18   XRA A          ;CLEAR 18-BYTE TABLE
353B 47                  MOV B,A
353C 3E12                MVI A,18
353E C34535              JMP SPCL1
3541 AF         SPCL6    XRA A          ;CLEAR 6-BYTE TABLE
3542 47                  MOV B,A
3543 3E06                MVI A,06
3545 70         SPCL1    MOV M,B
3546 3D                  DCR A
3547 23                  INX H
3548 C24535              JNZ SPCL1
354B C9                  RET
                ;
354C E1         ERROR1   POP H          ;ERROR ROUTINE, RETURN ADDRESS IN HL
                                        ;PUT BREAKPOINT AT ERROR2 AND MONITOR HL
354D 226834              SHLD EGENK4    ;ALTERNATELY, MONITOR EGENK4
3550 C30664     ERROR2   JMP RESTRT     ;WARM BOOT
```

```
CP/M MACRO ASSEM 2.0     #017     VIPER-X. GIL HYATT SYSTEM

                   ;
                   ;SUBROUTINE,LOAD A TABLE FROM FIFO. RE-ENTRANT.
                   ;REGISTERS NOT SAVED
                   ;
 3553 CD0364       EICD     CALL FIFRD         ;NUMBER OF WORDS ARE IN A.
 3556 DC4C35                CC ERROR1
 3559 3D                    DCR A
 355A E5                    PUSH H
 355B 2A6834                LHLD EGENK4        ;FETCH TABLE START ADDRESS
 355E 71                    MOV M.C
 355F 23                    INX H
 3560 70                    MOV M.B
 3561 23                    INX H
 3562 226834                SHLD EGENK4
 3565 E1                    POP H
 3566 B7                    ORA A              ;TEST A FOR ZERO
 3567 C25335                JNZ EICD           ;LOOP FOR NEXT WORD FROM FIFO
 356A C9                    RET
                   ;
                   ;SUBROUTINE.LOAD A TABLE INTO FIFO. RE-ENTRANT.
                   ;REGISTERS NOT SAVED.
                   ;
 356B E5           EICU     PUSH H             ;FIFO ADDRESS IN H.L;NO.OF WORDS IN A.
 356C 2A6834                LHLD EGENK4        ;TABLE ADDRESSED IN EGEN4.5
 356F 4E                    MOV C.M
 3570 23                    INX H
 3571 46                    MOV B.M
 3572 23                    INX H
 3573 226834                SHLD EGENK4
 3576 E1                    POP H
 3577 CD0C64                CALL FIFWR
 357A DC4C35                CC ERROR1
 357D 3D                    DCR A
 357E C8                    RZ                 ;TEST A FOR ZERO TO RETURN
 357F C36B35                JMP EICU           ;LOOP FOR NEXT WORD INTO FIFO
                   ;
 3582 216834       EICF7    LXI H.EGENK4       ;ADDRESS OF EGEN TABLE INTO EGENK4
 3585 115734                LXI D.EGENYS
 3588 73                    MOV M.E
 3589 23                    INX H
 358A 72                    MOV M.D
 358B 3E05                  MVI A.05           ;5-WORDS
 358D C9                    RET
                   ;
 358E 3E2E         COMSUR1  MVI A.'.'          ;LOAD COLORS INTO SURFACE MEMORY
 3590 322290                STA SURFAC+2
 3593 3E50                  MVI A.'P'
 3595 322690                STA SURFAC+6
 3598 3E4E                  MVI A.'N'
 359A 322A90                STA SURFAC+10
 359D 3E58                  MVI A.'X'
 359F 322E90                STA SURFAC+14
 35A2 3E59                  MVI A.'Y'
 35A4 323290                STA SURFAC+18
 35A7 3E42                  MVI A.'B'
 35A9 323690                STA SURFAC+22
```

```
8080 MACRO ASSEM 2.0     #018     VIPER-X. GIL HYATT SYSTEM

3EAC 3E30              MVI A,'0'
3EAE 321A90            STA SURFAC+26
3EB1 3E30              MVI A,'0'
3EB3 321E90            STA SURFAC+30
3EB6 3E31              MVI A,'1'          ;LOAD EDGE SMOOTHING SURFACE TABLE
3EB8 322290            STA SURFAC+34
3EBB 3E31              MVI A,'1'
3EBD 322690            STA SURFAC+38
3EC0 3E32              MVI A,'2'
3EC2 322A90            STA SURFAC+42
3EC5 3E33              MVI A,'3'
3EC7 322E90            STA SURFAC+46
3ECA 3E34              MVI A,'4'
3ECC 323290            STA SURFAC+50
3ECF 3E35              MVI A,'5'
3ED1 323690            STA SURFAC+54
3ED4 3E36              MVI A,'6'
3ED6 323A90            STA SURFAC+58
3ED9 3E37              MVI A,'7'
3EDB 323E90            STA SURFAC+62
3EDE C9                RET
                 ;
                 ;EXIT LOGIC
3EDF 78          TESTP6  MOV A,B          ;CHECK FOR X=63D
3EE0 D63F                SUI 63
3EE2 C2ED3E              JNZ TESTP7
3EE5 47                  MOV B,A          ;END OF THE LINE, 0=>X
3EE6 79                  MOV A,C          ;CHECK FOR Y=31D
3EE7 D61F                SUI 31
3EE9 C2EF3E              JNZ TESTP8
3EEC C9                  RET              ;END OF FRAME, A=0
3EED 04          TESTP7  INR B            ;NOT END OF LINE, X+1=>X
3EEE C9                  RET              ;A IS NOT ZERO
3EEF 0C          TESTP8  INR C            ;NOT LAST LINE,Y+1=>Y
3EF0 C9                  RET              ;A IS NOT ZERO
                 ;
3EF1 C9          TESTRT  RET              ;INSERT A SID BREAKPOINT HERE
                 ;
                 ;     DISPLAY STORAGE AREA
                 ;
7000                     ORG  STMEM
7000             IMAGE   DS   2000H
                 ;
                 ;  LOAD SURFACE COLOR TABLE
                 ;
9000             SURFAC  DS 40H
                 ;
                 ;---------DATA BASE MEMORY---------------------------------------
                 ;
                 ;                     DBM OBJECT LIBRARY
                 ;
                 ;     OBJECT MEMORY CONTAINS 8 POSSIBLE OBJECTS WITH 8 POSSIBLE
                 ;   VECTORS PER OBJECT.  EACH VECTOR REQUIRES 4 EIGHT BIT BYTES.
                 ;
9900                     ORG STMEM+2900H
                 ;
```

```
CP/M MACRO ASSEM 2.0     #019     VIPER-X, GIL HYATT SYSTEM

                  ;   OBJECT 0
                  ;      VECTOR 0
9900 02           DBOBJK   DB 2              ;CONNECTED EDGE
9901 08                    DB 08             ;X-ENDPOINT
9902 0C                    DB 12             ;Y-ENDPOINT
9903 00                    DB 0
                  ;      VECTOR 1
9904 00                    DB 0
9905 17                    DB 23
9906 0F                    DB 15
9907 80                    DB 80H
                  ;      VECTOR 2
9908 01                    DB 1
9909 11                    DB 17
990A 02                    DB 2
990B 40                    DB 40H
990C                       DS 20
                  ;   OBJECT 1
                  ;      VECTOR 0
9920 01                    DB 1
9921 14                    DB 20
9922 14                    DB 20
9923 40                    DB 40H
                  ;      VECTOR 1
9924 00                    DB 0
9925 04                    DB 4
9926 0C                    DB 12
9927 00                    DB 0
9928                       DS 24
                  ;   OBJECT 2
                  ;      VECTOR 0
9940 03                    DB 3
9941 10                    DB 16
9942 06                    DB 06
9943 00                    DB 0
                  ;      VECTOR 1
9944 00                    DB 0
9945 0C                    DB 12
9946 06                    DB 06
9947 80                    DB 80H
                  ;      VECTOR 2
9948 01                    DB 1
9949 0C                    DB 12
994A 10                    DB 16
994B 80                    DB 80H
                  ;      VECTOR 3
994C 02                    DB 2
994D 10                    DB 16
994E 10                    DB 16
994F C0                    DB 0C0H
9950                       DS 16
                  ;   OBJECT 3
                  ;        VECTOR 0
9960                       DS 32
                  ;OBJECT 4
                  ;          VECTOR 0
```

```
CROMEMCO MACRO ASSEM 3.0     #020     VIPER-X. GIL HYATT SYSTEM

9980 02              DB 2
9981 11              DB 17
9982 02              DB 2
9983 00              DB 0
             ;       VECTOR 1
9984 00              DB 0
9985 17              DB 23
9986 0F              DB 15
9987 80              DB 80H
             ;       VECTOR 2
9988 01              DB 1
9989 08              DB 8
998A 0C              DB 12
998B 40              DB 40H
998C                 DS 20
             ;
             ;                       DATA BASE INITIAL CONDITIONS
             ;
             ;     DBICON MEMORY CONTAINS 8 POSSIBLE ENTRIES WITH 8 BYTES
             ;  PER ENTRY.
             ;
             ;
             ;  DBICON 0                   ;8 ENTRIES PER OBJECT
99A0 00      DBICON  DB 0                  ;OBJECT NUMBER
99A1 00              DB 0
99A2 00              DB 0
99A3 00              DB 0
99A4 18              DB 18H                ;COLOR, SURFACE TABLE
99A5 00              DB 0
99A6 00              DB 0
99A7 00              DB 0
             ;  DBICON 1
99A8 01              DB 1
99A9 0A              DB 10
99AA 02              DB 2
99AB 04              DB 4
99AC 19              DB 19H
99AD 00              DB 0
99AE 00              DB 0
99AF 00              DB 0
             ;  DBICON 2
99B0 02              DB 2
99B1 00              DB 0
99B2 00              DB 0
99B3 00              DB 0
99B4 19              DB 19H
99B5 00              DB 0
99B6 00              DB 0
99B7 00              DB 0
             ;  DBICON 3
99B8 03              DB 3
99B9 00              DB 0
99BA 00              DB 0
99BB 00              DB 0
99BC 20              DB 20H
99BD 00              DB 0
```

```
CP/M MACRO ASSEM 2.0     #021     VIPER-X. GIL HYATT SYSTEM

 FFBE 00              DB 0
 FFBF 00              DB 0
              ;   DBIDIM 4
 FFC0 04              DB 4
 FFC1 00              DB 0
 FFC2 00              DB 0
 FFC3 00              DB 0
 FFC4 21              DB 21H
 FFC5 00              DB 0
 FFC6 00              DB 0
 FFC7 00              DB 0
              ;
 FFC8                 DS 16
              ;
              ;
              ;TI => TEST INSTRUMENTATION
              ;EM => EMULATED OPERATION
              ;EP => EDGE PIXEL FROM PIXEL MEMORY
              ;IP => INSIDE PIXEL FROM PIXEL MEMORY
              ;OP => OUTSIDE PIXEL FROM PIXEL MEMORY
              ;EF => EDGE PIXEL FROM FIFO
              ;---=> NOT USED BUT PRESERVED FOR DOCUMENTATION
              ;*   => NOT USED BUT PRESERVED FOR UPGRADE
              ;X   => NOT USED. WITH DELETION PENDING
              #    => ANNOTATIONS
              ;
 FFD8                 END BEGIN
```

TABLE OF COMPUTER LISTINGS

SPIRAL FILL PROCESSOR

```
                  ;       (THE BUG) LOOKS AT 8 PIXELS AROUND THE X AND Y COORDINAT
E
                  ;            AND FILLS AN 8 BIT WORD WITH THE STATUS DATA
                  ;
 14E3 60          FINDPX  MOV H,B
 14E4 69                  MOV L,C
 14E5 22C86F              SHLD SVALUE      ;FILL SVALUE WITH VERY FIRST PIXEL
 14E8 3ACA6F      FNDPX   LDA FLAGG1       ;CLEAR FLAG USED TO DEFINE THE END
 14EB AF                  XRA A            ; OF ROUTINE
 14EC 32CA6F              STA FLAGG1
 14EF C5                  PUSH B           ;SAVE ORIGINAL POSITION
 14F0 3ACD6F              LDA SXNUM        ;SAVES THE NUM. OF FULL PIXELS
 14F3 AF                  XRA A            ;ZERO OUT ACC.
 14F4 21CC6F              LXI H,SXSTAT     ;(H+L) = TPSW LOCATION
 14F7 32CD6F              STA SXNUM        ;=0
 14FA D5                  PUSH D
```

```
CP/M MACRO ASSEM 2.0     #016     VIPER-X.  GIL HYATT SYSTEM

 14FB 77                  MOV M,A
 14FC AF                  XRA A
 14FD F5                  PUSH PSW        ;PUSH PIXEL ON STACK
 14FE 04                  INR B           ;INC X
 14FF CD3515              CALL FNDSUB     ;0 POSITION (RIGHT)
 1502 0C                  INR C           ;INC Y
 1503 CD3515              CALL FNDSUB     ;1 POSITION (DIAG DR)
 1506 05                  DCR B           ;DEC X
 1507 CD3515              CALL FNDSUB     ;2 POSITION (DOWN)
 150A 05                  DCR B           ;DEC X
 150B CD3515              CALL FNDSUB     ;3 POSITION (DIAG DL)
 150E 0D                  DCR C           ;DEC Y
 150F CD3515              CALL FNDSUB     ;4 POSITION (LEFT)
 1512 0D                  DCR C           ;DEC Y
 1513 CD3515              CALL FNDSUB     ;5 POSITION (DIAG UL)
 1516 04                  INR B           ;INC X
 1517 CD3515              CALL FNDSUB     ;6 POSITION (UP)
 151A 04                  INR B           ;INC X
 151B CD3515              CALL FNDSUB     ;7 POSITION (DIAG UR)
 151E F1                  POP PSW
 151F D1                  POP D
 1520 C1                  POP B           ;ORIGINAL PIXEL
 1521 3ACD6F              LDA SXNUM
 1524 FE08                CPI 08H         ;IF ALL PIXELS FULL THEN
 1526 CA4F15              JZ FNDSB2       ;      CHECK FOR SET FLAGS
 1529 CD6315              CALL SXFILL     ;FILL PRESENT PIXEL AND
 152C 3ACA6F              LDA FLAGG1      ;      GET NEW PIXEL
 152F FE09                CPI 09H
 1531 C8                  RZ              ;END OF BUG
 1532 C3E814              JMP FNDPX       ;RET FOR NEXT PIXEL STATUS
 1535 CD3364      FNDSUB  CALL RDMEM      ;GET PIXEL COLOR
 1538 7B                  MOV A,E
 1539 E63F                ANI 3FH         ;BIT 0-5
 153B CA4B15              JZ FNDSB1       ;IF DONT CMP. PIXEL EMPTY
 153E 3ACD6F              LDA SXNUM
 1541 3C                  INR A           ;COUNT # OF GOOD CMPS
 1542 32CD6F              STA SXNUM
 1545 7E                  MOV A,M         ;PUT "1" IN TPSW (BIT 7)
 1546 0F                  RRC
 1547 F680                ORI 80H
 1549 77                  MOV M,A
 154A C9                  RET
 154B 7E          FNDSB1  MOV A,M
 154C 0F                  RRC
 154D 77                  MOV M,A         ;PUT "0" IN TPSW
 154E C9                  RET
 154F CDF515      FNDSB2  CALL LDPX       ;FILL LAST PIXEL
 1552 2AC86F              LHLD SVALUE     ;LOAD LAST ACCESSED FLAG SET PIXEL
 1555 44                  MOV B,H
 1556 4D                  MOV C,L
 1557 CD6315              CALL SXFILL     ;CHECK IF ALL SURROUNDING PIXEL FLAGS
 155A 3ACA6F              LDA FLAGG1              ;ARE CLEAR
 155D FE09                CPI 09H
 155F C8                  RZ
 1560 C3E814              JMP FNDPX
```

```
CP/M MACRO ASSEM 2.0     #017    VIPER-X.  GIL HYATT SYSTEM

                   ;        THIS ROUTINE FILLS PRESENT PIXEL AND LOCATES NEW PIXEL
                   ;
                   ;        SXFILL - LT=0, DN=0, RT=0, UP=  - NEW PIXEL RT
                   ;        SXFIL1 - LT=1, DN=0, RT=1, UP=1 - NEW PIXEL DN
                   ;        SXFIL2 - LT=1, DN= , RT= , UP=0 - NEW PIXEL UP
                   ;        SXFIL3 - LT=1, DN=1, RT=0, UP=1 - NEW PIXEL RT
                   ;        SXFIL5 - SAME AS SXFIL1 BUT DOES THE FILLING
                   ;        SXFIL6 - LT=0, DN=1, RT= , UP=  - NEW PIXEL LT
                   ;        SXFIL8 - CALLED IF ALL LOCATIONS ARE 1 OR ANY DIAGS
                   ;
1563 21CC6F        SXFILL  LXI H,SXSTAT     ;STATUS OF SURROUNDING PIXELS
1566 7E                    MOV A,M
1567 E610                  ANI 10H          ;4 POS. (LEFT)
1569 C28015                JNZ SXFIL2       ;FULL
156C 7E                    MOV A,M
156D E604                  ANI 04H          ;DN
156F C2AA15                JNZ SXFIL6
1572 7E            SXFIL1  MOV A,M
1573 E601                  ANI 01H          ;RT
1575 C2A215                JNZ SXFIL5
1578 CDF515                CALL LDPX        ;FILLS PRESENT PIXEL
157B CDFE15                CALL FLGFILL     ;SETS FLAG
157E 04                    INR B            ;RT
157F C9                    RET
1580 7E            SXFIL2  MOV A,M
1581 E640                  ANI 40H          ;UP
1583 C28E15                JNZ SXFIL3
1586 CDF515                CALL LDPX
1589 CDFE15                CALL FLGFILL
158C 0D                    DCR C            ;UP
158D C9                    RET
158E 7E            SXFIL3  MOV A,M
158F E604                  ANI 04H          ;2 POS (DOWN)
1591 CA7215                JZ SXFIL1
1594 7E                    MOV A,M
1595 E601                  ANI 01H
1597 C2B215                JNZ SXFIL8       ;ONLY DIAG OPEN OR ALL FILLED
159A CDF515                CALL LDPX
159D CDFE15                CALL FLGFILL
15A0 04                    INR B            ;RT
15A1 C9                    RET
15A2 CDF515        SXFIL5  CALL LDPX
15A5 CDFE15                CALL FLGFILL
15A8 0C                    INR C            ;DN
15A9 C9                    RET
15AA CDF515        SXFIL6  CALL LDPX
15AD CDFE15                CALL FLGFILL
15B0 05                    DCR B            ;LT
15B1 C9                    RET
                   ;
15B2 D5            SXFIL8  PUSH D           ;SAVE COLOR
15B3 CDF515                CALL LDPX
15B6 CD0616                CALL FLGCLR      ;CLEARS FLAG
15B9 04                    INR B            ;RIGHT
15BA CD3364                CALL RDMEM
15BD 7B                    MOV A,E
```

```
CP/M MACRO ASSEM 2.0     #018     VIPER-X.  GIL HYATT SYSTEM

 15BE E620               ANI 20H         ;LOOK FOR SET FLAG
 15C0 C2EE15             JNZ FLGCHK      ;   IN BIT 5
 15C3 05                 DCR B
 15C4 05                 DCR B           ;LEFT
 15C5 CD3364             CALL RDMEM
 15C8 7B                 MOV A,E
 15C9 E620               ANI 20H
 15CB C2EE15             JNZ FLGCHK
 15CE 04                 INR B
 15CF 0C                 INR C           ;DOWN
 15D0 CD3364             CALL RDMEM
 15D3 7B                 MOV A,E
 15D4 E620               ANI 20H
 15D6 C2EE15             JNZ FLGCHK
 15D9 0D                 DCR C
 15DA 0D                 DCR C           ;UP
 15DB CD3364             CALL RDMEM
 15DE 7B                 MOV A,E
 15DF E620               ANI 20H
 15E1 C2EE15             JNZ FLGCHK
 15E4 D1                 POP D
 15E5 3ACA6F             LDA FLAGG1      ;ALL 8 PIXELS ARE FULL
 15E8 3E09               MVI A,09H       ;AND NO FLAGS ARE SET
 15EA 32CA6F             STA FLAGG1      ;EXIT BUG
 15ED C9                 RET
                ;
 15EE 60        FLGCHK   MOV H,B
 15EF 69                 MOV L,C
 15F0 22C86F             SHLD SVALUE     ;STORE PIXEL THAT HAS THE SET FLAG
 15F3 D1                 POP D
 15F4 C9                 RET
                ;
                ;        FILL PRESENT PIXEL
                ;        B=X COORDINATE      C=Y COORDINATE
                ;
 15F5 D5        LDPX     PUSH D
 15F6 CD3364             CALL RDMEM
 15F9 D1                 POP D
 15FA CD3064             CALL LDMEM      ;FILL OLD PIXEL POS WITH CHAR
 15FD C9                 RET
                ;
                ;                FILL OR CLEAR FLAG
 15FE 7B        FLGFILL  MOV A,E
 15FF F620               ORI 20H
 1601 5F                 MOV E,A
 1602 CD3064             CALL LDMEM
 1605 C9                 RET
 1606 7B        FLGCLR   MOV A,E
 1607 E6DF               ANI 0DFH
 1609 5F                 MOV E,A
 160A CD3064             CALL LDMEM
 160D C9                 RET
                ;
```

TABLE OF COMPUTER LISTINGS

REFRESH MEMORY AND SURFACE MEMORY

```
                ;       CALL TO CLEAR PIXEL MEMORY
                ;
160E CD3964     CLPIX   CALL CLMEM
```

```
CP/M MACRO ASSEM 2.0    #019    VIPER-X.  GIL HYATT SYSTEM

 1611 C30912             JMP XSTRT1
                 ;
                 ;    DISPLAY STORAGE AREA
                 ;
 7000                    ORG   STMEM
 7000            IMAGE   DS    2000H
                 ;
                 ;  LOAD SURFACE COLOR TABLE
                 ;
 9000            SURFAC  DS 40H
                 ;
 9060                    ORG STMEM+2060H
                 ;
                 ;  MESSAGE TABLE
                 ;
 9060 4E4F542046MES00    DB 'NOT FOUND!'
 906A 0D                 DB 0DH
 906B 3C3C564950MES01    DB '<<VIPER-X>>'
 9076 0D                 DB 0DH
 9077 4255464645MES03    DB 'BUFFER ALMOST FULL - USE "CLBUF"'
 9097 0D                 DB 0DH
 9098 4255464645MES02    DB 'BUFFER NOT CLEARED - USE "CLBUF"'
 90B8 0D                 DB 0DH
 90B9 4F424A4543MES04    DB 'OBJECT NUMBER OUT OF BOUNDS!'
 90D5 0D                 DB 0DH
 90D6 434F4D4D41MES05    DB 'COMMAND?'
 90DE 0D                 DB 0DH
 90DF 0A                 DB 0AH
                 ;
 9200                    ORG STMEM+2200H
                 ;
                 ;  PARAMETER COMMAND TABLE
                 ;
 9200 47         COMND   DB 'G'
 9201 0D                 DB 0DH
 9202 4F42               DB 'OB'
 9204 0D                 DB 0DH
 9205 4458               DB 'DX'
 9207 0D                 DB 0DH
 9208 0A                 DB 0AH
                 ;
 9300                    ORG STMEM+2300H
```

```
                  ;  REFRESH CRT SUBROUTINE
                  ;     THIS ROUTINE SAVES ALL REGISTERS AND FLAGS.
                  ;
                  ;     A CALL TO THIS RE-ENTRANT SUBROUTINE WILL CAUSE THE
                  ;CONTENTS OF IMAGE MEMORY TO BE TRANSFERED THROUGHT THE
                  ;COLOR TABLE TO THE CRT DISPLAY.
                  ;
                  ;     THE SUBROUTINE WILL DISPLAY 64 CHARACTERS BY 24
                  ;LINES STARTING AT THE IMAGE MEMORY LOCATION DEFINED IN
                  ;THE MEMORY LOCATION DSTART.  DSTART WILL BE INITIALIZED
                  ;TO THE VALUE IMAGE ON POWER UP WHICH WILL CAUSE THE FIRST
                  ;24 OF THE 64 POSSIBLE LINES TO BE DISPLAYED.  THE
                  ;EXECUTIVE ROUTINES CAN CHANGE DSTART TO CAUSE OTHER
                  ;AREAS TO BE DISPLAYED.
                  ;
65C6 F5           XREFSH  PUSH PSW        ;SAVE ALL FLAGS AND REGISTERS
65C7 C5                   PUSH B
65C8 D5                   PUSH D
65C9 E5                   PUSH H
65CA 2AC26F               LHLD DSTART     ;SET REG. H.L TO DISPLAY START
65CD 11FF0B               LXI  D,DSIZE    ;SET REG. D.E TO DISPLAY SIZE
65D0 19                   DAD  D          ;ADD D.E TO H.L=DISPLAY END
65D1 EB                   XCHG            ;SET REG. D.E TO DISPLAY END
65D2 2AC26F               LHLD DSTART     ;SET REG. H.L TO DISPLAY START
65D5 0600                 MVI  B,0        ;SET CHARACTER COUNTER TO ZERO
65D7 E5           RFRH1   PUSH H          ;SAVE H.L
65D8 CD2A64               CALL DBSUB      ;(H,L) = (D,E) - (H,L)
65DB E1                   POP  H          ;LOAD H.L
65DC D20666               JNC  REFEXT     ;CARRY FLAG=0 IF (H,L)>(D,E)
```

```
CP/M MACRO ASSEM 2.0     #009     VIPER-X.  GIL HYATT SYSTEM

 65DF 78                MOV   A,B        ;IF NOT DONE, CHECK CHARACTER
 65E0 FE40              CPI   DPLINE     ;IS CHARACTER EQUAL TO DISPLAY LINE?
 65E2 C2EA65            JNZ   RFRH2      ;JUMP IF CHAR.# IS NOT END OF LINE
 65E5 0600              MVI   B,0        ;SET CHARACTER COUNTER TO ZERO
 65E7 CD2764            CALL  CRLF       ;GO TO NEXT DISPLAY LINE
 65EA 04        RFRH2   INR   B          ;INCREMENT CHARACTER COUNTER
 65EB 7E                MOV   A,M        ;LOAD BYTE 0 OF IMAGE MEM. TO A
 65EC 23                INX   H          ;SET H,L TO NEXT WORD IN IMAGE
 65ED 23                INX   H          ;  MEMORY.   (H,L)=(H,L)+2
 65EE E60F              ANI   0FH        ;MASK FOR SURFACE NO. (BITS 0-3)
 65F0 07                RLC              ;MULT A * 4
 65F1 07                RLC
 65F2 3C                INR A            ;INC BY 2
 65F3 3C                INR A
 65F4 D5                PUSH D           ;SAVE D,E
 65F5 E5                PUSH H           ;SAVE H,L
 65F6 1600              MVI   D,0        ;SET D,E TO VALUE OF SURFACE BITS
 65F8 5F                MOV   E,A
 65F9 210090            LXI   H,SURFAC   ;SET H,L TO BASE OF SURFACE TABLE 9000H
 65FC 19                DAD   D          ;(H,L) + A  SURFACE ADDRESS
 65FD 7E                MOV   A,M        ;LOAD COLOR SYMBOL FROM TABLE TO A
 65FE E1                POP   H          ;LOAD H,L
 65FF D1                POP   D          ;LOAD D,E
 6600 CD0964            CALL  OUTTY      ;OUTPUT COLOR SYMBOL TO DISPLAY
 6603 C3D765            JMP   RFRH1      ;LOOP BACK FOR NEXT IMAGE MEM. WORD
 6606 E1        REFEXT  POP   H          ;EXIT ROUTINE - RESTORE ALL REGISTERS
 6607 D1                POP   D
 6608 C1                POP   B
 6609 F1                POP   PSW
 660A CD2164            CALL  PRINT
 660D C9                RET              ;RETURN TO CALLING ROUTINE
                ;
                ;  PRINT CRT DISPLAY
                ;
 660E F5        XPRINT  PUSH PSW
 660F 3AC16F            LDA SFWORD
 6612 E601              ANI 1
 6614 CA6566            JZ PREXT2
 6617 C5                PUSH B
 6618 D5                PUSH D
 6619 E5                PUSH H
 661A 2AC26F            LHLD DSTART
 661D 11FF0B            LXI D,DSIZE
 6620 19                DAD D
 6621 EB                XCHG
 6622 2AC26F            LHLD DSTART
 6625 0600              MVI B,0
 6627 E5        PRINT1  PUSH H
 6628 CD2A64            CALL DBSUB
 662B E1                POP H
 662C D25D66            JNC PREXIT
 662F 78                MOV A,B
 6630 FE40              CPI DPLINE
 6632 C24166            JNZ PRINT2
 6635 0600              MVI B,0
 6637 3E0D              MVI A,0DH
```

```
CP/M MACRO ASSEM 2.0     #010    VIPER-X.  GIL HYATT SYSTEM

6639 CD1B64             CALL PRNTO
663C 3E0A               MVI A,0AH
663E CD1B64             CALL PRNTO
6641 04         PRINT2  INR B
6642 7E                 MOV A,M
6643 23                 INX H
6644 23                 INX H
6645 E60F               ANI 0FH
6647 07                 RLC
6648 07                 RLC
6649 3C                 INR A
664A 3C                 INR A
664B D5                 PUSH D
664C E5                 PUSH H
664D 1600               MVI D,0
664F 5F                 MOV E,A
6650 210090             LXI H,SURFAC
6653 19                 DAD D
6654 7E                 MOV A,M
6655 E1                 POP H
6656 D1                 POP D
6657 CD1B64             CALL PRNTO
665A C32766             JMP PRINT1
665D 3E0C       PREXIT  MVI A,0CH
665F CD1B64             CALL PRNTO
6662 E1                 POP H
6663 D1                 POP D
6664 C1                 POP B
6665 F1         PREXT2  POP PSW
6666 C9                 RET
                ;
                ;  PRINT CONTROL ROUTINE
                ;
                ;     THIS ROUTINE CONTROLS THE ABOVE PRINT ROUTINE BY
                ;TOGGLING THE PRINT CONTROL FLAG (BIT 0) OF THE COMMAND
                ;FLAG WORD (FWORD).  IF BIT 0 IS "0" THEN THE PRINT
                ;ROUTINE WILL NOT PRINT.  IF BIT 0 IS A "1" THEN THE
                ;PRINT ROUTINE WILL PRINT.  UPON POWER UP OR AFTER THE
                ;ESCAPE KEY IS DEPRESSED, BIT 0 IS SET TO "0" (PRINT OFF).
                ;EACH SUBSEQUENT "P" COMMAND WILL REVERSE OR TOGGLE THE
                ;PRINT CONTROL BIT. (BIT 0)
                ;
6667 F5         XPTCON  PUSH PSW
6668 3AC16F             LDA SFWORD
666B 1F                 RAR
666C 3F                 CMC
666D 17                 RAL
666E 32C16F             STA SFWORD
6671 C30C10             JMP START1
                ;
                ;  NEW DISPLAY LINE SUBROUTINE
                ;     THIS ROUTINE SAVES ALL REGISTERS AND FLAGS.
                ;
                ;     A CALL TO THIS RE-ENTRANT SUBROUTINE CAUSES THE
                ;THE DISPLAY TO MOVE TO THE NEXT LINE.  OUTPUTS A
                ;CARRIAGE RETURN AND A LINE FEED TO THE DISPLAY.
```

```
CP/M MACRO ASSEM 2.0     #011     VIPER-X.   GIL HYATT SYSTEM

                    ;
 6674 F5            XCRLF   PUSH PSW        ;SAVE A AND FLAGS.
 6675 3E0D                  MVI  A,0DH      ;OUTPUT CAR. RET.(CR)
 6677 CD0964                CALL OUTTY
 667A 3E0A                  MVI  A,0AH      ;OUTPUT LINE FEED (LF)
 667C CD0964                CALL OUTTY
 667F F1                    POP  PSW        ;LOAD A AND FLAGS.
 6680 C9                    RET
                    ;
```

```
                   ;
                   ;              SURMEM - LOADS SURFMO AND SURFM1 INTO SURFAC
                   ;
                   ;       ALL REGISTERS ARE SAVED.
                   ;       PASSING REGISTERS
                   ;         D: BITS 0-5 = RANGE
                   ;            BITS 6-7 = FIXED PRIORITY
                   ;         E: BITS 0-4 = FLAGS
                   ;            BITS 5-7 = OBJECT I.D.
                   ;         H: BITS 0-1 = FLAGS
                   ;            BITS 2-7 = SURFACE
                   ;         L: BITS 0-7 = COLOR
                   ;         A: BITS 0-3 = SURFACE NO.
                   ;
                   ;     THIS ROUTINE FILLS MEMORY LOCATION 9000H (SURFAC) WITH
                   ; THE CONTENTS OF H (SURFM1) AND D (SURFMO).  SURFAC IS THE
                   ; LOADING OF THE SURFACE COLOR TABLE.
                   ;
67EA F5            XSURMM  PUSH PSW
67EB E60F                  ANI 0FH          ;SET TO MODULO 16
67ED 07                    RLC              ;MULT A*4
67EE 07                    RLC              ;A=SURFACE NO.
67EF C5                    PUSH B
67F0 E5                    PUSH H           ;SAVE SURFM1
```

```
CP/M MACRO ASSEM 2.0     #018     VIPER-X.  GIL HYATT SYSTEM

 67F1 D5                    PUSH D            ;SAVE SURFMO
 67F2 4D                    MOV C,L           ;H+L TO B+C
 67F3 44                    MOV B,H
 67F4 210090                LXI H,SURFAC      ;H=9000H
 67F7 1600                  MVI D,OH          ;CLEAR D
 67F9 5F                    MOV E,A           ;E=SURFACE NO.
 67FA 19                    DAD D             ;ADD SURFACE NO. TO 9000H FOR PNTR.
 67FB D1                    POP D             ;POP SUURFMO
 67FC 73                    MOV M,E           ;OBJ I.D. + FLAGS
 67FD 23                    INX H
 67FE 72                    MOV M,D           ;FIXED PRIORITY + RANGE
 67FF 23                    INX H
 6800 71                    MOV M,C           ;COLOR
 6801 23                    INX H
 6802 70                    MOV M,B           ;SURFACE + FLAGS
 6803 E1                    POP H
 6804 C1                    POP B
 6805 F1                    POP PSW
 6806 C9                    RET
                   ;
                   ;        THIS ROUTINE READS THE SURFACE TABLES MEMORY
                   ;
 6807 F5           XRDSRM   PUSH PSW          ;SAVE THE ACCUMULATOR
 6808 C5                    PUSH B
 6809 E60F                  ANI OFH           ;SET TO MODULO 16
 680B 07                    RLC               ;A * 4
 680C 07                    RLC
 680D 210090                LXI H,SURFAC      ; SURFACE TABLE AT 9000H
 6810 1600                  MVI D,OH
 6812 5F                    MOV E,A
 6813 19                    DAD D             ;A + SURFAC
 6814 5E                    MOV E,M           ;D+E = SURFMO
 6815 23                    INX H
 6816 56                    MOV D,M
 6817 23                    INX H
 6818 4E                    MOV C,M           ;B+C = SURFM1
 6819 23                    INX H             ;B+C USED AS TEMPORARY STORAGE
 681A 46                    MOV B,M
 681B 23                    INX H
 681C 69                    MOV L,C           ;H+L = B+C
 681D 60                    MOV H,B
 681E C1                    POP B
 681F F1                    POP PSW
 651F C9                    RET
```

```
                ;  CPM VERSION PROGRAM SUBROUTINES--MODIFIED TO LINK TO THE
                ;STANDARD CPM CALLS.
                ;
                ;  CRT OUTPUT ROUTINE
                ;
6535 F5         XOUTTY  PUSH PSW
6536 C5                 PUSH B
6537 D5                 PUSH D
6538 E5                 PUSH H
6539 5F                 MOV E,A
653A 0E02               MVI C,02H
653C CD0500             CALL 0005H
653F E1                 POP H
6540 D1                 POP D
6541 C1                 POP B
6542 F1                 POP PSW
6543 C9                 RET
                ;
                ;  CRT INPUT ROUTINE
                ;
6544 C5         XINTTY  PUSH B
6545 D5                 PUSH D
6546 E5                 PUSH H
6547 0E01               MVI C,01H
6549 CD0500             CALL 0005H
654C E67F               ANI 7FH
654E FE1B               CPI 1BH
6550 CA0664             JZ RESTRT
6553 E1                 POP H
6554 D1                 POP D
6555 C1                 POP B
6556 C9                 RET
                ;
                ;  CRT INPUT ROUTINE FOR DISPLAY PROGRAM
                ;
                ;     THIS INPUT SUBROUTINE DIFFERS FROM THE ABOVE INPUT ROUTIN
                ;IN THAT IT DOSEN'T WAIT FOR A KEYBOARD INPUT.  IF THERE IS A
                ;VALID INPUT, THE ROUTINE WILL RETURN TO THE CALLING ROUTINE WI
H
                ;THE INPUT CHARACTER IN THE ACCUMULATOR (REG. A) AND THE CARRY
```

```
                ;FLAG SET TO ONE.  IF THERE IS NOT A VALID INPUT, THE ROUTINE WI
LL
                ;RETURN WITH THE ACCUMULATOR RESTORED TO IT'S ORIGINAL VALUE AND
                ;THE CARRY FLAG SET TO ZERO.  ALL OTHER REGISTERS ARE UNCHANGED.
                ;
 6557 C5        XINPUT  PUSH B
 6558 D5                PUSH D
 6559 E5                PUSH H
 655A F5                PUSH PSW        ;SAVE ACCUMULATOR
 655B 0E06              MVI C,06H
 655D 1EFF              MVI E,0FFH
 655F CD0500            CALL 0005H
 6562 A7                ANA A
 6563 CA7565            JZ INPUTE       ;TEST FOR VALID KEYBOARD INPUT
 6566 5F                MOV E,A
 6567 F1                POP PSW         ;IF INPUT, DISCARD OLD REG. "A"
 6568 7B                MOV A,E
 6569 E1                POP H
 656A D1                POP D
 656B C1                POP B
 656C E67F              ANI 7FH         ;STRIP PARITY BIT
 656E FE1B              CPI 1BH         ;CHECK FOR "ESCAPE KEY"
 6570 CA0664            JZ  RESTRT      ;IF ESCAPE, GO TO COMMAND LEVEL
 6573 37                STC             ;SET CARRY FLAG TO ONE.
 6574 C9                RET
 6575 F1        INPUTE  POP PSW         ;IF NO INPUT, RESTORE OLD REG. A
 6576 E1                POP H
 6577 D1                POP D
 6578 C1                POP B
 6579 37                STC             ;SET CARRY FLAG TO ZERO
 657A 3F                CMC
 657B C9                RET
                ;
                ;  PRINTER DATA STROBE ROUTINE
                ;
 657C F5        XSTRBE  PUSH PSW
 657D 3E0E              MVI A,0EH
 657F D3ED              OUT 0EDH
 6581 3E0F              MVI A,0FH
 6583 D3ED              OUT 0EDH
 6585 F1                POP PSW
 6586 C9                RET
                ;
                ;  INITIALIZE PRINTER ROUTINE
                ;
 6587 F5        XINITP  PUSH PSW
 6588 3E0F              MVI A,0FH
 658A D3ED              OUT 0EDH
 658C CD1864            CALL DELAY
 658F 3E0D              MVI A,0DH
 6591 D3ED              OUT 0EDH
 6593 CD1864            CALL DELAY
 6596 3E0F              MVI A,0FH
 6598 D3ED              OUT 0EDH
 659A 3EFF              MVI A,0FFH
 659C 3D        INITP1  DCR A
 659D CD1864            CALL DELAY
```

```
CP/M MACRO ASSEM 2.0     #008     VIPER-X.  GIL HYATT SYSTEM

 65A0 C29C65            JNZ INITP1
 65A3 3E11              MVI A,11H
 65A5 D3EC              OUT 0ECH
 65A7 CD1264            CALL STRBE
 65AA F1                POP PSW
 65AB C30001            JMP BEGIN
                  ;
                  ;  DELAY ROUTINE
                  ;
 65AE F5          XDELAY  PUSH PSW
 65AF 3EFF              MVI A,0FFH
 65B1 3D          LOOPD  DCR A
 65B2 C2B165            JNZ LOOPD
 65B5 F1                POP PSW
 65B6 C9                RET
                  ;
                  ;  PRINTER OUTPUT ROUTINE
                  ;
 65B7 F5          XPRNTO  PUSH PSW
 65B8 DBEC        LOOPP  IN 0ECH
 65BA E602              ANI 2
 65BC C2B865            JNZ LOOPP
 65BF F1                POP PSW
 65C0 D3EC              OUT 0ECH
 65C2 CD1264            CALL STRBE
 65C5 C9                RET
                  ;
```

```
;  FORM AN ADDRESS IN IMAGE MEMORY SUBROUTINE
;
;     THIS SUBROUTINE FORMS AN ADDRESS IN IMAGE MEMORY
;FROM THE SIX LEAST SIGNIFICANT BITS IN REGISTERS B AND C.
;THE RESULT IS A 12 BIT CONCATENATION STORED IN REGISTERS
;H AND L.  THE SIX MSB'S OF THE 12 BIT CONCATENATION ARE
;FROM REG. C AND THE SIX LSB'S ARE FROM REG. B.  ONLY REG D.
;THE ACCUMULATOR, AND FLAGS ARE SAVED.
;
6758 F5          XIMADD  PUSH PSW         ;SAVE ACCUMULATOR AND FLAGS
```

```
6759 D5          PUSH D           ;SAVE REG. "D"
675A 78          MOV  A,B         ;GET "X" POSITION AND PUT
                                  ;  IT IN THE ACCUMULATOR.
675B E63F        ANI  03FH        ;MASK LOWER SIX BITS.
675D 5F          MOV  E,A         ;STORE 6 LSB IN REG. "E".
675E 79          MOV  A,C         ;GET "Y" POSITION AND PUT
                                  ;  IT IN THE ACCUMULATOR.
675F E603        ANI  3           ;MASK LOWER TWO BITS.
6761 0F          RRC              ;MOVE TO 2 MSB.
6762 0F          RRC
6763 83          ADD  E           ;ADD TO (REG."E")
6764 5F          MOV  E,A         ;STORE SUM IN REG."E".
6765 79          MOV  A,C         ;GET "Y" POSITION.
6766 E63C        ANI  3CH         ;MASK BITS 2 THROUGH 5.
6768 0F          RRC              ;MOVE TO 4 LSB.
6769 0F          RRC
676A 57          MOV  D,A         ;STORE IN REG."D".
676B 210070      LXI  H,IMAGE     ;SET H,L TO IMAGE MEMORY.
676E EB          XCHG             ;EXCHANGE H,L WITH D,E.
676F 29          DAD  H           ;(H,L)=(H,L) TIMES 2.
6770 19          DAD  D           ;(H,L)=(H,L)+(D,E)
6771 D1          POP  D           ;RESTORE REG. "D"
6772 F1          POP  PSW         ;RESTORE ACCUMULATOR AND FLAGS
6773 C9          RET
```

I claim:

1. A transform processor system comprising:

an input circuit generating a driving function signal;

a memory storing a plurality of input points, each input point having a plurality of parameters;

a coefficient processor generating transform coefficients in response to the driving function signal;

a first transform processor coupled to the coefficient processor and to the memory and generating a first transformed point in response to a first one of the plurality of input points stored by the memory and in response to the transform coefficients;

a second transform processor coupled to the coefficient processor and to the memory and generating a second transformed point in response to a second one of the plurality of input points stored by the memory and in response to the same transform coefficients as used for the generation of the first transform point; and an output circuit coupled to the first transform processor and to the second transform processor and generating transformed output signals in response to the first transformed point and the second transformed point.

2. A transform processor system as set forth in claim 1, wherein the input circuit is an incremental input circuit generating the driving function signal as an incremental driving function signal.

3. A transform processor system as set forth in claim 1, wherein the input circuit is an incremental input circuit generating the driving function signal as an incremental driving function signal and wherein the coefficient processor is an incremental coefficient processor generating the plurality of transform coefficients by incrementally processing the incremental driving function signal.

4. A transform processor system as set forth in claim 1, wherein the input circuit is an incremental input circuit generating the driving function signal as an incremental driving function signal, wherein the coefficient processor is an incremental coefficient processor generating the plurality of transform coefficients by incrementally processing the incremental driving function signal, wherein the first transform processor is a first incremental transform processor generating the first transformed point by incrementally processing the first one of the plurality of input points stored by the memory in response to the transform coefficients, and wherein the second transform processor is a second incremental transform processor generating the second transformed point by incrementally processing the second one of the plurality of input points stored by the memory in response to the same transform coefficients.

5. A transform processor system as set forth in claim 1, further comprising an operator display coupled to the output circuit and generating an operator display in response to the transformed output signals.

6. A transform processor system as set forth in claim 1, wherein the input circuit includes a rotation device generating a rotation driving function command signal and a translation device generating a translation driving function command signal, wherein the coefficient processor generates the transform coefficients in response to the rotation driving function command signal and in response to the translation driving function command signal.

7. A transform processor system comprising:

an input circuit generating a driving function signal;

a memory storing a plurality of input points, each input point having a plurality of parameters;

a coefficient processor generating a plurality of coefficients in response to the driving function signal;

a transform processor coupled to the coefficient processor and to the memory and generating a plurality of transformed points in response to the plurality of input points stored by the memory and in response to the same coefficients; and an output circuit coupled to the transform processor and generating transformed output signals in response to the plurality of transformed points.

8. A transform processor system as set forth in claim 7, wherein the input circuit is an incremental input circuit generating the driving function signal as an incremental driving function signal.

9. A transform processor system as set forth in claim 7, wherein the input circuit is an incremental input circuit generating the driving function signal as an incremental driving function signal and wherein the coefficient processor is an incremental coefficient processor generating the plurality of coefficients by incrementally processing the incremental driving function signal.

10. A transform processor system as set forth in claim 7, wherein the input circuit is an incremental input circuit generating the driving function signal as an incremental driving function signal, wherein the coefficient processor is an incremental coefficient processor generating the plurality of coefficients by incrementally processing the incremental driving function signal, and wherein the transform processor is an incremental transform processor generating the plurality of transformed points by incrementally processing the plurality of input points stored by the memory in response to the same coefficients.

11. A transform processor system as set forth in claim 7, further comprising an operator display coupled to the output circuit and generating an operator display in response to the transformed output signals.

12. A transform processor system as set forth in claim 7, wherein the input circuit includes a rotation device generating a rotation driving function command signal and a translation device generating a translation driving function command signal, wherein the coefficient processor generates the plurality of coefficients in response to the rotation driving function command signal and in response to the translation driving function command signal.

13. A transform processor system comprising:

an input circuit generating a driving function signal;

a memory storing a plurality of input points, each input point having a plurality of parameters;

a hierarchal coefficient processor generating hierarchal transform coefficients that are common to a plurality of input points in response to the driving function signal;

a first transform processor coupled to the hierarchal coefficient processor and to the memory and generating a first transformed point in response to a first one of the plurality of input points stored by the memory and in response to the hierarchal transform coefficients;

a second transform processor coupled to the hierarchal coefficient processor and to the memory and generating a second transformed point in response to a second one of the plurality of input points stored by the memory and in response to the same hierarchal transform coefficients as used for the generation of the first transform point; and an output circuit coupled to the first transform processor and to the second transform processor and generating transformed output signals in response to the first transformed point and the second transformed point.

14. A transform processor system as set forth in claim 13, wherein the input circuit is an incremental input circuit generating the driving function signal as an incremental driving function signal.

15. A transform processor system as set forth in claim 13, wherein the input circuit is an incremental input circuit generating the driving function signal as an incremental driving function signal and wherein the hierarchal coefficient processor is an incremental hierarchal coefficient processor generating the hierarchal transform coefficients by incrementally processing the incremental driving function signal.

16. A transform processor system as set forth in claim 13, wherein the input circuit is an incremental input circuit generating the driving function signal as an incremental driving function signal, wherein the hierarchal coefficient processor is an incremental hierarchal coefficient processor generating the hierarchal transform coefficients by incrementally processing the incremental driving function signal, wherein the first transform processor is a first incremental transform processor generating the first transformed point by incrementally processing the first one of the plurality of input points stored by the memory in response to the hierarchal transform coefficients, and wherein the second transform processor is a second incremental transform processor generating the second transformed point by incrementally processing the second one of the plurality of input points stored by the memory in response to the same hierarchal transform coefficients.

17. A transform processor system as set forth in claim 13, further comprising an operator display coupled to the output circuit and generating an operator display in response to the transformed output signals.

18. A transform processor system as set forth in claim 13, wherein the input circuit includes a rotation device generating a rotation driving function command signal and a translation device generating a translation driving function command signal, wherein the hierarchal coefficient processor generates the hierarchal transform coefficients in response to the rotation driving function command signal and in response to the translation driving function command signal.

19. A transform processor system comprising:

an input circuit generating a driving function signal;

a memory storing a plurality of input points, each input point having a plurality of parameters;

a hierarchal coefficient processor generating a plurality of hierarchal coefficients in response to the driving function signal;

a transform processor coupled to the hierarchal coefficient processor and to the memory and generating a plurality of transformed points in response to the plurality of input points stored by the memory and in response to the same hierarchal coefficients; and an output circuit coupled to the transform processor and generating transformed output signals in response to the plurality of transformed points.

20. A transform processor system as set forth in claim 19, wherein the input circuit is an incremental input circuit generating the driving function signal as an incremental driving function signal.

21. A transform processor system as set forth in claim 19, wherein the input circuit is an incremental input circuit generating the driving function signal as an incremental driving function signal and wherein the hierarchal coefficient processor is an incremental hierarchal coefficient processor generating the plurality of hierarchal coefficients by incrementally processing the incremental driving function signal.

22. A transform processor system as set forth in claim 19, wherein the input circuit is an incremental input circuit generating the driving function signal as an incremental driving function signal, wherein the hierarchal coefficient processor is an incremental hierarchal coefficient processor generating the plurality of hierarchal coefficients by incrementally processing the incremental driving function signal, and wherein the transform processor is an incremental transform processor generating the plurality of transformed points by incrementally processing the plurality of input points stored by the memory in response to the same hierarchal coefficients.

23. A transform processor system as set forth in claim 19, further comprising an operator display coupled to the output circuit and generating an operator display in response to the transformed output signals.

24. A transform processor system as set forth in claim 19, wherein the input circuit includes a rotation device generating a rotation driving function command signal and a translation device generating a translation driving function command signal, wherein the hierarchal coefficient processor generates the plurality of hierarchal coefficients in response to the rotation driving function command signal and in response to the translation driving function command signal.

25. A transform processor system comprising:

a memory storing a plurality of input points, each input point having a plurality of parameters;

an input circuit generating a first driving function signal related to a first one of the input points stored by the memory and a second driving function signal related to a second one of the input points stored by the memory;

a first detector coupled to the input circuit and generating a first detector signal indicative of a change in the first driving function signal;

a second detector coupled to the input circuit and generating a second detector signal indicative of a change in the second driving function signal;

a first transform processor coupled to the first detector and to the memory and transforming the first one of the input points stored by the memory in response to the first detector signal;

a second transform processor coupled to the second detector and to the memory and transforming the second one of the input points stored by the memory in response to the second detector signal; and an output circuit coupled to the first transform processor and to the second transform processor and generating transformed output signals in response to the first transformed point and the second transformed point.

26. A transform processor system as set forth in claim 25, wherein the input circuit is an incremental input circuit generating the first driving function signal as a first incremental driving function signal and the second driving function signal as a second incremental driving function signal.

27. A transform processor system as set forth in claim 25, further comprising an operator display coupled to the output circuit and generating an operator display in response to the transformed output signals.

28. A transform processor system as set forth in claim 25, wherein the input circuit includes a rotation device generating the first driving function signal as a rotational driving function signal related to the first one of the input points stored by the memory.

29. A transform processor system comprising:

a memory storing a plurality of input points, each input point having a plurality of parameters;

an input circuit generating driving function signals related to the input points stored by the memory;

a plurality of detectors coupled to the input circuit and generating detector signals indicative of changes in the driving function signals;

a transform processor coupled to the plurality of detectors and to the memory and transforming the input points stored by the memory in response to the detector signals; and an output circuit coupled to the transform processor and generating transformed output signals in response to the transformed points.

30. A transform processor system as set forth in claim 29, wherein the input circuit is an incremental input circuit generating the driving function signals as incremental driving function signals.

31. A transform processor system as set forth in claim 29, further comprising an operator display coupled to the output circuit and generating an operator display in response to the transformed output signals.

32. A transform processor system as set forth in claim 29, wherein the input circuit includes a rotation device generating at least one of the driving function signals as a rotational driving function signal.

33. A transform processor system comprising:

a memory storing a plurality of input points, each input point having a plurality of parameters;

an input circuit generating a first driving function signal related to a first one of the input points stored by the memory and a second driving function signal related to a second one of the input points stored by the memory;

a first detector coupled to the input circuit and generating a first detector signal indicative of a change in the first driving function signal;

a second detector coupled to the input circuit and generating a second detector signal indicative of a change in the second driving function signal;

a first transform processor coupled to the first detector and to the memory and transforming the first one of the input points stored by the memory when the first detector signal is indicative of a change in the first driving function signal and bypassing transforming of the first one of the input points when the first detector signal is indicative of no change in the first driving function signal;

a second transform processor coupled to the second detector and to the memory and transforming the second one of the input points stored by the memory when the second detector signal is indicative of a change in the second driving function signal and bypassing transforming of the second one of the input points when the second detector signal is indicative of no change in the second driving function signal; and an output circuit coupled to the first transform processor and to the second transform processor and generating transformed output signals in response to the first transformed point and the second transformed point.

34. A transform processor system as set forth in claim 33, wherein the input circuit is an incremental input circuit generating the first driving function signal as a first incremental driving function signal and the second driving function signal as a second incremental driving function signal.

35. A transform processor system as set forth in claim 33, further comprising an operator display coupled to the output circuit and generating an operator display in response to the transformed output signals.

36. A transform processor system as set forth in claim 33, wherein the input circuit includes a rotation device generating the first driving function signal as a rotational driving function signal related to the first one of the input points stored by the memory.

37. A transform processor system comprising:

a memory storing a plurality of input points, each input point having a plurality of parameters;

an input circuit generating driving function signals related to the input points stored by the memory;

a plurality of detectors coupled to the input circuit and generating detector signals indicative of changes in the driving function signals;

a transform processor coupled to the plurality of detectors and to the memory and transforming the input points stored by the memory when the detector signals are indicative of changes in the driving function signals and bypassing transforming of the input points when the detector signals are indicative of no change in the driving function signals; and an output circuit coupled to the transform processor and generating transformed output signals in response to the transformed points.

38. A transform processor system as set forth in claim 37, wherein the input circuit is an incremental input circuit generating the driving function signals as incremental driving function signals.

39. A transform processor system as set forth in claim 37, further comprising an operator display coupled to the output circuit and generating an operator display in response to the transformed output signals.

40. A transform processor system as set forth in claim 37, wherein the input circuit includes a rotation device generating at least one of the driving function signals as a rotational driving function signal.

41. A transform processor system comprising:

a translation input circuit generating a translation driving function signal;

a rotation input circuit generating a rotation driving function signal; and a transform processor coupled to the translation input device and to the rotation input device and generating transformed output signals in response to the translation driving function signal and in response to the rotation driving function signal, wherein the transform processor includes a) a memory storing a plurality of points each point having at least two coordinates, b) a coefficient processor generating a plurality of coefficients in response to the translation driving function signal and in response to the rotation driving function signal, c) a transform circuit coupled to the coefficient processor and to the memory and generating a plurality of transformed points in response to the plurality of points stored by the memory and in response to the same coefficients, and d) an output circuit coupled to the transform circuit and generating the transformed output signals in response to the plurality of transformed points.

42. A transform processor system as set forth in claim 41, wherein the translation input circuit is an incremental translation input circuit generating the translation driving function signal as an incremental translation driving function signal and wherein the rotation input circuit is an incremental rotation input circuit generating the rotation driving function signal as an incremental rotation driving function signal.

43. A transform processor system as set forth in claim 41, wherein the translation input circuit is an incremental translation input circuit generating the translation driving function signal as an incremental translation driving function signal and wherein the rotation input circuit is an incremental rotation input circuit generating the rotation driving function signal as an incremental rotation driving function signal and wherein the coefficient processor is an incremental coefficient processor generating the plurality of coefficients by incrementally processing the incremental translation driving function signal and the incremental rotation driving function signal.

44. A transform processor system as set forth in claim 41, further comprising an operator display coupled to the output circuit and generating an operator display in response to the transformed output signals.

45. A transform processor system comprising:

an input circuit generating a driving function signal;

a memory storing a plurality of input points, each input point having a plurality of parameters;

an object coefficient processor generating object transform coefficients that are common to a plurality of input points in response to the driving function signal;

a first transform processor coupled to the object coefficient processor and to the memory and generating a first transformed point in response to a first one of the plurality of input points stored by the memory and in response to the object transform coefficients;

a second transform processor coupled to the object coefficient processor and to the memory and generating a second transformed point in response to a second one of the plurality of input points stored by the memory and in response to the same object transform coefficients as used for the generation of the first transform point; and an output circuit coupled to the first transform processor and to the second transform processor and generating transformed output signals in response to the first transformed point and the second transformed point.

46. A transform processor system as set forth in claim 45, wherein the input circuit is an incremental input circuit generating the driving function signal as an incremental driving function signal.

47. A transform processor system as set forth in claim 45, wherein the input circuit is an incremental input circuit generating the driving function signal as an incremental driving function signal and wherein the object coefficient processor is an incremental object coefficient processor generating the object transform coefficients by incrementally processing the incremental driving function signal.

48. A transform processor system as set forth in claim 45, wherein the input circuit is an incremental input circuit generating the driving function signal as an incremental driving function signal, wherein the object coefficient processor is an incremental object coefficient processor generating the object transform coefficients by incrementally processing the incremental driving function signal, wherein the first transform processor is a first incremental transform processor generating the first transformed point by incrementally processing the first one of the plurality of input points stored by the memory in response to the object transform coefficients, and wherein the second transform processor is a second incremental transform processor generating the second transformed point by incrementally processing the second one of the plurality of input points stored by the memory in response to the same object transform coefficients.

49. A transform processor system as set forth in claim 45, further comprising an operator display coupled to the output circuit and generating an operator display in response to the transformed output signals.

50. A transform processor system as set forth in claim 45, wherein the input circuit includes a rotation device generating a rotation driving function command signal and a translation device generating a translation driving function command signal, wherein the object coefficient processor generates the object transform coefficients in response to the rotation driving function command signal and in, response to the translation driving function command signal.

51. A transform processor system comprising:

an input circuit generating a driving function signal;

a memory storing a plurality of input points, each input point having a plurality of parameters;

an object coefficient processor generating a plurality of object coefficients in response to the driving function signal;

a transform processor coupled to the object coefficient processor and to the memory and generating a plurality of transformed points in response to the plurality of input points stored by the memory and in response to the same object coefficients; and an output circuit coupled to the transform processor and generating transformed output signals in response to the plurality of transformed points.

52. A transform processor system as set forth in claim 51, wherein the input circuit is an incremental input circuit generating the driving function signal as an incremental driving function signal.

53. A transform processor system as set forth in claim 51, wherein the input circuit is an incremental input circuit generating the driving function signal as an incremental driving function signal and wherein the object coefficient processor is an incremental object coefficient processor generating the plurality of object coefficients by incrementally processing the incremental driving function signal.

54. A transform processor system as set forth in claim 51, wherein the input circuit is an incremental input circuit generating the driving function signal as an incremental driving function signal, wherein the object coefficient processor is an incremental object coefficient processor generating the plurality of object coefficients by incrementally processing the incremental driving function signal, and wherein the transform processor is an incremental transform processor generating the plurality of transformed points by incrementally processing the plurality of input points stored by the memory in response to the same object coefficients.

55. A transform processor system as set forth in claim 51, further comprising an operator display coupled to the output circuit and generating an operator display in response to the transformed output signals.

56. A transform processor system as set forth in claim 51, wherein the input circuit includes a rotation device generating a rotation driving function command signal and a translation device generating a translation driving function command signal, wherein the object coefficient processor generates the plurality of object coefficients in response to the rotation driving function command signal and in response to the translation driving function command signal.

57. A transform processor system comprising:

an input circuit generating a driving function signal;

a memory storing a plurality of input points, each input point having a plurality of parameters;

a surface coefficient processor generating surface transform coefficients that are common to a plurality of input points in response to the driving function signal;

a first transform processor coupled to the surface coefficient processor and to the memory and generating a first transformed point in response to a first one of the plurality of input points stored by the memory and in response to the surface transform coefficients;

a second transform processor coupled to the surface coefficient processor and to the memory and generating a second transformed point in response to a second one of the plurality of input points stored by the memory and in response to the same surface transform coefficients as used for the generation of the first transformed point; and an output circuit coupled to the first transform processor and to the second transform processor and generating transformed output signals in response to the first transformed point and the second transformed point.

58. A transform processor system as set forth in claim 57, wherein the input circuit is an incremental input circuit generating the driving function signal as an incremental driving function signal.

59. A transform processor system as set forth in claim 57, wherein the input circuit is an incremental input circuit generating the driving function signal as an incremental driving function signal and wherein the surface coefficient processor is an incremental surface coefficient processor generating the surface transform coefficients by incrementally processing the incremental driving function signal.

60. A transform processor system as set forth in claim 57, wherein the input circuit is an incremental input circuit generating the driving function signal as an incremental driving function signal, wherein the surface coefficient processor is an incremental surface coefficient processor generating the surface transform coefficients by incrementally processing the incremental driving function signal, wherein the first transform processor is a first incremental transform processor generating the first transformed point by incrementally processing the first one of the plurality of input points stored by the memory in response to the surface transform coefficients, and wherein the second transform processor is a second incremental transform processor generating the second transformed point by incrementally processing the second one of the plurality of input points stored by the memory in response to the same surface transform coefficients.

61. A transform processor system as set forth in claim 57, further comprising an operator display coupled to the output circuit and generating an operator display in response to the transformed output signals.

62. A transform processor system as set forth in claim 57, wherein the input circuit includes a rotation device generating a rotation driving function command signal and a translation device generating a translation driving function command signal, wherein the surface coefficient processor generates the surface transform coefficients in response to the rotation driving function command signal and in response to the translation driving function command signal.

63. A transform processor system comprising:

an input circuit generating a driving function signal;

a memory storing a plurality of input points, each input point having a plurality of parameters;

a surface coefficient processor generating a plurality of surface coefficients in response to the driving function signal;

a transform processor coupled to the surface coefficient processor and to the memory and generating a plurality of transformed points in response to the plurality of input points stored by the memory and in response to the same surface coefficients; and an output circuit coupled to the transform processor and generating transformed output signals in response to the plurality of transformed points.

64. A ransform processor system as set forth in claim 63, wherein the input circuit is an incremental input circuit generating the driving function signal as an incremental driving function signal.

65. A transform processor system as set forth in claim 63, wherein the input circuit is an incremental input circuit generating the driving function signal as an incremental driving function signal and wherein the surface coefficient processor is an incremental surface coefficient processor generating the plurality of surface coefficients by incrementally processing the incremental driving function signal.

66. A transform processor system as set forth in claim 63, wherein the input circuit is an incremental input circuit generating the driving function signal as an incremental driving function signal, wherein the surface coefficient processor is an incremental surface coefficient processor generating the plurality of surface coefficients by incrementally processing the incremental driving function signal, and wherein the transform processor is an incremental transform processor generating the plurality of transformed points by incrementally processing the plurality of input points stored by the memory in response to the same surface coefficients.

67. A transform processor system as set forth in claim 63, further comprising an operator display coupled to the output circuit and generating an operator display in response to the transformed output signals.

68. A transform processor system as set forth in claim 63, wherein the input circuit includes a rotation device generating a rotation driving function command signal and a translation device generating a translation driving function command signal, wherein the surface coefficient processor generates the plurality of surface coefficients in response to the rotation driving function command signal and in response to the translation driving function command signal.

69. In a transform processor system, a process comprising:

generating a driving function signal;

storing a plurality of input points, each input point having a plurality of parameters;

generating a plurality of coefficients in response to the driving function signal;

generating a plurality of transformed points in response to the plurality of stored input points and in response to the same coefficients; and generating transformed output signals in response to the plurality of transformed points.

70. In a transform processor system, a process comprising:

generating a driving function signal;

storing a plurality of input points, each input point having a plurality of parameters;

generating a plurality of hierarchal coefficients in response to the driving function signal;

generating a plurality of transformed points in response to the plurality of input points and in response to the same hierarchal coefficients; and generating transformed output signals in response to the plurality of transformed points.

71. In a transform processor system, a process comprising:

storing a plurality of input points, each input point having a plurality of parameters;

generating driving function signals related to the input points stored by the memory;

generating detector signals indicative of changes in the driving function signals;

transforming the input points in response to the detector signals; and generating transformed output signals in response to the transformed input points.

72. In a transform processor system, a process comprising:

storing a plurality of input points, each input point having a plurality of parameters;

generating driving function signals related to the input points stored by the memory;

generating detector signals indicative of changes in the driving function signals;

transforming the input points when the detector signals are indicative of changes in the driving function signals and bypassing transforming of the input points when the detector signals are indicative of no change in the driving function signals; and generating transformed output signals in response to the transformed input points.

* * * * *